United States Patent [19]

Bratt et al.

[11] Patent Number: 4,525,780

[45] Date of Patent: Jun. 25, 1985

[54] DATA PROCESSING SYSTEM HAVING A MEMORY USING OBJECT-BASED INFORMATION AND A PROTECTION SCHEME FOR DETERMINING ACCESS RIGHTS TO SUCH INFORMATION

[75] Inventors: Richard G. Bratt, Wayland, Mass.; Gerald F. Clancy, Saratoga, Calif.; Craig J. Mundie, Cary, N.C.; Stephen I. Schleimer, Chapel Hill, N.C.; Steven J. Wallach, Saratoga, Calif.

[73] Assignee: Data General Corporation, Westboro, Mass.

[21] Appl. No.: 616,773

[22] Filed: May 31, 1984

Related U.S. Application Data

[63] Continuation of Ser. No. 266,409, May 22, 1981, abandoned.

[51] Int. Cl.³ .......................... G06F 9/34; G06F 9/46; G06F 13/00

[52] U.S. Cl. .................................................... 364/200

[58] Field of Search ... 364/200 MS File, 900 MS File

[56] References Cited

U.S. PATENT DOCUMENTS

| | | | |
|---|---|---|---|
| 3,902,163 | 8/1975 | Amdahl et al. | 364/200 |
| 3,902,164 | 8/1975 | Kelley et al. | 364/200 |
| 4,079,453 | 3/1978 | Dahl | 364/200 |
| 4,084,228 | 4/1978 | Dufond et al. | 364/200 |
| 4,130,867 | 12/1978 | Bachman et al. | 364/200 |
| 4,133,038 | 1/1979 | Huettner et al. | 364/200 |
| 4,135,240 | 1/1979 | Ritchie | 364/200 |
| 4,148,098 | 4/1979 | McCreight et al. | 364/200 |
| 4,177,510 | 12/1979 | Appell et al. | 364/200 |
| 4,205,372 | 5/1980 | Gruner et al. | 364/200 |
| 4,206,503 | 6/1980 | Woods et al. | 364/200 |
| 4,276,594 | 6/1981 | Morley | 364/200 |
| 4,325,120 | 4/1982 | Colley et al. | 364/200 |
| 4,354,225 | 10/1982 | Frieder et al. | 364/200 |
| 4,367,524 | 1/1983 | Budde et al. | 364/200 |
| 4,371,925 | 2/1983 | Carberry et al. | 364/200 |
| 4,398,243 | 8/1983 | Holberger et al. | 364/200 |
| 4,408,274 | 10/1983 | Wheatley et al. | 364/200 |
| 4,430,705 | 2/1984 | Cannavino et al. | 364/200 |
| 4,439,830 | 3/1984 | Chueh | 364/200 |
| 4,442,484 | 4/4984 | Childs, Jr. et al. | 364/200 |

*Primary Examiner*—Raulfe B. Zache
*Assistant Examiner*—A. E. Williams, Jr
*Attorney, Agent, or Firm*—Robert O'Connell

[57] ABSTRACT

A digital data processing system has a memory organized into objects containing at least operands and instructions. Each object is identified by a unique and permanent identifier code which identifies the data processing system and the object. The system uses a protection technique to prevent unauthorized access to objects by users who are identified by a subject number which identifies the user, a process of the system for executing a user's procedure, and the type of operation of the system to be performed by the user's procedure. An access control list for each object includes an access control list entry for each subject having access rights to the object and means for confirming that a particular active subject has access rights to a particular object before permitting access to the object. The system also includes stacks for containing information relating to the current state of execution of the system.

17 Claims, 200 Drawing Figures

PC 20716

PC 20716

RM 20722

TCL 21510

RQ 20728

MISSC 20726

LM 20730

WBCL 22010

BWCC 21910

BWS 22310

MCU 22210

BRWC 20718

RDH 22510

DPS 22410

P/O FIU 20120

P/O MCC 23210

P/O MCC 23210

P/O MCC 23210

MCC 23210

NC 10226

NC 10226

| PRIORITY LEVEL | EVENT | MASKED BY |
|---|---|---|
| 0 | E-UNIT STACK OVERFLOW | NONE |
| 1 | FATAL MEMORY ERROR | NONE |
| 2 | POWER FAIL | I |
| 3 | F-BOX STACK OVERFLOW | M,T,I |
| 4 | ILLEGAL E-UNIT DISPATCH (GATE FAULT) | NONE |
| 5 | STOREBACK EXCEPTION | MCWD |
| 6 | NAME TRACE TRAP | T,I |
| 7 | LOGICAL READ TRACE TRAP | T,I AND DES |
| 8 | LOGICAL WRITE TRACE TRAP | T,I AND DES |
| 9 | UID READ DEREFERENCE TRAP | DES |
| 10 | UID WRITE DEREFERENCE TRAP | DES |
| 11 | PROTECTION CACHE MISS | NONE |
| 12 | PROTECTION VIOLATION | MCWD |
| 13 | PAGE CROSSING INTERRUPT | NONE |
| 14 | LAT | NONE |
| 15 | WRITE LAT | NONE |
| 16 | MEMORY REFERENCE REPEAT | NONE |
| 17 | EGG TIMER OVERFLOW | A,M,T,I |
| 18 | E-BOX STACK UNDERFLOW | A,M,T,I |
| 19 | NON-FATAL MEMORY ERROR | NONE |
| 20 | INTERVAL TIMER OVEREFLOW | NONE |
| 21 | IPM INTERRUPT | NONE |
| 22 | S-OP TRACE TRAP | NONE |
| 23 | ILLEGAL S-OP | NONE |
| 24 | MICROINSTRUCTION TRACE TRAP | NONE |
| 25 | NON-PRESENT MICROINSTRUCTION | NONE |
| 26 | INSTRUCTION PREFETCH IS HUNG | NONE |
| 27 | F-BOX STACK UNDERFLOW | NONE |
| 28 | MICROINSTRUCTION BREAK POINT TRACE TRAP | T,I AND MCWD |
| 29 | MISS ON NAME CACHE LOAD OR READ REGISTER | NONE |

*FIG. 247*

FU 10120 MICROMACHINE PROGRAMS

SOURCE TEXT LISTING

```
0 : @20@:
0 : ENTRY BREL:
0 :       OFF_ALU_OUT = IPC OR PC.AON,
0 :       LOAD_AON( PF) WITH AON( PC.AON),
0 :       LOAD_OFF( PF) WITH OFFSET;
0 :
0 :       PARSE_K_LOAD_EPC, /* INSURE PAGE CROSSING DETECTED */
0 :       OFF_ALU_OUT = PARSER (SIGN_EXTEND) LEFT_SHIFTED(3) OR
0 :             ZEROVAL,
0 :       LOAD (ACCUMULATOR) WITH OFFSET;
0 :
0 :       OFF_ALU_OUT = ACC PLUS PF,
0 :       READ_PREFETCH_FOR_BRANCH USING OFF_ALU CON_LENGTH( 32),
0 :       SOURCE( OFF_ALU_DATA) TO JPD_BUS( CURR_PC),
0 :       GOTO _NEXT_S_OP;
0 :
```

MICROINSTRUCTIONS

```
923 0 : @20@:
924 0 : ENTRY BREL:
925 0 : OFF_ALU_UUT = IPC OR COMMON ( @A@ , 7 ) ,
  M 0 :  jpd_ctrl 10 alu_op 5 src_frame 2 , r_source 7 , com_ext @A@
926 0 : LOAD_AON ( CURRENT ( 5 ) ) WITH AON ( COMMON ( @A@ , 7 ) ) ,
  M 0 : dest_frame 0 , r_dest 5 , r_w 1 a_in 2, src_frame
  M 0 : 2 , r_source 7 , com_ext @A@
927 0 : LOAD_OFF ( CURRENT ( 5 ) ) WITH OFFSET
  M 0 : dest_frame 0 , r_dest 5 , r_w 1 o_in 3
927 0 : ;
929 0 : PARSE_K_LOAD_EP ,
  M 0 : dev_cmd 121 , nb_ctrl 1 ,
930 0 : OFF_ALU_OUT = PARSER ( SIGN_EXTEND ) LEFT_SHIFTED ( 3 ) OR
  M 0 :  alu_in 2 , nb_ctrl 1 , rand 1 sf 3 alu_op 5
931 0 : COMMON ( @B@ , 0 ) ,
  M 0 : src_frame 2 , r_source 0 , com_ext @B@ ,
932 0 : LOAD ( ACCUMULATOR ) WITH OFFSET
  M 0 : a_w 1 , o_in 3
932 0 : ;
934 0 : OFF_ALU_OUT = ACC PLUS CURRENT ( 5 ) ,
  M 0 :  alu_in 2 alu_op 3 src_frame 0 , r_source 5 ,
935 0 : READ_PREFETCH_F USING OFF_ALU CON_LENGTH ( 32 ) ,
  M 0 : mem 7 , dev_cmd 124 db_ctrl 1 len_ctrl 6 ,
936 0 : SOURCE ( OFF_ALU_DATA ) TO JPD_BUS ( CURR_PC ) ,
  M 0 : jpd_ctrl 7 dev_cmd 124 ,
937 0 : GOTO _NEXT_S_OP
  M 0 : nac 4 , lit8 _NEXT_S_OP
937 0 : ;
```

*FIG. 274*

POINTER FORMATS

ASSOCIATED ADDRESS TABLE

NAMESPACE OVERVIEW OF A PROCEDURE OBJECT

PATHNAME TO UID-OFFSET TRANSLATION

OBJECT UID'S
UNIVERSAL IDENTIFIER 01

ATU, MHT, AND MEMORY

CONCEPTUAL LAUD STRUCTURE

LAUDE DETAIL

ANPAT OVERVIEW

PRIMITIVE DATA ACCESS CHECKING

UMM CONCEPTUAL OVERVIEW

MEMORY FRAME TABLE DETAIL

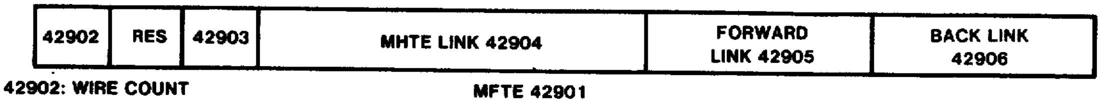

42902: WIRE COUNT
42903: USE COUNT

MFTE 42901

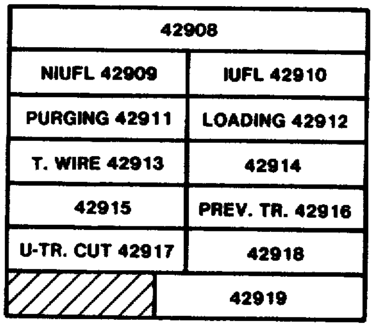

VMM DESCRIPTOR 42907

42908: VERSION NUMBER
42909: NIUFL HEAD PTR
42910: IUFL HEAD PTR
42911: PURGING LIST HEAD PTR
42912: LOADING LIST HEAD PTR
42913: TEMPORARY WIRED LIST HEAD PTR
42914: PAGING POOL LOW FRAME NO
42915: PAGING POOL HIGH FRAME NO
42916: PREVIOUS FRAME NO
42917: UNBOUND FRAME COUNT
42918: WAITING FOR A FRAME COUNT
42919: MHT SIZE
42925: MFT FRAME DISPLACEMENT ADDRESS
42926: MFT AON-OFFSET ADDRESS
42927: MFT SIZE

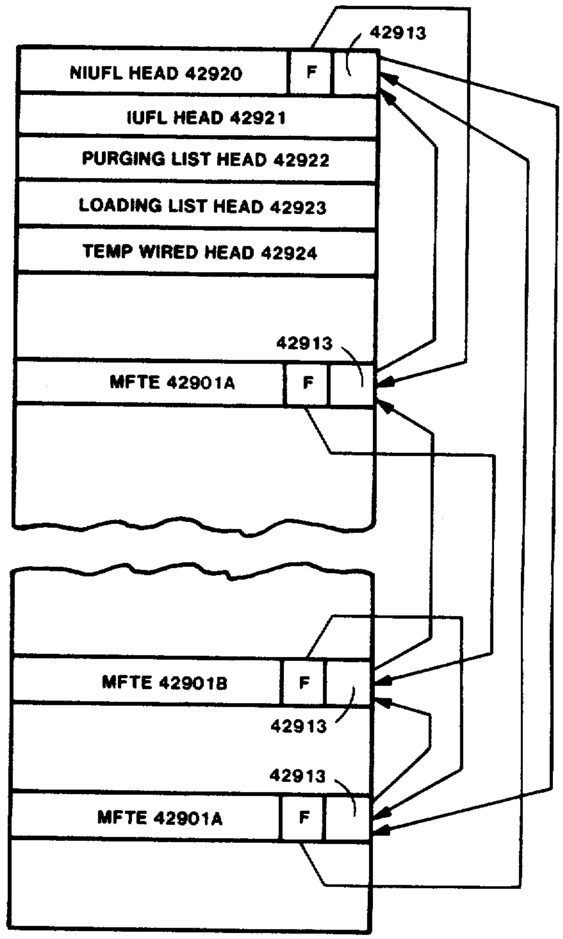

MFT 10718

MFT LISTS 42929

BLOCKS 43006 AND 43007:
PROCESS OMQ LOOP AND FRAME CLEANER

BLOCK 43005:
PROCESS VMMQ LOOP

SEGMENT 43601 DETAIL

FRAME ALLOCATION OVERVIEW

FRAME ALLOCATION FUNCTION 43600

OVERVIEW OF PROCESSES

EVENT COUNTERS AND AWAIT ENTRIES

AWAIT TABLE OVERVIEW

PROCESS SYNCHRONIZATION WITH EVENT COUNTERS AND AWAIT ENTRIES

VIRTUAL PROCESSOR SYNCHRONIZATION

PET ENTRIES AND LISTS

CLOCK EVENT COUNTER IMPLEMENTATION

VIRTUAL PROCESSOR MANAGER OVERVIEW

VIRTUAL PROCESSOR INFORMATION ENTRY DETAIL

VIRTUAL PROCESSOR LISTS DETAIL

VPAT DETAIL

| SATISFIED 46609 | NOTIFY 46611 |
|---|---|
| EVENT COUNTER AON 46613 | |
| EVENT COUNTER OFFSET 46615 | |
| EVENT COUNTER VALUE 46617 | |
| LINK TO NEXT VPATE 46619 | |
| VP NUMBER 46621 | |

VPATE 45403 DETAIL

MAS OBJECT OVERVIEW

MAS BOSE DETAIL

46827: PENDING INTERUPT
46829: DOMAIN DEAD
46831: INVOKE VERIFY ON ENTRY
46833: INVOKE VERIFY ON EXIT
46835: DEFAULT HANDLER NON-NULL

MAS FRAME DETAIL

46903: RESULT OF CROSS-DOMAIN
460905: IN SIGNALLER
46907: DO NOT RETURN
46909-15: LIST PRESENT FLAGS

NOTE: IN A FRAME RESULTING FROM A CROSS-DOMAIN CALL, PFO 17=0; IN A FRAME MAKING A CROSS-DOMAIN CALL, NFO = 0

SS 10336 OVERVIEW

SECURE STACK 10336 FRAME DETAIL

PROCEDURE OBJECT OVERVIEW

LISTS IN MEDIATED FRAMES

FU 10120 MICROINSTRUCTION FORMAT
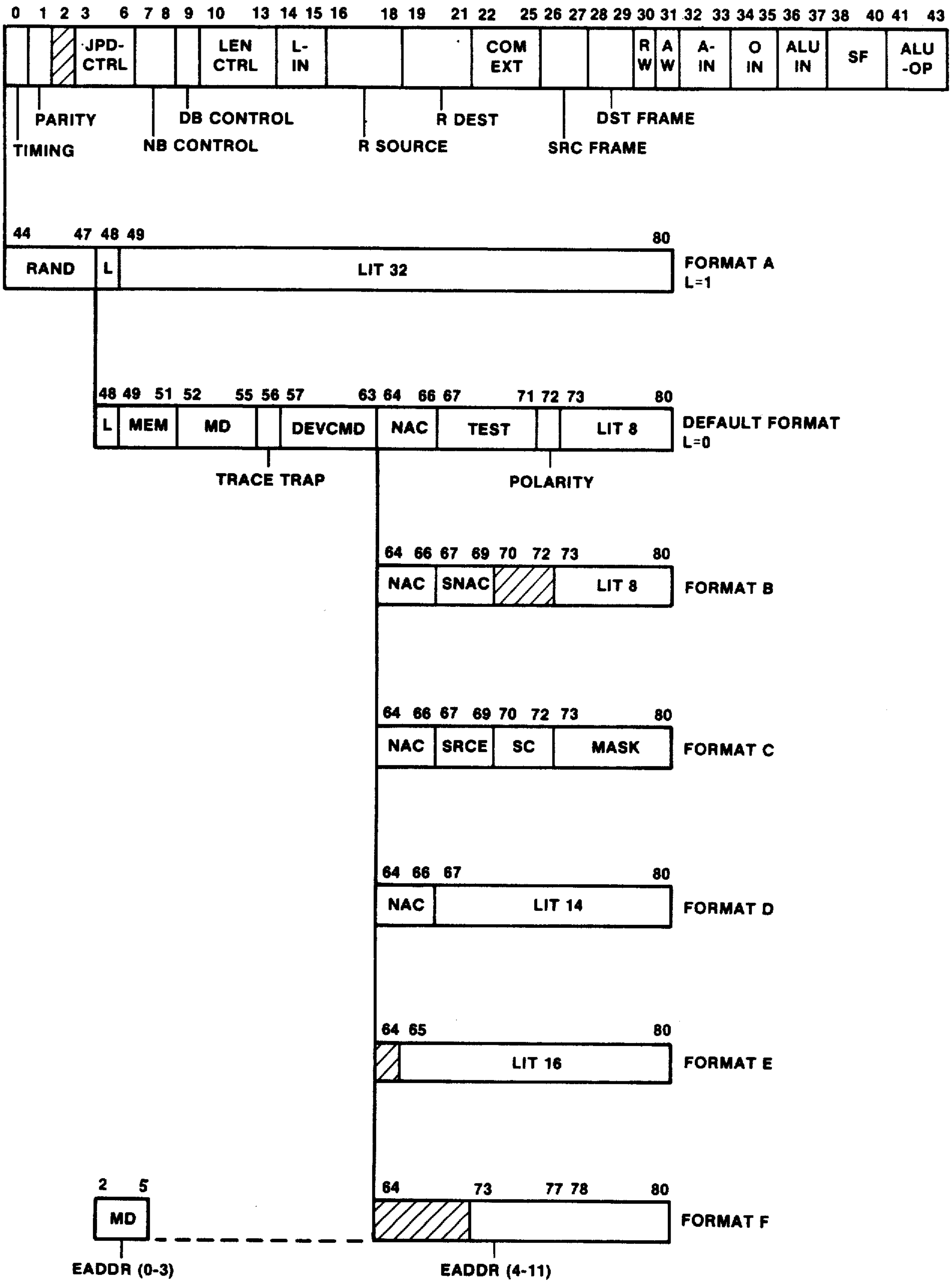
*FIG. A1*

DATA PROCESSING SYSTEM HAVING A MEMORY USING OBJECT-BASED INFORMATION AND A PROTECTION SCHEME FOR DETERMINING ACCESS RIGHTS TO SUCH INFORMATION

This application is a continuation of application Ser. No. 266,409, filed 5/22/81 now abandoned.

CROSS REFERENCE TO RELATED APPLICATIONS

The present patent application is related to other patent applications assigned to the assignee of the present application.

1. Field of the Invention

The present invention relates to a digital data processing system and, more particularly, to a multiprocess digital data processing system in which information, including operands and instructions, can be organized as objects each of which is identified by a unique and permanent code number and which includes protection means for preventing unauthorized access by a user to objects of another user.

2. Description of Prior Art

A general trend in the development of data processing systems has been towards systems suitable for use in interconnected data processing networks. Another trend has been towards data processing systems wherein the internal structure of the system is flexible, protected from users, and effectively invisible to the user and wherein the user is presented with a flexible and simplified interface to the system.

Certain problems and shortcomings affecting the realization of such a data processing system have appeared repeatedly in the prior art and must be overcome to create a data processing system having the above attributes. These prior art problems and limitations include the following topics.

First, the data processing systems of the prior art have not provided a system wide addressing system suitable for use in common by a large number of data processing systems interconnected into a network. Addressing systems of the prior art have not provided sufficiently large address spaces and have not allowed information to be permanently and uniquely identified. Prior addressing systems have not made provisions for information to be located and identified as to type or format, and have not provided sufficient granularity. In addition, prior addressing systems have reflected the physical structure of particular data processing systems. That is, the addressing systems have been dependent upon whether a particular computer was, for example, an 8, 16, 32, 64 or 128 bit machine. Since prior data processing systems have incorporated addressing mechanisms wherein the actual physical structure of the processing system is apparent to the user, the operations a user could perform have been limited by the addressing mechanisms. In addition, prior processor systems have operated as fixed word length machines, further limiting user operations.

Prior data processing systems have not provided effective protection mechanisms preventing one user from effecting another user's data and programs without permission. Such protection mechanisms have not allowed unique, positive identification of users requesting access to information, or of information, nor have such mechanisms been sufficiently flexible in operation.

In addition, access rights have pertained to the users rather than to the information, so that control of access rights has been difficult. Finally, prior art protection mechanisms have allowed the use of "Trojan Horse arguments". That is, users not having access rights to certain information have been able to gain access to that information through another user or procedure having such access rights.

Yet another problem of the prior art is that of providing a simple and flexible interface user interface to a data processing system. The character of user's interface to a data processing system is determined, in part, by the means by which a user refers to and identifies operands and procedures of the user's programs and by the instruction structure of the system. Operands and procedures are customarily referred to and identified by some form of logical address having points of reference, and validity, only within a user's program. These addresses must be translated into logical and physical addresses within a data processing system each time a program is executed, and must then be frequently retranslated or generated during execution of a program. In addition, a user must provide specific instructions as to data format and handling. As such reference to operands or procedures typically comprise a major portion of the instruction stream of the user's program and requires numerous machine translations and operations to implement. A user's interface to a conventional system is thereby complicated, and the speed of execution of programs reduced, because of the complexity of the program references to operands and procedures.

A data processing system's instruction structure includes both the instructions for controlling system operations and the means by which these instructions are executed. Conventional data processing systems are designed to efficiently execute instructions in one or two user languages, for example, FORTRAN or COBOL. Programs written in any other language are not efficiently executable. In addition, a user is often faced with difficult programming problems when using any high level language other than the particular one or two languages that a particular conventional system is designed to utilize.

Yet another problem in conventional data processing systems is that of protecting the system's internal mechanisms, for example, stack mechanisms and internal control mechanisms, from accidental or malicious interference by a user.

Finally, the internal structure and operation of prior art data processing systems have not been flexible, or adaptive, in structure and operation. That is, the internal structure structure and operation of prior systems have not allowed the systems to be easily modified or adapted to meet particular data processing requirements. Such modifications may include changes in internal memory capacity, such as the addition or deletion of special purpose subsystems, for example, floating point or array processors. In addition, such modifications have significantly affected the users interface with the system. Ideally, the actual physical structure and operation of the data processing system should not be apparent at the user interface.

The present invention provides data processing system improvements and features which solve the above-described problems and limitations.

SUMMARY OF THE INVENTION

The digital computer system of the present invention includes a memory system comprising mass storage devices and one or more processors connected to the memory system. The memory system is organized into objects containing data items, e.g., operands and instructions, each object being identified by an object identifier. Locations of data items in the memory system are specified by means of the object identifier for the object containing the data item. The object identifier includes a code field which identifies the time of creation of the object relative to a selected initial time which is common to a plurality of digital computer systems. The system further includes a stack means which store the current state of execution of the system of the objects contain information relating to such current state of execution.

Access to the data items in objects is controlled by protection mechanisms of the system. When the digital computer system processes data in an object, it does so for a subject representing an entity using the computer system. An access control list associated with each object defines sets of subjects in a set of memory operations which a subject in a given set of subjects may perform on data items in the object. A memory operation on a data item in an object succeeds only if there is an access control list entry associated with the object which allows the subject for whom the processor is performing the memory operation to perform that operation on the data in the object.

It is thus an object of the present invention to provide an improved data processing system.

It is another object of the present invention to provide a data processing system capable of use in large, interconnected data processing networks.

It is yet another object of the present invention to provide an improved addressing mechanism suitable for use in large, interconnected data processing networks.

It is a further object of the present invention to provide an improved information protection mechanism.

It is still another object of the present invention to provide a simplified and flexible user interface to a data processing system.

It is yet a further object of the present invention to provide an improved mechanism for referring to operands.

It is a still further object of the present invention to provide an instruction structure allowing efficient data processing system operation with a plurality of high level user languages.

It is a further object of the present invention to provide data processing internal mechanisms protected from user interference.

It is yet another object of the present invention to provide a data processing system having a flexible internal structure capable of multiple, concurrent operations.

Other objects, advantages and features of the present invention will be understood by those of ordinary skill in the art, after referring to the following detailed description of the preferred embodiments and drawings wherein:

BRIEF DESCRIPTION OF DRAWINGS

FIG. 5 is a diagram illustrating a stack mechanism;

FIGS. 21–100 are not used.

FIGS. 111–200 are not used.

FIG. 247 is a diagram illustrating priority level and masking of computer system events;

FIG. 274 is a diagram illustrating fetch unit micromachine programs;

FIGS. 275-300 are not used.

FIGS. 308-400 are not used.

FIG. 408 is a diagram illustrating hashing in an active subject table;

FIG. 409 is a diagram illustrating logical allocation units and objects;

FIG. 410 is a diagram illustrating an active logical allocation unit table and active allocation units;

FIG. 411 is a diagram illustrating a conceptual logical allocation unit directory structure;

FIG. 412 is a diagram illustrating detail of a logical allocation unit directory entry;

FIG. 413 is a diagram illustrating universal identifiers and active object numbers;

FIG. 414 is a diagram illustrating an object manager queue and an active object manager queue;

FIG. 415 is a diagram illustrating an active object table implementation;

FIG. 416 is a diagram illustrating subject templates, primitive access control list entries, and extended access control list entries;

FIG. 417 is a diagram illustrating an active subject table entry;

FIG. 418 is a diagram illustrating a domain table;

FIG. 419 is a diagram illustrating an active non-primitive access table overview;

Figure 420:
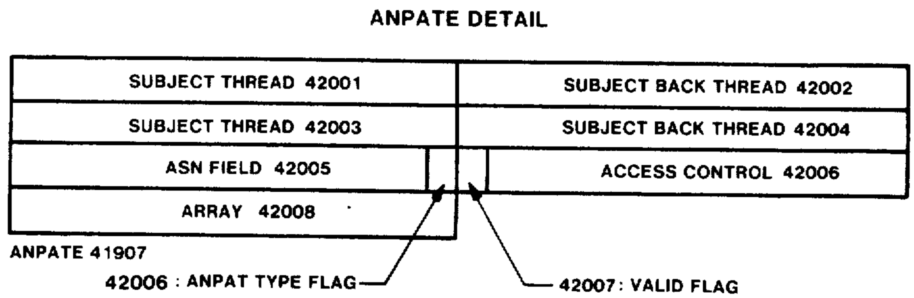
Figure 421:
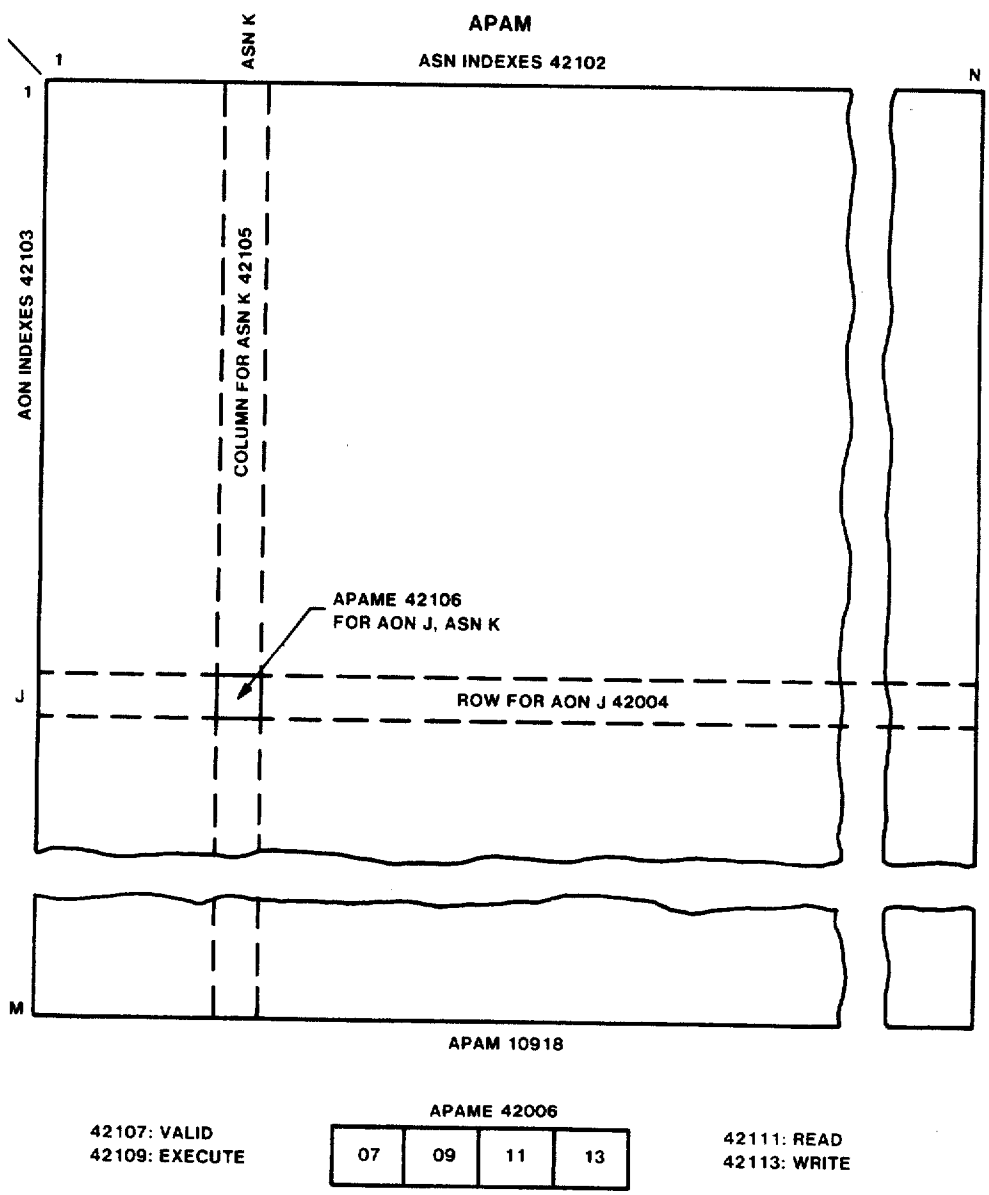
Figure 422:
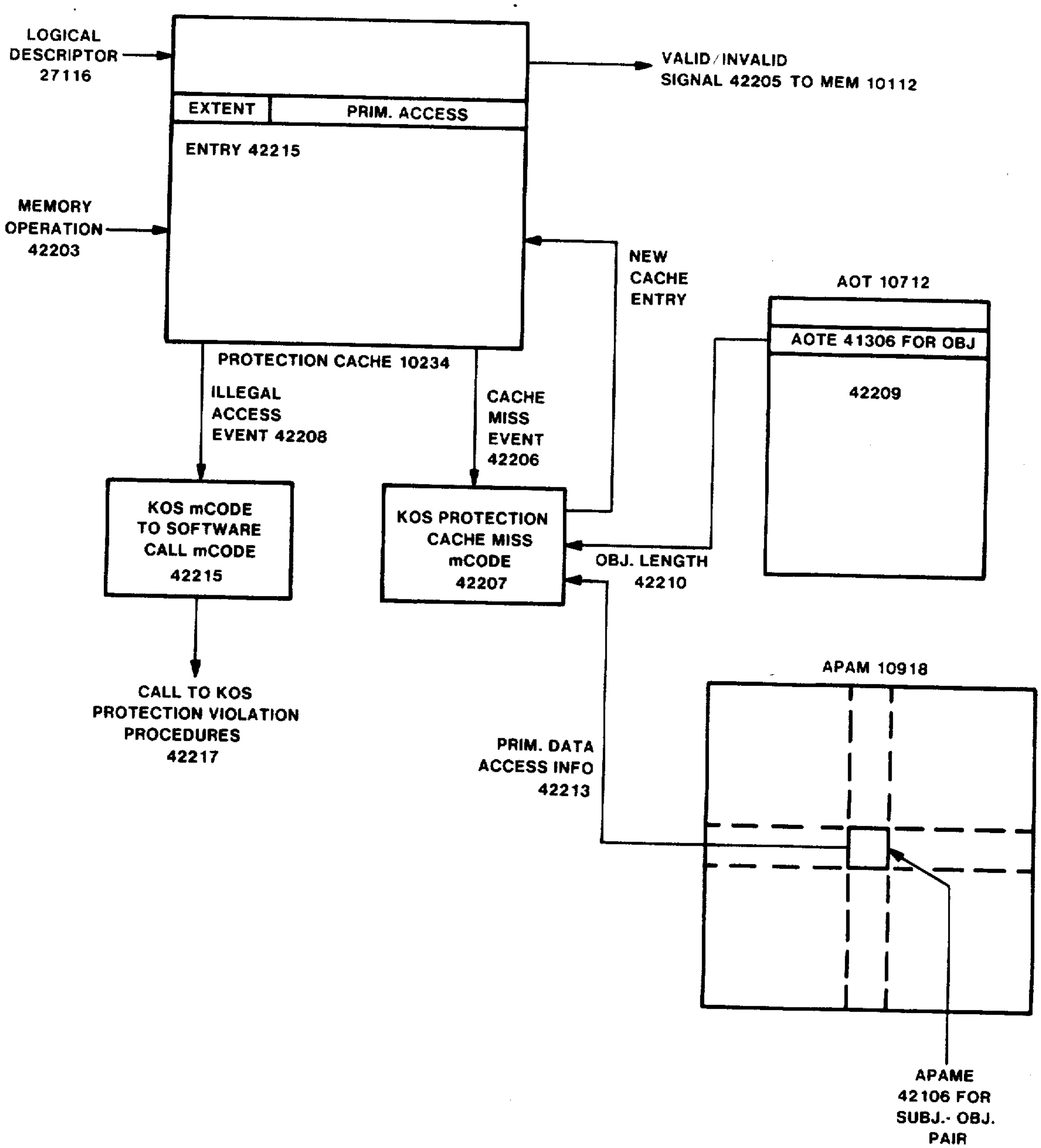
Figure 423:
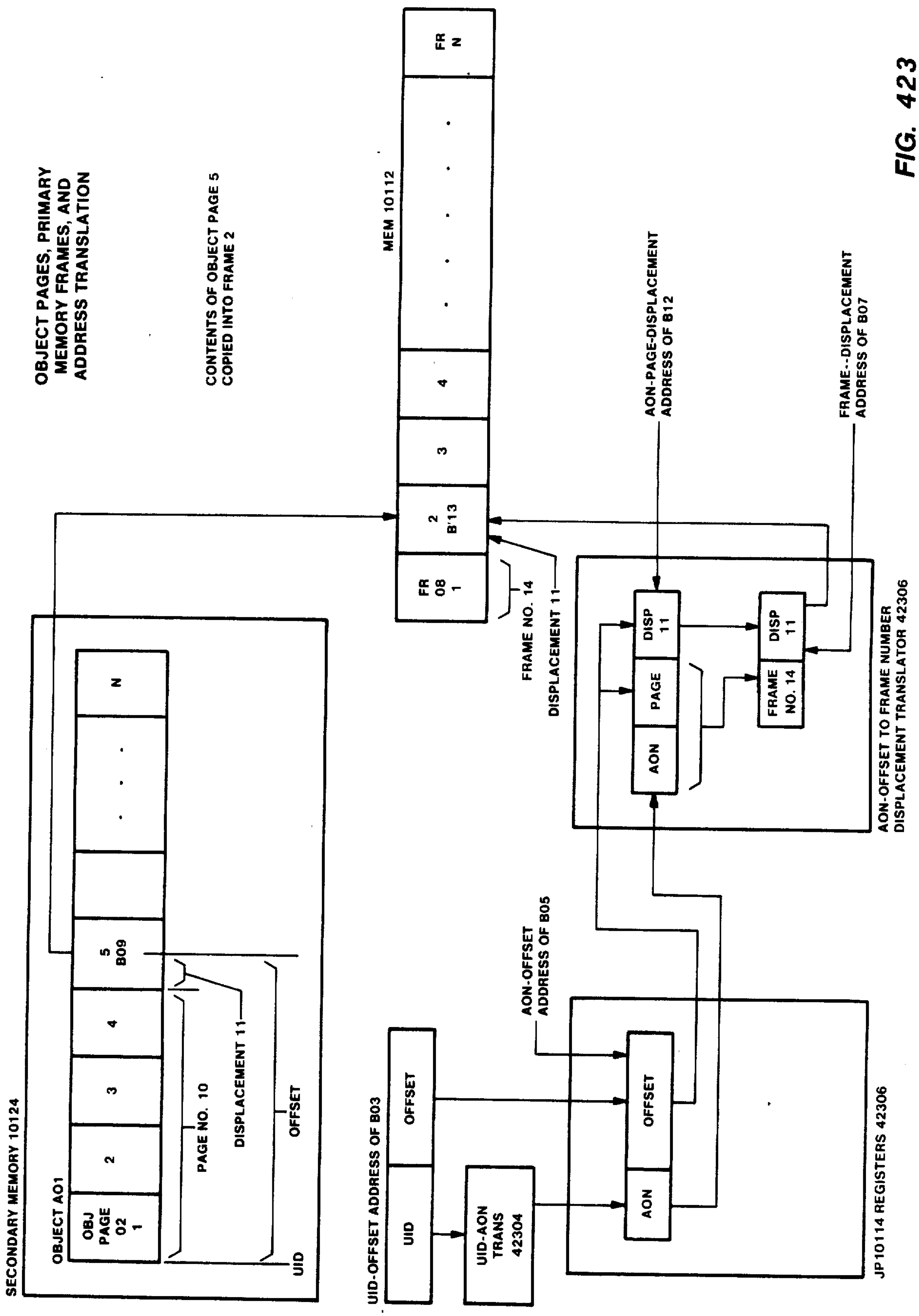
Figure 424:
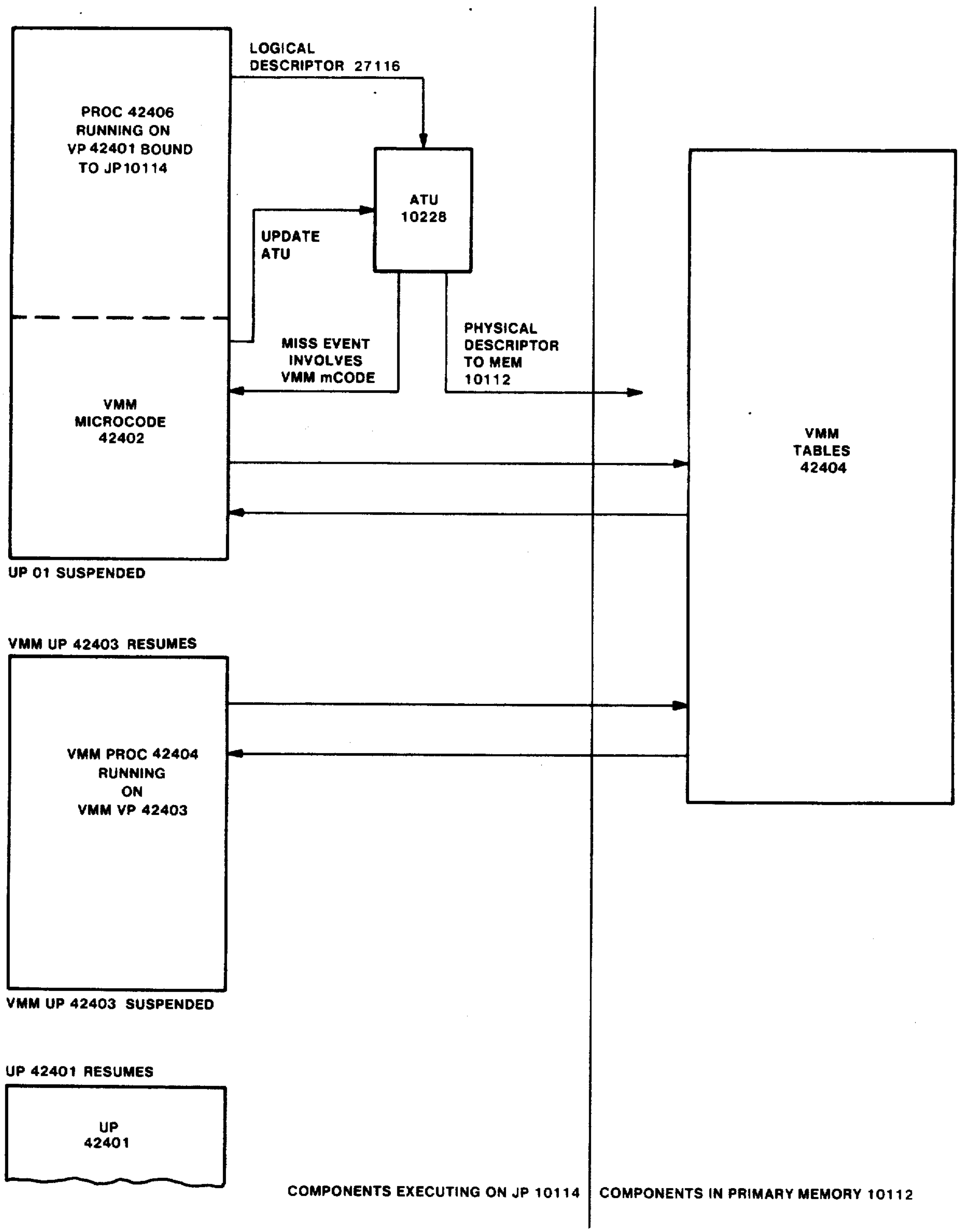
Figure 425:
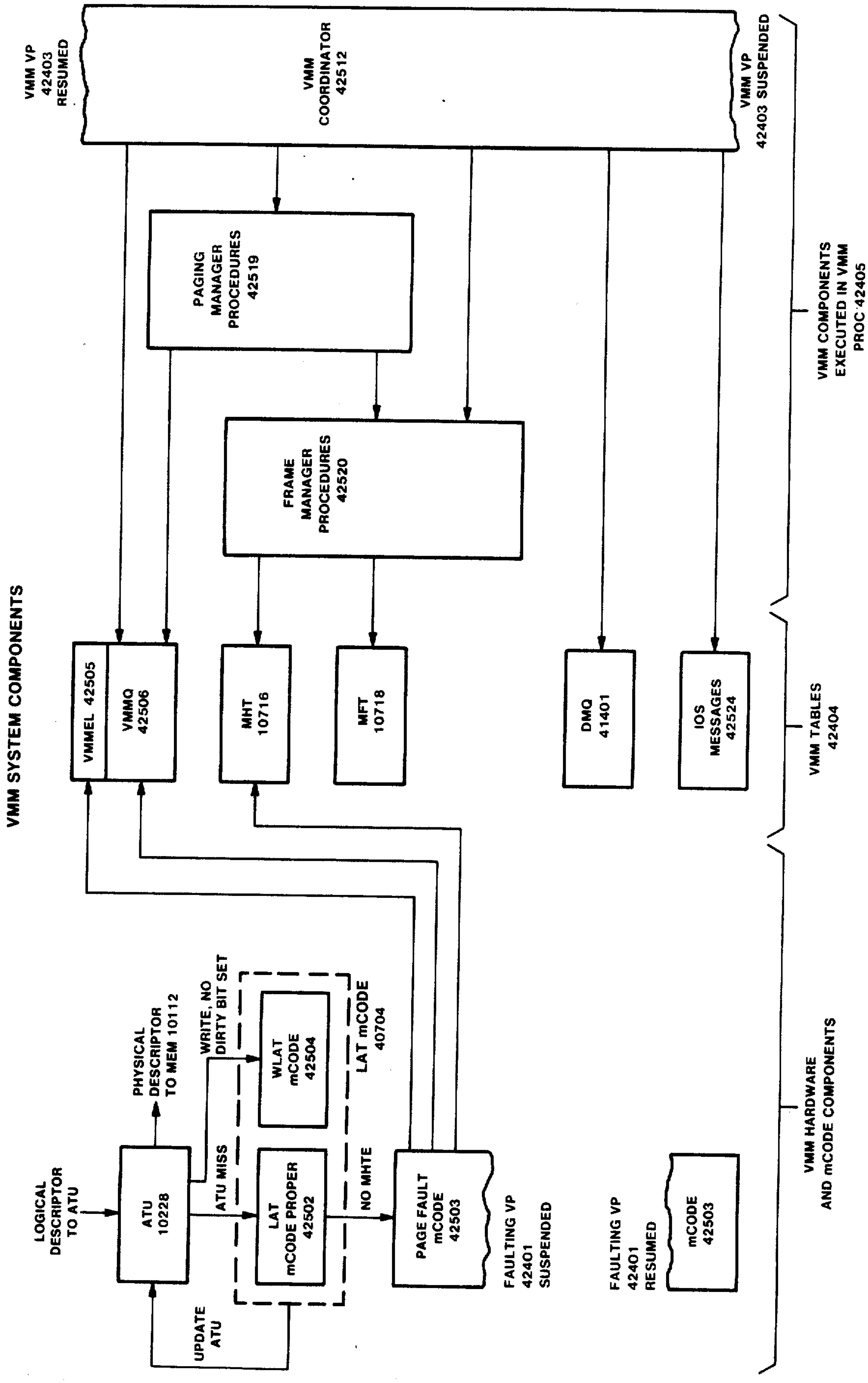
Figure 426:
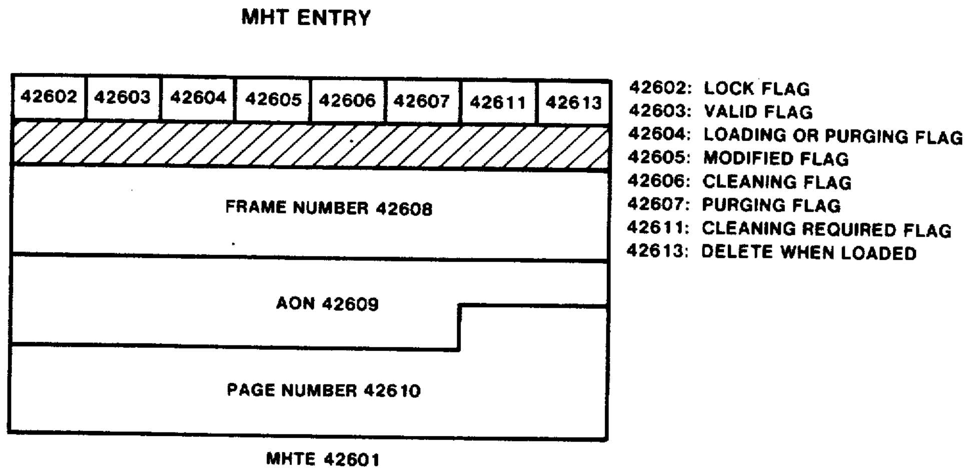
Figure 427:
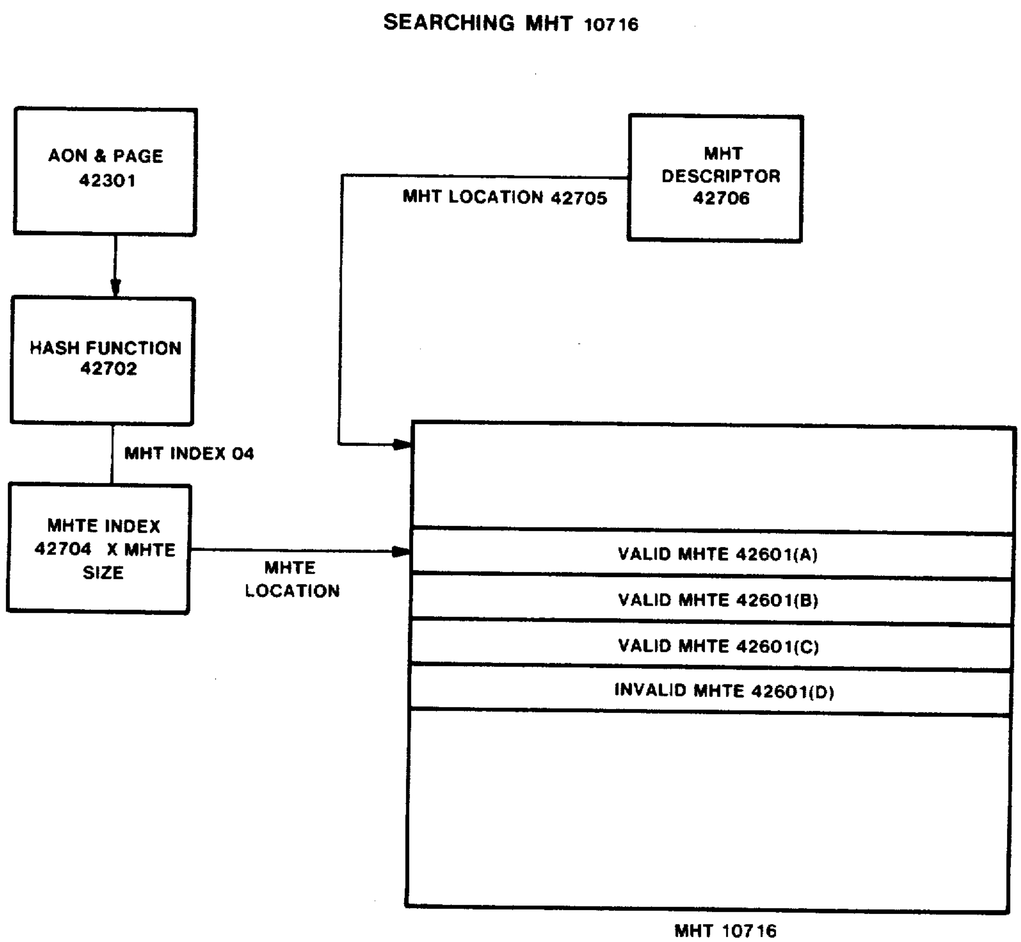
Figure 428:
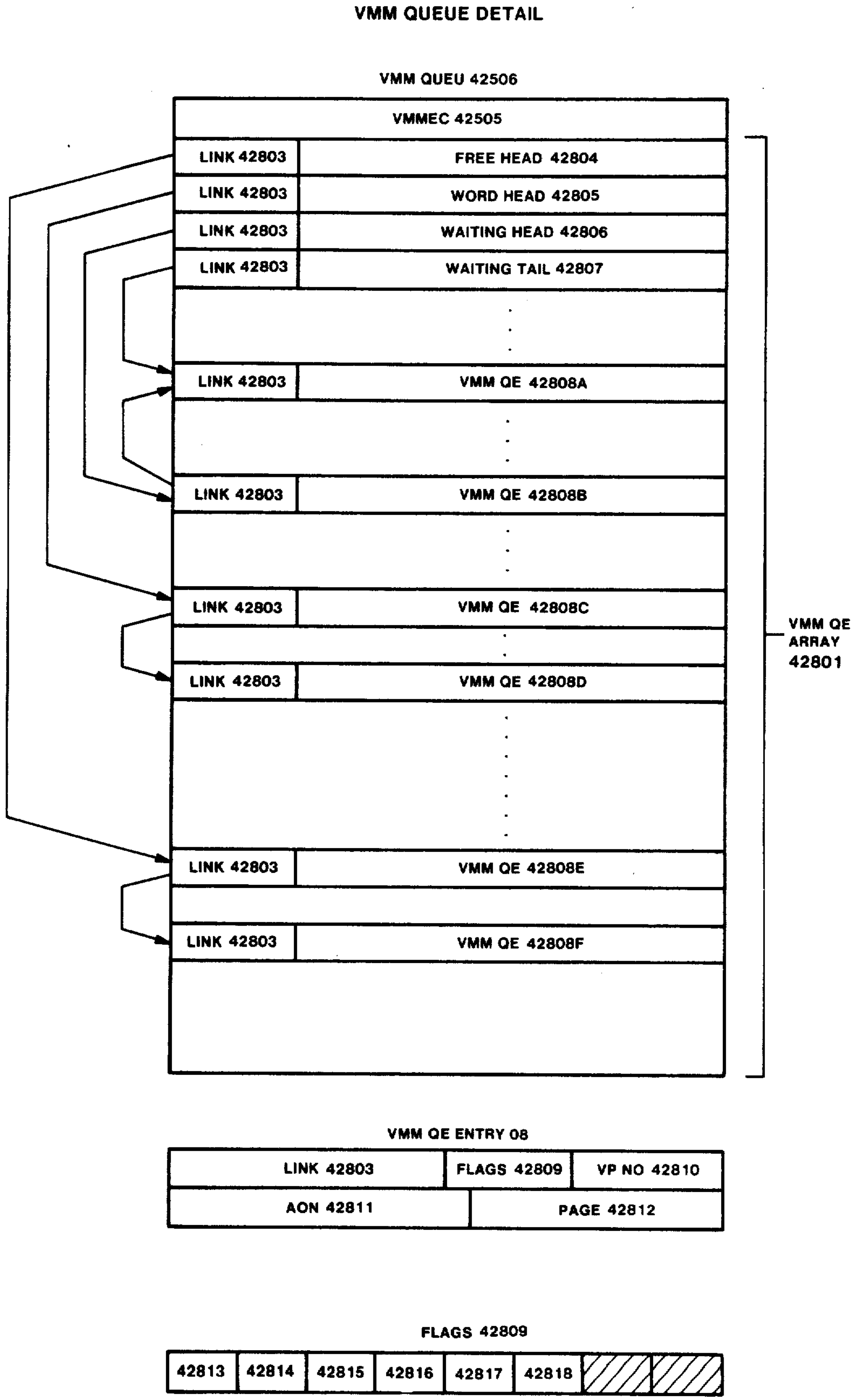
Figure 431:
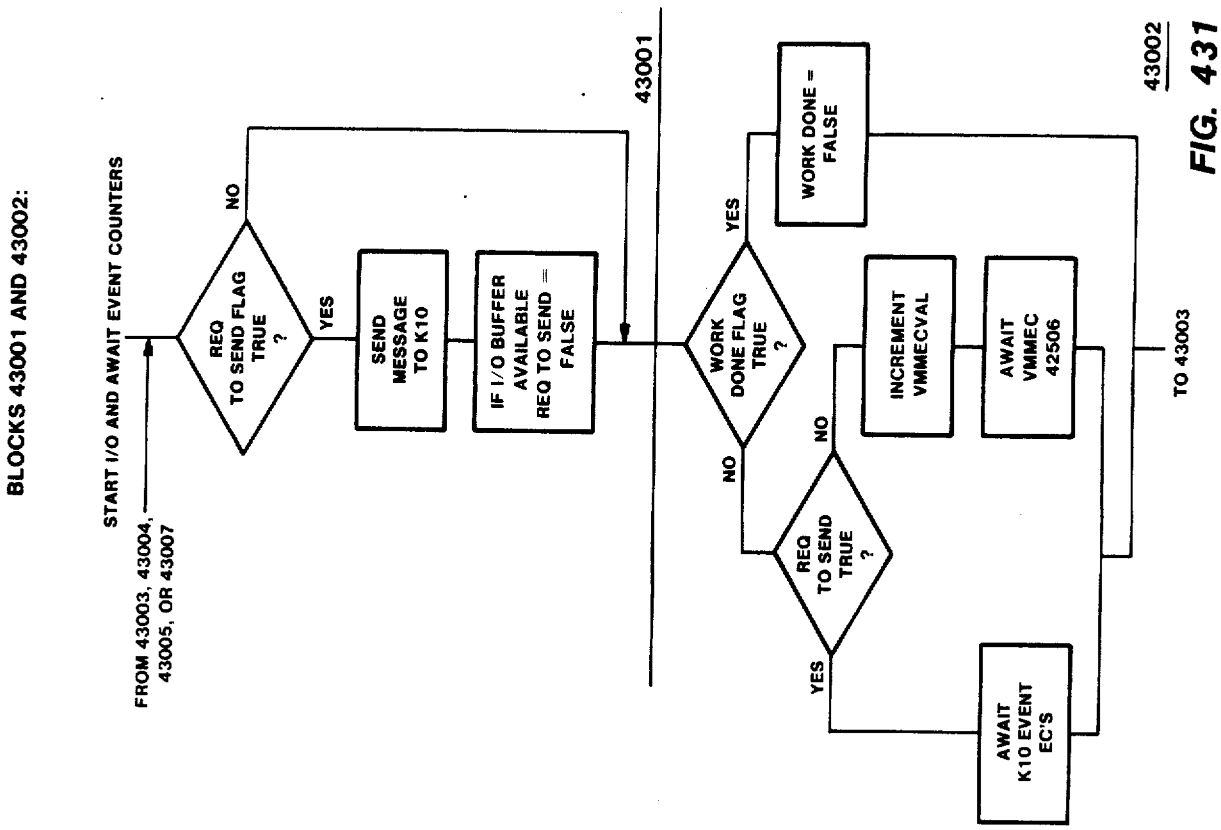
Figure 430:
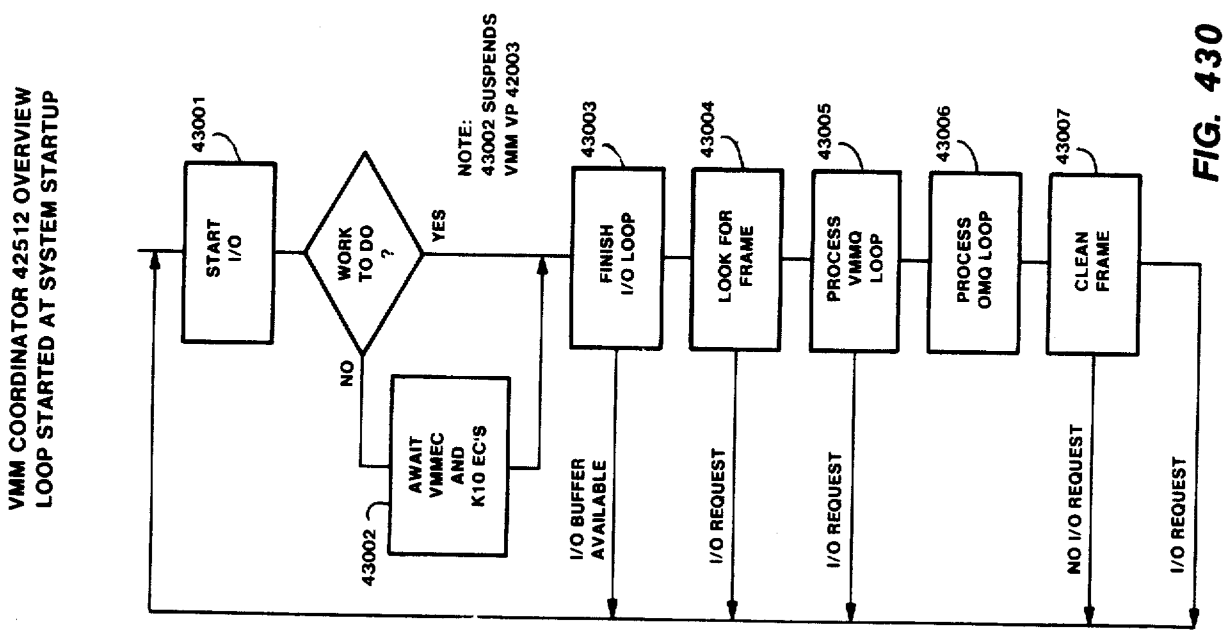
Figure 433:
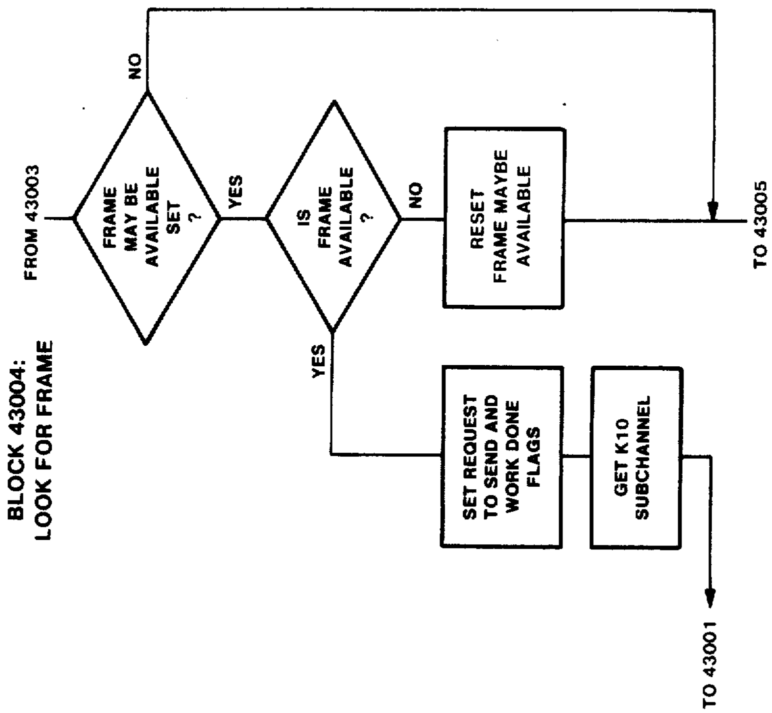
Figure 432:
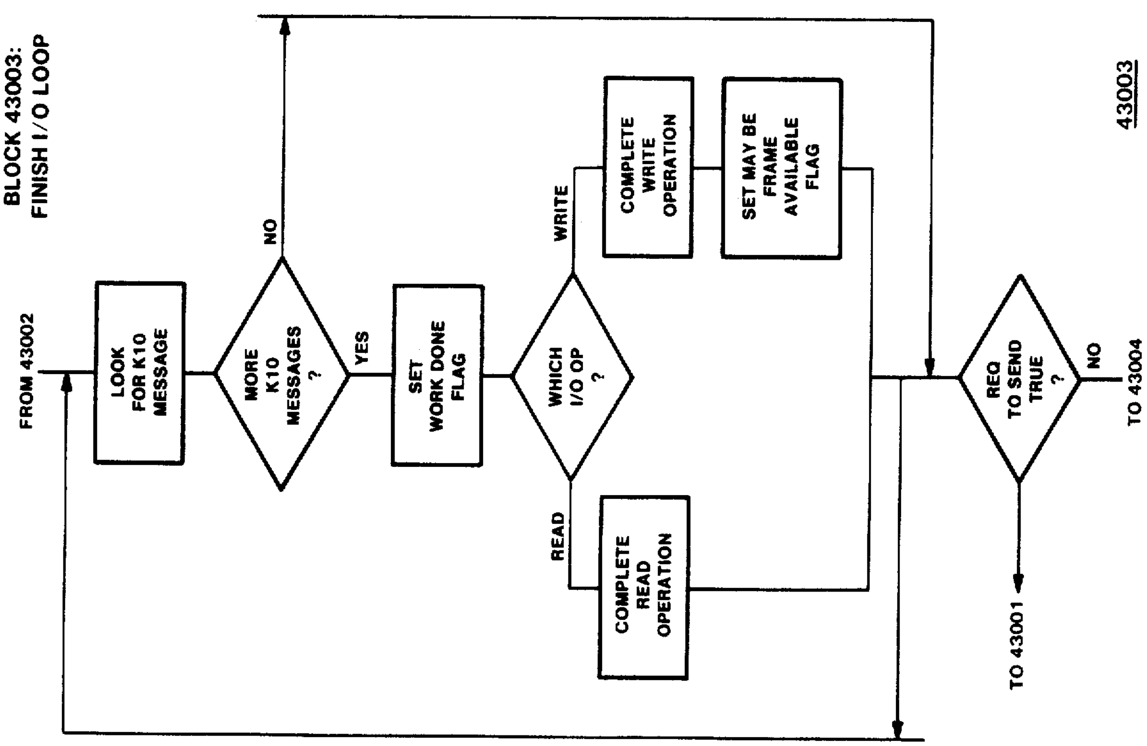
Figure 435:
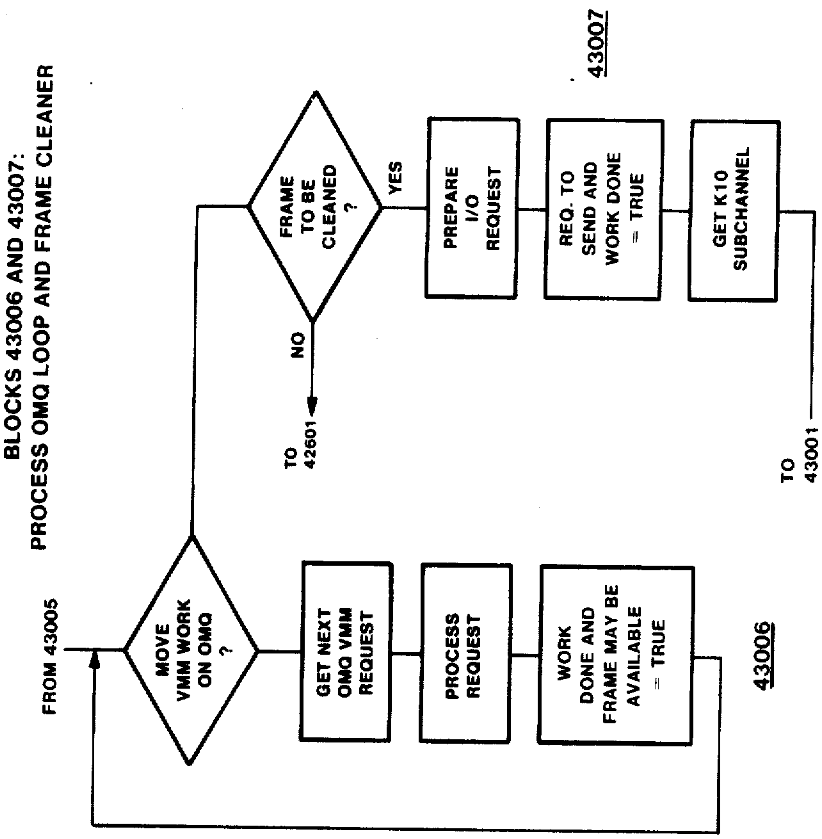
Figure 434:
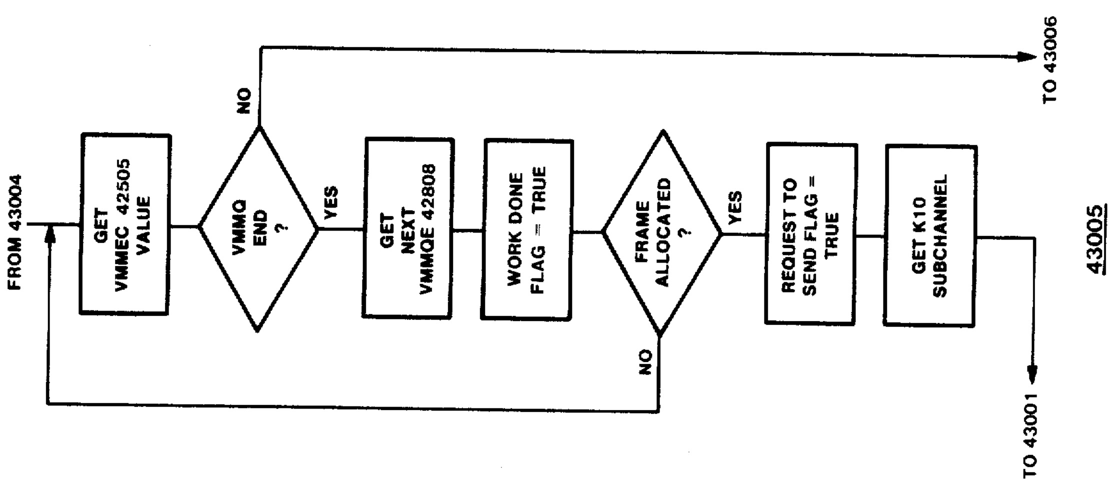
Figure 437:
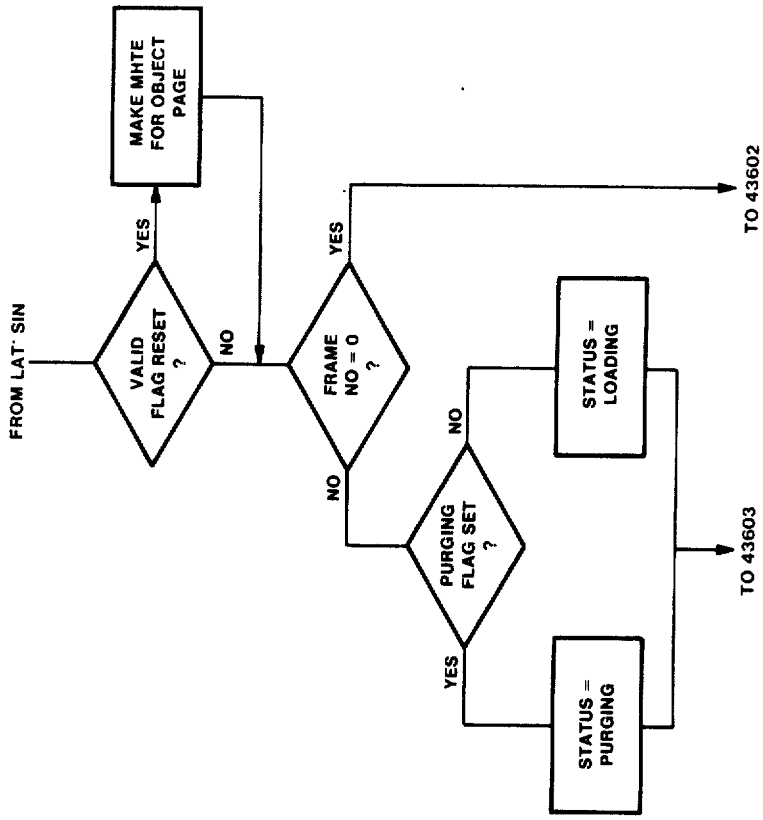
Figure 436:
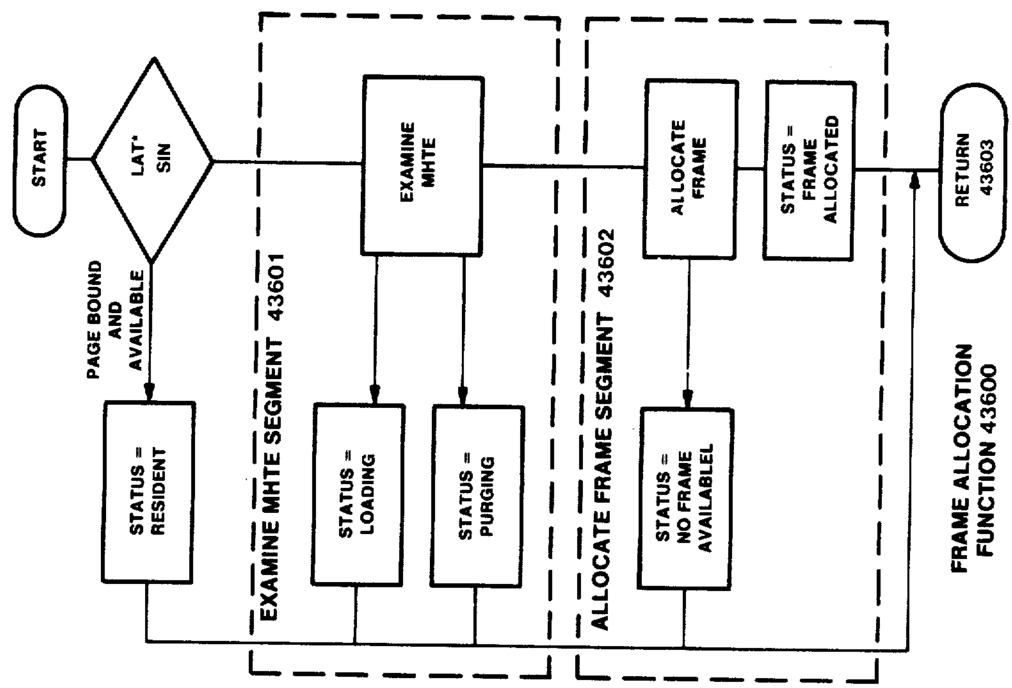
Figure 438:
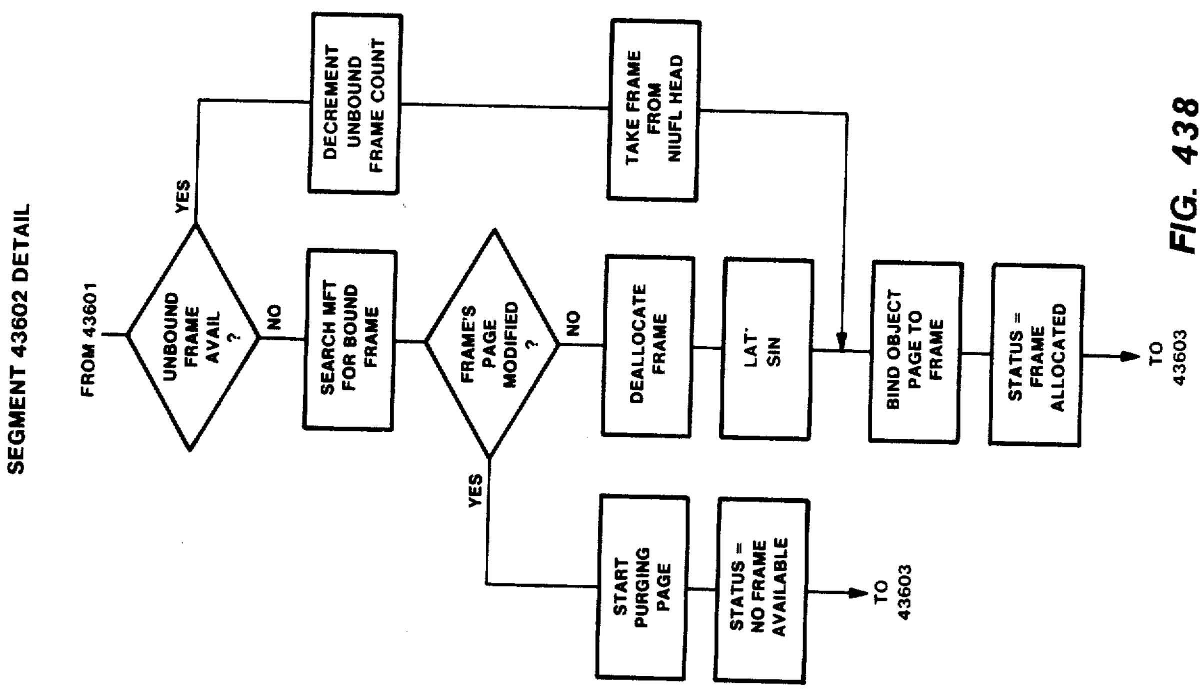
Figure 439:
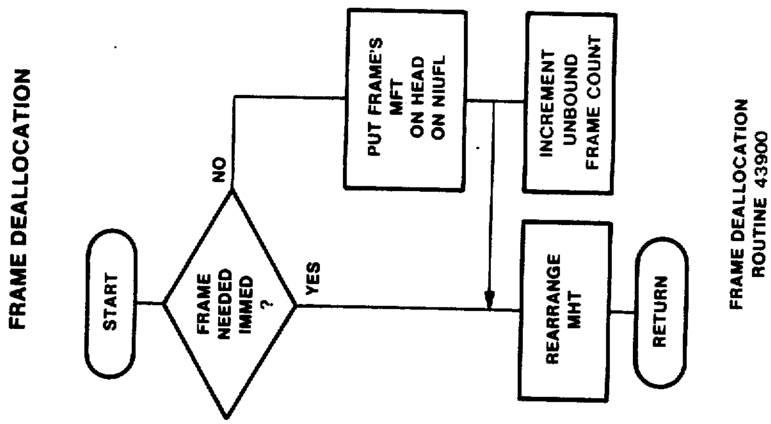
Figure 440:
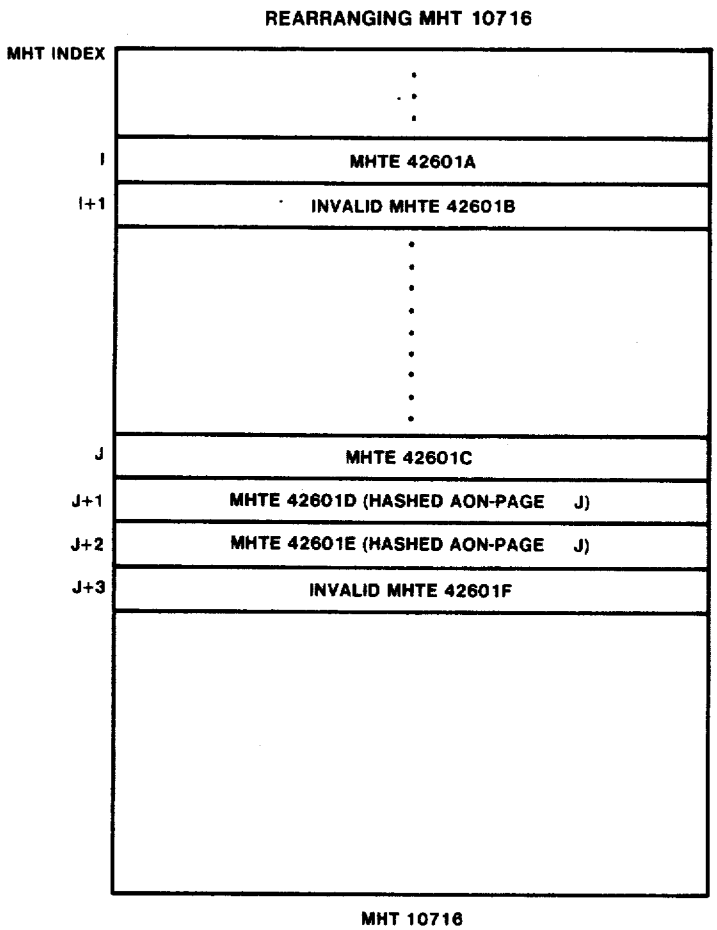

FIG. 420 is a diagram illustrating an active non-primitive access table entry;

FIG. 421 is a diagram illustrating an active primitive access matrix and an active primitive access matrix entry;

FIG. 422 is a diagram illustrating primitive data access checking;

FIG. 423 is a diagram illustrating object pages, memory frames, and address translation;

FIG. 424 is a diagram illustrating a conceptual overview of a virtual memory manager;

FIG. 425 is a diagram illustrating virtual memory manager components;

FIG. 426 is a diagram illustrating a memory hash table entry;

FIG. 427 is a diagram illustrating searching of a memory hash table;

FIG. 428 is a diagram illustrating a virtual memory manager queue;

FIG. 429 is a diagram illustrating detail of a memory frame table;

FIG. 430 is a diagram illustrating a conceptual overview of a virtual memory manager coordinator;

FIG. 431 is a diagram illustrating start I/O and await event counter blocks;

FIG. 432 is a diagram illustrating a finish I/O loop block;

FIG. 433 is a diagram illustrating a look for frame block;

FIG. 434 is a diagram illustrating a process virtual memory manager queue loop block;

FIG. 435 is a diagram illustrating a process object manager queue loop block and a clean frame block;

FIG. 436 is a diagram illustrating a frame allocation overview;

FIG. 437 is a diagram illustrating a detailed block 43601;

FIG. 438 is a diagram illustrating a detailed block 43602;

FIG. 439 is a diagram illustrating frame deallocation;

FIG. 440 is a diagram illustrating rearranging of a memory hash table;

FIGS. 441-446 are not used.

Figure 447:
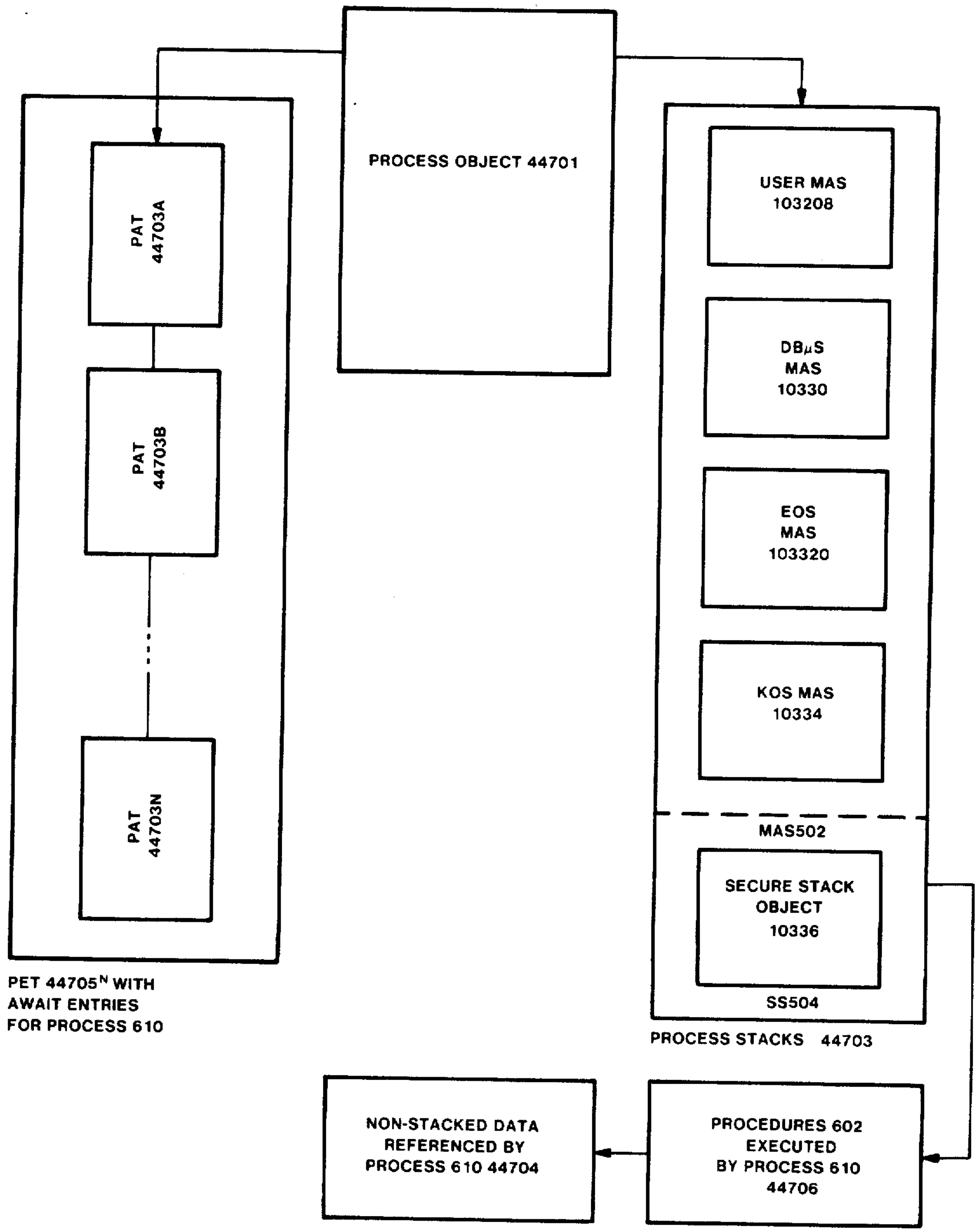
Figure 448:
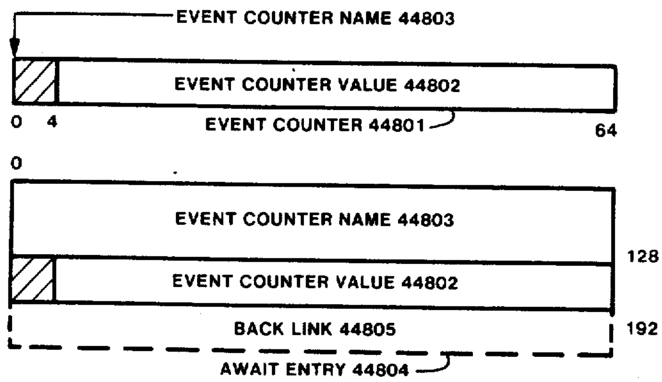
Figure 449:
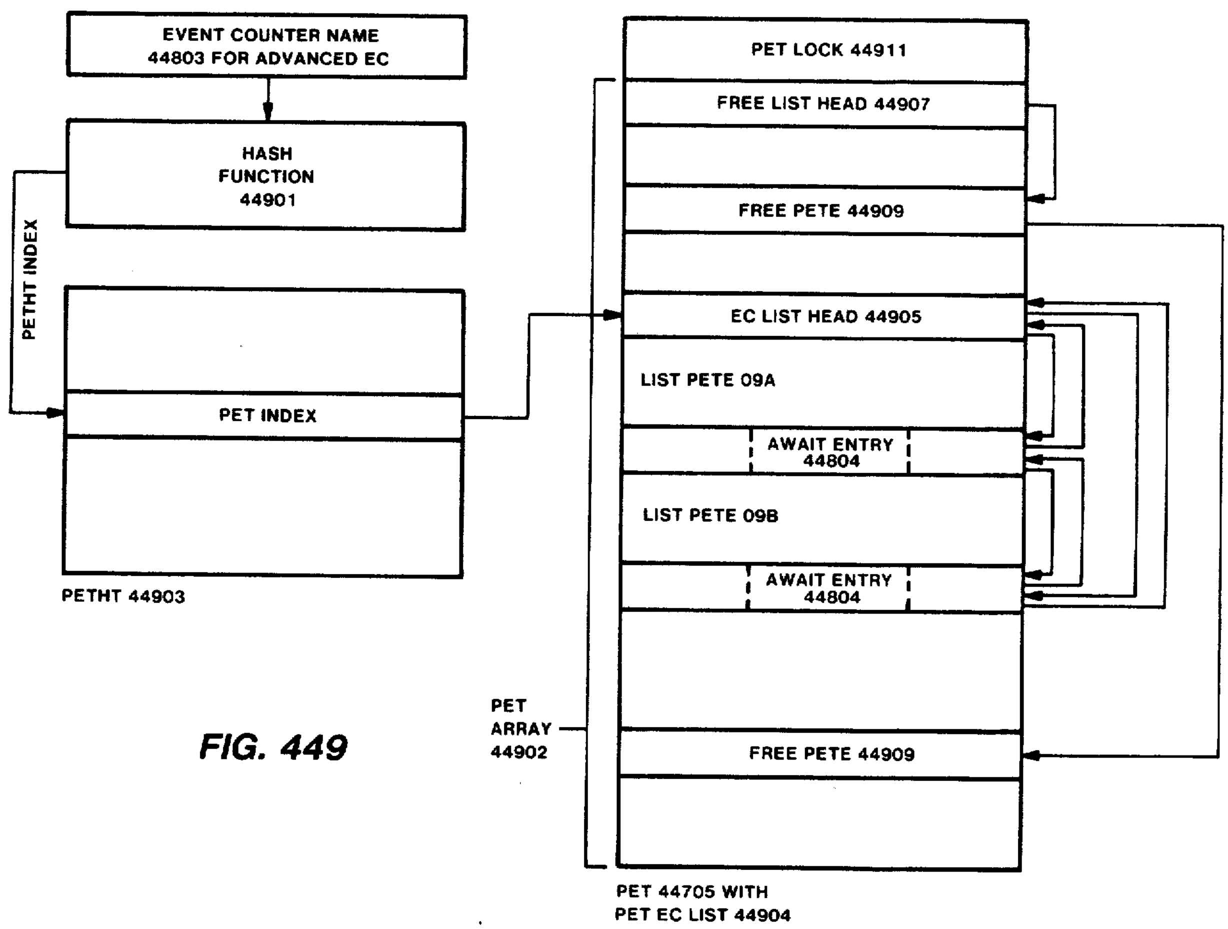
Figure 450:
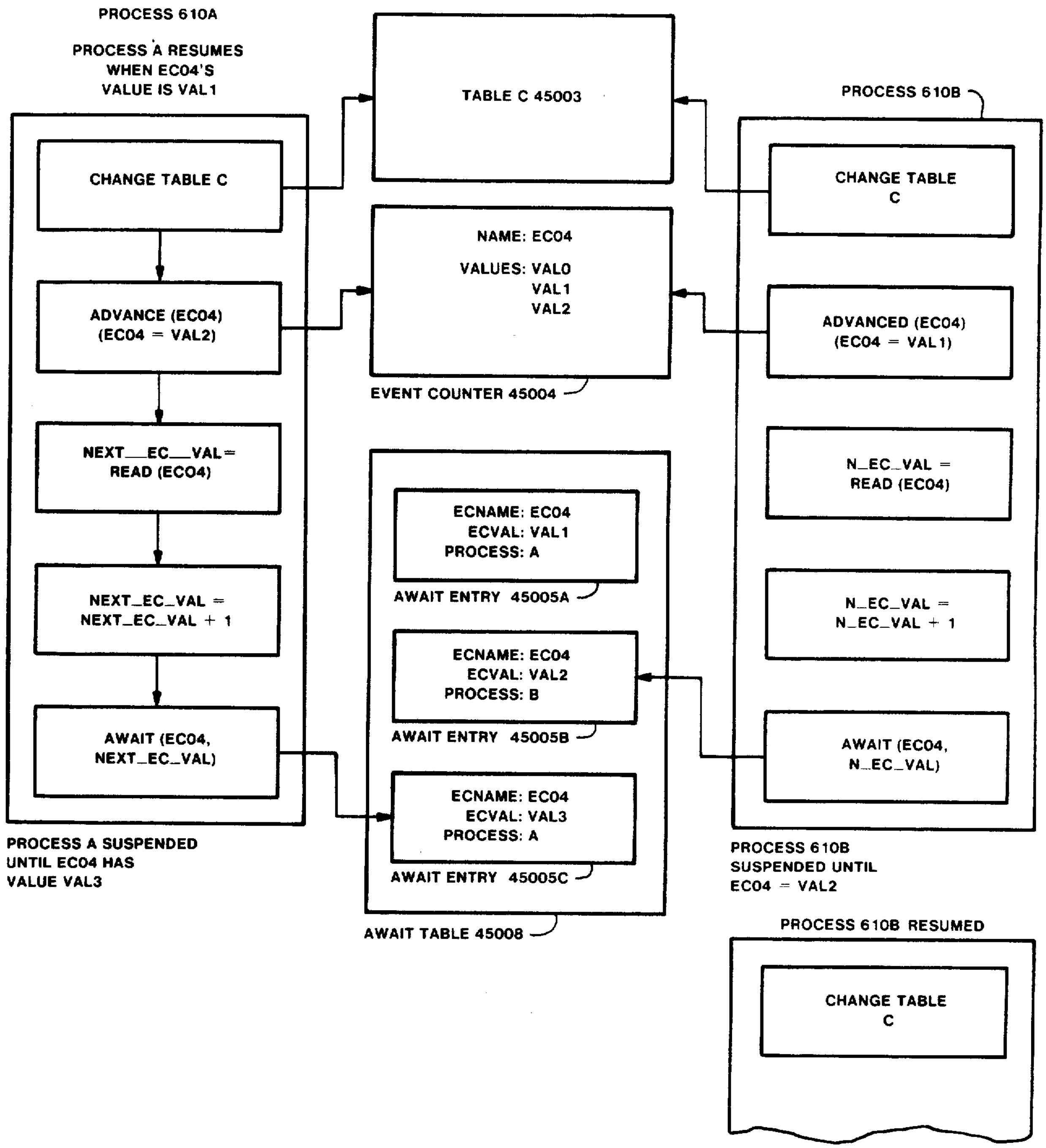
Figure 451:
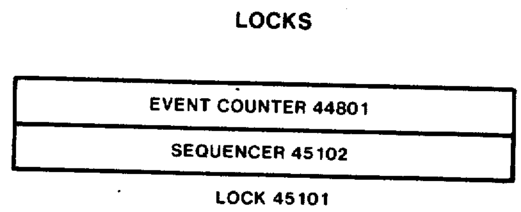
Figure 452:
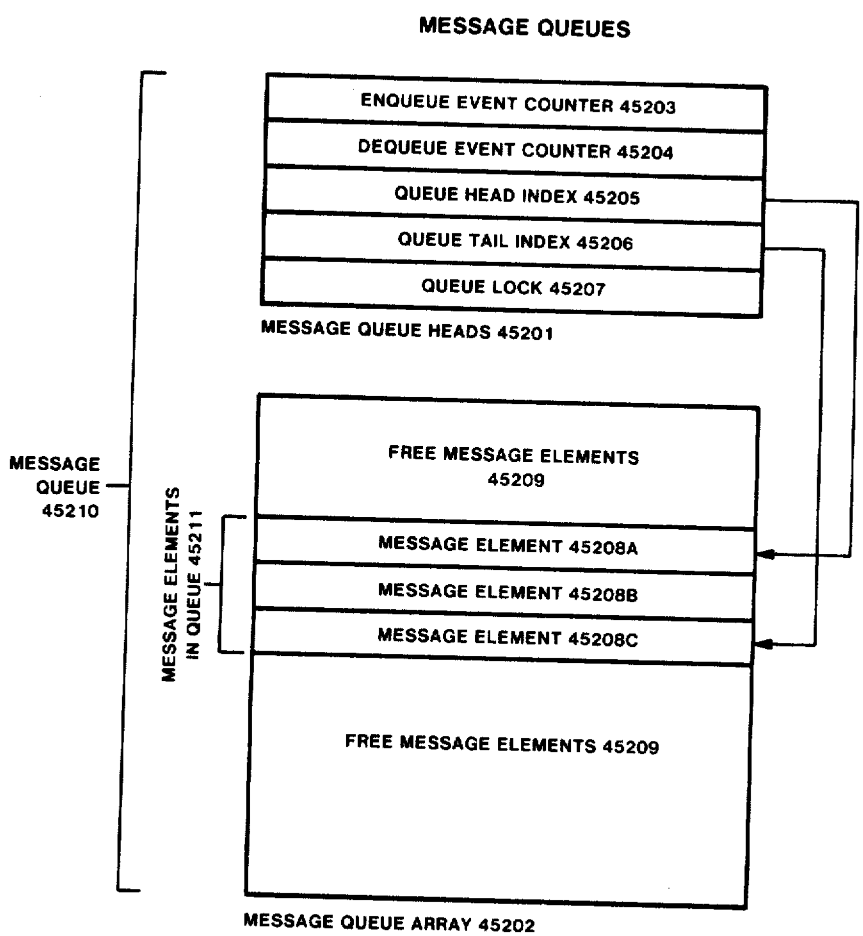
Figure 453:
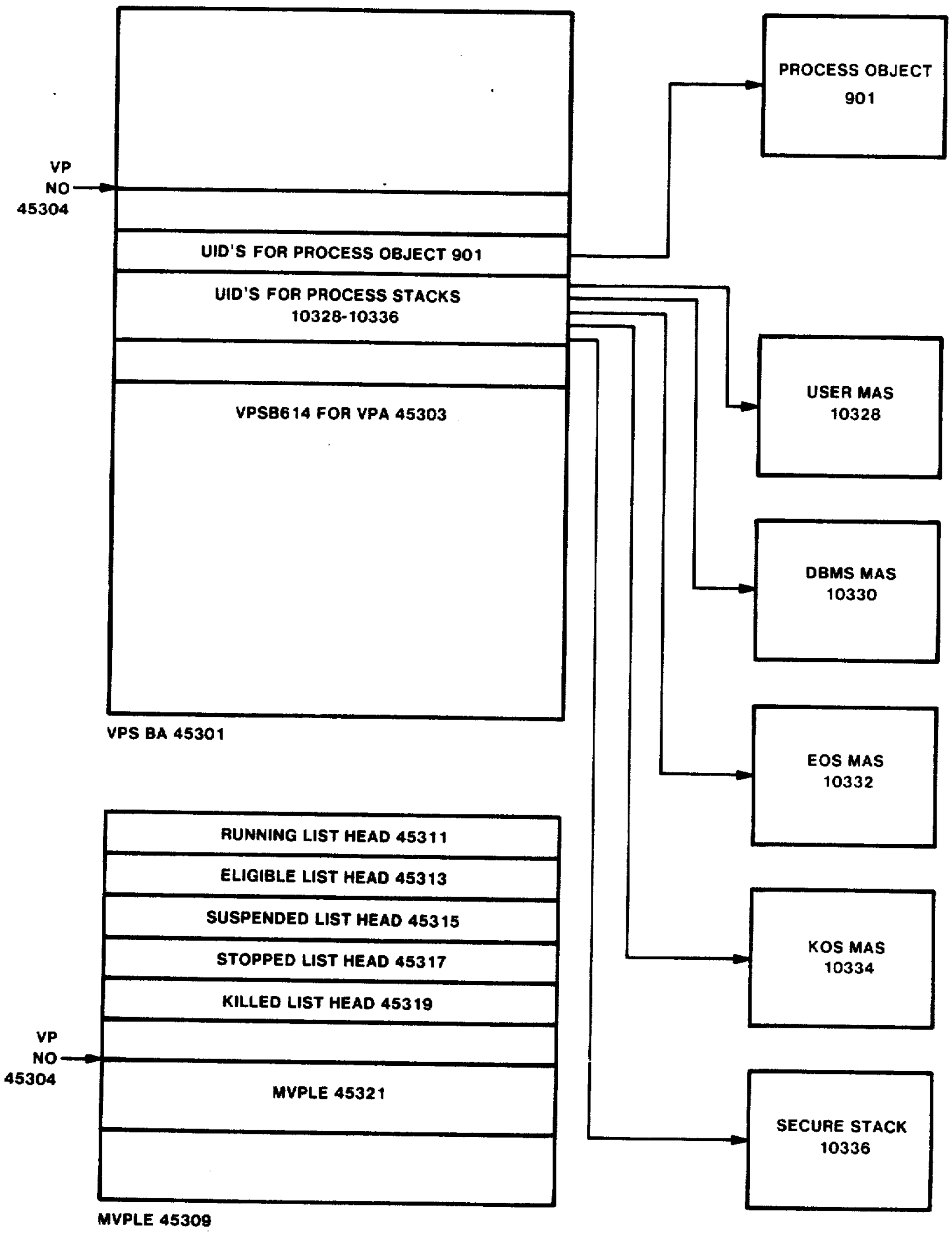
Figure 454:
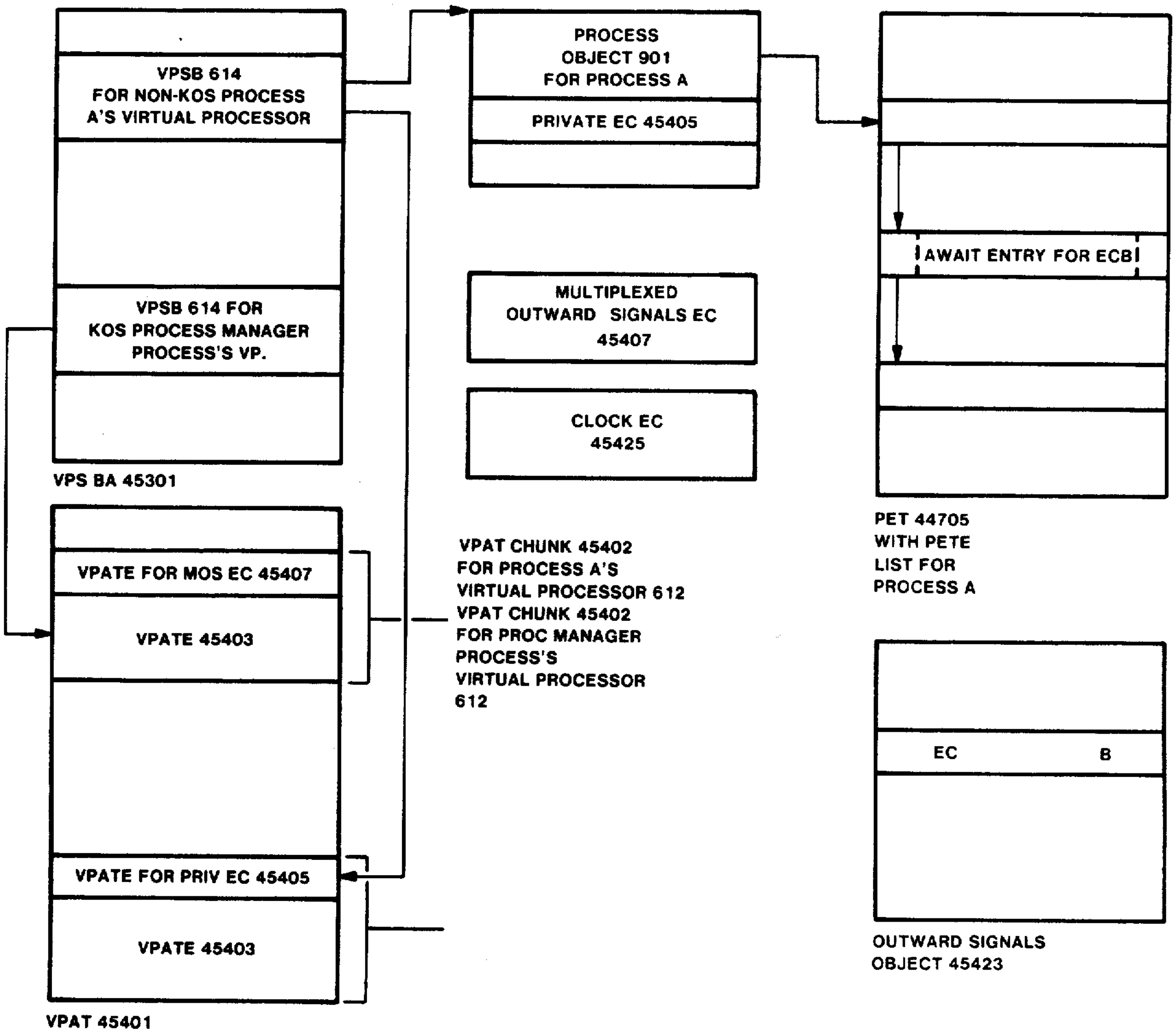
Figure 455:
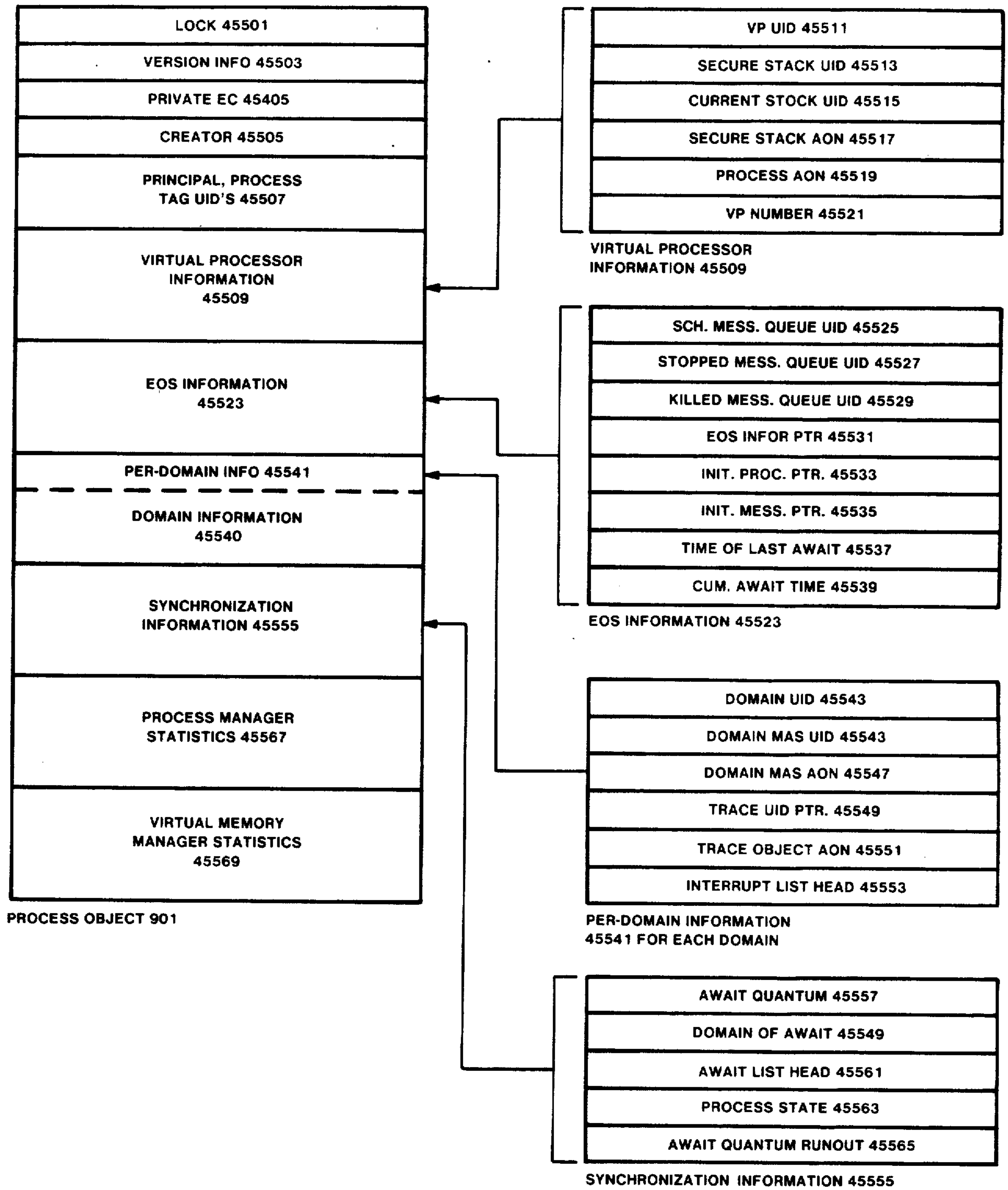
Figure 456:
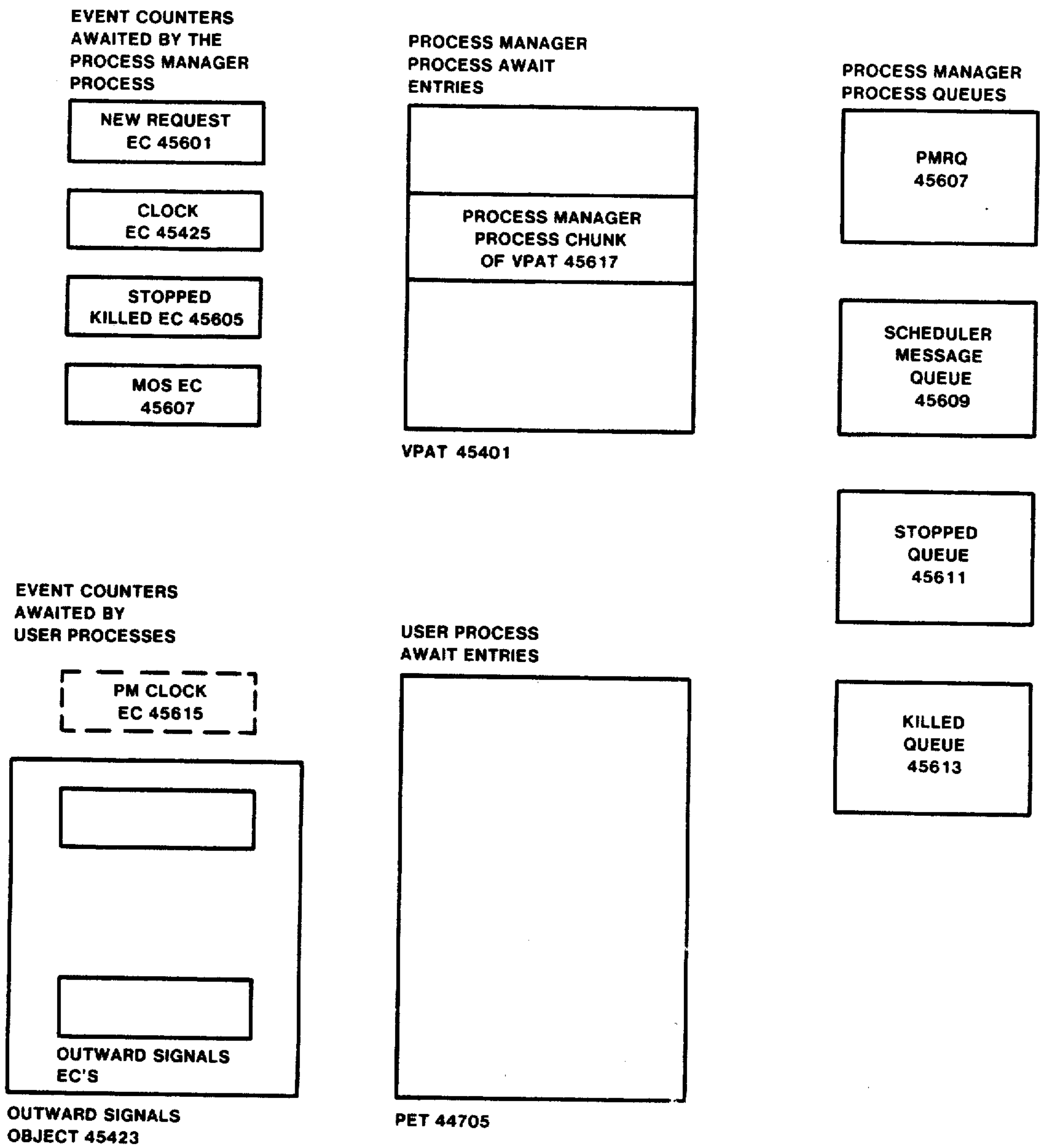
Figure 457:
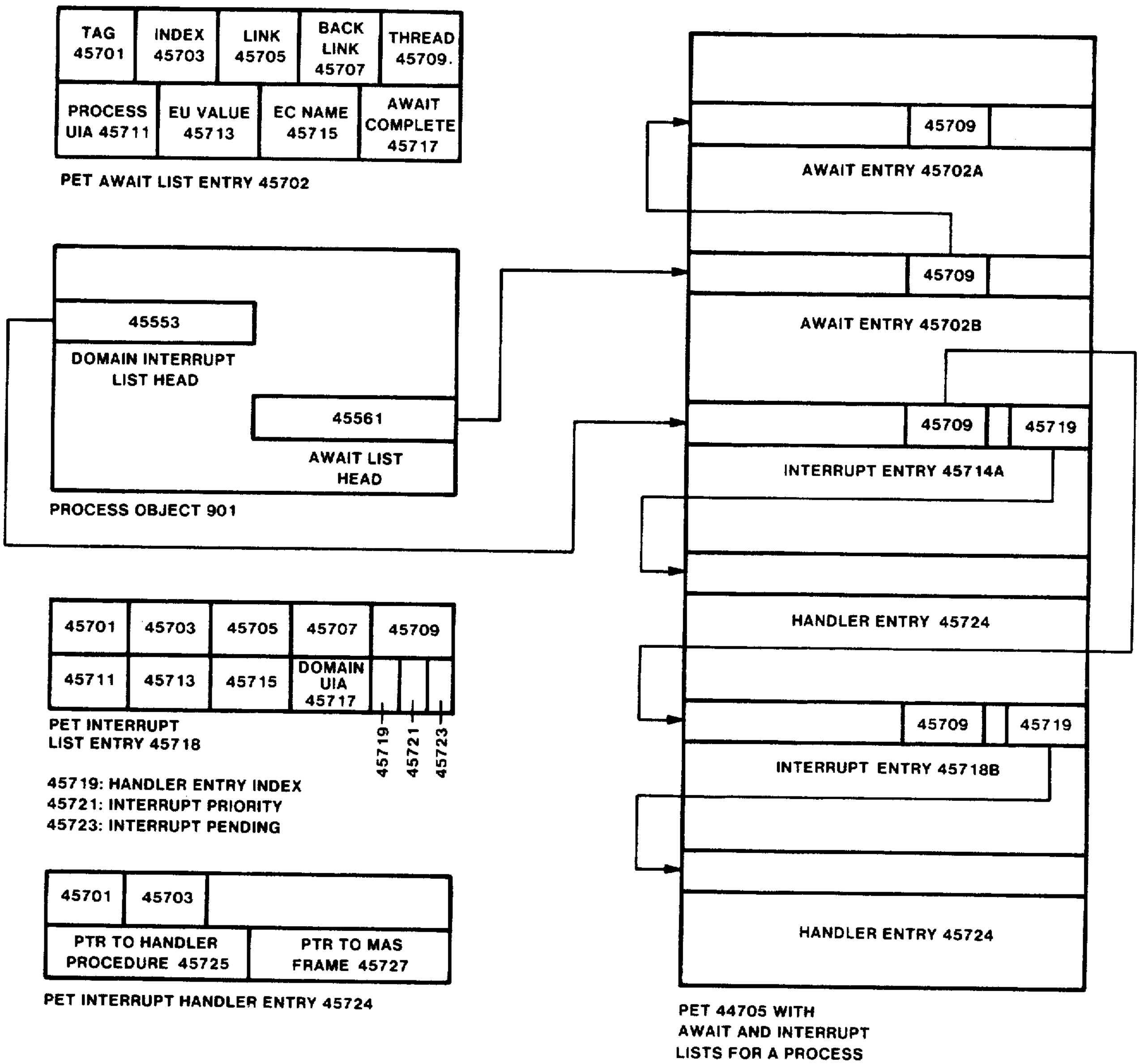
Figure 458:
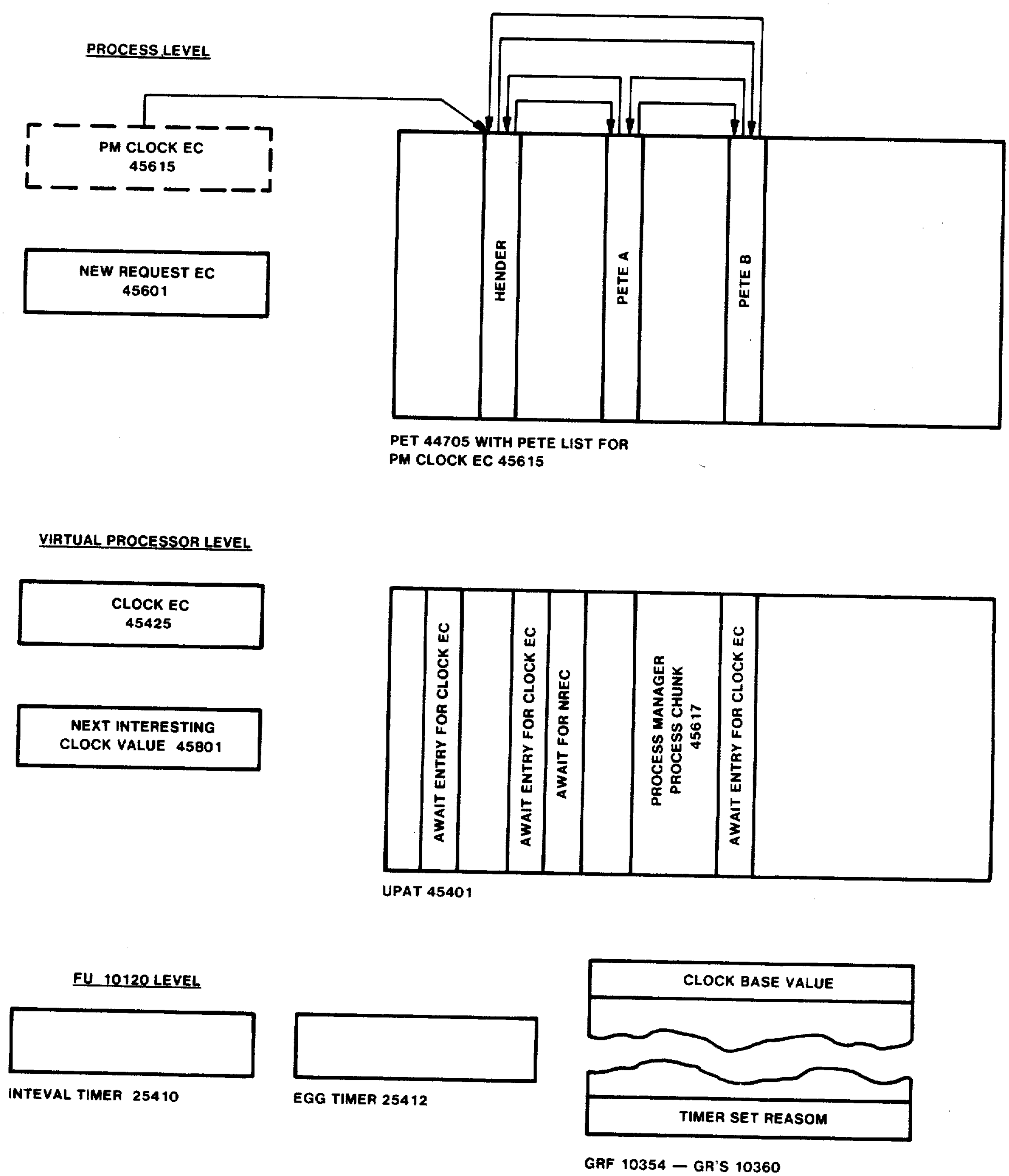
Figure 459:
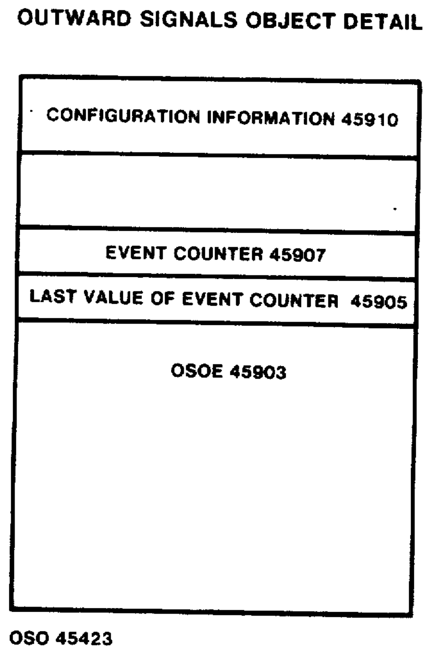
Figure 460:
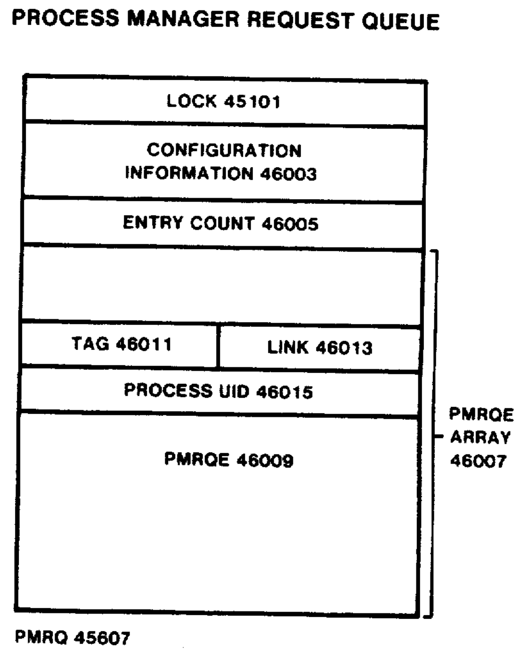
Figure 461:
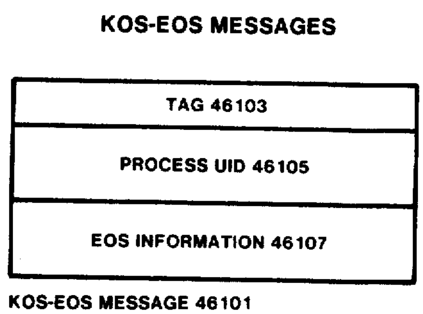
Figure 462:
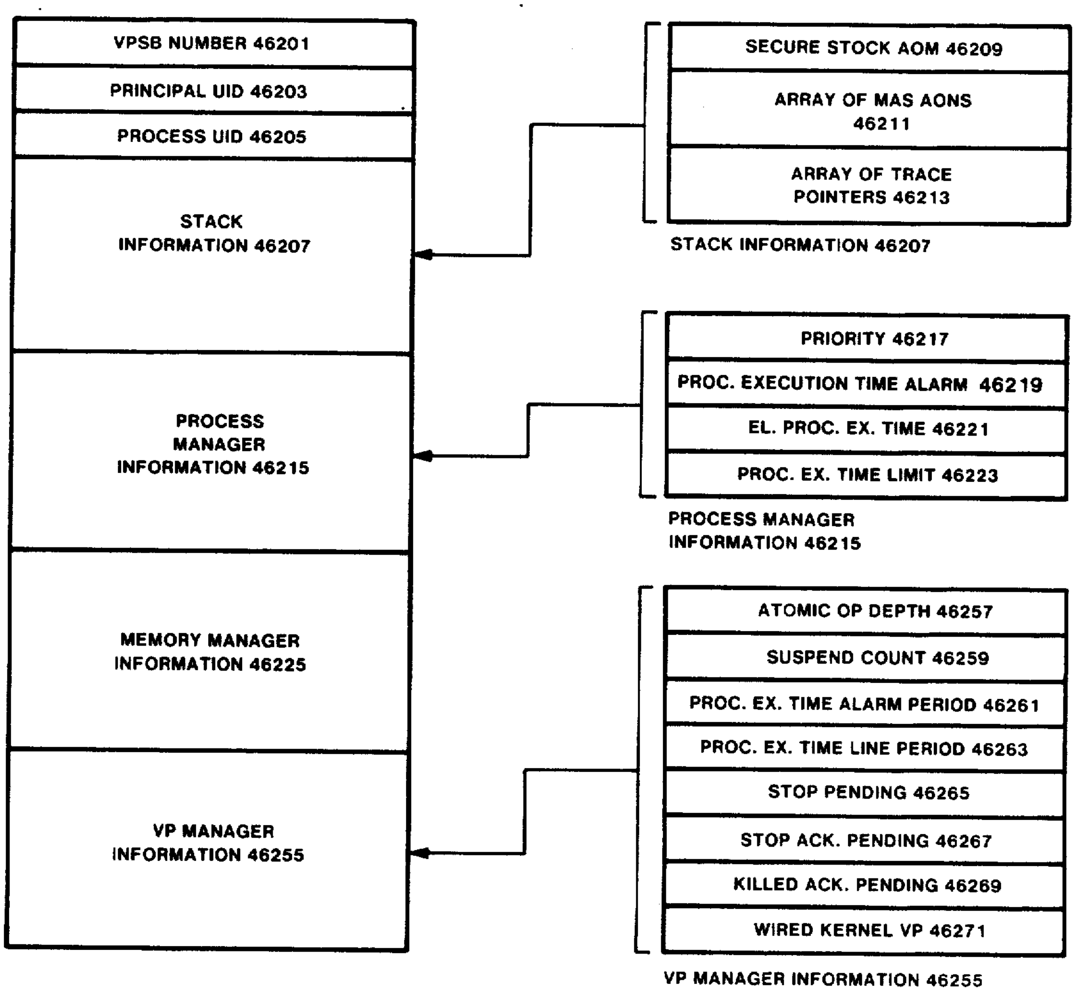
Figure 463:
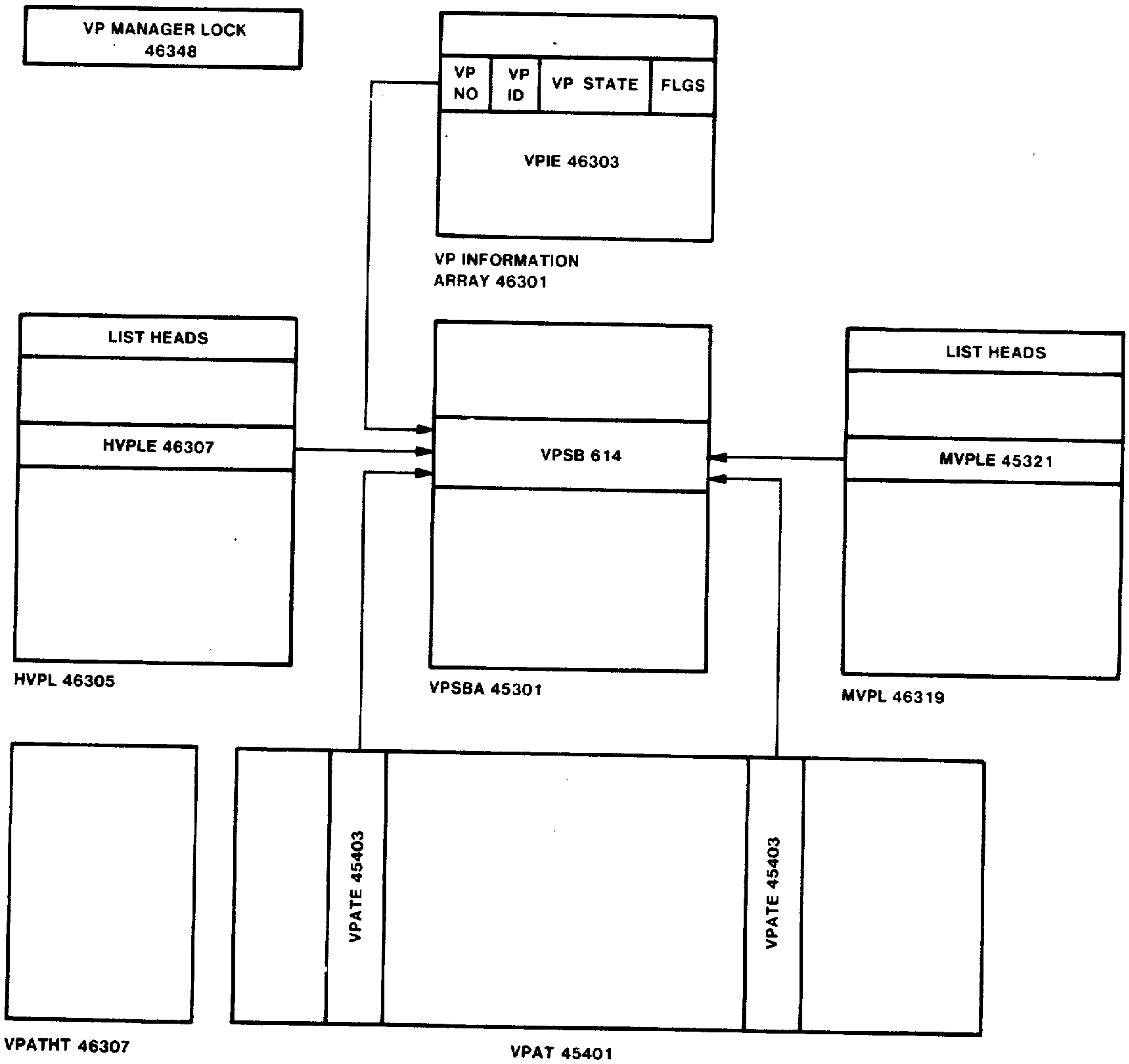
Figure 464:
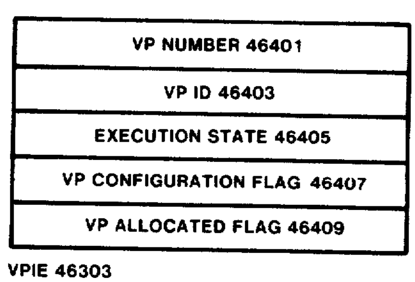
Figure 465:
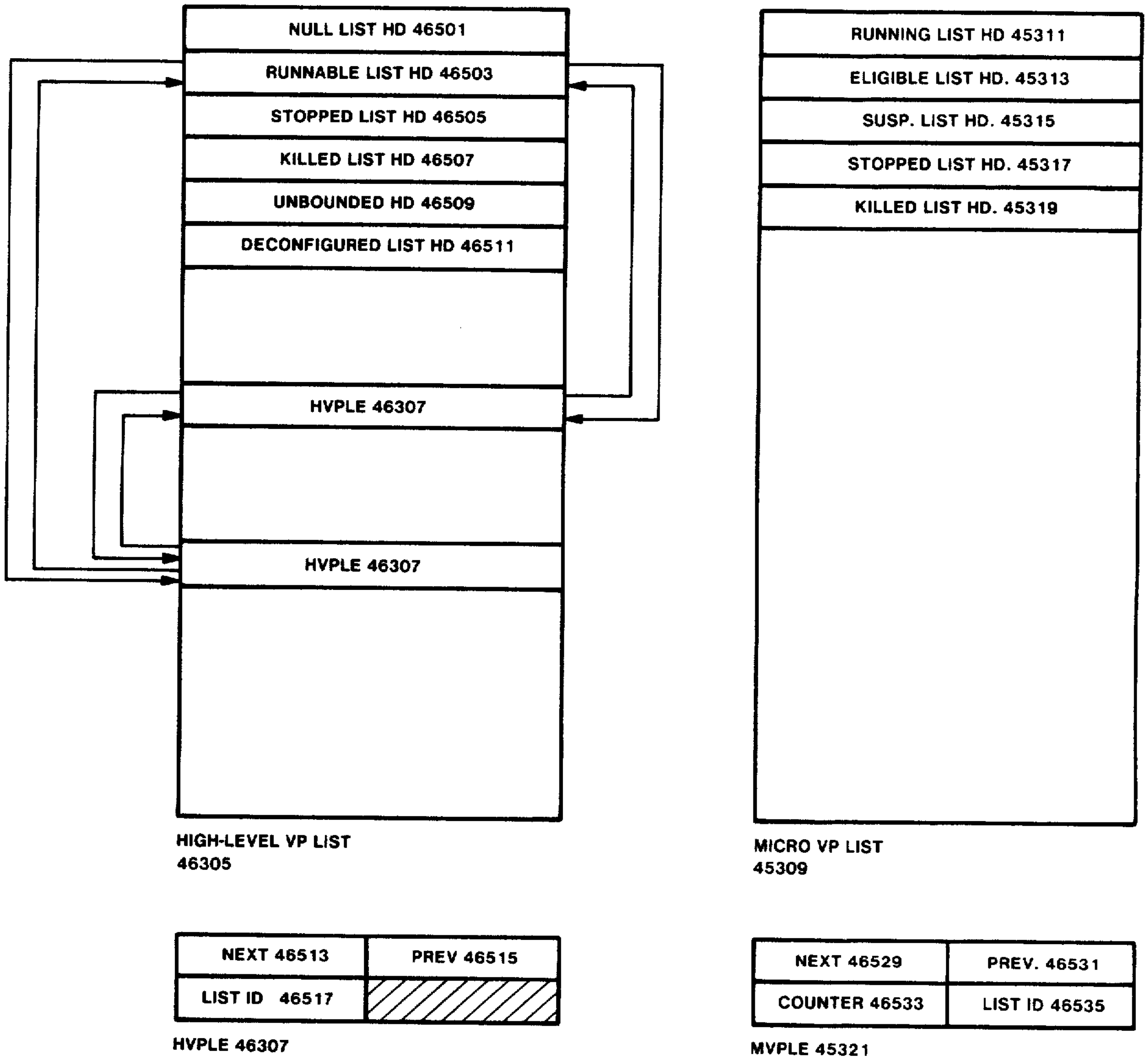
Figure 466:
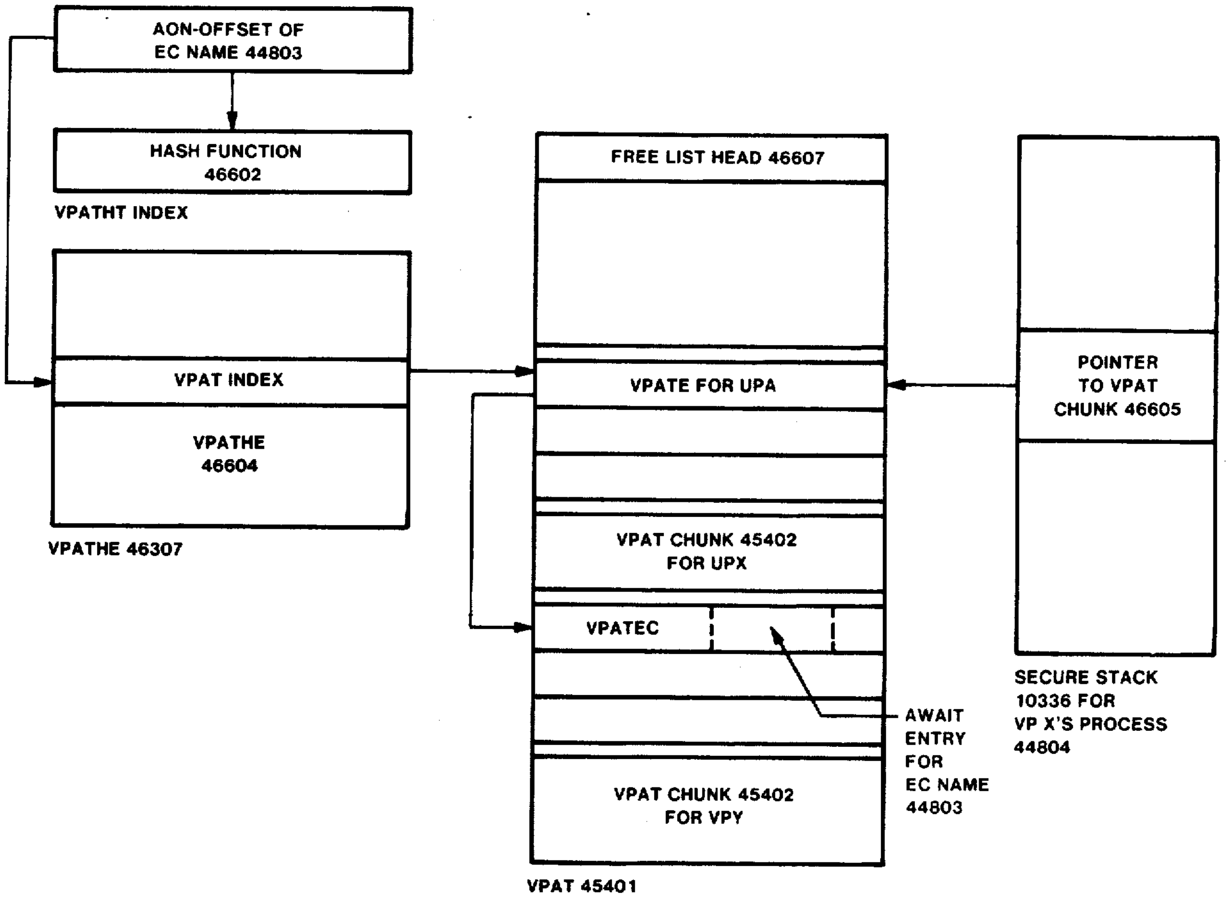
Figure 467:
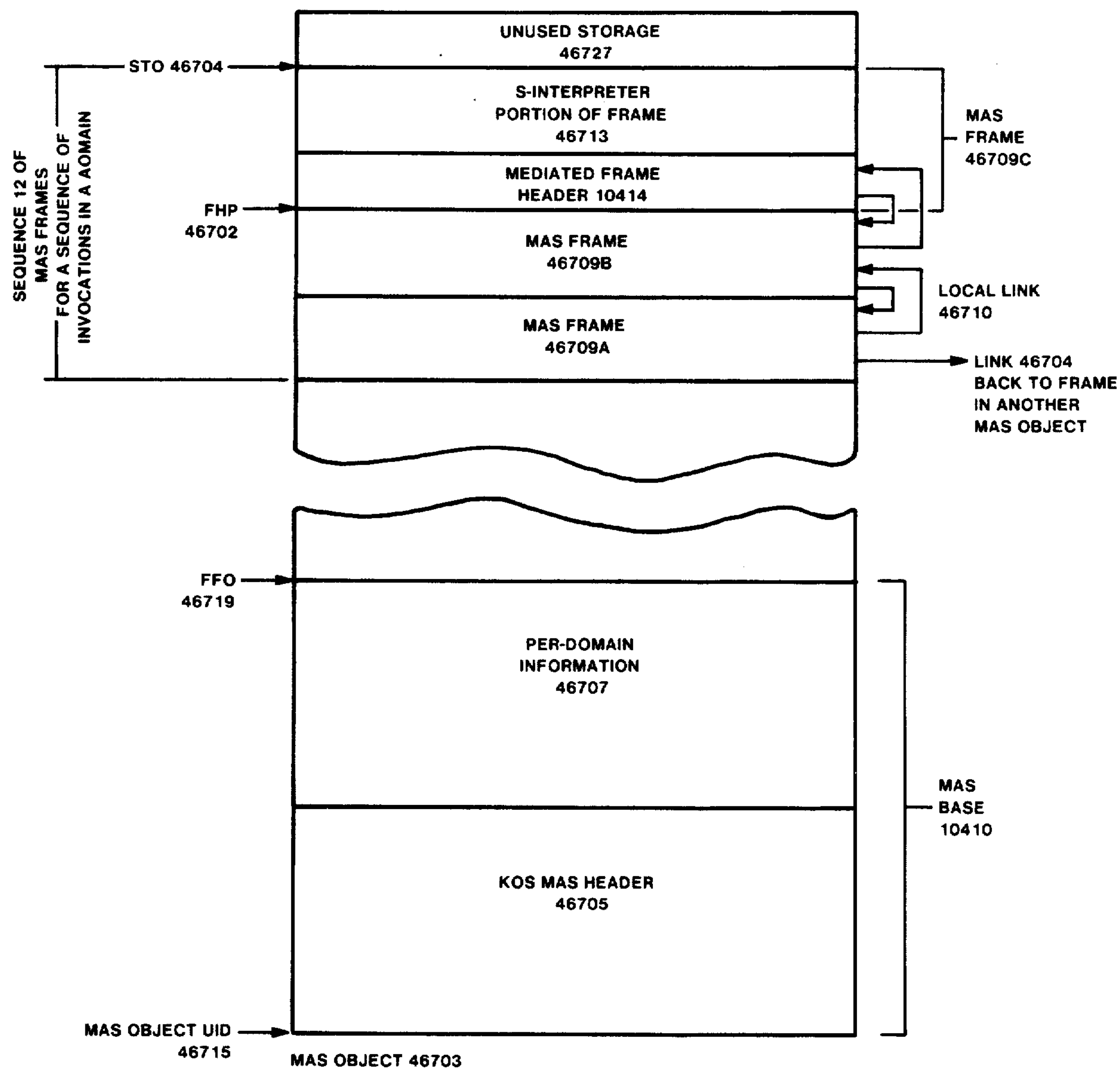
Figure 468:
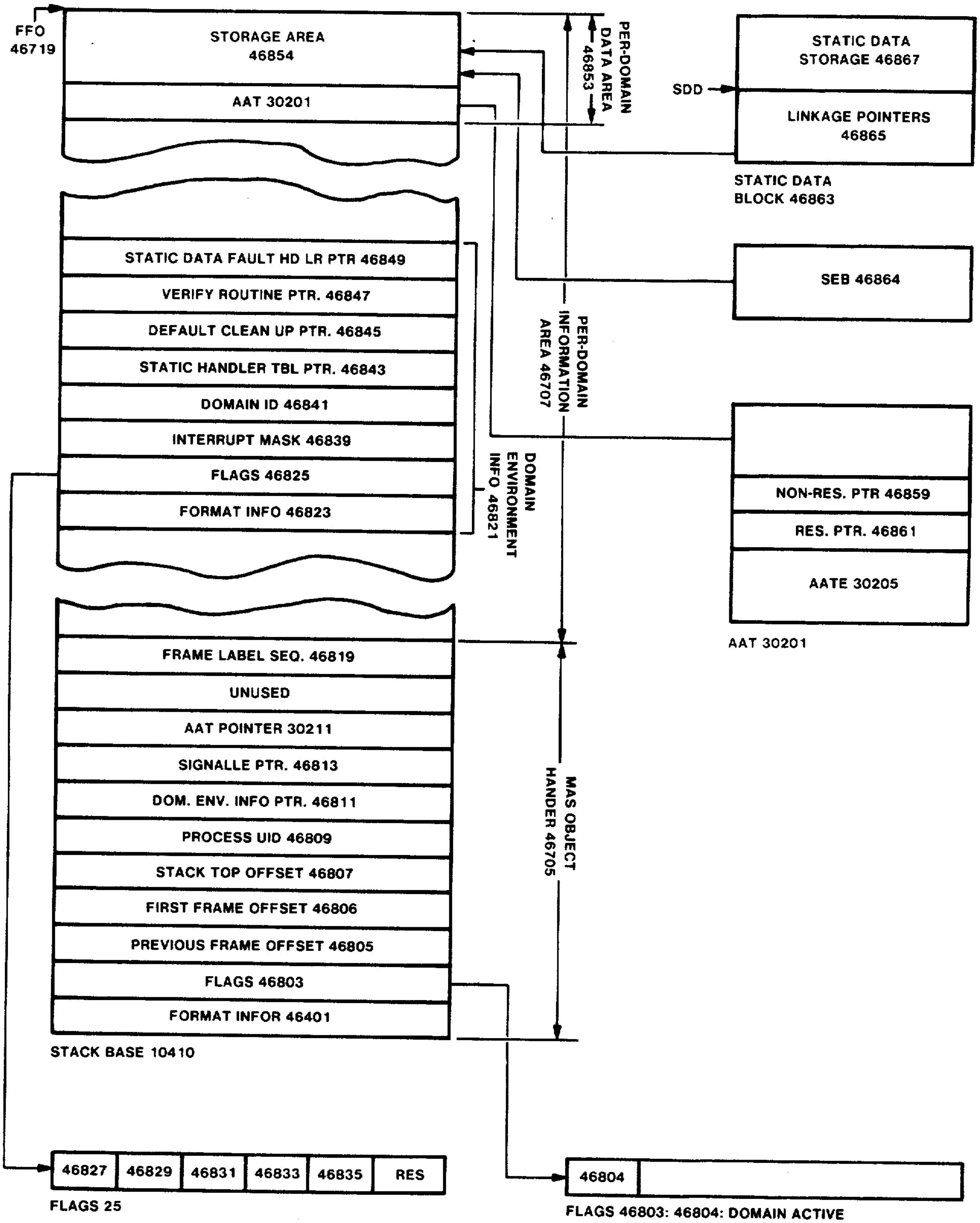
Figure 469:
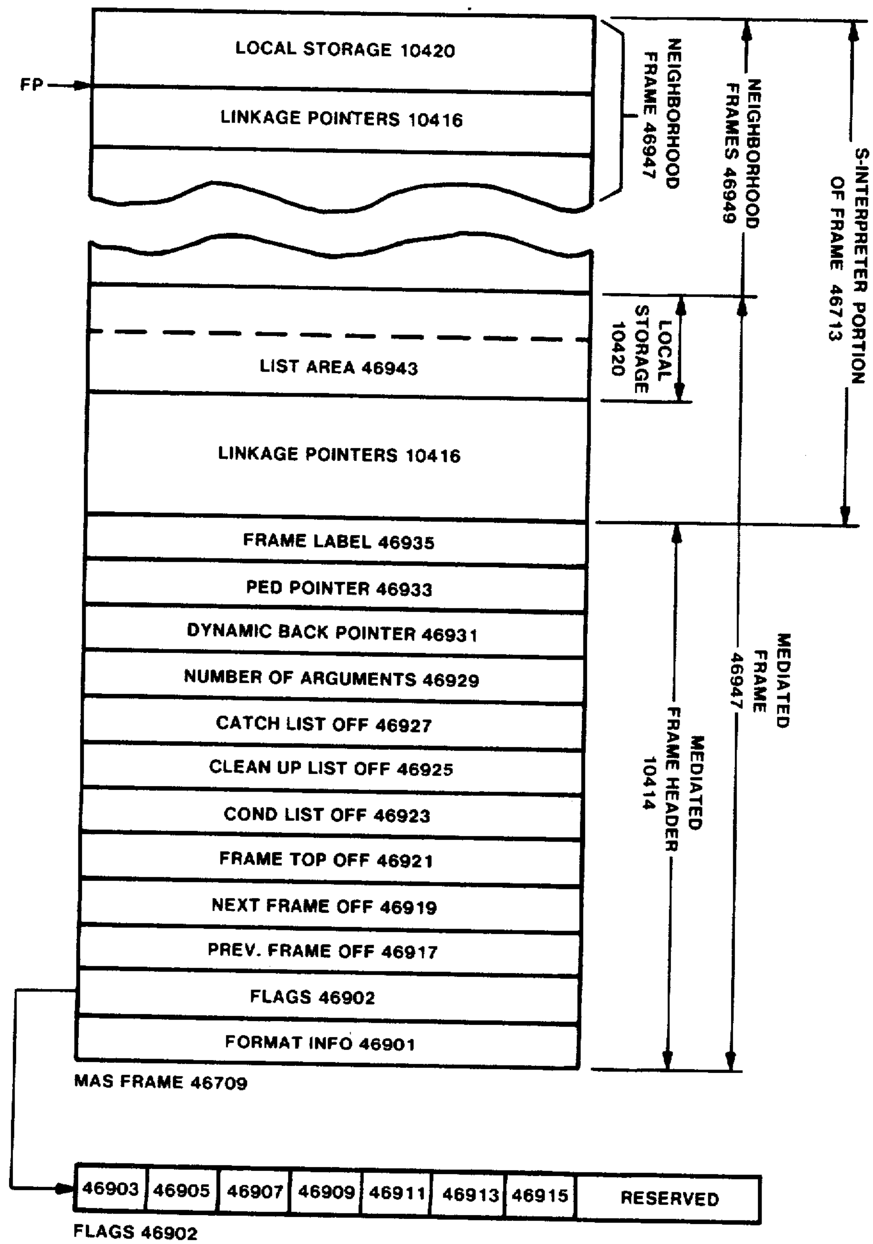
Figure 470:
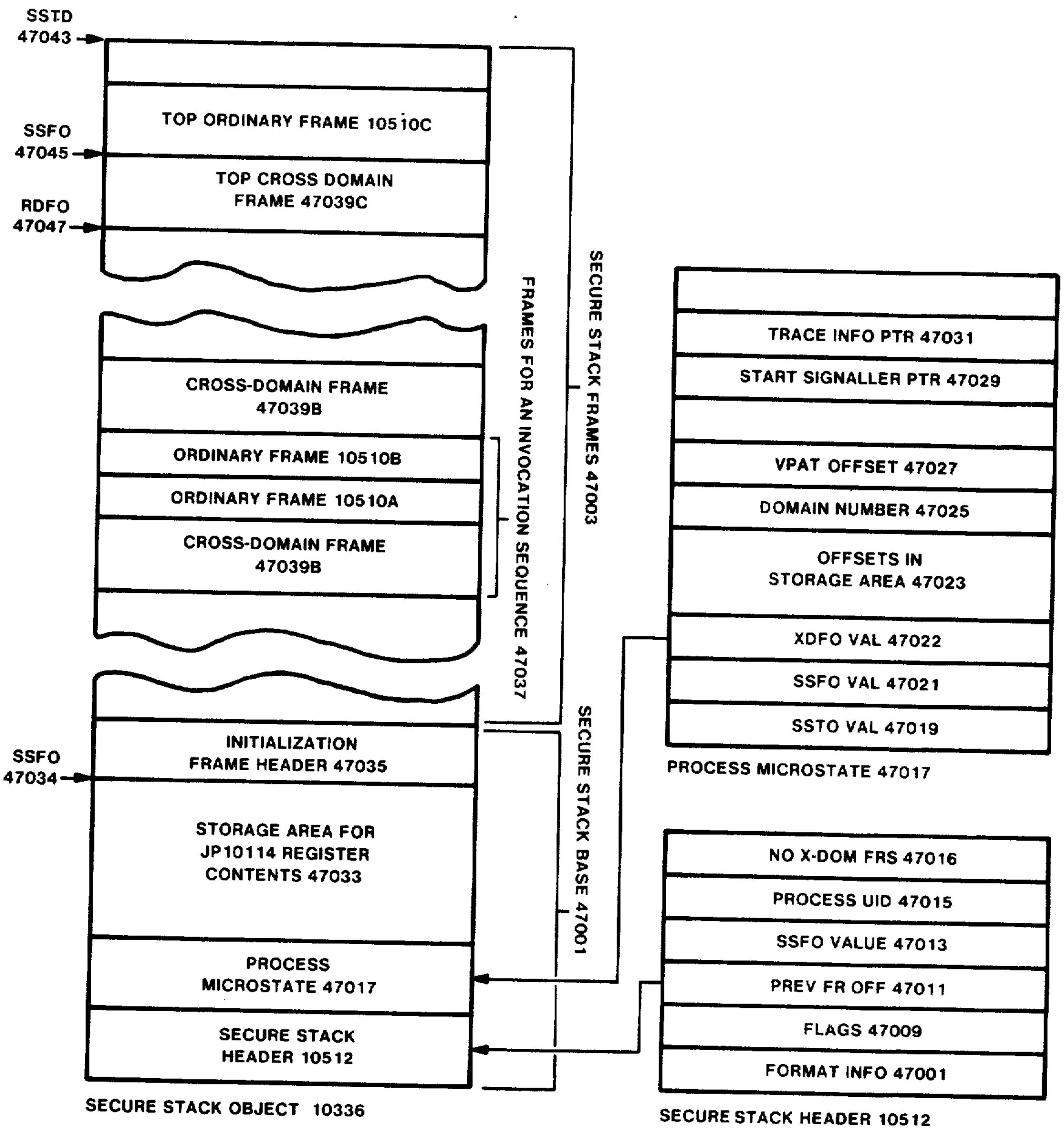
Figure 471:
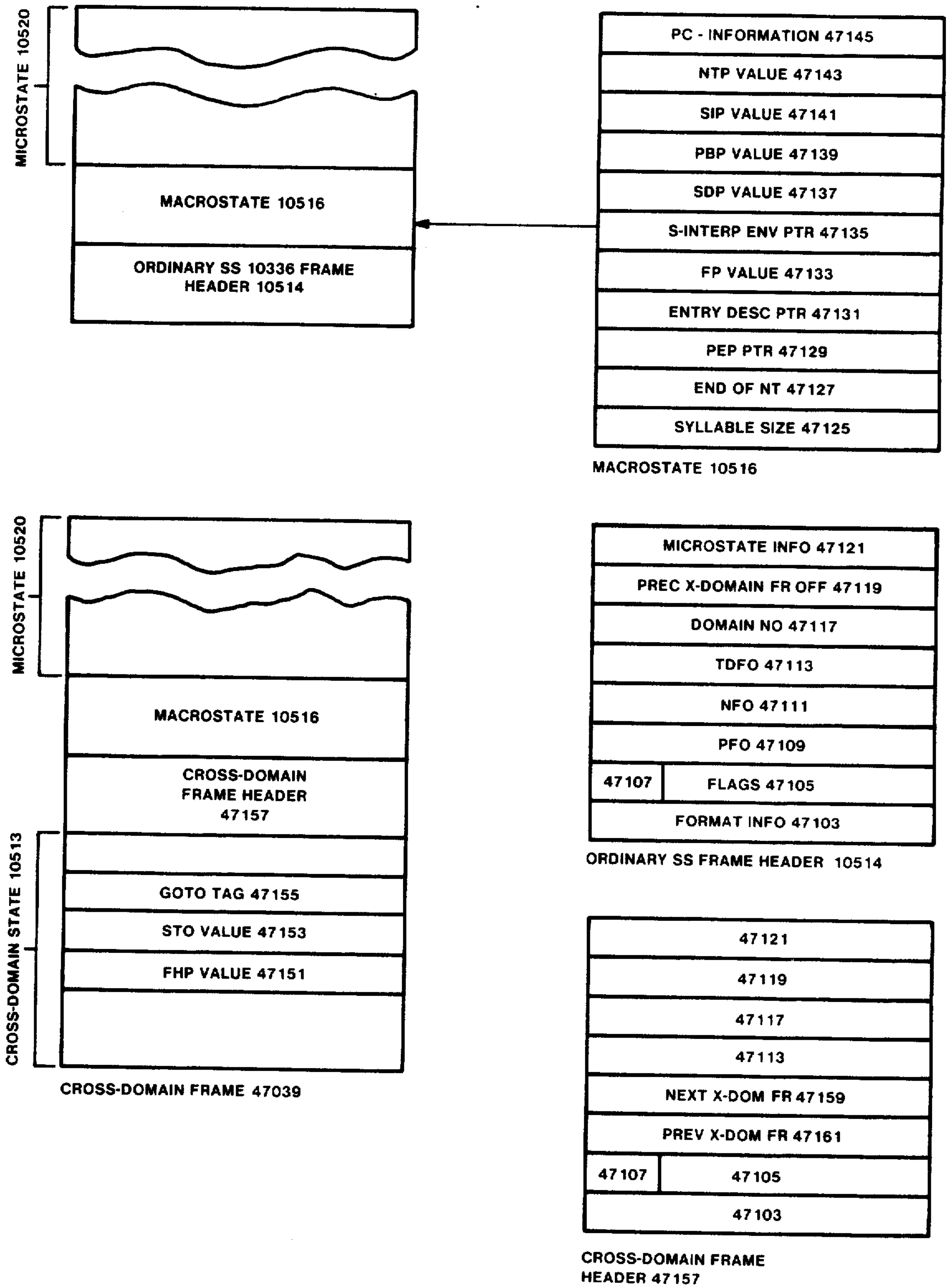
Figure 472:
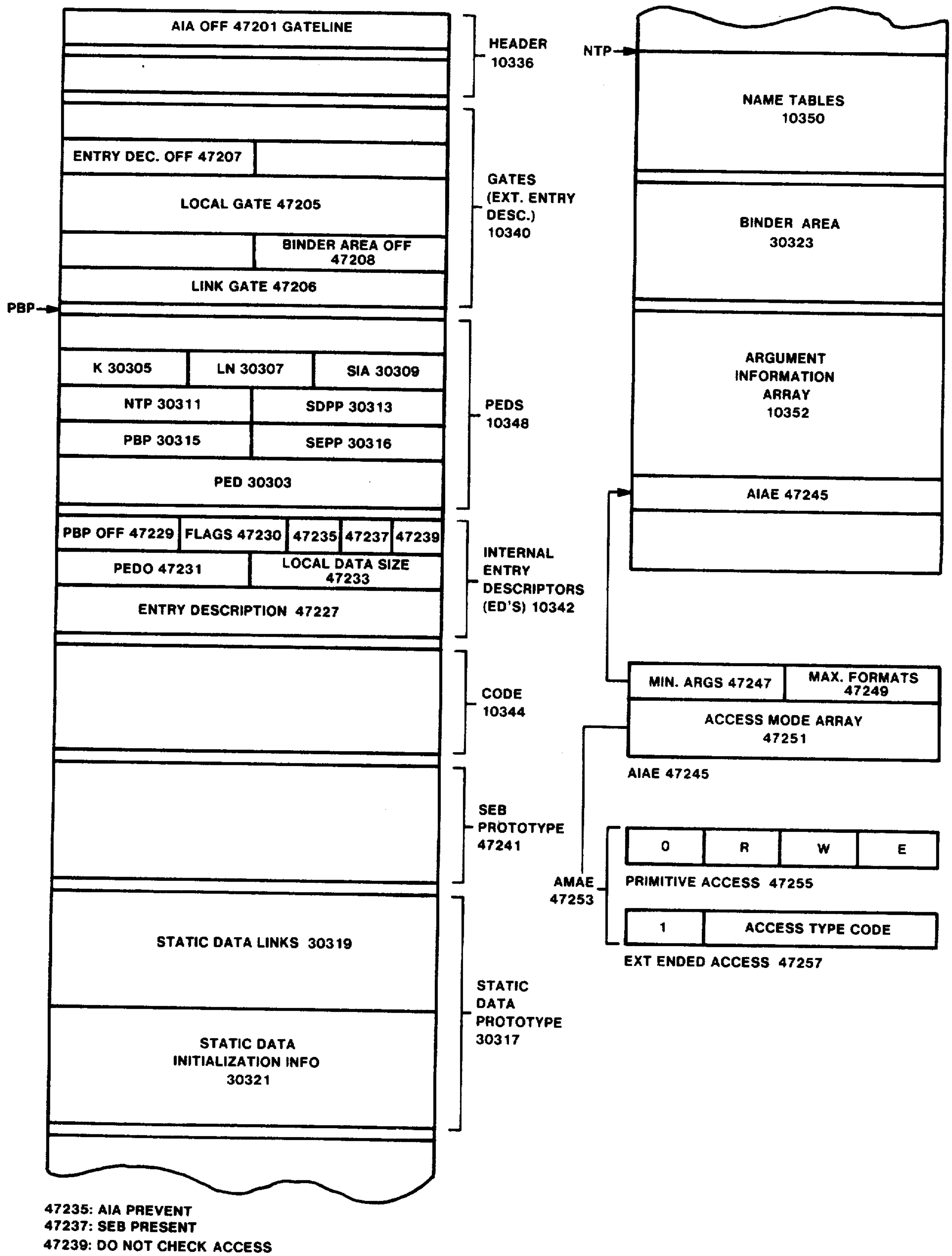
Figure 473:
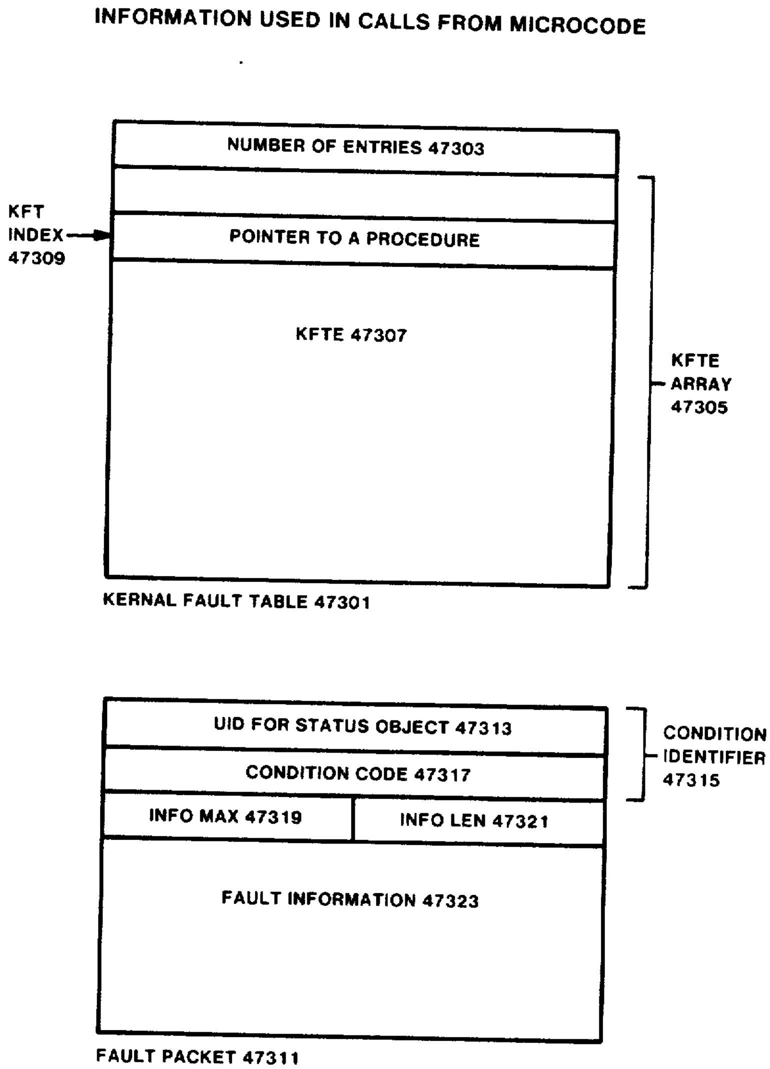
Figure 474:
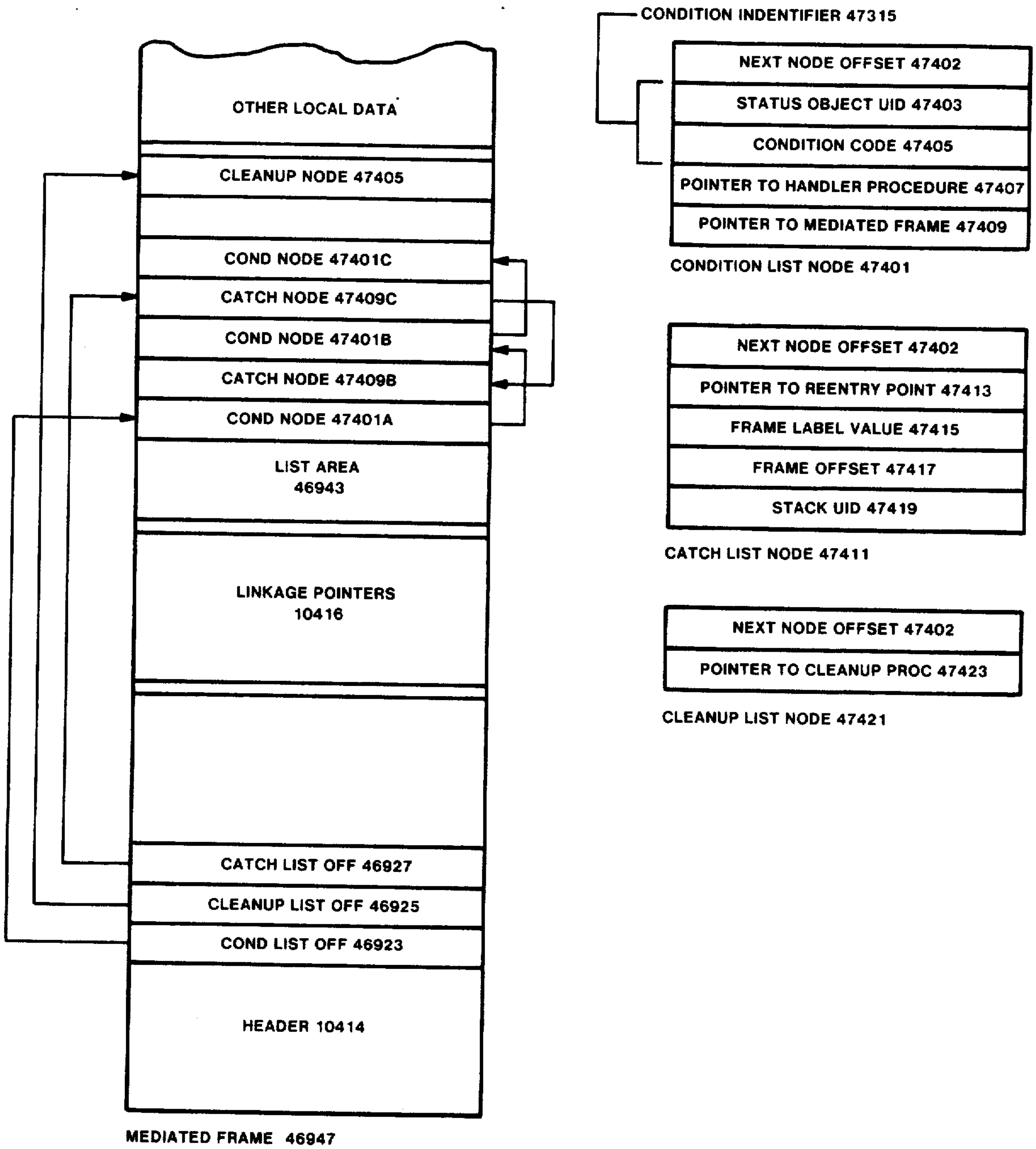
Figure 475:
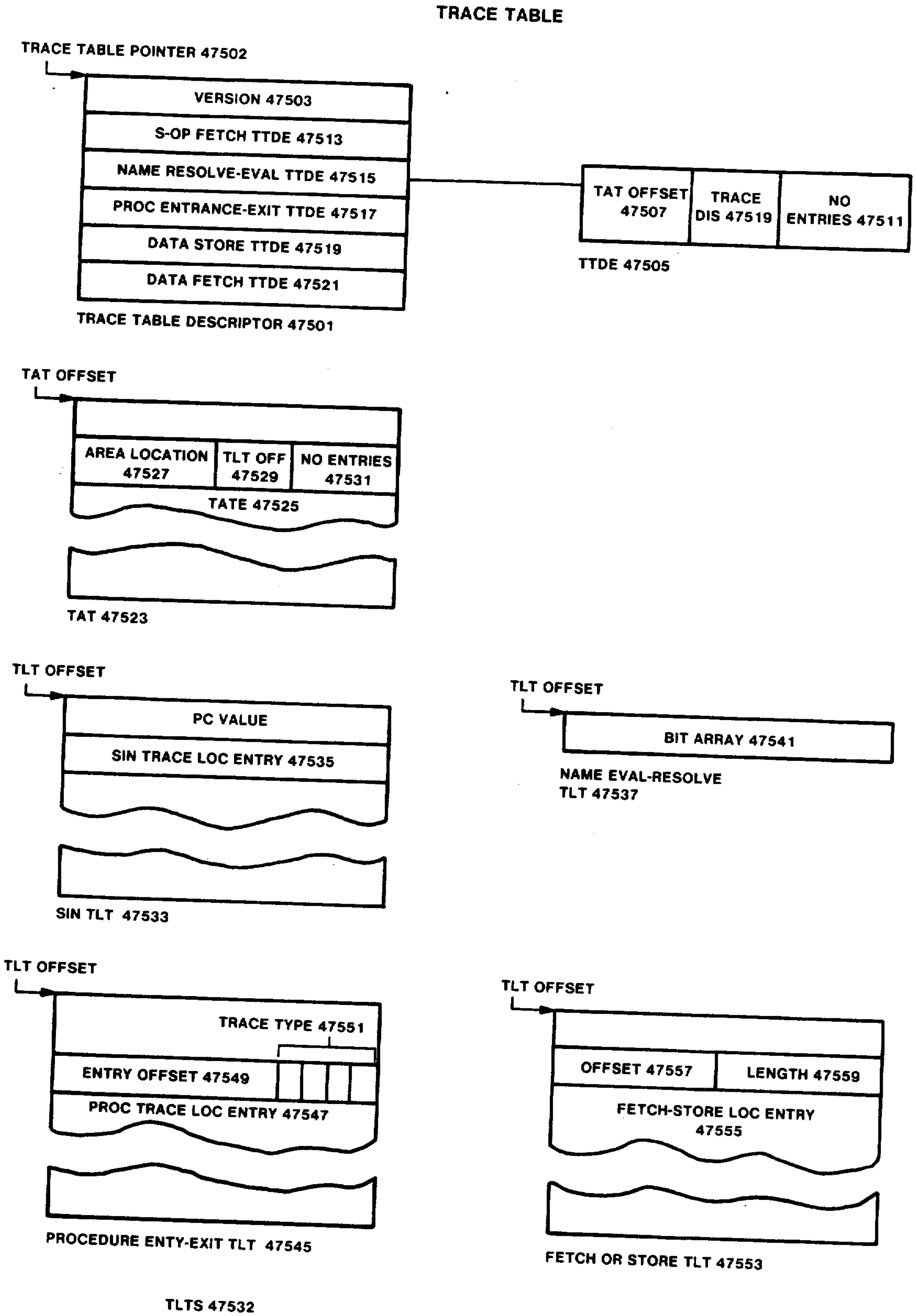

FIG. 447 is a diagram illustrating an overview of processes;

FIG. 448 is a diagram illustrating event counters and await entries;

FIG. 449 is a diagram illustrating an await table overview;

FIG. 450 is a diagram illustrating process synchronization with event counters and await entries;

FIG. 451 is a diagram illustrating locks;

FIG. 452 is a diagram illustrating message queues;

FIG. 453 is a diagram illustrating an overview of a virtual processor;

FIG. 454 is a diagram illustrating virtual processor synchronization;

FIG. 455 is a diagram illustrating detail of a process object;

FIG. 456 is a diagram illustrating an overview of process management;

FIG. 457 is a diagram illustrating process event table entries and lists;

FIG. 458 is a diagram illustrating an implementation of a clock event counter;

FIG. 459 is a diagram illustrating details of an outward signals object;

FIG. 460 is a diagram illustrating a process manager request queue;

FIG. 461 is a diagram illustrating messages from a kernel operating system to an extended operating system;

FIG. 462 is a diagram illustrating details of a virtual processor state block;

FIG. 463 is a diagram illustrating an overview of a virtual processor manager;

FIG. 464 is a diagram illustrating details of a virtual processor information entry;

FIG. 465 is a diagram illustrating details of virtual processor lists;

FIG. 466 is a diagram illustrating details of a virtual processor await table;

FIG. 467 is a diagram illustrating an overview of a macrostack object;

FIG. 468 is a diagram illustrating details of a macrostack object base;

FIG. 469 is a diagram illustrating details of a macrostack frame;

FIG. 470 is a diagram illustrating an overview of a secure stack;

FIG. 471 is a diagram illustrating details of a secure stack frame;

FIG. 472 is a diagram illustrating an overview of procedure object;

FIG. 473 is a diagram illustrating calls from microcode;

FIG. 474 is a diagram illustrating mediated frames;

FIG. 475 is a diagram illustrating a trace table; and,

FIG. A1 is a diagram illustrating fetch unit microinstruction formats.

DESCRIPTION OF THE PREFERRED EMBODIMENTS

The following description presents the structure and operation of a computer system incorporating a presently preferred embodiment of the present invention. As indicated in the following Table of Contents, certain features of computer system structure and operation will first be described in an Introductory Overview. Next, these and other features will be described in further detail in a more detailed Introduction to the detailed descriptions of the computer system. Following the Introduction, the structure and operation of the computer system will be described in detail. The detailed descriptions will present descriptions of the structure and operation of each of the major subsystems, or elements, of the computer system, of the interfaces between these major subsystems, and of overall computer system operation. Next, certain features of the operation of the individual subsystems will be presented in further detail, followed by a more detailed description of overall computer system operation. Finally, appendices will describe certain features of the operation of individual subsystems and of the overall system in yet further detail. Of these appendices, Appendix A presents a detailed description of the microcode operation of the present computer system. Appendix B presents a further detailed description of the overall operation of the present computer system. Appendix B is not essential for one of ordinary skill in the art to gain a complete understanding of the present invention and is provided as a supplement to the following detailed description. As such, Appendix B is provided, together with the present patent application, as a separate document to reside in the prosecution history of the present patent application and thus to be available to readers desiring additional information.

Certain conventions are used throughout the following descriptions to enhance clarity of presentation. First, and with exception of the Introductory Overview, each figure referred to in the following descriptions will be referred to by a three digit number. The most significant digit represents the number of the chapter in the following descriptions in which a particular figure is first referred to. The two least significant digits represent the sequential number of appearance of a figure in a particular chapter. For example, FIG. 319 would be the nineteenth figure appearing in the third chapter. Figures appearing in the Introductory Overview are referred to by a one or two digit number representing the order in which they are referred to in the Introductory Overview. It should be noted that certain figure numbers, for example, FIG. 208, do not appear in the following figures and descriptions; the subject matter of these figures has been incorporated into other figures and these figures deleted, during drafting of the following descriptions, to enhance clarity of presentation.

Second, reference numerals comprise a two digit number (00–99) preceded by the number of the figure in which the corresponding elements first appear. For example, reference numerals 31901 to 31999 would refer to elements 1 through 99 appearing in FIG. 319.

Finally, interconnections between related circuitry is represented in two ways. First, to enhance clarity of presentation, interconnections between circuitry may be represented by common signal names or references, rather than by drawn representations of wires or buses. Second, where related circuitry is shown in two or more figures, the figures may share a common figure number and will be distinguished by a letter designation, for example, FIGS. 319, 319A, and 319B. Common electrical points between such circuitry may be indicated by a bracket enclosing a lead to such a point and a designation of the form "A-b". "A" indicates other figures having the same common point for example, 319A, and "b" designates the particular common electrical point. In cases of related circuitry shown in this manner in two or more figures, reference numerals to elements will be assigned in sequence through the group of figures; the figure number portion of such reference numerals will be that of the first figure of the group of figures.

INTRODUCTORY OVERVIEW

Figure 14:
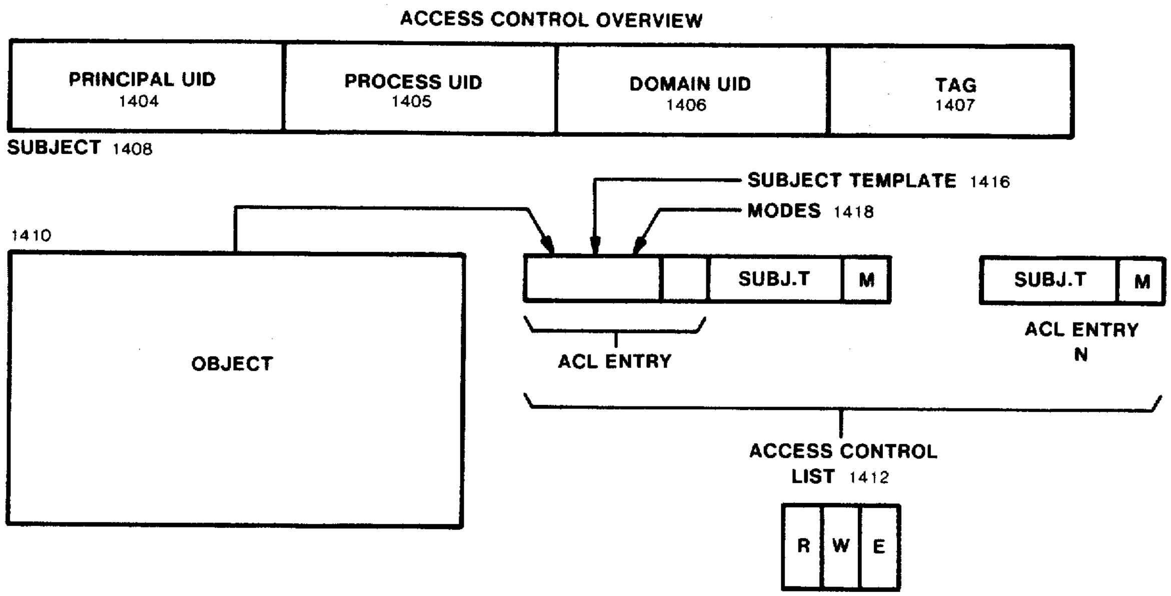
FIG. 14 is a diagram illustrating access control to objects.
Figure 15:
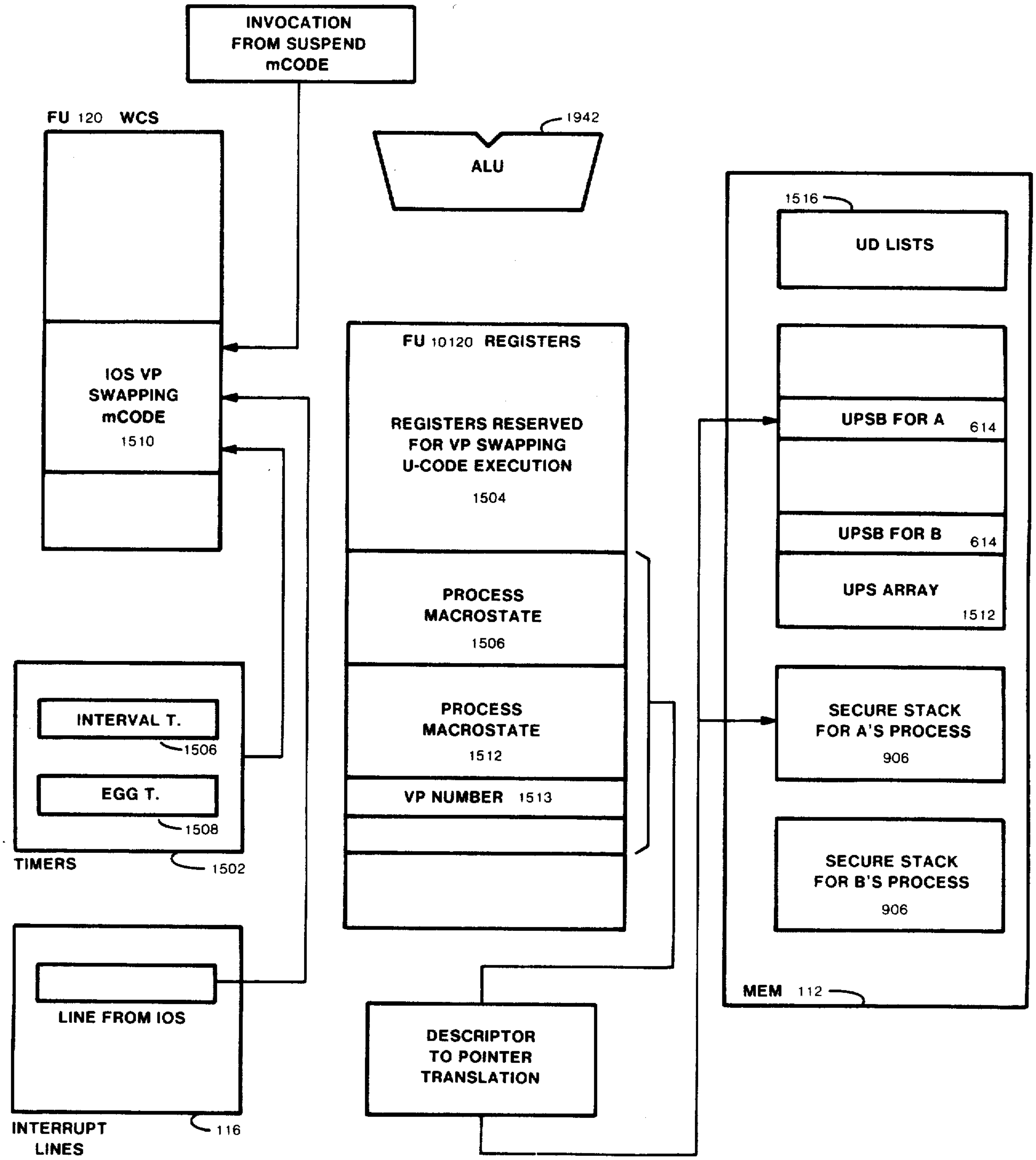
FIG. 15 is a diagram illustrating virtual processors and virtual processor swapping.

A. Hardware Overview (FIG. 1)
B. Individual Operating Features (FIGS. 2, 3, 4, 5, 6)
1. Addressing (FIG. 2)
2. S-Language Instructions and Namespace Addressing (FIG. 3)
3. Architectural Base Pointer Addressing
4. Stack Mechanisms (FIGS. 4–5)
C. Procedure Processes and Virtual Processors (FIG. 6)
D. CS 101 Overall Structure and Operation (FIGS. 7, 8, 9, 10, 11, 12, 13, 14, 15)
1. Introduction (FIG. 7)
2. Compilers 702 (FIG. 7)
3. Binder 703 (FIG. 7)
4. EOS 704 (FIG. 7)
5. KOS and Architectural Interface 708 (FIG. 7)
6. Processes 610 and Virtual Processors 612 (FIG. 8)
7. Processes 610 and Stacks (FIG. 9)
8. Processes 610 and Calls (FIGS. 10, 11)
9. Memory References and the Virtual Memory Management System (FIG. 12, 13)
10. Access Control (FIG. 14)
11. Virtual Processors and Virtual Processor Swapping (FIG. 15)

E. CS 101 Structural Implementation (FIGS. 16, 17, 18, 19, 20)
1. (IOS) 116 (FIGS. 16, 17)
2. Memory (MEM) 112 (FIG. 18)
3. Fetch Unit (FU) 120 (FIG. 19)
4. Execute Unit (EU) 122 (FIG. 20)

1. Introduction (FIGS. 101-110)

A. General Structure and Operation (FIG. 101)
a. General Structure
b. General Operation
c. Definition of Certain Terms
d. Multi-Program Operation
e. Multi-Language Operation
f. Addressing Structure
g. Protection Mechanism
B. Computer System 10110 Information Structure and Mechanisms (FIGS. 102, 103, 104, 105)
a. Introduction (FIG. 102)
b. Process Structures 10210 (FIGS. 103, 104, 105)
1. Procedure Objects (FIG. 103)
2. Stack Mechanisms (FIGS. 104, 105)
3. FURSM 10214 (FIG. 103)
C. Virtual Processor State Blocks and Virtual Process Creation (FIG. 102)
D. Addressing Structures 10220 (FIGS. 103, 106, 107, 108)
1. Objects, UID's, AON's, Names, and Physical Addresses (FIG. 106)
2. Addressing Mechanisms 10220 (FIG. 107)
3. Name Resolution (FIGS. 103, 108)
4. Evaluation of AON Addresses to Physical Addresses (FIG. 107)
E. CS 10110 Protection Mechanisms (FIG. 109)
F. CS 10110 Micro-Instruction Mechanisms (FIG. 110)
G. Summary of Certain CS 10110 Features and Alternate Embodiments.

2. Detailed Description of CS 10110 Major Subsystems (FIGS. 201-206, 207-274)

A. MEM 10110 (FIGS. 201, 206, 207-237)
a. Terminology
b. MEM 10112 Physical Structure (FIG. 201)
c. MEM 10112 General Operation
d. MEM 10112 Port Structure
1. IO Port Characteristics
2. JO Port Characteristics
3. JI Port Characteristics
e. MEM 10112 Control Structure and Operation (FIG. 207)
1. MEM 10112 Control Structure
2. MEM 10112 Control Operation
f. MEM 10112 Operations
g. MEM 10112 Interfaces to JP 10114 and IOS 10116 (FIGS. 209, 210, 211, 204)
1. IO Port 20910 Operating Characteristics (FIGS. 209, 204)
2. JO Port 21010 Operating Characteristics (FIG. 210)
3. JI Port 21110 Operating Characteristics (FIG. 211)
h. MIC 20122 Structure and Operation (FIGS. 207, 212-225)
1. JOPAR 20710, JIPR 20712, IOPAR 20714 and PRMUX 20720 (FIG. 212)
2. Port Control 20716 (FIG. 213)
3. MIC 20122 Control Circuitry (FIGS. 214-237)
a.a. Request Manager 20722 (FIG. 214)
b.b. Trailer Condition Logic 21510 (FIG. 215)
c.c. Miss Control 20726 (FIG. 216)
d.d. Read Queue 20728 (FIG. 217)
e.e. Load Manager 20730 (FIG. 213)
f.f. Bypass Write and Cache Write Back Control 21910 (FIG. 219)
g.g. Write Back Control Logic 22010 (FIG. 220)
h.h. Byte Write Select Logic 22310 (FIG. 223)
i.i. Bypass Write Control 20718 (FIG. 221)
j.j. Memory Cache Usage Logic 22210 (FIG. 222)
k.k. Data Path Steering Logic 22410 (FIG. 224)
l.l. Read Data Handshake Logic 22510 (FIG. 225)
i. FIU 20120 (FIGS. 201, 230, 231)
j. Memory Cache 20116 (FIGS. 232, 233)
1. General Cache Operation (FIG. 233)
2. Memory Cache 20116's Cache 23210 (FIG. 232)
k. Memory Arrays 20112 (FIGS. 234, 235, 236)
l. Bank Controller 20114 (FIG. 237)
B. Fetch Unit 10120 (FIGS. 202, 206, 101, 103, 104, 238)
1. Descriptor Processor 20210 (FIGS. 202, 101, 103, 104, 238, 239)
a. Offset Processor 20218 Structure
b. AON Processor 20216 Structure
c. Length Processor 20220 Structure
d. Descriptor Processor 20218 Operation
a.a. Offset Selector 20238
b.b. Offset Multiplexer 20240 Detailed Structure (FIG. 238)
c.c. Offset Multiplexer 20240 Detailed Operation
a.a.a. Internal Operation
b.b.b. Operation Relative to DESP 20210
e. Length Processor 20220 (FIG. 239)
a.a. Length ALU 20252
b.b. BIAS 20246 (FIG. 239)
f. AON Processor 20216
a.a. AONGRF 20232
b.b. AON Selector 20248
2. Memory Interface 20212 (FIGS. 106, 240)
a.a. Descriptor Trap 20256 and Data Trap 20258
b.b. Name Cache 10226, Address Translation Unit 10228, and Protection Cache 10234 (FIG. 106)
c.c. Structure and Operation of Generalized Cache and NC 10226 (FIG. 240)
d.d. ATU 10228 and PC 10234
3. Fetch Unit Control Logic 20214 (FIG. 202)
a.a. Fetch Unit Control Logic 20214 Overall Structure
b.b. Fetch Unit Control Logic 20214 Operation
a.a.a. Prefetcher 20264, Instruction Buffer 20262, Parser 20264, Operation Code Register 20268, CPC 20270, IPC 20272, and EPC 20274 (FIG. 241)
b.b.b. Fetch Unit Dispatch Table 11010, Execute Unit Dispatch Table 20266, and Operation Code Register 20268 (FIG. 242)
c.c.c. Next Address Generator 24310 (FIG. 243)
c.c. FUCTL 20214 Circuitry for CS 10110 Internal Mechanisms (FIGS. 244-250)
a.a.a. State Logic 20294 (FIGS. 244A-244Z)
b.b.b. Event Logic 20284 (FIGS. 245, 246, 247, 248)
c.c.c. Fetch Unit S-Interpreter Table 11012 (FIG. 249)
d.d.d. Microinstruction Word Formats (FIG. 250)
d.d. CS 10110 Internal Mechanism Control a.a.a. Return Control Word Stack 10358 (FIG. 251)
b.b.b. Machine Control Block (FIG. 252)
c.c.c. Register Address Generator 20288 (FIG. 253)
d.d.d. Timers 20296 (FIG. 254)
e.e.e. Fetch Unit 10120 Interface to Execute Unit 10122
C. Execute Unit 10122 (FIGS. 203, 255-268)
a. General Structure of Execute Unit 10122
1. Execute Unit I/O 20312
2. Execute Unit Control Logic 20310
3. Multiplier Logic 20314
4. Exponent Logic 20316
5. Multiplier Control 20318
6. Test and Interface Logic 20320
b. Execute Unit 10122 Operation (FIG. 255)
1. Execute Unit Control Logic 20310 (FIG. 255)
a.a. Command Queue 20342
b.b. Command Queue Event Control Store 25514 and Command Queue Event Address Control Store 25516
c.c. Execute Unit S-Interpreter Table 20344
d.d. Microcode Control Decode Register 20346
e.e. Next Address Generator 20340
2. Operand Buffer 20322 (FIG. 256)
3. Multiplier 20314 (FIGS. 257, 258)
a.a. Multiplier 20314 I/O Data Paths and Memory (FIG. 257)
a.a.a. Packed Decimal to Unpacked Decimal Conversion
b.b.b. Container Size Check
c.c.c. Final Result Output Multiplexer 20324
b.b. Multiplier 20314 Arithmetic Operation Logic (FIG. 258)
a.a.a. Multiplier 20314 Internal Data Paths and Multiply/Divide Operations (FIG. 258)
b.b.b. Multiplication, Partial Products
c.c.c. Main Working Register 20372
d.d.d. Multiplier ALU2 20374
e.e.e. Final Result Shifter 20362
f.f.f. Final Result Register 20336
c.c. Multiplier 20314 Arithmetic Operations
a.a.a. Floating Point Operations
b.b.b. Decimal Operations
4. Exponent Logic 20316 and Multiplier Control 20318—Floating Point Operations (FIG. 259)
a.a. Exponent Logic 20316 and Multiplier Control 20318 Structure (FIG. 259)
b.b. Exponent Logic 20316 and Multiplier Control 20318 Operation
5. Test and Interface Logic 20320 (FIGS. 260-268)
a.a. FU 10120/EU 10122 Interface
a.a.a. Loading of Command Queue 20342 (FIG. 260)
b.b.b. Loading of Operand Buffer 20320 (FIG. 261)
c.c.c. Storeback (FIG. 262)
d.d.d. Test Conditions (FIG. 263)
e.e.e. Exception Checking (FIG. 264)
f.f.f. Idle Routine
g.g.g. EU 10122 Stack Mechanisms (FIGS. 265, 266, 267)
h.h.h. Loading of Execute Unit S-Interpreter Table 20344 (FIG. 268)
D. I/O System 10116 (FIGS. 204, 206, 269)
a. I/O System 10116 Structure (FIG. 204)
b. I/O System 10116 Operation (FIG. 269)
1. Data Channel Devices
2. I/O Control Processor 20412
3. Data Mover 20410 (FIG. 269)
a.a. Input Data Buffer 20440 and Output Data Buffer 20442
b.b. Priority Resolution and Control 20444 (FIG. 269)
E. Diagnostic Processor 10118 (FIG. 101, 205)
F. CS 10110 Micromachine Structure and Operation (FIGS. 270-274)
a. Introduction
b. Overview of Devices Comprising FU Micromachine (FIG. 270)
1. Devices Used By Most Microcode
a.a. MOD Bus 10144, JPD Bus 10142, and DB Bus 27021
b.b. Microcode Addressing
c.c. Descriptor Processor 20218 (FIG. 271)
d.d. EU 10122 Interface
2. Specialized Micromachine Devices
a.a. Instruction Stream Reader 27001
b.b. SOP Decoder 27003
c.c. Name Translation Unit 27015
d.d. Memory Reference Unit 27017
e.e. Protection Unit 27019
f.f. KOS Micromachine Devices
c. Micromachine Stacks and Microroutine Calls and Returns (FIGS. 272, 273)
1. Micromachine Stacks (FIG. 272)
2. Micromachine Invocations and Returns
3. Means of Invoking Microroutines
4. Occurrence of Event Invocations (FIG. 273)
d. Programming the Micromachine (FIG. 274)
e. Virtual Micromachines and Monitor Micromachine
1. Virtual Mode
2. Monitor Micromachine
f. Interrupt and Fault Handling
1. General Principles
2. Hardware Interrupt and Fault Handling in CS 10110
3. Monitor Mode: Differential Masking and Hardware Interrupt Handling
g. FU Micromachine and CS 10110 Subsystems
3. Namespace, S-Interpreters and Pointers (FIGS. 301-307, 274)
A. Pointers and Pointer Resolution (FIGS. 301, 302)
a. Pointer Formats (FIG. 301)
b. Pointers in FU 10120 (FIG. 302)
c. Resolutions of Unresolved Pointers by Procedures 602
d. Descriptor to Pointer Conversion
B. Namespace and the S-Interpreters (FIGS. 303-307, 274)
a. Procedure Object 606 Overview (FIG. 303)
b. Resolution of Pointers in Procedure Objects 608
c. Namespace
1. Name Resolution and Evaluation
2. The Name Table (FIG. 304)
3. Architectural Base Pointers (FIGS. 305, 306, 274)
a.a. Resolving and Evaluating Names (FIG. 305)
b.b. Implementation of Name Evaluation and Name Resolve in CS 10110
c.c. Name Cache 10226 Entries (FIG. 306)
d.d. Name Cache 10226 Hits
e.e. Name Cache 10226 Misses f.f. Flushing Name Cache 10226 (FIG. 274)
g.g. Fetching the Instruction Stream
h.h. Parsing the Instruction Stream
d. The S-Interpreters (FIG. 307)
1. Translating SIP into a Dialect Number (FIG. 307)
2. Dispatching 4. The Kernel Operating System A. Introduction
a. Operating Systems (FIG. 401)
1. Resources Controlled by Operating Systems (FIG. 402)
2. Resource Allocation by Operating Systems
b. The Operating System in CS 10110
c. Extended Operating System and the Kernel Operating System (FIG. 403)
B. Objects and Object Management (FIG. 404)
a. Objects and User Programs (FIG. 405)
b. UIDs 40401 (FIG. 406)
c. Object Attributes
d. Attributes and Access Control
e. Implementation of Objects
1. Introduction (FIGS. 407, 408)
2. Objects in Secondary Storage 10124 (FIGS. 409, 410)
a.a. Representation of an Object's Contents on Secondary Storage 10124
b.b. LAUD 40903 (FIGS. 411, 412)
c.c. Operations on LAUD 40903
a.a.a. Object Creation and Deletion
b.b.b. Reading and Changing an Object's Attributes
3. Active Objects (FIG. 413)
a.a. UID 40401 to AON 41304 Translation
b.b. Active Object Manager Process 610 (FIG. 414)
c.c. AOT 10712 and Logical Address Reduction (LAR) (FIG. 415)
d.d. AOTE 41306
C. The Access Control System
a. Subjects
b. Domains
c. Access Control Lists
1. Subject Templates (FIG. 416)
2. Primitive Access Control Lists (PACLs)
a.a. Setting and Reading PACLs
b.b. Extended Access Rights and EACLs
c.c. Subjects, Domains, and Subject Templates in the Present Embodiment
d. Acceleration of Access Checking in CS 10110.
1. Subjects and ASN's (FIG. 408)
2. ASTEs 40806 (FIG. 417)
3. Domain Table 41801 and Domain Numbers (FIG. 418)
4. Pure Domains and Pure Subjects
5. Control Attribute Tables
a.a. ANPAT 10920 (FIG. 419)
b.b. ANPAT Entries 41907 (FIG. 420)
c.c. Operations Involving ANPAT 10970
d.d. APAM 10918 and Protection Cache 10234 (FIG. 421)
e.e. Protection Cache 10234 and Protection Checking (FIG. 422)
D. Virtual Memory Management (FIG. 423)
a. Components of the VMM System (FIG. 424)
b. Advantages of the VMM System
c. Detailed Overview of the VMM System (FIG. 425)
d. AON-offset Address 42305 to Frame Number-Displacement Address 42307 Translation (FIG. 426)
e. Implementation of Address Translation
1. The LAT* SIN
2. Searching MHT 10716 (FIG. 427)
3. Page Faults
a.a. VMMEC 42505 and VMMQ 42506 (FIG. 428)
b.b. Page Fault Microcode 42503 (FIGS. 426, 428)
f. VMM PROC 42405
1. MFT 10718 (FIG. 429)
2. VMM Coordinator 42512 (FIGS. 425, 426, 428, 429, 430)
a.a. Request to Send Block 43001 (FIGS. 425, 426, 428, 429, 431)
b.b. Await Event Counters Block 43002 (FIGS. 425, 426, 428, 429, 431)
c.c. Finish I/O Loop 43003 (FIGS. 425, 426, 428, 429, 432)
d.d. Look for Frame Block 43004 (FIGS. 425, 426, 428, 429, 433)
e.e. Process VMMQ Work List Loop Block 43005 (FIGS. 425, 426, 428, 429, 434)
f.f. Process OMQ Loop 43006 (FIGS. 425, 426, 428, 429, 435)
g.g. Frame Cleaner Block 43007 (FIGS. 425, 426, 428, 429, 435)
3. MEM 10112 Frame 42308 Allocation (FIGS. 425, 426, 428, 429, 436, 437, 438)
4. MEM 10112 Frame 42308 Deallocation (FIGS. 425, 426, 428, 429, 436, 439, 440)
E. Processes
a. Introduction (FIG. 402)
1. Processes 610 in CS 10110 (FIG. 447)
2. Synchronization of Processes 610 and Virtual Processors 612
a.a. Event Counters 44801, Await Entries 44804, and Await Tables (FIG. 448, 449)
b.b. Synchronization with Event Counters 44801 and Await Entries 44804
c.c. Event Counter 44801 Operations (FIG. 450)
d.d. Event Counters 44801 and Interrupts
e.e. Event Counters 44801 and System Clocks
f.f. Locks 45101 (FIG. 451)
g.g. Message Queues 45210 (FIG. 452)
3. Virtual Processors 612 (FIG. 453)
a.a. Virtual Processor Management (FIG. 453)
b.b. Virtual Processors 612 and Synchronization (FIG. 454)
b. Implementation of Processes 610
1. Process Object 901 (FIG. 455)
2. Access to Process Objects 901
3. Process Manager Event Counters 44801, Await Tables 44804, and Queues 45210 (FIG. 456)
a.a. PET 44705 (FIGS. 449, 457)
b.b. Process Manager Clock Event Counter 45615 Implementation (FIG. 458)
c.c. Outward Signals Object (OSO) 45409 and Multiplexed Outword Signals Event Counter 45407 (FIG. 459)
d.d. Process Manager Request Queue (PMRQ) 45607 (FIG. 460)
e.e. Queues for Communicating with EOS (FIGS. 456, 461)
4. Operations on Processes 610 a.a. Create Process Procedure 602 (FIG. 455)
b.b. Delete Process Procedure 602 (FIGS. 455, 457)
c.c. Procedures 602 which Set and Read Fields of Process Object 901 (FIG. 455)
d.d. Process-level Operations on Event Counters 44801 and Sequencers 45102 (FIG. 457)
a.a.a. The Process-level Await Operation PM Await (FIGS. 449, 455, 457)
b.b.b. The Process-level Advance Operation PM Advance (FIGS. 449, 455, 457)
c.c.c. Operations on Sequencers 45102
e.e. Operations on a Process Object 901's EACL
c. Implementation of Virtual Processors 612
1. VPSB 614 (FIG. 462)
2. Virtual Processor Management Data Bases (FIG. 463)
a.a. VPIA 46301 (FIG. 464)
b.b. HVPL 46305 and MVPL 45309 (VPLs) (FIG. 465)
c.c. VPAT 45401 (FIG. 466)
3. Operations on Virtual Processors 612
a.a. Request VP (FIGS. 462, 463, 464, 465)
b.b. Release VP (FIGS. 462, 463, 464, 465)
4. Operations on Processes 610 Which Involve Virtual Processors 612
a.a. The Bind Process Operation (FIGS. 455, 462, 463, 464, 465)
b.b. The Unbind Process Operation (FIGS. 455, 462, 463, 464, 465)
c.c. The Run Process Operation (FIGS. 455, 456, 462, 463, 464, 465)
d.d. The Stop Operation (FIGS. 455, 456, 462, 463, 464, 465)
e.e. Killing a Process 610 (FIGS. 455, 456, 462, 463, 464, 465)
5. Virtual Processor-level Synchronization Operations
a.a. The Advance SIN (FIGS. 459, 462, 465, 466)
b.b. The Await SIN (FIGS. 459, 462, 465, 466)
c.c. Virtual Processor-level Synchronization Using the System Clock (FIG. 458)
d.d. Begin Atomic Operation and End Atomic Operation (FIG. 462)
e.e. Suspend (FIG. 462, 465)
f.f. Resume (FIGS. 462, 465)
g.g. KOS Dispatcher Microcode (FIGS. 462, 465)
d. Process 610 Stack Manipulation
1. Introduction to Call and Return
2. Macrostacks (MAS) 502 (FIG. 467)
a.a. MAS Base 10410 (FIG. 468)
b.b. Per-domain Data Area 46853 (FIG. 468)
c.c. MAS Frame 46709 Detail (FIG. 469)
3. SS 504 (FIG. 470)
a.a. SS Base 47001 (FIG. 471)
b.b. SS Frames 47003 (FIG. 471)
a.a.a. Ordinary SS Frame Headers 10514 (FIG. 471)
b.b.b. Detailed Structure of Macrostate 10516 (FIG. 471)
c.c.c. Cross-domain SS Frames 47039 (FIG. 471)
4. Portions of Procedure Object 608 Relevant to Call and Return (FIG. 472)
5. Execution of Mediated Calls
a.a. Mediated Call SINs
b b. Simple Mediated Calls (FIGS. 270, 468, 469, 470, 471, 472)
c.c. Invocations of Procedures 602 Requiring SEBs 46864 (FIGS. 270, 468, 469, 470, 471, 472)
d.d. Cross-Procedure Object Calls (FIGS. 270, 468, 469, 470, 471, 472)
e.e. Cross-Domain Calls (FIGS. 270, 408, 418, 468, 469, 470, 471, 472)
f.f. Failed Cross-Domain Calls (FIGS. 270, 468, 469, 470, 471, 472)
6. Neighborhood Calls (FIGS. 468, 469, 472)
7. Calls from Microcode (FIGS. 270, 468, 469, 470, 471, 472, 473)
8. Terminating Several Invocations
a.a. Lists in MAS Frame 46703 (FIG. 474)
b.b. Implementation of Non-local GOTO (FIG. 474)
a.a.a. Establishing Location to Which Non-local GOTO May Transfer Control (FIG. 474)
b.b.b. Implementation of the Non-local GOTO SIN (FIG. 474)
c.c. Conditions
a.a.a. Establishing Condition Handlers (FIG. 474)
b.b.b. Signallers and the Execution of Condition Handlers (FIGS. 270, 468, 469, 470, 471, 472, 473, 474)
d.d. Crawl Outs (FIGS. 270, 468, 469, 470, 471, 472, 473, 474)
9. Interrupts
a.a. Establishing and Clearing Interrupts (FIGS. 455, 457, 468)
b.b. Interrupt Levels (FIGS. 455, 457, 468)
c.c. Processing Interrupts (FIGS. 455, 457, 468)
F. Debugging Aids in CS 10110
a. Overview of Debugging in CS 10110
b. Debugging Features Common to All CSs 10110
1. Trace Tables (FIG. 475)
2. Trace Table Pointer 47502
3. Information Returned to the Debugger by Trace Event Microcode
4. Macrostate Available to the Debugger
c. Implementation of Debugger Operations in the Present Embodiment
1. Enabling and Disabling Trace Event Signals (FIGS. 273, 475)
2. Debugging Operations (FIGS. 273, 475) Appendix A.

INTRODUCTORY OVERVIEW

The following overview will first briefly describe the overall physical structure and operation of a presently preferred embodiment of a digital computer system incorporating the present invention. Then certain operating features of that computer system will be individually described. Next, overall operation of the computer system will be described in terms of those individual features. Finally, the computer system's implementation will be described in further detail.

A. Hardware Overview (FIG. 1)

Figure 1:
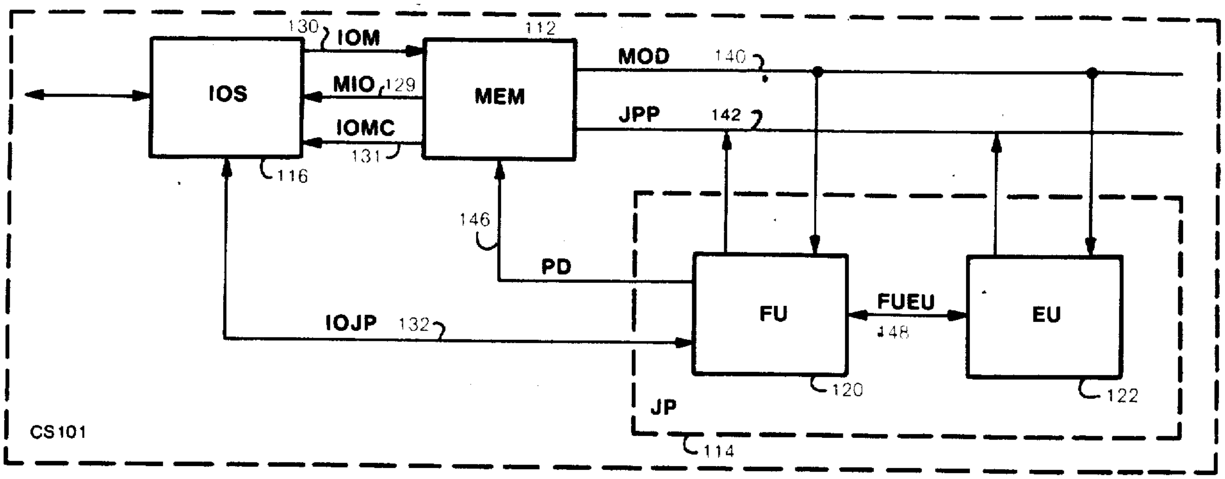
FIG. 1 is a partial block diagram of a computer system incorporating the present invention.

Referring to FIG. 1, a block diagram of Computer System (CS) 101 incorporating the present invention is shown. Major elements of CS 101 are I/O System (IOS) 116, Memory (MEM) 112, and Job Processor (JP) 114. JP 114 is comprised of a Fetch Unit (FU) 120 and an Execute Unit (EU) 122. CS 101 may also include a Diagnostic Processor (DP), not shown or described in the instant description.

Referring first to IOS 116, a primary function of IOS 116 is control of transfer of information between MEM 112 and the outside world. Information is transferred from MEM 112 to IOS 116 through IOM Bus 130, and from IOS 116 to MEM 112 through MIO Bus 129. IOMC Bus 131 is comprised of bi-directional control signals coordinating operation of MEM 112 and IOS 116. IOS 116 also has an interface to FU 120 through IOJP Bus 132. IOJP Bus 132 is a bi-directional control bus comprised essentially of two interrupt lines. These interrupt lines allow FU 120 to indicate to IOS 116 that a request for information by FU 120 has been placed in MEM 112, and allows IOS 116 to inform FU 120 that information requested by FU 120 has been transferred into a location in MEM 112. MEM 112 is CS 101's main memory and serves as the path for information transfer between the outside world and JP 114. MEM 112 provides instructions and data to FU 120 and EU 122 through Memory Output Data (MOD) Bus 140 and receives information from FU 120 and EU 122 through Job Processor Data (JPD) Bus 142. FU 120 submits read and write requests to MEM 112 through Physical Descriptor (PD) Bus 146.

JP 114 is CS 101's CPU and, as described above, is comprised of FU 120 and EU 122. A primary function of FU 120 is executing operations of user's programs. As part of this function, FU 120 controls transfer of instructions and data from MEM 112 and transfer of results of JP 114 operations back to MEM 112. FU 120 also performs operating system type functions, and is capable of operating as a complete, general purpose CPU. EU 122 is primarily an arithmetic and logic unit provided to relieve FU 120 of certain arithmetic operations. FU 120, however, is capable of performing EU 122 operations. In alternate embodiments of CS 101, EU 122 may be provided only as an option for users having particular arithmetic requirements. Coordination of FU 120 and EU 122 operations is accomplished through FU/EU (FUEU) Bus 148, which includes bi-directional control signals and mutual interrupt lines. As described further below, both FU 120 and EU 122 contain register file arrays referred to respectively as CRF and ERF, in addition to registers associated with, for example, ALUs.

A primary feature of CS 101 is that IOS 116, MEM 112, FU 120 and EU 122 each contain separate and independent microinstruction control, so that IOS 116, MEM 112, and EU 122 operate asynchronously under the general control of FU 120. EU 122, for example, may execute a complex arithmetic operation upon receipt of data and a single, initial command from FU 120.

Having briefly described the overall structure and operation of CS 101, certain features of CS 101 will be individually further described next below.

B. Individual Operating Features (FIGS. 2,3,4,5,6)

1. Addressing (FIG. 2)

Figure 2:
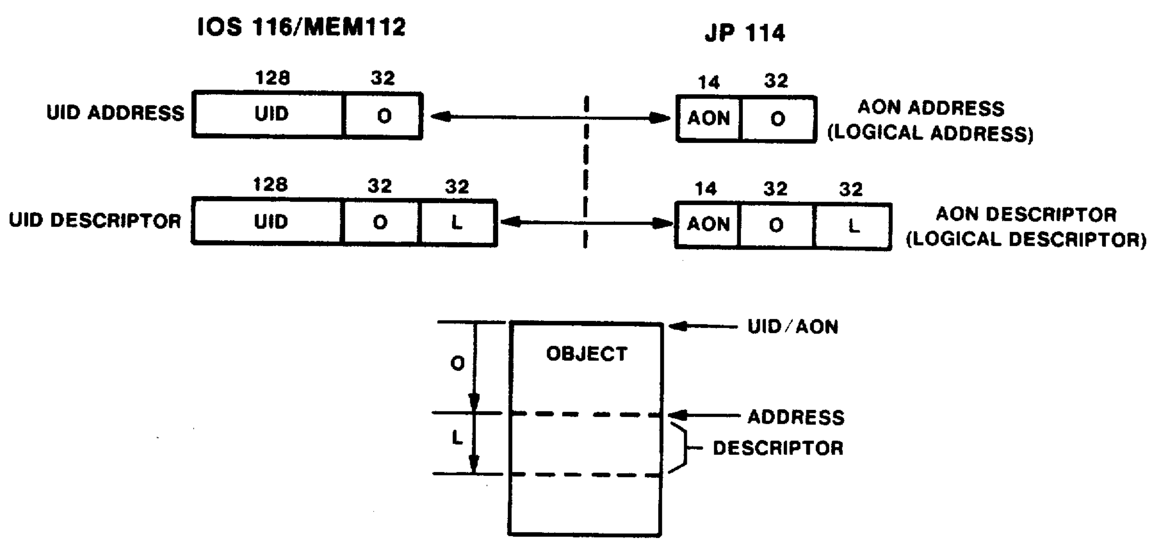
FIG. 2 is a diagram illustrating computer system addressing structure of the present invention.

Referring to FIG. 2, a diagramic representation of portions of CS 101's addressing structure is shown. CS 101's addressing structure is based upon the concept of Objects. An Object may be regarded as a container for holding a particular type of information. For example, one type of Object may contain data while another type of Object may contain instructions or procedures, such as a user program. Still another type of Object may contain microcode. In general, a particular Object may contain only one type or class of informtion. An Object may, for example, contain up to $2^{32}$ bits of information, but the actual size of a particular Object is flexible. That is, the actual size of a particular Object will increase as information is written into that Object and will decrease as information is taken from that Object. In general, information in Objects is stored sequentially, that is without gaps.

Each Object which can ever exist in any CS 101 system is uniquely identified by a serial number referred to as a Unique Identifier (UID). A UID is a 128 bit value comprised of a serial number dependent upon, for example, the particular CS 101 system and user, and a time code indicating time of creation of that Object. UIDs are permanently assigned to Objects, no two Objects may have the same UID, and UIDs may not be reused. UIDs provide an addressing base common to all CS 101 systems which may ever exist, through which any Object ever created may be permanently and uniquely identified.

As described above, UIDs are 128 bit values and are thus larger than may be conveniently handled in present embodiments of CS 101. In each CS 101, therefore, those Objects which are active (currently being used) in that system are assigned 14 bit Active Object Numbers (AONs). Each Object active in that system will have a unique AON. Unlike UIDs, AONs are only temporarily assigned to particular Objects. AONs are valid only within a particular CS 101 and are not unique between systems. An Object need not physically reside in a system to be assigned an AON, but can be active in that system only if it has been assigned an AON.

A particular bit within a particular Object may be identified by means of a UID address or an AON address. In CS 101, AONs and AON addresses are valid only within JP 114 while UIDs and UID addresses are used in MEM 112 and elsewhere. UID and AON addresses are formed by appending a 32 bit Offset (0) field to that Object's UID or AON. O fields indicate offset, or location, of a particular bit relative to the start of a particular Object.

Segments of information (sequences of information bits) within particular Objects may be identified by means of descriptors. A UID descriptor is formed by appending a 32 bit Length (L) field of a UID address. An AON, or logical descriptor is formed by appending a 32 bit L field to an AON address. L fields identify length of a segment of information bits within an Object, starting from the information bit identified by the UID or AON address. In addition to length information, UID and logical descriptors also contain Type fields containing information regarding certain characteristics of the information in the information segment. Again, AON based descriptors are used within JP 114, while UID based descriptors are used in MEM 112.

Referring to FIGS. 1 and 2 together, translation between UID addresses and descriptors and AON addresses and descriptors is performed at the interface between MEM 112 and JP 114. That is, addresses and descriptors within JP 114 are in AON form while addresses and descriptors in MEM 112, IOS 116, and the external world are in UID form. In other embodiments of CS 101 using AONs, transformation from UID to AON addressing may occur at other interfaces, for example at the IOS 116 to MEM 112 interface, or at the IOS 116 to external world interface. Other embodiments of CS 101 may use UIDs throughout, that is not use AONs even in JP 114.

Finally, information within MEM 112 is located through MEM 112 Physical Addresses identifying particular physical locations within MEM 112's memory space. Both IOS 116 and JP 114 address information within MEM 112 by providing physical addresses to MEM 112. In the case of physical addresses provided by JP 114, these addresses are referred to as Physical Descriptors (PDs). As described below, JP 114 contains circuitry to translate logical descriptors into physical descriptors.

Figure 3:
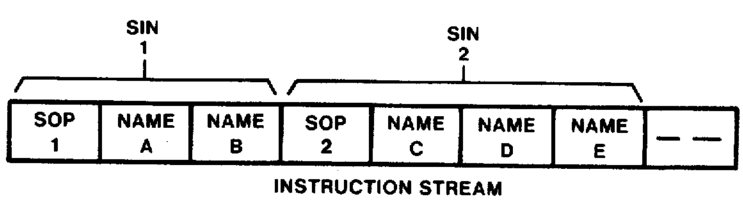
FIG. 3 is a diagram illustrating the computer system instruction stream of the present invention.

2. S-Language Instructions and Namespace Addressing (FIG. 3)

CS 101 is both an S-Language machine and a Namespace machine. That is, operations to be executed by CS 101 are expressed as S-Language Operations (SOPs) while operands are identified by Names. SOPs are of a lower, more detailed, level than user language instructions, for example FORTRAN and COBOL, but of a higher level than conventional machine language instructions. SOPs are specific to particular user languages rather than a particular embodiment of CS 101, while conventional machine language instructions are specific to particular machines. SOPs are in turn interpreted and executed by microcode. There will be an S-Language Dialect, a set of SOPs, for each user languages. CS 101, for example, may have SOP Dialects for COBOL, FORTRAN, and SPL. A particular distinction of CS 101 is that all SOPs are of a uniform, fixed length, for example 16 bits. CS 101 may generally contain one or more sets of microcode for each S-Language Dialect. These microcode Dialect Sets may be completely distinct, or may overlap where more than one SOP utilizes the same microcode.

As stated above, in CS 101 all operands are identified by Names, which are 8, 12, or 16 bit numbers. CS 101 includes one or more "Name Tables" containing an Entry for each operand Name appearing in programs currently being executed Each Name Table Entry contains information describing the operand referred to by a particular Name, and the directions necessary for CS 101 to translate that information into a corresponding logical descriptor. As previously described, logical descriptors may then be transformed into physical descriptors to read and write operands from or to MEM 112. As described above, UIDs are unique for all CS 101 systems and AONs are unique within individual CS 101 systems. Names, however, are unique only within the context of a user's program. That is, a particular Name may appear in two different user's programs and, within each program, will have different Name Table Entries and will refer to different operands.

CS 101 may thereby be considered as utilizing two sets of instructions. A first set is comprised of SOPs, that is instructions selecting algorithms to be executed. The second set of instructions are comprised of Names, which may be regarded as entry points into tables of instructions for making references regarding operands.

Referring to FIG.3, a diagramic representation of CS 101 instruction stream is shown. A typical SIN is comprised of an SOP and may include one or more Names referring to operands. SOPs and Names allow user's programs to be expressed in very compact code. Fewer SOPs than machine language instructions are required to express a user's program. Also, use of SOPs allows easier and simpler construction of compilers, and facilitates adaption of CS 101 systems to new user languages. In addition, use of Names to refer to operands means that SOPs are independent of the form of the operands upon which they operate. This in turn allows for more compact code in expressing user programs in that SOPs specifying operations dependent upon operand form are not required.

3. Architectural Base Pointer Addressing

As will be described further below, a user's program residing in CS 101 will include one or more Objects. First, a Procedure Object contains at least the SINs of the user's programs and a Name Table containing entries for operand Names of the program. The SINs may include references, or calls, to other Procedure Objects containing, for example, procedures available in common to many users. Second, a Static Data Area may contain static data, that is data having an existence for at least a single execution of the program. And third, a Macro-stack, described below, may contain local data, that is data generated during execution of a program. Each Procedure Object, the Static Data Area and the Macro-stack are individual Objects identified by UIDs and AONs and addressable through UID and AON addresses and descriptors.

Locations of information within a user's Procedure Objects, Static Data Area, and Macro-stack are expressed as offsets from one of three values, or base addresses, referred to as Architectural Base Pointers (ABPs). For example, location information in Name Tables is expressed as offsets from one of the ABPs. ABPs may be expressed as previously described.

The three ABPs are the Frame Pointer (FP), the Procedure Base Pointer (PBP), and the Static Data Pointer (SDP). Locations of data local to a procedure, for example in the procedure's Macrostack, are described as offsets from FP. Locations of non-local data, that is Static Data, are described as offsets from SDP. Locations of SINs in Procedure Objects are expressed as offsets from PBP; these offsets are determined as a Program Counter (PC) value. Values of the ABPs vary during program execution and are therefore not provided by the compiler converting a user's high level language program into a program to be executed in a CS 101 system. When the program is executed, CS 101 provides the proper values for the ABPs. When a program is actually being executed, the ABP's values are stored in FU 120's GRF.

Other pointers are used, for example, to identify the top frame of CS 101's Secure Stack (a microcode level stack described below) or to identify the microcode Dialect currently being used in execute the SINs of a procedure. These pointers are similar to FP, SDP, and PBP.

4. Stack Mechanisms (FIGS. 4–5)

Figure 4A:
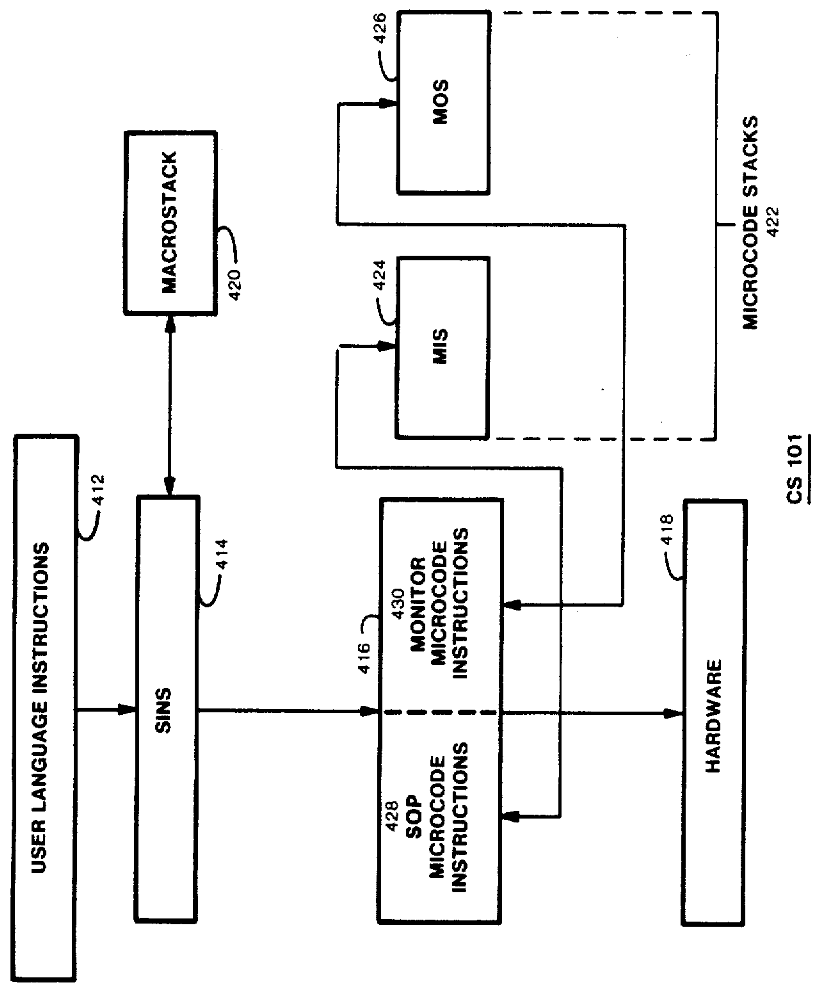
FIG. 4A is a diagram illustrating the control structure of a computer system incorporating the present invention.
Figure 4:
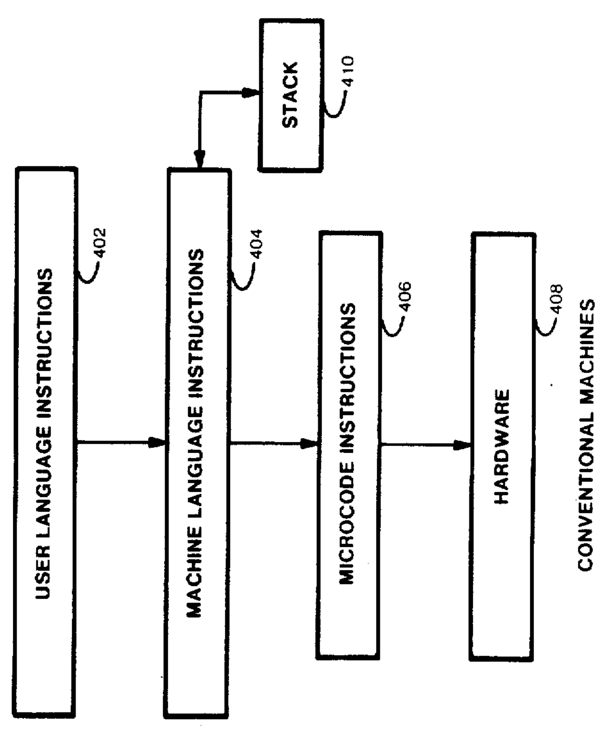
FIG. 4 is a diagram illustrating the control structure of a conventional computer system.
Figure 5:
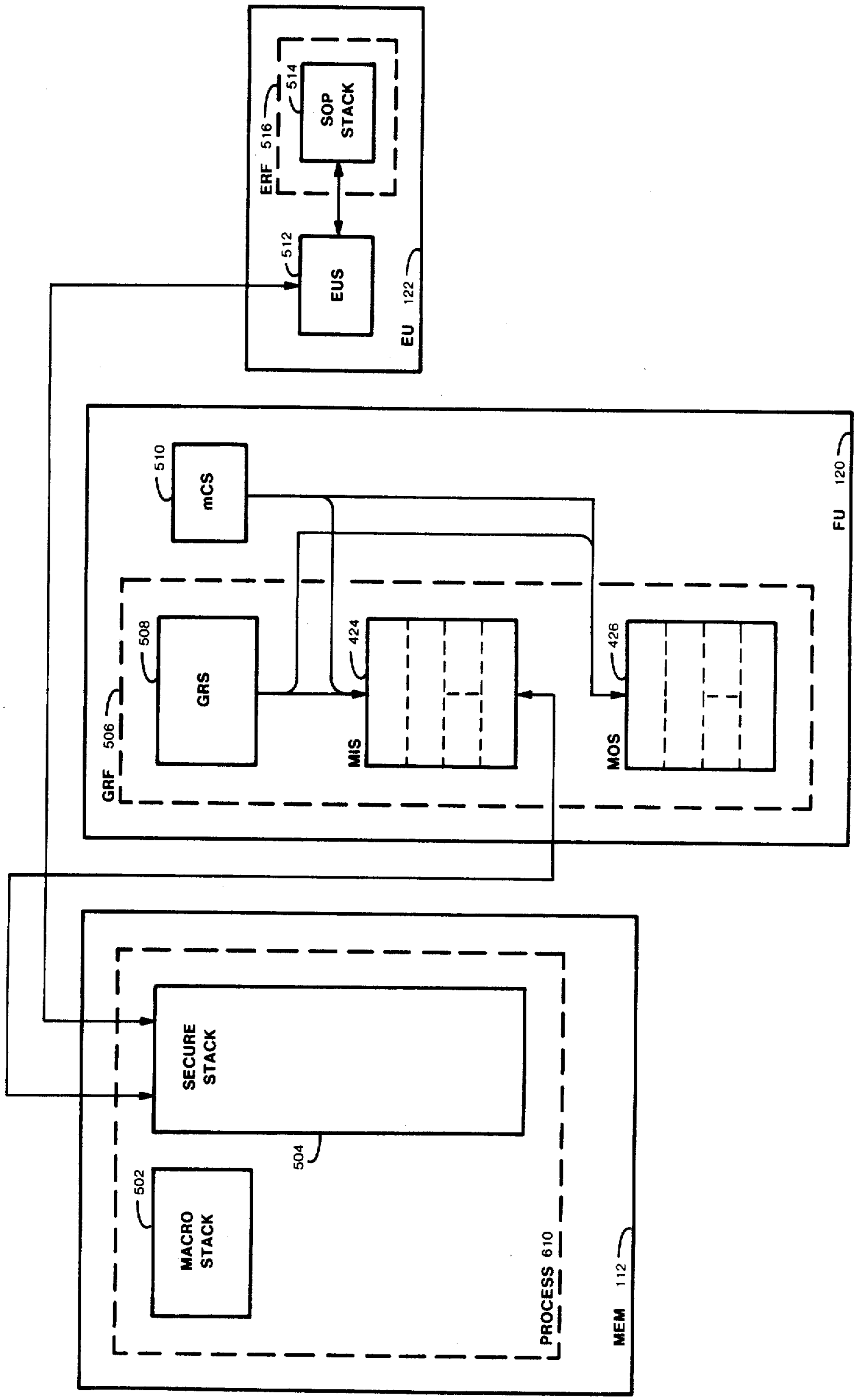
FIGS. 5–475 and FIG. A1 inclusive, briefly described below, are diagrams all relating to the present invention.

Referring to FIG. 4 and 4A, diagramic representations of various control levels and stack mechanisms of, respectively, conventional machines and CS 101, are shown. Referring first to FIG. 4, top level of control is provided by User Language Instructions 402, for example in FORTRAN or COBOL. User Language Instructions 402 are converted into a greater number of more detailed Machine Language Instructions 404, used within a machine to execute user's programs. Within the machine, Machine Language Instructions 404 are interpreted and executed by Microcode Instructions 406, that is sequences of microinstructions which in turn directly control Machine Hardware 408. Some conventional machines may include a Stack Mechanism 410 used to save current machine state, that is current microinstruction and contents of various machine registers, if a current Machine Language Instruction 404 cannot be executed or is interrupted. In general, machine state on the microcode and hardware level is not saved. Execution of a current Machine Language Instruction 404 is later resumed at start of the microinstruction sequence for executing that Machine Language Instruction 404.

Referring to FIG. 4A, top level control in CS 101 is by User Language Instructions 412 as in a conventional machine. In CS 101, however, User Language Instructions 412 are translated into SINs 414 which are of a higher level than conventional machine language instructions. In general, a single User Language Instruction 412 is transformed into at most two or three SINs 414, as opposed to an entire sequence of conventional Machine Language Instructions 404. SINs 414 are interpreted and executed by Microcode Instructions 416 (sequences of microinstructions) which directly control CS 101 Hardware 418. CS 101 includes a Macro-stack Mechanism (MAS) 420, at SINs 414 level, which is comparable to but different in construction and operation from a conventional Machine Language Stack Mechanism 410. CS 101 also includes Micro-code Stack Mechanisms 422 operating at Microcode 416 level, so that execution of an interrupted microinstruction of a microinstruction sequence may be later resumed with the particular microinstruction which was active at the time of the interrupt. CS 101 is therefore more efficient in handling interrupts in that execution of microinstruction sequences is resumed from the particular point that a microinstruction sequence was interrupted, rather than from the beginning of that sequence. As will be described further below, CS 101's Micro-code Stack Mechanisms 422 on microcode level is effectively comprised of two stack mechanisms. The first stack is Micro-instruction Stack (MIS) 424 while the second stack is referred to as Monitor Stack (MOS) 426. CS 101 SIN Microcode 428 and MIS 424 are primarily concerned with execution of SOPs of user's programs. Monitor Microcode 430 and MOS 426 are concerned with operation of certain CS 101 internal functions.

Division of CS 101's microcode stacks into an MIS 424 and a MOS 426 illustrates a further feature of CS 101. In conventional machines, monitor functions may be performed by a separate CPU operating in conjunction with the machine's primary CPU. In CS 101, a single hardware CPU is used to perform both functions with actual execution of both functions performed by separate groups of microcode. Monitor microcode operations may be initiated either by certain SINs 414 or by control signals generated directly by CS 101's Hardware 418. Invocation of Monitor Microcode 430 by Hardware 418 generated signals insures that CS 101's monitor functions may always be invoked.

Referring to FIG. 5, a diagramic representation of CS 101's stack mechanisms for *a single user's program, or procedure,* is shown. Basically, and with exception of MOS 426, CS 101's stacks reside in MEM 112 with certain portions of those stacks accelerated into FU 120 and EU 122 to enhance speed of operation.

Certain areas of MEM 112 storage space are set aside to contain Macro-Stacks (MASs) 502, stack mechanisms operating on the SINs level, as described above. Other areas of MEM 112 are set aside to contain Secure Stack (SS) 504, operating on the microcode level, as described above and of which MIS 424 is a part.

As described further below, both FU 120 and EU 122 contain register file arrays, referred to respectively as GRF and ERF, in addition to registers associated with, for example, ALUs. Referring to FU 120, shown therein is FU 120's GRF 506. GRF 506 is horizontally divided into three areas. A first area, referred to as General Registers (GRs) 508 may in general be used in the same manner as registers in a conventional machine. A second area of GRF 506 is Micro-Stack (MIS) 424, and is set aside to contain a portion of a Process's SS 504. A third portion of GRF 506 is set aside to contain MOS 426. Also indicated in FU 120 is a block referred to as Microcode Control State (mCS) 510. mCS 510 represents registers and other FU 120 hardware containing current operating state of FU 120 on the microinstruction and hardware level. mCS 510 may include, for example, the current microinstruction controlling operation of FU 120.

Referring to EU 122, indicated therein is a first block referred to as Execute Unit State (EUS) 512 and a second block referred to as SOP Stack 514. EUS 512 is similar to mCS 510 in FU 120 and includes all registers and other EU 122 hardware containing information reflecting EU 122's current operating state. SOP Stack 518 is a portion of EU 122's ERF 516 which has been set aside as a stack mechanism to contain a portion of a process's SS 504 pertaining to EU 122 operations.

Considering first MASs 502, as stated above MASs 502 operate generally upon the SINs level. MASs 502 are used in general to store current state of a process's (defined below) execution of a user's program.

Referring next to MIS 424, in a present embodiment of CS 101 that portion of GRF 506 set aside to contain MIS 424 may have a capacity of eight stack frames. That is, up to 8 microinstruction level interrupts or calls pertaining to execution of a user's program may be stacked within MIS 424. Information stored in MIS 424 stack frames is generally information from GR 508 and MCS 510. MIS 424 stack frames are transferred between MIS 424 and SS 504 such that at least one frame, and no more than 8 frames, of SS 504 reside in GRF 506. This insures that at least the top-most frames of a process's SS 504 are present in FU 120, thereby enhancing speed of operation of FU 120 by providing rapid access to those top frames. SS 504, residing in MEM 112, may contain, for all practical purposes, an unlimited number of frames so that MIS 424 and SS 504 appear to a user to be effectively an infinitely deep stack.

MOS 426 resides entirely in FU 120 and, in a present embodiment of CS 101, may have a capacity of 8 stack frames. A feature of CS 101 operation is that CS 101 mechanisms for handling certain events or interrupts should not rely in its operation upon those portions of CS 101 whose operation has resulted in those faults or interrupts. Among events handled by CS 101 monitor microcode, for example, are MEM 112 page faults. An MEM 112 page fault occurs whenever FU 120 makes a reference to data in MEM 112 and that data is not in MEM 112. Due to this and similar operations, MOS 426 resides entirely in FU 120 and thus does not rely upon information in MEM 112.

As described above, GRs 508, MIS 424, and MOS 426 each reside in certain assigned portions of GRF 506. This allows flexibility in modifying the capacity of GRs 508, MIS 424, and MOS 426 as indicated by experience, or to modify an individual CS 101 for particular purposes.

Referring finally to EU 122, EUS 512 is functionally a part of a process's SS 504. Also as previously described, EU 122 performs arithmetic operations in response to SINs and may be interrupted by FU 120 to aid certain FU 120 operations. EUS 512 allows stacking of interrupts. For example, FU 120 may first interrupt an arithmetic SOP to request EU 122 to aid in evaluation of a Name Table Entry. Before that first interrupt is completed, FU 120 may interrupt again, and so on.

SOP Stack 514, is a single frame stack for storing current state of EU 122 when an interrupt interrupts execution of an arithmetic SOP. An interrupted SOP's state is transferred into SOP Stack 514 and the interrupt begins execution in EUS 512. Upon occurrence of a second interrupt (before the first interrupt is completed) EU's first interrupt state is transferred from EUS 512 to a stack frame in SS 504, and execution of the second interrupt begins in EUS 512. If a third interrupt occurs before completion of second interrupt, EU's second interrupt state is transferred from EUS 512 to another stack frame in SS 504 and execution of the third interrupt is begun in EUS 512; and so on. EUS 512 and SS 504 thus provide an apparently infinitely deep microstack for EU 122. Assuming that the third interrupt is completed, state of second interrupt is transferred from SS 504 to EUS 512 and execution of second interrupt resumed. Upon completion of second interrupt, state of first interrupt is transferred from SS 504 to EUS 512 and completed. After completion of first interrupt, state of the original SOP is transferred from SOP Stack 514 to EUS 512 and execution of that SOP resumed.

C. Procedure Processes, and Virtual Processors (FIG. 6)

Figure 6:
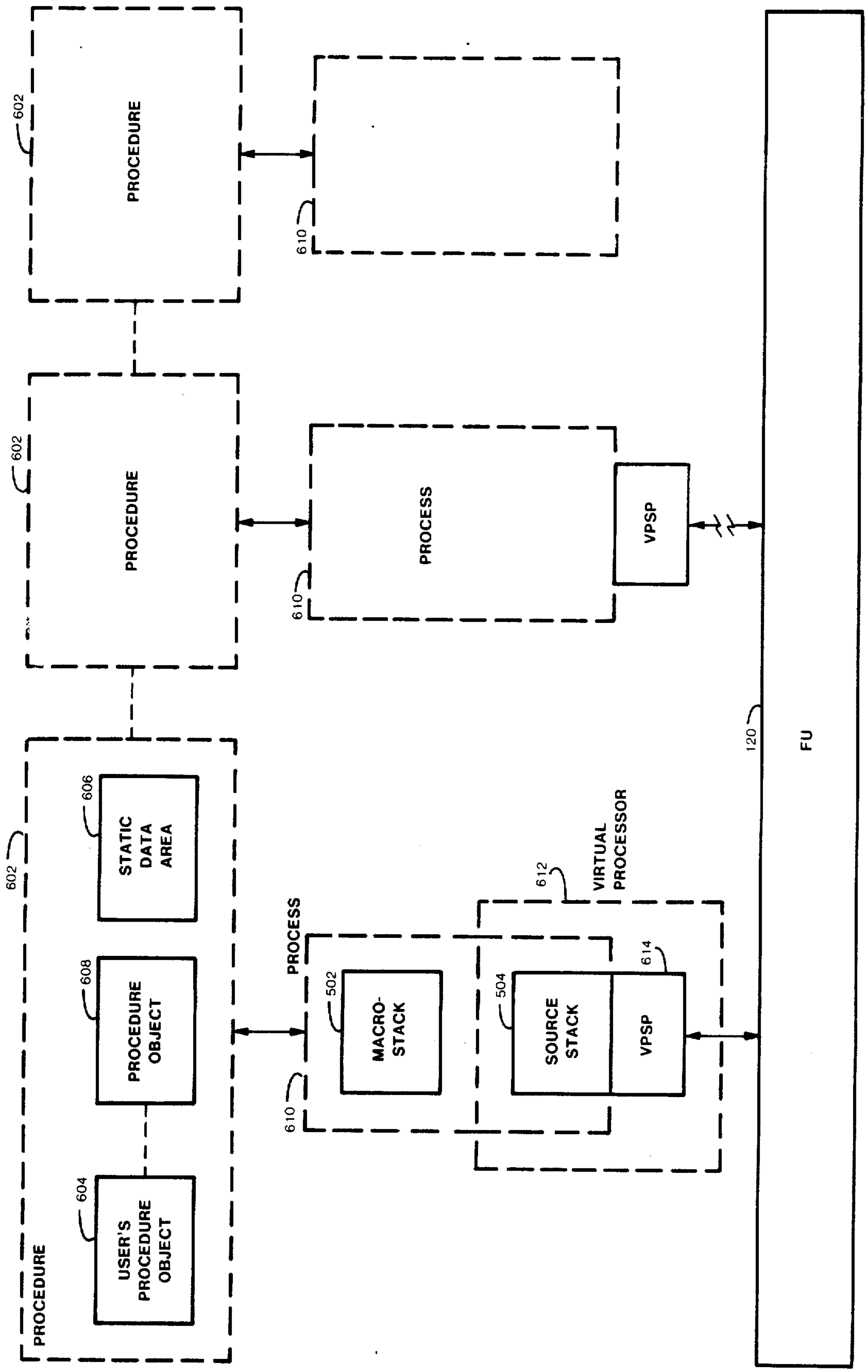
FIG. 6 is a diagram illustrating procedures, procedure objects, processes, and virtual processors.

Referring to FIG. 6, a diagramic representation of procedures, processes, and virtual processes is shown. As described above, a user's program to be executed is compiled to result in a Procedure 602. A Procedure 602 includes a User's Procedure Object 604 containing the SOPs of the user's program and a Name Table containing Entries for operand Names of the user's program, and a Static Data Area 606. A Procedure 602 may also include other Procedure Objects 608, for example utility programs available in common to many users. In effect, a Procedure 602 contains the instructions (procedures) and data of a user's program.

A Process 610 includes, as described above, a Macro-Stack (MAS) 502 storing state of execution of a user's Procedure 602 at the SOP level, and a Secure Stack (SS) 504 storing state of execution of a user's Procedure 602 at the microcode level. A Process 610 is associated with a user's Procedure 602 through the ABPs described above and which are stored in the MAS 502 of the Process 610. Similarly, the MAS 502 and SS 504 of a Process 610 are associated through non-architectural pointers, described above. A Process 610 is effectively a body of information linking the resources, hardware, microcode, and software, of CS 101 to a user's Procedure 602. In effect, a Process 610 makes the resources of CS 101 available to a user's Procedure 602 for executing of that Procedure 602. CS 101 is a multi-program machine capable of accommodating up to, for example, 128 Processes 610 concurrently. The number of Processes 610 which may be executed concurrently is determined by the number of Virtual Processors 612 of CS 101. There may be, for example, up to 16 Virtual Processors 612.

As indicated in FIG. 6, a Virtual Processor 612 is comprised of a Virtual Processor State Block (VPSB) 614 associated with the SS 504 of a Process 612. A VPSB 614 is, in effect, a body of information accessible to CS 101's operating system and through which CS 101's operating system is informed of, and provided with access to, a Process 610 through that Process 610's SS 504. A VPSB 614 is associated with a particular Process 610 by writing information regarding that Process 610 into that VPSB 614. CS 101's operating system may, by gaining access to a Process 610 through an associated UPSP 614, read information, such as ABP's, from that Process 610 to FU 120, thereby swapping that Process 610 onto FU 120 for execution. It is said that a Virtual Processor 612 thereby executes a Process 610; a Virtual Processor 612 may be regarded therefor, as a processor having "Virtual", or potential, existence which becomes "real" when its associated Process 610 is swapped into FU 120. In CS 101, as indicated in FIG. 6, only one Virtual Processor 612 may execute on FU 120 at a time and the operating system selects which Virtual Processor 612 will excecute on FU 120 at any given time. In addition, CS 101's operating system selects which Processes 610 will be associated with the available Virtual Processors 612.

Having briefly described certain individual structural and operating features of CS 101, the overall operation of CS 101 will be described in further detail next below in terms of these individual features.

D. CS 101 Overall Structure and Operation (FIGS. 7, 8, 9, 10, 11, 12, 13, 14, 15)

1. Introduction (FIG. 7)

Figure 7:
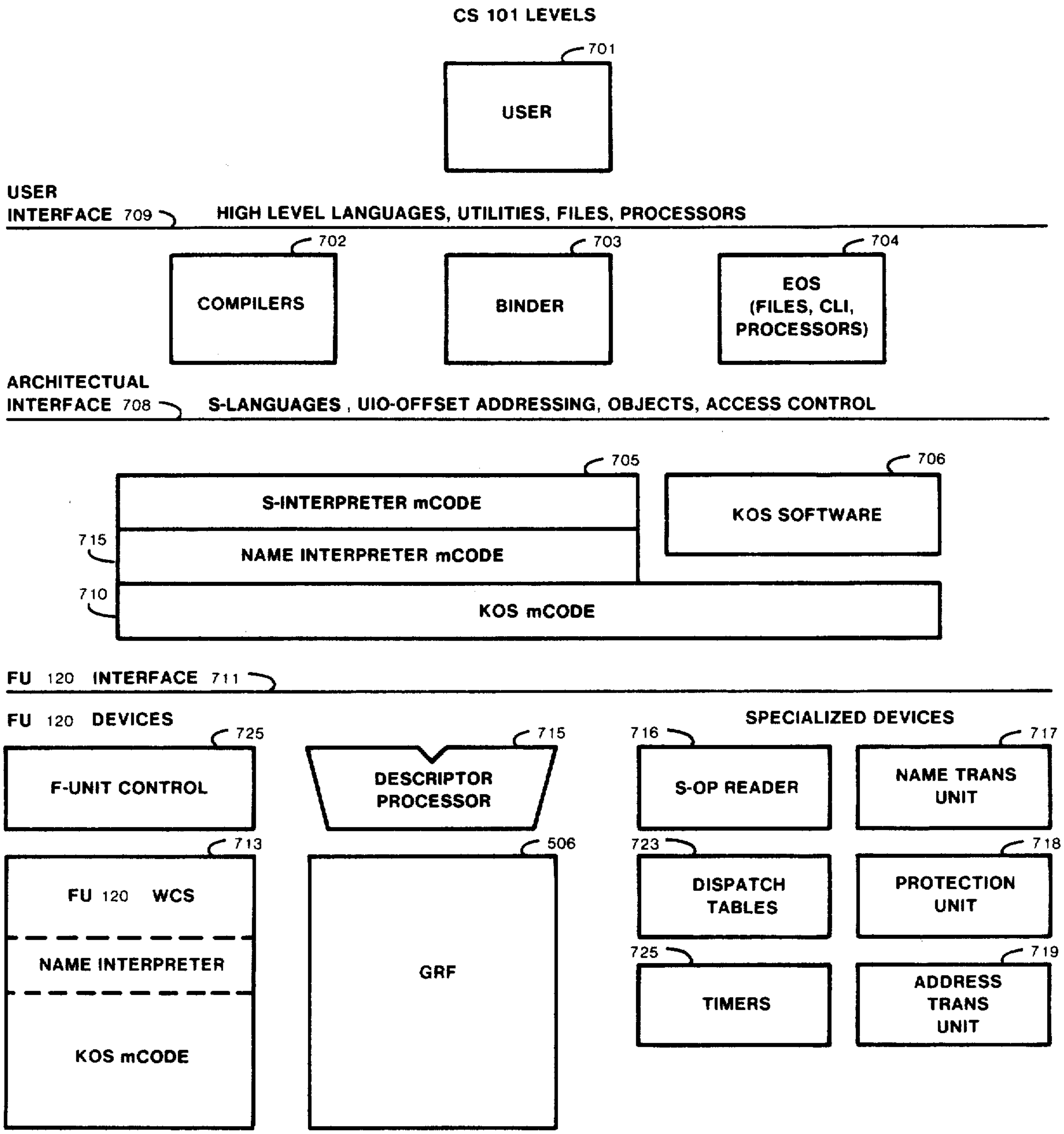
FIG. 7 is a diagram illustrating operating levels and mechanisms of the present computer.

As indicated in FIG. 7, CS 101 is a multiple level system wherein operations in one level are generally transparent to higher levels. User 701 does not see the S-Language, addressing, and protection mechanisms defined at Architectural Level 708. Instead, he sees User Interface 709, which is defined by Compilers 702, Binder 703, and Extended (high level) Operating System (EOS) 704. Compilers 702 translate high-level language code into SINs and Binder 703 translates symbolic Names in programs into UID-offset addresses.

As FIG. 7 shows, Architectural Level 708 is not defined by FU 120 Interface 711. Instead, the architectural resources level are created by S-Language interpreted SINs when a program is executed; Name Interpreter 715 operates under control of S-Language Interpreters 705 and translates Names into logical descriptors. In CS 101, both S-Language Interpreters 705 and Name Interpreter 715 are implemented as microcode which executes on FU 120. S-Language Interpreters 705 may also use EU 122 to perform calculations. A Kernel Operating System (KOS) provides CS 101 with UID-offset addressing, objects, access checking, processes, and virtual processors, described further below. KOS has three kinds of components: KOS Microcode 710, KOS Software 706, and KOS Tables in MEM 112. KOS 710 components are microcode routines which assist FU 120 in performing certain required operations. Like other high-level language routines, KOS 706 components contain SINs which are interpreted by S-Interpreter Microcode 705. Many KOS High-Level Language Routines 706 are executed by special KOS processes; others may be executed by any process. Both KOS High-Level Language Routines 706 and KOS Microcode 710 manipulate KOS Tables in MEM 112.

FU 120 Interface 711 is visible only to KOS and to S-Interpreter Microcode 705. For the purposes of this discussion, FU 120 may be seen as a processor which contains the following main elements:

A Control Mechanism 725 which executes microcode stored in Writable Control Store 713 and manipulates FU 120 devices as directed by this microcode.

A GRF 506 containing registers in which data may be stored.

A Processing Unit 715.

All microcode which executes on FU 120 uses these devices; there is in addition a group of devices for performing special functions; these devices are used only by microcode connected with those functions. The microcode, the specialized devices, and sometimes tables in MEM 112 make up logical machines for performing certain functions. These machines will be described in detail below.

In the following, each of the levels illustrated in FIG. 7 will be discussed in turn. First, the components at User Interface 709 will be examined to see how they translate user programs and requests into forms usable by CS 101. Then the components below the User Interface 709 will be examined to see how they create logical machines for performing CS 101 operations.

2. Compilers 702 (FIG. 7)

Compilers 702 translate files containing the high-level language code written by User 701 into Procedure Objects 608. Two components of a Procedure Object 608 are code (SOPs) and Names, previously described. SOPs represent operations, and the Names represent data. A single SIN thus specifies an operation to be performed on the data represented by the Names.

3. Binder 703 (FIG. 7)

In some cases, Compiler 702 cannot define locations as offsets from an ABP. For example, if a procedure calls a procedure contained in another procedure object, the location to which the call transfers control cannot be defined as an offset from the PBP used by the calling procedure. In these cases, the compiler uses symbolic Names to define the locations. Binder 703 is a utility which translates symbolic Names into UID-offset addresses. It does so in two ways: by combining separate Procedure Objects 608 into a single large Procedure Object 608, and then redefining symbolic Names as offsets from that Procedure Object 608's ABPs, or by translating symbolic Names when the program is executed. In the second case, Binder 703 requires assistance from EOS 704.

4. EOS 704 (FIG. 7)

EOS 704 manages the resources that User 701 requires to execute his programs. From User 701's point of view, the most important of these resources are files and processes. EOS 704 creates files by requesting KOS to create an object and then mapping the file onto the object. When a User 701 performs an operation on a file, EOS 704 translates the file operation into an operation on an object. KOS creates them at EOS 704's request and makes them available to EOS 704, which in turn makes them available to User 701. EOS 704 causes a process to execute by associating it a Virtual Processor 612. In logical terms, a Virtual Processor 612 is the means which KOS provides EOS 704 for executing Processes 610. As many Processes 610 may apparently execute simultaneously in CS 101 as there are Virtual Processors 612. The illusion of simultaneous execution is created by multiplexing JP 114 among the Virtual Processors; the manner in which Processes 610 and Virtual Processors 610 are implemented will be explained in detail below.

5. KOS and Architectural Interface 708 (FIG. 7)

S-Interpreter Microcode 705 and Name Interpreter Microcode 715 require an environment provided by KOS Microcode 710 and KOS Software 706 to execute SINs. For example, as previously explained, Names and program locations are defined in terms of ABPs whose values vary during execution of the program. The KOS environment provides values for the ABPs, and therefore makes it possible to interpret Names and program locations as locations in MEM 112. Similarly, KOS help is required to transform logical descriptors into references to MEM 112 and to perform protection checks.

The environment provided by KOS has the following elements:

A Process 610 which contains the state of an execution of the program for a given User 701.

A Virtual Processor 612 which gives the Process 610 access to JP 114.

An Object Management System which translates UIDs into values that are usable inside JP 114.

A Protection System which checks whether a Process 610 has the right to perform an operation on an Object.

A Virtual Memory Management System which moves those portions of Objects which a Process 610 actually references from the outside world into MEM 112 and translates logical descriptors into physical descriptors.

In the following, the logical properties of this environment and the manner in which a program is executed in it will be explained.

6. Processes 610 and Virtual Processors 612 (FIG. 8)

Processes 610 and Virtual Processors 612 have already been described in logical terms; FIG. 8 gives a high-level view of their physical implementation.

Figure 8:
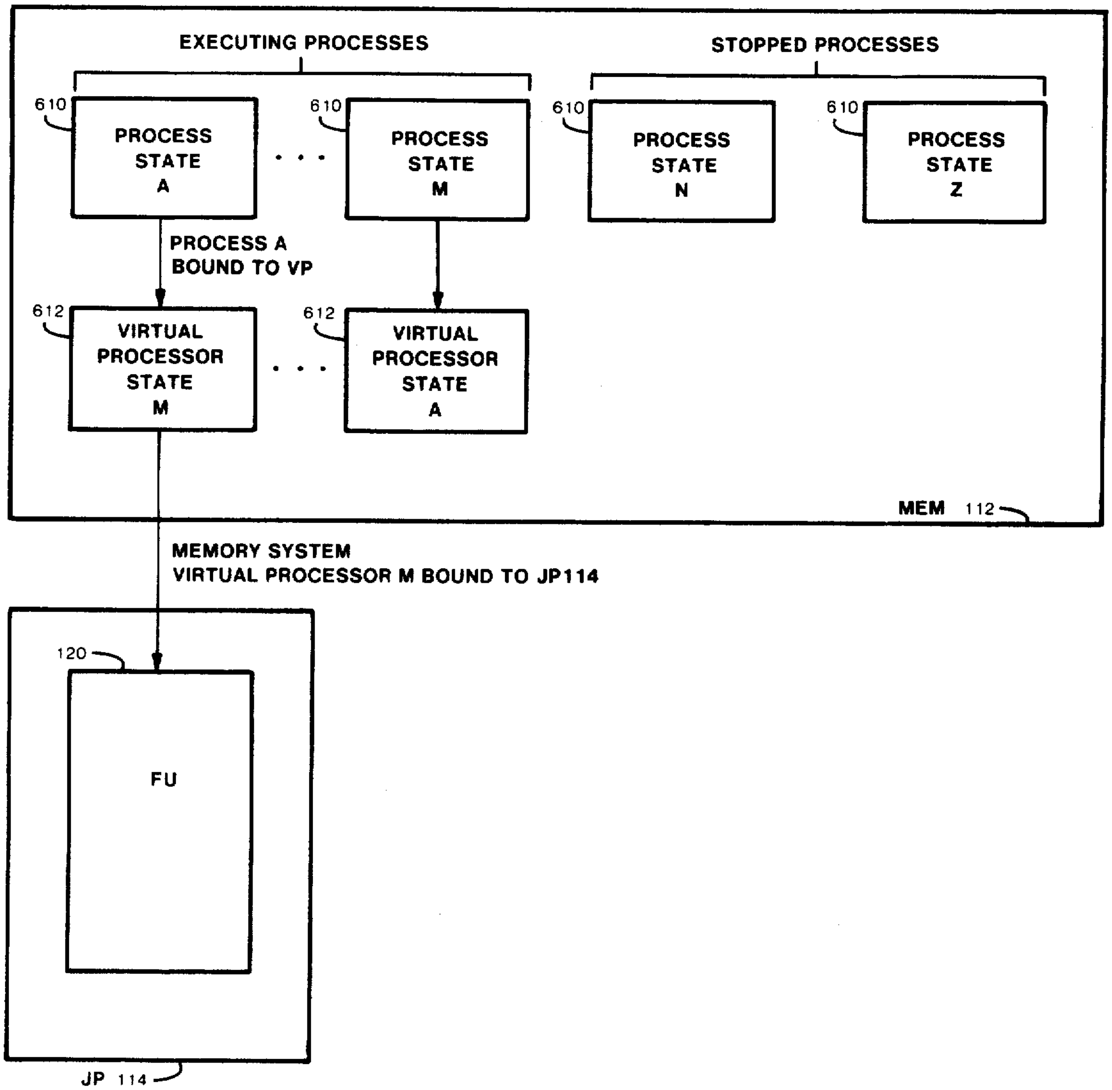
FIG. 8 is a diagram illustrating a physical implementation of processes and virtual processors.

FIG. 8 illustrates the relationship between Processes 610, Virtual Processors 612, and JP 114. In physical terms, a Process 610 is an area of MEM 112 which contains the current state of a user's execution of a program. One example of such state is the current values of the ABPs and a Program Counter (PC). Given the current value of the PBP and the PC, the next SOP in the program can be executed; similarly, given the current values of SDP and FP, the program's Names can be correctly resolved. Since the Process 610 contains the current state of a program's execution, the program's physical execution can be stopped and resumed at any point. It is thus possible to control program execution by means of the Process 610.

As already mentioned, a Process 610's execution proceeds only when KOS has bound it to a Virtual Processor 612, that is, an area of MEM 112 containing the state required to execute microinstructions on JP 114 hardware. The operation of binding is simply a transfer of Process 610 state from the Process 610's area of MEM 112 to a Virtual Processor 612's area of MEM 112. Since binding and unbinding may take place at any time, EOS 704 may multiplex Processes 610 among Virtual Processors 612. In FIG. 8, there are more Processes 610 than there are Virtual Processors 612. The physical execution of a Process 610 on JP 114 takes place only while the Process 610's Virtual Processor 612 is bound to JP 114, i.e., when state is transferred from Virtual Processor 612's area of MEM 112 to JP 114's registers. Just as EOS 704 multiplexes Virtual Processors 612 among Processes 610, KOS multiplexes JP 114 among Virtual Processors 612. In FIG. 8, only one Process 610 is being physically executed. The means by which JP 114 is multiplexed among Virtual Processors 612 will be described in further detail below.

Figure 9:
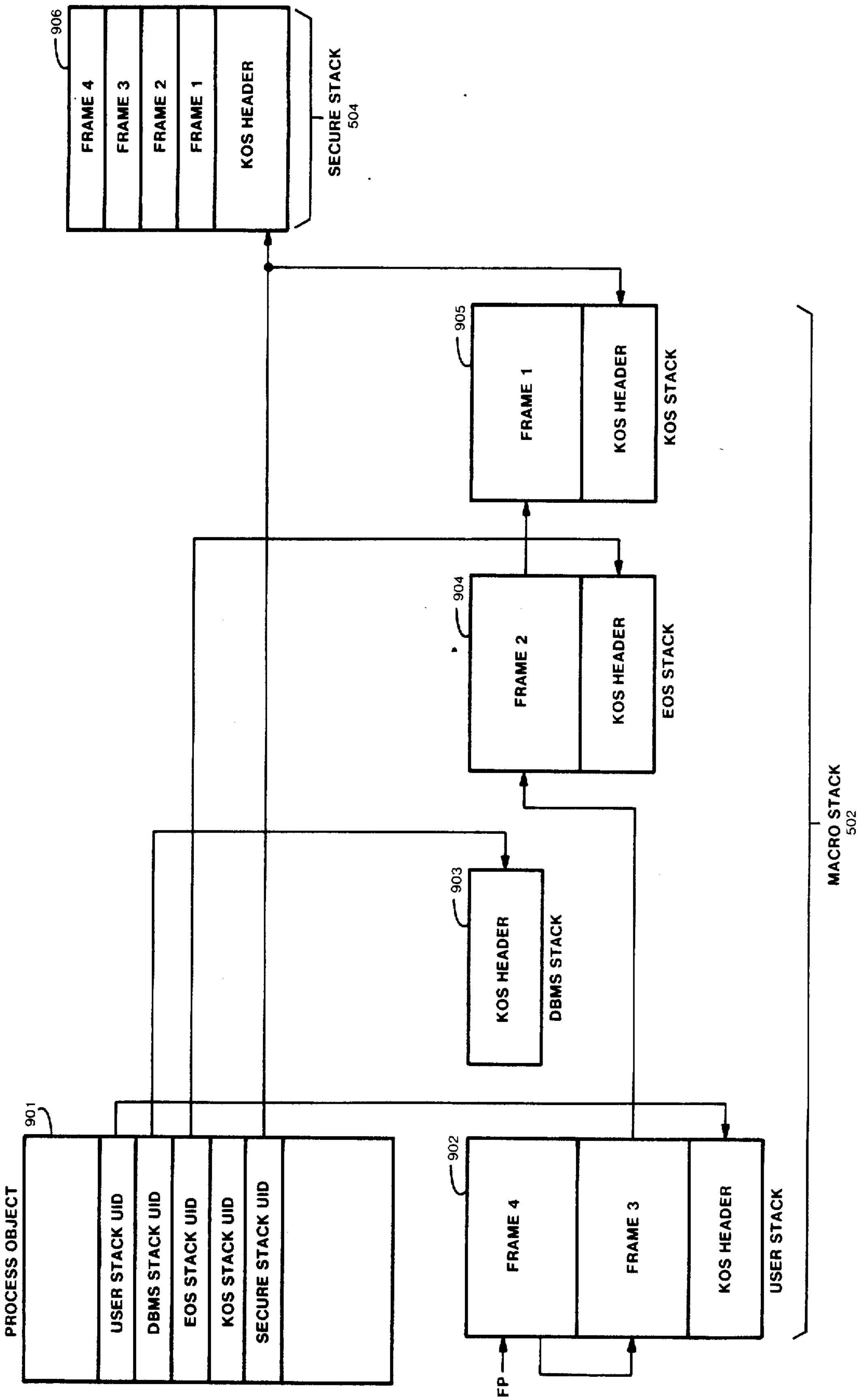
FIG. 9 is a diagram illustrating a process and process stack objects.

7. Processes 610 and Stacks (FIG. 9)

In CS 101 systems, a Process 610 is made up of six Objects: one Process Object 901 and Five Stack Objects 902 to 906. FIG. 9 illustrates a Process 610. Process Object 901 contains the information which EOS 704 requires to manage the Process 610. EOS 704 has no direct access to Process Object 901, but instead obtains the information it needs by means of functions provided to it by KOS 706, 710. Included in the information are the UIDs of Stack Objects 902 through 906. Stack Objects 902 to 906 contain the Process 610's state.

Stack Objects 902 through 905, are required by CS 101's domain protection method and comprise Process 610's MAS 502. Briefly, a domain is determined in part by operations performed when a system is operating in that domain. For example, the system is in EOS 704 domain when executing EOS 704 operations and in KOS 706, 710 domain when executing KOS 706, 710 operations. A Process 610 must have one stack for each domain it enters. In the present embodiment, the number of domains is fixed at four, but alternate embodiments may allow any number of domains, and correspondingly, any number of Stack Objects. Stack Object 906 comprises Process 610's Secure Stack 504 and is required to store state which may be manipulated only by KOS 706, 710.

Each invocation made by a Process 610 results in the addition of frames to Secure Stack 504 and to Macro-Stack 502. The state stored in the Secure Stack 504 frame includes the macrostate for the invocation, the state required to bind Process 610 to a Virtual Processor 612. The frame added to Macro-Stack 502 is placed in one of Stack Objects 902 through 905. Which Stack Objects 902 to 905 gets the frame is determined by the invoked procedure's domain of execution.

FIG. 9 shows the condition of a Process 610's MAS 502 and Secure Stack 504 after the Process 610 has executed four invocations. Secure Stack 504 has one frame for each invocation; the frames of Process 610's MAS 502 are found in Stack Objects 902, 904, and 905. As revealed by their locations, Frame 1 is for an invocation of a routine with KOS 706, 710 domain of execution, Frame 2 for an invocation of a routine with the EOS 704 domain of execution, and Frames 3 and 4 for invocations of routines with the User domain of execution. Process 610 has not yet invoked a routine with the Data Base Management System (DBMS) domain of execution. The frames in Stack Objects 902 through 905 are linked together, and a frame is added to or removed from Secure Stack 504 every time a frame is added to Stack Objects 902 through 905. MAS 502 and Secure Stack 504 thereby function as a single logical stack even though logically contained in five separate Objects.

Figure 10:
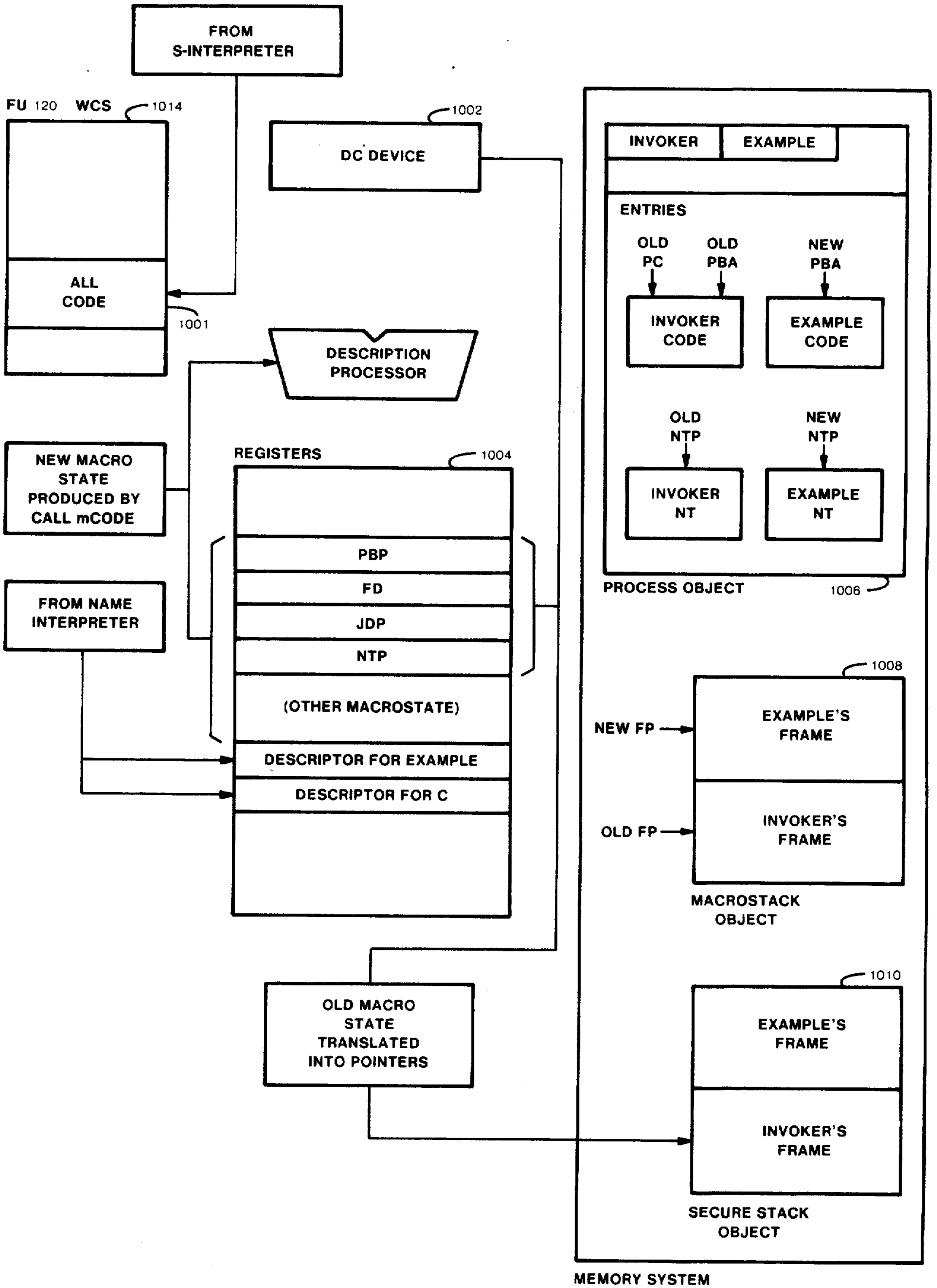
FIG. 10 is a diagram illustrating operation of macrostacks and secure stacks.
Figure 11:
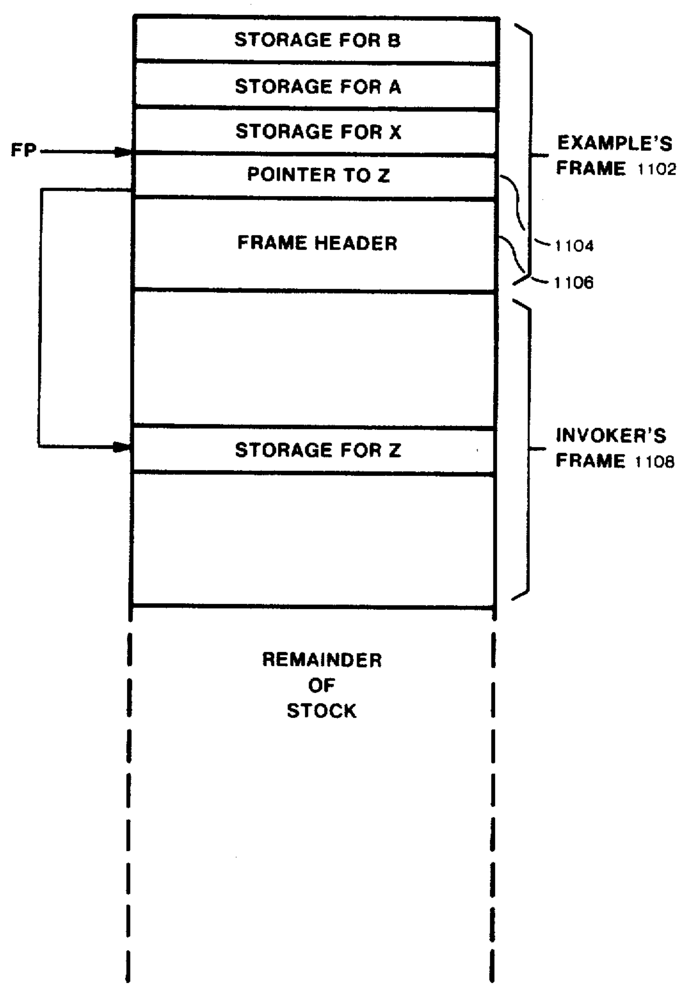
FIG. 11 is a diagram illustrating detailed structure of a stack.

8. Processes 610 and Calls (FIGS. 10, 11)

In the CS 101, calls and returns are executed by KOS 706, 710. When KOS 706, 710 performs a call for a process, it does the following:

It saves the calling invocation's macrostate in the top frame of Secure Stack 504 (FIG. 9).

It locates the procedure whose Name is contained in the call. The location of the first SIN in the procedure becomes the new PBP.

Using information contained in the called procedure, KOS 706, 710 creates a new MAS 502 frame in the proper Stack Object 902 through 905 and a new Secure Stack 504 frame in Secure Stack 504. FP is updated to point to the new MAS 502. If necessary, SDP is also updated.

Once the values of the ABPs have been updated, the PC is defined, Names can be resolved, and execution of the invoked routine can commence. On a return from the invocation to the invoking routine, the stack frames are deleted and the ABPs are set to the values saved in the invoking routine's macrostate. The invoking routine then continues execution at the point following the invocation.

A Process 610 may be illustrated in detail by putting the FORTRAN statement A+B into a FORTRAN routine called EXAMPLE and invoking it from another FORTRAN routine named CALLER. To simplify the example, it is assumed that CALLER and EXAMPLE both have the same domain of execution. The parts of EXAMPLE which are of interest look like this:

```
SUBROUTINE EXAMPLE (C)
INTEGER X,C
INTEGER A,B
...
A=B
...
RETURN
END
```

The new elements are a formal argument, C, and a new local variable, X. A formal argument is a data item which receives its value from a data item used in the invoking routine. The formal argument's value thus varies from invocation to invocation. The portions of INVOKER which are of interest look like this:

```
SUBROUTINE INVOKER
INTEGER Z
...
  CALL EXAMPLE (Z)
...
END
```

The CALL statement in INVOKER specifies the Name of the subroutine being invoked and the actual arguments for the subroutine's formal arguments. During the invocation, the subroutine's formal arguments take on the values of the actual arguments. Thus, during the invocation specified by this CALL statement, the formal argument C will have the value represented by the variable Z in INVOKER.

When INVOKER is compiled, the compiler produces a CALL SIN corresponding to the CALL statement. The CALL SIN contains a Name representing a pointer to the beginning of the called routine's location in a procedure object and a list of Names representing the call's actual arguments. When CALL is executed, the Names are interpreted to resolve the SIN's Names as previously described, and KOS 710 microcode to perform MAS 502 and Secure Stack 504 operations.

FIG. 10 illustrates the manner in which the KOS 710 call microcode manipulates MAS 502 and Secure Stack 504. FIG. 10 includes the following elements:

Call Microcode 1001, contained in FU 120 Writable Control Store 1014.

PC Device 1002, which contains part of macrostate belonging to the invocation of INVOKER which is executing the CALL statement.

Registers in FU Registers 1004. Registers 1004 contents include the remainder of macrostate and the descriptors corresponding to Names for EXAMPLE's location and the actual argument Z.

Procedure Object 1006 contains the entries for INVOKER and EXAMPLE, their Name Tables, and their code.

Macro-Stack Object 1008 (MAS 502) and Secure Stack Object 1010 (Secure Stack 504) contain the stack frames for the invocations of INVOKER and EXAMPLE being discussed here. EXAMPLE's frame is in the same Macro-Stack object as INVOKER's frame because both routines are contained in the same Procedure Object 1006, and therefore have the same domain of execution.

KOS Call Microcode 1001 first saves the macrostate of INVOKER's invocation on Secure Stack 504. As will be discussed later, when the state is saved, KOS 706 Call Microcode 1001 uses other KOS 706 microcode to translate the location information contained in the macrostate into the kind of pointers used in MEM 112. Then Microcode 1001 uses the descriptor for the routine Name to locate the pointer to EXAMPLE's entry in Procedure Object 1006. From the entry, it locates pointers to EXAMPLE's Name Table and the beginning of EXAMPLE's code. Microcode 1001 takes these pointers, uses other KOS 706 microcode to translate them into descriptors, and places the descriptors in the locations in Registers 1004 reserved for the values of the PBP and NTP. It then updates the values contained in PC Device 1002 so that when the call is finished, the next SIN to be executed will be the first SIN in EXAMPLE.

CALL Microcode 1001 next constructs the frames for EXAMPLE on Secure Stack 504 and Macro-Stack 502. This discussion concerns itself only with Frame 1102 on Macro-Stack 502. FIG. 11 illustrates EXAMPLE's Frame 1102. The size of Frame 1102 is determined by EXAMPLE's local variables (X, A, and B) and formal arguments (C). At the bottom of Frame 1102 is Header 1104. Header 1104 contains information used by KOS 706, 710 to manage the stack. Next comes Pointer 1106 to the location which contains the value represented by the argument C. In the invocation, the actual for C is the local variable Z in INVOKER. As is the case with all local variables, the storage represented by Z is contained in the stack frame belonging to INVOKER's invocation. When a name interpreter resolved C's name, it placed the descriptor in a register. Call Microcode 1001 takes this descriptor, converts it to a pointer, and stores the pointer above Header 1104.

Since the FP ABP points to the location following the last pointer to an actual argument, Call Microcode 1001 can now calculate that location, convert it into a descriptor, and place it in a FU Register 1004 reserved for FP. The next step is providing storage for EXAMPLE's local variables. EXAMPLE's Procedure Object 1006 contains the size of the storage required for the local variables, so Call Microcode 1001 obtains this information from Procedure Object 1006 and adds that much storage to Frame 1102. Using the new value of FP and the information contained in the Name Table Entries for the local data, Name Interpreter 715 can now construct descriptors for the local data. For example, A's entry in Name Table specified that it was offset 32 bits from FP, and was 32 bits long. Thus, its storage falls between the storage for X and B in FIG. 11.

Figure 12:
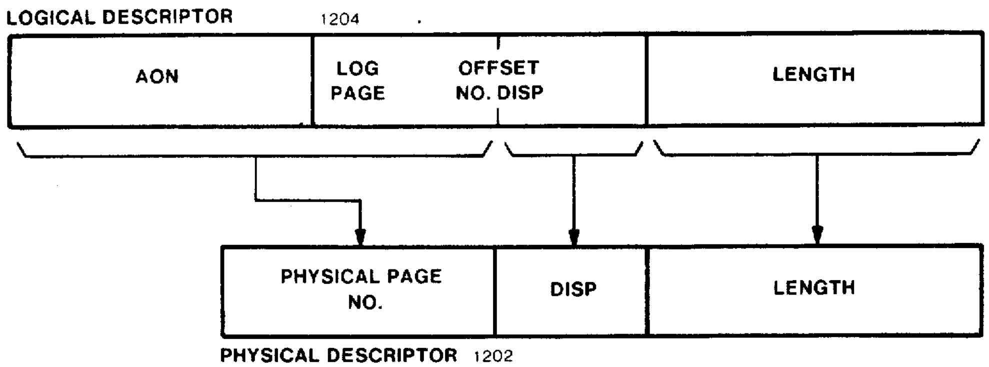
FIG. 12 is a diagram illustrating a physical descriptor.
Figure 13:
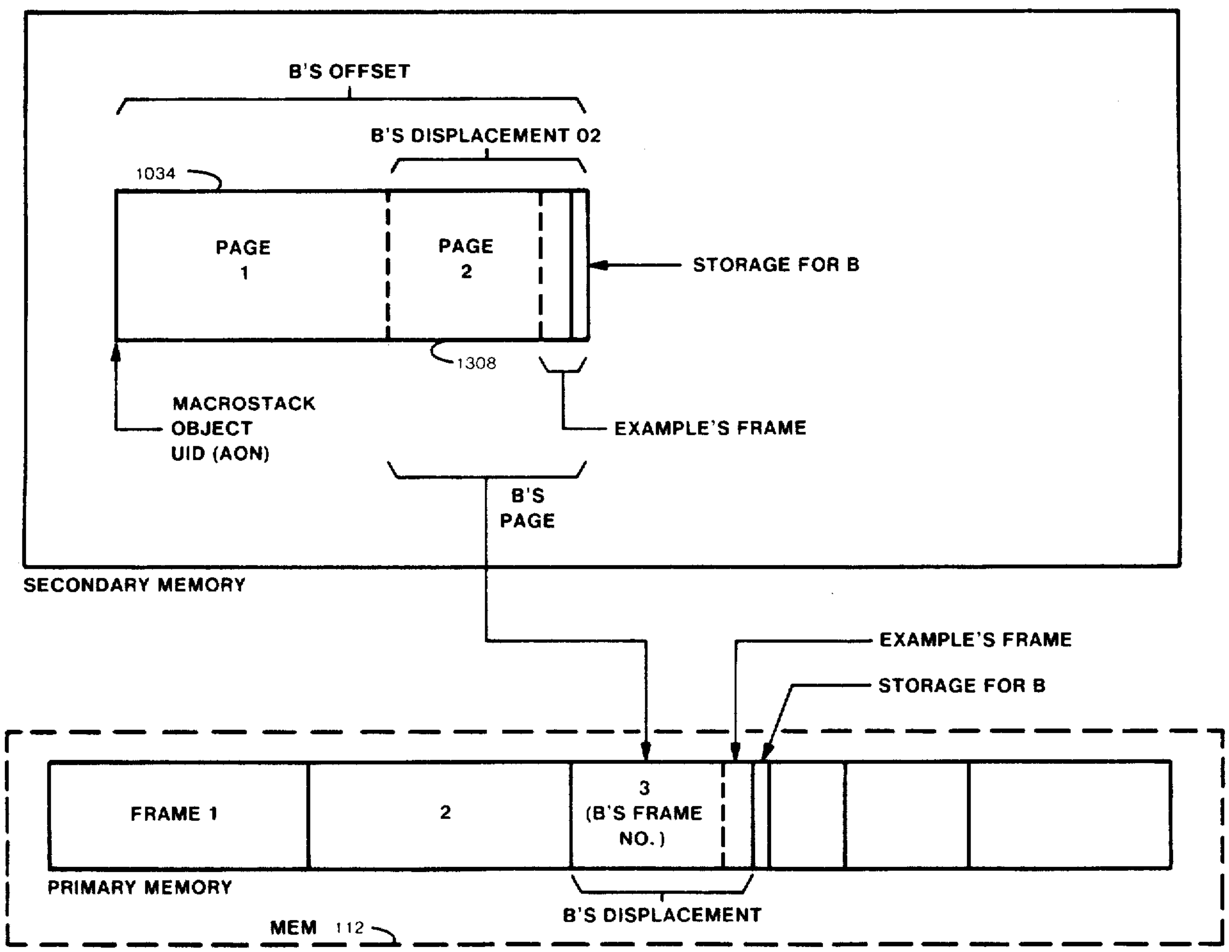
FIG. 13 is a diagram illustrating the relationship between logical pages and frames in a memory storage space.

9. Memory References and the Virtual Memory Management System (FIGS. 12, 13)

As already explained, a logical descriptor contains an AON field, an offset field, and a length field. FIG. 12 illustrates a Physical Descriptor. Physical Descriptor 1202 contains a Frame Number (FN) field, a Displacement (D) field, and a Length (L) field. Together, the Frame Number field and the Displacement field specify the location in MEM 112 containing the data, and the Length field specifies the length of the data.

As is clear from the above, the virtual memory management system must translate the AON-offset location contained in a logical descriptor 1204 into a Frame Number-Displacement location. It does so by associating logical pages with MEM 112 frames. (N.B: MEM 112 frames are not to be confused with stack frames). FIG. 13, illustrates how Macrostack 502 Object 1302 is divided into Logical Pages 1304 in secondary memory and how Logical Pages 1304 are moved onto Frames 1306 in MEM 112. A Frame 1306 is a fixed-size, contiguous area of MEM 112. When the virtual memory management system brings data into MEM 112, it does so in frame-sized chunks called Logical Pages 1308. Thus, from the virtual memory system's point of view, each object is divided into Logical Pages 1308 and the address of data on a page consists of the AON of the data's Object, the number of pages in the object, and its displacement on the page. In FIG. 13, the location of the local variable B of EXAMPLE is shown as it is defined by the virtual memory system. B's location is a UID and an offset, or, inside JP 114, an AON and an offset. As defined by the virtual memory system, B's location is the AON, the page number 1308, and a displacement within the page. When a process references the variable B, the virtual memory management system moves all of Logical Page 1308 into a MEM 112 Frame 1306. B's displacement remains the same, and the virtual memory system translates its Logical Page Number 1308 into the number of Frame 1306 in MEM 112 which contains the page.

The virtual memory management system must therefore perform two kinds of translations: (1) AON-offset addresses into AON-page number-displacement addresses, and (2) AON-page number into a frame number.

10. Access Control (FIG. 14)

Each time a reference is made to an Object, KOS 706, 710 checks whether the reference is legal. The following discusson will first present the logical structure of access control in CS 101, and then discuss the microcode and devices which implement it. CS 101 defines access in terms of subjects, modes of access, and Object size. A process may reference a data item located in an Object if three conditions hold:

(1) If the process's subject has access to the Object.

(2) If the modes of access specified for the subject include those required to perform the intended operation.

(3) If the data item is completely contained in the Object, i.e., if the data item's length added to the data item's offset do not exceed the number of bits in the Object.

The subjects which have access to an Object and the kinds of access they have to the Object are specified by a data structure associated with the Object called the Access Control List (ACL). An Object's size is one of its attributes. Neither an Object's size nor its ACL is contained in the Object. Both are contained in system tables, and are accessible by means of the Object's UID.

FIG. 14 shows the logical structure of access control in CS 101. Subject 1408 has four components: Principal 1404, Process 1405, Domain 1406, and Tag 1407. Tag 1407 is not implemented in a present embodiment of CS 101, so the following description will deal only with Principal 1404, Process 1405, and Domain 1406.

Principal 1404 specifies a user for which the process which is making the reference was created;

Process 1405 specifies the process which is making the reference; and,

Domain 1406 specifies the domain of execution of the procedure which the process is executing when it makes the reference.

Each component of the Subject 1408 is represented by a UID. If the UID is a null UID, that component of the subject does not affect access checking. Non-null UIDs are the UIDs of Objects that contain information about the subject components. Principal Object 1404 contains identification and accounting information regarding system users, Process Object 1405 contains process management information, and Domain Object 1406 contains information about per-domain error handlers.

There may be three modes of accessing an Object 1410: read, write, and execute. Read and write are self-explanatory; execute is access which allows a subject to execute instructions contained in the Object.

Access Control Lists (ACLs), 1412 are made up of Entries 1414. Each entry has two components: Subject Template 1416 and Mode Specifier 1418. Subject Template 1416 specifies a group of subjects that may reference the Object and Mode Specifier 1418 specifies the kinds of access these subjects may have to the Object. Logically speaking, ACL 1412 is checked each time a process references an Object 1410. The reference may succeed only if the process's current Subject 1408 is one of those on Object 1410's ACL 1412 and if the modes in the ACL Entry 1414 for the Subject 1408 allow the kind of access the process wishes to make.

11. Virtual Processors and Virtual Processor Swapping FIG. 15)

As previously mentioned, the execution of a program by a Process 610 cannot take place unles EOS 704 has bound the Process 610 to a Virtual Processor 612. Physical execution of the Process 610 takes place only while the process's Virtual Processor 612 is bound to JP 114. The following discussion deals with the data bases belonging to a Virtual Processor 612 and the means by which a Virtual Processor 612 is bound to and removed from JP 114.

FIG. 15 illustrates the devices and tables which KOS 706, 710 uses to implement Virtual Processors 612. FU 120 WCS contains KOS Microcode 706 for binding Virtual Processors 612 to JP 114 and removing them from JP 114. Timers 1502 and Interrupt Line 1504 are hardware devices which produce signals that cause the invocation of KOS Microcode 706. Timers 1502 contains two timing devices: Interval Timer 1506, which may be set by KOS 706, 710 to signal when a certain time is reached, and Egg Timer 1508, which guarantees that there is a maximum time interval for which a Virtual Processor 612 can be bound to JP 114 before it invokes KOS Microcode 706. Interrupt Line 1504 becomes active when JP 114 receives a message from IOS 116, for example when IOS 116 has finished loading a logical page into MEM 112.

FU 120 Registers 508 contain state belonging to the Virtual Processor 612 currently bound to JP 114. Here, this Virtual Processor 612 is called Virtual Processor A. In addition, Registers 508 contain registers reserved for the execution of VP Swapping Microcode 1510. ALU 1942 (part of FU 120) is used for the descriptor-to-pointer and pointer-to-descriptor transformations required when one Virtual Processor 612 is unbound from JP 114 and another bound to JP 114. MEM 112 contains data bases for Virtual Processors 612 and data bases used by KOS 706, 710 to manage Virtual Processors 612. KOS 706, 710 provides a fixed number of Virtual Processors 612 for CS 101. Each Virtual Processor 612 is represented by a Virtual Processor State Block (VPSB) 614. Each VPSB 614 contains information used by KOS 706, 710 to manage the Virtual Processor 612, and in addition contains information associating the Virtual Processor 612 with a process. FIG. 15 shows two VPSBs 614, one belonging to Virtual Processor 612A, and another belonging to Virtual Processor 612B, which will replace Virtual Processor 612A on JP 114. The VPSBs 614 are contained in VPSB Array 1512. The index of a VPSB 614 in VPSB Array 1512 is Virtual Processor Number 1514 belonging to the Virtual Processor 612 represented by a VPSB 614. Virtual Processor Lists 1516 are lists which KOS 706, 710 uses to manage Virtual Processors 612. If a Virtual Processor 612 is able to execute, its Virtual Processor Number 1514 is on a list called the Runnable List; Virtual Processors 612 which cannot run are on other lists, depending on the reason why they cannot run. It is assumed that Virtual Processor 612B's Virtual Processor Number 1514 is the first one on the Runnable List.

When a process is bound to a Virtual Procesor 612, the Virtual Processor Number 1514 is copied into the process's Process Object 901 and the AONs of the process's Process Object 901 and stacks are copied into the Virtual Processor 612's VPSB 614. (AONs are used because a process's stacks are wired active as long as the process is bound to a Virtual Processor 612). Binding is carried out by KOS 706, 710 at the request of EOS 704. In FIG. 15, two Secure Stack Objects 906 are shown, one belonging to the process to which Virtual Processor 612A is bound, and one belonging to that to which Virtual Processor 612B is bound.

Having described certain overall operating features of CS 101, a present implementation of CS 101's structure will be described further next below.

E. CS 101 Structural Implementation (FIGS. 16,17,18,19,20)

1. (IOS 116 (FIGS. 16, 17)

Figure 16:
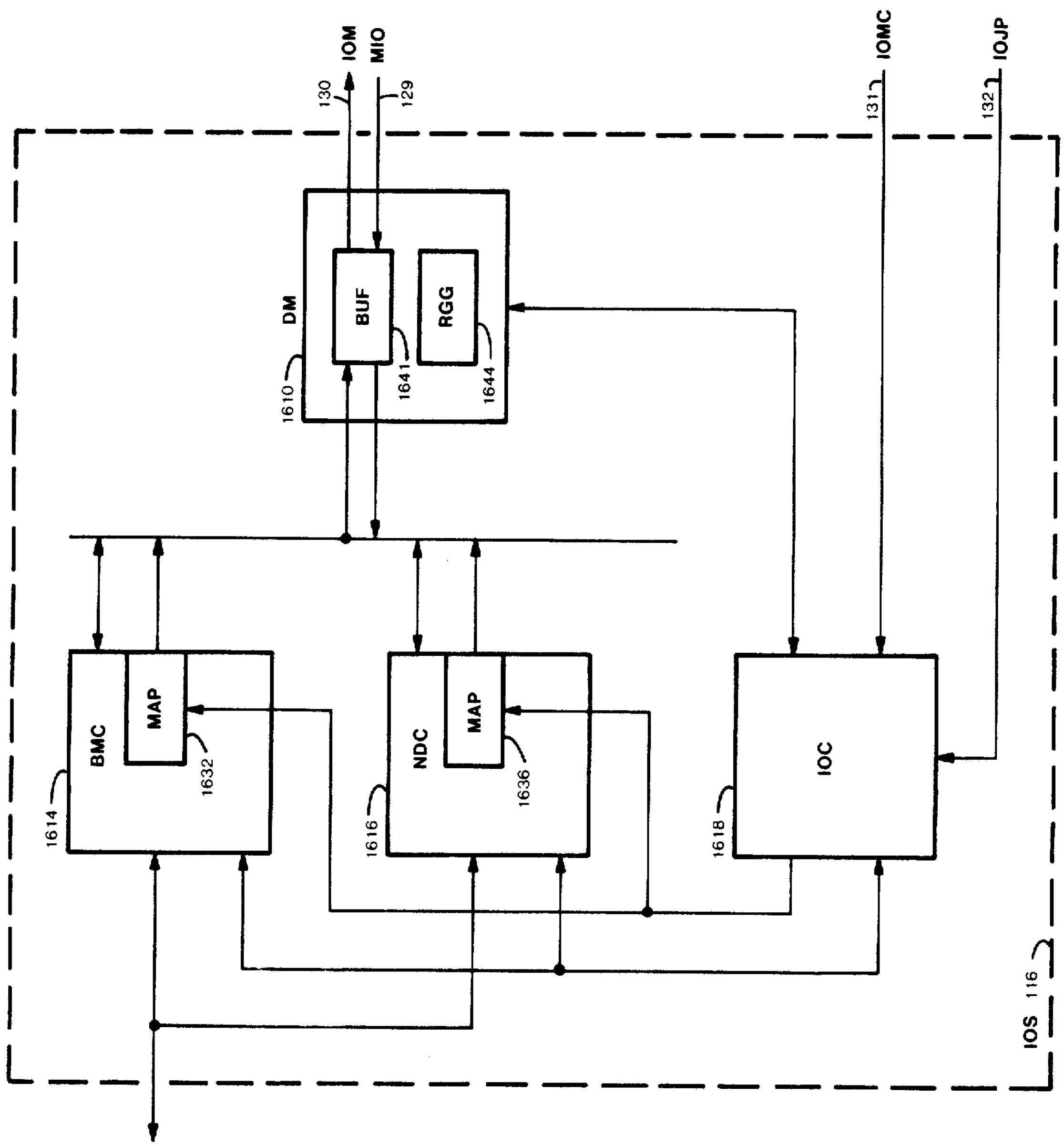
FIG. 16 is a partial block diagram of an I/O system of the present computer system.

Referring to FIG. 16, a partial block diagram of IOS 116 is shown. Major elements of IOS 116 include an ECLIPSE® Burst Multiplexer Channel (BMC) 1614 and a NOVA® Data Channel (NDC) 1616, an IO Controller (IOC) 1618 and a Data Mover (DM) 1610. IOS 116's data channel devices, for example BMC 1614 and NDC 1616, comprise IOS 116's interface to the outside world. Information and addresses are received from external devices, such as disk drives, communications modes, or other computer systems, by IOS 116's data channel devices and are transferred to DM 1610 (described below) to be written into MEM 112. Similarly, information read from MEM 112 is provided through DM 1610 to IOS 116's data channel devices and thus to the above described external devices. These external devices are a part of CS 101's addressable memory space and may be addressed through UID addresses.

IOC 1618 is a general purpose CPU, for example an ECLIPSE® computer available from Data General Corporation. A primary function of IOC 1618 is control of data transfer through IOS 116. In addition, IOC 1618 generates individual Maps for each data channel device for translating external device addresses into physical addresses within MEM 112. As indicated in FIG. 16, each data channel device contains an individual Address Translation Map (MAP) 1632 and 1636. This allows IOS 116 to assign individual areas of MEM 112's physical address space to each data channel device. This feature provides protection against one data channel device writing into or reading from information belonging to another data channel device. In addition, IOC 1618 may generate overlapping address translation Maps for two or more data channel devices to allow these data channel devices to share a common area of MEM 112 physical address space.

Data transfer between IOS 116's data channel devices and MEM 112 is through DM 1610, which includes a Buffer memory (BUF) 1641. BUF 1641 allows MEM 112 and IOS 116 to operate asychronously. DM 1610 also includes a Ring Grant Generator (RGG) 1644 which controls access of various data channel devices to MEM 112. RGG 1644 is designed to be flexible in apportioning access to MEM 112 among IOS 116's data channel devices as loads carried by various data channel devices varies. In addition, RGG 1644 insures that no one, or group, of data channel devices may monopolize access to MEM 112.

Figure 17:
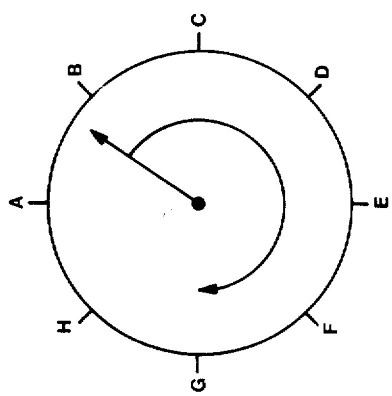
FIG. 17 is a diagram illustrating operation of a ring grant generator.

Referring to FIG. 17, a diagramic representation of RGG 1644's operation is shown. As described further in a following description, RGG 1644 may be regarded as a commutator scanning a number of ports which are assigned to various channel devices. For example, ports A, C, E, and G may be assigned to a BMC 1614, ports B and F to a NDC 1616, and ports D and H to another data channel device. RGG 1644 will scan each of these ports in turn and, if the data channel device associated with a particular port is requesting access to MEM 112, will grant access to MEM 112 to that data channel device. If no request is present at a given port, RGG 1644 will continue immediately to the next port. Each data channel device assigned one or more ports is thereby insured opportunity of access to MEM 112. Unused ports, for example indicating data channel devices which are not presently engaged in information transfer, are effectively skipped over so that access to MEM 112 is dynamically modified according to the information transfer loads of the various data channel devices. RGG 1644's ports may be reassigned among IOS 116's various data channel devices as required to suit the needs of a particular CS 101 system. If, for example, a particular CS 101 utilizes NDC 1616 more than a BMC 1614, that CS 101's NDC 1616 may be assigned more ports while that CS 101's BMC 1614 is assigned fewer ports.

Figure 18:
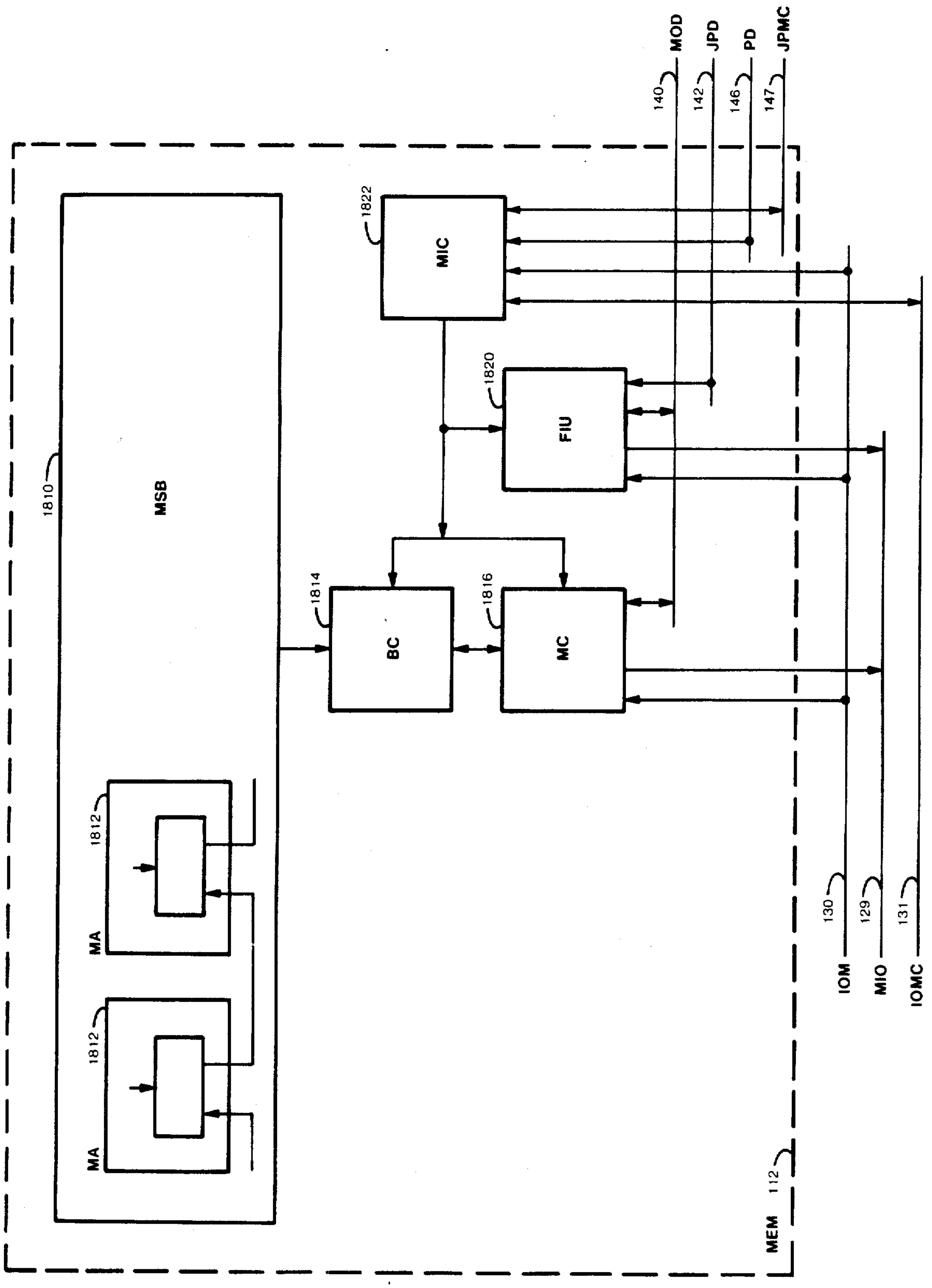
FIG. 18 is a partial block diagram of a memory system.

2 Memory (MEM) 112 (FIG. 18)

Referring to FIG. 18, a partial block diagram of MEM 112 is shown. Major elements of MEM 112 are Main Store Bank (MSB) 1810, a Bank Controller (BC) 1814, a Memory Cache (MC) 1816, a Field Interface Unit (FIU) 1820, and Memory Interface Controller (MIC) 1822. Interconnections of these elements with input and output buses of MEM 112 to IOS 116 and JP 114 are indicated.

MEM 112 is an intelligent, prioritizing memory having a single port to IOS 116, comprised of IOM Bus 130, MIO Bus 129, and IOMC Bus 131, and dual ports to JP 114. A first JP 114 port is comprised of MOD Bus 140 and PD Bus 146, and a second port is comprised of JPD Bus 142 and PD Bus 146. In general, all data transfers from and to MEM 112 by IOS 116 and JP 114 are of single, 32 bit words; IOM Bus 130, MIO Bus 129, MOD Bus 140, and JPD Bus 142 are each 32 bits wide. CS 101, however, is a variable word length machine wherein the actual physical width of data buses are not apparent to a user. For example, a Name in a user's program may refer to an operand containing 97 bits of data. To the user, that 97 bit data item will appear to be read from MEM 112 to JP 114 in a single operation. In actuality, JP 114 will read that operand from MEM 112 in a series of read operations referred to as a string transfer. In this example, the string transfer will comprise three 32 bit read transfers and one single bit read transfer. The final single bit transfer, containing a single data bit, will be of a 32 bit word wherein one bit is data and 31 bits are fill. Write operations to MEM 112 may be performed in the same manner. If a single read or write request to MEM 112 specifies a data item of less than 32 bits of data, that transfer will be accomplished in the same manner as the final transfer described above. That is, a single 32 bit word will be transferred wherein non-data bits are fill bits.

Bulk data storage in MEM 112 is provided in MSB 1810, which is comprised of one or more Memory Array cards (MAs) 1812. The data path into and out of MA 1812 is through BC 1814, which performs all control and timing functions for MAs 1812. BC 1814's functions include addressing, transfer of data, controlling whether a read or write operation is performed, refresh, sniffing, and error correction code operations. All read and write operations from and to MAs 1812 through BC 1814 are in blocks of four 32 bit words.

The various MAs 1812 comprising MSB 1810 need not be of the same data storage capacity. For example, certain MAs 1812 may have a capacity of 256 kilobytes while other MAs 1812 may have a capacity of 512 kilobytes. Addressing of the MAs 1812 in MSB 1810 is automatically adapted to various MA 1812 configurations. As indicated in FIG. 18, each MA 1812 contains an address circuit (A) which receives an input from the next lower MA 1812 indicating the highest address in that next lower MA 1812. The A circuit on an MA 1812 also receives an input from that MA 1812 indicating the total address space of that MA 1812. The A circuit of that MA 1812 adds the highest address input from next lower MA 1812 to its own input representing its own capacity and generates an output to the next MA 1812 indicating its own highest address. All MAs 1812 of MSB 1810 are addressed in parallel by BC 1814. Each MA 1812 compares such addresses to its input from the next lower MA 1812, representing highest address of that next lower MA 1812, and its own output, representing its own highest address, to determine whether a particular address provided by BC 1814 lies within the range of addresses contained within that particular MA 1812. The particular MA 1812 whose address space includes that address will then respond by accepting the read or write request from BC 1814.

MC 1816 is the data path for transfer of data between BC 1814 and IOS 116 and JP 114. MC 1816 contains a high speed cache storing data from MSB 1810 which is currently being utilized by either IOS 116 or JP 114. MSB 1810 thereby provides MEM 112 with a large storage capacity while MC 1816 provides the appearance of a high speed memory. In addition to operating as a cache, MC 1816 includes a bypass write path which allows IOS 116 to write blocks of four 32 bit words directly into MSB 1810 through BC 1814. In addition, MC 1816 includes a cache write-back path which allows data to be transferred out of MC 1816's cache and stored while further data is transferred into MC 1816's cache. Displaced data from MC 1816's cache may then be written back into MSB 1810 at a later, more convenient time. This write-back path enhances speed of operation of MC 1816 by avoiding delays incurred by transferring data from MC 1816 to MSB 1810 before new data may be written into MC 1816.

MEM 112's FIU 1820 allows manipulation of data formats in writes to and reads from MEM 112 by both JP 114 and IOS 116. For example, FIU 1820 may convert unpacked decimal data to packed decimal data, and vice versa. In addition, FIU 1820 allows MEM 112 to operate as a bit addressable memory. For example, as described all data transfers to and from MEM 112 are of 32 bit words. If a data transfer of less than 32 bits is required, the 32 bit word containing those data bits may be read from MC 1816 to FIU 1820 and therein manipulated to extract the required data bits. FIU 1820 then generates a 32 bit word containing those required data bits, plus fill bits, and provides that new 32 bit word to JP 114 or IOS 116. When writing into MEM 112 from IOS 116 through FIU 1820, data is transferred onto IOM Bus 130, read into FIU 1820, operated upon, transferred onto MOD Bus 140, and transferred from MOD Bus 140 to MC 1816. In read operations from MEM 112 to IOS 116, data is transferred from MC 1816 to MOD Bus 140, written into FIU 1820 and operated upon, and transferred onto MIO Bus 129 to IOS 116. In a data read from MEM 112 to JP 114, data is transferred from MC 1816 onto MOD Bus 140, transferred into FIU 1820 and operated upon, and transferred again onto MOD Bus 140 to JP 114. In write operations from JP 114 to MEM 112, data on JPD Bus 142 is transferred into FIU 1820 and operated upon, and is then transferred onto MOD Bus 140 to MC 1816. MOD Bus 140 is thereby utilized as an MEM 112 internal bus for FIU 1820 operations.

Finally, MIC 1822 provides primary control of BC 1814, MC 1816, and FIU 1820. MIC 1822 receives control inputs from and provides control outputs to PD Bus 146 and IOMC Bus 131. MIC 1822 contains primary microcode control for MEM 112, but BC 1814, MC 1816, and FIU 1820 each include internal microcode control. Independent, internal microcode controls allow BC 1814, MC 1816, and FIU 1820 to operate independently of MIC 1822 after their operations have been initiated by MIC 1822. This allows BC 1814 and MSB 1810, MC 1816, and FIU 1820 to operate independently and asynchronously. Efficiency and speed of operation of MEM 112 are thereby enhanced by allowing pipelining of MEM 112 operations.

3. Fetch Unit (FU) 120 (FIG. 19)

A primary function of FU 120 is to execute SINs. In doing so, FU 120 fetches instructions and data (SOPs and Names) from MEM 112, returns results of operations to MEM 112, directs operation of EU 122, executes instructions of user's programs, and performs the various functions of CS 101's operating systems. As part of these functions, FU 120 generates and manipulates logical addresses and descriptors and is capable of operating as a general purpose CPU.

Figure 19:
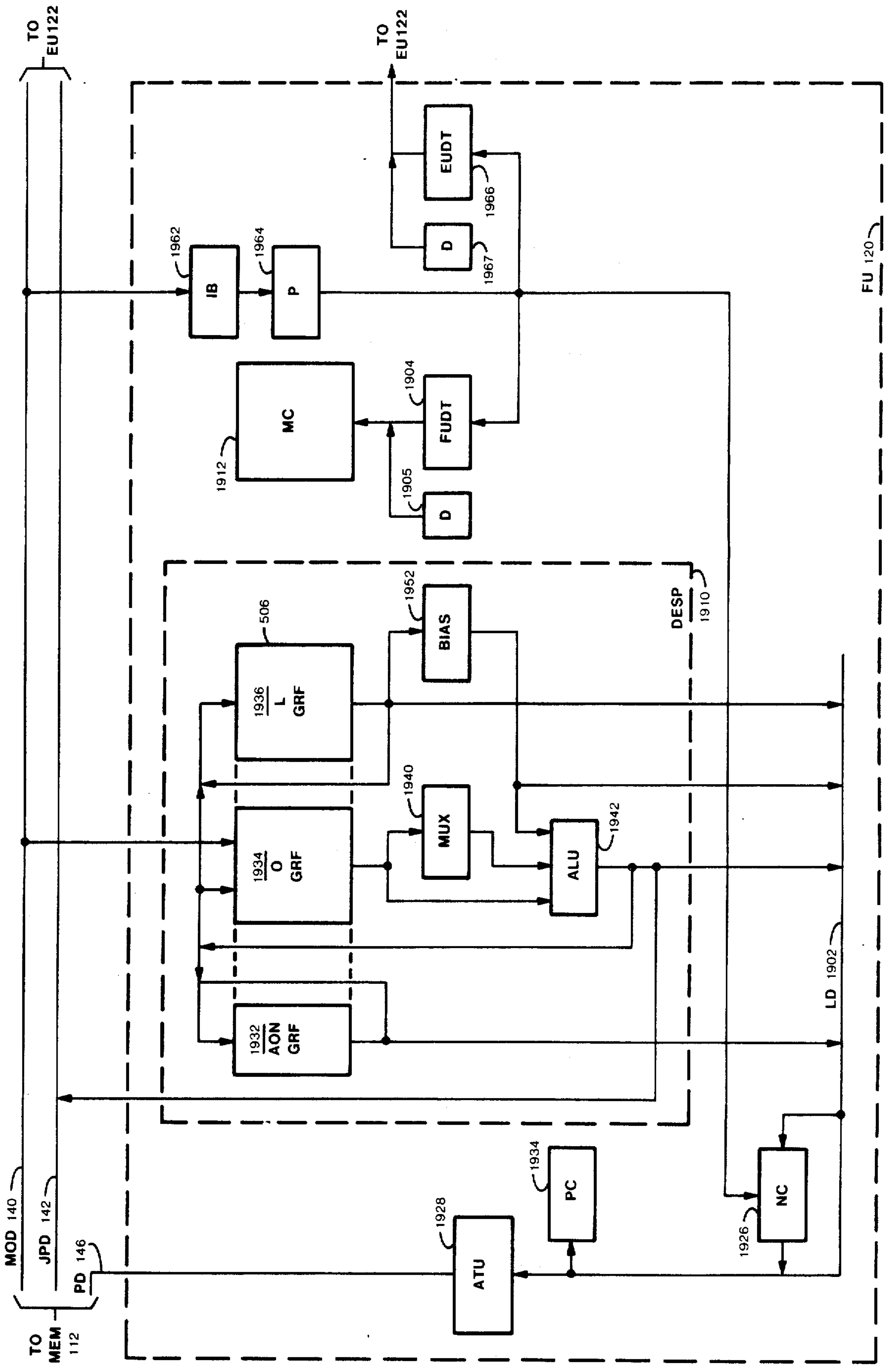
FIG. 19 is a partial block diagram of a fetch unit of the present computer system.
Figure 20:
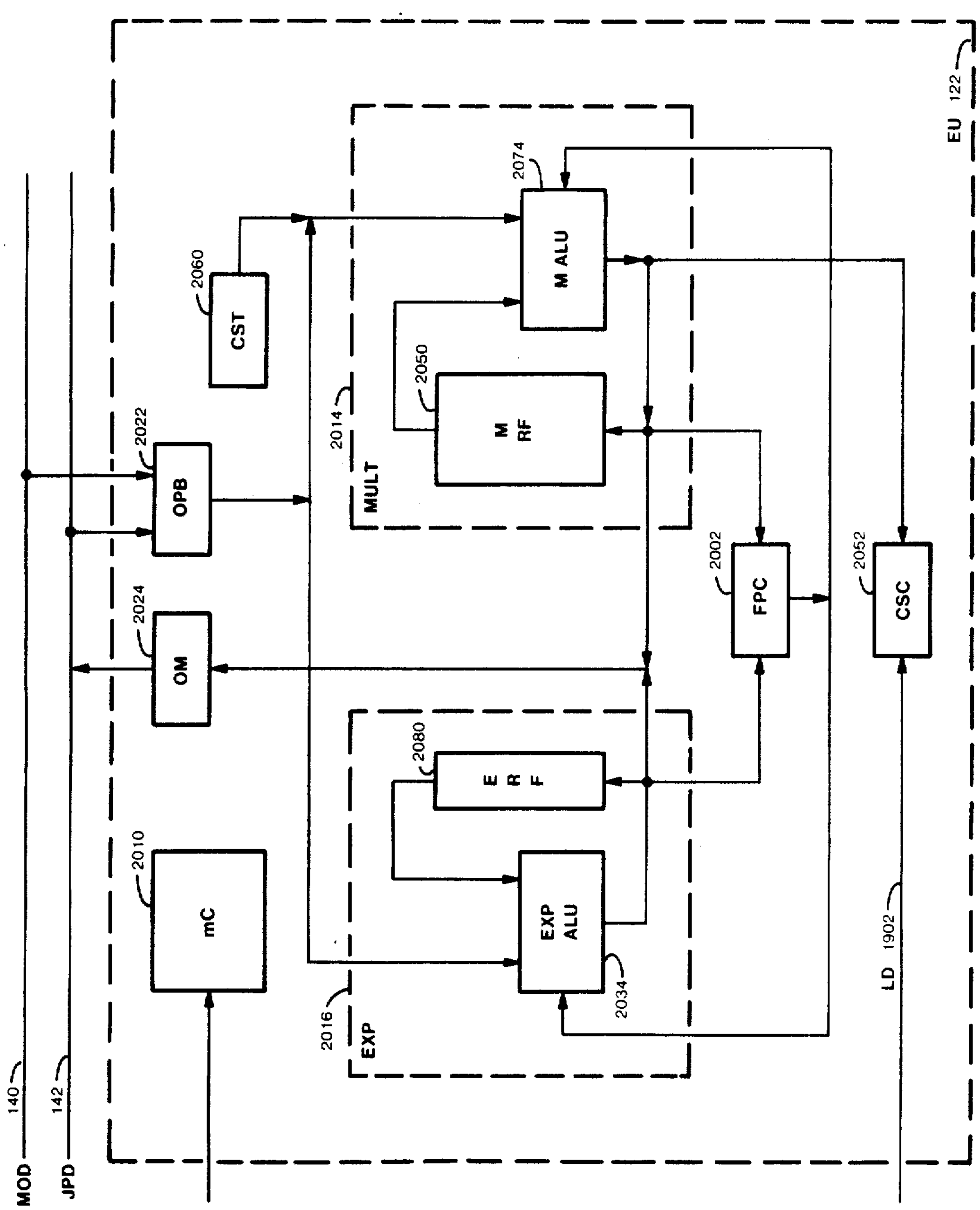
FIG. 20 is a partial block diagram of an execute unit of the present computer system.

Referring to FIG. 19, a major element of FU 120 is the Descriptor Processor (DESP) 1910. DESP 1910 includes General Register File (GRF) 506. GRF 506 is a large register array divided vertically into three parts which are addressed in parallel. A first part, AONGRF 1932, stores AON fields of logical addresses and descriptors. A second part, OFFGRF 1934, stores offset fields of logical addresses and descriptors and is utilized as a 32 bit wide general register array. A third portion GRF 506, LENGRF 1936, is a 32 bit wide register array for storing length fields of logical descriptors and as a general register for storing data. Primary data path from MEM 112 to FU 120 is through MOD Bus 140, which provides inputs to OFFGRF 1934. As indicated in FIG. 19, data may be transferred from OFFGRF 1934 to inputs of AONGRF 1932 and LENGRF 1936 through various interconnections. Similarly, outputs from LENGRF 1936 and AONGRF 1932 may be transferred to inputs of AONGRF 1932, OFFGRF 1934, and LENGRF 1936.

Output of OFFGRF 1934 is connected to inputs of DESP 1910's Arithmetic and Logic Unit (ALU) 1942. ALU 1942 is a general purpose 32 bit ALU which may be used in generating and manipulating logical addresses and descriptors, as distinct from general purpose arithmetic and logic operands performed by MUX 1940. Output of ALU 1942 is connected to JPD Bus 142 to allow results of arithmetic and logic operations to be transferred to MEM 112 or EU 122.

Also connected from output of OFFGRF 1934 is Descriptor Multiplexer (MUX) 1940. An output of MUX 1940 is provided to an input of ALU 1942. MUX 1940 is a 32 bit ALU, including an accumulator, for data manipulation operations. MUX 1940, together with ALU 1942, allows DESP 1910 to perform 32 bit arithmetic and logic operations. MUX 1940 and ALU 1942 may allow arithmetic and logic operations upon operands of greater than 32 bits by performing successive operations upon successive 32 bit words of larger operands.

Logical descriptors or addresses generated or provided by DESP 1910, are provided to Logical Descriptor (LD) Bus 1902. LD Bus 1902 in turn is connected to an input of Address Translation Unit (ATU) 1928. ATU 1928 is a cache mechanism for converting logical descriptors to MEM 112 physical descriptors.

LD Bus 1902 is also connected to write input of Name Cache (NC) 1926. NC 1926 is a cache mechanism for storing logical descriptors corresponding to operand Names currently being used in user's programs. As previously described, Name Table Entries corresponding to operands currently being used in user's programs are stored in MEM 112. Certain Name Table Entries for operands of a user's program currently being executed are transferred from those Name Tables in MEM 112 to FU 120 and are therein evaluated to generate corresponding logical descriptors. These logical descriptors are then stored in NC 1926. As will be described further below, the instruction stream of a user's program is provided to FU 120's Instruction Buffer (IB) 1962 through MOD Bus 140. FU 120's Parser (P) 1964 separates out, or parses, Names from IB 1962 and provides those Names as address inputs to NC 1924. NC 1924 in turn provides logical descriptor outputs to LD Bus 1902, and thus to input of ATU 1928. NC 1926 input from LD Bus 1902 allows logical descriptors resulting from evaluation of Name Table Entries to be written into NC 1926. FU 120's Protections Cache (PC) 1934 is a cache mechanism having an input connected from LD Bus 1902 and providing information, as described further below, regarding protection aspects of references to data in MEM 112 by user's programs. NC 1926, ATU 1928, and PC 1934 are thereby acceleration mechanisms of, respectively, CS 101's Namespace addressing, logical to physical address structure, and protection mechanism.

Referring again to DESP 1910, DESP 1910 includes BIAS 1952, connected from output of LENGRF 1936. As previously described, operands containing more than 32 data bits are transferred beteen MEM 112 and JP 114 by means of string transfers. In order to perform string transfers, it is necessary for FU 120 to generate a corresponding succession of logical descriptors wherein length fields of those logical descriptors is no greater than 5 bits, that is, specify lengths of no greater than 32 data bits.

A logical descriptor describing a data item to be transferred by means of a string transfer will be stored in GRF 506. AON field of the logical descriptor will reside in AONGRF 1932, O field in OFFGRF 1934, and L field in LENGRF 1936. At each successive transfer of a 32 bit word in the string transfer, O field of that original logical descriptor will be incremented by the number of data bits transferred while L field will be accordingly decremented. The logical descriptor residing in GRF 506 will thereby describe, upon each successsive transfer of the string transfer, that portion of the data item yet to be transferred. O field in OFFGRF 1934 will indicate increasingly larger offsets into that data item, while L field will indicate successively shorter lengths. AON and O fields of the logical descriptor in GRF 506 may be utilized directly as AON and O fields of the successive logical descriptors of the string transfer. L field of the logical descriptor residing in LENGRF 1936, however, may not be so used as L fields of the successive string transfer logical descriptors as this L field indicates remaining length of data item yet to be transferred. Instead, BIAS 1952 generates the 5 bit L fields of successive string transfer logical descriptors while correspondingly decrementing L field of the logical descriptor in LENGRF 1936. During each transfer, BIAS 1952 generates L field of the *next* string transfer logical descriptor while concurrently providing L field of the *current* string transfer logical descriptor. By doing so, BIAS 1952 thereby increases speed of execution of string transfers by performing pipelined L field operations. BIAS 1952 thereby allows CS 101 to appear to the user to be a variable word length machine by automatically performing string transfers. This mechanism is used for transfer of any data item greater than 32 bits, for example double precision floating point numbers.

Finally, FU 120 includes microcode circuitry for controlling all FU 120 operations described above. In particular, FU 120 includes a microinstruction sequence control store (mC) 1920 storing sequences of microinstructions for controlling step by step execution of all FU 120 operations. In general, these FU 120 operations fall into two classes. A first class includes those microinstruction sequences directly concerned with executing the SOPs of user's programs. The second class includes microinstruction sequences concerned with CS 101's operating systems, including certain automatic, internal FU 120 functions such as evaluation of Name Table Entries.

As previously described, CS 101 is a multiple S-Language machine. For example, mC 1920 may contain microinstruction sequences for executing user's SOPs in at least four different Dialects. mC 1920 is comprised of a writeable control store and sets of microinstruction sequences for various Dialects may be transferred into and out of mC 1920 as required for execution of various user's programs. By storing sets of microinstruction sequences for more than one Dialect in mC 1920, it is possible for user's programs to be written in a mixture of user languages. For example, a particular user's program may be written primarily in FORTRAN but may call certain COBOL routines. These COBOL routines will be correspondingly translated into COBOL dialect SOPs and executed by COBOL microinstruction sequences stored in mC 1920.

The instruction stream provided to FU 120 from MEM 112 has been previously described with reference to FIG. 3. SOPs and Names of this instruction stream are transferred from MOD Bus 140 into IB 1962 as they are provided from MEM 112. IB 1962 includes two 32 bit (one word) registers. IB 1962 also includes prefetch circuitry for reading for SOPs and Names of the instruction stream from MEM 112 in such a manner that IB 1962 shall always contain at least one SOPs or Name. FU 120 includes (P) 1964 which reads and separates, or parses, SOPs and Names from IB 1962. As previously described, P 1964 provides those Names to NC 1926, which accordingly provides logical descriptors to ATU 1928 so as to read the corresponding operands from MEM 112.

SOPs parsed by P 1964 are provided as inputs to Fetch Unit Dispatch Table (FUDT) 1904 and Execute Unit Dispatch Table (EUDT) 1966. Referring first to FUDT 1904, FUDT 1904 is effectively a table for translating SOPs to starting addresses in mC 1912 of corresponding microinstruction sequences. This intermediate translation of SOPs to mC 1912 addresses allows efficient packing of microinstruction sequences within mC 1912. That is, certain microinstruction sequences may be common to two or more S-Language Dialects. Such microinstruction sequences may therefore be written into mC 1912 once and may be referred to by different SOPs of different S-Language Dialects.

EUDT 1966 performs a similar function with respect to EU 122. As will be described below, EU 122 contains a mC, similar to mC 1912, which is addressed through EUDT 1966 by SOPs specifying EU 122 operations. In addition, FU 120 may provide such addresses mC 1912 to initiate EU 122 operations as required to assist certain FU 120 operations. Examples of such operations which may be requested by FU 120 include calculations required in evaluating Name Table Entries to provide logical descriptors to be loaded into NC 1926.

Associated with both FUDT 1904 and EUDT 1966 are Dialect (D) registers 1905 and 1967. D registers 1905 and 1967 store information indicating the particular S-Language Dialect currently being utilized in execution of a user's program. Outputs of D registers 1905 and 1967 are utilized as part of the address inputs to mC 1912 and EU 122's mC.

4. Execute Unit (EU) 122 (FIG. 20)

As previously described, EU 122 is an arithmetic and logic unit provided to relieve FU 120 of certain arithmetic operations. EU 122 is capable of performing addition, subtraction, multiplication, and division operations on integer, packed and unpacked decimal, and single and double precision floating operands. EU 122 is an independently operating microcode controlled machine including Microcode Control (mC) 2010 which, as described above, is addressed by EUDT 1966 to initiate EU 122 operations. mC 2010 also includes logic for handling mutual interrupts between FU 120 and EU 122. That is, FU 120 may interrupt current EU 122 operations to call upon EU 122 to assist an FU 120 operation. For example, FU 120 may interrupt an arithmetic operation currently being executed by EU 122 to call upon EU 122 to assist in generating a logical descriptor from a Name Table Entry. Similarly, EU 122 may interrupt current FU 120 operations when EU 122 requires FU 120 assistance in executing a current arithmetic operation. For example, EU 122 may interrupt a current FU 120 operation if EU 122 receives an instruction and operands requiring EU 122 to perform a divide by zero.

Referring to FIG. 20, a partial block diagram of EU 122 is shown. EU 122 includes two arithmetic and logic units. A first arithmetic and logic unit (MULT) 2014 is utilized to perform addition, subtraction, multiplication, and division operations upon integer and decimal operands, and upon mantissa fields of single and double precision floating point operands. Second ALU (EXP) 2016 is utilized to perform operations upon single and double precision floating point operand exponent fields in parallel with operations performed upon floating point mantissa fields by MULT 2014. Both MULT 2014 and EXP 2016 include an arithmetic and logic unit, respectively MALU 2074 and EXPALU 2084. MULT 2014 and EXP 2016 also include register files, respectively MRF 2050 and ERF 2080, which operate and are addressed in parallel in a manner similar to AONGRF 1932, OFFGRF 1984 and LENGRF 1936.

Operands for EU 122 to operate upon are provided from MEM 112 through MOD Bus 140 and are transferred into Operand Buffer (OPB) 2022. In addition to serving as an input buffer, OPB 2022 performs certain data format manipulation operations to transform input operands into formats most efficiently operated with by EU 122. In particular, EU 122 and MULT 2014 may be designed to operate efficiently with packed decimal operands. OPB 2022 may transform unpacked decimal operands into packed decimal operands. Unpacked decimal operands are in the form of ASCII characters wherein four bits of each characters are binary codes specifying a decimal value between zero and nine. Other bits of each character are referred to as zone fields and in general contain information identifying particular ASCII characters. For example, zone field bits may specify whether a particular ASCII character is a number, a letter, or punctuation. Packed decimal operands are comprised of a series of four bit fields wherein each field contains a binary number specifying a decimal value of between zero and nine. OPB 2022 converts unpacked decimal to packed decimal operands by extracting zone field bits and packing the four numeric value bits of each character into the four bit fields of a packed decimal number.

EU 122 is also capable of transforming the results of arithmetic operands, for example in packed decimal format, into unpacked decimal format for transfer back to MEM 112 or FU 120. In this case, a packed decimal result appearing at output of MALU 2074 is written into MRF 2050 through a multiplexer, not shown in FIG. 20, which transforms the four bit numeric code fields of the packed decimal results into corresponding bits of unpacked decimal operand characters, and forces blanks into the zone field bits of those unpacked decimal characters. The results of this operation are then read from MRF 2050 to MALU 2074 and zone field bits for those unpacked decimal characters are read from Constant Store (CST) 2060 to MALU 2074. These inputs from MRF 2050 and CST 2060 are added by MALU 2074 to generate final result outputs in unpacked decimal format. These final results may then be transferred onto JPD Bus 142 through Output Multiplexer (OM) 2024.

Considering first floating point operations, in addition or subtraction of floating point operands it is necessary to equalize the values of the floating point operand exponent fields. This is referred to as prealignment. In floating point operations, exponent fields of the two operands are transferred into EXPALU 2034 and compared to determine the difference between exponent fields. An output representing difference between exponent fields is provided from EXPALU 2034 to an input of floating point control (FPC) 2002. FPC 2002 in turn provides control outputs to MALU 2074, which has received the mantissa fields of the two operands. MALU 2074, operating under direction of FPC 2002, accordingly right or left shifts one operand's mantissa field to effectively align that operand's exponent field with the other operand's exponent field. Addition or subtraction of the operand's mantissa fields may then proceed.

EXPALU 2034 also performs addition or subtraction of floating point operand exponent fields in multiplication or division operations, while MALU 2074 performs multiplication and division of the operand mantissa fields. Multiplication and division of floating point operand mantissa fields by MALU 2074 is performed by successive shifting of one operand, corresponding generation of partial products of the other operand, and successive addition and subtraction of those partial products.

Finally, EU 122 performs normalization of the results of floating point operand operations by left shifting of a final result's mantissa field to eliminate zeros in the most significant characters of the final result mantissa field, and corresponding shifting of the final result exponent fields. Normalization of floating point operation results is controlled by FPC 2002. FPC 2002 examines an unnormalized floating point result output of MALU 2074 to detect which, if any, of the most significant characters of that results contain zeros. FPC 2002 then accordingly provides control outputs to EXPALU 2034 and MALU 2074 to correspondingly shift the exponent and mantissa fields of those results so as to eliminate leading character zeros from the mantissa field. Normalized mantissa and exponent fields of floating point results may then be transferred from MALU 2074 and EXPALU 2034 to JPD Bus 142 through OM 2024.

As described above, EU 122 also performs addition, subtraction, multiplication, and division operations on operands. In this respect, EU 122 uses a leading zero detector in FPC 2002 in efficiently performing multiplication and division operations. FPC 2002's leading zero detector examines the characters or bits of two operands to be multiplied or divided, starting from the highest, to determine which, if any, contain zeros so as not to require a multiplication or division operation. FPC 2002 accordingly left shifts the operands to effectively eliminate those characters or bits, thus reducing the number of operations to multiply or divide the operands and accordingly reducing the time required to operate upon the operands.

Finally, EU 122 utilizes a unique method, with associated hardware, for performing arithmetic operations on decimal operands by utilizing circuitry which is otherwise conventionally used only to perform operations upon floating point operands. As described above, MULT 2074 is designed to operate with packed decimal operands, that is operands in the form of consecutive blocks of four bits wherein each block of four bits contains a binary code representing numeric values of between zero and nine. Floating point operands are similarly in the form of consecutive blocks of four bits. Each block of four bits in a floating point operand, however, contains a binary number representing a hexadecimal value of between zero and fifteen. As an initial step in operating with packed decimal operands, those operands are loaded, one at a time, into MALU 2074 and, with each such operand, a number comprised of all hexadecimal sixes is loaded into MALU 2074 from CST 2060. This CST 2060 number is added to each packed decimal operand to effectively convert those packed decimal operands into hexadecimal operands wherein the four bit blocks contain numeric values in the range of six to fifteen, rather than in the original range of zero to nine. MULT 2014 then performs arithmetic operation upon those transformed operands, and in doing so detects and saves information regarding which four bit characters of those operands have resulted in generation of carries during the arithmetic operations. In a final step, the intermediate result resulting from completion of those arithmetic operations upon those transformed operands are reconverted to packed decimal format by subtraction of hexadecimal sixes from those characters for which carries have been generated. Effectively, EU 122 converts packed decimal operands into "Excess Six" operands, performs arithmetic operations upon those "Excess Six" operands, and reconverts "Excess Six" results of those operations back into packed decimal format.

Finally, as previously descibed FU 120 controls transfer of arithmetic results from EU 122 to MEM 112. In doing so, FU 120 generates a logical descriptor describing the size of MEM 112 address space, or "container", that result is to be transferred into. In certain arithmetic operations, for example integer operations, an arithmetic result may be larger than anticipated and may contain more bits than the MEM 112 "container". Container Size Check Circuit (CSC) 2052 compares actual size of arithmetic results and L fields of MEM 112 "container" logical descriptors. CSC 2052 generates an output indicating whether an MEM 112 "container" is smaller than an arithmetic result.

Having briefly described certain features of CS 101 structure and operation in the above overview, these and other features of CS 101 will be described in further detail next below in a more detailed introduction of CS 101 structure and operation. Then, in further descriptions, these and other features of CS 101 structure and operation will be described in depth.

1. Introduction (FIGS. 101-110)

A. General Structure and Operation (FIG. 101)

a. General Structure

Figure 101:
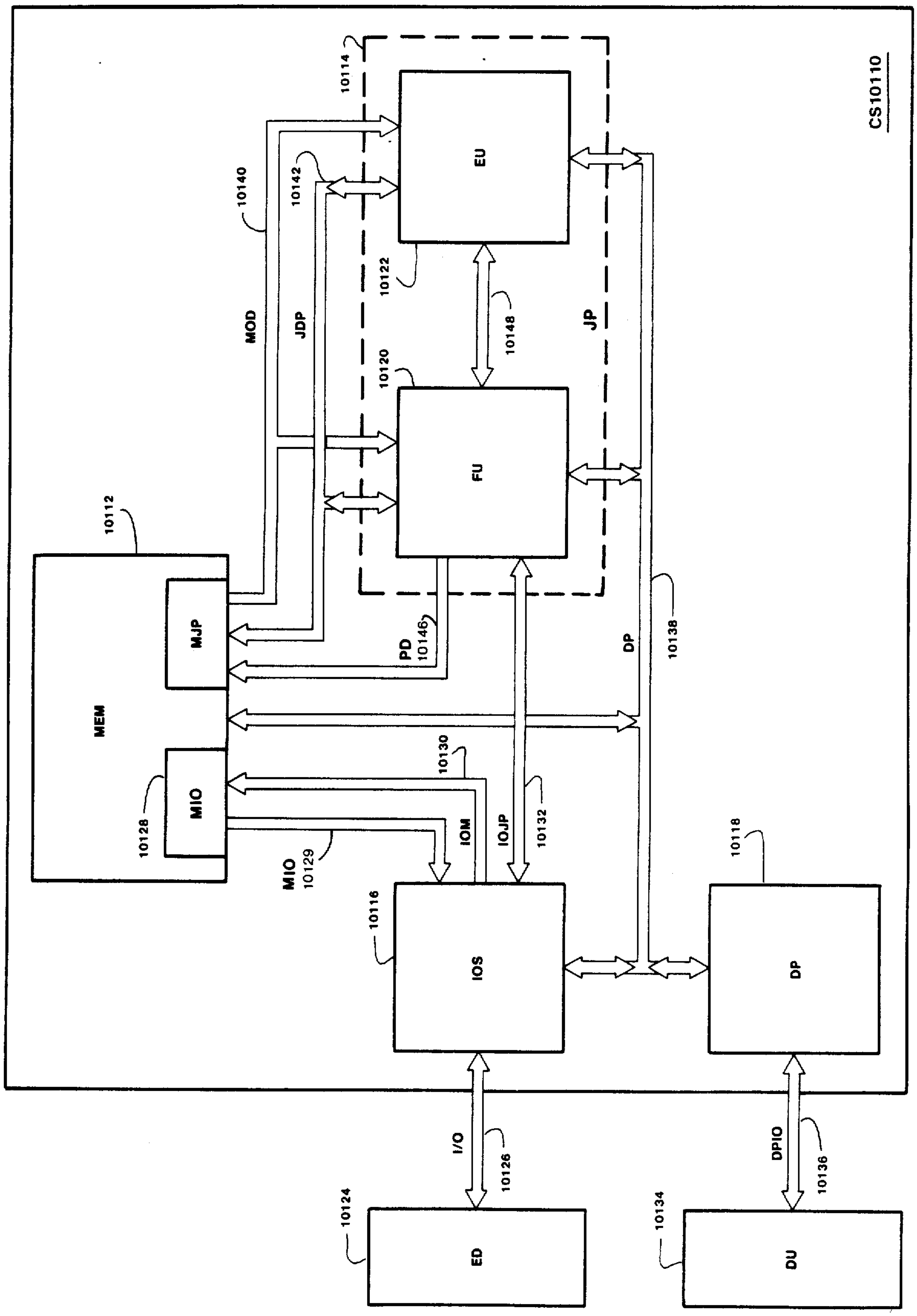
FIG. 101 is a more detailed partial block diagram of the present computer system.

Referring to FIG. 101, a partial block diagram of Computer System (CS) 10110 is shown. Major elements of CS 10110 are Dual Port Memory (MEM) 10112, Job Processor (JP) 10114, Input/Output System (IOS) 10116, and Diagnostic Processor (DP) 10118. JP 10114 includes Fetch Unit (FU) 10120 and Execute Unit (EU) 10122.

Referring first to IOS 10116, IOS 10116 is interconnected with External Devices (ED) 10124 through Input/Output (I/O) Bus 10126. ED 10124 may include, for example, other computer systems, keyboard/display units, and disc drive memories. IOS 10116 is interconnected with Memory Input/Output (MIO) Port 10128 of MEM 10112 through Input/Output to Memory (IOM) Bus 10130 and Memory to Input/Output (MIO) Bus 10129, and with FU 10120 through I/O Job Processor (IOJP) Bus 10132.

DP 10118 is interconnected with, for example, external keyboard/CRT Display Unit (DU) 10134 through Diagnostic Processor Input/Output (DPIO) Bus 10136. DP 10118 is interconnected with IOS 10116, MEM 10112, FU 10120, and EU 10122 through Diagnostic Processor (DP) Bus 10138.

Memory to Job Processor (MJP) Port 10140 of Memory 10112 is interconnected with FU 10120 and EU 10122 through Job Processor Data (JPD) Bus 10142. An output of MJP 10140 is connected to inputs of FU 10120 and EU 10122 through Memory Output Data (MOD) Bus 10144. An output of FU 10120 is connected to an input of MJP 10140 through Physical Descriptor (PD) Bus 10146. FU 10120 and EU 10122 are interconnected through Fetch/Execute (F/E) Bus 10148.

b. General Operation

As will be discussed further below, IOS 10116 and MEM 10112 operate independently under general control of JP 10114 in executing multiple user's programs. In this regard, MEM 10112 is an intelligent, prioritizing memory having separate and independent ports MIO 10128 and MJP 10140 to IOS 10116 and JP 10114 respectively. MEM 10112 is the primary path for information transfer between External Devices 10124 (through IOS 10116) and JP 10114. MEM 10112 thus operates both as a buffer for receiving and storing various individual user's programs (e.g., data, instructions, and results of program execution) and as a main memory for JP 10114.

A primary function of IOS 10116 is as an input/output buffer between CS 10110 and ED 10124. Data and instructions are transferred from ED 10124 to IOS 10116 through I/O Bus 10126 in a manner and format compatible with ED 10124. IOS 10116 receives and stores this information, and manipulates the information into formats suitable for transfer into MEM 10112. IOS 10116 then indicates to MEM 10112 that new information is available for transfer into MEM 10112. Upon acknowledgement by MEM 10112, this information is transferred into MEM 10112 through IOM Bus 10130 and MIO Port 10128. MEM 10112 stores the information in selected portions of MEM 10112 physical address space. At this time, IOS 10116 notifies JP 10114 that new information is present in MEM 10112 by providing a "semaphore" signal to FU 10120 through IOJP Bus 10132. As will be described further below, CS 10110 manipulates the data and instructions stored in MEM 10112 into certain information structures used in executing user's programs. Among these structures are certain structures, discussed further below, which are used by CS 10110 in organizing and controlling flow and execution of user programs.

FU 10120 and EU 10122 are independently operating microcode controlled "machines" together comprising the CS 10110 micromachine for executing user's programs stored in MEM 10112. Among the principal functions of FU 10120 are: (1) fetching and interpreting instructions and data from MEM 10112 for use by FU 10120 and EU 10122; (2) organizing and controlling flow of user programs; (3) initiating EU 10122 operations; (4) performing arithmetic and logic operations on data; (5) controlling transfer of data from FU 10120 and EU 10122 to MEM 10112; and, (6) maintaining certain "stack" and "register" mechanisms, described below. FU 10120 "cache" mechanisms, also described below, are provided to enhance the speed of operation of JP 10114. These cache mechanisms are acceleration circuitry including, in part, high speed memories for storing copies of selected information stored in MEM 10112. The information stored in this acceleration circuitry is therefore more rapidly available to JP 10114. EU 10122 is an arithmetic unit capable of executing integer, decimal, or floating point arithmetic operations. The primary function of EU 10122 is to relieve FU 10120 from certain extensive arithmetic operations, thus enhancing the efficiency of CS 10110.

In general, operations in JP 10114 are executed on a memory to memory basis; data is read from MEM 10112, operated upon, and the results returned to MEM 10112. In this regard, certain stack and cache mechanisms in JP 10114 (described below) operate as extensions of MEM 10112 address space.

In operation, FU 10120 reads data and instructions from MEM 10112 by providing physical addresses to MEM 10112 by way of PD Bus 10146 and MJP Port 10140. The instructions and data are transferred to FU 10120 and EU 10122 by way of MJP Port 10140 and MOD Bus 10140. Instructions are interpreted by FU 10120 microcode circuitry, not shown in FIG. 101 but described below, and when necessary, microcode instructions are provided to EU 10122 from FU 10120's microcode control by way of F/E Bus 10148, or by way of JPD Bus 10142.

As stated above, FU 10120 and EU 10122 operate asynchronously with respect to each other's functions. A microinstruction from FU 10120 microcode circuitry to EU 10122 may initiate a selected operation of EU 10122. EU 10122 may then proceed to independently execute the selected operation. FU 10120 may proceed to concurrently execute other operations while EU 10122 is completing the selected arithmetic operation. At completion of the selected arithmetic operation, EU 10122 signals FU 10120 that the operation results are available by way of a "handshake" signal through F/E Bus 10148. FU 10120 may then receive the arithmetic operation results for further processing or, as discussed momentarily, may directly transfer the arithmetic operation results to MEM 10112. As described further below, an instruction buffer referred to as a "queue" between FU 10120 and EU 10122 allows FU 10120 to assign a sequence of arithmetic operations to be performed by EU 10122.

Information, such as results of executing an instruction, is written into MEM 10112 from FU 10120 or EU 10122 by way of JPD Bus 10142. FU 10120 provides a "physical write address" signal to MEM 10112 by way of PD Bus 10146 and MJP Port 10140. Concurrently, the information to be written into MEM 10112 is placed on JPD Bus 10142 and is subsequently written into MEM 10112 at the locations selected by the physical write address.

FU 10120 places a semaphore signal on IOJP Bus 10132 to signal to IOS 10116 that information, such as the results of executing a user's program, is available to be read out of CS 10110. IOS 10116 may then transfer the information from MEM 10112 to IOS 10116 by way of MIO Port 10128 and IOM Bus 10130. Information stored in IOS 10116 is then transferred to ED 10124 through I/O Bus 10126.

During execution of a user's program, certain information required by JP 10116 may not be available in MEM 10112. In such cases as further described in a following discussion, JP 10114 may write a request for information into MEM 10112 and notify IOS 10116, by way of IOJP Bus 10132, that such a request has been made. IOS 10116 will then read the request and transfer the desired information from ED 10124 into MEM 10112 through IOS 10116 in the manner described above. In such operations, IOS 10116 and JP 10114 operate together as a memory manager wherein the memory space addressable by JP 10114 is termed virtual memory space, and includes both MEM 10112 memory space and all external devices to which IOS 10116 has access.

As previously described, DP 10118 provides a second interface between Computer System 10110 and the external world by way of DPIO Bus 10136. DP 10118 allows DU 10134, for example a CRT and keyboard unit or a teletype, to perform all functions which are conventionally provided by a hard (i.e., switches and lights) console. For example, DP 10118 allows DU 10134 to exercise control of Computer System 10110 for such purposes as system initialization and start up, execution of diagnostic processes, and fault monitoring and identification. DP 10118 has read and write access to most memory and register portions within each of IOS 10116, MEM 10112, FU 10120, and EU 10122 by way of DP Bus 10138. Memories and registers in CS 10110 can therefore be directly loaded or initialized during system start up, and can be directly read or loaded with test and diagnostic signals for fault monitoring and identification. In addition, as described further below, microinstructions may be loaded into JP 10114's microcode circuitry at system start up or as required.

Having described the general structure and operation of Computer System 10110, certain features of Computer System 10110 will next be briefly described to aid in understanding the following, more detailed descriptions of these and other features of Computer System 10110.

c. Definition of Certain Terms

Certain terms are used relating to the structure and operation of CS 10110 throughout the following discussions. Certain of these terms will be discussed and defined first, to aid in understanding the following descriptions. Other terms will be introduced in the following descriptions as required.

A *procedure* is a sequence of operational steps, or instructions, to be executed to perform some operation. A procedure may include data to be operated upon in performing the operation.

A *program* is a static group of one or more procedures. In general, programs may be classified as user programs, utility programs, and operating system programs. A user program is a group of procedures generated by and private to one particular user of a group of users interfacing with CS 10110. Utility programs are commonly available to all users; for example, a compiler comprises a set of procedures for compiling a user language program into an S-language program. Operating system programs are groups of procedures internal to CS 10110 for allocation and control of CS 10110 resources. Operating system programs also define interfaces within CS 10110. For example, as will be discussed further below all operands in a program are referred to by "NAME". An operating system program translates operand NAME into the physical locations of the operands in MEM 10112. The NAME translation program thus defines the interface between operand NAME (name space addresses) and MEM 10112 physical addresses.

A *process* is an independent locus of control passing through physical, logical or virtual address spaces, or, more particularly, a path of execution through a series of programs (i.e., procedures). A process will generally include a user program and data plus one or more utility programs (e.g., a compiler) and operating system programs necessary to execute the user program.

An *object* is a uniquely identifiable portion of "data space" accessible to CS 10110. An object may be regarded as a container for information and may contain data or procedure information or both. An object may contain for example, an entire program, or set of procedures, or a single bit of data. Objects need not be contiguously located in the data space accessible to CS 10110, and the information contained in an object need not be contiguously located in that object.

A *domain* is a state of operation of CS 10110 for the purposes of CS 10110's protection mechanisms. Each domain is defined by a set of procedures having access to objects within that domain for their execution. Each object has a single domain of execution in which it is executed if it is a procedure object, or used, if it is a data object. CS 10110 is said to be operating in a particular domain if it is executing a procedure having that domain of execution. Each object may belong to one or more domains; an object belongs to a domain if a procedure executing in that domain has potential access to the object. CS 10110 may, for example have four domains: User domain, Data Base Management System (DBMS) domain, Extended Operating System (EOS) domain, and Kernel Operating System (KOS) domain. User domain is the domain of execution of all user provided procedures, such as user or utility procedures. DBMS domain is the domain of execution for operating system procedures for storing, retrieving, and handling data. EOS domain is the domain of execution of operating system procedures defining and forming the user level interface with CS 10110, such as procedures for controlling and executing files, processes, and I/O operations. KOS domain is the domain of execution of the low level, secure operating system which manages and controls CS 10110's physical resources. Other embodiments of CS 10110 may have fewer or more domains than those just described. For example, DBMS procedures may be incorporated into the EOS domain or EOS domain may be divided by incorporating the I/O procedures into an I/O domain. There is no hardware enforced limitation on the number of, or boundaries between, domains in CS 10110. Certain CS 10110 hardware functions and structures are, however, dependent upon domains.

A *subject* is defined, for purposes of CS 10110's protection mechanisms, as a combination of the current principle (user), the current process being executed, and the domain the process is currently being executed in. In addition to principle, process, and domain, which are identified by UIDs, subject may include a Tag, which is a user assigned identification code used where added security is required. For a given process, principle and process are constant but the domain is determined by the procedure currently being executed. A process's associated subject is therefore variable along the path of execution of the process.

Having discussed and defined the above terms, certain features of CS 10110 will next be briefly described.

d. Multi-Program Operation

CS 10110 is capable of concurrently executing two or more programs and selecting the sequence of execution of programs to make most effective use of CS 10110's resources. This is referred to as multiprogramming. In this regard, CS 10110 may temporarily suspend execution of one program, for example when a resource or certain information required for that program is not immediately available, and proceed to execute another program until the required resource or information becomes available. For example, particular information required by a first program may not be available in MEM 10112 when called for. JP 10114 may, as discussed further below, suspend execution of the first program, transfer a request for that information to IOS 10116, and proceed to call and execute a second program. IOS 10116 would fetch the requested information from ED 10124 and transfer it into MEM 10112. At some time after IOS 10116 notifies JP 10114 that the requested information is available in MEM 10112, JP 10114 could suspend execution of the second program and resume execution of the first program.

e. Multi-Language Operation

As previously described, CS 10110 is a multiple language machine. Each program written in a high level user language, such as COBOL or FORTRAN, is compiled into a corresponding Soft (S) Language program. That is, in terms of a conventional computer system, each user level language has a corresponding machine language, classically defined as an assembly language. In contrast to classical assembly languages, S-Languages are mid-level languages wherein each command in a user's high level language is replaced by, in general, two or three S-Language instructions, referred to as SINs. Certain SINs may be shared by two or more high level user languages. CS 10110, as further described in following discussions, provides a set, or dialect, of microcode instructions (S-Interpreters) for each S-Language. S-Interpreters interpret SINs and provide corresponding sequences of microinstructions for detailed control of CS 10110. CS 10110's instruction set and operation may therefore be tailored to each user's program, regardless of the particular user language, so as to most efficiently execute the user's program. Computer System 10110 may, for example, execute programs in both FORTRAN and COBOL with comparable efficiency. In addition, a user may write a program in more than one high level user language without loss of efficiency. For example, a user may write a portion of his program in COBOL, but may wish to write certain portions in FORTRAN. In such cases, the COBOL portions would be compiled into COBOL SINs and executed with the COBOL dialect S-Interpreter. The FORTRAN portions would be compiled into FORTRAN SINs and executed with a FORTRAN dialect S-Interpreter. The present embodiment of CS 10110 utilizes a uniform format for all SINs. This feature allows simpler S-Interpreter structures and increases efficiency of SIN interpretation because it is not necessary to provide means for interpreting each dialect individually.

f. Addressing Structure

Each object created for use in, or by operation of, a CS 10110 is permanently assigned a Unique Identifier (UID). An object's UID allows that object to be uniquely identified and located at any time, regardless of which particular CS 10110 it was created by or for or where it is subsequently located. Thus each time a new object is defined, a new and unique UID is allocated, much as social security numbers are allocated to individuals. A particular piece of information contained in an object may be located by a logical address comprising the object's UID, an offset from the start of the object of the first bit of the segment, and the length (number of bits) of the information segment. Data within an object may therefore be addressed on a bit granular basis. As will be described further in following discussions, UID's are used within a CS 10110 as logical addresses, and, for example, as pointers. Logically, all addresses and pointers in CS 10110 are UID addresses and pointers. As previously described and as described below, however, short, temporary unique identifiers, valid only within JP 10114 and referred to as Active Object Numbers are used within JP 10114 to reduce the width of address buses and amount of address information handled.

An object becomes active in CS 10110 when it is transferred from backing store ED 10124 to MEM 10112 for use in executing a process. At this time, each such object is assigned an Active Object Number (AON). AONs are short unique identifiers and are related to the object's UIDs through certain CS 10110 information structures described below. AONs are used only within JP 10114 and are used in JP 10114, in place of UIDs, to reduce the required width of JP 10114's address buses and the amount of address data handled in JP 10114. As with UID logical addresses, a piece of data in an object may be addressed through a bit granular AON logical address comprising the object's AON, an offset from the start of the object of the first bit of the piece, and the length of the piece.

The transfer of logical addresses, for example pointers, between MEM 10112 (UIDA) and JP 10114 (AONs) during execution of a process requires translations between UIDs and AONs. As will be described in a later discussion, this translation is accomplished, in part, through the information structures mentioned above. Similarly, translation of logical addresses to physical addresses in MEM 10112, to physically access information stored in MEM 10112, is accomplished through CS 10110 information structures relating AON logical addresses to MEM 10112 physical addresses.

Each operand appearing in a program is assigned a Name when the program is compiled. Thereafter, all references to the operands are through their assigned Names. As will be described in detail in a later discussion, CS 10110's addressing structure includes a mechanism for recognizing Names as they appear in an instruction stream and Name Tables containing directions for resolving Names to AON logical addresses. AON logical addresses may then be evaluated, for example translated into a MEM 10112 physical address, to provide actual operands. The use of Names to identify operands in the instructions stream (process) (1) allows a complicated address to be replaced by a simple reference of uniform format; (2) does not require that an operation be directly defined by data type in the instruction stream; (3) allows repeated references to an operand to be made in an instruction stream by merely repeating the operand's Name; and, (4) allows partially completed Name to address translations to be stored in a cache to speed up operand references. The use of Names thereby substantially reduces the volume of information required in the instruction stream for operand references and increases CS 10110 speed and efficiency by performing operands references through a parallel operating, underlying mechanism.

Finally, CS 10110 address structure incorporates a set of Architectural Base Pointers (ABPs) for each process. ABPs provide an addressing framework to locate data and procedure information belonging to a process and are used, for example, in resolving Names to AON logical addresses.

g. Protection Mechanism

CS 10110's protection mechanism is constructed to prevent a user from (1) gaining access to or disrupting another user's process, including data, and (2) interfering with or otherwise subverting the operation of CS 10110. Access rights to each particular active object are dynamically granted as a function of the currently active subject. A subject is defined by a combination of the current principle (user), the current process being executed, and the domain in which the process is currently being executed. In addition to principle, process, and domain, subject may include a Tag, which is a user assigned identification code used where added security is required. For a given process, the principle and process are constant but the domain is determined by the procedure currently being executed. A process's associated subject is therefore variable along the path of execution of the process.

In a present embodiment of CS 10110, procedures having KOS domain of execution have access to objects in KOS, EOS, DBMS, and User domains; procedures having EOS domain of execution have access to objects in EOS, DBMS, and User domains; procedures having DBMS domain of execution have access to objects in DBMS and User domains; and procedures having User domain of execution have access only to objects in User domain. A user cannot, therefore, obtain access to objects in KOS domain of execution and cannot influence CS 10110's low level, secure operating system. The user's process may, however, call for execution of a procedure having KOS domain of execution. At this point the process's subject is in the KOS domain and the procedure will have access to certain objects in KOS domain.

In a present embodiment of CS 10110, also described in a later discussion, each object has associated with it an Access Control List (ACL). An ACL contains an Access Control Entry (ACE) for each subject having access to that object. ACEs specify, for each subject, access rights a subject has with regard to that object.

There is normally no relationship, other than that defined by an object's ACL, between subjects and objects. CS 10110, however, supports Extended Type Objects having Extended ACLs wherein a user may specifically define which subjects have what access rights to the object.

In another embodiment of CS 10110, described in a following discussion, access rights are granted on a dynamic basis. In executing a process, a procedure may call a second procedure and pass an argument to the called procedure. The calling procedure will also pass selected access rights to that argument to the called procedure. The passed access rights exist only for the duration of the call.

In the dynamic access embodiment, access rights are granted only at the time they are required. In the ACL embodiment, access rights are granted upon object creation or upon specific request. In either embodiment, each procedure to which arguments may be passed in a cross-domain call has associated with it an Access Information Array (AIA). A procedure's AIA states what access rights a calling procedure (subject) must have before the called procedure can operate on the passed argument. CS 10110's protection mechanisms compare the calling procedure's access rights to the rights required by the called procedure. This ensures that a calling procedure may not ask a called procedure to do what the calling procedure is not allowed to do. Effectively, a calling procedure can pass to a called procedure only the access rights held by the calling procedure.

Having described the general structure and operation and certain features of CS 10110, those and other features of CS 10110 operation will next be described in greater detail.

B. Computer System 10110 Information Structures and Mechanisms (FIGS. 102, 103, 104, 105)

CS 10110 contains certain information structures and mechanisms to assist in efficient execution of processes. These structures and mechanisms may be considered as falling into three general types. The first type concerns the processes themselves, i.e., procedure and data objects comprising a user's process or directly related to execution of a user's process. The second type are for management, control, and execution of processes. These structures are generally shared by all processes active in CS 10110. The third type are CS 10110 micromachine information structures and mechanisms. These structures are concerned with the internal operation of the CS 10110 micromachine and are private to the CS 10110 micro-machine.

a. Introduction (FIG. 102)

Figure 102:
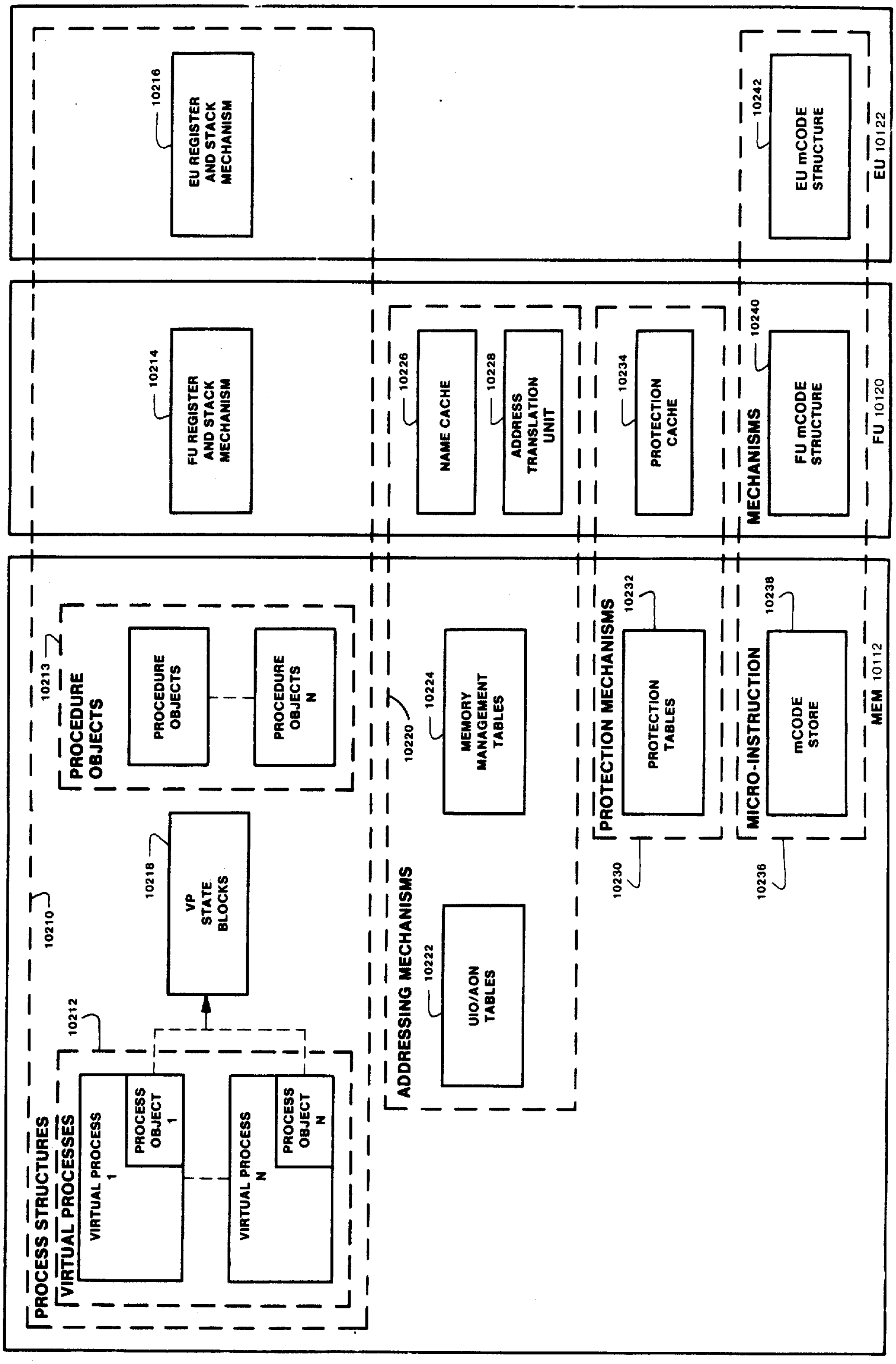
FIG. 102 is a diagram illustrating certain information structures and mechanisms of the present computer system.

Referring to FIG. 102, a pictorial representation of CS 10110 (MEM 10112, FU 10120, and EU 10122) is shown with certain information structures and mechanisms depicted therein. It should be understood that these information structures and mechanisms transcend or "cut across" the boundaries between MEM 10112, FU 10120, EU 10122, and IOS 10116. Referring to the upper portion of FIG. 102 Process Structures 10210 contains those information structures and mechanisms most closely concerned with individual processes, the first and third types of information structures described above. Process Structures 10210 reside in MEM 10112 and Virtual Processes 10212 include Virtual Processes (VP) 1 through N. Virtual Processes 10212 may contain, in a present embodiment of CS 10110, up to 256 VP's. As previously described, each VP includes certain objects particular to a single user's process, for example stack objects previously described and further described in a following description. Each VP also includes a Process Object containing certain information required to execute the process, for example pointers to other process information.

Virtual Processor State Blocks (VPSBs) 10218 include VPSBs containing certain tables and mechanisms for managing execution of VPs selected for execution by CS 10110.

A particular VP is bound into CS 10110 when a Virtual Process Dispatcher, described in a following discussion selects that VP as eligible for execution. The selected VPs Process Object, as previously described, is swapped into a VPSB. VPSBs 10218 may contain, for example 16 or 32 State Blocks so that CS 10110 may concurrently execute up to 16 or 32 VPs. When a VP assigned to a VPSB is to be executed, the VP is swapped onto the information structures and mechanisms shown in FU 10120 and EU 10122. FU Register and Stack Mechanism (FURSM) 10214 and EU Register and Stack Mechanism (EURSM) 10216, shown respectively in FU 10120 and EU 10122, comprise register and stack mechanisms used in execution of VPs bound to CS 10110. These register and stack mechanisms, as will be discussed below, are also used for certain CS 10110 process management functions. Procedure Objects (POs) 10213 contains Procedure Objects (POs) 1 to N of the processes executing in CS 10110.

Addressing Mechanisms (AM) 10220 are a part of CS 10110's process management system and are generally associated with Computer System 10110 addressing functions as described in following discussions. UID/AON Tables 10222 is a structure for relating UID's and AON's, previously discussed. Memory Management Tables 10224 includes structures for (1) relating AON logical addresses and MEM 10112 physical addresses; (2) managing MEM 10112's physical address space; (3) managing transfer of information between MEM 10112 and CS 10110's backing store (ED 10124) and, (4) activating objects into CS 10110; Name Cache (NC) 10226 and Address Translation Cache (ATC) 10228 are acceleration mechanisms for storing addressing information relating to the VP currently bound to CS 10110. NC 10226, described further below, contains information relating operand Names to AON addresses. ATC 10228, also discussed further below, contains information relating AON addresses to MEM 10112 physical addresses.

Protection Mechanisms 10230, depicted below AM 10220, include Protection Tables 10232 and Protection Cache (PC) 10234. Protection Tables 10232 contain information regarding access rights to each object active in CS 10110. PC 10234 contains protection information relating to certain objects of the VP currently bound to CS 10110.

Microinstruction Mechanisms 10236, depicted below PM 10230, includes Micro-code (m Code) Store 10238, FU (Micro-code) m Code Structure 10240, and EU Micro-code (m Code) Structure 10242. These structures contain microinstruction mechanisms and tables for interpreting SINs and controlling the detailed operation of CS 10110. Micro-instruction Mechanisms 10236 also provide microcode tables and mechanisms used, in part, in operation of the low level, secure operating system that manages and controls CS 10110's physical resources.

Figure 105:
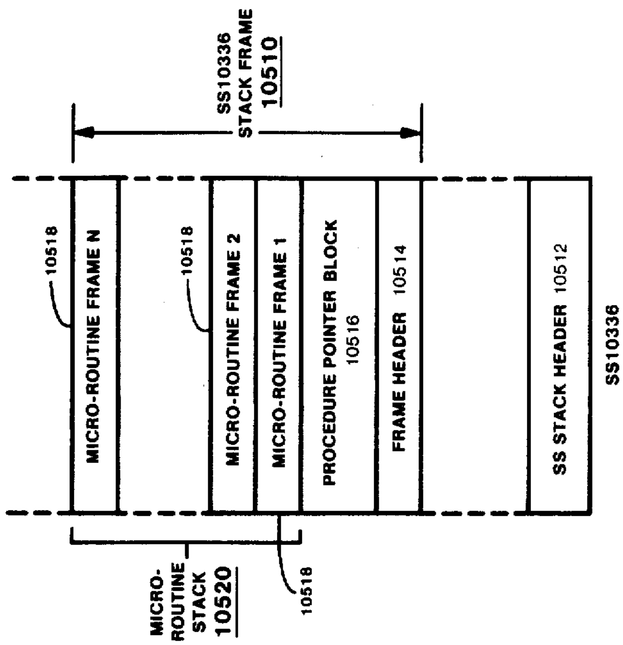
FIG. 105 is a diagram illustrating a secure stack structure.

Having thus briefly described certain CS 10110 information structures and mechanisms with the aid of FIG. 102, those information structures and mechanisms will next be described in further detail in the order mentioned above. In these descriptions it should be noted that, in representation of MEM 10112 shown in FIG. 102 and in other figures of following discussions, the addressable memory space of MEM 10112 is depicted. Certain portions of MEM 10112 address space have been designated as containing certain information structures and mechanisms. These structures and mechanisms have real physical existence in MEM 10112, but may vary in both location and volume of MEM 10112 address space they occupy. Assigning position of a single, large memory to contain these structures and mechanisms allows these structures and mechanisms to be reconfigured as required for most efficient operation of CS 10110. In an alternate embodiment, physically separate memories may be used to contain the structures and mechanisms depicted in MEM 10112, rather than assigned portions of a single memory.

b. Process Structures 10210 (FIGS. 103, 104, 105)

Figure 103:
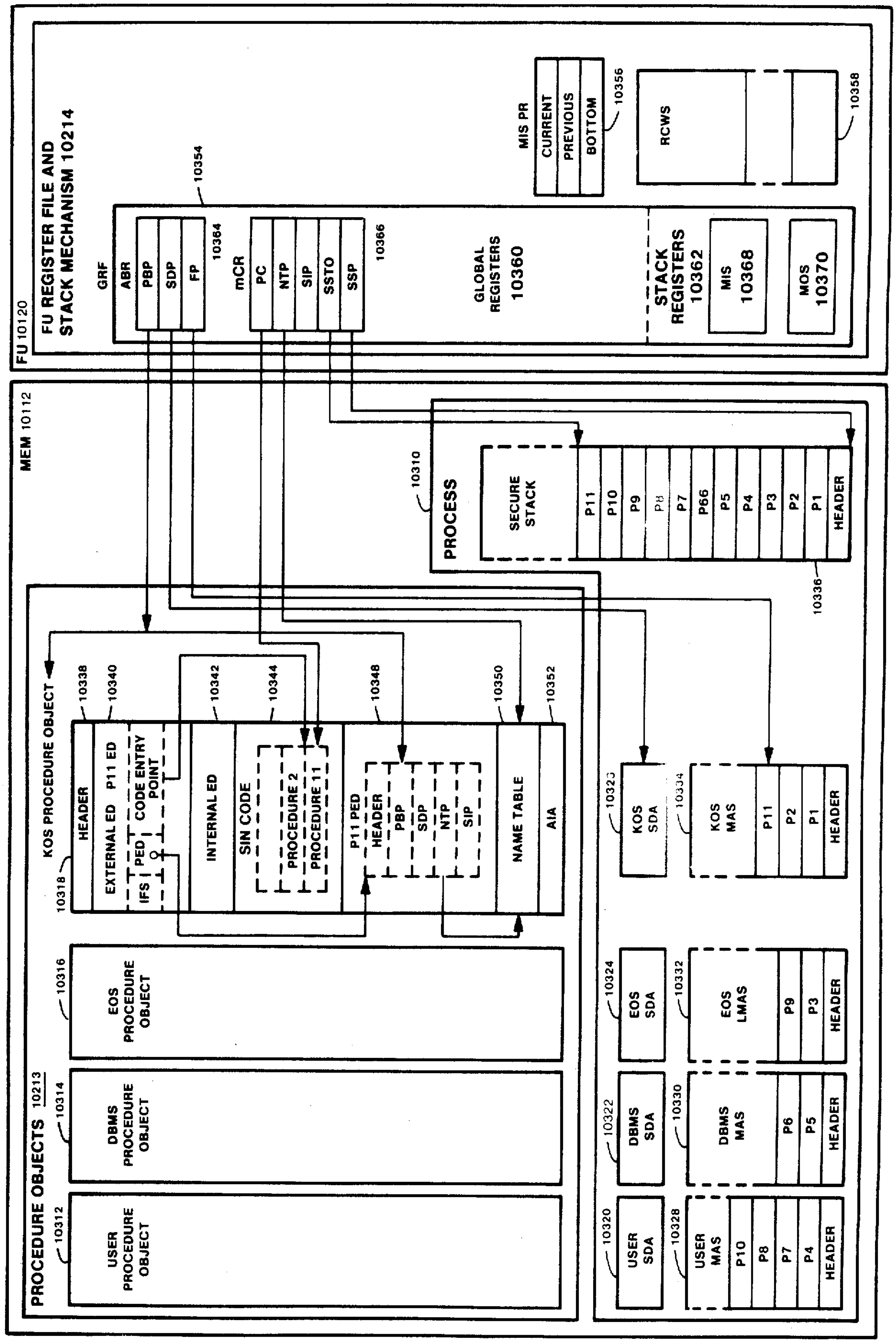
FIG. 103 is a diagram illustrating process structures.
Figure 104:
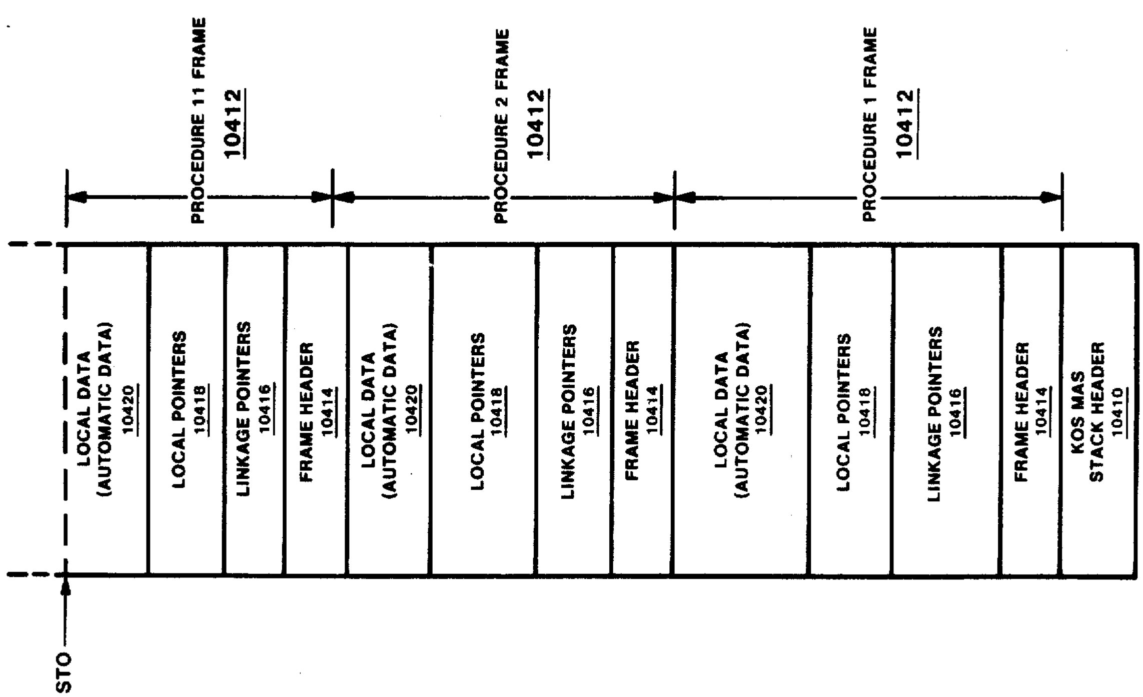
FIG. 104 is a diagram illustrating a macrostack structure.

Referring to FIG. 103, a partial schematic representation of Process Structures 10210 is shown. Specifically, FIG. 103 shows a Process (P) 10310 selected for execution, and its associated Procedure Objects (POs) 10213. P 10310 is represented in FIG. 103 as including four procedure objects in POs 10213. It is to be understood that this representation is for clarity of presentation; a particular P 10310 may include any number of procedure objects. Also for clarity of presentation, EURSM 10216 is not shown as EURSM 10216 is similar to FURSM 10214. EURSM 10216 will be described in detail in the following detailed discussons of CS 10110's structure and operation.

As previously discussed, each process includes certain data and procedure object As represented in FIG. 103 for P 10310 the procedure objects reside in POs 10213. The data objects include Static Data Areas and stack mechanisms in P 10310. POs, for example KOS Procedure Object (KOSPO) 10318, contain the various procedures of the process, each procedure being a sequence of SINs defining an operation to be performed in executing the process. As will be described below, Procedure Objects also contain certain information used in executing the procedures contained therein. Static Data Areas (SDAs) are data objects generally reserved for storing data having an existence for the duration of the process. P 10310's stack mechanisms allow stacking of procedures for procedure calls and returns and for swapping processes in and out of JP 10114. Macro-Stacks (MAS) 10328 to 10334 are generally used to store automatic data (data generated during execution of a procedure and having an existence for the duration of that procedure). Although shown as separate from the stacks in P 10310, the SDAs may be contained with MASs 10328 to 10334. Secure Stack (SS) 10336 stores, in general, CS 10110 micro-machine state for each procedure called. Information stored in SS 10336 allows machine state to be recovered upon return from a called procedure, or when binding (swapping) a VP into CS 10110.

As shown in P 10310, each process is structured on a domain basis. A P 10310 may therefore include, for each domain, one or more procedure objects containing procedures having that domain as their domain of execution, an SDA and an MAS. For example, KOS domain of P 10310 includes KOSPO 10318, KOSSDA 10326, and KOSMAS 10334. P 10310's SS 10336 does not reside in any single domain of P 10310, but instead is a stack mechanism belonging to CS 10110 micromachine.

Having described the overall structure of a P 10310, the individual information structures and mechanisms of a P 10310 will next be described in greater detail.

1. Procedure Objects (FIG. 103)

KOSPO 10318 is typical of CS 10110 procedure objects and will be referred to for illustration in the following discussion. Major components of KOSPO 10318 are Header 10338, External Entry Descripter (EED) Area 10340, Internal Entry Descripter (IED) Area 10342, S-Op Code Area 10344, Procedure Environment Descripter (PED) 10348, Name Table (NT) 10350, and Access Information Array (AIA) Area 10352.

Header 10338 contains certain information identifying PO 10318 and indicating the number of entries in EED area 10340, discussed momentarily.

EED area 10340 and IED area 10342 together contain an Entry Descripter (ED) for each procedure in KOSPO 10318. KOSPO 10318 is represented as containing Procedures 1, 2, and 11, of which Procedure 11 will be used as an example in the present discussion. EDs effectively comprise an index through which certain information in KOSPO 10318 can be located. IEDs form an index to all KOSPO 10318 procedures which may be called only from other procedures contained in KOSPO 10318. EEDs form an index to all KOSPO 10318 procedures which may be called by procedures external to KOSPO 10318. Externally callable procedures are distinguished aid, as described in a following discussion of CS 10110's protection mechanisms, in confirming external calling procedure's access rights.

Referring to ED 11, ED for procedure 11, three fields are shown therein. Procedure Environment Descripter Offset (PEDO) field indicates the start, relative to start of KOSPO 10318, of Procedure 11's PED in PED Area 10348. As will be discussed further below, a procedure's PED contains a set of pointers for locating information used in the execution of that procedure. PED Area 10348 contains a PED for each procedure contained in 10318. In the present embodiment of CS 10110, a single PED may be shared by two or more procedures. Code Entry Point (CEP) field indicates the start, relative to Procedure Base Pointer (PBP) which will be discussed below, of Procedure 11's SIN Code and SIN Code Area 10344. Finally, ED 11's Initial Frame Size (IFS) field indicates the required Initial Frame Size of the KOSMAS 10334 frame storing Procedure 11's automatic data.

PED 11, Procedure 11's PED in PED Area 10348, contains a set of pointers for locating information used in execution of Procedure 11. The first entry in PED 11 is a header containing information identifying PED 11. PED 11's Procedure Base Pointer (PBP) entry is a pointer providing a fixed reference from which other information in PO 10318 may be located. In a specific example, Procedure 11's CEP indicates the location, relative to PBP, of the start of Procedure 11's S-Op code in S-Op Code Area 10344. As will be described further below, PBP is a CS 10110 Architectural Base Pointer (ABP). CS 10110's ABP's are a set of architectural pointers used in CS 10110 to facilitate addressing of CS 10110's address space. PED 11's Static Data Pointer (SDP) entry points to data, in PO 10318, specifying certain parameters of P 10310's KOSSDA 10326. Name Table Pointer (NTP) entry is a pointer indicating the location, in NT 10350, of Name Table Entry's (NTE's) for Procedure 11's operands. NT 10350 and NTE's will be described in greater detail in the following discussion of Computer System 10110's Addressing Structure. PED 11's S-Interpreter Pointer (SIP) entry is a pointer, discussed in greater detail in a following discussion of CS 10110's microcode structure, pointing to the particular S-Interpeter (SINT) to be used in interpreting Procedure 11's SIN Code.

Referring finally to AIA 10352, AIA 10352 contains, as previously discussed, information pertaining to access rights required of any external procedure calling a 10318 procedure. There is an AIA 10352 entry for each PO 10318 procedure which may be called by an external procedure. A particular AIA entry may be shared by one or more procedures having an ED in EED Area 10340. Each EED contains certain information, not shown for clarity of presentation, indicating that that procedure's corresponding AIA entry must be referred to, and the calling procedure's access rights confirmed, whenever that procedure is called.

2. Stack Mechanisms (FIGS. 104, 105)

As previously described, P 10310's stack mechanisms include SS 10336, used in part for storing machine state, and MAS's 10328 to 10334, used to store local data generated during execution of P 10310's procedures. P 10310 is represented as containing an MAS for each CS 10110 domain. In an alternate embodiment of CS 10110, a particular P 10310 will include MAS's only for those domains in which that P 10310 is executing a procedure.

Referring to MAS's 10328 to 10334 and SS 10336, P 10310 is represented as having had eleven procedure calls. Procedure 0 has called Procedure 1, Procedure 1 has called Procedure 2, and so on. Each time a procedure is called, a corresponding stack frame is constructed on the MAS of the domain in which the called procedure is executed. For example, Procedures 1, 2, and 11 execute in KOS domain; MAS frames for Procedures 1, 2, and 11 therefore are placed on KOSMAS 10334. Similarly, Procedures 3 and 9 execute in EOS domain, so that their stack frames are placed on EOSMAS 10332. Procedures 5 and 6 execute in DBMS domain, so that their stack frames are placed on DBMSMAS 10330. Procedures 4, 7, 8, and 10 execute in User domain with their stack frames being placed on USERMAS 10328. Procedure 11 is the most recently called procedure and procedure 11's stack frame on KOSMAS 10334 is referred to as the current frame. Procedure 11 is the procedure which is currently being executed when VP 10310 is bound to CS 10110.

SS 10336, which is a stack mechanism of CS 10110 micromachine, contains a frame for each of Procedures 1 to 11. Each SS 10336 frame contains, in part, CS 10110 operating state for its corresponding procedure.

Referring to FIG. 104, a schematic representation of a typical MAS, for example KOSMAS 10334, is shown. KOSMAS 10334 includes Stack Header 10410 and a Frame 1Q0412 for each procedure on KOSMAS 10334. Each Frame 10412 includes a Frame Header 10414, and may contain a Linkage Pointer Block 10416, a Local Pointer Block 10418, and a Local (Automatic) Data Block 10420.

KOSMAS 10334 Stack Header 10410 contains at least the following information:

(1) an offset, relative to Stack Header 10410, indicating the location of Frame Header 10414 of the first frame on KOSMAS 10334;

(2) a Stack Top Offset (STO) indicating location, relative to start of KOSMAS 10334, of the top of KOSMAS 10334; top of KOSMAS 10334 is indicated by pointer STO pointing to the top of the last entry of Procedure 11 Frame 10412's Local Data Block 10420;

(3) an offset, relative to start of KOSMAS 10334, indicating location of Frame Header 10414 of the current top frame of KOSMAS 10334; in FIG. 104 this offset is represented by Frame Pointer (FP), an ABP discussed further below;

(4) the VP 10310's UID;

(5) a UID pointer indicating location of certain domain environment information, described further in a following discussion;

(6) a signaller pointer indicating the location of certain routines for handling certain CS 10110 operating system faults;

(7) a UID pointer indicating location of KOSSDA 10326; and (8) a frame label sequencer containing pointers to headers of frames in other domains; these pointers are used in executing non-local go-to operations.

KOSMAS 10334 Stack Header 10410 thereby contains information for locating certain important points in KOSMAS 10334's structure, and for locating certain information pertinent to executing procedures in KOS domain.

Each Frame Header 10414 contains at least the following information:

(1) offsets, relative to the Frame Header 10414, indicating the locations of Frame Headers 10414 of the previous and next frames of KOSMAS 10334;

(2) an offset, relative to the Frame Header 10414, indicating the location of the top of that Frame 10412;

(3) information indicating the number of passed arguments contained in that Frame 10412;

(4) a dynamic back pointer, in UID/Offset format, to the previous Frame 10412 if that previous Frame 10412 resides in another domain;

(5) a UID/Offset pointer to the environmental descripter of the procedure calling that procedure;

(6) a frame label sequence containing information indicating the locations of other Frame Headers 10414 in KOSMAS 10334; this information is used to locate other frames in KOSMAS 10334 for the purpose of executing local go-to operations. Frame Headers 10414 thereby contain information for locating certain important points in KOSMAS 10334 structure, and certain data pertinent to executing the associated procedures. In addition, Frame Headers 10414, in combination with Stack Header 10410, contain information for linking the activation records of each VP 10310 MAS, and for linking together the activation records of the individual MAS's.

Linkage Pointer Blocks 10416 contain pointers to arguments passed from a calling procedure to the called procedure. For example, Linkage Pointer Block 10416 of Procedure 11's Frame 10412 will contain pointers to arguments passed to Procedure 11 from Procedure 10. The use of linkage pointers in CS 10110's addressing structure will be discussed further in a following discussion of CS 10110's Addressing Structure. Local Data Pointer Blocks 10418 contain pointers to certain of the associated procedure's local data. Indicated in FIG. 104 is a pointer, Frame Pointer (FP), pointing between top most Frame 10412's Linkage Pointer Block 10416 and Local Data Pointer Block 10418. FP, described further in following discussions, is an ABP to MAS Frame 10412 of the process's current procedure.

Each Frame 10412's Local (Automatic) Data Block 10420 contains certain of the associated procedure's automatic data.

As described above, at each procedure call a MAS frame is constructed on top of the MAS of the domain in which the called procedure is executed. For example, when Procedure 10 calls Procedure 11 a Frame Header 10414 for Procedure 11 is constructed and placed on KOSMAS 10334. Procedure 11's linkage pointers are then generated, and placed in Procedure 11's Linkage Pointer Block 10416. Next Procedure 11's local pointers are generated and placed in Procedure 11's Local Pointer Block 10418. Finally, Procedure 11's local data is placed in Procedure 11's Local Data Block 10420. During this operation, USERMAS 10328's frame label sequence is updated to include an entry pointing to Procedure 11's Frame Header 10414. KOSMAS 10334's Stack Header 10410 is updated with respect to STO to the new top of KOSMAS 10334. Procedure 2's Frame Header 10414 is updated with respect to offset to Frame Header 10414 of Procedure 11 Frame 10412, and with respect to frame label sequence indicating location of Procedure 11's Frame Header 10414. As Procedure 11 is then the current procedure, FP is updated to a point between Linkage Pointer Block 10416 and Local Pointer Block 10418 of Procedure 11's Frame 10412. Also, as will be discussed below, a new frame is constructed on SS 10336 or Procedure 11. CS 10110 will then proceed to execute Procedure 11. During execution of Procedure 11, any further local data generated may be placed on the top of Procedure 11's Local Data Block 10420. The top of stack offset information in Procedure 11's Frame Header 10414 and in KOSMAS 10334 Stack Header 10410 will be updated accordingly.

MAS's 10328 to 10334 thereby provide a per domain stack mechanism for storing data pertaining to individual procedures, thus allowing stacking of procedures without loss of this data. Although structured on a domain basis, MAS's 10328 to 10334 comprise a unified logical stack structure threaded together through information stored in MAS stack and frame headers.

As described above and previously, SS 10336 is a CS 10110 micromachine stack structure for storing, in part, CS 10110 micromachine state for each stacked VP 10310 procedure. Referring to FIG. 105, a partial schematic representation of a SS 10336 Stack Frame 10510 is shown. SS 10336 Stack Header 10512 and Frame Headers 10514 contain information similar to that in MAS Stack Headers 10410 and Frame Headers 10414. Again, the information contained therein locates certain points within SS 10336 structure, and threads together SS 10336 with MAS's 10328 to 10334.

SS 10336 Stack Frame 10510 contains certain information used by the CS 10110 micromachine in executing the VP 10212 procedure with which this frame is associated. Procedure Pointer Block 10516 contains certain pointers including ABPs, used by CS 10110 micromachine in locating information within VP 10310's information structures. Micro-Routine Frames (MRFs) 10518 together comprise Micro-Routine Stack (MRS) 10520 within each SS 10336 Stack Frame 10510. MRS Stack 10520 is associated with the internal operation of CS 10110 microroutines executed during execution of the VP 10212 procedure associated with the Stack Frame 10510. SS 10336 is thus a dual function CS 10110 micromachine stack. Pointer Block 10516 entries effectively define an interface between CS 10110 micromachine and the current procedure of the current process. MRS 10520 comprise a stack mechanism for the internal operations of CS 10110 micromachine.

Having briefly described Virtual Processes 10212, FURSM 10214 will be described next. As stated above, EURSM 10216 is similar in operation to FURSM 10214 and will be described in following detailed descriptions of CS 10110 structure and operation.

3. FURSM 10214 (FIG. 103)

Referring again to FIG. 103, FURSM 10214 includes CS 10110 micromachine information structures used internally to CS 10110 micromachine in executing the procedures of a P 10310. When a VP, for example P 10310, is to be executed, certain information regarding that VP is transferred from the Virtual Processes 10212 to FURSM 10214 for use in executing that procedure. In this respect, FURSM 10214 may be regarded as an acceleration mechanism for the current Virtual Process 10212.

FURSM 10214 includes General Register File (GRF) 10354, Micro Stack Pointer Register Mechanism (MISPR) 10356, and Return Control Word Stack (RCWS) 10358. GRF 10354 includes Global Registers (GRs) 10360 and Stack Registers (SRs) 10362. GR 10360 include Architectural Base Registers (ABRs) 10364 and Micro-Control Registers (MCRs) 10366. Stack Registers 10362 include Micro-Stack (MIS) 10368 and Monitor Stack (MOS) 10370.

Referring first to GRF 10354, and assuming for example that Procedure 11 of P 10310 is currently being executed, GRF 10354 primarily contains certain pointers to P 10310 data used in execution of Procedure 11. As previously discussed, CS 10110's addressing structure includes certain Architectural Base Pointers (ABP's) for each procedure. ABPs provide a framework for accessing CS 10110's address space. The ABPs of each procedure include a Frame Pointer (FP), a Procedure Base Pointer (PBP), and a Static Data Pointer (STP). As discussed above with reference to KOSPO 10318, these ABPs reside in the procedure's PEDs. When a procedure is called, these ABP's are transferred from that procedure's PED to ABR's 10364 and reside therein for the duration of that procedure. As indicated in FIG. 103, FP points between Linkage Pointer Block 10416 and Local Pointer Blocks 10418 of Procedure 11's Frame 10412 on KOSMAS 10334. PBP points to the reference point from which the elements of KOSPO 10318 are located. SDP points to KOSSDA 10326. If Procedure 11 calls, for example, a Procedure 12, Procedure 11's ABPs will be transferred onto Procedure Pointer Block 10516 of SS 10336 Stack Frame 10510 for Procedure 11. Upon return to Procedure 11, Procedure 11's ABPs will be transferred from Procedure Pointer Block 10516 to ABR's 10364 and execution of Procedure 11 resumed.

MCRs 10336 contain certain pointers used by CS 10110 micromachine in executing Procedure 11. CS 10110 micromachine pointers indicated in FIG. 103 include Program Counter (PC), Name Table Pointer (NTP), S-Interpreter Pointer (SIP), Secure Stack Pointer (SSP), and Secure Stack Top Offset (SSTO). NTP and SIP have been previously described with reference to KOSPO 10318 and reside in KOSPO 10318. NTP and SIP are transferred into MCR's 10366 at start of execution of Procedure 11. PC, as indicated in FIG. 103, is a pointer to the Procedure 11 SIN currently being executed by CS 10110. PC is initially generated from Procedure 11's PBP and CEP and is thereafter incremented by CS 10110 micromachine as Procedure 11's SIN sequences are executed. SSP and SSTO are, as described in a following discussion, generated from information contained in SS 10336's Stack Header 10512 and Frame Headers 10514. As indicated in FIG. 103 SSP points to start of SS 10336 while SSTO indicates the current top frame on SS 10336, whether Procedure Pointer Block 10516 or a MRF 10518 of MRS 10520, by indicating an offset relative to SSP. If Procedure 11 calls a subsequent procedure, the contents of MCR's 10366 are transferred into Procedure 11's Procedure Pointer Block 10516 on SS 10336, and are returned to MCR's 10366 upon return to Procedure 11.

Registers 10360 contain further pointers, described in following detailed discussions of CS 10110 operation, and certain registers which may be used to contain the current procedure's local data.

Referring now to Stack Registers 10362, MIS 10368 is an upward extension, or acceleration, of MRS 10520 of the current procedure. As previously stated, MRS 10520 is used by CS 10110 micromachine in executing certain microroutines during execution of a particular procedure. MIS 10368 enhances the efficiency of CS 10110 micromachine in executing these microroutines by accelerating certain most recent MRFs 10518 of that procedure's MRS 10520 into FU 10120. MIS 10368 may contain, for example, up to the eight most recent MRFs 10518 of the current procedures MRS 10520. As various microroutines are called or returned from, MRS 10520 MRF's 10518 are transferred accordingly between SS 10336 and MIS 10368 so that MIS 10368 always contains at least the top MRF 10518 of MRS 10520, and at most eight MRFs 10518 of MRS 10520. MISPR 10356 is a CS 10110 micromachine mechanism for maintaining MIS 10368. MISPR 10356 contains a Current Pointer, a Previous Pointer, and a Bottom Pointer. Current Pointer points to the top-most MRF 10518 on MIS 10368. Previous Pointer points to the previous MRF 10518 on MIS 10368, and Bottom Pointer points to the bottom-most MRF 10518 on MIS 10368. MISPR 10356's Current, Previous and Bottom Pointers are updated as MRFs 10518 are transferred between SS 10336 and MIS 10368. If Procedure 11 calls a subsequent procedure, all Procedure 11 MRFs 10518 are transferred from MIS 10368 to Procedure 11's MRS 10520 on SS 10336. Upon return to Procedure 11, up to seven of Procedure 11's MRFs 10518 frames are returned from SS 10336 to MIS 10368.

Referring to MOS 10370, MOS 10370 is a stack mechanism used by CS 10110 micromachine for certain microroutines for handling fault or error conditions. These microroutines always run to completion, so that MOS 10370 resides entirely in FU 10120 and is not an extension of a stack residing in a P 10310 in MEM 10112. MOS 10370 may contain, for example, eight frames. If more than eight successive fault or error conditions occur, this is regarded as a major failure of CS 10110. Control of CS 10110 may then be transferred to DP 10118. As will be described in a following discussion, diagnostic programs in DP 10118 may then be used to diagnose and locate the CS 10110 faults or errors. In other embodiments of CS 10110 MOS 10370 may contain more or fewer stack frames, depending upon the degree of self diagnosis and correction capability desired for CS 10110.

RCWS 10358 is a two-part stack mechanism. A first part operates in parallel with MIS 10368 and a second part operates in parallel with MOS 10370. As previously described, CS 10110 is a microcode controlled system. RCWS is a stack for storing the current microinstruction being executed by CS 10110 micromachine when the current procedure is interrupted by a fault or error condition, or when a subsequent procedure is called. That portion of RCWS 10358 associated with MIS 10368 contains an entry for each MRF 10518 residing in MIS 10368. These RCWS 10358 entries are transferred between SS 10336 and MIS 10368 in parallel with their associated MRFs 10518. When resident in SS 10336, these RCWS 10358 entries are stored within their associated MRFs 10518. That portion of RCWS 10358 associated with MOS 10370 similarly operates in parallel with MOS 10370 and, like MOS 10370, is not an extension of an MEM 10112 resident stack.

In summary, each process active in CS 10110 exists as a separate, complete, and self-contained entity, or Virtual Process, and is structurally organized on a domain basis. Each Virtual Process includes, besides procedure and data objects, a set of MAS's for storing local data of that processes procedures. Each Virtual Process also includes a CS 10110 micromachine stack, SS 10336, for storing CS 10110 micromachine state pertaining to each stacked procedure of the Virtual Process. CS 10110 micromachine includes a set of information structures, register 10360, MIS 10368, MOS 10370, and RCWS 10358, used by CS 10110 micromachine in executing the Virtual Process's procedures. Certain of these CS 10110 micromachine information structures are shared with the currently executing Virtual Process, and thus are effectively acceleration mechanisms for the current Virtual Process, while others are completely internal to CS 10110 micromachine.

A primary feature of CS 10110 is that each process' macrostacks and secure stack resides in MEM 10112. CS 10110's macrostack and secure stacks are therefore effectively unlimited in depth.

Yet another feature of CS 10110 micromachine is the use of GRF 10354. GRF 10354 is, in an embodiment of CS 10110, a unitary register array containing for example, 256 registers. Certain portions, or address locations, of GRF 10354 are dedicated to, respectively, GRs 10360, MIS 10368, and MOS 10370. The capacities of GR 10360, MIS 10368, and MOS 10370, may therefore be adjusted, as required for optimum CS 10110 efficiency, by reassignment of GRF 10354's address space. In other embodiments of CS 10110, GRs 10360, MIS 10368, and MOS 10370 may be implemented as functionally separate registers arrays.

Having briefly described the structure and operation of Process Structures 10210, VP State Block 10218 will be described next below.

C. Virtual processor State Blocks and Virtual Process Creation (FIG. 102)

Referring again to FIG. 102, VP State Blocks 10218 is used in management and control of processes. VP State Blocks 10218 contains a VP State Block for each Virtual Process (VP) selected for execution by CS 10110. Each such VP State Block contains at least the following information:

(1) the state, or identification number of a VP;

(2) entries identifying the particular principle and particular process of the VP;

(3) an AON pointer to that VP's secure stack (e.g., SS 10336);

(4) the AON's of that VP's MAS stack objects (e.g., MAS's 10328 to 10334); and, (5) certain information used by CS 10110's VP Management System.

The information contained in each VP State Block thereby defines the current state of the asociated VP.

A Process is loaded into CS 10110 by building a primitive access record and loading this access record into CS 10110 to appear as an already existing VP. A VP is created by creating a Process Object, including pointers to macro-and secure-stack objects created for that VP, micromachine state entries, and a pointer to the user's program. CS 10110's KOS then generates Macro- and Secure-Stack Objects with headers for that process and, as described further below, loads protection information regarding that process' objects into Protection Structures 10230. CS 10110's KOS then copies this primitive machine state record into a vacant VPSB selected by CS 10110's VP Manager, thus binding the newly created VP into CS 10110. At that time a KOS Initializer procedure completes creation of the VP for example by calling in the user's program through a compiler. The newly creatd VP may then be executed by CS 10110.

Having briefly described VP State Blocks 10218 and creation of a VP, CS 10110's Addressing Structures 10220 will be described next below.

D. Addressing Structures 10220 (FIGS. 103, 106, 107, 108)

1. Objects, UID's, AON's, Names, and Physical Addresses (FIG. 106)

As previously described, the data space accessible to CS 10110 is divided into segments, or containers, referred to as objects. In an embodiment of CS 10110, the addressable data space of each object has a capacity of $2^{32}$ information and is structured into $2^{18}$ pages with each page containing $2^{14}$ bits of information.

Figure 106A:
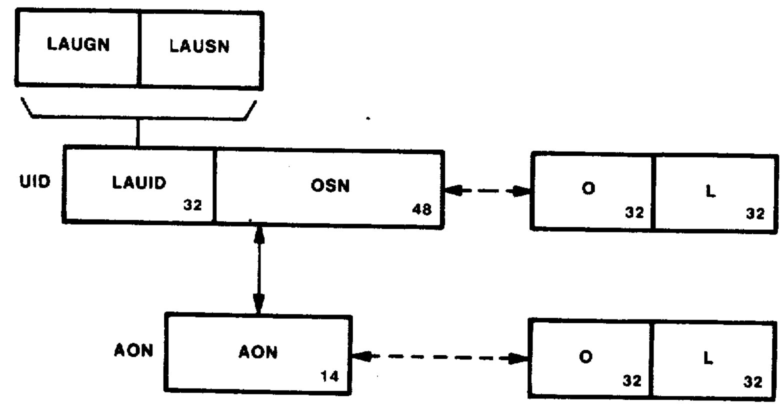
FIGS. 106 A, B, and C are diagrams illustrating the addressing structure of the present computer system.

Referring to FIG. 106A, a schematic representation of CS 10110's addressing structure is shown. Each object created for use in, or by operation of, a CS 10110 is permanently assigned a unique identifier (UID). An object's UID allows an object to be uniquely identified and located at any future point in time. Each UID is an 80 bit number, so that the total addressable space of all CS 10110's includes $2^{80}$ objects wherein each object may contain up to $2^{32}$ bits of information. As indicated in FIG. 106, each 80 bit UID is comprised of 32 bits of Logical Allocation Unit Identifier (LAUID) and 48 bits of Object Serial Number (OSN). LAUIDs are associated with individual CS 10110 systems. LAUIDs identify the particular CS 10110 system generating a particular object. Each LAUID is comprised of a Logical Allocation Unit Group Number (LAUGN) and a Logical Allocation Unit Serial Number (LAUSN). LAUGNs are assigned to individual CS 10110 systems and may be guaranteed to be unique to a particular system. A particular system may, however, be assigned more than one LAUGN so that there may be a time varying mapping between LAUGNs and CS 10110 systems. LAUSNs are assigned within a particular system and, while LAUSNs may be unique within a particular system, LAUSNs need not be unique between systems and need not map onto the physical structure of a particular system.

OSNs are associated with individual objects created by an LAU and are generated by an Architectural Clock in each CS 10110. Architectural clock is defined as a 64 bit binary number representing increasing time. Least significant bit of architectural clock represents increments of 600 picoseconds, and most significant bit represents increments of 127 years. In the present embodiment of CS 10110, certain most significant and least significant bits of architectural clock time are disregarded as generally not required practice. Time indicated by architectural clock is measured relative to an arbitrary, fixed point in time. This point in time is the same for all CS 10110s which will ever be constructed. All CS 10110s in existence will therefore indicate the same architectural clock time and all UIDs generated will have a common basis. The use of an architectural clock for generation of OSNs is advantageous in that it avoids the possibility of accidental duplication of OSNs if a CSC 10110 fails and is subsequently reinitiated.

As stated above, each object generated by or for use in a CS 10110 is uniquely identified by its associated UID. By appending Offset (O) and Length (L) information to an object's UID, a UID logical address is generated which may be used to locate particular segments of data residing in a particular object. As indicted in FIG. 106, O and L fields of a UID logical address are each 32 bits. O and L fields can therefore indicate any particular bit, out of $2^{32-1}$ bits, in an object and thus allow bit granular addressing of information in objects.

As indicated in FIG. 106 and as previously described, each object active in CS 10110 is assigned a short temporary unique identifier valid only within JP 10114 and referred to as an Active Object Number (AON). Because fewer objects may be active in a CS 10110 than may exist in a CS 10110's address space, AON's are, in the present embodiment of CS 10110, 14 bits in length. A particular CS 10110 may therefore contain up to $2^{14}$ active objects. An object's AON is used within JP 10114 in place of that object's UID. For example, as discussed above with reference to process structures 10210, a procedure's FP points to start of that procedure's frame on its process' MAS. When that FP is residing in SS 10336, it is expressed as a UID. When that procedure is to be executed, FP is transferred from SS 10336 to ABR's 10364 and is translated into the corresponding AON. Similarly, when that procedure is stacked, FP is returned to SS 10336 and in doing so is translated into the corresponding UID. Again, a particular data segment in an object may be addressed by means of an AON logical address comprising the object's AON plus associated 32 bit Offset (O) and Length (L) fields.

Figure 106B:
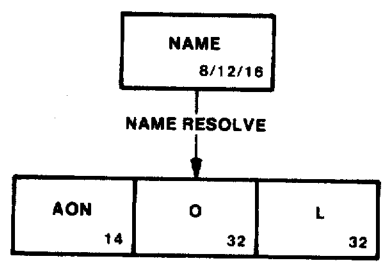

Each operand appearing in a process is assigned a Name and all references to a process's operands are through those assigned Names. As indicated in FIG. 106B, in the present embodiment of CS 10110 each Name is an 8, 12, or 16 bit number. All Names within a particular process will be of the same length As will be described in a following discussion, Names appearing during execution of a process may be resolved, through a procedure's Name Table 10350 or through Name Cache 10226, to an AON logical address As described below, an AON logical address corresponding to an operand Name may then be evaluated to a MEM 10112 physical address to locate the operand referred to.

Figure 106C:
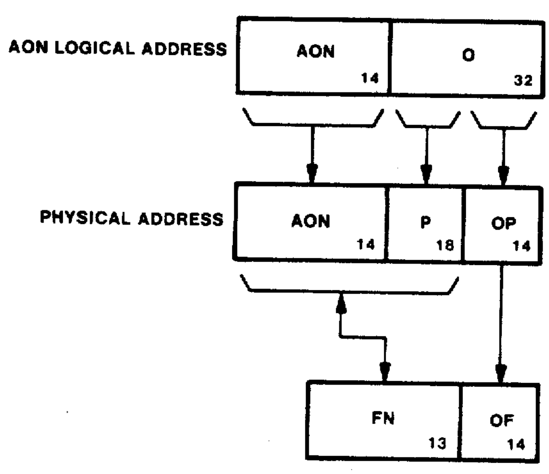

The evaluation of AON logical addresses to MEM 10112 physical addresses is represented in FIG. 106C. An AON logical address's L field is not involved in evaluation of an AON logical address to a physical address and, for purposes of clarity of presentation, is therefore not represented in FIG. 106C. AON logical address L field is to be understood to be appended to the addresses represented in the various steps of the evaluation procedure shown in FIG. 106C.

As described above, objects are $2^{32}$ bits structured into $2^{18}$ pages with each page containing a $2^{14}$ bits of data. MEM 10112 is similarly physically structured into frames with, in the present embodiment of CS 10110, each frame containing $2^{14}$ bits of data. In other embodiments of CS 10110, both pages and frames may be of different sizes but the translation of AON logical addresses to MEM 10112 physical addresses will be similar to that described momentarily.

An AON logical address O field was previously described as a 32 bit number representing the start, relative to start of the object, of the addressed data segment within the object. The 18 most significant bits of O field represent the number (P) of the page within the object upon which the first bit of the addressed data occurs. The 14 least significant bits of O field represent the offset ($O_P$), relative to the start of the page, within that page of the first bit of the addressed data. AON logical address 0 field may therefore, as indicated in FIG. 106C, be divided into an 18 bit page (P) field and a 14 bit offset within page ($O_P$) field. Since, as described above, MEM 10112 physical frame size is equal to object page size, AON logical address $O_P$ field may be used directly as an offset within frame ($O_F$) field of the physical address. As will be described below, an AON logical address AON and P fields may then be related to the frame number (FN) of the MEM 10112 frame in which that page resides, through Addressing Mechanisms 10220.

Having briefly described the relationships between UIDs, UID Logical Addresses, Names, AONs, AON Logical Addresses, and MEM 10112 Physical Addresses, Addressing Mechanisms 10220 will be described next below.

2. Addressing Mechanisms 10220 (FIG. 107)

Figure 107:
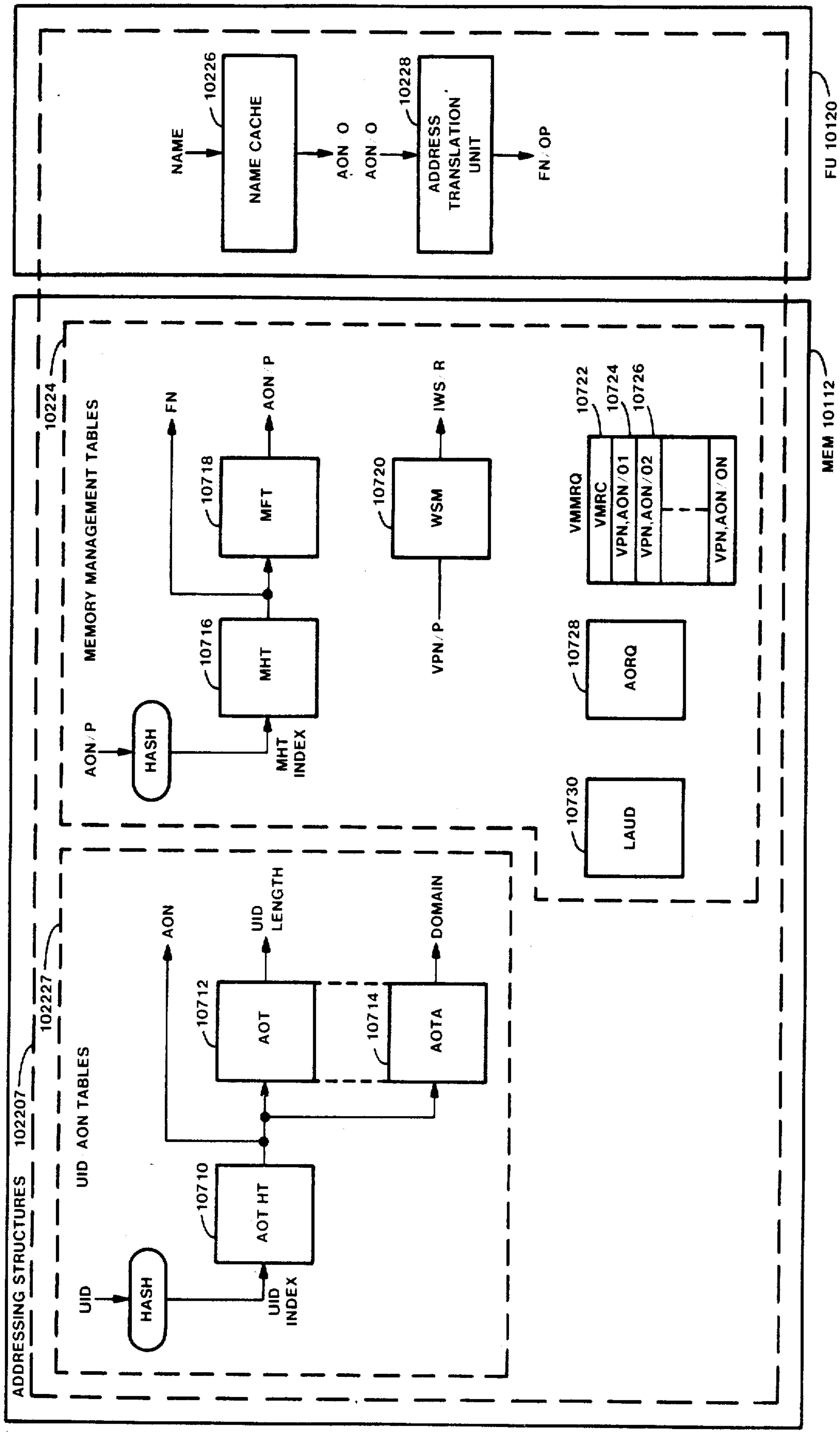
FIG. 107 is a diagram illustrating addressing mechanisms of the present computer system.

Referring to FIG. 107, a schematic representation of Computer System 10110's Addressing Mechanisms 10220 is shown. As previously described, Addressing Mechanisms 10220 comprise UID/AON Tables 10222, Memory Management Tables 10224, Name Cache 10226, and Address Translation Unit 10228.

UID/AON Tables 10222 relate each object's UID to its assigned AON and include AOT Hash Table (AOTHT) 10710, Active Object Table (AOT) 10712, and Active Object Table Annex (AOTA) 10714.

Associated with AOT 10712 is AOTA 10714. AOTA 10714 is an extension of AOT 10712 and contains certain information pertaining to active objects, for example the domain of execution of each active procedure object.

Having briefly described CS 10110's mechanism for relating UIDs and AONs, CS 10110's mechanism for resolving operand Names to AON logical addresses will be described next below.

3. Name Resolution (FIGS. 103, 108)

Referring first to FIG. 103, each procedure object in a VP, for example KOSPO 10318 in VP 10310, was described as containing a Name Table (NT) 10350. Each NT 10350 contains a Name, Table Entry (NTE) for each operand whose Name appears in its procedure. Each NTE contains a description of how to resolve the corresponding Name to an AON Logical Address, including fetch mode information, type of data referred to by that Name, and length of the data segment referred to.

Figure 108:
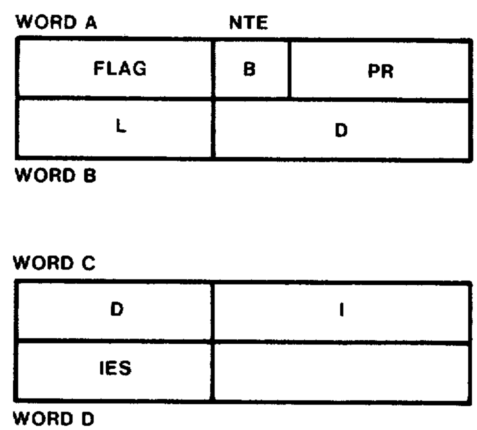
FIG. 108 is a diagram illustrating a name table entry.

Referring to FIG. 108, a representation of an NTE is shown. As indicated, this NTE contains seven information fields: Flag, Base (B), Predisplacement (PR), Length (L), Displacement (D), Index (I), and Inter-element Spacing (IES). Flag Field, in part, contains information describing how the remaining fields of the NTE are to be interpreted, type of information referred to by the NTE, and how that information is to be handled when fetched from MEM 10112. L Field, as previously described, indicates length, or number of bits in, the data segment. Functions of the other NTE fields will be described during the following discussions.

In a present embodiment of CS 10110, there are five types of NTE: (1) base (B) is not a Name, address resolution is not indirect; (2) B is not a Name, address resolution is indirect; (3) B is a Name, address resolution is indirect; (4) B is a Name, address resolution is indirect. A fifth type is an NTE selecting a particular element from an array of elements. These five types of NTE and their resolution will be described below, in the order mentioned.

In the first type, B is not a Name and address resolution is not indirect, B Field specifies an ABR 10364 containing an AON plus offset (AON/0) Pointer. The contents of D Field are added to the O Field of this pointer, and the result is the AON Logical Address of the operand. In the second type, B is not a Name and address resolution is indirect, B Field again specifies an ABR 10364 containing an AON/O pointer. The contents of PR Field are added to the O Field of the AON/O pointer to provide an AON Logical Address of a Base Pointer. The Base Pointer AON Logical Address is evaluated, as described below, and the Base Pointer fetched from MEM 10112. The contents of D Field are added to the O Field of the Base Pointer and the result is the AON Logical Address of the operand.

NTE types 3 and 4 correspond, respectively to NTE types 1 and 2 and are resolved in the same manner except that B Field contains a Name. The B Field Name is resolved through another NTE to obtain an AON/O pointer which is used in place of the ABR 10364 pointers referred to in discussion of types 1 and 2.

The fifth type of NTE is used in references to elements of an array. These array NTEs are resolved in the same manner as NTE types 1 through 4 above to provide an AON Logical Address of the start of the array. I and IES Fields provide additional information to locate a particular element in the array. I Field is always Name which is resolved to obtain an operand value representing the particular element in the array. IES Field provides information regarding spacing between elements of the array, that is the number of bits between adjacent element of the array. IES Field may contain the actual IES value, or it may contain a Name which is resolved to an AON Logical Address leading to the inter-element spacing value The I and IES values, obtained by resolving the I and IES Fields as just described, are multiplied together to determine the offset, relative to the start of the array, of the particular element referred to by the NTE. This within array offset is added to the O Field of the AON Logical Address of the start of the array to provide the AON Logical Address of the element.

In the current embodiment of CS 10110, certain NTE fields, for example B, D, and Flag fields, always contain literals. Certain other fields, for example, IES, D, PRE, and L fields, may contain either literals or names to be resolved Yet other fields, for example I field, always contain names which must be resolved.

Passing of arguments from a calling procedure to a called procedure has been previously discussed with reference to Virtual Processes 10212 above, and more specifically with regard to MAS's 10328 to 10334 of VP 0310 Passing of arguments is accomplished through the calling and called procedure's Name Tables 10350. In illustration, a procedure W(a,b,c) may wish to pass arguments a, b, and c to procedure X(u,v,w), where arguments, v and w correspond to arguments a, b, and c. At compilation, NTEs are generated for arguments a, b, and c in Procedure W's procedure object, and NTEs are generated for arguments u, v and w in Procedure X's procedure object Procedure X's NTEs for u, v, and w are constructed to resolve to point to pointers in Linkage Pointer Block 10416 of Procedure X's Frame 10412 in MAS. To pass arguments a, b, and c from Procedure W to Procedure X, the NTEs of arguments a, b, and c are resolved t AON Logical Addresses (i.e., AON/O form). Arguments a, b, and c's AON Logical Addresses are then translated to corresponding UID addresses which are placed in Procedure X's Linkage Pointer Block 10416 at those places pointed to by Procedure X's NTEs for u, v, and w. When Procedure X is executed, the resolution of Procedure X's NTEs for u, v, and w will be resolved to locate the pointers, in Procedure X's Linkage Pointer Block 10416 to arguments a, b, and c. When arguments are passed in this manner, the data type and length information are obtained from the called procedure's NTEs, rather than the calling procedure's NTEs. This allows the calling procedure to pass only a portion of, for example, arguments a, b, or c, to the called procedure and thus may be regarded as a feature of CS 10110's protection mechanisms.

Having briefly described resolution of Names to AON/Offset addresses, and having previously described translation of UID addresses to AON addresses, the evaluation of AON addresses to MEM 10112 physical addresses will be described next below.

4. Evaluation of AON Addresses to Physical Addresses (FIG. 107)

Referring again to FIG. 107, a partial schematic representation of CS 10110's Memory Management Table 10224 is shown. Memory Hash Table (MHT) 10716 and Memory Frame Table (MFT) 10718 are concerned with translation of AON addresses into MEM 10112 physical addresses and will be discussed first. Working Set Matrix (WSM) 10720 and Virtual Memory Manager Request Queue (VMMRQ) 10722 are concerned with management of MEM 10112's available physical address base and will be discussed second. Active Object Request Queue (AORQ) 10728 and Logical Allocation Unit Directory (LAUD) 10730 are concerned with locating inactive objects and management of which objects are active in CS 10110 and will be discussed last.

Translation of AON/O Logical Addresses to MEM 10112 physical addresses was previously discussed with reference to FIG. 106C. As stated in that discussion, objects are divided into pages. Correspondingly, the AON/O Logical Address' O Field is divided into an 18 bit page number (P) Field and a 14 bit offset within a page ($O_P$) Field. MEM 10112 is structured into frames, each of which in the present embodiment of CS 10110 is equal to a page of an object. An AON/O address' $O_P$ Field may therefore be used directly as an offset within frame ($O_F$) of the corresponding physical address. The AON and P fields of an AON address must, however, be translated into a MEM 10112 frame represented by a corresponding Frame Number (FN).

Referring now to FIG. 107, an AON address' AON and P Fields are "hashed" to generate an MHT index which is used as an index into MHT 10716. Briefly, "hashing" is a method of indexing, or locating, information in a table herein indexes to the information are generated from the information itself through a "hashing function". A hashing function maps each piece of information to the corresponding index generated from it through the hashing function. MHT 10716 then provides the corresponding FN of the MEM 10112 frame in which, that page is stored. FNs are used as indexes into MFT 10718, which contains, for each FN, an entry describing the page stored in that frame. This information includes the AON and P of the page stored in that MEM 10112 frame. An FN from MHT 10716 may therefore be used as an index into MFT 10718 and the resulting AON/P of MFT 10718 compared to the original AON/P to confirm the correctness of the FN obtained from MHT 10716. MHT 10716 is an effectively acceleration mechanism of MFT 10718 to provide rapid translation of AON address to MEM 10112 physical addresses.

MFT 10718 also stores "used" and "modified" information for each page in MEM 10112. This information indicates which page frames stored therein have been used and which have been modified. This information is used by CS 10110 in determining which frames may be deleted from MEM 10112, or are free, when pages are to be written into MEM 10112 from backing store (ED 10124). For example, if a page's modified bit indicates that that page has not been written into, it is not necessary to write that page back into backing store when it is deleted from MEM 10112; instead, that page may be simply erased.

Referring finally to ATU 10228, ATU 10228 is an acceleration mechanism for MHT 10716. AON/O addresses are used directly, without hashing, as indexes into ATU 10228 and ATU 10228 correctly provides corresponding FN and $O_P$ outputs. A CS 10110 mechanism, described in a following detailed discussion of CS 10110 operation, continually updates the contents of ATU 10228 so that ATU 10228 contain the FN's and $O_{Ps}$ ($O_{Fs}$) of the pages most frequently referenced by the current process. If ATU 10228 does not contain a corresponding entry for a given AON input, an ATU fault occurs and the FN and $O_F$ information may be obtained directly from MHT 10716.

Referring now to WSM 10720 and VMMRQ 10722, as previously stated these mechanisms are concerned with the management of MEM 10112's available address space. For example, if MHT 10716 and MFT 10718 do not contain an entry for a page referenced by the current procedure, an MHT/MFT fault occurs and the reference page must be fetched from backing store (ED 10124) and read into MEM 10112. WSM 10720 contains an entry for each page resident in MEM 10112. These entries are accessed by indexes comprising the Virtual Processor Number (VPN) of the virtual process making a page reference and the P of the page being referenced. Each WSM 10720 entry contains 2 bits stating whether the particular page is part of a VP's working set, that is, used by that VP, and whether that page has been referenced by that VP. This information, together with the information contained in that MFT 10718 entries described above, is used by CS 10110's Virtual Memory Manager (VMM) in transferring pages into and out of MEM 10112.

CS 10110's VMM maintains VMMRQ 10722, which is used by VMM to control transfer of pages into and out of MEM 10112. VMMRQ 10722 includes Virtual Memory Request Counter (VMRC) 10724 and a Queue of Virtual Memory Request Entries (VMREs) 10726. As will be discussed momentarily, VMRC 10724 tracks the number of currently outstanding request for pages. Each VMRE 10726 describes a particular page which has been requested. Upon occurrence of a MHT/MFT (or page) fault, VMRC 10724 is incremented, which initiates operation of CS 10110's VMM, and a VMRE 10726 is placed in the queue. Each VMRE 10726 comprises the VPN of the process requesting the page and the AON/O of the page requested. At this time, the VP making the request is swapped out of JP 10114 and another VP bound to JP 10114. VMM allocates MEM 10112 frame to contain the requested page, using the previously described information in MFT 10718 and WSM 10720 to select this frame. In doing so, VMM may discard a page currently resident in MEM 10112 for example, on the basis of being the oldest page, an unused page, or an unmodified page which does not have to be written back into backing store. VMM then requests an I/O operation to transfer the requested page into the frame selected by the VMM. While the I/O operation is proceeding, VMM generates new entries in MHT 10716 and MFT 10718 for the requested page, cleans the frame in MEM 10112 which is to be occupied by that page, and suspends operation. IOS 10116 will proceed to execute the I/0 operation and writes the requested page directly into MEM 10112 in the frame specified by VMM. IOS 10116 then notifies CS 10110's VMM that the page now resides in memory and can be referenced. At some later time, that VP requesting that page will resume execution and repeat that reference. Going first to ATU 10228, that VP will take an ATU 10228 fault since VP 10212 has not yet been updated to contain that page. The VP will then go to MHT 10716 and MFT 10718 for the required information and, concurrently, WSM 10720 and ATU 10228 will be updated.

In regard to the above operations, each VP active in CS 10110 is assigned a Page Fault Frequency Time Factor (PFFT) which is used by CS 10110's VMM to adjust that VP's working set so that the interval between successive page faults for that VP lies in an optimum time range. This assists in ensuring CS 10110's VMM is operating most efficiently and allows CS 10110's VMM to be tuned as required.

The above discussions have assumed that the page being referenced, whether from a UID/O address, an AON/O address, or a Name, is resident in an object active in CS 10110. While an object need not have a page in MEM 10112 to be active, the object must be active to have a page in MEM 10112. A VP, however, may reference a page in an object not active in CS 10110. If such a reference is made, the object must be made active in CS 10110 before the page can be brought into MEM 10112. The result is an operation similar to the page fault operation described above. CS 10110 maintains an Active Object Manager (AOM), including Active Object Request Queue (AORQ) 10728, which are similar in operation to CS 10110's VMM and VMMRQ 10722. CS 10110's AOM and AORQ 10728 operate in conjunction with AOTHT 10710 and AOT 10712 to locate inactive objects and make them active by assigning them AON's and generating entries for them in AOTHT 10710, AOT 10712, and AOTA 10714.

Before a particular object can be made active in CS 10110, it must first be located in backing store (ED 10124). All objects on backing store are located through a Logical Allocation Unit Directory (LAUD) 10730, which is resident in backing store. An LAUD 10730 contains entries for each object accessible to the particular CS 10110. Each LAUD 10730 entry contains the information necessary to generate an AOT 10712 entry for that object. An LAUD 10730 is accessed through a UID/O address contained in CS 10110's VMM. A reference to an LAUD 10730 results in MEM 10112 frames being assigned to that LAUD 10730, and LAUD 10730 being transferred into MEM 10112. If an LAUD 10730 entry exists for the referenced inactive object, the LAUD 10730 entry is transferred into AOT 10712. At the next reference to a page in that object, AOT 10712 will provide the AON for that object but, because the page has not yet been transferred into MEM 10112, a page fault will occur. This page fault will be handled in the manner described above and the referenced page transferred into MEM 10112.

Having briefly described the structure and operation of CS 10110's Addressing Structure, including the relationship between UIDs, Names, AONs, and Physical Addresses and the mechanisms by which CS 10110 manages the available address space of MEM 10112, CS 10110's protection structures will be described next below.

E. CS 10110 Protection Mechanisms (FIG. 109)

Figure 109:
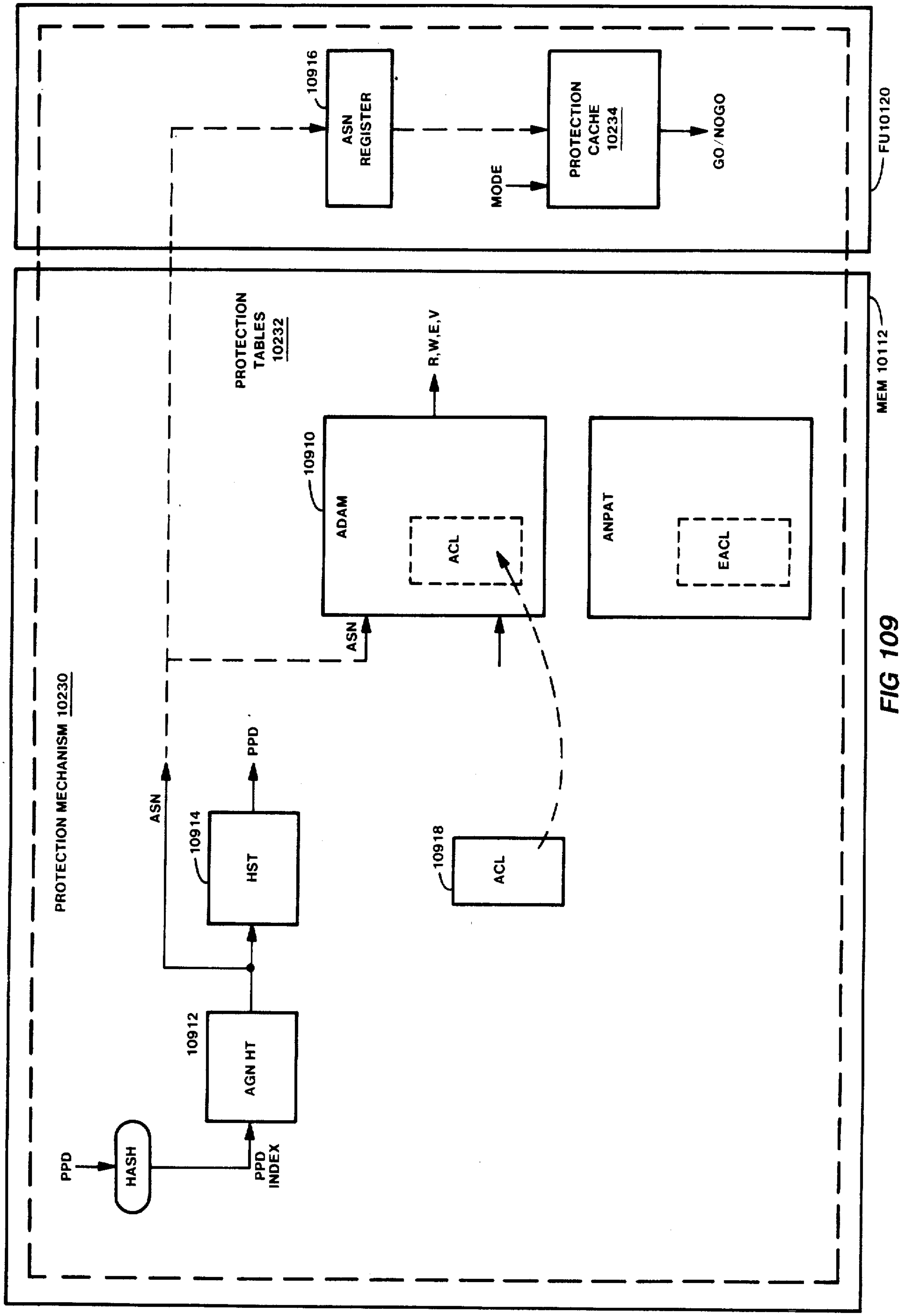
FIG. 109 is a diagram illustrating protection mechanisms of the present computer system.

Referring to FIG. 109, a schematic representation of Protection Mechanisms 10230 is shown. Protection Tables 10232 include Active Primitive Access Matrix (APAM) 10910, Active Subject Number Hash Table (ASNHT) 10912, and Active Subject Table (AST) 10914. Those portions of Protection Mechanism 10230 resident in FU 10120 include ASN Register 10916 and Protection Cache (PC) 10234.

As previously discussed, access rights to objects are arbitrated on the basis of subjects. A subject has been defined as a particular combination of a Principle, Process, and Domain (PPD), each of which is identified by a corresponding UID. Each object has associated with it an Access Control List (ACL) 10918 containing an ACL Entry (ACLE) for each subject having access rights to that object.

When an object becomes active in CS 10110 (i.e., is assigned an AON) each ACLE in that object's ACL 10918 is written into APAM 10910. Concurrently, each subject having access rights to that object, and for which there is an ACLE in that object's ACL 10918, is assigned an Active Subject Number (ASN). These ASNs are written into ASNHT 10912 and their corresponding PPDs are written into AST 10914. Subsequently, the ASN of any subject requesting access to that object is obtained by hashing the PPD of that subject to obtain a PPD index into ASNHT 10912. ASNHT 10912 will in turn provide a corresponding ASN. An ASN may be used as an index into AST 10914. AST 10914 will provide the corresponding PPD, which may be compared to an original PPD to confirm the accuracy of the ASN.

As described above, APAM 10910 contains an ACL 10918 for each object active in CS 10110. The access rights of any particular active subject to a particular active object are determined by using that subject's ASN and that object's AON as indexes into APAM 10910. APAM 10910 in turn provides a 4 bit output defining whether that subject has Read (R) Write (W) or Execute (E) rights with respect to that object, and whether that particular entry is Valid (V).

ASN Register 10916 and PC 10234 are effectively acceleration mechanisms of Protection Tables 10232. ASN Register 10916 stores the ASN of a currently active subject while PC 10234 stores certain access right information for objects being used by the current process. PC 10234 entries are indexed by ASNs from ASN register 10916 and by a mode input from JP 10114. Mode input defines whether the current procedure intends to read, write, or execute with respect to a particular object having an entry in PC 10234. Upon receiving ASN and mode inputs, PC 10234 provides a go/nogo output indicating whether that subject has the access rights required to execute the intended operation with respect to that object.

In addition to the above mechanism, each procedure to which arguments may be passed in a cross-domain call has associated with it an Access Information Array (AIA) 10352, as discussed with reference to Virtual Processes 10212. A procedure's AIA 10352 states what access rights a calling procedure (subject) must have to a particular object (argument) before the called procedure can operate on the passed argument CS 10110's protection mechanisms compare the calling procedures access rights to the rights required by the called procedure. This insures the calling procedure may not ask a called procedure to do what the calling procedure is not allowed to do. Effectively, a calling procedure can pass to a called procedure only the access rights held by the calling procedure.

Finally, PC 10234, APAM 10910, or AST 10914 faults (i.e., misses) are handled in the same manner as described above with reference to page faults in discussion of CS 10110's Addressing Mechanisms 10220. As such, the handling of protection misses will not be discussed further at this point.

Having briefly described structure and operation of CS 10110's Protection Mechanisms 10230, CS 10110's Micro-Instruction Mechanisms 10236 will be described next below.

F. CS 10110 Micro-Instruction Mechanisms (FIG. 110)

As previously described, CS 10110 is a multiple language machine. Each program written in a high level user language is compiled into a corresponding S-Language program containing instructions expressed as SINs. CS 10110 provides a set, or dialect, of microcode instructions, referred to as S-Interpreters (SINTs) for each S-Language. SINTs interpret SINs and provide corresponding sequences of microinstructions for detailed control of CS 10110.

Figure 110:
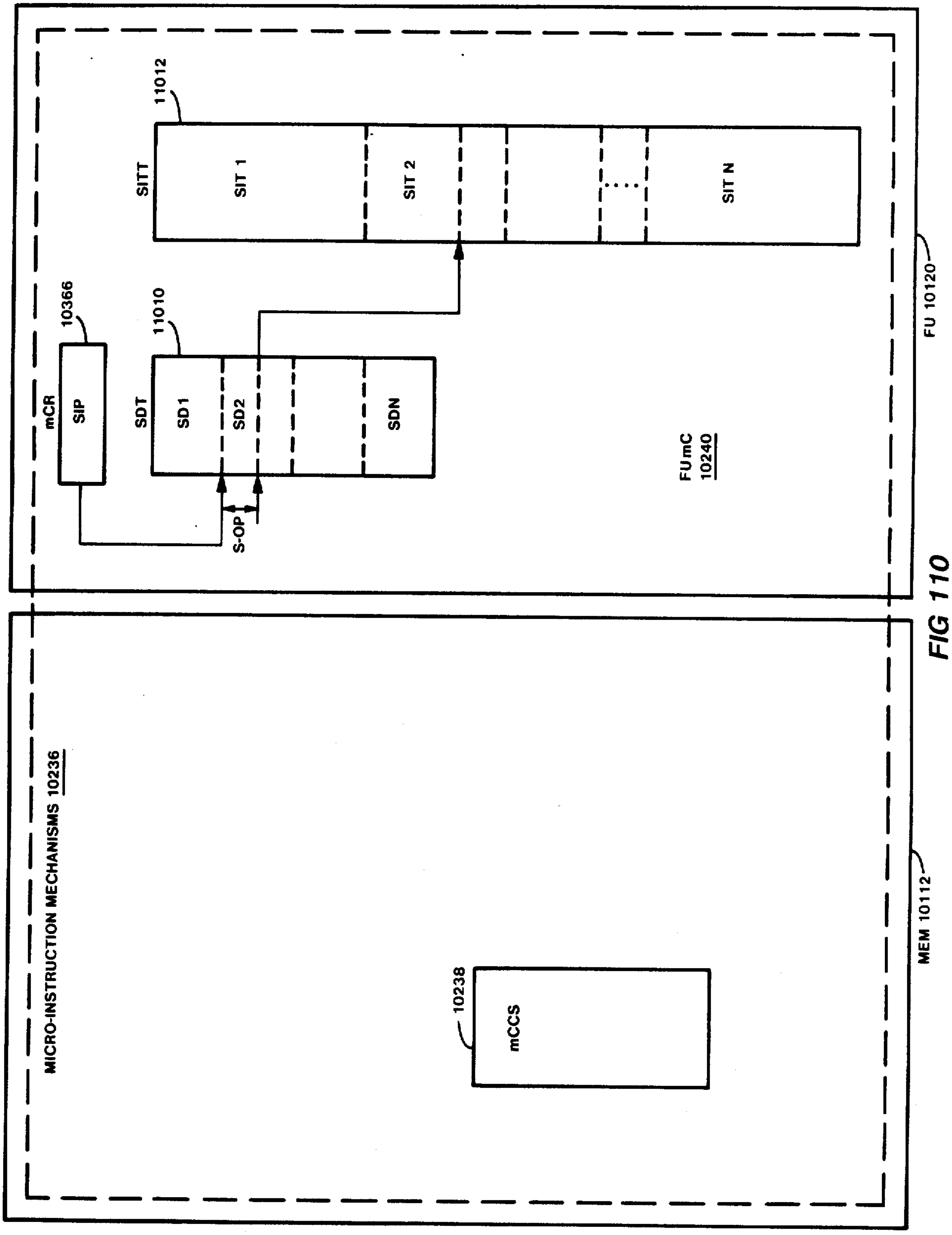
FIG. 110 is a diagram illustrating instruction and microinstruction mechanism of the present computer system.

Referring to FIG. 110, a partial schematic representation of CS 10110's Micro-Instruction Mechanisms 10236 is shown. At system initialization all CS 10110 microcode, including SINTs and all machine assist microcode, is transferred from backing store to Micro-Code Control Store (mCCS) 10238 in MEM 10112. The Micro-Code is then transferred from mCCS 10238 to FU Micro-Code Structure (FUmC) 10240 and EU Micro-Code Structure (EUmC) 10242. EUmC 10242 is similar in structure and operation to FUmC 10240 and thus will be described in following detailed descriptions of CS 10110's structure and operation. Similarly, CS 10110 machine assist microcode will be described in following detailed discussions. The present discussion will concern CS 10110's S-Interpreter mechanisms.

CS 10110's S-Interpreters (SINTs) are loaded into S-Interpret Table (SITT) 11012, which is represented in FIG. 110 as containing S-Interpreters 1 to N. Each SIT contains one or more sequences of micro-code; each sequence of microcode corresponds to a particular SIN in that S-Language dialect. S-Interpreter Dispatch Table (SDT) 11010 contains S-Interpreter Dispatchers (SDs) 1 to N. There is one SD for each SINT in SITT 11012, and thus a SD for each S-Language dialect. Each SD comprises a set of pointers. Each pointer in a particular SD corresponds to a particular SIN of that SD's dialect and points to the corresponding sequence of microinstructions for interpreting that SIN in that dialect's SIT in SITT 11012. In illustration, as previously discussed when a particular procedure is being executed the SIP for that procedure is transferred into one of mCR's 10366. That SIP points to the start of the SD for the SIT which is to be used to interpret the SINs of that procedure. In FIG. 110, the SIP in mCRs 10366 is shown as pointing to the start of SD2. Each S-Op appearing during execution of that procedure is an offset, relative to the start of the selected SD, pointing to a corresponding SD pointer. That SD pointer in turn points to the corresponding sequence of microinstructions for interpreting that SIN in the corresponding SIT in SITT 11012. As will be described in following discussions, once the start of a microcode sequence for interpreting an SIN has been selected, CS 10110 micromachine then proceeds to sequentially call the microinstructions of that sequence from SITT 11012 and use those microinstructions to control operation of CS 10110.

G. Summary of Certain CS 10110 Features and Alternate Embodiments

The above Introductory Overview has described the overall structure and operation and certain features of CS 101, that is, CS 10110. The above Introduction has further described the structure and operation and further features of CS 10110 and, in particular, the physical implementation and operation of CS 10110's information, control, and addressing mechanisms. Certain of these CS 10110 features are summarized next below to briefly state the basic concepts of these features as implemented in CS 10110. In addition, possible alternate embodiments of certain of these concepts are described.

First, CS 10110 is comprised of a plurality of independently operating processors, each processor having a separate microinstruction control. In the present embodiment of CS 10110, these processors include FU 10120, EU 10122, MEM 10112 and IOS 10116. Other such independently operating processors, for example, special arithmetic processors such as an array processor, or multiple FU 10120's, may be added to the present CS 10110.

In this regard, MEM 10112 is a multiport processor having one or more separate and independent ports to each processor in CS 10110. All communications between CS 10110's processors are through MEM 10112, so that MEM 10112 operates as the central communications node of CS 10110, as well as performing memory operations. Further separate and independent ports may be added to MEM 10112 as further processors are added to CS 10110. CS 10110 may therefore be described as comprised of a plurality of separate, independent processors, each having a separate microinstruction control and having a separate and independent port to a central communications and memory node which in itself is an independent processor having a separate and independent microinstruction control. As will be further described in a following detailed description of MEM 10112, MEM 10112 itself is comprised of a plurality of independently operating processors, each performing memory related operations and each having a separate microinstruction control. Coordination of operations between CS 10110's processors is achieved by passing "messages" between the processors, for example, SOP's and descriptors.

CS 10110's addressing mechanisms are based, first, upon UID addressing of objects That is, all information generated for use in or by operation of a CS 10110, for example, data and procedures, is structured into objects and each object is assigned a permanent UID. Each UID is unique within a particular CS 10110 and between all CS 10110's and is permanently associated with a particular object. The use of UID addressing provides a permanent, unique addressing means which is common to all CS 10110's, and to other computer systems using CS 10110's UID addressing.

Effectively, UID addressing means that the address (or memory) space of a particular CS 10110 includes the address space of all systems, for example disc drives or other CS 10110s, to which that particular CS 10110 has access. UID addressing allows any process in any CS 10110 to obtain access to any object in any CS 10110 to which it has physical access, for example, another CS 10110 on the other side of the world. This access is constrained only by CS 10110's protection mechanism. In alternate embodiments of CS 10110, certain UIDs may be set aside for use only within a particular CS 10110 and may be unique only within that particular CS 10110. These reserved UIDs would, however, be a limited group known to all CS 10110 systems as not having uniqueness between systems, so that the unique object addressing capability of CS 10110's UID addressing is preserved.

As previously stated, AONs and physical descriptors are presently used for addressing within a CS 10110, effectively as shortened UIDs. In alternate embodiments of CS 10110, other forms of AONs may be used, or AONs may be discarded entirely and UIDs used for addressing within as well as between CS 10110s.

CS 10110's addressing mechanisms are also based upon the use of descriptors within and between CS 10110s. Each descriptor includes an AON or UID field to identify a particular object, an offset field to specify a bit granular offset within the object, and a length field to specify a particular number of bits beginning at the specified offset. Descriptors may also include a type, or format field identifying the particular format of the data referred to by the descriptor. Physical descriptors are used for addressing MEM 10112 and, in this case, the AON or UID field is replaced by a frame number field referring to a physical location in MEM 10112.

As stated above, descriptors are used for addressing within and between the separate, independent processors (FU 10120, EU 10122, MEM 10112, and IOS 10116) comprising CS 10110. thereby providing common, system wide bit granular addressing which includes format information. In particular, MEM 10112 responds to the type information fields of descriptors by performing formatting operations to provide requestors with data in the format specified by the requestor in the descriptor. MEM 10112 also accepts data in a format specified in a descriptor and reformats that data into a format most efficiently used by MEM 10112 to store the data.

As previously described, all operands are referred to in CS 10110 by Names wherein all Names within a particular S-Language dialect are of a uniform, fixed size and format. A K value specifying Name size is provided to FU 10120, at each change in S-Language dialect, and is used by FU 10120 in parsing Names from the instruction stream. In an alternate embodiment of CS 10110, all Names are the same size in all S-Language dialects, so that K values, and the associated circuitry in FU 10120's parser, are not required.

Finally, in descriptions of CS 10110's use of SOPs, FU 10120's microinstruction circuitry was described as storing one or more S-Interpreters. S-Interpreters are sets of sequences of microinstructions for interpreting the SOPs of various S-Language dialects and providing corresponding sequences of microinstructions to control CS 10110. In an alternate embodiment of CS 10110, these S-Interpreters (SITT 11012) would be stored in MEM 10112. FU 10120 would receive SOPs from the instruction stream and, using one or more S-Interpreter Base Pointers (that is, architectural base pointers pointing to the SITT 11012 in MEM 10112), address the SITT 11012 stored in MEM 10112. MEM 10112 would respond by providing, from the SITT 11012 in MEM 10112, sequences of microinstructions to be used directly in controlling CS 10110. Alternately, the SITT 11012 in MEM 10112 could provide conventional instructions usable by a conventional CPU, for example, Fortran or machine language instructions. This, for example, would allow FU 10120 to be replaced by a conventional CPU, such as a Data General Corporation Eclipse ®.

Having briefly summarized certain features of CS 10110, and alternate embodiments of certain of these features, the structure and operation of CS 10110 will be described in detail below.

2. DETAILED DESCRIPTION OF CS 10110 MAJOR SUBSYSTEMS (FIGS. 201-206, 207-274)

Figure 204:
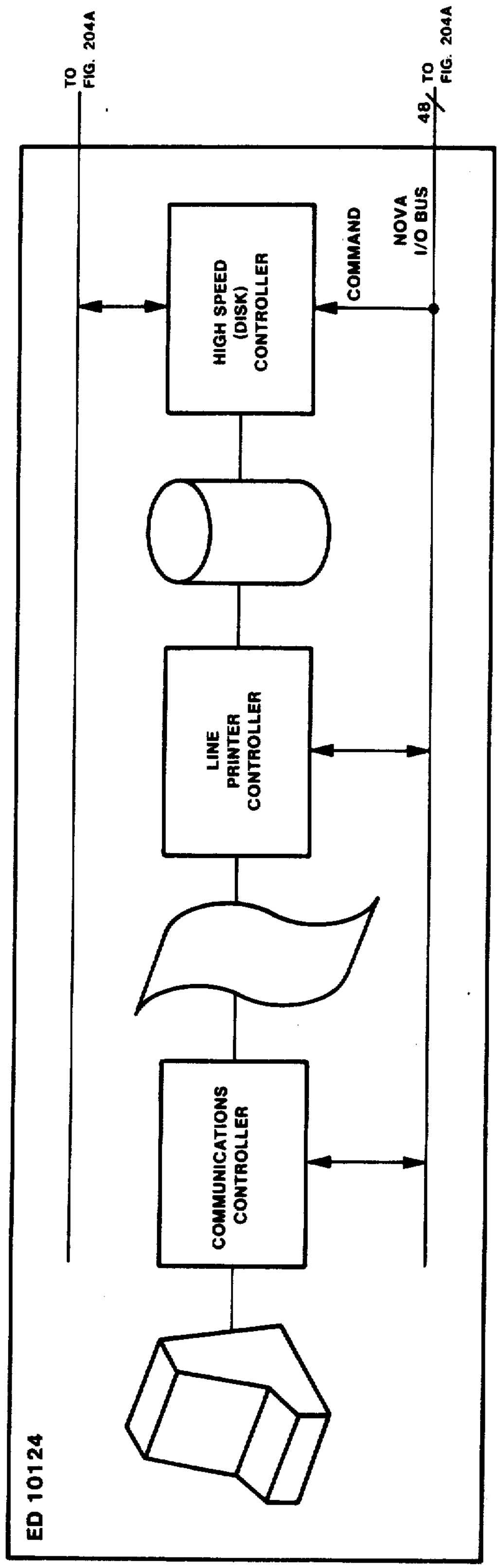
FIG. 204 is a detailed block diagram of an I/O system.
Figure 205:
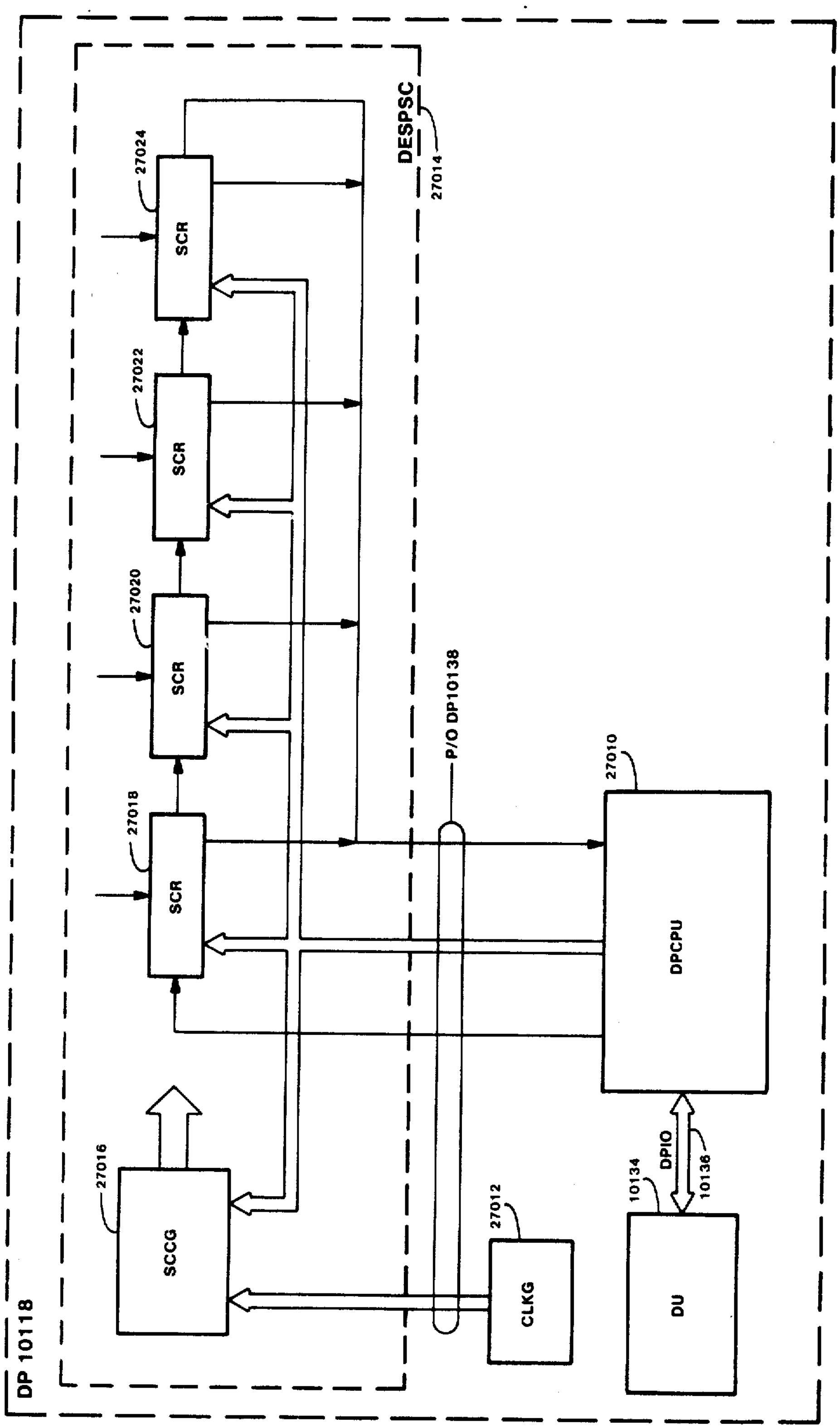
FIG. 205 is a partial block diagram of a diagnostic processor system.
Figure 206:
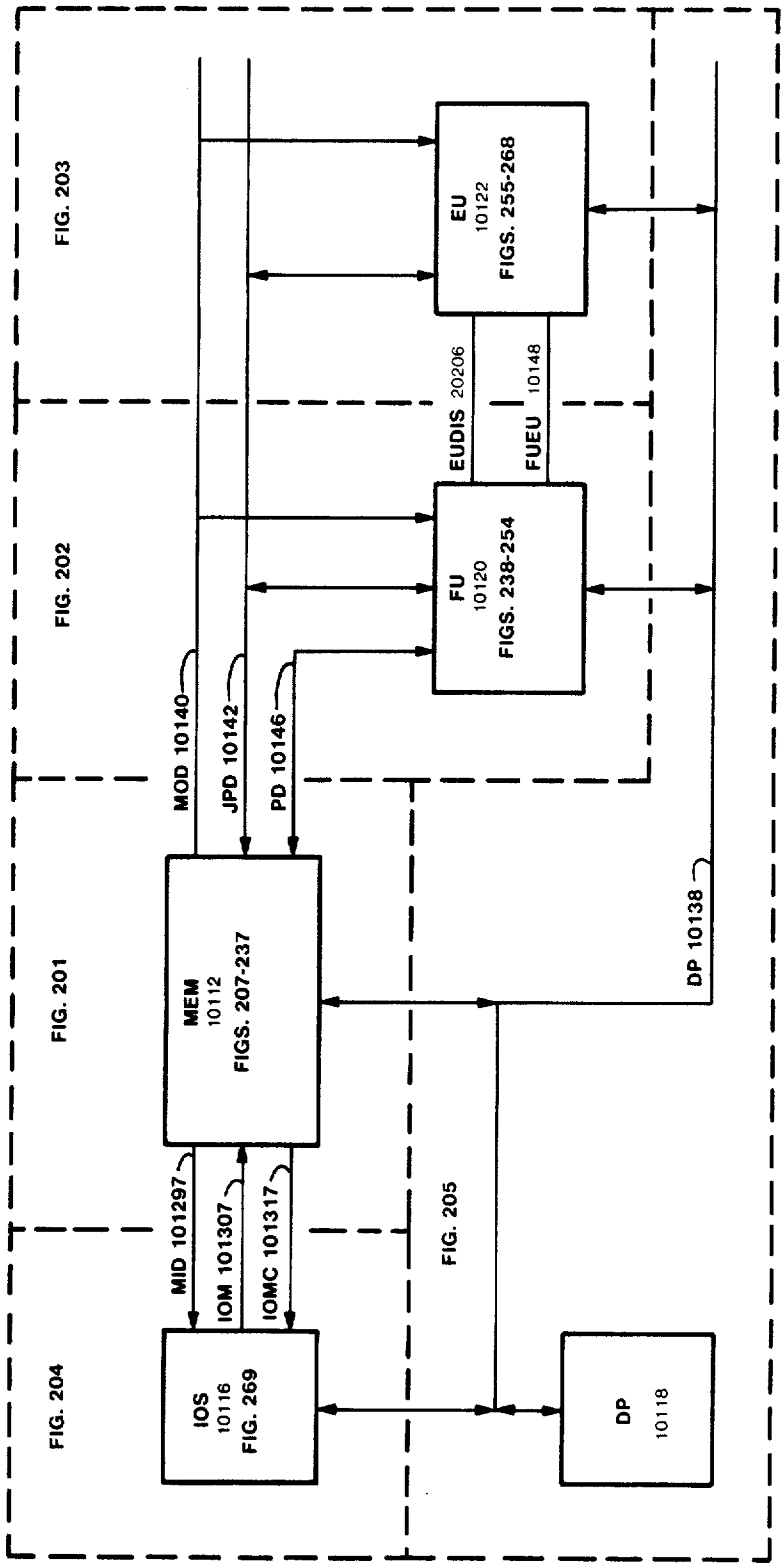
FIG. 206 is a diagram illustrating assembly of FIGS. 201-205 to form a detailed block diagram of the present computer system.

Having previously described the overall structure and operation of CS 10110, the structure and operation of CS 10110's major subsystems will next be individually described in further detail. As previously discussed, CS 10110's major subsystems are, in the order in which they will be described, MEM 10112, FU 10120, EU 10122, IOS 10116, and DP 10118. Individual block diagrams of MEM 10112, FU 10120, EU 10122, IOS 10116, and DP 10118 are shown in, respectively, FIGS. 201 through 205. FIGS. 201 through 205 may be assembled as shown in FIG. 206 to construct a more detailed block diagram of CS 10110 corresponding to that shown in FIG. 101. For the purposes of the following descriptions, it is assumed that FIGS. 201 through 205 have been assembled as shown in FIG. 206 to construct such a block diagram. Further diagrams will be presented in following descriptions as required to convey structure and operation of CS 10110 to one of ordinary skill in the art.

As previously described, MEM 10112 is an intelligent, priortizing memory having separate and independent ports MIO 10128 and MJP 10140 to, respectively, IOS 10116 and JP 10114. MEM 10112 is shared by and is accessible to both JP 10114 and IOS 10116 and is the primary memory of CS 10110. In addition, MEM 10112 is the primary path for information transferred between the external world (through IOS 10116) and JP 10114.

As will be described further below, MEM 10112 is a two-level memory providing fast access to data stored therein. MEM 10112 first level is comprised of a large set of random access arrays and MEM 10112 second level is comprised of a high speed cache whose operation is generally transparent to memory users, that is JP 10114 and IOS 10116. Information stored in MEM 10112, in either level, appears to be bit addressable to both JP 10114 and IOS 10116. In addition, MEM 10112 presents simple interfaces to both JP 10114 and IOS 10116. Due to a high degree of pipe lining (concurrent and overlapping memory operations) MEM 10112 interfaces to both JP 10114 and IOS 10116 appear as if each JP 10114 and IOS 10116 have full access to MEM 10112. This feature allows data transfer rates of up to, for example, 63.6 megabytes per second from MEM 10112 and 50 megabytes per second to MEM 10112.

In the following descriptions, certain terminology used on those descriptions will be introduced first, followed by description of MEM 10112 physical organization. Then MEM 10112 port structures will be described, followed by descriptions of MEM 10112's control organization and control flow. Next, MEM 10112's interfaces to JP 10114 and IOS 10116 will be described. Following these overall descriptions the major logical structures of MEM 10112 will be individually described, starting at MEM 10112's interfaces to JP 10114 and IOS 10116 and proceeding inwardly to MEM 10112's first (or bulk) level of data stored. Finally, certain features of MEM 10112 microcode control structure will be described.

A. MEM 10112 (FIGS. 201, 206, 207-237)

a. Terminology

Certain terms are used throughout the following descriptions and are defined here below for reference by the reader.

A word is 32 bits of data

A byte is 8 bits of data

A block is 128 bits of data (that is, 4 words).

A block is always aligned on a block boundary, that is the low order 7 bits of logical or physical address are zero (see Chapter 1, Sections A.f and D. Descriptions of CS 10110 Addressing).

The term aligned refers to the starting bit address of a data item relative to certain address boundaries. A starting bit address is block aligned when the low order 7 bits of starting bit address are equal to zero, that is the starting bit address falls on a boundary between adjacent blocks. A word align starting bit address means that the low order 5 bits of starting bit address are zero, the starting bit address points to a boundary between adjacent words. A byte aligned starting bit address means that the low order 3 bits of starting bit address are zero, the starting bit address points to a boundary between adjacent bytes.

Bit granular data has a starting bit address falling within a byte, but not on a byte boundary, or the address is aligned on a byte boundary but the length of the data is bit granular, that is not a multiple of 8 bits.

b. MEM 10112 Physical Structure (FIG. 201)

Figure 201:
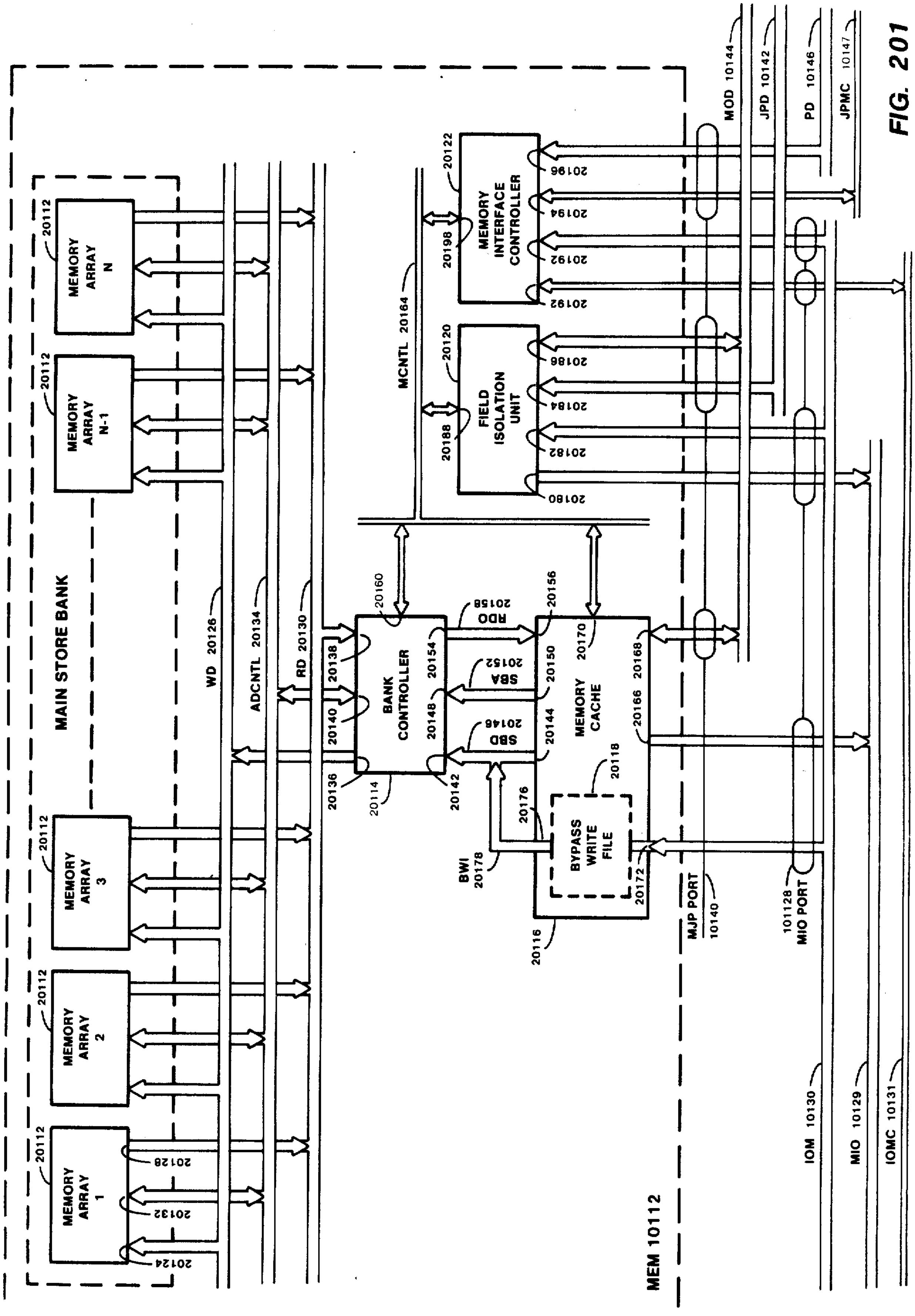
FIG. 201 is a detailed block diagram of a memory system.

Referring to FIG. 201, a partial block diagram of MEM 10112 is shown. Major functional units of MEM 10112 are Main Store Bank (MSB) 20110, including Memory Arrays (MA's) 20112, Bank Controller (BC) 20114, Memory Cache (MC) 20116, including Bypass Write File (BYF) 20118, Field Isolation Unit (FIU) 20120, and Memory Interface Controller (MIC) 20122

MSB 20110 comprises MEM 10112's first or bulk level of storage. MSB 20110 may include from one to, for example, 16 MA 20112's. Each MA 20112 may have a storage capacity, for example, 256 K-byte, 512 K-byte, 1 M-byte, or 2 M-bytes of storage capacity. As will be described further below, MA 20112's of different capacities may be used together in MSB 20110 Each MA 20112 has a data input connected in parallel to Write Data (WD) Bus 20124 and a data output connected in parallel to Read Data (RD) Bus 20126. MA's 20112 also have control and address ports connected in parallel to address and control (ADCTL) Bus 20128. In particular, Data Inputs 20124 of Memory Arrays 20112 are connected in parallel to Write Data (WD) Bus 20126, and Data Outputs 20128 of Memory Arrays 20112 are connected in parallel to Read Data (RD) Bus 20130. Control Address Ports 20132 of Memory Arrays 20112 are connected in parallel to Address and Control (ADCTL) Bus 20134.

Data Output 20136 of Bank Controller 20114 is connected to WD Bus 20126 and Data Input 20138 of BC 20114 is connected to RD Bus 20130 Control and Address Port 20140 of BC 20114 is connected to ADCTL Bus 20134. BC 20114's Data Input 20142 is connected to MC 20116's Data Output 20144 through Store Back Data (SBD) Bus 20146. BC 20114's Store Back Address Input 20148 is connected to MC 20116 Store Back Address Output 20150 through Store Back Address (SBA) Bus 20152. BC 20114's Read Data Output 20154 is connected to MC 20116's Read Data Input 20156 through Read Data Out (RDO) Bus 20158. BC 20114's Control Port 20160 is connected to Memory Control (MCNTL) Bus 20164.

MC 20116 has Output 20166 connected to MIO Bus 10131 through MIO Port 10128, and Port 20168 connected to MOD Bus 10144 through MJP Port 10140. Control Port 20170 of MC 20116 is connected to MCNTL Bus 20164. Input 20172 of BYF 20118 is connected to IOM Bus 10130 through MIO Port 10128, and Output 20176 is connected to SBD Bus 20146 through Bypass Write In (BWI) Bus 20178.

Finally, FIU 20120 has an Output 20180 and an Input 20182 connected to, respectively, MIO Bus 10129 and IOM Bus 10130 through MIO Port 10128. Input 20184 and Port 20186 are connected to, respectively, JPD Bus 10142 and MOD Bus 10144 through MJP Port 10140. Control Port 20188 is connected to MCNTL Bus 20164. Referring finally to MIC 20122, MIC 20122 has Control Port 20190 and Input 20192 connected to, respectively, IOMC Bus 10131 and IOM Bus 10130 through MIO Port 10128. Control Port 20194 and Input 20196 are connected, respectively, to JPMC Bus 10147 and Physical Descriptor (PD) Bus 10146 through MJP Port 10140. Control Port 20198 is connected to MCNTL Bus 20164.

c. MEM 10112 General Operation

Referring first to MEM 10112's interface to IOS 10116, this interface includes MIO Bus 10129, IOM Bus 10130, and IOMC Bus 10131. Read and Write Addresses and data to be written into MEM 10112 are transferred from IOS 10116 to MEM 10112 through IOM Bus 10130. Data read from MEM 10112 is transferred to IOS 10116 through MIO Bus 10129. IOMC 10131 is a Bi-directional Control bus between MEM 10112 and IOS 10116 and, as described further below, transfers control signals between MEM 10112 and IOS 10116 to control transfer of data between MEM 10112 and IOS 10116.

MEM 10112's interface to JP 10114 is MJP Port 10140 and includes JPD Bus 10142, MOD Bus 10144, PD Bus 10146, and JPMC Bus 10147. Physical descriptors, that is MEM 10112 physical read and write addresses, are transferred from JP 10114 to MEM 10112 through PD Bus 10146. S Ops, that is sequences of S Instructions and operand names, are transferred from MEM 10112 to JP 10114 through MOD Bus 10144 while data to be written into MEM 10112 from JP 10114 is transferred from JP 10114 to MEM 10112 through JPD Bus 10142. JPMC Bus 10147 is a By-directional Control bus for transferring command and control signals between MEM 10112 and JP 10114 for controlling transfer of data between MEM 10112 and JP 10114. As will be described further below, MJP Port 10140, and in particular MOD Bus 10144 and PD Bus 10146, is generally physically organized as a single port that operates as a dual port. In a first case, MJP Port 10140 operates as a Job Processor Instruction (JI) Port for transferring S Ops from MEM 10112 to JP 10114. In a second case, MOD 10144 and PD 10146 operate as a Job Processor Operand (JO) Port for transfer of operands, from MEM 10112 to JP 10114, while JPD Bus 10142 and PD Bus transfer operands from JP 10114 to MEM 10112.

Referring to MSB 20110, MSB 20110 contains MEM 10112's first, or bulk, level of storage capacity. MSB 20110 may contain from one to, for example, 16 MA's 20112. Each MA 20112 contains a dynamic, random access memory array and may have a storage capacity of, for example 256 Kilo-bytes, 512 Kilo-bytes, 1 Mega-bytes, or 2 Mega-bytes. MEM 10112 may therefore have a physical capacity of up to, for example, 16 Mega-bytes of bulk storage. As will be described further below MA 20112's of different capacity may be used together in MSB 20110, for example, four 2 Mega-byte MA 20112's and four 1 Mega-byte MA 20112's.

BC 20114 controls operation of MA's 20112 and is the path for transfer of data to and from MA's 20112. In addition, BC 20114 performs error detection and correction on data transferred into and out of MA's 20112, refreshes data stored in MA's 20112, and, during a refresh operations, performs error detection and correction of data stored in MA's 20112.

MC 20116 comprises MEM 10112's second, or cache, level of storage capacity and contains, for example 8 Kilo-bytes of high speed memory. MC 20116, including BYF 20118, is also the path for data transfer between MSB 20110 (through BC 20114) and JP 10114 and IOS 10116. In general, all read and write operations between JP 10114 and IOS 10116 are through MC 20116. IOS 10116 may, however, perform read and write operations of complete blocks by-passing MC 20116. Block write operations from IOS 10116 are accomplished through BYF 20118 while block read operations are performed through a data transfer path internal to MC 20116 and shown and described below. All read and write operations between MEM 10112 and JP 10114, however, must be performed through the cache internal to MC 20116, as will be shown and described further below.

As also shown and described below, FIU 20120 includes write data registers for receiving data to be written into MEM 10112 from JP 10114 and IOS 10116, and circuitry for manipulating data read from MSB 20110 so that MEM 10112 appears as a bit addressable memory. FIU 20120, in addition to providing bit addressability of MEM 10112, performs right and left alignment of data, zero fill of data, sign extension operations, and other data manipulation operations described further below. In performing these data manipulation operations on data read from MEM 10112 to JP 10114, MOD Bus 10144 is used as a data path internal to MEM 10112 for transferring of data from MC 20116 to FIU 20120, and from FIU 20120 to MC 20116. That is, data to be transferred to JP 10114 is read from MC 20116, transferred through MOD Bus 10144 to FIU 20120, manipulated by FIU 20120, and transferred from FIU 20120 to JP 10114 through MOD Bus 10144.

MIC 20122 contains circuitry controlling operation of MEM 10112 and, in particular, controls MEM 10112's interface with JP 10114 and IOS 10116. MIC 20122 receives MEM 10112 read and write request, that is read and write addresses through PD Bus 10146 and IOM Bus 10130 and control signals through JPMC Bus 10147 and IOMC Bus 10131, and provides control signals to BC 20114, MC 20116, and FIU 20120 through MCNTL Bus 20164.

Having described the overall structure and operation of MEM 10112, the structure and operation of MEM 10112's Port, MIO Port 10128, and MJP Port 10140, will be described next, followed by descriptions of MEM 10112's control structure and the control and flow of MEM 10112 read and write requests.

d. MEM 10112 Port Structure

MEM 10112 port structure is designed to provide a simple interface to JP 10114 and IOS 10116. While providing fast and flexible operation in servicing MEM 10112 read and write requests from JP 10114 and IOS 10116. In this regard, MEM 10112, as will be described further below, may handle up to 4 read and write requests concurrently and up to, for example, a 63.6 M-byte per second data rate. In addition MEM 10112 is capable of performing bit granular addressing, block read and write operations, and data manipulations, such as alignment and filling, to enable JP 10114 and IOS 10116 to operate most efficiently.

MEM 10112 effectively services requests from three ports. These ports are MIO Port 10128 to IOS 10116, hereafter referred to as IO Port, and JI and JO Ports, described above, to JP 10114. These three ports share the entire address base of MEM 10112, but IOS 10116, for example, may be limited from making full use of MEM 10112's address space. Each port has a different set of allowed operations. For example, JO Port can use bit granular addresses but can reference only 32 bits of data on each request. JI Port can make read requests only to word align 32 bit data items. IO Port may reference bit granular data, and, as described further below, may read or write up to 16 bytes on each read or write request. The characteristics of each of these ports will be discussed next below.

1. IO Port Characteristics

IOS 10116 may access MEM 10112 in either of two modes. The first mode is block transfers by-passing or through the cache in MC 20116, and the second is non-block transfer through the cache in MC 20116.

Block by-passes may occur for both read and write operations. A read or write operation is eligible for a block by-pass if the data is on block boundaries, is 16 bytes long, and the read or write request is not accompanied by a control signal indicating that an encache (load into MC 20116's cache) operation is to be performed. A by-pass operation takes place only if the block address, that is the physical address of the block in MEM 10112 does not address a currently encached block, that is the block is not present in MC 20116's cache. If the block is encached in MC 20116's cache, the read or write transfer is to MC 20116's cache.

Partial block references, that is non-full block transfers will go through MC 20116's cache. If a cache miss occurs, that is the reference data is not present in MC 20116's cache, MEM 10112's control structures transfer the data to or from MSB 20110 and update MC 20116's cache. It should be noted that partial blocks may be as short as one byte, or up to 15 bytes long. A starting byte address may be anywhere within a block, but the partial block's length may not cross a block boundary.

Bit length transfers, that is transfers of data items having a length of 1 to 16 bits and not a multiple of a byte, or where address is not on a byte boundary, go through MC 20116's cache. These operations may cross byte, word, or block boundaries but may not cross page boundaries. These specific operations requested by IO port determines whether a read or write request is a partial block or bit length transfer.

2. JO Port Characteristics

All read or write requests from JO Port must go through MC 20116's cache; by-pass operations may not be performed. The data transferred between MEM 10112 and JP 10114 is always 32 bits in length but, of the 32 bits passed, from zero to 32 bits may be valid data. JP 10114 determines the location of valid data within the 32 bits by referring to certain FIU specification bits provided as part of the read or write request. As will be described further below, FIU specification bits, and other control bits, are provided to MIC 20122 by JP 10114 through JPMC Bus 10147 when each read or write request is made.

While MEM 10112 does not perform block by-pass operations to JP 10114, MEM 10112 may perform a cache read-through operation. Such operations occur on a JP 10114 read request wherein the requested data is not present in MC 20116's cache. If the JP 10114 read request is for a full word, which is word aligned, MEM 10112's Load Manager, discussed below, transfers the requested data directly to JP 10114 while concurrently loading the requested data into MC 20116's cache. This operation is referred to as a "hand-off" operation. These operations may also be performed by IO Port for 16 bit half words aligned on the right hand half word of a 32 bit word, or if a full block is handed left and loaded into MC 20116's cache.

3. JI Port Characteristics

All JI Port requests are satisfied through MC 20116's cache; MEM 10112 does not perform by-pass operations to JI Port. JI Port requests are always read requests for full-word aligned words and are handed off, as described above, if a cache miss occurs. In most other respects, JI Port requests are similar to JO Port requests.

Having described the overall structure and operation of MEM 10112, including MEM 10112's input and output ports to JP 10114 and IOS 10116, MEM 10112's control structure will be described next below.

e. MEM 10112 Control Structure and Operation (FIG. 207)

Figure 207:
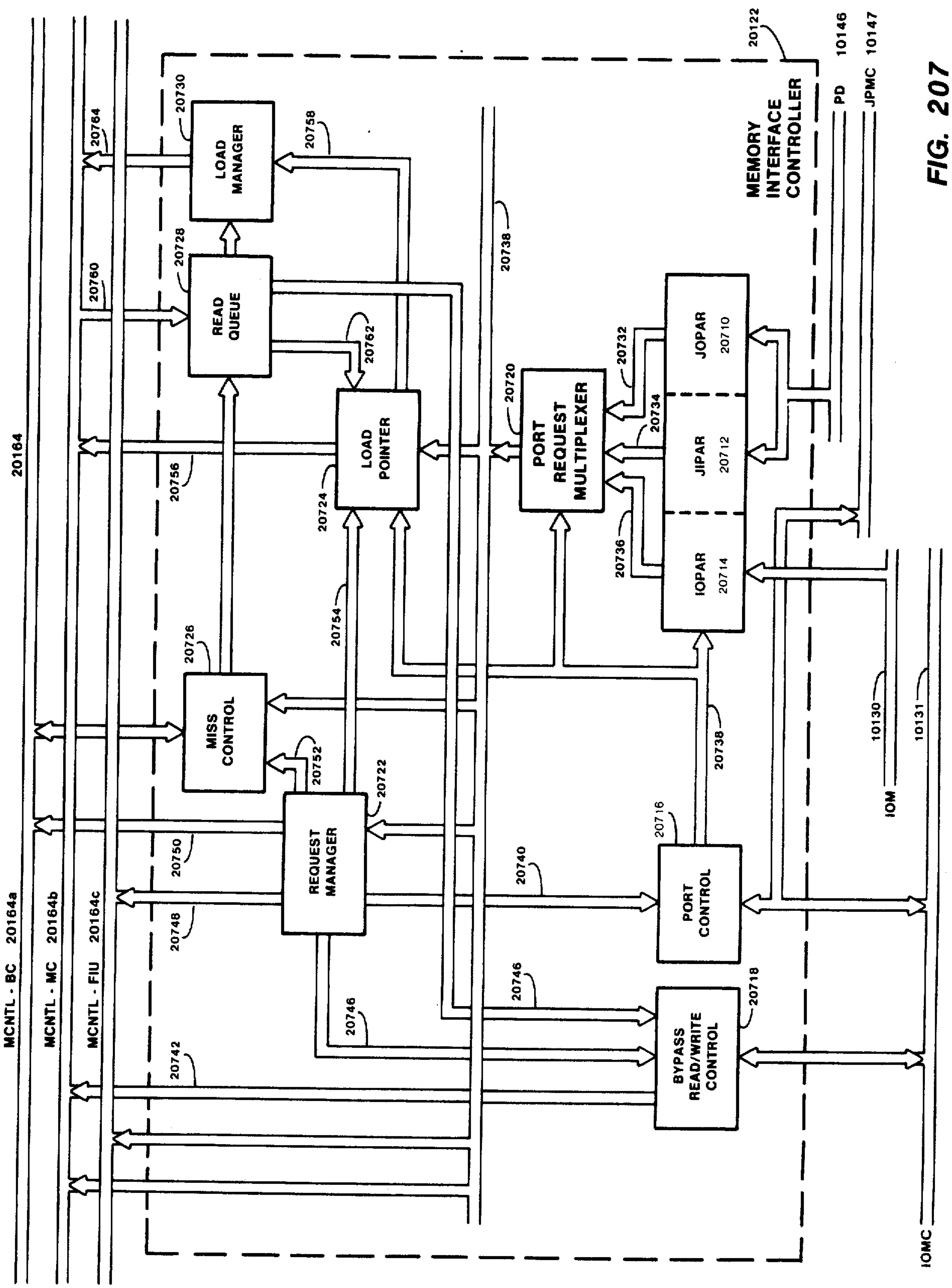
FIG. 207 is a detailed block diagram of a memory interface controller.

Referring to FIG. 207, a more detailed block diagram of MIC 20116 is shown. FIG. 207 will be referred to in conjunction with FIG. 201 in the following discussion of MEM 10112's control structure 1. MEM 10112 Control Structure Referring first to FIG. 207, MCNTL Bus 20164 is represented as including MCNTL-BC Bus 20164A, MCNTL-MC Bus 20164B, and MCNTL-FIU Bus 20164C. Buses 20164A, 20164B, and 20164C are branches of MCNTL Bus 20164 connected to, respectively, BC 20114, MC 20116, and FIU 20120. Also represented in FIG. 207 are PD Bus 10146 and JPMC Bus 10147 to JP 10114, and IOM Bus 10130 and IOMC Bus 10131 to IOS 10116.

JO Port Address Register (JOPAR) 20710 and JI Port Address Register (JIPAR) 20712 have inputs connected from PD Bus 10146. IO Port Address Register (IOPAR) 20714 has an input connected from IOM Bus 10130. Port Control Logic (PC) 20716 has bi-directional input/outputs connected from JPC 10147 and IOMC Bus 10131. By-pass Read/Write Control Logic (BR/WC) 20718 has a bi-directional input/output connected from IOMC Bus 10131.

Outputs of JOPAR 20710, JIPAR 20712, and IOPAR 20714 are connected to inputs of Port Request Multiplexer (PRMUX) 20720 through, respectively, Buses 20732, 20734, 20736. PRMUX 20720's output in turn is connected to Bus 20738. Branches of Bus 20738 are connected to inputs of Load Pointers (LP) 20724, Miss Control (MISSC) 20726, and Request Manager (RM) 20722, and to Buses MCNTL-MC 20164B and MCNTL-FIU 20164C.

Outputs of PC 20716 are connected to inputs of JOPAR 20710, JIPAR 20712, IOPAR 20714, PRMUX 20720, and LP 20724 through Bus 20738. Bus 20740 is connected between an input/output of PC 20716 and an input/output of RM 20722.

An output of BR/WC 20718 is connected to MCNTL-MC Bus 20164B through Bus 20742. Inputs of BR/WC 20718 are connected from outputs of RM 20722 and Read Queue (RQ) 20728 through, respectively, Buses 20744 and 20746.

RM 20722 has outputs connected to MCNTL-BC Bus 20164A, MCNTL-FIU Bus 20164C, and input of MISSC 20726, and an input of LP 20724 through, respectively, Buses 20748, 20750, 20752, and 20754. MISSC 20726's output is connected to MCNTL-BC Bus 20164A. Outputs of LP 20724 are connected to MCNTL-MC Bus 20164B and to an input of LM 20730 through, respectively, Buses 20756 and 20758. RQ 20728's input is connected from MCNTL-MC Bus 20164B through Bus 20760 and RQ 20728 has outputs connected to an input of LP 20724, through Bus 20762, and as previously described to an input of BR/WC 20718 through Bus 20746. Finally, LM 20730's output is connected to MCNTL-MC Bus 20164B through Bus 20764.

Having described the structure of MIC 20122 with reference to FIG. 207, and having previously described the structure of MEM 10112 with reference to FIG. 201, MEM 10112's control structure operation will next be described with reference to both FIGS. 201 and 207.

2. MEM 10112 Control Operation

Referring first to FIG. 207, JOPAR 20710, JIPAR 20712, and IOPAR 20714 are, as previously described, connected from PD Bus 10146 from JP 10114 and IOM Bus 10130 from IOS 10116. JPAR 20710, JIPAR 20712, and IOPAR 20714 receive read and write request addresses from JP 10114 and IOS 10116 and store these addresses for subsequent service by MEM 10112. As will be described further below, these address inputs from JP 10114 and IOS 10116 include FIU information specifying what data manipulation operations must be performed by FIU 20120 before requested data is transferred to the requestor or written into MEM 10112, information regarding the destination data read from MEM 10112 is to be provided to, information regarding the type of operation to be performed by MEM 10112, and information regarding operand length. Request address information received and stored in JOPAR 20710, JIPAR 20712, and IOPAR 20714 is retained therein until MEM 10112 has initiated service of the corresponding requests. MEM 10112 will accept further request address information into a given port register only after a previous request into that port has been serviced or aborted. Address information outputs from JOPAR 20710, JIPAR 20712, and IOPAR 20714 are transferred through PRMUX 20720 to Bus 20738 and from there to RM 20722, MC 20116, and FIU 20120 as service of individual requests is initiated. As will be described below, this address information will be transferred through PRMUX 20720 and Bus 20738 to LP 20724 for use in servicing a cache miss upon occurrence of a MC 20116 miss.

PC 20716 receives command and control signals pertinent to each requested memory operation from JP 10114 and IOS 10116 through JPMC Bus 10147 and IOMC Bus 10131. PC 20716 includes request arbitration logic and port state logic. Request arbitration logic determines the sequence in which IO, JI, JO ports are serviced, and when each port is to be serviced. In determining the sequence of port service, request arbitration logic uses present port state information for each port from the port state logic, information from JPMC Bus 10147 and IOMC Bus 10131 regarding each incoming request, and information from RM 20722 concerning the present state of operation of MEM 10112. Port state logic selects each particular port to be serviced and, by control signals through Bus 20738, enables transfer of each port's request address information from JOPAR 20710, JIPAR 20712, and IOPAR 20714 through PRMUX 20720 to Bus 20738 for use by the remainder of MEM 10112's control logic in servicing the selected port. In addition to request information received from JP 10114 and IOS 10116 through JPMC Bus 10147 and IOMC Bus 10131, port state logic utilizes information from RM 20722 and, upon occurrence of a cache miss, from LM 20730 (for clarity of presentation, this connection is not represented in FIG. 207). Port state logic also controls various port state flag signals, for example port availability signals, signals indicating valid requests, and signals indicating that various ports are waiting service.

RM 20722 controls execution of service for each request. RM 20722 is a microcode controlled "micromachine" executing programs called for by requested MEM 10112 operations. Inputs of RM 20722 include request address information from IOPAR 20714, JIPAR 20212, and JOPAR 20210, including information regarding the type of MEM 10112 operation to be performed in servicing a particular request, interrupt signals from other MEM 10112 control elements, and, for example, start signals from PC 20716's request arbitration logic. RM 20722 provides control signals to FIU 20120, MC 20116, and most other parts of MEM 10112's control structure.

Referring to FIG. 201, MC 20116's cache is, for example, an 8 Kilo-byte, four set associative cache used to provide rapid access to a subset of data stored in MSB 20110. The subset of MSB 20110 data stored in MC 20116's cache at any time is the data most recently used by JP 10114 or IOS 10116. MC 20116's cache, described further below, includes tag store comparison logic for determining encached addresses, a data store containing corresponding encached data, and registers and logic necessary to up-date cache contents upon occurrence of a cache miss. Registers and logic for servicing cache misses includes logic for determining the least recently used cache entry and registers for capture and storage of information regarding missed cache references, for example modify bits and replacement page numbers. Inputs to MC 20116 are provided from RM 20722, LM 20730 (discussed further below), FIU 20120, MSB 20110 (through BC 20114), LP 20724 (described further below) and address information from PRMUX 20720. Outputs of MC 20116 include data and go to FIU 20120 (through MOD Bus 10144), the data requestors (JP 10114 and IOS 10116), and a MC 20116 Write Back File (described further below).

As previously described, FIU 20120 includes logic necessary to make MEM 10112 appear bit addressable. In addition, FIU 20120 includes logic for performing certain data manipulation operations as required by the requestors (JP 10114 or IOS 10116). Data is transferred into FIU 20120 from MC 20116 through that portion of MOD Bus 10144 internal to MEM 10112, is manipulated as required, and is then transferred to the requestor through MOD Bus 10144 or MIO Bus 10129. In the case of writes requiring read-modify-write of encached data, the data is transferred back to MC 20116 through MOD Bus 10144 after manipulation. In general, data manipulation operations include locating requested data onto selected MOD Bus 10144 or MIO Bus 10129 lines and filling unused bus lines as specified by the requestor. Data inputs to FIU 20120 may be provided from MC 20116 or JP 10114 through MOD Bus 10144 or from IOS 10116 through IOM Bus 10130. Data outputs from FIU 20120 may be provided to MC 20116, JP 10114, or IOS 10116 through these same buses. Control information is provided to FIU 20120 from RM 20722 through Bus 20748 and MCNTL-FIU Bus 20164C. Address information may be provided to FIU 20120 from JOPAR 20710, JIPAR 20712, or IOPAR 20714 through PRMUX 20720, Bus 20738, and MCNTL-FIU Bus 20164C.

Returning to FIG. 207, MISSC 20726 is used in handling MC 20116 misses. In the event of a request referring to data not in MC 20116's cache, MISSC 20726 stores a block address of the reference and type of operation to be performed, this information being provided from an address register in MC 20116 and from RM 20722. MISSC 20726 utilizes this information in generating a command to BC 20114, through MCNTL-BC Bus 20164A, for a data read from MSB 20110 to obtain the referenced data. BC 20114 places this command in a queue, or register, and subsequently executes the commanded read operation. MISSC 20726 also generates an entry into RQ 20728 (described further below) indicating the type of operation to be performed when referenced data is subsequently read from MSB 20110.

RQ 20728 is, for example, a three-level deep queue storing information indicating operations associated with data being read from MSB 20110. Two kinds of operation may be indicated: block by-pass reads and cache loads. If a cache load is specified, that is a read and store to MC 20116's cache, is indicated, RM 20722 is interrupted and forced to place other MEM 10112 operations in idle until cache load is completed. A block by-pass read operation results in by-pass read control (described below) assuming control of the data from MSB 20110. Inputs to RQ 20728 are control signals from RM 20722, MISSC 20726, and BC 20114. RQ 20728 provides control outputs to LP 20724 (described below) LM 20730 (described below) RM 20722, and by-pass read control (described below).

LP 20724 is a set of registers for storing information necessary for servicing MC 20116 misses that result in order to load MC 20116's tag store. LM 20730 uses this information when data stored in MSB 20110 and read from MSB 20110 to service a MC 20116 cache miss, becomes available through BC 20114. Inputs to LP 20724 include the address of the missing reference, provided from JOPAR 20710, JIPAR 20712, or IOPAR 20714 through PRMUX 20720 and Bus 20738, commands from RM 20722, and a control signal from RQ 20728. LP 20724 outputs include addresses of missed references to MC 20116, through Bus 20756 and MNCTL-MC 20164B, and command signals to LM 20730 and BR/WC 20718.

LM 20730, referred to above, controls loading of MC 20116's cache with data from MSB 20110 after occurrence of a cache miss. RQ 20728, referred to above, indicates, for each data read from MSB 20110, whether the data read is the result of a MC 20116 cache miss. If the data is read from MSB 20110 as a result of a cache miss, LM 20730 proceeds to issue a sequence of control signals for loading the data from MSB 20110 and its associated address into MC 20116's cache. This data is transferred into MC 20116's cache data store while the block address, from LP 20724 is transferred into the tag store (described in the following discussion) of MC 20116's cache. If the transfer of data into MC 20116's cache replaces data previously resident in that cache, and that previous data is "dirty", that is has been written into so as to be different from an original copy of the data stored on MSB 20110, the modified data resident in MC 20116's cache must be written back into MSB 20110. This operation is performed through a Write Back File contained in MC 20116 and described below. In the event of such an operation, LM 20730 initiates a write back operation by MC 20116 and BC 20114, also as described below.

As will be described further in a following description, all MC 20116 cache load operations are full 4 word blocks. A request resulting in a MC 20116 cache miss may result in a "hand-off", that is a read operation of a full 4 word block. Handoff operations also may be of single 32 bit words wherein a 32 bit word aligned word is transferred from JP 10114 or a 16 bit operand aligned on the right half-word is transferred from IOS 10116. In such a handoff operation, LM 20730 will send a valid request signal to the requesting port and a handoff operation will be performed. Otherwise, a waiting signal will be sent to the requesting port and the request will re-enter the priority queue of PC 20716 for subsequent execution. To accomplish these operations, LM 20730 receives input from RQ 20728, (not shown in FIG. 207 for clarity of presentation) and LP 20724. LM 20730 provides outputs to port state logic of PC 20716, to MC 20116, MC 20116's Write Back File and MC 20116's Write Back Address Register and to BC 20114.

Referring to FIG. 201, as previously discussed IOS 10116 may request a full block write operation directly to MSB 20110. Such a by-pass write request may be honored if the block being transferred is not encached in MC 20116's cache. In such a case, RM 20722 will initiate the transfer setting up By-Pass Write Control logic in BR/WC 20718, and may then pass control of the operation over to BR/WC 20718's By-Pass Write Control logic for completion. By-Pass Write Control may then accept the remaining portion of the data block from IOS 10116, generating appropriate hand shaking signals through IOMC Bus 10131, in load the data block into BYF 20118 and MC 20116. MISSC 20726 will provide a by-pass write command to BC 20114, through MNCTL-PC Bus 20164A. BC 20114 will then transfer the data block from BYF 20118 and into MA's 20112 in MSB 20110.

As previously described, BYF 20118 receives data from IOM Bus 10130 and provides data output to BC 20114 through BWI Bus 20178 and SBD Bus 20146. BYF 20118 is capable of simultaneously accepting data from IOM Bus 10130 while reading data out to BC 20114. Control of writing data into BYF 20118 is provided from BR/WC 20718's By-Pass Write Control logic.

IOS 10116 may, as previously described, request a full block read operation by-passing MC 20116's cache. In such a case, BR/WC 20718's by-pass read control handles data transfer to IOS 10116 and generates required hand shaking signals to IOS 10116 through IOMC Bus 10131. The data path for by-pass read operations is through a data path internal to MC 20116, rather than through BYF 20118. This internal data path is RDO Bus 20158 to MIO Bus 10129.

As previously described, BC 20114 manages all data transfers to and from MA's 20112 in MSB 20110. BC 20114 receives requests for data transfers from RM 20722 in an internal queue register. All data transfers to and from MSB 20110 are full block transfers with block aligned addresses. On data write operations, BC 20114 receives data from BWF 20118 or from MC 20116's Write Back File and transfers the data into MA's 20112. During read operations, BC 20114 fetches the data block from MA's 20112 and places the data block on RDO Bus 20158 while signalling to MIC 20122 that the data is available. As described above, MIC 20122 tracks and controls transfer of data and BYF 20118, MC 20116, and MC 20116's Write Back File, and directs data read from MSB 20110 to the appropriate destination, MC 20116's Data Store, JP 10114, or IOS 10116.

In addition to the above operations, BC 20114 controls refresh of MA's 20112 and performs error detection and correction operations. In this regard, BC 20114 performs two error detection and correction operations. In the first, BC 20114 detects single and double bit errors in data read from MSB 20110 and corrects single bit errors. In the second, BC 20114 reads data stored in MA's 20112 during refresh operations and performs single bit error detection. Whenever an error is detected, during either read operations or refresh operations, BC 20114 makes a record of that error in an error log contained in BC 20114 (described further in a following description). Both JP 10114 and IOS 10116 may read BC 20114's error log, and information from BC 20114's error log may be recorded in a CS 10110 maintenance log and to assist in repair and trouble shooting of CS 10110. BC 20114's error log may be addressed directly by RM 20722 and data from BC 20114's error log is transferred to JP 10114 or IOS 10116 in the same manner as data stored in MSB 20110.

Referring finally to MA's 20112, each MA 20112 contains an array of dynamic semiconductor random access memories. Each MA 20112 may contain 256 Kilo-bytes, 512 Kilo-bytes, 1 Mega-bytes, or 2 Mega-bytes of data storage. The storage capacity of each MA 20112 is organized as segments of 256 Kilo-bytes each. In addressing a particular MA 20112, BC 20114 selects that particular MA 20112 as will be described further below. BC 20114 concurrently selects a segment within that MA 20112, and a block of four words within that segment. Each word may comprise 39 bits of information, 32 bits of data and 7 bits of error correcting code. The full 39 bits of each MA 20112 word are transferred between BC 20114 and MA's 20112 during each read and write operation. Having briefly described the general structure and operation of MEM 10112, certain types of operations which may be performed by MEM 10112 will be described next below.

f. MEM 10112 Operations

MEM 10112 may perform two general types of operation. The first type are data transfer operations and the second type are memory maintenance operations. Data transfer operations may include read, write, and read and set. Memory maintenance operations may include read error log, repair block, and flush cache. Except during a flush cache operation, the existence of MC 20116 and its operation is invisible to the requestors, that is JP 10114 and IOS 10116.

A MEM 10112 read operation transfers data from MS 10112 to a requestor, either JP 10114 or IOS 10116. A read data transfer is asynchronous in that the requestor cannot predict elapsed time between submission of a memory operation request and return of requested data. Operation of a requestor in MEM 10112 is coordinated by a requested data available signal transmitted from MEM 10112 to the requestor.

A MEM 10112 write operation transfers data from either JP 10114 or IOS 10116 to MEM 10112. During such operations, JP 10114 is not required to wait for a signal from MEM 10112 that data provided to MEM 10112 from JP 10114 has been accepted. JP 10114 may transfer data to MEM 10112's JO Port whenever a JO Port available signal from MEM 10112 is present; read data is accepted immediately without further action or waiting required of JP 10114. Word write operations from IOS 10116 are performed in a similar manner. On block write operations, however, IOS 10116 is required to wait for a data taken signal from MEM 10112 before sending the 2nd, 3rd and 4th words of a block.

MEM 10112 has a capability to perform "lock bit" operations. In such operations, a bit granular read of the data is performed and the entire operand is transmitted to the requestor. At the same time, the most significant bit of the operand, that is the Lock Bit, is set to one in the copy of data stored in MEM 10112. In the operand sent to the requestor, the lock bit remains at its previous value, the value before the current read and set operation. Test and set operations are performed by performing read and set operations wherein the data item length is specified to be one bit.

As previously described, MEM 10112 performs certain maintenance operations, including error detection. MEM 10112's Error Log in BC 20114 is a 32 bit register containing an address field and an error code field. On a first error to occur, the error type and in some cases, such as ERCC errors on read data stored in MSB 20110, the address of the data containing the error is stored in BC 20114's Error Log Register. An interrupt signal indicating detection of an error is raised at the same that information regarding the error is stored in the Error Log. If multiple errors occur before Error Log is read and reset, the information regarding the first error will be retained and will remain valid The Error Log code field will, however, indicate that more than one error has occurred.

JP 10114 may request a read Error Log operation referred to as a "Read Log and Reset" operation. In this operation, MEM 10112 reads the entire contents of Error Log to JP 10114, resets Error Log Register, and resets the interrupt signal indicating presence of an error. IOS 10116, as discussed further below, is limited to reading 16 bits at a time from MEM 10112. It therefore requires two read operations to read Error Log. First read operation to IOS 10116 reads an upper 16 bits of Error Log data and does not reset Error Log. The second read operation is performed in the same manner as a JP 10114 Read Log and Reset operation, except that only the low order 16 bits of Error Log are read to IOS 10116.

MEM 10112 performs repair block operations to correct parity or ERCC errors in data stored in MC 20116's Cache or in data stored in MA's 20112. In a repair block procedure, parity bits for data stored in MC 20116's Cache, or ERCC check bits of data stored in MA's 20112, are modified to agree with the data bits of data stored therein. In this regard, repaired uncorrectible errors, such as two bit errors of data in MA's 20112, will have good ERCC and parity values. Until a repair block operation is performed, any read request directed to bad data, that is data having parity or ERCC check bits indicating invalid data, will be flagged as invalid. Repair block operations therefore allow such data to be read as valid, for example to be used in a data correction operation. Errors are ignored and not logged in BC 20114's Error Log in repair block operations. A write operation into an area containing bad data may be accomplished if MEM 10112's internal operation does not require a read-modified-write procedure. Only byte aligned writes of integral byte length data residing in MC 20116 and word aligned writes of integral word lengths of data in MSP 20110 do not require read-modified-write operation. By utilizing such write operations, it is therefore possible to overwrite bad data by use of normal write operations before or instead of repair block operations.

MEM 10112 performs a cache flush operation in event of a power failure, that is when MEM 10112 goes into battery back-up operation. In such an event, only MA's 20112 and BC 20114 remain powered. Before JP 10114 and IOS 10116 lose power, JP 10114 and IOS 10116 must transfer to MEM 10112 any data, including operating state, to be saved. This is accomplished by using a series of normal write operations. After conclusion of these write operations, both JP 10114 and IOS 10116 transmit a flush cache request to MEM 10112. Upon receiving two flush cache requests, MEM 10112 flushes MC 20116's Cache so that all dirty data encached in MC 20116's Cache is transferred into MA's 20112 before power is lost. If only JP 10114 or IOS 10116 is operating, DP 10118 will detect this fact and will have transmitted an enabling signal (FLUSHOK) to MEM 10112 during system initialization. FLUSHOK enables MEM 10112 to perform cache flush upon receiving a single flush cache request. After a cache flush operation, no further MEM 10112 operations are possible until DP 10118 resets a power failure lock-out signal to enable MEM 10112 to resume normal operation.

Having described MEM 10112's overall structure and operation and certain operations which may be performed by MEM 10112, MEM 10112's interfaces to JP 10114 and IOS 10116 will be described next below.

g. MEM 1012 Interfaces to JP 10114 and IOS 10116 (FIGS. 209, 210, 211, 204)

Figure 211:
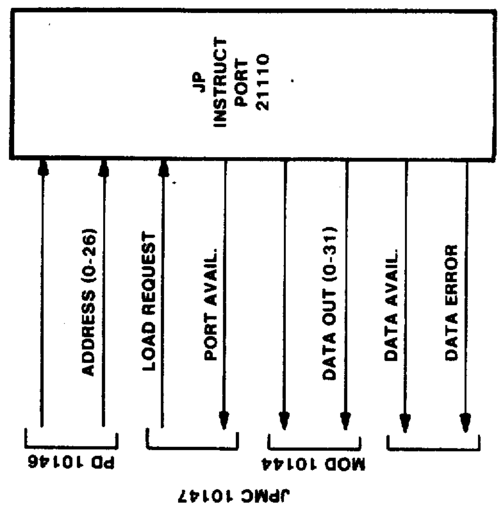
FIG. 211 is a diagram of a memory instruction port interface.
Figure 210:
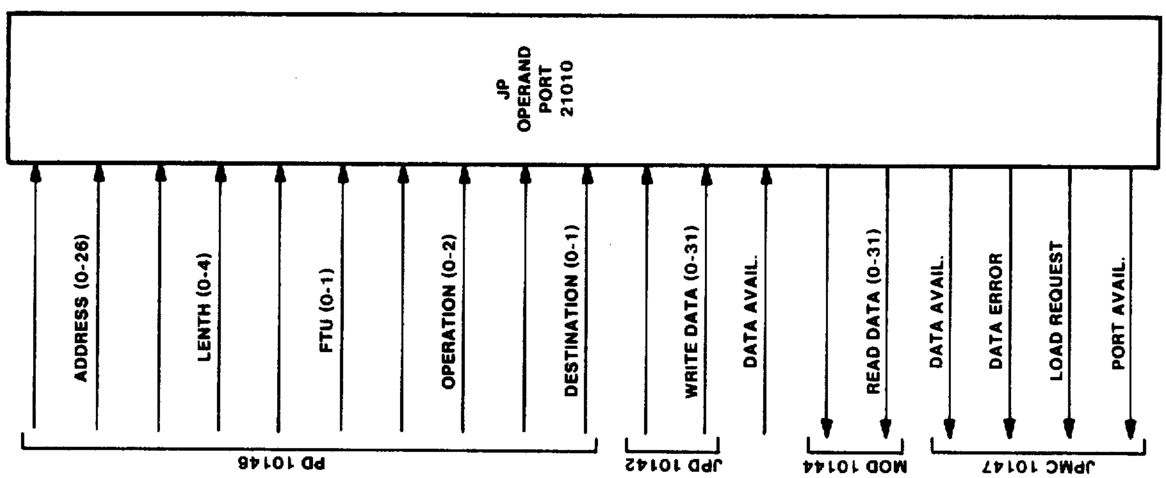
FIG. 210 is a diagram of a memory operand port interface.
Figure 209:
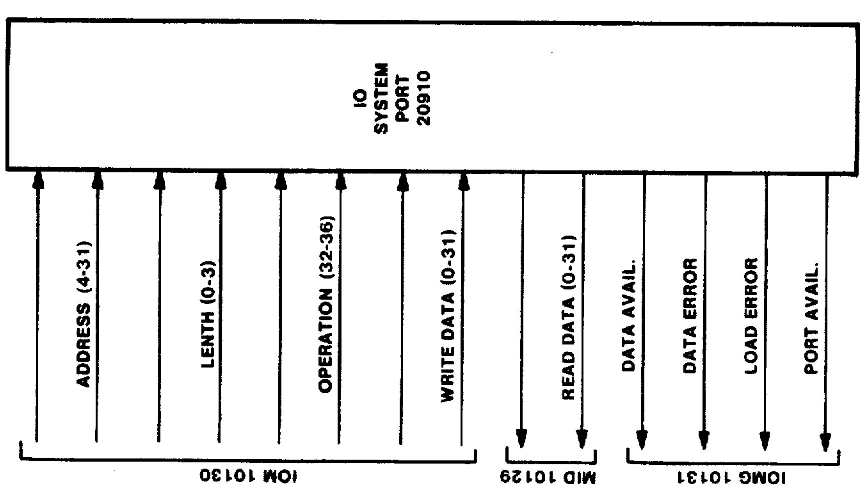
FIG. 209 is a diagram of a memory to I/O system port interface.

As previously described, MJP Port 10140 and MIO Port 10128 logically function as three independent ports. These ports are an IO Port to IOS 10116, a JP Operand Port to JP 10114 and a JP Instruction Port to JP 10114. Referring to FIGS. 209, 210, and 211, diagramic representations of IO Port 20910, JP Operand (JPO) Port 21010, and JP Instruction (JPI) Port 21110 are shown respectively.

IO Port 20910 handles all IOS 10116 requests to MEM 10112, including transfer of both instructions and operands. JPO Port 21010 is used for read and write operations of operands, for example numeric values, to and from JP 10114. JPI Port 21110 is used to read SINs, that is SOPs and operand NAMEs, from MEM 10112 to JP 10114. Memory service requests to a particular port are serviced in the order that the requests are provided to the Port. Serial order is not maintained between requests to different ports, but ports may be serviced in the order of their priority. In one embodiment of the present invention, IO Port 20910 is accorded highest priority, followed by JPO Port 21010, and lastly by JPI Port 21110, with requests currently contained in a port having priority over incoming requests. As described above and will be described in more detail in following descriptions, MEM 10112 operations are pipelined. This pipelining allows interleaving of requests from IO Port 20910, JPO Port 21010, and JPI Port 21110, as well as overlapping service of requests at a particular port. By overlapping operations it is meant that one operation servicing a particular port begins before a previous operation servicing that port has been completed.

1. IO Port 20910 Operating Characteristics (FIGS. 209, 204)

Referring first to FIG. 209, a diagramic representation of IO Port 20910 is shown. Signals are transmitted between IO Port 20910 and IOS 10116 through MIO Bus 10129, IOM Bus 10130, and IOMC Bus 10131. MIO Bus 10129 is a unidirectional bus having inputs from MC 20116 and FIU 20120 and dedicated to transfers of data and instructions from MEM 10112 to IOS 10116. IOM Bus 10130 is likewise a unidirectional bus and is dedicated to the transfer, from IOS 10116 to MEM 10112, of read addresses, write addresses, and data to be written into MEM 10112. IOM Bus 10130 provides inputs to BYF 20118, FIU 20120, and MIC 20122. IOMC Bus 10131 is a set of dedicated signal lines for the exchange of control signals between IOS 10116 and MEM 10112.

Referring first to MIO Bus 10129, MIO Bus 10129 is a 36 bit bus receiving read data inputs from MC 20116's Cache and from FIU 20120. A single read operation from MEM 10112 to IOS 10116 transfers one 32 bit word (or 4 bytes) of data (MIO(0-31)) and four bits of odd parity (MIOP(0-3)), or one parity bit per byte.

Referring next to IOM Bus 10130, a single transfer from IOS 10116 to MEM 10112 includes 36 bits of information which may comprise either a memory request comprising a physical address, a true length, and command bits. These memory requests and data are multiplexed onto IOM 10130 by IOS 10116.

Data transfers from IOS 10116 to MEM 10112 each comprise a single 32 bit data word (IOM(0-31)) and four bits of odd parity (IOMP(0-3)) or one parity bit per byte. Such data transfers are received by either BYF 20118 or FIU 20120.

Each IOS 10116 memory request to MEM 10112, as described above, includes an address field, a length field, and an operation code field. Address and length fields occupy the 32 IOM Bus 10130 lines used for transfer of data to MEM 10112 in IOS 10116 write operations. Length field includes four bits of information occupying bits (IOM(0-3)) of IOM Bus 10130 and address field contains 27 bits of information occupying bits (IOM(4-31)) of IOM Bus 10130. Together, address and length field specify a physical starting address and true length of the particular data item to be written into or read from MEM 10112. Operation code field specifies the type of operation to be performed by MEM 10112. Certain basic operation codes comprise 3 bits of information occupying bits (IOMP (32-36)) of IOM Bus 10130; as described above. These same lines are used for transfer of parity bits during data transfers. Certain operations which may be requested of MEM 10112 by IOS 10116 are, together with their corresponding command code fields, are;

000=read,
001=read and set,
010=write,
011=error,
100=read error log (first half),
101=read error log (second half) and reset,
110=repair block, and
111=flush cache.

Two further command bits may specify further operations to be performed by MEM 10112. A first command bit, indicates to MEM 10112 during write operations whether it is desirable to encache the data being written into MEM 10112 in MC 20116's Cache. IOS 10116 may set this bit to zero if reuse of the data is unlikely, thereby indicating to MEM 10112 that MEM 10112 should avoid enchaching the data. IOS 10116 may set this bit to one if the data is likely to be reused, thereby indicating to MEM 10112 that it is preferable to encache the data. A second command bit is referred to a CYCLE. CYCLE command bit indicates to MEM 10112 whether a particular data transfer is a single cycle operation, that is a bit granular word, or a four cycle operation, that is a block aligned block or a byte aligned partial block.

IOMC 10131 includes a set of dedicated lines for exchange of control signals between IOS 10116 and MEM 10112 to coordinate operation of IOS 10116 and MEM 10112. A first such signal is Load IO Request (LIOR) from IOS 10116 to MEM 10112. When IOS 10116 wishes to load a memory request into MEM 10112, IOS 10116 asserts LIOR to MEM 10112. IOS 10116 must assert LIOR during the same system cycle during which the memory request, that is address, length, and command code fields, are valid. If LIOR and IO Port Available (IOPA) signals, described below, are asserted during the same clock cyle, MEM 10112's port is loaded from IOS 10116 and IOPA is dropped, indicating the request has been accepted. If a load of a request is attempted and IOPA is not asserted, MEM 10112 remains unaware of the request,' LIOR remains active, and the request must then be repeated when IOPA is asserted.

IOPA is a signal from MEM 10112 to IOS 10116 which is asserted by MEM 10112 when MEM 10112 is available to accept a new request from IOS 10116. IOPA may be asserted while a previous request from IOS 10116 is completing operation if the address, length, and operation code fields of the previous request are no longer required by MEM 10112, for example in servicing bypass operations.

IO Data Taken (TIOMD) is a signal from MEM 10112 to IOS 10116 indicating that MEM 10112 has accepted data from IOS 10116. IOS 10116 places a first data word on IOM Bus 10130 on the next system clock cycle after a write request is loaded; that is, LIOR has been asserted, a memory request presented, and IOPA dropped. MEM 10112 then takes that data word on the clock edge beginning the next system clock cycle. At this point, MEM 10112 asserts TIOMD to indicate the data has been accepted. On a single word operations TIOMD is not used by IOS 10116 as a first data word is always accepted by MEM 10112 if IO Port 20910 was available. On block operations, a first data word is always taken but a delay may occur between acceptance of first and second words. IOS 10116 is required to hold the second word valid on IOM Bus 10130 until MEM 10112 responds with TIOMD to indicate that the block operation may proceed.

Data Available for IO (DAVIO) is a signal asserted by MEM 10112 to IOS 10116 indicating that data requested by IOS 10116 is available. DAVIO is asserted by MEM 10112 during the system clock cycle in which MEM 10112 places the requested data on MIO Bus 10129. In any single word type transfer, DAVIO is active for a single system clock transfer. In block type transfers, DAVIO is normally active for four consecutive system clock cycles. Upon event of a single cycle "bubble" resulting from detection and correction of an ERCC error by BC 20114, DAVIO will remain high for four non-consecutive system clock cycles and with a single cycle bubble, a non-assertion, in DAVIO corresponding to the detection and correction of the error.

IO Memory Interrupt (IMINT) is a signal asserted by MEM 10112 to IOS 10116 when BC 20114 places a record of a detected error in BC 20114's Error Log, as described above.

Previous MIO Transfer Invalid (PMIOI) signal is similarly a signal asserted by MEM 10112 to IOS 10116 regarding errors in data read from MEM 10112 to IOS 10116. If an uncorrectible error appears in such data, that is an error in two or more data bits, the incorrect data is read to IOS 10116 and PMIOI signal asserted by MEM 10112. Correctible, or single bit, errors in data do not result in assertion of PMIOI. MEM 10112 will assert PMIOI to IOS 10116 of the next system clock cycle following MEM 10112's assertion of DAVIO.

Having described MEM 10112's interface to IOS 10116, and certain operations which IOS 10116 may request of MEM 10112, certain MEM 10112 operations within the capability of the interface will be described next. First, operand transfers, for example of numeric data, between MEM 10112 and IOS 10116 may be bit granular with any length from one to sixteen bits. Operand transfers may cross boundaries within a page but may not cross physical page boundaries. As previously described, MIO Bus 10129 and IOM Bus 10130 are capable of transferring 32 bits of data at a time. The least significant 16 bits of these buses, that is bits 16 to 31, will contain right justified data during operand transfers. The contents of the most significant 16 bits of these buses is generally not defined as MEM 10112 generally does not perform fill oerations on read operations to IO Port 20910, nor does IOS 10116 fill unused bits during write operations. During a read or write operation, only those data bits indicated by length field in the corresponding memory request are of significance. In all cases, however, parity must be valid on all 32 bits of MIO Bus 10129 and IOM Bus 10130.

Figure 204A:
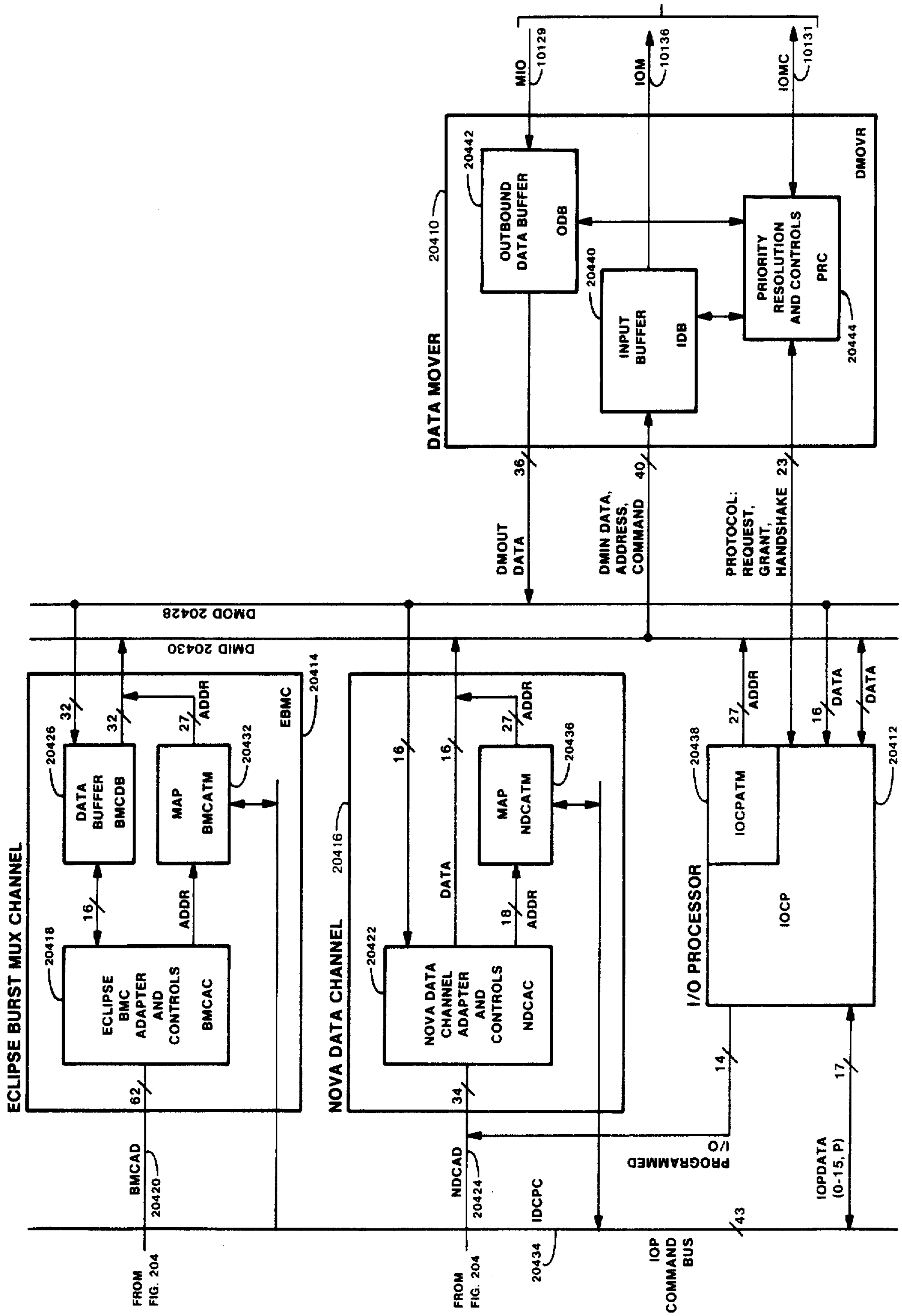

Referring to FIG. 204A, IOS 10116 includes Data Channels 20410 and 20412 each of which will be described further in a following detailed description of IOS 10116. Data Channels 20410 and 20412 each possess particular characteristics defining certain IO Port 20910 operations. Data Channel 20410 operates to read and write block aligned full and partial blocks. Full blocks have block aligned addresses and lengths of 16 bytes. Partial blocks have byte aligned addresses and lengths of 1 to 15 bytes; a partial block transfer must be within a block, that is not cross block boundaries. A full 4 word block will be transferred between IOS 10116 and MEM 10112 in either case, but only those blocks indicated by length of field in a corresponding MEM 10112 request are of actual significance in a write operation. Non-addressed bytes in such operations may contain any information so long as parity is valid for the entire data transfer. Data Channel 20412 preferably reads or writes 16 bits at a time on double byte boundaries. Such reads and writes are right justified on MIO Bus 10129 and IOM Bus 10130. The most significant 16 bits of these buses may contain any information during such operations so long as parity is valid for the entire 32 bits. Data Channel 20412 operations are similar to IOS 10116 operand read and write operations with double byte aligned addresses and lengths of 16 bits. Finally, instructions, for example controlling IOS 10116 operation, are read from MEM 10112 to IOS 10116 a block at a time. Such operations are identical to a full block data read.

Having described the operating characteristics of IO Port 20910, the operating characteristics of JPO Port 21010 will be described next.

2. JPO Port 21010 Operating Characteristics (FIG. 210)

Referring to FIG. 210, a diagramic representation of JPO Port 21010 is shown. As previously described, JPO Port 21010 is utilized for transfer of operands, for example numeric data, between MEM 10112 and JP 10114. JPO Port 21010 includes a request input (address, length, and operation information) to MIC 20122 from 36 bit PD Bus 10146, a write data input to FIU 20120 from 32 bit JPD Bus 10142, a 32 bit read data output from MC 20116 and FIU 20120 to 32 bit MOD Bus 10144, and bi-directional control inputs and outputs between MIC 20122 and JPMC Bus 10147.

Referring first to JPO Port 21010's read data output to MOD Bus 10144, MOD Bus 10144 is used by JPO Port 21010 to transfer data, for example operands, to JP 10114. MOD Bus 10144 is also utilized internal to MEM 10112 as a bi-directional bus to transfer data between MC 20116 and FIU 20120. In this manner, data may be transferred from MC 20116 to FIU 20120 where certain data format operations are performed on the data before the data is transferred to JP 10114 through MOD Bus 10144. Data may also be used to transfer data from FIU 20120 to MC 20116 after a data format operation is performed in a write operation. Data may also be transferred directly from MC 20116 to JP 10114 through MOD Bus 10144. Internal to MEM 10112, MOD Bus 10144 is a 36 bit bus for concurrent transfer of 32 bits of data, MOD Bus 10144 bits (MOD(0-31)), and 4 bits of odd parity, 1 bit per byte, MOD Bus 10144 bits (MODP(0-3)). External to MEM 10112, MOD Bus 10144 is a 32 bit bus, comprising bits (MOD(0-31)); parity bits are not read to JP 10114.

Data is written into MEM 10112 through JPD Bus 10142 to FIU 20120. As just described, data format operations may then be performed on this data before it is transferred from FIU 20120 to MC 20116 through MOD Bus 10144. In such operations, JPD Bus 10142 operates as a 32 bit bus carrying 32 bits of data, bits (JPD (0-31)), with no parity bits. JO Port 21010 generates parity for JPD Bus 10142 data to be written into MEM 10112 as this data is transferred into MEM 10112.

Memory requests are also transmitted to MEM 10112 from JP 10114 through JPD Bus 10142, which operates in this regard as a 40 bit bus. Each such request includes an address field, a length field, an FIU field specifying data formating operations to be performed, operation code field, and a destination code field specifying destination of data read from MEM 10112. Address field includes a 13 bit physical page number field, (JPPN(0-12)), and a 14 bit physical page offset field, (JPPO(0-13)). Length field includes 6 bits of length information, (JLNG(0-5)), and expresses true length of the data item to be written to or read from MEM 10112. As JPD Bus 10142 and MOD Bus 10144 are each capable of transferring 32 bits of data in a single MEM 10112 read or write cycle, 6 bits of length information are required to express true length. As will be described in a following description, JP 10114 may provide physical page offset and length information directly to MEM 10112, perform logical page number to physical page number translations, and may perform a Protection Mechanism 10230 check on the resulting physical page number. As such, MEM 10112 expects to receive (JPPN(0-12)) later than (JPPO(0-13)) and (JLNG(0-5)). (JPPO(0-13)) and (JLNG(0-5)) should, however, be valid during the system clock cycle in which a JP 10114 memory request is loaded into MEM 10112.

Operation code field provided to MEM 10112 from JP 10114 is a 3 bit code, (JMCMD(0-2)) specifying an operation to be formed by MEM 10112. Certain operations which JP 10114 may request of MEM 10112, and their corresponding operation codes, are:

000=read;
001=read and set;
010=write;
011=error;
100=error;
101=read error log and reset;
110=repair block; and,
111=flush cache.

Two bit FIU field, (JFIU(0-1)) specifies data manipulation operations to be performed in executing read and write operations. Among the data manipulation operations which may be requested by JP 10114, and their FIU fields, are:

00=right justified, zero fill;
01=right justified, sign extend;
10=left justify, zero fill; and,
11=left justify, blank fill.

For write operations, JPO Port 21010 may respond only to the most significant bit of FIU field, that is the FIU field bit specifying alignment.

Finally, destination field is a two bit field specifying a JP 10114 destination for data read from MEM 10112. This field is ignored for write operations to MEM 10112. A first bit of destination field, JPMDST, identifies the destination to be FU 10120, and the second field, EBMDST, specifies EU 10122 as the destination.

JPMC Bus 10147 includes dedicated lines for exchange of control signals between JPO Port 21010 and JP 10114. Among these control signals is Load JO Request (LJOR), which is asserted by JP 10114 when JP 10114 wishes to load a request into MEM 10112. LJOR is asserted concurrently with presentation of the memory request to MEM 10112 through PD Bus 10146. JO Port Available (JOPA) is asserted by MEM 10112 when JPO Port 21010 is available to accept a new memory request from JP 10114. If LJOR and JOPA are asserted concurrently, MEM 10112 accepts the memory request from JP 10114 and MEM 10112 drops JOPA to indicate that memory request has been accepted. As previously discussed, MEM 10112 may assert JOPA while a previous request is being executed and the PD Bus 10146 information, that is the memory request previously provided concerning the previous request, is no longer required.

If JP 10114 submits a memory request and JOPA is not asserted by MEM 10112, MEM 10112 does not accept the request and JP 10114 must resubmit that request when JOPA is asserted. Because, as described above, JPPN field of a memory request from JP 10114 may arrive late compared to the other fields of the request, MEM 10112 will delay loading of JPPN field for a particular request until the next system clock cycle after the request was initially submitted. MEM 10112 may also obtain this JPPN field at the same time it is being loaded into the port register by by-passing the port register.

JP 10114 may abort a memory request upon asserting Abort JP Request (ABJR). ABJR will be accepted by MEM 10112 during system clock cycle after accepting memory request from JP 10114 and ABJR will result in cancellation of the requested operation. A single ABJR line is provided for both JPO Port 21010 and JPI Port 1110 because, as described in a following description, MEM 10112 may accept only a single request from JP 10114, to either JPO Port 21010 or to JPI Port 21110, during a single system clock cycle.

Upon completion of an operand read operation requested through JPO Port 21010 MEM 10112 may assert either of two data available signals to JP 10114. These signals are data available for FA(DAVFA) and data available for EB(DAVEB). As previously described, a part of each read request from JP 10114 includes a destination field specifying the intended destination of the requested data. As will be described further below, MEM 10112 tracks such destination information for read requests and returns destination information with corresponding information in the form of DAVFA and DAVEB. DAVFA indicates a destination in FU 10120 while DAVEB indicates a destination in EU 10122. MEM 10112 may also assert signal zero filled (ZFILL) specifying whether read data for JPO Port 21010 is zero filled. ZFILL is valid only when DAVEB is asserted.

For a JPO Port 21010 write request, the associated write data word should be valid on the same system clock cycle as the request, or one system clock cycle later. JP 10114 asserts Load JP Write Data (LJWD) during the system clock cycle when JP 10114 places valid write data on JPD Bus 10142.

As previously discussed, when MEM 10112 detects an error in servicing a JP 10114 request MEM 10112 places a record of this error in MC 20116's Error Log. When an entry is placed in Error Log for either JPO Port 21010 or IO Port 20910, MEM 10112 asserts an interrupt flag signal indicating a valid Error Log entry is present. DP 10118 detects this flag signal and may direct the flag signal to either JP 10114 or IOS 10116, or both. IOS 10116 or JP 10114, as selected by DP 10118, may then read and reset Error Log and reset the flag. The interrupt flag signal is not necessarily directed to the requestor, JP 10114 or IOS 10116, whose request resulted in the error.

If an uncorrectible MEM 10112 error, that is an error in two or more bits of a single data word, is detected in a read operation the incorrect data is read to JP 10114 and an invalid data signal asserted. A signal, Previous MOD Transfer Invalid (PMODI), is asserted by MEM 10112 on the next system clock cycle following either DAVFA or DAVEB. PMODI is not asserted for single bit errors, instead the data is corrected and the corrected data read to JP 10114.

Having described JPO Port 21010's structure, and characteristics, JPI Port 21110 will be described next below.

3. JPI Port 21110 Operating Characteristics (FIG. 211)

Referring to FIG. 211, a diagramic representation of JPI Port 21110 is shown. JPI Port 21110 includes an address input from PD Bus 10146 to FIU 20120, a data output to MOD Bus 10144 from MC 20116, and bi-directional control inputs and outputs from MIC 20122 to JPMC Bus 10147. As previously described, a primary function of JPI Port 21110 is the transfer of SOPs and operand NAMEs from MEM 10112 to JP 10114 upon request from JP 10114. JPI Port thereby performs only read operations wherein each read operation is a transfer of a single 32 bit word having a word aligned address.

Referring to JPI Port 21110 input from PD Bus 10146, read requests to MEM 10112 by JP 10114 for SOPs and operand NAMEs each comprise a 21 bit word address. As described above, each JPI Port 21110 read operation is of a single 32 bit word. As such, the five least significant bits of address are ignored by MEM 10112. For the same reason, a JPI Port 21110 request to MEM 10112 does not include a length field, an operation code field, an FIU field, or a destination code field. Length, operation code, and FIU code fields are not required since JPI Port 21110 performs only a single type of operation and destination code field is not required because destination is inherent in a JPI Port 21110 request.

The 32 bit words read from MEM 10112 in response to JPI Port 21110 requests are transferred to JP 10114 through MC 20116's 32 bit output to MOD Bus 10144. As in the case of JPO 21010 read outputs to JP 10114, JPI Port 21110 does not provide parity information to JP 10114.

Control signals exchange between JP 10114 and JPI Port 21110 through JPMC Bus 10147 include Load JI Request (LJIR) and JI Port Available (JIPA), which operate in the same manner as discussed with reference to JPO Port 21010. As previously described, JPO Port 21010 and JPI Port 21110 share a single Abort JP Request (ABJR) command. Similarly, JPO Port 21010 and JPI Port 21110 share Previous MOD Transfer Invalid (PMODI) from MEM 10112. As described above, a JPI Port 21110 request does not include a destination field as destination is implied. MEM 10112 does, however, provide a Data Available Signal (DAVFI) to JP 10114 when a word read from MEM 10112 in response to a JPI Port 21110 request is present on MOD Bus 10144 and valid.

Having described the overall structure and operation of MEM 10112, and the structure and operation of MEM 10112's interfaces to JP 10114 and IOS 10116, the structure and operation of each major functional block of MEM 10112 will next be described in further detail. In general, these discussions will begin at MEM 10112's interfaces to JP 10114 and IOS 10116, and will progress inwards to MA's 20112. As such, MIC 20122 will be described first, followed by descriptions of MC 20116, FIU 20120, BC 20114, and MA's 20112, in that order.

h. MIC 20122 Structure and Operation (FIGS. 207, 212-225)

MIC 20122, as previously described with reference to FIG. 207, provides primary control for MEM 10112. Among the functions controlled by MIC 20122 are: selection and control of service of requests to IO Port 20910, JPO Port 21010, and JPI Port 21110; interrogation and service of MC 20116; control of data formating operations by FIU 20120; control of data paths through MEM 10112; and, initiation of BC 20114 operations in response to request to MEM 10112. MIC 20122 is microcode controlled with primary control residing in RM 20722. RM 20722 may initiate operations of subordinate MIC 20122 circuits for example BR/WC 20718, and subsequently execute operations in parallel with those operations initiated by RM 20722. This division of control responsibility, that is the capability of RM 20722 to initiate subordinate operations while executing parallel operations, allows MEM 10112 to, for example, overlap block transfers to and from IOS 10116 while executing read and write operations between MC 20116 and JP 10114.

During the following descriptions, the sequence of MIC 20122 operations executed for each MEM 10112 operation will be described together with the MIC 20122 structures involved in these operations. The following descriptions will begin at those portions of IO Port 20714, JPI Port 20712, and JPO Port 20710 resident in MIC 20122, and will progress through, for example, RM 20722, LM 20730, and MIC 20122's interface to BC 20114. FIG. 207 will be referred to during these descriptions, together with other figures showing portions of MIC 20122 in further detail, which will be introduced as required.

1. JOPAR 20710, JIPAR 20712, IOPAR 20714, and PRMUX 20720 (FIG. 212)

Figure 212:
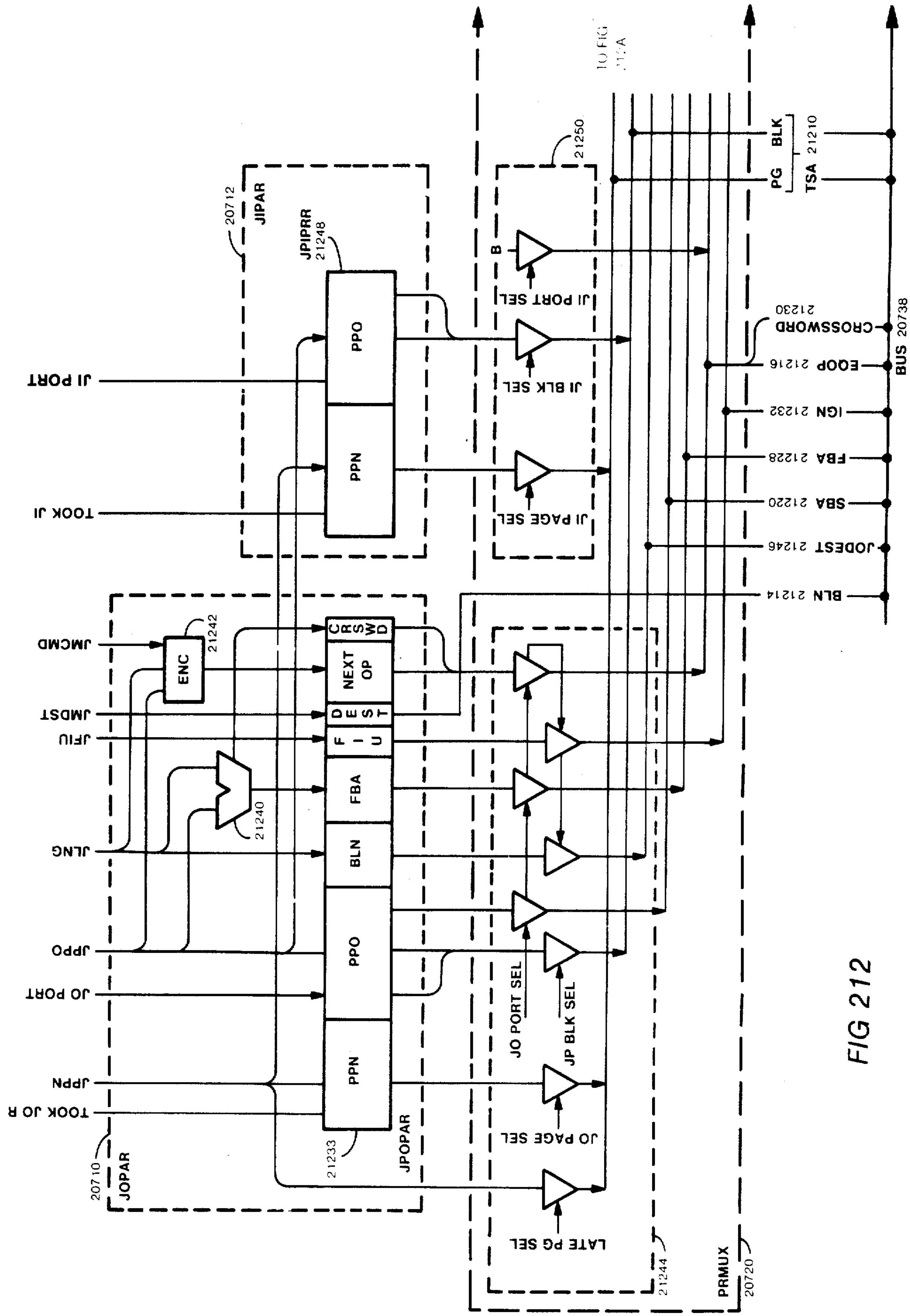
FIGS. 212 and 212A are a detailed block diagram of a memory system I/O, operand, and instruction ports and request multiplexer.
Figure 212A:
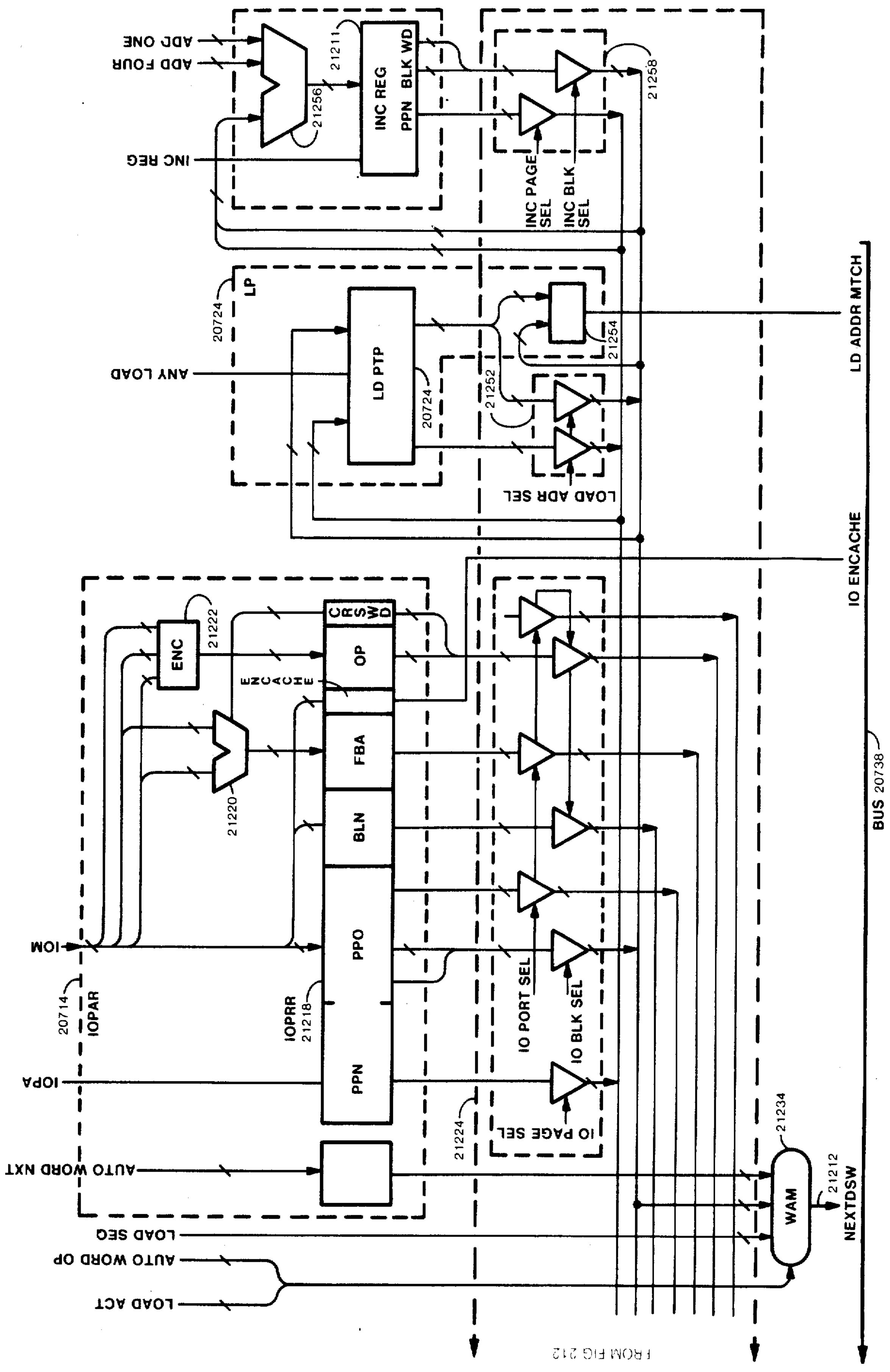

Referring to FIGS. 212 and 212A, those portions of IO Port 20910, JPO Port 21010, and JPI Port 21110 residing in MIC 20122, and PRMUX 20720, are shown together with other MIC 20122 logic circuitry which will be discussed further below.

As indicated in FIG. 212, JOPAR 20710, JIPAR 20712, and IOPAR 20714 are each composed of a set of registers (for example, SN74S194s) for receiving and storing address, length, operation code, FIU code, and destination code fields of memory requests. As described above, inputs of JOPAR 20710, JIPAR 20712, and IOPAR 20714 are connected from, respectively, PD Bus 10146 and IOM Bus 10130. The memory request fields received and stored by JOPAR 20710, JIPAR 20712, and IOPAR 20714, together with their corresponding inputs from JO, JI and IO Ports, are indicated in FIG. 212. Outputs of JOPAR 20710, JIPAR 20712, and IOPAR 20714 are connected to inputs of PRMUX 20720, which is comprised of corresponding sets of tri-state driver circuits (for example, SN74S244s).

The various outputs of PRMUX 20720 comprising Bus 20738 are indicated in FIG. 212. Among these buses are certain buses shared by IO Port 20910, JPO Port 21010, and JPI Port 21110. Tag Store Address (TSA) Bus 21210 is a 20 bit bus for, in part, distributing block address portions of address fields within MEM 10112. Next Data Store Word (NEXTDSW) Bus 21212, is a 2 bit bus for distributing word within block information of address fields within MEM 10112. Bit length information from length fields of memory requests are distributed through MEM 10112 by five bit Bit Length Number (BLN) Bus 21214. Finally, requested operation information from operation code fields of memory requests are distributed through 4 bit Request Operation (REQOP) Bus 21216. Other buses comprising Bus 20738 will be described below as required.

Referring first to IO Port 20910, including IOPAR 20714, IO Port Request Registers (IOPRR) 21218 receive 36 bits of request information from IOM Bus 10130. This information includes Physical Page Number (PPN), Physical Page Offset (PPO), Length Field (BLN), and an Encache Bit indicating whether data to be written into MEM 10112 is to be encached in MC 20116 and is loaded directly into IOPRR 21218. Adder 21240 receives BLN and the five least significant bits of PPO and adds these inputs to generate a five bit Final Bit Within-A-Word Address (FBA(0–4)), which is then loaded into IOPRR 21218.

As will be described in a following description, FBA(0–4) actually points one bit past actual final bit address and is subsequently corrected in later request processing. If calculation of FBA(0–4) results in a carry, and FBA(0–4) is not 0, then the memory request is a cross word reference, that is the data item extends across a word boundary. This occurence is indicated by setting to one an IO Cross Word (IOCW) flag which is stored in IOPRR 21218.

Encode Logic (ENC) 21242 is a Read Only Memory (ROM) and combinatorial logic receiving the three bit operation code field, five least significant bits of PPO of address, and four bits of BLN. ENC 21242 encodes this information to generate a four bit Next IO Operation (OP) code which is subsequently loaded into IOPRR 21218. Operation code field of an IOS 10116 request indicates only the general type of MEM 10112 operation to be executed in servicing a particular request. The actual operation performed by MEM 10112 will depend upon the specific operation command and the address boundaries of the data item referred to in the particular memory request. For example, a byte granular length with a starting address aligned on a word boundary may require MEM 10112 to execute a different operation than does a word granular length aligned on a word boundary.

IOPA input to IOPRR 21218 is, as previously discussed, a signal generated by MEM 10112 indicating that IO Port 20910 is available to accept a memory request from IOS 10116. IOPA is used in IOPRR 21218 as an enabling signal and, when asserted, allows a memory request from IOS 10116 to be transferred into IOPRR 21218.

Three enabling signals to Gates 21224 of PRMUX 20720 gate the contents of IOPRR onto Bus 20738, which, as indicated in FIG. 212, is comprised of certain sub-buses. These enabling signals are generated by other portions of MIC 20122 logic described in a following description. These enabling signals, the portions of IOPRR 21218's contents gated onto each of Bus 20738's sub-bus by each signal, and Bus 20738's sub-buses, are:

IO Port Select (IOPORTSEL)

(1) IOPORTSEL gates the low order five bits of PPO onto Starting Bit Address (SBA) Bus 21226, which transfers this information to FIU 20120. These low order five bits of PPO define a starting bit address within a word or, for block transfers, define a starting byte address within a block.

(2) IOPORTSEL gates BLN (Length) onto BLN Bus 21214. Because IOS 10116 reads or writes at most 16 bits, or 16 bytes on block transfers, at a time the most significant bit of length information on BLN Bus 21214 is forced to zero.

(3) IOPORTSEL gates FBA (Final Bit Address) onto FBA Bus 21228 of Bus 20738. FBA defines a final bit address within a word or a final byte within a block address when block transfers are performed.

(4) IOPORTSEL gates encoded requestor operation (NEXTOP) onto four bit Requestor Operation (REQOP) Bus 21216 of Bus 20738.

(5) IOPORTSEL gates IO Cross Word (IOCW) onto Cross Word (CROSSWORD) Line 21230 of Bus 20738. IOCW, together with any NEXTOP, are used within MIC 20122 to control the operation performed by MEM 10112 when the corresponding memory request is serviced.

(6) IOS 10116 expects all data to be right aligned, half words with no fill or extension, or block aligned, 32 bit block transfers. As such, when servicing an IOS 10116 request, IOPORTSEL forces zeros onto two bit Alignment (ALIGN) Bus 21232 of Bus 20738. ALIGN Bus 21232, as described further below, transmits alignment information to FIU 20120 where it is used in selecting data formating operations performed by FIU 20120 in servicing memory requests.

IO Block Selet (IOBLKSEL)

(1) IOBLKSEL gates two bits of word and block address information from PPO field of memory request onto NEXTDSW Bus 21212 through Word Address Multiplexer (WAM) 21234. WAM 21234 also receives a two bit word within block address information from JOPAR 20710, and a two bit Load Sequence (LOADSEQ) Word and Block Address generated by MIC 20122. As will be discussed further below, LOADSEQ is generated by MIC 20122 during MC 20116 block load operations, and is used to select blocks to be loaded into MC 20116's cache. The selection of which WAM 21234's inputs is transferred onto NEXTDSW Bus 21212 is determined by a two bit control input comprising signals Load Active (LOADACT) and Automatic Word Operation (AUTOWORDOP). AUTOWORDOP selects whether NEXTDSW Bus 21212 will receive two bits of word and block address information from one of requestor JOPAR 20710, JIPAR 20712, and IOPAR 20714, or from Request Manager (RM) 20722. LOADACT selects WAM 21234 input LOADSEQ during block loads of MC 20116. NEXTDSW Bus 21212 two bit word address information is, as described in a following description, used to determine a next word to be referenced in MC 20116's cache.

(2) IOBLKSEL gates seven bits of block on page address information onto bits 13 to 19 of TSA Bus 21210 from PPO field of IOPRR 21218.

IO Page Select (IOPAGESEL)

(1) IOPAGESEL gates 13 bits of PPN field from IOPRR 21218 onto bits 0 to 12 of TSA Bus 21210.

As previously described, IOS 10116 may suggest to MEM 10112 whether MEM 10112 should encache data access by block operations that might otherwise by-pass MC 20116's cache. Encache bit of IOS 10116 memory request is received and stored in IOPRR 21218 and passed directly from there to other portions of MIC 20122 through single bit IO Encache (IOENCACHE) Bus 21236. If IOENCACHE bit is set to 1, MEM 10112 may not perform a MC 20116 cache by-pass operation in servicing that particular memory request. If IOENCACHE bit is not set to one, MEM 10112, and in particular MIC 20122, decides whether a block access operation must go through MC 20116's cache, depending upon whether the referenced data is presently encached or not.

Referring to JOPAR 20710, JPO Port 21010 requests are received and stored in Job Processor Operand Port Request Register (JPOPRR) 21233. Contents of JPOPRR 21238 include a PPN field, a PPO field, a BLN field and a FIU field, a destination (DEST) field, an OP field, and a CROSSWORD field PPO field includes a 7 bit block-within-physical-page (PLA) field, a two bit word-within-block (WD) field, and a 5 bit bit-within-word (BIT) field. The PPN, PPO, BLN, FIU, and DEST fields into JPOPRR 21233 are received directly from JP 10114 as, respectively, JPPN(0-12), JPPO(90-13), JLNG(0-5), JFIU10-1), and JMDST or EBMDST, which have been previously discussed with reference to MEM 10112's interface to JP 10114. FBA and CROSSWORD fields of JPOPRR 21233 are generated by Adder 21240 from the five least significant bits of JPPO(0-13) and the 6 bits of JLNG(0-5) in a manner similar to that discussed with reference to IOPAR 20714. NEXTOP field is generated by Encoder (ENC) 21242 from the five least significant bits of JPPO(0-13), the 6 bits of JLN(0-5) and 3 bit JMCMD(0-2).

JPO Port 21010 request information, that is JPOPRR 21233's fields and PPN field (JPPN (0-12)) from PD Bus 10146, are gated onto Bus 20738 through Gates 21244 of PRMUX 20720. Enabling signals JO Port Select, JO Port Block Select, JO Page Select, and JO Late Page Select gate JOP Port 21010 request information onto certain Bus 20738 sub-buses. These enabling signals, the memory request fields gated by each, and the corresponding sub-buses of Bus 20738 are:

JO Port Select (JOPORTSEL)

(1) JOPORTSEL gates 5 bit Starting Bit Address (SBA) comprising BIT field of PPO field onto five bit Starting Bit Address (SBA) Bus 21226. As previously described, starting bit address information is provided by SBA Bus 20226 to FIU 20120 for use in executing data formating operations.

(2) JOPORTSEL gates length information, that is 5 bit BLN field, onto BLN Bus 21214. As previously described, BLN Bus 21214 provides length information to FIU 20120 for use in data formating operations.

(3) JOPORTSEL gates 5 bit FBA field onto FBA Bus 21228 for use in by FIU 20120 in executing data formating operations.

(4) JOPORTSEL gates 2 bit FIU field onto ALIGN Bus 21232 to FIU 20120 for use in data formating operations. It should be noted, as described further below, that ALIGN Bus 21232 does not go directly to FIU 20120, but to RM 20722 which generates corresponding control signals to FIU 20120.

(5) JOPORTSEL gates 4 bit NEXTJPOP field onto REQOP Bus 21216. As previously described, next operation information on REQOP Bus 21216 is used by MIC 20122 in determining what type of MEM 10112 operation is to be performed in servicing the associated memory request.

(6) JOPORTSEL gates CROSSWORD onto single bit CROSSWORD Bus 21230, where it is used by MIC 20122 to determine whether the requested memory operation involves crossing word boundaries.

JO Block Select (JOBLKSEL)

(1) JOBLKSEL gates BLK field of PPO field onto bits 13 to 19 of TSA Bus 21210. As previously described, TSA Bus 21210 transfers BLK field to MC 20116 for use in addressing MC 20116's cache.

(2) JOBLKSEL gates WD field of PPO field to an input of WAM 21234. As previously described, WAM 21234 may then switch WD field onto NEXTDSW Bus 21212 to MC 20116 for use in addressing MC 20116's cache.

JOPAGESEL (1) JOPAGESEL gates 13 bit PPN field onto bits 0-12 of TSA Bus 21210, which in turn provides PPN field to MC 20116 for use in addressing MC 20116's cache. TSA Bus 21210 also provides PPN field to Load Pointer (LP) 20724 and to Increment Register (INCREG) 21211.

JOLATEPAGESEL (1) LATEPAGESEL may gate PPN (JPPN(0-12)) directly from PD Bus 10146 to bits 0-12 of TSA Bus 21210. LATEPAGESEL may do so, for example, when MEM 10112 and, in particular, MIC 20122 begins execution of a request from JP 10114 on the clock cycle immediately following the request. PPN (JPPN(0-12)) will always arrive one clock cycle after the request, as described in a following description, and will be landed into JPOPAR 21233, or JPIPRR 21248. LATEPAGESEL allows PPN to by pass JPOPRR 21233 and JPIPRR 21248 to TSA Bus 21210 to be available for use during the same clock cycle in which it is received. It should be noted that PPN is loaded into JPOPRR 21233 by TOOKJO, rather than by JOPORTAV.

Finally, 2 bit DEST field, JMDST, and EBMDST, are provided directly to MIC 20122 through JP Operand Destination (JODEST) Bus 21246 as two bit signal JODEST. JODEST is used by MIC 20122 in generating control signals DAVEA and DAVEB to JP 10114 in indicating destination of data being read from MEM 10112 in response to the associated memory request.

Referring to JPI Port 21110, JPI Port 21110 may accept only one type of memory request, a 32 bit, word aligned read request. As will be described in a following description of JP 10114, destination of all JPI 21110 memory requests is an instruction buffer in JP 10114. JPI Port Request Register (JPIPRR) 21248 therefore contains only a 13 bit PPN field (JPPN(0-12)) and a 14 bit PPO field (JPPO(0-13)), both received from PD Bus 10146. In addition, PPO field in JPIPRR 21248 stores only 7 bit block within page field (BLK) and 2 bit word within block field (WD). JPIPRR 21248 is enabled to accept a memory request input from PD Bus 10146 by enable signal inputs JIPORTAV previously discussed, and Took JI Port (TJIP) in a manner as previously described with reference to JPO Port 21010.

Enable signals JI Page Select (JIPAGESEL), JI Block Select (JIBLKSEL), and JI Port Select (JIPORTSEL) gate JPIPRR 21248 contents, and a hard wire control signal described below, through Gates 21250 of PRMUX 20720. These enable signals, the JPIRR 21248 fields gated by these enabling signals, and the sub-buses of Bus 20738 to which these fields are gated, are:

JIPORTSEL (1) JIPORTSEL gates 4 bit hard wired signal B, binary code 1011, onto REQOP Bus 21216. As previously described, information on REQOP Bus 21216 is used within MIC 20122 to select the particular MEM 10112 operation to be executed in servicing a particular memory request. Binary code 1011 forces MIC 20122 to select a 32 bit, word aligned read to JP 10114.

JIBLKSEL (1) JIBLKSEL enables WD field of PPO field to an input of WAM 21234 where it may be subsequently gated onto NEXTDSW Bus 21212 as previously described.

(2) JIBLKSEL gates block on page field BLK of PPO field onto bits 13 to 19 of TSA Bus 21210, where in turn it is provided to MC 20116 for use in addressing MC 20116's cache.

JIPAGESEL (1) JIPAGESEL gates 13 bit PPN field onto bits 0-12 of TSA Bus 21210, where this information is provided in turn to MC 20116's for use in addressing MC 20116's cache.

Referring to LDPTR 20724, LDPTR 20724 data inputs are connected from outputs of PRMUX 20720 to receive 13 bits of PPN field and 7 bits of BLK field from IOPRR 21218, JPOPRR 21238, and JPIPRR 21248. LDPTR receives and stores PPN and BLK fields of the memory request in an outstanding cache load to be serviced. In particular, LDPTR stored PPN and BLK fields of the currently outstanding cache load operation being performed by MEM 10112 in servicing a memory request. Enable signal Any Load (ANYLOAD) enables LDPTR 20724 to receive PPN and BLK fields of any memory request currently being serviced Load Address Select (LOADADRSEL) enable signal to gates 21252 of PRMUX 20720 may transfer the stored PPN and BLK fields of LPTR 20724 onto, respectively, bits 0-12 and bits 13-19 of TSA Bus 21210 As previously described, PPN and BLK information on TSA Bus 21210 is transferred to MC 20116 for addressing of MC 20116's cache.

PPN and BLK fields of LDPTR 20724 are used by LM 20730, described below, to provide addressing information to MC 20116's data cache during cache load operations. LDPTR normally samples TSA Bus 21210's PPN and BLK fields during service of each memory request until a MC 20116 cache miss occurs. Upon occurrence of such a miss, LDPTR is locked, storing PPN and BLK fields of the memory request resulting in a MC 20116 cache miss. LM 20730 may subsequently use LDPTR 20724's PPN and BLK fields to load the data from MSB 20110 into MC 20116. Upon return of the necessary data from MSB 20110 to MC 20116, LM 20730 may use LDPTR 20724's PPN and BLK fields to update MC 20116's cache tag store and address MC 20116's cache and for loading the data into MC 20116's cache.

Associated with LDPTR 20724 is comparator 21254. Comparator 21254 compares BLK fields currently present on bits 14-19 of TSA Bus 21210 to LDPTR 20724's BLK field. Comparison of TSA Bus 21210 and LDPTR 20724 BLK fields detects the event of an attempted access to an MC 20116 cache slot currently awaiting updating by transfer of data from MSB 20110. Such a "collision" will result in the conflicting, or second, request to await execution until MC 20116's cache is updated by being loaded with data from MSB 20110. Service of the second, colliding, request is delayed to prevent a change in usage and dirty bit state of the MC 20116 cache block currently waiting updating and which was determined at the time of the original MC 20116 cache miss. A pending MC 20116 cache update does not affect access to other blocks in MC 20116's cache.

Referring to Increment Register (INCREG) 21211, INCREG 21211 is used by RM 20722 to generate MC 20116 addresses, that is a PPN, BLK, and WD field, for memory requests crossing word boundaries and for flushing of MC 20116's cache. Upon occurrence of a memory request crossing word boundaries, two least significant bits of PPN field the 7 bits of BLK field and 2 bits of WD field from IOPRR 21218, JPOPRR 21233, or JPIPRR 21248 are read from PSA Bus 21210 to a first input of Adder 21256. Two other inputs to Adder 21256 are single bit inputs ADDFOUR and ADDONE. In event of cross word memory request, MC 20122 asserts input ADDONE to Adder 21256. Adder 21256 then generates an output equal to the word address, that is PPN, BLK and WD fields, of the cross word memory address plus one. Word address output of Adder 21256 is thereby that of the second word of the cross word memory request. Adder 21256 output is then transferred into INCREG 21211 upon occurrence of enabling signal Increment Register Enable (INCREGE). In servicing the cross word memory request, RM 20722 will transfer PPN, BLK, and WD fields of IOPRR 21218, JPOPRR 21238, or JPIPRR 21248 to TSA Bus 21210 as first word address of the cross word memory request. Subsequently, RM 20722 will transfer BLK and WD field of INCREG 21211 to TSA Bus 21210 as second word address of the cross word memory request. Contents of INCREG 21211 are transferred onto TSA Bus 21210 through Gates 21258 of PRMUX 20720. Enabling signals Increment Block Select (INCBLKSEL) and. Increment Page Select (INCPAGESEL) to Gates 21258 are used, respectively, to transfer BLK and WD fields and PPN field to TSA Bus 21210. The original PPN is not incremented as a cross word operation and can not cross page boundaries.

As previously stated, RM 20722 may also use INCREG 21211 in flushing MC 20116's cache. In such flush operations, MC 20116's cache is scanned to determine which words stored therein are "dirty", that is have been written on to so as to contain different data than the original copies of these words stored in MSB 20110. For these purposes, PPN, BLK and WD fields of INCREG 21211, that is starting address of MC 20116 cache locations, and ADDFOUR input to 21256 is enabled. INCBLKSEL and INCPAGESEL are then asserted to transfer address onto TSA Bus 21210. Addresses transferred onto TSA Bus 21210 are fed back to Adder 21256's first input, and increased by four by Adder 21256's ADDFOUR input, and transferred into INCREGE 21211 by enable input INCREG. INCREG 21211 thereby generates successive word addresses incremented by four, and thereby generates successive block addresses for MC 20116 cache. Whenever, as will be described in the following description, MC 20116 detects a "dirty" block during a "FLUSH" operation, that block is written back into MSB 20110.

Having described the structure and operation of JOPAR 20710, JIPAR 20712, IOPAR 20714, PRMUX 20720, LDPTR 20724, and INCREG 21211, Port Control (PC) 20716 will be described next below.

2. Port Control 20716 (FIG. 213)

Figure 213:
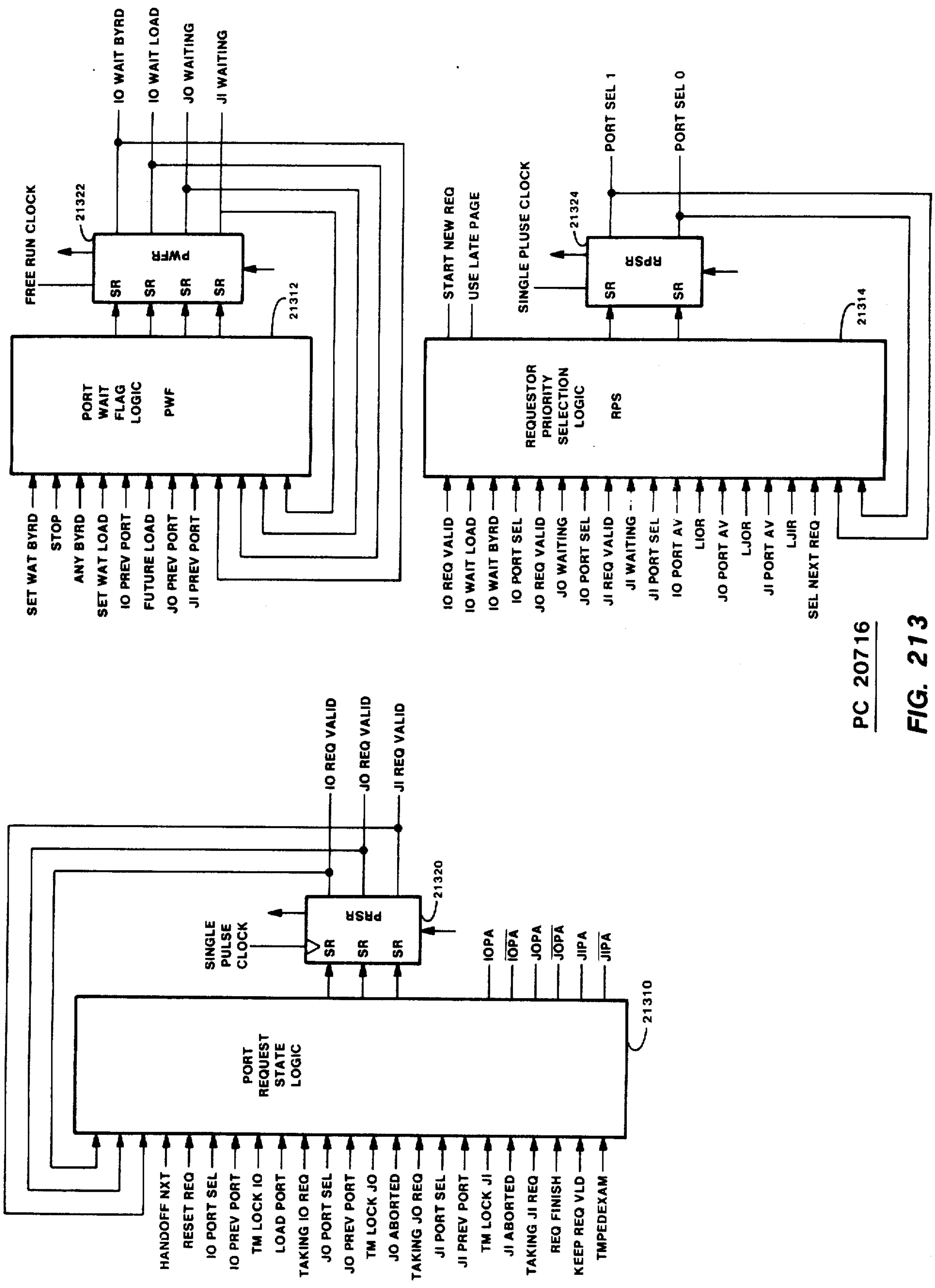
FIGS. 213 and 213A are a block diagram of memory port request logic, port wait flag logic, requestor priority selection logic, address path selection logic, and abort logic.
Figure 213A:
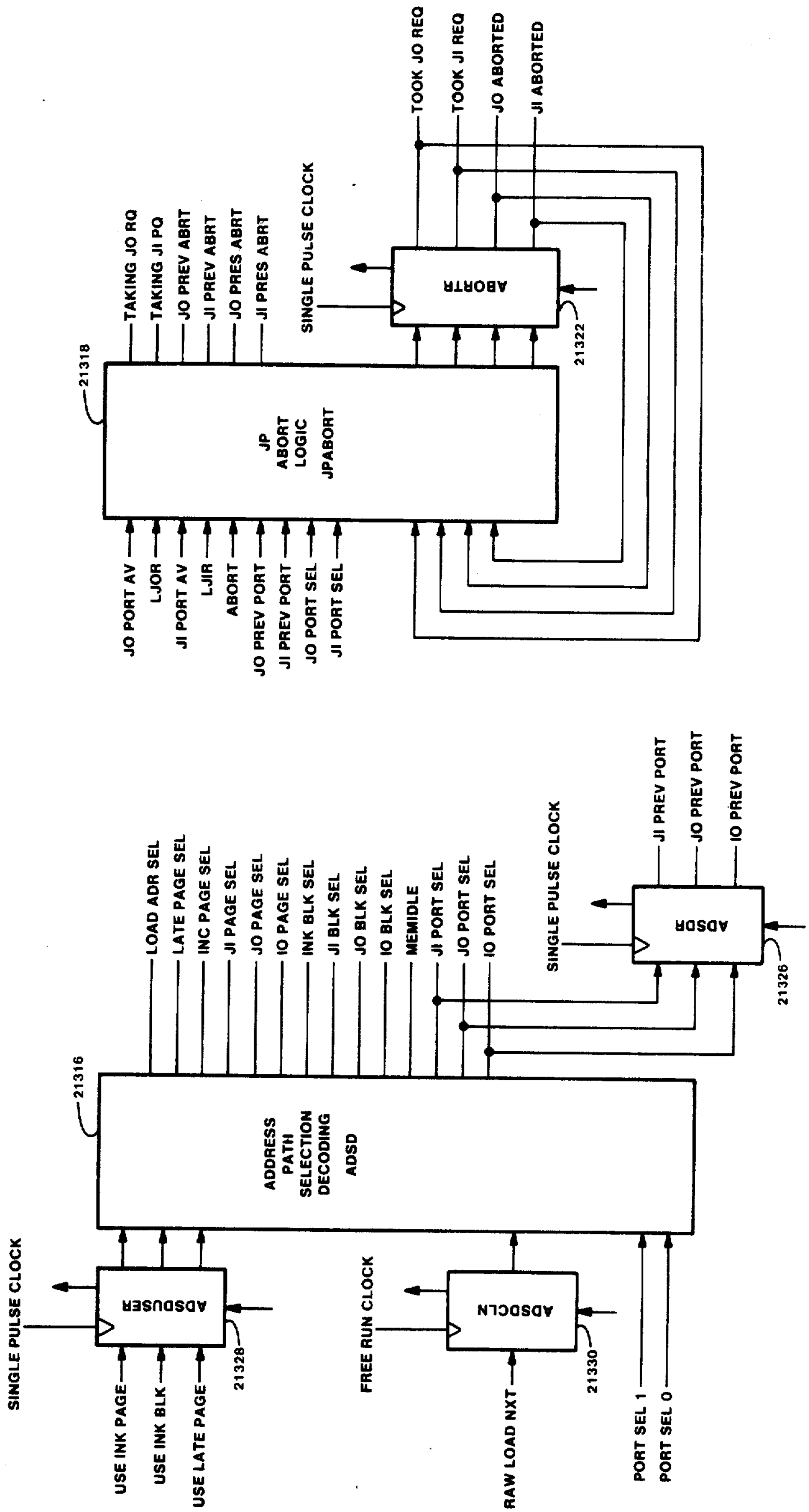

Referring to FIG. 213, Port Control (PC) 20716 is shown. Due to the large number of interconnections between logic elements of PC 20716, and between PC 20716 and other circuits of MIC 20122, signal interconnections are not shown by connecting lines but, for clarity of presentation, are indicated by commonality of signal names between common electrical points.

Major functional elements of PC 20716, and certain of their functions, are:

(1) Port Request State Logic (PRS) 21310; PRS 21310 determines and tracks validity of each memory request received by IO Port 20910, JPO Port 21010, or JPI Port 21110.

(2) Port Wait Flag Logic (PWF) 21312; PWF 21312 generates port waiting signals, discussed previously, whenever RM 20722 attempts to service a request at a memory port and is unable to do so. Any port having an asserted waiting flag signal is masked from the priority queue, described below, that is inhibited from receiving service, until that port's waiting flag is removed.

(3) Request Priority Selection Logic (RPS) 21314; RPS 21314 determines requesting port's priority, that is relative priority for IO Port 20910 JPO Port 21010, and JPI Port 21110 and selects that port having highest priority for service.

Referring to PRS 21310, PRS 21310 includes logic for each MEM 10112 Port, that is IO Port 20910, JPO Port 21010, and JPI Port 21110, for determining and tracking the validity of each request to each of these ports and availability of each of these ports to JP 10114 and IOS 10116. A first set of signals generated by PRS 21310, IOPA and $\overline{\text{IOPA}}$, JOPA and $\overline{\text{JOPA}}$, JIPA and $\overline{\text{JIPA}}$, indicate, respectively, whether IO Port 20910, JPO Port 21010, and JPI Port 21110 are available to accept memory requests. A second set of signals, IO Request Valid (IOREQVALID), JO Request Valid (JOREQVALID), and JI Request Valid (JIREQVALID) indicate whether a particular memory request to, respectively IO Port 20910, JPO Port 21010, or JPI Port 21110, is valid. Port Available and Port Request Validity signals are generated concurrently by PRS 21310.

Inputs to PRS 21310 include IOREQVALID, JOREQVALID, and JIREQVALID from outputs of Register 21320. These inputs serve PRS 21310 as an indicator of a current state of Port availability as previously determined by PRS 21310. Input Hand-Off-Next (HANDOFFNXT) from another portion of MIC 20122 (described below) indicates that a next operation to be performed is a Hand Off operation as previously described. Input Reset Request (RESETREQ) is a reset signal generated by MIC 20122 indicating that a currently serviced request valid flag is to be reset, that is terminated. Inputs IO Port Select (IOPORTSEL) and IO Previous Port (IOPREVPORT) are MIC 20122 generated signals indicating, respectively, that IO Port 20910 is currently selected for service and that IO Port 20910 was the port to be serviced selected for service on the previous clock cycle. Input (TMLOCKIO) is provided via FIU 20120 and indicates that the request valid flag and port available signal for IO Port 20910 is to remain unchanged; this is a test and diagnostic function. Load Port (LOADPORT) is a two bit input generated by another portion of MIC 20122 and indicating which Port, of IO Port 20910, JPO Port 21010 or JPI Port 21110, is currently having data loaded into MC 20116's Cache on its behalf. LOADPORT is provided from LOAD POINTER 20724, and is used to determine which request valid to reset on a handoff. Taking IO Requests (TAKINGIOREQ) is an MIC 20122 generated signal indicating that an IO Port 20910 request is currently being accepted and setting the IO request valid flag. JOPORTSEL and JIPORTSEL, JOPREVPORT and JIPREVPORT, TMLOCKJO and TMLOCKJI, and TAKINGJOREQ and TAKINGJIREQ are similar in function and operation to, respectively, IOPORTSEL, IOPREVPORT, TMLOCKIO, and TAKINGIOREQ. Inputs JO Aborted (JOABORTED) and JI Aborted (JIABORTED) are MIC 20122 generated signals indicating, respectively, that a JPO Port 21010 or JPI Port 21110 request has been aborted. Input Request Finish (REQFINISH) is generated by other portions of MIC 20122 to indicate conclusion of servicing of a memory request. Input Keep Request Valid (KEEPREQVLD) is generated by other portions of MIC 20122 to indicate that while a current request may not be serviced immediately, for example due to a need to transfer requested data from MSB 20110 to MC 20114, the request will be retained and serviced when possible. KEEPREQVLD also resets the reset valid flag, which would have been reset in anticipation of completion of the request. Input TMDEPEXAM is a test and diagnostic signal set by DP 10118 to force all ports to appear busy to the requestors.

In summary, as described above and as previously described, PRS 21310's Port availability outputs, that is IOPA, $\overline{\text{IOPA}}$, JOPA, $\overline{\text{JOPA}}$, JIPA and $\overline{\text{JIPA}}$, indicate when a particular port is available to receive a memory request. PRS 21310's request valid outputs, that is IOREQVALID, JOREQVALID, and JIREQVALID indicate when a particular port has a currently outstanding valid request. A LOADPORT Signal, that is LIOR, LJOR, or LJIR, from JP 10114 or IOS 10116 will result in the corresponding port availability flag being set and the corresponding request entering the priority queue for service. Either RM 20722 or JP 10114 may reset the corresponding port availability and request valid flag for JP 10114. JP 10114 may abort a memory request for either JPO Port 21010 or JPI Port 21110. An abort resets both the corresponding ports validity and availability flag, and terminates processing the corresponding request. There is one flag per port, as described, and both the request valid and port available signals are derived from the same signal. RM 20722 may reset a particular port availability and port request flag to indicate request not valid and port available on the last sequence of the service sequence for that particular port request. If the request valid flag is set by DP 10118, it will remain set and continuously executed; if it is reset by DP 10118, it cannot be set by a requestor. In addition, FIU 20120 may send signals TMLOCKIO, TMLOCKJO, or TMLOCKJI, to PRS 21310 to lock, respectively, IO Port 20910, JPO Port 21010, or JPI Port 21110 and prevent the port from changing state. A port so locked results in PRS 21310 indicating that the port is unavailable. In general, TMLOCKIO, TMLOCKJO, and TMLOCKJI are used for test and diagnosis of MEM 10112. It should be noted that, in general, PRS 21310's request validity and port availability outputs are based upon current information loaded into JOPAR 20710, JIPAR 20712, and IOPAR 20714 and thus represent each particular port's validity and availability state, that is the current state of the request being serviced for a particular port.

It may be necessary to suspend service of a particular port's request because RM 20722 is currently unable to service that request. Such events may occur, for example, when an IO request "collides", that is conflicts with, a MC 20116 cache load or because of a conflict with a by-pass read operation. PWF 21312 includes combinatorial logic for generating flags indicating when particular ports are forced to wait for service. These flags are IO Wait For Bypass Read (IOWAITBYRD), IO Wait For Cache Load (IOWAITLOAD), JO Waiting Cache Load (JOWAITING), and JI Waiting Cache Load (JIWAITING). These signals are generated as outputs of PWF 21312 and stored in 4 bit PWF Registers (PWFR) 21322. Inputs to PWF 21312 include Set Wait For Bypass Read (SETWATBYRD) generated by other portions of MIC 20122 and indicating that the current IO request must wait for an IO BYPASS READ operation, which is in the pipeline, to complete. Input Stop (STOP) is generated by MIC 20122 and is used to synchronize MEM 10112 with IOS 10116 and JP 10114 when CS 10110 is placed in a test and diagnostic single pulse operating mode. Input Any Bypass Read (ANYBYD) is generated by MIC 20122 upon any MC 20116 Bypass Read Operation and remain valid as long as a Bypass Read is in the pipeline Input Set Wait Load (SETWATLOAD) is also generated by MIC 20122 whenever a MC 20116 cache load operation is being initiated. Inputs IO PREVPORT, JOPREVPORT, JIPREVPORT indicate that, respectively, IO Port 20910, JPO Port 21010, or JPI Port 21110 was the particular port serviced the previous clock cycle. PWF 21312 uses these inputs to determine which port was serviced by RM 20722 the previous clock cycle and must wait until, for example, a cache load is completed. As indicated in FIG. 213, PWF 21312's outputs IOWAITBYRD, IOWAITLOAD, JOWAITING, and JIWAITING are provided as inputs to PWF 21312 to indicate to PWF 21312 current status of those ports waiting service.

In summary, RM 20122 may attempt to service a particular port's request and be unable to do so. In such occurrences, that port is flagged as waiting and is masked from priority queue, described below, until that port's wait flag is removed PWF 21312 sets a bit in PWFR 21322 whenever a request must be so suspended. For JP 10114, a wait may occur, for example, on a collision with a MC 20116 cache load. An IOS 10116 request may be required to wait after a collision with a MC 20116 cache load or because of a conflict with a bypass read operation. A port waiting flag will mask that port's current request, but leaves the corresponding request valid flag output of PRS 21310 and PRSR 21320 set, indicating a valid request. Completion of a MC 20116 cache load operation may reset all waiting flags except IOWAITBYRD, indicating that IO Port 20910 is waiting upon a bypass read operation IOWAITBYRD may be reset at the end of that by-pass read operation. Waiting flag outputs of PWFR 21322 will continue to be set on each system clock cycle during which FUTURELOAD is asserted, indicating that a cache load is in the pipeline of BC 20114. IOWAITBYRD flag will be set on each system clock cycle during which ANYBYRD is asserted, indicating that a by-pass read operation is in the pipeline of BC 20114. Removal of inputs FUTURELOAD or ANYBYRD allows corresponding wait flag outputs of PWFR 21322 to be reset and allows any port previously having had a wait flag due to FUTURELOAD or ANYBYRD to be returned to request priority queue.

RPS 21314 determines a priority for each request received by IO Port 20910, JPO Port 21010, and JPI Port 21110 and selects the highest priority port for service. This priority determination is performed upon each system clock cycle and determines the port to be serviced on next system clock cycle. Port selection is encoded and loaded into Request Priority Selection Register (RPSR) 21324 as two bit code output, Port Select (PORTSEL) 1 and Port Select (PORTSEL) 0. Encoding for port selection may be: 00, no request is outstanding and no port is selected; 01, select JPO Port 21010 for service; 10, select JPI Port 21110 for service; and, 11, select IO Port 20910 for service. Other outputs of RPS 21314 include Start New Request (STARTNEWREQ) and Use Late Page (USELATEPAGE). STARTNEWREQ indicates that service of a selected request is to be initiated, and jams RM 20722 to begin execution at sequence count 1 indicates, as previously described with reference to JOPAR 20710, and JIPAR 20712 that PPN field of a request will be accepted onto TSA Bus 21210 by bypassing JPORPAR 21238 and JPIPRR 21248.

Inputs to RPS 21314 include IOREQVALID, IOPA, and LIOR relating to IO Port 20910, and corresponding signals relating to JPO Port 21010 and JPI Port 21110. RP 21314 inputs also include IOWAITBYRD, IOWAITLOAD, JOWAITING, and JIWAITING. Input Select Next Request (SELNEXTREQ) is an output of RM 20722 indicating that the next port to be serviced is to be selected. Unless SELNEXTREQ is asserted, next port to be serviced is the same port as on previous system clock cycle.

Each port, IO Port 20910, JPO Port 21010, and JPI Port 21110, has two possible request histories, that is old request and new request. An old request is one for which a REQVALID flag, described above, is asserted. A new request is one for which a port available signal, that is IOPA, JOPA, or JIPA, has been asserted and for which the requestor has asserted a load request signal, that is LIOR, LJOR, or LJIR. RPS 21314 internally generates six "request ready" signals indicating whether there is currently present a valid old or new request for IO Port 20910, JPO Port 21010 and JPI Port 21110. As will be described momentarily, these six possible request ready signals are ranked in priority, and a particular request ready signal will mask all request ready signals of lower priority. RPS 21314 will therefore see and act upon only one such internally generated request ready signal in generating outputs PORTSEL 1 and PORTSEL 0. Any request ready signal will result in RPS 21314 asserting STARTNEWREQ which, in turn, may force RM 20722 to initiate a sequence servicing the selected request. PPN always follows the other fields of a request by one clock cycle. If RM 20722 begins execution of a JPI Port 21110 or JPO Port 21010 immediately upon receipt of a request, PP will by-pass JPOPAR 21238 or JPIPRR 21248 to TSA Bus 21210 to avoid a register delay in initiating request execution. When, therefore, the selected request is a new JPO Port 21010 or JPI Port 21110 request, RPS 21314 will assert USELATEPAGE, thus enabling the late arriving PPN field of the request to TSA Bus 21210. RPS 21314's internally generated request ready signals are, in descending order of priority:

(1) Old IO Ready (OLDIORDY) is asserted if IOREQVALID is asserted and IO Port 20910 is not waiting a cache load or bypass read to complete, that is IOWAITBYRD and IOWAITLOAD are not asserted. OLDIORDY is suppressed if IOPORTSEL is asserted because IO Port 20910 is already being serviced.

(2) Old JO Ready (OLDJORDY) is asserted if JOREQVALID is asserted and JPO Port 21010 is not awaiting a MC 20116 cache load to complete, that is JOWAITING is not asserted. OLDJORDY is suppressed if JOPORTSEL is asserted because JPO Port 21010 is already being serviced. OLDJORDY will not be asserted if higher priority OLDIORDY is asserted.

(3) Old JI Ready (OLDJIRDY) is asserted if JIREQVALID is asserted and JI Port 21110 is not awaiting a MC 20116 cache load to complete, that is JIWAITING is not asserted. OLDJIRDY is suppressed if JIPORTSEL is asserted because JPI Port 21110 is already being serviced. OLDJIRDY will be suppressed if higher priority signals OLDJORDY or OLDIORDY are asserted.

(4) New IO Ready (NEWIORDY) is asserted if IOPA and LIOR are asserted. NEWIORDY will be suppressed if OLDJIRDY, OLDJORDY, or OLDIORDY are asserted.

(5) New JO Ready (NEWJORDY) is asserted if JOPA and LJOR are asserted. NEWJORDY will be suppressed if NEWIORDY, OLDJIRDY, OLDJORDY, or OLDIORDY are asserted.

(6) New JI Ready (NEWJIRDY) is asserted if JIPA and LJIR are asserted. NEWJIRDY will be suppressed if NEWJORDY, NEWIORDY, OLDJIRDY, OLDJORDY, or OLDIORDY are asserted.

Address Selection Decoding (ADSD) 21316 generates enabling signals to JOPAR 20710, JIPAR 20712, IOPAR 20714, and PRMUX 20720, previously described, to select which memory request address fields will be gated onto, for example TSA Bus 21210. These outputs of ADSD 21316 include LOADADRSEL, LATEPAGESEL, INCPAGESEL, JIPAGESEL, JOPAGESEL, IOPAGESEL, INCBLKSEL, JIBLKSEL, JOBLKSEL, IOBLKSEL, JIPORTSEL, JOPORTSEL, and, IOPORTSEL. Further outputs include Memory Idle (MEMIDLE), used within MIC 20122 as will be described below to indicate that MEM 10112 is not currently servicing a request. Outputs JIPORTSEL, JOPORTSEL, and IOPORTSEL from ADSD 21316 are stored in ADSD Register (ADSDR) 21326 to provide outputs, respectively, JIPREVPORT, JOPREVPORT, and IOPREVPORT. These previous port signals, discussed previously, are port select signals delayed by one system clock cycle and are provided to JPABORT 21318 and, as previously discussed, PRS 21310 and RPS 21314. JIPREVPORT, JOPREVPORT, and IOPREVPORT indicate the port serviced the previous clock cycle and are used to determine which port is to be aborted or set to waiting. Such decisions are made on system clock cycle after a port is selected, by JIPORTSEL, JOPORTSEL, and IOPORTSEL, as these port select signals will not indicate the particular port to be aborted or set to waiting during the system clock cycle in which the port is selected since the port select signals may be referencing the service of another port.

Inputs to ADSD 21316 include PORTSEL 1 and PORTSEL 0. PORTSEL 0 and 1 are the primary signals from which ADSD 21316 outputs are generated. Generation of block and page address selection signals by ADSD 21316 is further controlled by inputs Use Late Page (USELATEPAGE), Use Increment Register 21211 Page field (USEINCPAGE), and Use Increment Register 21211 Block field (USEINCBLK). These inputs are generated by RM 20722 to indicate, for example when request address field gated onto TSA Bus 21210 is to be derived from Late Page Bypass around JPOPRR 21238 and JPIPRR 21248 or from INCREG 21211. USEINCPAGE, USEINCBLK, and USELATEPAGE are delayed by one clock cycle in ADSDUSE Register (ADSDUSER) 21328 for timing alignment purposes. Yet another input to ADSD 21316 is RAWLOADNEXT which is asserted by LM 20730 when a MC 20116 cache load operation will occur on next system clock cycle. In such cases, block and page address fields gated onto TSA Bus 21210 are taken from block and page address fields of LP 20724 during that next system clock cycle. RAWLOADNEXT is delayed by one clock cycle in ADSD Cache Load Next (ADSDCLN) register 21330 for timing alignment purposes.

As previously described and will be described further below, JP 10114 performs a number of check operations on validity of JP 10114 references to MEM 10112. If a JP 10114 memory request fails these validity checks, JP 10114 may abort that request by providing control signal ABORT to MEM 10112 more particularly to JPABORT 21318 of MIC 20122. Such abort requests may arise due to a protection violation, referred in earlier descriptions of CS 10110's Protection Mechanisms 10230, or due to lack of logical to physical address translation as described in Addressing Structures 10220. In general, JP 10114 may discover that a request to MEM 10112 should be aborted only after that request has been accepted by MEM 10112. JP 10114 may then send an abort request to MEM 10112. A JP 10114 memory request to be aborted may be queued up and waiting for service, or may have already begun execution. In the first case, the corresponding request validity flag, as previously described with reference to PRS 21310, will be reset and JP 10114 may submit further memory requests. In a second case, the JP 10114 request to be aborted is currently being serviced and is forced inactive, that is the RM 20722 sequence servicing that request is terminated.

JPABORT 21318 is comprised of a set of combinatorial gating, for example, SN74S00s and SN74S02s. Associated with JPABORT 21318 is Abort Register (ABORTR) 21332, for example a SN74S194. Outputs of JPABORT 21318 include Taking JO Request (TAKINGJOREQ) and Taking JI Request (TAKINGJIREQ), both of which have been previously discussed with reference to PRS 21310. TAKINGJOREQ indicates that MEM 10112 is receiving a memory request from JPO Port 21010, that it is receiving a LJOR from JP 10114. TAKINGJIREQ similarly indicates that MEM 10112 is receiving a JPI Port 21110 request, that it is receiving a JIPA from JP 10114. Outputs Took JO Request (TOOKJOREQ) and Took JI Request (TOOKJIREQ) from ABORTR 21332 are JPABORT 21318 outputs TAKINGJOREQ and TAKINGJIREQ outputs, respectively, delayed by one system clock cycle. TOOKJOREQ and TOOKJIREQ indicate, respectively, that MEM 10112 has just accepted memory requests from JPO Port 21010 and JPI Port 21110. As will be described now following description, TOOKJOREQ and TOOKJIREQ are used by other portions of MIC 20122 in determining appropriate action to be taken in aborting a JPO Port 21010 or JPI Port 21110 request.

Outputs Abort Previous JO Request (JOPREVABRT), Abort Previous JI Request (JIPREVABRT), Abort JO Present Request (JOPRESABRT), and Abort Present JI Request (JIPRESABRT) of JPABORT 21318 indicate, respectively, whether MEM 10112 is to abort a request that may have been active one clock cycle previously, or is presently active, or is a pending JPO Port 21010 or JPI Port 21110 request. These outputs are provided to another portion of MIC 20122 logic, which will be described further below. Outputs JOPREVABRT and JIPREVABRT cause termination of RM 20722 sequences set up by services to the port one clock cycle previously. Outputs JOPRESABRT and JIPRESABRT result in cancellation of MEM 10112 requests for which service has been initiated and is being serviced on the present system clock cycle. Request Aborted (JOABORTED) and JPI Port 21110 Request Aborted (JIABORTED). JOABORTED and JIABORTED are, as previously described, provided as inputs to PRS 21310 and indicate, respectively, that a JPO Port 21010 or a JPI Port 21110 request has been aborted, and that the request valid flag is to be reset.

Inputs to JPABORT include ABORT, LJOR, and LJIR from JP 10114, JOPA and JIPA from PRS 21310, and JOPREVPORT, JIPREVPORT, JOPORTSEL, and JIPORTSEL from ADSD 21316, all of which have been previously discussed. Other inputs to JPABORT 21318 include TOOKJOREQ and TOOKJIREQ, and JOABORTED and JIABORTED, which have also been previously discussed. These inputs indicate to JPABORT that a request from JP 10114 is to be aborted, what requests to JPO Port 21010 and JPI Port 21110 are currently or have previously been received, and which of JPO Port 21010 and JPI Port 21110 was serviced on the previous clock cycle or is currently being serviced.

Having described structure and operation of MEM 10112 circuitry comprising MEM 10112's interfaces to JP 10114 and IOS 10116, that is JPAR 20710, JIPAR 20712, IOPAR 20714, PRMUX 20720, and PC 20716, together with other related circuitry, MEM 10112's primary control structure will be described next.

3. MIC 20122 Control Circuitry (FIGS. 214–237)

Primary control of MEM 10112 is provided by Request Manager (RM) 20722 with associated trailer condition logic described below, MISS Control (MISSC) 20726, Read Queue (RQ) 20728, Load Manager (LM) 20730, Bypass Read/Write Control (BR/WC) 20718, and other associated circuitry. As will be described below, RM 20722 includes an array of Programmable Read Only Memories (PROMs) containing sequences of microinstructions for controlling operation of MEM 10112 in response to each possible memory request submitted by JP 10114 and IOS 10116. RM 20722 microinstruction sequences may, during executon, be altered by operation of jam and interrupt operations described below. RM 20722 microinstruction sequences may also be altered by trailers. Trailers are conditionally executed commands, executed or not on the clock cycle after the command is issued. A trailer action is a conditional action occurring under control of MIC 20722's trailer condition logic in response to occurrence of a trailer condition in MEM 10112's operation. Trailer actions affect or modify the normal sequence of RM 20722 microinstruction sequences, or conditionally allow certain commands to be executed. There may be one or more trailer actions associated with each RM 20722 microinstruction sequence for servicing memory requests. In general, a trailer action will be executed only if that trailer action's associated trailer condition occurs. MEM 10112 will therefore execute request servicing operations of the form: in response to memory request A execute RM 20722 microinstruction sequence B, but if trailer sequence C occurs then execute trailer action D, or if trailer condition E occurs execute trailer action F and so on.

As stated above, primary control of MEM 10112 operation is provided by RM 20722 and MIC 20122's trailer condition logic. During servicing of a memory request RM 20722 and MIC 20122's trailer condition logic will provide sequences of microinstructions, that is control signals, to subsidiary MIC 20122 control "nodes". Each control node will in turn execute a limited sequence of related actions necessary to execute these microinstructions. Certain nodes may be simple conditional commands (control signals), rather than sequences of microinstructions. It is these subsidiary control nodes which actually execute MEM 10112 trailer actions. Among MIC 20122's subsidiary control nodes include MISSC 20726, RQ 20728, LM 20730, BR/WC 20718, and PC 20738 and LP 20724 which have been previously described. These MIC 20122 control nodes in turn provide control signals to JOPAR 20710, JIPAR 20712, IOPAR 20714, PRMUX 20720, INCREG 21210, BY/WF 20118, MC 20116, and BC 20114. MC 20116 also receives certain control direct control signals from RM 20722 while all direct control of FIU 20120 is provided directly from RM 20722.

a.a. Request Manager RM 20722 (FIG. 214)

Figure 214:
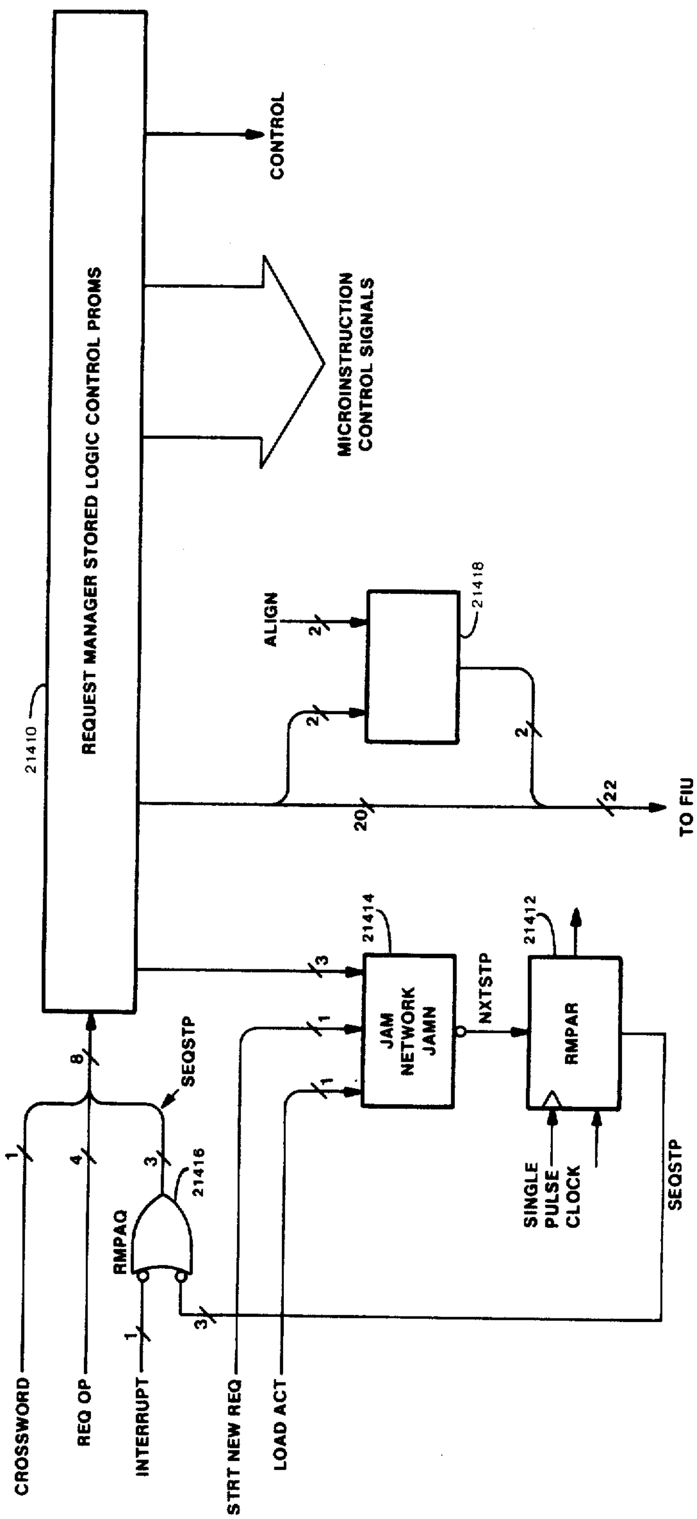
FIG. 214 is a detailed block diagram of memory request manager.

Referring to FIG. 214, RM 20722 is shown. RM 20722 includes Request Manager Prom Array (RMPA) 21410. RMPA 21410 is a 256 word by 68 bit array of, for example, 82S131 PROMs. A particular microinstruction sequence contained in RMPA 21410 is selected by 8 bit address input comprised of 4 bit input REQOP and single bit input CROSSWORD, previously described with reference to PRMUX 20720, and 3 bit input Sequence Step (SEQSTP). REQOP and CROSSWORD together form a 5 bit address selecting a particular microinstruction sequence to be executed. SEQSTP selects a particular step, or microinstruction, within that sequence. Each RM 20722 microinstruction sequence is executed within at most 6 steps which are defined as steps 001(1) to 110(6). As will be discussed below, steps 000(0) and 111(7) are special steps of each sequence. In normal operation, SEQSTP is derived from Next Step (NXTSTP) output of RMPA 21410, which, for each step, defines the next step of that particular sequence. NXTSTP is delayed by one system clock cycle, in Request Manager Prom Array Register (RMPAR) 21412, to become SEQSTP during the next system clock cycle. In normal operation, therefore, each request step chooses the following request step to be executed. Execution of a microinstruction sequence for servicing a request therefore normally proceeds in numerical order of step from SEQSTP equals one until completion of the sequence. NXTSTP may, however, be overridden by a jam or interrupt operation and SEQSTP forced to a different step number than that provided by NXTSTP output of RMPA 21410. A jam operation may be forced by inputs STRTNEWREQ and LOADACT to Jam Network (JAMN) 21414 which is connected between NXTSTP output of RMPA 21410 and RMPAR 21412's input. STRTNEWREQ, as previously discussed, indicates start of service of a new request and forces an NXTSTP value of one to RMPAR 21412's input. As previously described, SEQSTP equals one selects the first step of all RMPA 21410 microinstruction sequences. LOADACT, also previously described, forces the currently active port, that is the port whose request is currently being serviced, into waiting state as described with reference to PWF 21312. LOADACT input to JAMN 21414 forces a NXTSTP value of zero to RMPAR 21412's input. SEQSTP equals zero is, as previously discussed, a special step of each of RMPA 21410's microinstruction sequences. Step zero is the idle state of each microinstruction sequence. When in this step of any microinstruction sequence, RM 20722 is waiting for a valid request from a port. Step zero is also entered at completion of service for any request if no other requests are valid and waiting execution. STRTNEWREQ and LOADACT therefore both terminate a currently executing microinstruction upon occurrence of next system clock to RMPAR 21412. STRTNEWREQ will force RM 20722 to step one, that is the first step, of the microinstruction sequence for servicing a memory request whose service is to begin upon that next system clock cycle, while LOADACT will force RM 20722 to an idle state, that is SEQSTP equals zero, to wait for a valid request.

Interrupts are initiated by INTERRUPT input to Request Manager Prom Array Gate (RMPAG) 21416. Assertion of INTERRUPT immediately forces SEQSTP to SEQSTP equals 7. Step 7 of each microinstruction sequence is an idle state similar to step zero but is entered from an interrupted request sequence. That interrupted sequence may re-enter priority queue for subsequent service, that is the request is not aborted or otherwise discarded by MEM 10112. As in the case of being forced to step zero, RM 20722 may begin service of a new request from step 7, when a valid request is presented to RM 20722.

Certain conditions resulting in a jam or interrupt operation are, for example:

(1) A memory request accesses MC 20116's cache and an MC 20116 cache miss occurs. An RM 20722 interrupt results and RM 20722 is forced to SEQSTP equals 7. Unless this request is a bypass read or write operation, that request re-enters priority queue for subsequent service when its wait condition is satisfied. That request will be forced to wait as a result of the cache load or a collision with a previous MC 20116 cache load address, that is an interfering request to an MC 20116 cache address awaiting data to be loaded from MSB 20110.

(2) As will be described further below, LM 20730 may require concurrent use of TSA Bus 21210 and MC 20116's cache. LOADACT will be asserted and force a jam of SEQSTP equals zero. As previously discussed, LOADACT and REQACT will result in the currently active port, that is the port whose request is currently being serviced, to enter waiting state. After MC 20116 cache load operation is completed, such waiting ports re-enter priority queue. It should be noted that LOADACT will suppress assertion of SELNEXTPORT, so that all ports awaiting service are forced to continue waiting until MC 20116 cache load operation is complete.

(3) A JPO Port 21010 or JPI Port 21110 request may be aborted after RM 20722 has begun service of that request. RM 20722 is interrupted and forced to SEQSTP equals 7. As previously discussed, JPABORT 21318 will reset JOREQVALID or JIREQVALID as required. The wait flags are not set.

(4) An IOS 10116 read operation from MC 20116's cache may be requested before an IO 10116 bypass read operation has completed. RM 20722 will be jammed to SEQSTP equals zero and IO Port 20910 will enter waiting state until bypass read operation is completed. An IO Port 20910 wait is necesary so that data may return to IOS 10116 in the order in which it was requested.

(5) A memory request to flush MC 20116's cache may be submitted when flag OK To Flush (OKTOFLUSH), described below, is not asserted. RM 20722 will be jammed to SEQSTP equals zero and the flush request will be discarded. That request for a flush will result in OKTOFLUSH being asserted, and any subsequent flush request will be executed. The wait flags are not set.

(6) A memory request requiring use of MC 20116's Write Back File may be submitted when the Write Back File is busy. RM 20722 will be forced to SEQSTP equals 7 and that request will be returned to priority queue. The wait flags are not set.

(7) Certain steps in microinstruction sequences servicing particular memory requests are non-interruptable, for example SEQSTP equals one of an IOS 10116 block read. RQ 20728, described below, may at this time contain indication of a request for a MC 20116 cache load operation or a bypass read operation. RM 20722 will be forced to SEQSTP equals 7 and the non-interruptable request will re-enter priority queue for later service. The appropriate wait flag is set.

RM 20722 may receive a memory request to read BC 20114's error log while a request to BC 20114 is pending as will be described below, request to BC 20114's error log are not put in BC 20114's command queue thus resulting in a conflict for use of MEM 10112's data buses, for example RDO 20158. RM 20722 will be forced to SEQSTP equals 7 and the memory request for read of BC 20114's error log will re-enter priority queue.

Considering first the four bit REQOP and single bit CROSSWORD fields of RMPA 21410's address, these fields select particular microinstructions sequences for controlling corresponding MEM 10112 operations to be performed in servicing memory requests. Certain of these operation codes, that is REQOPs, the MEM 10112 operations specified by those operation codes, and the number of sequenced steps required to complete those operations, are:

(1) REQOP (0000)=Null Write: a null write operation is a request to write to memory with a length field of 0. No data stored in MEM 10112 will be altered by such an operation but, if a MIC 20116 cache block so referenced is not resident in MC 20116's cache, a load sequence will be initiated to transfer referenced data from MSB 20110 to MC 20116 cache. A null write operation is completed in one sequence step.

(2) REQOP (0001)=Bit Write: a bit write is any write to memory of a data item of 1 to 32 bits in length which requires a read and modify of MC 20116's cache contents in order to maintain correct parity of the corresponding data in MC 20116's cache. Bit writes do not begin on a byte boundary or are not an integral number of bytes in length. A bit write requires three sequence steps for execution if the reference does not cross word boundaries, and requires five sequence steps for execution if the request crosses word boundaries.

(3) REQOP (0010)=Rotate Write: rotate writes are writes of data items 8 to 32 bits in length, in multiples of 8 bits, which begin on a byte boundary. A rotate write operation requires one sequence step for execution if it does not cross word boundaries, and requires two sequence steps if a cross word boundary operation is required.

(4) REQOP (0011)=Partial Block Write: partial block writes are block writes from IO 10116 which have a byte length of less than sixteen. Partial block write operations require loading of MC 20116's cache if the information is not already encached. Partial block write operations may not by-pass MC 20116's cache. Starting address of a partial block write may be located anywhere within a block so long as it falls on a byte boundary. Length of a partial block write must be such that the write does not overflow into an adjacent block. Partial block write operations require five sequence steps for completion.

(5) REQOP (0100)=Full Block Write: a full block write is a write of an entire sixteen byte block which begins on a block boundary. A full block write may be performed by a by-pass write operation if IOS 10116 does not request encaching of the block and the block is not already encached. A full block write operation requires five sequence steps for completion.

(6) REQOP (0101)=Read and Set: in a read and set operation from 1 to 32 bits may be read and returned to the requestor, that is JP 10114 or IOS 10116. The particular bit pointed to by starting bit address is then set to one and written back into MC 20116's cache. This is a non-interruptable memory operation. A read and set operation requires four sequence steps for completion if word boundaries are not crossed, and five sequenced steps if word boundaries are crossed.

(7) REQOP (0110)=Read Error Log Most Significant Bits: this operation returns the sixteen most significant bits of BC 20114's error log entry to IOS 10116. This operation does not alter or otherwise effect contents of BC 20114's error log. A read error log most significant sixteen bits operation requires four sequence steps for completion.

(8) REQOP (0111)=Read Entire Error Log And Reset: a read entire error log and reset operation reads the entire 32 bit BC 20114 error log entry, described in a following description, to JP 10114 or, alternately reads the least significant sixteen bits of this entry to IOS 10116. All error bits in BC 20114's error log are cleared and error log enabled for subsequent loading. A read entire error log reset operation requires four sequence steps for completion.

(9) REQOP (1000)=Null Read: a null read operation results from any memory read request with a specified length of 0. No MEM 10112 data is transferred to requestor; a data word consisting of all zeros or all blanks, however, will be read to the requestor depending upon certain FIU alignment bits specified in the memory request resulting in a null read operation. A null read operation requires two sequence steps for completion.

(10) REQOP (1001)=Bit Read: a bit read operation requires that the requested data to be read must be passed through FIU 20120, described in the following description, for either alignment, blank fill-in, or the operation crosses word boundaries and requires assembly, or sign extension manipulation operations to be performed. All JP 10114 read requests of less than 32 bits or that are not word aligned are bit read operations. A bit read operation requires three sequence steps for completion if word boundaries are not crossed, and four sequence steps if word boundaries are crossed.

(11) REQOP (1010)=Rotate Read: a rotate read operation is a read operation executed through FIU 20120. A rotate read operation rotates a data word from MC 20116's cache so that the requested data occupies least significant sixteen bits of MIO Bus 10129. A rotate read operation requires two sequence steps for completion if word boundaries are not crossed, and four sequence steps if word boundaries are crossed.

(12) REQOP (1011)=Full Word Read: a full word read operation is executed when JP 10114 makes a memory read request for 32 bits aligned on a word boundary. This data is transferred directly from MC 20116's cache to JP 10114. A full word read operation will also occur when IOS 10116 requests a read of sixteen bits of data which are already located in the least significant sixteen bits of a word. This data will be transferred directly from MC 20116's cache to IOS 10116. A full word read operation requires one sequence step for completion.

(13) REQOP (1100)=Block Read: a block read operation transfers a sixteen byte block, beginning on a block boundary, to a requestor. A block read operation is eligible for a bypass read operation to IOS 10116 if IOS 10116 has not requested that the requested data be encached in MC 20116's cache and the block is not already encached. A block read operation requires four sequence steps for completion.

(14) REQOP (1101)=Error Operation: an error operation will result from any memory request requesting RM 20722 to execute a memory request which is not valid for that particular requestor. An error operation results in an Invalid Operation (INVALIDOP) flag being loaded into BC 20114 error log and an interrupt to the current error processor, either JP 10114 or IOS 10116. An error operation requires one sequence step for completion.

(15) REQOP (1110)=Repair Block: a repair block operation writes a block encached in MC 20116's cache back to MSB 20110, ignoring any MIC 20116 cache parity errors, and generating correct ERCC code for use in BC 20114 and MSB 20110. If a block referred to in a repair block operation is not encached in MIC 20116's cache, it is brought to MC 20116 cache without logging of ERCC errors appearing upon transfer of the block from MSB 20110 to MC 20116's cache where the block is written back into MSB 20110 as described above. A repair block operation, as previously described, leaves the data undergoing repair block operation free of ERCC or MC 20116 parity errors. A repair block operation requires five sequence steps for completion.

(16) REQOP (1111)=Flush Cache: a flush cache operation is, as previously described, used only upon loss of power to CS 10110. A flush cache operation writes all "dirty" MC, 20116 cache blocks back into MSB 20110 if, as previously described, OKTOFLUSH bit has been previously set. OKTOFLUSH may be set either by flush cache commands to MEM 10112 from both JP 10114 and IOS 10116, or by a flush cache command from either JP 10114 or IOS 10116 together with previous approval from DP 10118. A flush cache operation requires five sequence steps per block flushed for completion.

Having described structure and operation of Request Manager 20722, structure and operation of RM 20722's associated trailer condition logic will be described next below.

b.b. Trailer Condition Logic 21510 (FIG. 215)

Figure 215:
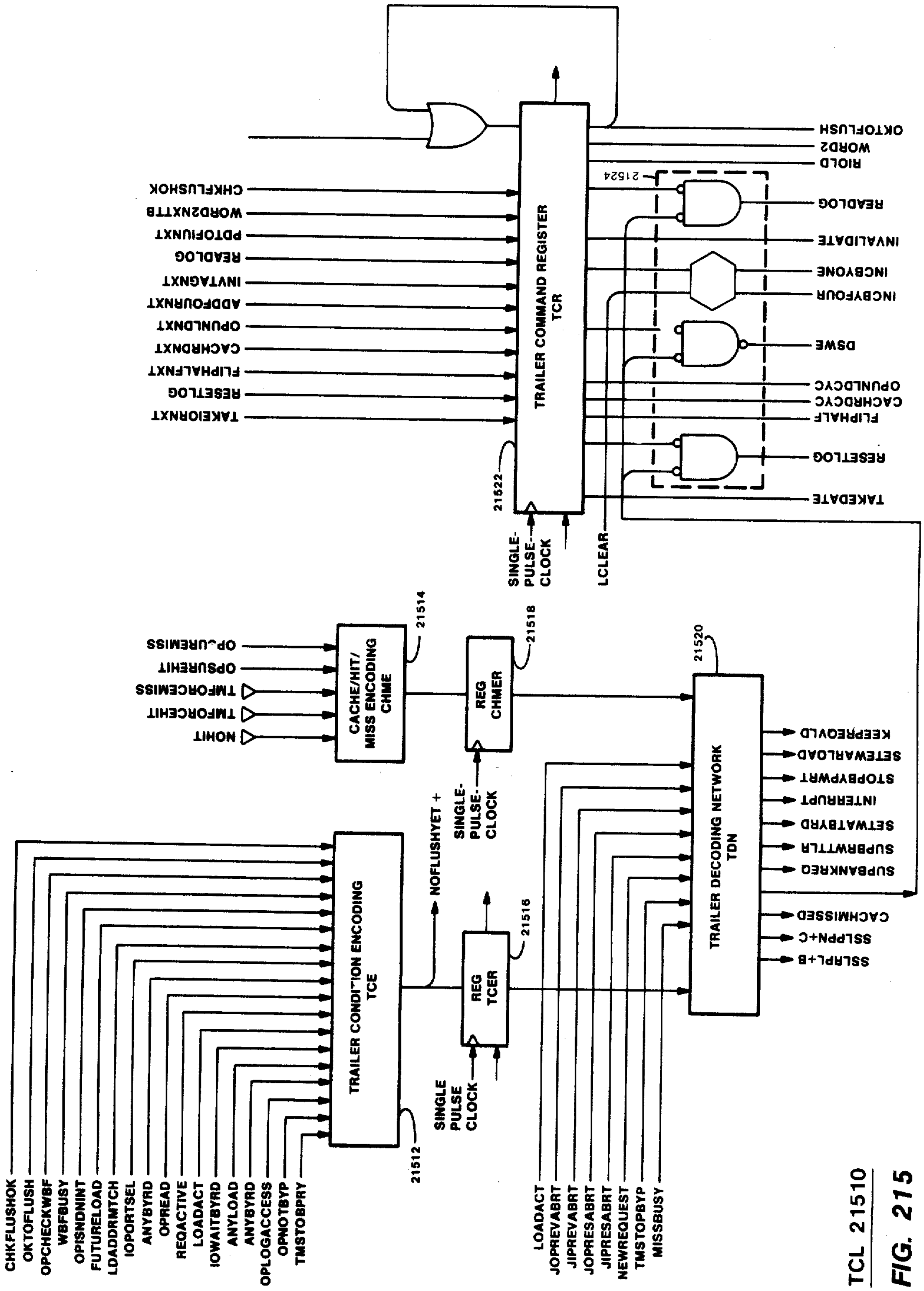
FIG. 215 is a detailed block diagram of memory trailor condition logic.

Referring to FIG. 215, Trailer Condition Logic (TCL) 21510 is shown. As previously described, TCL 21510 initiates conditional actions, the execution of which is dependent upon occurrence of certain conditions arising in MEM 10112 operation. These conditional actions may either modify or assist in execution of microinstruction sequences provided from RM 20722 in response to memory request.

TCL 21510 includes Trailer Condition Encoding logic (TCE) 21512, which receives inputs from MIC 20722 and other portions of MEM 10112 circuitry representing current state of MEM 10112 operation in general, and Cache/Hit/Miss Encoding logic (CHME) 21514, which in general receives inputs regarding operation of MC 20116. Encoded outputs TCE 21512 and CHME 21514 are loaded into, respectively, Trailer Condition Encoding Register (TCER) 21516 and Cache/Hit/Miss Encoding Register (CHMER) 21518. Encoded outputs of TCER 21516 and CHMER 21518 are provided as inputs to Trailer Decoding Network (TDN) 21520, together with other inputs representing current state of MEM 10112 operation. Outputs of TDN 21520 are provided to other portions of MEM 10112 circuitry, including MIC 20722, and are signals directing operation of MEM 10112 based upon certain conditions arising in operation of MEM 10112 on the current and previous clock cycles. Trailer Command Register (TCR) 21522 receives control signals, generally from RM 20722, indicating certain MEM 10112 operations to be executed during the next microinstruction sequence step. These command signals will be transferred into TCR 21522 and provided as TCR 21522 control outputs to other portions of MEM 10112, including MIC 20722, at start of that next microinstruction sequence step. Certain of these TCR 21522 command signal outputs are gated, in Gates 21524, by an output of TDN 21520, to selectively suppress, depending upon certain trailer conditions, certain of those operations if corresponding trailer conditions occur in MEM 10112 operation.

In summary, during a first clock cycle certain outputs of RM 20722 representing MEM 10112 operations to be initiated or executed during a second clock cycle are presented as inputs to TCR 21522. Concurrently, certain signals representing current operating condition of MEM 10112 and MC 20116 are sampled and encoded by TCE 21512 and CHME 21514. Encoded outputs of TCE 21512 and CHME 21514 are then presented as inputs to TCER 21516 and CHMER 21518. At start of second clock cycle, TCR 21522 inputs presented during first clock cycle are loaded into TCR 21522 and appear as TCR 21522 outputs representing RM 20722 selected operations to be initiated or executed during second clock cycle. Concurrently, encoded outputs of TCE 21512 and CHME 21514 are transferred into TCER 21516 and CHMER 21518, to appear as TCER 21516 and CHMER 21518 outputs representing MEM 10112's state of operation during first clock cycle, that is MEM 10112's previous state of operation. At start of second clock cycle, these encoded outputs of TCR 21516 and CHMER 21518, together with TDN 21520's other inputs representing a current state of MEM 10112 operation, are decoded by TDN 21520. TDN 21520 then provides, this time, outputs initiating certain MEM 10112 conditional actions based upon previous and current state of MEM 10112 operation. One of these TDN 21520 outputs, Suppress Micro Trailer (SUPMCROTLR) is provided as a gating input Gates 21524 to prevent or otherwise modify certain MEM 10112 operations, previously selected by RM 20722, which would otherwise have been initiated or executed during the second clock cycle. RM 20722 and TCL 21510 thereby provide MEM 10112 operation control based upon previous and current state of MEM 10112 operation of the form "execute or initiate" operation A as selected by RM 20722 in response to memory request B, or if trailer condition C has arisen in MEM 10112 operation execute conditional action to D, or if trailer condition E has arisen execute conditional action F, and so on.

Referring now to specific inputs and outputs of TCL 21510, inputs to TCE 21512 include Check Flush OK (CHKFLUSHOK), that is RM 20722 has initiated an operation to determine whether an MC 20116 cache flush is currently permissible, and OK TO Flush (OK- FLUSH) indicating that an MC 20116 cache flush operation may currently be performed. Input Operation Check Write Back File (OPCHECKWBF) and Write Back File Busy (WBFBUSY) respectively indicate that an operation to check current status MC 20116's write back file is currently being performed and that MC 20116's write back file is currently busy, that is executing a write back operation. Input Operation is Non-Interrupt (OPISNONINT) indicates that a non-interruptable MEM 10112 operation is currently being executed. Input Future Load (FUTURELOAD) indicates that an MC 20116 cache load operation is pending. Load Address Match (LDADDRMTCH), previously discussed with reference to JOPAR 20710 to IOPAR 20714 and PRMUX 20720, indicates that memory request to an MC 20116 cache set currently awaiting a load operation has occurred Input IO Port Select (IOPORTSEL) previously discussed, indicates that IO Port 20910 is selected for service. Input Any Bypass Read (ANYBYRD) indicates that a bypass read operation is being executed (that is a bypass read in the pipeline) while input Operation Read (OPREAD) indicates that a general read operation is being executed by RM 20722. Input Request Active (REQACTIVE) indicates that a memory request is currently being actively serviced. Input Load Active (LOADACT) indicates that LM 20730 is currently actively loading MC 20116's cache. Input I/O Wait Bypass Read (IOWAITBYRD) indicates that a request in IO Port 20910 is currently waiting a bypass read operation. Inputs Any Load (ANYLOAD) and Any Bypass Read (ANYBYRD) discussed above, represent respectively that an MC 20116 cache load operation is to be executed and that a bypass read operation is in the data queue pipeline waiting for data from BC 20114. Input Operation Log Access (OPLOGACCESS) indicates that a memory request requiring access to MC 20116's error log is being serviced. Input Operation Not Bypass Read or Write (OPNOTBYP) indicates that MEM 10112 operation currently being executed does not require a bypass read or write. Input Test Memory Stop Bypass (TMSTOPBYP) indicates that a MEM 10112 test mode is prohibiting bypass read and write operations.

Inputs of CHME 21514 include No Hit (NOHIT) which indicates a request to MC 20116's cache has been made and there has been a cache miss, that is the requested data was not resident in MC 20116's cache. Inputs Test Mode Force Hit (TMFORCEHIT) and Test Mode Force Miss (TMFORCEMISS) indicate, respectively, that a memory test mode is forcing an MC 20116 cache hit or miss. Inputs Operation Sure Hit (OPSUREHIT) and Operation Sure Miss (OPSUREMISS) forces, respectively, the cache miss signal in TCL 21510 to indicate a cache hit or miss.

Referring to inputs of TDN 21520, LOADACT, JOPREVABRT, JIPREVABRT, JOPRESABRT, JIPRESABRT, and NEWREQUEST have been previously discussed, as has TMSTOPBYP. Input Miss Busy (MISSBUSY) indicates that a memory request to MISSC 20726 has been made, that a miss has resulted, and that MC 20116's cache is currently busy with another operation and will not presently be loaded with the required data from MSB 20110. As previously described, these inputs represent current state of certain MEM 10112 operations.

Outputs of TDN 21520, as discussed above, represent conditional actions to be executed by MEM 10112, as determined by previous and present MEM 10112 trailer conditions. Outputs Select LRU Slot Number (SSLRPL) and Select Physical Page Number (SSLPPN) indicate, respectively, that the cache slot referenced will be forced to the least recently used slot number or the slot indicated by the two least significant bits of PPN sourced from INCREG 21211. Output Cache Missed (CACHEMISSED) indicates that a memory request for data in MC 20116's has been submitted, the requested data was not resident therein, and that data must be loaded into MC 20116's cache from MSB 20110 or that a bypass read or write operation may continue. Output Suppress Micro Trailer (SUPMCROTLR) is provided to Gates 21524 to suppress certain MEM 10112 operations selected by RM 20722. Output Suppress Bank Request (SUPBANKREQ) indicates that a read or write request to MSB 20110 is not to be executed. Output Suppress Bypass Read/Write Trailer (SUPBRWTTLR) indicates that a by-pass read or write operation is not be be executed. Output Set Wait Bypass Read (SETWATBYRD) indicates that the current IO Port 20910 request is to be placed in waiting status for a previously initiated by-pass read to complete, as previously discussed with reference to PWF 21312. Output Interrupt (INTERRUPT) indicates that RM 20722 currently servicing a memory request is to be interrupted. Output Stop Bypass Write (STOPBYPWRT) indicates that a current request eligible for by-pass write operation will not by-pass MC 20116's cache. Output Sets Wait Load (SETWATLOAD) indicates that the current operation is to be set in waiting status for an outstanding cache load operation, previously initiated, to be completed. Output Keep Request Valid (KEEPREQVLD), previously discussed, indicates that a current request is to remain valid, that is returned to priority queue but not to be currently executed Inputs to TCR 21522, as previously described, are control signals from RM 20722 indicating certain MEM 10112 operations to be initiated or executed. These inputs include Take IO Data Next (TAKEIODNXT), indicating that upon next system clock cycle a word of write data will be taken from IOS 10116 over IOM Bus 10130. Input Reset Log (RESETLOG) indicates that BC 20114 error log is to be reset as previously discussed. Flip Half Next (FLIPHALFNXT) indicates that FIU 20120 is to execute an operation described in a following description of FIU 20120. Input Cache Read Next (CACHRDNXT) indicates that the next clock cycle is to be a read of MC 20116's cache. Similarly, inputs Cache Write Next (CACHWRTNEXT) indicates the next clock cycle is to be a MC 20116 cache write operation. Input Operation Unload Next (OPUNLDNXT) indicates that the next clock cycle is to unload MC 20116's cache, reading a word from the cache to Write Back File (WBF) 23212 (described below). Input Add Four Next (ADDFOURNXT) is an instruction to INCREG 21210, previously discussed, to increment the address stored therein by 4 words, for example during a MC 20116 cache flush. Input Invalidate Tag Next (INVTAGNXT) is a control signal to MC 20116's cache and will be described further in a following description of MC 20116. Input Read Log (READLOG) indicates that MC 20114's error log is to be read to RDO Bus 20158. Read to FIU Next (RDTOFIUNXT) indicates that a next operation is to be a read to FIU 20120 from MC 20116's cache. Input Word 2 Next (WORD2NXT) is asserted during a cross word boundary read or write and indicates that the second word is to be read or written. Input Check Flush OK (CHKFLUSHOK) is asserted prior to an MC 20116 cache flush operation and indicates that MEM 10112 operating state is to be checked to determine whether a MC 20116 cache flush operation may be executed.

Referring to outputs of TCR 21522, outputs Reset Log (RESETLOG), Data Store Write Enable (DSWE), and Read Log (READLOG) are gated by SUPMCROTLR, described previously with reference to TDN 21520. RESETLOG is a control signal indicating that BC 20114's error log is to be reset. READLOG is a control signal indicating that contents of BC 20114's error log are to be read. DSWE is an enable signal for writing data into MC 20116's Data Store (MCDS) 23220 (described below). Outputs Increment By Four (INCBYFOUR) and Increment By One (INCBYONE) are control signals for incrementing INCREG 21211, INCBYFOUR incrementing MC 20116 address on a block by block basis while INCBYONE increments this address on a word by word basis. These outputs are gated by LCLEAR which is asserted upon execution of a machine clear by DP 10118. Output Take Data (TAKEDATA) initiates acceptance of write data from IOS 10116. Output Flip Half (FLIPHALF) indicates that the FIU 20120 flip half operation is to be executed. Outputs Cache Read Cycle (CACHRDCYC) and Operation Unload Cycle (OPUNLDCYC) indicate, respectively, that MC 20116's cache is to execute a read cycle or is to be read and written to WBF 23212. Output Invalidate (INVALIDATE) indicates that an MC 20116 cache tag store entry is to be invalidated. Read Input Data Load (RIDLD) indicates that read data from MC 20116's cache is to be loaded into FIU 20120. Output Word Two (WORD2) indicates that the second word of a cross word boundary read or write operation is to be read or written. Output OK To Flush (OKTOFLUSH), previously discussed, indicates that an MC 20116 cache flush operation may be executed. This output is fed back to an input of TCR 21522 to sustain this operating state until MC 20116's cache has been completely flushed.

Having described the structure and operation of RM 20722 and associated Trailer Control Logic 21510, other subsidiary MIC 20122 control will be described next below, starting with Miss Control (MISSC) 20726.

c.c. Miss Control 20726 (FIG. 216)

Figure 216:
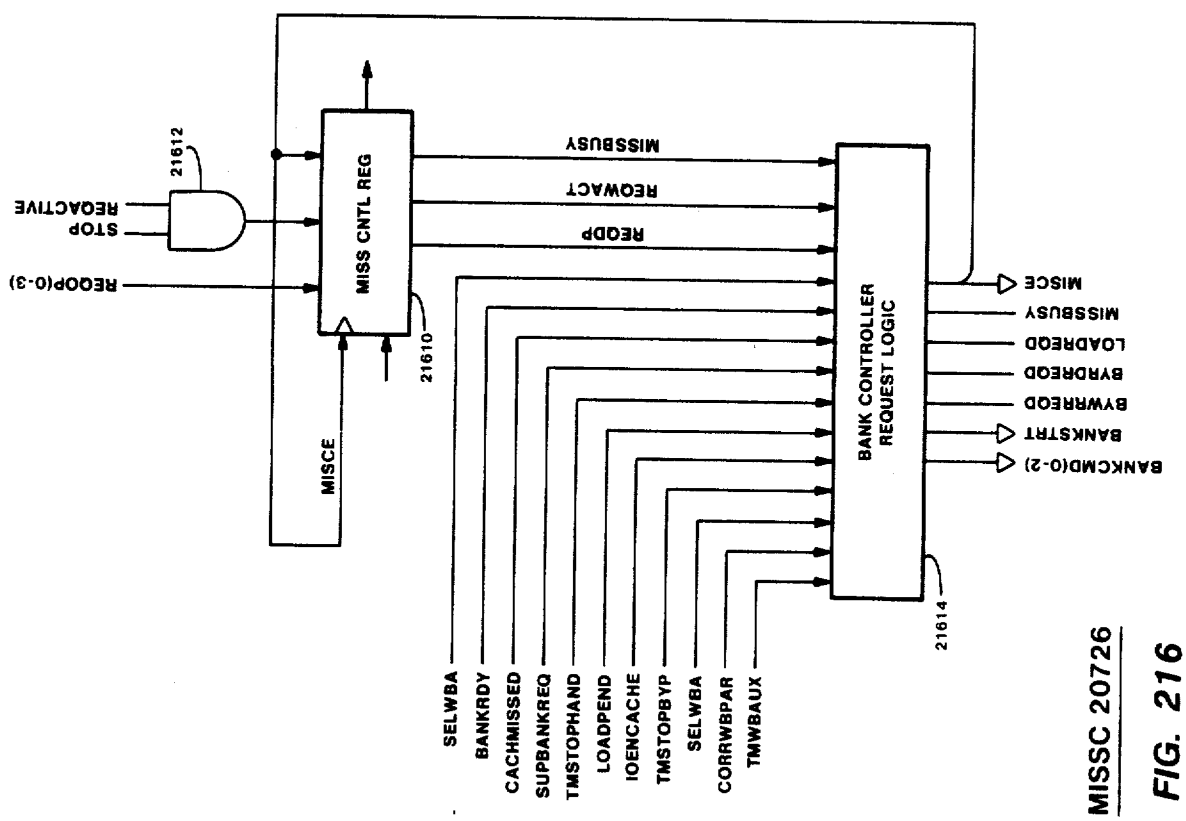
FIG. 216 is a detailed block diagram of memory miss control logic.

Referring to FIG. 216, MISSC 20726 is shown. MISSC 20726 includes Miss Control Register (MISSCTRLR) 21610, with associated Gate 21612, and Bank Controller Request (BCRL) 21614. MISSCTRLR 21610 may be comprised of, for example, SN74S194 registers, Gate 21612 may be comprised, for example of, compatible gates, and BCRL 21614 may, for example, be comprised of 82S131 PROMs. Also included in MISSC 20726 is a Miss Address Register (MISADR). MISSC 20726's MISADR is functionally a part of both MISSC 20726 and MC 20116's cache and resides in MC 20116. Operation of MISSC 20726's MISADR with respect to MISSC 20726 will be described in the following description of MISSC 20726 and will be further described in a following description of MC 20116.

Interconnections between MISSCTRL 21610, Gate 21612, and BCRL 21614 are indicated in FIG. 216 and will not be described further. Interconnections between MISSC 20726 and other portions of MEM 10112 are indicated by signal names appended to inputs and outputs of MISSC 20726. These inputs and outputs will be individually described in the following description of MISSC 20726 operation.

As previously described, all data reads from MEM 10112 to JP 10114 or IOS 10116, with exception of bypass reads, are through MC 20116's cache. A MC 20116 cache miss will, however, occur if the data referenced on a particular memory read request is not resident in MC 20116's cache. Upon occurence of such a cache miss, MISSC 20726 provides certain control signals, described below, to MB 20114 to transfer the requested data from MSB 20110 to MC 20116's cache. As will also be described below, MISSC 20726 also generates control signals, pertaining to cache misses, to RQ 20728 and BR/WC 20718.

MISSCTRLR 21610 and MISSC 20726's MISADR together comprise a trap register for capturing information pertaining to memory read requests resulting in MC 20116 cache misses. As indicated in FIG. 216, data inputs to MISSCTRLR include REQOP from PRMUX 20720, indicating the type of operation to be performed by MEM 10112 in servicing a currently active request, and Miss Enable (MISCE) from BCRL 21614 indicating whether MISSCTRLR 21610 and MISSC 20726's MISADR can be loaded or must hold its present contents. As will be described shortly, MISCE is also provided as of enable input to MISSCTRLR 21610. Input REQACTIVE to Gate 21612 indicates whether a memory request is currently active and being serviced in MEM 10112. REQACTIVE is gated together with STOP in Gate 21612 and STOP will sychronize BC 20114 with MIC 20122 when MEM 10112 is in single pulse test and diagnostic mode. Gate 21612's output to MISSCTRLR 21610 therefore indicates whether a memory request is currently active and being serviced in MEM 10112 and MIC 20122 is receiving a system clock this cycle. MISSCTRLR 21610 is clocked on each system clock cycle so as to receive and store REQOP of the memory request currently active, current state of its own load enable (MISCE), and whether a memory request is currently active in MEM 10112. Upon occurrence of an MC 20116 cache miss, Cache Missed (CACHMISSED) input to BCRL 21614 may result in assertion of MISCE output of BCRL 21614 which, in turn, disables MISSCTRLR. MISSCTRLR 21610 will therefore trap and store REQOP of the memory request resulting in the MC 20116 cache miss, the fact that a memory request was active, and the block address in MC 20116's MISADR, and the fact that MISSC 20726 was not at that time busy servicing an MC 20116 cache miss. This information trapped in MISSCTRLR 21610 is provided to BCRL 21614 as, respectively, outputs REQOP, Request Was Active (REQWACT), and Miss Control Busy (MISSBUSY).

MISSC 20726's MISADR, located in MC 20116, is connected from TSA Bus 21210 from PRMUX 20720. MISSC 20726's MISADR thereby receives and stores page and block address fields of each memory request as service of that request is started. Upon occurrence of an MC 20116 cache miss, MISSC 20726's MISADR will trap and store page and block address fields of the memory request resulting in an MC 20116 cache miss.

MISSC 20726 will use information stored in MISSCTRLR 21610 and MISSC 20726's MISADR together with other inputs to BCRL 21614, to generate a request to BC 20114 to transfer the required data from MSB 20110 to MC 20116's cache or to bypass the cache on bypass reads and writes. This request will include a request to BC 20114 along with certain control information provided to LP 20724 and RQ 20728 which is required for correct servicing of MISSC 20726's request to BC 20114. MISSC 20726's request to BC 20114 will include the address, that is block and page fields, of the required data from MISSC 20726's MISADR plus outputs Bank Command (BANKCMD) and Bank Start (BANKSTART) from BCRL 21614. BANKCMD is a three bit code determining what operation by BC 20114 is required while BANKSTART is a request to MC 20114 to execute the requested operation. BANKCMD and BANKSTART are gated by Miss Valid (MISSVALID) in BCRL 21614. MISSVALID is an enable signal which is true if the MC 20116 cache miss indicated by CACHEMISSED occurred during an inactive cycle of RM 20722 wherein SUPBANKREQ trailer condition is not asserted and CACHMISSED is asserted. MISSVALID thereby enables BCRL 21614's request to BC 20114 if a cache miss did occur and the memory request resulting in a cache miss was suppressed by a trailer condition.

Certain Requests which BCRL 21624 may submit to BC 20114, and the corresponding BANKCMD (0-2) codes, are:

(1) BANKCMD=000: this command is reserved for future assignment;

(2) BANKCMD=001: read data is to be loaded into MC 20116's cache;

(3) BANKCMD=010: read data is to be loaded into MC 20116's cache but ERCC errors detected by BC 20114 are not to be loaded into BC 20114's error log; or bad parity is to be generated to correspond to multiple bit ECC errors.

(4) BANKCMD=011: read data from MSB 20110 is to bypass MC 20116's cache;

(5) BANKCMD=100: read data read from MSB 20110 is to bypass MC 20116's cache and ERCC errors detected by BC 20114 are not to be entered in BC 20114's error log or load parity is to be generated;

(6) BANKCMD equals 101: perform a write to MSB 20110 from MC 20116's write back file while ignoring parity errors (this command is used for repair block operation);

(7) BANKCMD equals 110: write to MSB 20110 from BYF 20118; and, (8) BANKCMD equals 111: write to MSB 20110 from MC 20116's write back file.

Concurrently with submission of BCRL 21614's request to BC 20114, BCRL 21614 generates signals Bypass Read Requested (BYRDREQ) and Load Cache Requested (LOADREQD) to RQ 20724 and Bypass Write Requested (BYWRREQD) to WC 20718. BYRDREQD and LOADREQD are stored in 20728 for subsequent use by LM 20730, described below, to determine whether to load the requested data from MSB 20110 and to MC 20116's cache or to pass this data off to JP 10114 or IOS 10116 directly. BYWRREQD is asserted when block write from IOS 10116 will bypass MC 20116's cache and MSB 20110 will accept write data from MC 20116's BYF 20118 rather than from MC 20116's WBF 23286.

BC 20114 indicates whether it is currently able to accept a request from MISSC 20726 through input Bank Ready (BANKRDY). BC 20114 indicates that it is ready to accept a request by asserting BANKRDY. SELWBA may be asserted, for example, when MISSC 20726 is engaged in writing back data from MC 20116's cache to MSB 20110 to make space available in MC 20116's cache for data to be written from MSB 20110 in response to an earlier cache miss. SELWBA selects the source of address and command to be BC 20114 by selecting either MISSC 20726's MISADR or MC 20116's Write Back Address Register (WBAR), described below. If BC 20114 does accept the request from MISSC 20726, as indicated by assertion of BANKRDY and non-assertion of SELWBA, MISSC 20726 will drop that request as it is accepted by BC 20114 and be free to accept a subsequent cache miss. If BC 20114 is not ready to take another request, for example is taking a write back request, MISSC 20726 will continue to lock MISSCTRLR 21610, through MISCE, and assert Miss Busy (MISSBUSY), indicating that MISSC 20726 is not currently free to accept a cache miss. When BC 20114 subsequently accepts MISSC 20726's request, MISSBUSY will be dropped and MISSCTRLR 21610 is able to accept subsequent cache misses. If RM 20722 receives an MC 20116 cache miss, and attempts to use MISSC 20726 while MISSBUSY is asserted, that memory request resulting in that subsequent cache miss will be interrupted and the port containing that memory request will re-enter priority queue for subsequent service.

Certain other inputs to BCRL 21614, not previously discussed, affect generation of MISSC 20726's request to BC 20114, and MISSC 20726's outputs to RQ 20728 and BY/WC 20718. Test Mode Stop Handoff (TMSTOPHAND) affects outputs BYRDREQD and LOADREQD. TMSTOPHAND, by affecting these outputs, indicates that MC 20116 is to be inhibited from handing off the data read from MSB 20110 when that data is read into MC 20116's cache. TMSTOPHAND may be asserted, by DP 10118 during diagnostic tests. Load Pending (LOADPEND) prevents a second load MC 20116 cache load operation from being initiated while a previous MC 20116 cache load operation is present in RQ 20728. Because the present embodiment of MEM 10112 accommodates only one level of miss information to be stored at a time, two outstanding loads are not permitted. IO Encache (IOENCACHE), previously discussed, indicates that IOS 10116 has requested that certain data be encached and modifies a bypass read or write request into a MC 20116 cache read or write. Test Mode Stop Bypass (TMSTOPBYP) is used to test MEM 10112, in particular MC 20116. TMSTOPBYP inhibits initiation of a bypass read or write operation and modifies such an operation into a cache read or write. Input Correct Write Back Parity (CORRWBPAR) is asserted by RM 20722 as part of a repair block operation. Such an operation may be executed as part of a write back operation to transfer data from MC 20116's cache to MSB 20110 in response to a Repair Block request. When CORRWBPAR is asserted, the write back operation is performed but parity errors ignored and correct ERCC generated. Input Test Mode Write Back Auxiliary (TMWBAUX) is a test signal used in de-bugging operations and again alters a write back operation performed by BC 20114. When TMWBAUX is asserted, a sequence of reads to MC 20116's cache is performed rather than a sequence of writes in response to a Cache Flush request. This allows MEM 10112 to exercise MSB 20110, in a particular MA's 20112 at a higher rate than can be achieved by submitting read and write requests through IO Port 20910, JPO Port 21010, and JPI Port 21110.

Having described structure and operation of MISSC 20726, structure and operation of RQ 20728 will be described next below.

d.d. Read Oueue 20728 (FIG. 217)

Figure 217:
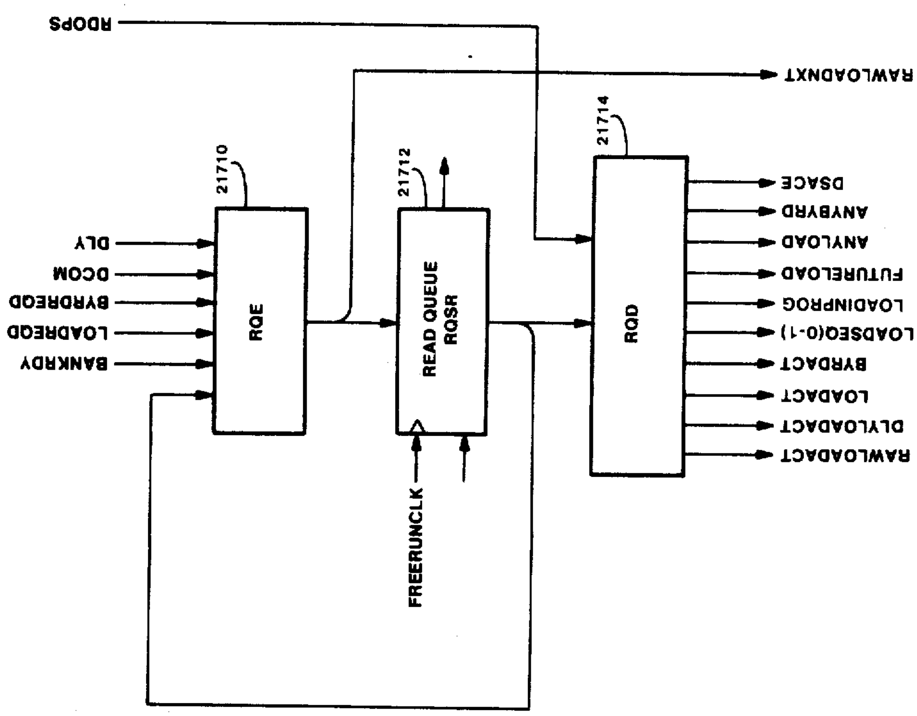
FIG. 217 is a detailed block diagram of memory read queue logic.

Referring to FIG. 217, Read Queue (RQ) 20728 is shown. RQ 20728 includes Read Queue Encoding Logic (RQE) 21710, Read Queue Stack Registers (RQSR) 21712, and Read Queue Decoding (RQD) 21714.

RQE 21710 may be comprised, for example, of 82S131 PROMs and RQD 21714 may be comprised of, for example, SN74302s and SN74S00s. RQSR 21712 may be comprised of, for example, SN74S194 registers.

As previously described, MEM 10112 may be capable of pipelining up to three concurrent memory requests. Each of these requests may require data to be read from MSB 20110, for example in loading MC 20116's cache upon occurrence of a cache miss or in bypass reads to JP 10114 or IOS 10116. In general, BC 20114 will honor requests for data to be read from MSB 20110 in the order in which those requests are submitted to BC 20114. RQ 20728 comprises a three level stack for storing the information pertaining to each of up to three sequential read requests made to BC 20114. Information stored in RQ 20728 determines what operations are to be performed by MEM 10112 in handling requested data from MSB 20110 when data corresponding to a particular request is read from MSB 20110 by BC 20114. This stack is a First-In-First-Out (FIFO) queue. The kind of operation required for handling data read from MSB 20110 responds to a particular request is determined when that request is submitted to BC 20114 and is loaded into RQ 20728 at that time. Each level of RQ 20728's stack contains two entries. One entry indicates that, for a particular request, data read from MSB 20110 is to be written into MC 20116's cache. The other entry indicates that, for a particular request, data read from MSB 20110 is to be passed directly to IOS 10116 in a bypass read operation. Only one of these two entries may be asserted in any given RQ 20728 stack level. That is, a single stack level entry may not both indicate that the data is to be read into MC 20116's cache and that the data is to be bypassed read to the requestor. If the entry says that the data is to be loaded into MC 20116's cache, Load Pointer (LDPTR) 20724 may indicate that the block or one word may be passed to the requestor in addition to loading MC 20116's cache. In addition, in the above discussion of MISSC 20726 it was indicated that MEM 10112 may handle only one cache load in the pipeline at a time. As such, only one RQ 20728 stack level at a time may contain an entry asserting that the data read from MSB 20110 is to be read into MC 20116's cache.

RQSR 21712's three stack levels are referred to as Top entry level, Next entry level, and Active entry level. Active level is the bottom level of RQSR 21712's stack. Active level determines the kind of operation currently being performed by MEM 10112 on data being delivered from MSB 20110. Information stored in Active level indicates either of two MEM 10112, and in particular MIC 20722, operating states. First is Load Active (LOADACT) and second is Bypass Read Active (BYRDACT). These two states indicate respectively that MEM 10112 is performing an operation to load MC 20116's cache or to perform a bypass read operation. Next Level indicates an MEM 10112 operation to be performed upon next appearance of data from MSB 20110. Next level indicates states Load Next Queue (LOADNEXTQ) and Bypass Read Next Queue (BYRDNEXTQ). LOADNEXTQ and BYRDNEXTQ respectively indicate that, upon next read of data from MSB 20110, MEM 10112 is to load that data into MC 20116's cache or to perform a bypass read operation. Top entry level represents the most recent entry in RQSR 21712. Top entry level indicates states Load Entering Queue (LOADENTERQ) and Bypass Read Entering Queue (BYRDENTRQ). Information stored in Top entry level indicate a type of operation associated with the most recent request, that is the most recent request of a sequence of requests, presented to BC 20114. LOADENTERQ and BYRDENTRQ respectively indicate that the most recent request to BC 20114 has been for data to be used by MEM 10112 in performing an MC 20116 cache load operation or a bypass read operation. Data appearing in response to a BC 20114 request represented in RQSR 21712's top entry level will be provided from MSB 20110 after data appearing in response to a request represented in next entry level has appeared.

A particular request will enter RQSR 21712's stack when a request is made to BC 20114, for example MISSC 20726 as described above. BC 20114's acceptance of request is indicated to RQ 20728 by assertion of Input Bank Ready (BANKRDY) to RQE 21710 by BC 20114. Each entry in a RQSR 21712 stack level will move down to next lower stack level when BC 20114 indicates to RQ 20728 that data is being read from MSB 21010 in response to a request in RQSR 21712. BC 20114 indicates to RQ 20728 that such data being read from MSB 20110 by asserting input Data Coming (DCOM) to RQE 21710. A higher level request entry will move down to an empty (no operation specified) level, with the condition that no entry will move down to active entry level until DCOM is asserted by BC 20114.

Referring to other inputs of RQ 20728, inputs LOADREQD and BYREQD, previously discussed, to RQ 21710 indicate, respectively, whether a data request to BC 20114 is for an MC 20116 cache load or for a bypass read operation. As previously described, BC 20114 includes error correction circuitry for correcting errors in data read from MSB 20110. As will be described further in a following description, such an error correction operation by BC 20114 results in a one system clock cycle delay in the data read from MSB 20110. If such an operation results in reading data from MSB 20110 in response to a BC 20114 request in RQ 20728, BC 20114 will assert DCOM to indicate that data will be appearing, and input Delay (DLY) to RQE 21710 to indicate that that data will be delayed by one clock cycle. DLY is asserted on the clock cycle when the data word being corrected would have been available from BC 20114 and remains asserted until the block transfer is complete. Finally, Read Data Output Strobe (RDOPS) to RDQ 21714 is provided from BC 20114 to indicate that read data from MSB 20110 is present on RDO Bus 20158. RDOPS is a data confirmation signal preventing initiation of a MC 20116 cache load or bypass read operation with invalid data.

Referring now to outputs of RQ 20728, these outputs indicate what operation MEM 10112 is to perform, that is a cache load or bypass read, with respect to data presently being read from MSB 20110 through BC 20114. These outputs are provided to LM 20730, described below, LP 20724, BR/WC 20718, and RM 20722. RM 20722 receives Load Active (LOADACT), indicating that MEM 10112 is to perform an MC 20116 cache load operation with respect to data currently being read from MSB 20110. RM 20722 also receives, from RQE 21710, Raw Load Next (RAWLOADNXT) that, without further qualification, interrupts RM 20722 so that MC 20116's cache may be used for loading. LM 20730 and LP 20724 both receive LOADACT and input Any Load (ANYLOAD). ANYLOAD trailer condition indicates that an MC 20116 cache load request is present in RQ 20728 and is used in inhibiting subsequent cache load operations from being requested because, as described above, MISSC 20726 will accept only one cache miss, and thus cache load operation, at a time. BR/WC 20718 receives outputs LOADACT and Bypass Read Active (BYRDACT) from RQD 21714. LOADACT has been described above. BYRDACT indicates to BR/WC 20718 that MEM 10112 is executing a bypass read operation with respect to the data currently being read from MSB 20110. As will be described below, LM 20722 stores address information regarding blocks of data to be read into MC 20116 cache from MSB 20110. Output Load Sequence (0-1) (LOADSEQ(0-1) of RQD 21714 is provided as a state machine address to LM 20730 to identify to LM 20730 which of a sequence of control signals to generate. LM 20730 in turn uses LOADSE0(0-1) information to identify the corresponding word address of the block of data being written into MC 20116's cache.

Other outputs of ROD 21714 are provided to PC 20716 to control operation of PC 20716. These outputs include Load In Progress (LOADINPROG), indicating the MEM 10112 is executing a MC 20116 cache load operation, and Future Load (FUTURELOAD) indicating that some point in the future MEM 10112 will perform an MC 20116 cache load operation. Outputs Any Load (ANYLOAD) and Any Bypass Read (ANYBYRD) indicate that RQ 20728 contains, respectively, an MC 20116 load request and a bypass read request. Output Data Store Address Chip Enable (DSACE) of RQD 21714 is, as will be described in a following description, an addressing enable signal to MC 20116's cache and is used therein to enable addressing of that cache.

Having described the structure and operation of RQ 20728, structure and operation of Load Manager (LM) 20730 will be described next below. Operation of LM 20730 is tightly coupled with the operation of LP 20724, previously described, and RQ 20728, just described. For this reason, FIGS. 212 and 217, respectively showing LP 20720 and RQ 20728, should be referred to during the following description.

e.e. Load Manager 20730 (FIG. 213)

Figure 218:
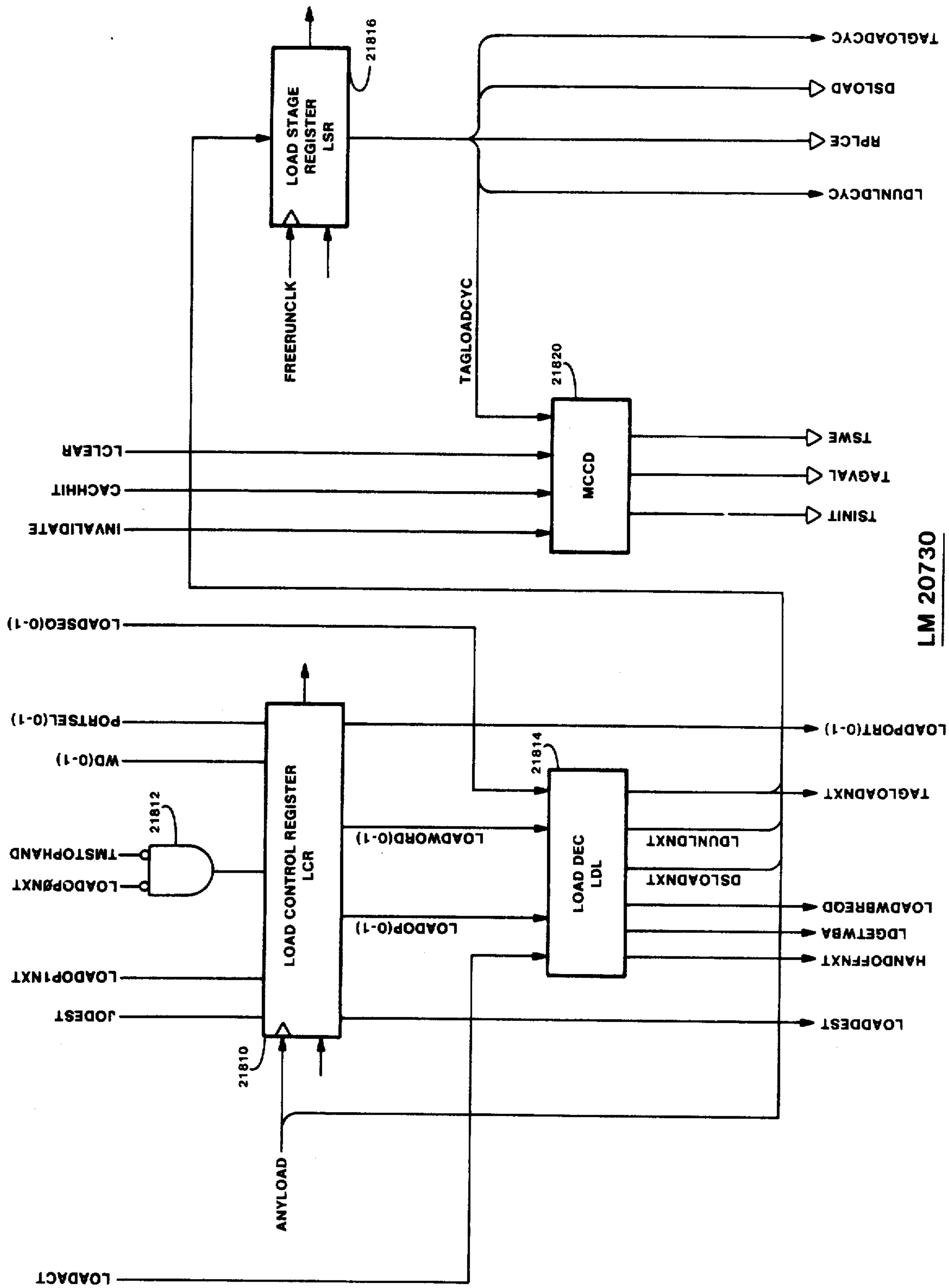
FIG. 218 is a detailed block diagram of memory load manager logic.

Referring to FIG. 218, Load Manager (LM) 20730 is shown. LM 20730 includes Load Control Register (LCR) 21810 with associated input Gate 21812 and Load Decode Logic (LDL) 21814. LCR 21810, Gate 21812, and LDL 21814 may be comprised of, for example, SN74S194 registers, SN74S02 gates, and 82S131 PROMs. Also included in LM 20730 is Load Stage Register (LSR) 21816 and MC 20116 Cache Decode Logic (MCCD) 21820, comprised, for example, of SN74S194 registers and SN74S51 gates. Inputs to and outputs from LM 20730 and other portions of MEM 10112, in particular MIC 20127, are indicated as previously described by signal names appended to inputs and outputs of LM 20730. As indicated in FIG. 218, LCR 21810 receives certain data and enable inputs from MEM 10112 sources external to LM 20730, certain of which are gated through Gate 21812 which provides in turn a data input to LCR 21810. LCR 21810 provides certain outputs to MEM 10112's circuitry external to LM 20730, and certain inputs to LDL 21814. LDL 21814, as just stated, receives inputs from LCR 21810, with other inputs from sources external to LM 20730. LDL 21814 provides outputs to other portions of MEM 10112 and data inputs to LSR 21816. LSR 21816 provides control signal outputs to portions of MEM 10112's circuitry external to LM 20730, and an input to MCCD 21820. In addition to an input from LSR 21816, MCCD 21820 receives inputs from sources external to LM 20730 and in turn provides outputs to, in particular MC 20116.

As stated above, operation of LM 20730 is closely related to operation of LP 20724 and RM 20722. In general, LM 20730 is responsible for handling data that is read from MSB 20110 by BC 20114 in response to requests for MC 20116 cache load operations and bypass read operations. LM 20730 may direct the data read from MSB 20110 be loaded into MC 20116's cache, that this data be passed to IOS 10116 in a bypass read operation, or that the data may be both loaded into MC 20116's cache while concurrently transferred as a word or block to the requestor, that is a handoff operation. LM 20730 also controls writing back to MSB 20110 of dirty blocks that have been displaced from MC 20116's cache to make room for a new block to be loaded in response to MC 20116 cache miss.

Referring first to LCR 21810, LCR 21810 data inputs receive information describing what MEM 10112 operations are to be performed in regard to data read from MSB 20110 in response to memory request calling for a bypass read or resulting in a MC 20116 cache miss and subsequent cache load operation. Data inputs to LCR 21810 provide information indicating what operation is to be performed by LM 20722 in servicing data read from BC 20114 to be loaded into MC 20116's cache and is provided to LCR 21810 during servicing of a present memory request. This information is transferred into LCR 21810 by enable signal ANYLOAD, previously discussed, at start of any MEM 10112 operation. Input JO Port Destination (JODEST) is provided from PRMUX 20720, previously described. JODEST determines, for each JPO Port 21010 read request, whether the requested data is to be provided to FU 10120 or EU 10122. Input Load Operation One Next (LOADOP1NXT) to LCR 21810 and Load Operation 0 Next (LOADOP0NXT) to Gate 21812 are provided from RM 20722. As previously described, each memory request includes a two bit upcode field describing what operation is to be performed by MEM 10112. LOADOP1NEXT and LOADOP0NXT are a corresponding two bit code provided by RM 20722 and describe, to LM 20730, what operation is to be performed by MEM 10112 with regard to the next data item to be read from MSB 20110. LOADOP0NXT is gated together with Test Mode Stop Handoff (TMSTOPHAND) in Gate 21812 to inhibit execution of handoff operations during MEM 10112 test as previously described. LCR 21810 provides two bit output LOADOP(0-1) corresponding to LOADOP0NXT and LOADOP1NXT and indicates what operation is to be performed with regard to the 4 word block being presently read from MSB 20110.

Input WD(0-1) to LCR 21810 is provided from WD Bus 21212 from PRMUX 20720, previously described.

Also as previously described, all data read operations from MSB 20110 are in the form of four word blocks. In handoff word-read operations, input WD(0-1) to LCR 21810 is used as a word within block address to select which particular word of the four word block presently being read from MSB 20110 is to be read to the requestor. Output LOADWORD(0-1) of LCR 21810 corresponds to input WD(0-1) and is word within block address of the word to be read out to requestor during a handoff word-read operation currently being executed by MEM 10112. During handoff operations or MC 20116 cache load operations, LOADSEQ(0-1) input to LDL 21814 is used as word within block address to successively transfer the four words of the block into MC 20116's cache. Input LOADACT to LDL 21814, like input LOADOP(0-1) from LCR 21810, indicates what operation is to be performed by MEM 10112. In this case, LOADACT indicates that MEM 10112 is to initiate a MC 20116 cache load operation with the data block currently being read from MSB 20110.

Finally, input PORTSEL(0-1) to LCR 21810 is provided from RPSR 21324 of Request Priority Selection Logic 21314, previously described. PORTSEL(0-1) is a two bit code indicating which of IO Port 20910, JPO Port 21010, and JPI Port 21110 is currently being serviced. Load Port(0-1) (LOADPORT(0-1)) output of LCR 21810 corresponds to input PORTSEL(0-1) and indicates which of these ports is to have its wait flag or request flag reset and, on handoff operations, which port is to receive read data.

Referring now to outputs of LCR 21810 and LDL 21814 to other parts of MEM 10112, Load Destination (LOADDEST) corresponds to JODEST. LOADDEST indicates whether FU 10120 or EU 10122 is to receive data currently being read from MSB 20110. Output Handoff Next (HANDOFFNXT) from LDL 21814 indicates to Port Request State Logic (PRS) 21310, previously described, that a data word is to be transferred to the appropriate requestor on the next clock cycle. Output Load Get Write Back Address (LDGETWBA) is provided to TCR 21522 and TCL 21510 to indicate that a write back address will be written into MC 20116's Write Back Address Register from tag store of MC 20116's cache. LDGETWBA may occur, for example, when it is necessary to write a block of data from MC 20116's cacher to MSB 20110 to free cache space for the block currently being read from MSB 20110. Similarly, output Load Write Back Requested (LOADWBREQD) is provided to BC 20114 to indicate that a write back of data from MC 20116's cache to MSB 20110 is required as part of a MC 20116 cache load operation. Output Tag Load Next (TAGLOADNXT) is provided to MC 20116, as described further in a following description of MC 20116, to indicate that the tag store is to be loaded on the next clock cycle with the address of the new block of data being loaded into the cache. Output Load Port(0-1) (LOADPORT(0-1)) is provided to PRS 21310 to indicate which port of IO Port 20910, JPO Port 21010, and JPI Port 21110 had submitted a memory request requiring a MC 20116 cache load operation, in order to handoff data or reset the request valid flag.

LDL 21814 provides two outputs, Data Store Load Next (DSLOADNXT) and Load Unload Next (LDUNLDNXT) to LSR 21816. DSLOADNXT indicates that during the next memory request service a data word from MSB 20110 will be written into Memory Cache Data Store (MCDS) 23220 (described below). LDUNLDNXT indicates that during next clock cycle a data word from MCDS 23220 is to be transferrred to Write Back File (WBF) 23212 (described below). Other inputs to LSR 21816 are TAGLOADNXT and ANYLOAD, both of which have been previously described.

LSR 21816 is a staging register used for pipelining of commands and instructions from LM 20730. Inputs to LSR 21816 have been described above. Outputs of LSR 21816 include Load Unload Cycle (LDUNLDCYC), indicating that a data word is to be transferred from MCDS 23220 to WBF 23212 during the current clock cycle. Output Data Store Load (DSLOAD) is provided to MC 20116 to indicate that a data word is to be written into MCDS 23220 during the current clock cycle. Output Tag Load Cycle (TAGLOADCYC) is provided to MC 20116, as described further in a following description, to load a new block address into Memory Cache Tag Store (MCTS) 23214 (described below). Output Replace Chip Enable (RPLCE) is also provided to MC 20116 to control the loading of Least Recently Used Logic (LRUL) 23224 replacement register, described below.

Referring finally to MCCD 21820, MCCD 21820 provides certain control signals to MC 20116 for control of MC 20116's cache. The functions of these control signals will be described further in a following description of MC 20116 but will be briefly summarized here. Inputs to MCCD 21820 include TAGLOADCYC, previously discussed. Input Invalidate (INVALIDATE) is provided from RM 20722 during cache invalidation operations and the address tag store entry is to be marked invalid. Input Cache Hit (CACHHIT) is provided from MC 20116 and indicates that data referred to in a memory read request has been found to be resident in MC 20116's cache. Input LCLEAR, previously described, is a general CS 10110 clear command from DP 10118 and, in this case, may initiate clearing of MC 20116's cache.

Outputs of MCCD 21820 include Tag Store Initiate (TSINIT), Tag Valid (TAGVAL), and Tag Store Write Enable (TSWE) as will be described further in a following description of MC 20116, TSINIT and TSWE respectively clears 4 tag slot entries and enable writing of addresses into MC 20116's tag store. TAGVAL indicates that, upon a particular tag store write, the corresponding MC 20116 tag entry is to be marked invalid.

f.f. Bypass Write and Cache Write Back Control 21910 (FIG. 219)

Figure 219:
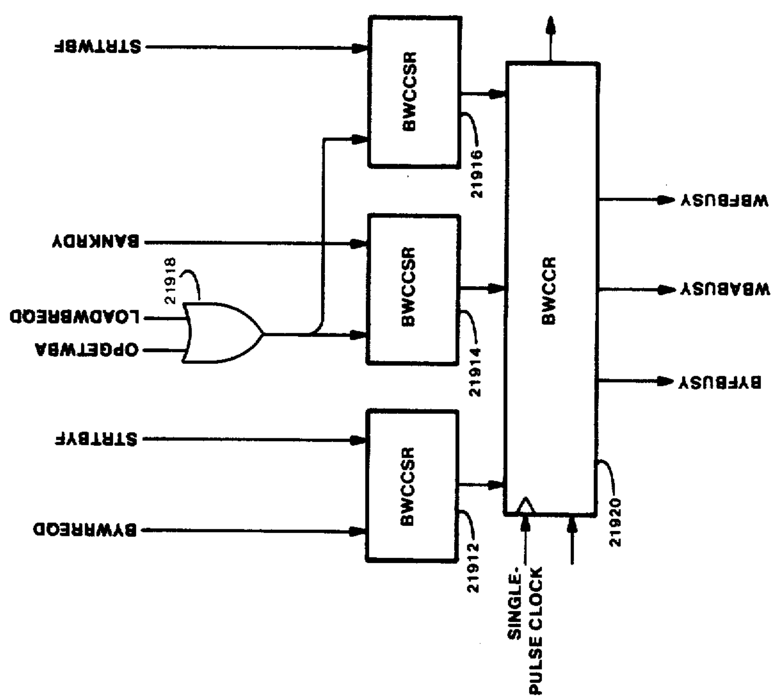
FIG. 219 is a detailed block diagram of memory bypass write and cache write control logic.

Referring to FIG. 219, Bypass Write and Cache Write Back Control (BWCC) 21910 is shown. BWCC 21910 is generally associated with LM 20730 and generates certain signals regarding bypass write and write-back operations which are used by other portions of MIC 20122 circuitry in controlling bypass write and data write back operations. As indicated in FIG. 219, BWCC 21910 includes BWCC Status Registers (BWCCSRs) 21912, 21914, and 21916. BWCCSRs 21912, 21914, and 21916 receive certain bypass write and data write back status signals from other portions of MIC 20122 circuitry, either directly or through Gate 21918. BWCCSRs 21912 to 21916 in turn provide encoded status outputs (flags) to BWCC Register (BWCCR) 21920. BWCCR 21920 in turn provides outputs, to other portions of MIC 20122 circuitry, regarding bypass write and data write back operations currently being performed by MEM 10112.

Outputs provided by BWCC 21910 from BWCCR 21920 include Bypass File Busy (BYFBUSY); Write Back Address Busy (WBABUSY), and Write Back File Busy (WBFBUSY). BYFBUSY indicates that BYF 20118 currently contains valid write data to be written into MSB 20110. WBABUSY indicates that MC 20116's WBAR currently contains a valid address corresponding to data in WBF 20118 to be written into MSB 20110 in connection with a cache load operation. WBFBUSY indicates that WBF 20118 currently contains valid data to be written from MC 20116's cache to MSB 20110 in connection with a cache load operation.

Inputs to BWCCSR 21912, which provides BYF Busy Flag (BYFBUSY), include Bypass Write Requested (BYWRREQD) from BCRL 21614 and Start Bypass File (STRTBYF) from BC 20114. BYWRREQD indicates that RM 20722 has submitted a bypass write request to BC 20114 via MISSCTRL 20726. STRTBYF indicates that BC 20114 has accepted the bypass write request and that BYF 20118 is now free for reuse by another bypass write operation. BYWRREQD sets BYFBUSY, STRTBYF resets BYFBUSY.

Inputs to BWCCSR 21914 which provides WBA Busy Flag (WBABUSY), include Operation Get Write Back Address (OPGETWBA) and Load Write Back Requested (LOADWBREQD) the former from RM 20722, the latter from LM 20720, and which are gated together in Gate 21918. Another input to BWCCSR 21914 is Bank Ready (BANKRDY) from BC 20114. LOADWBREQD indicates that LM 20720 is loading WBAR with the write back address corresponding to the write back operation of data from MC 20116 to MSB 20110 in association with a cache load operation. OPGETWBA indicates that RM 20722 is loading the WBAR from tag store with a write back address corresponding to the write back of data from MC 20116 to MSB 20110 in association with a repair block or cache flush operation. BANKRDY indicates that BC 20114 has accepted a request to execute this operation and that the WBAR can now be reused again. LOADWBREQD and OPGETWBA set WBABUSY while BANKRDY resets WBABUSY.

Inputs to BWCCSR 21916, which provides WBF Busy Flag (WBFBUSY), include the output of Gate 21918, that is gated signals OPGETWBA and LOADWBREQD, as just discussed. Input STRTWBF is provided from BC 20114. STRTWBF indicates that BC 20114 has begun to execute a request for write back operation and that WBF 20118 is now free to be reused. OPGETWBA or LOADWBREQD sets WBFBUSY to protect the valid contents of WBF 20118, while STRTWBF resets WBFBUSY.

g.g. Write Back Control Logic 22010 (FIG. 220)

Figure 220:
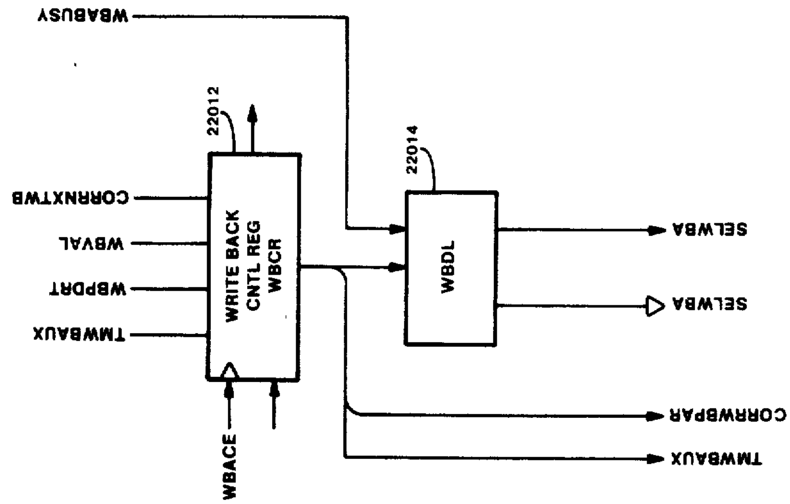
FIG. 220 is a detailed block diagram of memory writeback control logic.

Referring to FIG. 220, Write Back Control Logic (WBCL) 22010 is shown. WBCL 22010 is associated with LM 20730 and BWCC 21910 and generates certain control signals used in execution of write back operations of data from MC 20116's cache to MSB 20110. WBCL 22010 includes Write Back Control Register (WBCR) 22012 and Write Back Decision Logic WBDL 22014. WBCR 22012 in turn provides certain outputs to WBDL 22014 and to other portions of MIC 20122 circuitry. WBDL 22014 also receives WBABUSY from BWCC 21910. WBDL 22014 then provides address selection signals to MC 20116's cache, selecting either the WBAR or Miss Address Register (MISAR), described below. These signals also generate write back requests to BC 20114 via MISCTRL 20726. WBCR 22012 and WBDL 22014 may, for example, be respectively comprised of SN74S194 registers and gates such as SN74S00s and SN74S02s.

Outputs of WBCL 22010 included Select Write Back Address (SELWBA) outputs from WBDL 22014. A first SELWBA output is used within MIC 20122, for example, by MISCTRL 20726, to generate yet further control signals directing selection of a write back address by BC 20114 in execution of a write back operation. The second SELWBA output is provided to, for example, MC 20116 directly to indicate that a write back address for use in a write back operation is to be selected. WBCL 22010 also provides outputs Test Memory Write Back Auxiliary (TMWBAUX) and Correct Write Back Parity (CORRWBPAR) from WBCR 22012. TMWBAUX and CORRWBPAR are used, for example, by MISCTRL 20726 as previously described. TMWBAUX, as previously described, is used in certain memory test operations to control execution of write back operations in testing BC 20114 and MCB 20110. CORRWBPAR, also previously described, indicates that, in each block transferred during the requested write back operation, parity errors are to be corrected. CORRWBPAR may, for example, be asserted in case of a write back operation executed for a repair block and MC 20116 cache flush operation.

Referring now to inputs of WBCL 22010, WBABUSY is, as previously stated and previously discussed with reference to BWCC 21910, provided to WBDL 22014 to indicate that a write back operation is desired if it is appropriate to do so. WBABUSY is effectively an enable signal for WBDL 22014 to generate SELWBA outputs. Inputs to WBCR 22012 include TMWBAUX from MC 20116 which, as previously discussed, indicates that an MEM 10112 test operation is to be performed. Input Write Back Parity Dirty (WBPDRT) is provided from MC 20116 and indicates that the dirty bit associated with a particular block being displaced from MC 20116's cache is asserted. As such, that particular block must be written back to MSB 20110 to replace a previous copy of that block already resident in MSB 20110. Input Write Back Valid (WBVAL) is similarly provided from MC 20116 and indicates that the validity bit of a particular block being displaced from MC 20116's cache is asserted. WBVAL thereby indicates that that block may be safely used. Input Correct Next Write Back (CORRNXTWB) is provided from RM 20722 and indicates that the parity bits of a particular block to be written back into MSB 20110 during a next operation are to be ignored. In particular, assertion of CORRNXTWB results in assertion of output CORRWBPAR.

h.h. Byte Write Select Logic 22310 (FIG. 223)

Figure 223:
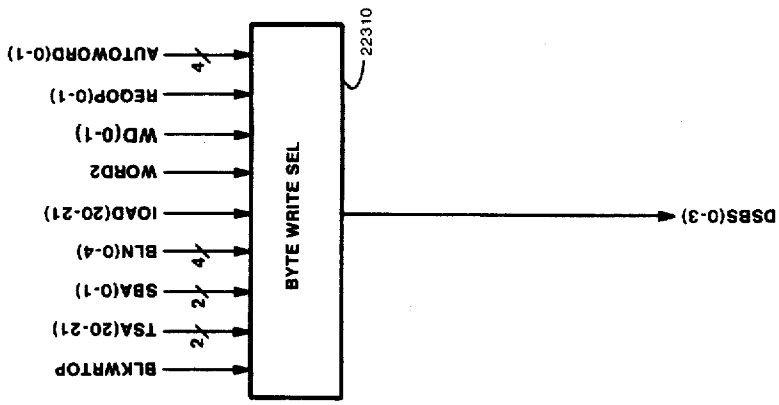
FIG. 223 is a detailed block diagram of memory byte write select logic.

Referring to FIG. 223, Byte Write Select Logic (BWS) 22310 is shown. As previously described, each byte of a 32 bit data word, and its associated byte parity, can be selectively written into MC 20116's cache. This operation is effectively an acceleration of a read/-modify/write operation which would otherwise be necessary where parity could change due to writing on a byte by byte basis rather than a word basis. Since each byte is written with its parity, an operation of writing half words, COBOL character strings, and partial blocks is executed more rapidly because this operation may be performed directly in MC 20116 without going through FIU 20120. A condition for performing a byte write operation is that the write must be an integral number of bytes in length and beginning on a byte boundary, as indicated by the starting bit address provided as part of the associated memory request. A full word write occurring on a word boundary is a special case of this byte write condition. In addition to writes of individual bytes, a block write operation may be performed as a sequence of byte write operations.

BWS 22310 which may, for example, be comprised of 82S131 PROMs and SN74S158 multiplexors, generates output Data Store Byte Select (DSBS) (0–3) to MC 20116 during execution of byte write operations. DSBS (0–3) is used by MC 20116 as a byte select address and is effectively a byte within word address.

Referring to inputs of BWS 22310, Block Write Operation (BLKWRTOP) is provided from RM 20722. BLKWRTOP will be asserted when a byte by byte block operation is to be performed. Considering first the case of a partial block operation wherein less than a full block is to be written into MC 20116, input Request Op (REQOP) (0–1) from PRMUX 20720 through REQOP Bus 21216 indicates what type of operation is to be performed by MEM 10112; this is for non-block operations only. In this case, a byte operation is indicated. Input Word two (WORD2) from TCR 21522 (described below) indicates whether the byte currently being written is from first or second word when the write operation crosses word boundaries. Inputs Starting Bit Address (SBA) (0–1), Autoword (WD) (0–1), and Byte Length Number (BLN) (0–4) are provided from PRMUX 20720. SBA (0–1) is provided through SBA Bus 21226 and identifies starting byte address of the first byte to be written. Input WD (0–1) is word within block address of the byte to be written and is provided through WD Bus 21212. Input BLN (0–4) identifies length of the data item, that is number of bytes, to be written and is provided through BLN Bus 21214. Together, inputs SBA (0–1), WD (0–1), and BLN (0–4) identify the particular byte or bytes to be written into MC 20116. BW522310 will generate corresponding DSBS (0–3) outputs to MC 20116 to cause those bytes to be written into MC 20116's cache.

As previously stated, if BLKWRTOP is asserted, a block is to be written on a byte by byte basis. In such a case, beginning word and byte addresses are provided by inputs WD (0–1) and SBA (0–1). Input AUTOWORD (0–1) is, as previously described, a sequence of word within block addresses generated by RM 20722 during block write operations. During a byte by byte block write operation, inputs SBA (0–1) and WD (0–1) are compared to the current word to be written as indicated by AUTOWORD (0–1). BWS 22310 generates DSBS (0–3) for WD (0–1) falling within a range defined by inputs SBA (0–1), WD (0–1), and BLN (0–1). DSBS (0–3) are thereby generated for bytes whose addresses fall in the range of: SBA (0–1) less than or equal to AUTOWORD (0–1) less than or equal to SBA (0–1) plus BLN (0–2) minus 1. DSBS (0–3) are thereby generated for a sequence of bytes comprising a partial block having boundaries on byte boundaries.

i.i. Bypass Write Control 20718 (FIG. 221)

Figure 221:
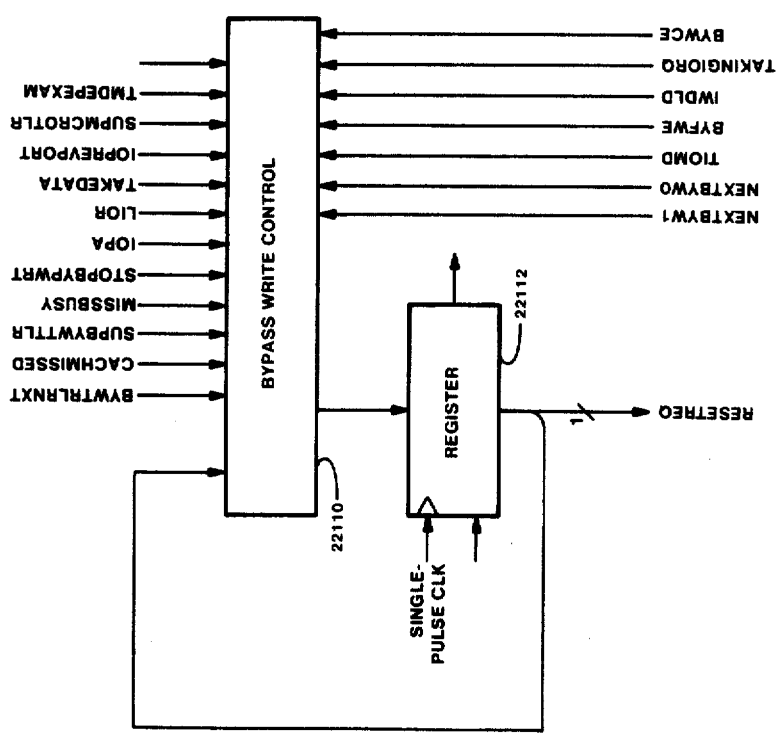
FIG. 221 is a detailed block diagram of memory bypass write control logic.

Referring to FIG. 221, Bypass Write Control (BWC) 20718 is shown. BWC 20718 includes Write Control Logic (WCL) 22110 and Register 22112. As previously described, BWC 20718 generates certain control signals for execution of bypass read and write operations. As indicated in FIG. 221, WCL 22110 receives certain inputs, each described below, from other portions of MIC 20122 circuitry and provides outputs to, for example, MC 20116. Certain WCL 22110 outputs are provided as inputs to Register 22112, which stores current state of certain WCL 22110 conditions and returns those conditions as an input to WCL 22110 to aid in determining future outputs of WCL 22110.

Referring first to outputs of WCL 22110, the majority of these outputs are provided to MC 20116 and will be described more fully in a following description of MC 20116. Outputs Next Bypass Write 1 (NEXTBYWl) and Next Bypass Write 0 (NEXTBYW0) comprise a two bit address code to MC 20116's Bypass Write File (BWF) 20118. NEXTBYW1 and NEXTBYW0 are used in BYF 20118 to assist in addressing of BYF 20118 when data is written into BYF 20118 from IOM Bus 10130. Outputs Bypass File Write Enable (BYFWE) and Bypass Write Chip Enable (BYWCE) are similarly provided to BYF 20118 as enable signals used in writing of data into BYF 20118 from IOM Bus 10130. Output IWD Load (IWDLD) is an enable input to the IWD register, described in a following description of BYF 20118, which is used in particular for receiving data from IOM 10130. Output TIOMD of WCL 22110 is, as previously discussed, a command and control signal communicated to IOS 10116 to indicate to IOS 10116 that MEM 10112 has accepted data presented by IOS 10116.

Referring also to the previous description of RM 20722, output Reset Request (RESETREQ) of Register 22112 indicates, as previously discussed with reference to Port Request Stat Logic (PRS) 21310, that the current request being serviced by RM 20722 is to be terminated due to an attempt to execute a cache flush before OKTOFLUSH has been set.

Considering those WCL 22110 inputs used in generation of WCL 22110 outputs to BYF 20128, referring to inputs of WCL 22110, Bypass Write Trailer Next (BYWTRLRNXT) is provided from RM 20722 and indicates that a bypass write trailer condition will be active during next clock cycle to possibly start a bypass write operation. Input Suppress Bypass Write Trailer (SUPBYWTTLR) is provided from TDN 21520 and suppresses generation of a bypass write operation, if certain conditions are met. Input Cache Missed (CACHMISSED) indicates, as previously described, that a memory request has resulted in a cache miss and thus that the bypass write may proceed. Input Miss Busy (MISSBUSY) indicates that MISSC 20726 is busy handling a previous MC 20116 cache miss and thus that a present request which has resulted in a further cache miss must be deferred, that is RESETREQ must be asserted.

Input Stop Bypass Write (STOPBYPWRT) is provided from TDN 21520 and TCL 21510 and indicates that a trailer condition requiring a stop of a bypass write has occurred. Input IO Port Available (IOIPA) is provided from PRS 21310 and has been previously discussed with reference to PRS 21310. Input Load IO Request (LIOR) is a command and control signal, previously discussed, provided by IOS 10116 to indicate that IOS 10116 has loaded a memory request into IO Port 20910. Input Take Data (TAKEDATA) is generated by RM 20722 and indicates that BYF 20118 is to accept the data from IOM Bus 10130 on next clock cycle. Input IO Previous Port (IOPREVPORT) is, as previously discussed, provided from Address Selection Decoding (ADSD) 21316 of PC 20716 and indicates that IO Port 20910 was the port whose memory request was previously serviced. Input Suppress Micro Control Trailer (SUPMCROTLR) is provided from TDN 21520 and indicates that no trailer actions are to be executed on next clock cycle, in this case no bypass write operation. Input Test Mode Deposit Examine (TMDEPEXAM) indicates that a MEM 10112 test operation is to be performed. As will be described in a following description of FIU 20120, TMDEPEXAM indicates that certain information contained in FIU 20120 registers are to be provided to DP 10118.

j.j. Memory Cache Usage Logic 22210 (FIG. 222)

Figure 222:
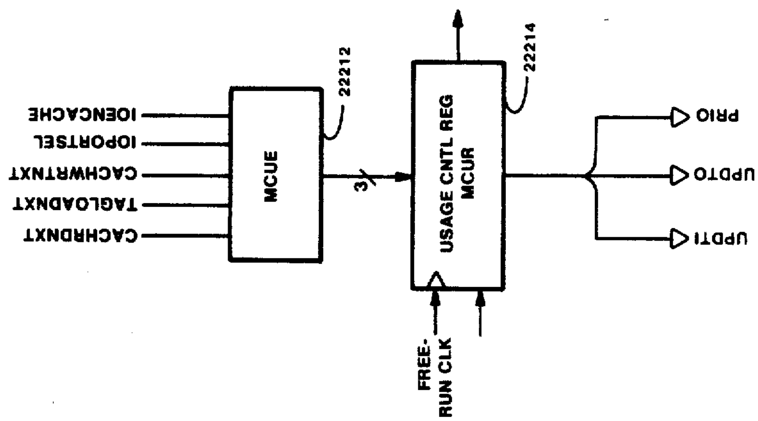
FIG. 222 is a detailed block diagram of memory cache usage logic.

Referring to FIG. 222, Memory Cache Usage Logic (MCU) 22210 is shown. As previously described, MC 20116's cache, in general, contains that data which is presently required by JP 10114 and IOS 10116. It is therefore necessary for MC 20116 to transfer data between MC 20116's cache and MSB 20110 in a manner that data contained in MC 20116's cache at any time is that data most probably required by JP 10114 and IOS 10116. By doing so, MC 20116 may minimize the incidents of MC 20116 cache misses wherein data requested by JP 10114 or IOS 10116 is not resident in MC 20116's cache. In general, MC 20116 tracks usage of data contained in MC 20116's cache and, when necessary, transfers that data which is least recently used back to MSB 20110 while retaining that data which is most recently used. MCU 22210 provides certain control signals to MC 20116 which aid in selecting which MC 20116 cache resident data is to be transferred to MSB 20110 and which is to be retained in MC 20116's cache. These control signals also assist in directing MC 20116 internal operations with regard to MC 20116 cache to increase efficiency of MC 20116 cache operations. Control signals provided by MCU 22210 are based upon pending MEM 10112 operations, in particular MC 20116 cache operations.

As shown in FIG. 222, MCU 22210 includes MCU Encoding Logic (MCUE) 22212 and MCU Register (MCUR) 22214. MCUE 22212 may be comprised, for example, of various TTL gates while MCUR 22214 may be, for example, comprised of SN74S194 registers. MCUE 2221 receives inputs regarding pending MC 20116 cache operations from other portions of MIC 20122 circuitry. MCUE 22212 generates a three bit encoded output representing pending MC 20116 operations. MCUR 22214 operates as a buffer register for receiving MCUE 22212's encoded output and delaying this output by one clock cycle, that is until those pending MC 20116 operations are to be executed. MCUR 22214 then provides the three bit encoded output from MCUE 22212 to MC 20116.

MCUE 22212 inputs Cache Read Next (CACHRDNXT), and Cache Write Next (CACHWRTNXT) are provided from RM 20722 and Tag Load Next (TAGLOADNXT) from LM 20730. CACHRDNXT and CACHWRTNXT indicate, respectively, that MC 20116 is to perform a MC 20116 cache read or write operation upon next clock period. TAGLOADNXT indicates that, on next clock period, MC 20116 is to perform an operation loading MC 20116's cache tag store, as described in a following description of MC 20116. Input IO Port Select (IOPORTSEL) is, as previously described, provided from PC 20716. IOPORTSEL indicates that the current memory request being serviced is from IO Port 20910. Input IO Encache (IOENCACHE) is, as previously described, a control command signal provided from IOS 10116 as part of a memory request. IOENCACHE is a request to MC 20116 that data read into MEM 10112 in association with that memory request be encached in MC 20116's cache.

Referring to outputs of MCUR 22214, Update 1 (UPDT1) and Update 0 (UPDT0) comprised a two bit code indicating operations to be performed by MC 20116. One code, for example 00, indicates that no MC 20116 cache operation is pending and that MC 20116 cache's usage RAMs should not be altered. A second code, for example 11, is derived from TAGLOADNXT and indicates that MC 20116 should update its usage RAMs to indicate a valid, clean block is encached. Two other codes, for example 01 and 10, indicate respectively that MC 20116 should update its usage RAMs to indicate that the block should be marked to indicate a read or write has occurred. MCUR 22214's third output is Priority IO (PRIO) is derived from IOPORTSEL and IOENCACHE. Normally, data written into MEM 10112 may be encached in MC 20116's cache or may already be resident in MC 20116's cache. In such cases, MC 20116 will designate that information in MC 20116 cache as the most recently used data therein. If, however, IOS 10116 asserts IOENCACHE, MC 20116 will write the data from IOS 10116 into MC 20116's cache and will indicate that data written therein as the least recently used data therein. This allows MC 20116, if necessary, to immediately write back that data to MSB 20110 if, for example, MC 20116 cache space is required for other purposes. This operation effectively causes IOENCACHE from IOS 10116 to place data in the cache that it might need again but if necessary may go to backing store (MSB 20110) if displaced.

k.k. Data Path Steering Logic 22410 (FIG. 224)

Figure 224:
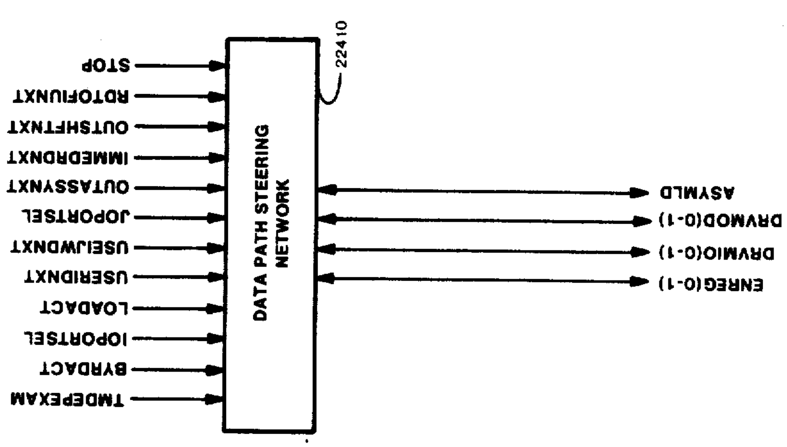
FIG. 224 is a detailed block diagram of memory data path storing logic.

Referring to FIG. 224, Data Path Steering Logic (DPS) 22410 is shown. MEM 10112 controls three principal data buses. MIO Bus 10129 is controlled by MEM 10112 for transfer of data from MEM 10112 to IOS 10116. MOD Bus 10144 is also controlled by MEM 10112 for transfers of data from MEM 10112 to JP 10114, and for internal memory transfers between MC 20116's cache and FIU 20120. A third principal MEM 10112 data bus is IB bus which is an internal data bus for FIU 20120 and will be described further in a following description of FIU 20120. DPS 22410 generates encoded enabling signals selecting data sources for each of these buses. These encoded enabling signals are generated by inputs to DPS 22410, from other portions of MIC 20122 circuitry, indicating data transfers to be performed by MEM 10112. As will be described in a following description of FIU 20120, a pipeline register in FIU 20120 receives encoded enabling signal outputs of DPS 22410, decodes these enabling signals, and distributes enabling signals to various sources for MIO Bus 10129, MOD Bus 10144, and FIU 20122's IB bus.

Referring to inputs of DPS 22410, TMDEPEXAM, previously discussed, is provided from FIU 10120 and indicates that an MEM 10112 test operation is being executed. Specifically, a register referred to as IARM in FIU 10120 is to be loaded with read data from MEM 10112 to be transferred to DP 10118, or data from DP 10118 which will have been loaded into register IARM in FIU 10120 is to be written into MEM 10112. BYRDACT from RM 20722 indicates, as previously discussed, that MEM 10112 is to perform a bypass read operation. IOPORTSEL is provided from PC 20716 and indicates that IO Port 20910 is currently being serviced by RM 20722. LOADACT from RM 20722 indicates that a MC 20116 cache load operation is being executed. Inputs Use Read Input Data Next (USERIDNXT) and Use IOS-or-JP Word Next (USEIJWDNXT) are provided from RM 20722 and refer respectively to a Read Input Data (RID) register and either IOS 10116 or JP 10114 write data register in FIU 20120. Inputs USERIDNXT and USEIJWDNXT respectively indicate that data in these registers is to be transferred to FIU 10120's internal IB bus for a subsequent data manipulation operation. Input JOPORTSEL indicates that a JPO Port 21010 memory request is being serviced. Input Output Assembly Next (OUTASSYNXT) is provided from RM 20720 and refers to an Assembly Register (ASYMR) in FIU 10120. FIU 10120's ASYMR is effectively a result register for receiving results of data manipulation operations. OUTASSYNXT indicates that the contents of FIU 10120's ASYMR is to be transferred on to MOD Bus 10144 and MIO Bus 10129 the next clock cycle. Input Immediate Read Next (IMMEDRDNXT) is provided from RM 20722 and indicates that MEM 10112 is to place the contents of a read operation from MC 20116's cache onto MOD Bus 10144 and MIO Bus 10129 on the next clock cycle. Input Out Shift Next (OUTSHFTNXT) is provided from RM 20722 and refers to a data shifting network in FIU 10122. OUTSHFTNXT indicates that the output of FIU 10120's data shifting network is to be transferred on to MOD Bus 10144 and MIO Bus 10129 during next clock cycle. Input Read to FIU Next (RDTOFIUNXT) is provided from RM 20722 and indicates that data on MOD Bus 10144, that is from MC 20116, is to be transferred into the RID registers in FIU 20120 on the next clock cycle. Input STOP, previously discussed, from DP 10118 indicates that MEM 10112 has been temporarily stopped for single pulsing the register.

Referring now to outputs of DPS 22410. Drive MOD Bus (DRVMOD) (0–1) is an encoded value specifying a source whose data is to be transferred on to MOD Bus 10144 during next system clock cycle. Possible sources are FIU 10120's shift network, FIU 10120's ASYMR, MC 20116, and the BC 20114 read output register. RM 20722 may specify FIU 10120's shift network as source by asserting OUTSHFTNXT or FIU 10120's ASYMR as source by asserting OUTASSYNXT. RM 20722 may select MC 20116 as source by asserting IMMEDRDNXT. LM 20730 may override any selection of RM 20722 by asserting LOADACT. LOADACT will select BC 20114's read output register as source to MOD Bus 10144 and MIO Bus 10129. LOADACT causes BC 20114's read output register to drive MIO Bus 10129 and MOD Bus 10144 so that handoff of data to JP 10114 in conjunction with a MC 20116 cache load operation can be transferred to the requestor.

Output Drive MIO Bus (DRVMIO) (0–1) is an encoded value specifying a source whose data is to be transferred on to MIO Bus 10129 during next system clock cycle. Possible sources are the same as for MOD Bus 10144 and RM 20722 control of MIO Bus 10129 is the same as for MOD Bus 10144. Whenever RM 20722 selects a source for MOD Bus 10140 it also selects that same source MIO Bus 10129. Although the same data is therefore transferred on to both buses, confusion is avoided as only the appropriate requestor, that is JP 10114 or IOS 10116 is provided with a data available signal, previously discussed.

MIO Bus 10129 may be active in a bypass read operation at same that MOD Bus 10144 is active for a JP 10114 operation. This is accomplished by having BYRDACT override RM 20722 on selection of a source for MIO Bus 10129. In addition, inputs IOPORTSEL and JPPORTSEL to DPS 22410 are asserted as requried. There will be no conflict with RM 20722 since RM 20722 may not perform a read operation to IOS 10116 while a bypass read operation is being executed. LM 20730 may override RM 20722 for access to MIO Bus 10129 for cache load operations. There will, however, be no conflict with an MC 20116 cache load operation because during such a cache load operation no other operations may be initiated.

Output Enable Register (ENREG) (0–1) is an encoded value specifying which of four FIU 20120 registers are to be used as data source for FIU 10120's internal IB bus into FIU 10120's shift and mask network. Two of these registers, JWD and RID, have been previously discussed. A third register is IO Word Register (IWD) for receiving data from IOM Bus 10130. The fourth register is referred to as IARMREG and is a register used to transfer data from DP 10118 to FIU 10120. RM 20722 sets up, during current system clock cycle, a register to be used as a source for FIU 10120's IB bus on next clock cycle USERIDNXT gates RID register on to IB bus. USEIJWDNXT gates either IWD or JWD bus to next cycle. If JPO Port 21010 is active, source to IB bus is JWD register. If IO Port 20910, is active IWD register is source to IB bus. Input TMDEPEXAM selects IARMREG to be source to IB bus on next cycle. DP 10118 will cause TMDPEXAM to be asserted when DP 10118 wishes to write data into MEM 10112.

Finally, output Assembly Load (ASYMLD) enables FIU 10120's ASYMR register to receive data from FIU 10120's shift and mask network. Data loaded into FIU 10120's ASYMR will subsequently be read from FIU 10120 to MOD Bus 10144 or MIO Bus 10129 during next system clock cycle, if OUTASSYNXT is asserted.

L.L. Read Data Handshake Logic 22510 (FIG. 225)

Figure 225:
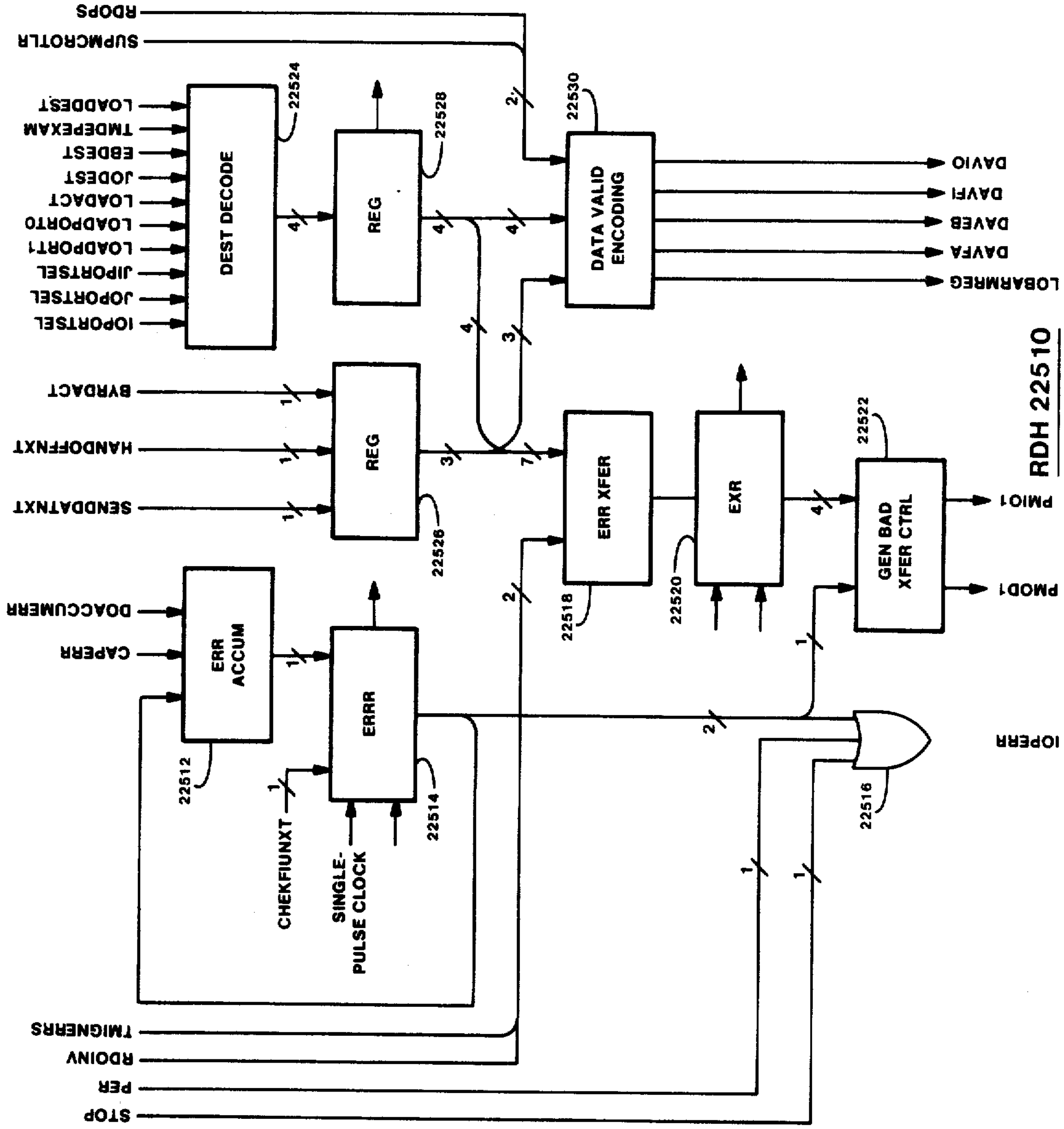
FIG. 225 is a detailed block diagram of memory read data handshake logic.

Referring to FIG. 225, Read Data Handshake Logic (RDH) 22510 is shown. RDH 22510 generates certain signals, as previously described, to JP 10114 and IOS 10116 indicating availability and status of data to be read to JP 10114 and IOS 10116. This information includes both data availability and data error signals.

RDH 22510 circuitry primarily related to generation of data error signals includes Error Accumulator Logic (ERRAC) 22512, Error Register (ERRR) 22514, Gate 22516, Error Transfer Logic (ERRXF) 22518, Error Transfer Register (EXR) 22520, and Generate Bad Transfer Control Logic (GBXC) 22522. RDH 22510 circuitry primarily related to generating data availability outputs includes Destination Decode Logic (DD) 22524, Pipeline Registers 22526 and 22528, and Data Validity Encoding Logic (DVE) 22530. ERRAC 22512, ERRR 22514, and Gate 22516 all receive input signals from other portions MEM 10112 circuitry, as will be described further below. ERRAC 22512 provides an encoded output to ERRR Register 22514. ERRR 22514 provides outputs to ERRAC 22512, Gate 22516, and GBXC 22522. ERRXF 22518 receives certain inputs from sources external to RDH 22510 and inputs from Pipeline Registers 22526 and 22528.

ERRXF 22518 provides an output to EXR 22520. EXR 22520, together with ERRR 22514 provides inputs to GBXC 22522. Data error output signals from RDH 22510 are provided from Gate 22516 and GBXC 22522. Referring to RDH 22510 data availability circuitry, Pipeline Register 22526, DD 22524, and DUE 22530 all receive inputs from sources external to RDH 22510. DD 22524 provides outputs to Pipeline Register 22528 and Pipeline Registers 22526 and 22528 provide inputs to DUE 22530.

RDH 22510 data error output signals include IO Parity Error (IOPERR), Previous MOD Invalid (PMODI), and Previous MIO Invalid (PMIOI). IOPERR indicates that the parity bits of data being transferred from IOS 10116 indicate that there are errors in that data. PMODI indicates that parity bits of data transferred onto MOD Bus 10144 the previous cycle indicate that there are errors in that data. PMIOI similarly indicates that parity bits of data being transferred on to MIO Bus 10129 the previous cycle indicate that that data contains errors.

As indicated in FIG. 225, IOPERR is generated by inputs STOP and Parity Error (PER) to Gate 22516 and by an output of ERRR 22514. Input STOP to Gate 22516 indicates that DP 10118 has stopped MEM 10112 and is essentially an indication of a test single pulse condition. Input PER is provided from FIU 10120 and indicates that FIU 10120 has detected a parity error in data being transferred from IOS 10116. Referring to Gate 22516's inputs from ERR 22514, these inputs represent the inputs to ERRR 22514 but delayed by a clock cycle. ERRR 22514's input Check FIU Next (CHEKFIUNXT) is provided from TCL 21510. CHEKFIUNXT is a trailer condition indicating that errors in data from IOS 10116 should be checked for in the next cycle. ERRR 22514's input from ERRAC 22512 indicates that, during a cache read, MC 20116 has detected parity errors in the data. Input Cache Parity Error (CAPERR) is provided from MC 20116 and indicates that, in a word being read from MC 20116's cache, parity errors have been detected. Input Do Accumulated Error (DOACCUMERR) to ERRAC 22512 is provided from RM 20722 and is an enable signal for ERRAC 22512 to perform an error accumulation operation over a cross word operation. During a multiple word read operation, ERRAC 22512 will generate an error output for each word of that block after a first word in which a parity error has been detected. This continuing error indication of an initially detected error condition in a multiple word read is generated by the signal fed back from ERRR 22514 output to an input of ERRAC 22512.

Together, ERRAC 22512 and ERRR 22514, with other signals into Gate 22516, provide an indication of when data errors occur in data read from MC 20116's cache. Referring now to ERRXF 22518, EXR 22520, and GBXC 22522 generating outputs PMODI and PMIOI, input to GPXC 22522 from ERRR 22514 indicates, as just described, an error in a block transfer to JP 10114 or IOS 10116. Inputs to ERRXF 22518 include Read Data Out Invalid (RDOINV) from BC 20114. RDOINV is a general indication that data being read through BC 20114 to MOD Bus 10144 or MIO Bus 10129 is invalid due to ECC multiple hit errors. Input Test Mode Ignore Errors (TMIGNERRS) is provided from FIU 20122 and is a result of a test condition requiring data to be read from MEM 10112 regardless of errors contained therein. Other inputs to ERRXF 22518 are, as previously described, from Pipeline Registers 22526 and 22528. As will be discussed below, these inputs provide a determination of where data is being read to (that is JP 10114 or IOS 10116). This information, together RDOINV and TMIGNERRS inputs to ERRXF 22518, are encoded and transferred to Pipeline Register EXR 22520 which, in turn, provides this information to GBXC 22522. Information provided through EXR 22520 is used by GBXC 22522 to indicate, in particular, whether data appearing on MOD Bus 10144 or MIO Bus 10129 is invalid. GBXC 22522, as previously described, provides these indications with outputs PMODI and PMIOI.

RDH 22510 outputs indicating data availability include DAVFI, DAVFA, DAVEB, and DAVIO, all of which have been previously discussed with reference to MEM 10112 interfaces to JP 10114 and IOS 10116. These outputs are generated from inputs, as indicated from FIG. 225, to Pipeline Register 22526, DD 22524, and DUV 22530, each of which will be described below.

Either LM 20730 or RM 20722 may place data on either MIO Bus 10129 or MOD Bus 10144. BRC 20718 may place data on MIO Bus 10129 whenever RQ 20728 indicates an active bypass read operation, that is BYRDACT is asserted. Because of Pipelining Registers, for example, Registers 22526 and 22528, a data transfer is set up in one system clock cycle and the data transferred, with its corresponding control signals, on following clock cycle.

DD 22524 generates a four bit code indicating destination of data being transferred from those inputs to DD 22524 as indicated in FIG. 225. A destination for a data transfer initiated by RM 20722 is indicated by inputs IOPORTSEL, JOPORTSEL, JIPORTSEL, all of which have been described previously as indicating a port selected for service. In addition, RM 20722 will assert input JODEST or EBDEST to indicate destination of a data transfer to JP 10114, that is whether the data is to go to FU 10120 or EU 10122. Upon a data transfer initiated by LM 20730, LM 20730 will provide a destination code comprising inputs LOADPORT0 and LOADPORT1, both of which have been similarly described before. Input LOADACT to DD 22524 is asserted during a handoff read operation to indicate that LOADPORT(0-1), JODEST, and EBDEST are valid so that if LM 20730 asserts HANDOFFNXT the destination of data will be known. Input TMDEPEXAM to DD 22524 indicates that a MEM 10112 test operation is being performed wherein data is being transferred into an FIU 20122 register referred to as BARM and described further in a following description of FIU 20122. Staging Register 22528 receives four bit destination code from DD 22524 and delays that code by one clock cycle so that a data availability signal from RDH 22510 will be generated concurrently with availability of that data. Output of Pipeline Register 22528 is provided to DV 22530 to select the particular data availability output to be asserted.

Referring now to Pipeline Register 22526's inputs, these inputs indicate, in general, that data availability signal is to be generated. These inputs are transferred through Pipeline Register 22526 to DV 22530 to aid in determining the particular data availability signal to be generated. As will be described below, inputs SUPMCROTLR and RDOPS, both previously described, are inputs expressing conditions which may inhibit generation of a data availability output from DV 22530.

If RM 20722 is initiator of a data transfer, RM 20722 asserts Send Data Next (SENDDATNXT) which is staged in Register 22526 for use during following clock cycle. During that following clock cycle any faults, for example a cache miss, will cause SUPMCROTLR to be asserted. SUPMCROTLR will then inhibit any data availability output from being asserted. Similarly, when LM 20730 initiates a data transfer, LM 20730 asserts HANDOFFNXT one cycle prior to the data being available for transfer. Again, Pipeline Register 22526 delays HANDOFFNXT by one clock cycle. Input Read Data Output Sent (RDOS) provided from BC 20114 will gate HANDOFFNXT to enable the data availability signal selected by the encoded output of DD 22524. Similarly, a bypass read operaton will gate RDOPS with BYRDACT to generate data available signal DAVIO since IOS 10116 is the only requestor which may receive a bypass read.

Having described structure, operation, and certain timing relationships of MIC 20122 circuitry, structure and operation of FIU 20120 will be described next below.

i. FIU 20120 (FIGS. 201, 230, 231)

As previously described, FIU 20120 performs certain data manipulation operations, including those operations necessary to make MEM 10112 bit addressable. Data manipulation operations may be performed on data being written into MEM 10112, for example, JP 10114 through JPD Bus 10142 or from IOS 10116 through IOM Bus 10130. Data manipulations operations may also be performed on data being read from MEM 10112 to JPD 10114 or IOS 10116. In case of data read to JP 10114, MOD Bus 10144 is used both as a MEM 10112 internal bus, in transferring data from MC 20116 to FIU 20120 for manipulation, and to transfer manipulated data from MEM 10112 to JP 10114. In case of data read to IOS 10116, MOD Bus 10144 is again used as MEM 10112 internal bus to read data from MC 20116 to FIU 20120 for subsequent manipulation. The manipulated data is then read from FIU 20120 to IOS 10116 through MIO Bus 10129.

Certain data manipulation operations which may be performed by FIU 20120 have been previously described. In general, a data manipulation operation consists of four distinct operations, and FIU 20120 may manipulate data in any possible manner which may be achieved through performing any combination of these operations. These four possible operations are selection of data to be manipulated, rotation or shifting of that data, masking of that data, and transfer of that manipulated data to a selected destination. Each FIU 20120 data input will comprise a thirty-two bit data word and, as described above, may be selected from input provided from JPD Bus 10142, MOD Bus 10144, and IOM Bus 10130. In certain cases, an FIU 20120 data input may comprise two thirty-two bit words, for example, when a cross word operation is performed generating an output comprised of bits from each of two different thirty-two bit words. Rotation or shifting of a selected thirty-two bit data word enables bits within a selected word to be repositioned with respect to word boundaries. When used in conjunction with the masking operation, described momentarily, rotation and shifting may be reiterably performed to transfer any selected bits in a word to any selected locations in that word. As will be described further below, a masking operation allows any selected bits of a word to be effectively erased, thus leaving only certain other selected bits, or certain selected bits to be forced to predetermined values. A masking operation may be performed, for example, to zero fill or sign extend portions of a thirty-two bit word. In conjunction with a rotation or shifting operation, a masking operation may, for example, select a single bit of a thirty-two bit input word, position that bit in any selected bit location, and force all other bits of that word to zero. Each output of FIU 20120 is a thirty-two bit data word and, as described above, may be transferred on to MOD Bus 10144 or onto MIO Bus 10129. As will be described below, selection of a particular sequence of the above four operations to be performed on a particular data word is determined by control inputs provided from MIC 20122. These control inputs from MIC 20122 are decoded and executed by microinstruction control logic included within FIU 20120.

Figure 230:
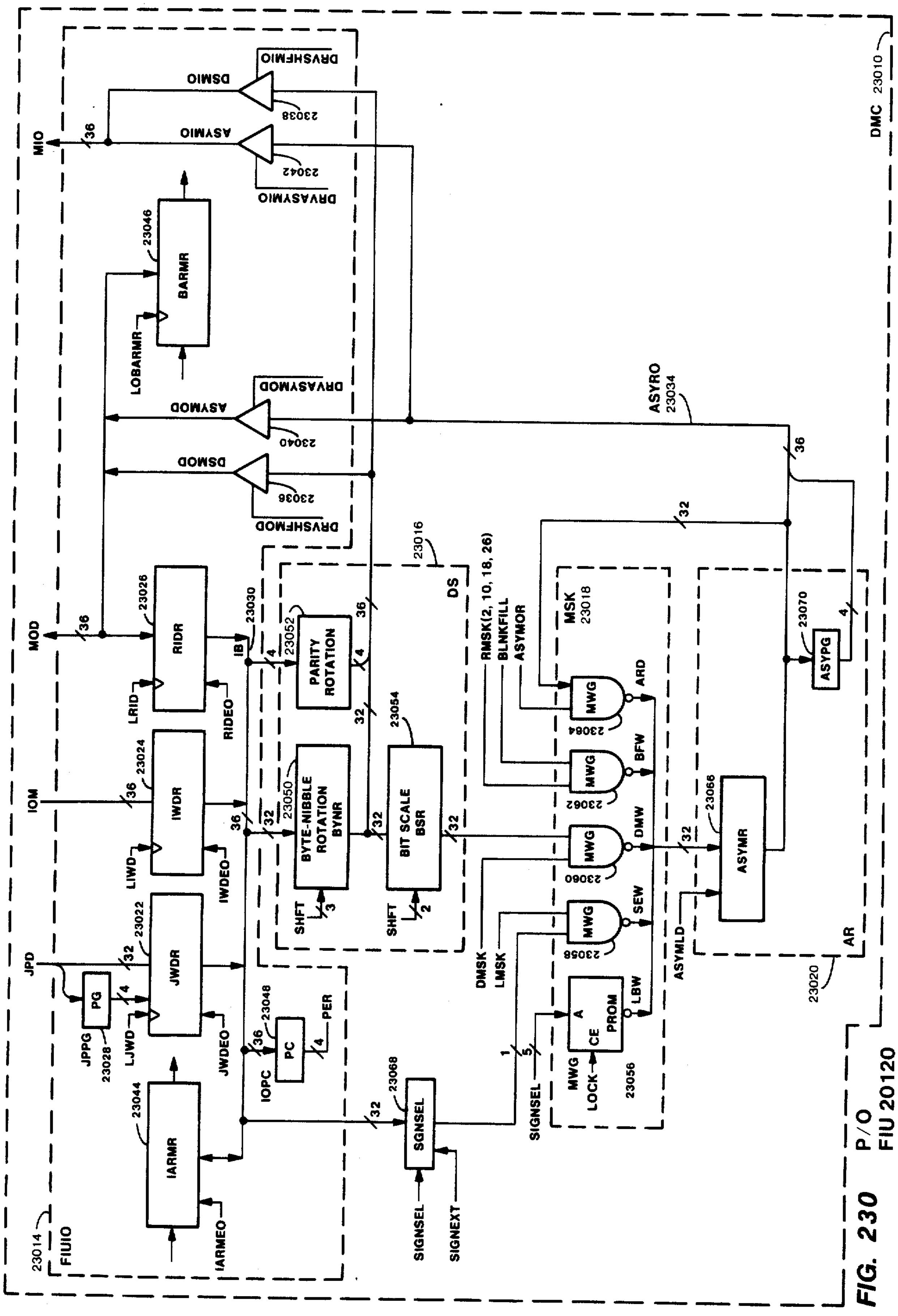
FIGS. 230 and 230B are a detailed block diagram of memory field interface unit logic.
Figure 230A:
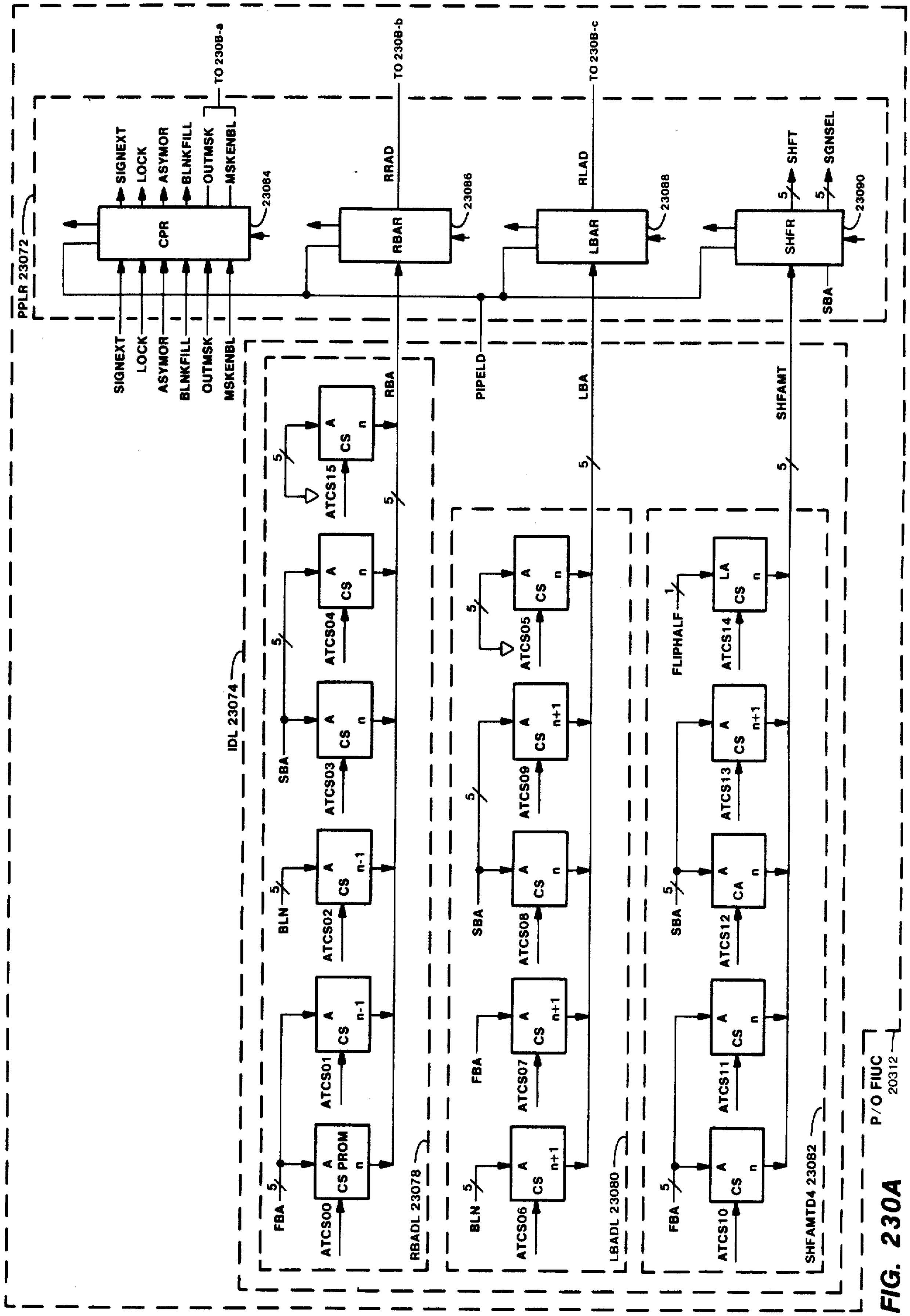
Figure 230B:
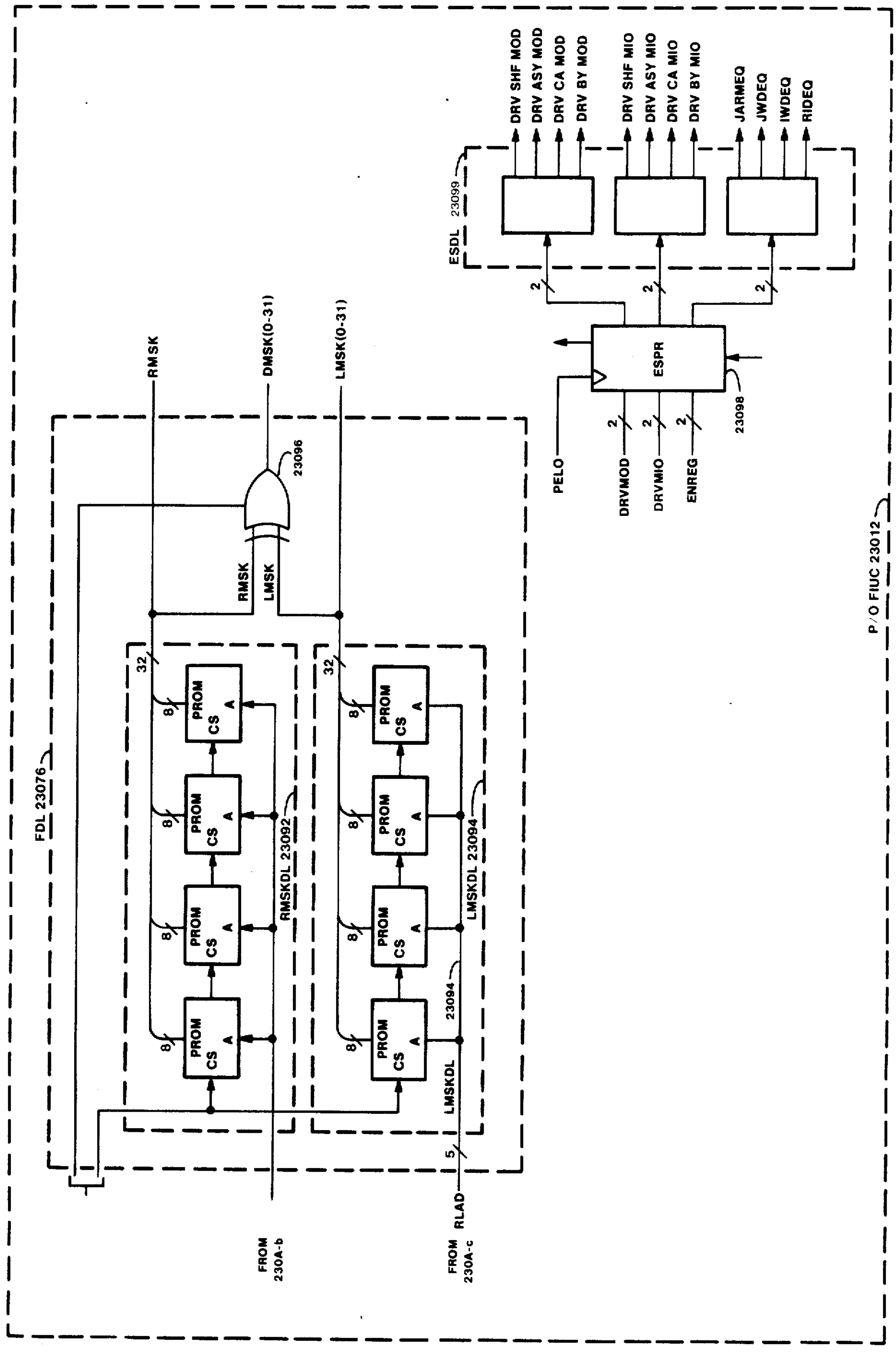
Figure 231:
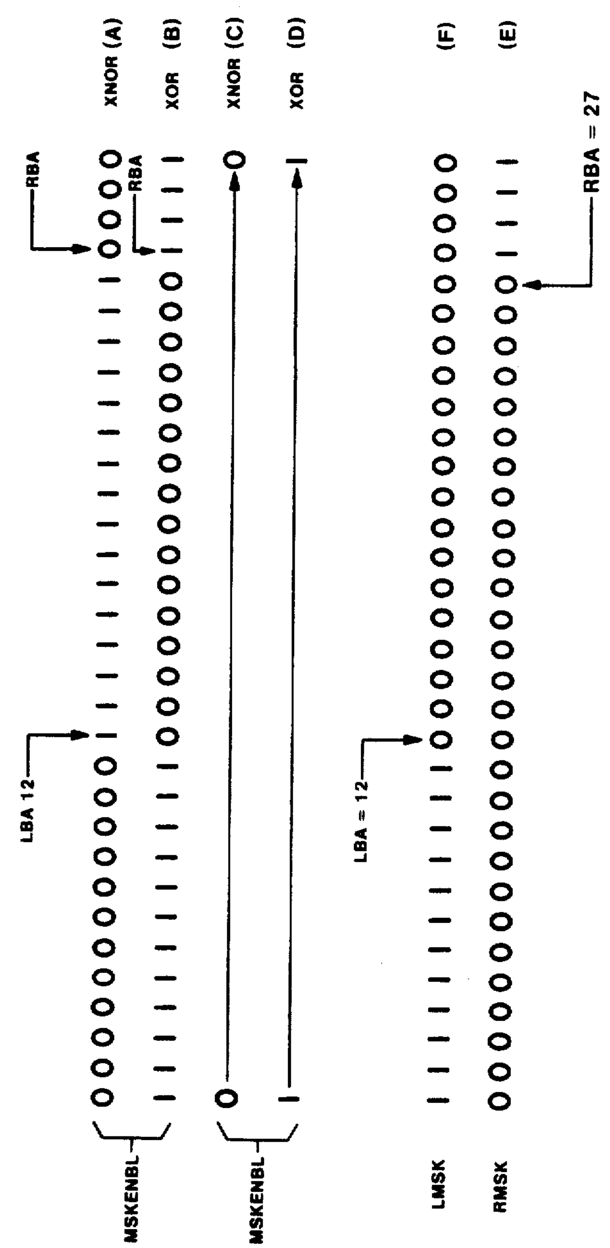
FIG. 231 is a diagram illustrating memory format manipulation operations.

Referring to FIG. 230, a partial block diagram of FIU 20120 is shown. As indicated therein, FIU 20120 includes Data Manipulation Circuitry (DMC) 23010 and FIU Control Circuitry (FIUC) 23012. Data Manipulation Circuitry 23010 in turn includes FIUIO circuitry (FIUIO) 23014, Data Shifter (DS) 23016, Mask Logic (MSK) 23018, and Assembly Register (AR) logic 23020. Data manipulation circuitry 23010 will be described first followed by FIUC 23012. In describing data manipulation circuitry 23010, FIUIO 23014 will be described first, followed by DS 23016, MSK 23018, and AR 23020, in that order.

Referring to FIUIO 23014, FIUIO 23014 comprises FIU 20120's data input and output circuitry. Job Processor Write Data Register (JWDR) 23022, IO System Write Data Register (IWDR) 23024, and Write Input Data Register (RIDR) 23026 are connected from, respectively, JPD Bus 10142, IOM Bus 10130, and MOD Bus 10144 for receiving data word inputs from, respectively, JP 10114, IOS 10116, and MC 20116. JWDR 23022, IWDR 23024 and RIDR 23026 are each thirty-six bit registers comprised, for example, of SN74S374 registers. Data words transferred into IWDR 23024 and RIDR 23026 are each, as previously described, comprised of a thirty-two data word plus four bits of parity. Data inputs from JP 10114 are, however, as previously described, thirty-two bit data words without parity. Job Processor Parity Generator (JPPG) 23028 associated with JWDR 23022 is connected from JPD Bus 10142 and generates four bits of parity for each data input to JWDR 23022. JWDR 23022's thirty-six bit input thereby comprises thirty-two bits of data, directly from JPD Bus 10142, plus a corresponding four bits of parity from JPPG 23028.

Data words, thirty-two bits of data plus four bits of parity, are transferred into JWDR 23022, IWDR 23024, or RIDR 23026 when, respectively, input enable signals Load JWD (LJWD), Load IWD (LIWD) or Load RID (LRID) are asserted. LJWD is provided from FU 10120 while LIWD and LRID are provided from MIC 20122.

Data words resident in JWDR 23022, IWDR 23024, or RIDR 23026 may be selected and transferred onto FIU 20120's Internal Data (IB) Bus 23030 by output enable signals JWD Enable Output (JWDEO), IWD Enable Output (IWDEO), an RID Enable Output (RIDEO). JWDEO, IWDEO, and RDIEO are provided from FIUC 23012 described below.

As will be described further below, manipulated data words from DS 23016 or AR 23020 will be transferred onto, respectively, Data Shifter Output (DSO) Bus 23032 or Assembly Register Output (ASYRO) Bus 23034 for subsequent transfer onto MOD Bus 10144 or MIO Bus 10129. Each manipulated data word appearing on DSO Bus 23032 or ASYRO Bus 23034 will be comprised of 32 bits of data plus 4 bits of parity. Manipulated data words present on DSO Bus 23032 may be transferred onto MOD Bus 10144 or MIO Bus 10129 through, respectively, DSO Bus To MOD Bus Driver Gate (DSMOD) 23036 or BSO Bus To MIO Bus Driver Gate (DSMIO) 23038. Manipulated data words present on ASYRO Bus 23034 may be transferred onto MOD Bus 10144 or MIO BUS 10129 through, respectively, ASYRO Bus To MOD Bus Driver Gate (ASYMOD) 23040 or ASYRO Bus To MIO Bus Driver Gate (ASYMIO) 23042. DSMOD 23036, DSMIO 23038, ASYMOD 23040, and ASYMIO 23042 are each comprised of, for example, SN74S244 drivers. A manipulated data word on DSO Bus 23032 be transferred through DSMOD 23036 to MOD Bus 10144 when driver gate enable signal Driver Shift To MOD (DRVSHFMOD) to DSMOD 23036 is asserted. Similarly, a manipulated data word on DSO Bus 23032 will be transferred through DSMIO 23038 to MIO Bus 10129 when driver gate enable signal Drive Shift Through MIO Bus (DRVSHFMIO) to DSMIO 23038 is asserted. Manipulated data words present on ASYRO Bus 23034 may be transferred onto MOD Bus 10144 or MIO Bus 10129 when, respectively, driver gate enable signal Drive Assembly To Mod Bus (DRVASYMOD) to ASYMOD 23040 or Drive Assembly To MIO Bus (DRVASYMIO) to ASYMIO 23042 are asserted. DRVSHFMOD, DRVSHFMIO, DRVASYMOD, and DRVASYMIO are provided, as described below, from FIUC 23012.

Registers IARMR 23044 and BARMR 23046, which will be described further in a following description of DP 10118, are used by DP 10118 to, respectively, write data words onto IB 23030 and to Read data words from MOD Bus 10144, for example manipulated data words from FIU 20120. Data word written into IARMR 23044 from DP 10118, that is 32 bits of data and 4 bits of parity, will be transferred onto IB Bus 23030 when register enable output signal IARM enable output (IARMEO) from FIUC 23012 is asserted. Similarly, a data word present on MOD Bus 10144, comprising 32 bits of data plus 4 bits of parity, will be written into BARMR 23046 when load enable signal Load BARMR (LDBARMR) to BARMR 23046 is asserted by MIC 20122. A data word written into BARMR 23046 from MOD Bus 10144 may then subsequently be read to DP 10118. IARMR 23044 and BARMR 23046 are similar to JWDR 23022, IWDR 23024, and IRDR 23026 and may be comprised, for example, of SN74S299 registers.

Referring finally to IO Parity Check Circuit (IOPC) 23048, IOPC 23048 is connected from IB Bus 23030 to receive each data word, that is 32 bits of data plus 4 bits of parity, appearing on IB Bus 23030. IOPC 23048 confirms parity and data validity of each data word appearing on IB Bus 23030 and, in particular, determines validity of parity and data of data words written into FIU 20120 from IOS 10116. IOPC 23048 generates output Parity Error (PER), previously discussed, indicating a parity error in data words from IOS 10116.

Referring to DS 23016, DS 23016 includes Byte Nibble Logic (BYNL) 23050, Parity Rotation Logic (PRL) 23052, and Bit Scale Logic (BSL) 23054. BYNL 23050, PRL 23052, and BSL 23054 may respectively be comprised of, for example, 25S10 shifters. BYNL 23050 is connected from IB Bus 23030 for receiving and shifting the 32 data bits of a data word selected and transferred onto IB Bus 23030. PRL 23052 is a 4 bit register similarly connected from IB Bus 23030 to receive and shift the 4 parity bits of a data word selected and transferred onto IB Bus 23030. Outputs of BYNL 23050 and PRL 23052 are both connected onto DSO Bus 23032, thus providing a 36 bit FIU 20120 data word output directly from BYNL 23050 and PRL 23052. BYNL 23050's 32 bit data output is also connected to BSL 23054's input. BSL 23054's 32 bit output is in turn provided to MSK 23018.

As previously described, DS 23016 performs data manipulation operations involving shifting of bits within a data word. In general, data shift operations performed by DS 23016 are rotations wherein data bits are right shifted, with least significant bits of data word being shifted into most significant bit position and most significant bits being translated towards least significant bit positions. DS 23016 rotation operations are performed in two stages. First stage is performed by BYNL 23050 and PRL 23052 and comprises right rotations on a nibble basis (a nibble is defined as 4 bits of data). That is, BYNL 23050 right shifts a data word by an integral number of 4 bit increments. A right rotation on a nibble by nibble basis may, for example, be performed when RM 20722 asserts FLIPHALF previously described. FLIPHALF is asserted for IOS 10116 half word read operations wherein the request data resides in the most significant 16 bits of a data word from MC 20116. BYNL 23050 will perform a right rotation of 4 nibbles to transfer the desired 16 bits of data into the least significant 16 bits of BYNL 23050's output. Resulting BYNR 23050 output, together PRL 23052's parity bit output would then be transferred through DSO 23050 to MIO Bus 10129. In addition to performing data shifting operations, DS 23016 may transfer a data word, that is the 32 bits of data, directly to MSK 23018 when data manipulation to be performed does not require data shifting, that is shifts of 0 bits may be performed.

Because data bits are shifted by BYNL 23050 on a nibble basis, the relationship between the 32 data bits of a word and the corresponding 4 parity bits may be maintained if parity bits are similarly right rotated by an amount corresponding to right rotation of data bits. This relationship is true if the data word is shifted in multiples of 2 nibbles, that is 8 bits or 1 byte. PRL 23052 right rotates the 4 parity bits of a data word by an amount corresponding to right rotation of the corresponding 32 data bits in BYNL 23050. Right rotated outputs of BYNL 23050 and PRL 23052 therefore comprise a valid data word having 32 bits of data and 4 bits of parity wherein the parity bits are correctly related to the data bits. A right rotated data word output from BYNL 23050 and PRL 23052 may be transferred onto DSO Bus 23032 for subsequent transfer to MOD Bus 10144 or MIO Bus 10129 as described above. DSO 23032 is used as FIU 20120's output data path for byte write operations and "rotate read" operations wherein the required manipulation of a particular data word requires only an integral numer of right rotations by bytes. Amount of right rotation of 32 bits of data in BYNL 23050 and 4 bits of parity in PRL 23052 is controlled by input signal shift (SHFT) (0-2) to BYNL 23050 and PRL 23052. As will be described below, SHFT (0-2) is generated, together with SHFT (3-4) controlling BSL 23054, by FIUC 23012. BYNL 23050 and PRL 23052, like BSL 23054 described below, are parallel shift logic chips and entire rotation operation of BYNL 23050 and PRL 23052 or BSL 23054 may be performed in a single clock cycle.

Second stage of rotation is performed by BSL 23054 which, as described above, receives the 32 data bits of a data word from BYNL 23050. BSL 23054 performs right rotation on a bit by bit basis with the shift amount being selectable between 0–3 bits. Therefore, BSL 23054 may rotate bits through nibble boundaries. BYNL 23050 and BSL 23054 therefore comprise a data shifting circuit capable of performing bit-by-bit right rotation by an amount from 1 bit to a full 32 bit right rotation.

Referring now to MSK 23018, MSK 23018 is comprised of 5 32 bit Mask Word Generators (MWG's) 23056 to 23064. MSK 23018 generates a 32 bit output to AR 23020 by selectively combining 32 bit mask word outputs of MWG's 23056 to 23064. Each mask word generated by one of MWG's 23056 to 23064 is effectively comprised of a bit by bit combination of a set of enabling bits and a pre-determined 32 bit mask word, generated by FIUC 23012 and MIC 20122. MWG's 23058 to 23064 are each comprised of for example, open collector NAND gates for performing these functions, while MWG 23056 is comprised of a PROM.

As just described, outputs of MWG's 23056 to 23064 are all open collector circuits so that any selected combination of mask word outputs from MWG's 23056 to 23064 may be ORed together to comprise the 32 bit output of MSK 23018.

MWG 23056 to MWG 23064 generate, respectively, mask word outputs Locked Bit Word (LBW) (0–31), Sign Extended Word (SEW) (0–31), Data Mask Word (DMW) (0–31), Blank Fill Word (BWF) (0–31), and Assembly Register Output (ARO) (0–31). Referring first to MWG 23064 and ARO (0–31), the contents of Assembly Register (ASYMR) 23066 in AR 23020 are passed through MWG 23064 upon assertion of enabling signal Assembly Output Register (ASYMOR). ARO (0–31) is thereby a copy of the contents of ASYMR 23066 and MWG 23064 allows the contents of ASYMR 23066 to be ORed with the selected combination of LBW (0–31), SEW (0–31), DMW (0–31), or BFW (0–31).

DMW (0–31) from MWG 23060 is generated by ANDing enable Input Data Mask (DMSK) (0–31) with the 32 bit output of DS 23016. DMSK (0–31) is a 32 bit enabling word generated, as described below, by FIUC 23012. FIUC 23012 may generate 4 different DMSK (0–31) patterns. Referring to FIG. 231, the 4 DMSKs (0–31) which may be generated by FIUC 20132 are shown. DMSKA (0–31) is shown in Line A of FIG. 231. In DMSKA (0–31) all bits to the left of but not including a bit designated by Left Bit Address (LBA) and all bits to the right of and not including a bit designated by Right Bit Address (RBA) are 0. All bits between, and including, those bits designated by LBA and RBA are 1's. DMSKB (0–31) is shown in Line B of FIG. 231 and is DMSKA (0–31) inverted DMSKC (0–31) and DMSKD (0–31) are shown, respectively, in Lines C and D of FIG. 231 and are comprised of, respectively, all 0's or all 1's. As stated above DMSK (0–31) is ANDed with the 32 bit output of DS 23016. As such, DMSKC (0–31) may be used, for example, to inhibit DS 23016's output while DMSKD (0–31) may be used, for example, to pass DS 23016's output to AR 23020. DMSKA (0–31) and DMSKB (0–31) may be used, for example, to gate selected portions of DS 23016's output to AR 23020 where, for example, the selected portions of DS 23016's output may be ORed with other mask word outputs MSK 23018.

Referring next to MWG 23062, MWG 23062 generates BFW (0–31). BFW (0–31) is used in a particular operation wherein 32 bit data words containing 1 to 4 ASCII blanks are required to be generated wherein 1 bit/byte contains a logic one and remaining bits contain logic zeros. In this case, the ASCII blank bytes may contain logic 1's in bit positions 2, 10, 18, and 26.

Referring again to FIG. 231, Line E therein shows 32 bit right mask (RMSK) (0–31) which may be generated by FIUC 23012. In the most general case, RMSK contains zeros in all bit positions to the left of and including a bit position designated by RBA. When used in a blank fill operation, bit positions 2, 10, 18, and 26 may be selected to contain logic 1's depending upon those byte positions containing logic 1's, that is in those bytes containing ASCII blanks; these bytes to the right of RBA are determined by RMSK (0–31). RMSK (0–31) is enabled through MWG 23062 as BWF (0–31) when MWG 23062 is enabled by blank fill (BLNKFILL) provided from FIU 23012.

As described above, MWG's 23058 to 23064 and in particular MWG's 23060 and MWG 23062 are NAND gate operations. Therefore, the outputs of MWGs 23056 through 23064 are active low signals. The inverted output of ASYMR 23066 is used as an output to ASYRO 23034 to invert these outputs to active high.

MWG 23058, generating SEW (0–31), is used in generating sign extended or filled words. In sign extended words, all bit spaces to the left of the most significant bit of a 32 bit data word are filled with the sign bit of the data contained therein, the left most bits of the 32 bit word are filled with 1's or 0's depending on whether that word's sign bit indicates that the data contained therein is a positive or negative number.

Sign Select Multiplexor (SIGNSEL) 23066 is connected to receive the 32 data bits of a word present on IB Bus 23030. Sign Select (SGNSEL) (0–4) to SIGNSEL 23066 is derived from SBA (0–4), that is from SBA Bus 21226 from PRMUX 20720. As previously described, SBA (0–4) is Starting Bit Address identifying the first or most significant bit of a data word. When a data word contains a signed number, most significant bit contains sign bit of that number. SGNSEL (0–4) input to SIGNSEL 23066 is used as a selection input and, when SIGNSEL is enabled by Sign Extend (SIGNEXT) from FIU 23012, selects the sign bit on IB Bus 23030 and provides that sign bit as an input to MWG 23058.

Sign bit input to MWG 23058 is ANDed with each bit of left hand mask (LMSK) (0–31) from FIUC 23012. Referring again to FIG. 231, LMSK (0–31) is shown on Line F thereof. LMSK (0–31) contains all 0's to the right of and including the bit space identified by LBA and 1's in all bit spaces to the left of that bit space identified by LBA. SEW (0–31) will therefore contain sign bit in all bit spaces to the left of the most significant bit of the data word present on output of MWG 23058. The data word on IB Bus 23030 may then be passed through DS 23016 and subjected to a DMSK operation wherein all bits to the left of the most significant bit are forced to 0. SEW (0–31) and DMW (0–31) outputs of MWG's 23058 and 23060 may then be ORed to provide the desired find extended word output.

LBW (0–31), provided by MWG 23056, is used in locked bit operations wherein the most significant data bit of a data word is in MEM 10112 forced to logic 1.

SIGNSEL (0-4) is an address input to MWG 23056 and, as previously described, indicates most significant data bit of a data word present on an IB Bus 23030. MWG 23056 is enabled by input Lock (LOCK) from FIUC 23012 and the resulting LBW (0-31) will contain a single logic 1 in the bit space of the most significant data bit of the data word present on IB Bus 23030. The data word present on IB Bus 23030 may then be passed through DS 23016 and MWG 23060 to be ORed with LBW (0-31) so that that data words most significant data bit is forced to logic 1.

Referring to AR 23020, AR 23020 includes ASYMR 23066, which may be comprised for example of a SN74S175 registers, and Assembly Register Parity Generator (ASYPG) 23070. As previously described, ASYMR 23066 is connected from MSK 23018 32 bit output. A 32 bit word present on MSK 23018's output will be transferred into ASYMR 23066 when ASYMR 23066 is enabled by Assembly Register Load (ASYMLD) from MIC 20122. The 32 bit word generated through DS 23016 and MSK 23018 will then be present on ASYRO Bus 23034 and may, as described above, then be transferred onto MOD Bus 10144 or MIO Bus 10129. ASYPG 23070 is connected from ASYMR 23066 32 bit output and will generate 4 parity bits for the 32 bit word presently on the 32 data lines of ASYRO Bus 23034. ASYPG 23070's 4 bit parity output is bused on the 4 parity bit lines of ASYRO Bus 23034 and accompany the 32 bit data word present thereon.

Having described structure and operation of Data Manipulation Circuitry 23010, FIUC 23012 will be described next below.

Referring again to FIG. 230, FIUC 23012 provides pipelined microinstruction control of FIU 20120. That is, control signals are received from MIC 20122 during a first clock cycle and certain of the control signals are decoded by microinstruction logic to generate further FIUC 23012 control signals. During the second clock cycle, control signals received and generated during the first clock cycle are provided to DMC 23010, some of which are further decoded to provide yet other control signals to control operation of FIUC 23012. FIUC 23012 includes Initial Decode Logic (IDL) 23074, Pipeline Registers (PPLR) 23072, Final Decoding Logic (FDL) 23076, and Enable Signal Pipeline Register (ESPR) 23098 with Enable Signal Decode Logic (ESDL) 23099.

IDL 23074 and Control Pipeline Register (CPR) 23084 of PPLR 23072 are connected from control outputs of MIC 20122 to receive control signals therefrom during a first clock cycle as described above. IDL 23074 provides outputs to control pipeline registers Right Bit Address Register (RBAR) 23086, Left Bit Address Register (LBAR) 23088 and Shift Register (SHFR) 23090 of PPLR 23072. CPR 23084 and SHFR 23090 provide control outputs directly to DMC 23010. As described above these outputs control DMC 23010 during the second clock cycle.

CPR 23084, RBAR 23086, and LBAR 23088 provide outputs to FDL 23076 during the second clock cycle and FDL 23076 in turn provides certain outputs directly to DMC 23010.

ESPR 23098 and ESDL 23099 receive enable and control signals from MIC 20122 and in turn provide enable and control signals to DMC 23010 and certain other portions of MEM 10112 circuitry.

IDL 23074 and FDL 23076 may be comprised, for example, of PROMs. CPR 23084, RBAR 23086, LBAR 23088, SHFR 23090, and ESPR 23098 may be comprised, for example, of SN74S194 registers. ESDL 23099 may be comprised of, for example, compatible decoders, such as logic gates.

Referring first to IDL 23074, IDL 23074 performs an initial decoding of circuitry control signals from MIC 20122 and provides further control signals used by FIUC 23012 in controlling FIU 20120. IDL 23074 is comprised of read-only memory arrays Right Bit Address Decoding Logic (RBADL) 23078, Left Bit Address Decoding Logic (LBADL) 23080, and Shift Amount Decoding Logic (SHFAMTDL) 23082. RBADL 23078 receives, as address inputs, Final Bit Address (FBA) (0-4), Bit Length Number (BLN) (0-4), and Starting Bit Address (SBA) (0-4). FBA, BLN and SBA define, respectively, the final bit, length, and starting bit of a requested data item as previously discussed with reference to PRMUX 20720. RBADL 23078 also receives chip select enable signals Address Translation Chip Select (ATCS) 00, 01, 02, 03, 04, and 15 from MIC 20122 and, in particular, RM 20722. When FIU 20120 is required to execute certain MSK 23018 operations, inputs FBA (0-4), BLN (0-4), and SBA (0-4), together with an ATCS input, are provided to RBADL 23078 from MIC 20122. RBADL 23078 in turn provides output RBA (Right Bit Address) (0-4), which has been described above with reference to DMSK (0-31) and RMSK (0-31). LBADL 23080 is similar to RBADL 23078 and is provided with inputs BLN (0-4), FBA (0-4), SBA (0-4), and ATCS 06, 07, 08, 09, and 05 from MIC 20122. Again, for certain MSK 23018 operations, LBADL 23080 will generate Left Bit Address (LBA) (0-4), which has been previously discussed above with reference to DMSK (0-31) and LMSK (0-31).

RBA (0-4) and LBA (0-4) are, respectively, transferred to RBAR 23086 and LBAR 23088 at start of second clock cycle by Pipeline Load Enable signal PIPELD provided from MIC 20122. RBAR 23086 and LBAR 23088 in turn respectively provide outputs Register Right Address (RRAD) (0-4) and Register Left Address (RLAD) (0-4) as address inputs to Right Mask Decode Logic (RMSKDL) 23092, Left Mask Decode Logic (LMSKDL) 23094, and FDL 23076 at start of second clock cycle. RRAD (0-4) and RLAD (0-4) correspond respectively to RBA (0-4) and LBA (0-4).

RMSKDL 23092 and LMSKDL 23094 are ROM arrays, having, as just described, RRAD (0-4) and RLAD (0-4) as, respectively, address inputs and Mask Enable (MSKENBL) from CPR 23084 as enable inputs. Together, RMSKDL 23092 and LMSKDL 23094 generate, respectively, RMSK (0-31) and LMSK (0-31) to MSK 23018. RMSK (0-31) and LMSK (0-31) are provided as inputs to Exclusive Or/Exclusive Nor gating (XOR/XNOR) 23096. XOR/XNOR 23096 also receives enable and selection signal Out Mask (OUTMSK) from CPR 23084. RMSK (0-31) and LMSK (0-31) inputs to XOR/XNOR 23096 are used, as selected by OUTMSK from CPR 23084, to generate a selected DMSK (0-31) as shown in FIG. 231. DMSK (0-31) output of XOR/XNOR 23096 is provided, as described above, to MSK 23018.

Referring again to IDL 23074, SHFAMTDL 23082 decodes certain control inputs from MIC 20122 to generate, through SHFR 23090, control inputs SHFT (0-4) and SGNSEL (0-4) to, respectively, DS 23016, SIGNSEL 23068 and MWG 23056. Address inputs to the PROMs comprising SHFAMTBL 23082 include FBA (0-4), SBA (0-4), and FLIPHALF (FLIPHALF) from MIC 20122. FBA (0-4) and SBA (0-4) have been described above. FLIPHALF is a control signal indicating, as described above, that 16 bits of data requested by IOS 10116 resides in the upper half of a 32 bit data word and causes those 16 bits to be transferred to the lower half of FIU 20120's output data word onto MIO Bus 10129. MIC 20122 also provides chip enable signals ATCS 10, 11, 12, 13, and 14. Upon receiving these control inputs from MIC 20122, SHFAMTDL 23082 generates an output shift amount (SHFAMT) (0-4) which, together with SBA (0-4) from MIC 20122, is transferred into SHFR 23090 by PIPELD at start of second clock cycle. SHFR 23090 then provides corresponding outputs SHFT (0-4) and SIGNSEL (0-4). As described above, SIGNSEL (0-4) are provided to SIGNSEL 23068 and MWG 23056 and MSK 23018. SHFT (0-4) is provided as SHFT (0-2) and SHFT (3-4) to, respectively, BYNL 23050 and BSL 23054 and DS 23016.

Referring to CPR 23084, as described above certain control signals are provided directly to FIU 20120 circuitry without being decoded by IDL 23074 or FDL 23076. Inputs to CPR 23084 include Sign Extension (SIGNEXT) and Lock (LOCK) indicating, respectively, that FIU 20120 is to perform a sign extension operation through MWG 23058 or a lock bit word operation through MWG 23056. CPR 23084 provides corresponding outputs SIGNEXT and LOCK to MSK 23018 to select these operations. Input Assembly Output Register (ASYMOR) and Blank Fill (BLANKFILL) are passed through CPR 23084 as ASYMOR and BLANKFILL to, respectively, MWG 23064 and MWG 23062 to select the output of ASYMR 23066 as a mask or to indicate that MSK 23018 is to generate a blank filled word through MWG 23062. Inputs OUTMSK and MSKENBL to CPR 23084 are provided, as discussed above, as enable signals OUTMSK and MSKENBL to, respectively, EXOR/ENOR 23096 and RMSKDL 23092 and LMSKBL 23094 and generating RMSK (0-31), LMSK (0-31), and DMSK (0-31) as described above.

Referring finally to ESPR 23098 and ESDL 23099, ESPR 23098 and PPLR 23072 together comprise a pipeline register and ESDL 23099 decoding logic for providing enable signals to FIU 20120 and other MEM 10112 circuitry. ESPR 23098 receives inputs Drive MOD Bus (DRVMOD) (0-1), Drive MIO Bus (DRVMIO) (0-1), and Enable Register (ENREG) (0-1) from MIC 20122 as previously described. DRVMOD (0-1), DRVMIO (0-1), and ENREG (0-1) are transferred into ESPR 23098 by PIPELD as previously described with reference to PPLR 23072. ESPR 23098 provides corresponding outputs to ESDL 23099, which in turn decodes DRVMOD (0-1), DRVMIO (0-1), and ENREG (0-1) to provide enable signals to FIU 20120 and other MEM 10112 circuitry. Outputs DRVSHFMOD, DRVASYMOD, DRVSHFMIO, and DRVASYMIO are provided to DSMOD 23036, DSMIO 23038, ASYMOD 23040, ASYMIO 23042, and FIUIO 23014 to control transfer of FIU 20120 manipulated data words onto MOD Bus 10144 and MIO Bus 10129. Outputs IARMEO, JWDEO, IWDEO, and RIDEO are provided as output enable signals to IARMR 23044, JWDR 23022, IWDR 23024, and RIDR 23026 to transfer the contents of these registers onto IB Bus 23030 as previously described. Outputs DRVCAMOD, DRVCAMID, DRVBYMOD, and DRVBYMIO are provided, as described further in the following description of MC 20116, to MC 20116 for use in controlling transfer of information onto MOD Bus 10144 and MIO Bus 10129.

Having described the structure and operation of FIU 20120, structure and operation of MC 20116 will be described next below.

j. Memory Cache 20116 (FIGS. 232, 233)

Figure 232:
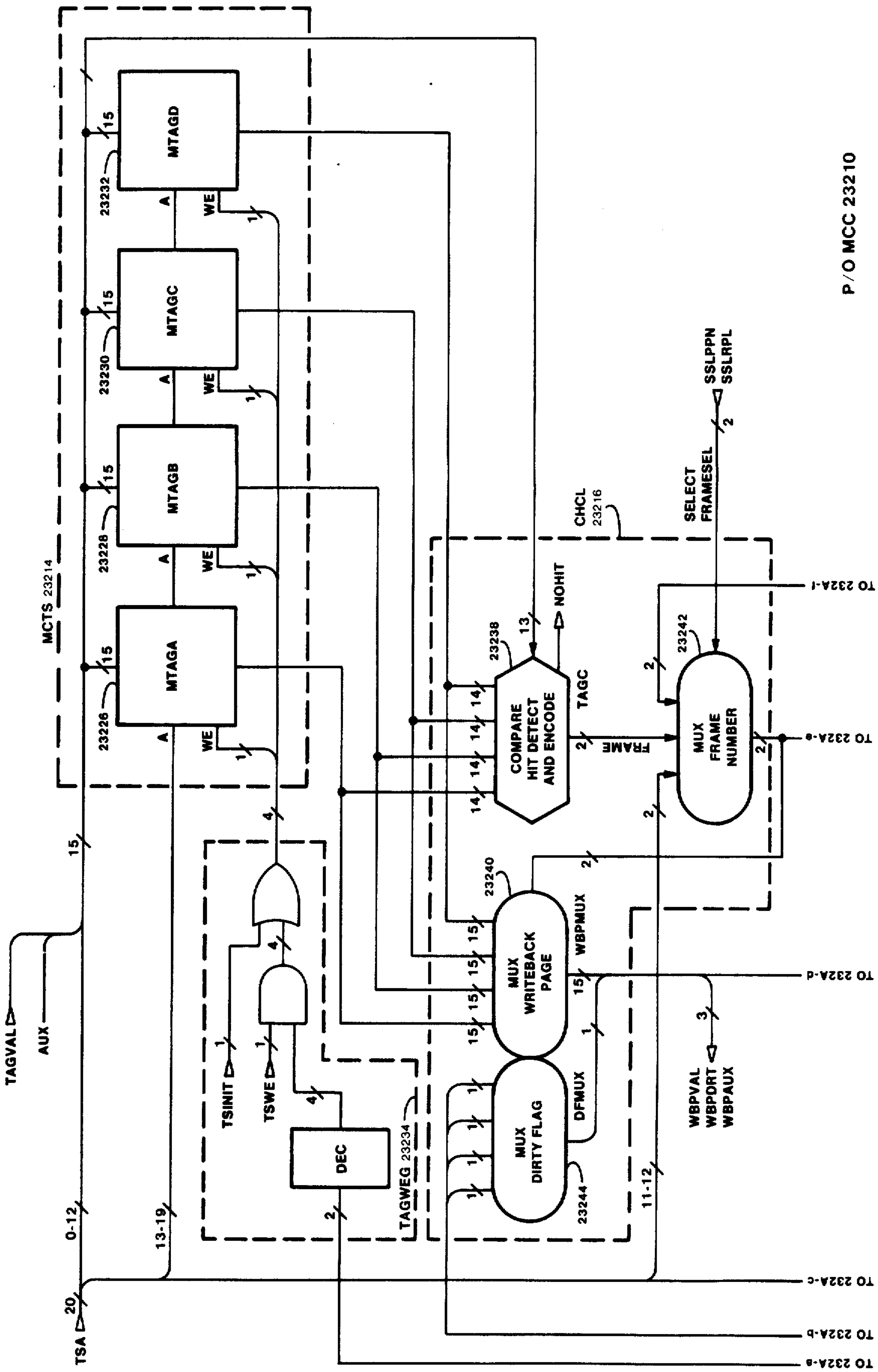
FIGS. 232, 232A and 232B are is a detailed block diagram of a cache.
Figure 232A:
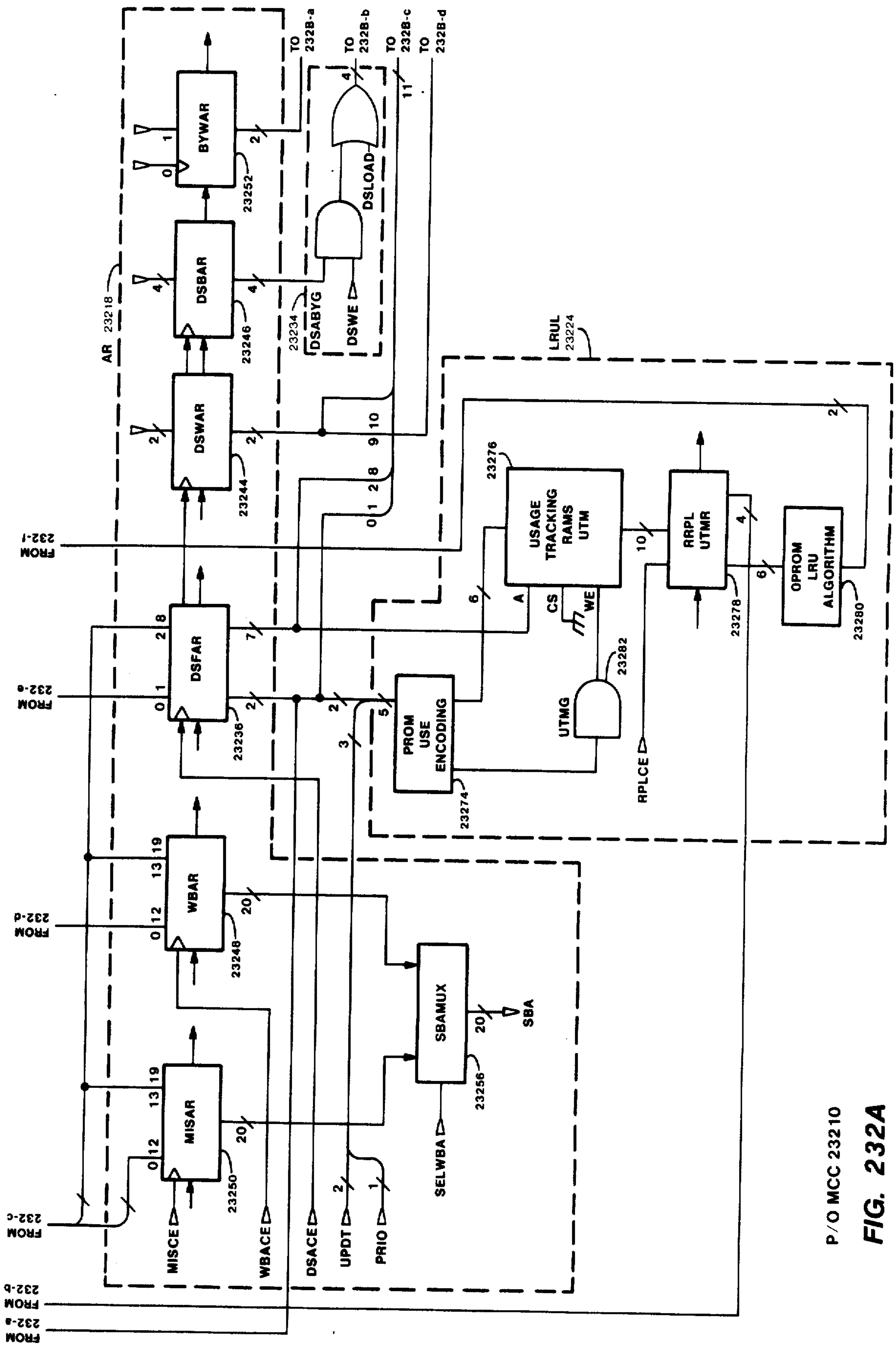
Figure 232B:
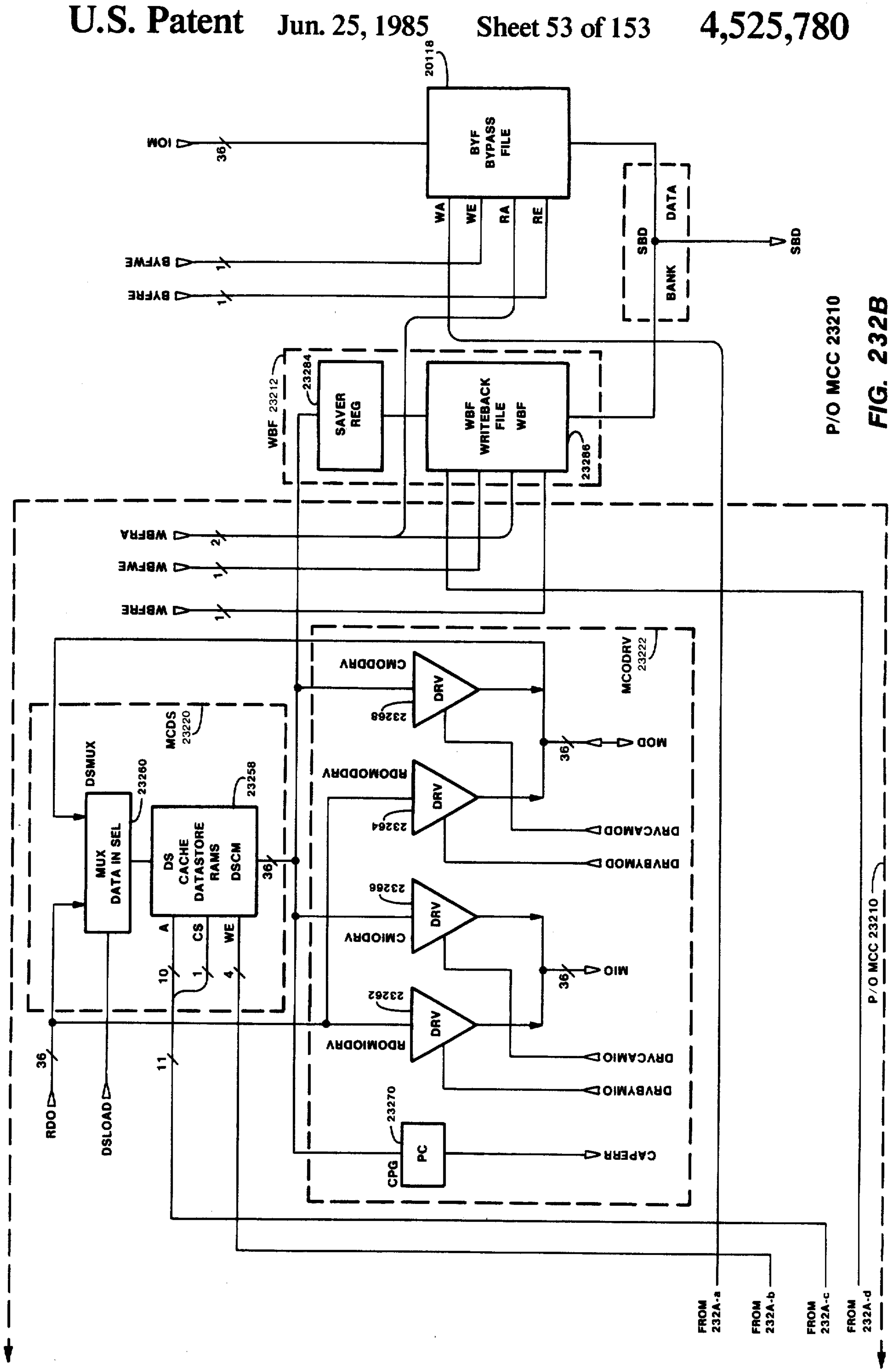
Figure 233:
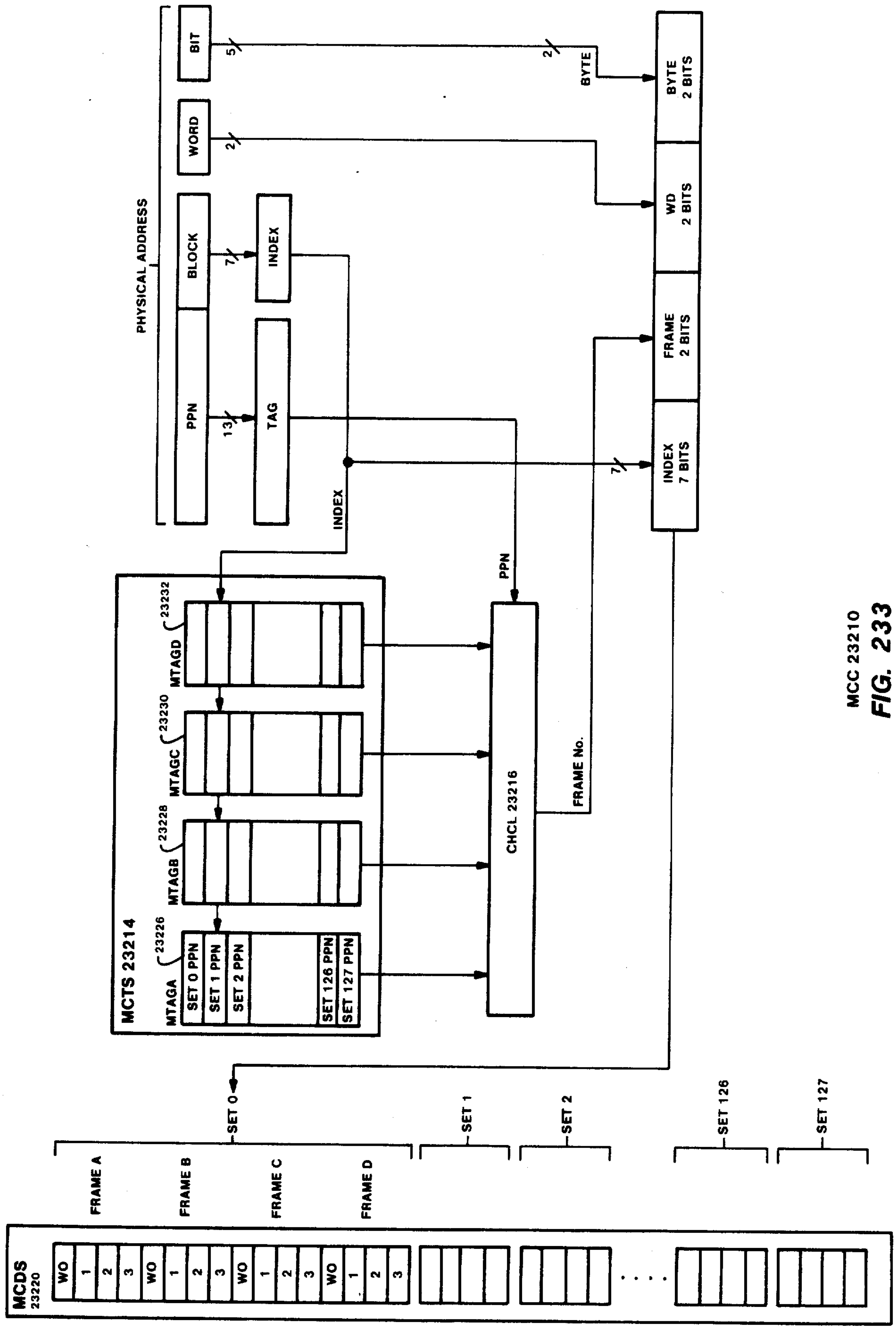
FIG. 233 is a diagram illustrating cache operation.

Referring to FIG. 232, a partial block diagram of MC 20116 is shown. MC 20116 includes, as previously described, MC Cache (MCC) 23210, Bypass File (BYF) 20118, and Write Back File (WBF) 23212. MCC 23210 will be described first, followed by WBF 23212, and finally by BYF 20118.

As indicated in FIG. 232, MCC 23210 includes MC Tag Store (MCTS) 23214, Cache Hit Comparison Logic (CHCL) 23216, Data Store Address Registers (AR) 23218, MC Data Store (MCDS) 23220, MC Output Drivers (MCODRV) 23222, and Least Recently Used Logic (LRUL) 23224.

As previously described, MC 20116 and, in particular, MCC 23210, is MEM 10112's second or high speed level of data storage. MC 20116 is the primary path of data transfer between MSB 20110 and JP 10114 and IOS 10116. MCC 23210 contains that data presently being used by JP 10114 and IOS 10116. As JP 10114 and IOS 10116 execute processes, data is transferred between MCC 23210 and MSB 20110 in a manner to update the contents of MCC 23210 in accordance with execution of those processes, that is so that MCC 23210 always contains that data currently required by JP 10114 or IOS 10116. As previously described, updating of the data contents of MCC 23210 requires data to be written back to MSB 20110. Write back operations are accomplished, as described further below, through WBF 23212. In addition, and as also previously described, IOS 10116 may write and read complete blocks of four words directly from MSB 20110, bypassing MCC 23210. Bypass write operations are accomplished, as described further below, through BYF 20118.

1. General Cache Operation (FIG. 233)

Referring to FIG. 233, a partial diagramic representation of MCC 23210 is shown and will be used in describing overall structure and operation of MCC 23210. MCC 23210 is an 8-K byte, 4-way set, associative cache which is word readable and byte writable. MCDS 23220 is MCC 23210's data store, that is contains all data stored in MCC 23210. MCDS 23220 may contain, for example, up to 2,048 data words, each data word comprising 32 bits, or 4 bytes, of data plus 4 bits of byte parity.

MCDS 23220's internal structure is divided into 128 sets, sets 0-127, wherein each set contains four cache frames, that is Frames A, B, C, and D. Each cache frame, for example Frame A of Set 0, contains four 36 bit words, that is 32 bits of data plus 4 bits of parity as described above.

Data storage locations in MCDS 23220 are selected, for data read or write operations, by physical addresses provided from IO Port 20910, JPO Port 21010, and JPI Port 21110. As indicated in FIG. 233, physical addresses provided to MCC 23210 are comprised of a 13 bit Physical Page Number (PPN) field, a 7 bit Block (BLK) within physical page field, a 2 bit Word (WD) with block field, and a 4 bit Byte Write Enable (BYTE) within word field. BYTE field is generated from the two most significant bits of a physical addresses bit within word field, previously described. A physical address provided to MCC 23210 may, therefore, individually identify each of 2 data words. MCDS 23220, however, has a capacity in the present example of 2,048 data words. In addition, data words are not stored in MCDS 23220 in a predetermined sequence but are stored therein as data storage spaces become available as data is transferred into and out of MCDS 23220. It is, therefore, necessary to translate between physical addresses and data store addresses (DSA), which are used to access MCDS 23220's data storage space. As indicated in FIG. 233, a DSA is comprised of a 7 bit Index (INDEX) field, a 2 bit Frame number (FRAME) field, a 2 bit Word (WD) field, and a 4 bit Byte Write Enable (BYTE). INDEX field is taken directly from BLK field of physical address and identifies a particular set of MCDS 23220's 128 sets. FRAME field identifies a particular frame within that set. WD field is taken directly from physical addresses WD field and identifies a particular word within that frame. BYTE field is similarly generated from physical addresses BYTE field and bytes to be written within that word. Because a DSA INDEX field is taken directly from a physical address BLK field, MCDS 23220's address space corresponds to MEM 10112's physical address space on a block by block basis. That is, all words within a particular block identified by a particular physical address block field will, if present in MCDS 23220, reside in a particular corresponding one of MCDS 23220's 128 sets. Similarly, a particular word within a given block will always reside in a corresponding particular one of four possible word spaces in the set selected by block field. For example, if a particular physical address's block field has indicated set zero and word field has indicated word two, corresponding data word space in MCDS 23220 will reside in set zero, word two of Frames A, B, C, or D. Finally, physical address byte write enable field corresponds directly to an MCDS 23220 byte locations within words.

A physical address's BLK, DWD, and BYTE fields are, therefore, sufficient to define within MCDS 23220's address space, a particular set, one of four word locations within that set, that is a word space and Frames A, B, C, or D, and the bytes to be written within one of those four words. A physical addresses PPN field is, however, necessary to uniquely define any particular word in MEM 10112's address space and correspondingly, to identify the particular frame in a set in which a word identified by a physical address is located. FRAME field of ASDA identifies a particular frame and is provided by MCTS 23214. MCTS 23214 contains the PPN fields, referred to as "Tags" of all words residing in MCDS 23220. As indicated in FIG. 233, MCTS 23214 is comprised of Tag Memory A (MTAGA) 23226, Tag Memory B (MTAGB) 23228, Tag Memory C (MTAGC) 23230, and Tag Memory D (MTAGD) 23232. MTAGA 23226 contains the PPN's, that is tags, of all words residing in frames A of sets 0 to 127 of MCDS 23220. Similarly, MTAGB 23228, MTAGC 23230 and MTAGD 23232 contain tags of words residing in, respectively, frames B, C, and D of sets 0 to 127. MTAGA 23226 to MTAGD 23232 are addressed by INDEX and correspondingly provide the tags (PPN) of those data words residing in frames A to D of the set selected by INDEX. If a requested data word is contained in MCDS 23220, at least one of MTAGA 23226 to MTAGD 23232 will respond by providing a corresponding tag. The finding of a MCC 23210 entry corresponding to a physical address submitted to MCC 23210 is referred to as a cache "hit". TAG outputs of MTAGA 23226 to MTAGD 23232 are compared to physical addresses PPN field by CHCL 23216. CHCL 23216 identifies which of MTAGA 23226 to MTAGD 23232 responded with a tag corresponding to physical address PPN field and generates a corresponding FRAME identifying the frame within a set in which the desired data word is located. That data word may then be read from MCDS 23220.

Having described overall operation of MCC 23210, structure and operation of MCC 23210 will be described in further detail below.

2. Memory Cache 20116's Cache MCC 23210 (FIG. 232)

Referring to FIG. 232, MCC 23210, corresponding to MCC 23210 of FIG. 232, is shown. As described above, MCTS 23214 contains the tags, that is PPN fields, of physical addresses of all data words stored in MCDS 23220. In addition to containing thirteen bits of TAG for corresponding entries in MCDS 23220, each entry in MTAGA 23226 to MTAGD 23232 includes a validity bit and auxiliary bit. Auxiliary bit may be used as a flag to indicate special conditions while validity bit indicates that valid data has been written into the corresponding MCDS 23220 entry. If the validity bit of a MCTS 23214 entry has not been set, that MCTS 23214 entry will not be considered by CHCL 23216 in comparing INDEX to MCTS 23214's tag outputs.

As indicated in FIG. 232, MTAGA 23226 to MTAGD 23232 are each 128 word by fifteen bit random access memories, comprised for example of 93422 256X4 RAMs. Data inputs of MTAGA 23226 to MTAGD 23232 are connected from TSA Bus 21210 from PRMUX 20720 to receive the PPN fields or Tags, of data words being written into MCDS 23220. MTAGA 23226 to MTAGD 23232 data inputs also receive Tag Valid (TAGVAL) and Auxiliary (AUX) bits from MIC 20122 as described above. MTAGA 23226 to MTAGD 23232 address inputs are also provided from TSA Bus 21210 and comprise the BLK fields, or INDEX, of physical addresses data words being written into or read from MCDS 23220. Individual Write Enable (WE) inputs are provided to MTAGA 23226 to MTAGD 23232 when TAGs are to be written into MCTS 23214. MTAGA 23226 to MTAGD 23232 WE inputs are provided from Tag Write Enable Gates (TAGWEG) 23234. Enable inputs Tag Store Initiate (TSINIT) and Tag Store Write Enable (TSWE) are provided to TAGWEG 23234 from MIC 20122, and in particular from RM 20722. A frame number input selecting one of MTAGA 23226 to MTAGD 23232 to be written into is provided to TAGWEG 23234 from Data Store Frame Address Register (DSFAR) 23236, described further below.

Tag outputs of MTAGA 23226 to MTAGD 23232 are provided to CHCL 23216, and in particular to Tag Comparitor (TAGC) 23238 and Write Back Page Multiplexer (WBPMUX) 23240. In addition to four tag inputs from MCTS 23214, TAGC 23238 receives TAG input, that is PPN field of physical address, from TSA Bus 21210 and PRMUX 20720 as previously described. TAGC 23238, as described above, compares TAG inputs from MCTS 23214 and PPN input. TAGC 23238 then provides a two bit encoded output, FRAME, indicating whether TAG corresponding to INDEX has been located in either MTAGA 23226, MTAGB 23228, TAGC 23230, or MTAGD 23232. If no corresponding TAG has been found, TAGC 23238 indicates that the requested data is not contained within MCC 23210, that is that a cache miss has occurred, by asserting output No Hit (NOHIT) to MIC 20122.

As stated above, WBPMUX 23240 also receives TAG outputs of MCTS 23214. WBPMUX 23240 also receives a two bit select input from Frame Select Mux (FRAMESMUX), described further below. WBPMUX 23240's select input selects, as WBPMUX 23240's output, that TAG input from MCTS 23214 corresponding to an INDEX to TAGC 23238. While a load is in progress, the new PPN of the block being loaded in the cache is written into the corresponding tag store. Before the new TAG is written, the old TAG is read out via WBPMUX 23240 that corresponds to the data that is being written back to MSB 20110. As will be described further below, this TAG information is captured for subsequent use by WBF 23212 in executing a write back operation wherein data is read from MCC 23210 and written back into MSB 20110.

Associated with WBPMUX 23240 is Dirty Flag Multiplexer (DFMUX) 23244. DFMUX 23244 receives the same two bit frame select input as provided to WBPMUX 23240 but receives dirty bit data inputs from, as described further below, LRUL 23224. As will be described below, LRUL 23224 includes a memory operating parallel to MCTS 23214 and MCDS 23220. In part, LRUL 23224 memory includes a "dirty bit", or "dirty flag", for each entry in MCDS 23220 and corresponding TAG and MCTS 23214. LRUL 23224's dirty flags indicate, for each corresponding entry in MCTS 23214 whether that entry has been written into, that is presently contains different data than a corresponding entry in MSB 20110. Upon occurrence of a cache miss, therefore, DFMUX 23244 provides a single dirty bit output referring to the corresponding entry in MCTS 23214. If WBF 23212 is to perform a write back operation, the single dirty bit output of DFMUX 23244 is provided to MIC 20122 as Write Back Page Dirty (WBPDRT) to indicate that that particular MCDS 23220 entry is dirty and must be written back to MSB 20110 rather than discarded. Also provided to MIC 20122 are outputs Write Back Page Validity (WBPVAL) and Write Back Page Auxiliary Bit (WBPAUX) from WBPMUX 23240. As described above, these outputs to MIC 20122 are taken from miss entries in MCTS 23214. Where a cache miss has occurred and an entry is to be written back to MSB 20110, WBPVAL indicates whether that entry and MCDS 23220 is valid. If that entry does not contain valid data, WBPVAL will indicate, despite assertion of WBPDRT, that that entry need not be written back to MSB 20110. WBPAUX is, as described above, an auxiliary bit which may be used to indicate special conditions.

As previously described with reference to FIG. 233 CHCL 23216 provides a two bit FRAME output comprising FRAME field of a DSA to MCDS 23220. FRAME output is provided by FRAMESMUX 23242. FRAMESMUX 23242 receives three two bit FRAME number inputs, and any one of which may be selected to be CHCL 23216's FRAME output. A first FRAME number input of FRAMESMUX 23242 is FRAME number output of TAGC 23238 and is FRAME number of an MCTS 23214 entry, in corresponding MCDS 23220 entry, corresponding to an INDEX of a memory request. FRAME number output of TAGC 23238 is provided as FRAME number output of FRAMESMUX 23242 when a memory request is submitted to MCC 23210 to determine whether requested data is resident in MCC 23210. If, as previously described, a cache hit occurs, that is the requested data is contained in MCDS 23210, FRAME number output of FRAMESMUX 23242 will be that of the corresponding entry in MCDS 23220.

A second input of FRAMESMUX 23242 is two bits provided from INCREG 21211 through TSA Bus 21210 from PRMUX 20720. As previously described, INCREG 21211 generates sequential MCC 23210 addresses, for example during cache flush operations. FRAMESMUX 23242 FRAME number output will therefore be provided from INCREG 21210 during cache flushes in order to select each of the frames.

FRAMESMUX 23242's third FRAME number input is provided from LRUL 23224 and, as described below, is used to select the least recently used frame of a particular MCDS 23220 set. FRAMESMUX 23242's FRAME number input LRUL 23224 is provided as FRAMESMUX 23242's FRAME number output during write back operations in which least recently used frames of MCDS 23220 are written back to MSB 20110, as described in an above description of WBPMUX 23240.

Selection between FRAMESMUX 23242's three FRAME number inputs is controlled by two bit Frame Select (FRAMESEL) input from MIC 20122. A first bit of FRAMESEL is Source Select Physical Page Number (SSLPPN) used, in general, during all MCC 23210 read and write operations. A secod bit of FRAMESEL is Source Select Replace (SSLRPL) which, in particular, selects FRAMESMUX 23242's input from LRUL 23224 during, for example, write back operations when data in MCDS 23220 is replaced by new data and the replaced data read back to MSB 20110.

As previously described, an MCC 23210 access operation is executed in two clock cycles. During first clock cycle, MCTS 23214 is read, resulting TAG outputs are compared to INDEX, and FRAMESMUX 23242 provides a corresponding FRAME number output or TAGC 23238 indicates a cache miss by asserting NOHIT. At start of second clock cycle, FRAMESMUX 23242's FRAME number output, together with INDEX, WD, and byte write enable fields of physical address, are transferred into Address Registers (AR) 23218. During second clock cycle, address information residing in AR's 23218 is provided for example, to MCDS 23220 to read or write data stored therein. AR 23218 includes Data Store Frame Address Register (DSFAR) 23236, Data Store Word Address Register (DSWAR) 23244, and Data Store Byte Address Register (DSBAR) 23246, all of which provide address information to MCDS 23220 for use in reading data from or writing data into MCDS 23220. AR 23218 also includes Write Back Address Register (WBAR) 23248, storing address information for use in write back operations, and Miss Address Register (MISAR) 23250, storing physical address of memory requests resulting in a cache miss. Bypass Write Address Register (BYWAR) 23252 is, as described further below, used by BYF 20118 in writing data into BYF 20118 bypass write operations. DSFAR 23236, DSWAR 23244, DSBAR 23246, WDAR 23248, MISAR 23250, and BYWAR 23252 may be comprised, for example, of SN74S194 registers.

Referring first to DSFAR 23236, DSWAR 23244, and DSBAR 23246, as stated above these registers provide data store addresses to MCDS 23220 for use in writing data into or reading data from MCDS 23220. DSFAR 23236 receives two bits of FRAME number from CHCL 23216 and seven bits of INDEX from TSA Bus 21210 from PRMUX 20720. DSFAR 23236 in turn provides FRAME number and INDEX to LRUL 23224, described further below, and as part of address input to MCDS 23220. As previously described, DSFAR 23236 provides FRAME number to TAGWEG 23234 for tag loads.

DSWAR 23234 receives two bits of WD field, indicated as Next Data Store Word (NEXTDSW) (0-1) from MIC 20122. DSWAR 23234 in turn provides two bits of WD field as part of address input to MCDS 23220. DSBAR 23246 receives four bits of BYTE field, Next Bytes (NEXTBYTES) (0-3) from MIC 20122. DSBAR 23246 in turn provides four bits of byte field as part of data store byte write enables to MCDS 23220. DSBAR 23246's output is gated in Data Store Address Byte Gates (DSABYG) 23254 by Data Store Write Enable (DSWE) and Data Store Load (DSLOAD) from MIC 20122. DSWE is asserted during write operations to MCDS 23220 and DSLOAD is asserted during a MCDS 23220 load operation. As previously described, all MCDS 23220 read accesses are on word boundaries whereas load and write operations are on byte boundaries Therefore, unless DSWE and DSLOAD are asserted, a MCDS 23220 read access is indicated and BYTE field of MCDS 23220 address is ignored. Finally, addresses are transferred into DSFAR 23236, DSWAR 23244, and DSBAR 23246 upon assertion of Data Store Address Chip Enable (DSACE) to enable inputs of DSFAR 23236, DSWAR 23244, and DSBAR 23246. DSACE is provided from MIC 20122.

Referring to MISAR 23250, MISAR 23250 captures block addresses of all references to MCC 23210 during first clock cycle of a MCC 23210 cache read or write operation. If a cache miss occurs, MISAR 23250 contents are locked, thus saving block address of a memory reference resulting in a cache miss. Address output of MISAR 23250 is provided, as described further below, to BC 20114 for use in servicing that cache miss. Data inputs to MISAR 23250 includes twenty bits of physical address from TSA Bus 21210 from PRMUX 20720. Address information provided to MISAR 23250 is transferred into MISAR 23250 by assertion of Miss Chip Enable (MISCE) from MIC 20122 to enable input of MISAR 23250. MISAR 23250 contents are locked therein by dropping MISCE.

WBAR 23248 is, as described previously, provided with TAG, that is PPN, address information through WBPMUX 23240 upon occurrence of a cache miss, that is when a memory request results in the requested data not being located in MCC 23210. WBAR 23248 also receives INDEX, or BLK field a physical address, from TSA Bus 21210. WBAR 23248 thereby captures block address of all MCC 23210 references resulting in a cache miss. WBAR 23248 is only loaded on a cache miss that results in a cache load in order to provide the address for data to be written back to MSB 20110. This address information is saved by WBAR 23248 for subsequent use in performing write back operations when data is displaced from MCC 23210 to be written back into MSB 20110. Address information is transferred into WBAR 23248 upon assertion of Write Back Address Chip Enable (WBACE) to WBAR 23248 enable input from MIC 20122.

In case of a cache miss or a requirement for a write back operation, address of missed cache reference from MISAR 23250 or address of data to be written back into MSB 20110 from WBAR 23248 is provided to BC 20114 through SBA Bus 20152. As indicated in FIG. 232, address outputs of MISAR 23250 and WBAR 23248 as provided as inputs to SBAMUX 23256. Address output of SBAMUX 23256 is provided to SBA Bus 20152. Selection between address outputs of MISAR 23250 and WBAR 23248 is provided by selection input Select Write Back Address (SELWBA) to SBAMUX 23256 from MIC 20122.

Finally, BYWAR 23252 provides to BYF 20118 address information regarding data to be written into BYF 20118 during bypass write operations. In particular, BYWAR 23252 data input is Next Bypass Write (NEXTBYW) (0-1) which is a two bit address specifying which of four data storage locations in BYF 20118 that a 36 bit data word from IOM Bus 10130 is to be written. A NEXTBYW (0-1) address is transferred into BYWAR 23252 when Bypass Write Chip Enable (BYWCE) to BYWAR 23252's enable is asserted by MIC 20122. As indicated in FIG. 232, NEXTBYW (0-1) is provided from BYWAR 23252 as Write Address input (WA) to BYF 20118 which will be described further below.

Referring to MCDS 23220, as previously described MCDS 23220 is MCC 23210's data store. MCDS 23220 includes Data Store Cache Memory (DSCM) 23258 and Data Store Multiplexer (DSMUX) 23260. DSCM 23258 is a 2,048 word by 36 bit random access memory comprised, for example, of 93425A 1KX1 RAMs and DSMUX may be comprised, for example, of compatible multiplexers.

As previously described, data may be written into MCDS 23220, and in particular into DSCM 23258, from MSB 20110 through BC 20114. Data may also be written into MCDS 23220 from MOD Bus 10144, for example when MOD Bus 10144 is used as MEM 10112 internal data bus for transferring data between FIU 20120 and MCDS 23220. As shown in FIG. 232, data inputs to DSMUX 23260 are provided from RDO Bus 20158 from BC 20114, and from MOD Bus 10144. DSMUX 23260 in turn provides data input to DSCM 23258. Selection of RDO Bus 20158 or MOD Bus 10144 as data input to DSCM 23258 is provided by Selection Input Data Store Load (DSLOAD) to DSMUX 23260 from MIC 20122.

Data read and write address inputs to DSCM 23258 include Ten Bit Address (A) input, Single Bit Chip Select (CS) input, and Four Bit Write Enable (WE) input. Ten Bit A input and Single Bit CS input are provided from DSFAR 23236 and DSWAR 23244 as previously described. Four Bit WE input is provided from DSBAR 23246 through DSABYG 23254. DSBAR 23246's byte write enable field address output is used as write enable input DSCM 23248 because, as previously discussed, DSCM 23258 is byte addressable only during write operations while all read operations are word addressable.

DSCM 23258 provides 36 bit data word output, that is 32 bits of data plus four bits of odd byte parity, to MCODRV 23222. MCODRV 23222 is comprised of driver gates for selectively transferring data words read from DSCM 23258 onto MIO Bus 10129 and MOD Bus 10144. MCODRV 23222 also transfers data present on RDO Bus 20158 directly onto MIO Bus 10129 and MOD Bus 10144 during bypass read operations.

MCODRV 23222 includes RDO Bus To MIO Bu Driver (RDOMIODRV) 23262 and RDO Bus To MOD Bus Driver (RDOMODDRV) 23264 for selectively transferring data from RDO Bus 20158 to, respectively, MIO Bus 10129 or MOD Bus 10144. Data is transferred from RDO Bus 20158 to MIO Bus 10129 or MOD Bus 10144 when RDOMIODRV 23262 or RDOMODDRV 23264 are enabled by, respectively, enable signals Drive Bypass To MIO (DRVBYMIO) and Drive Bypass To MOD (DRVBYMOD) from FIU 20120. Data is transferred from DSCM 23258 to MIO Bus 10129 or MOD Bus 10144 through, respectively, Cache To MIO Driver (CMIODRV) 23266 or Cache To MOD Driver (CMODDRV) 23268. Data from DSCM 23258 is transferred onto MIO Bus 10129 or MOD Bus 10144 when CMIODRV 23266 or CMODDRV 23268 by, respectively, enable inputs DRV Cache To MIO (DRVCAMIO) to CMIODRV 23266 and Drive Cache To MOD (DRVCAMOD) to CMODDRV 23268.

Also included in MCODDRV 23268 is Cache Parity Generator (CPG) 23270. CPG 23270 receives 36 bit data words read from DSCM 23258 and examines parity therein for correctness. CPG 23270 in turn generates Cache Parity Error (CAPERR) to MIC 20122 when a parity error is detected in a data word read from MCDS 23220.

Referring finally to LRUL 23224, LRUL 23224 tracks, for each MCDS 23220 set, which are most and least recently used frames. This information is then used in selecting frames whose data is to be read back to MSB 20110 when it is necessary to displace data from DSCM 23258 to provide memory space for data to be written therein. LRUL 23224 includes Use Encoding Logic (UEL) 23274, Usage Tracking Memory (UTM) 23276, Usage Tracking Register (UTR) 23278, and Least Recently Used Algorithm Logic (LRUAL) 23280. UEL 23274 receives current FRAME number output from DSFAR 23236, indicating which frame of a set is currently being used, together with UPDT and PRIO from MCU 22210 in MIC 20122. UEL 23274 generates, for each DSCM 23258 set currently being accessed, a six bit code indicating relative usage of the four frames therein. These six bits indicate, respectively, that: frame A has been referenced since frame B was referenced (AsB), AsC, AsD, BsC, BsD, and CsD. UTM 23276 is a 128 word by ten bit memory comprised, for example, of 93425A RAMs. UTM 23276 contains a usage word entry for each of DSCM 23258's 128 sets. Each usage word is comprised of six bits of usage information provided from UEL 23274 and four dirty flag bits, that is one dirty flag bit for each frame in a particular DSCM 23258 set. In addition to six bits of usage code from UEL 23274, UTM 23276 receives an Address (A) input from DSFAR 23236 comprising seven INDEX bits identify the DSCM 23258 set currently being accessed. Write Enable (WE) input to UTM 23276 is provided from UTM Gate (UTMG) 23282. Inputs of UTMG 23282 include an enable bit from UEL 23274 indicating when data is being written into a particular frame DSCM 23258 and Use Write Enable (USEWE) input from MIC 20122 indicating that a usage word is to be written into UTM 23276. UTM 23276 uses its Address (A) and Write Enable (WE) inputs to generate dirty flag bits for each usage word currently being written into UTM 23276. Upon each access of a DSCM 23258 frame, UTM 23276 provides a corresponding ten bit usage word output to UTMR 23278 where that information is captured for subsequent use. In particular, usage words are transferred into UTMR 23278 when it is necessary to displace a data word from DSCM 23258. Transfer of a usage word into UTMR 23278 is enabled by enable signal Replace Chip Enable (RPLCE) from MIC 20122. UTMR 23278 may be comprised of, for example, a SN74S194 register.

UTMR 23278 provides, for each usage word captured therein, four bits of dirty flag to DFMUX 23244 as previously described. This information is used by MIC 20122 in write back operations to determine whether a particular block is "dirty" and must thus be written back into MSB 20110 rather than discarded. The six bits of usage information of a usage word captured in UTMR 23278 are provided to LRUAL 23280 and are used therein to indicate which frame of a DSCM 23258 set currently being accessed is least recently used and thus should be replaced when it is necessary to make DSCM 23258 memory space available for further data. LRUAL 23280 decodes each usage word's six usage bits and provides a corresponding least recently used FRAME input to FRAMESMUX 23242 as previously described. Least recently used FRAME numbers are used in generating addresses to DSCM 23258 to read data words from DSCM 23258 when executing write back operations and for reading old page numbers for MCTS 23214 and writing new page numbers into MCTS 23214.

Referring to WBF 23212, as previously described WBF 23212 is a buffer register file for transfer of displaced data from DSCM 23258 to MSB 20110. All data writes or reads to or from MSB 20110 are in full four word blocks. Similarly, when data is to be displaced from DSCM 23258 and written back to MSB 20110, a full four word block is transferred. WBF 23212 includes Saver Register (SAVER) 23284 which captures all thirty-six bit data words read from DSCM 23258. If those data words read from DSCM 23258 are to be subsequently written back to MSB 20110, they are transferred from SAVER 23284 to Write Back File Memory (WBFM) 23286. WBFM 23286 is a four word by thirty-six bit memory comprised, for example, of SN74LS70 4×4 register files. WBFM 23286 receives and stores four data words, or one block, at a time of data to be transferred to MSB 20110. In addition to data word input from SAVER 23284, WBFM 23286 receives the word portion of Write Address (WA) from DSWAR 23244, as previously described, and a Write enable input Write Back File Write Enable (WBFWE) from MIC 20122. These write address and enable inputs are used in writing words from DSCM 23258 through SAVER 23284 to WBFM 23286. WBFM 23286 receives separate read address and enable inputs, Write Back File Read Address (WBFRA) (0-1) and Write Back File Read Enable (WBFRE) from BC 20114. These read address enable inputs are provided by BC 20114 to read data words from WBFM 23286 to BC 20114. Data output of WBFM 23286 is provided to Store Back Data (SBD) Bus 20146 to BC 20114.

Finally, as previously described, data may be written to or read from MSB 20110 directly in full four word block transfers bypassing MCC 23210. As previously described, bypass reads are accomplished through RDO Bus 20156 and RDOMIODRV 23262 or RDOMODDRV 23264. In a bypass read operation, therefore, four data words at a time are read directly from MSB 20110 through BC 20114 to MIO Bus 10129 or MOD Bus 10144.

BYF 20118 is used for bypass write operations and includes a full word by thirty-six bit buffer register. BYF 20118 receives four data words, not necessarily in four consecutive clock cycles, from IOM Bus 10130 and subsequently transfers four data words at a time to BC 20114 in four consecutive clock cycles. In both WBF 23212 and BYF 20118, data words may be concurrently written into and read from WBF 23212 and BYF 20118 so long as the same address is not written into during the same clock cycle that address is being read. As indicated in FIG. 232, BYF 20118 receives, in addition to data inputs from IOM Bus 10130, separate write and read address and enable inputs. BYF 20118 write address input is, as previously described, provided from BYWAR 23252. Write enable input Bypass File Write Enable (BYFWE) is provided from MIC 20122. BYF 20118 read address input, Write Back File Read Address (WBFRA) (0–1) is provided from BC 20114, as is BYF 20118 Read Enable input BYFRE. BYF 20118 write operations are thus controlled by MIC 20122 and MCC 23210 while BYF 20118 read operations are controlled by BC 20114.

Having described the structure and operation of MC 20116, the structure and operation of MA's 20112 will be described below, followed by structure and operation of BC 20114. MA's 20112 are described before BC 20114 to aid in understanding operation of BC 20114.

k. Memory Arrays MA 20112 (FIGS. 234, 235, 236)

As previously described, MSB 20110 comprises MEM 10112's first, or bulk, level of data storage. MSB 20110 includes one to, for example, sixteen MA 20112's, each of which contains a portion of MEM 10112 bulk data storage. Each MA 20112 may contain, for example, 256 Kilobytes, 512 Kilobytes, 1 Megabyte, or 2 Megabytes of data storage. MEM 10112's physical address space, and physical data storage space, is organized in segments of 256 Kilobytes each. Each MA 20112 is referred to as a data module and may therefore contain between one and eight segments of data storage capacity. As will be described further below, MSB 20110's and MA 20112's, addressing circuitry is designed to allow addressing of up to 64 segments. Memory capacity of individual MA 20112's may therefore be increased if required. As also will be described below, an MA 20112's data storage capacity may be increased without requiring modifications of MSB 20110's or BC 20114's addressing circuitry or operation. All data writes to or reads from MSB 20110, that is MA's 20112, are comprised of four word blocks as previously described. That is, each write to or read from MSB 20110 is comprised of a sequential transfer of four data words. Each data word residing in MSB 20110 is comprised of thirty-two bits of data plus seven bits of error correcting hamming code.

Figure 234:
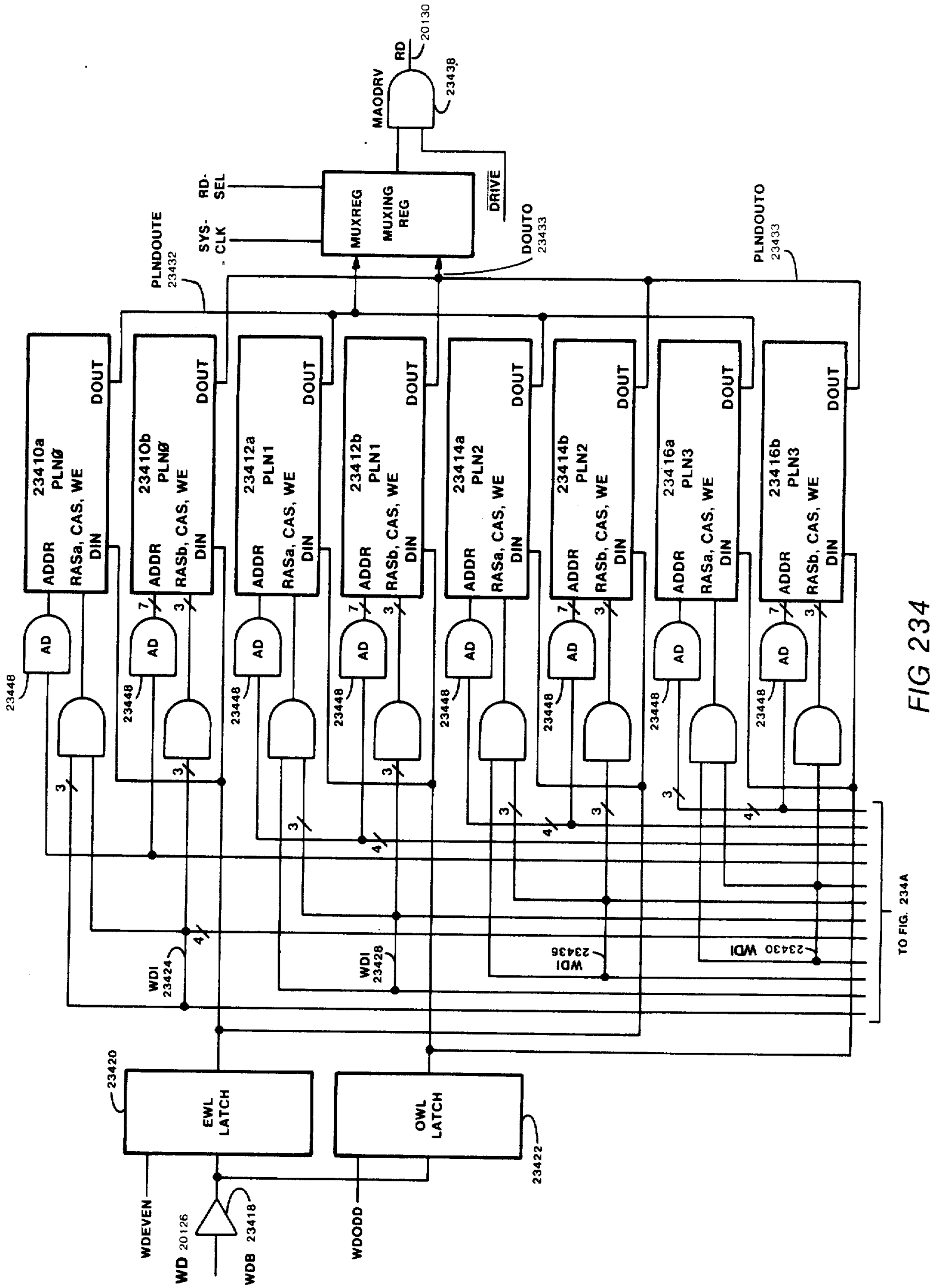
FIGS. 234 and 234A are a detailed block diagram of a memory array.
Figure 234A:
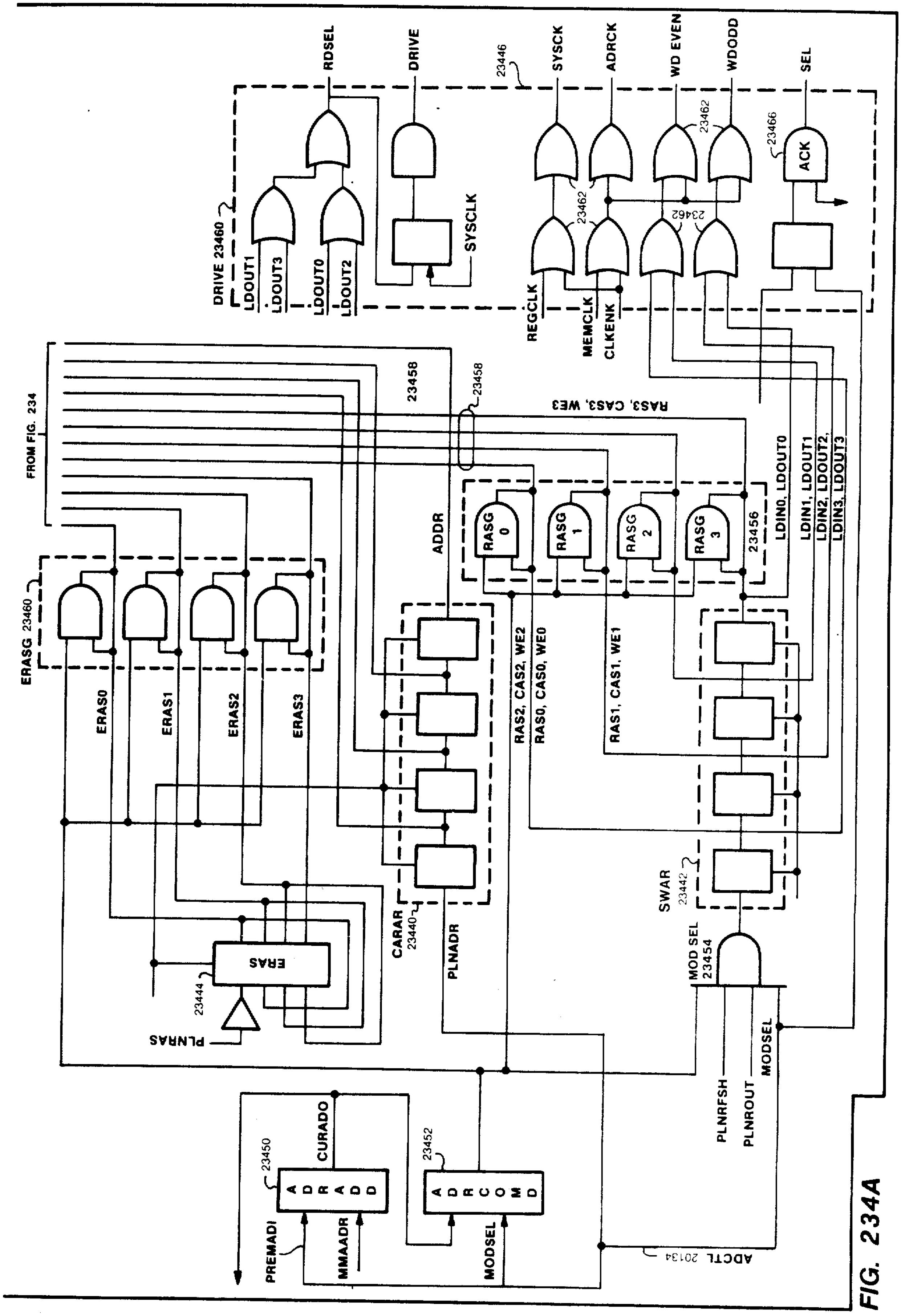

Referring to FIG. 234, a partial block diagram of an MA 20112 is shown. MA 20112's data storage is comprised of four random access memory arrays indicated in FIG. 234 as Memory Array Plane 0 (PLN0) 23410 to Memory Array Plane 3 (PLN3) 23416. Each RAM of PLN0 23410 to PLN3 23416 may have a data storage capacity of, for example, sixteen Kilobits or 64 Kilobits if MA 20112 contains, respectively, 256 Kilobytes or one Megabyte of data storage. As stated above, data is stored in, written into, and read from MSB 20110 in blocks of four words which may be referred to as word 0, word 1, word 2, and word 3. In MA 20112, all word zeros of blocks stored therein are contained in PLN0 23410 and words 1, 2 and 3 are stored, respectively, in PLN1 23412, PLN2 23414 and PLN3 23416. A write to or read from an MA 20112 therefore comprises a write or read of single word to or from each of PLN0 23410 to PLN3 23416, and is performed in that order.

Figure 235:
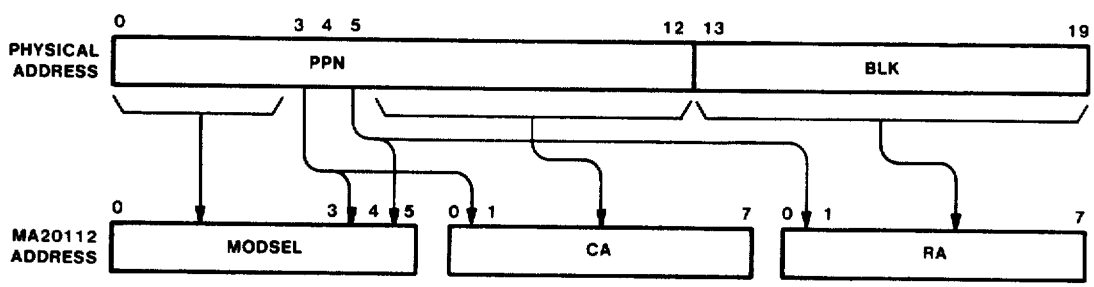
FIG. 235 is a diagram illustrating memory array addressing.
Figure 236:
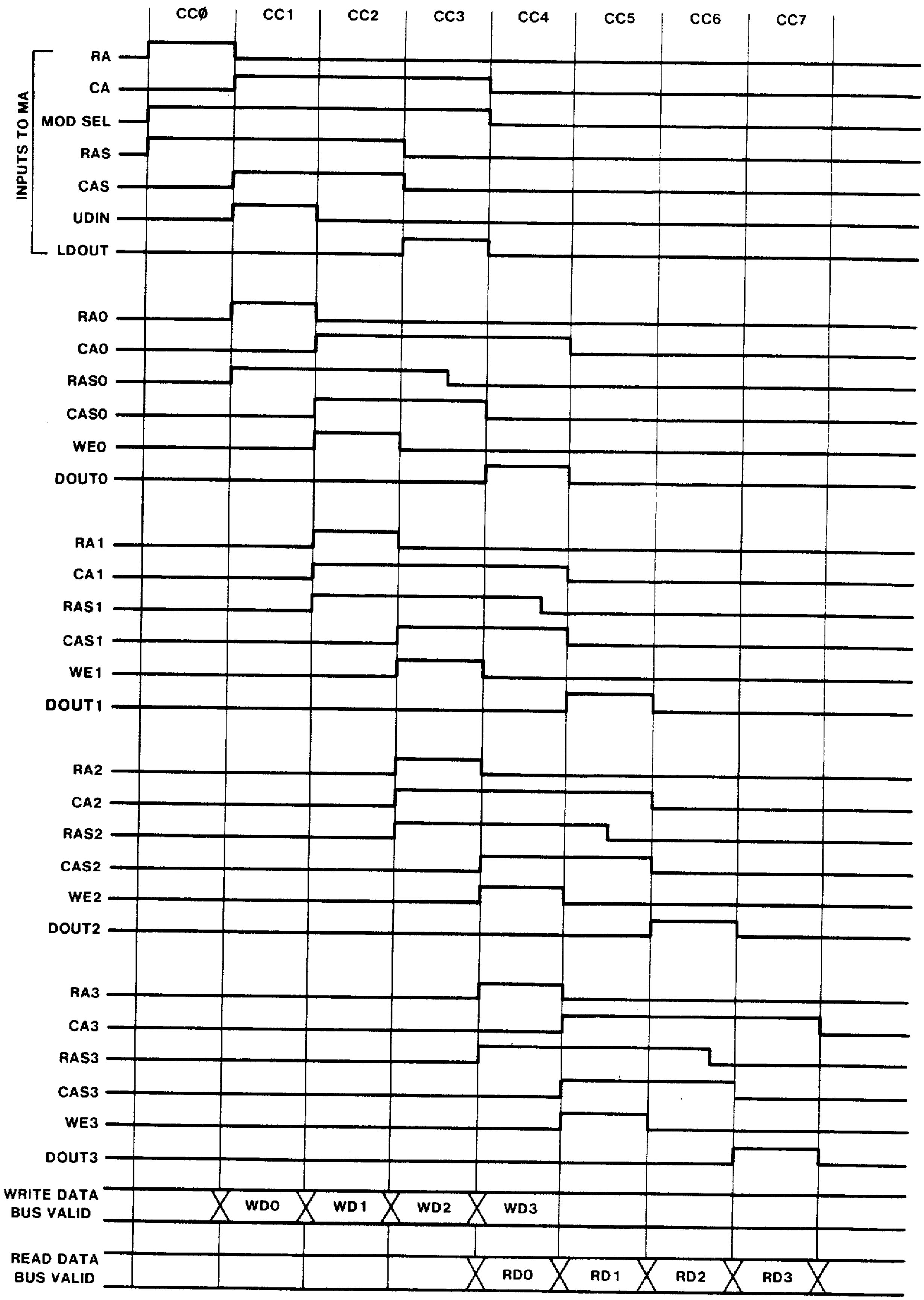
FIG. 236 is a diagram illustrating memory array operation and timing.

Referring to FIG. 235, relationship between physical address provided to MEM 10112 from IO Port 20910, JPO Port 21010, or JIP Port 21110 and physical address provided to MA 20112 is shown. As described above, all data transfers to and from an MA 20112 are four word blocks. Physical address to a MA 20112 therefore comprises the twenty most significant bits of a physical address provided to MEM 10112, that is physical address to block level. As indicated in FIG. 235, that portion of physical address from which an MA 20112 is derived includes the thirteen bit PPN field and seven bit BLK field of physical address. In an MA 20112, PLN0 23410 to PLN 3 23416 are logically arranged, and addressed as an array of rows and columns of data storage spaces. Each data storage space containing four thirty-nine bit data words, or one block of data. Selection of a four word block of MA 20112 data space thereby requires a row address and a column address. As previously described, words 0 to 3 of a block in MA 20112's data space are contained, respectively, in PLN0 23410 to PLN3 23416. A particular group of four words residing in PLN0 23410 to PLN3 23416 is identified by a corresponding single combination of row and column address. Presently that combination of row and column address to address inputs of PLN0 23410 to PLN3 23416 will thereby select, respectively, words zero to three of the block identified by that combination of row and column addresses. Also as stated above, each MA 20112 may, for example, contain either 256 Kilobytes, 512 Kilobytes or one Megabyte of storage capacity, respectively corresponding to either sixteen K or 64 K blocks of data, either single or double density boards. A row and column address of a data block in a MA 20112 must therefore comprise either seven bits each of row and column address or eight bits each of row and column address if that MA 20112 contains, respectively, 256 Kilobytes or 512 Kilobytes, 1 Megabyte or 2 Megabytes, of storage capacity.

In addition to row and column address to identify a particular data block in an MA 20112, address to MA's 20112 of MSB 20110 must include a Module Selection (MODSEL) field to select the particular module, or MA 20112, in which a particular data block resides. As indicated in FIG. 235, MODSEL field of an MA 20112 address contains six bits of address information and is thus sufficient to identify up to 64 modules wherein each module contains 256 K bytes, or 16 K blocks of data.

As indicated in FIG. 235, the six most significant bits of physical address PPN field are used directly as MODSEL field of MA 20112 address. Bits six to twelve inclusive of physical address PPN field are used directly as bits one to seven of MA address CA field and the seven bits of physical address BLK field are used directly as bits one to seven of MA address RA field. Bits three and four of physical address PPN field are, in addition to comprising bits four and five of MODSEL field, used respectively as bits zero of CA field and RA field of MA address. Bits four and five MA address MODSEL field thereby overlap bits zero of MA address CA and RA fields, and twenty bits of physical address are translated into twenty-two bits of MA address. When a particular MA 20112 contains 1 Megabyte or 2 Megabytes of data storage space, that MA 20112 will utilize all eight bits of MA address CA and RA fields. In an MA 20112 having 256 Kilobytes or 512 Kilobytes of address space, bits zero of MA address CA and RA fields are ignored, but the address information contained therein is not discarded but is retained in MA address MODSEL field. As will be described further below, each MA 20112 and MSB 20110 includes circuitry for examining MODSEL fields of MA addresses in such a manner that each particular MA 20112 will respond only to MA addresses referring to segments residing in that particular MA 20112. MA 20112s of differing capacity may therefore be combined in a particular CS 10110 to comprise MSB 20110, without need for complex mapping between physical addresses and MA addresses or modifications to BC 20114 or MSB 20110 circuitry to adapt MSB 20110 to varying data storage capacities.

As previously described, all data transfers to and from an MA 20112 are of four word blocks wherein the four words are sequentially transferred in four consecutive clock cycles. Also as described above, the four words comprising a block reside in four corresponding row and column address locations in PLN0 23410 to PLN3 23416. That is, the four word locations comprising a block in PLN0 23410 to PLN3 23416 are identified by a single combination of MA address CA and RA field. A read or write of a particular four word block is accomplished by sequentially addressing, with RA and CA fields of a MA address, PLN0 23410 to PLN3 23416, in that order. Address and control inputs to a memory plane include an eight bit Address input (ADDR) as RA and CA, and five control signals comprising a Row Address Strobe (RAS), a Column Address Strobe (CAS), Load Out (LDOUT), Load In (LDIN) and Write Enable (WE). WE is asserted only during write operations. Referring to FIG. 236, a timing diagram of a MA 20112's control and address inputs for read or write operation is shown. A write to or read from a single plane is executed in 4 clock cycles (CCs). Operations of PLN0 23410 to PLN3 23416 are overlapped, as shown, so that four words are sequentially written into or read from PLN0 23410 to PLN3 23416 during 8 consecutive clock cycles. Address, control, and data inputs and outputs of a MA 20112 are shown at top of FIG. 236. As stated above, RA and CA fields of an MA address are provided sequentially to a plane's address inputs, accompanied by corresponding address strobe inputs RAS and CAS. Referring to the MA 20112 control and address inputs, RA field is provided first, accompanied by Row Address Strobe 0 (RAS0), and followed by CA field which is accompanied by Column Address Strobe 0 (CASO). If a data read operation is being executed, LDOUT is asserted during CC3. If a data write operation is being executed, data is applied at start of or before CC0 and LDIN asserted during CC1. The sequential assertion of each plane's RA, RAS, CA, and CAS is shown below the MA 20112 control and address inputs. WE is generated from LDIN and asserted during write operations. Data read out appears as Data Out (DOUT(0–3)). MA 20112 refresh operations are executed by performing a MA 20112 read operation wherein CAS is not asserted and CA field is not provided, that is only RA field is provided and only RAS asserted. This results in a MA 20112 read operation of all columns having that row address. Having described overall structure and operation of an MA 20112, MA 20112 circuitry shown in FIG. 234 will now be described in further detail. PLN0 23410 to PLN3 3416 have been discussed above.

Referring again to FIG. 201, data inputs and data outputs of all MA 20112 are connected in parallel to, respectively, WD Bus 20126 and RD Bus 20130 which are in turn connected to data output and data input of BC 20114. Control inputs and outputs of all MA 20112's and BC 20114 are similarly connected and parallel to ADCTL Bus 20134.

Referring to FIG. 234, WD Bus 20126 is connected to inputs of Write Data Buffer (WDB) 23418. WDB 23418 data output is in turn connected to inputs of Even Word Latch (EWL) 23420 and Odd Word Latch (OWL) 23422. Enable inputs of EWL 23420 and OWL 23422 are connected from outputs of Memory Array Clock Generator (MACG) 23446, described further below. Data outputs of EWL 23420 are connected, through Write Data Input (WDI) Buses 23424 and 23426 to data inputs of, respectively, PLN0 23410 and PLN2 23414. Data output of OWL 23422 are connected to data inputs PLN1 23412 and PLN3 23416 through, respectively, Write Data Input (WDI) Buses 23428 and 23430. Even and odd data word outputs of PLN0 23410 to PLN3 23416 are connected, through Plane Data Output Even (PLNDOUTE) Bus 23432 and Plane Data Output Odd (PLNDOUTO) Bus 23433 to data inputs of Multiplexing Register (MUXREG) 23434. MUXREG 23434 has clock and selection inputs connected from MACG 23446. MUXREG 23434's data output is connected through Multiplexer Register Output (MUXREGO) 23436 to data input of Memory Array Output Driver (MAODRV) 23438. MAODRV 23438 receives an enable input from MACG 23446. MAODRV 23438 data output is connected to RD Bus 20130.

Referring to MA 20112 addressing circuitry, Column Address and Row Address Registers (CARAR) 23440 are connected from ADCTL Bus 20134 to receive row and column address fields of MA addresses. Address outputs of CARAR 23440 are connected in parallel, through Address Drivers (AD) 23448, to address inputs of Banks A and B of PLN0 23410 to PLN3 23416. CARAR 23440 receives clock input from MACG 23446. Strobe and Write Address Registers (SWAR) 23442 are similarly connected from ABCTL 20134, through Mode Select Gate (MODSEL) 23454. SWAR 23442 receives Plane Row Address Strobe (PLNRAS), Plane Column Address Strobe (PLNCAS), Plane Load Data In (PLNLDIN), Plane Read Data Out (PLNRDOUT), and Plane Refresh (PLNRFSH) from BC 20114. RAS, CAS, and WE outputs of SWAR 23442 are provided, through RAS Gates 23456 and RAS, CAS, WE Buses 23458 to control inputs of Banks A and B of PLN0 23410 to PLN3 23416. SWAR 23442 provides enable signals Plane 0 Load In (LDIN0) to Plane 3 Load In (LDIN3) and Plane 0 Load Out (LDOUT0) to Plane 3 Load Out (LDOUT3) to MACG 23446, described further below. Early Row Address Strobe Generator (ERAS) 23444 is similarly connected from ADCTL 20139 to receive PLNRAS. ERAS 23444, which receives ADRCLK input from MACG 23446, provides Early Row Address Strobes (ERAS) to control inputs of Banks A and B of PLN0 23410 to PLN3 23416 through Early Row Address Strobe Gates (ERASG) 23460. ERASG 23460 receives enable inputs from Address Comparitor (ADRCOMP) 23452 as described further below.

Referring now to MA 20112's mode address circuitry. Address Adder (ADRADD) 23450 is connected from ADCTL Bus 20134 to receive input Previous Maximum Address In (PREMADI) from the next lower MA 20112, that is the MA 20112 having the next sequentially lower physical address space. PREMADI represents the maximum address of that next lower MA 20112 address space. ADRADD 23450 also receives hard wired input Maximum Memory Array Address (MMAADR) from the present MA 20112, representing total address space on the present MA 20112. ADRADD 23450 provides output Current Memory Address Out (CURMADO) to the sequentially next higher physical address MA 20112. CURMADO to next sequentially higher MA 20112 is PREMADI to that MA 20112. ADRADD also provides CURMADO as an input to Address Comparitor (ADRCOMP) 23452. ADRCOMP 23452 is connected from ADCTL 20134 to receive MODSEL field of MA address. ADRCOMP 23452 provides enable signal outputs to MODSEL 23454, RASG 23456, and ERASG 23460.

Referring finally to MA 20112 clock circuitry MACG 23446 receives System Clock (SYSCLK), Register Clock (REGCLK), Memory Clock (MEMCLK), and Clock Enable (CLKENBL).

MACG 23446 receives control inputs MODSEL from ADRCOMP 23452, and LDIN0 to LDIN3 and LDOUT0 to LDOUT3 from SWAR 23442. MACG 23446 in turn provides outputs RDSEL, DRIVE, SYSCLK, ADRCLK, WDEVEN, and WDODD to other circuitry of MA 20112, and SEL to BC 20114.

Data inputs, that is four word blocks, are provided to each MA 20112 in parallel through Word (WD) Bus 20126 and Word Buffer (WDB) 23418. WDB 23418 may, for example, be comprised SN74S04s. WDB 23418's output is provided as data inputs to Even Word Latch (EWL) 23420 and Odd Word Latch (OWL) 23422. Even data words, that is words 0 and 2 of a block, are transferred into and captured in EWL 23420 and odd data words, that is data words 1 and 3 of a block, are transferred into and captured in OWL 23422. Data outputs of EWL 23420 are provided through Buses 23424 and 23426 to, respectively, PLN0 23410's DIN and PLN2 23414's DIN. Data outputs of OWL 23422 are provided through Buses 23428 and 23430 to PLN1 23412's DIN and PLN3 23416's DIN. EWL 23420 and OWL 23422 therefore provide even numbered data words and odd numbered data words to, respectively, PLN0 23410 and PLN2 23414, and PLN1 23412 and PLN3 23416. EWL 23420 and OWL 23422 are provided to satisfy data set up and hold times for the random access memories comprising PLN0 23410 to PLN3 23416. These random access memories have a data set up and hold time requirement slightly greater, in the present embodiment of MA 20112, than the available time interval between system clocks. By capturing alternate even and odd data words in EWL 23420 and OWL 23422, data words to be transferred into PLN0 23410 to PLN3 23416 are available over an interval of two clock cycles, thereby meeting data set up and hold time requirements.

As described above, data words read from PLN0 23410 to PLN3 23416 appear sequentially at PLN0 23410's DOUT to PLN3 23416's DOUT. Data words appearing at, respectively, even and odd DOUTs of PLN0 23410 to PLN3 23416's are sequentially transferred through Memory Plane Data Output Even (PLNDOUTE) Bus 23432 and Memory Plane Data Output Odd (PLNOUT0) Bus 23433 to Multiplexing Register (MUXREG) 23434. PLNDOUTE Bus 23432 and PLNDOUT 23433 are provided to satisfy, again data set up and hold times. MUXREG 23434 receives clock input SYSCLK and Read Selection Input (RDSEL). Data words read sequentially from PLN0 23410 to PLN3 23416 are sequentially transferred into registers in MUXREG 23434 by RDSEL and SYSCLK and subsequentially transferred, in the same sequence, on to Multiplexing Register Output (MUXREGO) Bus 23436 to MA Output Driver (MAODRV) 23438. In addition to data words from MUXREG 23434, MAODRV 23438 receives enable input Drive (DRIVE) from other portions of MA 20112 circuitry described below. When enabled by input DRIVE, data words present on MUXREGO 23436 are transferred through MAODRV 23438 to Read Data (RD) Bus 20130 to BC 20114. As previously described, all MA 20112 data outputs and MSB 20110 are connected to RD Bus 20130. MUXREG 23434 and MAODRV 23438 may be comprised, for example, of 25S09 registers and compatible AND gates.

Referring first to CARAR 23440, row and column address fields of MA addresses are provided as Plain Address (PLNADR) (0–7) to inputs of CARAR's 23440 of all MA 20112s in parallel. CARAR 23440, as shown in FIG. 234, is four stage shift register providing six successive MA address RA and CA field outputs to Planes A and B of PLN0 23410 to PLN3 23416, in that order, during four consecutive clock cycles.

As described above with reference to FIG. 236, RA field and CA field address inputs to PLN0 23410 to PLN3 23416 are accompanied by RAS and CAS control inputs, and WE inputs if a write operation is to be performed. These inputs are provided through SWAR 23442. Inputs to SWAR 23442 from BC 20114 through ADCTL 20134 include, as indicated in clock cycle zero (CC0) of FIG. 236, PLNRAS, PLNCAS and PLNLDIN. SWAR 23442 is again a four stage register providing successive outputs to control inputs of Banks A and B of PLN0 23410 to PLN3 23416. PLNRAS, PLNCAS and PLNLDIN are thus provided successively to PLN0 23410 to PLN3 23416 as, respectively, RAS, CAS, and WE when MODSEL 23454 is enabled by MODSEL input from ADRCOMP 23452. As indicated in FIG. 234, separate RAS outputs are generated for Banks A and Banks B of PLN0 23410 to PLN3 23416. Selection between Banks A and Banks B is controlled through RASG 23456 which enables RAS inputs to either Banks A or Banks B of PLN0 23410 to PLN3 23416. Selection between Banks A and Banks B of PLN0 23410 to PLN3 23416 is provided by Bank Select (BNKSEL) input from RASG 23456 from ADRCOMP 23452, described further below.

Input Plane Refresh (PLNRFSH) to MODSEL 23454 is asserted by BC 20114 during refresh operations. Banks A and B of PLN0 23410 to PLN3 23416 are provided with RAS inputs, thereby accomplishing a refresh operation. As stated above, input PLNLDIN is asserted to generate WE to PLN0 23410 to PLN3 23416 when a write operation is to be performed. Similarly, input PLNRDOUT to MODSEL 23454 is asserted by BC 20114 when an MA 20112 read operation is to be performed. PLNRDOUT, together with PLNLDIN, generate outputs LDIN0 to LDIN3 and LDOUT0 to LDOUT of SWAR 23442. As will be described further below, these outputs are provided to MACG 23446 to generate MACG 23446 output DRIVE, WDEVEN, and WDODD. As described above, DRIVE, WDEVEN, and WDODD are provided, respectively, to MAODRV 23438, EWL 23420 and OWL 23422 to control transfer of data into and out of MA 20112.

Referring to ERAS 23444, in a present embodiment of MA 20112 it is necessary, to insure adequate precharge periods for the integrated circuits comprising PLN0 23410 to PLN3 23416, to generate RAS inputs to the data RAMs which are less than 3 full clock cycles in length. ERAS 23444 is a four stage shift register receiving PLNRAS and clocked by ADRCLK. As described below with reference to MACG 23446, ADRCLK is a clock signal occuring before SYSCLK by a sufficient amount to insure proper setup time of addresses at the RAMs. Outputs of ERAS 23444 are RAS to PLN0 23410 to PLN3 23416 occurring earlier than those RAS outputs provided by SWAR 23442. RAS outputs of ERAS 23444 are ANDed with RAS outputs of SWAR 23442 to generate the shortened RAS inputs to PLN0 23410 to PLN3 23416 as required. Again, separate RAS outputs of ERAS 23444 are provided to Banks A and B of PLN0 23410 to PLN3 23416. Selection between ERAS 23444's RAS outputs is provided through ERASG 23416 and determined by MODSEL input from ADRCOMP 23452 in a manner similar to that described previously with reference to RASG 23456.

ARDADD 23450 and ADRCOMP 23452 together determine whether the particular segment of MSB 20110 address space is located on that particular MA 20112 and, if so, enable that MA 20112 to perform the operation requested by BC 20114. As described above, a first input to ADRADD 23450 is PREMADI, specifying the upper limit of the previous MA 20112's addresses space. A second input to ADRADD 23450 is MMAADR specifying the total amount of address space, for example, 256 Kilobyte or 512 Kilobyte or 1 Megabyte or 2 Megabytes of address space contained on that MA 20112. ADRADD 23450 adds PREMADI and MMAADR to generate CURMADO indicating the upper limit of that MA 20112 address space. As described above, CURMADO is provided as an input to the next higher MA 20112 and is an input to ADRCOMP 23452. ADRCOMP 23452 also receives PREMADI. ADRCOMP 23452 thus has inputs PREMADI and CURMADO indicating, respectively, the upper and lower limits of that MA 20112's address space. Input MODSEL (0–5), that is the MODSEL field of a MA address, is provided as a third input to ADRCOMP 23452. ADRCOMP 23452 compares MODSEL (0–5) to both PREMADI and CURMADO to determine whether a particular read or write operation indicated by BC 20114 refers to the address space of Banks A or B of that MA 20112. If so, ADRCOMP 23452 provides MODSEL enable signals to MODSEL 23454 and to MACG 23446. ADRCOMP 23452 also generates and provides BNKSEL to RASG 23456 and ERASG 23460 to select whether Bank A or Bank B of that MA 20112 should be enabled by being provided with RAS inputs from SWAR 23442 and ERAS 23444.

Referring finally to MACG 23446, MACG 23446 as described above generates certain clock and control signals used within that MA 20112 and by BC 20114. First, Drive Logic (DRIVE) receives LDOUT0 to LDOUT3 from SWAR 23442. As previously described, LDOUT0 to LDOUT3 indicates whether that MA 20112 is to execute a read operation. DRIVE 23460 generates, from LDOUT0 and LDOUT3, RDSEL to MUXREG 23434. RDSEL is a selection enable signal indicating to MUXREG 23434 whether a data input is to be presented from either PLN0 23410 or PLN2 23414, that is even word planes or from PLN1 23412 or PLN3 23416, that is odd word planes. RDSEL is used within MUXREG 23434 to multiplex even and odd numbered words from PLN0 23410 to PLN3 23416 into MUXREG 23434, and from MUXREG 23434 to MUXREGO Bus 23436. Inputs LDOUT0 to LDOUT3 to DRIVE 23460 are used to generate an initial signal indicating that a data word is to be read from one PLN0 23410 to PLN3 23416 on next clock cycle. This initial enabling signal is delayed by one clock cycle in a register and provided as output DRIVE to MAODRV 23438 to enable transfer of a word read from PLN0 23410 to PLN3 23416 on to RD Bus 20130.

ODD Even Select Logic (OES) 23462 receives inputs PL0LDIN to PL3LDIN. These inputs are gated together with a clock input to generate WDEVEN and WDODD to clock data words from WD Bus 20126 and WDB 23418 into, respectively, EWL 23420 and OWL 23422.

Clock Gating (CG) 23464 receives inputs REGCLK, MEMCLK, and CLKENBL from a clock generator in DP 10118 to generate ADRCLK and System Clock (SYSCLK) to other portions of MEM 10112 circuitry.

Aknowledgment Gating (ACK) 23466 of MACG 23446 generates acknowledgment output Select (SEL) to BC 20114 when that MA 20112 has been successively addressed. SEL indicates to BC 20114 that an MA 20112 and MSB 20110 has accepted a request for a read or write operation. ACK 23466 receives input MODSEL from ADRCOMP 23452 where it is clocked into a register by SYSCLK. Sampled MODSEL input is then provided as SEL.

Having described structure and operation of an MA 20112 above, the structure and operation of BC 20114 will be described next below.

Figure 237:
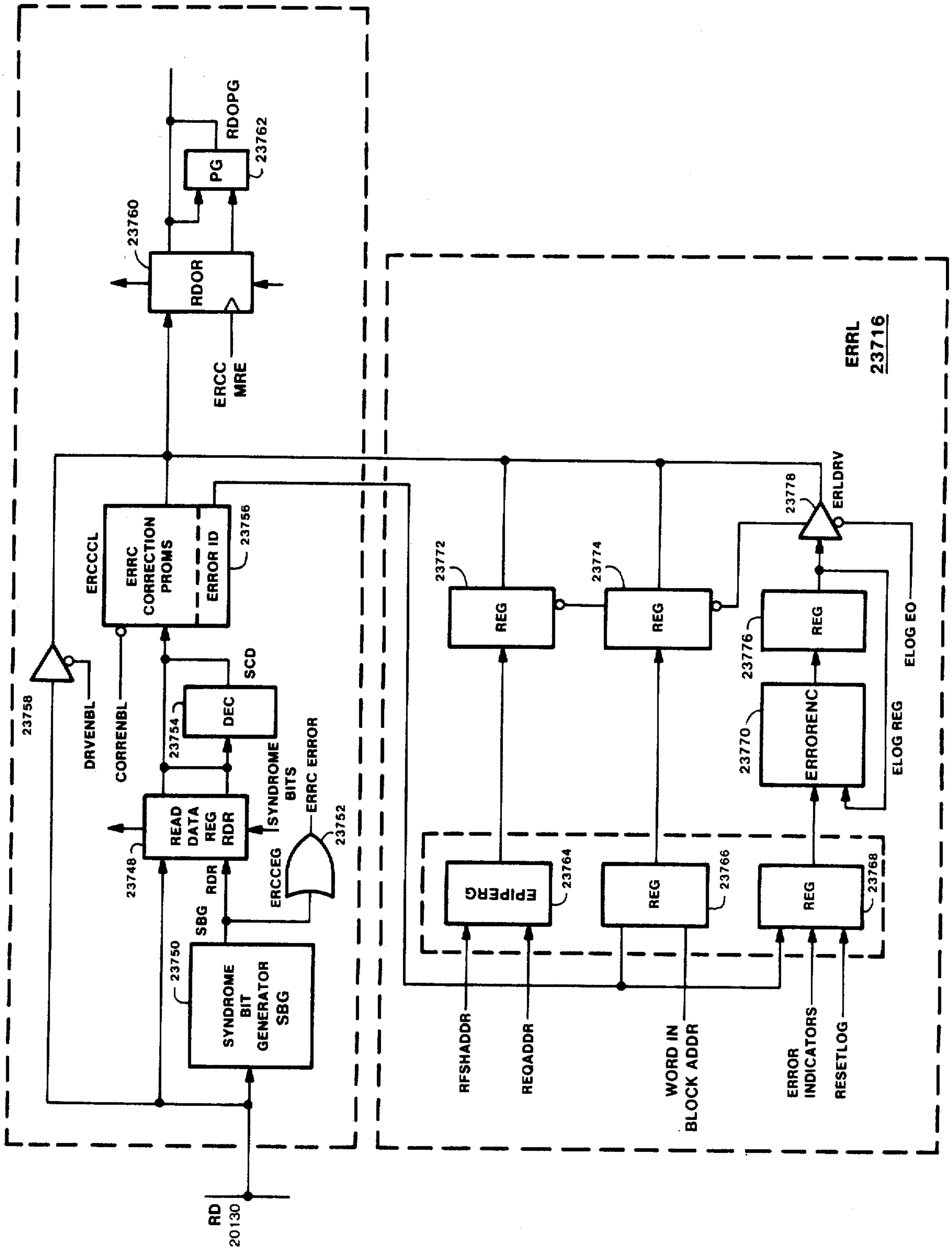
FIGS. 237A, and 237B are a detailed block diagram of a memory bank controller.

1. Bank Controller 20114 (FIGS. 237, 237A and 237B)

As previously described, BC 20114 is the data transfer path between MSB 20110 and MC 20116. In addition, BC 20114 generates address and control signals for MA 20112's, and performs error detection and correction on data written to, read from, and stored in MSB 20110.

Figure 237A:
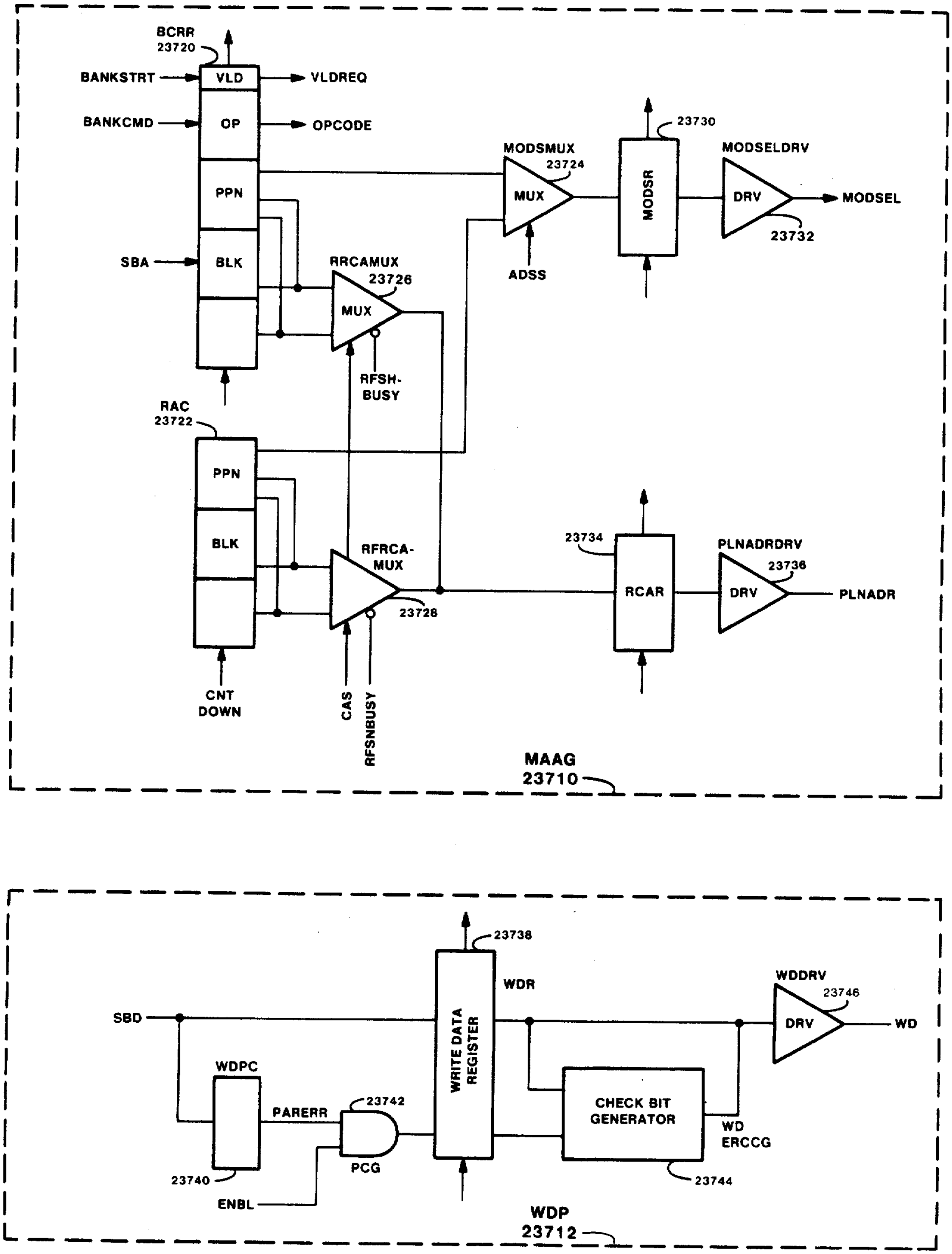
Figure 237B:
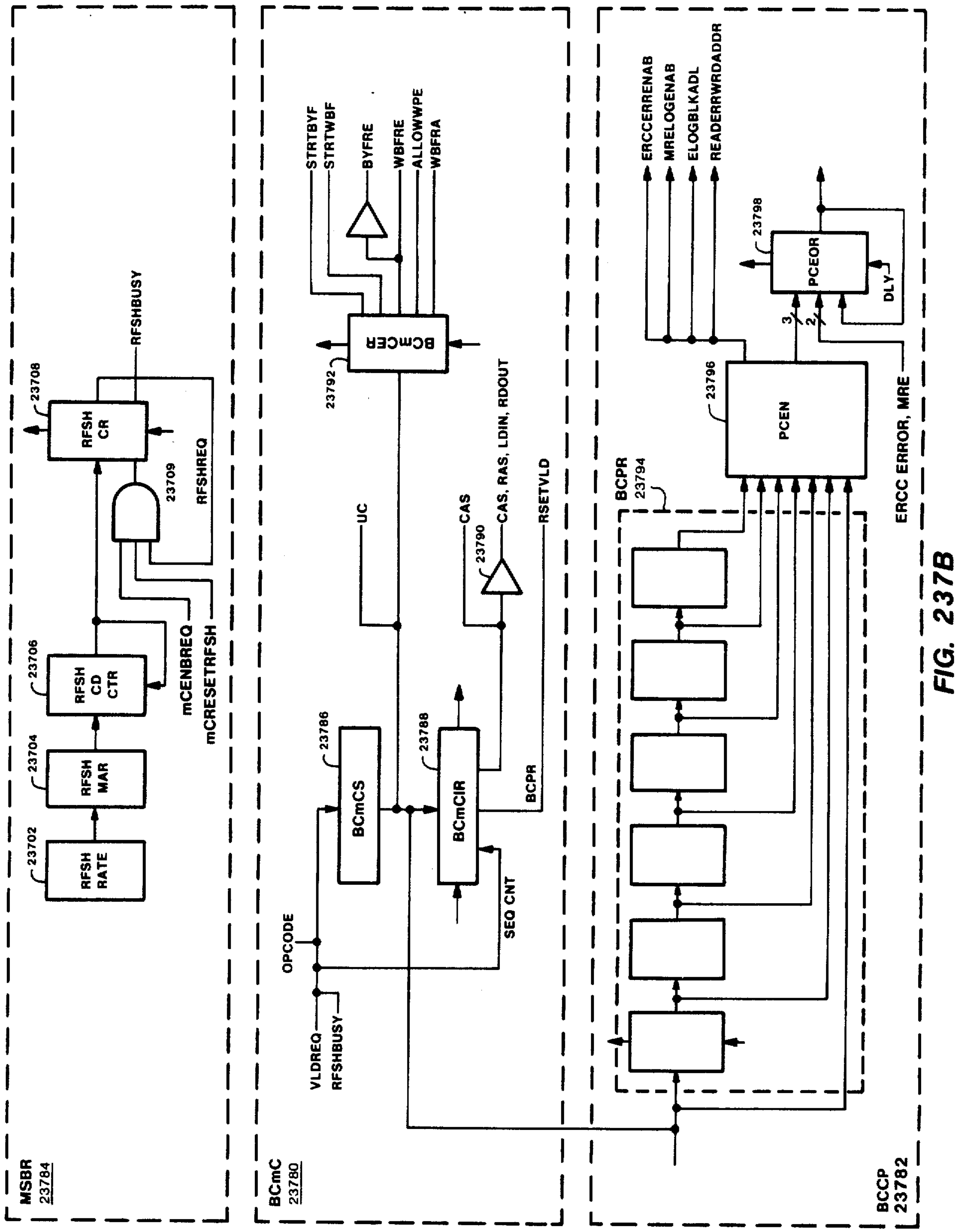

Referring to FIG. 237A, a partial block diagram of BC 20114 is shown. Major elements of BC 20114 include Memory Array Address Generator (MAAG) 23710, Write Data Path (WDP) 23712, Read Data Path (RDP) 23714, Error Log (ERRL) 23716, and Bank Controller Control (BCC) 23718, which will be described below in that order.

MAAG 23710 includes Bank Control Request Register (BCRR) 23720, which has address and control data inputs connected from PRMUX 20720 and MISSC 20726. Associated with BCRR 23720 is Refresh Address Counter (RAC) 23722. Address data outputs of BCRR 23720 and RAC 23722 are connected to inputs of Module Select Field Multiplexer (MODSMUX) 23724, Request Row and Column Address Multiplexer (RRCAMUX) 23726, and Refresh Row and Column Address Multiplexer (RFRCAMUX) 23728. MODSMUX 23724, RRCAMUX 23726, and RFRCAMUX 23728 receive control and enable inputs from BCC 23718 and provide module select field and row and column address field outputs to Module Select Field Register (MODSR) 23730, and Row and Column Address Register (RCAR) 23734. MODSR 23730 provides module select fields outputs of MA addresses, that is MODSEL (0-5) to ADCTL Bus 20134 through Module Select Field Driver (MODSELDRV) 23732. RCAR 23734 provides row and column address fields of MA address, that is PLNADR (0-7) to ADCTL Bus 20134 through Plane Address Driver (PLNADRDRV) 23736. BCRR 23720 provides control signal outputs to BCC 23718, as described further below.

A request to BC 20114 for a MSB 20110 read or write operation is comprised of physical address to block level, an operation code indicating the operation to be performed, and control bit indicating that the request is valid and should be performed. Such requests are received and stored in BCRR 23720. Physical address to block level is, as previously described with reference to FIG. 235, comprised of thirteen bits PPN field and seven bits of BLK field of physical address. Thirteen bits of PPN field and seven bits of BLK field of physical address are provided as address data inputs to BCRR 23720 from PRMUX 20720 through TSA Bus 21210. Operation code is provided to data inputs of BCR 23720 as BANKCMD (0-2) from MISSC 20726. Similarly, request validity control signals is provided as a data input to BCRR 23720 as BANKSTRT from MISSC 20726. When a request to BC 20114 is to be executed, BCRR 23720 provides outputs Valid Request (VLDREQ) and Operation Code (OPCODE), corresponding respectively to BANKSTRT and BANKCMD (0-2), as inputs to BCC 23718 which subsequently controls execution of that request.

As previously described, an MA address of an MSB 20110 operation is comprised of MODSEL (0-5) field, and CA and RA fields which are presented sequentially. MODSEL field is comprised of six most significant bits of physical address PPN field and transferred from BCRR 23720 address data outputs to ADCTL Bus 20134 through MODSMUX 23724, MODSR 23730, and MODSELDRV 23732. As will be described further below, refresh addresses are provided by RAC 23722 which also provides a MODSEL field input MODSMUX 23724. Selection between MODSEL fields from BCRR 23720 and RAC 23722 by MODSMUX 23724 is controlled by Address Source Selection (ADSS) input to MODSMUX 23724 from BCC 23718. MODSR 23730, connected between MODSMUX 23724 and MODSELDRV 23732, is a pipeline register provided for timing purposes.

CA field of a MA address, as previously described, is comprised of 7 most significant bits, plus bit three, of physical address PPN field RA field is comprised of 7 bit physical address BLK field plus bit four of PPN field. As indicated in FIG. 237A, RRCAMUX 23726 receives as inputs two eight bit fields from PPN field and BLK field of physical address stored in BCRR 23720. One eight bit input field comprises RA field of MA address, while second eight bit field comprises CA field. RRCAMUX 23726 receives selection input CAS (Column Address Strobe) from BCC 23718 and, under control of CAS selects either RA or CA field from BCRR 23720 as RRCAMUX 23726's output. RRCAMUX 23726 also receives an enable signal input Refresh Busy (RFSHBUSY) from BCC 23718. As will be described further below, RFSHBUSY is asserted when BC 20114 executes a MSB 20110 refresh operation and inhibits RRCAMUX 23726 during refresh operations. RRCAMUX 23726 sequentially transfers RA and CA fields of MA address from BCRR 23720 to input of RCAR 23734. RCAR 23734 is, again, a pipeline register for timing purposes. Output of RCAR 23734 is transferred onto ADCTL Bus 20134 as PLNADR (0-7) through PLNADRRV 23736.

Referring to RAC 23722, RAC 23722 is a counter controlled by Count Down (CNTDOWN) input from BCC 23718. RAC 23722 generates sequential refresh addresses for refreshing MA's 20112 of MSB 20110 as previously described. RAC 23722 generates, affectively, a thirteen bit PPN field and seven bit BLK field corresponding to thirteen bit PPN and BLK fields of BCRR 23720. Contents of RAC 23722 are thereby a physical address to block level for refresh purposes. Seven most significant bits of refresh address PPN field are provided, as described above, as an input to MODSMUX 23724 and can be selected by ADSS to appear as MODSEL (0-5) on ADCTL Bus 20134 during refresh operations. RFRCAMUX 23728, like RRCAMUX 23726, receives two eight bit input fields, that is CA and RA fields of an MA 20112 address from RAC 23722. RFRCAMUX 23728 receives selection inputs CAS, to sequentially select RA and CA fields from RAC 23722 as RFRCAMUX 23728's output. RFRCAMUX 23728 also receives enable input RFSHBUSY. RFSHBUSY to RFRCAMUX 23728 is an enable signal allowing RFRCAMUX 23728 to transfer refresh address RA and CA fields from RAC 23722 to inputs of RCAR 23734. Again, RA and CA fields from RFRCAMUX 23728 are pipelined in RCAR 23734 and provided through PLNADRDRV to ADCTL Bus 20134 as PLNADR (0-7).

As stated above, WDP 23712 represents BC 20114's data path from MC 20116 to MSB 20110. WDP 23712 includes Write Data Register (WDR) 23738, Write Data Parity Checker (WDPC) 23740, Parity Check Gate (PCG) 23742, Write Data Error Check Code Generator (WDERCCG) 23744, and Write Data Driver (WDDRV) 23746. Inputs of WDR 23738 and WDPC 23740 are connected from SBD Bus 20152. Output of WDPC 23740 is connected, together with enable input ENBL, to inputs of PCG 23742 and PCG 23742's output is connected to data inputs of WDR 23738. Outputs of WDR 23738 are connected to inputs of WDERCCG 23744 and inputs of WDDRV 23746. Outputs of WDERCCG 23744 are similarly connected to inputs of WDDRV 23746. Data outputs of WDDRV 23746 are connected to WD Bus 20126 which, in turn, is connected in parallel to data inputs of MA 20112s.

Data words provided to BC 20114 from MC 20116 to be written into MSB 20110 are comprised of thirty-six bit data words, including thirty-two bits of data and four bits of parity. The thirty-two data bits of data words to be written into MSB 20110 are transferred directly into WDR 23738. All thirty-six bits of each data word, that is the thirty-two data bits plus four parity bits, are transferred into WDPC 23740 where a parity check is performed to detect errors in that data word. WDPC 23740 generates a single bit parity error output indicating whether such a parity error has been determined. This parity error is gated together with ENBL and PCG 23742 and provided as a two bit input, indicating occurrence of a parity error, to WDR 23738. In order to maintain the integrity of data and associated errors, if a parity error has occurred in data to be written into MSB 20110, the two bit parity code causes WDERCCG 23744 to generate a check code output indicating a multiple bit error in the data. The thirty-two data bits of a data word resident in WDR 23738 plus the two bit parity check code from PCG 23742 are provided from WDR 23738 to WDERCCG 23744. WDERCCG 23744 generates, from these inputs, seven bits of error correcting hamming code for the thirty-two data bits currently residing WDR 23738. The thirty-two data bits from WDR 23738 plus seven error correcting hamming code bits from WDERCCG 23744 are provided as inputs to WDDRV 23746 which subsequently transfers those thirty-nine bits onto WD Bus 20126 as a MSB 20110 data word to be written into MA's 20112.

WDR 23738 may be comprised, for example, of SN74S194 registers. WDPC 23740 may be comprised, for example, of SN74S280 parity chips, and PCG 23742 may be comprised, for example of compatible gating or ROM. WDERCCG 23744 may be comprised, for example, of SN74S280 parity chips. WDDRV 23746 may, as MODSELDRV 23732 and PLNADRV 23736, be comprised of SN74S240 drivers.

RDP 23714 is the data path for transfer of data from MSB 20110, that is from RD Bus 20130, to MC 20116 through RDO Bus 20158. RDP 23714 includes two data paths, the first comprising Direct Path Driver (DPDRV) 23758 whose input is connected from RD Bus 20130 and whose output is connected to data inputs of Read Data Output Register (RDOR) 23760. DPDRV 23758 receives Drive Enable (DRVENBL) input from BCC 23718. RDP 23714 second data path includes Read Data Register (RDR) 23748 having a thirty-nine bit data word input connected from RD Bus 20130 and a seven bit syndrome bit input connected from Syndrome Bit Generator (SBG) 23750. SBG 23750 has a thirty-nine bit data word input connected from RD Bus 20130 and provides, as just stated, seven bit syndrome code output to RDR 23748. SBG 23750 seven bits syndrome code output is also provided as an input to Error Correcting Code Error Gate (ERCCEG) 23752, which in turn provides an ERCC Error Flag (ERCCERROR) output. RDR 23748 provides a thirty-two data bit output plus a seven bit syndrome code output to ERCC Correction Logic (ERCCL) 23756. RDR 23748 also provides three bits of syndrome code to syndrome code decoder 23754 which, in turn, provides eight bits of decoded syndrome data to ERCCCL 23756. ERCCCL 23756 provides thirty-two bit data output to RDOR 23760, which is ORed with thirty-two bit data output from DPDRV 23758, and a thirty-two bit data output to ERRL 23716. ERCCCL 23756 also provides a three bit ERCC Error Type Code Output (ERCCET) to ERRL 23716.

In addition to thirty-two bits of data from DPDRV 23758 or ERCCCL 23756, RDOR 23760 receives a single bit memory read error ERCC bit input from BCC 23718. RDOR 23760 provides the thirty-two data bits plus single MREERCC bit as inputs to Read Data Out Parity Generator (RDOPG) 23762. RDOPG 23762 in turn generates four bits of parity for the thirty-two bits of data currently residing in RDOR 23760. The thirty-two bits of data from RDOR 23760 and four bits of corresponding parity from RDOPG 23762 are connected onto RDO Bus 20158 as a thirty-six bit data word, as previously described. If a multiple bit parity error occurs in data read from MSB 20110, this data is parsed from BC 20116 without modification but the parity bits are set so as to indicate parity errors in each byte.

RDP 23714's first data path, that is through DPDRV 23758, is utilized when there are no ERCC errors appearing in thirty-nine bit data words read from MSB 20110. RDP 23714's second data path, that is through SBG 23750, RDR 23748, and ERCCCL 23756 is utilized when those thirty-nine bit data words contain ERCC errors.

Considering first RDP 23714's second data path, data words read from MSB 20110, as previously described, include thirty-two bits of data plus seven bits of error correcting hamming code. The thirty-two data bits of each word are transferred directly into RDR 23748 while all thirty-nine bits, that is thirty-two data bits and seven ERCC bits, are read into SBG 23750. SBG 23750 examines the thirty-two data bits and seven ERCC bits to generate a seven bit syndrome code indicating whether that word does contain an error and where those errors occur. That seven bit syndrome code is provided to ERCCEG 23752 which, in turn, generates single bit output ERCCERR indicating that an error has been detected. That seven bit syndrome code for a particular word is also transferred into RDR 23748 together with that data words thirty-two data bits. RDR 23748 in turn provides the thirty-two data bits plus seven syndrome code bits to ERCCCL 23756. Three bits of syndrome code are provided to SCD 23754. SCD 23754 decodes those three syndrome code bits and generates an eight bit code to ERCCCL 23756 indicating which group of data bits are to be corrected. ERCCCL 23756 performs a data correction operation and provides thirty-two bits of corrected data as input to RDOR 23760. ERCCCL 23756 also provides a five bit ERCCET output to ERRL 23716 indicating the type of error which was detected and the bit address of the error or errors.

If SBG 23750 does not detect an ERCC error in a thirty-nine bit data word being read from RD Bus 20130, DRVENBL to DPDRV 23758 is asserted and the thirty-two data bits of that data word are transferred into RDOR 23760.

RDOR 23760 will therefore contain, for each data word read from RD Bus 20130, thirty-two bits of data and may include four bits of ERCERR code indicating that multiple bit, uncorrectable data ERRCC error has been detected. These thirty-two bits of data and four possible bits of ERCERR code read into RDOPG 23762 which in turn generates four bits of parity for those thirty-two data bits. As described above, this forces continuity of errors; if multiple bit ECC errors are detected the data is passed on with parity errors so that the fact that the data is possibly corrupted is not lost. The thirty-two data bits from RDOR 23760 plus corresponding four parity bits from RDOPG 23762 may then be transferred onto RDO Bus 20158 as a thirty-six bit data word to MC 20116.

A third input to RDP 23714 is provided, as described further below, from ERRL 23716. As previously stated, ERRL 23716 is BC 20114's error log and contains entries for each error detected in data words read from MSB 20110, either directly as part of a read operation or indirectly as part of a refresh operation, that is sniffing. When BC 20114 receives an error log read request, those addresses are read from ERRL 23716 to RDOR 23760 where they are subsequently treated as thirty-two bits of data. That is, four bits of corresponding parity are generated and the resulting thirty-six bit data words transferred onto RDO Bus 20158 to be subsequently read to IOS 10116 or JP 10114.

As previously described, ERRL 23716 comprises BC 20114's error log. ERRL 23716 includes Error Pipeline Registers (EPIPEREG) 23764 to 23768, Error Encoder (ERRORENC) 23770, Error Log Registers (ELOGREG) 23772 to 23776, and Error Log Driver (ERLDRV) 23778. EPIPEREG 23764 is a multiplexing register having two twenty bit inputs, a first input being connected from RAC 23722 and comprising the twenty bit refresh address contained therein. EPIPEREG 23764 second input is from BCRR 23720 and comprises the twenty bit block level physical address contained therein and pertaining to a particular memory request. Output of EPIPEREG 23764 is twenty bits of data and is connected to data input of ELOGREG 23772.

EPIPEREG 23766 receives two data inputs, the first data input being connected from ERCCCL 23756 and containing five bits of bit address of an error which has been detected by SBG 23750. Second input to EPIPEREG 23766 is a two bit word within block address of an error detected by SBG 23750. Output of EPIPEREG 23766 is a seven bit word and bit within block address of an error detected in a data word read from MSB 20110 and is connected to data inputs of ELOGREG 23774.

EPIPEREG 23768 has a first input connected from ERCCCL 23756, which is a three bit code indicating the type of an error detected by SBG 23750 in a data word read from MSB 20110. A second input of EPIPEREG 23768 indicates that an error has been detected. Third input of EPIPEREG 23768 is provided from MIC 20122 and is a control signal (RESETLOG) indicating, as previously discussed that ERRL 23716 is to be reset. Output of EPIPEREG 23768 is connected to a first input of ERRENC 23770, and a second input of ERRENC 23770 is connected from the output of ELOGREG 23776. Outputs of ELOGREG 23772 and ELOG 23774 are connected to data input of RDOR 23760 and have enable inputs connected from BCC 23718. Output of ELOGREG 23776 is, as previously described, connected to a second input of ERRENC 23770 and is connected to input of Error Log Driver (ERLDRV) 23778. Enable input of ELDRV is connected, and parallel with ELOGREG 23772 and 23774, from BCC 23718. Output of ERLDRV 23778 is connected to data input of RDOR 23760 in parallel with outputs of ELOGREG 23772 and 23774.

As previously described, ERRL 23716 captures and stores addresses and information regarding errors discovered in data read from MSB 20110 or detected during MSB 20110 refresh operations. When a MA address is provided to MSB 20110 from MAAG 23710, that is for a read, write, or refresh operation, either the twenty bits of physical address to block level present in BCRR 23720 or the twenty bits of refresh address present in RAC 23722 are transferred into and captured in EPIPEREG 23764. When a corresponding thirty-nine bit data word from MSB 20110 appears on RD Bus 20130 as a result of a read or refresh operation, five bits of bit within word address and two bits of word within block address are transferred into and captured in EPIPEREG 23766 if an error in that thirty-nine bit data word is detected by SBG 23750. Concurrently, information regarding the type of error detected and other error indicators are transferred into and captured in EPIPEREG 23768. At this time, EPIPEREG 23768 samples RESETLOG from MIC 20122 to determine whether ERRL 23716 is to be reset. If, therefore, an error is detected in a thirty-nine bit data word appearing on RD Bus 20130 as a result of a read or refresh request to MSB 20110, EPIPEREG 23764 to 23768 will capture the address of that error down to bit level, the type of error, and other indications, such as RESETLOG, as to what action is to be taken. EPIPEREG 23764 to 23768 thereby operate as a pipeline register for capturing all necessary data to identify the location and type of an error in a data word read from or residing in MSB 20110 as that information becomes available. Physical address of that error to block level is captured, from MAAG 23710, when a read or refresh request is made to MSB 20110, while address of error to bit level and other information pertaining to that error captured when that data word appears on RD Bus 20130.

A detected error's address to bit level is subsequently transferred from EPIPEREG 23764 and 23766 to ELOGREG 23772 and 23774. Information regarding error type and disposition of error contained in EPIPEREG 23768 is provided as an input to ERRENC 23770. ERRENC 23770 subsequently generates a six bit code containing information, such as error type, pertaining to that error. Output of ERRENC 23770 is then transferred into ELOGREG 23776. ELOGREG 23776 provides the six bit code as an output which is fed back to ERRENC 23770 to assist in encoding of subsequent errors and controlling operation of ERRL 23716, for example in resetting or clearing ERRL 23716 when RESETLOG from MIC 20122 is asserted. Contents of ELOGREG 23772 to 23776 are transferred to data inputs of RDOR 23760 when enable signal ELOGEO to ERLDRV 23778 and ELOGREG 23772 and 23774 is asserted by BCC 23718. Output of ELOGREG 23772, ELOGREG 23774, ERLDRV 23778 comprise a thirty-two bit error log entry as previously described. This thirty-two bit error log entry from ERRL 23716 is, as described above, transferred into RDOR 23760 and subsequently provided to RDO Bus 20158 as a thirty-six bit data word, that is thirty-two bits of data plus four bits of parity, to be subsequently read to IOS 10116 or JP 10114.

Referring finally to BCC 23718, BCC 23718 includes Bank Controller Microcode Control Logic (BCmC) 23780, Bank Controller Control Pipeline (BCCP) 23782, and Main Store Bank Refresh Control (MSBR) 23784. BCmC 23780 stores and provides sequences of microinstructions for control of BC 20114, and thus MSB 20110, in response to requests for MSB 20110 operations submitted by MIC 20122 and MC 20116. As previously described, MSB 20110 operations, that is writes to, reads from and refreshes of MA's 20112 are pipelined That is, MSB 20110 operations are performed sequentially and may be overlapped. For example, the start of a write to MA's 20112 may overlap a read from MA's 20112. This overlapping of MSB 20110 operations requires overlapping, and thus pipelining, of certain BC 20114 control functions and is provided by BCCP 23782. Finally, MSBR 23784 measures the time interval between successive MSB 20110 refresh operations, requests such operations when necessary, and directs execution of refresh operations.

Referring first to BCmC 23780, BCmC 23780 includes Bank Controller Microcode Control Store (BCmCS) 23786, Bank Controller Microcode Internal Register (BCmCIR) 23788, Bank Controller Microcode Driver (BCmCDRV) 23790, and Bank Controller Microcode External Register (BCmCER) 23792. BCmCS 23786 has address inputs Operation Code (OPCODE) and Valid Request (VLDREQ) connected from corresponding outputs of BCRR 23720. BCmCS 23786 also has address inputs Refresh Busy (RFSHBUSY) connected from an output of MSBR 23784 and Sequence Count (SEQCNT) connected from an output of BCmCIR 23788. Microinstruction outputs of BCmCS 23786 are connected to inputs of BCmCIR 23788, BCmCER 23792, and BCCP 23782. BCmCS 23786 also has microinstruction outputs connected to control inputs of MSBR 23784, ERRL 23716 and RDP 23714. BCmCIR 23788 has microinstruction outputs connected to, as previously described, address inputs of BCmCS 23786, to inputs of BCmCDRV 23790 and to inputs of ERRENC 23770. BCmCDRV 23790 has control outputs PLNCAS, PLNRAS, PLNLDIN, PLNRDOUT, and PLNRFSH connected to ADCTL Bus 20134 and thus to control inputs of MA's 20112 BCmCER 23792 has microinstruction inputs connected, as previously described, from outputs of BCmCS 23786 and has microinstruction control outputs connected to control inputs of MC 20116.

BCmCS 23786 stores sequences of microinstructions for controlling operation of BC 20114 and thus operation of MSB 20110, that is MA's 20112. Selection of sequences of microinstuctions, and of microinstructions within a selected sequence, is controlled by seven bit address comprising three bit OPCODE and single bit VLDREQ from BCRR 23720, single bit input RFSHBUSY from MSBR 23784, and two bit address input SEQCNT from BCmCIR 23788. As described above, OPCODE is provided to BCRR 23720 and thus to BCmCS 23786 by MISSC 20726. OPCODE is BCmCS 23786's primary address input for selecting a particular microinstruction sequence. VLDREQ, again provided from MISSC 20726, is a flag indicating that a request for a BC 20114 and MSB 20110 operation is valid. RFSHBUSY is a flag requesting that BC 20114 execute an MSB 20110 refresh operation. Two bit input SEQCNT is provided through BCmCIR 23788 from BCmCS 23786's microinstruction output and is comprised of two bits of a previously provided next microinstruction. The two SEQCNT bits of each microinstruction stored in BCmCS 23786 are used to select the next microinstruction to be executed in a sequence of microinstructions. The two SEQCNT bits of a microinstruction currently being executed, and thus residing in art in BCmCIR 23788, are thus provided as address input to BCmCS 23786 to select that next microinstruction.

Four bits of each microinstruction provided from BCmCS 23786 are provided as input to BCCP 23782 and will be described further below. Nine bits of each microinstruction are provided by BCmCS 23786 as inputs to BCmCIR 23788, two of these bits providing SEQCNT output from BCmCIR 23788 to BCmCS 23786 address input. The nine bits of a microinstruction transferred into BCmCIR 23788 are used to control internal operation of BC 20114 and MSB 20110. One bit of a microinstruction currently residing in BCmCIR 23788 is provided to ERRENC 23770 as input Reset Valid (RESETVLD). RESETVLD indicates that a Reset Error Log Request (RESETLOG) submitted from MIC 20122 is valid and that ERRL 23716 should be reset. Five bits of a microinstruction currently residing BCmCIR 23788 represent control signals PLNCAS, PLNRAS, PLNLDIN, PLNRDOUT, and PLNRFSH to control inputs of MA's 20112. When certain of these five bits are asserted, corresponding output signals are provided through BCmCDRV 23790 to ADCTL Bus 20134 and thus to control inputs of MA's 20112. BCmCIR 23788 provides a final microinstruction bit output representing CAS to RFRCAMUX 23728 and RRCAMUX 23726, in conjunction with bit PLNCAS, to indicate that a CAS is being provided to MSB 20110 and directing that RFRCAMUX 23728 or RRCAMUX 23726 correspondingly provide CA fields of a MA address to ADCTL Bus 20134.

Four bits of each microinstruction provided from BCmCS 23786 are provided to MSBR 23784, ERRL 23716, and RDP 23714. Of these four bits, Microcode Enable Request (mCENBREQ) and Microcode Reset Refresh (mCRESTRFSH) are provided to MSBR 23784 to control, as described further below, generation of refresh requests by MSBR 23784. A third bit is output Load Error Pipe (LDEPIPE) which is provided as an enable input to EPIPEREG 23764 to 23768 to control a transfer of error information into those registers. Fourth output bit is provided as enable signal Memory Read Enable (MRENBL) to RDOR 23760 to enable transfer of data words read from MSB 20110 into RDOR 23760.

Referring finally to BCmCER 23792, BCmCER 23792 receives six bits of each microinstruction provided from BCmCS 23786, these six bits provide control signals to MC 20116, that is to circuitry external to BC 20114 and MSB 20110. Like BCmCIR 23788, BCmCER 23792 is pipeline register for holding microinstruction bits of a current microinstruction. Outputs of BCmCER 23792 include Start Bypass File (STRTBYF), Start Write Back File (STRTWBF), Bypass File Read Enable (BYFRE), and Write Back File Read Enable (WBFRE). As previously described, these outputs of BC 20114 comprising enable signals to WBF 23212 and BYF 20118. Output Write Back File Read Address (WBFRA) (0–1) of BCmCER 23792 is, as previously described, a word address to WBF 23212 to select a word to be read from WBF 23212 to MSB 20110 through WDR 23738. Output Allow Write Back Enable (ALLOWWBE) of BCmCER 23792 is an enabling signal allowing write back operation to be performed.

As previously described, certain MSB 20110 operations, for example reads and writes, may be overlapped. Overlapping of MSB 20110 functions in turn requires that certain BC 20114 control functions be overlapped. These control functions are represented by four bits of each microinstruction provided by BCmCS 23786 as inputs to BCCP 23782. BCCP 23782 includes Bank Control Pipeline Registers (BCPR) 23794, Pipeline Control Encoding Logic (PCEN) 23796, and Pipeline Control External Output Register (PCEOR) 23798. As shown in FIG. 237, BCPR's 23794 have four bits of microinstruction input connected from corresponding outputs of BCmCS 23786 and a single bit Memory Read Error (MRE) input connected from an output of SBG 23750. Outputs of each of BCPR's 23794 are connected to inputs of PCEN 23796. Outputs of PCEN 23796 are provided directly to other portions of BC 20114 circuitry and to inputs of PCEOR 23798. PCEOR 23798 also has inputs ERCCERR and MRE connected from, respectively, ERCCEG 23752 and SBG 23750. BCCP 23782 has outputs connected to certain inputs of MIC 20122, as will be described further below, and to another input of PCOR 23798.

At start of execution of each microinstruction provided from BCmCS 23786, four bits of each of those microinstructions plus fifth MRE bit are loaded into the pipeline shift register comprising BCPR's 23794. The contents of BCPR's 23794 are subsequently shifted through BCPR's 23794 at start of each microinstruction execution. BCPR's 23794 will therefore contain a sequence of microinstruction bits corresponding to the sequence of microinstructions provided from BCmCS 23786 and being executed by BC 20114. These control bits residing in BCPR's 23794 are provided as inputs to PCEN 23796, which in turn generates corresponding sequential sets of control outputs. For example, a complete MSB 20110 read operation requires four clock cycles reading for data words for execution. BCPR's 23794 and PCEN 23796 will correspondingly generate a sequence of four sets of control outputs as required for handling of those four data words read from MSB 20110 as those data words appear on RD Bus 20130.

Certain of PCEN 23796's control outputs are provided directly to BC 20114 to control operation of BC 20114. These outputs include two bit ERCC error enable to ERRL 23716 and SBG 23750 to enable operation of ERRL 23716 and SBG 23750 as data words read from MSB 20110 appear on RD Bus 20130. Two bit output Memory Read Error Log Enable (MRELOGENBL) to ERRL 23716 enables ERRL 23716 to log any errors discovered in data words read from MSB 20110 in a read operation. Single bit output Error Log Block Address Load (ELOGBLKADL) is an enable signal to EPIPEREG 23764 to enable EPIPEREG 23764 to load RFSHADDR or REQADDR from, respectively, RAC 23722 or BCRR 23720 at start of a request to MSB 20110. Two bit output Read Error Word Address (READERRWDADDR) is an enable signal to EPIPEREG 23766 and 23768 to enable these registers to load data pertaining an error discovered in a data word read from MSB 20110 in response to a MSB 20110 read or refresh request.

Certain outputs of PCEN 23796 are, as previously described, provided to PCEOR 23798, together with inputs ERCCERROR and MRE, and are subsequently provided as outputs to MIC 20122, indicating state of BC 20114 and MSB 20110 operation. These outputs include Read Data Output Present Select (RDOPS) indicating that data requested from MSB 20110 is presently available on RDO Bus 20158 and Data Coming (DCOM) indicating that requested data will appear on RDO Bus 20158 as start of next clock cycle. Output Read Data Out Invalid (RDOINV) indicates that data word requested from MSB 20110 is invalid due to discovery of an error in that data word. Output Delay (DLY) indicates that an error has been discovered in a data word being read from MSB 20110, that the error is being corrected, that the data word will be delayed by one clock cycle due to the error correction operation, and that the data word will appear on RDO Bus 20158 at start of next clock cycle. DLY therefore, as previously described, indicates occurrence of a "bubble" in the four sequential data words read from MSB 20110 in response to a read request. Reading of that data word will require five or more clock cycles as at least one data word will be delayed by one clock cycle due to error correction operations. Output DLY is fed back as an input to BCCP 23782 to provide a continuing DLY output in the case of errors in two or more consecutive data words read from MSB 20110.

As stated above, MSBR 23784 controls refresh of data stored in MSB 20110 as previously described with reference to MA's 20112. MSBR 23784 includes Refresh Rate Register (RFSHRATE) 23702, Refresh Margin Logic (RFSHMAR) 23704, Refresh Count Down Counter (RFSHCDCTR) 23706, and Refresh Control Register (RFSHCR) 23708 with associated Gate 23709. Four bit output of RFSHRATE 23702 is connected to input of RFSHMAR 23704 and eight bit output of RFSHMAR 23704 is connected to data inputs of RFSHCDCTR 23706. Single bit output of RFSHCDCTR 23706 is connected to load input of RFSHCDCTR 23706 and to a first input of RFSHCR 23708. First and second inputs of Gate 23709 are connected from BCmCS 23786 outputs mCENBREQ and mCRESETRFSH. A third input of Gate 23709 is connected from output Refresh Required (RFSHREQD) of RFSHCR 23708. Output of Gate 23709 is connected to a second input of RFSHCR 23708. A first output, RFSHREQD of RSFHCR 23708 is, as just stated, connected to a third input of Gate 23709. A second output of RFSHCR 23708, Refresh Busy (RFSHBUSY) is connected, as previously described, as an address input to BCmCS 23786 and as enable inputs to RFRCAMUX 23728 and RRCAMUX 23726.

RFSHRATE 23702 contains a four bit binary code representing time interval between successive MSB 20110 refresh operations. As previously described, each refresh operation refreshes all column of a given row of all MAs 20112. This four bit time interval code is provided as an address input to RFSHMAR 23704, which in turn provides an eight bit binary number representing time interval between successive MSB 20110 refresh operations.

RFSHMAR 23704 may contain, for example, up to sixteen different refresh intervals, each of which is selected by a particular refresh interval code from RFSHRATE 23702. Refresh interval codes are loaded into RFSHRATE 23702 by DP 10118, thus allowing DP 10118 to select MSB 20110 refresh interval, for example allowing DP 10118 to test MEM 10112 by increasing or decreasing MSB 20110 refresh interval.

At start of each refresh interval, RFSHMAR 23704's eight bit code is loaded into RFSHCDCTR 23706. RFSHCDCTR 23706 is then clocked to count down to zero. Upon occurrence of state zero in RFSHCDCTR 23706, RFSHCDCTR 23706 generates output Refresh Interval Concluded (RFSHINTC). RFSHINTC is provided to load enable input of RFSHCDCTR 23706 to load a next eight bit binary refresh interval number from RFSHMAR 23704 into RFSHCDCTR 23706 for next refresh interval. RFSHINTC is also provided to a first input of RFSHCR 23708 to indicate that a refresh operation is to be performed. RFSHCR 23708 provides, on next clock pulse, a corresponding output RFSHREQD to Gate 23709. RFSHREQD is gated together, in Gate 23709, with mCENBREQ and mCRESETRFSH. If mENBREQ is asserted and mRESETRFSH is not asserted, RFSHREQD is loaded through Gate 23709 into second input of RFSHCR 23708 to appear as RFSHBUSY to an address input of BCmCS 23786 and to RFRCAMUX 23728 and RRCAMUX 23726. If, however, mCENBREQ is not asserted or RESETRFSH is asserted, RFSHREQD input to Gate 23709 is inhibited and RFSHBUSY is not generated. That is, mCENBREQ from BCmC 23780 indicates that BC 20114 is executing an operation which may not be interrupted, thereby delaying RFSHBUSY until completion of that operation. BCmC 23780 may assert RESETRFSH at conclusion of a MSB 20110 referesh operation to reset RFSHBUSY, thus terminating refresh operation until conclusion of next refresh interval.

The above discussions have described structure and operation of MEM 10112, including MEM 10112's interfaces to JP 10114 and IOS 10116; structure and operation of MIC 20122, which receives request for MEM 10112 operations for JP 10114 and IOS 10116 and provides primary control for all MEM 10112 operations; MC 20116, which comprises MEM 10112's first, or high speed, level of data storage and primary path for data transfer between MSB 20110 and JP 10114 or IOS 10116; MA's 20112, which comprise MEM 10112's second, or bulk level of data storage; and BC 20114, which controls all transfers of data between MSB 20110 and BC 20116 and maintains data stored in MSB 20110.

As has been described in the above discussions, MEM 10112 is intelligent, priortizing memory having separate and independent ports to JP 10114 and IOS 10116. MEM 10112 is shared by and is accessable to both JP 10114 and 10116, is primary memory of CS 10110, and is primary path for information transfer between the external world (through IOS 10116) and JP 10114. MEM 10112 is a two level memory providing fast access to data stored therein. MEM 10112's first, or bulk, level of storage is comprised of a large set of random access memory arrays, that is MA's 20112, and MEM 10112's second level is comprised of a high speed cache, that is MCC 23210, whose operation is generally transparent to JP 10114 and IOS 10116. Information stored in MEM 10112 appears bit addressable to both JP 10114 and IOS 10116, and MEM 10112 is capable of performing certain data manipulation operations to provide data in the desired format to both JP 10114 and IOS 10116. In addition, MEM 10112 allows a direct bypass transfers of full four word blocks between MSB 20110 and IOS 10116 and JP 10114. Due to a high degree of pipelining, that is concurrent overalapping MEM 10112 operations, MEM 10112 interfaces to both JP 10114 and IOS 10116 appear as if each of JP 10114 and IOS 10116 have full, continual access to MEM 10112.

Having described the structure and operation of MEM 10112 above, the structure and operation of FU 10120 will be described next below.

B. Fetch Unit 10120 (FIGS. 202, 206, 101, 103, 104, 238)

As has been previously described, FU 10120 is an independently operating, microcode controlled machine comprising, together with EU 10122, CS 10110's micromachine for executing user's programs. Principal functions of FU 10120 include: (1) Fetching and interpreting instructions, that is SINs comprising SOPs and Names, and data from MEM 10112 for use by FU 10120 and EU 10122; (2) Organizing and controlling flow and execution of user programs; (3) Initiating EU 10122 operations; (4) Performing arithmetic and logic operations on data; (5) Controlling transfer of data from FU 10120 and EU 10122 to MEM 10112; and, (6) Maintaining certain stack register mechanisms. Among these stack and register mechanisms are Name Cache (NC) 10226, Address Translation Cache (ATC) 10228, Protection Cache (PC) 10234, Architectural Base Registers (ABRs) 10364, Micro-Control Registers (mCRs) 10366, Micro-Stack (MIS) 10368, Monitor Stack (MOS) 10370 of General Register File (GRF) 10354, Micro-Stack Pointer Register Mechanism (MISPR) 10356, and Return Control Word Stack (RCWS) 10358. In addition to maintaining these FU 10120 resident stack and register mechanisms, FU 10120 generates and maintains, in whole or part, certain MEM 10112 resident data structures. Among these MEM 10112 resident data structures are Memory Hash Table (MHT) 10716 and Memory Frame Table (MFT) 10718, Working Set Matrix (WSM) 10720, Virtual Memory Management Request Queue (VMMRQ) 10721, Active Object Table (AOT) 10712, Active Subject Table (AST) 10914, and Virtual Processor State Blocks (VPSBs) 10218. In addition, a primary function of FU 10120 is the generation and manipulation of logical descriptors which, as previously described, are the basis of CS 10110's internal addressing structure. As will be described further below, while FU 10120's internal structure and operation allows FU 10120 to execute arithmetic and logic operations, FU 10120's structure includes certain features to expedite generation and manipulation of logical descriptors.

Figure 202:
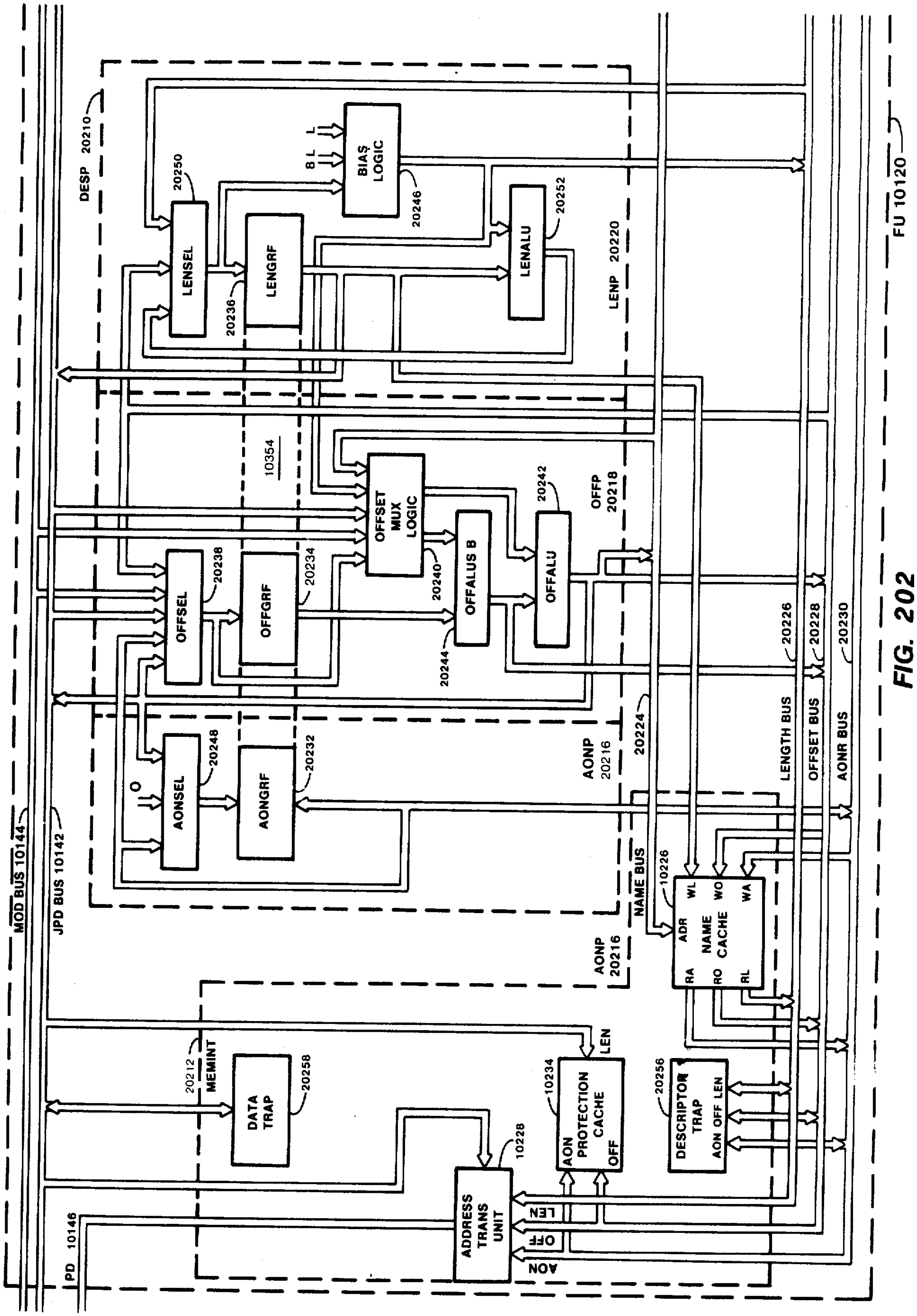
FIG. 202 and 202A are a detailed block diagram of a fetch unit.
Figure 202A:
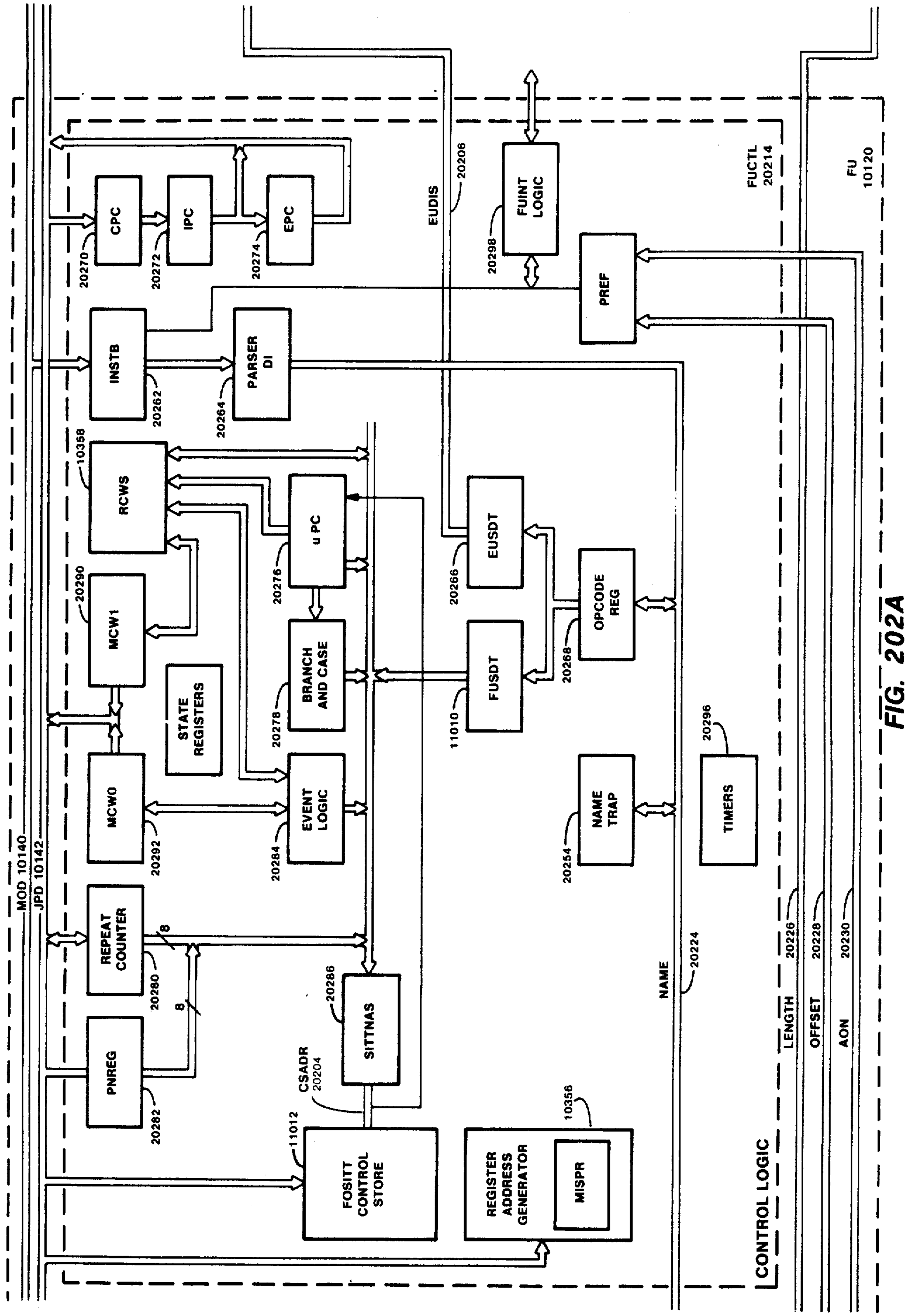

Referring to FIG. 202, a partial block diagram of FU 10120 is shown. To enhance clarity of presentation, certain interconnections within FU 10120, and between FU 10120 and EU 10122 and MEM 10112 are not shown by line connections but, as described further below, are otherwise indicated, such as by common signal names. Major functional elements of FU 10120 include Descriptor Processor (DESP) 20210, MEM 10112 Interface Logic (MEMINT) 20212, and Fetch Unit Control Logic (FUCTL) 20214. DSP 20210 is, in general, an arithmetic and logic unit for generating and manipulating entries for MEM 10112 and FU 10120 resident stack mechanisms and caches, as described above, and, in particular, for generation and manipulation of logical descriptors. In addition, as stated above, DESP 20210 is a general purpose Central Processor Unit (CPU) capable of performing certain arithmetic and logic functions.

DESP 20210 includes AON Processor (AONP) 20216, Offset Processor (OFFP) 20218, Length Processor (LENP) 20220. OFFP 20218 comprises a general, 32 bit CPU with additional structure to optimize generation and manipulation of offset fields of logical descriptors. AONP 20216 and LENP 20220 comprise, respectively, processors for generation and manipulation of AON and length fields of logical descriptors and may be used in conjuction with OFFP 20218 for execution of certain arithmetic and logical operations DESP 20210 includes GRF 10354, which in turn include Global Registers (GRs) 10360 and Stack Registers (SRs) 10362. As previously described, GR's 10360 includes ABRs 10364 and mCRs 10366 while SRs 10362 includes MIS 10368 and MOS 10370.

MEMINT 20212 comprises FU 10120's interface to MEM 10112 for providing Physical Descriptors (physical addresses) to MEM 10112 to read SINs and data from and write data to MEM 10112. MEMINT 20212 includes, among other logic circuitry, MC 10226, ATC 10228, and PC 10234.

FUCTL 20214 controls fetching of SINs and data from MEM 10112 and provides sequences of microinstructions for control of FU 10120 and EU 10122 in response to SOPs. FUCTL 20214 provides Name inputs to MC 10226 for subsequent fetching of corresponding data from MEM 10112. FUCTL 20214 includes, in part, MISPR 10356, RCWS 10358, Fetch Unit S-Interpreter Dispatch Table (FUSDT) 11010, and Fetch Unit S-Interpreter Table (FUSITT) 11012.

Having described the overall structure of FU 10120, in particular with regard to previous descriptions in Chapter 1 of this description, DESP 20210, MEMINT 20212, and FUCTL 20214 will be described in further detail below, and in that order.

1. Description Processor 20210 (FIGS. 202, 101, 103, 104, 238, 239)

As described above, DESP 20210 comprises a 32 bit CPU for performing all usual arithmetic and logic operations on data. In addition, a primary function of DESP 20210 is generation and manipulation of entries for, for example, Name Tables (NTs) 10350, ATC 10228, and PC 10234, and generation and manipulation of logical descriptors. As previously described, with reference to CS 10110 addressing structure, logical descriptors are logical addresses, or pointers, to data stored in MEM 10112. Logical descriptors are used, for example, as architectural base pointers or microcontrol pointers in ABRs 10364 and mCRs 10366 as shown in FIG. 103, or as linkage and local pointers of Procedure Frames 10412 as shown in FIG. 104. In a further example, logical descriptors generated by DESP 20210 and corresponding to certain operand Names are stored in MC 10226, where they are subsequently accessed by those Names appearing in SINs fetched from MEM 10112 to provide rapid translation between operand Names and corresponding logical descriptors.

As has been previously discussed with reference to CS 10110 addressing structure, logical descriptors provided to ATU 10228, from DESP 20210 or NC 10226, are translated by ATU 10228 to physical descriptors which are actual physical addresses of corresponding data stored in MEM 10112. That data subsequently is provided to JP 10114, and in particular to FU 10120 or EU 10122, through MOD Bus 10144.

As has been previously discussed with reference to MEM 10112, each data read to JP 10114 from MEM 10112 may contain up to 32 bits of information. If a particular data item referenced by a logical descriptor contains more than 32 bits of data, DESP 20210 will, as described further below, generate successive logical descriptors, each logical descriptor referring to 32 bits or less of information, until the entire data item has been read from MEM 10112. In this regard, it should be noted that NC 10226 may contain logical descriptors only for data items of 255 bits or less in length. All requests to MEM 10112 for data items greater than 32 bits in length are generated by DESP 20210. Most of data items operated on by CS 10110 will, however, be 32 bits or less in length so that NC 10226 is capable of handling most operand Names to logical descriptor translations.

As described above, DESP 20210 includes AONP 20216, OFFP 20218, and LENP 20220. OFFP 20218 comprises a general purpose 32 bit CPU with additional logic circuitry for generating and manipulating table and cache entries, as described above, and for generating and manipulating offset fields of AON pointers and logical descriptors. AONP 20216 and LENP 20220 comprise logic circuitry for generating and manipulating, respectively, AON and length fields of AON pointers and logical descriptors. As indicated in FIG. 202, GRF 10354 is vertically divided in three parts. A first part resides in ANOP 20216 and, in additon to random data, contains AON fields of logical descriptors. Second and third parts reside, respectively, in OFFP 20218 and LENP 20220 and, in addition to containing random data, respectively contain offset and length fields of logical descriptors. AON, Offset, and length portions of GRF 10354 residing respectively in AONP 20216, OFFP 20218, and LENP 20220 are designated, respectively, as AONGRF, OFFGRF, and LENGRF. AONGRF portion of GRF 10354 is 28 bits wide while OFFGRF and LENGRF portions of GRF 10354 are 32 bits in width. Although shown as divided vertically into three parts, GRF 10354 is addressed and operates as a unitary structure. That is, a particular address provided to GRF 10354 will address corresponding horizontal segments of each of GRF 10354's three sections residing in AONP 20216, OFFP 20218, and LENP 20220.

a. Offset Processor 20218 Structure

Referring first to OFFP 20218, in addition to being a 32 bit CPU and generating and manipulating table and cache entries and offset fields of AON pointers and logical descriptors, OFFP 20218 is DESP 20210's primary path for receiving data from and transferring data to MEM 10112. OFFP 20218 includes Offset Input Select Multiplexer (OFFSEL) 20238, OFFGRF 20234, Offset Multiplexer Logic (OFFMUX) 20240, Offset ALU (OFFALU) 20242, and Offset ALU A Inputs Multiplexer (OFFALUSA) 20244.

OFFSEL 20238 has first and second 32 bit data inputs connected from, respectively, MOD Bus 10144 and JPD Bus 10142. OFFSEL 20238 has a third 32 bit data input connected from a first output of OFFALU 20242, a fourth 28 bit data input connected from a first output of AONGRF 20232, and a fifth 32 bit data input connected from OFFSET Bus 20228. OFFSEL 20238 has a first 32 bit output connected to input of OFFGRF 20234 and a second 32 bit output connected to a first input of OFFMUX 20240. OFFMUX 20240 has second and third 32 bit data inputs connected from, respectively, MOD Bus 10144 and JPD Bus 10142. OFFMUX 20240 also has a fourth 5 bit data input connected from Bias Logic (BIAS) 20246 and LENP 20220, described further below, and fifth 16 bit data input connected from NAME Bus 20224. Thirty-two bit data output of OFFGRF 20234 and first 32 bit data output of OFFMUX 20240 are connected to, respectively, first and second data inputs of OFFALUSA 20244. A first 32 bit data output of OFFALUSA 20244 and a second 32 bit data output of OFFMUX 20240 are connected, respectively, to first and second data inputs of OFFALU 20242. A second 32 bit data output of OFFALUSA 20244 is connected to OFFSET Bus 20228. A first 32 bit data output of OFFALU 20242 is connected to JPD Bus 10142, to a first input of AON Input Select Multiplexer (AONSEL) 20248 and AONP 20216, and, as described above, to a third input of OFFSEL 20238. A second 32 bit data output of OFFALU 20242 is connected to OFFSET Bus 20228 and third 16 bit output is connected to NAME Bus 20224.

b. AON Processor 20216 Structure

Referring to AONP 20216, a primary function of AONP 20216 is that of containing AON fields of AON pointers and logical descriptors. In addition, those portions of AONGRF 20232 not otherwise occupied by AON pointers and logical descriptors may be used as a 28 bit wide general register area by JP 10114. These portions of AONGRF 20232 may be so used either alone or in conjunction with corresponding portions of OFFGRF 20234 and LENGRF 20236. AONP 20216 includes AONSEL 20248 and AONGRF 20232. As previously described, a first 32 bit data input AONSEL 20248 is connected from a first data output of OFFALU 20242. A second 28 bit data input of AONSEL 20248 is connected from 28 bit output of AONGRF 20232 and from AON Bus 20230. A third 28 bit data input of AONSEL 20248 is connected from logic zero, that is a 28 bit input wherein each input bit is set to logic zero. Twenty-eight bit data output of AONSEL 20248 is connected to data input of AONGRF 20232. As just described, 28 bit data output of AONGRF 20232 is connected to second data input of AONSEL 20248, and is connected to AON Bus 20230.

c. Length Processor 20220 Structure

Referring finally to LENP 20220, a primary function of LENP 20220 is the generation and manipulation of length fields of AON pointers and physical descriptors. In addition, LENGRF 20236 may be used, in part, either alone or in conjunction with corresponding address spaces of AONGRF 20232 and OFFGRF 20234, as general registers for storage of data. LENP 20220 includes Length Input Select Multiplexer (LENSEL) 20250, LENGRF 20236, BIAS 20246, and Length ALU (LENALU) 20252. LENSEL 20250 has first and second data inputs connected from, respectively, LENGTH Bus 20226 and OFFSET Bus 20228. LENGTH Bus 20226 is eight data bits, zero filled while OFFSET Bus 20228 is 32 data bits. LENSEL 20250 has a third 32 bit data input connected from data output of LENALU 20252. Thirty-two bit data output of LENSEL 20250 is connected to data input of LENGRF 20236 and to a first data input of BIAS 20246. Second and third 32 bit data inputs of BIAS 20246 are connected from, respectively, Constant (C) and Literal (L) outputs of FUSITT 11012 as will be described further below. Thirty-two bits data output of LENGRF 20236 is connected to JPD Bus 10142, to Write Length Input (WL) input of NC 10226, and to a first input of LENALU 20252. Five bit output of BIAS 20246 is connected to a second input of LENALU 20252, to LENGTH Bus 20226, and, as previously described, to a fourth input of OFFMUX 20240. Thirty-two bit output of LENALU 20252 is connected, as stated above, to third input of LENSEL 20250.

Having described the overall operation and the structure of DESP 20210, operation of DESP 20210 will be described next below in further detail.

d. Descriptor Processor 20210 Operation a.a. Offset Selector 20238

Referring to OFFP 20218, GRF 10354 includes GR's 10360 and SR's 10362. GR's 10360 in turn contain ABR's 10364, mCR's 10366, and a set of general registers. SR's 10362 include MIS 10368 and MOS 10370. GRF 10354 is vertically divided into three parts. AONGRF 20232 is 28 bits wide and resides in AONP 20216, LENGRF 20236 is 32 bits wide and resides in LENP 20220, and OFFGRF 20234 is 32 bits wide and resides in OFFP 20218. AONGRF 20232, OFFGRF 20234, and LENGRF 20236 may be comprised of Fairchild 93422s.

In addition to storing offset fields of AON pointers and logical descriptors, those portions of OFFGRF 20234 not reserved for ABR's 10365, mCR's 10366, and SR's 10362 may be used as general registers, alone or in conjunction with corresponding portions AONGRF 20232 and LENGRF 20236, when OFFP 20218 is being utilized as a general purpose, 32 bit CPU. OFFGRF 20234 as will be described further below, is addressed in parallel with AONGRF 20232 and LENGRF 20236 by address inputs provided from FUCTL 20214.

OFFSEL 20238 is a multiplexer, comprised for example of SN74S244s and SN74S257s, for selecting data inputs to be written into selected address locations of OFFGRF 20234. OFFSEL 20238's first data input is from MOD Bus 10144 and is the primary path for data transfer between MEM 10112 and DESP 20210. As previously described, each data read from MEM 10112 to JP 10114 is a single 32 bit word where between one and 32 bits may contain actual data. If a data item to be read from MEM 10112 contains more than 32 bits of data, successive read operations are performed until the entire data item has been transferred.

OFFSEL 20238's second data input is from JPD Bus 10142. As will be described further below, JPD Bus 10142 is a data transfer path by which data outputs of FU 10120 and EU 10122 are written into MEM 10112. OFFSEL 20238's input of JPD Bus 10142 thereby provides a wrap around path by which data present at outputs of FU 10120 or EU 10122 may be transferred back into DESP 20210 for further use. For example, as previously stated a first output of OFFALU 20242 is connected to JPD Bus 10142, thereby allowing data output of OFFP 20218 to be returned to OFFP 20218 for further processing, or to be transferred to AONP 20216 or LENP 20220 as will be described further below. In addition, output of LENGRF 20236 is also connected to JPD Bus 10142 so that length fields of AON pointers or physical descriptors, or data, may be read from LENGRF 20236 to OFFP 20218. This path may be used, for example, when LENGRF 20236 is being used as a general purpose register for storing data or intermediate results of arithmetic or logical operations.

OFFSEL 20238's third input is provided from OFFALU 20242's output. This data path thereby provides a wrap around path whereby offset fields or data residing in OFFGRF 20234 may be operated on and returned to OFFGRF 20234, either in the same address location as originally read from or to a different address location. OFFP 20218 wrap around path from OFFALU 20242's output to OFFSEL 20238's third input, and thus to OFFGRF 20234, may be utilized, for example, in reading from MEM 10112 a data item containing more than 32 bits of data. As previously described, each read operation from MEM 10112 to JP 10114 is of a 32 bit word wherein between one and 32 bits may contain actual data. Transfer of a data word containing more than 32 bits is accomplished by performing a succession of read operations from MEM 10112 to JP 10114. For example, if a requested data item contains 70 bits of data, that data item will be transferred in three consecutive read operations. First and second read operations will each transfer 32 bits of data, and final read operation will transfer the remaining 6 bits of data. To read a data item of greater than 32 bits from MEM 10112 therefore, DESP 20210 must generate a sequence of logical descriptors, each defining a successive 32 bit segment of that data item. Final logical descriptor of the sequence may define a segment of less than 32 bits, for example, six bits as in the example just stated. In each successive physical descriptor, offset field must be incremented by value of length field of the preceding physical descriptor to define starting addresses of successive data items segments to be transferred. Length field of succeeding physical descriptors will, in general, remain constant at 32 bits except for final transfer which may be less than 32 bits. Offset field will thereby usually be incremented by 32 bits at each transfer until final transfer. OFFP 20218's wrap around data path from OFFALU 20242's output to third input of OFFSEL 20238 may, as stated above, be utilized in such sequential data transfer operations to write incremented or decremented offset field of a current physical descriptor back into OFFGRF 20234 to be offset field of a next succeeding physical descriptor.

In a further example, OFFP 20218's wrap around path from OFFALU 20242's output to third input of OFFSEL 20238 may be used in resolving Entries in Name Tables 10350, that is Name resolutions. In Name resolutions, as previously described, offset fields of AON pointers, for example Linkage Pointers 10416, are successively added and subtracted to provide a final AON pointer to a desired data item.

OFFSEL 20238's fourth input, from AONGRF 20232's output, may be used to transfer data or AON fields from AONGRF 20232 to OFFGRF 20234 or OFFMUX 20240. This data path may be used, for example, when OFFP 20218 is used to generate AON fields of AON pointers or physical descriptors or when performing Name evaluations.

Finally, OFFSEL 20238's fifth data input from OFFSET Bus 20228 allows offset fields on OFFSET Bus 20228 to be written into OFFGRF 20234 or transferred into OFFMUX 20240. This data path may be used, for example, to copy offset fields to OFFGRF 20234 when JP 10114 is performing a Name evaluation.

Referring now to OFFMUX 20240, OFFMUX 20240 includes logic circuitry for manipulating individual bits of 32 bit words. OFFMUX 20240 may be used, for example, to increment and decrement offset fields by length fields when performing string transfers, and to generate entries for, for example, MHT 10716 and MFT 10718. OFFMUX 20240 may also be used to aid in generating and manipulating AON, OFFSET, and LENGTH fields of physical descriptors and AON pointers.

b.b. Offset Multiplexer 20240 Detailed Structure (FIG. 238)

Figure 238:
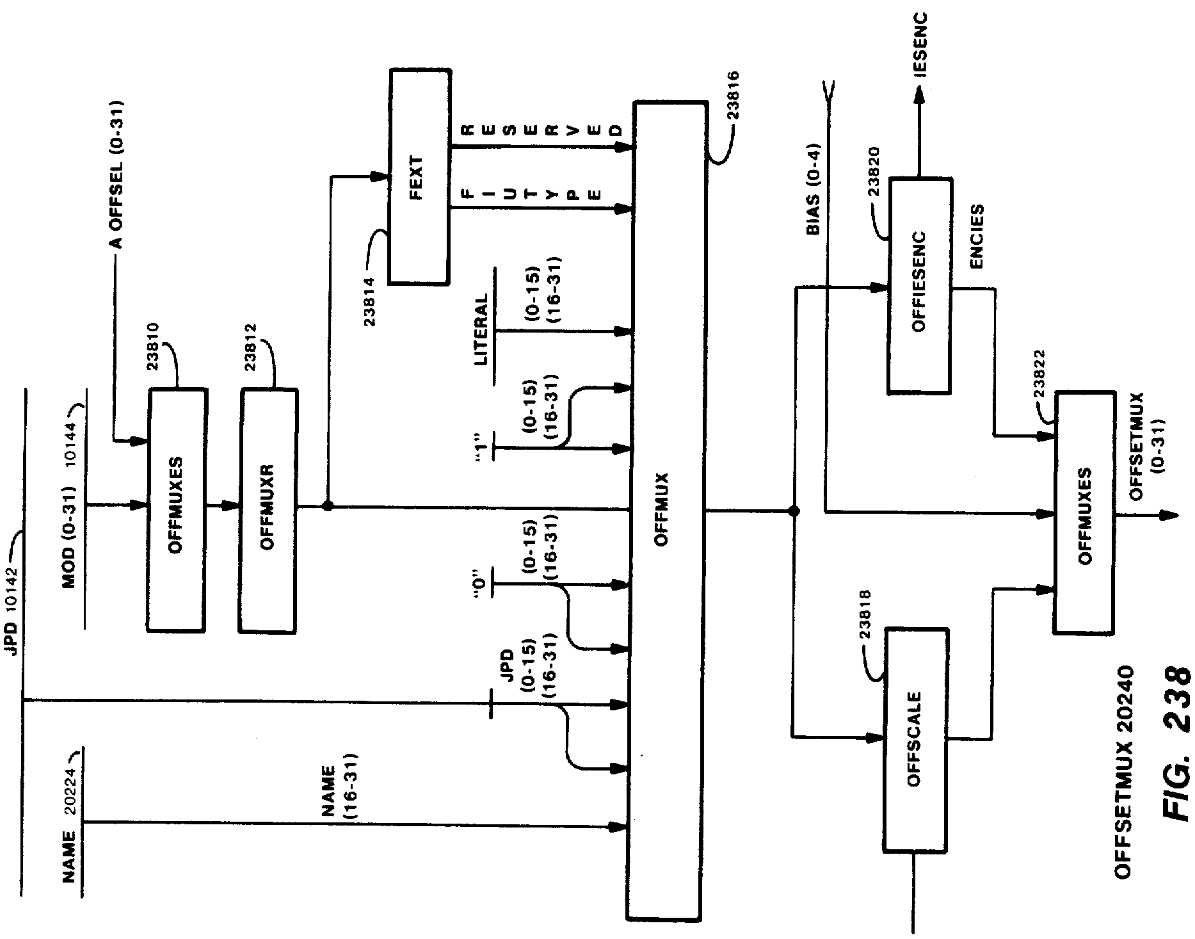
FIG. 238 is a detailed block diagram of fetch unit offset multiplexer.

Referring to FIG. 238, a more detailed, partial block diagram of OFFMUX 20240 is shown. OFFMUX 20240 includes Offset Multiplexer Input Selector (OFFMUXIS) 23810, which for example may be comprised of SN74S373s and SN74S244s and Offset Multiplexer Register (OFFMUXR) 23812, which for example may be comprised of SN74S374s. OFFMUX 20240 also includes Field Extraction Circuit (FEXT) 23814, which may for example be comprised of SN74S257s, and Offset Multiplexer Field Selector (OFFMUXFS) 23816, which for example may be comprised of SN74S257s and SN74S374s. Finally, OFFMUX 20240 includes Offset Scaler (OFFSCALE) 23818, which may for example be comprised of AMD 25S10s, Offset Inter-element Spacing Encoder (OFFIESENC) 23820, which may for example be comprised of Fairchild 93427s and Offset Multiplexer Output Selector (OFFMUXOS) 23822, which may for example be comprised of AMD 25Ss, Fairchild 93427s, and SN74S244s.

Referring first to OFFMUX 20240's connections to other portions of OFFP 20218, OFFMUX 20240's first data input, from OFFSEL 20238, is connected to a first input of OFFMUXIS 23810. OFFMUX 20240's second input, from MOD Bus 10144, is connected to a second input of OFFMUXIS 23810. OFFMUX 20240's third input, from JPD Bus 10142, is connected to a first input of OFFMUXFS 23816 while OFFMUX 20240's fourth input, from BIAS 20246, is connected to a first input of OFFMUXOS 23822. OFFMUX 20240's fifth input, from NAME Bus 20224, is connected to a second input of OFFMUXFS 23816. OFFMUX 20240's first output, to OFFALUSA 20244, is connected from output of OFFMUXR 23812 while OFFMUX 20240's second output, to OFFALU 20242, is connected from output of OFFMUXOS 23822.

Referring to OFFMUX 20240's internal connections, 32 bit output of OFFMUXIS 23810 is connected to input OFFMUXR 23812 and 32 bit output of OFFMUXR 23812 is connected, as described above, as first output of OFFMUX 20240, and as a third input of OFFMUXFS 23816. Thirty-two bit output of OFFMUXR 23812 is also connected to input of FEXT 23814. OFFMUXFS 23816's first, second and third inputs are connected as described above. A fourth input of OFFMUXFS 23816 is a 32 bit input wherein 31 bits are set to logic zero and 1 bit to logic 1. A fifth input is a 32 bit input wherein 31 bits are set to logic 1 and 1 to logic 0. A sixth input of OFFMUXFS 23816 is a 32 bit literal (L) input provided from FUSITT 11012 and is a 32 bit binary number comprising a part of a microinstruction FUCTL 20214, described below. OFFMUXFS 23816's seventh and eighth input are connected from FEXT 23814. Input 7 comprises FIU and TYPE fields of Name Table Entries which have been read into OFFMUXR 23812. Input 8 is a general purpose input conveying bits extracted from a 32 bit word captured in OFFMUXR 23812. As indicated in FIG. 238, OFFMUXFS 23816's first, third, fourth, fifth, and sixth inputs are each 32 bit inputs which are divided to provide two 16 bit inputs each. That is, each of these 32 bit inputs is divided into a first input comprising bit 0 to 15 of that 32 bit input, and a second input comprising bits 16 to 31.

Thirty-two bit output of OFFMUXFS 23816 is connected to inputs of OFFSCALE 23818 and OFFIESENC 23820. As indicated in FIG. 238, Field Select Output (FSO) of OFFMUXFS 23816 is a 32 bit word divided into a first word including 0 to 15 and a second word including bits 16 to 31. Output FSO of OFFMUXFS 23816, as will be described further below, thereby reflects the divided structure of OFFMUXFS 23816's first, third, fourth, fifth, and sixth inputs.

Logical functions performed by OFFMUXFS 23816 in generating output FSO, and which will be described in further detail in following descriptions, include:

(1) Passing the contents of OFFMUXR 23812 directly through OFFMUXFS 23816;

(2) Passing a 32 bit word on JPD Bus 10142 directly through OFFMUXFS 23816;

(3) Passing a literal value comprising a part of a microinstruction from FUCTL 20214 directly through OFFMUXFS 23816;

(4) Forcing FSO to be literal values 0000 0000;

(5) Forcing FSO to be literal value 0000 001;

(6) Extracting Name Table Entry fields;

(7) Accepting a 32 bit word from OFFMUXR 23812 or JPD Bus 10142, or 32 bits of a microinstruction from FUCTL 20214, and passing the lower 16 bits while forcing the upper 16 bits to logic 0;

(8) Accepting a 32 bit word from OFFMUXR 23812 or JPD Bus 10142, or 32 bits of microinstruction from FUCTL 20214, and passing the higher 16 bits while forcing the lower 16 bits to logic 0;

(9) Accepting a 32 bit word from OFFMUXR 23812, or JPD Bus 10142, or Name Bus 20224, or 32 bits of a microinstruction from FUCTL 20214, and passing the lower 16 bits while sign extending bit 16 to the upper 16 bits; and,

(10) Accepting a 32 bit word from Name Bus 20224 and passing the lowest 8 bits while sign extending bit 24 to the highest 24 bits.

Thirty-two bit output of OFFSCALE 23818 and 3 bit output of OFFIESENC 23820 are connected, respectively, to second and third inputs of OFFMUXOS 23822. OFFMUXOS 23822's first input is, as described above, OFFMUX 20240's fourth input and is connected from output BIAS 20246. Finally, OFFMUXOS 23822's 32 bit output, OFFMUX (0–31) is OFFMUX 20240's second output and as previously described as connected to a second input of OFFALU 20242.

c.c. Offset Muliplexer 20240 Detailed Operation a.a.a. Internal Operation

Having described the structure of OFFMUX 20240 as shown in FIG. 238, operation of OFFMUX 20240 will be described below. Internal operation of OFFMUX 20240, as shown in FIG. 238, will be described first, followed by description of OFFMUX 20240's operation with regard to DESP 20210.

Referring first to OFFMUXR 23812, OFFMUXR 23812 is a 32 bit register receiving either a 32 bit word from MOD Bus 10144, MOD (0–31), or a 32 bit word received from OFFSEL 20238, OFFSEL (0–31), and is selected by OFFMUXIS 23810. OFFMUXR 23812 in turn provides those selected 32 bit words from MOD Bus 10144 or OFFSEL 20238 as OFFMUX 20240's first data output to OFFALUSA 20244, as FEXT 23814's input, and as OFFMUXFS 23816's third input. OFFMUXR 23812's 32 bit output to OFFMUXFS 23816 is provided as two parallel 16 bit words designated as OFFMUXR output (OFFMUXRO) (0–15) and (16–31). As described above, OFFMUXFS 23816's output to OFFALUSA 20244 from OFFMUXR 23812 may be right shifted 16 places and the highest 16 bits zero filled.

FEXT 23814 receives OFFMUXRO (0–15) and (16–31) from OFFMUXR 23812 and extracts certain fields from those 16 bit words. In particular, FEXT 23814 extracts FIU and TYPE fields from NT 10350 Entries which have been transferred into OFFMUXR 23812. FEXT 23814 may then provide those FIU and TYPE fields as OFFMUXFS 23816's seventh input. FEXT 23814 may, selectively, extract certain other fields from 32 bit words residing in OFFMUXR 23812 and provide those fields as OFFMUXFS 23816's eighth input.

OFFMUXFS 23816 operates as a multiplexer to select certain fields from OFFMUXFS 23816's eight inputs and provide corresponding 32 bit output words, Field Select Output (FSO), comprised of those selected fields from OFFMUXFS 23816's inputs. As previously described, FSO is comprised of 2, parallel 16 bit words, FSO (0–15) and FSO (16–31). Correspondingly, OFFMUX 20240's third input, from JPD Bus 10142, is a 32 bit input presented as two 16 bit words, JPD (0–15) and JPD (16–31). Similarly, OFFMUXFS 23816's fourth, fifth, and sixth inputs are each presented as 32 bit words comprised of 2, parallel 16 bit words, respectively, "0" (0–15) and (16–31), "1" (0–15) and (16–31), and L (0–15) and (16–31). OFFMUXFS 23816's second input, from NAME Bus 20224, is presented as a single 16 bit word, NAME (16–31), while OFFMUXFS 23816's inputs from FEXT 23814 are each less than 16 bits in width. OFFMUXFS 23816 may, for a single 32 bit output word, select FSO (0–15) to contain one of corresponding 16 bit inputs JPD (0–15), "0" (0–15), "1" (0–15), or L (0–15). Similarly, FSO (16–31) of that 32 bit output word may be selected to contain one of NAME (16–31), JPD (16–31), 0 (16–31), 1 (16–31), L (16–31), or inputs 7 and 8 from FEXT 23814. OFFMUXFS 23816 therefore allows 32 bit words, comprised of two 16 bit fields, to be generated from selected portions of OFFMUXFS 23816's inputs.

OFFMUXFS 23816 32 bit output is provided as inputs to OFFSCALE 23818 and OFFIESENC 23820. Referring first to OFFIESENC 23820, OFFIESENC 23820 is used, in particular, in resolving, or evaluating, NT 10350 Entries (NTEs) referring to arrays of data words. As indicted in FIG. 108, word D of an NTE contains certain information relating to inter-element spacing (IES) of data words of an array. Word D of an NTE may be read from MEM 10112 to MOD Bus 10144 and through OFFMUX 20240 to input of OFFIESENC 23820. OFFIESENC 23820 then examines word D's IES field to determine whether inter-element spacing of that array is a binary multiple, that is 1, 2, 4, 8, 16, 32, or 64 bits. In particular, OFFIESENC 23820 determines whether 32 bit word D contains logic zeros in the most significant 25 bits and a single logic one in the least significant 7 bits. If inter-element spacing is such a binary multiple, starting addresses of data words of that array may be determined by left shifting of index (IES) to obtain offset fields of physical addresses of words in the array and a slower and more complex multiplication operation is not required. In such cases, OFFIESENC generates a first output, IES Encodeable (IESENC) to FUCTL 20214 to indicate that inter-element spacing may be determined by simple left shifting. OFFIESENC 23820 then generates encoded output, Encoded IES (ENCIES), to OFFMUXOS 23822. ENCIES is then a coded value specifying the amount of left shift necessary to translate index (IES) value into offsets of words in that array. As indicated in FIG. 238, ENCIES is OFFMUXOS 23822's third input.

OFFSCALE 23818 is a left shift shift network with zero fill of least significant bits, as bits are left shifted. Amount of shift by OFFSCALE 23818 is selectable between zero and 7 bits. Thirty-two bit words transferred into OFFSCALE 23818 from OFFSCALE 23818 from OFFMUXFS 23816 may therefore be left shifted, bit by bit, to selectively reposition bits within that 32 bit input word. In conjunction with OFFMUXFS 23816, and a wrap around connection provided by OFFALU 20242's output to OFFSEL 20238, OFFSCALE 23818 may be used to generate and manipulate, for example, entries for MHT 10716, MFT 10718, AOT 10712, and AST 10914, and other CS 10110 data structures. OFFMUXOS 23822 is a multiplexer having first, second, and third inputs from, respectively, BIAS 20246, OFFSCALE 23818, OFFIESENC 23820. OFFMUXOS 23822 may select any one of these inputs as OFFMUX 20240's second output, OFFMUX (0–31). As previously described, OFFMUX 20240's second output is connected to a second input of OFFALU 20242.

Having described internal of OFFMUX 20240, operation of OFFMUX 20240 with regard to overall operation of DESP 20210 will be described next blow.

b.b.b. Operation Relative to Descriptor Processor 20210

OFFMUX 20240's first input, from OFFSEL 20238, allows inputs to OFFSEL to be transferred through OFFMUXIS 23810 and into OFFMUXR 23812. This input allows OFFMUXR 23812 to be loaded, under control of FUCTL 20214 microinstructions, with any input of OFFSEL 20238. In a particular example, OF- FALU 20242's output may be fed back through OFFSEL 20238's third input and OFFMUX 20240's first input to allow OFFMUX 20240 and OFFALU 20242 to perform reiterative operations on a single 32 bit word.

OFFMUX 20240's second input, from MOD Bus 10144, allows OFFMUXR 23812 to be loaded directly from MOD Bus 10144. For example, NTEs from a currently active procedure may be loaded into OFFMUXR 23812 to be operated upon as described above. In addition, OFFMUX 20240's second input may be used in conjunction with OFFSEL 20238's first input, from MOD Bus 10144, as parallel input paths to OFFP 20218. These parallel input paths allow pipelining of OFFP 20218 operations by allowing OFFSEL 20238 and OFFGRF 20234 to operate independently from OFFMUX 20240. For example, FU 10120 may initiate a read operation from MEM 10112 to OFFMUXR 23812 during a first microinstruction. The data so requested will appear on MOD Bus 10144 during a second microinstruction and may be loaded into OFFMUXR 23812 through OFFMUX 20240's second input from MOD Bus 10144. Concurrently, FU 10120 may initiate, at start of second microinstruction, an independent operation to be performed by OFFSEL 20238 and OFFGRF 20234, for example loading output of OFFALU 20242 into OFFGRF 20234. Therefore, by providing an independent path into OFFMUX 20240 from MOD Bus 10144, OFFSEL 20238 is free to perform other, concurrent data transfer operations while a data transfer from MOD Bus 10144 to OFFMUX 20240 is being performed.

OFFMUX 20240's third input, from JPD Bus 10142, is a general purpose data transfer path. For example, data from LENGRF 20236 or OFFALU 20242 may be transferred into OFFMUX 20240 through JPD Bus 10142 and OFFMUX 20240's third input.

OFFMUX 20240's fourth input is connected from BIAS 20246 and primarily used during string transfers as described above. That is, length fields of physical descriptors generated for a string transfer may be transferred into OFFMUX 20240 through OFFMUX 20240's fourth input to increment or decrement, offset fields of those physical descriptors in OFFALU 20242.

OFFMUX 20240's fifth input is connected from NAME Bus 20224. As will be described further below, Names are provided to NC 10226 by FUCTL 20214 to call, from MC 10226, logical descriptors corresponding to Names appearing on MOD Bus 10144 as part of sequences of SINs. As each Name is presented to NC 10226, that Name is transferred into and captured in Name Trap (NT) 20254. Upon occurrence of an NC 10226 miss, that is NC 10226 does not contain an entry corresponding to a particular Name, that Name is subsequently transferred from NT 20254 to OFFMUX 20240 through NAME Bus 20224 and OFFMUX 20240's fifth input. That Name, which is previously described as an 8, 12, or 16 bit binary number, may then be scaled, that is multiplied by a NTE size. That scaled Name may then be added to Name Table Pointer (NTP) from mCRs 10366 to obtain the address of a corresponding NTE in an NT 10350. In addition, a Name resulting in a NC 10226 miss, or a page fault in the corresponding NT 10350, or requiring a sequence of Name resolves, may be transferred into OFFGRF 20234 from OFFMUX 20240, through OFFALU 20242 and OFFSEL 20238 third input. That Name may subsequently be read, or restored, from OFFGRF 20234 as required.

Referring now to outputs of OFFMUX 20240, OFFMUX 20240's first output, from OFFMUXR 23812, allows contents of OFFMUXR 23812 to be transferred to first input of OFFALU 20242 through OFFALUSA 20244. OFFMUX 20240's second output, from OFFMUXOS 23822, is provided directly to second input of OFFALU 20242. OFFALU 20242 may be concurrently provided with a first input from OFFMUXR 23812 and a second input, for example a manipulated offset field, from OFFMUXOS 23822.

Referring to OFFALUSA 20244, OFFALUSA 20244 is a multiplexer. OFFALUSA 20244 may select either output of OFFGRF 20234 or first output of OFFMUX 20240 to be either first input of OFFALU 20242 or to be OFFP 20218's output to OFFSET Bus 20228. For example, an offset field from OFFGRF 20234 may be read to OFFSET Bus 20228 to comprise the offset field of a current logical descriptor, and concurrently read into OFFALU 20242 to be incremented or decremented to generate the offset field of a subsequent logical descriptor in a string transfer.

OFFALU 20242 is a general purpose, 32 bit arithmetic and logic unit capable of performing all usual ALU operations. For example, OFFALU 20242 may add, subtract, increment, or decrement offset fields of logical descriptors. In addition, OFFALU 20242 may serve as a transfer path for data, that is OFFALU 20242 may transfer input data to OFFALU 20242's outputs without operating upon that data. OFFALU 20242's first output, as described above, is connected to JPD Bus 10142, to third input of OFFSEL 20238, and to first input of AONSEL 20248. Data transferred or manipulated by OFFALU 20242 may therefore be transferred on to JPD Bus 10142, or wrapped around into OFFP 20218 through OFFSEL 20238 for subsequent or reiterative operations. OFFALU 20242's output to AONSEL 20248 may be used, for example, to load AON fields of AON pointers or physical descriptors generated by OFFP 20218 into AONGRF 20232. In addition, this data path allows FU 10120 to utilize AONGRF 20232 as, for example, a buffer or temporary memory space for intermediate or final results of FU 10120 operations.

OFFALU 20242's output to OFFSET Bus 20228 allows logical descriptor offset fields to be transferred onto OFFSET Bus 20228 directly from OFFALU 20242. For example, a logical descriptor offset field may be generated by OFFALU 20242 during a first clock cycle, and transferred immediately onto OFFSET Bus 20228 during a second clock cycle.

OFFALU 20242's third output is to NAME Bus 20224. As will be described further below, NAME Bus 20224 is address input (ADR) to NC 10226. OFFALU 20242's output to NAME Bus 20224 thereby allows OFFP 20218 to generate or provide addresses, that is Names, to NC 10226.

Figure 239:
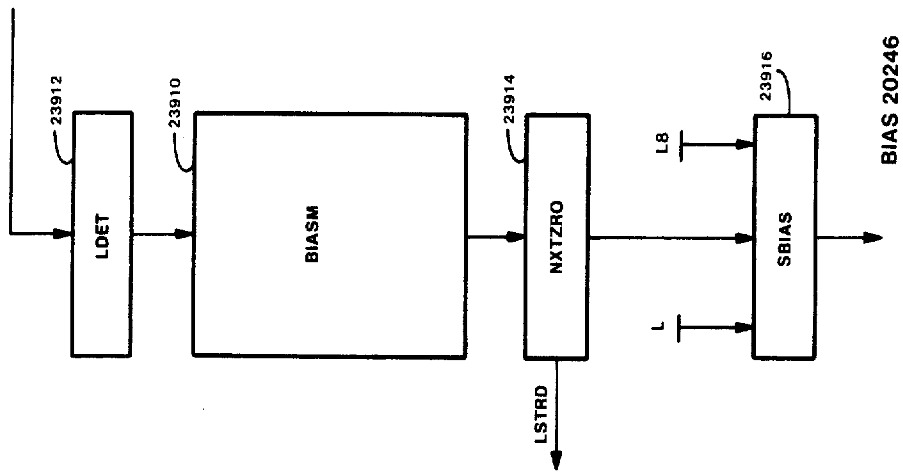
FIG. 239 is a detailed block diagram of fetch unit bias logic.

Having described the operation of OFFP 20218, operation of LENP 20220 will be described next below.

e. Length Processor 20220 (FIG. 239)

Referring to FIG. 202, a primary function of LENP 20220 is generation and manipulation of logical descriptor length fields, including length fields of logical descriptors generated in string transfers. LENP 20220 includes LENGRF 20236, LENSEL 20250, BIAS 20246, and LENALU 20252. LENGRF 20236 may be comprised, for example, of Fairchild 93422s. LENSEL 20250 may be comprised of, for example, SN74S257s, SN74S157s, and SN74S244s, and LENALU 20252 may be comprised of, for example, SN74S381s.

As previously described, LENGRF 20236 is a 32 bit wide vertical section of GRF 10354. LENGRF 20236 operates in parallel with OFFGRF 20234 and AONGRF 20232 and contains, in part, length fields of logical descriptors. In addition, also as previously described, LENGRF 20236 may contain data.

LENSEL 20250 is a multiplexer having three inputs and providing outputs to LENGRF 20236 and first input of BIAS 20246. LENSEL 20250's first input is from Length Bus 20226 and may be used to write physical descriptor or length fields from LENGTH Bus 20226 into LENGRF 20236 or into BIAS 20246. Such length fields may be written from LENGTH Bus 20226 to LENGRF 20236, for example, during Name evaluation or resolve operations. LENSEL 20250's second input is from OFFSET Bus 20228. LENSEL 20250's second input may be used, for example, to load length fields generated by OFFP 20218 into LENGRF 20236. In addition, data operated upon by OFFP 20218 may be read into LENGRF 20236 for storage through LENSEL 20250's second input.

LENSEL 20250's third input is from output of LENALU 20252 and is a wrap around path to return output of LENALU 20252 to LENGRF 20256. LENSEL 20250's third input may, for example, be used during string transfers when length fields of a particular logical descriptor are incremented or decremented by LENALU 20252 and returned to LENGRF 20236. This data path may also, for example, be used in moving a 32 bit word from one location in LENGRF 20236 to another location in LENGRF 20236. As stated above, LENSEL 20250's output is also provided to first input BIAS and allows data appearing at first, second, or third inputs of LENSEL 20250 to be provided to first input of BIAS 20246.

BIAS 20246, as will be described in further detail below, generates logical descriptor length fields during string transfers. As described above, no more than 32 bits of data may be read from MEM 10112 during a single read operation. A data item of greater than 32 bits in length must therefore be transferred in a series, or string, of read operations, each read operation transferring 32 bits or less of data. String transfer logical descriptor length fields generated by BIAS 20246 are provided to LENGTH Bus 20226, to LENALU 20252 second input, and to OFFMUX 20240's fourth input, as previously described. These string transfer logical descriptor length fields, referred to as bias fields, are provided to LENGTH Bus 20226 by BIAS 20246 to be length fields of the series of logical descriptors generated by DESP 20210 to execute a string transfer. These bias fields are provided to fourth input OFFMUX 20240 to increment or decrement offset fields of those logical descriptors, as previously described. These bias fields are provided to second input of LENALU 20252, during string transfers, to correspondingly decrement the length field of a data item being read to MEM 10112 in a string transfer. BIAS 20246 will be described in greater detail below, after LENALU 20252 is first briefly described.

a.a. Length ALU 20252

LENALU 20252 is a general purpose, 32 bit arithmetic and logic unit capable of executing all customary arithmetic and logic operations. In particular, during a string transfer of a particular data item LENALU 20252 receives that data items length field from LENGRF 20236 and successive bias fields from BIAS 20246. LENALU 20252 then decrements that logical descriptor's current length field to generate a length field to be used during the next read operation of the string transfer, and transfers the new length field back into LENGRF 20236 through LENSEL 20250's third input.

b.b. BIAS 20246 (FIG. 239)

Referring to FIG. 239, a partial block diagram of BIAS 20246 is shown. BIAS 20246 includes Bias Memory (BIASM) 23910, Length Detector (LDET) 23912, Next Zero Detector (NXTZRO) 23914, and Select Bias (SBIAS) 23916. Input of LDET 23912 is first input of BIAS 20246 and connected from output of LENSEL 20250. Output of LDET 23912 is connected to data input of BIASM 23910, and data output of BIASM 23910 is connected to input of NXTZRO 23914. Output of NXTZRO 23914 is connected to a first input of SBIAS 23916. A second input of SBIAS 23916 is BIAS 20246's second input, L8, and is connected from an output of FUCTL 20214. A third input of SBIAS 23916 is BIAS 20246's third input, L, and is connected from yet another output of FUCTL 20214. Output of SBIAS 23916 is output of BIAS 20246 and, as described above, is connected to LENGTH Bus 20226, to a second input of LENALU 20252, and to fourth input of OFFMUX 20240.

BIASM 23910 is a 7 bit wide random access memory having a length equal to, and operating and addressed in parallel with, SR's 10362 of GRF 10354. BIASM 23910 has an address location corresponding to each address location of SR's 10362 and is addressed concurrently with those address locations in SR's 10362. BIASM 23910 may be comprised, for example, of AMD 27S03As.

BIASM 23910 contains a bias value of each logical descriptor residing in SR's 10362. As described above, a bias value is a the number representing number of bits to be read from MEM 10112 in a particular read operation when a data item having a corresponding logical descriptor, with a length field stored in LENGRF 20236, is to be read from MEM 10112. Initially, bias values are written into BIASM 23910, in a manner described below, when their corresponding length fields are written into LENGRF 20236. If a particular data item has a length of less than 32 bits, that data item's initial bias value will represent that data item's actual length. For example, if a data item has a length of 24 bits the associated bias value will be a 6 bit binary number representing 24. That data item's length field in LENGRF 20236 will similarly contain a length value of 24. If a particular item has a length of greater than 32 bits for example, 70 bits as described in a previous example, that data item must be read from MEM 10112 in a string transfer operation. As previously described, a string transfer is a series of read operations transferring 32 bits at a time from MEM 10112, with a final transfer of 32 bits or less completing transfer of that data item. Such a data item's initial length field entry in LENGRF 20236 will contain, using the same example as previously described, a value of 70. That data item's initial bais entry written into a corresponding address space of BIASM 23910 will contain a bias value of 32. That initial bias value of 32 indicates that at least the first read operation required to transfer that data item from MEM 10112 will transfer 32 bits of data.

When a data item having a length of less than 32 bits, for example 24 bits, is to be read from MEM 10112, that data item's bias value of 24 is read from BIASM 23910 and provided to LENGTH Bus 20226 as the length field of the logical descriptor for that read operation.

Concurrently, that bias value of 24 is subtracted from that data item's length field read from LENGRF 20236. Subtracting that bias value from that length value will yield a result of zero, indicating that no further read operations are required to complete transfer of that data item.

If a data item having, for example, a length of 70 bits is to be read from MEM 10112, that data item's initial bias value of 32 is read from BIASM 23910 to LENGTH Bus 20226 as the length field of the first logical descriptor of a string transfer. Concurrently, that data item's initial length field is read from LENGRF 20236. That data item's initial bias value, 32, is subtracted from that data item's initial length value, 70, in LENALU 20252. The result of that subtraction operation is the remaining length of data item to be transferred in one or more subsequent read operations. In this example, subtracting initial bias value from initial length value indicates that 38 bits of that data item remain to be transferred. LENALU 20252's output representing results of this subtraction, for example 38, are transferred to LENSEL 20250's third input to LENGRF 20236 and written into the address location from which that data item's initial length value was read. This new length field entry then represents the remaining length of that data item. Concurrently, LDET 23912 examines that residual length value being written into LENGRF 20236 to determine whether remaining length of that data item is greater than 32 bits or is equal to or less than 32 bits. If remaining length is greater than 32 bits, LDET 23912 generates a next bias value of 32, which is written into BIASM 23910 and same address location that held initial bias value. If remaining data item length is less than 32 bits, LDET 23912 generates a 6 bit binary number representing actual remaining length of data item to be transferred. Actual remaining length would then, again, be written into BIASM 23910 address location originally containing initial bias value. These operations are also performed by LDET 23912 in examining initial length field and generating a corresponding initial bias value. These read operations are continued as described above until LDET 23912 detects that remaining length field is 32 bits or less, and thus that transfer of that data item will be completed upon next read operation. When this event is detected, LDET 23912 generates a seventh bit input into BIASM 23910, which is written into BIASM 23910 together with last bias value of that string transfer, indicating that remaining length will be zero after next read operation. When a final bias value is read from BIASM 23910 at start of next read operation of that string transfer, that seventh bit is examined by NXTZRO 23914 which subsequently generates a test condition output, Last Read (LSTRD) to FUCTL 20214. FUCTL 20214 may then terminate execution of that string transfer after that last read operation, if the transfer has been successfully completed.

As previously described, the basic unit of length of a data item in CS 10110 is 32 bits. Accordingly, data items of 32 or fewer bits may be transferred directly while data items of more than 32 bits require a string transfer. In addition, transfer of a data item through a string transfer requires tracking of the transferred length, and remaining length to be transferred, of both the data item itself and the data storage space of the location the data item is being transferred to. As such, BIAS 20246 will store, and operate with, in the manner described above, length and bias fields of the logical descriptors of both the data item and the location the data item is being transferred to. FUCTL 20214 will receive an LSTRD test condition if bias field of source descriptor becomes zero before or concurrently with that of the destination, that is a completed transfer, or if bias field of destination becomes zero before that of the source, and may provide an appropriate microcode control response. It should be noted that if source bias field becomes zero before that of the destination, the remainder of the location that this data item is being transferred to will be filled and padded with zeros. If the data item is larger than the destination storage capacity, the destination location will be filled to capacity and FUCTL 20214 notified to initiate appropriate action.

In addition to allowing data item transfers which are insensitive to data item length, BIAS 20246 allows string transfers to be accomplished by short, tight microcode loops which are insensitive to data item length. A string transfer, for example, from location A to location B is encoded as:

(1) Fetch from A, subtract length from bias A, and update offset and length of a; and, (2) Store to B, subtract length from bias B, and branch to (1) if length of B does not go to zero or fall through (end transfer) if length of B goes to zero. Source (A) length need not be texted as the microcode loop continues until length of B goes to zero; as described above, B will be filled and padded with zeros if length of A is less than length of B, or B will be filled and the string transfer ended if length of A is greater than or equal to length of B.

LDET 23912 and NXTZRO 23914 thereby allow FUCTL 20214 to automatically initiate a string transfer upon occurrence of a single microinstruction from FUCTL 20214 initiating a read operation by DESP 20210. That microinstruction initiating a read operation will then be automatically repeated until LSTRD to FUCTL 20214 from NXTZRO 23914 indicates that the string transfer is completed. LDET 23912 and NXTZRO 23914 may, respectively, be comprised for example of S74S260s, SN74S133s, SN74S51s, SN74S00s, SN74S00s, SN74S04s, SN74S02s, and SN74S32s.

Referring finally to SBIAS 23916, SBIAS 23916 is a multiplexer comprised, for example, of SN74S288s, SN74S374s, and SN74S244s. SBIAS 23916, under microinstruction control from FUCTL 20214, selects BIAS 20246's output to be one of a bias value from BIASM 23910, L8, or L. SBIAS 23916's first input, from BIASM 23910, has been described above. SBIAS 23916's second input, L8, is provided from FUCTL 20214 and is 8 bits of a microinstruction provided from FUSITT 11012. SBIAS 23916's second input allows microcode selection of bias values to be used in manipulation of length and offset fields of logical descriptors by LENALU 20252 and OFFALU 20242, and for generating entries to MC 10226. SBIAS 23916's third input, L, is similarly provided from FUCTL 20214 and is a decoded length value derived from portions of microinstructions in FUSITT 11012. These microcode length values represent certain commonly occurring data item lengths, for example length of 1, 2, 4, 8, 16, 32, and 64 bits. An L input representing a length of 8 bits, may be used for example in reading data from MEM 10112 on a byte by byte basis.

Having described operation of LENP 20220, operation of AONP 20216 will be described next below.

f. AON Processor 20216 a.a. AONGRF 20232

As described above, AONP 20216 includes AONSEL 20248 and AONGRF 20232. AONGRF 20232 is a 28 bit wide vertical section of GRF 10354 and stores AON fields of AON pointers and logical descriptors. AONSEL 20248 is a multiplexer for selecting inputs to be written into AONGRF 20232. AONSEL 20248 may be comprised, for example of SN74S257s. AONGRF 20232 may be comprised of, for example, Fairchild 93422s.

As previously described, AONGRF 20232's output is connected onto AON Bus 20230 to allow AON fields of AON pointers and logical descriptors to be transferred onto AON Bus 20230 from AONGRF 20232. AONGRF 20232's output, together with a bi-directional input from AON Bus 20230, is connected to a second input of AONSEL 20248 and to a fourth input of AONSEL 20238. This data path allows AON fields, either from AONGRF 20232 or from AON Bus 20230, to be written into AONGRF 20232 or AONGRF 20234, or provided as an input to OFFMUX 20240.

b.b. AON Selector 20248

AONSEL 20248's first input is, as previously described, connected from output of OFFALU 20242 and is used, for example, to allow AON fields generated or manipulated by OFFP 20218 to be written into AONGRF 20232. AONSEL 20248's third input is a 28 bit word wherein each bit is a logical zero. AONSEL 20248's third input allows AON fields of all zeros to be written into AONGRF 20232. An AON field of all zeros is reserved to indicate that corresponding entries in OFFGRF 20234 and LENGRF 20236 are neither AON pointers nor logical descriptors. AON fields of all zeros are thereby reserved to indicate that corresponding entries in OFFGRF 20234 and LENGRF 20236 contain data.

In summary, as described above, DESP 20210 includes AONP 20216, OFFP 20218, and LENP 20220. OFFP 20218 contains a vertical section of GRF 10354, OFFGRF 20234, for storing offset fields of AON pointers and logical descriptors, and for containing data to be operated upon by DESP 20210. OFFP 20218 is principal path for transfer of data from MEM 10112 to JP 10114 and is a general purpose 32 bit arithmetic and logic unit for performing all usual arithmetic and logic operations. In addition, OFFP 20218 includes circuitry, for example OFFMUX 20240, for generation and manipulation of AON, OFFSET, and LENGTH fields of logical descriptors and AON pointers. OFFP 20218 may also generate and manipulate entries for, for example, NC 10226, ATU 10228, PC 10234, AOT 10712, MHT 10716, MFT 10718, and other data and address structures residing in MEM 10112. LENP 20220 includes a vertical section of GRF 10354, LENGRF 20236, for storing length fields of logical descriptors, and for storing data. LENP 20220 further includes BIAS 20246, used in conjunction with LENGRF 20236 and LENALU 20252, for providing length fields of logical descriptors for MEM 10112 read operations and in particular automatically performing string transfers. AONP 20216 similarly includes a vertical section of GRF 10354, AONGRF 20232. A primary function AONGRF 20232 is storing and providing AON fields of AON pointers and logical descriptors.

Having described structure and operation of DESP 20210, structure and operation of Memory Interface (MEMINT) 20212 will be described next below.

Figure 240:
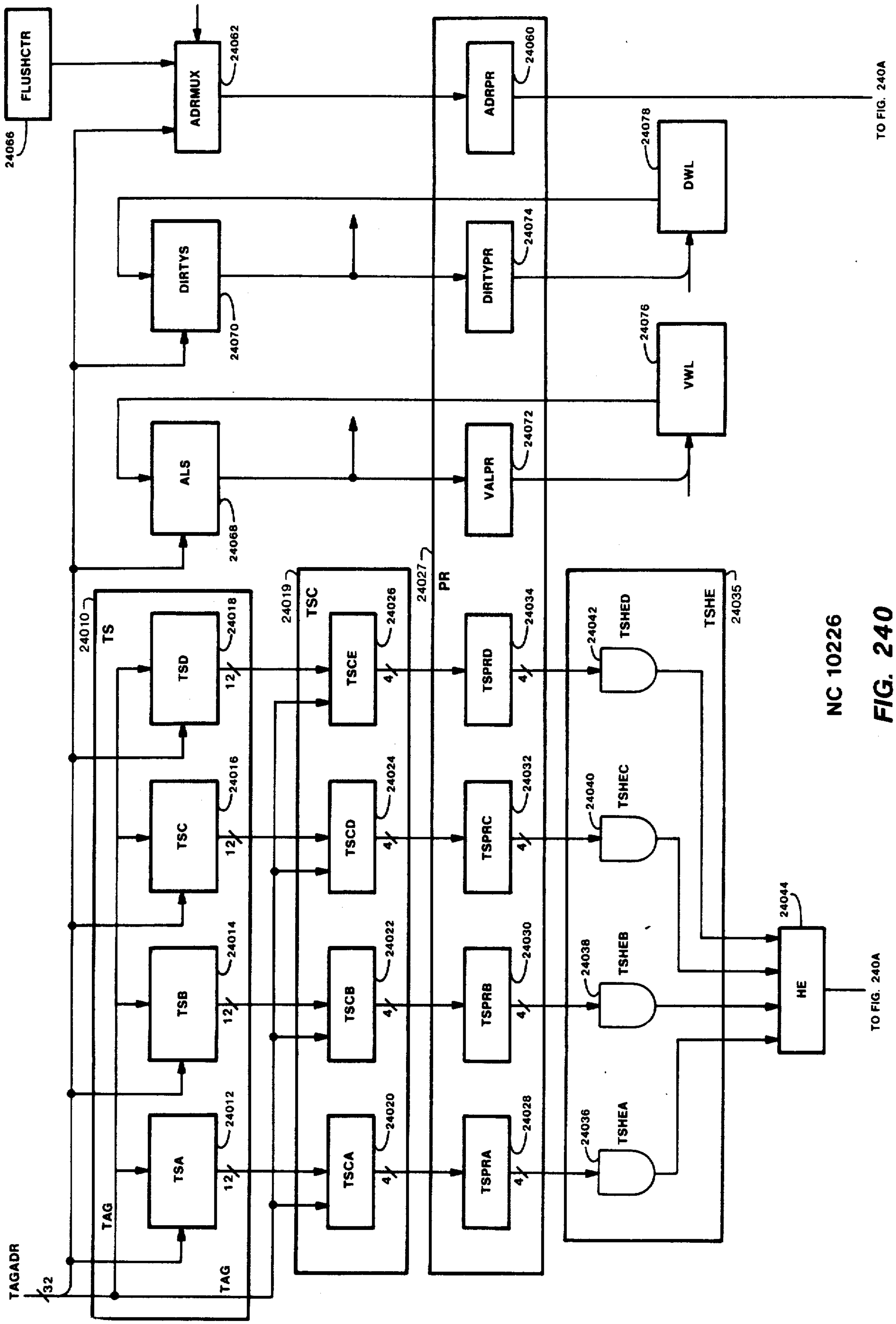
FIGS. 240 and 240A are a detailed block diagram of a generalized four way, set associative cache representing name cache, protection cache, and address translation unit.
Figure 240A:
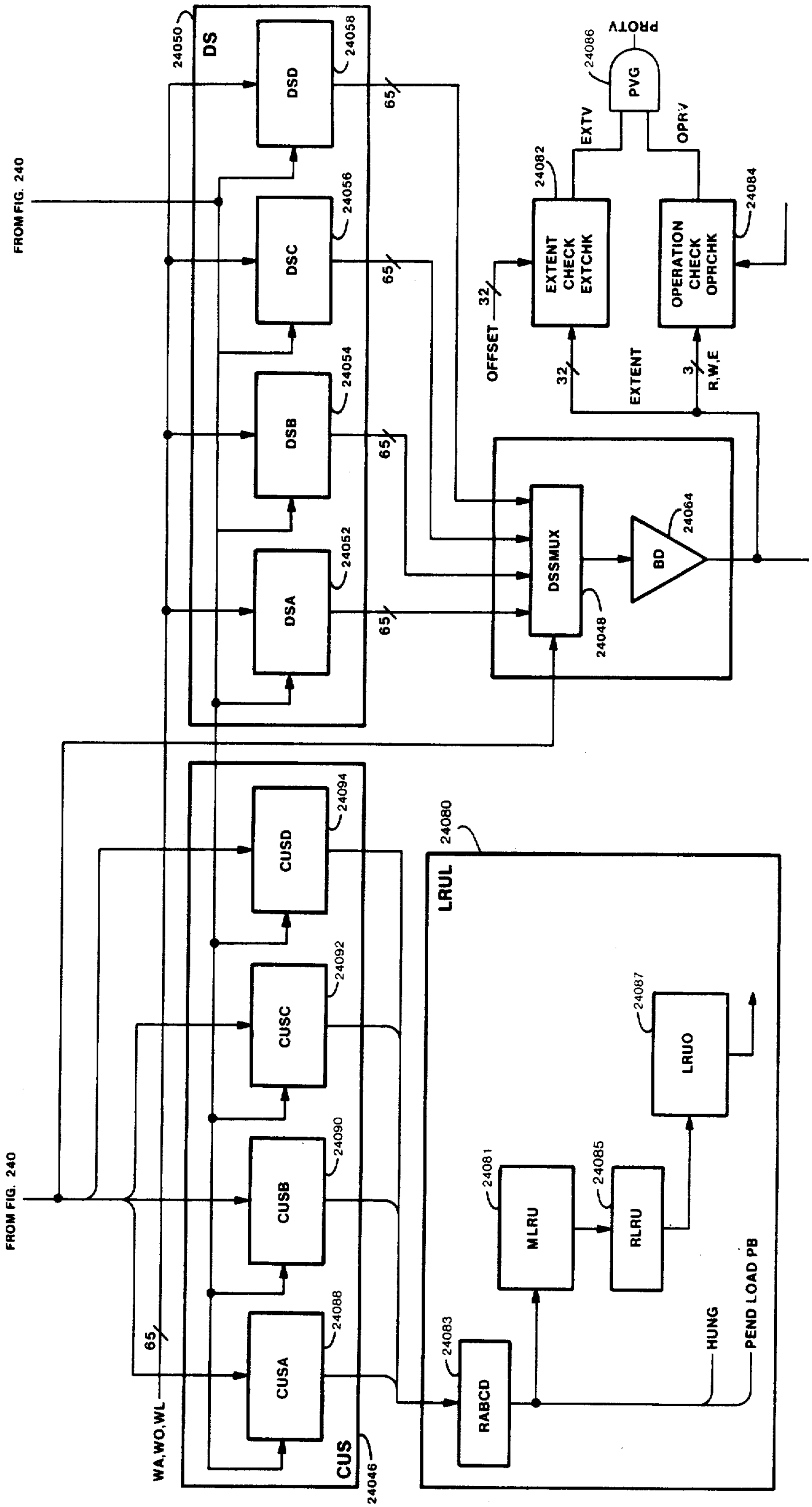

2. Memory Interface 20212 (FIGS. 106, 240)

MEMINT 20212 comprises FU 10120's interface to ME 10112. As described above, MEMINT 20212 includes Name Cache (NC) 10226, Address Translation Unit (ATU) 10228, and Protection Cache (PC) 10234, all of which have been previously briefly described. MEMINT 20212 further includes Descriptor Trap (DEST) 20256 and Data Trap (DAT) 20258. Functions performed by MEMINT 20212 includes (1) resolution of Names to logical descriptors, by NC 10226; (2) translation of logical descriptors to physical descriptors, by ATU 10228; and (3) confirmation of access writes to objects, by PC 10234.

As shown in FIG. 202, NC 10226 adress input (ADR) is connected from NAME Bus 20224. NC 10226 Write Length Field Input (WL) is connected from LENGRF 20236's output. NC 10226's Write Offset Field Input (WO) and Write AON Field Input (WA) are connected, respectively, from OFFSET Bus 20228 and AON Bus 20230. NC 10226 Read AON Field (RA), Read Offset Field (RO), and Read Length Field (RL) outputs are connected, respectively, to AON Bus 20230, OFFSET Bus 20228, and LENGTH Bus 20226.

DEST 20256's bi-directional AON (AON), Offset (OFF), and Length (LEN) ports are connected by bi-directional buses to and from, respectively, AON Bus 20230, OFFSET Bus 20228, and LENGTH Bus 20226.

PC 10234 has AON (AON) and Offset (OFF) inputs connected from, respectively, AON Bus 20230 and OFFSET Bus 20228. PC 10234 has a Write Entry (WEN) input connected from JPD Bus 10142. ATU 10228 has AON (AON), Offset (OFF), and Length (LEN) inputs connected from, respectively, AON Bus 20230, OFFSET Bus 20228, and LENGTH Bus 20226. ATU 10228's output is connected to Physical Descriptor (PD) Bus 10146.

Finally, DAT 20258 has a bi-directional port connected to and from JPD Bus 10142.

a.a. Descriptor Trap 20256 and Data Trap 20258

Referring first to DST 20256 and DAT 20258, DST 20256 is a register for receiving and capturing logical descriptors appearing on AON Bus 20230, OFFSET Bus 20228, and Length Bus 20226. Similarly, DAT 20258 is a register for receiving and capturing data words appearing on JPD Bus 10142. DST 20256 and DAT 20258 may subsequently return captured logical descriptors or data words to, respectively, AON Bus 20230, OFFSET Bus 20228, and LENGTH Bus 20226, and to JPD Bus 10142.

As previously described, many CS 10110 operations, in particular MEM 10112 and JP 10114 operations, are pipelined. That is, operations are overlapped with certain sets within two or more operations being executed concurrently. For example, FU 10120 may submit read request to MEM 10112 and, while MEM 10112 is accepting and servicing that request, submit a second read request. DEST 20256 and DAT 20258 assist in execution of overplapping operations by providing a temporary record of these operations. For example, a part of a read or write request to MEM 10112 by FU 10120 is a logical descriptor provided to ATU 10228. If, for example the first red request just referred to results in a ATU 10228 cache miss or a protection violation, the logical descriptor of that first request must be recovered for subsequent action by CS 10110 as previously described. That logical descriptor will have been captured and stored in DEST 20256 and thus is immediately available, so that DESP 20210 is not required to regenerate that descriptor. DAT 20258 serves a similar purpose with regard to data being written into MEM 10112 from JP 10114. That is, DAT 20258 receives and captures a copy of each 32 bit word transferred onto JPD Bus 10142 by JP 10114. In event of MEM 10112 being unable to accept a write request, that data may be subsequently reprovided from DAT 20258.

b.b. Name Cache 10226, Address Translation Unit 10228, and Protection Cache 10234 (FIG. 106)

Referring to NC 10226, ATU 10228, and PC 10234, these elements of MEMINT 20212 are primarily cache mechanisms to enhance the speed of FU 10120's interface to MEM 10112, and consequently of CS 10110's operation. As described previously, NC 10226 contains a set of logical descriptors corresponding to certain operand names currently appearing in a process being executed by CS 10110. NC 10226 thus effectively provides high speed resolution of certain operand names to corresponding logical descriptors. As described above with reference to string transfers, NC 10226 will generally contain logical descriptors only for data items of less than 256 bits length. NC 10226 read and write addresses are names provided on NAME Bus 20224. Name read and write addresses may be provided from DESP 20210, and in particular from OFFP 20218 as previously described, or from FUCTL 20214 as will be described in a following description of FUCTL 20214. Logical descriptors comprising NC 10226 entries, each entry comprising an AON field, an Offset field, a Length field, are written into NC 10226 through NC 10226 inputs WA, WO, and WL from, respectively, AON Bus 20230, OFFSET Bus 20228, and LENGRF 20236's output. Logical descriptors read from NC 10226 in response to names provided to NC 10226 ADR input are provided to AON Bus 20230, OFFSET Bus 20228, and LENGTH Bus 20226 from, respectively, NC 10226 outputs RA, RO, and RL.

ATU 10228 is similarly a cache mechanism for providing high speed translation of logical to physical descriptors. In general, ATU 10228 will contain, at any given time, a set of logical to physical page number mappings for MEM 10112 read and write requests which are currently being made, or anticipated to be made, to MEM 10112 by JP 10114. As previously described, each physical descriptor is comprised of a Frame Number (FN) field, and Offset Within Frame (O) fields, and a Length field. As discussed with reference to string transfers, a physical descriptor length field, as in a logical descriptor length field, specify a data item of less than or equal to 32 bits length. Referring to FIG. 106C, as previously discussed a logical descriptor comprised of a 14 bit AON field, a 32 bit Offset field, and Length field, wherein 32 bit logical descriptor Offset field is divided into a 18 bit Page Number (P) field and a 14 bit Offset within Page (O) field. In translating a logicl into a physical descriptor, logical descriptor Length and O fields are used directly, as respectively, physical descriptor length and O fields. Logical descriptor AON and P fields are translated into physical descriptor FN field. Because no actual translation is required, ATU 10228 may provide logical descriptor L field and corresponding O field directly, that is without delay, to MEM 10112 as corresponding physical descriptor O and Length fields. ATU 10228 cache entries are thereby comprised of physical descriptor FN fields corresponding to AON and P fields of those logical descriptors for which ATU 10228 has corresponding entries. Because physical descriptor FN fields are provided from ATU 10228's cache, rather than directly as in physical descriptor O and Length fields, a physical descriptor's FN field will be provided to MEM 10112, for example, one clock cycle later than that physical descriptors O and Length fields, as has been previously discussed.

Referring to FIG. 202, physical descriptor FN fields to be written into ATU 10228 are, in general, generated by DESP 20210. FN fields to be written into ATU 10228 are provided to ATU 10228 Data Input (DI) through JPD Bus 10142. ATU 10228 read and write addresses are comprised of AON and P fields of logical descriptors and are provided to ATU 10228's AON and OFF inputs from, respectively, AON Bus 20230 and OFFSET Bus 20228. ATU 10228 read and write addresses may be provided from DESP 20210 or, as described further below, from FUCTL 20214. ATU 10228 FN outputs, together with O and Length fields comprising a physical descriptor, are provided to PD Bus 10146.

PC 10234 is a cache mechanism for confirming active procedure's access rights to objects identified by logical descriptors generated as a part of JP 10114 read or write requests to MEM 10112. As previously described access rights to objects are arbitrated on the basis of subjects. A subject has been defined as a particular combination of a principal, process, and domain. A principal, process, and domain are each identified by corresponding UIDs. Each subject having access rights to an object is assigned an Active Subject Number (ASN) as described in a previous description of CS 10110's Protection Mechanism. The ASN of a subject currently active in CS 10110 is stored in ASN Register 10916 in FU 10120. Access rights of a currently active subject to currently active objects are read from those objects Access Control Lists (ACL) 10918 and stored in PC 10234. If the current ASN changes, PC 10234 is flushed of corresponding access right entries and new entries, corresponding to the new ASN, are written into PC 10234. The access rights of a particular current ASN to a particular object may be determined by indexing, or addressing, PC 10234 with the AON identifying that object. Addresses to write entries into or read entries from PC 10234 are provided to PC 10234 AON input from AON Bus 20230. Entries to be written into PC 10234 are provided to PC 10234's WEN input from JPD Bus 10142. PC 10234 is also provided with inputs, not shown in FIG. 202 for purposes of clarity, from FUCTL 20214 indicating the current operation to be perfomed by JP 10114 with respect to an object being presently addressed by FU 10120. Whenever FU 10120 submits a read or write request concening a particular object to MEM 10112, AON field of that request is provided as an addess to PC 10234. Access rights of the current active subject to that object are read from corresponding PC 10234 entry and compared to FUCTL 20214 inputs indicating the particular operation to be performed by JP 10114 with respect to that object. The operation to be performed by JP 10114 is then compared to that active subject's access rights to that object and PC 10234 provides an output indicating whether that active subject possesses the rights required to perform the intended operation. Indexing of PC 10234 and comparison of access rights to intended operation is performed concurrently with translation of the memory request logical descriptor to a corresponding physical descriptor by ATU 10228. If PC 10234 indicates that that active subject has the required access rights, the intended operation is executed by JP 10114. If PC 10234 indicates that that active subject does not have the required access rights, PC 10234 indicates that a protection mechanism violation has occurred and interrupts execution of the intended operation.

c.c. Structure and Operation of a Generalized Cache and NC 10226 (FIG. 240)

Having described overall structure and operation of NC 10226, ATU 10228, and PC 10234, structure and operation of these caches will be described in further detail below. Structure and operation of NC 10226, ATU 10228, and PC 10234 are similar, except that NC 10226 is a four-way set associative cache, ATU 10228 is a three-way set associative cache and PC 10234 is a two-way set associative cache.

As such, the structure and operation of NC 10226, ATU 10228, and PC 10234 will be described by reference to and description of a generalized cache similar but not necessarily identical to each of NC 10226, ATU 10228, and PC 10234. Reference will be made to NC 10226 in the description of a generalized cache next below, both to further illustrate structure and operation of the generalized cache, and to describe differences between the generalized cache and NC 10226. ATU 10228 and PC 10234 will then be described by description of differences between ATU 10228 and PC 10234 and the generalized cache. General structure and theory of operation of caches has been previously described with reference to MC 20116 and will not be repeated below.

Referring to FIG. 240, a partial block diagram of a generalized four-way, set associative cache is shown. Tag Store (TS) 24010 is comprised of Tag Store A (TSA) 24012, Tag Store B (TSB) 24014, Tag Store C (TSC) 24016, and Tag Store D (TSD) 24018. Each of the cache's sets, represented by TSA 24012 to TSD 24018, may contain, for example as in NC 10226, up to 16 entries, so that TSA 24012 to TSD 24018 are each 16 words long.

As previously described, address inputs to a cache are divided into a tag field and an index field. Tag fields are stored in the cache's tag store and indexed, that is addressed to be read or written from or to tag store by index field of the address. A tag read from tag store in response to index field of an address is then compared to tag field of that address to indicate whether the cache contains an entry corresponding to that address, that is, whether a cache hit occurs. In, for example, NC 10226, a Name syllable may be comprised of an 8, 12, or 16 bit binary word, as previously described. The four least significant bits of these words, or Names, comprise NC 10226's index field while the remaining 4, 8, or 12 most significant bits comprise NC 10226's tag field. TSA 24012 to TDS 24018 may each, therefore, be 12 entry wide memories to store the 12 bit tag fields of 16 bit names. Index (IND) or address inputs of TSA 24012 to TSD 24018, would in NC 10226, be connected from four least significant bits of NAME Bus 20224 while Tag Inputs (TAGI) of TSA 24012 to TSD 24018 would be connected from the 12 most significant bits of NAME Bus 20224.

As described above, tag outputs of TS 24010 are compared to tag fields of addresses presented to the cache to determine whether the cache contains an entry corresponding to that address. Using NC 10226 as an example 12 bit Tag Outputs (TAGOs) of TSA 24012 to TSD 24018 are connected to first inputs of Tag Store Comparators (TSC) 24019, respectively to inputs of Tag Store Comparitor A (TSCA) 24020, Tag Store Comparitor B (TSCB) 24022, Tag Store Comparitor D (TSCD) 24024, and Tag Store Comparitor E (TSCE) 24026. Second 12 bit inputs of TSCA 24020 to TSCE 24026 may be connected from the 12 most significant bits of NAME Bus 20224 to receive tag fields of NC 10226 addresses. TAS 24020 to TSCE 24026 compare tag field of an address to tag outputs read from TSA 24012 to TSE 24018 in response to index field of that address, and provide four bit outputs indicating which, if any, of the possible 16 entries and their associated tag store correspond to that address tag field. TSCA 24020 to TSCE 24026 may be comprised, for example, of Fairchild 93S46s.

Four bit outputs of TSCA 24012 to TSCE 24026 are connected in the generalized cache to inputs of Tag Store Pipeline Registers (TSPR) 24027; respectively to inputs of Tag Store Pipeline Register A (TSPRA) 24028, Tag Store Pipeline Register B (TSPRB) 24030, Tag Store Pipeline Register C (TSPRC) 24032, and Tag Store Pipeline Register D (TSPRD) 24034. As previously described with reference to MC 20116, ATU 10228 and PC 10234 is pipelined with a single cache access operation being executed in two clock cycles. During first clock cycle tag store is addressed and tags store therein compared to tag field of address to provide indication of whether a cache hit has occurred, that is whether cache contains an entry corresponding to a particular address. During second clock cycle, as will be described below, a detected cache hit is encoded to obtain access to a corresponding entry in cache data store. Pipeline operation over two clock cycles is provided by cache pipeline registers which include, in part, TSPRA 24028 to TSPRD 24034. NC 10226 is not pipelined and does not include TSPRA 24028 to TSPRD 24034. In NC 10226, outputs of TSCA 24012 to TSCD 24024 are connected directly to inputs of TSHEA 24036 to TSHED 24042, described below.

Outputs of TSPRA 24028 to TSPRD 24034 are connected to inputs of Tag Store Hit Encoders (TSHE) 24035, respectively to Tag Store Hit Encoder A (TSHEA) 24036, Tag Store Hit Encoder B (TSHEB) 24038, Tag Store Hit Encoder C (TSHEC) 24040, and Tag Store Hit Encoder D (TSHED) 24042. TSHEA 24036 to TSHED 24042 encode, respectively, bit inputs from TSPRA 24028 to TSPRD 24034 to provide single bit outputs indicating which, if any, set of the cache's four sets includes an entry corresponding to the address input.

Single bit outputs of TSHEA 24036 to TSHED 24042 are connected to inputs of Hit Encoder (HE) 24044. HE 24044 encodes single bit inputs from TSHEA 24036 to TSHED 24042 to provide two sets of ouputs. First outputs of HE 24044 are provided to Cache Usage Store (CUS) 24046 and indicate in which of the cache's four sets, corresponding to TSA 24012 to TSD 24018, a cache hit has occurred. As described previously with reference to MC 20116, and will be described further below, CUS 24046 is a memory containing information for tracking usage of cache entries. That is, CUS 24046 contains entries indicating whether, for a particular index, Set A, Set B, Set C or Set D of the cache's four sets has been most recently used and which has been least recently used. CUS 24046 entries regarding Sets A, B, C, and D are stored in, respectively, memories CUSA 24088, CUSB 24090, CUSC 24092, and CUSD 24094. Second output of HE 24044, as described further below, is connected to selection input of Data Store Selection Multiplexer (DSSMUX) 24048 to select an output from Data Store (DS) 24050 to be provided as output of the cache when a cache hit occurs.

Referring to DS 24050, as previously described a cache's data store contains the information, or entries, stored in that cache. For example, each entry in NC 10226's DS 24050 is a logical descriptor comprised of an AON, and Offset, and Length. A cache's data store parallels, in structure and organization, that cache's tag store and entries therein are identified and located through that cache's tag store and associated tag store comparison and decoding logic. In NC 10226, for example, for each Name having an entry in NC 10226 there will be an entry, the tag field of that name, stored in TS 24010 and a corresponding entry, a logical descriptor corresponding to that Name, in DS 24050. As described above, NC 10226 is a four-way, set associative cache so that TS 24010 and DS 24050 will each contain four sets of data. Each set was previously described as containing up to 16 entries. DS 24050 is therefore comprised of four 16 word memories. Each memory is 65 bits wide, accommodating 28 bits of AON, 32 bits of offset, and 5 bits of length. These four component data store memories of DS 24050 are indicated in FIG. 240 as Data Store A (DSA) 24052, Data Store B (DSB) 24054, Data Store C (DSC) 24056, and Data Store D (DSD) 24058. DSA 24052, DSB 24054, DSC 24056 and DSD 24058 correspond, respectively, in structure, contents, and operation to TSA 24012, TSB 24014, TSC 24016 and TSD 24018.

Data Inputs (DIs) of DSA 24052 to DSD 24058 are, in NC 10226 for example, connected from AON Bus 20230, OFFSET Bus 20228, LENGTH Bus 20226 and comprise inputs WA, WO, WL respectively of NC 10226. DSA 24052 to DSD 24058 DIs are, in NC 10226 as previously described, utilized in writing NC 10226 entries into DSA 24052 to DSD 24058. Address inputs of DSA 24052 to DSD 24058 are connected from address outputs of Address Pipeline Register (ADRPR) 24060. As will be described momentarily, except during cache flush operations, DSA 24052 to DSD 24058 address inputs are comprised of the same index fields of cache addresses as are provided as address inputs to TS 24010, but are delayed by one clock cycle and ADRPR 24060 for pipelining purposes. As described above, NC 10226 is not pipelined and does not have the one clock cycle delay. An address input to the cache will thereby result in corresponding entries, selected by index field of that address, being read from TSA 24012 to TSD 24018 and DSA 24052 to DSD 24058. The four outputs of DSA 24052 to DSD 24058 selected by a particular index field of a particular address are provided as inputs to DSSMUX 24048. DSSMUX 24048 is concurrently provided with selection control input from HE 24044. As previously described, this selection input to DSSMUX 24048 is derived from TS 24010 tag entries and indicates which of DSA 24052 to DSD 24058 entries corresponds to an address provided to the cache. In response to that selection control input, DSSMUX 24048 selects one of DS 24050's four logical descriptor outputs as the cache's output corresponding to that address. DSSMUX 24048's output is then provided, through Buffer Driver (BD) 24062 as the cache's output, for example in NC 10226 to AON Bus 20230, OFFSET Bus 20228, and LENGTH Bus 20226.

Referring to ADRMUX 24062, ADRMUX 24062 selects one of two sources to provide address inputs to DS 24050, that is to index to DS 24050. As described above, a first ADRMUX 24062 input is comprised of the cache's address index fields and, for example in NC 10226, is connected from the four least significant bits of NAME Bus 20224. During cache flush operations, DS 24050 address inputs are provided from Flush Counter (FLUSHCTR) 24066, which in the example is a four bit counter. During cache flush operations, FLUSHCTR 24066 generates sequential bit addresses which are used to sequentially address DSA 24052 to DSD 24058. Selection between ADRMUX 24062 first and second inputs, respectively the address index fields and from FLUSHCTR 24066, is controlled by Address Multiplexer Select (ADRMUXS) from FUCTL 20214.

Validity Store (VALS) 24068 and Dirty Store (DIRTYS) 24070 are memories operating in parallel with, and addressed in parallel wih TS 24010. VALS 24068 contains entries indicating validity of corresponding TS 24010 and DS 24050 entries. That is, VALS 24068 entries indicate whether corresponding entries have been written into corresponding locations in TS 24010 and DS 24050. In the example, VALS 24068 may thereby be a 16 word by 4 bit wide memory. Each bit of a VALS 24068 word indicates validity of a corresponding location in TSA 24012 and DSA 24052, TSB 24014 and DSB 24054, TSC 24016 and DSC 24056, and TSD 24018 and DSD 24058. DIRTYS 24070 similarly indicates whether corresponding entries in corresponding locations of TS 24010 and DS 24050 have been written over, or modified. Again, DIRTYS 24070 will be a sixteen word by four bit wide memory.

Address inputs of VALS 24068 and DIRTYS 24070 are, for example in NC 10226, connected from least significant bits of NAME Bus 20224 and are thus addressed by index fields of NC 10226 addresses in parallel with TS 24010. Outputs of VALS 24068 are provided to TSCA 24020 to TSEE 24026 to inhibit outputs of TSCA 24020 through TSCE 24026 upon occurrence of an invalid concurrence between a TS 24010 entry and a NC 10226 address input. Similar outputs of DIRTYS 24070 are provided to FUCTL 20214 for use in cache flush operations to indicate which NC 10226 entries are dirty and must be written back into an MT 10350 rather than disgarded.

Outputs of VALS 24068 and DIRTYS 24070 are also connected, respectively, to inputs of Validity Pipeline Register (VALPR) 24072 and Dirty Pipeline Register (DIRTYPR) 24074. VALPR 24072 and DIRTYPR 24074 are pipeline registers similar to TSPRA 24028 to TSPRD 24034 and are provided for timing purposes as will be described momentarily. Outputs of VALPR 24072 and DIRTYPR 24074 are connected to inputs of, respectively, Validity Write Logic (VWL) 24076 and Dirty Write Logic (DWL) 24078. As described above, NC 10226 is not a pipelined cache and does not include VALPR 24072 and DIRTYPR 24074; outputs of VALS 24068 and DIRTYS 24070 are connected directly to inputs of VWL 24076 and DWL 24078. Outputs of VWL 24076 and DWL 24078 are connected, respectively, to data inputs of VALS 24068 and DIRTYS 24070. Upon occurrence of a write operation to TS 24010 and DS 24050, that is writing in or modifying a cache entry, corresponding validity and dirty word entries are read from VALS 24068 and DIRTYS 24070 by index field of the caches input address. Outputs to VALS 24068 DIRTYS 24070 are received and stored in, respectively, VALPR 24070 and DIRTYPR 24074. At start of next clock cycle, validity and dirty words in VALPR 24072 and DIRTYPR 24074 are read into, respectively, VWL 24076 and DWL 24078. VWL 24076 and DWL 24078 respectively modify those validity or dirty word entries from VALS 24068 and DIRTYS 24070 in accordance to whether the corresponding entries in TS 24010 and DS 24050 are written into or modified. These modified validity and dirty words are then written, during second clock cycle, from VWL 24076 and DWL 24078 into, respectively, VALS 24068 and DIRTYS 24070. Control inputs of VWL 24076 and DWL 24078 are provided from FUCTL 20214.

Referring finally to Least Recent Used Logic (LRUL) 24080, as previously described with reference to MC 20116, LRUL 24080 tracks usage of cache entries. As previously described, the generalized cache of FIG. 240 is a four way, set associative cache with, for example, up to 16 entries in each of NC 10226's sets. Entries within a particular set are identified, as described above, by indexing the cache's TS 24010 and DS 24050 may contain, concurrently, up to four individual entries identified by the same index but distiguished by having different tags. In this case, one entry would reside in Set A, comprising TSA 24012 and DSA 24052, one in Set B, comprising TSB 24014 and DSB 24054, and so on. Since the possible number of individual entries having a common tag is greater than the number of cache sets, it may be necessary to delete a particular cache entry when another entry having the same tag is to be written into the cache. In general, the cache's least recently used entry would be deleted to provide a location in TS 24010 and DS 24050 for writing in the new entry. LRUL 24080 assists in determining which cache entries are to be deleted when necessary in writing in a new entry by tracking and indicating relative usage of the cache's entries. LRUL 24080 is primarily comprised of a memory, LRU Memory (MLRU) 24081, containing a word for each cache set. As described above, NC 10226, for example, includes 16 sets of 4 frames each, so that LRUL 24080's memory may correspondingly be, for example, 16 words long. Each word indicates relative usage of the 4 frames in a set and is a 6 bit word.

Words are generated and written into LRUL 24080's MLRU 24081, through Input Register A, B, C, D (RABCD) 24083, according to a write only algorithm executed by HE 24044, as described momentarily. Each bit of each six word pertains to a pair of frames within a particular cache set and indicates which of those two frames was more recently used than the other. For example, Bit 0 will contain logic 1 if Frame A was used more recently than Frame B and a logic zero if Frame B was used more recently than Frame A. Similarly, Bit 1 pertains to Frames A and C, Bit 2 to Frames A and D, Bit 3 to Frames B and C, Bit 4 to Frames B and D, and Bit 5 to Frames C and D. Initially, all bits of a particular LRUL 24080 word are set to zero Assuming, for example, that the frames of a particular set are used in the sequence Frame A, Frame D, Frame B; Bits 0 to 5 of that LRUL 24080 word will initially contain all zeros. Upon a reference to Frame A, Bits 0, 1, and 2, referring respectively to Frames A and B, Frames A and C, and Frames A and D, will be written as logic 1's. Bits 3, 4, and 5, referring respectively to Frames B and C, Frames B and D, and Frames C and D, will remain logic 0. Upon reference to Frame D, Bits 0 and 1, referring respectively to Frames A and B and Frames A and C, will remain logic 1's. Bit 2, referring to Frames A and D, will be changed from logic 1 to logic 0 to indicate that Frame D has been referred to more recently than Frame A. Bit 3, referring to Frames B and C, will remain logic 0. Bits 4 and 5, referring respectively to Frames B and D and Frames C and D, will be written as logic 0, although they are already logic zeros, to indicate respectively that Frame D has been used more recently than Frame B or Frame C. Upon reference to Frame B, Bit 0, referring to Frames A and B, will be written to logic 0 to indicate that Frame B has been used more recently than Frame A. Bits 1 and 2, referring resectively to Frames A and C and Frames A and D, will remain respectively as logic 1 and logic 0. Bits three and four, referring respectively to Frames B and C and Frames B and D, will be written as logics 1's to indicate respectively that Frame B has been used more recently than Frame C or Frame D. Bit five will remain logic 0.

When it is necessary to replace a cache entry in a particular frame, the LRUL 24080 word referring to the cache set containing that frame will be read from LRUL 24080's MLRL 24081 through LRU Register (RLRU) 24085 and decoded by LRU Decode Logic (LRUD) 24087 to indicate which is least recently used frame. This decoding is executed by means of a Read Only Memory operating as a set of decoding gating.

Having described the structure and operation of a generalized cache as shown in FIG. 240, with references to NC 10226 for illustration and to point out differences between the generalized cache and NC 10226, structure and operation of ATU 10228 and PC 10234 will be described next below. ATU 10228 and PC 10234 will be described by describing the differences between ATU 10228 and PC 10234 and the generalized cache and NC 10226. ATU 10228 will be described first, followed by PC 10234.

d.d. Address Translation Unit 10228 and Protection Cache 10234

ATU 10228 is a three-way, set associative cache of 16 sets, that is contains 3 frames for each set. Structure and operation of ATU 10228 is similar to the generalized cache described above. Having 3 rather than 4 frames per set, ATU 10228 does not include a STD 24018, ATSCE 24026, ATSPRD 24034, ATSHED 24042, or ADSD 24058. As previously described ATU 10228 address inputs comprise AON and O fields of logical descriptors. AON fields are each 28 bits and O fields comprise the 18 most significant bits of logical descriptor offset fields, so that ATU 10228 address inputs are 48 bits wide. Four least significant bits of O fields are used as index. AON fields and the 14 most significant bits of O field comprise ATU 10228's tags. ATU 10228 tags are thereby each 42 bits in width. Accordingly, TSA 24012, TSB 24014, and TSC 24016 of ATU 10228's TS 24010 are each 16 words long by 42 bits wide.

DSA 24052, DSB 24054, and DSC 24056 of ATU 10228 are each 16 bits long. ATU 10228 outputs are, as previously described, physical descriptor Frame Number (FN) fields of 13 bits each. ATU 10228's DSA 24052, DSB 24054, DSC 24056 are thereby each 13 bits wide.

ATU 10228's LRUL 24080 is similar in structure and operation to that of the generalized cache. ATU 12028's LRUL 24080 words, each corresponding to an ATU 10228 set, are each 3 bits in width as 3 bits are sufficient to indicate relative usage of frames within a 3 frame set. In ATU 10228, Bit 1 of an LRUL 24080 word indicates whether Frame A was used more recently than Frame B, Bit 2 whether Frame A was used more recently than Frame C, and Bit 3 whether Frame B was used more recently than Frame C. In all other respects, other than as stated above, ATU 10228 is similar in structure and operation to the generalized cache.

Referring to PC 10234, PC 10234 is a two-way, set associative cache of 8 sets, that is has two frames per set. Having 2 rather than 4 frames, PC 10234 will not include a TSL 24016, a TSD 24018, a TSCC 24024, a TSCD 24026, a TSPRC 24032, a TSPRD 24034, a TSHEC 24040, a TSHED 24042, a DSC 24056, or a DSD 24058.

Address inputs of PC 10234 are the 28 bit AON fields of logical descriptors. The 3 least significant bits of those AON fields are utilized as indexes for addressing PC 10234's TS 24010 and DS 24050. The 25 most significant bits of those AON field address inputs are utilized as PC 10234's tags, so that PC 10234's TSA 24012 and TSB 24014 are each 8 word by 25 bit memories.

Referring to PC 10234's LRUL 24080, a single bit is sufficient to indicate which of the two frames in each of PC 10234's sets was most recently accessed. PC 10234's LRUL 24080's memory is thereby 8 words, or sets long, one bit wide.

As previously described, PC 10234 entries comprise information regarding access rights of certain active subjects to certain active objects. Each PC 10234 entry contains 35 bits of information. Three bits of this information indicate whether a particular subject was read, write, or execute rights relative to a particular object. The remaining 32 bits effectively comprise a length field indicating the volume or portion, that is the number of data bits, of that object to which those access rights pertain.

Referring again to FIG. 240, PC 10234 differs from the generalized cache and from NC 10226 and ATU 10228 in further including Extent Check Logic (EXTCHK) 24082 and Operation Check Logic (OPRCHK) 24084. PC 10234 entries include, as described above, 3 bits identifying type of access rights a particular subject has to a particular object. These 3 bits, representing a Read (R), Write (W), or Execute (E) right, are provided to a first input of OPRCHK 24084. A second input of OPRCHK 24084 is provided from FUCTL 20214 and specifies whether JP 10114 intends to perform a Read (RI), a Write (WI), or Execute (EI), operation with respect to that object. OPRCHK 24084 compares OPRCHK 24084 access right inputs from DS 24050 to OPRCHK 24084's intended operation input from FUCTL 20214. If that subject does not possess the rights to that object which are required to perform the operation intended by JP 10114, OPRCHK 24084 generates an Operation Violation (OPRV) indicating that a protection violation has occurred.

Similarly, the 32 bits of a PC 10234 entry regarding extent rights is provided as an input (EXTENT) to EXTCHK 24082. As stated above. EXTENT field of PC 10234 entry indicates the length or number of data bits, within an obect, to which those access rights pertain. EXTENT field from PC 10234 entry is compared, by EXTCHK 24082, to offset field of the logical descriptor of the current JP 10114 request to MEM 10112 for which a current protection mechanism check is being made. If comparison of extent rights and offset field indicate that the current memory request goes beyond the object length to which the corresponding rights read from DS 24050 apply, EXTCHK 24082 generates an Extent Violation (EXTV) output. EXTV indicates that a current memory request by JP 10114 refers to a portion of an object to which the PC 10234 entry read from BS 24050 does not apply. As described previously, each read from or write to MEM 10112, even as part of a string transfer, is a 32 bit word. As such, EXTCHK 24082 will generate an EXTV output when OFFSET field of a current logical descriptor describes a segment of an object less than 32 bits from the limit defined by EXTENT field of the PC 10234 entry provided in response to that logical descriptor. EXTV and OPRV are gated together, by Protection Violation Gate (PVG) 24086 to generate Protection Violation (PROTV) output indicating that either an extent or an operation violation has occurred.

Having described the structure and operation of MEMINT 20212, and previously the structure and operation of DESP 20210, structure and operation of FUCTL 20214 will be described next below.

3. Fetch Unit Control Logic 20214 (FIG. 202)

The following descriptions will provide a detailed description of FU 10120's structure and operation. Overall operation of FU 10120 will be described first, followed by description of FU 10120's structure, and finally by a detailed description of FU 10120 operation.

As previously described, FUCTL 20214 directs operation of JP 10114 in executing procedures of user's processes. Among the functions performed by FUCTL 20214 are, first, maintenance and operation of CS 10110's Name Space, UID, and AON based addressing system, previously described; second, interpretation of SOPs of user's processes to provide corresponding sequences of microinstructions to FU 10120 and EU 10122 to control operation of JP 10114 in execution of user's processes, previously described; and, third, control of operation of CS 10110's internal mechanisms, for example CS 10110's stack mechanisms.

As will be described in further detail below, FUCTL 20214 includes Prefetcher (PREF) 20260 which generates a sequence of logical addresses, each logical address comprising an AON and an offset field, for reading S-Instructions (SINs) of a user's program from MEM 10112. As previously described, each SIN may be comprised of an S-Operation (SOP) and one or more operand Names and may occupy one or more 32 bit words. SINs are read from MEM 10112 as a sequence of single 32 bit words, so that PREF 20260 need not specify a length field in a MEM 10112 read request for an SIN. SINs are read from MEM 10112 through MOD Bus 10144 and are captured and stored in Instruction Buffer (INSTB) 20262. PARSER 20264 extracts, or parses, SOPs and operand Names from INSTB 20262. PARSER 20264 provides operand Names to NC 10226 and SOPs to FUS Intrepreter Dispatch Table (FUSDT) 11010 and to EU Dispatch Table (EUSDT) 20266 through Op-Code Register (OPCODEREG) 20268. Operation of INSTB 20262 and PARSER 20264 is controlled by Current Program Counter (CPC) 20270, Initial Program Counter (IPC) 20272, and Executed Program Counter (EPC) 20274.

As previously described, FUSDT 11010 provides, for each SOP received from OPCODEREG 20268, a corresponding S-Interpreter Dispatch (SD) Pointer, or address, to FUSITT 11012 to select a corresponding sequence of microinstructions to direct operation of JP 10114, in particular FU 10120. As previously described, FUSITT 11012 also contains sequences of microinstructions for controlling and directing operation of CS 10110's internal mechanisms, for example those mechanisms such as RCWS 10358 which are involved in swapping of processes. EUSDT 20266 performs an analogous function with respect to EU 10122 and provides SD Pointers to EU S-Interpreter Tables (EUSITTs) residing in EU 10122.

Micro-Program Counter (mPC) 20276 provides sequential addresses to FUSITT 11012 to select individual microinstructions of sequences of microinstructions. Branch and Case Logic (BRCASE) 20278 provides addresses to FUSITT 11012 to select microinstructions sequences for microinstructions branches and cases. Repeat Counter (REPCTR) 20280 and Page Number Register (PNREG) 20282 provide addresses to FUSITT 11012 during FUSITT 11012 load operations.

As previously described, FUSITT 11012 is a writable microinstruction control store which is loaded with selected S-Interpreters (SINTs) from MEM 10112.

FUSITT 11012 addresses are also provided by Event Logic (EVENT) 20284 and by JAM input from NC 10226. As will be described further below, EVENT 20284 is part of FUCTL 20214's circuitry primarily concerned with operation of CS 10110's internal mechanisms. Input JAM from NC 10226 initiates certain FUCTL 20214 control functions for CS 10110's Name Space addressing mechanisms, and in particular NC 10226. Selection between the above discussed address inputs to FUSITT 11012 is controlled by S-Interpreter Table Next Address Generator Logic (SITTNAG) 20286.

Other portions of FUCTL 20214's circuitry are concerned with operation of CS 10110's internal mechanisms. For example, FUCTL 20214 includes Return Control Word Stack (RCWS) 10358, previously described with reference to CS 10110's Stack Mechanisms. Register Address Generator (RAG) 20288 provides pointers for addressing of GRF 10354 and RCWS 10358 and includes Micro-Stack Pointer Registers (MISPR) 10356.

As previously described, MISPR 10356 mechanism provides pointers for addressing Micro-Stack (MIS) 10368. As will be described further below, actual MIS 10368 Pointers pointing to current, previous, and bottom frames of MIS 10368 reside in Micro-Control Word Register 1 (MCW1) 20290. MCW1 20290 and Micro-Control Word Zero Register (MCWO) 20292 together contain certain information indicating the current execution environment of a microinstruction sequence currently being executed by FU 10120. This execution information is used in aide of execution of these microinstruction sequences. State Registers (STATE) 20294 capture and store certain information regarding state of operation of FU 10120. As described further below, this information, referred to as state vectors, is used to enable and direct operation of FU 10120.

Timers (TIMERS) 20296 monitor elapsed time since occurrence of the events requiring servicing by FU 10120. If waiting time for these events exceeds certain limits, TIMERS 20296 indicate that these limits have been exceeded so that service of those events may be initiated.

Finally, Fetch Unit to E Unit Interface Logic (FUEUINT) 20298 comprises the FU 10120 portion of the interface between FU 10120 an EU 10122. FUEUINT 20298 is primary path through which operation of FU 10120 and EU 10122 is coordinated.

Having described overall operation of FU 10120, structure of FU 10120 will be described next below with aide of FIG. 202, description of FU 10120's structure will be followed by a detailed description of FU 10120 wherein further, more detailed, diagrams of certain portions of FU 10120 will be introduced as required to enhance clarity of presentation.

a.a. Fetch Unit Control Logic 20214 Overall Structure

Referring again to FIG. 202, as previously described FIG. 202 includes a partial block diagram of FUCTL 20214. Following the same sequence of description as above, PREF 20260 has a 28 bit bi-directional port connected to AON Bus 20230 and 32 bit bi-directional port directed from OFFSET Bus 20228. A control input of PREF 20260 is connected from control output of INSTB 20262.

INSTB 20262 32 bit data input (DI) is connected from MOD Bus 10144. INSTB 20262's 16 bit output (DO) is connected to 16 bit bi-directional input of OPCODEREG 20268 and to 16 bit NAME Bus 20224. OPCODEREG 20268's input comprises 8 bits of SINT and 3 bits of dialect selection. As previously described, NAME Bus 20224 is connected to 16 bit bi-directional port of Name Trap (NT) 20254, to address input ADR of NC 10226, and to inputs and outputs of OFFP 20228. Control inputs of INST 20262 and PARSER 20264 are connected from a control output of CPC 20270.

Thirty-two bit input of CPC 20270 is connected from JPD Bus 10142 and CPC 20270's 32 bit output is connected to 32 bit input of IPC 20272. Thirty-two bit output of IPC 20272 is connected to 32 bit input of EPC 20274 and to JPD Bus 10142. EPC 20274's 32 bit output is similarly connected to JPD Bus 10142.

Eleven bit outputs of OPCODEREG 20268 are connected to 11 bit address inputs of FUSDT 11010 and EUSDT 20266. These 11 bit address inputs to FUSDT 11010 and EUSDT 20266 each comprise 3 bits of dialect selection code and 8 bits of SINT code. Twelve bit SDT outputs of EUSDT 20266 is connected to inputs of Microinstruction Control Store in EU 10122, as will be described in a following description of EU 10122. FUSDT 11010 has, as described further below, two outputs connected to address (ADR) Bus 20298. First output of FUSDT 11010 are six bit SDT pointers, or addresses, corresponding to generic SINTs as will be described further below. Second output of FUSDT 11010 are 15 bit SDT pointers, or addresses, for algorithm microinstruction sequences, again as will be described further below.

Referring to RCWS 10358, RCWS 10358 has a first bi-directional port connected from JPD Bus 10142. Second, third, and fourth bi-directional ports of RCWS 10358 are connected from, respectively, a bi-directional port of MCW1 20290, a first bi-directional port EVENT 20284, and a bi-directional port of mPC 20276. An output of RCWS 10358 is connected to ADR Bus 20298.

An input of mPC 20276 is connected from ADR Bus 20298 and first and second outputs of mPC 20276 are connected to, respectively, an input of BRCASE 20278 and to ADR Bus 20298. An output of BRCASE 20278 is connected to ADR Bus 20298.

As described above, a first bi-directional port of EVENT 20284 is connected to RCWS 10358. A second bi-directional port of EVENT 20284 is connected from MCWO 20292. An output of EVENT 20284 is connected to ADR Bus 20298.

Inputs of RPCTR 20280 and PNREG 20282 are connected from JPD Bus 10142. Outputs of RPCTR 20280 and PNREG 20282 are connected to ADR Bus 20298.

ADR Bus 20298, and an input from a first output of FUSITT 11012, are connected to inputs of SITTNAG 20286. Output of SITTNAG 20286 is connected, through Control Store Address (CSADR) Bus 20299, to address input of FUSITT 11012. Data input of FUSITT 11012 is connected from JPD Bus 10142. Control outputs of FUSITT 11012 are connected to almost all elements of JP 10114 and thus, for clarity of presentation, are not shown in detail by drawn physical connections but are described in following descriptions.

As described above, MCWO 20292 and MCW1 20290 have bi-directional ports connected to, respectively, bi-directional ports of EVENT 20284 and to a second bi-directional port of RCWS 10358. Outputs of MCWO 20292 and MCW1 20290 are connected to JPD Bus 10142. Other inputs of MCWO 20292 and MCW1 20290, as will be described further below, are connected from several other elements of JP 10114 and, for clarity of presentation, are not shown herein in detail but are described in the following text. STATE 20294 similarly has a large number of inputs and outputs connected from and to other elements of JP 10114, and in particular FU 10120. Inputs and outputs of STATE 20294 are not indicated here for clarity of presentation and will be described in detail below.

RAG 20288 has an input connected from JPD Bus 10142 and other inputs connected, for example, from MCW1 20290. RAG 20288, including MISPR 10356, provides outputs, for example, as address inputs to RCWS 10358 and GRF 10354. Again, for clarity of presentation, inputs and outputs of RAG 20288 are not shown in detail in FIG. 202 but will be described in detail further below.

TIMERS 20296 receive inputs from EVENT 20284 and FUSITT 11012 and provide outputs to EVENT 20284. For clarity of presentation, these indications are not shown in detail in FIG. 202 but will be described further below.

FUINT 20298 receives control inputs from FUSITT 11012 and EU 10122. FUINT 20298 provides outputs to EU 10122 and to other elements of FUCTL 20214. For clarity of presentation, connections to and from FUINT 20298 are not shown in detail in FIG. 202 but will be described in further detail below.

Having described the overall operation, and structure, of FUCTL 20214, operation of FUCTL 20214 will be described next below. During the following descriptions further diagrams of certain portions of FUCTL 20214 will be introduced as required to disclose structure and operation of FUCTL 20214 to one of ordinary skill in the art. FUCTL 20214's operation with regard to fetching and interpretation of SINs, that is SOPs and operand Names, will be described first, followed by description of FUCTL 20214's operation with regard to CS 10110's internal mechanisms.

b.b. Fetch Unit Control Logic 20214 Operation

Figure 241:
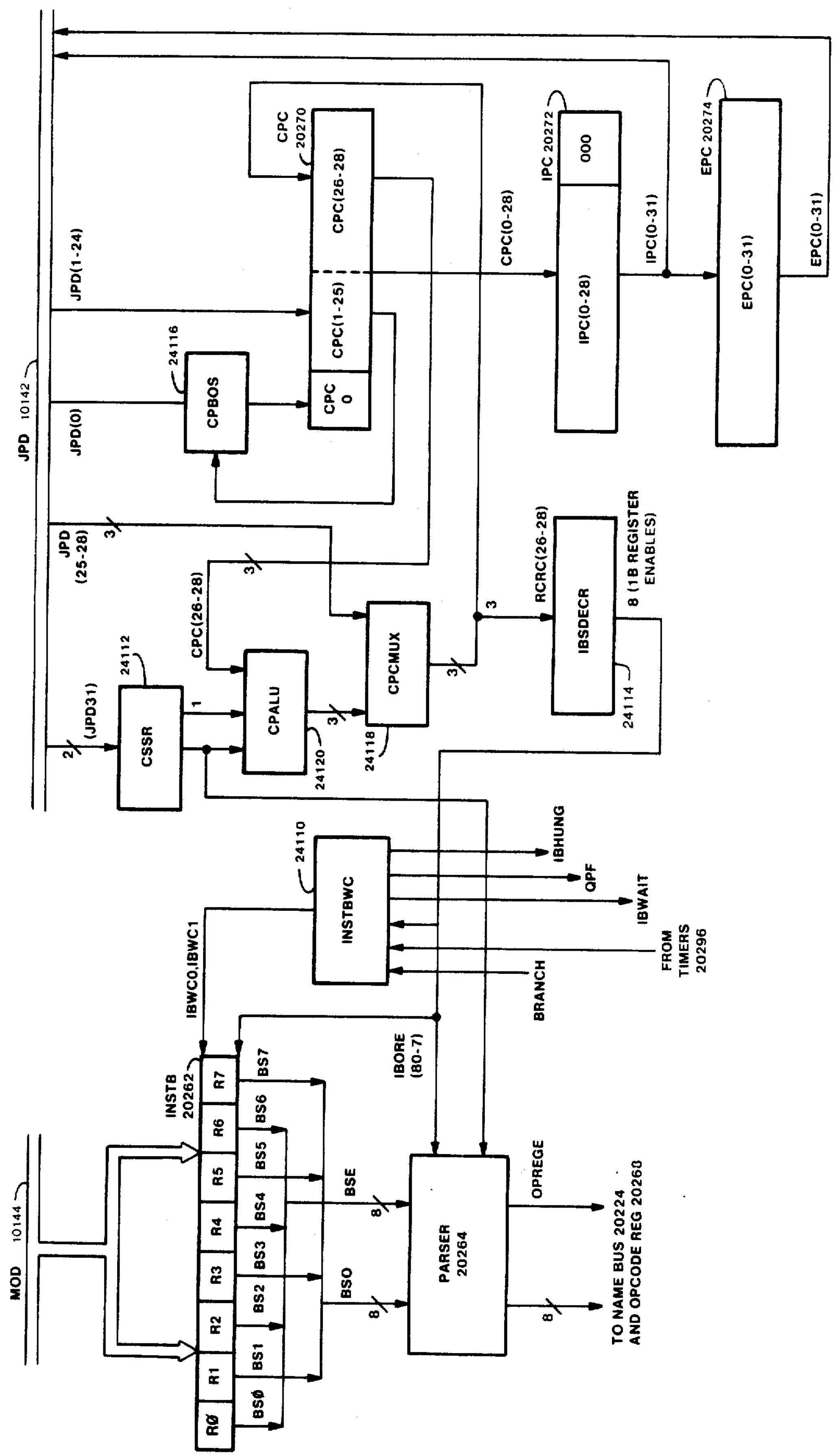
FIG. 241 is a detailed block diagram of portions of computer system instruction and microinstruction control logic.

Referring first to those elements of FUCTL 20214 directly concerned with control of JP 10114 in response to SOPs and Name syllables, those elements include: (1) PREF 20260; (2) INSTB 20262; (3) PARSER 20264; (4) CPC 20270, IPC 20272, and EPC 20274; (5) OPCODEREG 20268; (6) FUSDT 11010 and EUSDT 20266; (7) mPC 20276; (8) BRCASE 20278; (9) REPCTR 20280 and PNREG 20282; (10) a part of RCWS 10358; (11) SITTNAG 20286; (12) FUSITT 11012; and, (13) NT 20254. These FUCTL 20214 elements will be described below in the order named.

a.a.a. Prefetcher 20260, Instruction Buffer 20262, Parser 20264, Operation Code Register 20268, CPC 20270, IPC 20272, and EPC 20274 (FIG. 241)

As described above, PREF 20260 generates a series of addresses to MEM 10112 to read SINs of user's programs from MEM 10112 to FUCTL 20214, and in particular to INSTB 20262. Each PREF 20260 read request transfers one 32 bit word from MEM 10112. Each SIN may be comprised of an SOP and one or more Name syllables Each SOP may comprise, for example, 8 bits of information while each Name syllable may comprise, for example, 8, 12, or 16 bits of data. In general, and as will be described in further detail in a following description of STATE 20294, PREF 20260 obtains access to MEM 10112 on alternate 110 nano-second system clock cycles. PREF 20260's access to MEM 10112 is conditional upon INSTB 20262 indicating that INSTB 20262 is ready to receive an SIN read from MEM 10112. In particular, INSTB 20262 generates control output Quiry Prefetch (QPF) to PREF 20260 to enable PREF 20260 to submit a request to MEM 10112 when, as described further below, INSTB 20262 is ready to receive an SIN read from MEM 10112.

PREF 20260 is a counter register comprised, for example of SN74S163s.

Bi-directional inputs and outputs of PREF 20260 are connected to AON Bus 20230 and OFFSET Bus 20228. As PREF 20260 reads only single 32 bit words, PREF 20260 is not required to specify a LENGTH field as part of an SIN read request, that is an AON and an OFFSET field are sufficient to define a single 32 bit word. At start of read of a sequence of SINs from MEM 10112, address (AON and OFFSET fields) of first 32 bit word of that SIN sequence are provided to MEM 10112 by DESP 20210 and concurrently loaded, from AON Bus 20230 and OFFSET Bus 20228, into PREF 20260. Thereafter, as each successive thirty-two bit word of the SIN's sequence is read from MEM 10112, the address residing in PREF 20260 is incremented to specify successive 32 bit words of that SIN's sequence. The successive single word addresses are, for all words after first word of a sequence, provided to MEM 10112 from PREF 20260.

As described above, INSTB 20262 receives SINs from MEM 10112 through MOD Bus 10144 and, with PARSER 20264 and operating under control of CPC 20270, provides Name syllables to NAME Bus 20224 and SINs to OPCODEREG 20268. INSTB 20262 is provided, together with PREF 20260 to increase execution speed of SINS.

Referring to FIG. 241, a more detailed block diagram of INSTB 20262, PARSER 20264, CPC 20270, IPC 20272, EPC 20274 as shown INSTB 20262 is shown as comprising two 32 bit registers having parallel 32 bit inputs from MOD Bus 10144. INSTB 20262 also receives two Write Clock (WC) inputs, one for each 32 bit register of INSTB 20262, from Instruction Buffer Write Control (INSTBWC) 24110. INSTB 20262's outputs are structured as eight, eight bit Basic Syllables (BSs), indicated as BS0 to BS7. BS0, BS2, BS4, and BS6 are 0Red to comprise eight bit Basic Syllable, Even (BSE) of INSTB 20262 while BS0, BS3, BS5, and BS7 are similarly 0Red to comprise Basic Syllable, Odd (BSO) of INSTB 20262. BSO and BSE are provided as inputs of PARSER 20264.

PARSER 20264 receives a first control input from Current Syllable Size Register (CSSR) 24112, associated with CPC 20270. A second control input of PARSER 20264 is provided from Instruction Buffer Syllable Decode Register (IBSDECR) 24114, also associated with CPC 20270. PARSER 20264 provides an eight bit output to NAME Bus 20224 and to input of OPCODEREG 20268.

Referring to INSTBWC 24110, INSTBWC 24110 provides, as described further below, control signals pertaining to writing of SINs into INSTB 20262 from MOD Bus 10144. INSTBWC 24110 also provides control signals pertaining to operation of PREF 20260. In addition to WC outputs to INSTB 20262, INSTBWC 24110 provides control output QPF to PREF 20260, control output Instruction Buffer Hung (IBHUNG) to EVENT 20284, and control signal Instruction Buffer Wait (IBWAIT) to STATE 20294. INSTBWC 24110 also receives a control input BRANCH from BRCASE 20278 and an error input from TIMERS 20296.

Referring to CPC 20270, IPC 20272, and EPC 20274, IPC 20272 and EPC 20274 are represented in FIG. 241 as in FIG. 202. Further FUCTL 20214 circuitry is shown as associated with CPC 20270. CPC 20270 is a twenty-nine bit register receiving bits one to twety-five (CPC(1-25)) from bits one to twenty-five of JPD Bus 10142. CPC 20270 Bit 0 (CPC0) is provided from CPC0 CPCO Select (CPCOS) 24116. Inputs of CPCOS 24116 are Bit 1 output from CPC 20270 (CPC1) and Bit 0 from JPD Bus 10142. Bits twenty-six, twenty-seven, and twenty-eight of CPC 20270 (CPC(26-28)) are provided from CPC Multiplexer (CPCMUX) 24118. CPCMUX 24118 also provides an input to IBSDECR 24114. Inputs of CPCMUX 24118 are bits twenty-five, twenty-six, and twenty-eight from JPD Bus 10142 and a three bit output of CPC Arithmetic and Logic Unit (CPCALU) 24120. A first input of CPCALU 24120 is connected from output bits 26, 27, and 28 of CPC 20270. Second input of CPCALU 24120 is connected from CSSR 24112. CSSR 24112's input is connected from JPD Bus 10142.

As described above, INSTB 20262 is implemented as a sixty-four bit wide register INSTB 20262 is organized as two thirty-two bit words, referred to as Instruction Buffer Word 0 (IB0) and Instruction Buffer Word 1 (IB1), and operates as a two word, first-in-first-out buffer memory. PREF 20260 loads one of IB0 or IB1 on each memory reference by PREF 20260. Only PREF 20260 may load INSTB 20262, and INSTB 20262 may be loaded only from MOD Bus 10144. Separate clocks, respectively Instruction Buffer Write Clock 0 (IBWC0) and Instruction Buffer Write Clock 1 (IBWC1), are provided from INSTBWC 24110 to load, respectively, IBW0 and IBW1 into INSTB 20262. IBWC0 and IBWC1 are each a gated 110 nano-second clock. An IBW0 or an IBW1 is written into INSTB 20262 when, respectively, IBWC0 or IBWC1 is enabled by INSTBWC 24110. IBWC0 and IBWCI will be enabled only when MEM 10112 indicates that data for INSTB 20262 is availabe by asserting interface control signal DAVI as previously discussed INSTBWC 24110 is primarily concerned with control of FU 10120 with respect to writing of SINs into INSTB 20262. As described above, INSTBWC 24110 provides IBWC0 and IBWC1 to INSTB 20262. IBWC0 and IBWC1 are enabled by INSTBWC 24110's input DAVI from MEM 10112. Selection between IBWC0 and IBWC1 is controlled by INSTBWC 24110's input from CPC 20270. In particular, and as will be described further below, Bit 26 (CPC 26) of CPC 20270's twenty-nine bit word indicates whether IBW0 or IBW1 is written into INSTB 20262.

In addition to controlling writing of IBW0 and IBW1 into INSTB 20262, INSTBWC 24110 provides control signals to elements of FU 10120 to control reading of SINs from MEM 10112 to INSTB 20262. In this regard, INSTBWC 24110 detects certain conditions regarding status of SIN words in INSTB 20262 and provides corresponding control signals, described momentarily, to other elements of FU 10120 so that INSTB 20262 would generally always contain at least one valid SOP or Name syllable. First, if INSTB 20262 is not full, that is either IBW0 or IBW1 or both is invalid, for example because IBW0 has been read from INSTB 20262 and executed, INSTBWC 24110 detects this condition and provides control signal QPF to PREF 20262 to initiate a read from MEM 10112. INSTBWC 24110 currently enables either IBW0 or IBW1 portion of INSTB 20262 to receive the word read from MEM 10112 in response to PREF 20260's request. As stated above, this operation will be initiated when INSTBWC 24110 detects and indicates, by generating a validity flag, that either IBW0 or IBW1 is invalid. In this case, IBW0 or IBW1 will be indicated as invalid when read from INSTB 20262 by PARSER 20264. As will be described further below, INSTBWC 24110 validity flags for IBW0 and IBWI are generated by INSTBWC 24110 control inputs comprising Bits 26 to 28 (CPC 26-28) from CPC 20270 and by current syllable size or value, flag (K) input from CSSR 24112. Secondly, INSTBWC 24110 will detect when INSTB 20262 is empty, that is when both IBW0 and IBWI are invalid, as just described, or when only a half of a sixteen bit Name syllable is present in INSTB 20262. In response to either condition, INSTBWC 24110 will generate control signal IBWAIT to STATE 20294. As will be described further below, IBWAIT will result in suspension of execution of microinstructions referencing INSTB 20262. PREF 20260 requests to MEM 10112 will already have been initiated, as described above unless certain other conditions, described momentarily, occur. Thirdly, INSTBWC 24110 will detect when INSTB 20262 is empty and PREF 20262 is hung, that is unable to submit requests to MEM 10112, and a current microinstruction is attempting to parse a syllable from INSTB 20262. In this case, INSTBWC 24110 will generate control signal Instruction Buffer Hung (IBHUNG) to EVENT 20284. As will be described further below, IBHUNG will result in initiation of a microinstruction sequence to restore flow of words to INSTB 20262. Fourthly, INSTBWC 24110 will detect, through microinstruction control signals provided from FUSITT 11012, when a branch in a microinstruction sequence provided by FUSITT 11012 in response to an SOP occurs. In this case, both IBW0 and IBW1 will be flaged as invalid. INSTBWC 24110 will then ignore SIN words being read from MEM 10112 in response to a previously submitted PREF 20260 request, but not yet received at the time the branch occurs. This prevents INSTB 20260 from receiving invalid SIN words; PREF 20260 and INSTB 20262 will then proceed to request and receive valid SIN words of the branch.

As described above, PARSER 20264, operating under control of CPC 20270 and CPC 20270 associated circuitry, reads Name syllables and SOPs from INSTB 20262 to, respectively, NAME Bus 20224 and OPCODEREG 20268. PARSER 20264 operates as a multiplexer with associated control logic.

As previously described, INSTB 20262 is internally structured as eight, eight bit words, BS0 to BS7. IBW0 comprises BS0 to B3 while IBW1 comprises BS4 to BS7. Each SOP is comprised of eight bits of data and thus comprises one Basic Syllable while each Name syllable comprises 8, 12, or 16 bits of data and thus comprises either one or two Basic Syllables. Name syllable size, as previously stated, is indicated by Current Syllable Size Value K stored in CSSR 24112.

BS0 and BS4 are loaded into INSTB 20262 from MOD Bus 10144 bits zero to seven while BS2 and BS6 are loaded from MOD Bus 10144 bits sixteen to twenty-three. BS1 and BS5 are loaded from MOD Bus 10144 bits eight to fifteen while BS3 and BS7 are loaded from MOD Bus 10144 bits twenty-four to thirty-one. Odd numbered Basic Syllable outputs BS1, BS3, BS5, and BS7 are ORed to comprise eight bit Basic Syllable, Odd output BS0 of INSTB 20262. Even numbered Basic Syllable outputs BSo, BS2, BS4 and BS6 of INSTB 20262 are similarly ORed to comprise eight bit Basic Syllable, Even output BSE. At any time, one odd numbered Basic Syllable output and one even numbered Basic Syllable output of INSTB 20262 are selected as inputs to PARSER 20264 by Instruction Buffer Read Enable (IBORE) enable and selection signals provided to INSTB 20262 by IBSDECR 24114. IBSDECR 24114 includes decoding circuitry. Input to IBSDECR 24114's decoding logic is comprised of three bits (RCPC(26-28)) provided from CPCMUX 24118. As indicated in FIG. 241, CPC (26-28) may be provided from JPD Bus 10142 bits 25 to 28 or from output of CPCALU 24120. One input CPCALU 24120 is CPC (26-28) from CPC 20270. Operation of CPC 20270 and CPC 20270's associated circuitry will be described further below. RCPC (26-28) is decoded by IBSDECR 24114 to generate IBORE (0-7) to INSTB 20262. RCPC 26 and RCPC 27 are decoded to select one of the four odd numbered Basic Syllable outputs (that is BS1, BS3, BS5 or BS7) of INSTB 20262 as the odd numbered basic syllable input to PARSER 20264. RCPC 28 selects either the preceding or the following even numbered Basic Syllable output of INSTB 20262 as the even numbered Basic Syllable input to PARSER 20264. The eight decoded bits of IBORE (0-7) generated by IBDECR 24114 decoding logic are loaded into IBSDECR 24114 eight bit register and subsequently provided to INSTB 20262 as IBORE (0-7).

PARSER 20264 selects BS0, or BSE, or both BSO and BSE, as PARSER 20264s output to NAME Bus 20224 or to OPCODEREG 20268. In the case of an SOP or an eight bit Name syllable, either BSO or BSE will be selected as PARSER 20264's output. In the case of a twelve or sixteen bit Name syllable, both BS0 and BSE may be selected as PARSER 20264's output. PARSER 20264 operation is controlled by microinstruction control outputs from FUSITT 11012.

Program counters IPC 20272, EPC 20274, and CPC 20270 are associated with control of fetching and parsing of SINs. In general, IPC 20272, EPC 20274, and CPC 20270 operate under microinstruction control from FUSITT 11012.

CPC 20270 is Current Program Counter and contains 28 bits pointing to the current syllable in INSTB 20272. Bits 29 to 31 of CPC 20270 are not provided, so the bits 29 to 31 of CPC 20270's output are zero, which guarantees byte boundaries for SOPs. Contents of CPC 20270 are thereby also a pointer which is a byte align offset into a current procedure object. Initial Program Counter (IPC) 20272 is a buffer register connected from output of CPC 20270 and provided for timing overlap. IPC 20272 may be loaded only from CPC 20270 which, as previously described, is 29 bits wide, that does not contain bits 29, 30, and 31 which are forced to zero in IPC 20272. IPC 20272 may be read onto JPD Bus 10142 as a start value in an unconditional branch.

EPC 20274 is a thirty-two bit register usually containing a pointer to the current SOP being executed. Upon occurrence of an SOP branch, the pointer in EPC 20274 will point to the SOP from which the branch was executed. The pointer residing in EPC 20274 is an offset into a current procedure object. EPC 20274 may be loaded only from IPC 20272, and may be read onto JPD Bus 10142.

Referring again to CPC 20270, as described above CPC 20270 is a current syllable counter. CPC 20270 contains a pointer to the next SOP syllable, or Base Syllable, to be parsed by PARSER 20264. As SOPs are always on byte boundaries, CPC 20270 pointer is 29 bits wide, CPC (0-28). The three low order bits of CPC 20270's pointer, that is CPC (29-31), do not physically exist and are assumed to be always zero. CPC 20270's pointer to next instruction syllable to be parsed thereby always points to byte boundaries CPC 20270 bits 26 to 28, CPC (26-28), indicate, as described above, a particular Base Syllable in INSTB 20262. Bits 0-25 (CPC(0-25)) of CPC 20270 indicate 32 bit words, read into INSTB 20262 as IBW0 and IBW1, of a sequence of SINs. CPC 20270 pointer is updated each time a parse operation reading a Base Syllable from INSTB 20262 is executed. As previously described, these parsing operations are performed under microinstruction control from FUSITT 11012.

Conceptually, CPC 20270 is organized as a twenty-six bit counter, containing CPC (0-25), with a three bit register appended on the low order side, as CPC (26-28). This organization is used because CPC (26-28) counts INSTB 20262 Base Syllables parsed and must be incremented dependant upon current Name Syllable Size K stored CSSR 24112. CPC (0-25), however, counts successive thirty-two bit words of a sequence of SINs and may thereby be implemented as a binary counter. As shown in FIG. 241, CPC (26-28) is loaded from output of CPCMUX 24118. A first input of CPCMUX 24118 is connected from bits 29 to 31 of JPD Bus 10142. This input to CPC (26-28) from JPD Bus 10142 is provided to allow CPC 20270 to be loaded from JPD Bus 10142, for example when loading CPC 20270 with an initial ponter value. Second input of CPCMUX 24118 is from output of CPCALU 24120 and is the path by which CPC (26-28) is incremented as successive Base Syllables are parsed from INSTB 20262. A first input of CPCALU 24120 is CPC (26-28)

from CPC 20270. Second input of CPALU 24120 is a dual input from CSSR 24112. First input from CSSR 24112 is logic 1 in the least significant bit position, that is in position corresponding to CPC (28). This input is used when single Base Syllables are parsed from INSTB 20262, for example in an eight bit SOP or an eight bit Name syllable CSSR 24112's first input to CPCALU 24120 increments CPC (0-32) by eight, that is one to CPC (26-28), each time a single Base Syllable is parsed from INSTB 20262. Second input to CPCALU 24120 from CSSR 24112 is K, that is current Name Syllable size. As previously described, K may be eight, twelve, or sixteen. CPC (26-28) is thereby incremented by one when K equals eight and is incremented by two when K equals twelve or sixteen. As shown in FIG. 241, K is loaded into CSSR 24112 from JPD Bus 10142.

CPC (0-25), as described above, operates as a twenty-six bit counter which is incremented each time CPC (26-28) overflows. CPC (0-25) is incremented by carry output of CPCALU 24120. In actual implementation, CPC 20270 is organized to reduce the number of integrated circuits required. CPC (1-25) is constructed as a counter and inputs of CPC (1-25) counter are connected from bits 1 to 24 of JPD Bus 10142 to allow loading of an initial value of CPC 20270 pointer. CPC (0) and CPC (26-28) are implemented as a four bit register. Operation of CPC (26-28) portions of this register have been described above. Input of CPC (0) portion of this register is connected from output of CPCOS 24116. CPCOS 24116 is a multiplexer having a first input connected from bit 0 of JPD Bus 10142. This input from JPD Bus 10142 is used, for example, when loading CPC 20272 with an initial pointer value. Second input of CPCOS 24116 is overflow output of CPC (1-25) counter and allows CPC (0) portion of the four bit register and CPC (1-25) counter to operate as a twenty-six bit counter.

Finally, as shown in FIG. 241, output of CPC 20270 may be loaded into IPC 20272. An initial CPC 20270 pointer value may therefore be written into CPC 20270 from JPD Bus 10142 and subsequently copied into IPC 20272.

Referring again to PARSER 20264, as described above PARSER 20264 reads, or parses, basic syllables from INSTB 20262 to NAME Bus 20224. Input of PARSER 20264 is a sixteen bit word comprised of an eight bit odd numbered Base Syllable, BS0, and an eight bit even numbered Base Syllable, BSE. Depending upon whether PARSER 20264 is parsing an eight bit SOP, an eight bit Name syllable, a twelve bit Name syllable, or sixteen bit Name syllable, PARSER 20264 may select BSO, BSE, or both BSO and BSE, as output onto NAME Bus 20224.

If PARSER 20264 is parsing Name syllables and K is not equal to eight, that is equal to twelve or sixteen, PARSER 20264 transfers both BSO and BSE onto NAME Bus 20224 and determines which of BSO or BSE is most significant. The decision as to whether BSO or BSE is most significant is determined by CPC (28). If CPC (28) indicates BS0 is most significant, BSO is transferred onto NAME Bus 20224 bits 0 to 7 (NAME(0-7)) and BSE onto NAME Bus 20224 bits eight to fifteen (NAME(8-15)). If CPC (28) indicates BSE is most significant, BSE is transferred onto NAME (0-7) and BSO onto NAME (8-15). This operation insures that Name syllables are parsed onto NAME Bus 20224 in the order in which occur in the SIN stream.

If PARSER 20264 is parsing Name syllables of Syllable Size K=8, PARSER 20264 will select either BSO or BSE, as indicated by CPC (28), as output to NAME (0-7). PARSER 20264 will place 0's on NAME (8-15).

If PARSER 20264 is parsing SOPs of eight bits, PARSER 20264 will select BSO or BSE as output to NAME (0-7) as selected by CPC (28). PARSER 20264 will place 0's onto NAME (8-15). Concurrently, PARSER 20264 will generate OPREGE to OPCODEREG 20268 to enable transfer of NAME (0-7) into OPCODEREG 20268. OPCODEREG 20268 is not loaded when PARSER 20264 is parsing Name syllables. The microinstruction input from FUSITT 11012 which controls PARSER 20264 operation also determines whether PARSER 20264 is parsing an SOP or a Name syllable and controls generation of OPREGE.

Operation of NC 10226, which receives Name syllables as address inputs from NAME Bus 20224, has been discussed previously with reference to MEMINT 20212. Name Trap (NT) 20254 is connected from NAME Bus 20224 to receive and capture Name syllables parsed onto NAME Bus 20224 by PARSER 20264. Operation of NT 20254 has been also previously discussed with reference to MEMINT.

b.b.b. Fetch Unit Dispatch Table 11010, Execute Unit Dispatch Table 20266 and Operation Code Register 20268 (FIG. 242)

As previously described, CS 10110 is a multiple language machine. Each program written in a high level user language is compiled into a corresponding S-Language program containing S-Language Instructions referred to as SOPs. CS 10110 provides a set or dialect, of microcode instructions, referred to as S-Interpreters (SINTs) for each S-Language. SINTs interpret SOPs to provide corresponding sequences of microinstructions for detailed control of CS 10110 operations. CS 10110's SINTs for FU 10120 and EU 10122 operations are stored, respectively, in FUSITT 11012 and in a corresponding control store memory in EU 10122, described in a following description of EU 10122. Each SINT comprises one or more sequences of microinstructions, each sequence of microinstructions corresponding to a particular SOP in a particular S-Language dialect. Fetch Unit S-Interpreter Dispatch Table (FUSDT) 11010 and Execute Unit S-Interpreter Dispatch Table (EUSDT) 20266 contain an S-Interpreter Dispatcher (SD) for each S-Language dialect. Each SD is comprised of a set of SD Pointers (SDPs) wherein each SDP in a particular SD corresponds to a particular SOP of that SD dialect. Each SDP is an address pointing to a location, in FUSITT 11012 or EUSITT, of the start of the corresponding sequence of microinstructions for interpreting the SOP corresponding to that SDP. As will be described further below, SOPs received and stored in OPCODEREG 20268 are used to generate addresses into FUSDT 11010 and EUSDT 20266 to select corresponding SDPs. Those SDPs are then provided to FUSITT 11012 through ADR 20202, or to EUSITT through EUDIS Bus 20206, to select corresponding sequences of microinstructions from FUSITT 11012 and EUSITT.

Figure 242:
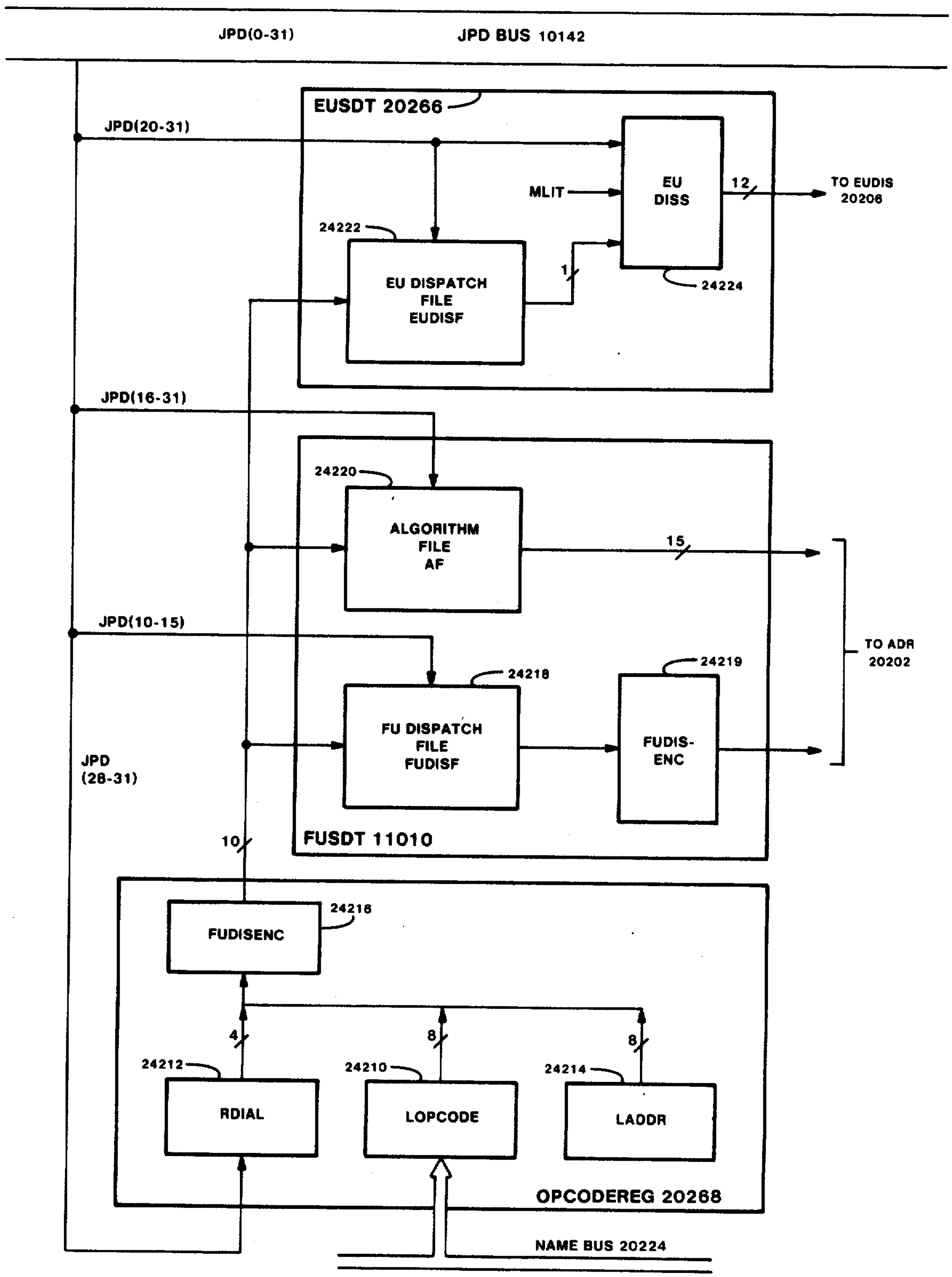
FIG. 242 is a detailed block diagram of portions of computer system microinstruction control logic.

Referring to FIG. 242, a more detailed block diagram of OPCODEREG 20268, FUSDT 11010, and EUSDT 20266 is shown. As shown therein, OPCODEREG 20268 is comprised of Op-Code Latch (LOPCODE) 24210, Dialect Register (RDIAL) 24212, Load Address Register (LADDR) 24214, and Fetch Unit Dispatch Encoder (FUDISENC) 24216. Data inputs of LOPCODE 24010 are connected from NAME Bus 20224 to receive SOPs parsed from INSTB 20262. Load inputs of RDIAL 24212 are connected from Bits 28 to 31 of JPD Bus 10142. Outputs of LOPCODE 24210, RDIAL 24212 and LADDR 24214 are connected to inputs of FUDISENC 24216. Outputs of FUDISENC 24216 are connected to address inputs of FUSDT 11010 and EUSDT 20266.

FUSDT 11010 is comprised of Fetch Unit Dispatch File (FUDISF) 24218 and Algorithm File (AF) 24220. Address inputs of FUDISF 24218 and AF 24220 are connected, as previously described, from address outputs of FUDISENC 24216. Data load inputs of FUDISF 24218 and AF 24220 are connected from, respectively, Bits 10 to 15 and Bits 16 to 31 of JPD Bus 10142. SDP outputs of FUDISF 24218 and AF 24220 are connected to ADR Buses 20202.

EUSDT 20266 is comprised of Execute Unit Dispatch File (EUDISF) 24222 and Execute Unit Dispatch Selector (EUDISS) 24224. Address inputs of EUDISF 24222 are, as described above, connected from outputs of FUDISENC 24216. Data load inputs of EUDISF 24222 are connected from Bits 20 to 31 of JPD Bus 10142. Inputs of EUDISS 24224 are connected from SDP output of EUDISF 24222, from Bits 20 to 31 of JPD Bus 10142, and from Microcode Literal (mLIT) output of FUSITT 11012. SDP outputs of EUDISS 24224 are connected to EUDIS Bus 20206.

As previously described, OPCODEREG 20268 provides addresses, generated from SOPs loaded into OPCODĖREG 20268, to FUSDT 11010 and EUSDT 20266 to select SDPs to be provided as address inputs to FUSITT 11012 and EUSITT. LOPCODE 24210 receives and stores eight bit SOPs parsed from INSTB 20262 as described above. OPCODEREG 20268 also provides addresses to FUSDT 11010 and EUSDT 20266 to load FUSDT 11010 and EUSDT 20266 with SDs for S-Language dialects currently being utilized by CS 10110. LOPCODE 24210 and RDIAL 24212, as described below, provide addresses to FUSDT 11010 and EUSDT 20266 when translating SOPs to SDPs and ADDR 24214 provides addresses when FUSDT 11010 and EUSDT 20266 are being loaded with SDs.

Referring first to LADDR 24214, LADDR 24214 has an eight bit counter. Addresses are provided to FUSDT 11010 and EUSDT 20266 from LADDR 24214 only when FUSDT 11010 and EUSDT 20266 are being loaded with SDs, that is groups of SDPs for S-Language dialects currently being utilized by CS 10110. During this operation, output of LADDR 24214 is enabled to FUSDT 11010 and EUSDT 20266 by microcode control signals (not shown for clarity of presentation) from FUSITT 11012. Selection between FUDISF 24218, AF 24220, and EUDISF 24222 to receive addresses is similarly provided by microinstruction enable signals (also not shown for clarity of presentation) provided from FUSITT 11012. These FUSDT 11010 and EUSDT 20266 address enable inputs may select, at any time, any or all of FUDISF 24218, AF 24220, or EUDSF 24222 to receive address inputs SDPs to be loaded into FUDISF 24218, AF 24220, and EUDISF 24222 are provided, respectively, from Bits 10 to 15 (JPD(10-15)), Bits 16 to 31 (JPD(16-31)), and Bits 20 to 31 (JPD(20-31)) of JPD Bus 10142. Address contents of LADDR 24214 are successively incremented by one as successive SDPs are loaded into FUSDT 11010 and EUSDT 20266. Incrementing of LADDR 24214 is, again, controlled by microinstruction control inputs from FUSITT 11012.

Address inputs to FUSDT 11010 and EUSDT 20266 durng interpretation of SOPs are provided from LOPCODE 24210 and RDIAL 24212. LOPCODE 24210 is a register counter having, as described above, data inputs connected from NAME Bus 20224 to receive SOPs from PARSER 20264. In a first mode, LOPCODE 24210 may operate as a latch, loaded with one SOP at a time from output of PARSER 20264. In a second mode, LOPCODE 24210 operates as a clock register to receive successive eight bit inputs from low order eight bits of NAME Bus 20224 (NAME(8-15)). Loading of LOPCODE 24210 is contolled by microinstruction control outputs (not shown for clarity of presentation) from FUSITT 11012.

As will be described further below, eight bit SOPs stored in LOPCODE 24210 are concatenated with the output of RDIAL 24212 to provide addresses to FUSDT 11010 and EUSDT 20266 to select SDPs corresponding to particular SOPs. That portion of these addresses provided from LOPCODE 24210, that is the eight bit SOPs, selects particular SDPs within a particular SD. Particular SDs are selected by that portion of these addresses which is provided from the contents of RDIAL 24212.

RDIAL 24212 receives and stores four bit Dialect Codes indicating the particular S-Language dialect currently being used by CS 10110 and executing the SOPs of a user's program. These four bit Dialect Codes are provided from JPD Bus 10142, as JPD (28-31). Loading of RDIAL 24212 with four bit Dialect Codes is controlled by microinstruction control signals provided form FUSITT 11012 (not shown for clarity of presentation).

Four bit Dialect Codes in RDIAL 24212 define partitions in FUDISF 24218, AF 24220 and EUDISF 24222. Each partition contains SDPs for a different S-Language dialect, that is contains a different SD. FUDISF 24218, AF 24220 and EUDISF 24222 may contain, for example, eight 128 word partitions or four 256 word partitions. A single bit of Dialect Code, for example Bit 3, defines whether FUDISF 24218, AF 24220, and EUDISF 24222 contain our or eight partitions If FUSDT 11010 and EUSDT 20266 contain four partitions, the two most significant bits of address into FUSDT 11010 and EUSDT 20266 are provided from Dilect Code Bits 1 and 2 and determine which partition is addressed. The lower order eight bits of address are provided from LOPCODE 24210 and determine which word in a selected partition is addressed. If FUSDT 11010 and EUSDT 20266 contain eight partitions, the three most significant bits of address into FUSDT 11010 and EUSDT 20266 are provided from Bits 0 to 2 of Dialect Code, to select a particular partition, and the lower seven bits of address are provided from LOPCODE 24210 to select a particular word in the selected partition.

As described above, LOPCODE 24210 eight bit output and RDIAL 24212's four bit output are concatenated together, through FUDISENC 24216, to provide a ten bit address input to FUSDT 11010 and EUSDT 20266. FUDISENC 24216 is an encoding circuit and will be described further below with reference to FUDISF 24218. As previously described, selection of FUDISF 24218, AF 24220, and EUDISF 24222 to receive address inputs from RDIAL 24212 and LOPCODE 24210 is controlled by microinstruction control enable inputs provided from FUSITT 11012 (not shown for clarity of presentation).

Referring to FUSDT 11010, both FUDISF 24218 and AF 24220 provide SDPs to FUSITT 11012, but do so for differing purposes. In general, microinstruction control operations may be regarded as falling into two classes. First, there are those microinstruction operations which are generic, that is general in nature and used by or applying to a broad variety of SOPs of a particular dialect or even of many dialects. An example of this class of microinstruction operation is fetches of operand values. FUDISF 24218 provides SDPs for this class of microinstruction operations. As described below, FUDISF 24218 is a fast access memory allowing a single microinstruction control output of FUSITT 11012 to parse an SOP from INSTB 20262 into LOPCODE 24210, and a corresponding SDP to be provided from FUDISF 24218. That is, an SOP of this generic class may be parsed from INSTB 20262 and a corresponding SDP provided from FUDISF 24218 during a single system clock cycle. Operation of FUDISF 24218 thereby enhances speed of operation of JP 10114, in particular at the beginning of execution of new SOPs.

The second class of microinstruction operations are those specific to particular SINTs or to particular groups of SINTs. These groups of SINTs may reside entirely within a particular dialect, for example FORTRAN, or may exist within one or more dialects. SDPs for this class of microinstruction operation are provided by AF 24220. As described further below, AF 24220 is slower than FUDISF 24218, but is larger. In general, AF 24220 contains SDPs of microinstruction sequences specific to particular SINTs. In general, generic microinstruction operations are performed before those operations specific to particular SINTs, so that SDPs are required from AF 24220 at a later time than those from FUDISF 24218. SDPs for specific SINT operations may therefore be provided from lower speed AF 24220 without a penalty in speed of execution of SOPs.

Referring again to FUDISF 24218, FUDISF 24218 is a 1,024 word by 6 bit fast access by polar memory. Each word contained therein, as described above, is an SDP, or address to start of a corresponding sequence of microinstructions in FUSITT 11012. As will be described further below, FUSITT is an 8K (8192) word memory. SDPs provided by FUDISF 24218 are each, as described above, 6 bits wide and may thus address a limited, 32 word area of FUSITT 11012's address space. FUDISF 24218 is enabled to provide SDPs to FUSITT 11012 by microinstruction control signals (not shown for clarity of presentation) from FUSITT 11012. FUDISF 24218 six bit SDPs are encoded by FUDISENC 24219 to address FUSITT 11012 address space in increments of 4 microinstructions, that is in increments of 4 address locations. FUDISF 24218 SDPs thereby address 4 microinstructions at a time from FUSITT 11012's microinstruction sequences. As will be described further below, mPC 20276 generates successive microinstruction addresses to FUSITT 11012 to select successive microinstructions of a sequence following an initial microinstruction selected by an SDP from FUSDT 11010. An FUDISF 24218 SDP will thereby select the first microinstruction of a 4 microinstruction block, and mPC 20276 will select the following 3 microinstructions of that 4 microinstruction sequence. A 4 microinstruction sequence may therefore be executed in line, or sequentially, for each FUDISF 24218 SDP provided in response to a generic SOP. FUDISENC 24219 encodes FUDISF 24218 six bit SDPs to select these 4 microinstruction sequences so that the least significant bit of these SDPs occupies the 24 bit of FUSITT 11012 address inputs, and so on. The two least significant bits of an FUSITT 11012 address, or SDP, provided from FUDISF 24218 are forced to 0 while the ninth and higher bits may be hard-wired to define any particular block of 128 addresses in FUSITT 11012. This hard-wiring of the most significant bits of FUSITT 11012 addresses from FUDISF 24218 allows a set of generic microinstruction sequences selected by FUDISF 24218 to be located as desired within FUSITT 11012's address space. FUDISENC 24219 is comprised of a set of driver gates.

As previously described, SDPs for generic microinstructions currently being utilized by CS 10110 in executing user's programs are written into FUDISF 24218 from Bits 10 to 15 of JPD Bus 10142 (JPD(10-15)). Addresses for loading SDPs into FUDISF 24218 are provided, as previously described, from LADDR 24214. LADDR 24214 is enabled to provide load addresses, and FUDISF 24218 is enabled to be written into, by microinstruction control signals (not shown for clarity of presentation) provided from FUSITT 11012.

Referring to AF 24220, as previously described AF 24220 is of larger capacity than FUDISF 24218, but has slower access time. AF 24220 is a 1,024 word by 15 bit memory. In general, 2 clock cycles are required to obtain a DSP from AF 24220. During first clock cycle, an SOP is loaded into LOPCODE 24210 and, during second clock cycle, AF 24220 is addressed to provide a corresponding SDP. SDPs provided by AF 24220 are each 15 bits in width and thus capable of addressing a larger address space than that of FUSITT 11012. As previously described, FUSITT 11012 is an 8K word memory. If FUSITT 11012 is addressed by an AF 24220 SDP referring to an address location outside of FUSITT 11012's address space, FUSITT 11012 will generate a microinstruction Not In Control Store output to EVENT 20284 as described further below. An AF 24220 SDP resulting in this event will then be used to address certain microinstruction sequences stored in MEM 10112. These microinstructions will then be executed from MEM 10112, rather than from FUSDT 11010. This operation allows certain microinstruction sequences, for example rarely used microinstruction sequences, to remain in MEM 10112, thus freeing AF 24220 and FUSITT 11012's address spaces from more frequently used SOPs.

As previously described AF 24220 is loaded, with SDPs, for SINTs currently being used by CS 10110 in executing user's programs, from Bits 16-31 of JPD Bus 10142 (JPD(16-31)). Also as previously discussed, addresses to load SDPs into AF 24220 are provided from LADDR 24214. LADDR 24214 is enabled to provide load addresses and AF 24220 to receive SDPs, by microinstruction control signals (not shown for clarity of presentation) provided from FUSITT 11012.

Referring finally to EUSDT 20266, SDPs may be provided to EU 10122 from 3 sources. EU 10122 SDPs may be provided from EUDISF 24222, from JPD Bus 10142 or from literal fields of microinstructions provided from FUSITT 11012. EUDISF 24222's SDPs are each 12 bits in width and comprise 9 bits of address into EUSITT and 3 bits of operand format information.

EUDISF 24222 is 1,024 word by 12 bit memory. As previously described addresses to read SDPs from EUDISF 24222 are provided from OPCODEREG 20268 by concatenating a 4 bit Dialect Code from RDIAL 24212 and an 8 bit SOP from LOPCODE 24210. SDPs provided by EUDISF 24222 are provided as a first input to EUDISS 24224.

EUDISS 24224 is a multiplexer. As just described, a first input of EUDISS 24224 are SDPs from EUDISF 24222. A second 12 bit input of EUDISS 24224 is provided from Bits 20 to 31 of JPD Bus 10142 (JPD(20-31)). A third input of EUDISS 24224 is a 12 bit input provided from a literal field of an FUSITT 11012 microinstruction output. EUDISS 20224 selects one of these 3 inputs to be transferred on EUDIS Bus 20206 to be provided as an execute unit SDP to EUSITT. Selection between EUDISS 20224's inputs is provided by microinstruction control signals (not shown for clarity of presentation) provided from FUSITT 11012.

As previously described, EUDISF 24222 is loaded, with SDPs for S-Language dialects currently being used by CS 10110, from Bits 20 to 31 of JPD Bus 10142 (JPD(20-31)). Addresses to load SDPs into EUDISF 24222 are provided, as previously described, from LADDR 20214. FUSITT 11012 provides enable signals (not shown for clarity of presentation) to LADDR 24214 and EUDISF 24222 to enable writing of SDPs into EUDISF 24222.

The structure and operation of FUCTL 20214 circuitry for fetching and parsing SINs from MEM 10112 to provide Name syllables and SOPs, and for interpreting SOP to provide SDPs to FUSITT 11012 and EUSITT from FUSDT 11010 and EUSDT 20266, have been described above. As described above, SDPs provided by FUSDT 11010 and EUSDT 20266 are initial, or starting, addresses pointing to first microinstructions of sequences of microinstructions. Addresses for microinstructions following those initial microinstructions are provided by FUCTL 20214's next address generator circuitry which may include mPC 20276, BRCASE 20278, REPCTR 20280 and PNREG 20282, EVENT 20284 and SITTNAG 20286. mPC 20276, BRCASE 20278, REPCTR 20280 and PNREG 20282, and SITTNAG 20286 are primarily concerned with generation of next addresses during execution of microinstruction sequences in response to SOPs and will be described next below. EVENT 20284 and other portions of FUCTL 20214's circuitry are more concerned with generation of microinstruction sequences with regard to CS 10110's internal mechanisms operations and will be described in a later description. EU 10122 also includes next address generation circuitry and this circuitry will be described in a following description of EU 10122.

c.c.c. Next Address Generator 24310 (FIG. 243)

As stated above, in FU 10120 first, or initial, microinstructions of microinstruction sequences for interpreting SOPs are provided by FUSDT 11010. Subsequent addresses of microinstructions within these sequences are, in general, provided by mPC 20276 and BRCASE 20278. mPC 20276, as described further below, provides sequential addresses for selecting sequential microinstructions of microinstruction sequences. BRCASE 20278 provides addresses for selecting microinstructions when a microinstruction Branch or microinstruction Case operation is required. REPCTR 20280 and PNREG 20282 provide addresses for writing, or loading, of microinstruction sequences into FUSITT 11012. Other portions of FUCTL 20214 circuitry, for example EVENT 20284, provides microinstruction sequence selection addresses to select microinstruction sequences for controlling operation of CS 10110's internal mechanisms. SITTNAS 20286 selects between these microinstruction address sources to provide to FUSITT 11012 those addresses required to select microinstructions of the operation to be currently executed by CS 10110.

Figure 243:
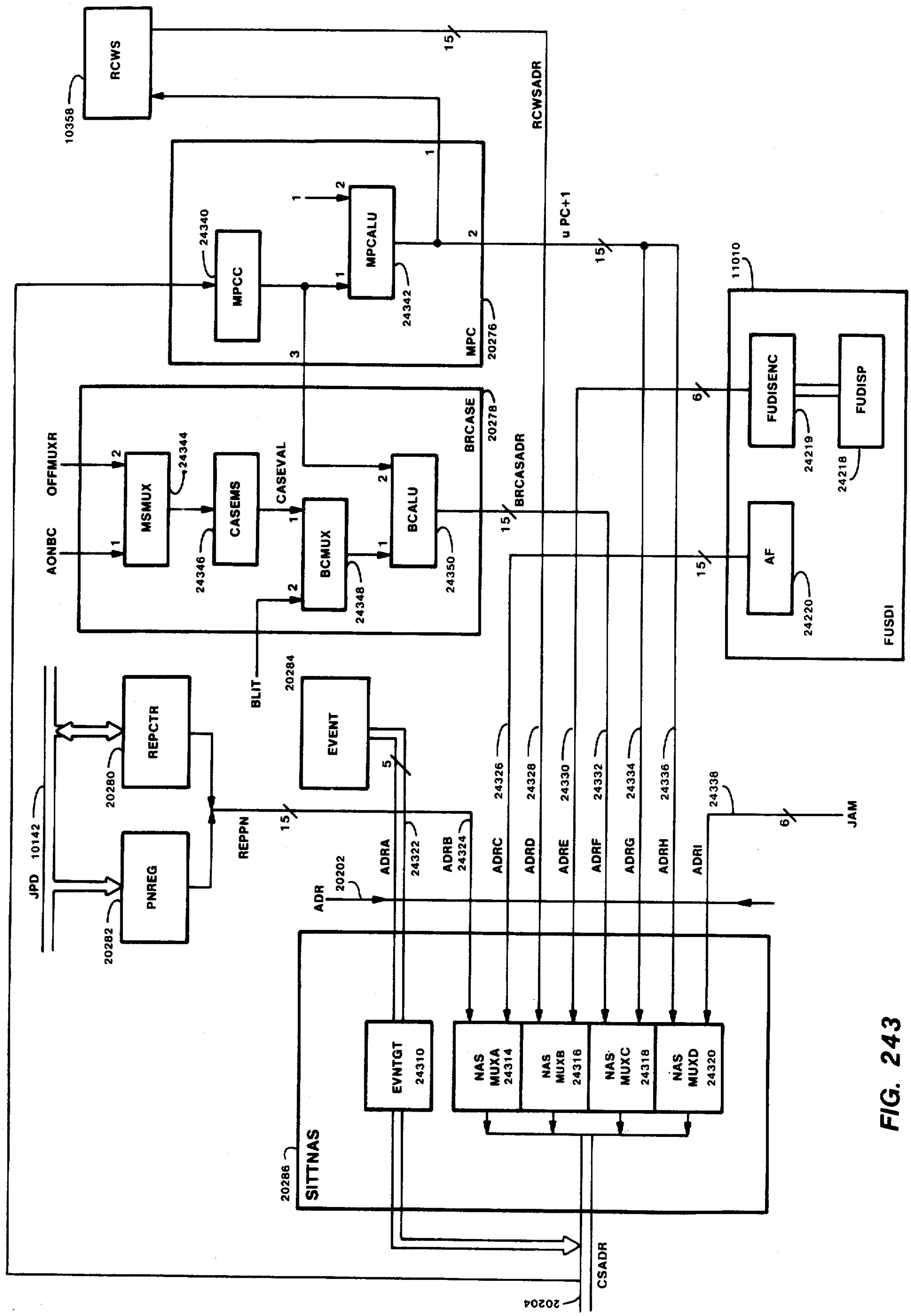
FIG. 243 is a detailed block diagram of further portions of computer system microinstruction control logic.
Figure 244:
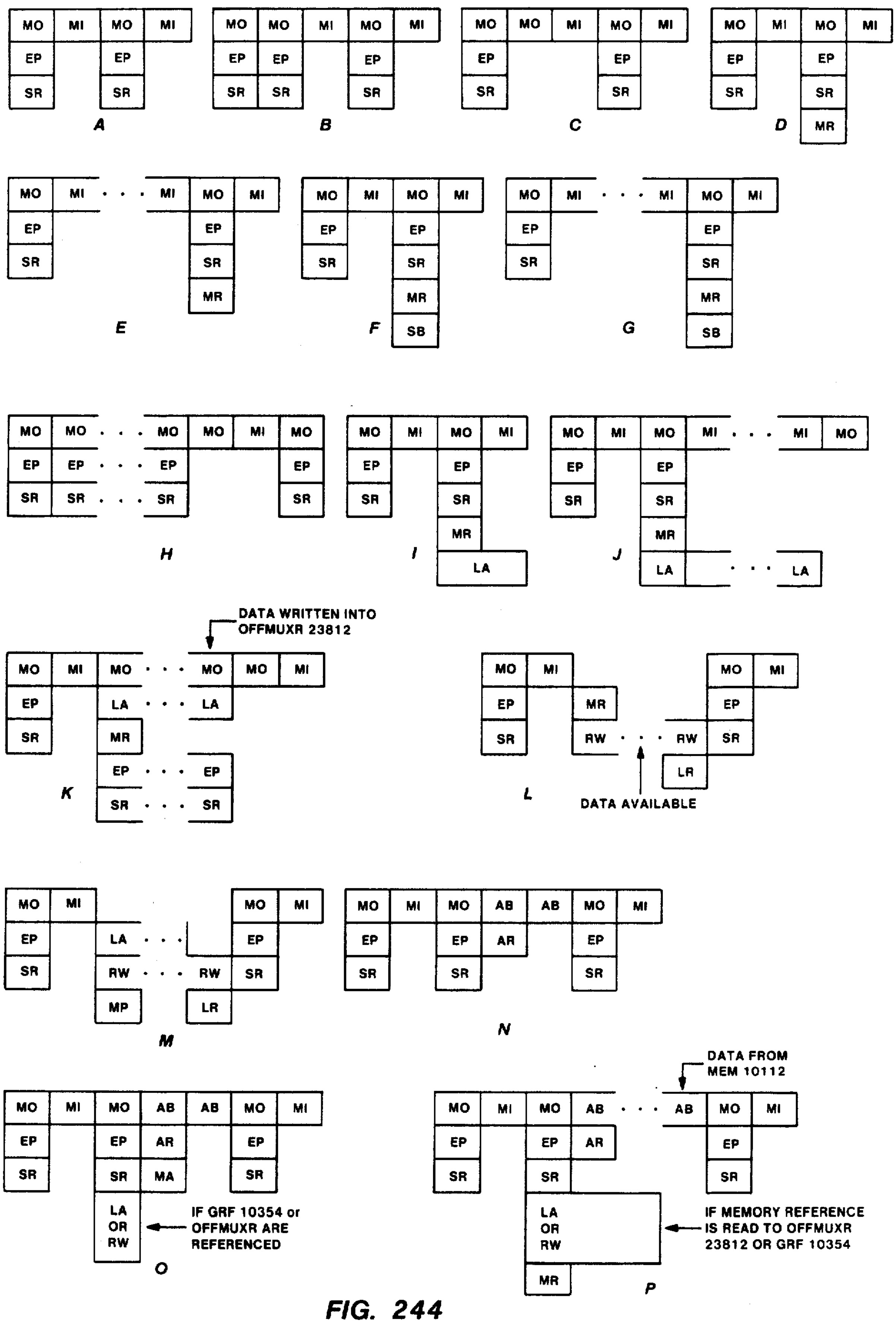
FIGS. 244 and 244A are a diagram illustrating computer system states of operation.

Referring to FIG. 243, a partial block diagram of FU 10120's Next Address Generator (NAG) 24310 is shown. In addition to FUSDT 11010, NAG 24310 includes mPC 20276, BRCASE 20278, EVENT 20284, REPCTR 20280 and PNREG 20282, a part of RCWS 10358, and SITTNAS 20286. EVENT 20284 is, as described above, primarily concerned with execution of microinstruction sequences for controlling CS 10110 internal mechanisms. EVENT 20284 as shown herein only to illustrate its relationships to other portions of NAG 24310. EVENT 20284 will be described further in a following description of FUCTL 20214's circuitry controlling CS 10110's internal mechanisms. Similarly, operation of RCWS 10358 will be described in part in the present description of NAG 24310, and in part in a following description of control of CS 10110's internal mechanisms.

Referring first to NAG 24310's structure, interconnections of FUSDT 11010, RCWS 10358, mPC 20276, BRCASE 20278, REPCTR 20280, PNREG 20282, EVENT 20284, and SITTNAS 20286 have been previously described with reference to FIG. 202. NAG 24310's structure will be described below only wherein FIG. 243 differs from FIG. 202.

Referring first to SITTNAS 20286, SITTNAS 20286 is shown as comprised of EVENT Gate (EVNTGT) 24310 and Next Address Select Multiplexer (NASMUX) 24312. NASMUX 24312 is comprised of NAS Multiplexer A (NASMUXA) 24314, NASMUXB 24316, NASMUXC 24318, and NASMUXD 24320. Outputs of EVNTGT 24310 and NASMUXA 24314 to NASMUXD 24320 are ORed to CSADR 20204 to provide microinstruction selection addresses to FUSITT 11012.

ADR 20202 is shown in FIG. 243 as comprised of nine buses, Address A (ADRA) Bus 24322 to Address I (ADRI) Bus 24338. Output of EVENT 20284 is connected to input of EVNTGT 24310 by ADRA Bus 24322. Outputs of REPCTR 20280 and PNREG 20282 and output of AF 24220 are connected to inputs of NASMUXA 24314 by, respectively, ADRB Bus 24324 and ADRC Bus 24326. Outputs of RCWS 10358 and FUDISENC 4219 are connected to inputs of NASMUXB 24316 by, respectively, ADRD Bus 24328 and ADRE Bus 24330. Outputs of BRCASE 20278 and second output of mPC 20276 are connected to inputs of NASMUXC 24318 by, respectively, ADRF Bus 24332 and ADRG Bus 24334. Second output of mPC 20276 and JAM output of NC 10226 are connected to inputs of NASMUXD 24320 by, respectively, ADRH Bus 24336 and ADRI Bus 24338. ADR 20202 thus comprises a set of buses connecting microinstruction address sources to inputs of SITTNAS 20286.

Referring to mPC 20276, mPC 20276 is comprised of Micro-Program Counter Counter (mPCC) 24340 and Micro-Program Counter Arithmetic and Logic Unit (mPCALU) 24342. Data input of mPCC 24340 is connected from CSADR Bus 20204. Output of mPCC 24340 is connected to a first input of mPCALU 24342 and is mPC 20276's third output to BRCASE 20278. Second input of mPCALU 24342 is a fifteen binary number set, for example by hard-wiring, to be binary one. Output of mPCALU 24342 comprises mPC 20276's first output, to RCWS 10358, and mPC 20276's second output, to inputs of NASMUXC 24318 and NASMUXD 24320.

BRCASE 20278 is shown in FIG. 243 as comprising Mask and Shift Multiplexer (MSMUX) 24344, Case Mask and Shift Logic (CASEMS) 24346, Branch and Case Multiplexer (BCMUX) 24348 and Branch and Case Arithmetic and Logic Unit (BCALU) 24350. A first input of MSMUX 24344 (AONBC, not previously shown) is connected from output of AONGRF 20232. A second input of MSMUX 24344 (OFFMUXR, not previously shown) is connected from output of OFFMUXR 23812. Output of MSMUX 24344 is connected to input CASEMS 24346, and output of CASEMS 24346 is connected to a first input of BCMUX 24348. A second input of BCMUX 24348, BLIT is connected from a literal field output of FUSITT 11012's microinstruction output. Output of BCMUX 24348 and third output of mPC 20276, from output of mPCC 24340, are connected, respectively, to first and second inputs of BCALU 24350. Output of BCALU 24350 comprises BRCASE 20278 outputs to NASMUXC 24318.

An address to select a next microinstruction may be provided to FUSITT 11012 by SITTNAS 20286 from any of eight sources. First source is output of mPC 20276. Output of mPC 20276 is referred to as Micro-Program Count Plus 1 (mPC+1) and is fifteen bits of address. Second source is from EVENT 20284 and is comprised of five bits of address. Third source is output of FUDISP 24218 and FUDISENC 24219 and, as previously described, is comprised of six bits of address. Fourth source is output of AF 24220 and, as previously described, is comprised of fifteen bits of address. Fifth source is output of BRCASE 20278. Output of BRCASE 20278 is referred to as Branch and Case Address (BRCASEADR) and comprises fifteen bits of address. Sixth source is an output of RCWS 10358. Output of RCWS 10358 is referred to as RCWS Address (RCWSADR) and is comprised of fifteen bits of address. Seventh source is REPCTR 20280 and PNREG 20282 whose outputs (REPPN) together comprise fifteen bits of address. Finally, eighth source is JAM input from NC 10226, which comprises five bits of address. These address sources differ in number of bits of address that they provide, but a microinstruction address gated onto CSADR Bus 20202 by SITTNAS 20286 always comprises fifteen bits of address. If a particular source applies fewer than fifteen bits, that address is extended to fifteen bits by SITTNAS 20286. In general, extension of address bits may be performed by hard-wiring of additional address input bits to SITTNAS 20286 from each of these sources and will be described further below.

Referring to mPC 20276, mPCC 24340 is a fifteen bit register and mPCALU 24342 is a fifteen bit ALU. mPCC 24340 is, as described above, connected from CSADR Bus 20204 and is sequentially loaded with a microinstruction address currently being presented to FUSITT 11012. mPCC 24340 will thus contain the address of the currently executing microinstruction. mPCALU 24342 is dedicated to incrementing the address contained in mPCC 24340 by one. mPC+1 output of mPCALU 24342 will thereby always be address of next sequential microinstruction. mPC+1 is, as described above, a fifteen bit address and is thus not extended in SITTNAS 20286.

Referring to BRCASE 20278, as described above BRCASE 20278 provides next microinstruction addresses for mPC 20276 Relative Branches and for Case Branches. Next microinstruction addresses for microprogram Relative Branches and for Case Branches are both generated as addresses relative to address of currently executing microinstruction as stored in mPCC 24340, but differ in the manner in which these relative addresses are generated. Considering first Case Branches, Case Branch addresses relative to a currently executing microinstruction address are generated, in part, by MSMUX 24344 and CASEMS 24346. As described above, MSMUX 24344 which is a multiplexer receives two inputs. First input is AONBC from output of AONGRF 20232 and second input is OFFMUXR from output of OFFMUXR 23812. Each of these inputs is eight bits, or one byte, in width. Acting under control of microinstruction output from FUSITT 11012, MSMUX 24344 selects either input AONBC or input OFFMUXR as an eight bit output to input of CASEMS 24346. CASEMS 24346 is a Mask and Shift circuit, similar in structure and operation to that of FIU 20116 but operating upon bytes rather than thirty-two bit words. CASEMS 24346, operating under microinstruction control from FUSITT 11012, manipulates eight bit input from MSMUX 24344 by masking and shifting to provide eight bit Case Value (CASEVAL) output to BCMUX 24348. CASEVAL represents a microinstruction address displacement relative to address of a currently executing microinstruction and, being an eight bit number, may express a displacement of 0 to 255 address locations in FUSITT 11012.

BCMUX 24348 is an eight bit multiplexer, similar in structure and operation to MSMUX 24344, and is controlled by microinstruction inputs provided from FUSITT 11012. In executing a case operation, BCMUX 24348 selects CASEVAL input to MCMUX 24348's output to first input of BCALU 24350. BCALU 24350 is a sixteen bit arithmetic and logic unit. Second input of BCALU 24350 is fifteen bit address of currently executing microinstruction from mPCC 24340. BCALU 24350 operates under microinstruction control provided from FUSITT 11012 and, in executing a Case operation, adds CASEVAL to the address of a currently executing microinstruction. During a Case operation, carry input of BSALU 24350 is forced, by microinstruction control from FUSITT 11012, to one so that BCALU 24350's second input is effectively mPC+1, or address of currently executing microinstruction plus 1. Output BRCASEADR of BCALU 24350 will thereby be fifteen bit Case address which is between one and 256 FUSITT 11012 address locations higher than the address location of the currently executing microinstruction. The actual case value address displacement from the address of the currently executing microinstruction is determined by either input AONBC or input OFFMUXR to MSMUX 24344, and these mask and shift operations are performed by CASEMS 24346.

Case operations as described above may be used, for example, in interpreting and manipulating CS 10110 table entries. For example, Name Table Entries of Name Tables 10350 contain flag fields carrying information regarding certain operations to be peformed in resolving and evaluating those Name Table Entries. These operations may be implemented as Case Branches in microinstruction sequences for resolving and evaluating those Name Table Entries. In the present example, during resolve of a Name Table Entry the microinstruction sequence for performing that resolve may direct a byte of that Name Table Entry's flag field to be read from AONGRF 20232, or OFFMUXR 23812, and through MSMUX 24344 to CASEMS 24346. That microinstruction sequence will then direct CASEMS 24346 to shift and mask that flag field byte to provide a CASEVAL. That CASEVAL will have a value dependent upon the flags within that flag field byte and, when added to mPC+1, will provide a FUSITT 11012 microinstruction address for a microinstruction sequence for handling that Name Table Entry in accordance with those flag bits.

As described above, BRCASE 20278 may also generate microinstruction addresses for Branches occurring within execution of a given microinstruction sequence. In this case, microinstruction control signals from FUSITT 11012 direct BCMUX 24348 second input as output to BCALU 24350. BCMUX 24348's second input is Branch Literal (BLIT). As described above, BLIT is provided from a literal field of a microinstruction word from FUSITT 11012's microinstruction output. BLIT output of BCMUX 24348 is added to address of currently executing microinstruction from mPCC 24340, and BCALU 24350, to provide fifteen bit BRCASEADR of a microinstruction address branched to from the address of the currently executing microinstruction. BRCASEADR may represent, for example, any of four Branch Operations. Possible Branch Operations are: first, a Conditional Short Branch; second, a Conditional Short Call; third, a Long Go To; and, fourth, a Long Call. In each of these possible Branch Operations, BLIT is treated as the twos complement of the desired branch value, that is the microinstruction address offset relative to the address of the currently executing microinstruction BLIT field may therefore be, effectively, added to or subtracted from the address of the currently executing microinstruction, to provide a microinstruction address having a positive or negative displacement from the address of the currently executing microinstruction. In a Conditional Short Branch or a Conditional Short Call, the fourteen bit literal field is a sign extended eight bit number. Both Conditional Short Branch and Conditional Short Call microinstruction addresses may therefore point to an address within a range of +127 to −128 FUSITT 11012 address locations of the address of the currently executing microinstruction. In the case of a Long Go To or Long Call, the BLIT field is a fourteen bit number representing displacement relative to the address of the currently executing microinstruction. BRCASEADR may, in these cases, represent a FUSITT 11012 microinstruction address within a range of +8191 to −8192 FUSITT 11012 address locations of the address of the currently executing microinstruction. BRCASE 20278 thereby provides FU 10120 with capability of executing a full range of microinstruction sequence Case and Branch operations.

Referring to RCWS 10358, as previously described RCWS 10358 stores information regarding microinstruction sequences whose execution has been halted. RCWS 10358 allows execution of those microinstruction sequences to be resumed at a later time. A return control word (RCW) may be written onto RCWS 10358 during any microinstruction sequence that issues a Call to another microinstruction sequence. The calling microinstruction sequence may, for example, be aborted to service an event, as described further in a following description, or may result in a Jam. A Jam is a call for a microinstruction sequence which is forced by operation of CS 10110 hardware, rather than by a microinstruction sequence. RCWS 10358 operation with regard to CS 10110's internal mechanisms will be described in a following description of EVENT 20284, STATE 20294, and MCW1 20290 and MCW0 20292. For puposes of the present discussion, that portion of a RCW concerned with interpretation of SOPs contains, first, certain state information FUSITT 11012 and, second, a return address into FUSITT 11012. State that FUSITT 11012 state is provided from STATE 20294, as described below, and that portion of a RCW containing FUSITT 11012 state information will be described in a following description. Microinstruction address portions of RCWs are provided from output of mPCALU 24342. This microinstruction address is the address of the microinstruction to which FU 10120 is to return upon return from a Call, Event, or Jam. Upon occurrence of a Call or Jam, the microinstruction return address is mPC+1, that is the address of the microinstruction after the microinstruction issuing the Call or Return. For aborted microinstruction sequences, the microinstruction return address is mPC, that is the address of the microinstruction executing at the time abort occurs.

Upon return from a call, service of an event, or service of a jam, FU 10120 state flag portion of RCW is loaded into STATE 20294. Microinstruction return address is provided by RCWS 10358 as fifteen bit RCWSADR to SITTNAS 20286 and is gated onto CSADR 20204. RCWSADR is provided to FUSITT 11012 to select the next microinstruction and is loaded into mPCC 24340 from CSADR 20204.

As previously described, RCWS 10358 is connected to JPD Bus 10142 by a bi-directional bus. RCWs may be written into RCWS 10358 from JPD Bus 10142, or read from RCWS 10358 to JPD Bus 10142. The fifteen bit next microinstruction address portion, and the single bit FUSITT 11012 state portion of RCW is written from or read to Bits 16 to 31 of JPD Bus 10142. FU 10120 may write Present Bottom RCW or Previous RCW into RCWS 10358 from JPD Bus 10142 and may read Present Bottom RCW, or Previous RCW, or another selected RCW, onto JPD Bus 10142. RCWS 10358 thereby provides a means for storing and returning microinstruction addresses of microinstruction sequences whose execution has been suspended, and a means for writing and reading microinstruction address, and FUSITT 11012 state flags, from and to JPD Bus 10142.

As previously described, REPCTR 20280 and PNREG 20282 provide microinstruction addresses for writing of microinstructions into FUSITT 11012. REPCTR 20280 is an eight bit counter and PNREG 20282 is a seven bit register. Eight bit output of REPCTR 20280 is left concatenated with seven bit output of PNREG 20282 to provide fifteen bit microinstruction addresses REPPN. That is, REPCTR 20280 provides the eight low order bits of microinstruction address while PNREG 20282 provides the seven most significant bits of address.

REPCTR may be loaded from Bits 24–31 of JPD Bus 10142, and may be read to Bits 24–31 of JPD Bus 10142. In addition, the eight bits of microinstruction address in REPCTR 20280 may be incremented or decremented as microinstructions are written into FUSITT 11012.

As described above, PNREG 20282 contains the seven most significant bits of microinstruction address. These address bits may be written into PNREG 20282 from Bits 17–23 of JPD Bus 10142. Contents of PNREG 20282 may not, in general, be read to JPD Bus 10142 and may not be incremented or decremented.

Referring to JAM input to SITTNAS 20286 from NC 10226, certain Name evaluate or resolve operations may result in jams. A Jam functions as a call to microinstruction sequences for servicing Jams and are forced by FU 10120 hardware circuitry involved in Name syllable evaluates and resolves.

JAM input to SITTNAS 20286 is comprised of six Jam address bits. Three bits are provided by NC 10226 and three bits are provided from FUSITT 11012's microinstruction output as part of microinstruction sequences for correcting Name syllable evaluates and resolves. The three bits of address from NC 10226 form the most significant three bits of JAM address. One of these bits gates JAM address onto CSADR Bus 20204 and is thus not a true address bit. Output of FUSITT 11012 provides the three least significant bits of JAM address and specifies the particular microinstruction sequence required to service the particular Jam which has occurred. Therefore, during Name evaluate or resolves, the microinstruction sequences provided by FUSITT 11012 to perform Name evaluates or resolves specifies what microinstruction sequences are to be initiated if a Jam occurs. The three bits of JAM address provided by NC 10226 determine, first, that a Jam has occurred and, second, provide two bits of address which, in combination with the three bits of address from FUSITT 11012, specify the particular microinstruction sequence for handling that Jam. JAM address inputs from NC 10226 and from FUSITT 11012 thereby provide six of the fifteen bits of JAM address. The remaining nine bits of JAM address are provided, for example, by hard-wired inputs to NASMUXD 24320. These hard-wired address bits force JAM address to address FUSITT 11012 in blocks of 4 microinstruction addresses, in a manner similar to address inputs to FUDISF 24218 and FUDISENC 24219.

Address inputs provided to SITTNAS 20286 from FUSDT 11010 have been previously described with respect to description of FUCTL 20214 fetch, parse, and dispatch operations. Address inputs provided by EVENT 20284 will be described in a following description of FUCTL 20214's operations with regard to CS 10110's internal mechanisms.

Referring finally to SITTNAS 20286, as previously described SITTNAS 20286 is comprised of EVNTGT 24310 and NASMUX 24312. Inputs are provided to NASMUX 24312, as described above, from FUSDT 11010, mPC 20276, BRCASE 20278, RCWS 10358, REPCTR 20280 and PNREG 20282, and by JAM input. These inputs are, in general, provided with regard to FUCTL 20214's operations in fetching, parsing, and interpreting SOPs and Name syllables. These operations are thereby primarily directly concerned with execution of user's programs, that is the execution of sequences of SINs. NASMUX 24312 selects between these inputs and transfers selected address inputs onto CSADR 20204 as microinstruction addresses to FUSITT 11012 under microinstruction control from microinstruction outputs of FUSITT 11012. Microinstruction address outputs are provided to SITTNAS 20286 from EVENT 20284 in response to Events, described further below, occuring in CS 10110's operations in executing user's programs. These microinstruction addresses from EVENT 20284 are gated onto CSADR 20204, to select appropriate microinstruction sequences, by EVNTGT 24310. EVNTGT 24310 is separated from NASMUX 24312 to allow EVNTGT 24310 to over-ride NASMUX 24312 and provide microinstruction address to EVENT 20284 while NASMUX 24312 is inhibited due to occurrence of certain Events. These Events are, in general, associated with operation of CS 10110's internal mechanisms and structure and operation of EVENT 20284, together with STATE 20294, MCW1 20290, and MCW0 20292, and other portions of RCWS 10358, will be described next below.

c.c. FUCTL 20214 Control Circuitry for CS 101110 Internal Mechanisms (FIGS. 244-250)

Figure 244A:
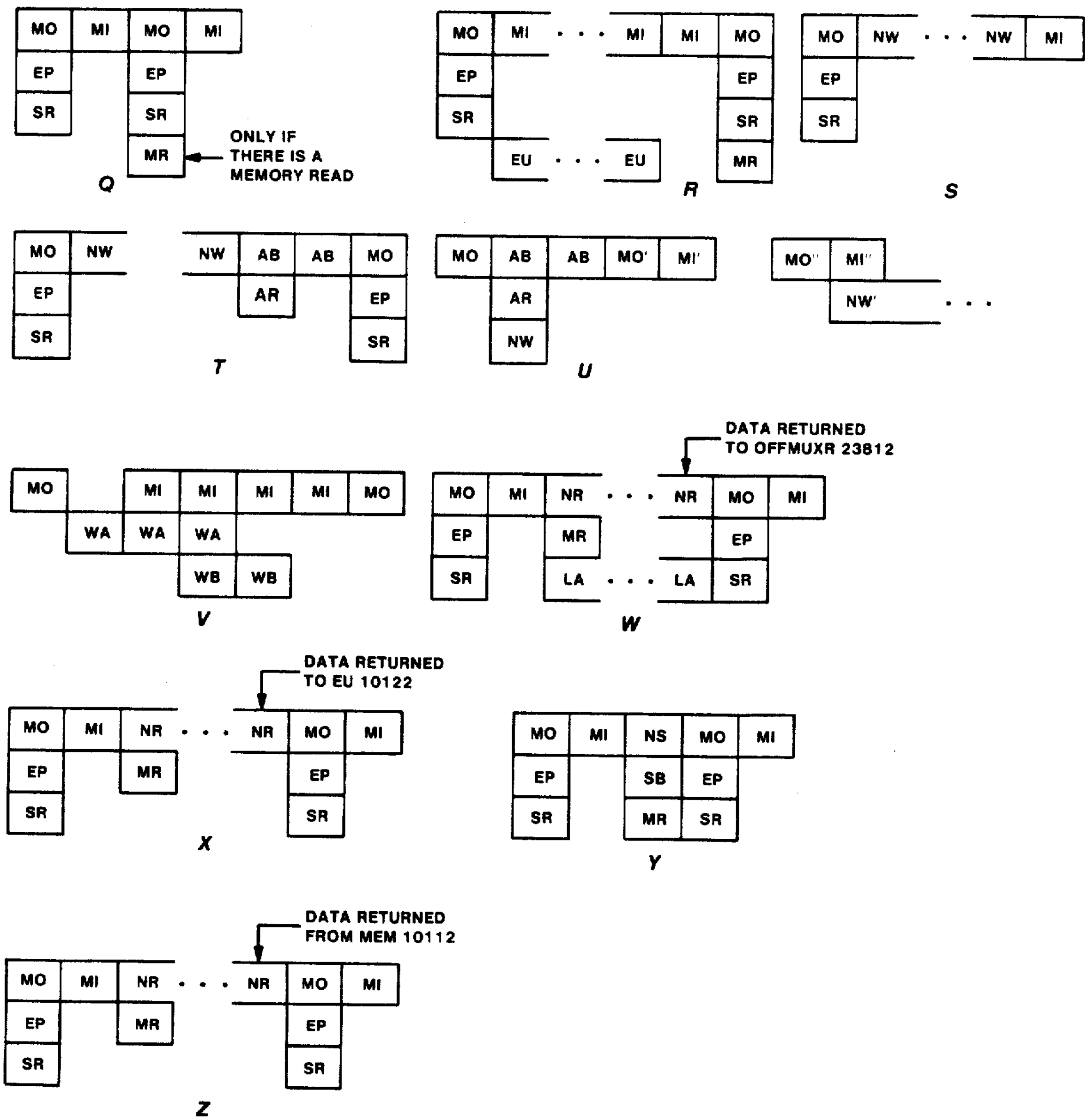

Certain portions of FUCTL 20214's Control Circuitry are more directly concerned with operation of CS 10110's internal mechanisms, for example CS 10110 Stack Mechanisms. This circuitry may include STATE 20294, EVENT 20284, MCW1 20290 and MCW0 20292, portions of RCWS 10358, REG 20288, and Timers 20296. These FUCTL 20214 control elements will be described next below, beginning with STATE 20294.

a.a.a. State Logic 20294 (FIGS. 244A-244Z)

In general, all CS 10110 operations, including execution of microinstructions, are controlled by CS 10110's Operating State. CS 10110 has a number of Operating States, hereafter referred to as States, each State being defined by certain operations which may be performed in that State. Each of these States will be described further below. Current State of CS 10110 is indicated by a set of State Flags stored in a set of registers in STATE 20294. Each State is entered from previous State and is exited to a following State. Next State of CS 10110 is detected by random logic gating distributed throughout CS 10110 to detect certain conditions indicating which State CS 10110 will enter next. Outputs of these Next State Detection gates are provided as inputs to STATE 20294's registers. A particular State register is set and provides a State Flag output when CS 10110 enters the State associated with that particular register. State Flag outputs of STATE 20294's state registers are provided as enable signals throughout CS 10110 to enable initiaton of operations allowed within CS 10110's current State, and to inhibit initiation of operations which are not allowed within CS 10110's current State.

Certain of CS 10110's States, and associated STATE 20294 State Registers and State Flag outputs, are:

(1) MO: the initial State of any microinstruction. State MO is always entered as first data cycle of every microinstruction. During MO, CS 10110's State may not be changed, thus allowing a microinstruction to be arbitrarily aborted and restarted from State MO. In normal execution of microinstructions, State MO is followed by State M1, described below, that is, State MO is exited to State M1. State M0 may be entered from State M0 and from State M1, State AB, State LR, State NR, or State MS, each of which will be described below.

(2) EP: Enable Pause State. State EP is entered when State MO is entered for the first time in a microinstruction. If that microinstruction requests a pause, that microinstruction will force State MO to be re-entered for one clock cycle. If State M0 lasts more than one clock cycle, State EP is entered on each extension of State M0 unless the extension is a result of a pause request.

(3) SR: Source GRF State. SR State is active for one clock cycle wherein SR State register enables loading of a GRF 10354 output register. State SR is re-entered on every State M0 cycle except a State M0 cycle generated by a microinstruction requesting extension of State M0. When all STATE 20294 State Registers are cleared, DP 20218 may set state SR register alone, for purposes of reading from GRF 10354.

(4) M1: Final state of normal microinstruction execution. State M1 is the exit State of normal microinstruction execution. FUSITT 11012 microinstruction register, described below, is loaded with a next microinstruction upon exit from State M1. In addition, State M1 Flag output of STATE 20294 enables all CS 10110 registers to receive data on their inputs, that is data on inputs of these registers are clocked to outputs of these registers. State M1 may be entered from State M1, or from State M0, State MW, State MWA, or State WB.

(5) LA: Load Accumulator Enable State. State LA is entered, upon exit from State M1, by microinstructions which read data from MEM 10112 to OFFMUXR 23812. As previously described, OFFMUXR 23812 serves as a general purpose accumulator for DESP 20210. STATE LA overlaps into execution of next microinstruction, and persists until data is returned from MEM 10112 in response to a request to MEM 10112. When MEM 10112 signals data is available, by asserting DAVFA, LA State Flag enables loading of data into OFFMUXR 23812. If the next microinstruction references OFFMUXR 23812, that microinstruction execution is deferred until a read to OFFMUXR 23812 is completed, as indicated by CS 10110 exiting from State LA.

(6) RW: Load GRF 10354 Wait State. State RW is entered from State M1 of microinstructions which read data from MEM 10112 to GRF 10354. RW Fag inhibits initiation of a next microinstruction, that is prevents entry to State M0, and persists through the CS 10110 clock cycle during which data is returned from MEM 10112 in response to a request. State RW initiates Load GRF Enable State, described below.

(7) LR: Load GRF Enable State. State LR is entered in parallel with State RW, on last clock cycle of RW, and persists for one CS 10110 clock cycle. LR Flag enables writing of MEM 10112 output data into GRF 10354.

(8) MR: Memory Reference Trailer State. State MR is entered on transition to State MO whenever a previous microinstruction makes a logical or physical address reference to MEM 10112. MR Flag enables recognition of any MEM 10112 reference Events, described below, which may occur. State MR persists for one clock cycle. If an MEM 10112 memory reference Event occurs, that Event forces exit from State MR to States AB and MA, otherwise State MR has no effect upon selection next state.

(9) SB: Store Back Enable State. State SB is entered during State M0 of a microinstruction following a microinstruction which generated a store back of a result of a EU 10122 operation. SB Flag gates that result to be written into MEM 10112 through JPD Bus 10142.

(10) AB: Microinstruction Abort State. State AB is entered from first MO State after an Event request is recognized, as described in a following description. State AB may be entered from State MO or from State AB and suppresses an entry into State M1. If there has been an uncompleted reference to MEM 10112, that is, the reference has not been aborted and data has not returned from MEM 10112, JP 10114 remains in State AB until the MEM 10112 reference is completed. Should an abort have occurred due to a MEM 10112 reference Event, State AB lasts two clock cycles only. As will be described in a following description of EVENT 20284, State MO of a first microinstruction of a Handler for an Event causing an abort is entered from State AB. AB Flag gates the Handler address of the highest priority recognized Event onto CSADR Bus 20204 to select a corresponding Event Handler microinstruction sequence. EVENT 20284 is granted control of CSADR Bus 20204 during all State AB clock cycles.

(11) AR: Microinstruction Abort Reset State. State AR is entered in parallel with first clock cycle of State AB and persists for one clock cycle. AR Flag resets various STATE 20294 State Registers when an abort occurs. If there are no uncompleted MEM 10112 references, next State AB clock cycle is the last. On uncompleted MEM 10112 references, State AR is entered, but State AB remains active until reference is complete. Should a higher priority Event request service and be recognized while JP 10114 is in State AB, State AR is re-entered. State AB will thereby be active for two clock cycles during all honored Event requests.

(12) MA: MEM 10112 Reference Abort. State MA is entered in parallel with State AB if a MEM 10112 reference is aborted, as indicated by asserted ABORT control signal output from MEM 10112. State MA persists for one clock cycle and State AB flag generates a MEM 10112 Reference Abort Flag which, as described below, results in a repeat of the MEM 10112 reference. AB Flag also resets MEM 10112 Trailer States, described below.

(13) NW: Nano-interrupt Wait State. State NW is entered from State M0 of a microinstruction which issues a Nano-interrupt Request to EU 10122 for an EU 10122 operation. FU 10120 remains in State NW until EU 10122 acknowledges that interrupt. Various EU 10122 Events may make requests at this time. State NW is exited into State AB or State M1.

(14) FM: First Microinstruction of a SIN. State FM is entered in parallel with State M0 on first microinstruction of each SIN and persists for one clock cycle. FM Flag inhibits premature use of AF 24220 and enables recognition of SIN Entry Events. State FM is re-entered upon return from all aborts taken during State M0 of the first microinstruction of an SIN.

(15) SOP: Original Entry to First SIN. State SOP is entered upon entry to State M0 of the first microinstruction of an SOP and is exited from upon any exit from that microinstruction. State SOP is entered only once for each SOP. SOP Flag may be used, for example, for monitoring performance of JP 10114.

(16) EU: EU 10122 Operand Buffer Unavailable. State EU is entered from State M0 of a microinstruction which attempts to read data to EU 10122 Operand Buffer, described in a following description, wherein EU 10122 Operand Buffer is full. When a new SOP is entered, three fetches of data from MEM 10112 may be performed before EU 10122 Operand Buffer is full; two fetches will fill EU 10122 Operand Buffer but EU 10122 may take one operand during a second fetch, thereby clearing EU 10122 Operand Buffer space for a third operand.

(17) NR: Long Pipeline Read. Entry into State NR disables overlap of MEM 10112 reads and disables execution of the next microinstruction. A following microinstruction does not enter State M0 until requested data is returned from MEM 10112. State NR is entered from State NR or from State M1.

(18) NS: Nonpipeline Store Back. State NS is entered in parallel with State SB whenever a microinstruction requesting a pipeline store back, or a write to MEM 10112, occurs. State NS flag generates entry into State M0 of a following microinstruction upon exit from State SB.

(19) WA: Load Control Store State A. State WA is entered from State M0 of a microinstruction which directs loading of microinstruction into FUSITT 11012. WA State Flag controls selection of addresses to CSADR Bus 20204 for writing into FUSITT 11012, and generates a write enable pulse to FUSITT 11012 to write microinstructions into FUSITT 11012.

(20) WB: Load Control Store State B. State WB is entered from State WA and is used to generate an appropriate timing interval for writing into FUSITT 11012. State WB also extends State M1 to 2 clock cycles to ensure a valid address input to FUSITT 11012 when a next microinstruction is to be read from FUSITT 11012.

Having described certain CS 10110 states, and operations which may be performed within those states, state sequences for certain CS 10110 operations will be described next below with aid of FIGS. 244A to 244Z. FIG. 244A to FIG. 244Z represent those state timing sequences necessary to indicate major features of CS 10110 state timing. All state timing shown in FIGS. 244A to 244V assumes full pipelining of CS 10110 operations, for example pipelining of reads from and writes to MEM 10112 by JP 10114. Pipelining is not assumed in Figs. 244W to 244Z. Referring to FIGS. 244A to 244Z, these figures are drawn in the form of timing diagrams, with time increasing from left to right. Successive horizontally positioned "boxes" represents successive CS 10110 states during successive CS 10110 110 nano-second clock cycles. Vertically aligned "boxes" represent alternate CS 10110 states which may occur during a particular clock cycle. Horizontally extended dotted lines connecting certain states represented in FIG. 244A to 244Z represent an indeterminate time interval which is an integral multiple of 110 nano-second CS 10110 clock cycles.

Referring to FIG. 244A to 244Z in sequence, State Timing Sequences shown therein represent:

(1) FIG. 244A; state timing for execution of a normal microinstruction with no Events occurring and no MEM 10112 references.

(2) FIG. 244B; execution of a normal microinstruction, with no Events occurring, no MEM 10112 references, and a hold in State M0 for one clock cycle.

(3) FIG. 244C; a microinstruction requests an extension of State M0 for one clock cycle, with no Events occurring and no MEM 10112 references.

(4) FIG. 244D; a write to MEM 10112 from DESP 20210, for example from GRF 10354 or from OFFALU 20242. MEM 10112 port is available and MEM 10112 reference is made during first sequential occurrence of States M0 and M1.

(5) FIG. 244E; a write to MEM 10112 from DESP 20210 as described above. MEM 10112 port is unavailable for an indeterminate number of clock cycles. A MEM 10112 reference is made during first sequential occurrence of States M0 and M1.

(6) FIG. 244F; writing of an EU 10122 result back into MEM 10112. MEM 10112 is available and a write operation is initiated during first sequential occurrence of States M0 and M1.

(7) FIG. 244G; writing back of an EU 10122 result to MEM 10112 as described above. MEM 10112 port is unavailable for an undetermined number of clock cycles, or EU 10122 does not have a result ready to be written into MEM 10112. Write operation is initiated during first sequential occurrence of States M0 and M1.

(8) FIG. 244H; a read of an EU 10122 result into FU 10120. EU 10122 result is not available for an undetermined number of clock cycles.

(9) FIG. 244I; a read from MEM 10112 to OFFMUXR 23812, with no delays. The microinstruction following the microinstruction initiating a read from MEM 10112 does not reference OFFMUXR 23812.

(10) FIG. 244J; a read from MEM 10112 to OFFMUXR 23812 with data from MEM 10112 being delayed by an indeterminate number of clock cycles. The next following microinstruction from that initiating the read from MEM 10112 does not reference OFFMUXR 23812.

(11) FIG. 244K; a read from MEM 10112 to OFFMUXR 23812. The next microinstruction following the microinstruction initiating the read from MEM 10112 references OFFMUXR 23812.

(12) FIG. 244L; a read from MEM 10112 to GRF 10354. The read to GRF 10354 is initiated by the first sequentially occurring States M0 and M1.

(13) FIG. 244M; a read from MEM 10112 to GRF 10354 and to OFFMUXR 23812. In this case, read operations may not be overlapped.

(14) FIG. 244N; JP 10114 honors an Event request and initiates a corresponding Event Handler microinstruction sequence, no MEM 10112 references occur.

(15) FIG. 244O; JP 10114 honors an Event request as stated above. MEM 10112 references are made during the first sequential occurrence of States M0 and M1 and a MEM 10112 reference Event occurs. In case of an MEM 10112 reference event, State MA is entered from one clock cycle. This occurs only if a MEM 10112 reference is made and aborted.

(16) FIG. 244P; an Event occurs in a MEM 10112 reference made during the first sequential occurrence of States M0 and M1. The MEM 10112 reference does not result in a memory reference Event. CS 10110 remains in State AB until the MEM 10112 reference is completed by return of data from MEM 10112.

(17) FIG. 244Q; a read of data from MEM 10112 or JPD Bus 10114 to EU 10122 Operand Queue. EU 10122 Operand Queue is not full.

(18) FIG. 244R; a read of MEM 10112 or JPD Bus 10142 data to EU 10122 Operand Queue. EU 10122 Operand Queue is full when the microinstruction initiating the read is issued.

(19) FIG. 244S; a request for a "nano-interrupt" to EU 10122 by FU 10120 with no Events occurring.

(20) FIG. 244T; FU 10120 submits a "nano-interrupt" request to EU 10122 and an EU 10122 State Overflow, described further in a following description, occurs. No other Events are recognized, as described in a following description of EVENT 20284.

(21) FIG. 244U; FU 10120 submits a "nano-interrupt" request to EU 10122. Another Event is recognized during State M0 and an abort results. First abort state is entered for the non-EU 10122 event. All aborts recognized in State M0 are taken or acknowledged, before entrance into State M0. Therefore, on retry at State M0 of the original microinstruction entered from State M0, next abort recognized is for EU 10122 Stack Overflow Event since EU 10122 Stack Overflow has higher priority.

(22) FIG. 244V; a load of a 27 bit microinstruction segment into FUSITT 11012.

In FIGS. 244A to 244V, pipelining MEM 10112 reads and writes, and of JP 10114 operations, has been assumed. In FIGS. 244W to 244Z, non-overlapping operation of JP 10114 is assumed.

(23) FIG. 244W; a read of data from MEM 10112 to OFFMUXR 23812.

(24) FIG. 244X; a read of data from MEM 10112 to EU 10122 Operand Queue.

(25) FIG. 244Y; a write of an EU 10122 result into MEM 10112.

(26) FIG. 244Z; a read of a 32 bit SIN word from MEM 10112 in response to a prefetch or conditional prefetch request.

Having described the general structure and operation of STATE 20294, and the operating states and operations of CS 10110, structure and operation of EVENT 20284 will be described next below.

b.b.b. Event Loqic 20284 (FIGS. 245, 246, 247, 248)

An Event is a request for a change in sequence of execution of microinstructions which is generated by CS 10110 circuitry, rather than by currently executing microinstructions. Occurrence of an Event will result in provision of a microinstruction sequence, referred to as an Event Handler, by FUSITT 11012 which modifies CS 10110's operations in accordance with the needs of that Event. Event request signals may be generated by CS 10110 circuitry internal to JP 10114, that is from FU 10120 or EU 10122 or CS 10110 circuitry external to JP 10114, for example from IOP 10116 or from MEM 10112. Event request signals are provided as inputs to EVENT 20284. As will be described further below, EVENT 20284 masks Event Requests to determine which Events will be recognized during a particular CS 10110 Operating State, assigns priorities for servicing multiple Event Requests, and fabricates Handler addresses to FUSITT 11012 for microinstruction sequences for servicing requests. EVENT 20284 then provides those Handler microinstruction addresses to FUSITT 11012 through EVNTGT 24310, to initiate execution of selected Event Handler microinstruction sequences.

Certain terms and expressions are used throughout the following description. The following paragraphs define these usages and provide examples illustrating these terms. An Event "makes a request" when a condition in CS 10110 hardware operation results in a Event Request signal being provided to EVENT 20284. As will be described further below, these Event Request signals are provided to EVENT 20284 combinatorial logic which determines the validity of those "requests".

An Event Request "is reognized" if it is not masked, that is inhibited from being acted upon. Masking may be explicit, using masks generated by FUSITT 11012, or may be implicit, resulting from an improper CS 10110 State or invalid due to other considerations. That is, certain Events are recognized only during certain CS 10110 States even though those requests may be recognized during certain other states. Any number of requests, for example up to 31, may be simultaneously recognized.

An Event Request is "honored" if it is the highest priority Event Request occurring. When a request is honored, a corresponding address, of a corresponding microinstruction sequence in FUSITT 11012, for its Handler microinstruction sequence is gated onto CSADR Bus 20204 by EVENT 20284. A request is honored when CS 10110 enters State AB. State AB gates the selected Event Handler microinstruction address on CSADR Bus 20284.

To summarize, a number of Events may request service by JP 10114. Of these Events, all, some, or none, may be recognized. Only one Event Request, the highest priority Event Request, will be honored when JP 10114 enters State AB. Microinstruction control of CS 10110 will then transfer to that Event's Handler microinstruction sequence. A necessary condition for entering State AB is that an Event Request has been made and recognized.

A microinstruction sequence "completes", "is completed", or reaches "completion" when CS 10110 exits State M1 while that microinstruction sequence is active. A microinstruction sequence may, as described above, be aborted in State M0 an indefinite number of times before, if ever, reaching completion.

A MEM 10112 reference "completes", "is completed", or reaches "completion" when requested data is returned to the specified destination, that is read from MEM 10112 to the requestor, or MEM 10112 accepts data to be written into MEM 10112.

"Trace Traps" are an inherent feature of microinstructions being executed. Trace Traps occur on every microinstruction of a given type (if not masked), for example during a sequence of microinstructions to perform a Name evaluate or resolve, and occur on each microinstruction of the sequence. In general, a Trace Trap Event must be serviced before execution of the next microinstruction. Trace Traps are distinct from Interrupts in that an Interrupt, described below, does not occur on execution of each microinstruction of a microinstruction sequence, but only on those microinstructions where certain other conditions must be considered.

"Interrupts" are the largest class of events in JP 10114. Occurrence of an Interrupt may not, in general, be predicted for a particular execution of a particular microinstruction in a particular instance. Interrupts may require service before execution of the next microinstruction, before execution of the current microinstruction can complete, or before beginning of the next SIN. An Interrupt may be unrelated to execution of any microinstruction, and is serviced before beginning of the next microinstruction.

A "Machine Check" is an Event that JP 10114 may not handle alone, or whose occurrence makes further actions by JP 10114 suspect. These events are captured in EVENT 20284 Registers and result in a request to DP 10118 to stop operation of JP 10114 for subsequent handling.

In summary, three major classes of Events in CS 10110 are Trace Traps, Interrupts, and Machine Checks. Each of these class of events will be described in further detail below, beginning with Trace Traps.

The State of all possible Trace Trap Event Requests, whether requesting or not requesting, is loaded into EVENT 20284 Registers at completion of State M1 and at completion of State AB. That is, since Trap Requests are a function of the currently executing microinstruction, the State of a Trap Request will be loaded into EVENT 20284 Trace Trap Registers at end of State M1 of each currently executing microinstruction. Similarly, if any Trap Requests are recognized, State AB will be entered at the end of the first clock cycle of the next following State M0 and their State loaded at end of the State AB.

Recognized, or unmasked, Trap Requests may be pushed onto RCWS 10358 as Pending Requests. Unrecognized, or masked, Trace Trap Requests may be pushed onto RCWS 10358 as Not Pending Requests and are subsequently disregarded. Subsequently, when a microinstruction sequence ends in a return to a calling microinstruction sequence, the Trace Trap Request bits in an RCWS 10358 may be used to generate Trace Trap Event Requests.

Upon exit from State AB, all Trace Trap Requests, except Micro-Break-Point and Microinstruction Trace Traps, described below, are loaded into corresponding EVENT 20284 Trace Trap Request Registers as not requesting. Micro-Break-Point and Microinstruction Trace Traps, are, in general, always latched as requesting at completion of State AB. Trace Traps may be explicitly masked by a Trace Mode Mask, an Indivisibility Mode Mask, and by a Trace Enable input, all generated by FUSITT 11012 as described below. Micro-Break-Point Trap may also be masked by clearing a Trace Enable bit in a Trace Enable field of certain microinstructions containing Trace Traps. In general, masking is effective from State M0 of the microinstruction which generates the mask, through completion of a microinstruction which clears the mask Trace Traps generated by a microinstruction which clears a mask are taken so as to abort a following microinstruction during its M0 State.

Figure 245:
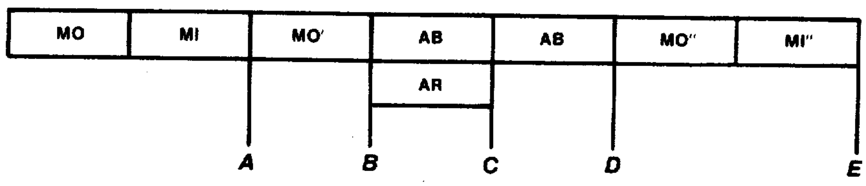
FIG. 245 is a diagram illustrating computer system states of operation for a trace trap request.

Referring to FIG. 245, CS 10110 state timing for a typical Trap Request, and generation of a microinstruction address to a corresponding Trace Trap Handler microinstruction sequence by EVENT 20284 is shown. FIG. 245 is drawn using the same conventions as described above with reference to FIGS. 244A to 244Z. In FIG. 245, a microinstruction executing in States M0 and M1 causes a Trace Trap Request but does not generate an MR (Memory Reference) Trailer State. Trace Trap Request to EVENT 20284 is signaled by Time A. This Trace Trap Request is latched into EVENT 20284 Trace Trap Event Registers, and an Abort Request is provided to STATE 20294. At Time B, FU 10120 enters States AB and AR. The microinstruction address for a Handler microinstruction sequence of the highest priority Event present in EVENT 20284 is presented to FUSITT 11012 and execution of the addressed microinstruction sequence begins. At Time C, FU 10120 exits States AB and AR and enters State AB. State AB will be exited at end of the next 110 nano-second clock cycle. Address of the selected Event Handler microinstruction sequence will remain on CSADR Bus 20204 for duration of State AB. At Time D, a pointer into RCWS 10358, described in a following description, is incremented, thereby effectively pushing the first microinstruction's return control word, that is the microinstruction executing at first State M0, onto RCWS 10358. First microinstruction of the Trace Trap Event Handler microinstruction sequence is provided by FUSITT 11012. Execution of Handler microinstruction sequence will begin at start of the third State M0 of the state timing sequence shown in FIG. 245. EVENT 20284's Trace Trap Register for this event is now latched in non-requesting state and will remain so until transition out of second State M1 shown in FIG. 245. At this time, EVENT 20284 Registers will latch new Trap Requests. Finally, at Time E, Trace Trap Event Registers of EVENT 20284 are latched with new Trap Requests arising from execution of the microinstruction being executed in States M0 and M1 occurring between Times D and E. Traps due to the microinstruction that was executed in States M0 and M1 before Time A, but were not serviced, are requested again when the previously pushed RCW described above is returned from RCWS 10358 upon return from the Trace Trap Event Handler microinstruction sequence initiated at Time D. All Trace Trap Requests which have been serviced are explicitly cleared in RCWS 10358 RCWs by their Event Handler microinstruction sequences to prevent recurrence of those Trap Requests. Since Trace Trap Event Requests arising from reads or writes to MEM 10112 will recur if those requests are repeated, EVENT 20284 generates memory repeat Interrupts after all aborted MEM 10112 read and write requests to insure that these Traps will eventually be serviced Event Handler microinstruction sequences for these read and write Trace Trap Events explicitly disable serviced Trace Trap Event Requests by clearing bits in the logical descriptor of the aborted memory read and write requests.

Having described overall structure and operation of Trace Trap Events, certain specific Trace Trap Events will be described in greater detail below. Trace Trap Events occurring in CS 10112 may include Name Trace Traps, SOP Trace Traps, Microinstruction Trace Traps, Micro-Break-Point Trace Traps, Logical Write Trace Traps, Logical Read Trace Traps, UID Read Trace Traps, and UID Write Trace Traps. These Trace Traps will be described below in the order named.

A Name Trace Trap is requested upon every microinstruction sequence that contains an evaluate or resolve of a Name syllable. Name Trace Traps are provided by decoding certain microinstruction fields of those microinstruction sequences. Name Trace Trap field is masked by either Trace Mask, Indivisibility Mask, or Trace Enable, as described above. All of these masks are set and cleared by microinstruction control signals provided during microinstruction sequences calling for resolves or evaluates of Name syllables.

A SOP Trace Trap may be requested whenever FU 10120 enters State FM (First Microinstruction of an SOP). SOP Trace Traps may be masked by Trace Mask, Indivisibility Mask, or Trace Trap Enable, again provided by microinstruction control outputs of FUSITT 11012. In general, the first microinstruction of such a microinstruction sequence interrupting such SOPs is not completed before a Trace Trap is taken.

Microinstruction Trace Traps may be requested upon completion of microinstructions which do not contain a Return Command, that is those microinstructions which do not return microinstruction control of CS 10110 to the calling microinstruction sequence. For microinstruction sequences containing Return Commands, state of microinstruction Trace Trap Request in a corresponding RCW is used. Every microinstruction for which a Microinstruction Trace Trap is not masked is aborted during State M0 of execution of that microinstruction. Microinstruction Trace Traps may be masked by Trace Mask, Indivisibility Mask, or Trace Enable from FUSITT 11012. A Micro-Break-Point Trap may be requested upon execution of microinstructions which do not contain Return Commands, but in which a Trace Enable bit in a microinstruction is asserted. A Micro-Break Point Trap may be masked by Trace Mask, Indivisibility Mask, or Trace Enable. In addition, a Trace Enable bit of a microinstruction field in these microinstruction sequences controls recognition of Micro-Break-Point Traps. Micro-Break-Point Traps are thereby requested whenever a microinstruction Trace Trap is requested, but have additional enabling conditions expressed in the microinstructions. Since only recognized Traps are pushed onto RCWS 10358 in a RCW, a Microinstruction Trace Trap and a Micro-Break Point Trap having different request states may be present in RCWS 10358 concurrently Logical Write Trace Traps may be requested when enabled by a bit set in a logical descriptor during a microinstruction sequence submitting a write request to MEM 10112 and using logical descriptors to do so. Logical Write Trace Traps are recognized only if they occur during a state which will be immediately followed by State MR (Memory Reference Trailer). A Logical Write Trace Trap will result in the MEM 10112 write request being aborted. Logical Write Trace Traps may be masked by Trace Masks, Indivisibility Mask, or Trace Trap Enable. A further condition for recognition of a Logical Write Trace Trap is determined by the state of certain bits in a logical descriptor of the memory write request. Logical Write Trace Traps are, in general, not pushed onto RCWS 10358 as part of a RCW since aborted MEM 10112 requests are re-generated so that Logical Write Trace Traps may be repeated.

Logical Read Trace Traps are similar in all respects to the Logical Write Trace Traps, but occur during MEM 10112 read requests. Generation of Logical Read Trace Traps is controlled again in part by certain bits in logical descriptors of MEM 10112 read requests.

In certain implementations of CS 10110, UID Trace Traps may be requested when FU 10120 requests an MEM 10112 read operation based upon a UID address or pointer. UID Read Trace Traps are recognized if requested and there is, in general, no explicit masking of UID Read Trace Traps. Generation of UID Read Trace Traps is controlled by certain bits in MEM 10112 read request logical descriptors. UID Read Trace Trap Requests result in the MEM 10112 read requests being aborted and CS 10110 entering State AB. Handler microinstruction sequences for UID Read Trace Traps will, in general, reset the trapped enable bit in the MEM 10112 read request logical descriptor before re-issuing the MEM 10112 read request.

UID Write Trace Traps are similar to UID Read Trace Traps, and are controlled by bits in the logical descriptor in MEM 10112 write request based upon UID addresses or pointers.

Having described above structure and operation of Trace Trap Events, CS 10110 Interrupt Events will be described next below.

As previously described, Interrupts form the largest class of CS 10110 Events. Interrupts may be regarded as falling into one or more of several classes. First, Memory Reference Repeat Interrupts are those Interrupt Events associated, in general, with read and write requests to MEM 10112 in which a read or write request is submitted to MEM 10112, and an Interrupt Event results. That Interrupt Event is handled, and the MEM 10112 request repeated. Second, Deferred Service Interrupts are those Interrupts wherein CS 10110 defers service of an Interrupt until entry to a new SIN. Fourth, Microinstruction Service Interrupts occur when a currently executing microinstruction requires assistance of an Event Handler microinstruction sequence to be completed. Finally, Asynchronous Interrupt Events may occur at any time and must be serviced before CS 10110 may exit State M0 of the next microinstruction. These Interrupt Events will be described next below in the order named.

A Memory Reference Repeat Interrupt is requested, for example, if a microinstruction executes a command, and a corresponding RCW read from RCWS 10358 indicates that a memory reference was aborted before entrance to the microinstruction sequence from which return was executed. This type of Interrupt Event occurs for all aborted memory references. If an event is honored, that is abort state is entered, for any event and there is a memory reference outstanding, not aborted, the memory reference completes before State AB is exited. No memory Repeat Interrupt Request will be written into the RCW written onto RCWS 10358. Conversely, if a memory reference is aborted, even if the event honored is not that event which aborted the memory reference, a Memory Repeat Interrupt Request will be written into a RCW pushed onto a RCWS 10358.

Figure 246:
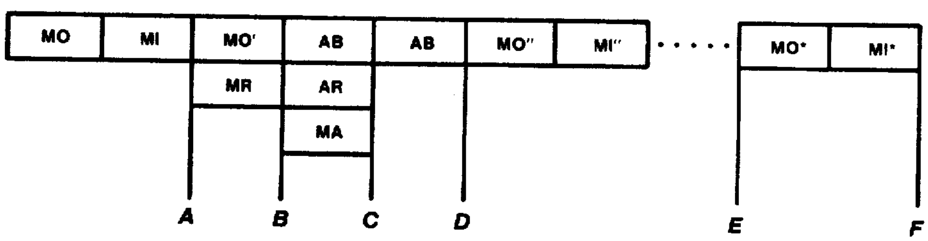
FIG. 246 is a diagram illustrating computer system states of operation for a memory repeat interrupt.

There are two state timing sequences for execution of Memory Repeat Interrupts. In the first case, there are no MEM 10112 references in the mcroinstruction executing a Return Command. In the second case, a microinstruction executing a Return Command executes a return and also makes a MEM 10112 reference. Referring to FIG. 246, a CS 10110 State Timing Diagram for the first case is shown. FIG. 246 is drawn using the same conventions as used in FIGS. 244 and 245. As described above, in the first case a microinstruction executing a Return Command is executed in States M0 and M1 following Time D. An aborted MEM 10112 reference was made in States M0 and M1 preceding Time A. An MEM 10112 Reference Abort Request is made upon CS 10110's entry into State MR following Time A. Since a Memory Repeat Interrupt is requested only from a RCW provided by RCWS 10358, a Memory Repeat Interrupt is indicated only if a microinstruction executes a Return Command resulting in RCWS 10358 providing such an RCW. Therefore, a Memory Repeat Interrupt Request Register of EVENT 20284 is loaded with "not requesting" at this time. At Time B, CS 10110 enters State AB, State AR, and State MA. At this time, a Memory Reference Abort Request is asserted and written into an RCW when State AB is exited just before Time D. At Time D, CS 10110 exits State AR and State MA. As just described, CS 10110 will remain in State B until Time D. At Time D, Memory Reference Abort Request is written into RCWS 10358 as part of an RCW and, as described further below, various RCWS 10358 Stack Pointers are incremented to load that RCW into RCWS 10358. At this time, EVENT 20284's Interrupt Request Register receives "no request" as state of Memory Repeat Interrupt. First microinstruction of Memory Repeat Interrupt Handler microinstruction sequence is provided by FUSITT 11012. At Time E, the last microinstruction of the Memory Repeat Interrupt Handler microinstruction sequence is provided by FUSITT 11012 and a Return Command is decoded. RCWS 10358 Previous Stack Pointer, previously described, is selected to address RCWS 10358 to provide the previously written RCW as output to EVENT 20284's Memory Repeat Interrupt Event Register. At Time F, EVENT 20284's Memory Repeat Interrupt Register is loaded from output of RCWS 10358 and RCWS 10358's Stack Register Pointers are decremented. At this time, Memory Repeat Interrupt Request is made and, as described below, is written into the current Return Control Word, whether honored or not. JP 10114 then repeats the aborted MEM 10112 reference.

In the second case, a State Timing Sequence wherein the microinstruction executing a return also makes a MEM 10112 reference, CS 10110 State Timing is identical up to Time F. At Time F, MEM 10112 Repeat request is not recognized and the state of Memory Repeat Interrupt written into the current Return Control Word is "not requesting" unless a current MEM 10112 reference is aborted. The previous MEM 10112 Repeat Interrupt Request is disregarded as it is assumed that it is no longer required. Thus, there are two ways to avoid, or cancel a Memory Repeat Interrupt Request. First, that portion of a RCW receiving a MEM 10112 Repeat Interrupt Request may be rewritten as "not requesting". Second, an aborted MEM 10112 reference may be made in the same microinstruction that returns from a Handler servicing the aborted MEM 10112 reference.

Certain CS 10110 Events result in aborting a MEM 10112 read or write references and may result in repeat of MEM 10112 references. These events may include:

(1) Logical read and write Traps and, in certain implementations of CS 10110, UID read and write Traps, previously discussed;

(2) A PC 10234 miss;

(3) Detection of a Protection Violation by PC 10234;

(4) A Page Crossing in a MEM 10112 read or write request;

(5) A Long Address Translation, that is an ATU 10228 miss requiring JP 10114 to evaluate a logical descriptor to provide a corresponding physical descriptor;

(6) Detection of a reset dirty bit flag from ATU 10228 upon a MEM 10112 write request as previously described;

(7) An FU 10122 stack overflow;

(8) An FU 10122 Illegal Dispatch;

(9) A Name Trace Trap event as previously described;

(10) A Store Back Exception, as will be described below;

(11) EU 10122 Events resulting in aborting of a Store Back, that is a write request to MEM 10112 from EU 10122;

(12) A read request to a non-accelerated Stack Frame, that is a Stack Frame presently residing in MEM 10112 rather than accelerated to JP 10114 Stack Mechanisms; and,

(13) Conditional Branches in SIN sequences resulting in an outsanding MEM 10112 read reference from PREF 20260; and, Of these Events, Logical Read and Write Traps, UID Read and Write Traps, and Name Trace Traps have been previously described. Other Events listed above will be described next below in further detail.

A PC 10234 Miss Interrupt may be requested upon a logical MEM 10112 reference, that is when a logical descriptor is provided as input to ATU 10228 and a protection state is not encached in PC 10234. PC 10234 will, as previously described, indicate that a corresponding PC 10234 entry is not present by providing a Event Protection Violation (EVENTPVIOL) output to EVENT 20284. PC 10234 will concurrently assert an Abort output (ABORT) to force CS 10110 into State AB and thus abort that MEM 10112 reference.

A Page Crossing MEM 10112 Reference Interrupt is requested if a logical MEM 10112 reference, that is a logical descriptor, specifies an operand residing on two logical pages of MEM 10112. An output of ATU 10228 will abort such MEM 10112 references by asserting an Abort output (ABORT).

A Protection Violation Interrupt is requested if a logical MEM 10112 reference does not possess proper access rights, a mode violation, or if that reference appears to refer to an illegal portion of that object, an extent violation. Again, PC 10234 will indicate occurrence of a Protection Violation Event, which may be disabled by a microinstruction control output of FUSITT 11012.

A Long Address Translation Event may be requested upon a logical MEM 10112 reference for which ATU 10228 does not have an encached entry. ATU 10228 will abort that MEM 10112 reference by asserting outputs ABORT and Long Address Translation Event (EVENTLAT).

A Dirty Bit Reset Event Interrupt may be requested when JP 10114 attempts to write to an MEM 10112 page having an encached entry in ATU 10228 whose dirty bit is not set. ATU 10228 will abort that MEM 10112 write request by asserting outputs ABORT and Write Long Address Translation Event (EVENTWLAT).

An FU 10120 User Stack Overflow Event may be requested if the distance between a Current Frame Pointer and a Bottom Frame Pointer, previously described with reference to CS 10110 Stack Mechanisms, is greater than a given value. As previously described, in CS 10110 this value is eight A User Stack Overflow Event will continue to be requested until either Current Frame Pointer or Bottom Frame Pointer changes value so that the difference limit defined above is no longer violated. A User Stack Overflow Event may be masked by a Trace Mask, an Indivisibility Mask, or by enable outputs of a microinstruction from FUSITT 11012. A Handler microinstruction sequence for User Stack Overflow Events must be executed with one or more of these masks set to prevent recursion of these events. CS 10110 is defined to be running on Monitor Stack (MOS) 10370 when User Stack Overflow Events are masked. User Stack Overflow Events are not loaded into any of EVENT 20284's Event Registers, nor are these events written into a RCW to be written onto RCWS 10358.

Illegal EU 10122 Dispatch Events are requested by EUSDT 20266 if FU 10120 attempts to dispatch, or provide an initial microinstruction sequence address, to EU 10122 to a EUSITT address which is not accessable to a user's program. Illegal EU 10122 Dispatch Events are, in general, not masked. Illegal EU 10122 Dispatch Event Requests are cleared upon CS 10110 exits from State AB. The Handler microinstruction sequence for Illegal EU 10122 Dispatch Events should, in general, reset Illegal EU 10122 Dispatch Event entries in RCWs to prevent recursion of these events.

EU 10122 will indicate a Store Back Exception Event if any one of a number of exceptional conditions arise during arithmetic operations. These events are recognized when CS 10110 enters State SB and are ignored except during Store Back to MEM 10112 of EU 10122 results. These Events may be disabled by microinstruction output of FUSITT 11012 but are, in general, not masked. Store Back Exception Events may be written into RCWs, to be stored in RCWS 10358, and are cleared upon CS 10110's exit from State AB. Again, a Store Back Exception Event Handler microinstruction sequence should reset Store Back Exception Events written into RCWs to prevent recursion of these events.

As described above, the next major class of Interrupt Events are Deferred Service Interrupts. CS 10110 defers service of Deferred Service Interrupts until entry of a new SOP Deferred Service Interrupts which have been recognized will be serviced before completion of execution of the first microinstruction of that new SOP. Deferred Service Interrups include Nonfatal MEM 10112 Errors, Interval Timer Overflows, and Interrupts from IOS 10116. These Interrupts will be described below, in the order named.

A Nonfatal MEM 10112 Interrupt is signaled by MEM 10112 upon occurrence of a correctable (single bit) MEM 10112 error. Nonfatal Memory Error Interrupts are recognized only during State M0 of the first microinstruction of an SOP. MEM 10112 will continue to assert Nonfatal Memory Error Interrupt until JP 10114 issues an acknowledgement to read MEM 10112's Error Log.

An Interval Timer Overflow Interrupt is indicated by TIMERS 20296 when, as described below, an Interval Timer increments to zero, thus indicating lapse of an allowed time limit for execution of an operation. Interval Timer Overflow Interrupts are recognized during State M0 of the first microinstruction of a SOP. TIMERS 20296 will continue to request such interrupts until cleared by a microinstruction output of FUSITT 11012.

IOS 10116 will indicate an IOS 10116 Interrupt to indicate that an inter-processor message from IOS 10116 to JP 10114 is pending. IOS 10116 will continue to assert an IOS 10116 Interrupt Request, which is stored in a register, until cleared by a microinstruction control output of FUSITT 11012. IOS 10116 Interrupts are recognized during State MO of the first microinstruction of an SOP.

The next major class of CS 10110 events are Interrupts due to the requirement by microinstruction sequences to be serviced in order to complete execution. These Interrupts must be serviced before a microinstruction sequence may be completed. Microinstruction Service Interrupts include Illegal SOP Events, Microinstructions Not Present in FUSITT 11012 Events, an attempted parse of a hung INSTB 20262, underflow of an FU 10120 Stack, an NC 10226 Cache Miss, or an EU 10122 Stack Overflow Each of these events will be described below, in the order named.

An Illegal SOP Event is indicated by FUSDT 11010 to indicate that a current SOP Code is a Long Code, that is greater than eight bits, while the current dialect (S-Language) expects only Short Operation Codes, that is eight bit SOPs. An Illegal SOP Interrupt is not detected for unimplemented SOPs within the proper code length range. Illegal SOP Events are, in general, not masked. FUSDT 11010 continues to indicate an Illegal SOP Event until a new SOP is loaded into OPCODEREG 20268. Illegal SOP Events are recognized during the first microinstruction of an SOP, that is during State FM. Should a Handler microinstruction sequence for a higher priority event change contents of OPCODEREG 20268, a previous Illegal SOP Event will be indicated again when the aborted SOP is retried.

Absence of a Microinstruction in FUSITT 11012 is indicated by FUSITT 11012 asserting a Control Store Address Invalid (CSADVALID). This FUSITT 11012 output indicates that that particular microinstruction address points outside of FUSITT 11012's address space. Output of FUSITT 11012 in such event is not determined and parity checking, described below, of microinstruction output is inhibited. The Handler microinstruction sequence for these Events will load FUSITT 11012 address zero with the required microinstruction from MEM 10112, as previously described, and return to the original microinstruction sequence.

An attempted parse of a hung INSTB 20262 is indicated by INSTBWC 24110 when a parse operation is attempted, INSTB 20262 is empty, and PREF 20260 is not currently requesting SINs from MEM 10112. In general, these Events are not masked. If a higher priority Event is serviced, these Events are indicated again when the aborted microinstruction is retried if the original conditions still apply.

An FU 10120 Stack Underflow Event is requested when a current microinstruction references a Previous Stack Frame which is not in an accelerated stack, that is, the Current Stack Pointer equals Bottom Stack Pointer. FU 10120 Underflow Events are, in general, not masked and are requested again on a retry if the microinstruction is aborted and this event has not been serviced.

An NC 10226 Miss Interrupt occurs on a MEM 10112 read or write operation when a load or read of NC 10226 is attempted and there is no valid NC 10226 block corresponding to that Name syllable. An NC 10226 Miss Event does not result in a request for a Name evaluate or resolve. In general, these Events are not masked and result in a request being issued again if the microinstruction resulting in that Event is retried and has not been serviced.

An EU 10122 Stack Overflow Event is requested from EU 10122 to indicate that EU 10122 is currently already servicing at least one level of Interrupt an FU 10122 is requesting another. As will be described in a following description of EU 10122, EU 10122 contains a one level deep stack for handling of Interrupts. EU 10122 Stack Overflow Events are enabled during State NW. All previously pending events will have been serviced before EU 10122 Stack Overflow Event requests are recognized. These Events will be serviced immediately upon entry into a following State M0, being the highest priority interrupt event. EU 10122 Stack Overflow Events may, in general, not be masked and once recognized are the next honored event.

Finally, the third major class of CS 10110 Interrupt Events are Asychronous Events. Asynchronous Events must, in general, be serviced before exiting State M0 of a microinstruction after they are recognized. Asychronous Events include Fatal Memory Error Events, AC Power Failure Events, Egg Timer Overflow Events, and EU 10122 Stack Underflow Events. CS 10110 Egg Timer is a part of TIMERS 20296 and will be discussed as part of TIMERS 20296. These events will be described below, in the order referred to.

Fatal MEM 10112 Error Events are requested by MEM 10112 by assertion of control signal output PMODI, previously described, when last data read from MEM 10112 contains a noncorrectable error. Fatal MEM 10112 Error Events are recognized on first State M0 after occurrence. Fatal MEM 10112 Error Events are stored in an EVENT 20284 Event Register and are cleared upon entry into its service microinstruction sequence. In general, Fatal MEM 10112 Error Events may not be masked.

AC Power Failure Events are indicated by DP 10118 by assertion of output signal ACFAAIL when DP 10118 detects a failure of power to CS 10110. Recognition of AC Power lailure Events is disabled upon entry to AC Power Failure Event Handler microinstruction sequence. No further AC Power Failure Events will be recognized until DP 10118 reinitiates JP 10114 operation.

As will be described further below, FUCTL 20214's Egg Timer is a part of TIMERS 20296. Egg Timer Overflow Events are indicated by TIMERS 20296 whenever TIMERS 20296's Egg Timer indicates overflow of Egg Timer Counter. Egg Timer Overflow Events may be masked as described in a following description.

Finally, EU 10122 Stack Underflow Events are signaled by EU 10122 when directed to read a word from EU 10122 Stack Mechanism and there is no accelerated stack frame present. EU 10122 will continue to assert this Event Interrupt until acknowledged by JP 10114 by initiation of a Handler microinstruction sequence.

The above descriptions of CS 10110 events have stated that recognition of certain of those Events may be masked, that is inhibited to allow recognition of other Events having higher priority. Certain of these masking operations were briefly described in the above descriptions and will be described in further detail next below. In general, recognition of Events may be masked in five ways, four of which are properly designated as masks. These four masks are generated by microinstruction control from FUSITT 11012 and include Asychronous Masks for, in general, Asychronous Events. Monitor Masks are utilized for those CS 10110 operations being performed on Monitor Stack (MOS) 10370, as previously described with reference to CS 10110 Stack Mechanisms. Trace Mask is utilized with reference to Trace Trap Events. Indivisible Mask is generated or provided by FUSITT 11012 as an integral or indivisible part of certain microinstructions and allow recognition of certain selected events during certain single microinstructions. Certain other Events, for example Logical Read and Write Traps and UID Read and Write Traps, are recognized or masked by flag bits in logical descriptors associated with those operations. Finally, certain microinstructions result in FUSITT 11012 providing microinstruction control outputs enabling or inhibiting recognition of certain events, but differ from Indivisible Masks in not being associated with single particular microinstructions.

Referring to FIG. 247, the relative priority level and applicable masks of certain CS 10110 Events are depicted therein in three vertical columns. Information regarding priority and masking of particular Events is shown in horizontal entries, each comprising an entry in each of these three vertical columns. Left hand column, titled Priority Level, states relative priority of each Event entry. Second column, titled EVENT, specifies which Event is referred to in that table entry. A particular Event will yield priority to all higher priority Events and will take presidence over all lower priority Events. FIG. 247's third column, titled Masked By, specifies for each entry which masks may be used to mask the corresponding Event. A indicates use of Asychronous Masks, M use of Monitor Mask, T use of Trace Trap Mask, and I represents that Indivisible Mask may be used. DES indicates that an Event is enabled or masked by flag bits of logical descriptors, while MCWD indicates that a particular Event may be masked by microinstruction control signal outputs provided by FUSITT 11012. NONE indicates that a particular Event may, in general, not be masked.

The final major class of CS 10110 event was described above as Machine Check Events. In general, if any of these Events are detected by logic gating in EVENT 20284, EVENT 20284 will provide a Check Machine signal to DP 10118. DP 10118 will then stop operation of JP 10114 and Machine Check Event Handler microinstruction sequences will be initiated. Among these Machine Check Events are wherein FU 10120 is attemting to store back an EU 10122 result to MEM 10112 and EU 10122 signals a parity error in EU 10122's Control Store. These events are stored in EVENT 20284 Event Registers and recogized when FU 10120 enters State AB. EU 10122 will have previously ceased operation until a corrective microinstruction sequence may be initiated. The same Event will occur if FU 10120 attempts to use an EU 10122 arithmetic operation result or test operation result having a parity error in EU 10122's Control Store. Should MOS 10370 overflow or underflow, this event will be detected, FU 10120 operations stopped, and corrective microinstruction sequences initiated. MOS 10370 overflow or underflow occurs whenever a previous MOS 10370 Stack Frame is referenced, whenever MOS 10370 Stack Pointer equals MOS 10370 Bottom Stack Pointer, or the difference between MOS 10370 Current and Bottom Stack Pointers is greater than sixteen. Underflows result in a transfer of operation to MIS 10368, while overflows are handled by DP 10118 Finally, a Machine Check Event will be requested when a parity error is detected in a microinstruction currently being provided by FUSITT 11012 during State M0 of that microinstruction.

Having described general operation of EVENT 20284, the structure and operation of EVENT 20284 will be described briefly next below.

Figure 248:
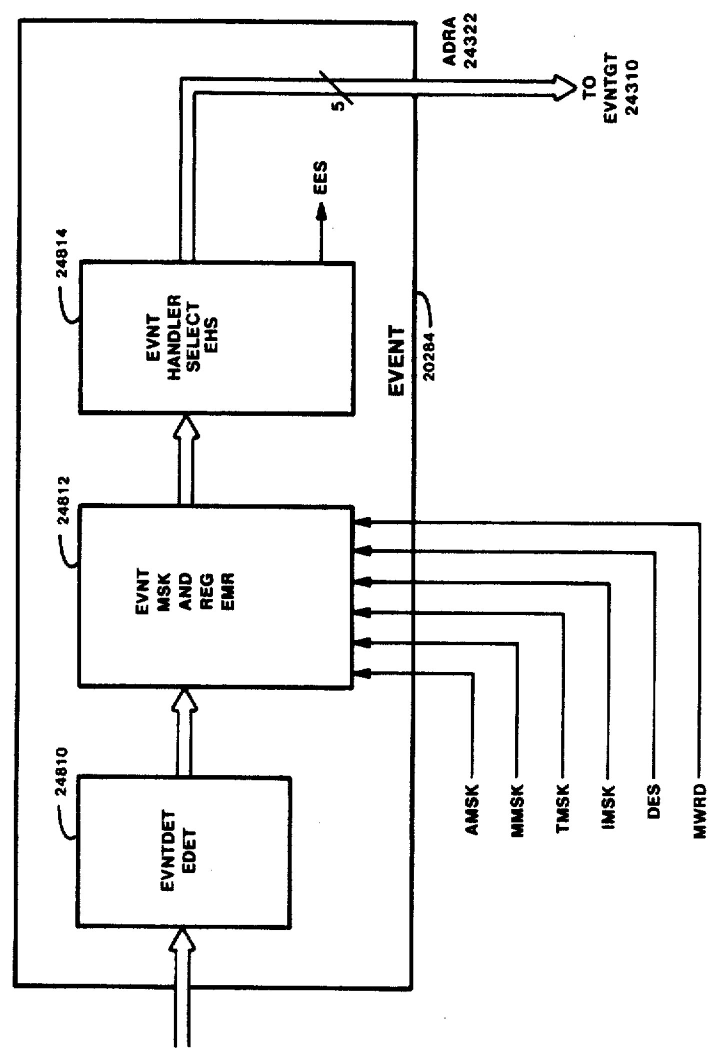
FIG. 248 is a detailed block diagram of event logic.

Referring to FIG. 248, a partial block diagram of EVENT 20284 is shown. EVENT 20284 includes Event Detector (EDET) 24810, Event Mask and Register Circuitry (EMR) 24812, and Event Handler Selection Logic (EHS) 24814. EDET 24810 is comprised of random logic gating and, as previously described, receives inputs representing event conditions from other portions of CS 10110's circuitry. EDET 24810 detects occurrences of CS 10110 operating conditions indicating that Events have occurred and provides outputs to EMR 24812 indicating what Events are requested.

EMR 24812 includes a set of registers, for example SN74S194s, comprising EVENT 20284's Event Registers. These registers are enabled by mask inputs, described momentarily, to enable masking of those Events which are latched in EVENT 20284's Event Registers. Certain Events, as previously described, are not latched and logic gating having mask enable inputs is provided to enable masking of those events which are not latched. EMR 24812 mask inputs are Asychronous, Monitor, Trace Trap, and Indivisible Masks, respectively AMSK, MMSK, TMSK, and ISMK, provided from FUSITT 11012. Mask inputs derived from FUSITT 11012 microinstruction outputs (mWRD) are provided from microinstruction control outputs of FUSITT 11012. EMR 24812 provides outputs representing mask and unmask events which have been requested to EHS 24814.

EHS 24814 is comprised of loic gating detecting which of EHS 24814's unmasked Event Requests is of highest priority. EHS 24814 selects the highest priority unmasked Event Request input and provides a corresponding Event Handler microinstruction address to EVNTGT 24310 through ADRA Bus 24322. These address outputs of EHS 24814 are five bit addresses selecting the initial microinstruction of the Event Handler microinstruction sequence of the current highest priority unmasked Event. As previously described with reference to NASMUX 24312, certain inputs of ENTGT 24310 are hard-wired to provide a full fifteen bit address output from EVNTGT 24310. EVENT 20284 also provides, from EHS 24814, an Event Enable Select (EES) output to SITTNAS 20286 to enable EVNTGT 24310 to provide microinstruction addresses to CSADR Bus 20204 when EVENT 20284 must provide a microinstruction address for handling of a current Event.

Having described the structure and operation of FUCTL 20214's circuitry providing microinstruction addresses to FUSITT 11012, FUSITT 11012 will be described next below c.c.c. Fetch Unit S-Interpreter Table 11012 (FIG. 249)

Figure 249:
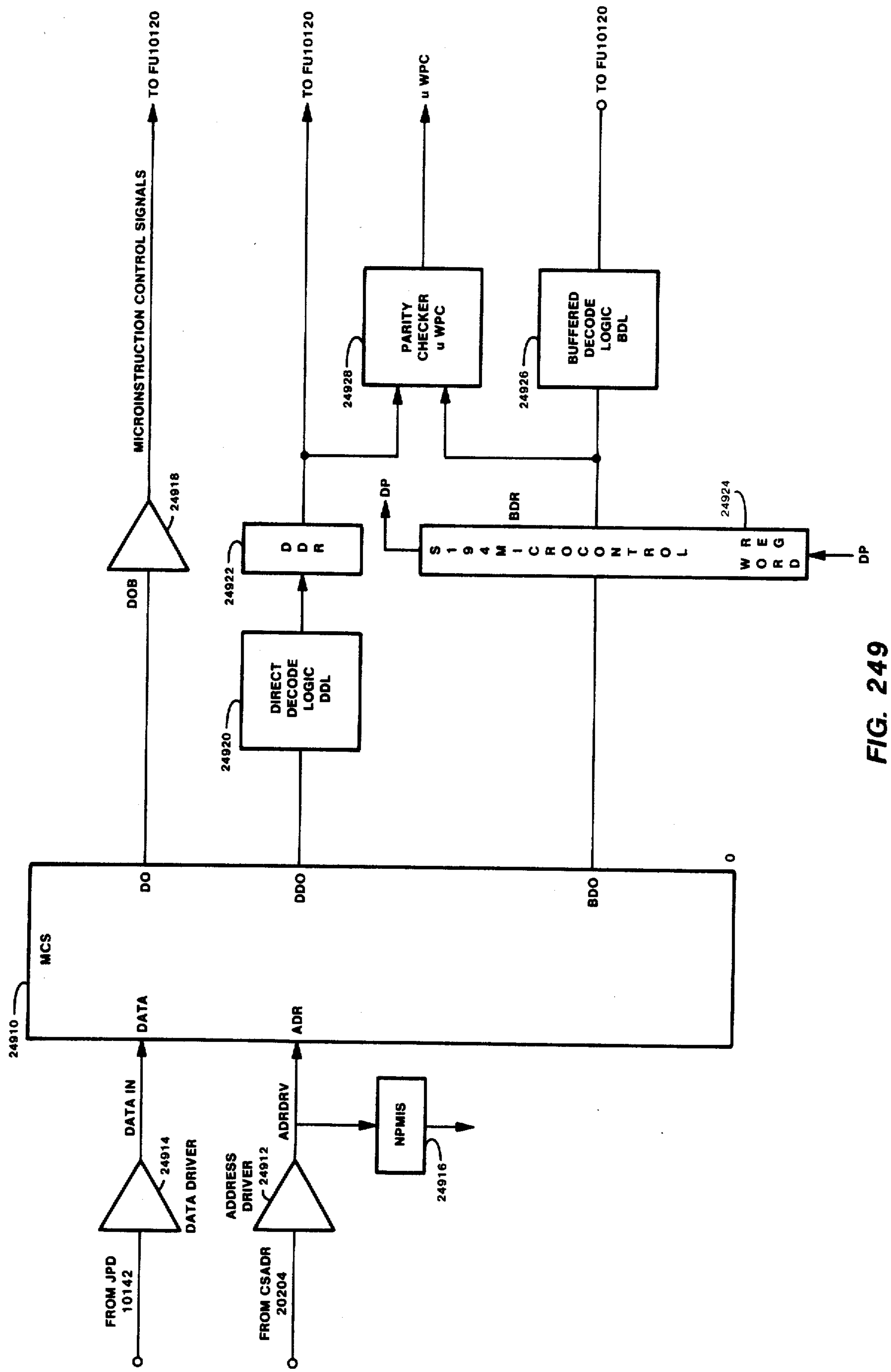
FIG. 249 is a detailed block diagram of microinstruction control store logic.

Referring to FIG. 249, a partial block diagram of FUSITT 11012 is shown. Address (ADR) and Data (DATA) inputs of Micro-Instruction Control Store (mCS) 24910 are connected, respectively, from CSADR Bus 20204 through Address Driver (ADRDRV) 24912 and from JPD Bus 10142 through Data Driver (DDRV) 24194. mCS 24910 comprises a memory for storing sequences of microinstructions currently being utilized by CS 10110. mCS 24910 is an 8K (8192) word by 80 bit wide memory. That is, mCS 24910 may contain, for example, up to, 8192 80 bit wide microinstructions. Microinstructions to be written into mCS 24910 are provided, as previously described, to mCS 24910 DATA input from JPD Bus 10142 through DDRV 24914. Addresses of microinstructions to be written into or read from mCS 24910 are provided to mCS 24910 ADR input from CSADR Bus 20204 through ADRDRV 24912. ADRDRV 24912 and DDRV 24914 are buffer drivers comprised, for example, of SN74S240s and SN74S244s.

Also connected from output of ADRDRV 24912 is input of Nonpresent Micro-Instruction Logic (NPmIS) 24916. NPmIS 24916 is comprised of logic gating monitoring read addresses provided to mCS 24910. When a microinstruction read address present on CSADR Bus 20204 refers to an address location not within mCS 24910's address space, that is of a non-present microinstruction, NPmIS 24916 generates an Event Request output indicating this occurrence. As previously described FUCTL 20214 will then call, and execute, microinstructions so addressed from MEM 10112.

As indicated in FIG. 249, mCS 24910 provides three sets of outputs. These outputs are Direct Output (DO), Direct Decoded Output (DDO), and Buffered Decode Output (BDO). In general, control information within a particular microstruction word is used on next clock cycle after the address of that particular microinstruction word has been provided to mCS 24910 ADR input. That is, during a first clock cycle a microinstruction's address is provided to mCS 24910 ADR input. That selected microinstruction appears upon mCS 24910's DO, DDO, BDO outputs during that clock cycle and are used, after decoding, during next clock cycle. Outputs DO, DDO, BDO differ in delay time before decoded microinstruction outputs are available for use.

mCS 24910 DO output provides certain bits of microinstruction words directly to particular destinations, or users, through Direct Output Buffer (DOB) 24918. These microinstructions bits are latched and decoded at their destinations as required. DOB 24918 may be comprised, for example, of SN74S04s.

mCS 24910's DDO output provides decoded microinstruction control outputs for functions requiring the presence of fully decoded control signals at the start of the clock cycle in which those decoded control signals are utilized. As shown in FIG. 249, mCS 24910's DDO output is connected to input of Direct Decode Logic (DDL) 24920. DDL 24920 is comprised of logic gating for decoding certain microinstruction word bits during same clock cycle in which those bits are provided by mCS 24910's DDO. These microinstruction bits are provided, as described above, during the same clock cycle in which a corresponding address is provided to mCS 24910's ADR input During this clock cycle, DDL 24920 decodes mCS 24910's DDO microinstruction bits to provide fully decoded outputs by end of this clock cycle. Outputs of DDL 24920 are connected to inputs of Direct Decode Register (DDR) 24922. DDR 24922 is a register comprised, for example, of SN74S374s. DDL 24920's fully decoded outputs are loaded into DDR 24922 at the end of the clock cycle during which, as just described, an address is provided to mCS 24910's ADR input and mCS 24910's corresponding DDO output is decoded by DDL 24920. Fully decoded microinstruction control outputs corresponding to mCS 24910's DDO outputs are thereby available at start of the second clock cycle. Microinstruction control outputs of DDR 24922 are thereby available to FU 10120 at start of the second clock cycle for those FU 10120 operations requiring immediate, that is undelayed, microinstruction control signal outputs from FUSITT 11012.

Finally, mCS 24910's BDO is provided for those FU 10120 operations not requiring microinstruction control signals immediately at the start of the second clock cycle. As shown in FIG. 249, mCS 24910's BDO is connected to inputs of Buffered Decode Register (BDR) 24924. Microinstruction word output bits from mCS 24910's BDO are provided to inputs of BDR 24924 during the clock cycle in which a corresponding address is provided to mCS 24910's ADR input. mCS 24910's BDO outputs are loaded into BDR 24924 at end of this clock cycle. BDR 24924's outputs are connected to inputs of Buffered Decode Logic (BDL) 24926. BDL 24926 is comprised of logic gating for decoding outputs of BDR 24924. BDL 24926 thereby provides decoded microinstruction control outputs to FU 10120 at some delayed time after start of the second clock cycle. Microinstruction control outputs from BDL 24926 are thereby delayed in time from the appearance of microinstruction control outputs of DDR 24922 but, as BDR 24924 stores microinstruction word bits rather than decoded microinstruction word bits, BDR 24924 is required to store proportionately fewer bits than DDR 24922.

Finally, as shown in FIG. 249 outputs of DDR 24922 and BDR 24924, are connected to inputs of Microinstruction Word Parity Checker (mWPC) 24928. mWPC 24928 is comprised of logic gating for checking parity of outputs of DDR 24922 and BDR 24924. A failure in parity of either output of DDR 24922 and BDR 24924 indicates a possible error in microinstruction output from mCS 24910. When such an error is detected by mWPC 24928, mWPC 24928 generates a corresponding Microinstruction Word Parity Error (mWPE).

d.d.d. Microinstruction Word Formats (FIG. 250)

Figure 250:
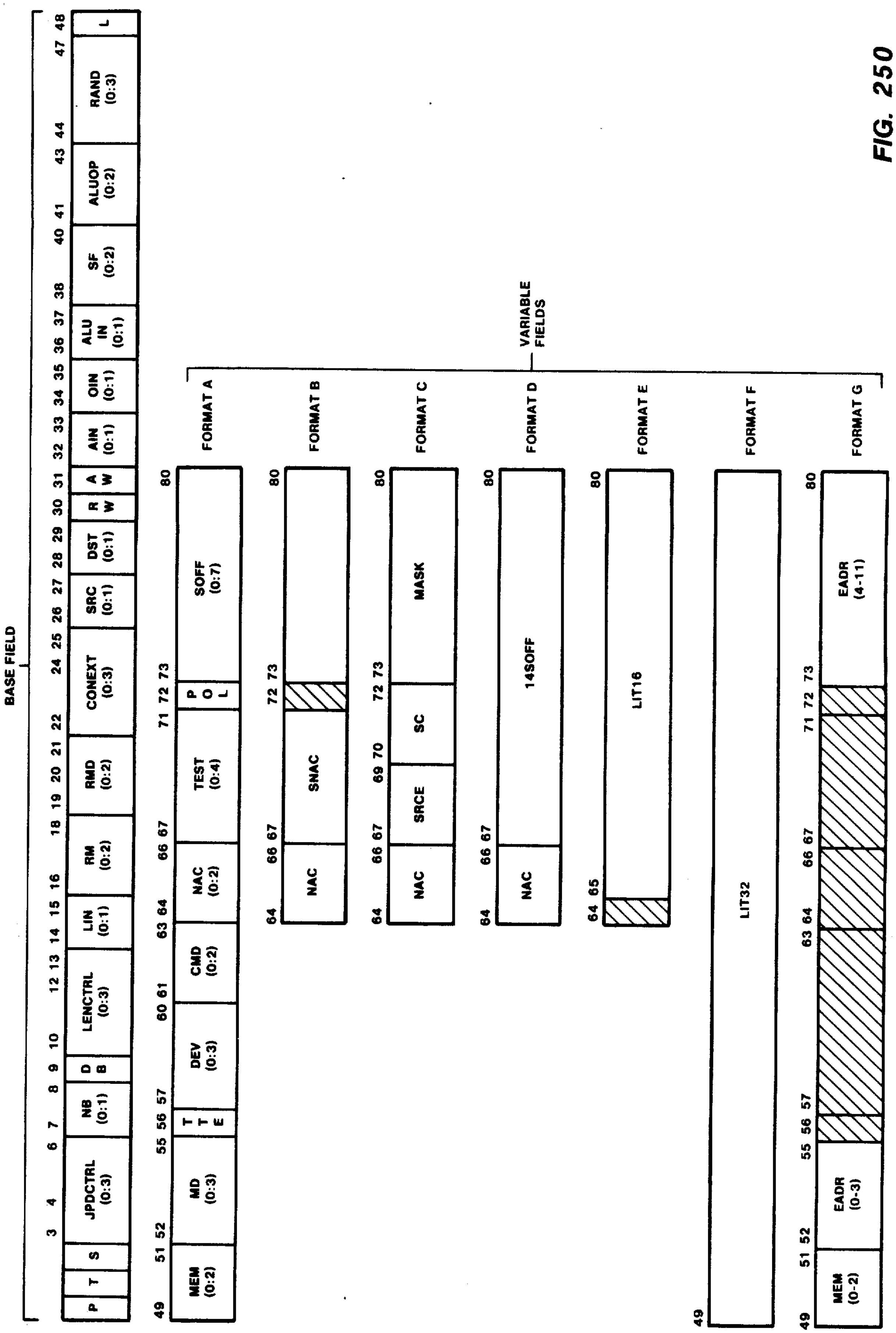
FIG. 250 is a diagram illustrating microinstruction formats.

Referring to FIG. 250, diagramic representation of FUSITT 11012's microinstruction word formats is shown. Each microinstruction word is comprised of 81 bits of information, which may be arranged in any of seven different formats, referred to as Formats A through G in FIG. 250. Bits 0 to 48 inclusive of each microinstruction word are referred to as Microinstruction Word Base Field and are arranged in the same manner in all seven microinstruction word formats Bits 49 to 80 comprise Microinstruction Word Variable Field and, in general, are arranged differently in each of the seven microinstruction word formats Within Microinstruction Word Variable Field, bits 49 to 63 inclusive are arranged in the same manner in Formats A, B, C, D, and E, and arranged differently in Formats F and G. Each of these seven formats is shown in FIG. 250 and will be described next below. As has been previously described, bits are numbered from the most significant bit, as bit 0, to the least significant bit, being the highest numbered bit. In FIG. 250, any unused bits in a particular format are indicated by cross hatch shading.

Referring first to Microinstruction Word Base Field, base field is comprised of bits 0 to 48 of each microinstruction word and is comprised of a number of subfields. Bits 0 and 1 are referred to as Parity (P) and Timing (T) fields. P field is a parity bit for the entire 81 bit microinstruction word. T field is utilized to indicate those microinstructions which require more than one system clock cycle for State M0. When T field is asserted, this bit is decoded to indicate that JP 10114 should remain in State M0. Bit 2 is a Spare (S) bit and is reserved for future use.

Bits 3 to 6 inclusive comprise JPD Bus 10142 control field and select a particular source, for example, output of OFFALU 20242, to be source for transferring data onto JPD Bus 10142. Bits 7 and 8 comprise NAME Bus 20224 control (NB) field and select a particular source, for example, output of OFFALU 20242, to be source for writing data onto NAME Bus 20224. Bit 9 comprises a logical Descriptor Bus Source Selection Control (DB) field for selecting a source of data to be written onto LENGTH Bus 20226, OFFSET Bus 20228, and AON Bus 20230.

Bits 10 through 13 inclusive comprise Length Control (LENCTRL) field for controlling operation of LENP 20220. In particular, LENCTRL field controls operation of BIASLOGIC 20246. Bits 14 and 15 comprise Length Input Control (LIN) field for controlling operation of LENSEL 20250.

Bits 16 to 31 inclusive comprise fields for addressing of GRF 10354. Bits 16 to 18 inclusive comprise a Source Register Select (RS) field for selecting a particular register within a given frame of SR's 10362 as a source of data. Bits 19 to 21 inclusive comprise a Destination Register Select (RD) field for selecting a particular register within a given frame of SR's 10362 as a destination register to receive data. Bits 22 to 25 inclusive comprise a Common Area address (CONEXT) field for selecting a particular register in a given frame of GR's 10360, that is, the common area of GRF 10354, as a source or destination register for data. Bits 26 and 27 comprise a Source Frame (SRC) field for selecting a particular frame in GRs 10360 or SRs 10362 as a data source. Bits 28 and 29 comprise a Destination Frame Select (DST) field for selecting a particular frame in GRs 10360 or SRs 10362 as a data destination frame. Fields SRC and DST are used together with fields RS, RD, and CONEXT to address particular data source and data destination registers within the frames of GRs 10360 and SRs 10362. Bit 30 comprises a Write Enable Control Bit (RW) field for GRF 10354, enabling GRF 10354 for writing of data into GRF 10354.

Bits 31 to 43 inclusive are used, in particular for control of DESP 20210. Bit 31 comprises a Write Enable Control (AW) field for OFFMUXR 23812, for writing of data of into OFFMUXR 23812. Bits 32 and 33 comprise an AONGRF Input Select (AIN) field for controlling AONSEL 20248, that is, for selecting data inputs to AONGRF 20232. Bits 34 and 35 comprise an OFFGRF 20234 Input Select (OIN) field for controlling OFFSEL 20238, to select a data input to OFFGRF 20234. Bits 36 and 37 comprise an OFFALU 20242 Input Select (ALUIN) field for controlling OFFALUSA 20244, for selecting data inputs to OFFALU 20242 through OFFALUSA 20244. Bits 38 to 40 inclusive comprise a Scale Factor Control (SF) field for controlling operation of OFFSCALE 23818, previously described Bits 41 to 43 inclusive comprise an ALU Operation Control (ALUOP) field for controlling operation of OFFALU 20242.

Bits 44 to 47 inclusive comprise a Random Control (RAND) field which is used for general control of DESP 20210 operations. Bit 48 comprises a Literal Size (L) field which is used in conjunction with Microinstruction Word Variable fields of Formats E and F to specify size of literal fields within the variable fields of Formats E and F. As will be described below, these literal fields may contain either 16 or 31 bits of information.

Referring now to Microinstruction Word Variable Fields, as described above any one of seven possible Microinstruction Variable Fields may be concatenated with the Microinstruction Word Base Field to comprise a complete 81 bit microinstruction word. These variable fields each comprise bits 49 to 80, inclusive, of a microinstruction word and trailer particular microinstruction words for particular functions. As shown in FIG. 250, bits 49 to 63 inclusive of Microinstruction Word Variable Field are comprised of sub-fields which are common to Formats A, B, C, D, and E while bits 64 to 66 inclusive comprise a sub-field common to Formats A, B, C, and D. Formats E and F are similar in that each contains a literal field, that is a field containing a numeric value rather than a specific set of control bits. Format E contains a 16 bit literal field, bits 65 to 80 inclusive, while Format F contains a 32 bit literal field, bits 49 to 80 inclusive. Format G, as described below, is unique from Formats A to F and is utilized in particular with respect to control of EU 10122.

Referring to bits 49 to 63 inclusive of Microinstruction Word Variable Field, as stated above these bits comprise sub-fields common to Formats A through E. Bits 49 to 51 inclusive comprise a Memory Control (MEM) field for commanding specific operations by MEM 10112. Bits 52 to 55 inclusive comprise a Memory Destination (MD) field specifying JP 10114 destination for data read from MEM 10112. MD field is used in conjunction with MEM field in certain MEM 10112 operations, for example read requests for reading data from MEM 10112 to JP 10114.

Bit 56 is a Break Point Branch request bit, as previously described.

Bits 57 to 63 inclusive comprise a Device Command (DEVCMD) field used, in general, for control of FU 10120 operation. For example, DEVCMD field is used to control PC 10234, MEM 10112, ATC 10228, NC 10226, and INSTB 20262 operations.

Having described sub-fields of Bits 49 to 63 inclusive of Microinstruction Word Variable Field, Bits 64 to 80 inclusive of Microinstruction Word Variable Field for Formats A, B, C, D, and E will be described next below.

Bits 64 to 66 inclusive of Microinstruction Word Variable Field comprise a sub-field, as stated above, to Formats A, B, C, and D. Bits 64 to 66 comprise a Next Microinstruction Word Address Control (NAC) field. NAC field selects next source of microinstruction address to FUSITT 11012 by, in part, controlling operation of SITTNAS 20286. In particular, NAC field may select FUDISF 24218 and FUDISENC 24219, or AF 24220, or RCWS 10358, or mPC 20276, or BRCASE 20278, or EVENT 20284, or JAM input from NC 10226.

Referring now solely to Format A, Bits 67 to 71 inclusive comprise a Test Condition (TEST) field. TEST field contains certain bits specifying what conditions of CS 10110 operation will result in setting of, as true or false, as previously described and will be described in a following description of MCW1 20290, MCW0 20292, and RCWS 10358. Bit 72 is associated with TEST field and specifies whether a given test defined by Bits 67 to 71 is for a true or false condition of the condition tested for.

Bits 73 to 80 inclusive of Format A Microinstruction Word Variable Field comprise an eight bit Literal Select Offset (SOFF) field utilized in microinstruction Branch Operations. SOFF field may be provided as BLIT input of BRCASE 20278. As described above, BLIT specifies microinstruction Branch Operations by determining a microinstruction address offset relative to address of a currently executing microinstruction.

Referring to microinstruction word Format B, as described above Bits 64 to 66 inclusive comprise NAC subfield of Microinstruction Word Variable Field. Bits 67 to 71 inclusive comprise a Secondary Next Address Control (SNAC) subfield used in conjunction with NAC subfield. NAC subfield may specify, as described above, AF 24220 or FUDISF 24218 as source of next microinstruction address. SNAC field may then specify an SDP, or Address of an initial microinstruction sequence, within AF 24220 or FUDISF 24218. SNAC subfield thereby, in conjunction with NAC subfield, allows resolve and evaluate addressing of AF 24220 and FUDISF 24218.

As indicated in FIG. 250, Bit 72 is not utilized in Format B.

Bits 73 to 80 inclusive of Format B are utilized, as in Format A as an eight bit literal SOFF field for control of microinstruction Branch Operations.

Referring to Bits 64 to 80 of Format C, Bits 64 to 66 inclusive comprise, as described above, an NAC subfield. Bits 67 to 80 comprise subfields for control of microinstruction Case Operations as previously described with reference to BRCASE 20278. Bits 67 to 69 inclusive comprise a Source of Case Value (SRCE) subfield specifying source of case value input to CASEMS 24346 of BRCASE 20278. Bits 72 to 72 inclusive comprise a Shift Case Value (SC) subfield controlling shift operation of CASEMS 24346. Bits 73 to 80 inclusive comprise a Mask (MASK) subfield controlling mask operations of CASEMS 24346. Bits 67 to 80 inclusive of Format C thereby completely define and control microinstruction Case Operations.

Referring to Format B, again Bits 64 to 66 inclusive comprise an NAC subfield. Bits 67 to 80 inclusive comprise a 14 bit Literal Select Offset (14SOFF) field used, as in SOFF subfields of Formats A and B, to control microinstruction Branch Operations. 14SOFF subfield is used in Format B to specify branch microinstruction addresses relative to microinstruction address of a currently executing microinstruction for Long Microinstruction Branches. 14SOFF subfield may be used as BLIT input to BRCASE 20278.

Referring to Formats E & F, Formats E and F comprise microinstruction word formats providing literal fields. As previously described, Bits 49 to 63 inclusive of Format E include the same subfields as in Formats A, B, C, and D. Bit 64 of Format E is not used and Bits 65 to 80 inclusive are utilized as a 16 bit Literal (LIT16) field. In Format F, Bits 49 to 63 do not contain subfields, and Bits 49 to 80 inclusive of Format F are utilized as a 32 bit Literal (LIT32) field.

Referring finally to Format G, as described above Format G is unique from Formats A through F and is used primarily in conjunction with EU 10122 operations. In particular, Format G, which utilizes the same Base Field as Formats A through F, utilizes Variable Field to allow direct addressing of EUSITT in EU 10122. Bits 49 to 51 inclusive of Format G Variable Field is similar to Bits 49 to 51 inclusive of Formats A to E Variable Field and comprising an MEM subfield for control of MEM 10112 operations. Bits 52 to 55 inclusive and Bits 73 to 80 inclusive of Format G Variable Field together comprise a 12 bit EU 10122 EUSITT Address (EADR) subfield allowing direct addressing of EU 10122's EUSITT. Bits 52 to 55 contain the four most significant address bits of EADR field while Bits 73 to 80 include the eight least significant bits of EADR subfield address. Bits 56 to 72 inclusive of Format G Variable Field are, as indicated in FIG. 250, not utilized in a present embodiment of CS 10110.

Formats A through F are recognized and distinguished from one another by interpretation of certain fields therein. For example, presence of an NAC subfield is recognized by FUCTL 20214, as indicating that either Format A, B, C, or D is being utilized. Certain bits within NAC sub-field of these formats are then interpreted to determine which of Formats A through D is currently present. Absence of an NAC sub-field indicates that Formats E, F, or G are present. Formats E and F are distinguished by L subfield of Microinstruction Word Base Field, that is L subfield indicates whether a 16 or 32 bit literal field is present. Format G is distinguished by being utilized only in conjunction with certain other microinstructions pertaining to EU 10122 and which indicate that a Format G microinstruction word will appear. In summary, microinstruction word Formats A through G, by concatenating a Base Field and a Variable Field, thereby provide a range of microinstruction word formats for efficiently providing microinstruction control of CS 10110.

Having described structure and operation of FUCTL 20214 with regard to microinstruction control of CS 10110, both with regard to interpretation of SINs and Name syllables, and with regard to certain of CS 10110's internal mechanisms, such as EVENT 20284, certain other FUCTL 20214 operations regarding CS 10110's internal mechanisms will be described next below. These other portions of FUCTL 20214 will include certain aspects of RCWS 10358, MCW1 20290 and MCW0 20292, REG 20288, TIMERS 20296, and FUINT 20298.

d.d. CS 10110 Internal Mechanism Control

Associated with SR's 10362, the stack mechanism area of GRF 10354, are two CS 10110 control structures primarily associated with operation of CS 10110's internal mechanisms. A first of these referred to as Machine Control Block, describes current execution environment of JP 10114 microprograms, that is, JP 10114 microinstruction sequences. Machine Control Block is comprised of two information words residing in MCW1 20290 and MCW0 20292. These Machine Control Words contain all control state information necessary to execute JP 10114's current microprogram. Second control structure is a portion of RCWS 10358, which as previously described parallels the structure of SR's 10362. Each register frame on MIS 10368 or MOS 10370 has, with exception of Top (Current) Register Frame, associated with it a Return Control Word (RCW) residing in RCWS 10358. RCWs are created when MIS 10362 or MOS 10370 register frames are pushed, that is moved onto MIS 10368 or MOS 10370 due to creation of a new Current Register Frame. A current RCW does not exist in a present embodiment of CS 10110.

RCWS 10358 will be described first next below, followed by Machine Control Block.

a.a.a. Return Control Word Stack 10358 (FIG. 251)

Figure 251:
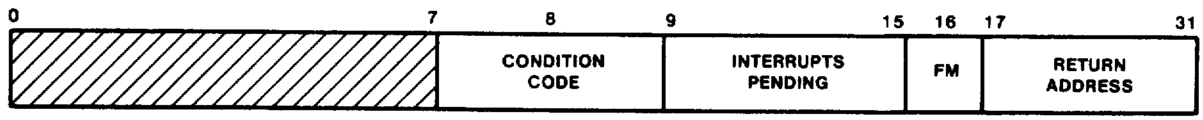
FIG. 251 is a diagram illustrating a return control word stack word.

Referring to FIG. 251, a diagramic representation of a RCWS 10358 RCW is shown. As previously described, RCWS 10358 RCWs contain information necessary to reinitiate or continue execution of a microinstruction sequence if execution of that sequence has been discontinued. Execution of a microinstruction sequence may be discontinued due to a requirement to service a CS 10110 Event, as described above, or if that microinstruction sequence has called for execution of another microinstruction sequence, as in a Branch or Case Operation.

As shown in FIG. 251, each RCW may contain, for example, 32 bits of information. RCW Bits 16 to 31 inclusive are primarily concerned with storing current microinstruction address of microinstruction sequences which have been discontinued, as described above. Bits 17 to 31 inclusive contain microinstruction sequence return address. Return address is, as previously described, address of the microinstruction currently being executed of a microinstruction sequence whose execution has been discontinued. When JP 10114 returns from servicing of an Event or execution of a called microinstruction sequence, return address is provided from RCWS 10358 to SITTNAS 20286 and through CSADR Bus 20204 to FUSITT 11012 as next microinstruction address to resume execution of that microinstruction sequence. Bit 16 of an RCW contains a state bit indicating whether the particular microinstruction referred to by return address field is the first microistruction of a particular SOP. That is, Bit 16 of an RCW stores CS 10110 State FM.

Bits 8 to 15 inclusive of an RCW contain information pertaining to current condition code of JP 10114 and to pending Interrupt Requests. In particular, Bit 8 contains a condition code bit which, as previously described indicates whether a particular test condition has been met. RCW Bit 8 is thereby, as previously described, a means by which JP 10114 may pass results of a particular test from one microinstruction sequence to another Bits 9 to 15 inclusive of an RCW contain information regarding currently pending Interrupts. These Interrupts have been previously discussed, in general, with reference to EVENT 20284. In particular, RCW Bit 9 contains pending state of Illegal EU 10122 Dispatch Interrupt Requests; RCW Bit 10 contains pending state of Name Trace Trap Request; RCW Bit 11 contains pending state of Store Back Interrupt Request; RCW Bit 12 contains pending state of Memory Repeat Interrupt Request; RCW Bit 13 contains pending state of SOP Trace Trap Request; RCW Bit 14 contains pending state of Microtrace Trap Request; and, RCW Bit 15 contains pending state of Micro-Break Point Trap Request. Interrupt Handling microinstruction sequence which require use of CS 10110 mechanisms containing information regarding pending Interrupts must, in general, save and store that information. This save and restore operation is accomplished by use of Bits 9 to 15 of RCWS 10358's RCWs. Upon entry to an Interrupt Handling microinstruction sequence, these bit flags are set to indicate Interrupts which were outstanding at time of entry to that microinstruction sequence. Because these bits are used to initiate Interrupt Request upon returns, pending Interrupts may be cancelled by resetting appropriate bits of Bits 9 to 15 upon return. This capability may be used to implement Microinstruction Trace Traps, previously described.

As indicated in FIG. 251, RCW Bits 0 to 7 are not utilized in a present embodiment of CS 10110. RCW bits 0 to 7 are not implemented in a present embodiment of CS 10110 but are reserved for future use.

As previously described, RCWs may be writtten into or read from RCWS 10358 from JPD Bus 10142. This allows contents of RCWS 10358 to be initially written as desired, or read from RCWS 10358 to MEM 10112 and subsequently restored as required for swapping of processes in CS 10110.

b.b.b. Machine Control Block (FIG. 252)

As described above, FUCTL 20214's Machine Control Block is comprised of a Machine Control Word 1 (MCW1) and a Machine Control Word 0 (MCW0). MCW1 and MCW0 reside, respectively, in Registers MCW1 20290 and MCW0 20292. MCW1 and MCW0 described the current execution environment of FUCTL 20214's current microprogram, that is the microinstruction sequence currently being executed by JP 10114.

Figure 252:
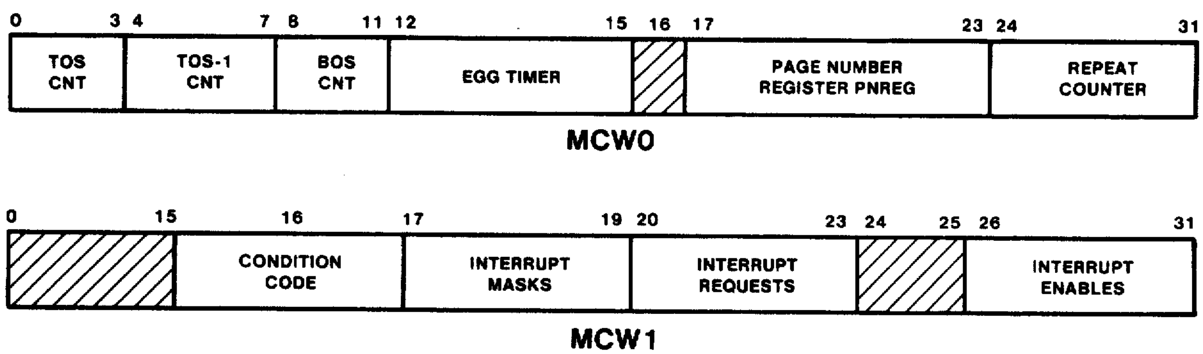
FIG. 252 is a diagram illustrating machine control words.

Referring to FIG. 252, diagramic representations of MCW0 and MCW1 are shown. As indicated therein, MCW0 and MCW1 may each contain, for example, 32 bits of information regarding current microprogram execution environment.

Referring to MCW0, MCW0 includes 6 execution environment subfields. Bits 0 to 3 inclusive contain a Top Of Stack Counter (TOSCNT) subfield which is a pointer to Current Frame of accelerated Microstack (MIS) 10368. TOSCNT field is initially set to point to Frame 1 of MIS 10368. Bits 4 to 7 inclusive comprise a Top of Stack −1 Counter (TOS-1CT) subfield which is a pointer to Previous Frame of accelerated MIS 10368, that is to the MIS 10368 frame proceeding that pointed by TOSCNT subfield. TOS-1CNT subfield is initially set to Frame 0 of MIS 10368. Bits 8 to 11 inclusive comprise a Bottom of Stack Counter (BOSCNT) subfield which is a pointer to Bottom Frame of accelerated MIS 10368. BOSCNT subfield is initially set to point to Frame 1 of MIS 10368. TOSCNT, TOS-1CNT, and BOSCNT subfields of MCW0 may be read, written, incremented and decremented under microprogram control as frames are transferred between MIS 10368 and a SS 10336.

Bits 17 to 23 inclusive and Bits 24 to 31 inclusive of MCW0 comprise, respectively, Page Number Register (PNREG) and Repeat Counter (REPCTR) subfields which, together, comprise a microinstruction address pointing to a microinstruction currently being written into FUSITT 11012.

Bits 12 to 15 inclusive of MCW0 comprise an Egg Timer (EGGT) subfield which will be described further below with respect to TIMERS 20296. Bit 16 of MCW0 is not utilized in a present embodiment of CS 10110.

Referring to MCW1, MCW1 is comprised of four subfields. Of the 32 bits comprising MCW1, Bits 0 to 15 inclusive and Bits 24 and 25 are not utilized in a present embodiment of CS 10110. Bit 16 is comprised of a Condition Code (CC) subfield indicating results of certain test conditions in JP 10114. As previously described CC subfield is automatically saved and restored in RCWS 10358 RCW's.

Bits 17 to 19 inclusive of RCW1 comprise an Interrupt Mask (IM) subfield. The three bits of IM subfield are utilized to indicate a hierarchy of non-interruptible JP 10114 microinstruction control operating states. That is, a three bit code stored therein indicates relative power to interrupt between three otherwise non-interruptible JP 10114 operating states. Bits 20 to 23 inclusive comprise an Interrupt Request (IR) subfield which indicate Interrupt Request. These Interrupt Requests may include, for example, Egg Timer Overflow, Interval Timer Overflow, or Non-Fatal Memory Error, as have been previously described. Finally, Bits 26 to 31 inclusive comprise a Trace Trap Enable (TTR) subfield indicating which Trace Trap Events, previously described, are currently enabled. These enables may include Name Trace Enable, Logical Retrace Enable, Logical Write Trace Enable, SOP Trace Enable, Microinstruction Enable, and Microinstruction Break Point Enable.

MCW0 and MCW1 has been described above as if residing in registers having individual, discrete existence, that is MCW1 20290 and MCW0 20292. In a present embodiment of CS 10110, MCW1 20290 and MCW0 20292 do not exist as a unified, discrete register structure but are instead comprised of individual registers having physicl existence in other portions of FUCTL 20214. MCW1 20290 and MCW0 20292, and MCW1 and MCW0, have been so described to more distinctly represent the structure of information contained therein. In addition, this approach has been utilized to illustrate the manner by which current JP 10114 execution state may be controlled and monitored through JPD Bus 10142. As indicated in FIG. 202, MCW1 20290 and MCW0 20292 have outputs connected to JPD Bus 10142, thus allowing current execution state of JP 10114 to be read out of FUCTL 20214. Individual bits or subfields of MCW0 and MCW1 may, as previously descibed, be written by microinstruction control provided by FUSITT 11012. In a present physical embodiment of CS 10110, those registers of MCW0 20292 containing subfields TOSCNT, TOS-1CNT, and BOSCNT reside in RAG 20288. Those portions of MCW0 20292 containing subfield EGGT reside in TIMERS 20296. MCW0 20292 registers contain PNREG and REPCTR subfields are physically comprised of REPCTR 20280 and PNREG 20282. In MCW1 20290, CC subfield exists as output of FUCTL 20214 test circuits. Those MCW1 20290 registers containing IM, IR, and TTE subfields reside within EVENT 20284.

Having described FUCTL 20214 structure and operation as regards RCWS 10358, MCW1 20290 and MCW0 20292, FUCTL 20214, RAG 20288 will be described next below.

c.c.c. Register Address Generator 20228 (FIG. 253)

Figure 253:
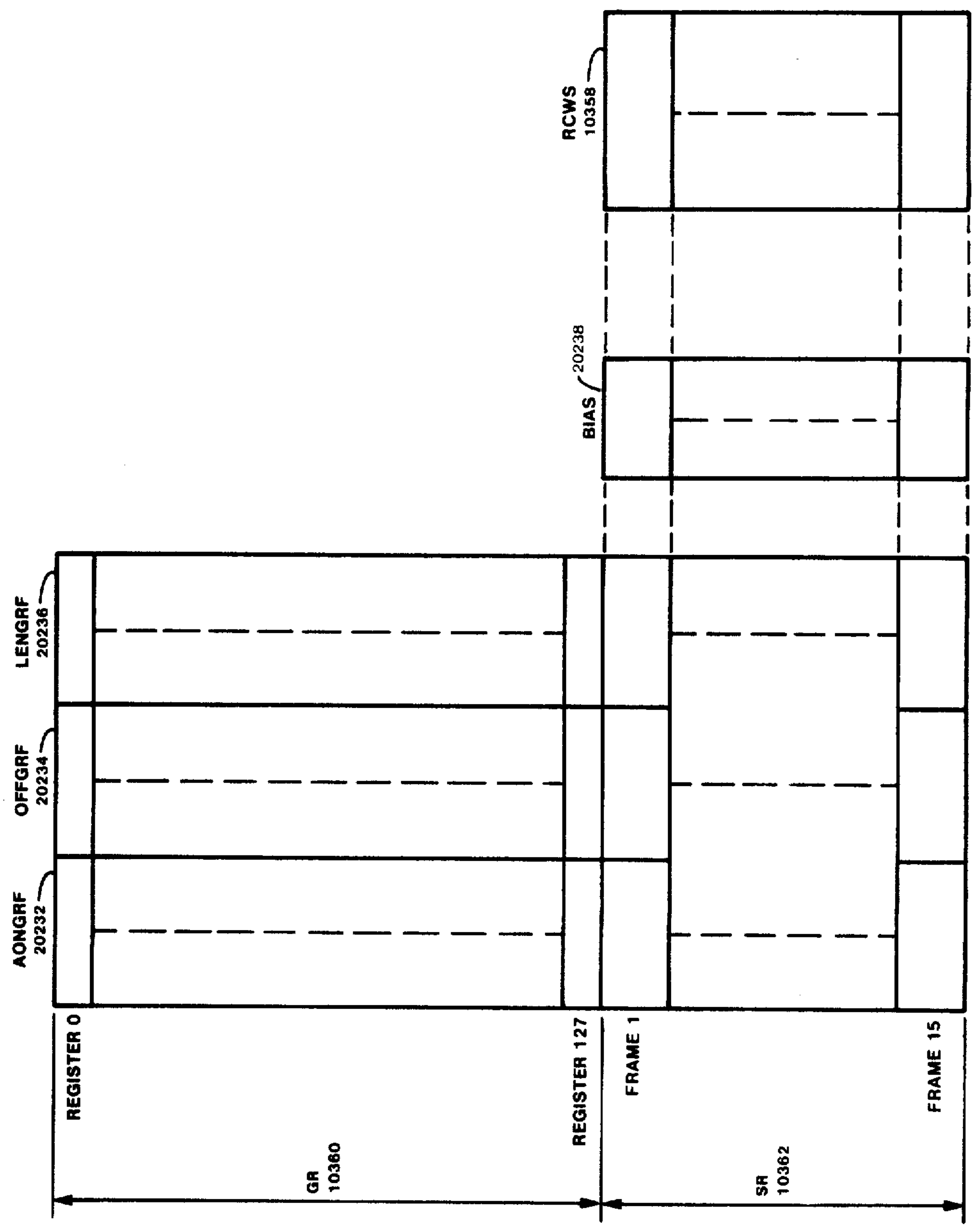
FIGS. 253 and 253A are a detailed block diagram of a register address generator.
Figure 253A:
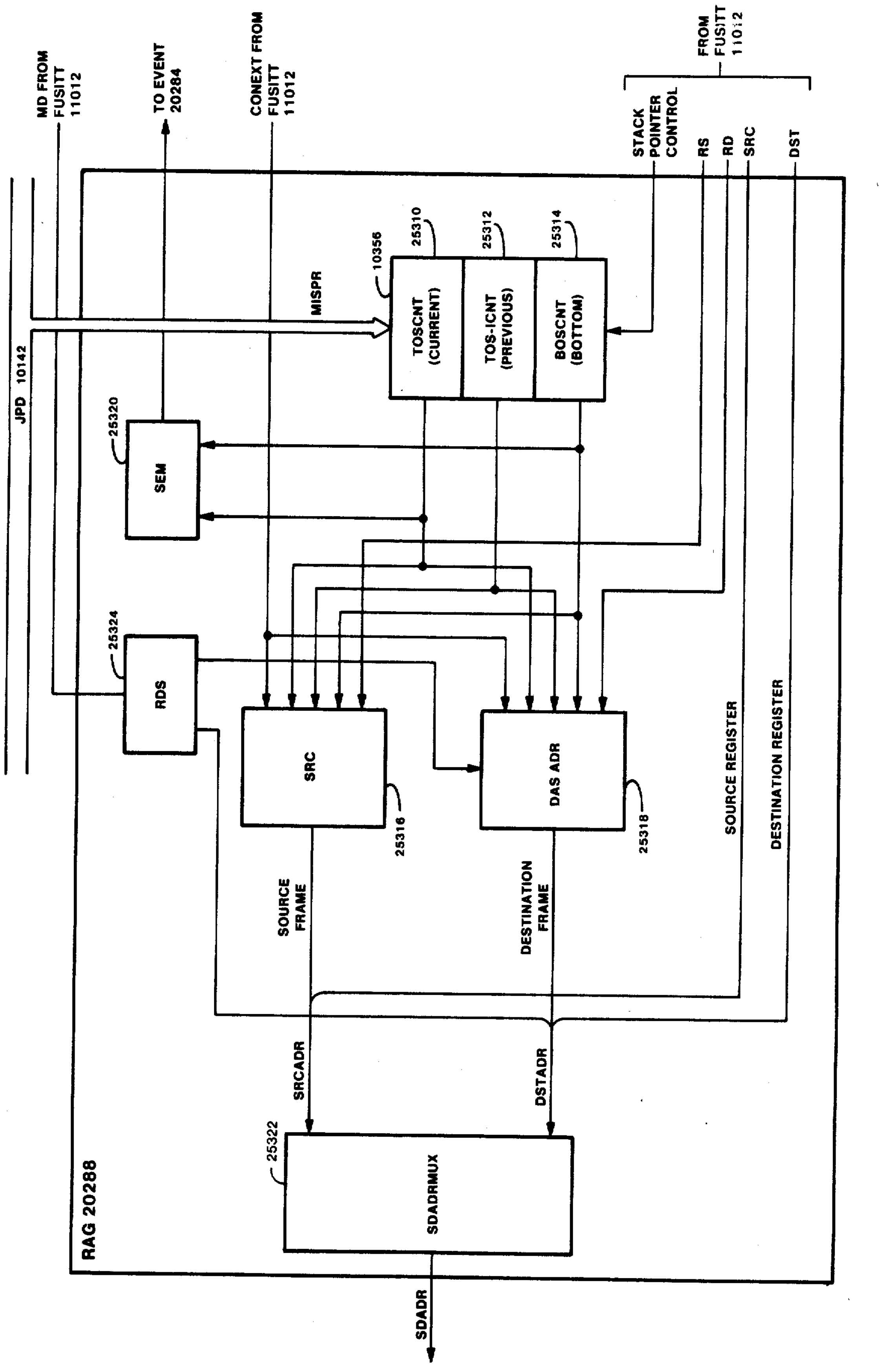

Referring to FIG. 253, a partial block diagram of RAG 20228, together with diagramic representation of GRF 10354, BIAS 20246 and RCWS 10358, is shown. As previously described, JP 10114 register and stack mechanisms include General Register File (GRF) 10354. BIAS 20246, and RCWS 10358. GRF 10354 is, in a present embodiment of CS 10110, a 256 word by 92 bit wide array of registers. GRF 10354 is divided horizontally to provide Global Registers (GRs) 10360 and Stack Registers (SRs) 10362, each of which contains 128 of GRF 10354's 256 registers. GRF 10354, that is both GRs 10360 and SRs 10362, is divided vertically into three vertical sections designated as AONGRF 20232, OFFGRF 20234, and LENGRF 20236. AONGRF 20232, OFFGRF 20234, and LENGRF 20236 are, respectively, 28 bits, 32 bits, and 32 bits wide. GRs 10360 is utilized as an array of 128 individual registers, each register containing one 92 bit word. SRs 10362 is structured and utilized as an array of 16 register frames wherein each frame contains eight registers and each register contains one 92 bit wide word. Eight of SR 10362's frames are utilized as Microstack (MIS) 10362 and the remaining eight of SR 10362's frames are utilized as Monitor Stack (MOS) 10370. For addressing purposes only, as described further below, GRs 10360 is regarded as being structured in the same manner as SRs 10362, that is as 16 frames of eight registers each.

BIAS 20246, as previously describe, is a register array within BIAS 20246. BIAS 20246 contains 128 six bit wide registers, or words, and operates in parallel with and is addressed in parallel with SR 10362 portion of GRF 10354. RCWS 10358 is, as previously described, an array of 16 registers, or words, wherein each register contains one 32 bit RCW. RCWS 10358 is structured and operates in parallel with SRs 10362 with each RCWS 10358 register corresponding to a SR 10362 frame of eight registers. As described below, RCWS 10358 is addressed in parallel with SR 10362's frames.

Source and Destination Register Addresses (SDAR) for selecting a GRF 10354 register to be, respectively, read from or written to are provided by RAG 20288. As described above BIAS 20246 operates and is addressed in parallel with SR 10362 portion of GRF 10354, that is parallel with SRs 10362. BIAS 20246 registers are thereby connected to and in parallel with address inputs of SRs 10362 and are addressed concurrently with GRs 10360. Registers RCWS 10358 also operate and are addressed in parallel with SRs 10362. Address inputs of RCWS 10358's registers are thereby connected in parallel with address inputs of SR 10362's registers.

RAG 20288's address inputs to GRF 10354, and to BIAS 20246 and RCWS 10358, may select registers therein to be either source registers, that is registers providing data, or destination registers, that is registers receiving data. RAG 20288's address outputs are designated as output Source and Destination Register Address (SDADR) of RAG 20288. RAG 20288's SDADR output is connected to address input of register comprising GRF 10354, BIAS 20246, and RCWS 10358. As described above, SRs 10362 are structured as 16 frames of 8 registers per frame and RCWS 10358 is structured as a corresponding 16 frames of one register per frame. GRF 10354 and BIAS 20246 are structured and utilized as single registers but, for addressing purposes, are regarded as being comprised of 16 frames of 8 registers per frame. Each SDADR output of RAG 20288 is an 8 bit word wherein the most significant bit indicates whether the addressed register, either a Source or a Destination Register, reside in GRs 10360 or within SRs 10362, BIAS 20246, and RCWS 10358. The four next most significant bits comprise a frame select field for selecting one of 16 frames within GRs 10360 or within SRs 10362, BIAS 20246, and RCWS 10358. The three least significant bits comprise a register select field selecting a particular register within the frame selected by frame select field.

Within a single system clock cycle, SDADR output of RAG 20288 may select a source register and data may be read from that source register, or SDADR output may select a destination register and data may be written into that destination register. As previously described, each JP 10114 microinstruction requires a minimum of two-system clock cycles for execution, that is at first clock cycle in State M0 and a second clock cycle in State M1. During a single microinstruction therefore, a source register may be selected and data read from that source register, and a destination register selected and data written into that destination register. Certain operations, however, may require more than one microinstruction for execution. For example, a read-modify-write operation wherein data is read from a particular register, modified, and written back into that register may require two or more microinstructions for execution.

Referring first to RAG 20288 structure, RAG 20288 includes MISPR 10356. MISPR 10356 includes Top Of Stack Counter (TOSCNT) 25310, Top Of Stack-1 Counter (TOS-1CNT) 25312, and Bottom Of Stack Counter (BOSCNT) 25314. Contents of TOSCNT 25310, TOS-1CNT 25312 and BOSCNT 25314 are respectively, pointers to Current, Previous, and Bottom frames of SRs 10362, that is, to MIS 10368. As will be described below, these pointers are also utilized to address MOS 10370. TOSCNT 25310, TOS-1CNT 25312, and BOSCNT 25314 are each four bit binary counters comprised, for example, of SN74S163s.

Data inputs of TOSCNT 25310 to BOSCNT 25314 are connected from JPD Bus 10142. Control inputs of TOSCNT 15310 to BOSCNT 25314 are connected from microinstruction control outputs of FUSITT 11012. Data outputs of TOSCNT 25310 to BSOCNT 25314 are connected to data inputs of Source Register Address Multiplexer (SRCADR) 25316 and to data inputs of Destination Register Address Multiplexer (DSTADR) 25318. Data outputs of TOSCNT 25310 and BOSCNT 25314 are connected to inputs of Stack Event Monitor Logic (SEM) 25320.

Source and destination frame addresses are selected, as will be described further below, by SRCADR 25316 and DSTADR 25318 respectively. In addition to data inputs from TOSCNT 25310 and BOSCNT 25314, data inputs of SRCADR 25316 and DSTADR 25318 are connected from microinstruction word CONEXT subfield output from FUSITT 11012. Control inputs of SRCADR 25316 and DSTADR 25318 are connected from, respectively, microinstruction word RS and RD subfield outputs from FUSITT 11012. Source Frame Address Field (SRCFADR) output of SRCADR 25316 and Destination Frame Address Field (DSTFADR) output of DSTADR 25318 are connected to inputs of Source and Destination Register Address Multiplexer (SDADRMUX) 25322. SRCFADR and DSTFADR comprise frame select fields of RAG 20288, SDADR outputs for, respectively, source and destination registers.

In addition to SRCFADR and DSTFADR outputs of ADRSRC 25316 and DSTADR 25318, SDADRMUX 25322 receives microinstruction word SRC and DST subfield inputs from microinstruction outputs of FUSITT 11012. As previously described, SRC subfield is a 3 bit number designating a source register, that is, a source register within a frame selected by SRCFADR DST is similarly a 3 bit number selecting a destination register within a frame indicated by DSTFADR. SRC subfield input to SDADRMUX 25322 is concatenated with SRCADR 25316 to respectively comprise, as described above, register and frame fields of a source register SDADR output of SDADRMUX 25322. Similarly, DST subfield is concatenated with DSTFDADR output of DSTADR 25318 to comprise, respectively, register and frame subfields of a destination register SDADR output of SDADRMUX 25322. Selection between source and destination register address inputs to SDADRMUX 25322, to generate a corresponding source of destination register SDADR output of SDADRMUX 25322 is controlled by microinstruction control inputs (not shown for clarity of presentation) connected to control inputs of SDADRMUX 25322. RDWS 25324 is a PROM decoding MD field from microinstruction words during reads from MEM 10112 and provides register select field of destination register address and selects one of the pointers as frame select field.

An Event output of SEM 25320 is connected to an input of EVENT 20284, previously described. SRCADR 25316, DSTADR 25318, and SDADRMUX 25322, as will be described further below, operate as multiplexers and may be comprised, for example, of SN74S153s.

Having described structure and organization of GRF 10354, BIAS 20246, and RCWS 10358, and structure of RAG 20288, operation of RAG 20288 to generate Source of Destination Register Address outputs SDADR will be described next below Addressing of JP 10114's stack mechanism, comprising SRs 10362 and RCWS 10358, will be described first, followed by addressing of GRs 10360 and BIAS 20246.

SR 10362 portion of GRF 10354, RCWS 10358, and BIAS 20246 are addressed by Current, Previous, and Bottom Frame Pointers contained, respectively, in TOSCNT 25310, TOS-1CNT 25312, and BOSCNT 25314. Current, Previous, and Bottom Pointers comprise frame select fields of SDADRMUX 25322. As previously described, Current, Previous and Bottom Pointer outputs of TOSCNT 25310 to BOSCNT 25314 are provided as inputs of SRCADR 25316 and DSTADR 25318. Microinstruction word RS subfield to control input of SRCADR 25316 selects either Current, Previous or Bottom Pointer input of SRCADR 25316 to comprise SRCFADR output of SRCADR 25316, that is to be frame select field of source register address. Similarly, microinstruction word RD subfield to control input of DSTADR 25318 concurrently selects either Current, Previous, or Bottom Pointer inputs of DSTADR 25318 to comprise DSTADR 25318's concurrently selects either Current, Previous, or Bottom Pointer inputs of DSTADR 25318 to comprise DSTADR 25318s DSTFADR output, that is frame select field of destination register address. As described above, SRCFADR and DSTFADR are provided as inputs to SDADRMUX 25322. Microinstruction word SRC and DST subfield inputs to SDADRMUX 25322 concurrently determine, respectively, source and destination registers within source and destination frames specified by SRCFADR and DSTFADR. SDADRMUX 25322 then, operating under microinstruction control, selects either SRCFADR and SRC to comprise SDADR output to SR 10362 as a source register address or selects DSTFADR and DST as SDADR output specifying a destination register address. By microinstruction control of SRCADR 25316, DSTADR 25318, and SDADRMUX 25322, a CS 10110 microprogram may select a source frame and register within SR 10362 and simultaneously specify a possible different destination frame and register within SR 10362. All possible combinations of source frame and register and destination frame and register in GRs 10360, SRs 10362, BIAS 20246, and RCWS 10358 are valid.

Control of SRCADR 25316, DSTADR 25318, and SDADRMUX 25322 in addressing SR 10362 portion of GRF 10354, and RCWS 10358, is controlled, in part, by current CS 10110 state. Pertinent CS 10110 operating states, previously described, are State M1 and State RW. When CS 10110 is in neither State RW nor State M1, SR 10362 is addressed through SRCADR 25316 and microinstruction word SRC subfield, that is SR 10362 and RCWS 10358 are provided with source register addresses when CS 10110 is in neither RW nor M1 States. When CS 10110 enters State M1, SR 10362 and RCWS 10358 is addressed through DSTADR 25318 and by microinstruction word DST subfield. That is, SR 10362 and RCWS 10358 are provided with destination register addresses during State M1. Similarly, SR 10362 and RCWS 10358 are provided with destination register addresses when CS 10110 is operating in State RW, that is when data is being read from MEM 10112 and written into SR 10362 or RCWS 10358. In this case, however, low order 3 bits of destination register address, that is register select field, are provided by RDS 25324, which decodes microinstruction word subfield MD (Memory Destination). RDS 25324 also provides a control input that DSTADR 25318 to select one of Current, Previous, or Bottom Pointers from MISPR 10356 to comprise frame select field of destination register address.

As stated above, frame select field of source and destination register addresses are provided from TOSCNT 25310, TOS-1CNT 25312, and BOSCNT 25314. As described above, the most significant bit of source and destination register address are forced to logic 1 or logic 0, depending upon whether GR 10360 or SR 10362, BIAS 20246, and RCWS 10358 are being addressed. Contents of TOSCNT 25310 to BOSCNT 25314, that is Current, Previous, and Bottom Pointers, are controlled by microinstruction control outputs of FUSITT 11012. Current and Previous Pointers change as stacks are "pushed" or "popped" to and from MIS 10368 as JP 10114 performs, respectively, calls and returns. Similarly, Current, Previous and Bottom Pointers will be incremented or decremented as MIS 10368 frames are transferred between MIS 10368 and MEM 10112, as previously described with respect to CS 10110's Stack Mechanisms.

Referring first to Current and Previous Pointer operation, Current and Previous Pointers in TOSCNT 25310 and TOS-1CNT 25312 are initially set, respectively, to point to Frames 1 and 0 of MIS 10368 by being loaded from JPD Bus 10142. TOSCNT 25310 and TOS-1CNT 25312 are enabled to count when two conditions are met. First condition is dependent upon current operating state of CS 10110. TOSCNT 25310 and TOS-1CNT 25312 will be enabled to count during last system clock cycle of CS 10110 operating States M1 or AB. Second condition is dependant upon whether JP 10114 is to execute a call or return. TOSCNT 25310 and TOS-1CNT 25312 may be enabled to count if a current microinstruction indicates JP 10114 is to execute a call or return, or if CS 10110 is exiting State AB as exit from State AB is an implied call operation. Both a call and an implied call, that is exit from State AB, will cause TOSCNT 25310 and TOS-1CNT 25312 to be incremented. A return will cause TOSCNT 25310 and TOS-1CNT 25312 to be decremented.

Referring to BOSCNT 25314, Bottom Frame Pointer is initially loaded from JPD Bus 10142 to point to MIS 10368 Frame 1. Again, incrementing or decrementing of BOSCNT 25314 is dependant upon CS 10110 operating state and operation to be performed. BOSCNT 25314 is enabled to count upon exiting from State M1. In addition, DEVCMD subfield of a current microinstruction word must indicate that BOSCNT 25314 is to be incremented or decremented. BOSCNT 25314 will be incremented or decremented upon exit from State M1 as indicated by microinstruction word DEVCMD subfield.

SEM 25320 monitors relative values of Current and Bottom Pointers residing in TOSCNT 25310 and BOSCNT 25314 and provides outputs to EVENT 20284 for purposes of controlling operation of MI 10368 and MOS 10370. SEM 25320 is comprised of a Read Only Memory, for example 93S427s, receiving Current and Bottom Pointers as inputs. SEM 25320 detects 3 Events occurring in operation of TOSCNT 25310 and BOSCNT 25314, and thus in operation of MIS 10368 and MOS 10370. First, SEM 25320 detects an MIS 10368 Stack Overflow. This Event is indicated if the present value of Current Frame Pointer is greater than 8 larger than the present value of Bottom Frame Pointer. Second, SEM 25320 detects when MIS 10368 contains only one frame of information. This event is indicated if the value of Current Frame Pointer is equal to the value of Bottom Frame Pointer. In this case, the previous frame of MIS 10368 resides in MEM 10112 and must be fetched from MEM 10112 before a reference to the previous stack frame may be made. Third, SEM 25320 detects when MIS 10368 and MOS 10370 are full. This Event is indicated if the present value of Current Frame Pointer is 16 larger than the present value of Bottom Frame Pointer. When this Event occurs, any further attempt to write a frame onto MIS 10368 or MOS 10370 will result in a MOS 10370 Stack Overflow. EVENT 20284 responds to these Events indicated by SEM 25320 by initiating execution of an appropriate Event Handling microinstruction sequence, as previously described. It should be noted that MIS 10368 and MOS 10370 are addressed in the same manner, that is through use of Current, Previous and Bottom Frame Pointers and certain microinstruction word subfields.

Primary difference between operation of MIS 10368 and MOS 10370 is in the manner in which stack overflows are handled. In the case of MIS 10368, stack frames are transferred between MIS 10368 and MEM 10112 so that MIS 10368 is effectively a bottomless stack. MOS 10370, however, contains a maximum of 8 stack frames, in a present embodiment of CS 10110, so that no more than eight Events may be pushed onto MOS 10370 at a given time.

GR 10360 is addressed in a manner similar to SR 10362, BIAS 20246, and RCWS 10358, that is through ADRSRC 25316, DSTADR 25318, and SDADRMUX 25322. Again, register select fields of source and destination register addresses are provided by microinstruction word SRC and DST subfields. Frame select field of source and destination register addresses is, however, specified by microinstruction word CONEXT subfield. In this case, microinstruction word RS and RD subfields specify that frame select fields of source and destination register addresses are to be provided by CONEXT subfield. Accordingly, ADRSRC 25316 and DSTADR 25318 provide CONEXT subfield as SRCFADR and DSTFADR inputs to SDADRMUX 25322.

Having described structure and operation of RAG 20288, TIMERS 20296 will be described next below.

Figure 254:
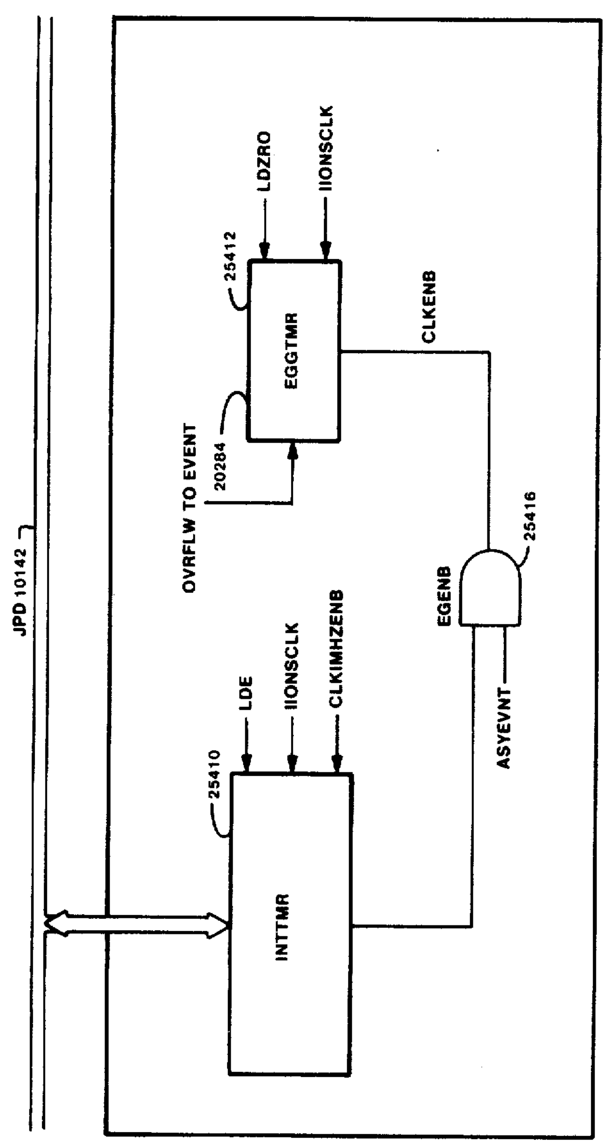
FIG. 254 is a block diagram of interval and egg timers.

Referring to FIG. 254, a partial block diagram of TIMERS 20296 is shown. As indicated therein, TIMERS 20296 includes Interval Timer (INTTMR) 25410, Egg Timer (EGGTMR) 25412, and Egg Timer Clock Enable Gate (EGENB) 25416.

d.d.d. Timers 20296 (FIG. 254)

Referring first to INTTMR 25410, a primary function of INTTMR 25410 is to maintain CS 10110 architectural time as previously described with reference to FIG. 106A and previous descriptions of CS 10110 UID addressing. As described therein, a portion of all UID addresses generated by all CS 10110 systems is an Object Serial Number (OSN) field. OSN field uniquely defines each object created by operation of or for use in a particular CS 10110. OSN field of an object's UID is, in a particular CS 10110, generated by determining time of creation of that object relative to an arbitrary historic starting time common to all CS 10110 systems. That time is maintained within a MEM 10112 storage space, or address location, but is measured by operation of INTTMR 25410.

INTTMR 25410 is a 28 bit counter clocked by a 110 Nano-Second Clock (11ONSCLK) input and is enabled to count by a one MHZ Clock Enable input (CLK1MHZENB). INTTMR 25410 may thereby be clocked at a one MHZ rate to measure one microsecond intervals. Maximum time interval which may be measured by INTTMR 25410 is thereby 268.435 seconds.

As indicated in FIG. 254, INTTMR 25410 may be loaded from and read to JPD Bus 10142. In normal operation, the MEM 10112 location containing architectural time for a particular CS 10110 will be loaded with current architectural time at time of start up of that particular CS 10110. INTTMR 25410 will concurrently be loaded with all zeros. Thereafter, INTTMR 25410 will be clocked at one microsecond intervals. Periodically, when INTTMR 25410 overflows, architectural time stored in MEM 10112 will be accordingly updated. At any time, therefore, current architectural time may be determined, down to a one microsecond increment, by reading architectural time from the previous updated architectural time stored in MEM 10112 and elapsed interval since last update of architectural time from INTTMR 25410. In the event of a failure of CS 10110, architectural time in MEM 10112 and INTTMR 25410 may be saved in MEM 10112 by reading elapsed intervals since last architectural time update. When normal CS 10110 operation resumes, INTTMR 25410 may be reloaded with a count reflecting current architectural time. As indicated in FIG. 254, INTTMR 25410 is loaded from JPD Bus 10142 when INTTMR 25410 is enabled by a Load Enable input (LDE) provided from DP 10118.

Referring to EGGTMR 25412, certain CS 10110 Events, in particular Asychronous Events previously described with reference to EVENT 20284, are received or acknowledged by EVENT 20284 only at conclusion of State M1 of first microinstruction of an SOP. As certain CS 10110 microinstructions have long execution times, these Asynchronous Events may be subjected to an extended latency, or waiting, interval before being serviced EGGTMR 25412, in effect, measures latency time of pending Asychronous Events and provides an output to EVENT 20284 if a predetermined maximum latency time is exceeded.

As indicated in FIG. 254, EGGTMR 25412 is clocked by a 110 Nano-Second Clock input (11ONSCLK). EGGTMR 25412 is initially set to zero by load input (LDZRO) at end of State M1 of the first microinstruction of each SOP executed by CS 10110, or when specifically instructed so by DEVCMD subfield of a microinstruction word. EGGTMR 25412 is incremented when enabled by Clock Enable (CLKENB) input from EGGENB 25416. There are two conditions necessary for EGGTMR 25412 to be incremented. First condition is occurrence of an Asychronous Event, which is indicated by input ASYEVNT to EGGENB 25416 from EVENT 20284 Second condition is that 16 or more microseconds have elapsed since last increment of EGGTMR 25412. This interval is measured by an output from fourth bit of INTTMR 25410 which, as shown in FIG. 254, is connected to an input of EGGENB 25416. EGGTMR 25412 is a four bit counter and will thereby overflow and generate output OVRFLW to EVENT 20284 256 microseconds after beginning of an SOP if an Asychronous Event has occurred and if at least 16 microseconds have elapsed since start of that SOP EGGTMR 25412 thereby insures a maximum service latency of 256 microseconds for Asychronous Events.

e.e.e. Fetch Unit 10120 Interface to Execute Unit 10122

Finally, as previously described FU 10120's interface to EU 10122 is primarily comprised of EUDIS Bus 20206, for providing EUDPs to EU 10122's EUSITT, and FUINT 20298. Operation of EUSDT 20266 and EUDIS Bus 20206 has been previously described and will be described further in a following description of EU 10122. FUINT 20298 is primarily concerned with generating Event Requests for conditions signalled from EU 10122 so that these Events may be serviced. In this regard, FUINT 20298 is primarily comprised of gates receiving Event Requests from EU 10122 and providing corresponding outputs to EVENT 20284. Another interface function performed by FUINT 20298 is generation of a "transfer complete" signal generated by FU 10122 and provided to EU 10122 to assert that a EU 10122 result read from EU 10122 to FU 10120 has been received. This transfer complete signal indicates to EU 10122 that EU 10122's result register, described in a following description of EU 10122, is available for further use by EU 10122. This transfer complete signal is generated by an output of FUSITT 11012 as part of microinstruction sequences for transferring data from EU 10122 to FU 10120 or MEM 10112.

Having described structure and operation of FU 10120, including DESP 20210, MEMINT 20212, and FUCTL 20214, the structure and operation of EU 10122 will be described next below.

C. Execute Unit 10122 (FIGS. 203, 255-268)

As previously described, EU 10122 is an arithmetic processor capable of executing integer, packed and unpacked decimal, and single and double precision floating point arithmetic operations. A primary function of EU 10122 is to relieve FU 10120 of certain arithmetic operations, thus enhancing efficiency of CS 10110.

Transfer of operands from MEM 10112 to EU 10122 is controlled by FU 10120, as is transfer of results of arithmetic operations from EU 10122 to FU 10120 or MEM 10112. In addition, EU 10122 operations are initiated by FU 10120 by EU 10122 Dispatch Pointers invited to EU 10122 by EUSDT 20266. EU 10122 Dispatch Pointers may initiate both arithmetic operations required for execution of SINs and certain EU 10122 operations assisting in handling of CS 10110 events. As previously described, EU 10122 Dispatch Pointers are translated into sequences of microinstructions for controlling EU 10122 by EU 10122's EUSITT which is similar in structure and operation to FUSITT 11012. As will be described further below, EU 10122 includes a command queue for receiving and storing sequences of EU 10122 Dispatch Pointers from FU 10120. In addition, EU 10122 includes a general register file, or scratch pad memory, similar to GRF 10354. EU 10122's general register file is utilized, in part, in EU 10122 Stack Mechanisms similar to FU 10120's SR's 10362.

Figure 203:
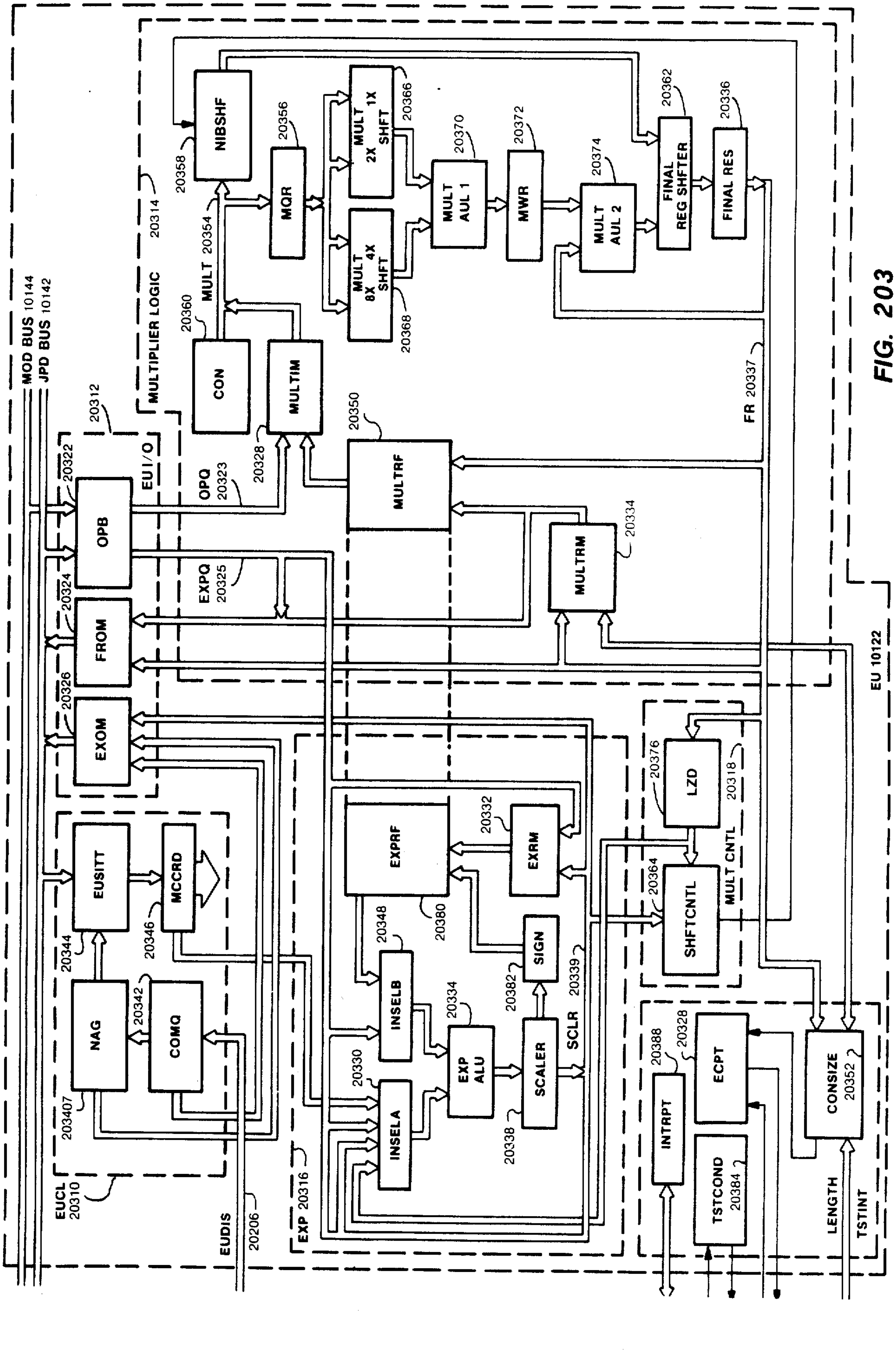
FIG. 203 is a detailed block diagram of an execute unit.

Referring to FIG. 203, a partial block diagram of EU 10122 is shown. EU 10122's general structure and operation will be described first with referene to FIG. 203. Then EU 10122's structure and operation will be described in further detail with aid of subsequent figures which will be presented as required.

As indicated in FIG. 203, major elements of EU 10122 include Execute Unit Control Logic (EUCL) 20310, Execute Unit IO Buffer (EUIO) 20312, Multiplier Logic (MULT) 20314, Exponent Logic (EXP) 20316, Multiplier Control Logic (MULTCNTL) 20318, and Test and Interface Logic (TSTINT) 20320. EUCL 20310 receives Execute Unit Dispatch Pointers (EUDP's) from EUSDT 20266 and provides corresponding sequences of microinstructions to control operation of EU 10122.

EUIO 20312 receives operands, or data, from MEM 10112, translates those operands into certain formats most efficiently used by EU 10122. EUIO 20312 receives results of EU 10122's operations and translates those results into formats to be returned to MEM 10112 or FU 10120, and presents those results to MEM 10112 and FU 10120.

MULT 20314 and EXP 20316 are arithmetic units for performing arithmetic manipulations of EU 10122 operations. In particular, EXP 20316 performs operations with respect to exponent fields of single and double precision floating point operations. MULT 20314 performs arithmetic manipulations with respect to mantissa fields of single and double precision floating point operations, and arithmetic operations with regard to integer and packed decimal Operations. MULTCNTL 20318 controls and coordinates operation of MULT 20314 and EXP 20316 and prealignment and normalization of mantissa and exponent fields in floating point operations. Finally, TSTINT 20320 performs certain test operations with regard to EU 10122's operations, and is the interface between EU 10122 and FU 10120.

a. General Structure of EU 10122

1. Execute Unit I/O 20312

Referring first to EUIO 20312, EUIO 20312 includes Operand Buffer (OPB) 20322, Final Result Output Multiplexer (FROM) 20324, and Exponent Output Multiplexer (EXOM) 20326. OPB 20322 has first and second inputs connected, respectively, from MOD Bus 10144 and JPD Bus 10142. OPB 20322 has a first output connected to a first input of Multiplier Input Multiplexer (MULTIM) 20328 and MULT 20314. A second output of OPB 20322 is connected to first inputs of Inputs Selector A (INSELA) 20330 and Exponent Execute Unit General Register File Input Multiplexer (EXRM) 20332 in EXP 20316.

FROM 20324 has an output connected to JPD Bus 10142. A first input of FROM 20324 is connected from output of Multiplier Execute in General Register File Input Multiplexer (MULTRM) 20334 and MULT 20314. A second input of FROM 20324 is connected from output of Final Result Register (RFR) 20336 of MULT 20314. EXOM 20326 has an output connected to JPD Bus 10142. EXOM 20326 is a first input connected from output of Scale Register (SCALER) 20338 of EXP 20316. EXOM 20326 has second and third inputs connected from outputs of, respectively, Next Address Generator (NAG) 20340 and Command Queue (COMQ) 20342 of EUCL 20310.

2. Execute Unit Control Logic 20310

Referring to EUCL 20310, EUCL 20310 includes NAG 20340, COMQ 20342, Execute Unit S Interpreter Table (EUSITT) 20344, and Microinstruction Control Register and Decode Logic (mCRD) 20346. COMQ 20342 has an input connected from EUDIS Bus 20206 for receiving SDPs from EUSDT 20266. COMQ 20342 has, as described above, a first output connected to a third input of EXOM 20326, and has a second output connected to an input of NAG 20340. NAG 20340 has, as described above, a first output connected to second input of EXOM 20326. NAG 20340 has a second output connected to a first input of EUSITT 20344. As previously described, EUSITT 20344 corresponds to FUSITT 11012 and stores sequences of microinstructions for controlling operation of EU 10122 in response to EU 10122 Dispatch Pointers from FU 10120. EUSITT 20344 has a second input connected from JPD Bus 10142 and has an output connected to input of mCRD 20346. mCRD 20346 includes a register and logic for receiving and decoding microinstructions provided by EUSITT 20344. In addition to an input from EUSITT 20344, mCRD 20346 has first outputs providing decoded microinstruction control signals to all parts of EU 10122. mCRD 20346 also has a second output connected to a first input of Input Selecter B (INSELB) 20348 and EXP 20316.

3. Multiplexer Logic 20314

Referring to MULT 20314, MULT 20314 includes two parallel arithmetic operation paths for performing addition, subtraction, multiplication, and division operations on packed decimal numbers, integer numbers, and mantissa portions of single and double precision floating point numbers. MULT 20314 also includes a related portion of EU 10122's general register file, a memory for storing constants used in arithmetic operations, and certain input data selection circuits. That portion of EU 10122's GRF residing in MULT 20314 is comprised of Multiplier Register File (MULTRF) 20350. Output of MULTRF 20350 is connected to a second input of MULTIM 20328. A first input of MULTRF 20350 is connected from output of RFR 20336 and a second input of MULTRF 20350 is connected from output of MULTRM 20334. First and second inputs of MULTRM 20334 are in turn connected, respectively, from output of RFR 20336 and from output of Container Size Logic (CONSIZE) 20352 of TSTINT 20320.

MULTIM 20328 selects the data inputs to MULT 20314's arithmetic circuits and has, as previously described, first and second inputs connected respectively from first output of OPB 20322 and from output of MULTRF 20350. Output of MULTIM 20328 is connected through Multiplier (MULT) Bus 20354 to input of Multiplier Quotient Register (MQR) 20356 and to input of Nibble Shifter (NIBSHF) 20358. Another input to MQR 20356 and NIBSHF 20358 is provided by Constant Store (CONST) 20360. CONST 20360 is a memory for storing constant values used n MULT 20314 operations. Output of CONST 20360 is connected to MULT Bus 20354. MULT 20314's arithmetic circuits may thereby be provided with inputs from OPB 20322, MULTRF 20350, and CONST 20360.

MULT 20314's arithmetic circuitry is comprised of two, parallel arithmetic operation paths having, as common inputs, outputs of MULTIM 20328 and CONST 20360. Common termination of these parallel arithmetic operation paths is Final Register Shifter (FRS) 20362. A first arithmetic operation path is provided through NIBSHF 20358, whose input is connected from MULT Bus 20354. NIBSHF 20358's output is connected to a first input of FRS 20362 and a control input of NRBSHF 20358 is connected from an output of Multiplier Control Logic (MULTCNT) 20364 and MULTCNTL 20318.

MULT 20314's second arithmetic operation path is provided through MQR 20356. As described above, MQR 20356's input is connected from MULT Bus 20354. MQR 29356's output is connected to first and second inputs of Times 1 And Times 2 Multiply Shifter (MULTSHFT12) 20366 and Times 4 And Times 8 Multiply Shifter (MULTSHFT48) 20368. Outputs of MULTSHFT12 and MULTSHFT8 are connected, respectively, to first and second inputs of First Multiplier Arithmetic and Logic Unit (MULTALU1) 20370. MULTALU1 20370's output is connected to input of Multiplier Working Register (MWR) 20372. Output of MWR 20372 is connected to a first input of Second Multiplier Arithmetic and Logic Unit (MULTALU2) 20374. A second input of MULTALU2 20374 is connected from output of RFR 20336. Output of MULTALU2 is connected to a second input of FRS 20362. As described above, first input of FRS 20362 is connected from output of NIBSHF 20368. Output of FRS 20362 is connected to input of RFR 20336.

As described above, output of RFR 20336 is connected to second input of MULTALU2 20374, to first input of MULTRF 20350, to first input of MULTRM 20334, and to second input of FROM 20324. Output of RFR 20336 is also connected to input of Leading Zero Detector (LZD) 20376 of MULTCNTL 20318, and to inputs of Exception Logic (ECPT) 20378, CONSIZE 20352, and TSTINT 20320.

4. Exponent Logic 20316

Referring to EXP 20316, as previously described EXP 20316 performs certain operations with respect to exponent fields of single and double precision floating point number in EU 10122 floating point operations. EXP 20316 includes a second portion of EU 10122's general register file, shown herein as Exponent Register File (EXPRF) 20380. Although indicated as individual register files, MULTRF 20350 and EXPRF 20380 comprise, as in GRF 10354, a unitary register file structure with common, parallel addressing of corresponding registers therein.

Output of EXPRF 20380 is connected to a second input of INSELA 20330. A first input of EXPRF 20380 is connected from output of EXRM 20332. As previously described, a first input of EXRM 20332 is connected from second output of OPB 20322 through EXPQ Bus 20325. A second input of EXRM 20332 is connected from output Scale Register (SCALER) 20338. A second input of EXPRF 20380 is connected from output of Sign Logic (SIGN) 20382. Input of SIGN 20382 is connected from second output of SCALER 20338.

INSELA 20330, INSELB 20348, Exponent ALU (EXPALU) 20384 and SCALER 20338 comprise EXP 20316's arithmetic circuitry for manipulating exponent fields of floating point numbers. INSELA 20330 and INSELB 20348 select, respectively, first and second inputs to EXPALU 20384. As previously described, a first input of INSELA 20330 is connected from second output of OPB 20322 through EXPQ Bus 20325. Second input of INSELA 20330 is connected from output of EXPRF 20380. Output of INSELA 20330 is connected to first input of EXPALU 20384. First input of INSELB 20348 is, as previously described, connected from a second output of mCRD 20346. Second input of INSELB 20348 is connected from output of OPB 20322 through EXPQ Bus 20325. Third input of INSELB 20348 is connected from output of SCALER 20338 and fourth input of INSELB 20348 is connected from output of LZD 20376. Output of INSELB 20348 is connected to second input of EXPALU 20348. Output of EXPALU 20348 is connected to input of SCALER 20338.

As previously described, second output of SCALER 20338 is connected with input of SIGN 20382 and first output is connected to second input of EXRM 20332 and to third input of INSELB 20348. First output of SCALER 20338 is also connected to EXPQ Bus 20325, to first input of EXOM 20326, and to a second input of MULTCNT 20364.

5. Multiplier Control 20318

As previously described, MULTCNTL 20318 provides certain control signals and information for controlling and coordinating operation of EXP 20316 and MULT 20314 in performing arithmetic operations on floating point numbers. MULTCNTL 20318 includes LZD 20376 and MULTCNT 20364. Input of LZD 20376 is connected from output of RFR 20336 through FR Bus 20337. Output of LZD 20376 are connected to a second input of MULTCNT 20364 and to fourth input of INSELB 20348. A second input of MULTCNT 20364 is connected from output of SCALER 20338. As previously described, control output of MULTCNT 20364 is connected to control inputs of NIBSHF 20358.

6. Test and Interface Logic 20320

Finally, TSTINT 20320 includes ECPT 20378, CONSIZE 20352, and Testing Condition Logic (TSTCON) 20386. Input of ECPT 20378 and first input of CONSIZE 20352 are connected from output of RFR 20336 through FR Bus 20337. A second input of CONSIZE 20352 is connected from LENGTH Bus 20226. An output of CONSIZE 20352 is connected, together with other inputs from EU 10122 (not shown for clarity of presentation) to TSTCON 20386. Output of TSTCON 20386 (not shown for clarity of presentation) are connected to NAG 20340. TSTCON 20386 and ECPT 20378 have outputs to and inputs from FU 10120's FUINT 20298.

Having described the overall structure of EU 10122 above, operation of EU 10122 will be described next below with aid of further diagrams which will be introduced as required. In general, the following discussion will follow the flow of instructions, that is EU 10122 Dispatch Pointers, and operands from FU 10120 and MEM 10112, execution of arithmetic operations with regard to those operands under microinstruction control provided by EUCL 20310, and return of final result of arithmetic operations to MEM 10112 and FU 10120. In this regard, EUCL 20310 and OPB 20322 will be described first. As previously described, EUCL 20310 provides microinstruction control of EU 10122 in response to EU 10122 Dispatch Pointers provided by FU 10120. OPB 20322 receives operands from MEM 10112 and FU 10120 and translate those operands into formats most suitable for efficient use by EU 10122. Operation of MULT 20314 and EXP 20316 will then be described to disclose operation of EU 10122 in executing integer, packed and unpacked decimal, and single and double precision floating point operations. During these discussions, operation of MULTCNTL 20318, FROM 20324, and EXOM 20326 will be disclosed. Finally, operation of TSTINT 20320 will be described, including a description of the detailed control signal interface between EU 10122 and FU 10120 through TSTINT 20320 and FUINT 20298. In addition to defining the interface between EU 10122 and FU 10120, certain features of EU 10122 operation will be described wherein those operations are executed in cooperation with MEM 10112 and FU 10120. For example, EU 10122's Stack Mechanisms, comprising in part portions of MULTRF 20350 and EXPRF 20380, resides partly in MEM 10112 so that operation of EU 10122's Stack Mechanisms requires cooperative operations by EU 10122, MEM 10112 and FU 10120.

b. Execute Unit 10122 Operation (FIG. 255)

1. Execute Unit Control Logic 20310 (FIG. 255)

Figure 255:
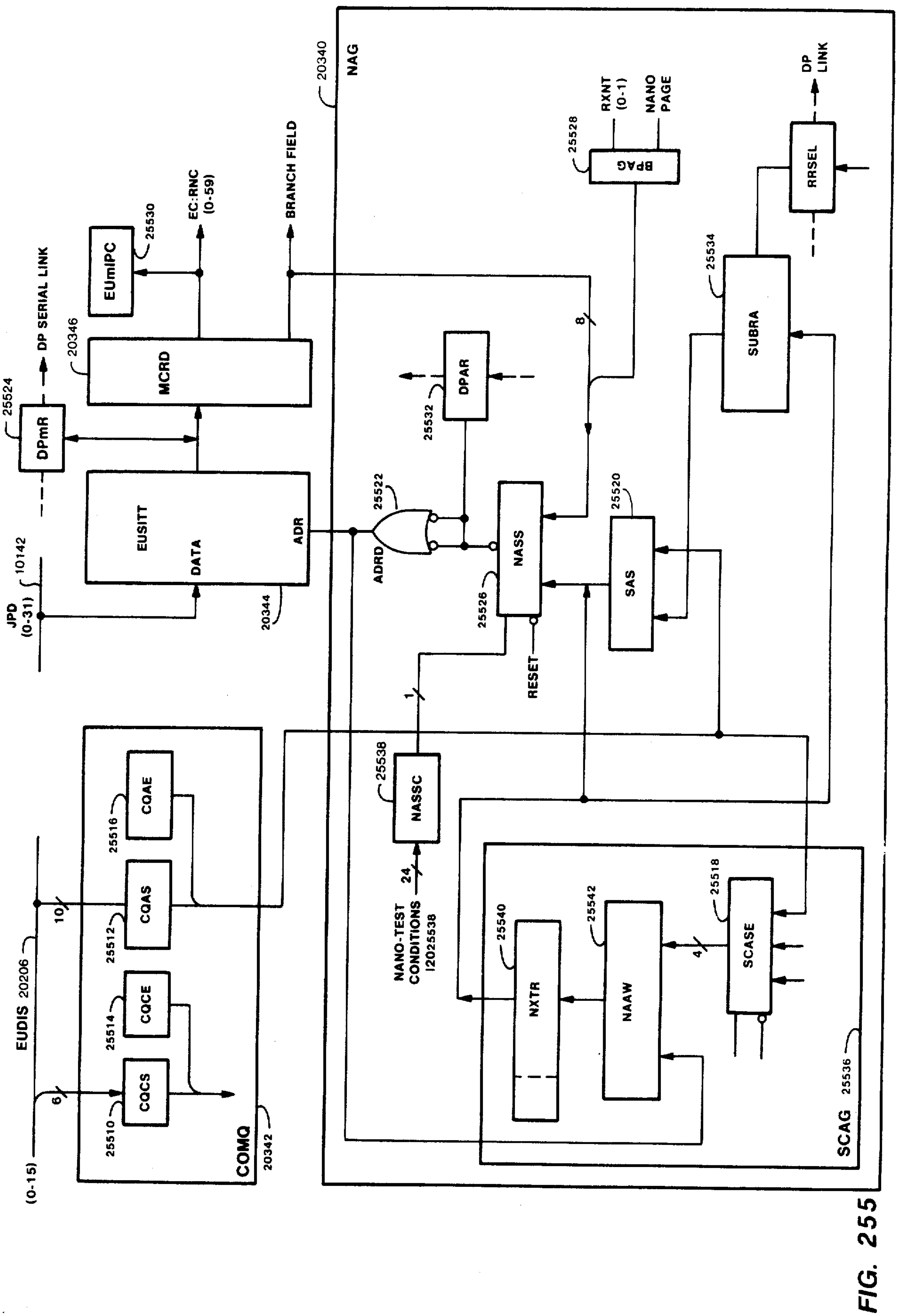
FIG. 255 is a detailed block diagram of execute unit control logic.

Referring to FIG. 255, a more detailed block diagram of EUCL 20310 is shown. As described above, EUCL 20310 receives EU 10122 Dispatch Pointers through EUDIS Bus 20206 from EUSDT 20266 and FUCTL 20214. EU 10122 Dispatch Pointers select certain EU 10122 microinstruction sequences for executing EU 10122 arithmetic operations as required to execute user's programs, that is SOPs, and to assist in handling JP 10114 Events. As described above, major elements of EUCL 20310 include COMQ 20342, EUSITT 20344, mCRD 20346, and NAG 20340.

a.a. Command Queue 20342

Inputs of COMQ 20342 are connected from EUDIS Bus 20206 to receive and store EU 10122 Dispatch Pointers provided from EUSDT 20266. Each such EU 10122 Dispatch Pointer is comprised of two information fields. A first information field contains a 10 bit starting address of a corresponding sequence of microistructions residing in EUSITT 20344. Second field of each EU 10122 Dispatch Pointer is a 6 bit field containing certain control information, such as information identifying data format of corresponding operands to be operated upon. In this case unit dispatch pointer control field bits specify whether operands to be operated upon comprise signed or unsigned integer, packed or unpacked decimal, or single or double precision floating point numbers.

COMQ 20342 is comprised of two one word wide by two word deep register files. A first of these register fields is comprised of SOP Command Queue Control Store (CQCS) 25510 and SOP Command Queue Address Store (CQAS) 25512. Together, CQCS 25510 and CQAS 25512 comprise a one word wide by two word deep register file for receiving and storing EU 10122 Dispatch Pointers corresponding to SOPs, that is Dispatch Pointers for initiating EU 10122 operations directly concerned with executing a user's program. Address fields of these SOPs are received in CQAS 25512, while control fields are received and stored in CQCS 25510. COMQ 20342 is thereby capable of receiving and storing up to two sequential EU 10122 Dispatch Pointers corresponding to user program SOPs. These SOP derived Dispatch Pointers are executed in the order received from FU 10120. EU 10122 is thereby capable of receiving and storing one currently executing SOP Dispatch Pointer and one pending SOP Dispatch Pointer. Further SOP Dispatch Pointers may be read into COMQ 20342 as previous SOPs are executed.

b.b. Command Queue Event Control Store 25514 and Command Queue Event Address Control Store 25516

Command Queue Event Control Store (CQCE) 25514 and command Queue Event Address Control Store (CQAE) 25516 are similar in function and operation to, respectively, CQCS 25510 ad CQAS 25512. CQCE 25514 and CQAE 25516 receive and store, however, EU 10122 Dispatch Pointers initiating EU 10122 operations requested by FU 10120 as required to handle JP 10114 Events. Again, CQCE 25514 and CQAE 25516 comprise a one word wide by two word deep register file CQAE 25516 receives and stores address fields of Event Dispatch Pointers, while CQCE 25514 receives and stores corresponding control fields of Event Dispatch Pointers. Again, COMQ 20342 is capable of receiving and storing up to two sequential Event Dispatch Pointers at a time.

As indicated in FIG. 255, outputs of CQAS 25512 and CQAE 25516, that is address fields of EU 10122 Dispatch Pointers are provided as inputs to Select Case Multiplexer (SCASE) 25518 and Starting Address Select Multiplexer (SAS) 25520 and NAG 20340, which will be described further below. Control field outputs of CQCS 25510 and CQCE 25514 are provided as inputs to OPB 20322, described further below.

c.c. Execute Unit S-Interpreter Table 20344

Referring to EUSITT 20344, as described above EUSITT 20344 is a memory for storing sequences of microinstructions for controlling operation of EU 10122 in response to EU 10122 Dispatch Pointers received from FU 10120. These microinstruction sequences may, in general, direct operation of EU 10122 to execute arithmetic operations in response to SOPs of user's programs, or aid direct execution of EU 10122 operations required to service JP 10114 Events. EUSITT 20344 may be, for example, a 60 bit wide by 1,280 word long memory structured as pages of 128 words per page. A portion of EUSITT 20344's pages may be contained in Read Only Memory, for example for storing sequence of microinstructions for handling JP 10114 Events. Remaining portions of EUSITT 20344 may be constructed of Random Access Memory, for example for storing sequences of microinstructions for executing EU 10122 operations in response to user program SOPs. This structure allows EU 10122 microinstruction sequences concerned with operation of JP 10114's internal mechanisms, for example handling of JP 10114 Events, to be effectively permanently stored in EUSITT 20344. That portion of EUSITT 20344 constructed of Random Access Memory may be used to store sequences of microinstructions for executing SOPs. These Random Access Memories may be used as writable control store to allow sequences of microinstructions for executing SOPs of one or more S-Languages currently being utilized by CS 10110 to be written into EUSITT 20344 from MEM 10112 as required.

As previously described, EUSITT 20344's second input is a Data (DATA) input connected from JPD Bus 10142. EUSITT 20344's data input is utilized to write sequences of microinstructions into EUSITT 20344 from MEM 10112 through JPD Bus 10142. EUSITT 20344's first input is an address (ADR) input connected from output of Address Driver (ADRD) 25522 and NAG 20340. Address inputs provided by ADRD 25522 select word locations within EUSITT 20344 for writing of microinstructions into EUSITT 20344, or for reading of microinstructions from EUSITT 20344 to mCRD 20346 to control operation of EU 10122. Generation of these address inputs to EUSITT 20344 by NAG 20340 will be described further below.

d.d. Microcode Control Decode Register 20346

Output of EUSITT 20344 is connected to input of mCRD 20346. As previously described, mCRD 20346 is a register for receiving microinstructions from EUSITT 20344, and decoding logic for decoding those microinstructions and providing corresponding control signals to EU 10122. As indicated in FIG. 255, Diagnostic Processor Micro-Program Register (DPmR) 25524 is a 60 bit register connected in parallel with output of EUSITT 20344 to input of mCRD 20346. DPmR 25524 may be loaded with 60 bit microinstructions by DP 10118. Diagnostic microinstructions may thereby be provided directly to input of mCRD 20346 to provide direct microinstruction by microinstruction control of EU 10122.

Outputs of mCRD 20346 are provided, in general, to all portions of EU 10122 to control detailed operations of EU 10122. Certain outputs of mCRD 20346 are connected to inputs of Next Address Source Select Multiplexer (NASS) 25526 and Long Branch Page Address Gate (LBPAG) 25528 and NAG 20340. As will be described further below, these outputs of mCRD 23046 are used in generating address inputs to EUSITT 20344 when particular microinstructions sequences call for Jumps or Long Branches to other microinstruction sequences. Outputs of mCRD 20346 are also connected in parallel to inputs of Execution Unit Micro-Instruction Parity Check Logic (EUmIPC) 25530. EUmIPC 25530 checks parity of all microinstruction outputs of mCRD 20346 to detected errors in mCRD 20346's outputs.

e.e. Next Address Generator 20340

As described above, read and write addresses to EUSITT 20344 provided by NAG 20340 through ADRD 25522. Address inputs to ADRD 25522 are provided from either NASS 25526 or Diagnostic Processor Address Register (DPAR) 25532. In normal operation, address inputs to EUSITT 20344 are provided from NASS 25526 as will be described momentarily. DP 10118, however, may load EUSITT 20344 addresses into DPAR 25532. These addresses may then be read from DPAR 25532 through ADRD 25522 to individually select address locations within EUSITT 20344. DPAR 25532 may be utilized, in particular, to provide addresses to allow stepping through of EU 10122 microinstruction sequences microinstruction by microinstruction.

As described above, NASS 25526 is a multiplexer having inputs from three NAG 20340 address sources. NASS 25526's first address input is from Jump (JMP) output of mCRD 20346 and LBPAG 25528. These address inputs are utilized, in part, when a current microinstruction calls for a Jump or Long Branch to another microinstruction or microinstruction sequence. Second address source is provided from SAS 25520 and, in general, is comprised of starting addresses of microinstruction sequences. SAS 25520 is a muliplexer having a first input from CQAS 25512 and CQAE 25516, that is starting addresses of microinstruction sequences corresponding to SOPs or for servicing JP 10114 Events. A second SAS 25520 input is provided from Sub-routine Return Address Stack (SUBRA) 25534. In general, and as will be described further below, SUBRA 25534 operates as a stack mechanism for storing current microinstruction addresses of interrupted microinstruction sequences. These stored addresses may subsequently be utilized to resume execution of those interrupted microinstruction sequences. Third address source to NASS 25526 is provided from Sequential and Case Address Generator (SCAG) 25536. In general, SCAG 25536 generates address to select sequential microinstructions within particular microinstruction sequences SCAG 25536 also generates microinstruction address for microinstruction Case operations. As indicated in FIG. 255, outputs of SCAG 25536 and of SAS 25520 are bused together to comprise a single NASS 25526 input. Selection between outputs of SCAG 25536 and SAS 25520 are provided by control inputs (not shown for clarity of presentation) to SCAG 25536 and SAS 25520. Selection between NASS 25526's address inputs is controlled by Next Address Source Select Control Logic (NASSC) 25538, which provides control inputs to NASS 25526. NASSC 25538 is effectively a multiplexer receiving control inputs from TSTCON 20386 and TSTINT 20320. As will be described further below, TSTCON 20386 monitors certain operating conditions or states within EU 10122 and provides corresponding inputs to NASSC 25538. NASSC 25538 effectively decodes these control inputs from TSTCON 20386 to provide selection control input to NASS 25526.

Having described overall structure and operation of NAG 20340, operation of NAG 20340 will be described in further detail next below.

Referring first to NASS 25526's address inputs provided from JMP output of mCRD 20346 and LBPAG 25528, this address source is provided to allow selection of a next microinstruction by a current microinstruction. JMP output of mCRD 20346 allows a current microinstruction to direct a Jump to another microinstruction within the same page of EUSITT 20344. NASS 25526's input through LBPAG 25528 is provided from another portion of mCRD 20346's output specifying pages within EUSITT 20344. This input through LBPAG 25528 allows execution of Long Branch operations, that is jumps from a microinstruction in one page of EUSITT 20344 to a microinstruction in another page. In addition, NASS 25526's input from JMP output of mCRD 20346 and through LBPAG 25528 is utilized to execute an Idle, or Standby, routine when EU 10122 is not currently executing a microinstruction sequence requested by FU 10120. In this case, Idle routine directs TSTCON 20386 to monitor EU 10122 Dispatch Pointer inputs to EU 10122 from FU 10120. If no EU 10122 Dispatch Pointers are present in COMQ 20342, or none are pending, TSTCON 20386 will direct NASSC 25538 to provide control inputs to NASS 25526 to select NASS 25526's input from mCRD 20346 and LBPAG 25528. Idle routine will continually test for EU 10122 Dispatch Pointer inputs until such a Dispatch Pointer is received into COMQ 20342. At this time, TSTCON 20386 will detect the pending Dispatch Pointer and direct NASS 25538 to provide control outputs to NASS 25526 to select NASS 25526's input from, in general, SAS 25520. TSTCON 20386 and NASSC 25538 will also direct NASS 25526 to select inputs from SAS 25520 upon return from a called microinstruction to a previously interrupted microinstruction sequence.

As described above, SAS 25520 receives starting addresses from COMQ 20342 and from SUBRA 25534. SAS 25520 will select the output of CQAS 25512 or of CQAE 25516 as the input to NASS 25526 when a new microinstruction sequence is to be initiated to execute a user's program SOP or to service a JP 10114 Event. SAS 25520 will select an address output of SUBRA 25534 upon return from a called sub-routine to a previously executing but interrupted sub-routine. SUBRA 25534, as described above, is effectively a stack mechanism for storing addresses of currently executing microinstructions when those microinstruction sequences are interrupted. SUBRA 25534 is an 11 bit wide by 8 word deep register with certain registers dedicated for use in stacking Event Handling microinstruction sequences. Other portions of SUBRA 25534 are utilized for stacking of microinstruction sequences for executing SOPs, that is for stacking microinstruction sequences wherein a first microinstruction sequence calls for a second microinstruction sequence. SUBRA 25534 is not operated as a first-in-first out stack, but as a random access memory wherein address inputs selecting registers and SUBRA 25534 are provided by microinstruction control outputs of mCRD 20346. Operations of SUBRA 25534 as a stack mechanism is thereby controlled by the microinstruction sequences stored in EUSITT 20344. As indicated in FIG. 255, addresses of current microinstructions of interrupted microinstruction sequences are provided to data input of SUBRA 25534 from output of SCAG 25536, which will be described next below.

As described above, SCAG 25536 generates sequential addresses to select sequential microinstructions within microinstruction sequences and to generate microinstruction addresses for Case operations. SCAG 25536 includes Next Address Register (NXTR) 25540, Next Address Arithmetic and Logic Unit (NAALU) 25542, and SCASE 25518. NAALU 25542 is a 12 bit arithmetic and logic unit. A first eleven bit input of NAALU 25542 is connected from output of ADRD 25522 and is thereby current address provided to EUSITT 20344. A second four bit input to NAALU 25542 is provided from output of SCASE 25518. During sequential execution of a microinstruction sequence, output of SCASE 25518 is binary zeros and carry input of NAALU is forced to 1. Output of NAALU 25542 will thereby be and address one greater than the current microinstruction address provided to EUSIT 20344 and will thereby be the address of the next sequential microinstruction. As indicated in FIG. 255, SCASE 25518 receives an input from output of SCALER 20338. This input is utilized during Case operations and allows a data sensitive number to be selected as SCASE 25518's output into second input of NAALU 25542. SCASE 25518's input from SCALER 20338 thereby allows NAG 20340 to perform microinstruction Case operations wherein Case Values are determined by the contents of SCALER 20338.

Next address outputs of NAALU 25542 are loaded into NXTR 25540, which is comprised of tri-state output registers. Next address outputs of NXTR 25540 are connected, in common with outputs of SAS 25520, to second input of NASS 25526 as described above. During normal execution of microinstruction sequences, therefore, SCAG 25536 will, through NASS 25526 and ADRD 25522, select sequential microinstructions from EUSITT 20344. SCAG 25536 may also, as just described, provide next microinstruction addresses in microinstruction Case operations.

In summary, NAG 20340 is capable of performing all usual microinstruction sequence addressing operations. For example, NAG 20340 allows selection of next microinstructions by current microinstructions, either for Jump operations or Long Branch operations, through NASS 25526's input from mCRD 20346's JMP or through LBPAG 25528. NAG 20340 may provide microinstruction sequence starting addresses through COMQ 20342 and SAS 25520, or may provide return addresses to interrupted and stacked microinstruction sequences through SUBRA 25534 and SAS 25520. NAG 20340 may sequentially address microinstructions of a particular microinstruction sequence through operation of SCAG 25536, or may perform microinstruction Case operations through SCAG 25536.

2. Operand Buffer 20322 (FIG. 256)

Having described structure and operation of EUCL 20310, structure and operation of OPB 20322 will be described next below. As previously described, OPB 20322 receives operands, that is data, from MEM 10112 and FU 10120 through MOD Bus 10144 and JPD Bus 10142. OPB 20322 may then perform certain operand format translations to provide data to MULT 20314 and EXP 20316 in the formats most efficiently utilized by MULT 20314 and EXP 20316. As previously described, EU 10122 may perform arithmetic operations on integer, packed and unpacked decimal, and single or double precision floating point numbers.

Single precision floating point operands are comprised of single 32 bit words wherein each 32 bit word is comprised of an eight bit exponent field and a 24 bit mantissa field. Double precision floating point operands are comprised of an 8 bit exponent field and a 56 bit mantissa field. Double precision floating point operands are read into OPB 20322 as two 32 bit words wherein first word is comprised of 8 bit exponent field and the 24 most significant bits of mantissa field. Second word of a double precision floating point operand is comprised of the 32 least significant bits of mantissa field. Integer operands are comprised of single 32 bit words containing information in binary code. Packed decimal operands are comprised of single 32 bit words which are in turn comprised of 8 four bit Binary Coded Decimal (BCD) fields. Unpacked decimal operands are comprised of two 32 bit words wherein each word is comprised of four 8 bit fields containing numeric ASCI characters. Each ASCI character is comprised of a four bit field containing a decimal number in BCD code and a four bit zone field. As in the case of double precision floating point operands, the two 32 bit words of unpacked decimal operands are read into OPB 20322 sequentially. In alternate embodiments of CS 10110 and EU 10122, integer and packed decimal operands may be expanded to 64 bit (2 word) operands wherein the two 32 bit words are operated upon sequentially. As described above and will be described further below, OPB 20322 accepts operands in these formats from MEM 10112 and FU 10120 and converts these operands into formats most efficiently utilized by EU 10122 or arithmetic operations.

Figure 256:
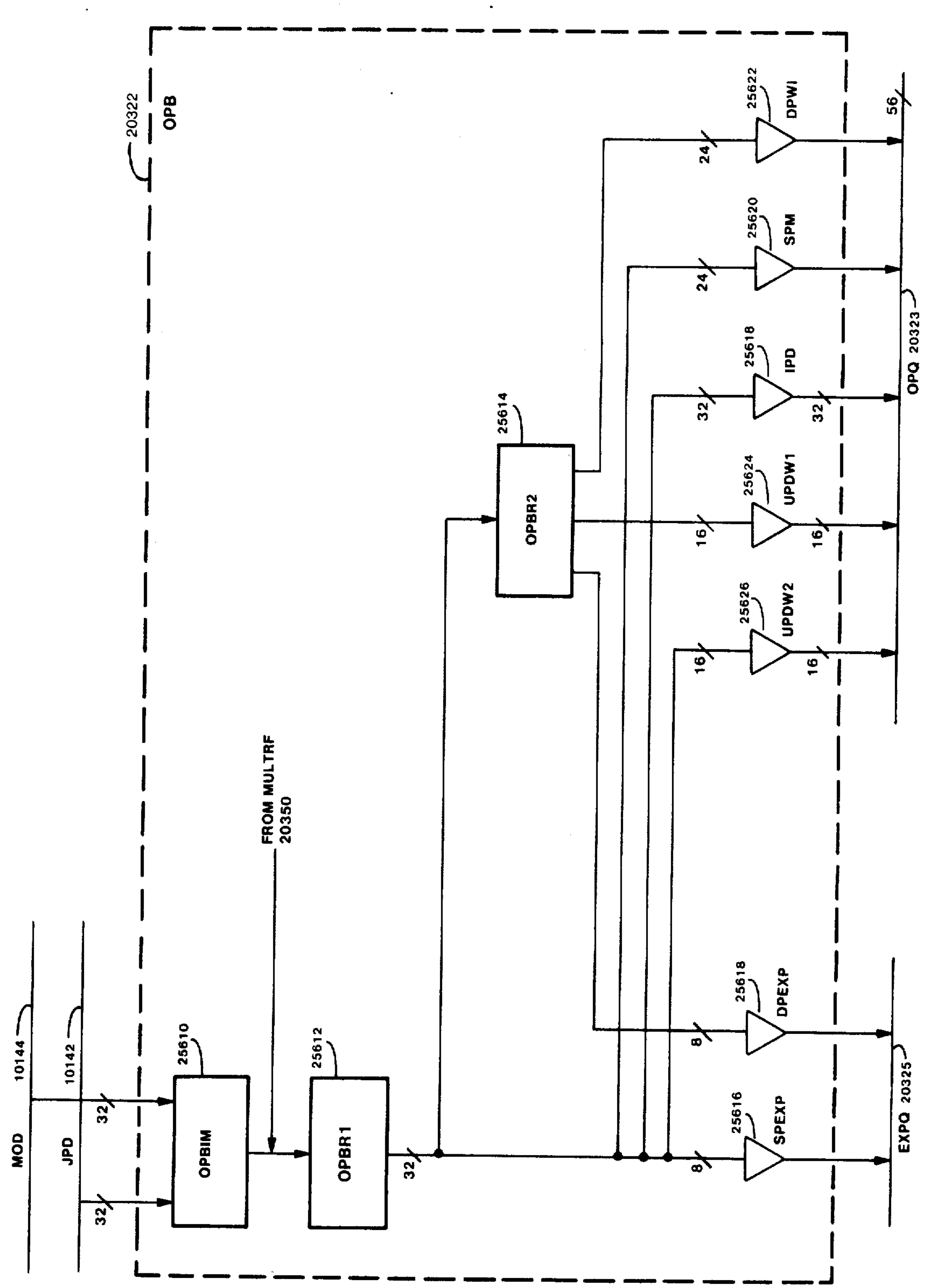
FIG. 256 is a detailed block diagram of an execute unit operand buffer.

Referring to FIG. 256, a more detailed block diagram of OPB 20322 is shown. As shown therein, OPB 20322 includes dual 32 bit input multiplexer Operand Buffer Input Multiplexer (OPBIM) 25610, 32 bit Operand Buffer Register 1 (OPBR1) 25612, 32 bit Operand Buffer Register 2 (OPBR2) 25614, and certain driver gates connected between outputs of OPBR1 25612 and OPBR2 25614 and EXPQ Bus 20325 and OPQ Bus 20323.

First and second 32 bit inputs of OPBIM 25610 are connected from, respectively, MOD Bus 10144 and JPD Bus 10142. Thirty-two bit output of OPBIM 25610 is connected to data input of OPBR1 25612 and a 32 bit output from MULTRF 20350 is connected in parallel with output of OPBIM 25610 to data input of OPBR1 25612. Thirty-two bit output of OPBR1 25612 is connected, in part, to data input of OPBR2 25614. Thirty-two bit words appearing upon either MOD Bus 10144 or JPD Bus 10142 may thereby be transferred through OPBIM 25610 and written into OPBR1 25612. Similarly, 32 bit outputs of MULTRF 20350 may be written into OPBR1 25612. Thirty-two bit words may then be read from OPBR1 25612 and written into OPBR2 25614.

As described above, integer, single precision floating point, and packed decimal operands are each comprised of single 32 bit words. In these cases, the single 32 bit words of these operands are read into OPBR1 25612 and, as described further below, read from OPBR1 25612 to EXPQ Bus 20325 and OPQ Bus 20323. Unpacked decimal and double precision floating point operands, however, are comprised of two 32 bit words. In these cases, first 32 bit word of these operands is transferred throuh OPBR1 25612 and written into OPBR2 25614 while second 32 bit word of these operands is written into OPBR1 25612.

At conclusion of transfer of single word operands, such as integer, packed decimal or single precision floating point operands, into OPB 20322 those operands will be present in OPBR1 25612. At conclusion of transfer of two word operands into OPB 20322, such as unpacked decimal or double precision floating point operands, first word of those operands will be present in OPBR2 25614 and second word of this operand will be present in OPBR1 25612.

As stated above, certain gates are connected between outputs of OPBR1 25612 and OPBR2 25614 to transfer operands therein onto EXPQ Bus 20325 and OPQ Bus 20323. Referring first to EXPQ Bus 20325, as previously described exponent fields of single and double precision floating point operands are transferred onto EXPQ Bus 20325 to be provided to EXP 20316 for subsequent use and arithmetic operations. As described above, single precision floating point operands are single word operands, and eight bit exponent field of single precision operands will be present in OPBR1 25612. A double precision floating point number is a two word operand wherein eight bit exponent field is contained within first word and thereby is present in OPBR2 25614. Accordingly, Single Precision Exponent Drivers (SPEXP) 25616 is connected from those outputs of OPBR1 25612 upon which eight bit field of single precision floating point operands appears. Double Precision Exponent Drivers (DPEXP) 25618 is connected from those outputs of OPBR2 25614 upon which appear exponent field of double precision loading operands Outputs of SPEXP 25616 and DPEXP 25618 are connected to EXPQ Bus 20325 to transfer exponent fields of single and double precision floating point operands from, respectively, OPBR1 25612 and OPBR2 25614 onto EXPQ Bus 20325.

Referring to OPQ Bus 20323, as previously described OPQ Bus 20323 transfers mantissa fields of single and double precision floating point operands, integer operands, packed decimal operands, and BCD fields of unpacked operands from OPB Bus 20322 to MULT 20314 for subsequent use in arithmetic operations. Considering first integer and packed decimal operands, as described above these operands are single, 32 bit word operands and appear in OPBR1 25612. Integer and packed decimal operands are read from OPBR1 25612 to OPQ Bus 20323 through 32 bit Integer and Packed Decimal driver (IPD) 25618 whose inputs are connected from outputs of OPBR1 25612 and whose outputs are connected onto OPQ Bus 20323. Signed integer operands are sign extended on the 24 most significant bits of OPQ Bus 20323. Unsigned integer operands and decimal operands, described below, are zero extended.

Single precision floating point operands are single, 32 bit word operands appearing in OPBR1 25612. As described above, 8 bit exponent fields of single precision floating point operands are read from OPBR1 25612 to EXPQ Bus 20325 through SPEXP 25616. Twenty-four bit mantissa fields of single precision floating point operands are read from OPBR1 25612 to OPQ Bus 20323 through 24 bit Single Precision Mantissa drivers (SPM) 25620. As indicated in FIG. 256, inputs of SPM 25620 are connected from outputs of OPBR1 25612 and outputs of SPM 25620 are connected onto OPQ Bus 20323.

In the case of single precision floating point operands, o's are forced onto the 32 least significant bits of OPQ Bus 20323.

Double precision floating point operands are, as described above, comprised of two 32 bit words with 8 bit exponent field and 24 least significant bits of mantissa field appearing in OPBR2 25614 and 32 least significant bits of mantissa field appearing in OPBR1 25612. The 32 least significant bits of a double precision floating point operand appearing in OPBR1 25612 are read onto OPQ Bus 20323 through IPD 25618. The 24 most significant bits of a double precision floating point operand are read from OPBR2 25614 to OPQ Bus 20323 through 24 bit Double Precision Word One drivers (DPW1) 25622. As indicated in FIG. 256, inputs of DPW1 25622 are connected from outputs of OPBR2 25614 and outputs of DPW1 25622 are connected onto OPQ Bus 20323.

Unpacked decimal operands are, as described above, comprised of two 32 bit words wherein each word is comprised of four 8 bit ASCI characters. Each ASCI character is comprised of a four bit BCD code expressing numeric value of that character, and a four bit zone field. Word one of an unpacked decimal operand will appear in OPBR2 25614 while word two will appear in OPBR1 25612. As will be described further below, MULT 20314 is designed to operate efficiently with packed decimal operands, that is with decimal numbers expressed in four bit BCD code. As indicated in FIG. 256, inputs of 16 bit Unpacked Decimal Word One Drivers (UPDW1) 25624 and of 16 bit Unpacked Decimal Word Two Drivers (UPDW2) 25626 are connected to certain outputs of, respectively, OPBR2 25614 and OPBR1 25612. Sixteen bit outputs of UPDW1 25624 and UPDW2 25626 are connected onto OPQ Bus 20323. Inputs of UPDW1 25624 and UPDW2 25626 are connected to those 16 output bits of OPBR2 25614 and OPBR1 25612 upon which the binary coded decimal fields of ASCI contained therein appear. That is, UPDW1 25624 and UPDW2 25626 read only the four bit BCD code fields of the ASCI characters of unpacked decimal operands from OPBR2 25614 and OPBR1 25612 onto OPQ Bus 20323. UPDW1 25624 and UPDW2 25626 thereby transform a 64 bit unpacked decimal operand present in OPBR2 25614 and OPBR1 25612 into a 32 bit packed decimal operand appearing upon OPQ Bus 20323.

In summary, therefore, OPB 20322 is capable of accepting integer, single and double precision floating point, and packed and unpacked decimal operands from MEM 10112 and FU 10120 and providing appropriate fields of those operands to MULT 20314 and EXP 20316 in the formats most efficiently utilized by MULT 20314 and EXP 20316. In doing so, OPB 20322 extracts exponent and mantissa fields from single and double precision floating point operands to provide exponent and mantissa fields of these operands to, respectively, EXP 20316 and MULT 20314, and also unpacks, or converts, unpacked decimal operands to packed decimal operands most efficiently utilized by MULT 20314.

Having described structure and operation of OPB 20322, structure and operation of MULT 20314 will be described next below.

3. Multiplier 20314 (FIGS. 257, 258)

MULT 20314, as previously described, performs addition, subtraction, multiplication, and division operations on mantissa fields of single and double precision floating point operands, integer operands, and decimal operands. As described above with reference to OPB 20322, OPB 20322 converts unpacked decimal operands to packed decimal operands to be operated upon by MULT 20314. MULT 20314 is thereby effectively capable of performing all arithmetic operations on unpacked decimal operands.

a.a. Multiplier 20314 Data Paths and Memory (FIG. 257)

Figure 257:
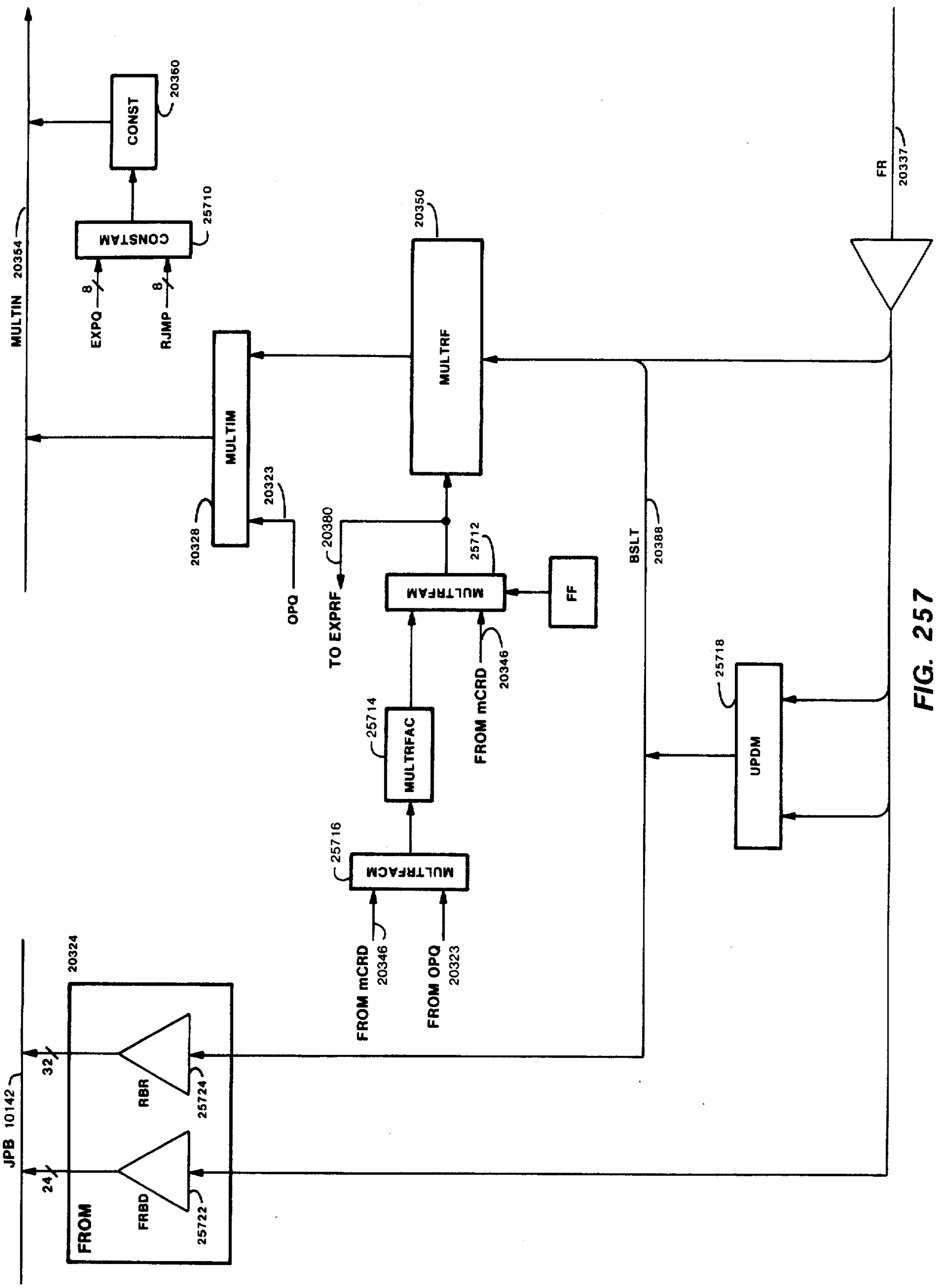
FIG. 257 is a detailed block diagram of execute unit multiplier data paths and memory.
Figure 258:
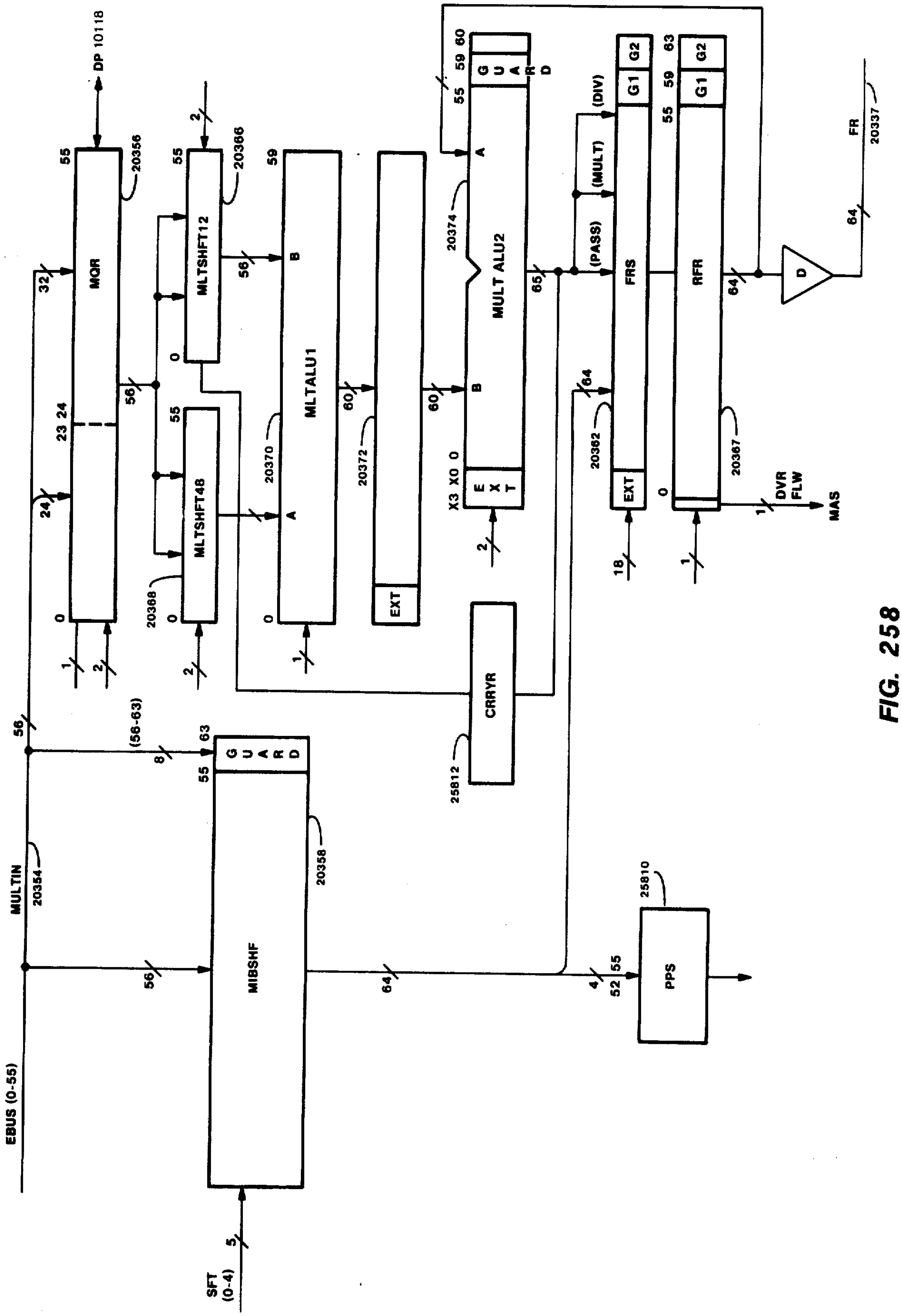
FIG. 258 is a detailed block diagram of execute unit multiplier arithmetic operation logic.

Referring to FIG. 257, a more detailed block diagram of MULT 20314's data paths and memory is shown. As previously described, major elements of MULT 20314 include memory elements comprised of MULTRF 20350 and CONST 20360, operand input and result output multiplexing logic including MULTIM 20328 and MULTRM 20334, and arithmetic operation logic. MULT 20314's operand input and result output multiplexing logic and memory elements will be described first, followed by description of MULT 20314's arithmetic operation logic.

As previously described, input data, including operands, is provided to MULT 20314's arithmetic operation logic through MULTIN Bus 20354. MULTIN Bus 20354 may be provided with data from three sources. A first source is CONST 20360 which is a 512 word by 32 bit wide Read Only Memory. CONST 20360 is utilized to store constants used in arithmetic operations. In particular, CONST 20360 stores zone fields for unpacked decimal, that is ASCI character, operands. As previously described, unpacked decimal operands are received by OPB 20322 and converted to packed decimal operands for more efficient utilization by MULT 20314. As such, final result outputs generated by MULT 20314 from such operands are in packed decimal format. As will be described below, MULT 20314 may be utilized to convert these packed decimal results into unpacked decimal results by insertion of zone fields. As indicated in FIG. 257, address inputs are provided to CONST 20360 from EXPQ Bus 20325 and from output of mCRD 20346. Selection between these address inputs is provided through CONST Address Multiplexer (CONSTAM) 25710. CONST 20360 addresses will, in general, be provided from EUCL 20310 but alternately may be provided from EXPQ Bus 20325 for special operations.

Operand data is provided to MULTIN Bus 20354 through MULTIM 20328, which is a dual input, 64 bit multiplexer. A first input of MULTIM 20328 is provided from OPQ Bus 20323 and is comprised of operand information provided from OPB 20322. OPQ Bus 20323 is a 56 bit wide bus and operand data appearing thereon may be comprised of 32 bit integer operands; 32 bit packed decimal operands, either provided directly from OPB 20322 or as a result of OPB 20322's conversion of an unpacked decimal to a packed decimal operand; 24 bit single precision operand mantissa fields; or 56 bit double precision floating point operand mantissa fields. As previously described, certain OPQ Bus 20323 may be zero or sign extension filled, depending upon the particular operand.

Second input of MULTIM 20328 is provided from MULTRF 20350. MULTRF 20350 is a 16 word by 64 bit wide random access memory. As indicated in FIGS. 203 and 257, MULTRF 20350 is connected between output of RFR 20336, through FR Bus 20337, and to input of MULT 20314's arithmetic operation logic through MULTIM 20328 and MULTIN Bus 20354. MULTRF 20350 may therefore be utilized as a scratch pad memory for storing intermediate results of arithemetic operations, including reiterative arithmetic operations. In addition, a portion of MULTRF 20350 is utilized, as in GRF 10354, as an EU 10122 Stack Mechanism similar to MIS 10368 and MOS 10370 in FU 10120. Operation of EU 10122 Stack Mechanism will be described in a following descripion of EU 10122's interfaces to MEM 10112 and FU 10120. Address Inputs (ADR) of MULTRF 20350 are provided from Multiplier Register File Address Multiplexer (MULTRFAM) 25712.

MULTRFAM 25712 is a dual four bit multiplexer comprised, for example, of SN74S258s. In addition to address inputs to MULTRF 20350, MULTRFAM 25712 provides address inputs to EXPRF 20380. As previously described, MULTRF 20350 and EXPRF 20380 together comprise an EU 10122 general register file similar to GRF 10354 and FU 10120. As such, MULTRF 20350 and EXPRF 20380 are addressed in parallel to read and write parallel entries from and to MULTRF 20350 and EXPRF 20380. Address inputs to MULTRFAM 25712 are provided, first, from outputs of mCRD 20346, thus providing microinstruction control of addressing of MULTRF 20350 and EXPRF 20380. Second address input to MULTRFAM 25712 is provided from output of Multiplier Register File Address Counter (MULTRFAC) 25714.

MULTRFAC 25714 is a four bit counter and is used to generate sequential addresses to MULTRF 20350 and EXPRF 20380. Initial addresses are loaded into MULTRFAC 25714 from Multiplier Register File Address Counter Multiplexer (MULTRFACM) 25716. MULTRFACM 25716 is a dual four bit multiplexer. Inputs to MULTRFACM 25716 are provided, first, from outputs of mCRD 20346. This input allows microinstruction selection of an initial address to be loaded into MULTRFAC 25714 to be subsequently used and generating sequential MULTRF 20350 and EXPRF 20380 addresses. Second address input to MULTRFACM 25716 is provided from OPQ Bus 20323. MULTRFACM 25716's input from OPQ Bus 20323 allows a single address, or a starting address of a sequence of addresses, to be selected through JPD Bus 10142 or MOD Bus 10144, for example from MEM 10112 or FU 10120.

Intermediate and final result outputs of MULT 20314 arithmetic logic are provided to data inputs of MULTRF 20350 directly from FR Bus 20337 and from MULTRM 20334. Inputs to MULTRM 20334, in turn, are provided from FR Bus 20337 and from output of CONSIZE 20352 and TSTINT 20320.

FR Bus 20337 is a 64 bit bus connected from 64 bit output of RFR 20336 and carries final and intermediate results of MULT 20314 arithmetic operations. As will become apparent in a following description of MULT 20314 arithmetic operation logic, RFR 20336 output, and thus FR Bus 20337, are 64 bits wide. Sixty-four bits are provided to insure retention of all significant data bits of certain MULT 20314 arithmetic operation intermediate results, in particular operations involving double precision floating point 64 bit mantissa fields. In addition, as will be described momentarily and has been previously stated, MULT 20314 may convert a final result in packed decimal format into a final result in unpacked decimal format. In this operation, a single 32 bit, or one word, packed decimal result is converted into a 64 bit, or two word, unpacked decimal format by insertion of zone fields.

As described above, two parallel data paths are provided to transfer information from FR Bus 20337 into MULTRF 20350. First path is directly from FR Bus 20337 and second path is through Unpacked Decimal Multiplexer (UPDM) 25718 of MULTRM 20334. Direct path is utilized for thirty-two bits of information comprising bits 0 to 23 and bits 56 to 63 of FR Bus 20337. Data path through UPDM 25718 may comprise either bits 24 to 55 of FR Bus 20337, which are connected into a first input of UPDM 25718, or bits 40 through 55 which are connected to a second input of UPDM 25718. Single precision floating point numbers are 32 bit numbers plus two or more guard bits and are thus written into MULTRF 20350 through bits 0 to 23 of the direct path into MULTRF 20350 and through first input (bits 24 to 55) of UPDM 25718. Double precision floating point numbers are 5 bits wide, plus guard bits, and thus utilize the direct path into MULTRF 20350 and the path through first input of UPDM 25718. Bits 56 to 63 of direct path are utilized for guard bits of double precision floating point numbers. Both integer and packed decimal numbers utilize bits 24 through 55 of FR Bus 20337, and are thus written into MULTRF 20350 through first input of UPDM 25718. As previously described, bits 0 to 23 of these operands are filled by sign extension.

a.a.a. Packed Decimal to Unpacked Decimal Conversion

In addition to being utilized for direct writing of data into MULTRF 20350, UPDM 25718 is used in unpacking of packed decimal final results to generate unpacked decimal final results. In this operation, a packed decimal result comprising 32 bits of information are separated into two 16 bit words. The two 16 bit words are then transformed into two 32 bit unpacked decimal words by writing the four bit BCD fields of those 16 bit words into appropriate locations in the 32 bit words and inserting zone fields. When this operation is to be performed, the unpacked decimal number will appear as described above on bits 24 to 55 of FR Bus 20337. First input of UPDM 25718 is used to generate first 32 bit word of an unpacked number by extracting the 16 most significant bits, or 4 most significant BCD fields, of packed decimal number from FR Bus 20337. UPDM 25718 transfers these four BCD fields onto appropriate locations of UPDM 25718's 32 bit output and forces zeros into those portions of that 32 bit output which are to contain zone fields. This first 32 bit word is then written into MULTRF 20350. UPDM 25718 then generates a second 32 bit word by extracting the 16 least significant bits, or 4 least significant BCD fields, of packed decimal number from FR Bus 20337 through UPDM 25718's second input. Again, these BCD fields are transferred onto appropriate locations in UPDM 25718's 32 bit output and zeros forced into those output locations which will be occupied by zone fields. This second 32 bit word is then also written into MULTRF 20350. The two 32 words stored in MULTRF 20350 are then transferred, one at a time, into MULT 20314's arithmetic operation logic. Zone fields read from CONST 20360 are added to those two words, in a logical operation, to provide as a final result two 32 bit numbers comprising a single unpacked decimal number. The unpacked decimal final result may then be returned to MULTRF 20350 to be stored or, as described momentarily, transferred onto JPD Bus 10142 to be transferred to FU 10120 or MEM 10112.

b.b.b. Container Size Check

As stated above, MULTRM 20334 has an input from CONSIZE 20352. As will be described below with reference to TSTINT 20320, CONSIZE 20352 performs a "container size" check upon each store back of results from EU 10122 to MEM 10112. CONSIZE 20352 compares the number of significant bits in a result to be stored back to the logical descriptor describing the MEM 10112 address space that result is to be written into. Where reiterative write operations to MEM 10112 are required to transfer a result into MEM 10112, that is a string transfer, container size information may read from CONSIZE 20352 through Container Size Driver (CONSIZED) 25720 and MULTRM 20334 and written into MULTRF 20350. This allows EU 10122, using container size information stored in MULTRM 20350, to perform continuous container size checking during a string transfer of result from EU 10122 to MEM 10112. In addition, as will be described momentarily, container size information may be read from CONSIZE 20352 to JPD Bus 10144.

c.c.c. Final Result Output Multiplexer 20324

Referring finally to PROM 20324, as previously described FROM 20324 is utilized to transfer, in general, results of EU 10122 arithmetic operations onto JPD Bus 10142 for transfer to MEM 10112 or FU 10120. As indicated in FIG. 257, FROM 20324 is comprised of 24 bit Final Result Bus Driver (FRBD) 25722 and Result Bus Driver (RBR) 25724. Input of FRBD 25722 is connected from FR Bus 20337 and allows data appearing thereon to be transferred onto JPD Bus 10142. In particular, FRBD 25722 is utilized to transfer 24 bit mantissa fields of single precision floating point results onto JPD Bus 10142 in parallel with a corresponding exponent field from EXP 20316. RBR 25724 input is connected from RSLT Bus 20388 to allow output of UPDM 25718 to be transferred onto JPD Bus 10142. RBR 25724, RSLT Bus 20388, and UPDM 25718 are used, in general, to transfer final results of EU 10122 operations from output of MULT 20314 onto JPD Bus 10142 Final results transferred by this data path include integer, packed and unpacked decimal results, and mantissa fields of double precision floating point results. Both unpacked decimal numbers and mantissa fields of double precision floating point numbers are comprised of two 32 bit words and are thus transferred onto JPD Bus 10142 in two sequential transfer operations.

Having described structure and operation of MULT 20314's memory elements and input and output circuitry, MULT 20314's arithmetic operation logic will be described next below.

b.b. Multiplier 20314 Arithmetic Operation Logic (FIG. 258)

As previously described, MULT 20314's arithmetic operation logic is capable of performing addition, subtraction, multiplication, and division operations on signed and unsigned integer, packed decimal, and single and double precision floating point number mantissa fields. As will be described further below with reference to EXP 20316, arithmetic operations upon single and double precision floating point operands are executed by MULT 20314 and EXP 20316 operating together.

a.a.a. Multiplier 20314 Internal Data Paths and Multiply/Divide Operations (FIG. 258)

Referring to FIG. 258, a more detailed block diagram of MULT 20314's arithmetic operation logic is shown. As described above, MULT 20314's arithmetic operation and logic includes two data paths which operate cooperatively to perform all MULT 20314 arithmetic operations.

A first data path is provided through 64 bit NIBSHF 20358 which may be comprised, for example, AMD 25S10s. Data inputs of NIBSHF 20358 are connected from MULTIN Bus 20354. NIBSHF 20358 64 bit output is connected to inputs of FRS 20362 and four bits, or one nibble, of NIBSHF 20358's outputs are connected to input of Partial Product Select logic (PPS) 25810. NIBSHF 20358 may be utilized as a 64 bit data path for receiving and storing operands. In particular, NIBSHF 20358 may receive the multiplier operand when a multiplication operation is to be performed, or the denominator (divisor) when a division operation is to be performed. In addition, NIBSHF 20358 may operate as a wrap-around shift register, shifting an operand therein in increments of four bits, or one nibble. In floating point number addition and subtraction operations, it is necessary to equalize the exponent powers, or fields, of floating point operands to be added or subtracted. Effectively, exponent field of one operand is selected to be exponent field of both operands and mantissa field of one operand is right or left shifted by an amount determined by the difference between the exponent fields of the two operands. This operation is referred to as prealignment of operands. Amount by which one operand mantissa field must be shifted to accomplish this prealignment is determined by EXP 20316 as will be described in following description of EXP 20316. In general, prealignment is accomplished by right shifting of mantissa field of the smaller operand. Mantissa field of larger operand is loaded into MQR 20356 and, as described further below, provided to first input of MULTALU 20374 to be added to mantissa field of smaller operand. Mantissa field of smaller operand is then presented to NIBSHF 20358 and right shifted by an amount determined by EXP 20316. Prealigned smaller operand mantissa field may then be transferred from NIBSHF 20358, through FRS 20362, and into RFR 20336. Prealigned smaller operand may then be held in RFR 20336 to be provided to second input of MULTALU 20374.

As will be described further below, multiplication and division operations are generally accomplished by successive generation and, respectively, addition or subtraction of partial products generated from the multiplicand or numerator operand. In multiplication, determination of which partial products are generated is determined by PPS 25810 which examines successive nibbles of the multiplier operand which is shifted by NIBSHF 20358. As described above, PPS 25810 inputs are comprised of four bits, or one nibble, of NIBSHF 20358's 64 bit output. Multiplicand operand is presented to NIBSHF 20358 and right shifted in one nibble increments to allow PPS 25810 to examine successive nibbles of that multiplier operand PPS 25810 is comprised, for example, of a Read Only Memory and, as will be described further below, provides control outputs to MULTSHF48 20368 and to MULTSHFT12 20366 to control generation of partial products.

Second data path of MULT 20314 is provided through MQR 20356. MQR 20356 is a 56 bit register whose data inputs are connected from MULTIN Bus 20354. MQR 20356's 56 bit outputs are connected to inputs of MULTSHFT48 20368 and MULTSHFT12 20366. During addition and subtraction operations, MQR 20356 receives and stores operands which are to be added to or substracted from operands passed through NIBSHF 20358 and stored in RFR 20367. In addition, during multiplication and division operations MQR 20356 receives and stores multiplicand and numerator operands. MQR 20356 may also be utilized as a wrap-around shift register capable of shifting an operand contained therein in increments of one bit. This function is utilized during division operations when MULT 20314 executes a one bit at a time nonrestoring divide algorithm. In this divide algorithm, divisor operand resides in RFR 20336 and is successively subtracted from numerator operands. Partial remainders are stored in RFR 20367 with the remainder being left shifted by one bit upon each successive subtraction. MQR 20356 may be comprised, for example, of SN74S194s.

b.b.b. Multiplication, Partial Products

As previously described, MULTSHFT48 20368 and MULTSHFT12 20366, together with MULTALU1 20370, are utilized to generate partial products during multiplication operations. Multiplication operations are accomplished by successive summation of partial products generated from a multiplicand operand. The particular partial products generated and summed are determined by multiplier nibbles presented at output of NIBSHF 20358. As described above multiplier operand in NIBSHF 20358 is successively right shifted in one nibble increments. Successive nibbles are examined by PPS 25810 to determine which successive multiplicand operand partial products are to be generated and summed. MULTSHFT48 20368 and MULTSHFT12 20366 are each 56 bit two to one multiplexers comprised, for example, of SN74S157s.

An operand appearing at first input of MULTSHFT12 20366 from output of MQR 20356 is passed directly through to output of MULTSHFT12 20366 and is thus effectively multiplied by one. An operand appearing at second input of MULTSHFT12 20366 from MQR 20356 appears at output of MULTSHFT12 20366 shifted one bit to the left and is thus effectively multiplied by two. An operand appearing at first input of MULTSHFT48 20368 from output of MQR 20356 appears at output of MULTSHFT48 20368 shifted two bits to the left and is thus effectively multiplied by four. An input appearing at second input of MULTSHFT48 20368 appears at output of MULTSHFT48 20368 shifted three bits to the left and is thus effectively multiplied by eight. In addition, PPS 25810 may selectively force each output of MULTSHFT12 20366 and MULTSHFT48 20368 to zero. This may be used, for example, to pass data directly through MULTSHF12 20366 to MULTALU1 20370.

Output of MULTSHFT12 20366 and MULTSHFT48 20368 are connected, respectively, to inputs of MULTALU1 20370. MULTALU1 20370 is a 56 bit arithmetic and logic unit comprised, for example, of SN74S381s, and operates under control of outputs from PPS 25810. MULTALU1 20370 is capable of adding and subtracting outputs of MULTSHFT12 20366 and MULTSHFT48 20368 to generate selected partial products which are multiples of operands stored in MQR 20356. For example, when multiplying two operands, a particular nibble of multiplier operand in NIBSHF 20358 may determine that a partial product equal to three times the value of multiplicand M stored in MQR 20356 is required. If so, MULTSHFT12 20366, under control of PPS 25810, will provide an output equal to one times M while MULTSHFT48 20368 will provide an output equal to four times M. MULTALU1 20370, again operating under control PPS 25810, will then subtract output of MULTSHFT12 20366 from output of MULTSHFT48 20368 to provide a final output equal to 3×M. MULTSHFT12 20366, MULTSHFT48 20368, and MULTALU1 20370 operate in this manner to generate partial products to generate any desired value of partial product between 1Mand 14M where, as stated above, M is the value of operand stored in MQR 20356. If a partial product value of 15×M is required, this operation is executed as two partial products. A first partial product equal to −1×M is generated during a first arithmetic operation and a partial product value of 16×M generated during a second arithmetic operation. When partial products are subsequently summed by MULTALU2 20374, as described further below, final result of summation of these two partial products is effectively a partial product of 15×M. When such a two stage partial product generation is required, PPS 25810 recognizes this condition and, utilizing an internal register, carries forward the 16×M operation as an input to the partial product operation of the next nibble of the multiplier operand stored in NIBSHF 20358.

In summary, MULTSHFT12 20366, MULTSHFT48 20368 and MULTALU1 20370 operate under control of PPS 25810 as required by the nibbles of a multiplier operand present at output of NIBSHF 20358 to generate successive partial products of multiplicand operands stored in MQR 20356. When MULT 20314 is not executing a multiplication operation, MULTSHFT12 20366, MULTSHFT48 20368 and MULTALU1 20370 operate as a direct feed-through path, through first input of MULTSHFT12 20366 and first input of MULTALU1 20370, thereby allowing an operand stored in MQR 20356 to be loaded directly into MWR 20372.

c.c.c. Main Working Register 20372

WR 20372 is a 60 bit register having data inputs connected from output of MULTALU1 20370 and providing data outputs to first input of MULTALU2 20374. MWR 20372 may be comprised, for example, of SN74S374s and is a main working register of MULT 20314. MWR 20372 receives and holds successive partial products generated during multiplication operations, divisor operands during division operations, and operands for addition and subtraction operations. Generation of partial products to be loaded into MWR 20370 has been described above. In addition and subtraction operations, one of the operands to be added or subtracted is loaded into MWR 20370 through the path comprising MULTIN Bus 20354, MQR 20356, first input of MULTSHFT12 20366, and first input of MULTALU1 20370. Second operand of an addition or subtraction operation is read from MULTIN Bus 20354 to NIBSHF 20358 and from NIBSHF 20358 through FRS 20362 and RFR 20336. Second operand of an addition or subtraction operation may then be provided to second input of MULTALU2 20374 from output of RFR 20336 while first operand is, as described above, provided to first input MULTALU2 20374 from MWR 20372. During multiplication operations, a current partial product is held in MWR 20372 and provided to first input of MULTALU2 20374 while the summed value of previously generated and added partial products is held in RFR 20336 and thus provided to second input of MULTALU2 20374. During division operations, MWR 20372 contains the divisor operand, while the division result resides in MQR 20356.

d.d.d. Multiplier ALU2 20374

MULTALU2 20374 is a 65 bit arithmetic and logic unit comprised, for example, of SN74S381s, and is MULT 20314's primary arithmetic and logic element. As just described, first input of MULTALU2 20374 is provided from MWR 20372 while a second input is provided from output of RFR 20336. MULTALU2 20374 may add or subtract MULTALU2 20374's first and second inputs, from MWR 20372 and RFR 20336, as required to perform all MULT 20314 addition, subtraction, multiplication, and division operations. Output of MULTALU2 20374 is provided to inputs of FRS 20362.

e.e.e. Final Result Shifter 20362

FRS 20362 is a 66 bit multiplexer comprised, for example, of SN74S153s. FRS 20362 is provided with four input sources. A first source is provided from output of NIBSHF 20358 to allow operands to be loaded from MULTIN Bus 20354 through NIBSHF 20358 and FRS 20362 to RFR 20336 as described above. A second input is provided directly from output of MULTALU2 20374 and allows output of MULTALU2 20374 to be passed directly through FRS 20362 and loaded into RFR 20336. Third and fourth inputs of FRS 20362 are also provided from output of MULTALU2 20374 but are shifted relative to FRS 20362's second input from MULTALU2 20374 so that FRS 20362's output is similarly shifted.

A third input is utilized during multiply operations and is shifted four bits, or one nibble, to the right. As will be described further below, a multiplication operation, for example floating point numbers, is executed by generating and adding partial products of hexadecimal characters of increasing values. That is, successive hexadecimal characters of a multiplier operand in NIBSHF 20358 are examined from right to left, that is in direction of increasing value, and corresponding partial products generated from multiplicand operand in MQR 20356. The successive partial products must correspondingly be left shifted by one hexadecimal character, or one nibble, when added to the sum of previous partial products. In MULT 20314, this left shift is accomplished by right shifting of the sum of previous partial products. As previously described, at each stage of a multiplication operation a current partial product provided from MWR 20372 is added, in MULTALU2 20374, to the sum of previous partial products stored in RFR 20336 to generate, as output of MULTALU2 20374, a current sum of partial products. This current sum of partial products is provided to FRS 20362's multiply input and is accordingly right shifted by one nibble, or one hexadecimal character. Right shifted current sum of partial products then appears as output of FRS 20362 and is loaded into RFR 20336 to become previous sum of partial products for next partial product operation of the multiplication.

Fourth input of FRS 20362 is used during division operations. As previously described, MULT 20314 executes a one bit at a time nonrestoring divide algorithm. In a divide operation, numerator operand is transferred through MULTIN Bus 20354, and NIBSHF 20358, and FRS 20362 to be loaded into RFR 20336. Divisor operand is loaded into MWR 20372. The number in RFR 20336 is initially numerator operand and is thereafter remainder term of division operation. Subtraction of successive divisors from numerator, or remainder, value in RFR 20336 is performed by MULTALU2 20374. The successive subtraction operations are executed one bit at a time with both divisor and remainder being right shifted by one bit upon successive subtraction operation. During division operation, current remainder value, that is result of subtraction of a current divisor value from previous remainder value by MULTALU2 20374, is provided to divide input of FRS 20362. Divide input of FRS 20362 is left shifted by one bit relative to direct through-put path so that successive remainder outputs of FRS 20362 to RFR 20336 are successively left shifted by one bit as required for division operation. Quotient operand bits are shifted, one bit at a time, into MQR 20356 to form the operation result.

f.f.f. Final Result Register 20336

. Finally, RFR 20336 is MULT 20314's final result register and may be comprised, for example, of SN74S194s. RFR 20336 may operate as a direct through-put register, or may operate as shift register. RFR 20336's shift capability is utilized during diagnostic operations. As will be described further below, results of floating point arithmetic operations are normalized, that is mantissa field is left shifted and exponent field right shifted, so that there are no zeros in leading, or most significant, hexadecimal characters of mantissa fields. This convention is utilized to insure retention of all significant bits of results of floating point number arithmetic operations. As will be described further below, LZD 20376 examines final results of floating point number arithmetic operations in RFR 20336 to detect whether one or more leading hexadecimal characters thereof contain zeros. If such zeros are detected, LZD 20376 provides control outputs to EXP 20316 and to RFR 20336 to shift floating point number result mantissa and exponent fields to normalize the results of floating point number arithmetic operations. Right shifts of mantissa field are performed by RFR 20336, while left shifts of mantissa fields are performed by NIBSHF 20358. In left shifting a mantissa field, that field is transferred to NIBSHF 20358 from RFR 20336 through MULTRF 20350 and LZD 20376 generators a shift amount control output to NIBSHF 20358.

As indicated in FIG. 258, RFR 20336 includes a 65th bit providing an output designated as Overflow (OVRFLW). Certain MULT 20314 arithmetic may result in an overflow, that is a numeric result greater than 64 bits in length. Such an overflow may result from, for example, an arithmetic operation performed by MULTALU2 20374 or from a left shift operation executed by FRS 20362. RFR 20336's 65th bit register is provided to capture such overflow bits and to provide OVRFLW to MULTCNT 20364. MULTCNT 20364 may then provide control output to NIBSHF 20358 to right shift the number contained therein and thus preserve the most significant overflow bit. In addition to detecting overflow events, MULTALU2 20374, FRS 20362, and RFR 20336 each contain two bits of information which are utilized as guard bits to prevent loss of information arising from right shift operations, for example during summation of partial products in a multiplication operation As described above, output of RFR 20336 is, in addition to being provided to second input of MULTALU2 20374, transferred onto FR Bus 20337 and those results provided to inputs of MULTRF 20350, LZD 20376, ECPT 20328, and CONSIZE 20352, and to input of FROM 20324 for transfer onto JPD Bus 10142.

As indicated in FIG. 258, MULT 20314 further includes a Carry Register (CRRYR) having data inputs connected from output of MULTALU2 20374 and having control outputs to MULTSHFT12 20366. Operation of CRRYR 25812 will be described further below in a following description of MULT 20314 arithmetic operations with decimal operands.

c.c. Multiplier 20314 Arithmetic Operations

Having described structure and operation of MULT 20314, operation of MULT 20314 will be further illustrated below with further descriptions of certain arithmetic operations which may be performed by MULT 20314. Arithmetic operations which will be described further below, and the order in which they will be described, include multiplication of floating point numbers and addition and subtraction of decimal numbers. Other features of MULT 20314 operation with respect to integer, decimal, and floating point operands have been described previously, and will be further illustrated by the following specific examples a.a.a. Floating Point Operations In considering first multiplication of two floating point operands, for example single precision floating point operands, one operand is referred to as multiplier operand and the other is multiplicand operand. Each of these operands is comprised of a 24 bit mantissa field and an 8 bit exponent field wherein one bit of exponent field is a sign bit. Each 24 bit mantissa field is structured as six 4 bit, or one nibble, subfields wherein each subfield contains a hexadecimal character, that is a 4 bit binary number having value between zero and 15. As described above and will be described further below, exponent fields of multiplier and multiplicand operands are read from OPB 20322 to EXP 20316 through EXPQ Bus 20325. Concurrently, mantissa fields of multiplier and multiplicand operands are read from OPB 20322 to MULT 20314 through OPQ Bus 20323 and MULTIM 20328. Multiplier mantissa field is written through MULTIN Bus 20354, into NIBSHF 20358. Multiplicand mantissa field is written, through MULTIN Bus 20354 into MQR 20356. At this time, contents of RFR 20336 and of MWR 20372 are set to zero.

Input of PPS 25810, at this time, is the least significant character of multiplier mantissa field from NIBSHF 20358. From this input, PPS 25810 generates control signals to MULTSHFT12 20366, MULTSHFT48 20368, and MULTALU1 20370 to generate first, or least significant, partial product of the multiplication operation. First partial product represents, the product of the least significant character of multiplier mantissa field times the multiplicand mantissa field stored in MQR 20356. If, for example, the numeric value of least significant multiplier mantissa field character is equal to three, PPS 25810 will provide control outputs selecting first input of MULTSHFT12 20366, and first input of MULTSHFT48 20368. First and second inputs of MULTALU1 20370 will thereby respectively represent values equal to one times and four times multiplier mantissa field stored in MQR 20356. Control outputs of PPS 25810 will direct MULTALU1 20370 to subtract MULTALU1 20370's first input from MULTALU1 20370's second output so that output of MULTALU1 20370 will be a hexadecimal character number representing three times the value of multiplicand mantissa field. This first output of MULTALU1 20370 is thereby first partial product of the multiplication operation. In generating partial products, it should be noted that certain partial products may be generated directly by selecting a single input of MULTSHFT12 20366 or MULTSHFT48 20368; for example, partial products equal to one, two, four, and eight times multiplicand mantissa field may be so generated directly. Certain other partial products require addition and subtraction of outputs of both MULTSHFT12 20366 and MULTSHFT48 20368. For example, as described above a partial product of three times multiplicand mantissa field is generated, effectively, as four times multiplicand mantissa field minus one times multiplicand mantissa field. This is accomplished by selecting first inputs of both MULTSHFT12 20366 and MULTSHFT48 20368 and subtracting output of MULTSHFT12 20366 from output of MULTSHFT48 20368. As a further example, a partial product of five times multiplicand mantissa field is generated as four times plus one times that field. Certain partial products, however, are generated during two, successive partial product operations. These partial products lie in the range of between 11 and 15 times value of multiplicand mantissa field. For example, a partial product of 13 times multiplicand mantissa field is generated as 16 times mantissa field minus 3 times mantissa field. During first partial product operation, a partial product of minus three times mantissa field is generated and treated, as described further below, as the partial product for that operation. A carry representing 16 times multiplicand mantissa field is generated and carried forward to next partial product operation. For example, if next partial product originally called for three times multiplicand mantissa field, that next partial product would now call for four times multiplicand mantissa field. As previously described, PPS 25810, as part of normal operation, detects multiplier hexadecimal character values of 11 and greater to automatically provide appropriate control signals to MULTSHFT12 20366, MULTSHFT48 20368, and MULTALU1 20370 to execute such two stage partial product generation operations, including generating and carrying forward of carries. Continuing the discussion, first partial product output of MULTALU1 20370 is loaded into MWR 20372 and provided by MWR 20372 to first input of MULTALU2 20374. MULTALU2 20374 then adds first partial product from MWR 20372 to output of RFR 20336. Output of MULTALU2 20374 is then transferred through FRS 20362, right shifting by 4 bits, and stored in RFR 20336.

MULT 20314 then repeats the above operation to generate a second partial product for next most significant hexadecimal character of multiplier mantissa field by right shifting the contents of NIBSHF 20358 by one nibble and repeating the above operations. In this manner, contents of RFR 20336 represents summation of all partial products generated during the multiplication operation. At conclusion of multiplication operation, which may require an additional partial product step if most significant character of multiplier mantissa field required a two step partial product operation, contents of RFR 20336 represent the multiplied value of multiplier and multiplicand mantissa fields. Multiplication mantissa field results contained in RFR 20336 may then be transferred, as described above, into MULTRF 20350, or transferred onto JPD Bus 10142 in conjunction with results of corresponding exponent field multiplication operations provided from EXP 20316. Double precision floating point multiplication operations are executed in the same manner as described above for single precision operations. Double precision operations require 14 or 15 partial product operations rather than 6 or 7, due to increased length of double precision floating point operand mantissa fields.

b.b.b. Decimal Operations

Having described multiplication of floating point operands, which basic operation may be utilized in multiplication of integer and decimal operands, addition of decimal operands will be described next. As previously described, decimal operands are comprised of binary coded decimal characters of four bits each wherein each character may represent a numeric value between zero and nine. As will be described below, decimal operand addition and subtraction operations are performed utilizing binary arithmetic logic by converting the decimal operands into a format suitable for use in binary arithmetic logic circuits.

Assuming two 32 bit decimal operands are to be added, or subtracted, a first operand is read from OPB 20322 and loaded into MQR 20356. First operand is then transferred through MULTSHFT12 20366 first input and through MULTALU1 20370 and loaded into MWR 20372. At this time, a 32 bit constant word comprised of 8 BCD characters, wherein each character is a BCD 6, is read from CONST 20360 and loaded into MQR 20356. Susequently, first operand is read from MWR 20372 through MULTALU2 20374 and FRS 20362 and loaded into RFR 20336. Concurrently, the constant word is transferred from MQR 20356 through MULTSHFT12 20366 and MULTALU1 20370 and loaded into MWR 20372. First operand, then residing in RFR 20336, is then added to constant word residing in MWR 20372 by MULTALU2 20374 and the result transferred through FRS 20362 and loaded into RFR 20336. During this operation, second decimal operand may be read from OPB 20322 and loaded into MQR 20356, and then transferred into MWR 20372. Second operand is then added, by MULTALU2 20374 to the contents of RFR 20336 which, as stated above, is the sum of first operand and constant word. Output of MULTALU2 20374 is thereby sum of first and second operands and constant word. This output, hereafter referred to intermediate decimal result, is comprised of four bit BCD characters, as were first and second operands and constant word.

As previously described, inputs of CRRYR 25812 are connected from carry outputs of MULTALU2 20374's four bit adders. CRRYR 25812 is utilized during addition or subtraction of decimal characters to capture and store the carry outputs of the individual BCD characters when second operand is added to sum of first operand and constant word to yield intermediate decimal result. Intermediate decimal result is then loaded into RFR 20336 while a second copy of constant is read from CONST 20360 and loaded into MQR 20356. The carry outputs resulting from the MULTALU2 20374 addition operation yielding intermediate decimal result and stored in CRRYR 25812. The carry outputs are then utilized as control inputs to MULTSHFT 12 20366 to select certain characters of second copy of constant word stored in MQR 20356. These selected characters from second copy of constant word are loaded into MWR 20372. In a final addition operation, selected characters of second copy of constant word stored in MWR 20372 are subtracted from intermediate decimal result stored in RFR 20336 by MULTALU2 20374. This final addition operation transforms intermediate decimal result into a final decimal result in BCD format and this final decimal result is loaded into RPR 20336. Final decimal result may then read from RFR 20336 and transferred into MULTRF 20350 or read onto JPD Bus 10142 as previously described.

Decimal operands of more than 8 BCD characters may be added or subtracted as described above by executing successive additions or subtractions of eight decimal characters at a time. MULTRF 20350 is utilized to store the intermediate results of these operations until a final result is achieved Multiplication and division of decimal operands may be similarly performed by performing repetitive addition or subtraction operations of decimal operands as has been described above.

Finally, LZD 20376, previously described and described further below, is utilized in part to enhance speed of execution of multiplication, division, addition, and subtraction operations. LZD 20376 examines successive nibbles of each operand in an arithmetic operation, starting with the most significant, to determine which, if any, leading nibbles contain zeros. In certain cases, for example the most significant nibbles of multiplicands, the arithmetic operation need not be executed for these nibbles as, containing zeros, they will yield zeros in the result. LZD 20376 will provide corresponding control outputs which will cause the arithmetic operation to be correspondingly truncated, thus enhancing speed of execution of the operation by eliminating unnecessary stops of the operation.

MULT 20314 is thereby capable of performing a range of arithmetic operations, including conversion of decimal operands to formats suitable for utilization with binary arithmetic elements and reconversion of results to decimal formats. These operations may be combined or performed in any sequence or combination under control of microinstruction sequences provided by EUCL 20310 to perform any desired or necessary arithmetic operation. A present embodiment of EU 10122 provides microinstruction sequences for performing addition, subtraction, multiplication, and division operations with respect to integer, packed and unpacked decimal, and single and double precision floating point operands. Other embodiments of EU 10122 may provide microinstruction sequences to perform any other selected arithmetic operations involving any other selected operand formats.

Having described structure and operations of MULT 20314, structure and operation of EXP 20316 will be described next below.

4. Exponent Logic 20316 and Multiplier Control 20318 Floating Point Operations (FIG. 259)

a.a. Exponent Logic 20316 and Multiplier Control 20318 Structure (FIG. 259)

Figure 259:
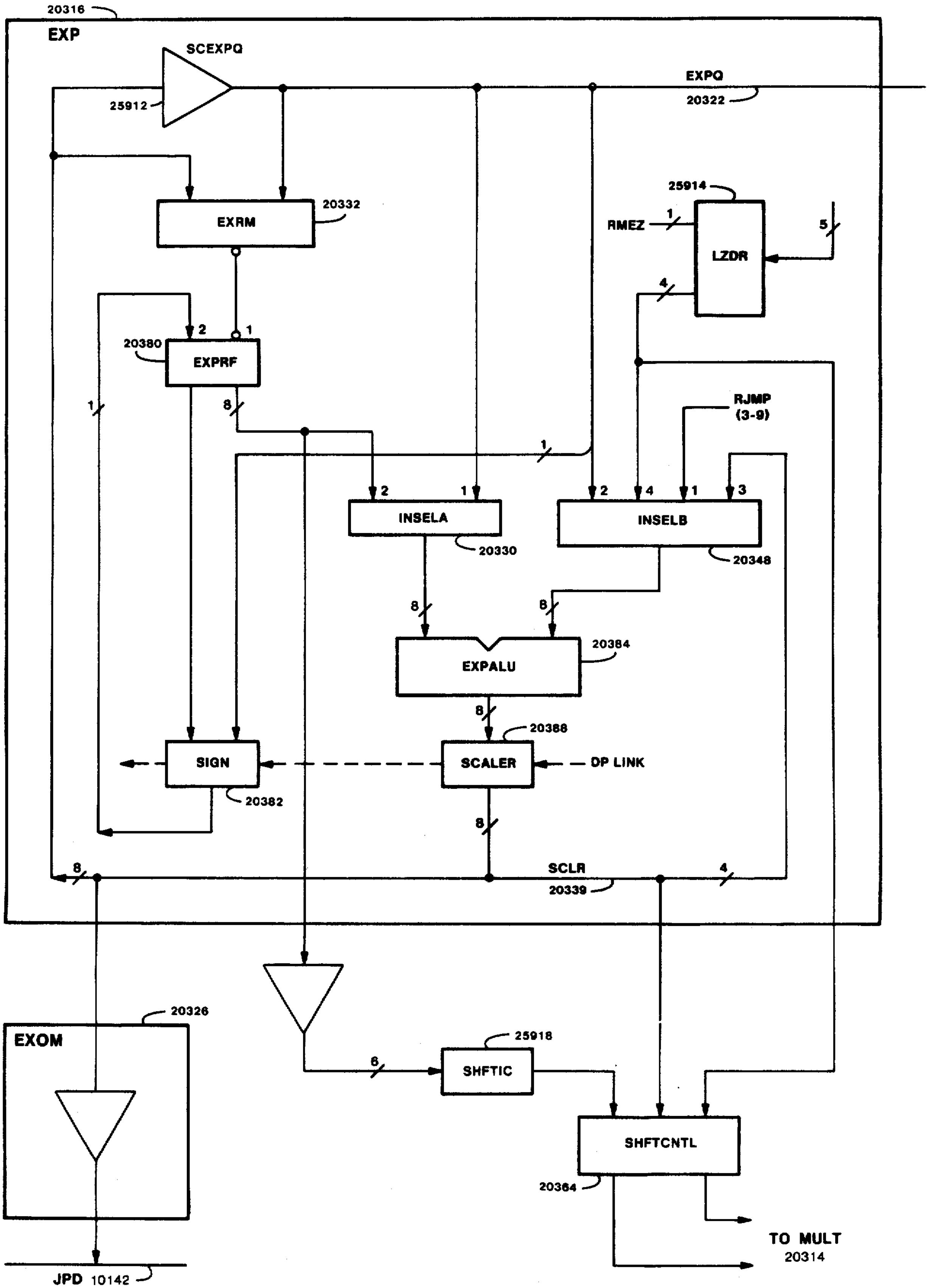
FIG. 259 is a detailed block diagram of execute unit exponent operation and multiplier control logic.

Referring to FIG. 259, EXP 20316 and MULTCNTL 20318 are shown. Referring first to EXP 20316, EXP 20316 is a general purpose unit for executing arithmetic operations and is used, in particular, for arithmetic operations regarding exponent fields of single and double precision floating point operands. Data inputs to EXP 20316 are provided to EXPQ Bus 20325 from OPB 20322. Results of EXP 20316 operations may be transferred from SCALER 20338 to JPD Bus 10142 through EXOM 20326. Alternately, results of EXP 20316 operations from SCALER 20338 may be transferred onto EXPQ Bus 20325 and from EXPQ Bus 20325 onto RSLT Bus 20388 through Exponent Bus to Result Bus Driver (EXPRSLT) 25910.

EXP 20316's arithmetic operations, for example addition and subtraction of floating point operand exponent fields when multiplying or dividing floating point operands, are executed by EXPALU 20384. EXPALU 20384 is a 8 bit general purpose arithmetic and logic unit comprised, for example, of SN74S181s. EXPALU 20384's first and second data inputs are provided, respectively, from INSELA 20330 and from INSELB 20348. INSELA 20330 and INSELB 20348 are multipexer circuits respectively comprised, for example, of SN74S157s and SN74S153s.

Results of EXPALU 20384 operations are provided as inputs to SCALER 20338, which operates both as a data storage register and as a shift register for diagnostic purposes. These results may be transferred from SCALER 20338 to SCLR Bus 20339. SCALER 20338 may be comprised, for example, of SN74S194s.

As just described, data inputs to EXPALU 20384 are provided from INSELA 20330 and from INSELB 20348. Referring first to INSELA 20330, INSELA 20330 is provided with a first data input from EXPQ Bus 20325 and a second data input from EXPRF 20380. INSELA 20330's first data input from EXPQ Bus 20325 may be utilized to provide operand information directly to INSELA 20330 from OPB 20322. Alternately, outputs of SCALER 20338 may be provided to INSELA 20330's first input through a feed back path comprised of SCLR 20339, SCLR to EXPQ Bus Driver (SCEXPQ) 25912, and EXPQ Bus 20325. INSELA 20330's second input is provided with data from output of EXPRF 20380, whose inputs are in turn provided from output of EXRM 20332.

A first input of EXRM 20332 is connected from EXPQ Bus 20325 and may be utilized to transfer operand information directly into EXPRF 20380 directly from OPB 20322. This data path may be utilized, for example, in operations regarding exponent fields of floating point operands. Exponent field of a first floating point operand may be transferred from OPB 20322 to EXPRF 20380 through EXRM 20332 and held therein until mantissa field of second operand has been read from OPB 20322 and into second input of INSELB 20348. Exponent field of second operand may then be provided to second input of EXPALU 20384 by INSELB 20348 while exponent field of first operand is read from EXPRF 20380 and through second input of INSELA 20330 to first input of EXPALU 20384. EXPALU 20384 may then perform addition or subtraction operations upon the two exponent fields as required.

Second input of EXRM 20332 is connected from output of SCALER 20338. This data path from output of SCALER 20338 may be utilized to transfer results of EXPALU 20384 and SCALER 20338 operations into EXPRF 20380 to be stored for subsequent use. As indicated in FIGS. 203 and 259, a second input of EXPRF 20380 is provided from output of SIGN 20382. This connection, and operation of SIGN 20382, will be described in following description.

Referring to INSELB 20348, INSELB 20348 is provided with 4 data inputs. INSELB 20348's second data input is connected from EXPQ Bus 20325 and, as described above, may be utilized to read, for example, floating point operand exponent fields into INSELB 20348 from OPB 20322. INSELB 20348's third data input is connected from output of SCALER 20338 through SCLR Bus 20339. ISELB 20348's third input may be utilized as part of a feed back path to transfer results of EXPALU 20384 and SCALER 20338 operations from SCALER 20338 to second input of EXPALU 20384.

INSELB 20348's first input is connected from an output of mCRD 20346 and EUCL 20310. INSELB 20348's first input allows a predetermined literal field from a microinstruction word in EUSITT 20344 to be provided as second input to EXPALU 20384. This input may be utilized, for example, in executing case operations as previously described above with reference to NAG 20340.

INSELB 20348's fourth input is from output of Leading Zero Detecting Register (LZDR) 25914 which, in turn, is connected from output of Leading Zero Detect Logic (LZDL) 25916 and LZD 20376. Operation of LZDL 25916, LZDR 25914 and INSELB 20348's fourth input will be described further below.

b.b. Exponent Logic 20316 and Multiplier Control 20318 Operation

As previously described, a primary function of EXP 20316 is execution of arithmetic operations of exponent fields during EU 10122 operations concerning single and double precision floating point operands. Operation of MULT 20314 and EXP 20316 with regard to floating point operands is coordinated and controlled, as described momentarily, through operation of LZD 20376 and SHFTCNTL 20364 of MULTCNTL 20318.

As previously described, a first function of EXP 20316 with respect to floating point operand operations is addition and subtraction of exponent fields during, respectively, multiplication and division of floating point operands. A second function is prealignment, that is equalization, of exponent fields in addition and subtraction of floating point operands. As previously described, prealignment is accomplished by right or left shifting of one operand mantissa field so that, effectively, exponent fields of both operands are equal.

Prealignment of operands is accomplished, in part, through SHFTCNTL 20364. Exponent fields of two floating point operands to be prealigned are subtracted by EXPALU 20384 and the result, representing difference between the two operand exponent fields, loaded into SCALER 20338. Difference between exponent fields is then provided as an input to SHFTCNTL 20364 through SCLR Bus 20339. SHFTCNTL 20364 is primarily comprised of a Read Only Memory. SHFTCNT 20364 generates output control signals to NIBSHF 20358, selecting direction and amount of shift required of one operand's mantissa field stored therein to accomplish equalization, or prealignment, of the two operands exponent fields. The two operand mantissa fields may then be added or subtracted as required.

A third floating point operand function, also previously described, is normalization of a floating point operand operation result, that is left shifting of result mantissa field to eliminate leading zeros therein. As previously described, floating point operand intermediate result appears in RFR 20336 and is transferred onto FR Bus 20337. Floating point operand intermediate result is then provided from FR Bus 20337 to input of LZDL 25916 in LZD 20376. LZDL 25916 detects which if any leading, or most significant, hexadecimal characters of floating point operand intermediate result contain all zeros. LZDL 25916 generates output signals indicating the number of leading zero nibbles in floating point operand intermediate result and these control signals are loaded into and stored in LZDR 25914. LZDR 25914 is a storage register and provides four inputs to INSELB 20348. Number of leading zero nibbles stored in LZDR 25914 is then provided as fourth input to INSELB 20348 and as an input to SHFTCNTL 20364. Again, SHFTCNTL 20364 generates control signal outputs to NIBSHF 20358, which has been presented with floating point operand intermediate result. Floating point operand intermediate result is then left shifted in NIBSHF 20358 by an amount sufficient to eliminate all leading zeros. Concurrently, number of leading zero nibbles is read from LZDR 25914 and into second input of EXPALU 20384 while floating point operand intermediate result exponent field is read from EXPRF 20380 and into first input of EXPALU 20384. Number of leading zero nibbles from LZDR 25914 is then subtracted from floating point operand intermediate result exponent field to provide final result exponent field. Final result exponent field is then read from SCALER 20338 while final result mantissa field is read from RFR 20336. Finally, result of floating point operand arithmetic operation may then be transferred onto JPD Bus 10142 as previously described.

SHFTCNTL 20364 also provides shift control signals to NIBSHF 20358 during MULT 20314 multiplication operations. A third input to SHFTCNTL 20364 is provided from Shift Increment Counter (SHFTIC) 25918, which is a six bit counter. Data inputs of SHFTIC 25918 are connected from outputs of mCRD 20346, to load initial count values, and SHFTIC 25918 counting operations are controlled by microinstruction outputs of mCRD 20346. SHFTCNTL 20364, operating under control of input from SHFTIC 25918, will then cause right shifts, nibble by nibble, of multiplier operands stored in NIBSHF 20358 during multiplication operations.

In addition to the above described function, MULTCNTL 20318 also controls conversion of packed decimal results into unpacked decimal results when required. As previously described, MULT 20314's performs all arithmetic operations upon unpacked decimal operands in packed decimal form after those unpacked decimal operands have been transformed into packed decimal operands in OPB 20322. MULT 20314 may then transform those packed decimal results back into unpacked decimal results for transmission to FU 10120 or MEM 10112.

As previously described, results of packed decimal operations appear in RFR 20336, and may be transferred onto FR Bus 20337. As indicated in FIG. 259, inputs of Unpacked Decimal Logic (UPDL) 25920 are connected from FR Bus 20337. Control outputs of UPDL 25920 are connected to inputs of CONSTAM 25710 and may thus be provided as address inputs to CONST 20360. UPDL 25920 is primarily comprised of logic gating for examining the results of unpacked decimal operations appearing on FR Bus 20337. UPDL 25920 then ascertains the locations zone fields are to occupy in corresponding unpacked decimal results and generates corresponding control signals to UPDL 25920. UPDL 25920 control outputs are then utilized as address inputs to CONST 20360 which, in turn, provides zone fields in appropriate locations on MULTIN Bus 20354.

As previously described, the packed decimal results on FR Bus 20337 are partially transformed into unpacked decimal results through UPDM 25718. Partially transformed unpacked decimal results from UPDM 25718 and zone fields provided from CONST 20360 are then logical ORed in MULT 20314, as previously described, to appear on FR Bus 20337 as final unpacked decimal results.

Finally, referring again to EXP 20316, EXP 20316 performs certain sign logic operations to determine arithmetic sign of the results of EU 10122 operations. These sign operations are performed, in particular, by SIGN 20382. SIGN 20382 has single bit first and second inputs connected from, respectively, second input to INSELB 20348 and an output of EXPRF 20380. These inputs comprise sign bits of operands provided to EU 10122 through OPB 20322. For example, first and second inputs of SIGN 20382 may be sign bits of the exponent fields of two floating point operands to be added, subtracted, multiplied, or divided by EU 10122. SIGN 20382 also receives an input (not shown for clarity of presentation) from EUCL 20310 indicating the arithmetic operation to be performed. Utilizing these inputs, SIGN 20382 generates a single bit output indicating sign of result of the arithmetic operation to be performed. Output of SIGN 20382 is provided as second input to EXPRF 20380 where sign of result is stored for further use in subsequent arithmetic operations, or until final result is read onto JPD Bus 10142.

Having described structure and operation of EXP 20316 and MULTCNTL 20318, and previously of EUCL 20310, EUIO 20312, and MULT 20314, structure and operation of TSTINT 20320 will be described next below. The following description of TSTINT 20320 will include description of certain EU 10122 operations, for example EU 10122's Stack Mechanisms, and will include description of EU 10122's interfaces with FU 10120 and MEM 10112.

5. Test and Interface Logic 20320 (FIGS. 260-268)

As previously described, TSTINT 20320 includes CONSIZE 20352, ECPT 20328, TSTCOND 20384, and INTRPT 20388. CONSIZE 20352, as previously described, performs "container size" check operations when results of EU 10122 operations are to be written into MEM 10112. That is, CONSIZE 20352 compares size or number of significant bits, of an EU 10122 result to the capacity, or container size, of the MEM 10112 location that EU 10122 result is to be written into. As indicated, in FIG. 203, CONSIZE 20352 receives a first input, that is the results of EU 10122 operations, from FR Bus 20337. A second input of CONSIZE 20352 is connected to LENGTH Bus 20226 to receive length field of logical descriptors identifying MEM 10112 address space into which those EU 10122 results are to be written. CONSIZE 20352 includes logic circuitry, for example a combination of Read Only Memory and Field Programmable Logic Arrays, for examining EU 10122 operation results appearing on FR Bus 20337 and determining the number of bits of data in those results. CONSIZE 20352 compares EU 10122 result size to logical descriptor length field and, in particular, if result size exceeds logical descriptor length, provides an alarm output to ECPT 20328, described below.

TSTCOND 20384, previously described and which will be described further below, is an interface circuit between FU 10120 and EU 10122. TSTCOND 20384 allows FU 10120 to specify and examine results of certain test operations performed by EU 10122 with respect to EU 10122 operations.

ECPT 20328 monitors certain EU 10122 operations and provides outputs indicating when certain "exceptions" have occurred. These exceptions include attempted divisions by zero, floating point exponent underflow or overflow, and integer container size fault.

INTRPT 20388 is again an interface between EU 10122 and FU 10120 allowing FU 10120 to interrupt EU 10122 operations. INTRPT 20388 allows FU 10120 to direct EU 10122 to execute certain operations to aid in handling of certain FU 10120 events previously described.

Operation of CONSIZE 20352, ECPT 20328, TSTCOND 20384, INTRPT 20388, and other features of EU 10122's interface with FU 10120 will be described further below in the following description of operation of that interface and of operation of certain EU 10122 internal mechanisms, such as FU 10120 Stack Mechanisms.

a.a. FU 10120/EU 10122 Interface

As previously described, EU 10122 and FU 10120 are asychronous processors, each operating under its own microcode control. EU 10122 and FU 10120 operate simultaneously and independently of each other but are coupled, and their operations coordinated, by interface signals described below. Should EU 10122 not be able to respond immediately to a request from FU 10120, FU 10120 will idle until EU 10122 becomes available; conversely, should EU 10122 not receive, or have present, operands or a request for operations from FU 10120, EU 10122 will remain in idle state until operands and requests for operations are received from FU 10120.

In normal operation, EU 10122 manipulates operands under control of FU 10120, which in turn is under control of SOPs of a user's program. When FU 10120 requires arithmetic or logical manipulation of an operand, FU 10120 dispatches a command, that is an Execute Unit Dispatch Pointer (EUDP) to EU 10122. As previously described, an EUDP is basically an initial address into EUSITT 20344. An EUDP identifies starting location of a EU 10122 microinstruction sequence performing the required operation upon operands. Operands are fetched from MEM 10112 under FU 10120 control, as previously described, and are transferred into OPB 20322. Those operands are then called from OPB 20322 by EU 10122 and transferred into MULT 20314 and EXP 20316 as previously described. After the required operation is completed, FU 10120 is notified that a result is ready. At this point, FU 10120 may check certain test conditions, for example through TSTCOND 20384, such as whether an integer or decimal carry bit is set or whether a mantissa sign bit is set or reset. This test operation is utilized by FU 10120 for conditional branching and synchronization of FU 10120 and EU 10122 operations. Exception checking, by ECPT 20328, is also performed at this time. Exception checking determines, for example, whether division by zero was attempted or if a container size fault has occurred. In general, FU 10120 is not informed of exception errors until FU 10120 requests exception checking. After results are transferred into FU 10120 or MEM 10112 by EU 10122, EU 10122 goes to idle operation until a next operation is requested by FU 10120.

Having briefly described overall interface operation between FU 10120 and EU 10122, operation of that interface, referred to as handshaking, will be described in greater detail next below. In general, handshaking operation between EU 10122 and FU 10120 during normal operation may be regarded as following into six operations. These operations may include, for example, loading of COMQ 20342, loading of OPB 20322, storeback or transfer of results from EU 10122 to FU 10120 or MEM 10112, check of test conditions, exception checking, and EU 10122 idle operation. Handshaking between FU 10120 and EU 10122 will be described below for each of these classes of operation, in the order just referred to.

a.a.a. Loading of Command Queue 20342 (FIG. 260)

Figure 260:
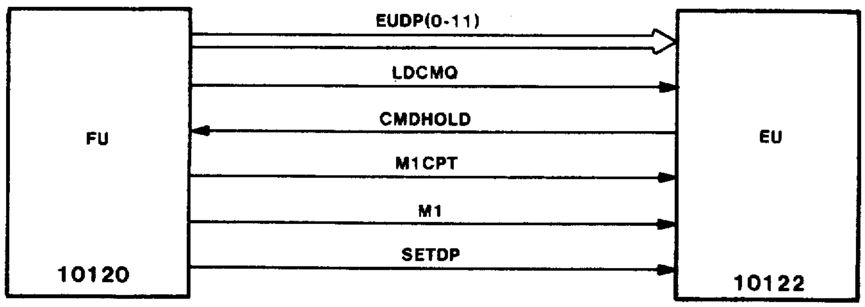
FIG. 260 is a diagram illustrating operation of an execute unit command queue load and interface to a fetch unit.

Referring to FIG. 260, a schematic representation of EU 10122's interface with FU 10120 for purposes of loading COMQ 20342 as shown. During normal SOP directed JP 10114 operation, 8 bit operation (OP) codes are parsed from the instruction stream, as previously described, and concatenated with dialect information to address EUSDT 20266 also as previously described. EUSDT 20266 provides corresponding addresses, that is EUDPs, to EUSITT 20344.

Dialect information specifies the S-Language currently being executed and, consequently, the group of microinstruction sequences available in EUSITT 20344 for that S-Language. As previously described, FU 10120 may specify four S-Language dialects with up to 256 EU 10122 microinstruction sequences per dialect, or 8 dialects with up to 128 microinstruction sequences per dialect.

EUDPs provided by EUSDT 20266 are comprised of a 9 bit address field, a 2 bit operand information field, and a 1 bit flag field, as previously described. Address field is starting address of a microinstruction sequence in EUSITT 20344 and EU 10122 will perform the operation directed by that microinstruction sequence. EUSITT 20344 requires 11 bits of address field and the 9 bit address field of EUDPs are mapped into an 11 bit address field by left justification and zero filling.

FU 10120 may also dispatch, or select, any EU 10122 microinstruction controlled operation from JPD Bus 10142. Such EUDPs are provided from JPD Bus 10142 to data input of EUSITT 20344 and passed directly through to mCRD 20346. Before a EUDP may be provided from JPD Bus 10142, however, FU 10120 provides a check operation comparing that EUDP to a list of legal, or allowed, EUSITT 20344 addresses stored in MEM 10112. A fault will be indicated if an EUDP provided through JPD Bus 10142 is not a legal EUSITT 20344 address. Alternately, FU 10120 may effectively provide an EUDP, or EUSITT 20344 addresses, from a literal field in a FU 10120 microinstruction word. Such a FU 10120 microinstruction word literal field may be effectively utilized as an SOP into EUSDT 20266.

Handshaking between EU 10122 and FU 10120 during load COMQ 20342 operations may proceed as illustrated in FIG. 260. A twelve bit EUDP may be placed on EUDIS Bus 20206 and Control Signal Load Command Queue (LDCMQ) asserted. If COMQ 20342 is full, EU 10122 raises control signal Command Hold (CMDHOLD) which causes FU 10120 to remain in State M0 until there is room in COMQ 20342. As previously described, COMQ 20342 is comprised of two, two word buffers wherein one buffer is utilized for normal SOP operation and the other utilized for control of FU 10120 and EU 10122 internal mechanism operation.

EUDPs are loaded into COMQ 20342 when state timing signals MICPT and MI are asserted. If a EUDP being transferred into COMQ 20342 concerns a double precision floating point operation, control signal Set Double Precision (SETDP) is asserted. SETDP is utilized to control OPB 20322, and because single precision and precision floating point operations otherwise utilize the same SOP and thus would otherwise refer to same EUSITT 20344 microinstruction sequence.

At this point, a EUDP has been loaded into COMQ 20342 and will be decoded to control FU 10120 operation by EUCL 20310 as previously described. Each particular EUDP will be cleared by that EUDPs EUSITT 20344 microinstruction sequence after the requested microinstruction sequence has been executed.

b.b.b. Loading of Operand Buffer 20320 (FIG. 261)

Figure 261:
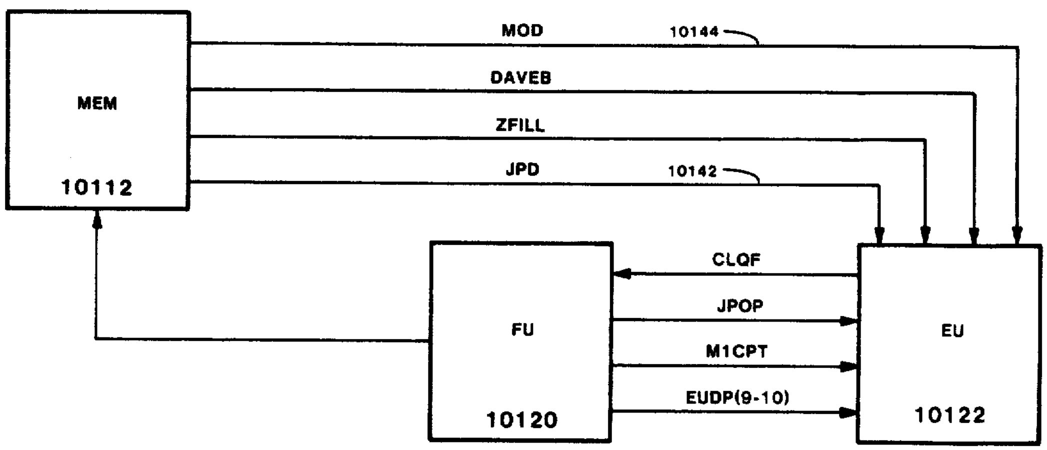
FIG. 261 is a diagram illustrating operation of an execute unit operand buffer load and interface to a fetch unit.

Referring to FIG. 261, a diagramic representation of the interface and handshaking between EU 10122, FU 10120 and MEM 10112 for loading OPB 20322 is shown. Control signal Clear Queue Full (CLQF) from EU 10122 must be asserted by EU 10122 before FU 10120 initiates a request to MEM 10112 for an operand to be transferred to EU 10122. CLQF clears and "EU 10122's OPB 20322 Full" condition in FU 10120. CLQF indicates, thereby, that there is room in OPB 20322 to receive operands. If FU 10120 is in a "EU 10122's OPB 20322 Full" condition and further operand is required to be transferred to EU 10122, FU 10120 will remain in State MI until CLQF is asserted.

At the beginning of execution of a particular SOP, FU 10120 may transfer two operands to OPB 20322 without "EU 10122's OPB 20322 Full" condition occurring. This is because EU 10122 is idle at the beginning of an SOP execution and generally immediately unloads a first operand from OPB 20322 before a second operand arrives.

Control signal Job Processor Operand (JPOP) provided from FU 10120 must be non-asserted for operands to be transferred from MEM 10112 to OPB 20322 through MOD Bus 10144. This is the normal condition of JPOP. If JPOP is asserted, OPB 20322 is loaded with data from JPD Bus 10142. Data is strobed into OPB 20322 from JPD Bus 10142 by control signals MICPT and JPOP. Operands read from MEM 10112, however, are transferred into OPB 20322 through MOD Bus 10144 when MEM 10112 asserts DAVEB to indicate that valid data from MEM 10112 is available on MOD Bus 10144. DAVEB is also utilized to strobe data on MOD Bus 10144 into OPB 20322. If control signal ZFILL from MEM 10112 is asserted at this point, ZFILL is interpreted during integer operand operations to indicate that those operands are unsigned and should be left zero filled, rather than sign extended. If data is being provided from JPD Bus 10142 rather than from MEM 10112, that is if JPOP is asserted, bit 11 of current EUDP may be utilized to perform the same function as ZFILL during loading of OPB 20322 from MOD Bus 10144.

Loading of OPB 20322 is controlled, in part, by bits 9 and 10 of EUDPs provided from FU 10120 through EUDIS Bus 20206. Bit 9 indicates length of a first operand while bit 10 indicates length of a second operand. Operand length, together with operand type specified in address portion of a EUDP, determines how a particular operand is unloaded from OPB 20322 and transferred into MULT 20314 and EXP 20316.

At this point, both COMQ 20342 and OPB 20322 have been loaded with, respectively, EUDPs and operands. It should be noted that operands are generally not transferred into OPB 20322 before a corresponding EUDP is loaded into COMQ 20342. Operands and EUDPs may, however, be simultaneously transferred into EU 10122. If other operands are required for a particular operation, those operands are loaded into OPB 20322 as described above.

c.c.c. Storeback (FIG. 262)

Figure 262:
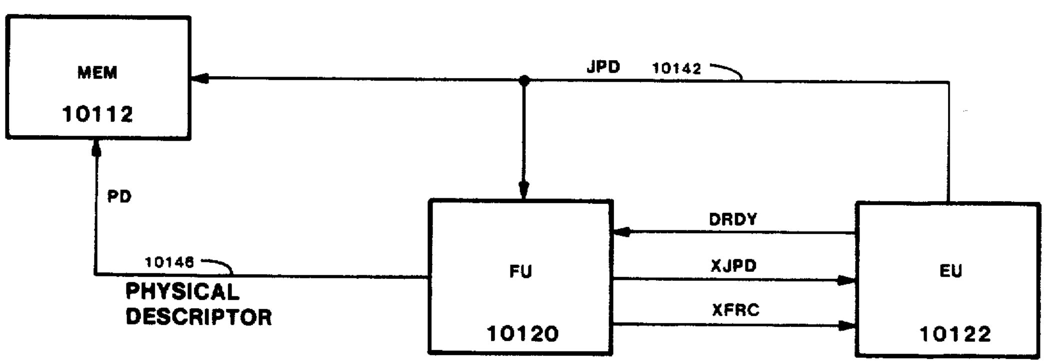
FIG. 262 is a diagram illustrating operation of an execute unit storeback or transfer of results and interface to a fetch unit.

Referring to FIG. 262, a diagramic representation of a storeback, or transfer, of results to MEM 10112 from EU 10122 and handshaking performed therein is shown. When a final result of a EU 10122 operation is available, EU 10122 asserts control signal Data Ready (DRDY). FU 10120 thereupon responds with control signal Transfer to JPD Bus 10142 (XJPD), which gates EU 10122's result onto JPD Bus 10142. In normal operation, that is execution of SOPs, FU 10120 causes EU 10122's result to be stored back into a destination in MEM 10112, as selected by a physical descriptor provided from FU 10120. Alternately, a result may be transferred into FU 10120, 32 bits, or one word, at a time.

FU 10120 may, as described above and described further below, check EU 10122 test conditions during storeback of results. FU 10120 generates control signal Transfer Complete (XFRC) once the storeback operation is completed. XFRC also indicates to EU 10122 that EU 10122's results and test conditions have been accepted by FU 10120, so that EU 10122 need no longer assert these results and test conditions.

d.d.d. Test Conditions (FIG. 263)

Figure 263:
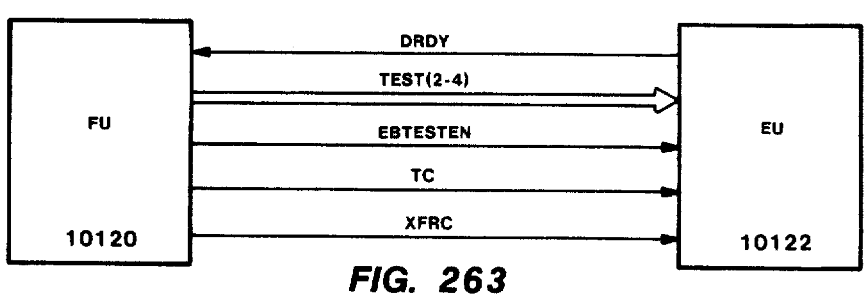
FIG. 263 is a diagram illustrating operation of an execute unit check test condition and interface to a fetch unit.
Figure 264:
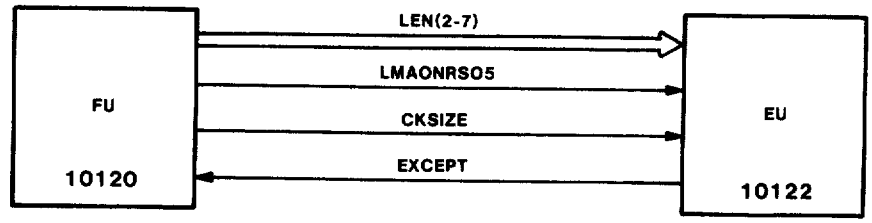
FIG. 264 is a diagram illustrating operation of an execute unit exception test and interface to a fetch unit.

Referring to FIG. 263, a diagramic representation of checking of EU 10122 test conditions by FU 10120, and handshaking therein, is shown. As previously described, test results indicating certain conditions and operations of EU 10122 are sampled and stored in TSTCOND 20384 and may be examined by FU 10120. When DRDY is asserted by EU 10122, FU 10120 may select, for example, one of 8 EU 10122 conditions to test, as well as transferring results as described above. EU 10122 conditions which may be tested by FU 10120 are listed and described below. Such conditions, as whether a final result is positive, negative, or zero, may be checked in order to facilitate conditional branching of FU 10120 operations as previously described. FU 10120 specifies a condition to be tested through Test Condition Select signals (TEST(2-4)). FU 10120 asserts control signal EU Test Enable (EUTESTEN) to EU 10122 to gate the selected test condition. That selected test condition then appears as Data Signal Test Condition (TC) from EU 10122 to FU 10120. A TC of logic 1 may, for example, indicate that the selected condition is false while a TC of logic 0 may indicate that the selected condition is true. FU 10120 indicates that FU 10120 has sensed the requested test condition, and that the test condition need no longer be asserted by EU 10122, by asserting control signal XFRC.

e.e.e Exception Checking (FIG. 264)

Referring to FIG. 264, a diagramic representation of exception checking of EU 10122 exceptions by FU 10120, and handshaking therein, is shown. As previously described, any EU 10122 exception conditions may be checked by FU 10120 as FU 10120 is initiating storeback of EU 10122 results. Exception checking may detect, for example, attempted division by zero, floating point exponent underflow or overflow, or a container size fault. An attempted division by zero or floating point underflow or overflow may be checked before storeback, that is without specific request by FU 10120.

As previously described, a container size fault is detected by CONSIZ 20352 by comparing length of result with size of destination container in MEM 10112. Container size exception checking occurs during store back of EU 10122 results, that is while FU 10120 is in State SB. Container size is automatically performed by EU 10122 hardware, that is by CONSIZE 20352, only on results of less than 33 bits length. Size checking of larger results, that is larger integers and BCD results, is performed by a microcode routine, using CONSIZE 20352's output, as transfer of such larger results is executed as string transfer. It is unnecessary to perform container size check for either single or double precision floating point results as these data types always occupy either 32 or 64 bits. Destination container size is provided to CONSIZE 20352 through LENGTH Bus 20226.

Control signal Length to Memory AON or Random Signals (LMAONRS) is generated by FU 10120 from Type field of the logical descriptor corresponding to a particular EU 10122 result. LMAONRS indicates that the results data type is an unsigned integer. LMAONRS determines the manner in which a required container size of the EU 10122 result is determined. After receiving this information from LMAONRS, EU 10122 determines whether destination container size in MEM 10112 is sufficiently large to contain the EU 10122 result. If that destination container size is not sufficiently large, a container size fault is detected by CONSIZE 20352, or through an EU 10122 microinstruction sequence.

Container size faults, as well as division by zero and exponent underflow and overflow faults, are signaled to FU 10120 when FU 10120 asserts control signal Check Size (CKSIZE). At this time, EU 10122 asserts control signal Exception (EXCPT) if any of the above faults has occurred. If a fault has occurred, an Event request to FU 10120 results. When an Event request is honored by FU 10120, FU 10120 may interrupt EU 10122 and dispatch EU 10122 to a microinstruction routine that transfers those exception conditions onto JPD Bus 10142. If a container size fault has caused that exception condition, EU 10122 may transfer to FU 10120 the required container size through JPD Bus 10142.

f.f.f. Idle Routine

Figure 265:
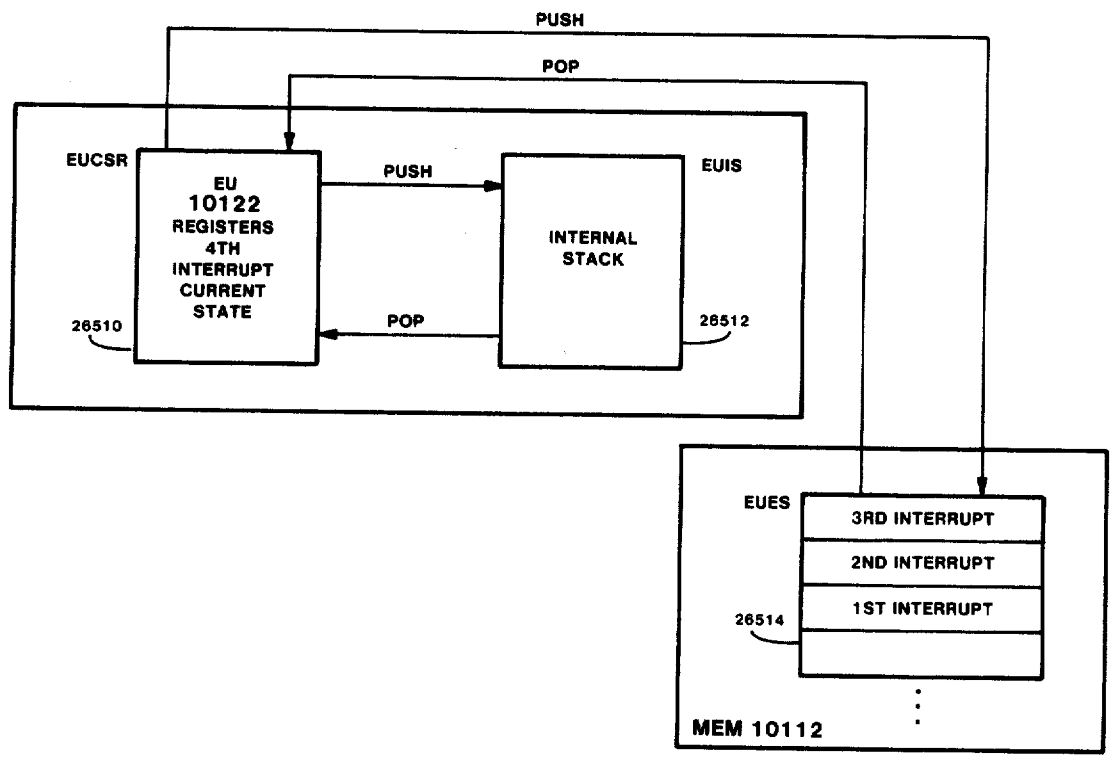
FIG. 265 is a block diagram of an execute unit arithmetic operation stack mechanism.
Figure 266:
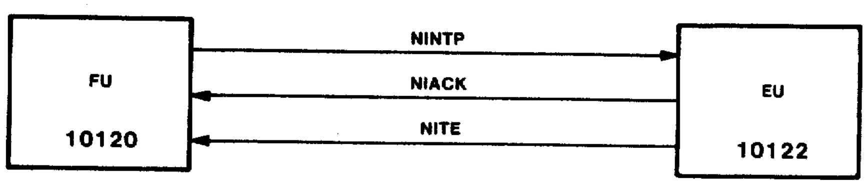
FIG. 266 is a diagram illustrating execute unit and fetch unit interrupt handshaking and interface.
Figure 267:
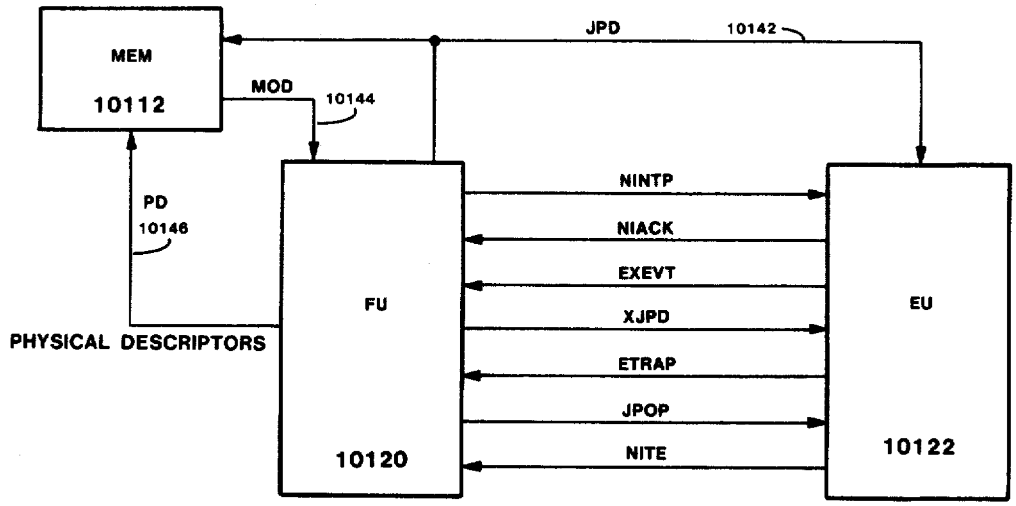
FIG. 267 is a diagram illustrating execute unit and fetch unit interface and operation for nested interrupts.

Finally, when a current EU 10122 operation is completed, EU 10122 goes into an Idle loop microinstruction routine. If necessary, FU 10120 may assert control signal Excute Unit Abort (EUABORT) to force EU 10122 into Idle loop microinstruction routine until EU 10122 is required for further operations.

g.g.g. Eu 10122 Stack Mechanisms (FIGS. 265, 266, 267)

As previously described, EU 10122 may perform either of two classes of operations. First, EU 10122 may perform arithmetic operations in execution of SOPs of user's programs. Second, EU 10122 may operate as an arithmetic calculator assisting operation of FU 10120's internal mechanisms and operations, referred to as kernel operations.

In kernel operation, EU 10122 acts as an arithmetic calculator for FU 10120 during address generation, address translation, and other kernel functions. In kernel mode, EU 10122 is executing microinstruction sequences at request of FU 10120 kernel microinstruction sequences, rather than at request of an SOP. In general, these kernel operations are vital to operation of JP 10114. FU 10120 may interrupt EU 10122 operations with regard to SOPs and initiate EU 10122 microinstruction sequences to perform kernel operations.

When interrupted, EU 10122 saves EU 10122's current operating state in a one level deep stack. EU 10122 may then accept an EUDP from that portion of COMQ 20342 utilized to receive and store EUDPs regarding FU 10120's and EU 10122's internal, or kernel, operations. When requesting kernel operations by EU 10122, FU 10120 generally transfers operands to OPB 20322 through JPD Bus 10142, and receives EU 10122 final results through JPD Bus 10142. Operands may also be provided to EU 10122 through MOD Bus 10144. After EU 10122 has completed a requested kernel operation, EU 10122 reloads operating state from its internal stack and continues normal operation from the point normal operation was interrupted.

Should another interrupt from FU 10120 occur while a prior interrupt is being executed, EU 10122 moves current state and data, that is of first interrupt, to MEM 10112. EU 10122 requests FU 10120 store state and date of first interrupt in MEM 10112 by requesting an "EU 10122 Stack Overflow" Event. EU 10122's "normal" state, that is state and data pertaining to the operation EU 10122 is executing at time of occurrence of first interrupt, is stored in an EU 10122 internal stack and remains there. EU 10122 then begins executing second interrupt. When EU 10122 has completed operations for second interrupt, state from first interrupt is reloaded from MEM 10112 by EU 10122 requesting a "EU 10122 Stack Underflow" Event to FU 10120. EU 10122 then completes execution of first interrupt and reloads state and resumes execution of normal operation, that is the operation being executed before the first interrupt.

EU 10122 is therefore capable of handling interrupts from FU 10120 during two circumstances. First interrupt circumstance is comprised of interrupts occurring during normal operation, that is while executing SOPs of user's programs. Second circumstance arises when interrupts occur during kernel operations, that is during execution of microinstruction sequences for handling interrupts. EU 10122 operation will be described next below for each of these circumstances, and in the order referred to.

Referring to FIG. 265, a diagramic representation of EU 10122's stack mechanisms, previously described, is shown. Those portions of EU 10122's stack mechanisms residing within EU 10122 are comprised of EU 10122's Current State Registers (EUCSRs) 26510 and EU 10122's Internal Stack (EUIS) 26512. EUCSR 26510 is comprised of EU 10122's internal registers which contain data and state of current EU 10122 operation. EUCSR 26510 may be comprised, for example, of mCRD 20346, registers of TSTINT 20320, and the previously described registers within MULT 20314 and EXP 20316.

State and data contained in EUCSR 26510 is that of the operation currently being executed by EU 10122. This current state may, for example, be that of a SOP currently being executed by EU 10122, or that of an interrupt, for example a fourth interrupt of a nested sequence of interrupts, requested by FU 10120.

EUIS 26512 is comprised of certain registers of MULTRF 20350 and EXPRF 20380. EUIS 26512 is utilized to store and save current state of an SOP operation currently being executed by EU 10122 and which has been interrupted. State and data of that SOP operation will remain stored in EUIS 26512 regardless of the number of interrupts which may occur on a nested sequence of interrupts requested by FU 10120. State and data of the interrupted SOP operation will be returned from EUIS 26512 to EUCSR 26510 when all interrupts have been completed.

Final portion of EU 10122's stack mechanism is that portion of EU 10122's internal stack (EUES) 26514 residing in MEM 10112. EUES 26514 is comprised of certain MEM 10112 address locations used to store state and data of successive interrupt operations of sequences of nested interrupts. That is, if a sequence of four interrupts is requested by FU 10120, state and data of fourth interrupt will reside in EUCSR 26510 while state and data of first, second, and third interrupts have been transferred, in sequence, into EUES 26514. In this respect, and as previously described operation of EU 10122's stack mechanisms is similar to that of, for example, MIS 10368 and SS 10336 previously described with reference to FIG. 103.

As described above, an interrupt may be requested of EU 10122 by FU 10120 either during EU 10122 normal operation, that is during execution of SOPs by EU 10122, or while EU 10122 is executing a previous interrupt requested by FU 10120. Operation of EU 10122 and FU 10120 upon occurrence of an interrupt during EU 10122 normal operation will be described next below.

Referring to FIG. 266, a diagramic representation of handshaking between EU 10122 and FU 10120 during an interrupt of EU 10122 while EU 10122 is operating in normal mode is shown and should be referred to in conjunction with FIG. 265. For purposes of the following discussions, interrupts of EU 10122 operations by FU 10120 are referred to as nanointerrupts to distinguish from interrupts internal to FU 10120.

FU 10120 interrupts normal operation of EU 10122 by assertion of control signal Nano-Interrupt (NINTP) during State M0 of FU 10120 operation. NINTP may be masked by EU 10122 during certain critical EU 10122 operations, such as arithmetic operations. If NINTP is masked by EU 10122, FU 10120 will remain in State NW until EU 10122 acknowledges the interrupt.

Upon receiving NINTP from FU 10120, EU 10122s transfers state and data of current SOP operation from EUCSR 26510 to EUIS 26512. EU 10122 then asserts control signal Nano-Interrupt Acknowledge (NIACK) to FU 10120 to acknowledge availability of EU 10122 to accept a nanointerrupt. FU 10120 will then enter State Ml and place an EUDP on EUDIS Bus 20206. Loading of COMQ 20342 then proceeds as previously described, with EU 10122 loading nanointerrupt EUDPs into the appropriate registers of COMQ 20342. COMQ 20342 is loaded as previously described and, if JPOP is asserted, data transferred into OPB 20322 from JPD Bus 10142. If JPOP is not asserted, data is taken into OPB 20322 from MOD Bus 10144. EU 10122 then proceeds to execute the required nanointerrupt operation and storing back of results and checking of test conditions proceeds as previously described for EU 10122 normal operation. In general, exception checking is not performed. When EU 10122 has completed execution of the nanointerrupt operation, EU 10122 transfers state and data of the interrupted SOP operation from EUIS 26512 to EUCSR 26510 and resumes execution of that SOP. At this point, EU 10122 asserts control signal Nano-Interrupt Trap Enable (NITE). NITE is received and tested by FU 10120 to indicate end of nanointerrupt processing.

Referring to FIG. 267, a diagramic representation of interfaces between EU 10122, FU 10120, and MEM 10112 during nested, or sequential, EU 10122 interrupts for kernel operations, and handshaking therein, is shown. During the following discussion, it is assumed that EU 10122 is already processing a nanointerrupt for a kernel operation submitted to EU 10122 by FU 10120. FU 10120 may then submit a second, third, or fourth, nanointerrupt to EU 10122 for a further kernel operation. FU 10120 will assert NINTP to request a nanointerrupt of EU 10122. EU 10122's normal mode state and data from a previously executing SOP operation has been stored in, and remains in, EUIS 26512. Current state and data of currently executing nanointerrupt operation in EUCSR 26510 will be transferred to EUES 26514 in MEM 10112 to allow initiation of pending nanointerrupt. EU 10122 will at this time assert NIACK and control signal Execute Unit Event (EXEVT). EXEVT to FU 10120 informs FU 10120 that an EU 10122 Event has occurred, specifically, and in this case, EXEVT requests FU 10120 service of an EU 10122 Stack Overflow. FU 10120 is thereby trapped to an "EU 10122 Stack Overflow" Event Handler microinstruction sequence. This handler transfers current state and data of interrupted nanointerrupt previously executing in EU 10122 into EUES 26514. State and data of interrupted nanointerrupt is transferred to EUES 26514, one 32 bit word at a time. FU 10120 asserts control signals XJPD to gate each of these state and data words onto JPD Bus 10142 and controls transfer of these words into EUES 26514.

Processing of new nanointerrupt proceeds as described above with reference to interrupts occurring during normal operation. If any subsequent nanointerrupts occur, they are handled in the same manner as just described; FU 10120 signals a nanointerrupt to FU 10120, current EU 10122 state and data is saved by FU 10120 in EUES 26514, and new nanointerrupt is processed. After a nested nanointerrupt, that is a nanointerrupt of a sequence of nanointerrupts, has been serviced, EU 10122 asserts control signal EU 10122 Trap (ETRAP) to FU 10120 to request a transfer of a previous nanointerrupt's state and data from EUES 26514 to EUCSR 26510. FU 10120 will retrieve that next previous nanointerrupt state and data from EUES 26514 through MOD Bus 10144 and will transfer that data and state onto JPD Bus 10142. This state and data is returned, one 32 bit word at a time, and is strobed into EU 10122 by JPOP from FU 10120. Processing of that prior nanointerrupt will then resume. The servicing of successively prior nanointerrupts will continue until all previous nanointerrupts have been serviced. Original state and data of EU 10122, that is that of SOP operation which was initially interrupted, is then returned to EUCSR 26510 from EUIS 26512 and execution of that SOP resumed. At this time, EU 10122 asserts NITE to indicate end of EU 10122 kernel operations in regard to nanointerrupts.

Having described structure and operation of EU 10122, FU 10120 and MEM 10112, with respect to servicing of kernel operation nanointerrupts by EU 10122, loading of EU 10122's EUSITT 20344 with microinstruction sequences will be described next below.

h.h.h. Loading of Execute Unit S-Interpreter Table 20344 (FIG. 268)

Figure 268:
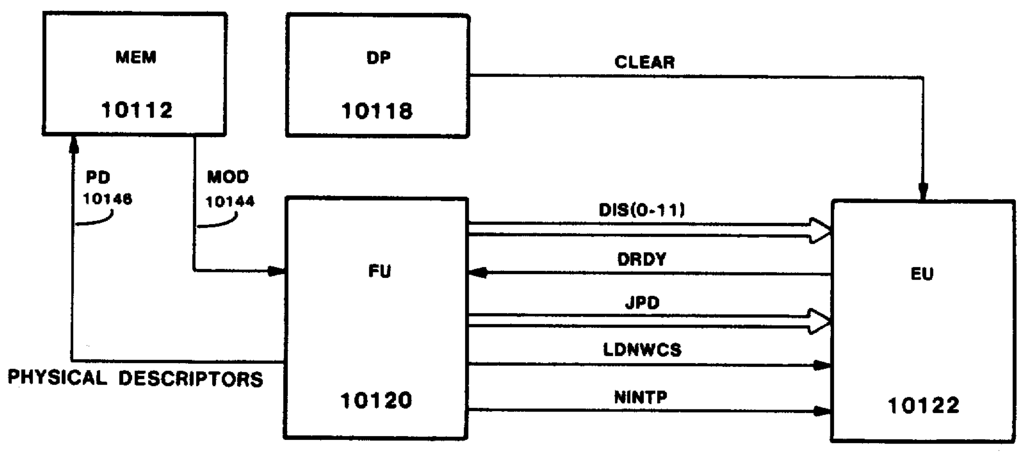
FIG. 268 is a diagram illustrating execute unit and fetch unit interface and operation for loading an execute unit control store.

Referring to FIG. 268, a diagramic representation of interface and handshaking between EU 10122, FU 10120, MEM 10112, and DP 10118 during loading of microinstructions into EUSITT 20344 is shown. As previously described, EUSITT 20344 contains all microinstructions required for control of EU 10122 in executing kernel nanointerrupt operations and in executing arithmetic operations in response to SOPs of user's programs. EUSITT 20344 may store microinstruction sequences for interpreting arithmetic SOPs of user's programs for, for example, up to 4 different S-Language Dialects. In general, a capacity of storing microinstruction sequences for arithmetic operations in up to 4 S-Language Dialects is sufficient for most requirements, so that EUSITT 20344 need be loaded with microinstruction sequences only at initialization of CS 10110 operation. Should microinstruction sequences for arithmetic operations of more than 4 S-Language Dialects be required, those microinstruction sequences may be loaded into EUSITT 20344 in the manner as will be described below.

As previously described, a portion of the microinstructions stored in EUSITT 20344 is contained in Read Only Memories and is thus permanently stored in EUSITT 20344. Microinstruction sequences permanently stored in EUSITT 20344 are, in general, those required for execution of kernel operations. Microinstruction sequences permanently stored in EUSITT 20344 include those used to assist in writing other EU 10122 microinstruction sequences into EUSITT 20344 as required. Certain microinstruction sequences are stored in a Random Access Memory, referred to as the Writeable Control Store (WCS) portion of EUSITT 20344, and include these for interpreting arithmetic operation SOPs of various S-Language Dialects.

Writing of microinstruction sequences into EU 10122 is initialized by forcing EU 10122 into an Idle state. Initialization of EU 10122 is accomplished by FU 10120 asserting EUABORT or by DP 10118 asserting control signal clear (CLEAR). Either EUABORT or CLEAR will clear a current operation of EU 10122 and force EU 10122 into Idle state, wherein EU 10122 waits for further EUDPs provided from FU 10120. FU 10120 then dispatches a EUDP initiating loading of EUSITT 20344 to EU 10122 through EUDIS Bus 20206. Load EUSITT 20344 EUDP specifies starting address of a two step microinstruction sequence in the PROM portion of EUSITT 20344. This two step microinstruction sequence first loads zeros into SCAG 25536, which as previously described provides read and write addresses to EUSITT 20344. EUSITT 20344 load microinstruction sequence then reads a microinstruction from EUSITT 20344 to mCRD 20346. This microinstruction specifies conditions for handshaking operations with FU 10120 so that loading of EUSITT 20344 may begin. At this time, and from this microinstruction word, EU 10122 asserts control signal DRDY to FU 10120 to indicate that EU 10122 is ready to accept EUDPs from FU 10120 for directing loading of EUSITT 20344. This initial microinstruction also generates a write enable control signal for the WCS portion of EUSITT 20344, inhibits loading of mCRD 20346 from EUSITT 20344, and inhibits normal loading operations of NXTR 25540 and SCAG 25536. This first microinstruction also directs NASS 25526 to accept address inputs from SCAG 25536 and, finally, causes NITE to FU 10120 to be asserted to unmask nanointerrupts from FU 10120.

FU 10120 then generates a read request to MEM 10112, and MEM 10112 transfers a first 32 bit word of a EU 10122 microinstruction word onto JPD Bus 10142. Each such 32 bit word from MEM 10112 comprises one half of a 64 bit microinstruction word of EU 10122. When FU 10120 receives DRDY from EU 10122, FU 10120 generates control signal Load Writeable Control Store (LDWCS). LDWCS in turn transfers a 32 bit word on JPD Bus 10142 into a first address of the WCS portion of EUSITT 20344. A next 32 bit half word of a EU 10122 microinstruction word is then read from MEM 10112 through JPD Bus 10142 and transferred into the second half of that first address within the WCS portion of EUSITT 20344. The address in SCAG 25536 is then incremented to select a next address within EUSITT 20344 and the process just described repeated automatically, including generation of DRDY and LDWCS, until loading of EUSITT 20344 is completed.

After loading of EUSITT 20344 is completed, the loading process is terminated when FU 10120 asserts NINTP, or DP 10118 asserts Control Signal Load Complete (LOADCR). Either NINTP or LOADCR releases control of operation of NAG 20340 to allow EU 10122 to resume normal operation.

The above descriptions have described structure and operation of EU 10122, including: execution of various arithmetic operations utilizing various operand formats; operation of EU 10122, FU 10120, and MEM 10112 with regard to handshaking; loading of EUDPs and operands; storeback of results; checking of test conditions and exceptions; EU 10122 Stack Mechanisms during normal and kernel operations; and loading of EU 10122 microinstruction sequences into EUSITT 20344. IOS 10116 and DP 10118 will be described next below, in that order.

Figure 269:
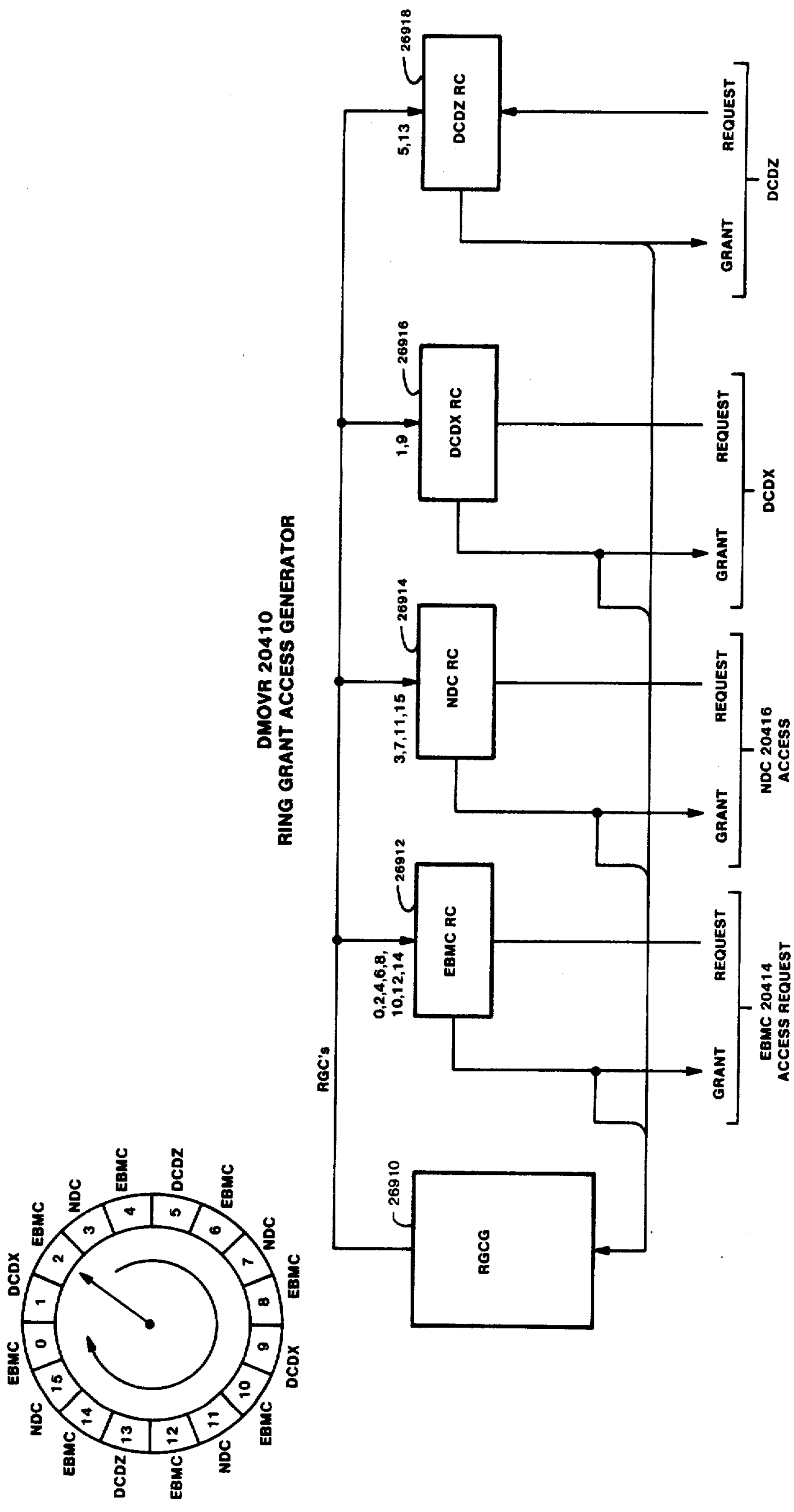
FIG. 269 is a detailed block diagram and illustration of operation of an I/O system ring grant generator.

D. I/O System 10116 (FIGS. 204, 206, 269)

Referring to FIG. 204, a partial block diagram of IOS 10116 is shown. As previously described, IOS 10116 operates as an interface between CS 10110 and the external world, for example, ED 10124. A primary function of IOS 10116 is the transfer of data between CS 10110, that is MEM 10112, and the external world. In addition to performing transfers of data, IOS 10116 controls access between various data sources and sinks of ED 10124 and MEM 10112. As previously described, IOS 10116 directly addresses MEM 10112's physical address space to write data into or read data from MEM 10112. As such, IOS 10116 also performs address translation, a mapping operation required in transferring data between MEM 10112's physical address space and address spaces of data sources and sinks in ED 10124.

As shown in FIG. 204, IOS 10116 includes Data Mover (DMOVR) 20410, Input/Output Control Processor (IOCP) 20412, and one or more data channel devices. IOS 10116's data channel devices may include ECLIPSE® Burst Multiplexer Channel (EBMC) 20414, NOVA Data Channel (NDC) 20416, and other data channel devices as required for a particular configuration of a CS 10110 system. IOCP 20412 controls and directs transfer of data between MEM 10112 and ED 10124, and controls and directs mapping of addresses between ED 10124 and MEM 10112's physical address space. IOCP 20412 may be comprised, for example, of a general purpose computer, such as an ECLIPSE® M600 computer available from Data General Corporation of Westboro, Mass.

EBMC 20414 and NDC 20416 comprise data channels through which data is transferred between ED 10124 and IOS 10116. EBMC 20414 and NDC 20416 perform actual transfers of data to and from ED 10124, under control of IOCP 20412, and perform mapping of ED 10124 addresses to MEM 10112 physical addresses, also under control of IOCP 20412. EBMC 20414 and NDC 20416 may respectively be comprised, for example, of an ECLIPSE® Burst Multiplexer Data Channel and a NOVA® Data Channel, also available from Data General Corporation of Westboro, Mass.

DMOVR 20410 comprises IOS 10116's interface to MEM 10112. DMOVR 20410 is the path through which data and addresses are transferred between EBMC 20414 and NDC 20416 and MEM 10112. Additionally, DMOVR 20410 controls access between EBMC 20414, NDC 20416, and other IOS 10116 data channels, and MEM 10112.

ED 10124, as indicated in FIG. 204, may be comprised of one or more data sinks and sources. ED 10124 data sinks and sources may include commercially available disc drive units, line printers, communication lengths, tape units, and other computer systems, including other CS 10110 systems. In general, ED 10124 may include all such data devices as are generally interfaced with a computer system.

a. I/O System 10116 Structure (FIG. 204)

Referring first to the overall structure of IOS 10116, data input/output of ECLIPSE® Burst Multiplexer Channel Adapter and Control Circuitry (BMCAC) 20418 of EBMC 20414 is connected to bi-directional BMC Address and Data (BMCAD) Bus 20420. BMCAD Bus 20420 in turn is connected to data and address inputs and outputs of data sinks and sources of ED 10124.

Similarly, data and address inputs and outputs of NOVA® Data Channel Adapter Control Circuits (NDCAC) 20422 in NDC 20416 is connected to bi-directional NOVA® Data Channel Address and Data (NDCAD) Bus 20424. NDCAD Bus 20424 in turn is connected to address and data inputs and outputs of data sources and sinks of ED 10124. BMCAD Bus 20420 and NDCAD Bus 20424 are paths for transfer of data and addresses between data sinks and sources of ED 10124 and IOS 10116's data channels and may be expanded as required to include other IOS 10116 data channel devices and other data sink and source devices of ED 10124.

Within EBMC 20414, bi-directional data input and output of BMCAC 20418 is connected to bi-directional input and output of BMC Data Buffer (BMCDB) 20426. Data inputs and data outputs of BMCDB 20426 are connected to, respectively, Data Mover Output Data (DMOD) Bus 20428 and Data Mover Input Data (DMID) Bus 20430. Address outputs of BMCAC 20418 are connected to address inputs of Burst Multiplexer Channel Address Translation Map (BMCATM) 20432 and address outputs of BMCATM 20432 are connected onto DMID Bus 20430. A bi-directional control input and output of BMCATM 20432 is connected from bi-directional IO Control Processor Control (IOCPC) Bus 20434.

Referring to NDC 20416, as indicated in FIG. 204 data inputs and outputs of NDCAC 20422 are connected, respectively, from DMOD Bus 20428 and to DMID Bus 20430. Address outputs of NDCAC 20422 are connected to address inputs of NOVA® Data Channel Address Translation Map (NDCATM) 20436. Address outputs of NDCATM 20436 are, in turn, connected onto DMID Bus 20430. A bi-directional control input and output of NDCATM 20436 is connected from IOCPC Bus 20434.

Referring to IOCP 20412, a bi-directional control input and output of IOCP 20412 is connected from IOCPC Bus 20434. Address and data output of IOCP 20412 is connected to NDCAD Bus 20424. An address output of IOCP Address Translation Map (IOCPATM) 20438 within IOCP 20412 is connected onto DMID Bus 20430. Data inputs and outputs of IOCP 20412 are connected, respectively, to DMOD Bus 20428 and DMID Bus 20430. A bi-directional control input and output of IOCP 20412 is connected to a bi-directional control input and output of DMOVR 20410.

Referring finally to DMOVR 20410, DMOVR 20410 includes Input Data Buffer (IDB) 20440, Output Data Buffer (ODB) 20442, and Priority Resolution and Control (PRC) 20444. A data and address input of IDB 20440 is connected from DMID Bus 20430. A data and address output of IDB 20440 is connected to IOM Bus 10130 to MEM 10112. A data output of ODB 20442 is connected from MIO Bus 10129 from MEM 10112, and a data output of ODB 20442 is connected to DMOD Bus 20428. Bi-directional control inputs and outputs of IDB 20440 and ODB 20442 are connected from bi-directional control inputs and outputs of PRC 20444. A bi-directional control input and output of PRC 20444 is connected from a bi-directional control input and output of IOCP 20412 as described above. Another bi-directional control input and output of PRC 20444 is connected to and from IOMC Bus 10131 and thus from a control input and output of MEM 10112. Having described overall structure of IOS 10116, operation of IOS 10116 will be described next below.

b. I/O System 10116 Operation (FIG. 269)

1. Data Channel Devices

Referring first to EBMC 20414, BMCAC 20418 receives data and addresses from ED 10124 through BMCAD Bus 20420. BMCAC 20418 transfers data into BMCDB 20426, where that data is held for subsequent transmission to MEM 10112 through DMOVR 20410, as will be described below. BMCAC 20418 transfers addresses received from ED 10124 to BMCATM 20432. BMCATM 20432 contains address mapping information correlating ED 10124 addresses with MEM 10112 physical addresses. BMCATM 20432 thereby provides MEM 10112 physical addresses corresponding to ED 10124 addresses provided through BMCAC 20418.

When, as will be described further below, EBMC 20414 is granted access to MEM 10112 to write data into MEM 10112, data stored in BMCDB 20426 and corresponding addresses from BMCATM 20432 are transferred onto DMID Bus 20430 to DMOVR 20410. As will be described below, DMOVR 20410 then writes that data into those MEM 10112 physical address locations. When data is to be read from MEM 10112 to ED 10124, data is provided by DMOVR 20410 on DMOD Bus 20428 and is transferred into BMCDB 20426 BMCAC 20418 then reads that data from BMCDB 20426 and transfers that data onto BMCAD Bus 20420 to ED 10124. During transfers of data from MEM 10112 to ED 10124, MEM 10112 does not provide addresses to be translated into ED 10124 addresses to accompany that data. Instead, those addresses are generated and provided by BMCAC 20418.

NDC 20416 operates in a manner similar to that of EBMC 20414 except that data inputs and outputs of NDCAC 20422 are not buffered through a BMCDB 20426.

As previously described, MEM 10112 has capacity to perform block transfers, that is sequential transfers of four 32 bit words at a time. In general, such transfers are performed through EBMC 20414 and are buffered through BMCDB 20426. That is, BMCDB 20426 allows single 32 bit words to be received from ED 10124 by EBMC 20414 and stored therein until a four word block has been received. That block may then be transferred to MEM 10112. Similarly, a block may be received from MEM 10112, stored in BMCDB 20426, and transferred one word at a time to ED 10124. In contrast, NDC 20416 may generally be utilized for single word transfers.

As indicated in FIG. 204, EBMC 20414, NDC 20416, and each data channel device of IOS 10116 each contain an individual address translation map, for example BMCATM 20432 in EBMC 20414 and NDCATM 20436 in NDC 20416. Address translation maps stored therein are effectively constructed and controlled by IOCP 20412 for each data channel device. IOS 10116 may thereby provide an individual and separate address translation map for each IOS 10116 data channel device. This allows IOS 10116 to insure that no two data channel devices, nor two groups of data sinks and sources in ED 10124, will mutually interfere by writing into and destroying data in a common area of MEM 10112 physical address space. Alternately, IOS 10116 may generate address translation maps for two or more data channel devices wherein those maps share a common, or overlapping, area of MEM 10112's physical address space. This allows data stored in MEM 10112 to be transferred between IOS 10116 data channel devices through MEM 10112, and thus to be transferred between various data sink and source devices of ED 10124. For example, a first ED 10124 data source and a first IOS 10116 data channel may write data to be operated upon into a particular area of MEM 10112 address space. The results of CS 10110 operations upon that data may then be written into a common area shared by that first data device and a second data device and read out of MEM 10112 to a second ED 10124 data sink by that second data channel device. Individual mapping of IOS 10116's data channel devices thereby provides total flexibility in partitioning or sharing of MEM 10112's address space through IOS 10116.

2. I/O Control Processor 20412

As described above, IOCP 20412 is a general purpose computer whose primary function is overall direction and control or data transfer between MEM 10112 and ED 10124. IOCP 20412 controls mapping of addresses between IOS 10116's data channel devices and MEM 10112 address space. In this regard IOCP 20412 generates address translation maps for IOS 10116's data channel devices, such EBMC 20414 and NDC 20416 IOCP 20412 loads these address translation maps into and controls, for example, BMCATM 20432 of EBMC 20414 and NDCATM 20436 and NDC 20416 through IOCPC Bus 20434. IOCP 20412 also provides certain control functions to DMOVR 20410, as indicated in FIG. 204. In addition to these functions, IOCP 20412 is also provided with data and addressing inputs and outputs. These data addressing inputs and outputs may be utilized, for example, to obtain information utilized by IOCP 20412 in generating and controlling mapping of addresses between IOS 10116's data channel devices and MEM 10112. Also, these data and address inputs and outputs allow IOCP 20412 to operate, in part, as a data channel device. As previously described, IOCP 20412 has data and address inputs and outputs connected from and to DMID Bus 20430 and DMOD Bus 20428. IOCP 20412 thus has access to data being transferred between ED 10124 and MEM 10112, providing IOCP 20412 with direct access to MEM 10112 address space. In addition, IOCP 20412 is provided with control and address outputs to NDCAD Bus 20424, thus allowing IOCP 20412 partial control of certain data source and sink devices in ED 10124.

3. Data Mover 20410 (FIG. 269)

a.a. Input Data Buffer 20440 and Output Data Buffer 20442

As described above, DMOVR 20410 comprises an interface between IOS 10116's data channels and MEM 10112. DMOVR 20410 performs actual transfer of data between IOS 10116's data channel devices and MEM 10112, and controls access between IOS 10116's data channel devices and MEM 10112. IDB 20440 and ODB 20442 are data and address buffers allowing asynchronous transfer of data between IOS 10116 and MEM 10112. That is, ODB 20442 may accept data from MEM 10112 as that data becomes available and then hold that data until an IOS 10116 data channel device, for example EBMC 20414, is ready to accept that data. IDB 20440 accepts data and MEM 10112 physical addresses from IOS 10116's data channel devices. IDB 20440 holds that data and addresses for subsequent transmission to MEM 10112 when MEM 10112 is ready to accept data and addresses. IDB 20440 may, for example, accept a burst, or sequence, of data from EBMC 20414 or single data words from NDC 20416 and subsequently provide that data to MEM 10112 in block, or four word, transfers as previously described. Similarly, ODB 20442 may accept one or more block transfers or data from ODB 20442 and subsequently provide that data to NDC 20416 as single words, or to DMID 20430 as a data burst. In addition, as previously described, a block transfer from MEM 10112 may not appear as four sequential words. In such cases, ODB 20442 accepts the four words of a block transfer as they appear on MIO Bus 10129 and assembles those words into a block comprising four sequential words for subsequent transfer to ED 10124.

Transfer of data through IDB 20440 and ODB 20442 is controlled by PRC 20444, which exchanges control signals with IOCP 20412 and has an interface, previously described, to MEM 10112 through IOMC Bus 10131.

b.b. Priority Resolution and Control 20444 (FIG. 269)

As previously described, PRC 20444 controls access between IOS 10116 data channel devices and MEM 10112. This operation is performed by means of a Ring Grant Access Generator (RGAG) within PRC 20444.

Figure 270:
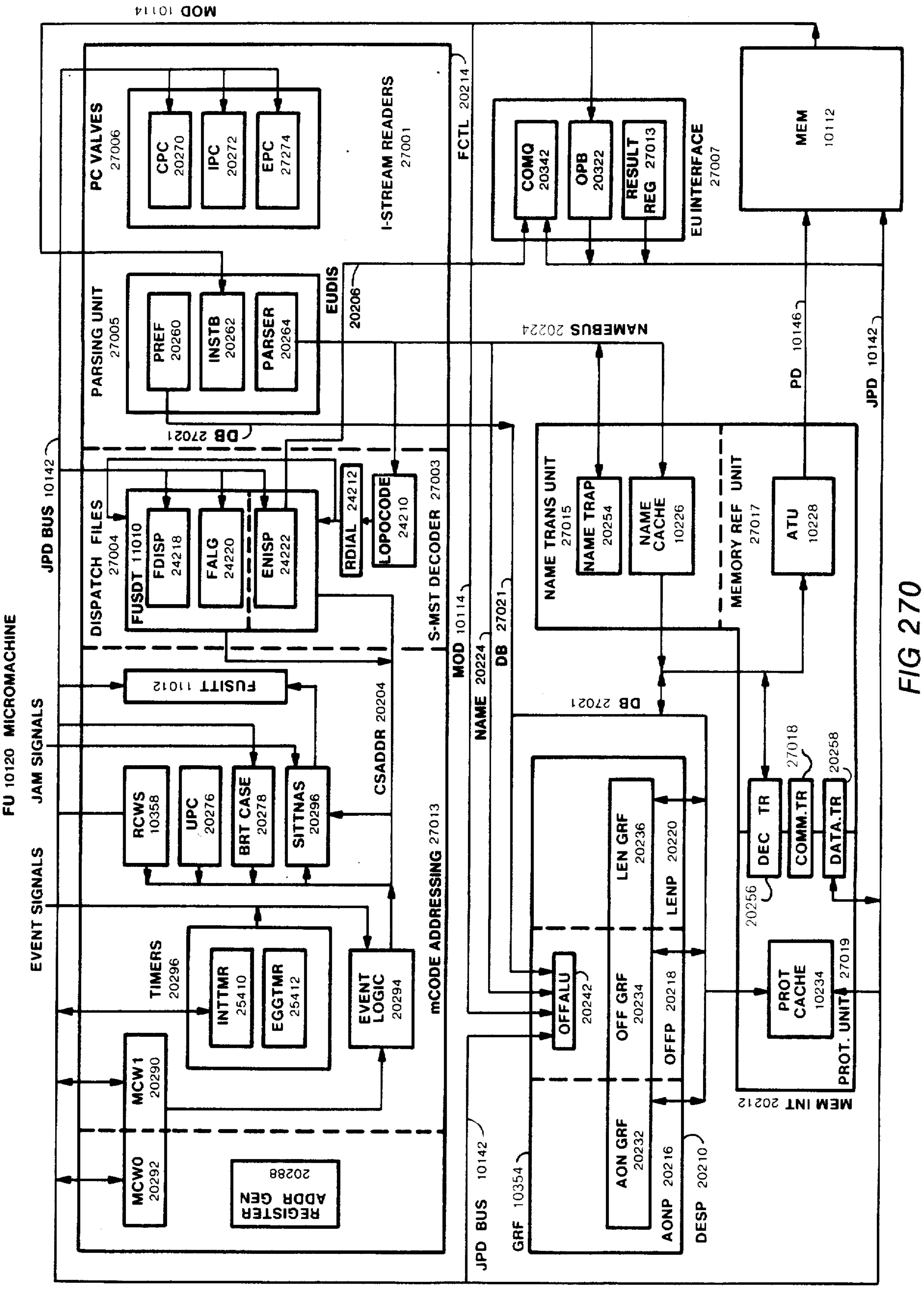
FIG. 270 is a detailed block diagram of a fetch unit micromachine of the present computer system.

Referring to FIG. 270, a diagramic representation of PRC 20444's RGAG is shown. In general, PRC 20444's RGAG is comprised of a Ring Grant Code Generator (RGCG) 26910 and one or more data channel request comparators. In FIG. 269, PRC 20444's RGAC is shown as including ECLIPSE® Burst Multiplexer Channel Request Comparator (EBMCRC) 26912, NOVA® Data Channel Request Comparator (NDCRC) 26914, Data Channel Device X Request Comparator (DCDXRC) 26916, and Data Channel Device Z Request Comparator (DCDZRC) 26918. PRC 20444's RGAG may include more or fewer request comparators as required by the number of data channel devices within a particular IOS 10116.

As indicated in FIG. 269, Request Grant Code (RGC) outputs of RGCG 26910 are connected in parallel to first inputs of EBMCRC 26912, NDCRC 26914, DCDXRC 26916, and DCDZRC 26918. Second inputs of EBMCRC 26912, NDCRC 26914, DCDXRC 26916, and DCDZRC 26918 are connected from other portions of PRC 20444 and receive indications that, respectively, EBMC 20414, NDC 20416, DCDX, or DCDZ has submitted a request for a read or write access to MEM 10112.

Request Grant Outputs (GRANT) of EBMCRC 26912, NDCRC 26914, DCDXRC 26916, and DCDZRC 26918 are in turn connected to other portions of PRC 20444 circuitry to indicate when read or write access to MEM 10112 has been granted in response to a request by a particular IOS 10116 data channel device. When indication of such a grant is provided to those other portions of PRC 20444, PRC 20444 proceeds to generate appropriate control signals to MEM 10112, through IOMC Bus 10131 as previously described, to IDB 20440 and ODB 20442, and to IOCP 20412. PRC 20444's control signals initiate that read or write request to that IOS 10116 data channel device. Grant outputs of EBMCRC 26912, NDCRC 26914, DCDXRC 26916, and DCDZRC 26918 are also provided as inputs to RGCG 26910 to indicate, as described further below, when a particular IOS 10116 has requested and been granted access to MEM 10112.

As indicated in FIG. 269, a diagramic figure above RGCG 26910, RGCG generates a repeated sequence of unique RGCs. Herein indicated as numeric digits 0 to 15. Each RGC identifies, or defines, a particular time slot during which a IOS 10116 data channel device may be granted access to MEM 10112. Certain RGCs are, effectively, assigned to particular IOS 10116 data channel devices. Each such data channel device may request access to MEM 10112 during its assigned RGC identified access slots. For example, EBMC 20414 is shown as being allowed access to MEM 10112 during those access slots identified by RGCs 0, 2, 4, 6, 8, 10, 12, and 14. NDC 20416 is indicated as being allowed access to MEM 10112 during RGC slots 3, 7, 11, and 15. DCDX is allowed access during slots 1 and 9, and DCDZ is allowed access during RGC slots 5 and 13.

As described above, RGCG generates RGCs 0 to 15 in a repetitive sequence. During occurrence of a particular RGC, each request comparator of PRC 20444's RGAG examines that RGC to determine whether its associated data channel device is allowed access during that RGC slot, and whether that associated data channel device has requested access to MEM 10112. If that associated data channel device is allowed access during that RGC slot, and has requested access, that data channel device is granted access as indicated by that request comparator's GRANT output. The request comparators GRANT output is also provided as an input to RGCG 26910 to indicate to RGCG 26910 that access has been granted during that RGC slot.

If a particular data channel device has not claimed and has not been granted access to MEM 10112 during that RGC slot, RGCG 26910 will go directly to next RGC slot. In next RGC slot, PRC 20444's RGAG again determines whether the particular data channel device allowed access during that slot has submitted a request, and will grant access if such a request has been made. If not, RGCG 26910 will again proceed directly to next RGC slot, and so on. In this manner, PRC 20444's RGAG insures that each data channel device of IOS 10116 is allowed access to MEM 10112 without undue delay. In addition, PRC 20444's RGAG prevents a single, or more than one, data channel device from monopolizing access to MEM 10112. As described above, each data channel device is allowed access to MEM 10112 at least once during a particular sequence of RGCs. At the same time, by not pausing within a particular RGC in which no request for access to MEM 10112 has occurred, PRC 20444's RGAG effectively automatically skips over those data channel devices which have not requested access to MEM 10112. PRC 20444's RGAG thereby effectively provides, within a given time interval, more frequent access to those data channel devices which are most busy. In addition, the RGCs assigned to particular IOS 10116 data channel devices may be reassigned as required to adapt a particular CS 10110 to the data input and output requirements of a particular CS 10110 configuration. That is, if EBMC 20414 is shown to require less access to MEM 10112 then NDC 20416, certain RGCs may be reassigned from EBMC 20414 to NDC 20416. Access to MEM 10112 by IOS 10116's data channel devices may thereby be optimized as required.

Having described structure and operation of IOS 10116, structure and operation of DP 10118 will be described next below.

E. Diagnostic Processor 10118 (FIGS. 101, 205)

Referring to FIG. 101, as previously described, DP 10118 is interconnected with IOS 10116, MEM 10112, FU 10120, and EU 10122 through DP Bus 10138. DP 10118 is also interconnected, through DPIO Bus 10136, with the external world and in particular with DU 10134. In addition to performing diagnostic and fault monitoring and correction operations, DP 10118 operates, in part, to provide control and display functions allowing an operator to interface with CS 10110. DU 10134 may be comprised, for example, of a CRT and keyboard unit, or a teletype, and provides operators of CS 10110 with all control and display functions which are conventionally provided by a hard console, that is a console containing switches and lights. For example, DU 10134, through DP 10118, allows an operator to exercise control of CS 10110 for such purposes as system initialization and startup, execution of diagnostic processes, fault monitoring and identification, and control of execution of programs. As will be described further below, these functions are accomplished through DP 10118's interfaces with IOS 10116, MEM 10112, FU 10120, and EU 10122.

DP 10118 is a general purpose computer system, for example a NOVA® 4 computer of Data General Corporation of Westboro, Mass. Interface of DP 10118 and DU 10134, and mutual operation of DP 10118 and DU 10134, will be readily apparent to one of ordinary skill in the art. DP 10118's interface and operation, with IOS 10116, MEM 10112, FU 10120, and EU 10122 will be described further next below.

DP 10118, operating as a general purpose computer programmed specifically to perform the functions described above, has, as will be described below, read and write access to registers of IOS 10116, MEM 10112, FU 10120 and EU 10122 through DP Bus 10138. DP 10118 may read data directly from and write data directly into those registers. As will be described below, these registers are data and instruction registers and are integral parts of CS 10110's circuitry during normal operation of CS 10110. Access to these registers thereby allows DP 10118 to directly control or effect operation of CS 10110. In addition, and as also will be described below, DP 10118 provides, in general, all clock signals to all portions of CS 10110 circuitry and may control operation of that circuitry through control of these clock signals.

For purposes of DP 10118 functions, CS 10110 may be regarded as subdivided into groups of functionally related elements, for example DESP 20210 in FU 10120. DP 10118 obtains access to the registers of these groups, and control of clocks therein, through scan chain circuits, as will be described next below. In general, DP 10118 is provided with one or more scan chain circuits for each major functional sub-element of CS 10110.

Referring to FIG. 205, a diagramic representation of DP 10118 and a typical DP 10118 scan chain is shown. As indicated therein, DP 10118 includes a general purpose Central Processor Unit, or computer, (DPCPU) 27010. A first interface of DPCPU 27010 is with DU 10134 through DPIO Bus 10136. DPCPU 27010 and DU 10134 exchange data and control signals through DPIO Bus 10136 in the manner to direct operations of DPCPU 27010, and to display the results of those operations through DU 10134.

Associated with DPCPU 27010 is Clock Generator (CLKG) 27012. CLKG 27012 generates, in general, all clock signals used within CS 10110.

DPCPU 27010 and CLKG 27012 are interfaced with the various scan chain circuits of CS 10110 through DP Bus 10138. As described above, CS 10110 may include one or more scan chains for each major sub-element of CS 10110. One such scan chain, for example DESP 20210 Scan Chain (DESPSC) 27014 is illustrated in FIG. 205.

Interface between DPCPU 27010 and CLKG 27012 and, for example, DESPSC 27014 is provided through DP Bus 10138. As indicated in FIG. 205, DESPSC 27014 includes Scan Chain Clock Gates (SCCG) 27016 and one or more Scan Chain Registers (SCRs) 27018 to 27024.

SCCG 27016 receives clock signals from CLKG 27012 and control signals from DPCPU 27010 through DP Bus 10138. SCCG 27016 in turn provides appropriate clock signals to the various registers and circuits of, for example, DESP 20210. Clock control signals provided by DPCPU 27010 to SCCG 27016 control, or gate, the various clock signals to these registers and circuits of DESP 20210, thereby effectively allowing DPCPU 27010 to control of DESP 20210.

SCRs 27018 to 27024 are comprised of various registers within DESP 20210. For example, SCRs 27018 to 27024 may include the output buffer registers of AONGRF 20232, OFFGRF 20234, LENGRF 20236, output registers of OFFALU 20242 and LENALU 20252, and registers within OFFMUX 20240 and BIAS 20246. Such registers are indicated in the present description, as previously described, by arrows appended to ends of those registers, with a first arrow indicating an input and a second an output. In normal CS 10110 operations, as previously described, SCRs 27018 to 27024 operate as parallel in, parallel out buffer registers through which data and instructions are transferred. SCRs 27018 to 27024 are also capable of operating as shift registers and, as indicated in FIG. 205, are connected together to comprise a single shift register circuit having an input from DPCPU 27010 and an output to DPCPU 27010. Control inputs to SCRs 27018 to 27024 from DPCPU 27010 control operation of SCRs 27018 to 27024, that is whether these registers shall operate as parallel in, parallel out registers, or as shift registers of DESPSC 27014's scan chain. The shift register scan chain comprising SCRs 27018 to 27024 allows DPCPU 27010 to read the contents of SCRs 27018 to 27024 by shifting the content of these registers into DPCPU 27010. Conversely, DPCPU 27010 may write into SCRs 27018 to 27024 by shifting information generated by DPCPU 27010 from DPCPU 27010 and through the shift register scan chain to selected locations within SCRs 27018 to 27024.

Scan chain clock generator circuits and scan chain registers of each scan chain circuit within CS 10110 thereby allow DP 10118 to control operation of each major sub-element of CS 10110. For example, to read information from the scan chain registers therein, and to write information into those scan chain registers as required for diagnostic, monitoring, and control functions.

Having described structure and operation of each major element of CS 10110, including MEM 10112, FU 10120, EU 10122, IOS 10116, and DP 10118, certain operations of, in particular, FU 10120 will be described further next below. The following descriptions will further disclose operational features of JP 10114, and in particular FU 10120, by describing in greater detail certain operations therein by further describing microcode control of JP 10114.

F. CS 10110 Micromachine Structure and Operation (FIGS. 270–274)

a. Introduction

The preceding descriptions have presented the hardware structures and operation of FU 10120 and EU 10122. The following description will describe how devices in FU 10120, and certain EU 10122 devices, function together as a microprogrammable computer, henceforth termed the FU micromachine. The FU micromachine performs two tasks: it interprets SINs, and it responds to certain signals generated by devices in FU 10120, EU 10122, MEM 10112, and IOS 10116. The signals to which the FU micromachine responds are termed Event signals. In terms of structure and operation, the FU micromachine is characterized by the following:

Registers and ALUs specialized for the handling of logical descriptors.

Registers organized as stacks for invocations of microroutines (microinstruction sequences).

Mechanisms allowing microroutine invocations by means of event signals from hardware.

Mechanisms which allow an invoked microroutine to return either to the microinstruction following the one which resulted in the invocation or to the microinstruction which resulted in the invocation.

Mechanisms which allow the contents of stack registers to be transferred to MEM 10112, thereby creating a virtual microstack of limitless size.

Mechanisms which guarantee response to an event signal within a predictable length of time.

The division of the devices comprising the micromachine into two groups: those devices which may be used by all microcode and those which may be used only by KOS (Kernel Operating System, previously described) microcode.

These devices and mechanisms allow the FU micromachine to be used in two ways: as a virtual micromachine and as a monitor micromachine. Both kinds of micromachine use the same devices in FU 10120, but perform different functions and have different logical properties. In the following discussion, when the FU micromachine is being used as a virtual micromachine, it is said to be in virtual mode, and when it is being used as a monitor micromachine, it is said to be in monitor mode. Both modes are introduced here and explained in detail later.

When the FU micromachine is being used in virtual mode, it has the following properties:

It runs on an essentially infinite micromachine stack belonging to a Process 610.

It can respond to any number of event signals in the M0 cycle (state) of a single microinstruction.

A page fault may occur on the invocation of any microroutine or on return from any microroutine.

When the FU micromachine is in virtual mode, any microroutine may not run to completion, i.e., complete its execution in a predictable length of time, or complete it at all.

It is executing a Process 610.

The last four properties are consequences of the first: Event signals result in invocations, and since the micromachine stack is infinite, there is no limit to the number of invocations. The infinite micromachine stack is realized by placing micromachine stack frames on Secure Stack 10336 belonging to a Process 610, and the virtual micromachine therefore always runs on a micromachine stack belonging to some Process 610. Furthermore, if the invocation of a microroutine or a return from a microroutine requires micromachine frames to be transferred from Secure Stack 10336 to the FU micromachine, a page fault may result, and Process 610 which is executing the microroutine may be removed from JP 10114, thereby making the time required to execute the microroutine unpredictable. Indeed, if Process 610 is stopped or killed, the execution of the microroutine may never finish. As will be seen in descriptions below, the Virtual Processor 612 is the means by which the virtual micromachine gains access to a Process 610's micromachine stack.

When in monitor mode, the FU micromachine has the following properties:

It has a micromachine stack of fixed size, the stack is always available to the FU micromachine, and it is not associated with a Process 610.

It can respond to only a fixed number of events during the M0 cycle of a single microinstruction.

In monitor mode, invocation of a microroutine or return from a microroutine will not cause a page fault.

Microroutines executing on the FU micromachine when the micromachine is in monitor mode are guaranteed to run to completion unless they themselves perform an action which causes them to give up JP 10114.

Microroutines executing in monitor mode need not be performing functions for a Process 610.

Again, the remaining properties are consequences of the first: because the monitor micromachine's stack is of fixed size, the number of events to which the monitor micromachine can respond is limited; furthermore, since the stack is always directly accessible to the micromachine, microroutine invocations and returns will not cause page faults, and microroutines running in monitor mode will run to completion unless they themselves perform an action which causes them to give up JP 10114. Finally, the monitor micromachine's stack is not associated with a Process 610's Secure Stack 10336, and therefore, the monitor micromachine can both execute functions for Processes 610 and execute functions (which are related to no Process 610, for example,) the binding and removal of Virtual Processors 612 from JP 10114.

The description which follows first gives an overview of the devices which make up the micromachine, continues with descriptions of invocations on the micromachine and micromachine programming, and concludes with detailed discussions of the virtual and monitor modes and an overview of the relationship between the micromachine and CS 10110 subsystems. The manner in which the micromachine performs specific operations such as SIN parsing, Name resolution, or address translation may be found in previous descriptions of CS 10110 components which the micromachine uses to perform the operations.

b. Overview of Devices Comprising FU Micromachine (FIG. 270)

FIG. 270 presents an overview of the devices comprising the micromachine. FIG. 270 is based on FIG. 201, but has been simplified to improve the clarity of the discussion. Devices and subdivisions of the micromachine which appear in FIG. 201 have the numbers given them in that figure. When a device in FIG. 270 appears in two subdivisions, it is shared by those subdivisions.

FIG. 270 has four main subdivisions. Three of them are from FIG. 201: FUCTL 20214, which contains the devices used to select the next microinstruction to be executed by the micromachine, DESP 20210, which contains stack and global registers and ALUs for descriptor processing; and MEMINT 20212, which contains the devices which translate Names into logical descriptors and logical descriptors into physical descriptors. The fourth subdivision, EU Interface 27007, represents those portions of EU 10122 which may be manipulated by FU 10120 microcode.

FIG. 270 further subdivides FUCTL 20214 and MEMINT 20212. FUCTL 20214 has four subdivisions:

I-Stream Reader 27001, which contains the devices used to obtain SINs and parse them into SOPs and Names.

SOP Decoder 27003, which translates SOPs into locations in FU microcode (FUSITT 11012), and in some cases EU microcode (EUSITT 20344), which contain the microcode that performs the corresponding SINs.

Microcode Addressing 27013, which determines the location of the next microinstruction to be executed in FUSITT 11012.

Register Addressing 27011, which contains devices which generate addresses for GRF 10354 registers.

MEMINT 20212 also has three subdivisions:

Name Translation Unit 27015, which contains devices which accelerate the translation of Names into logical descriptors.

Memory Reference Unit 27017, which contains devices which accelerate the translation of logical descriptors into physical descriptors.

Protection Unit 27019, which contains devices which accelerate primitive access checks on memory references made with logical descriptors.

FIG. 270 also simplifies the bus structure of FIG. 202 by combining LENGTH Bus 20226, OFFSET Bus 20228, and AONR Bus 20230 into a single structure, Descriptor Bus (DB) 27021. In addition, internal bus connections have been reduced to those necessary for explaining the logical operation of the micromachine. The following discussion first describes those devices used by most microcode executing on FU 10120, and then describes devices used to perform special functions, such as Name translation or protection checking.

1. Devices used by Most Microcode

The subdivisions of the micromachine which contain devices used by most microcode are Microcode Addressing 27013, Register Addressing 27011, DESP 20210, and EU Interface 27007. In addition, most microcode uses MOD Bus 10144, JPD Bus 10142, and DB Bus 27021. The discussion begins with the buses and then describes the other devices in the above order.

a.a. MOD Bus 10144. JPD Bus 10142, and DB Bus 27021

MOD Bus 10144 is the only path by which data may be obtained from MEM 10112. Data on MOD Bus 10144 may have as its destination Instruction Stream Reader 27001, DESP 20210, or EU Interface 27007. In the first case, the data on MOD Bus 10144 consists of SINs; in the second, it is data to be processed by FU 10120, and in the third, it is data to be processed by EU 10122. In the present embodiment, data to be processed by FU 10120 is generally data which is destined for internal use in FU 10120, for example in Name Cache 10226. Data to be processed by EU 10122 is generally operands represented by Names in SINs.

JPD Bus 10142 has two uses: it is the path by which data returns to ME 10112 after it has been processed by JP 10114, and it is the path by which data other than logical descriptors moves between the subdivisions of the micromachine. For example, when CS 10110 is initialized, the microinstructions which are loaded into FUSITT 11012 are transferred from MEM 10112 to DESP 20210 via MOD Bus 10144, and from DESP 20210 to FUSITT 11012 via JPD Bus 10142.

DB 27021 is the path by which logical descriptors are transferred in the micromachine. DB 27021 connects Name Translation Unit 27015, DESP 20210, Protection Unit 27019, and Memory Reference Unit 27017. Typically, a logical descriptor is obtained from Name Translation Unit 27015, placed in a register in DESP 20210, and then presented to Protection Unit 27019 and Memory Reference Unit 27017 whenever a reference is made using a logical descriptor. However, DB 27021 is also used to transmit cache entries fabricated in DESP 20210 to ATU 10228, Name Cache 10226 and Protection Cache 10234.

b.b. Microcode Addressing

As discussed here, microcode addressing is comprised of the following devices: Timers 20296, Event Logic 20284, RCWS 10358, BRCASE 20278, mPC 20276, MCW0 20292, MCW1 20290, SITTNAS 20286, and FUSITT 11012. All of these devices have already been described in detail, and they are discussed here only as they affect microcode addressing. Other devices contained in FIG. 202, State Registers 20294, Repeat Counter 20280, and PNREG 20282 are not directly relevant to microcode addressing, and are not discussed here.

As has already been described in detail, devices in Microcode Addressing 27013 are loaded from JPD Bus 10142. The microcode addresses provided by these devices and by FUSDT 11010 are transmitted among the devices and to FUSITT 11012 by CSADR Bus 20204. There are six ways in which the next microcode address may be obtained:

Most commonly, the value in mPC 20276 is incremented, by 1 by a special ALU in mPC 20276, thus yielding the address of the microinstruction following the current microinstruction.

If a microinstruction specifies a call to a microroutine or a branch, the microinstruction contains a literal which an ALU in BRCASE 20278 adds to the value in mPC 20276 to obtain the location of the next microinstruction.

If a microinstruction specifies the use of a case value to calculate the location of the next microinstruction, BRCASE 20278 adds a value calculated by DESP 20210 to the value in mPC 20716. The value calculated by DESP 20210 may be obtained from a field of a logical descriptor, thus allowing the micromachine to branch to different locations in microcode on the basis of type information contained in the logical descriptor. On return from an invocation of a microroutine, the location at which execution of the microroutine in which the invocation occurred is to continue is obtained from RCWS 10358.

At the beginning of the execution of an SIN, the location at which the microcode for the SIN begins is obtained from the SIN's SOP by means of FUSDT 11010.

Certain hardware signals cause invocations of microroutines. There are two classes of such signals: Event signals, which Event Logic 20284 transforms into invocations of certain microroutines, and JAM signals, which are translated directly into locations in microcode.

The addresses obtained as described above are transmitted to SITTNAS 20286, which selects one of the addresses as the location of the next microinstruction to be executed and transmits the location to FUSITT 11012. As the location is transmitted to FUSITT 11012, it is also stored in mPC 20276. All addresses except those for Jams are tranferred to SITTNAS 20286 via CSADR Bus 20204. Addresses obtained from JAM signals are transferred by separate lines to SITTNAS 20286.

As will be explained in detail below, microroutine calls and returns also involve pushing and popping micromachine stack frames and saving state contained in MCW1 20290.

Figure 271:
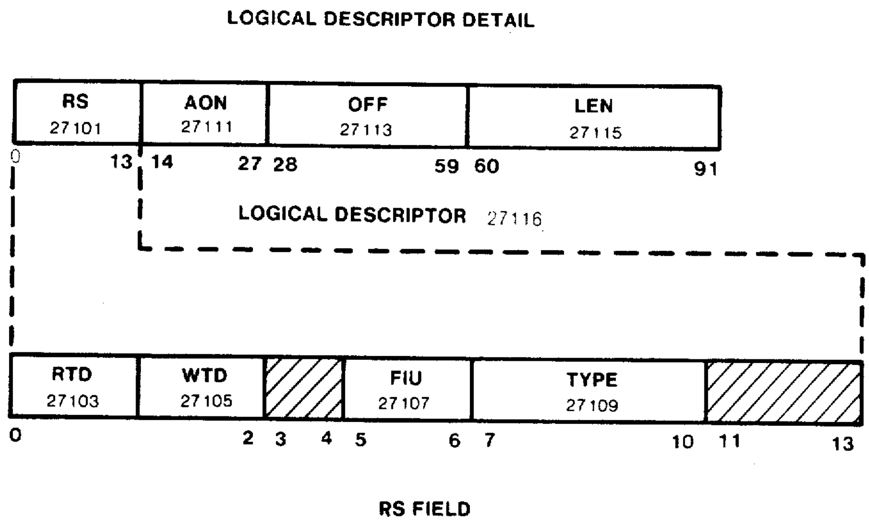
FIG. 271 is a diagram illustrating a logical descriptor.

Register Addressing 27011 controls access to micromachine registers contained in GRF 10354. As explained in detail below, GRF 10354 contains both registers used for the micromachine stack and global registers, that is, registers that are always accessible to all microroutines. The registers are grouped in frames, and individual registers are addressed by frame number and register number. Register Addressing 27011 allows addressing of any frame and register in the GRs 10360 of GRF 10354, but allows addressing of registers in only three frames of the SR's 10362: the current (top) frame, the previous frame (i.e., the frame preceding the top frame), and the bottom frame, that is, the lowest frame in a virtual micromachine stack which is still contained in GRF 10354. The values provided by Register Addressing 27011 are stored in MCW0 20292. As will be explained in the discussion of microroutine invocations which follows, current and previous are incremented on each invocation and decremented on each return.

c.c. Descriptor Processor 20210 (FIG. 271)

DESP 20210 is a set of devices for storing and processing logical descriptors. The internal structure of DESP 20210's processing devices has already been explained in detail; here, the discussion deals primarily with the structure and contents of GRF 10354. In a present embodiment of CS 10110, GRF 10354 contains 256 registers. Each register may contain a single logical descriptor. FIG. 271 illustrates a Logical Descriptor 27116 in detail. In a present embodiment of CS 10110, a Logical Descriptor 27116 has four main fields:

RS Field 27101, which contains various flags which are explained in detail below.

AON Field 27111, which contains the AON portion of the address of the data item represented by the Logical Descriptor 27116.

OFF Field 27113, which contains the offset portion of the address of the data item represented by Logical Descriptor 27116.

LEN Field 27115, which contains the length of the data item represented by the Logical Descriptor 27116.

RS Field 27101 has subfields as follows:

RTD Field 27103 and WTD Field 27105 may be set by microcode to disable certain Event signals provided for debuggers by CS 10110. For details, see a following description of debugging aids in CS 10110.

FIU Field 27107 contains two bits. The fields are set from information in the Name Table Entry used to construct the Logical Descriptor 27116. The bits determine how the data specified by the Logical Descriptor 27116 is to be justified and filled when it is fetched from MEM 10112.

TYPE Field 27109's four bits are also obtained from the Name Table Entry used to construct the Logical Descriptor 27116. The field's settings vary from S-Language to S-Language, and are used to communicate S-Language-specific type information to the S-Language's S-Interpreter microcode.

The four fields of a Logical Descriptor 27116 are contained in three separately-accessible fields in a GRF 10354 register: one containing RS Field 27101 and AON Field 27111, one containing OFF Field 27113, and one containing LEN Field 27115. In addition, each GRF 10354 register may be accessed as a whole. GRF 10354 is further subdivided into 32 frames of eight registers each. An individual GRF 10354 register is addressed by means of its frame number and its register number within the frame. In a present embodiment of CS 10110, half of the frames in GRF 10354 belong to SR's 10362 and are used for micromachine stacks, and half belong to GRs 10360 for storing "global information". In SR's 10362, each GRF 10354 frame contains information belonging to a single invocation of a microroutine. As previously explained, Register Addressing 27011 allows addressing of only three GRF 10354 frames in SR's tack 10362, the current top frame in the stack, the previous frame, and the bottom frame. Registers are accessed by specifying one of these three frames and a register number.

The global information contained in GRs 10360, is information which is not connected with a single invocation. There are three broad categories of global information:

Information belonging to Process 610 whose Virtual Processor 612 is currently bound to JP 10114. Included in this information are the current values of Process 610's ABPs and the pointers which KOS uses to manage Process 610's stacks.

Information required for the operation of KOS. Included in this information are such items as pointers to KOS data bases which occupy fixed locations in MEM 10112.

Constants, that is, fixed values required for certain frequently performed operations in FU 10120.

Remaining registers are available to microprogrammers as temporary storage areas for data which cannot be stored in a microroutine's stack frame. For example, data which is shared by several microroutines may best be placed in a GR 10360. Addressing of registers in the GRs 10360 of GRF 10354 requires two values: a value of 0 through 15 to specify the frame and a value of 0 through 7 to specify the register in the frame.

As previously discussed in detail, each of the three components AONP 20216, OFFP 20218, and LENP 20220 of DESP 20210 also contains ALUs, registers, and logic which allows operations to be performed on individual fields of GRF 10354 registers. In particular, OFFP 20218 contains OFFALU 20242, which may be used as a general purpose 32 bit arithmetic and logical unit. OFFALU 20242 may further serve as a source and destination for JPD Bus 10142, the offset portion of DB 27021, and NAME Bus 20224, and as a destination for MOD Bus 10144. Consequently, OFFALU 20242 may be used to perform operations on data on these buses and to transfer data from one bus to another. For example, when an SIN contains a literal value used in address calculation, the literal value is transferred via NAME Bus 20224 to OFFALU 20242, operated on, and output via the offset portion of DB 27021.

d.d. EU 10122 Interface

FU 10120 specifies what operation EU 10122 is to perform, what operands it is to perform it on, and when it is finished, what is to be done with the operands. FU 10120 can use two devices in EU 10122 as destinations for data, and one device as a source for data. The destinations are COMQ 20342 and OPB 20322. COMQ 20342 receives the location in EUSITT 20344 of the microcode which is to perform the operation desired by the FU 10120. COMQ 20342 may receive the location in microcode either from an FU 10120 microroutine or from an SIN's SOP. In the first case, the location is transferred via JPD Bus 10142, and in the second, it is obtained from EUSDT 20266 and transferred via EUDIS Bus 20206. OPB 20322 receives the operands upon which the operation is to be performed. If the operands come directly from MEM 10112, they are transferred to OPB 20322 via MOD Bus 10144; if they come from registers or devices in FU 10120, they are transferred via JPD Bus 10142.

Result Register 27013 is a source for data. After EU 10122 has completed an operation, FU 10120 obtains the result from Result Register 27013. FU 10120 may then place the result in MEM 10112 or in any device accessible from JPD Bus 10142.

2. Specialized Micromachine Devices

Each of the groups of specialized devices serves one of CS 10110's subsystems. I-Stream Reader 27001 is part of the S-Interpreter subsystem, Name Translation Unit 27015 is part of the Name Interpeter subsystem, Memory Reference Unit 27017 is part of the Virtual Memory Management System, and Protection Unit 27019 is part of the Access Control System. Here, these devices are explained only in the context of the micromachine; for a complete understanding of their functions within the subsystems to which they belong, see previous descriptions of the subsystems.

a.a. I-Stream Reader 27001

I-Stream Reader 27001 reads and parses a stream of SINs (termed the I-Stream) from a Procedure Object 604, 606, 608. The I-Stream consists of SOPs (operation codes), Names, and literals. As previously mentioned, in a present embodiment of CS 10110, the I-Stream read from a given Procedure 602 has a fixed format: the SOPs are 8 bits long and the Names and literals all have a single length. Depending on the procedure, the length may be 8, 12, or 16 bits. I-Stream Reader 27001 parses the I-Stream by breaking it up into its constituent SOPs and Names and passing the SOPs and Names to appropriate parts of the micromachine. I-Stream Reader 27001 contains two groups of devices:

PC Values 27006, which is made up of three registers which contain locations in the I-Stream. When added to ABP PBP, the values contained in these registers specify locations in Procedure Object 901 containing the Procedure 602 being executed. CPC 20270 contains the location of the SOP or Name currently being interpreted; IPC 20272 contains the location of the beginning of the SIN currently being executed; EPC 20274, finally, is of interest only at the beginning of the execution of an SIN; at that time, it contains the location of the last SIN to be executed.

Parsing Unit 27005, which is made up of INSTB 20262, PARSER 20264, and PREF 20260. The micromachine uses PREF 20260 to create Logical Descriptors 27116 for the I-Stream, which are then placed on DB Bus 27021 and used in logical memory references. The data returned from these references is placed in INSTB 20262, and parsed by PARSER 20264.

SOPs, Names, and literals obtained by PARSER 20264 are placed on NAME Bus 20224, which connects PARSER 20264, SOP Decoder 27003, Name Translation Unit 27015, and OFFALU 20242.

b.b. SOP Decoder 27003

SOP Decoder 27003 decodes SOPs into locations in FU 10120 and EU 10122 microcode SOP Decoder 27003 comprises FUSDT 11010, EUSDT 20266, Dialect Register (RDIAL) 24212, and LOPDCODE 24210. FUSDT 11010 are further comprised of FUDISP 24218 and FALG 24220. The manner in which these devices translate SOPs contained in SINs into locations in FUSITT 11012 and EUSITT 20344 has been previously described.

c.c. Name Translation Unit 27015

Name Translation Unit 27015 accelerates the translation of Names into Logical Descriptors 27116. This operation is termed name resolution. It is comprised of two components: NC 10226 and Name Trap 20254. NC 10226 contains copies of information from a Procedure Object 604's Name Table 10350, and thereby makes it possible to translate Names into Logical Descriptors 27116 without referring to Name Table 10350. When a Name is presented to Name Translation Unit 27015, it is latched into Name Trap 20254 for later use by Name Translation Unit 27015 if required. As will be explained in detail later, in the present embodiment, Name translation always begins with the presentation of a Name to NC 10226. If the Name has already been translated, the information required to construct its Logical Descriptor 27116 may be contained in NC 10226. If there is no information for the Name in NC 10226, Name Resolution Microcode obtains the Name from Name Trap 20254, uses information from Name Table 10350 for the procedure being executed to translate the Name, places the required information in NC 10226, and attempts the translation again. When the translation succeeds, a Logical Descriptor 27116 corresponding to the Name is produced from the information in Name Cache 10115, placed on DB Bus 27021, and loaded into a GRF 10354 register.

d.d. Memory Reference Unit 27017

Memory Reference Unit 27017 performs memory references using Logical Descriptors 27116. Memory Reference Unit 27017 receives a command for MEM 10112 and a Logical Descriptor 27116 describing the data upon which the command is to be performed. In the case of a write operation, Memory Reference Unit 27017 also receives the data being written via JPD Bus 10142. Memory Reference Unit 27017 translates Logical Descriptor 27116 to a physical descriptor and transfers the physical descriptor and the command to MEM 10112 via PD Bus 10146. A Memory Reference Unit 27017 has four components: ATU 10228, which contains copies of information from KOS virtual memory management system tables, and thereby accelerates logical-to-physical descriptor translation; Descriptor Trap 20256, which traps Logical Descriptors 27116, Command Trap 27018, which traps memory commands; and Data Trap 20258, which traps data on write operations. When a logical memory reference is made, a Logical Descriptor 27116 is presented via DB Bus 27021 to ATU 10228, and at the same time, Logical Descriptor 27116 and the memory command are trapped in Descriptor Trap 20256 and Command Trap 27018. On write operations, the data to be written is trapped in Data Trap 20258. If the information needed to form the physical descriptor is present in ATU 10228, the physical descriptor is transferred to MEM 10112 via PD Bus 10146. If the information needed to form the physical descriptor is not present in ATU 10228, an Event Signal from ATU 10228 invokes a microroutine which retrieves Logical Descriptor 27116 from Descriptor Trap 20256 and uses information contained in KOS virtual memory management system tables to make an entry in ATU 10228 for Logical Descriptor 27116. When the microroutine returns, the logical memory reference is repeated using Logical Descriptor 27116 from Descriptor Trap 20256, the memory command from Command Trap 27018, and on write operations, the data in Data Trap 20258. As will be described in detail in the discussion of virtual memory management, if the data referenced by a logical memory reference is not present in MEM 10112, the logical memory reference causes a page fault.

e.e. The Protection Unit 27019

On each logical memory reference, Protection Unit 27019 checks whether the subject making the reference has access rights which allow it to perform the action specified by the memory command on the object being referenced. If the subject does not have the required access rights, a signal from Protection Unit 27019 causes MEM 10112 to abort the logical memory reference. Protection Unit 27019 consists of Protection Cache 10234, which contains copies of information from KOS Access Control System tables, and thereby speeds up protection checking, and shares Descriptor Trap 20256, Command Trap 27018, and Data Trap 20258 with Memory Reference Unit 27017. When a logical memory reference is made, the AON and offset portions of the logical descriptor are presented to Protection Cache 10234. If Protection Cache 10234 contains protection information for the object specified by the AON and offset and the subject performing the memory reference has the required access, the memory reference may continue; if Protection Cache 10234 contains protection information and the subject does not have the required access, a signal from Protection Cache 10234 aborts the memory reference. If Protection Cache 10234 does not contain the required access information, a signal from Protection Cache 10234 aborts the memory reference and invokes a microroutine which obtains the access information from KOS Access Control System tables and places it in Protection Cache 10234. When Protection Cache 10234 is ready, the memory access is repeated, using the logical descriptor from Descriptor Trap 20256, the memory command from Command Trap 27018, and in the case of write operations, the data in Data Trap 20258.

f.f. KOS Micromachine Devices

As mentioned in the above introduction to the micromachine, the devices making up the micromachine may be divided into two classes: those which any microcode written for the micromachine may manipulate, and those which may be manipulated exclusively by KOS microcode. The latter class consists of certain registers in GRs 10360 of GRF 10354, the bottom frame of the portion of the virtual micromachine stack in the stack portion (Stack Registers 10362) of GRF 10354, and the devices contained in Protection Unit 27019 and Memory Reference Unit 27017. Because Protection Unit 27019 and Memory Reference Unit 27017 may be manipulated only by KOS microcode, non-KOS microcode may not use Descriptor Trap 20256 or Command Trap 27018 as a source or destination, may not load or invalidate registers in ATU 10228 or Protection Cache 10234, and may not perform physical memory references, i.e., memory references which place physical descriptors directly on PD Bus 10146, instead of presenting logical descriptors to Memory Reference Unit 27017 and Protection Unit 27019. Similarly, non-KOS microcode may not specify KOS registers in the GRs 10360 of GRF 10354 or the bottom frame of the stack portion of GRF 10354 when addressing GRF 10354 registers. Further, in embodiments allowing dynamic loading of FUSITT 11012, only KOS microcode may manipulate the devices provided for dynamic loading.

In a present embodiment of CS 10110, the distinction between KOS devices and registers and devices and registers accessible to all microprograms is maintained by the microbinder. The microbinder checks all microcode for microinstructions which manipulate devices in Protection Unit 27019, or Memory Reference Unit 27017, or which address GRF 10354 registers reserved for KOS use. However, it is characteristic of the micromachine that KOS devices are logically and physically separate from devices accessible to all microprograms and, consequently, other embodiments of CS 10110 may use hardware devices to prevent non-KOS microprograms from manipulating KOS devices.

c. Micromachine Stacks and Microroutine Calls and Returns (FIGS. 272, 273)

1. Micromachine Stacks (FIG. 272)

As previously mentioned, the FU micromachine is a stack micromachine. The properties of the FU micromachine's stack depends on whether the FU micromachine is in virtual or monitor mode. In virtual mode, the micromachine stack is of essentially unlimited size; if it contains more frames than allowed for inside FU 10120, the top frames are in GRF 10354 and the remaining frames are in Secure Stack 10336 belonging to Process 610 being executed by the FU micromachine. In the following, the virtual mode micromachine stack is termed the virtual micromachine stack. In monitor mode, the micromachine stack consists of a fixed amount of storage; in a present embodiment of CS 10110, the monitor mode micromachine stack is completely contained in the stack portion, SRs 10362, of GRF 10354; in other embodiments of CS 10110, part or all of the monitor mode micromachine stack may be contained in an area of MEM 10112 which has a fixed size and a fixed location known to the monitor micromachine. In yet other embodiments of CS 10110, monitor mode micromachine stack may be of flexible depth in a manner similar to the virtual micromachine stack. In either mode, microroutines other than certain KOS microroutines which execute state save and restore operations may access only two frames of GRF 10354 stack: the frame upon which the microroutine is executing, called the current frame, and the frame upon which the microroutine that invoked that microroutine executed, called the previous frame KOS microroutines which execute state save and restore operations may in addition access the bottom frame of that portion of the virtual micromachine stack which is contained in GRF 10354.

Figure 272:
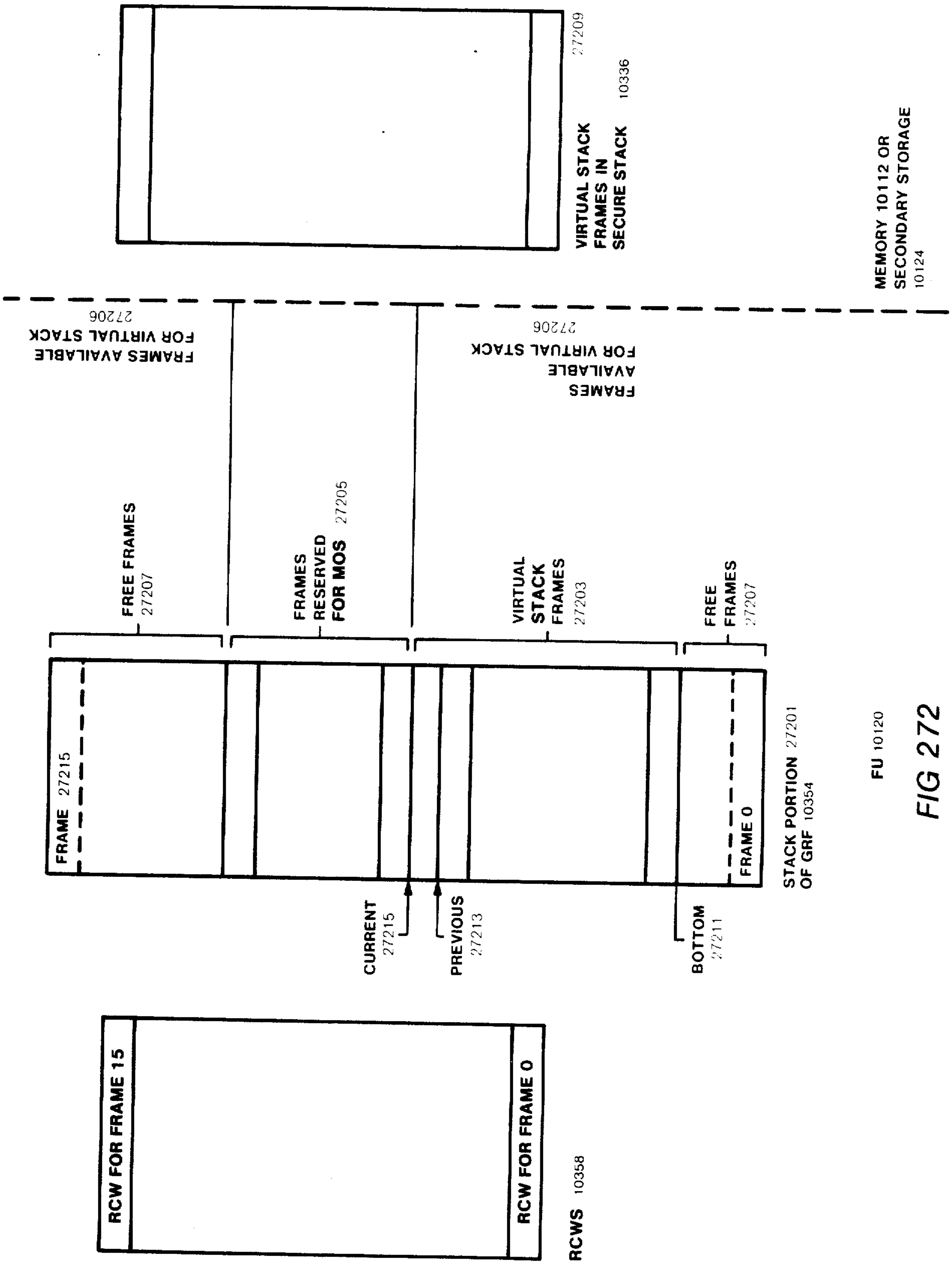
FIG. 272 is a diagram illustrating use of fetch unit stack registers.
Figure 273:
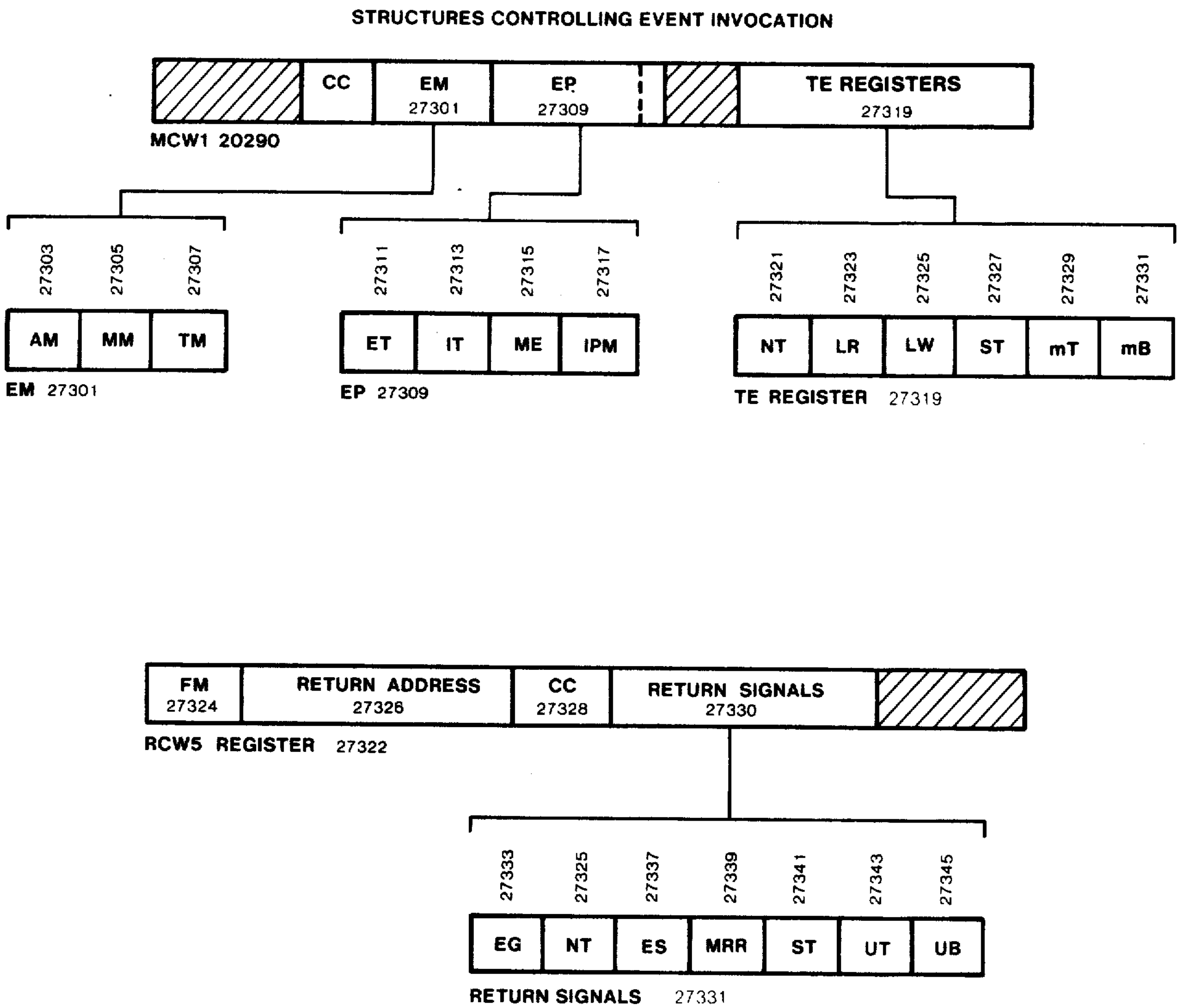
FIG. 273 is a diagram illustrating structures controlling event invocations.

FIG. 272 illustrates stacks for the FU micromachine. Those portions of the micromachine stack which are contained in the FU are contained in SR's 10362 (of GRF 10354) and in RCWS 10358. Each register of RCWS 10358 is permanently associated with a GRF frame in SRs 10362 of GRF 10354, and the RCWS 10358 register and the GRF frame together may contain one frame of a micromachine stack. As previously describe, each register of GRF 10354 contains three fields: one for an AON and other information, one for an offset, and one for a length. As illustrated in FIG. 251, each register in RCWS 10358 contains four fields:

A one bit field which retains the value of the Condition Code register in MCW1 20290 at the time that the invocation which created the next frame occurred.

A field indicating what Event Signals were pending at the time that the invocation to which the RCWS register belongs invoked another microroutine.

A flag indicating whether the microinstruction being executed when the invocation occurred was the first microinstruction in an SIN.

The address at which the execution of the invoking microroutine is to continue.

The uses of these fields will become apparent in the ensuing discussion.

The space available for micromachine stacks in SRs 10362 and RCWS 10358 is divided into two parts: Frames 27205 reserved for MOS 10370 and Frames 27206 available for the MIS 27203. Frames 27206 may contain no MIS Frames 27203, or be partially or completely occupied by MIS Frames 27203. Space which contains no MIS Frames is Free Frames 27207. The size of the space reserved for Monitor Micromachine Stack Frames 27205 is fixed, and Spaces 27203, 27205, and 27207 always come in the specified order. Register Addressing 27011 handles addressing in Stack Portion 27201 of GRF 10354 and RCWS 10358 in such fashion that the values for the locations of current, previous, and bottom frames specifying registers in RCWS 10358 or frames in Stack Portion 27201 automatically "wrap around" when they are incremented beyond the largest index value allowed by the sizes of the registers or decremented below the smallest index value. Thus, though Spaces 27203, 27205, and 27207 always have the same relative order, their GRF 10354 frames and RCWS registers may be located anywhere in Stack Portion 27201 and RCWS 10358.

2. Microroutine Invocations and Returns

In CS 10110, microroutines may be invoked by other microroutines or by signals from CS 10110 hardware. The methods of invocation aside, microroutine invocations and returns resemble invocations of and returns from procedures written in high-level languages. In the following, the general principles of microroutine invocations and returns are discussed, and thereafter, the specific methods by which microroutines may be invoked in CS 10110. The differences between invocations in monitor mode and invocations in virtual mode are explained in the detailed discussions of the two modes.

The microroutine which is currently being executed runs on the frame specified by Current Pointer 27215. When an invocation occurs, either because the executing microroutine performs a call, or because a signal which causes invocations has occured, JP 10114 hardware does three things:

It stores state information for the invoking microroutine in the RCWS 10358 register associated with the current frame. The state information includes the location at which execution of the invoking microroutine will resume, as well as other state information.

It increments Current Pointer 27215 and Previous Pointer 27213, thereby providing a frame for the new invocation.

It begins executing the first instruction of the newly invoked microroutine.

Because the newly-invoked microroutine can access registers of the invoking microroutine's frame, the invoking microroutine can pass "arguments" to the invoked microroutine by placing values in registers in its frame used by the invoked microroutine. However, the invoking microroutine cannot specify which registers contain "arguments" on an invocation, so the invoked microroutine must know which registers of the previous frame are used by the invoking microroutine. Since the only "arguments" which a microroutine has access to are those in the previous frame, a microroutine can pass arguments which it received from its invoker to a microroutine which it invokes only by copying the arguments from its invoker's frame to its own frame, which then becomes the newly-invoked routine's previous frame.

The return is the reverse of the above: Current Pointer 27215 and Previous Pointer 27213 are decremented, thereby "popping off" the finished invocation's frame and returning to the invoker's frame. The invoker then resumes execution at the location specified in the RCWS 10358 register and using the state saved in the RCWS 10358. The saved state includes the value of the Condition Code in MCW1 20290 at the time of the invocation and flags indicating various pending Events. The Condition Code field in MCW1 20290 is set to the saved value, and the pending event flags may cause Events to occur as described in detail below.

3. Means of Invoking Microroutines

In the micromachine, invocations may be produced either by commands in microinstructions or by hardware signals. In the following, invocations produced by commands in microinstructions are termed Calls, while those produced by hardware signals are termed Event invocations and Jams. Invocations are further distinguished from each other by the locations to which they return. Calls and Jams return to the microinstruction following the microinstruction in which the invocation occurs; Event invocations return to that microinstruction, which is then repeated.

In terms of implementation, the different return locations are a consequence of the point in the micromachine cycle at which Calls, Jams, and Event invocations save a return location and transfer control to the called routine. With Calls and Jams, these operations are performed in the M1 cycle; with Event invocations, on the other hand, the Event signal during the M0 cycle causes the M0 cycle to be followed by a MA cycle instead of the M1 cycle, and the operations are performed in the MA cycle. In the M1 cycle, the value in mPC 20276 is incremented; in the MA cycle, it is not. Consequently, the return value saved in RCWS 10358 on a Call or Jam is the incremented value of mPC 20276, while the return value saved on an Event invocation is the unincremented value of mPC 20276. The following discussion will deal first with Calls and Jams, and then with Event invocations.

A Call command in a microinstruction contains a literal value which specifies the offset from the microinstruction containing the Call at which execution is to continue after the Call. When the microinstruction with the Call command is executed in micromachine cycle M1, BRCASE 20278 adds the offset contained in the command to the current value of mPC 20276 in order to obtain the location of the invoked microroutine and sets SITTNAS 20286 to select the location provided by BRCASE 20278 as the location of the next microinstruction. Then the Call command increments mPC 20276 and stores the incremented value of mPC 20276 in the RCWS 10358 register associated with the current frame in SRs 10362 and increments Current Pointer 27215 and Previous Pointer 27213 to provide a new frame in SRs 10362. The Jam works exactly like the Call, except that a hardware signal during micromachine cycle M1 causes the actions associated with the invocation to occur and provides the location of the invoked microroutine directly to SITTNAS 20286.

With Events, Event Logic 20284 causes an invocation to occur during cycle M0 and provides the location of the invoked microroutine via CSADR 20299. Since the Event occurs during cycle M0, the location stored in RCWS 10358 is the unincremented value of mPC 20276, and SITTNAS 20286 selects the location provided by Event Logic 20284 as the location of the next microinstruction. Since the return from the Event causes the microinstruction during which the Event occurred to be re-executed, the microinstruction and the microroutine to which it belongs may be said to be "unaware" of the Event's occurrence. The only difference between the execution of a microinstruction during which an Event occurs and the execution of the same microinstruction without the Event is the length of time required for the execution.

4. Occurrence of Event Invocations (FIG. 273)

As described previously, Event invocations are produced by Event Logic 20284. The location in microcode to which Event Logic 20284 transfers control is determined by the following:

The operation being commenced by FU 10120. Certain Event invocations may occur only at the beginning of certain FU 10120 operations.

The state of Event signal lines from hardware and internal registers in Event Logic 20284.

The state of certain registers visible via MCW1 20290. Some of these registers enable Events and others mask Events. Of the registers which enable Events, some are set by Event signals and others by the microprogram.

On returns from invocations of microroutines, the settings of certain bits in the RCWS 10358 register belonging to the micromachine frame for the invocation that is being returned to.

Microprograms may use these mechanisms to disable Event signals and to delay an Event invocation from an Event signal for a single microinstruction or an indefinite period, and FU 10120 uses them to automatically delay Event invocations resulting from certain Event signals. Using traditional programming terminology, the mechanisms allow a differential masking of Event signals. An Event signal may be explicitly masked for a single microinstruction, it may be masked for a sequence of microinstructions, it may be automatically masked until a certain operation occurs, or it may be automatically masked for a certain maximum length of time. Event signals which occur while they are masked are not lost. In some cases, the Event signal continues until it is serviced; in others, a register is set to retain the fact that the Event signal occurred. When the Event signal is unmasked, the set register causes the Event signal to reoccur. In some cases, finally, the Event signal is not retained, but recurs when the microinstruction which caused it is repeated.

In the following, the relationship between FU 10120 operations and Event signals is first presented, and then a detailed discussion of the enabling registers in MCW1 20290 and of the bits in RCWS 10358 registers which control Event invocations.

FU 10120 allows Event invocations resulting from Event signals to be inhibited for a single microinstruction; it also delays certain Event invocations for certain Event signals until the first microinstruction of an SIN. Other Event signals occur only at the beginning of an SIN, at the beginning of a Namespace Resolve or Evaluate operation, or at the beginning of a logical memory reference.

Event invocations may be delayed for a single microinstruction by setting a field of the microinstruction itself. Setting this field delays almost all Event invocations, and thereby guarantees that an Event invocation will not occur during the microinstruction's M0 cycle.

Event signals relating to debugging occur at the beginnings of certain micromachine operations. Such Event signals are called Trace Event signals. As will be explained in detail, in the discussion of the debugger, Trace Event signals can occur on the first microinstruction of an SIN, at the beginning of an Evaluate or Resolve operation, at the beginning of a ogical memory reference, or at the beginning of a microinstruction. IPM interrupt signals and Interval Timer Overflow Event signals are automatically masked until the beginning of the next SIN or until a maximum amount of time has elapsed, which ever occurs first. The mechanisms involved here are explained in detail in the discussion of interrupt handling in the FU 10120 micromachine.

Turning now to the registers used to mask and enable Event signals, FIG. 273 is a representation of the masking and enabling registers in MCW1 20290 and of the field in RCWS 10358 registers which controls Event invocations. Beginning with the registers in MCW1 20290, there are three registers which control Event invocations: Event Mask Register (EM) 27301, Events Pending Register (EP) 27309, and Trace Enable Register (TE) 27319. Bits in EM 27301 mask certain Event signals as long as they are set; bits in EP Register 27309 record the occurrence of certain Event signals while they are masked; when bits in TE Register 27319 are set, Trace Event signals occur before certain FU 10120 operations.

EM 27301 contains three one bit fields: Asynchronous Mask Field 27303, Monitor Mask Field 27305, and Trace Event Mask Field 27307. As explained in detail in the discussion of FU 10120 hardware, these bits establish a hierarchy of Event masks. If Asynchronous Mask Field 27303 is set, only two Event signals are masked: that resulting from an overflow of EGGTMR 25412 and that resulting from an overflow of EU 10122's stack. If Monitor Mask Field 27305 is set, those Events are masked, and additionally, the FU Stack Overflow Event signal is masked. As will be explained in detail later, when the FU 10120 Stack Overflow Event signal is masked, the FU micromachine is executing in monitor mode. If Trace Event Mask Field 27307 is set, Trace Trap Event signals are masked in addition to the above signals. Each of the fields in EM 27301 may be individually set and cleared by the microprogram.

Four Event signals set fields in EP 27309: the EGGTMR 25412 Runout signal sets ET Field 27311, the INTTMR 25410 Runout signal sets IT Field 27313, the Non-Fatal Memory Error signal sets ME Field 27315, and the Inter-Process Message signal sets IPM Field 27317. Event invocations for all of these Event signals but the Egg Timer Runout signal occur at the beginning of an SIN; in these cases the fields in EP 27309 retain the fact that the Event signal has occurred until that time; the Event invocation for the Egg Timer Runout signal occurs as soon after the signal as the settings of mask bits in EM 27301 allow. The bit in ET Field 27311 retains the fact of the Egg Timer Runout signal until the masking allows the Event invocation to occur. All of the fields in EP 27309 but ME Field 27315 may be reset by microcode. The microroutines invoked by the Events must reset the appropriate fields; otherwise, they will be reinvoked when they return. ME Field 27315 is automatically reset when the memory error is serviced.

TE Register Field 27319 enables tracing. Each bit in the register enables a kind of Trace Event signal when it is set. Depending on the kind of tracing, the Trace Event signal occurs at the beginning of an SIN, at the beginning of a Resolve or Evaluate operation, at the beginning of a logical memory reference, or at the beginning of a microinstruction. For details, see the following description of debugging.

Turning now to the registers contained in RCWS 10358, each RCWS Register 27322 contains eight fields which control Event signals. The first field is FM Field 27323. FM Field 27323 reflects the value of a register in Event Logic 20284 when the invocation to which RCWS Register 27322 belongs occurs. The register in Event Logic 20284 is set only when the microinstruction currently being executed is the first microinstruction of an SIN. Thus, FM Field 27323 is set only in RCWS Registers 27322 belonging to Event invocations which occur in the M0 cycle of the first microinstruction in the SIN, i.e., at the beginning of the SIN. The value of the register in Event Logic 20284 is saved in FM Field 27323 because several Event invocations may occur at the beginning of a single SIN. The Event invocations occur in order of priority: when the one with the highest priority returns, the fact that FM Field 27323 is set causes the register in Event Logic 20284 to again be set to the state which it has on the first microinstruction of an SIN. The register's state, thus set, causes the next Event invocation which must occur at the beginning of the SIN to take place. After all such invocations are finished, the first microinstruction enters its M1 cycle and resets the register in Event Logic 20284. In its reset state, the register inhibits all Event invocations which may occur only at the beginning of an SIN. It is again set at the beginning of the next SIN.

The remaining fields in RCWS Register 27322 which control Event invocations are the fields in Return Signals Field 27331. These fields allow the information that an Event signal has occurred to be retained through Event invocations until the Event signal's Event invocation takes place. When an invocation occurs, these fields are set by Event Logic 20284. On return from the invocation, the values of the fields are input into Event Logic 20284, thereby producing Event signals. The Event signal with the highest priority results in an Event invocation, and the remaining Event signals set fields in Return Signals Field 27331 belonging to RCWS Register 27322 belonging to the invocation which is being executed when the Event signals occur. Because the fields in Return Signals Field 27330 are input into Event Logic 20284, microcode invoked as a consequence of Event signals which sets one of these fields must reset the field itself. Otherwise, the return from the microcode will simply result in a reinvocation of the microcode.

The seven fields in Return Signals Field 27330 have the following significance:

When EG Field 27333 is set, an EU 10122 dispatch operation produced an illegal location in EU 10122 microcode EUSITT 20344.

When NT Field 27335, ST Field 27341, mT Field 27343, or mB Field 27345 is set, a trace signal has occurred. These are explained in detail in the discussion of debugging.

When ES Field 27337 is set, an EU 10122 Storeback Exception has occurred, i.e., an error occurred when EU 10122 attempted to store the result of an operation in MEM 10112.

When MRR Field 27339 is set, a condition such as an ATU 10228 miss or a Protection Cache 10234 miss has occurred, and it is necessary to reattempt a memory reference.

d. Programming the Micromachine (FIG. 274)

The microinstructions with which the micromachine is programmed have been described in the discussion of FU 10120. Here, the tools used to program the micromachine are discussed in sufficient detail to allow those with ordinary skill in the art to understand the source texts of microprograms executed on the micromachine. These tools include a microprogramming language; a microassembler which translates programs written in the microprogramming language into microinstructions; and a microbinder, which constructs microcode objects and checks microprograms for consistency and proper usage of micromachine devices.

FIG. 274 illustrates a microprogram written for FU 10120. The microprogram executes a Relative Branch SIN, that is, a Branch operation which transfers control to an SIN at a location which is obtained by adding a literal contained in the SIN to the Relative Branch SIN's location The SIN consists of an opcode syllable, that is an SOP, and a syllable which contains the literal value to be added to the location of the SIN in order to obtain the location to which control is to Branch. The microcode which executes the Relative Branch obtains the literal value from the SIN, adds the literal to the value currently stored in CPC 20270, and fetches the SIN at the location specified by the new value of CPC 20270.

Turning to FIG. 274, the figure is the listing for a microprogram as it is produced by the microassembler. The listing has two parts. The first part is a listing of the source text from which the microassembler produces microinstructions; the second is a listing of the microinstructions themselves. In the second part of the listing, each line of the source text is repeated, and under the line appears the microinstruction fields set by the line of source text and the values to which they are set. If a microinstruction does not set a field, the field has a default setting, but the micromachine's behaviour during a microinstruction may be completely determined from the fields which the microinstruction explicitly sets. Lines in the source text listing are numbered, and the lines have the same numbers in the microinstruction listing.

Turning first to the source text listing, the microprogram in the source text listing consists of three microinstructions. All actions prescribed in a microinstruction can be executed in one micromachine cycle consisting of M0 and M1. The contents of the first microinstruction is specified by Lines 924 through 927 of the listing, the contents of the second by Lines 929 through 932, and the contents of the third by Lines 934 through 937. As may be seen, in the language used for microprograms in a present embodiment of CS 10110, microinstructions are terminated by semicolons. ENTRY BREL: on Line 294 is a Label. Labels are specified by the keyword ENTRY, a name, and a colon. Labels are used in the microprogram to establish points to which Calls and Branches in the microprogram can transfer control. /* INSURE PAGE CROSSING DETECTED */ is a comment. The microassembler treats any collection of characters bracketed by /* and */ as a comment, and ignores those characters when it assembles the microprogram.

The actions performed by a microinstruction are specified by means of microcommands. In the microprogramming language, microcommands in a microinstruction are separated by commas. Each microcommand specifies an action to be performed by a device or set of devices in the micromachine during the execution of that microinstruction. Actions specified in microcommands are executed simultaneously, and consequently, the order in which a microinstruction's microcommands are written has no effect on the microinstruction's execution. Since the actions specified in a microinstruction's microcommands are executed simultaneously in a single micromachine cycle, not all combinations of microcommands can be executed. For example, in a single micromachine cycle, only one GRF 10354 register may be used as a source of data, and only one GRF 10354 register may be used as a destination for data. Similarly, some devices may be used either as a source or a destination but not as both in a single microinstruction. In a present embodiment of CS 10110, the microbinder checks each microinstruction to ensure that all microcommands in the microinstruction may be executed simultaneously.

Each microcommand may contain names, operators, and integer values. The integer values are represented in decimal notation or in hexadecimal (base 16) notation. In the latter case, the integers are preceded and followed by @. @10@, for instance is hexadecimal 10, decimal 16. The names in a microcommand may represent FU 10120 devices, values contained in these devices, operations, literal values, or sequences of microcommands. The operators are symbols for operations, and the values are integer values used directly in the operations. Some of the names in a microcommand are defined by the microprogramming language, while others are defined by the microprogrammer. The microprogrammer uses a special construct in the micromachine language, the MACRO instruction, to define these names. The MACRO instruction tells the microassembler how to interpret names, but does not itself represent a microinstruction, and consequently, the microassembler generates no microinstructions for MACRO statements. For example, in Line 926, the programmer-defined name PF appears in a context which requires a GRF 10354 register address. Elsewhere in the microcode, PF is defined with the following MACRO instruction:

MACRO PF MEANS CURRENT ( 5 ) ENDMAC;

The instruction defines PF as the fifth register of the current frame of the micromachine stack, and when the microassembler assembles the microprogram, it translates all occurrences of PF into the register address CURRENT (5).

Turning now to the microinstruction listing, for each line of the source text, the microinstruction listing first gives a version of the line in which all programmer-defined names have been replaced by the items they represent. For example, in Line 926, the name PF in the source text has been replaced by CURRENT (5), thus indicating that PF is the fifth register in the current top GRF 10354 frame of the micromachine stack. Then the line beginning with M following the source text line indicates which microinstruction fields are set by the line, and what values (in decimal notation) the fields have. The meanings of these settings are explained in Appendix A of the present description, titled Fetch Unit Microword. Turning to Appendix A, there is found a representation of the microinstructions used to program FU 10120. This representation corresponds to that in FIG. 250, but uses slightly different names for the fields. The meanings of the various settings of a field can be found by referring to the field name in a list of commands by field which appears at the end of Appendix A. The list of commands contains the values which the field may have (in hexadecimal notation) and page references to descriptions of the settings in Appendix A.

For example, Line 926 sets the following fields: dest_frame (bits 28–29 of the microinstruction), r_dest (bits 19–21), r_w (bit 30), a_in (bits 32–33), src_frame (bits 26–27), r_source (bits 16–18), and com_ext (bits 22–25). The values to which the fields are set specify the following:

dest_frame 0 selects the top frame of the micromachine stack as a destination frame, i.e., a frame in which data will be stored when this microinstruction is executed.

r_dest 5 selects the fifth register in the top frame as the destination register.

RW field 1 allows the destination register to be written to.

A_IN 2, indicates that the AON field of the destination GRF 10354 register will be loaded from the AON field of the source GRF 10354 register. Other fields of the source and destination GRF 10354 registers will not be affected by this microcommand.

Src_frame 2 indicates that the source frame is in the global portion (GRs 10360) of GRF 10354, and is addressed via the COM_EXT field.

r_source 7 indicates that the source register is the eighth register of the source frame.

com_ext @A@ indicates that the source frame is frame 10 of the global registers (hexadecimal A =decimal 10).

Thus, the microcommand

LOAD_AON(PF) WITH AON (PC.AON)

causes the AON field contained in register 8 of frame 10 of GR's 10360 of GRF 10354 to be loaded into the AON field contained in register 5 of the top frame of the micromachine stack.

Using Appendix A to obtain the meanings of the microinstruction listing for the program example as just described, one of ordinary skill in the art may determine that the three microinstructions in the program example do the following:

The first microinstruction obtains the current value of IPC Register 20272. Then it obtains the AON belonging to PBP from a register in GRs 10360 of GRF 10354 named PC.AON. In this register, the AON field is set to PBP's AON and the offset and length fields are set to 0. Finally, places the current value of the AON and the IPC into a register in the topmost frame of the micromachine stack. The latter register is named PF. As a result of this operation, PF contains a logical descriptor for the SIN currently being executed. The operations are performed as follows: The current value of IPC Register 20272 is placed on JPD Bus 10142 and ORed together with the offset field of PC.AON in OFFALU 20242. Since the offset field of PC.AON is by convention set to 0, the operation ends with the current value of IPC Register 20272 being latched into the output register of OFFALU 20242. Simultaneously, the AON field of register PF in the top frame of the microstack is set to the value of the AON field of PC.AON and the offset field of register PF is set to the current value of IPC contained in the output register of OFFALU 20242.

The second microinstruction parses the second syllable of the SIN, which contains the literal value to be added to the current value of IPC Register 20272 to obtain the location of the next SIN; converts the literal value to an offset for the next SIN's descriptor; and places the descriptor in an accumulator in OFFP 20218. The first microcommand, PARSE_K_LOAD_EPC, places the next syllable of the SIN on NAME Bus 20224, sets EPC 20274 to the current value of CPC 20270, and increments CPC Register 20270 by the current value of K, the SIN syllable size, so that CPC 20270 points to the next syllable of the SIN. The second microcommand gates the syllable indicated by CPC 20270 from PARSER 20264 onto NAME Bus 20224, which transfers it to OFFALU 20242. As previously mentioned, this syllable contains a literal value for the Relative Branch. OFFALU 20242 shifts the literal value three binary digits to the left and ORs it with the offset field of a GR 10360 register called ZEROVAL which contains nothing but 0's. The OR does not affect the literal's value, and the shift operation multiplies the literal by 8, thereby transforming it into an offset for an SOP (SOPs are byte-aligned). The last microcommand moves the result of the OFFALU 20242 operation to an accumulator in OFFP 20218, where it is available for the next microinstruction.

The third microinstruction adds the offset obtained from the SIN literal to the offset field in the PF register to obtain the location of the next SIN; updates CPC 20270, EPC 20274, and IPC 20272 using the location of the next SIN; fetches the next SIN from MEM 10112; and transfers control to the microcode which parses and interprets that SIN's SOP. The first microcommand in this microinstruction simply uses OFFALU 20242 to add the offset obtained from the SIN literal to the offset in the PF register. The next microcommand forms a Logical Descriptor 27116 for the next SIN and uses it in a logical memory reference which causes data to be written to PREF 20260. Logical Descriptor 27116's AON comes from GRF 10354 register PF, since that register is specified as a source. USING OFF_ALU specifies that the offset portion of Logical Descriptor 27116 is to be obtained from the output register of OFFALU 20242, and CON_LENGTH (32) specifies that the length portion of Logical Descriptor 27116 is to be set to 0. Finally, the READ_PREFETCH_FOR_BRANCH portion of the microcommand specifies that the data fetched from MEM 10112 using Logical Descriptor 27116 is to be placed in Prefetcher 20260. The microcommand on Line 936 updates CPC 20270 by transferring the result of the OFFALU 20242 operation via JPD Bus 10142 to CPC 20270, thereby setting CPC 20270 to the location of the next SIN. The last microcommand, GOTO_NEXT_S_OP, selects the microinstruction with the label_NEXT_S_OP as the next microinstruction to be executed. The sequence of microinstructions (not shown) which begins with that label begins parsing the SIN whose location is contained in CPC 20270. Using the microcode source listings, microinstruction listings, and the Fetch Unit Microword document as described above, one of ordinary skill in the art may understand the manner in which a microprogram is executed on the FU 10120 micromachine.

e. Virtual Micromachines and the Monitor Micromachine

As previously described, microcode being executed on FU 10120's micromachine can run in either monitor mode or virtual mode. In this portion of the discussion, the distinguishing features and applications of the two modes are explained in detail.

1. Virtual Mode

As previously mentioned, the chief distinction between virtual mode and monitor mode is MIS 10368. The fact that MIS 10368 is of essentially unlimited size has the following consequences for microroutines which execute in virtual mode.

An invocation of a microroutine executing in virtual mode may have as its consequence further invocations to any depth.

Any invocation of or return from a microroutine executing in virtual mode may cause a page fault.

The FU micromachine is in virtual mode when all bits in the Event Masks portion of MCW1 20290 are cleared. In this state, no enabled Event signals are masked, and Event invocations may occur in any microinstruction which does not itself mask them.

Because invocations may occur to any depth in virtual mode, microroutines executing in this mode may be recursive. Such recursive microroutines are especially useful for the interpretation of Names. Often, as previously described, the Name Table Entry for a Name will contain Names which resolve to other Names, and the virtual micromachine's limitless stack allows the use of recursive Name Resolution microroutines in such situations. Recursive microroutines may also be used for complex SINs, such as Calls.

Because invocations can occur to any depth, any number of Events may occur while a microroutine is executing in monitor mode. This in turn greatly simplifies Event handling. If an Event signal occurs while an Event with a given priority is being handled and the Event being signalled has a higher priority than the one being handled, the result is simply the invocation of the new Event's handler. Thus, the order in which the Event handlers finish corresponds exactly to the priorities of their Events: those with the highest finish first.

A page fault may occur on any microinvocation or return executed in virtual mode because an invocation in virtual mode which occurs when there are no more Free Frames 27207 on SRs 10362 causes an Event signal which invokes a microroutine running in monitor mode. The microroutine transfers MIS Frames 27203 from GRF 10354 to Secure Stack 10336 in MEM 10112, and the transfer may cause a page fault. Similarly, when a microreturn takes place from the last frame on MIS Frames 27203 on SRs 10362, an Event signal occurs which invokes a microroutine that transfers additional frames from Secure Stack 10336 to GRF 10354, and this transfer, too, may cause a page fault.

The fact that page faults may occur on microinvocations or microreturns in virtual mode has two important consequences: microroutines which cannot tolerate page faults other than those explicitly generated by the microroutine itself cannot execute in virtual mode, and because unexpected page faults cause execution to become indeterminate, microroutines which must run to completion cannot execute in virtual mode. For example, if the microroutine which handles page faults executed in virtual mode, its invocation could cause a page fault, which would cause the microroutine to be invoked again, which would cause another page fault, and so on through an infinite series of recursions.

2. Monitor Micromachine

As previously described, the essential feature of monitor mode is MOS 10370. In a present embodiment of CS 10110, this stack has a fixed minimum size, and is always contained in GRF Registers 10354. The nature of MOS 10370 has four consequences for microroutines which execute in monitor mode:

When the micromachine is in monitor mode, the depth of invocations is limited; recursive microroutines therefore cannot be executed in monitor mode, and Event invocations must be limited.

Invocations of microroutines or returns from microroutines in monitor mode never result in page faults.

Microroutines executing in monitor mode are guaranteed to run to completion if they do not suspend the Process 610 which they are executing or perform a Call to software.

When the micromachine is executing in monitor mode, it is guaranteed to return to virtual mode within a reasonable period of time, either because a microroutine executing in monitor mode has run to completion, or because the microroutine has suspended the Process 610 which it is executing, or has made a Call to software. The result in both cases is the execution of a new sequence of SOPs, and thus a return to virtual mode.

In a present embodiment of CS 10110, the FU micromachine is in monitor mode when a combination of masking bits in MCW1 20290 is set which results in the masking of the FU Stack Overflow Event and the Egg Timer Overflow Event. As previously described, these Events are masked if Fields 27303, 27305, or 27307 is set. These Events and the consequences of masking them are explained in detail below.

The event signal for the FU Stack Overflow Event occurs on microinvocations for which there is no frame available in MIS Frames 27203. If the Event signal is not masked, it causes the invocation of a microroutine which moves MIS Frames from MIS Frames 27203 onto a Process 610's Secure Stack 10336. When the FU Stack Overflow Event is masked, all frames in SRs 10362 of GRs 10360 are available for microroutine invocations and microroutine invocations will not result in page faults, but if the capacity of SRs 10362 is exceeded, FU 10120 ceases operation.

The Egg Timer Overflow event signal occurs when Egg TMR 25412 runs out. As will be explained in detail later, Egg TMR 25412 ensures that an Interval Timer Runout, an Inter-processor Message, or a Non-fatal Memory Error will be serviced by JP 10114 within a reasonable amount of time. If an Interval Timer Runout Event signal or an Inter-processor Message Event signal occurs at a time when it is inefficient for the FU micromachine to handle the Event, Egg TMR 25412 begins running. When Egg TMR 25412 runs out, the Event is handled unless the micromachine is in monitor mode. If the Egg TMR 25412 Runout Event signal occurs while the FU micromachine is in monitor mode, i.e., while the Event is masked, the Event signal sets Field 27311 in MCW1 20290. When the FU micromachine reverts to virtual mode, i.e., when all Event Mask bits in MCW1 20290 are cleared, the Egg TMR 25412 Runout Event occurs, and the Interval Timer Runout and/or the Inter-processor Message Event handlers are invoked by Event Logic 20284.

f. Interrupt and Fault Handling

1. General Principles

Any computer system must be able to deal with with occurrences which disrupt the normal execution of a program. Such occurrences are generally divided into two classes: faults and interrupts. A fault occurs as a consequence of an attempt to execute a machine instruction, and its occurrence is therefore synchronous with the machine instruction. Typical faults are floating point overflow faults and page faults. A floating point overflow fault occurs when a machine instruction attempts to perform a floating point arithmetic operation and the result exceeds the capacity of the CS 10110's floating point hardware, that is EU 10122. A page fault occurs when a machine instruction in a computer system with virtual memory attempts to reference data which is not presently available in the computer system's primary memory, that is MEM 10112. Since faults are synchronous with the execution of machine instructions and in many cases the result of the execution of specific machine instructions, their occurrence is to some extent predictable. The occurrence of an interrupt is not predictable. An interrupt occurs as a consequence of some action taken by the computer system which has no direct connection with the execution of a machine instruction by the computer system. For example, an I/O interrupt occurs when data transmitted by an I/O device (IOS 10116) reaches the central processing unit (FU 10120), regardless of the machine instruction the central processing unit is currently executing.

In conventional systems, interrupts and faults have been handled as follows: if an interrupt or fault occurs, the computer system recognizes the occurrence before it executes the next machine instruction and executes an interrupt-handling microroutine or Procedure 602 instead of the next machine instruction. If the interrupt or fault cannot be handled by the Process 610 in which it occurs, the interrupt or fault results in a process swap. When the interrupt handling routine is finished, Process 610 which faulted or was interrupted can be returned to the CPU if it was removed and the next machine instruction executed.

While the above method works well with faults, the fact that interrupts are asynchronous causes several problems:

Machine instructions cannot require an indefinite amount of time to execute, since interrupts cannot be handled until the machine instruction during which they occur is finished.

It must be possible to remove a Process 610 from the CPU at any time, since the occurrence of an interrupt is not predictable. This requirement greatly increases the difficulty of process management.

The method used for interrupt and fault handling in a present embodiment of CS 10110 is described below.

2. Hardware Interrupt and Fault Handling in CS 10110

In CS 10110, there are two levels of interrupts: those which may created and dealt with completely by software, and those which may created by hardware signals. The former class of interrupts is dealt with in the discussion of Processes 610; the latter, termed hardware interrupts, is discussed below.

In CS 10110, hardware interrupts and faults begin as invocations of microroutines in FU 10120. The invocations may be the result of Event signals or may be made by microprograms. For example, when IOS 10116 places data in MEM 10112 for JP 10114, an Interprocessor Message Event signal results, and the signal causes the invocation of Inter-processor Message Interrupt handler microcode. On the other hand, a Page Fault begins as an invocation of Page Fault microcode by LAT microcode. The actions taken by the microcode which begins handling the fault or interrupt depend on whether the fault or interrupt is handled by the Process 610 which was being executed when the fault or Event occurred or by a special KOS Process 610.

In the first case, the Event microcode may perform a Microcode-to-Software Call to a high-level language procedure which handles the Event. An example of an Event handled in this fashion is a floating point overflow: when FU 10120 microcode determines that a floating point overflow has occurred, it invokes microcode which may invoke a floating point overflow procedure provided by the high-level language whose S-Language was being executed when the overflow occurred. In alternate embodiments of CS 10110, the overflow procedure may also be in microcode.

In the second case, the microcode handling the fault or interrupt puts information in tables used by a KOS Process 610 which handles the fault or interrupt and then causes the KOS Process 610 to run at some later time by advancing an Event Counter awaited by the Process 610. Event Counters and the operations on them are explained in detail in a following description of Processes 610. Since the tables and Event Counters manipulated by microcode are always present in MEM 10112, these operations do not cause page faults, and can be performed in monitor mode. For example, when IOS 10116 transmits an IPM Event signal to JP 10114 after IOS 10116 has loaded data into MEM 10112, the Event resulting from the Event signal invokes microcode which examines a queue containing messages from IOS 10116. The messages in the queue contain Event Counter locations, and the microcode which examines the queue advances those Event counters, thereby causing Processes 610 which were waiting for the data returned by the I/O operation to recommence execution.

3. The Monitor Mode, Differential Masking and Hardware Interrupt Handling

FU 10120 micromachine's monitor mode and differential masking facilities allow a method of hardware interrupt handling which overcomes two problems associated with conventional hardware interrupt handling: an interrupt can be handled in a predictable amount of time regardless of the amount of time required to execute an SIN, and if the microcode which handles the interrupt executes in monitor mode, the interrupt may be handled at any time without unpredictable consequences. There are two sources of hardware interrupts in CS 10110: an Inter-Processor Message (IPM) and an Interval Timer 25410 Runout. An IPM occurs when IOS 10116 completes an I/0 task for JP 10114 and signals completion of the task via IOJP Bus 10132. An Interval Timer Runout occurs when a preset time at which CS 10110 must take some action is reached. For example, a given Process 610 may have a limit placed on the amount of time it may execute on JP 10114. As is explained in a following description of process synchronization, the virtual processor management system sets Interval Timer 25412 to run out when Process 610 has used all of the time available to it.

Both IPMs and Interval Timer Runouts begin as Event signals. The immediate effect of the Event signal is to set a bit in EP Field 27309 of MCW1. In principle, the set bit can cause invocation of the event microcode for the Event on the next M0 cycle in which the FU 10120 micromachine is in virtual mode. Since microroutines running in monitor mode are guaranteed to return the micromachine to virtual mode within a reasonable length of time, and the Event invocation will occur when this happens, the Event is guaranteed to be serviced in a reasonable period of time. The microroutines invoked by the Events themselves execute in monitor mode, thereby guaranteeing that no page faults will occur while they are executing and that Process 610 which is executing on JP 10114 when the hardware interrupt occurs need not be removed from JP 10114.

While hardware interrupts are serviced in principle as described above, considerations of efficiency require that as many hardware interrupts as possible be serviced when the size of the FU micromachine's stack is at a minimum, i.e., at the beginning of an SIN's execution. This requirement is achieved by means of Egg TMR 25412 and ET Flag 27311 in MCW1 20290. As described above, when an IPM interrupt or an Interval Timer 25410 Runout interrupt occurs, Field 27317 or 27313 respectively is is set in MCW1 20290. At the same time, Egg TMR 25412 begins running. If the current SIN's execution ends before Egg TMR 25412 runs out, the set Field in MCW1 20290 causes the Interval Timer Runout or Inter-processor Message Event invocations to occur on the first microinstruction for the next SIN. If, on the other hand, the current SIN's execution does not end before Egg TMR 25412 runs out, the Egg Timer Runout causes an Event signal. The immediate result of this signal is the setting of ET bit 27311 in MCW1 20290, and the setting of ET bit 27311 in turn causes the Interval Timer Runout Event invocation and/or IPM Event invocation to take place on the next M0 cycle to occur while the micromachine is in virtual mode. The above mechanism thus guarantees that most hardware interrupts will be handled at the beginning of an SIN, but that hardware interrupts will always be handled within a certain amount of time regardless of the length of time required to execute an SIN.

g. FU Micromachine and CS 10110 Subsystems

The subsystems of CS 10110, such as the object subsystem, the process subsystem, the S-Interpreter subsystem, and the Name Interpreter subsystem, are implemented all or in part in the micromachine. The description of the micromachine therefore closes with an overview of the relationship between these subsystems and the micromachine. Detailed descriptions of the operation of the subsystems have been presented previously.

The subsystems fall into three main groups: KOS subsystems, the Name Interpreter subsystem, and the S-Interpreter subsystem. The relationship between the three is to some extent hierarchical: the KOS subsystems provide the environment required by the Name Interpreter subsystem, and the Name Interpreter subsystem provides the environment required by the S-Interpreter subsystem. For example, the S-Interpreter subsystem interprets SINs consisting of SOPs and Names; the Name Interpreter subsystem translates Names into logical descriptors, using values called ABPs to calculate the locations contained in the logical descriptors. The KOS subsystems calculate the values of the ABPs, translate Logical Descriptors 27116 into physical MEM 10112 addresses, and check whether a Process 610 has access to an object which it is referencing.

In a present embodiment of CS 10110, the Name Interpreter subsystem and the S-Interpreter subsystem are implemented completely in the micromachine; in other embodiments, they could be implemented in high-level languages or in hardware. The KOS subsystems are implemented in both the micromachine and in high-level language routines. In alternate embodiments of CS 10110, KOS subsystems may be embodied entirely in microcode, or in high-level language routines. Some high-level language routines may execute in any Process 610, while others are executed only by special KOS Processes 610. The KOS subsystems also differ from the others in the manner in which the user has access: with the S-Interpreter subsystem and the Name Interpreter subsystem, the subsystems come into play only when SINs are executed; the subsystems are not directly visible to users of the system. Portions of the KOS subsystems, on the other hand, may be explicitly invoked in high-level language programs. For example, an invocation in a high-level language program may cause KOS to bind a Process 610 to a Virtual Processor 612.

The following will first list the functions performed by the subsystems, and then relate the subsystems to the monitor and virtual micromachine modes and specific micromachine devices. KOS subsystems perform the following functions:

Virtual memory management;
Virtual processor management;
Inter-processor communication;
Access Control;
Object management; and,
Process management.

The Name Interpreter performs the following functions:

Fetching and parsing SOPs, and
Interpreting Names.

The S-Interpreter, finally, dispatches SOPs, i.e., locates the FU 10120 and EU 10122 microcode which executes the operation corresponding to a given SOP for a given S-Language.

Of these subsystems, the S-Interpreter, the Name Interpreter, and the microcode components of the KOS process and object manager subsystems execute on the virtual micromachine; the microcode components of the remaining KOS subsystems execute on the monitor micromachine. As will be seen in the discussions of these subsystems, subsystems which execute on the virtual micromachine may cause Page Faults, and may therefore reference data located anywhere in memory; subsystems which execute on the monitor micromachine may not cause Page Faults, and the data bases which these subsystems manipulate must therefore always be present at known locations in MEM 10112.

The relationship between subsystems and FU 10120 micromachine devices is the following: Microcode for all subsystems uses DESP 20210, Microcode Addressing 27013, and Register Addressing 27011, and may use EU Interface 27007. S-Interpreter microcode uses SOP Decoder 27003, and Name Interpreter Microcode uses Instruction Stream Reader 27001, Parsing Unit 27005, and Name Translation Unit 27015. KOS virtual memory management microcode uses Memory Reference Unit 27017, and Protection Microcode uses Protection Unit 27019.

Having described in detail the structure and operation of CS 10110's major subsystems, MEM 10112, FU 10120, EU 10122, IOS 10116, and DP 10118, and the CS 10110 micromachine, CS 10110 operation will be described in further detail next below. First, operation of CS 10110's Namespace, S-Interpreter, and Pointer Systems will be described. Then, operation of CS 10110 will be described in further detail with respect to CS 10110's Kernel Operating System.

3. Namespace, S-Interpreters, and Pointers (FIGS. 301–307, 274) The preceding chapters have presented an overview of CS 10110, examined its hardware in detail, and explained how the FU 10120 hardware functions as a micromachine which controls the activities of other CS 10110 components. In the remaining portions of the specification, the means are presented by which certain key features of CS 10110 are implemented using the hardware, the micromachine, tables in memory, and high-level language programs. The present chapter presents three of these features: the Pointer Resolution System, Namespace, and the S-interpreters.

The Pointer Resolution System translates pointers, i.e., data items which contain location information, into UID-offset addresses. Namespace has three main functions:

It locates SINs and fetches them from CS 10110's memory into FU 10120.
It parses SINs into SOPs and Names.
It translates Names into Logical Descriptors 27116 or values.

The S-interpreters decode S-operations received from namespace into locations in microcode contained in FUSITT 11012 and EUSITT 20344 and then execute that microcode. If the S-operations require operands, the S-interpreters use Namespace to translate the operands into Logical Descriptors 27116 or values as required by the operations.

Since Namespace depends on the Pointer Resolution System and the S-interpreters depend on Namespace, the discussion of the systems begins with pointers and then deals with namespace and S-interpreters.

Figure 301:
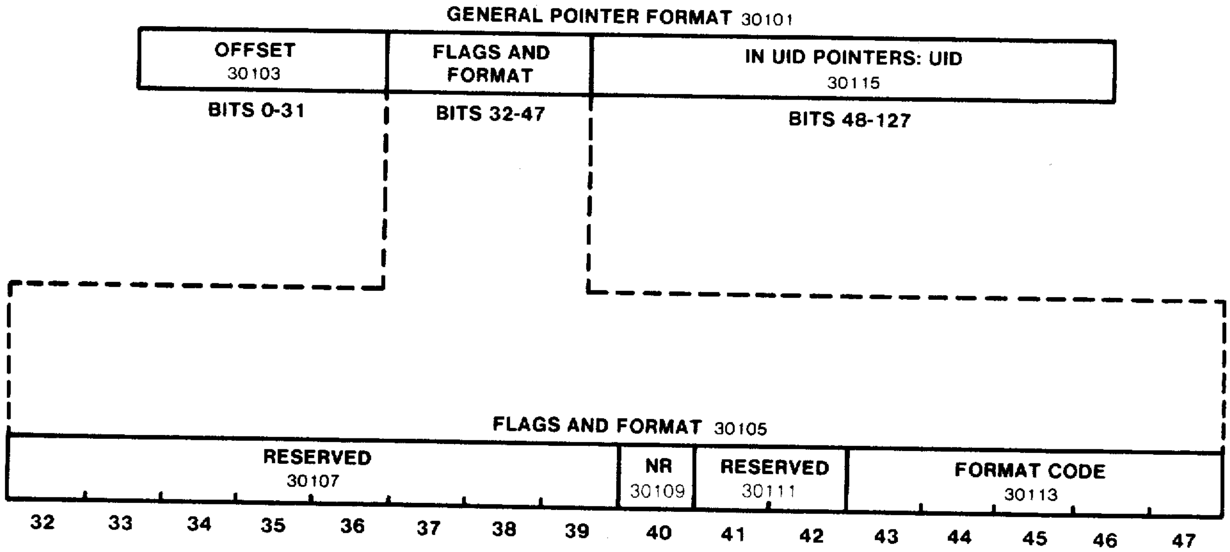
FIG. 301 is a diagram illustrating pointer formats.
Figure 302:
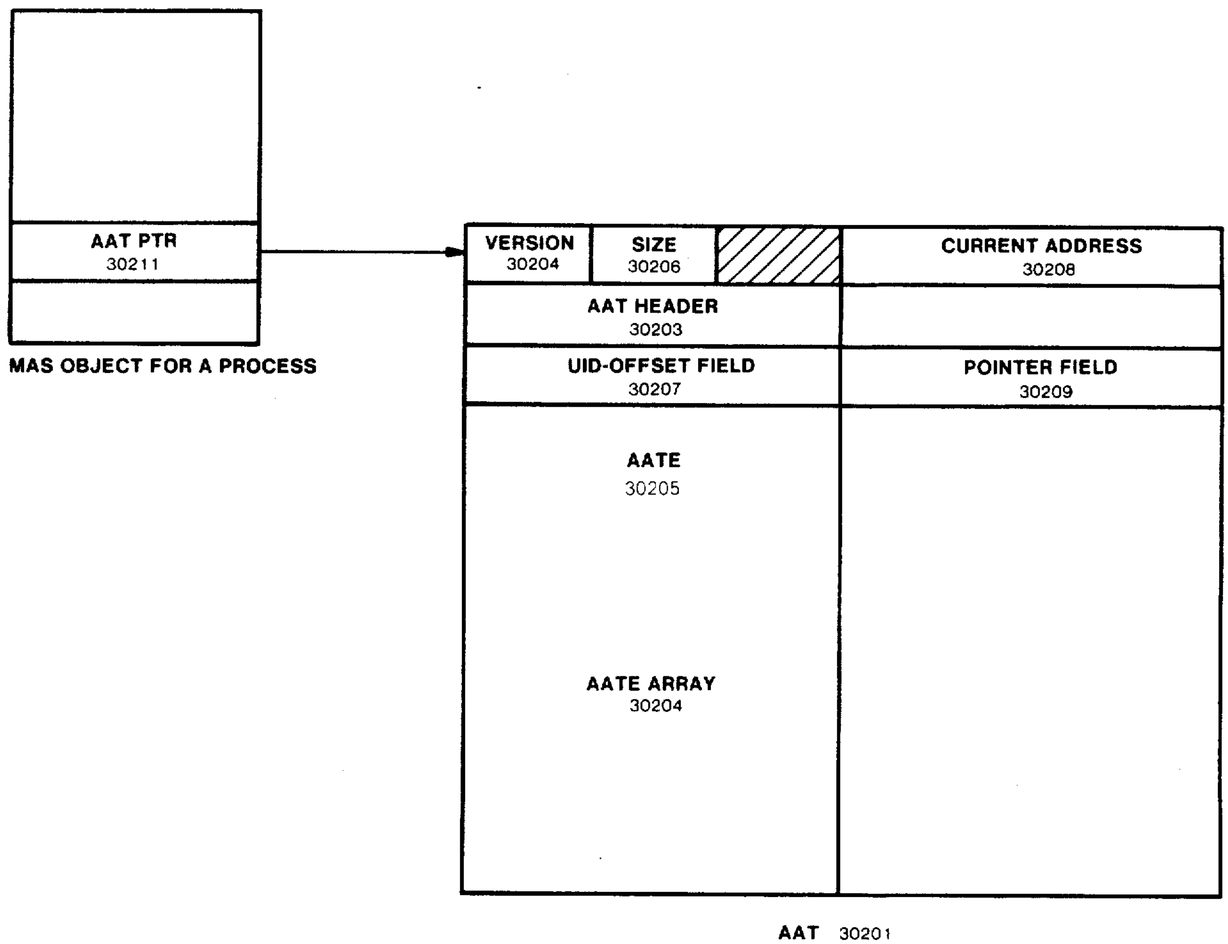
FIG. 302 is a diagram illustrating an associated address table.

A. Pointers and Pointer Resolution (FIGS. 301, 302)

A pointer is a data item which represents an address, i.e., in CS 10110, a UID-offset address. CS 10110 has two large classes of pointers: resolved pointers and unresolved pointers. Resolved pointers are pointers whose values may be immediately interpreted as UID-offset addresses; unresolved pointers are pointers whose values must be interpreted by high level language routines or microcode routines to yield UID-offset addresses. The act of interpreting an unresolved pointer is called resolving it. Since the manner in which an unresolved pointer is resolved may be determined by a high-level language routine written by a system user, unresolved pointers provide a means by which users of the system may define their own pointer types.

Both resolved and unresolved pointers have subclasses. The subclasses of resolved pointers are UID pointers and object relative pointers. UID pointers contain a UID and offset, and can thus represent any CS 10110 address; object-relative pointers contain only an offset; the address's UID is assumed to be the same as that of the object containing the object-relative pointer. An object-relative pointer can therefore only represent addresses in the object which contains the pointer.

The subclasses of unresolved pointers are ordinary unresolved pointers and associative pointers. The difference between the two kinds of unresolved pointers is the manner in which they are resolved. Ordinary unresolved pointers are always resolved by high-level language routines, while associative pointers are resolved the first time they are used in a Process 610 and a domain by high-level language routines, but are subsequently resolved by means of a table called the Associated Address Table (AAT). This table is accessible to microcode, and associative pointers may therefore be more quickly resolved than ordinary unresolved pointers.

The following discussion will first explain the formats used by all CS 10110 pointers, and will then explain how pointers are processed in FU 10120.

a. Pointer Formats (FIG. 301)

FIG. 301 represents a CS 10110 pointer. The figure has two parts: a representation of General Pointer Format 30101, which gives an overview of the fields which appear in all CS 10110 pointers, and a detailed presentation of Flags and Format Field 30105, which contains the information by which the kinds of CS 10110 pointers are distinguished.

Turning first to General Pointer Format 30101, all CS 10110 pointers contain 128 bits and are divided into three main fields:

- Offset Field 30103 contains the offset portion of a UID-offset address in resolved pointers and in associative pointers; in other unresolved pointers, it may contain an offset from some point in an object or other information as defined by the user.
- Flags and Format Field 30105 contains flags and format codes which distinguish between kinds of pointers. These flags and format codes are explained in detail below.
- UID field 30115 contains a UID in UID pointers and in some associative pointers; in object-relative pointers, and other associative pointers, its meaning is undefined, and in ordinary unresolved pointers, it may contain information as defined by the user.

Flags and Format Field 30105 contains four subfields:

- Fields 30107 and 30111 are reserved and must be set to 0.
- NR Field 30109 indicates whether a pointer is resolved or unresolved. In resolved pointers, the field is set to 0, and in unresolved pointers, it is set to 1.
- Format Code Field 30113 indicates the kind of resolved or unresolved pointers. Format codes for the present embodiment are explained below.

The values of Format Code Field 30113 may range from 0 to 31. If Format Code Field 30113 has the value 0, the pointer is a null pointer, i.e., a pointer which neither directly nor indirectly indicates an address. The meanings of the other format codes depend on the value of NR Field 30109:

| NR Field Value | Format Code Value | Meaning |
|---|---|---|
| 0 | 1 | UID pointer |
| 0 | 2 | Object-relative pointer |
| 0 | all other codes | Illegal |
| 1 | 1 | UID associative pointer |
| 1 | 2 | Object-relative associative pointer |
| 1 | all other codes | Ordinary unresolved pointer |

As indicated by the above table, the present embodiment has two kinds of associative pointer, UID associative pointers and object-relative associative pointers. Like a UID pointer, a UID associative pointer contains a UID and an offset, and like an object-relative pointer, an object-relative associative pointer contains an offset and takes the value of the UID from the object to which it belongs. However, as will be explained in detail later, the UID and offset which the associative pointers contain or represent are not used as addresses. Instead, the UID and offset are used as tags to locate entries in the AAT, which associates an associative pointer with a resolved pointer.

b. Pointers in FU 10120 (FIG. 302)

When a pointer is used as an address in FU 10120, the address information in the pointer must be translated into a Logical Descriptor 27116 consisting of an AON, an offset, and a length field of 0; when a Logical Descriptor 27116 in FU 10120 is used to form a pointer value in memory, the AON must be converted back to a UID. The first conversion is termed pointer-to-descriptor conversion, and the second descriptor-to-pointer conversion. Both conversions are accomplished by microcodes executing in FU 10120.

What is involved in the translation depends on the kind of pointer: if the pointer is a UID pointer, the UID must be translated into an AON; if the pointer is an object-relative pointer, the AON required to fetch the pointer is the pointer's AON, so no translation is necessary. If the pointer is an unresolved pointer, it must first be translated into a resolved pointer and then into a Logical Descriptor 27116. If the pointer is associative, the translation to a resolved pointer may be performed by means of the ATT.

In the present embodiment, when other FU 10120 microcode calls pointer-to-descriptor microcode, the calling microcode passes Logical Descriptor 27116 for the location of the pointer which is to be translated as an argument to the pointer-to-description translation microcode. The pointer-to-descriptor microcode returns a Logical Descriptor 27116 produced from the value of the pointer at the location specified by Logical Descriptor 27116 which the pointer-to-descriptor microcode received as an argument.

The pointer-to-descriptor microcode first uses Logical Descriptor 27116 given it as an argument to fetch the value of the pointer's Offset Field 30103 from memory. It then saves Logical Descriptor 27116's offset in the output register belonging to OFFALU 20242 and places the value of the pointer's Offset Field 30103 in the offset field of Logical Descriptor 27116 which it received as an argument. The pointer-to-descriptor microcode then saves Logical Descriptor 27116 indicating the pointer's location by storing Logical Descriptor 27116's AON and offset (obtained from OFFALU 20242) in a register in the GRF 10354 frame being used by the invocation of the pointer-to-descriptor microcode. Next, the microcode adds 40 to the offset stored in OFFALU 20242, thereby obtaining the address of NR Field 30109, and uses the address to fetch and read NR Field 30109 and Format Code Field 30113. The course of further processing is determined by the values of these fields. If NR Field 30109 indicates a resolved pointer, there are four cases, as determined by the value of Format Code Field 30113:

Format code field=0: The pointer is a null pointer.

Format code field=1: The pointer is a UID pointer.

Format code field=2: The pointer is an intra-object pointer.

Any other value of the format code field: The pointer is invalid.

In the first case, the microcode sets all fields of the argument to 0; in the second, it fetches the value of UID Field 30115 from memory and invokes LAR microcode (explained in the discussion of objects), which translates the UID to the AON associated with it. The AON is then loaded into the argument's AON field. In the third case, the AON of Logical Descriptor 27116 for the pointer's location and the pointer's AON are the same, so the argument already contains the translated pointer. In the fourth case, the microcode performs a call to a pointer fault-handling Procedure 602 which handles invalid pointer faults, passing saved Logical Descriptor 27116 for the pointer as an argument. Procedure 602 which handles the fault must return a resolved pointer to the microcode, which then converts it to a Logical Descriptor 27116 as described above.

If the unresolved bit is set to 1, there are two possibilities: the unresolved pointer is an associative pointer or it is an ordinary unresolved pointer. Again, the microcode determines which by examining Format Code Field 30113. If the pointer is an ordinary unresolved pointer, the microcode invokes a pointer fault-handling Procedure 602, as described above; if it is an associative pointer, the microcode uses the AAT to resolve the pointer. FIG. 302 illustrates the AAT. AAT 30201 consists of a Header 30203 and an Array 30204 of AAT Entries (AATEs) 30205. Header 30203 contains a Version Field 30204, giving the version of the table, a Size Field 30206, giving the table's size, and Current Address Field 30209, giving the UID-offset address of the static data belonging to the MAS stack to which AAT 30201 belongs. Each AATE has two fields: UID-offset Field 30207, which contains a UID and offset obtained from an associative pointer, and Pointer Field 30209, which contains the pointer which the associative pointer represents. The pointer in Field 30209 may be any kind of pointer, including another associative pointer. Each Stack Object 902 through 905 belonging to a Process 610 has an AAT 30201. A Stack Object 902 through 905's AAT 30201 may be located from the Stack Object by means of AAT Pointer 30211 in the Stack Object's base. For details on Stack Objects, see the discussion of Processes 610.

In the present embodiment, the microcode resolves associative pointers using AAT 30201 as follows: if the associative pointer is an object-relative associative pointer, the microcode obtains the associative pointer's AON from the argument, and converts it to a UID. With UID associative pointers, of course, this step is not necessary. The microcode then hashes the UID and offset to produce an AAT index. Beginning at this index, it searches AAT 30201, which is constructed in such a fashion that any AATE 30205 for the UID and offset obtained from the associative pointer will come between the index and the next empty AATE 30205. Starting at the entry specified by the index, microcode compares the associative pointer it is attempting to resolve with UID-offset Field 30207 of each AATE in turn. If it finds an empty AATE 30205 (i.e., an AATE 30205 whose UID-offset Field 30207 contains a Null UID) or searches the entire AAT 30201 without finding an AATE 30205 for the associative pointer, there is no AATE 30205 for the associative pointer and an AAT Fault results. Microcode performs a microcode-to-software Call, passing the associative pointer as an argument, and associative pointer fault Procedures 602 resolve the associative pointer and create an entry for it at the proper location in AATE 30205. After creating the entry, the Call returns to the microcode, which reattempts the resolution of the associative pointer.

If the microcode finds an AATE 30205 whose UID-offset Field 30207 contains a UID and offset matching that of the associative pointer being resolved, then Pointer Field 30209 contains either a resolved pointer containing the location represented by the associative pointer or an unresolved pointer. If the pointer is unresolved, that pointer is resolved as described above until a resolved pointer results. Once the unresolved pointer has been resolved, the microcode converts it to a descriptor as previously described.

c. Resolution of Unresolved Pointers by Procedures 602

As previously mentioned, CS 10110 does not prescribe the methods by which an unresolved pointer is to be resolved by user Procedures 602. When an Invalid Pointer Fault or an AAT Fault occurs, pointer-to-descriptor microcode merely passes a resolved pointer to the faulting pointer to the Procedure 602 which handles the fault. For the purpose of illustration, however, one method of handling such faults will be described. The method is used in the present embodiment for resolving pointers to Procedures 602, i.e., pointers to Gates 10340 in Procedure Objects 608. These pointers are used in invocations of Procedures 602 which are not contained in the same Procedure Object 608 as the Procedure 602 which invokes them. The pointers are contained in an area of Procedure Object 608 called the Static Data Prototype (explained in detail later). The pointers in the Static Data Prototype may be either resolved or unresolved. The unresolved pointers contain information which allows a Procedure 602 called the Dynamic Linker to construct a resolved pointer to the gate represented by the unresolved pointer. The manner in which the information in the unresolved pointers is interpreted depends completely on the Dynamic Linker.

When a Procedure 602 is executing, the pointers in the Static Data Area have been copied into the Static Data Block for that execution of the procedure. As will be explained in detail in the discussion of Processes 610, a Static Data Block block is an area in memory associated with a Process 610. The Static Data Block contains static data used by Procedures 602 executed by Process 610. When a given Procedure 602 is being executed by a Process 610, the SDP Architectural Base Pointer (ABP) points to the Static Data Block, and Names referring to procedure pointers refer to them by means of negative offsets from the SDP ABP. On a Call to a Procedure 602 contained in another Procedure Object 608, the Call SIN contains a Name which resolves to a procedure pointer in the Static Data Block. If the procedure pointer is unresolved, a pointer fault occurs and pointer-to-descriptor microcode passes the unresolved pointer's location in the Static Data Block to Dynamic Linker Procedure 602.

The Dynamic Linker then retrieves and interprets the pointer. In the present embodiment, the Dynamic Linker interprets Offset Field 30103 of an unresolved pointer in the Static Data Block as an offset in Procedure Object 608 containing Procedure 602 which is making the Call. The offset points to a location in a part of Procedure Object 608 called the Binder Area. The Dynamic Linker then goes to the location in the Binder Area specified in the unresolved pointer. The location contains information which allows the Dynamic Linker to obtain the file name of Procedure Object 608 which contains Procedure 602 which is being called and the location of Procedure 602's gate in Procedure Object 608. The Dynamic Linker then obtains the UID of Procedure Object 608 from EOS, uses the UID and offset information contained in the Binder Area location to locate Procedure 602's gate, places the pointer to the Gate at the location occupied by the unresolved pointer in the Static Data Block, and returns the pointer to the pointer-to-descriptor microcode. The microcode is now able to convert the pointer to a descriptor and proceeds as previously described. The above example is purely illustrative. In other embodiments, the Dynamic Linker may interpret the information contained in the unresolved pointer differently, and may use information contained in areas other than the Binder Area to resolve the unresolved pointer.

d. Descriptor to Pointer Conversion

Descriptor to pointer conversion is the reverse of pointer to descriptor conversion with resolved pointers. The operation must be performed whenever a resolved pointer is moved from an FU 10120 register into MEM 10112. The operation takes two arguments: a Logical Descriptor 27116 which specifies the address to which the pointer is to be written, and a Logical Descriptor 27116 whose AON and offset fields specify the location contained in the pointer. There are two cases: intra-object pointers and UID pointers. Both kinds of pointers have values in Offset Field 30103, so the descriptor-to-pointer microcode first writes the second argument's offset to location specified by the first argument's Logical Descriptor 27116. The next step is to determine whether the pointer is an intra-object pointer or a UID pointer. To do so, the microcode compares the arguments' AONs. If they are the same, the pointer points to a location in the object which contains it, and is therefore an intra-obJect pointer. Since UID Field 30115 of an intra-object pointer is meaningless, the only step remaining for intra-object pointers is to set Flags and Format Field 30105 to the binary representation of 2, which sets all bits but bit 46 to 0, and thereby identifies the pointer as a resolved intra-object pointer.

With UID pointers, the descriptor-to-pointer microcode sets Flags and Format Field 30105 to 1, thereby identifying the pointer as a resolved UID pointer, and calls a KOS LAR microroutine (explained in detail in the discussion of objects) which converts the first argument's AON to a UID and places the result UID in the current frame. When the KOS AON to UID conversion microroutine returns, the descriptor-to-pointer microcode writes the UID to the converted pointer's UID Field 30115.

B. Namespace and the S-Interpreters FIGS. 303–307, 274)

Namespace and the S-interpreter both interpret information contained in Procedure Objects 608. Consequently, the discussion of these components of CS 10110 begins with an overview of those parts of Procedure Object 606 relevant to Namespace and the S-interpreters, and then explains Namespace and the S-interpreters in detail.

a. Procedure Object 606 Overview (FIG. 303)

Figure 303:
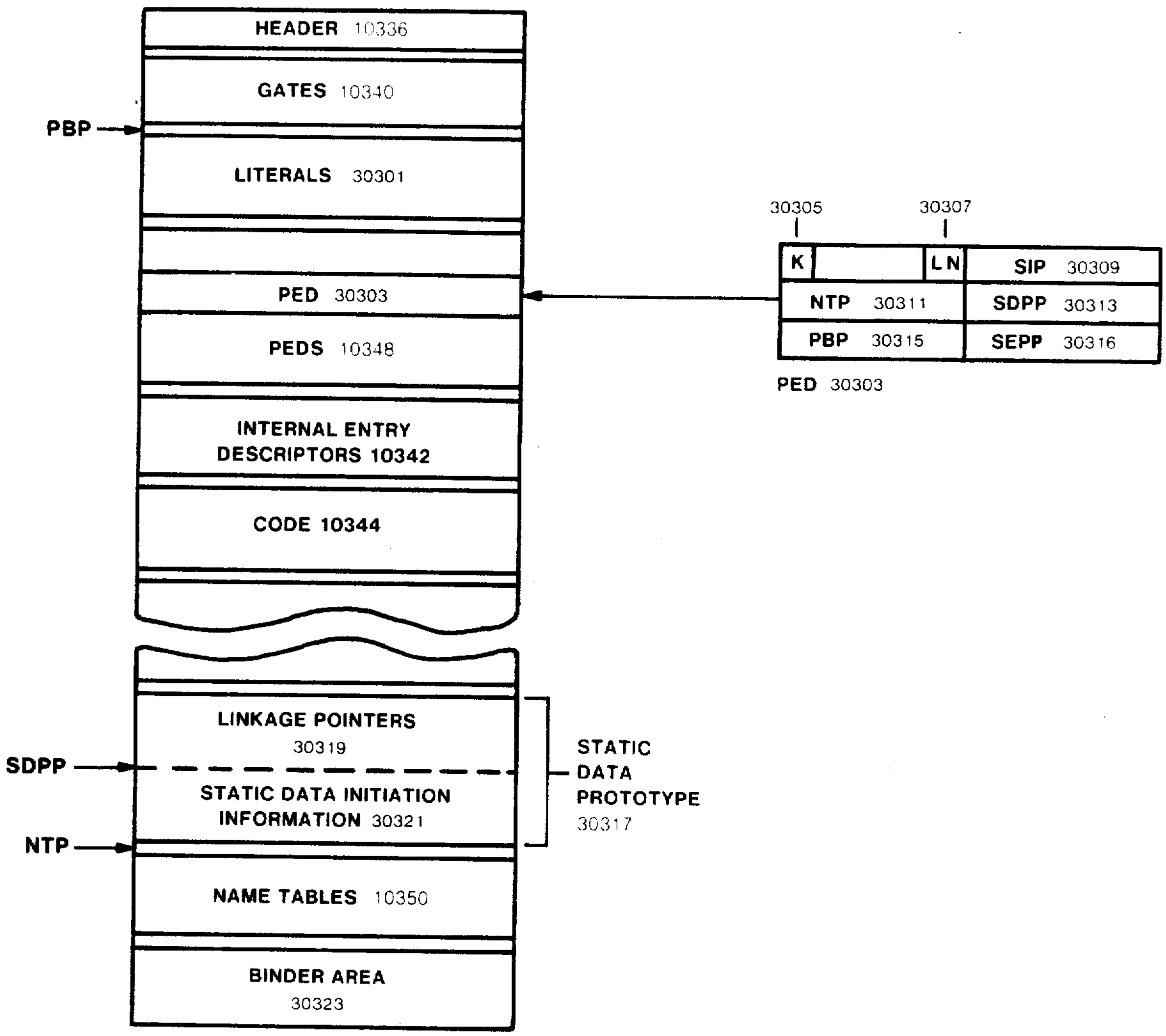
FIG. 303 is a diagram illustrating a namespace overview of a procedure object.

FIG. 303 represents those portions of Procedure Object 608. FIG. 303 expands information contained in FIG. 103; Fields which appear in both Figures have the number of FIG. 103. Portions of Procedure Object 608 which are not discussed here are dealt with later in the discussion of Calls and Returns. The most important part of a Procedure Object 608 for these systems is Procedure Environment Descriptor (PED) 30303. A Procedure 602's PED 30303 contains the information required by Namespace and the S-interpreter to locate and parse Procedure 602's code and interpret its Names. A number of Procedures 602 in a Procedure Object 608 may share a PED 30303. As will be seen in the discussion of Calls, the fact that a Procedure 602 shares a PED 30303 with the Procedure 602 that invokes it affects the manner in which the Call is executed.

The fields of PED 30303 which are important to the present discussion are three fields in Header 30304: K Field 30305, LN Field 30307, and SIP Field 30309, and three of the remaining fields: NTP Field 30311, SDPP Field 30313, and PBP Field 30315.

K Field 30305 indicates whether the Names in the SINs of Procedures 602 which share PED 30303 have 8, 12, or 16 bits.

LN Field 30307 contains the Name which has the largest index of any in Procedure 602's Name Table 10350.

SIP Field 30309 is a UID pointer to the object which contains the S-interpreter for Procedure 602's S-Language.

NTP Field 30311 is an object-relative pointer to the beginning of Procedure 602's Name Table 10350.

SDPP Field 30313 is a pointer which is resolved to the location of static data used by Procedures 602 to which PED 30303 belongs when one of Procedures 602 is invoked by a given Process 610. The resolved pointer corresponding to SDPP 30313 is the SDP ABP.

PBP Field 30315 contains the PBP ABP for invocations of Procedures 602 to which PED 30303 belongs. The PBP ABP is used to calculate locations inside Procedure Object 608.

Other areas of interest in Procedure Object 608 are Literals 30301 and Static Data Prototype (SDPR) 30317. Literals 30301 contains literal values, i.e., values in Procedure 602 which are known at compile time and will not change during program execution. SDPR 30317 may contain any of the following: pointers to external routines and to static data contained in other objects, information required to create static data for a Procedure 602, and in some cases, the static data itself. Pointers in SDPR 30317 may be either resolved or non-resolved.

In the present embodiment, Binder Area 30323 is also important. Binder Area 30323 contains information which allows unresolved pointers contained in Procedure Object 608 to be resolved. Unresolved pointers other than SDPP 30313 in Procedure Object 608 all contain locations in Binder Area 30323, and the specified location contains the information required to resolve the pointer.

FIG. 303 contains arrows showing the locations in Procedure Object 608 pointed to by NTP Field 30311, SDPP Field 30313, and PBP Field 30315. NTP Field 30311 points to the beginning of Name Tables 10350, and thus a Name's Name Table Entry can be located by adding the Name's value to NTP Field 30311. PBP Field 30315 points to the beginning of Literals 30301, and consequently, the locations of Literals and the locations of SINs may be expressed as offsets from the value of PBP Field 30315. SDPP Field 30313 points to the beginning of SDPR 30317. As will be explained in detail in the discussion of Calls, when a Procedure 602 has static data, the SDP ABP is derived from SDPP Field 30313.

b. Resolution of Pointers in Procedure Objects 608

As mentioned in the introduction to the specification, compilers in CS 10110 are independent of CS 10110's UID-offset addressing system. The compilers therefore place only unresolved pointers in Procedure Objects 608. At the end of compilation, therefore, SDPP 30313 is an unresolved pointer, as are the linkage pointers in SDPR 30317. SDPP 30313 contains the location of SDPR 30317, and the linkage pointers in SDPR 30317 contain locations in Binder Area 30323. The locations in Binder Area 30323 contain file system information which allow the unresolved linkage pointers to be resolved into file names. The EOS file management utility can then resolve the file names into UID pointers.

Resolution of these unresolved pointers is done by CS 10110 utility Procedures 602, and may take place at any time between the time Procedure Object 608 is compiled and the time that a Procedure 602 in it is executed. Resolution which takes place before execution of a Procedure 602 involves changes in Procedure 602's Procedure Object 608 and is therefore comparatively permanent; resolution which takes place during a Procedure 602's execution does not affect Procedure Object 608 and lasts only for the period of the Procedure 602's execution.

c. Namespace

The Namespace component of CS 10110 locates SINs belonging to a procedure and fetches them from memory to FU 10120, parses SINs into SOPs and Names, and performs Resolve and Evaluation operations on Names. The Resolve operation translates a Name into a Logical Descriptor 27116 for the data represented by the Name, while the Evaluation operation obtains the data itself. The Evaluation operation does so by performing a Resolve operation and then using the resulting Logical Descriptor 27116 to fetch the data. Since the Evaluation and Resolve operations are the most complicated, the discussion begins with them.

1. Name Resolution and Evaluation

Name Resolution and Evaluation translate Names into Logical Descriptors 27116 by means of information contained in the Names' NTEs, and the NTEs define locations in terms of Architectural Base Registers. Consequently, the following discussion will first describe Name Table Entries and Architectural Base Pointers and then the means by which Namespace translates the information contained in the Name Table Entries and Architectural Base Pointers into Logical Descriptors 27116.

2. The Name Table (FIG. 304)

As previously mentioned, Name Tables 10350 are contained in Procedure Objects 608. Name Tables 10350 contain the information required to translate Names into Logical Descriptors 27116 for the operands represented by the Names. Each Name has as its value the number of a Name Table Entry. A Name's Name Table Entry is located by multiplying the Name's value by the size of a short Name Table Entry and adding the product to the value in NTP Field 30311 of PED 30303 belonging to Procedure 602 which contains the SIN.

The Name Table Entry contains length and type information for the data item specified by the Name, and represents the data item's location as a displacement from a known location, termed the base. The base may be a location specified by an ABP, a location specified by another Name, or a location specified by a pointer. In the latter case, the pointer's location may be specified in terms of an ABP or as a Name.

Figure 304:
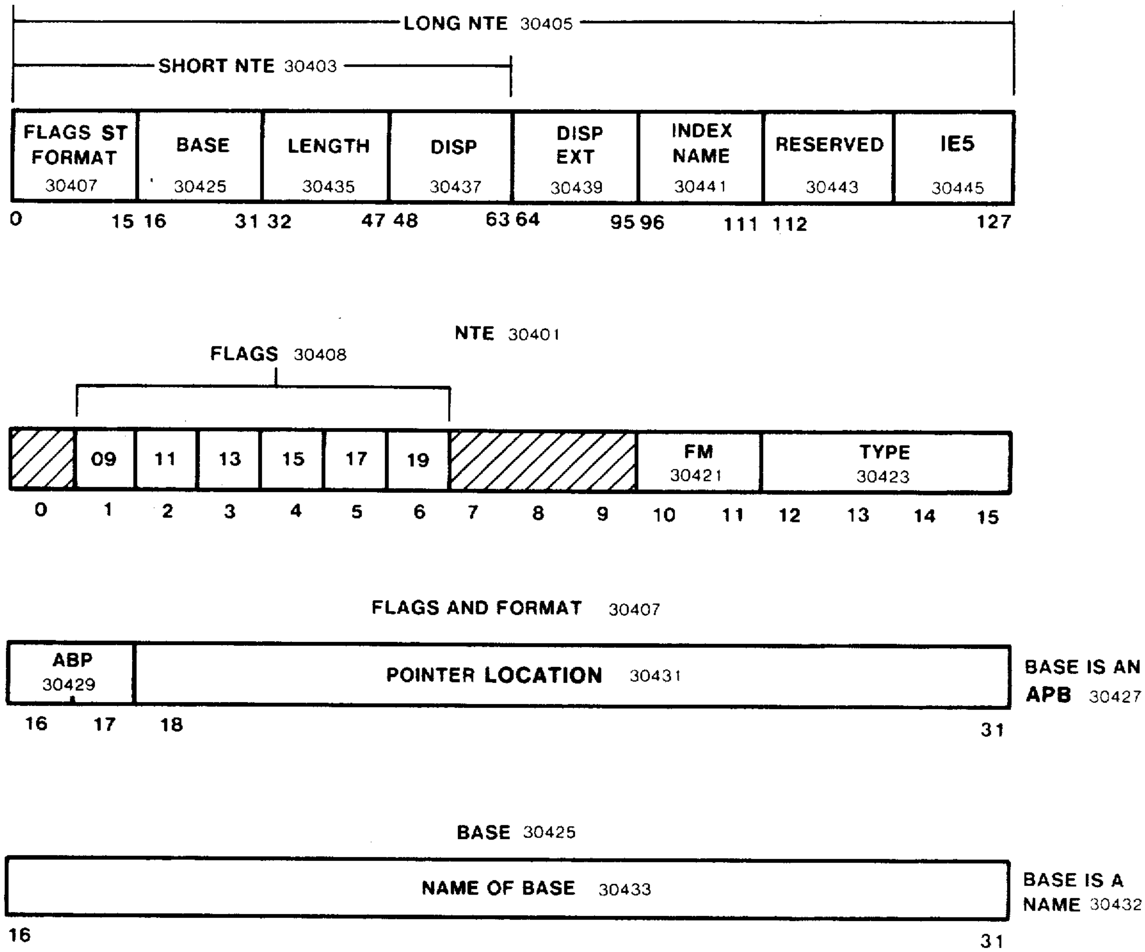
FIG. 304 is a diagram illustrating name table entries.

FIG. 304 is a detailed representation of a Name Table Entry (NTE) 30401. There are two kinds of NTEs 30401: Short NTEs 30403 and Long NTEs 30405. Short NTEs 30403 contain 64 bits; Long NTEs 30405 contain 128 bits. Names that represent scaler data items whose displacements may be expressed in 16 bits have Short NTEs 30403; Names that represent scaler data items whose displacements require more than 16 bits and Names that represent array elements have Long NTEs 30405.

A Short NTE 30403 has four main fields, each 16 bits in length:

Flags and Format Field 30407 contains flags and format information which specify how Namespace is to interpret NTE 30401.

Base Field 30425 indicates the base to which the displacement is to be added to obtain the location of the data represented by the Name. Base Field 30425 may represent the location in four ways: by means of an ABP, by means of a Name, by means of a pointer located by means of an ABP, and by means of a pointer located by means of a Name.

Length Field 30435 represents the length of the data. The length may be a literal value or a Name. If it is a Name, the Name resolves to a location which contains the data item's length.

Displacement Field 30437 contains the displacement of the beginning of the data from the base specified in Field 30425. The displacement is a signed integer value.

Long NTEs 30405 have four additional fields, each 16 bits ong: Two of the fields, Index Name Field 30441 and IES Field 30445 are used only in NTEs 30401 for Names that represent arrays.

Displacement Extension Field 30439 is used in all Long NTEs 30405. If the displacement value in Field 30437 has less than 16 bits, Displacement Extension Field 30439 contains sign bits, i.e., the bits in the field are set to 0 when the displacement is positive and 1 when the displacement is negative. When the displacement value has more than 16 bits, Displacement Extension Field 30439 contains the most significant bits of the displacement value as well as sign bits.

Index Name Field 30441 contains a Name that represents a value used to index an element of an array.

Field 30443 is reserved.

IES Field 30445 contains a Name or Literal that specifies the size of an element in an array. The value represented by this field is used together with the value represented by Index Name Field 30441 to locate an element of an array.

As may be seen from the above, the following fields may Contain names: Base Field 30425, Length Field 30435, Index Name Field 30441, and IES Field 30445.

Two fields in NTE 30401 require further consideration Flags and Format Field 30407 and Base Field 30425. Flags and Format Field 30407 has three subfields: Flags Field 30408, FM Field 30421, and Type Field 30423. Turning first to Flags Field 30408, the six flags in the field indicate how Namespace is to interpret NTE 30401. The flags have the following meanings when they are set:

Long NTE Flag 30409: NTE 30401 is a Long NTE 30405.

Length is a Name Flag 30411: Length Field 30435 contains a Name.

Base is a Name Flag 30413: Base Field 30425 contains a Name instead of the number of an ABP.

Base Indirect Flag 30415: Base Field 30425 represents a pointer, and the location represented by NTE 30401 is to be calculated by obtaining the pointer's value and adding the value contained in Displacement Field 30437 and Displacement Extension Field 30439 to the pointer's offset.

Array Flag 30417: NTE 30401 represents an array.

IES is a Name Flag 30419: IES Field 30445 contains a Name that represents the IES value.

Several of these flags may be set in a given NTE 30401. For example, an entry for an array element that was referenced via a pointer to the array which in turn was represented by a Name, and whose IES value was represented by a Name, would have Flags 30409, 30413, 30415, 30417, and 30419 set.

FM Field 30421 indicates how the data represented by the Name is to be formated when it is fetched from memory. The value of FM Field 30421 is placed in FIU Field 27107 of Logical Descriptor 27116 produced from NTE 30401. The two bits allow for four possibilities:

| Setting | Meaning |
|---|---|
| 00 | right justify, zero fill |
| 01 | right justify, sign fill |
| 10 | left justify, zero fill |
| 11 | left justify, ASCII space fill |

The four bits in Type Field 30423 are used by compilers for language-specific type information. The value of Type Field 30423 is placed in Type Field 27109 of Logical Descriptor 27116 produced from NTE 30401.

Base Field 30425 may have either Base is an ABP Format 30427 or Base is a Name Format 30432. The manner in which Base Field 30425 is interpreted depends on the setting of Base is a Name Flag 30413 and Base Indirect Flag 30415. There are four possibilities:

| Field Settings | | |
|---|---|---|
| Base is a Name | Base Indirect | Meaning |
| 0 | 0 | ABP Format locates base directly. |
| 0 | 1 | ABP Format locates a pointer which is the base. |
| 1 | 0 | Base is Name Format locates base when Name is resolved. |
| 1 | 1 | Base is Name Format locates a pointer when Name is resolve and the pointer is the base. |

As indicated by the above table, Base Field 30425 is interpreted as having Base is ABP Format 30427 when Base is a Name Flag 30411 is not set. In Base is ABP Format 30427, Base Field 30425 has two subfields: ABP Field 30429 and Pointer Locator Field 30431. The latter field has meaning only when Base Indirect Flag 30415 is set. ABP Field 30429 is a two-bit code which indicates the ABP. The settings and their meanings are the following:

| Setting | APB |
|---|---|
| 00 | FP |
| 01 | Unused |
| 10 | SDP |
| 11 | PBP |

The ABPs are discussed below. When Base Indirect Flag 30415 is set to 1 and Base is a Name Flag 30413 is set to 0, the remaining 14 bits of the Base Field in ABP Format are interpreted as Pointer Locator Field 30413. When so interpreted, Pointer Locator Field 30413 contains a signed integer, which, when multiplied by 128, gives the displacement of a pointer from the ABP specified in ABP Field 30429. The value of this pointer is then the base to which the displacement is added.

Base Field 30425 is interpreted as having Base is a Name Format 30432 when Base is a Name Flag 30413 is set to 1. In Base is a Name Format 30432, Base Field 30425 contains a Name. If Base Indirect Flag 30415 is not set, the Name is resolved to obtain the Base. If Base Indirect Flag 30415 is set, the name is evaluated to obtain a pointer value, and that pointer value is the Base.

Figure 305:
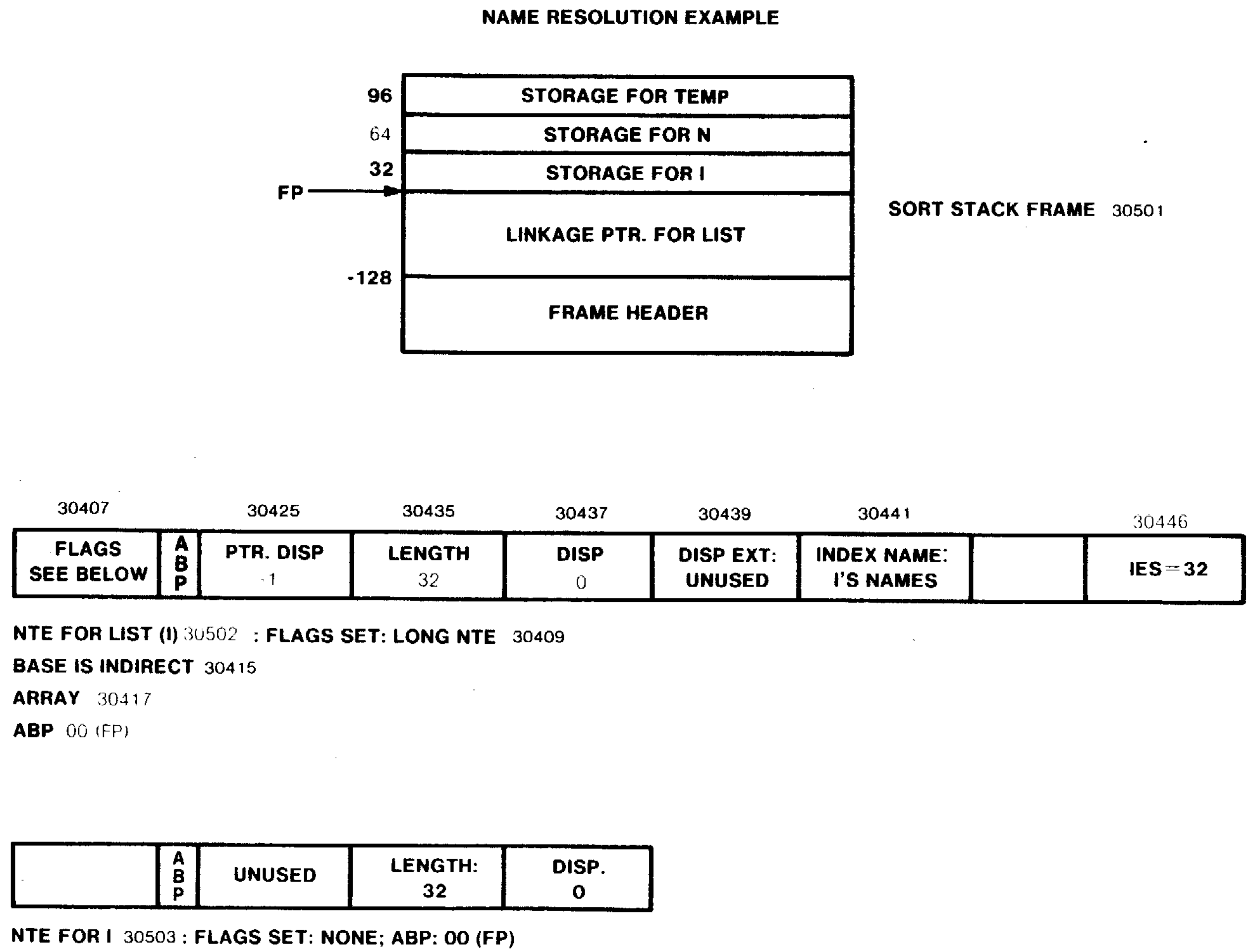
FIG. 305 is a diagram illustrating an example of name resolution.
Figure 306:
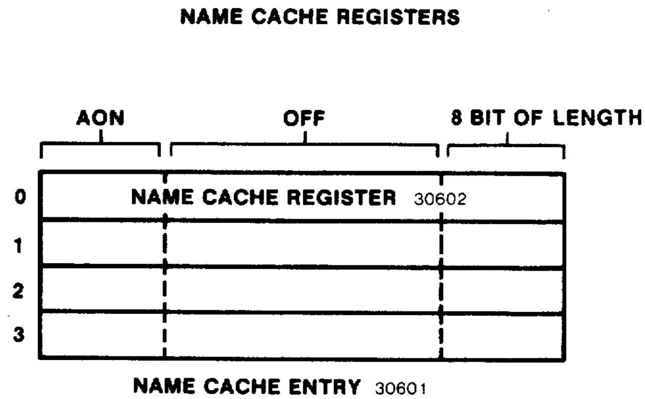
FIG. 306 is a diagram illustrating name cache entries.

3. Architectural Base Pointers (FIGS. 305, 306, 274)

If Base is a Name Flag 30413 belonging to a NTE 30401 is not set, Base Field 30425 specifies one of the three ABPs in CS 10110:

PBP specifies a location in Procedure Object 608 to which displacements may be added to obtain the locations of Literals and SINs.

SDP specifies a location in a Static Data Block for an invocation of a Procedure 602 to which displacements may be added to obtain the locations of static data and linkage pointers to Procedures 602 contained in other Procedure Objects 608 and static data.

FP specifies a location in the MAS frame belonging to Procedure 602's current invocation to which displacements may be added to obtain the location of local data and linkage pointer to arguments.

Each time a Process 610 invokes a Procedure 602, Call microcode saves the current values of the ABPs on Secure Stack 10336, calculates the values of the ABPs for the new invocation, and places the resulting Logical Descriptors 27116 in FU 10120 registers, where they are accessible to Namespace microcode.

Call microcode calculates the ABPs as follows: PBP is obtained directly from PBP Field 30315 in PED 30303 belonging to the Procedure 602 being executed. All that is required to make it into a Logical Descriptor 27116 is the addition of the AON for Procedure Object 608's UID. SDP is obtained by performing a pointer-to-descriptor translation on SDPP Field 30313. FP, finally, is provided by the portion of Call microcode which creates the new MAS 502 frame for the invocation. As is described in detail in the discussion of Call, the Call microcode copies linkage pointers to the invocation's actual arguments onto MAS 502, sets FP to point to the location following the last actual argument, and then allocates storage for the invocation's local data. Positive displacements from FP thus specify locations in the local data, while negative offsets specify linkage pointers.

a.a. Resolving and Evaluating Names (FIG. 305)

The primary operations performed by Namespace are resolving names and evaluating them. A Name has been resolved when Namespace has used the ABPs and information contained in the Name's NTE 30401 to produce a Logical Descriptor 27116 for the Name; a name has been evaluated when Namespace has resolved the Name, presented the resulting Logical Descriptor 27116 for the Name to memory, and obtained the value of the data represented by the Name from memory.

The resolve operation has three parts, which may be performed in any order:

Obtaining the Base from Base Field 30425 of the Name's NTE 30401.

Obtaining the displacement.

Obtaining the length from Length Field 30435.

Obtaining the length is the simplest of the operations: if Length in a Name Flag 30411 is set, the length is the value obtained by evaluating the Name contained in Length Field 30435; otherwise, Length Field 30435 contains a literal value and the length is that literal's value There are four ways in which the Base may be calculated. Which is used depends on the settings of Base is a Name Flag 30413 and Base Indirect Flag 30415:

Both Flags 0: the ABP specified in ABP Field 30429 is the Base.

Base is a Name Flag 30413 0 and Base Indirect Flag 30415 1: The Base is the location contained in the pointer specified by ABP Field 30429 and pointer Locator Field 30431.

Base is a Name Flag 30413 1 and Base Indirect Flag 30415 0: The Base is the location obtained by resolving the Name in Base Field 30425.

Both Flags 1: The Base is the location obtained by evaluating the Name in Base Field 30425.

The manner in which Namespace calculates the displacement depends on whether NTE 30401 represents a scaler data item or an array data item. In the first case, Namespace adds the value contained in Displacement Field 30437 and Displacement Extension Field 30439 to the location obtained for the Base; in the second case, Namespace evaluates Index Name Field 30441 and IES Field 30445, multiplies the resulting values together, and adds the product to the value in Displacement Field 30437 in order to obtain the displacement.

If any field of a NTE 30401 contains a Name, Namespace obtains the value or location represented by the Name by performing a Resolve or Evaluation operation on it as required. As mentioned in the discussion of NTEs 30401, flags in Flags Field 30408 indicate which fields of an NTE 30401 contain Names. Since the NTE 30401 for a Name used in another NTE 30401 may itself contain Names, Namespace performs the Resolve and Evaluation operations recursively.

The ways in which a Name may be resolved are too numerous to be described individually, but a single example may serve to illustrate the principles explained above. The Names in the example are generated by a FORTRAN compiler working with the following declarations:

```
SUBROUTINE SORT ( LIST )
INTEGER LIST ( 10 )
INTEGER I, N, TEMP
```

LIST is a formal argument; it represents an array of ten integers which is passed to the subroutine SORT by the FORTRAN program which calls the subroutine. I, N, and TEMP are local integer variables. The elements of LIST and I, N, and TEMP all have a length of 32 bits. Individual elements of LIST may be represented in the FORTRAN program by means of the name LIST plus an index value, for example LIST (I). The element represented by LIST (I) depends on the value of I. In the following, it is assumed that I has the value 3, making LIST (I) represent the third element in the array argument. In the S-instructions for the subroutine SORT, LIST (I) is represented by a Name, and the index I is represented by another Name. The MAS 502 frame for the invocation of SORT will contain a linkage pointer to the actual argument represented by LIST and the storage for the variables I, N, and TEMP. Hence, Base Fields 30425 for the Names' NTEs 30401 may define the Base in terms of the FP ABP. FIG. 305 shows the MAS 502 Frame for an invocation of SORT and NTEs 30401 for the Names representing LIST (I) and I. In SORT MAS 502 Frame 30501, the linkage pointer for LIST immediately precedes FP and the storage for I immediately follows FP. NTE 30401 for LIST (I) is for an array actual argument; consequently, Flags 30409, 30415, and 30417 are set. ABP Field 30429 is set to 00, the value for FP, and Pointer Locator Field 30431 is set to −1, yielding a displacement of −128 from FP for the beginning of the linkage pointer for LIST. The length of the element of LIST represented by LIST (I) is 32, so Length Field 30435 is set to that value. Displacement Field 30437 is set to 0, Index Name Field 30441 contains the Name which represents I, and IES Field 30445 contains 32, since each element of LIST is 32 bits long.

NTE 30401 for I is for a scaler value which has a Short NTE 30403 and may be located directly from FP; consequently, no flags are set in Flags Field 30407, ABP Field 30429 is set to 00, Pointer Locator Field 30431 is unused, Length Field 30435 is set to 32, and Displacement Field 30437 is set to 0, since the storage for I immediately follows FP.

The resolution of the Name representing LIST (I) proceeds in this manner: Length is a Name Flag 30411 is not set in NTE 30501, so NTE 30502's Length Field 30435 contains the value of the length and the value can be simply copied into Logical Descriptor 27116 for the data item represented by the Name.

Base is Indirect Flag 30415 is set in NTE 30502, but Base is a Name Flag 30413 is not set, so the Base is the value of a pointer which may be located by means of a displacement from an ABP. ABP Field 30429 specifies the FP, and Pointer Locator Field 30425 specifies an offset of −128 from FP. Conversion of the pointer at that location to a Logical Descriptor 27116 then yields the Base.

NTE 30502 is an array NTE, so the displacement calculation involves the evaluation of the name in Index Name Field 30441. Namespace evaluates the name by using the Name's NTE 30502 to produce a Logical Descriptor 27116 for the Name and then using the Logical Descriptor 27116 to fetch the value of the data represented by the Name. NTE 30503 for I is resolved as follows: its flags indicate that the length and displacement for the data represented by the Name can be read directly from NTE 30503, and that the Base is to be calculated from an ABP. ABP Field 30429 is set to 0, so the ABP in question is FP. Displacement Field 30437 is 0, so Logical Descriptor 27116 for the Name's data uses FP's AON and offset and has a Length Field of 32. Namespace then fetches the data at the specified location and returns it to the displacement calculation for NTE 30501. Here, it is assumed that the value is 3. Namespace calculates the displacement by multiplying the value in IES Field 30445 by 3 and adding the result to Displacement Field 30437. Logical Descriptor 27116 for LIST (I) is then obtained by adding the resulting displacement to the offset of the pointer obtained from the previously-described calculation of the Base.

b.b. Implementation of Name Evaluation and Name Resolve in CS 10110

In the present embodiment, the Name Evaluation and Resolve operations are carried out by FU 10120 microcode Eval and Resolve commands. Both commands require two pieces of information: a register in the current frame of SR portion 10362 of GRF 10354 for receiving Logical Descriptor 27116 produced by the operation, and the source of the Name which is to be resolved or evaluated. Both Resolve and Eval may choose between three sources: Parser 20264, Name Trap 20254, and the low-order 16 bits of the output register for OFFALU 20242. Resolve may specify current frame registers 0, 1, or 2 for Logical Descriptor 27116, and Eval may specify current frame registers 0 or 1. At the end of the Resolve operation, Logical Descriptor 27116 for the data represented by the Name is in the specified SR 10362 register and at the end of the Evaluation operation, Logical Descriptor 27116 is in the specified SR 10362 register and the data's value has been transferred via MOD Bus 10114 to EU 10122's OPB 20322.

The execution of both Resolve and Eval commands always begin with the presentation of the Name to Name Cache 10226. The Name presented to Name Cache 10226 is latched into Name Trap 20254, where it is available for subsequent use by Name Resolve microcode.

If there is an entry for the Name in Name Cache 10226, a name cache hit occurs. For Names with NTEs 30401 fulfilling three conditions, the Name Cache 10226 entry for the Name is a Logical Descriptor 27116 for the data item represented by the Name. The conditions are the following:

- NTE 30401 contains no Names.
- Length Field of NTE 30401 specifies a length of less than 256 bits.
- If Base is Indirect Flag 30415 is set, Pointer Displacement Field 30431 must have a negative value, indicating that the base is a linkage pointer.

Logical Descriptor 27116 can be encached in this case because neither the location nor the length of the data represented by the Name can change during the life of an invocation of Procedure 602 to which the Name belongs. If the Name Cache 10226 entry for the Name is a Logical Descriptor 27116, the hit causes Name Cache 10226 to place Logical Descriptor 27116 in the specified SR 10362 register. In all other cases, the Name Cache 10226 entry for the Name does not contain a Logical Descriptor 27116, and a hit causes Name Cache 10226 to emit a JAM signal. The JAM signal invokes microcode which uses information stored in Name Cache 10226 to construct Logical Descriptor 27116 for the data item represented by the Name. JAMS are explained in detail below.

If there is no entry for the Name in Name Cache 10226, a Name Cache Miss occurs, and Name Cache 10226 emits a cache miss JAM signal. The Name Resolve microroutine invoked by the cache miss JAM signal constructs an entry in Name Cache 10226 from the Name's NTE 30401, using FU 10120's DESP 20210 to perform the necessary calculations. When it is finished, the cache miss microcode leaves a Logical Descriptor 27116 for the Name in the specified SR 10362 register and returns.

The Resolve operation is over when Logical Descriptor 27116 has been placed in the specified GRF 10354 register; the Evaluation operation continues by presenting Logical Descriptor 27116 to Memory Reference Unit 27017, which reads the data represented by Logical Descriptor 27116 from memory and places it on OPB 20322. The memory reference may result in Protection Cache 10234 misses and ATU 10228 misses, as well as protection faults and page faults, but these are handled by means of event signals and are therefore invisible to the Evaluation operation.

Name Cache 10226 produces 15 different JAM signals. The signal produced by a JAM depends on the following: whether the operation is a Resolve or an Eval, which register Logical Descriptor 27116 is to be placed in, whether a miss occurred, and in the case of a hit, which register in the Name Cache 10226 entry for the Name was loaded last. From the point of view of the behavior of the microcode invoked by the JAM, the last two factors are the most important. Their relation to the microcode is explained in detail below.

In the present embodiment, all entries in Name Cache 10226 are invalidated when a Procedure 602 calls another Procedure 602. The invalidation is required because Calls always change the value of FP and may also change the values of SDP and PBP, thereby changing the meaning of NTEs 30401 using displacements from ABPs. Entries for Names in invoked Procedure 602 are created and loaded into Name Cache 10226 when the Names are evaluated or resolved and a cache miss occurs.

The following discussion will first present Name Cache 10226 as it appears to the microprogrammer and then explain in detail how Name Cache 10226 is used to evaluate and resolve Names, how it is loaded, and how it is flushed.

c.c. Name Cache 10226 Entries (FIG. 306)

The structure and the physical behavior of Name Cache 10226 was presented in the discussion of FU 10120 hardware; here, the logical structure of Name Cache 10226 entries as they appear to the microprogrammer is presented. To the microprogrammer, Name Cache 10226 appears as a device which, when presented a Name on NAME Bus 20224, always provides the microprogrammer with a Name Cache 10226 entry for the Name consisting of four registers. The microprogrammer may read from or write to any one of the four registers. When the microprogrammer writes to the four registers, the action taken by Name Cache 10226 when a hit occurs on the Name associated with the four registers depends on which of the registers has most recently been loaded. The means by which Name Cache 10226 associates a Name with the four registers, and the means by which Name Cache 10226 provides registers when it is full are invisible to the microprogrammer.

FIG. 306 illustrates Name Cache Entry 30601 for a Name. The four Registers 30602 in Name Cache Entry 30601 are numbered 0 through 3, and each Register 30602 has an AON, offset, and length field like those in GRF 10354 registers, except that some flag bits in GRF 10354 register AON fields are not included in Register 30602 fields, and the length field in Register 30602 is 8 bits long. As is the case with GRF 10354 registers, the microprogrammer can read or write individual fields of Register 30602 or entire Register 30602. Name Cache Entry 30601 is connected via DB 27021 to DESP 20210, and consequently, the contents of a GRF 10354 register may be obtained from or transferred to a Register 30602 or vice-versa. When the contents of a Register 30602 have been transfered to a GRF 10354 register, the contents may be processed using OFFALU 20242 and other arithmetic-logical devices in DESP 20210.

d.d. Name Cache 10226 Hits

When a Name is presented to Name Cache 10226 and Name Cache 10226 has a Name Cache Entry 30601 containing information about the Name, a name cache hit occurs. On a hit, Name Cache 10226 hardware always loads the contents of Register 30602 0 of the Name's Name Cache Entry 30601 into the GRF 10354 register specified in the Resolve or Eval microcommand. In addition, a hit may result in the invocation of microcode via a JAM:

- The JAM may invoke special microcode for resolving Names of array elements whose NTEs 30401 allow certain hardware accelerations of index calculations.
- The JAM may invoke general name resolution microcode which produces a Logical Descriptor 27116 from the contents of Name Cache Entry 30601.

Whether the hit produces a JAM, and the kind of JAM it produces, are determined by the last Register 30602 to be loaded when Name Cache Entry 30601 was created by Name Cache Miss microcode. If Register 30602 0 was the last to be loaded, no JAM occurs; if Register 30602 1 was loaded last, the JAM for special array Name resolution occurs; if Register 30602 2 or 3 was loaded last, the JAM for general Name resolution occurs.

As may be inferred from the above, Name Cache 10226 hardware defines the manner in which Name Cache Entries 30601 are loaded for the first two cases. In the first case, Name Cache Register 30602 0 must contain Logical Descriptor 27116 for the Name's data. As already mentioned, the Name's NTE 30401 must therefore describe data whose location and length does not change during an invocation and whose length is less than 256 bits. Name Cache 10226 hardware also determines the form of Name Cache Entries 30601 for encachable arrays. An encachable array NTE 30401 is an array NTE 30401 which fills the following conditions:

- The only Name contained in array NTE 30401 is in Index Name Field 30441.
- NTE 30401 for the index Name fills the conditions for scaler NTEs 30401 for which Logical Descriptors 27116 may be encached.
- The value in IES Field 30445 is no greater than 128 and a power of 2.
- Array NTE 30401 otherwise fills the conditions for scaler NTEs 30401 for which Logical Descriptors 27116 may be encached.

In the present embodiment, the encachable array entry uses registers 0, 1, and 2 of Name Cache Entry 30601 for the name:

| Register | Contents AON | OFFSET | LENGTH |
|---|---|---|---|
| 0 | Logical Descriptor 27116 for the index Name. | | |
| 1 | 0 | IES power of 2 | unused |
| 2 | Logical Descriptor 27116 for the array | | |

When a hit for this type of entry occurs, the resulting JAM signal does two things: it invokes encachable array resolve microcode and it causes the index Name's Logical Descriptor 27116 to be presented to Memory Reference Unit 27017 for a read operation which returns the value of the data represented by the index Name to an accumulator in OFFALU 20242. The encachable array resolve microroutine then uses the Name that caused the JAM, latched into Name Trap 20254, to locate Register 30602 2 of Name Cache Entry 30601 for the Name, writes the contents of Register 30602 2 into the GRF register specified by the Resolve or Eval microcommand, obtains the product of the IES value and the index value by shifting the index value left the number of times specified by the IES exponent in Register 30602 1, adds the result to the offset field of the GRF 10354 register containing the array's Logical Descriptor 27116, thus obtaining Logical Descriptor 27116 for the desired array element, and returns.

For the other cases, the manner in which Name Cache Entries 30601 are loaded and processed to obtain Logical Descriptors 27116 is determined by the microprogrammer. The JAM signal which results if a Name Cache Entry 30601 is neither a Logical Descriptor 27116 nor an encachable array entry merely invokes a microroutine. The microroutine uses the Name latched into Name Trap 20254 to locate the Name's Name Cache Entry 30601 and then reads tag values in Name Cache Entry 30601 to determine how the information in Name Cache Entry 30601 is to be translated into a Logical Descriptor 27116. The contents of Name Cache Entries 30601 for the other cases have two general forms: one for NTEs 30401 with Base is Indirect Flag 30415 set, and one for NTEs in which it is not set. The first general form looks like this:

| Register | AON | Contents OFFSET | LENGTH |
|---|---|---|---|
| 0 | ABP AON | tag / length | unused |
| 1 | 0 | index name/ IES | unused |
| 2 | 0 | unused | unused |
| 3 | 0 | data displacement from loc. specified | unused |

-continued

| Register | AON | Contents OFFSET | LENGTH |
| --- | --- | --- | --- |
| | | by pointer | |

Register 30602 0 contains the AON of the ABP. Register 30602 0's offset field contains two items: the tag, which contains Flags Field 30408 of NTE 30401 along with other information, and which determines how Name Resolve microcode interprets the contents of Name Cache Entry 30601, and a value or Name for the length of the data item. Register 30602 1 is used only if the Name represents a data item in an array. It then contains the Name from Index Field 30441 and the Name or value from IES Field 30445. The offset field of Register 30602 3 contains the sum of the offset indicated by NTE 30401's ABP and of the displacement indicated by NTE 30401.

The second format, used for NTEs 30401 whose bases are obtained from pointers or by resolving a Name, looks like this:

| Registers | AON | Contents OFFSET | LENGTH |
| --- | --- | --- | --- |
| 0 | 0 | tag / length | unused |
| 1 | 0 | index name/ IES | unused |
| 2 | 0 | FM and type bits/ base field | unused |
| 3 | 0 | data displacement from loc. specified by pointer or name | unused |

In this form, the location of the Base must be obtained either by evaluating a pointer or resolving a Name. Hence, there is no field specifying the Base's AON. Otherwise, Registers 30602 0 and 1 have the same contents as in the previous format. In Register 30602 2, the offset field contains Name Table Entry 30401's FM Field 30421 and Type Field 30423 and Base Field 30425. The Offset Field of Register 30602 2 contains the value of Name Table Entry 30401 Displacement Fields 30437 and 30439.

As in Name Table Entries 30401, the index must be represented by a Name, and length, IES, and Base may be represented by Names. If a field of Name Cache Entry 30601 contains a Name, a flag in the tag indicates that fact, and Name Resolve microcode performs an Eval or Resolve operation on it as required to obtain the value or location represented by the name.

The microcode which resolves Name Cache Entries 30601 of the types just described uses the general algorithms described in the discussion of Name Table Entries 30401, and is therefore not discussed further here.

e.e. Name Cache 10226 Misses

When a Name is presented to Name Cache 10226 and there is no Name Cache Entry 30601 for the Name, a name cache miss occurs. On a miss Name Cache 10226 hardware emits a JAM signal which invokes name cache miss microcode. The microcode obtains the Name which caused the miss from Name Trap 20254 and locates the Name's NTE 30401 by adding the Name to the value of NTP 30311 from PED 30303 for Procedure 602 being executed. As will be explained in detail later, when a Procedure 602 is called, the Call microcode places the AON and offset specifying the NTP's location in a register in GR's 10360. Using the information contained in the Name's NTE 30401, the Cache Miss microcode resolves the Name and constructs a Name Cache Entry 30601 for it. As described above, the microcode determines the method by which it resolves the Name and the form of the Name's Name Cache Entry 30601 by reading Flags Field 30408 in the Name's NTE 30401. Since the descriptions of the Resolve operation, the micromachine, Name Cache 10226, and the formats of Name Cache Entries 30601 are sufficient to allow those skilled in the art to understand the operations performed by Cache Miss microcode, no further description of the microcode is provided.

f.f. Flushing Name Cache 10226 (FIG. 274)

As described in the discussion of Name Cache 10226 hardware, hardware means, namely VALS 24068, exist which allow Name Cache Entries 30601 to be invalidated. Name Cache Entries 30601 may be invalidated singly, or all entries in Name Cache 10226 may be invalidated by means of a single microcommand. The latter operation is termed name cache flushing. In the present embodiment, Name Cache 10226 must be flushed when Process 610 whose Virtual Processor 612 is bound to JP 10114 executes a Call or a Return and whenever Virtual Processor 612NO is unbound from JP 10114. Flushing is required on Call and Return because Calls and Returns change the values of the ABPs and other pointers needed to resolve Names. At a minimum, a Call produces a new MAS Frame 10412, and a Return returns to a previous Frame 10412, thereby changing the value of FP. If the called Procedure 602 has a different PED 30303 from that of the calling Procedure 602, the Call or Return may also change PBP, SDP, and NTP. Flushing is required when a Virtual Processor 612 is unbound from JP 10114 because Virtual Processor 612 which is next bound to JP 10114 is bound to a different Process 610, and therefore cannot use any information belonging to Process 610 bound to the previous Virtual Processor 612.

g.g. Fetching the I-Stream

As explained in the discussion of FU 10120 hardware, SINs are fetched from memory by Prefetcher 20260. PREF 20260 contains a Logical Descriptor 27116 for a location in Code 10344 belonging to Procedure 602 which is currently being executed. On any MO cycle, PREF 20260 can place Logical Descriptor 27116 on DB 27021, cause Memory Reference Unit 27017 to fetch 32 bits at the location specified by Logical Descriptor 27116, and write them into INSTB 20262. When INSTB 20262 is full, PREF 20260 stops fetching SINs until Namespace parsing operations, described below, have processed part of the contents of INSTB 20262, thereby creating space for more SINs.

The fetching operation is automatic, and requires intervention from Namespace only when a SIN causes a branch, i.e., causes the next SIN to be executed to be some other SIN than the one immediately following the current SIN. On a branch, Namespace must load PREF 20260 with the location of the next SIN to be executed and cause PREF 20260 to begin fetching SINs at that location. The operation which does this is specified by the load_prefetch_for_branch microcommand. The microcommand specifies a source for a Logical Descriptor 27116 and transfers that Logical Descriptor 27116 via DB 27021 to PREF 20260. After PREF 20260 has thus been loaded, it begins fetching SINs at the specified location. Since any SINs still in INSTB 20262 have been rendered meaningless by the branch operation, the first SINs loaded into INSTB 20262 are simply written over INSTB 20262's prior contents. FIG. 274 contains an example of the use of the load_prefetch_for_branch microcommand.

h.h. Parsing the I-Stream

The I-stream as fetched from MEM 10112 and stored in INSTB 20262 is a sequence of SOPs and Names. As already mentioned, the I-stream has a fixed format: in the present embodiment, SOPs are always 8 bits long, and Names may be 8, 12, or 16 bits long. The length of Names used in a given procedure is fixed, and is indicated by the value in K Field 30305 in the Procedure 602's PED 30303. The Namespace parsing operations obtain the SOPs and Names from the I-stream and place them on NAME Bus 20224. The SOPs are transferred via this bus to the devices in SOP Decoder 27003, while the Names are transferred to Name Trap 20254 and Name Cache 10226 for Resolve and Evaluation operations as described above. As the parsing operations obtain SOPs and Names, they also update the three program counters CPC 20270, EPC 20274, and IPC 20272. The values in these three counters are offsets from PBP which point to locations in Code 10344 belonging to Procedure 602 being executed. CPC 20270 points to the I-stream syllable currently being parsed, so it is updated on every parsing operation. EPC 20274 points to the beginning of the last SIN executed by JP 10114, and IPC 20272 points to the beginning of the current SIN, so these program counters are changed only at the beginning of the execution of an SIN, i.e., when a SOP is parsed.

As described in the discussion of FU 10120 hardware, in the current implementation, parsing consists physically of reading 8 or 16 bits of data from a location in INSTB 20262 identified by a pointer for INSTB 20262 which is accessible only to the hardware. As data is read, the hardware increments the pointer by the number of bits read, wrapping around and returning to the beginning of INSTB 20262 if it reaches the end. At the same time that the hardware increments the pointer, it increments CPC 20270 by the same number of bits. As previously mentioned, CPC 20270 contains the offset from PBP of the SOP or Name being currently parsed, thus coordinating the reading of INSTB 20262 with the reading of Procedure 602's Code 10344.

The number of bits read depends on whether Parser 20264 is reading an SOP or a Name, and in the latter case, by the syllable size specified for the Name. The syllable size is contained in CSSR 24112. On a Call to a Procedure 602 which has a different PED 30303 from that of the calling procedure, the Call microcode loads the value contained in K Field 30305 into CSSR 24112.

Namespace's parsing operations are performed by separate microcommands for parsing SOPs and Names. There is a single microcommand for parsing S-operations: parse_op_stage. The microcommand obtains the next eight bits from INSTB 20262, places the bits onto NAME Bus 20224, and latches them into LOPCODE Register 24212. It also updates EPC 20274 and IPC 20272 as required at the beginning of an SIN: EPC 20274 is set to IPC 20272's former value, and IPC 20272 is set to CPC 20270's value. At the end of the operation, CPC 20270 is incremented by 8. Since the parsing of an SOP always occurs as the first operation in the interpretation of an SIN, the parse_op_stage command is generally combined with a dispatch fetch command. As will be explained below, the latter command interprets the S-operation as an address in FDISP 24218, and FDISP 24218 in turn produces an address in FUSITT 11012. The latter address is the location of the beginning of the SIN microcode for the SIN.

Figure 307:
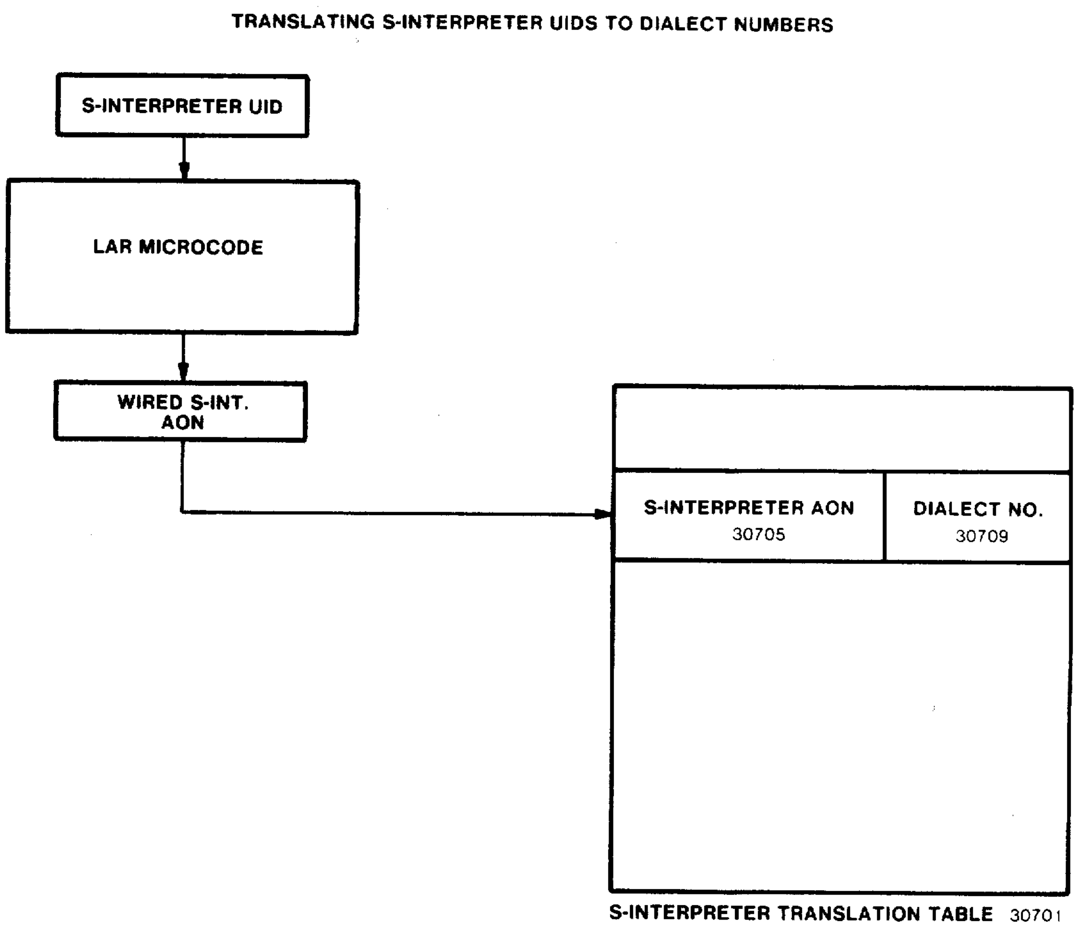
FIG. 307 is a diagram illustrating translation of S-interpreter universal identifiers to dialect numbers.

There are two microcommands for parsing Names: parse_k_load_epc and parse_k_dispatch_ebox. Both commands obtain a number of bits from INSTB 20262 and place them on NAME Bus 20214. With both microcommands, the syllable size, K, stored in CSSR 24112, determines the number of bits obtained from INSTB 20262. Both commands also increment CPC by the value stored in CSSR 24112. In addition, parse_k_load_epc sets EPC to IPC's value, while parse_k_dispatch_ebox also dispatches EU 10122, i.e., interprets the SOP saved in LOPCODE 24210 as an address in EDISP 24222, which in turn contains an address in EU EUSITT 20344. The EU EUSITT 20344 address is passed via EUDIS Bus 20206 to COMQ 20342 in EU 10122.

d. The S-Interpreters (FIG. 307)

CS 10110 does not assign fixed meanings to SOPs. While all SOPs are 8 bits long, a given 8 bit SOP may have one meaning in one S-Language and a completely different meaning in another S-Language. The semantics of an S-Language's S-operations are determined completely by the S-interpreter for the S-Language. Thus, in order to correctly interpret an S-operation, CS 10110 must know what S-interpreter it is to use. The S-interpreter is identified by a UID pointer with offset 0 in SIP Field 30309 of PED 30303 for Procedure 602 that CS 10110 is currently executing. In the present embodiment, the UID is the UID of a microcode object which contains FU 10120 microcode. When loaded into FUSITT 11012, the microcode interprets SOPs as defined by the S-Language to which the SOP belongs. In other embodiments, the UID may be the UID of a Procedure Object 608 containing Procedures 602 which interpret the S-Language's SOPs, and in still others, the S-interpreter may be contained in a PROM and the S-interpreter UID may not specify an object, but may serve solely to identify the S-interpreter.

When a Procedure 602 executes an SIN on JP 10114, CS 10110 must translate the value of SIP Pointer 30309 for Procedure 602 and the S-instruction's SOP into a location in the microcode or high-level language code which makes up the S-interpreter. The location obtained by the translation is the beginning of the microcode or high-level language code which implements the SIN. The translation of an SOP together with SIP Pointer 30309 into a location in the S-interpreter is termed dispatching. Dispatching in the present embodiment involves two primary components: a table in memory which translates the value of SIP Pointer 30309 into a small integer called the Dialect Number, and S-operation Decoder Portion 27003 of the FU 10120 micromachine. The following discussion will first present the table and explain how an SIP Pointer 30309 is translated into a Dialect Number, and then explain how the Dialect Number and the SOP together are translated into locations in FUSITT 11012 and EUSITT 20344.

1. Translating SIP into a Dialect Number (FIG. 307)

In the present embodiment, all S-interpreters in CS 10110 are loaded into FUSITT 11012 when CS 10110 begins operation and each S-interpreter is always placed in the same location. Which S-interpreter is used to interpret an S-Language is determined by a value stored in dialect register RDIAL 24212. Consequently, in the present embodiment, a Call to a Procedure 602 whose S-interpreter differs from that of the calling Procedure 602 must translate the UID pointer contained in SIP Field 30309 into a Dialect Number.

FIG. 307 represents the table and microcode which performs this translation in the present embodiment. S-interpreter Translation Table (STT) 30701 is a table which is indexed by small AONs. Each STT Entry (STTE) 30703 has two fields: an AON Field 30705 and a Dialect Number Field 30709. Dialect Number Field 30709 contains the Dialect Number for the S-interpreter object whose AON is in AON Field 30705.

When CS 10110 begins operation, each S-interpreter object is wired active and assigned an AON small enough to serve as an index in STT 30701. By convention, a given S-interpreter object is always assigned the same AON and the same Dialect Number. The AON is placed in AON Field 30705 of STTE 30703 indexed by the AON, and the Dialect Number is placed in Dialect Number Field 30709. Since the S-interpreter objects are wired active, these AONs will never be reassigned to other objects.

On a Call which requires a new S-interpreter, Call microcode obtains the new SIP from SIP Field 30309, calls KOS LAR microcode to translate its UID to its AON, uses the AON to locate the S-interpreter's STTE 30703, and places the value of Dialect Number Field 30709 into RDIAL 21242.

Other embodiments may allow S-interpreters to be loaded into FUSITT 11012 at times other than system initialization, and allow S-interpreters to occupy different locations in FUSITT 11012 at different times. In these embodiments, STT 30701 may be implemented in a manner similar to the implementations of AST 10914 or MHT 10716 in the present embodiment.

2. Dispatching

Dispatching is accomplished by Dispatch Files 27004. These files translate the values provided by RDIAL 24212 and the SOP of the S-instruction being executed into the location of microcode for the SIN specified by the S-operation in the S-interpreter specified by the value of RDIAL 24212. The present embodiment has three dispatch files: FDISP 24218, FALG 24220, and EDISP 24222. FDISP 24218 and FALG 24220 translate S-operations into locations of microcode which executes on FU 10120; EDISP 24222 translates S-operations into locations of microcode which executes on EU 10122. The difference between FDISP 24218 and FALG 24220 is one of speed: FDISP 24218 can translate an SOP in the same microinstruction which performs a parse_op_stage command to load the SOP into LOPCODE 24210. FALG 24220 must perform the translation on a cycle following the one in which the SOP is loaded into LOPCODE 24210. Typically, the location of the first portion of the microcode to execute an S-operation is contained in an FDISP 24218 register, the location of portions executed later is contained in an FALG 24220 register, and the location of microcode for the S-operation which executes on EU 10122 is contained in EDISP 24222.

In the present embodiment, the registers accomplish the translation from S-operation to microcode location as follows: As mentioned in the discussion of FU 10120 hardware, each Dispatch File contains 1024 registers. Each register may contain an address in an S-interpreter. As will be seen in detail later, the address may be an address in an S-interpreter's object, or it may be the address in FUSITT 11012 or EUSITT 20344 of a copy of microcode stored at an S-interpreter address. The registers in the Dispatch Files may be divided into sets of 128 or 256 registers. Each set of registers translates the SOPs for a single S-Language into locations in microcode. Which set of registers is used to interpret a given S-operation is decided by the value of RDIAL 24212; which register in the set is used is determined by the value of the S-operation. The value contained in the specified register is then the location of microcode which executes the S-instruction specified by the S-operation in the S-Language specified by RDIAL 24212.

Logically, the register addressed by the concatenated value in turn contains a 15 bit address which is the location in the S-interpreter of the first microinstruction of microcode used to execute the S-instruction specified by the S-operation in the S-Language specified by the contents of RDIAL 24212. In the present embodiment, the microcode referred to by the address may have been loaded into FUSITT 11012 and EUSITT 20344 or it may be available only in memory. Addresses of microcode located in FUSITT 11012 and EUSITT 20344 are only eight bits long. Consequently, if a Dispatch File 27004 contains an address which requires more bits than that, the microcode specified by the address is in memory. As described in the discussion of FU 10112 hardware, addresses larger than 8 bits produce an Event Signal, and microcode invoked by the event signal fetches the microinstruction at the specified address in the S-interpreter from memory and loads it into location 0 of FUSITT 11012. The event microcode then returns, and the microinstruction at location 0 is executed. If the next microinstruction also has an address larger than 8 bits, the event signal occurs again and the processs described above is repeated.

As previously mentioned, FDISP 24218 is faster than FALG 24220. The reason for the difference in speed is that FDISP registers contain only 6 bits for addressing the S-interpreter. The present embodiment assumes that all microcode addressed via FDISP 24218 is contained in FUSITT 11012. It concatenates 2 zero bits with the six bits in the FDISP 24218 register to produce an 8 bit address for FUSITT 11012. FDISP 24218 registers can thus contain the location of every fourth FUSITT 11012 register between FUSITT register 256 and FUSITT register 448. The microcode loaded into these locations in FUSITT 11012 is microcode for operations which are performed at the start of the SIN by many different SINs. For example, all SINs which perform operations on 2 operands and assign the result to a location specified by a third operand must parse and evaluate the first two operands and parse and resolve the third operand. Only after these operations are done are SINs-specific operations performed. In the present embodiment, the microcode which parses, resolves, and evaluates the operands is contained in a part of FUSITT 11012 which is addressable by FDISP 24218.

As previously mentioned, in the present embodiment, FUSITT 11012 and EUSITT 20344 may be loaded only when CS 10110 is initialized. The microcode loaded into FUSITT 11012 and EUSITT 20344 is produced by the microbinder from the microcode for the various SINs. To achieve efficient use of FUSITT 11012 and EUSITT 20344, microcode for operations shared by various S-interpreters appears only once in FUSITT 11012 and EUSITT 20344. While the SINs in different S-Languages which share the microcode have different registers in FDISP 24218, FALG 24220, or EDISP 24222 as the case may be, the registers for each of the S-instructions contain the same location in FUSITT 11012 or EUSITT 20344.

4. The Kernel Operating System

A. Introduction

Figure 401:
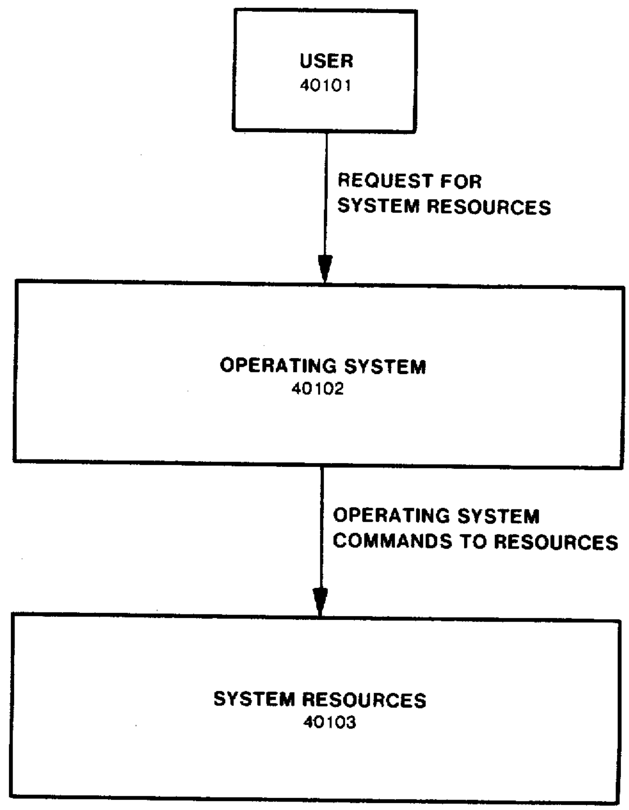
FIG. 401 is a diagram illustrating operating systems and system resources.

Many of the unique properties of CS 10110 are produced by the manipulation of tables in MEM 10112 and Secondary Storage 10124 by programs executing on JP 10114. These programs and tables together make up the Kernel Operating System (KOS). Having described CS 10110's components and the means by which they cooperate to execute computer programs, this specification now presents a detailed account of KOS and of the properties of CS 10110 which it produces. The discussion begins with a general introduction to operating systems, then presents an overview of CS 10110's operating systems, an overview of the KOS, and detailed discussions of the implementation of objects, access control, and Processes 610.

a. Operating Systems (FIG. 401)

In CS 10110, as in other computer systems, the operating system has two functions:

- It controls the use of CS 10110 resources such as JP 10114, MEM 10112, and devices in IOS 10116 by programs being executed on CS 10110.
- It defines how CS 10110 resources appear to users of CS 10110.

The second function is a consequence of the first: By controlling the manner in which executing programs use system resources, the operating system in fact determines how the system appears to its users. FIG. 401 is a schematic representation of the relationship between User 40101, Operating System 40102, and System Resources 40103. When User 40101 wishes to use a System Resource 40103, User 40101 requests the use of System Resource 40103 from Operating System 40102, and Operating System 40102 in turn commands CS 10110 to provide the requested Resources 40103. For example, when a user program wishes to use a peripheral device, it does not deal with the device directly, but instead calls the Operating System 40102 Procedure 602 that controls the device. While Operating System 40102 must take into account the device's complicated physical properties, the user program that requested the device need know nothing about the physical properties, but must only know what information the Operating System 40102 Procedure 602 requires to perform the operation requested by the user program. For example, while the peripheral device may require that a precise pattern of data be presented to it, the Operating System 40102 Procedure 602 may only require the data itself from the user program, and may format the data as required by the peripheral device. The Operating System 40102 Procedure 602 that controls the peripheral device thus transforms a complicated physical interface to the device into a much simpler logical interface.

Figure 402:
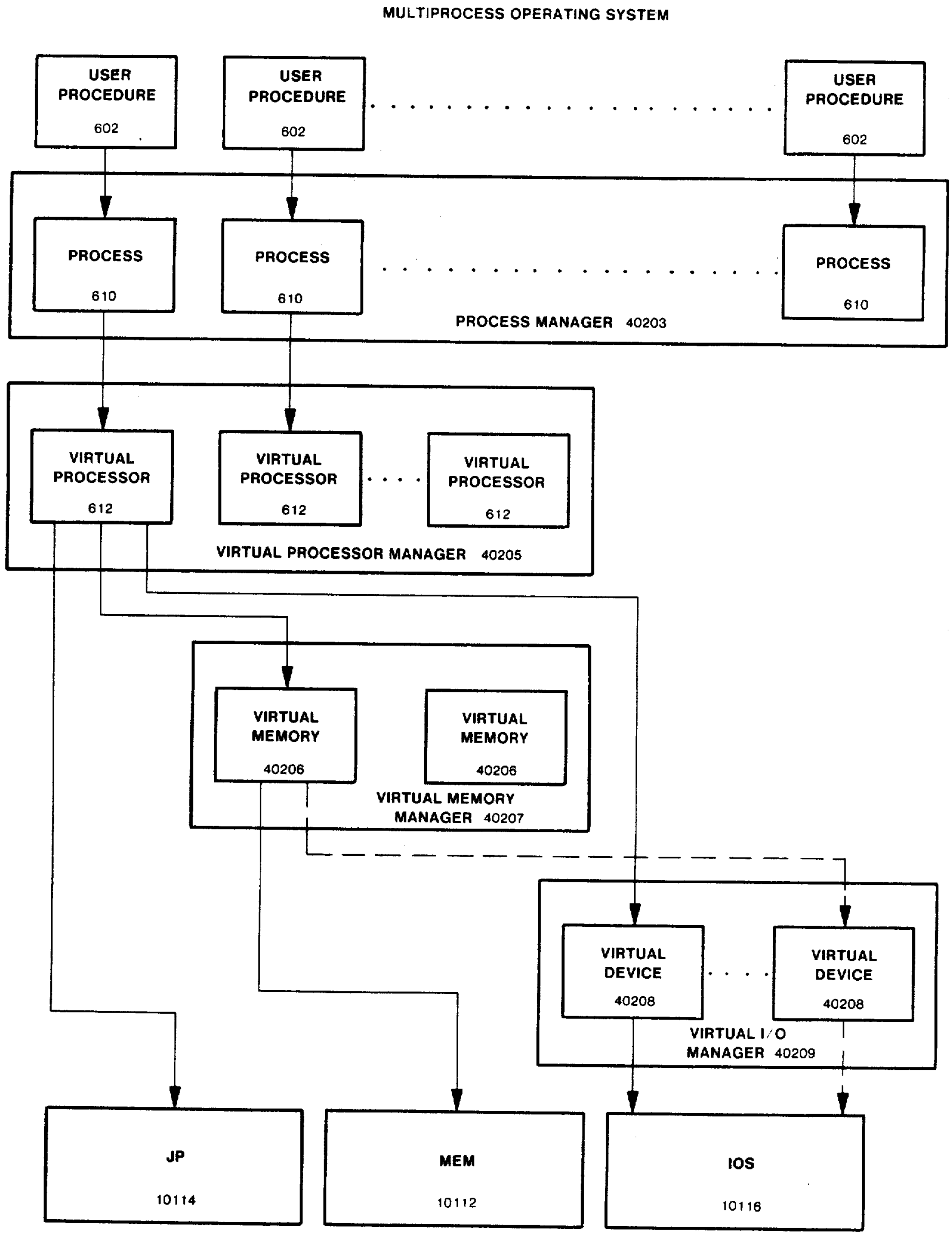
FIG. 402 is a diagram illustrating multiprocess operating systems.

1. Resources Controlled by Operating Systems (FIG. 402)

Operating Systems 40102 control two kinds of resources: physical resources and virtual resources. The physical resources in the present embodiment of CS 10110 are JP 10114, IOS 10116 and the peripheral devices associated with IOS 10116, MEM 10112, and Secondary Storage 10124. Virtual resources are resources that the operating system itself defines for users of CS 10110. As was explained above, in controlling how CS 10110's resources are used, Operating System 40102 defines how CS 10110 appears to the users. Instead of the physical resources controlled by Operating System 40102, the user sees a far simpler set of virtual resources. The logical I/O device interface that Operating System 40102 gives the user of a physical I/O device is such a virtual resource. Often, an Operating System 40102 will define sets of virtual resources and multiplex the physical resources among these virtual resources. For instance, Operating System 40102 may define a set of Virtual Processors 612 that correspond to a smaller group of physical processors, and a set of virtual memories that correspond to a smaller group of physical resources. When a user executes a program, it runs on a Virtual Processor 612 and uses virtual memory. It seems to the user of the virtual processor and the virtual memory that he has sole access to a physical processor and physical memory, but in fact, Operating System 40102 is multiplexing the physical processors and memories among the Virtual Processors 612 and virtual memories.

Operating System 40102, too, uses virtual resources. For instance, the memory management portion of an Operating System 40102 may use I/O devices; when it does so, it uses the virtual I/O devices defined by the portion of the Operating System 40102 that manages the I/O devices. One part of Operating System 40102 may also redefine virtual resources defined by other parts of Operating System 40102. For instance, one part of Operating System 40102 may define a set of primitive virtual I/O devices and another part may use these primitive virtual I/O devices to define a set of high-level user-oriented I/O devices. Operating System 40102 thus turns the physical CS 10110 into a hierarchy of virtual resources. How a user of CS 10110 perceives CS 10110 depends entirely on the level at which he is dealing with the virtual resources.

The entity that uses the resources defined by Operating System 40102 is the Process. A Process 610 may be defined as the activity resulting from the execution of a program with its data by a sequential processor. Whenever a user requests the execution of a program on CS 10110, Operating System 40102 creates a Process 610 which then executes the Procedures 602 making up the user's program. In physical terms, a Process 610 is a set of data bases in memory that contain the current state of the program execution that the process represents. Operating System 40102 causes Process 610 to execute the program by giving Process 610 access to the virtual resources which it requires to execute the program, by giving the virtual resources access to those parts of Process 610's state which they require to perform their operations, and by giving these virtual resources access to the physical resources. The temporary relationship of one resource to another or of a Process 610 to a resource is called a binding. When a Process 610 has access to a given Virtual Processor 612 and Virtual Processor 612 has access to Process 610's state, Process 610 is bound to Virtual Processor 612, and when Virtual Processor 612 has access to JP 10114 and Virtual Processor 612's state is loaded into JP 10114 registers, Virtual Processor 612 is bound to JP 10114, and JP 10114 can execute SINs contained in Procedures 602 in the program being executed by Process 610 bound to Virtual Processor 612. Binding and unbinding may occur many times in the course of the execution of a program by a Process 610. For instance, if a Process 610 executes a reference to data and the data is not present in MEM 10112, then Operating System 40102 unbinds Process 610's Virtual Processor 612 from JP 10114 until the data is available in MEM 10112. If the data is not available for an extended period of time, or if the user for whom Process 610 is executing the program wishes to stop the execution of the program for a while, Operating System 40102 may unbind Process 610 from its Virtual Processor 612. Virtual Processor 612 is then available for use by other Processes 610.

As mentioned above, the binding process involves giving a first resource access to a second resource, and using the first resource's state in the second resource. To permit binding and unbinding, Operating System 40102 maintains data bases that contain the current state of each resource and each Process 610. State may be defined as the information that the operating system must have to use the resource or execute the Process 610. The state of a line printer, for instance, may be variables that indicate whether the line printer is busy, free, off line, or out of order. A Process 610's state is more involved, since it must contain enough information to allow Operating System 40102 to bind Process 610 to a Virtual Processor 612, execute Process 610 for a while, unbind Process 610, and then rebind it and continue execution where it was halted. A Process 610's state thus includes all of the data used by Process 610 up to the time that it was unbound from a Virtual Processor 612, along with information indicating whether Process 610 is ready to begin executing again.

FIG. 402 shows the relationship between Processes 610, virtual, and physical resources in an operating system. The figure shows a multi-process Operating System 40102, that is, one that can multiplex CS 10110 resources among several Processes 610. The Processes 610 thus appear to be executing concurrently. The solid arrows in FIG. 402 indicate bindings between virtual resources or between virtual and physical resources. Each Process 610 is created by Operating System 40102 to execute a user program. The program consists of Procedures 602, and Process 610 executes Procedures 602 in the order prescribed by the program. Processes 610 are created and managed by a component of Operating System 40102 called the Process Manager. Process Manager 40203 executes a Process 610 by binding it to a Virtual Processor 612. There may be more Processes 610 than there are Virtual Processors 612. In this case, Operating System 40102 multiplexes Virtual Processors 612 among Processes 610.

Virtual Processors 612 are created and made available by another component of Operating System 40102, Virtual Processor Manager 40205. Virtual Processor 40205 also multiplexes JP 10114 among Virtual Processors 612. If a Virtual Processor 612 is ready to run, Virtual Processor Manager 40205 binds it to JP 10114. When Virtual Processor 612 can run no longer, or when another Virtual Processor 612 requires JP 10114, Virtual Processor Manager 40205 unbinds running Virtual Processor 612 from JP 10114 and binds another Virtual Processor 612 to it.

Virtual Processors 612 use virtual memory and I/O resources to perform memory access and input-output. Virtual Memory 40206 is created and managed by Virtual Memory Manager 40207, and Virtual I/O Devices 40208 are created and managed by Virtual I/O Manager 40209. Like Virtual Processor Manager 40205, Components 40207 and 40209 of Operating System 40102 multiplex physical resources among the virtual resources. As described above, one set of virtual resources may use another set. One way in which this can happen is indicated by the broken arrows in FIG. 402. These arrows show a binding between Virtual Memory 40206 and Virtual I/O Device 40208. This binding occurs when Virtual Memory 40206 must handle a reference to data contained on a peripheral device such as a disk drive. To the user of Virtual Memory 40206, all data appears to be available in MEM 10110. In fact, however, the data is stored on peripheral devices such as disk drives, and copied into MEM 10112 when required. When a Process 610 references data that has not been copied into MEM 10112, Virtual Memory 40206 must use IOS 10116 to copy the data into MEM 10112. In order to do this, it uses a Virtual I/O Device 40208 provided by Virtual I/O Manager 40209.

2. Resource Allocation by Operating Systems

The manner in which Operating System 40102 allocates resources is governed by two considerations: efficient operation of CS 10110 and fairness to users of CS 10110. The most efficient way to allocate resources is to give them only to those Processes 610 that can use them. If a Process 610's Virtual Processor 612 is bound to JP 10114, for example, Virtual Processor 612 may execute a reference to data that is not available in MEM 10112. Some delay is necessarily involved in getting the data, and Virtual Processor 612 cannot execute on JP 10114 until it has the data. To keep JP 10114 from idling until Virtual Processor 612 gets the data, Operating System 40102 unbinds Virtual Processor 612 from JP 10114 and binds another Virtual Processor 612' to JP 10114. Some time later, when the data is available, Operating System 40102 will put Virtual Processor 612 back onto JP 10114 and Process 610 will continue executing the user program where it left off.

Even when a Virtual Processor 612 can make full use of JP 10114, fairness to other users may require that Operating System 40102 remove it from JP 10114. For example, other users may have higher-priority demands on CS 10110 than the user to whom Process 610 belongs which is bound to Virtual Processor 612. Operating System 40102 may receive a request from one of these higher priority Processes 610', and may remove currently-running Virtual Processor 612 from JP 10114. Operating System 40102 may also define a maximum amount of time that Virtual Processor 612 may be bound to JP 10114 before Operating System 40102 intervenes and removes it from JP 10114.

b. The Operating System in CS 10110

For the sake of clarity, Operating System 40102 has been described as though it existed outside of CS 10110. In fact, however, Operating System 40102 itself uses the resources it controls. In the present embodiment, parts of Operating System 40102 are embodied in JP 10114 hardware devices, parts are embodied in microcode which executes on JP 10114, and parts are embodied in Procedures 602. These Procedures 602 are sometimes called by Processes 610 executing user programs, and sometimes by special Operating System Processes 610 which do nothing but execute operations for Operating System 40102.

The manner in which the components of Operating System 40102 interact may be illustrated by the way in which CS 10110 handles a page fault, i.e., a reference to data which is not available in MEM 10110. The first indication that there may be a page fault is an ATU Miss Event Signal. This Event Signal is generated by ATU 10228 in FU 10120 when there is no entry in ATU 10228 for a Logical Descriptor 27116 used in a read or write operation. The Event Signal invokes Operating System 40102 microcode, which examines a table in MEM 10112 in order to find whether the data described by Logical Descriptor 27116 has a copy in MEM 10112. If the table indicates that there is no copy, Operating System 40102 microcode communicates the fact of the page fault to an Operating System 40102 Virtual Memory Manager Process 610 and removes Virtual Processor 612 bound to the Process 610 which was executing when the page fault occurred from JP 10114. Some time later, Virtual Memory Manager Process 610 is bound to JP 10114. Procedures 602 executed by Virtual Memory Manager Process 610 then initiate the I/O operations required to locate the desired data in Secondary Storage 10124 and copy it into MEM 10112. When the data is available in MEM 10112, Operating System 40102 allows Virtual Processor 612 bound to Process 610 which was executing when the page fault occurred to return to JP 10114. Virtual Processor 612 repeats the memory reference which caused the page fault, and since the data is now in MEM 10112, the reference succeeds and execution of Process 610 continues.

c. Extended Operating System and the Kernel Operating System (FIG. 403)

In CS 10110, Operating System 40102 is made up of two component operating systems, the Extended Operating System (EOS) and the Kernel Operating System (KOS). The KOS has direct access to the physical resources. It defines a set of primitive virtual resources and multiplexes the physical resources among the primitive virtual resources. The EOS has access to the primitive virtual resources defined by KOS, but not to the physical resources. The EOS defines a set of user-level virtual resources and multiplexes the primitive virtual resources defined by KOS among the user level virtual resources. For example, KOS provides EOS with Processes 610 and Virtual processors 612 and binds Virtual Processors 612 to JP 10114, but EOS decides when a Process 610 is to be created and when a Process 610 is to be bound to a Virtual Processor 612.

Figure 403:
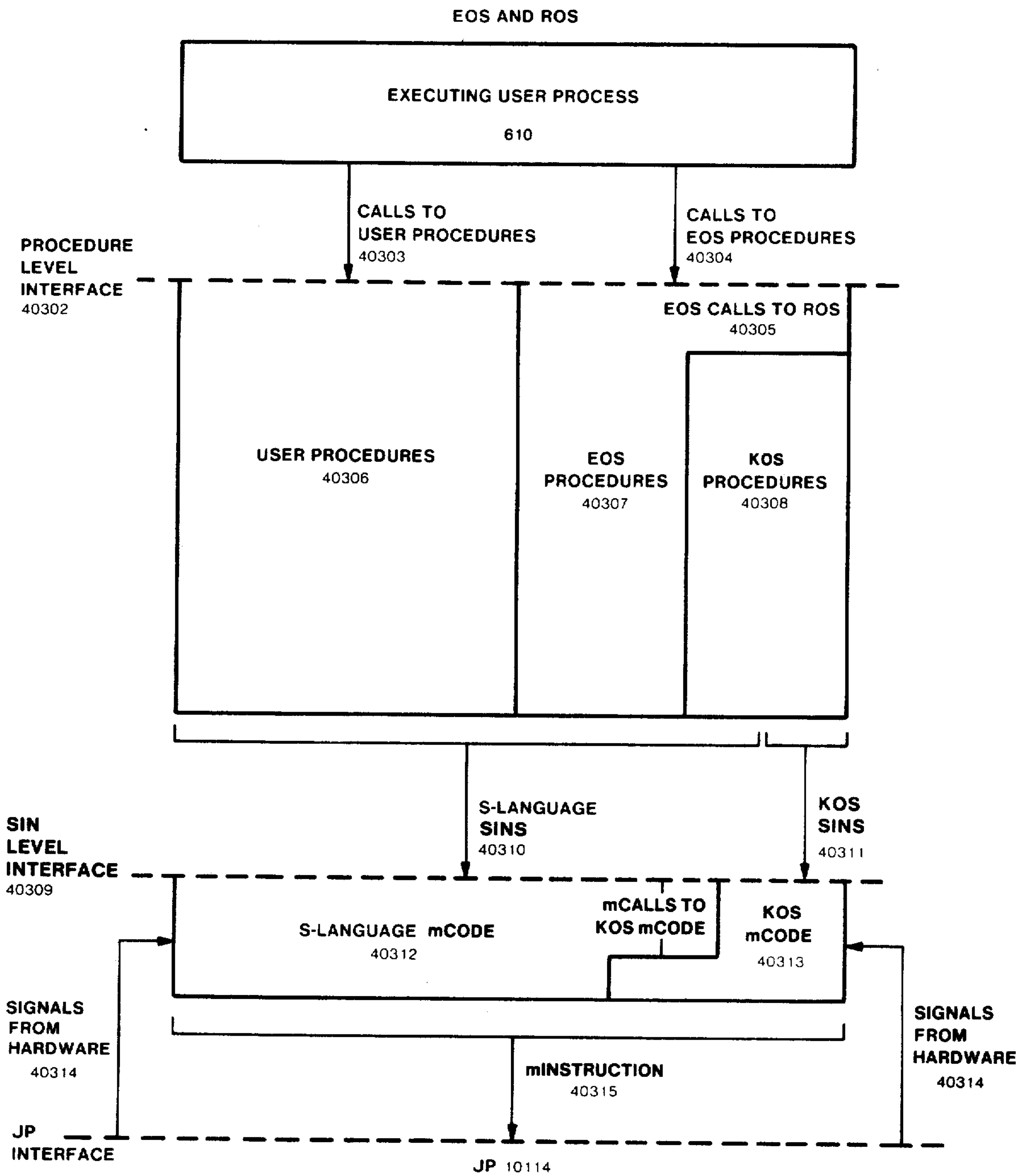
FIG. 403 is a diagram illustrating an extended operating system and a kernel operating system.

FIG. 403 shows the relationship between a user Process 610, EOS, KOS, and the physical resources in CS 10110. FIG. 403 shows three levels of interface between executing user Process 610 and JP 10114. The highest level of interface is Procedure Level 40302. At this level, Process 610 interacts with CS 10110 by calling Procedures 602 as specified by the program Process 610 is executing. The calls may be either calls to User Procedures 40306 or calls to EOS Procedures 40307. When Process 610 is executing a Procedure 602, Process 610 produces a stream of SINs. The stream contains two kinds of SINs, S-language SINs 40310 and KOS SINs 40311. Both kinds of SINs interact with CS 10110 at the next level of interface, SIN-level Interface 40309. SINs 40310 and 40311 are interpreted by Microcode 40312 and 40313, and Microinstructions 40315 interact with CS 10110 at the lowest level of interface, JP 10114 Interface 40316. As already explained in the discussion of the FU 10120 micromachine, certain conditions in JP 10114 result in Event Signals 40314 which invoke microroutines in S-interpreter Microcode 40312 or KOS Microcode 40313. Only Procedure-Level Interface 40302 and SIN-level Interface 40309 are visible to users. Procedure-level Interface 40309 appears as calls in user Procedures 602 or as statements in user Procedures 602 which compilers translate into calls to EOS Procedures 602. SIN-level Interface 40309 appears as the Name Tables 10335 and SINs in Procedure Objects 608 generated by compilers.

As FIG. 403 indicates, EOS exists only at Procedural Level 40302, while KOS exists at Procedural Level 40302, and SIN Level 40304, and within the microcode beneath SIN Level 40309. The only portion of the operating system that is directly available to user Processes 610 is EOS Procedures 40307. EOS Procedures 40307 may in turn call KOS Procedures 40308. In many cases, an EOS Procedure 40307 will contain nothing more than the call to a KOS Procedure 40308.

User Procedures 40306, EOS Procedures 40307, and KOS Procedures 40308 all contain S-language SINs 40310. In addition, KOS Procedures 40308 only may contain special KOS SINs 40311. Special KOS SINs 40311 control functions that are not available to EOS Procedures 40307 or User Procedures 40306, and KOS SINs 40311 may therefore not appear in Procedures 40306 or 40307. S-language SINs 40310 are interpreted by S-interpreter Microcode 40312, while KOS SINs 40311 are interpreted by KOS Microcode 40313. KOS Microcode 40313 may also be called by S-interpreter Microcode 40313. Depending on the hardware conditions that cause Event Signals 40314, Signals 40314 may cause the execution of either S-interpreter Microcode 40312 or KOS Microcode 40313.

FIG. 403 shows the system as it is executing a user Process 610. There are in addition special Processes 610 reserved for KOS and EOS use. These Processes 610 work like user Processes 610, but carry out operating system functions such as process management and virtual memory management. With one exception, EOS Processes 610 call EOS Procedures 40307 and KOS Procedures 40308, while KOS Processes 610 call only KOS Procedures 40308. The exception is the beginning of Process 610 execution: KOS performs the KOS-level functions required to begin executing a Process 610 and then calls EOS. EOS performs the required EOS level functions and then calls the first User Procedure 40306 in the program Process 610 is executing.

A description of how KOS handles page faults can serve to show how the parts of the system at the JP 10114-, SIN-, and Procedure Levels work together. A page fault occurs when a Process 610 references a data item that has no copy in MEM 10112. The page fault begins as an Event Signal from ATU 10228. The Event Signal invokes a microroutine in KOS Microcode 40313. If the microroutine confirms that the referenced data item is not in MEM 10112, it records the fact of the page fault in some KOS tables in MEM 10112 and calls another KOS microroutine that unbinds Virtual Processor 612 bound to Process 610 that caused the page fault from JP 10114 and allows another Process 610's Virtual Processor 612 to run. Some time after the page fault, a special operating system Process 610, the Virtual Memory Manager Process 610, runs and executes KOS Procedures 40309. Virtual Memory Manager Process 610 initiates the I/O operation that reads the data from Secondary Storage 10124 into MEM 10112. When IOS 10116 has finished the operation, Process 610 that caused the page fault can run again and Virtual Memory Manager Process 610 performs an operation which causes Process 610's Virtual Processor 612 to again be bound to JP 10114. When Process 610 resumes execution, it again attempts to reference the data. The data is now in MEM 10112 and consequently, the page fault does not recur.

The division of Operating System 40102 into two hierarchically-related operating systems is characteristic for CS 10110. Several advantages are gained by such a division:

Each of the two operating systems is simpler than a single operating system would be. EOS can concern itself mainly with resource allocation policy and high-level virtual resources, while KOS can concern itself with low-level virtual resources and hardware control.

Because each operating system is simpler, it is easier to verify that each system's components are performing correctly, and the two systems are therefore more dependable than a single system.

Dividing Operating System 40102 makes it easier to implement different embodiments of CS 10110. Only the interface provided by EOS is visible to the user, and consequently, the user interface to the system can be changed without altering KOS. In fact, a single CS 10110 may have a number of EOSs, and thereby present different interfaces to different users. Similarly, changes in the hardware affect the implementation of the KOS, but not the interface that KOS provides EOS. A given EOS can therefore run on more than one embodiment of CS 10110.

A divided operating system is more secure than a single operating system. Physical access to JP 10114 is provided solely by KOS, and consequently, KOS can ensure that users manipulate only those resources to which they have access rights.

All CSs 10110 will have the virtual resources defined by KOS, while the resources defined by EOS will vary from one CS 10110 to another and even within a single CS 10110. Consequently, the remainder of the discussion will concern itself with KOS.

The relationship between the KOS and the rest of CS 10110 is governed by four principles:

Only the KOS has access to the resources it controls. User calls to EOS may result in EOS calls to KOS, and S-language SINs may result in invocations of KOS microcode routines, but neither EOS nor user programs may directly manipulate resources controlled by KOS.

The KOS is passive. It responds to calls from the EOS, to microcode invocations, and to Event Signals, but it initiates no action on its own.

The KOS is invisible to all system users but the EOS. KOS does not affect the logical behavior of a Process 610 and is noticeable to users only with regard to the speed with which a Process 610 executes on CS 10110.

As discussed above, KOS manages both physical and virtual resources. The physical resources and some of the virtual resources are visible only within KOS; others of the virtual resources are provided to EOS. Each virtual resource has two main parts: a set of data bases that contain the virtual resource's state, and a set of routines that manipulate the virtual resource. The set of routines for a virtual resource are termed the resource's manager. The routines may be KOS Procedures 40308, or they may be KOS Microcode 40313. As mentioned, in some cases, KOS uses separate Processes 610 to manage the resources.

For the purposes of this specification, the resources managed by KOS fall into two main groups: those associated with objects, and those associated with Processes 610. In the following, first those resources associated with objects, and then those associated with Processes 610 are discussed.

Figure 404:
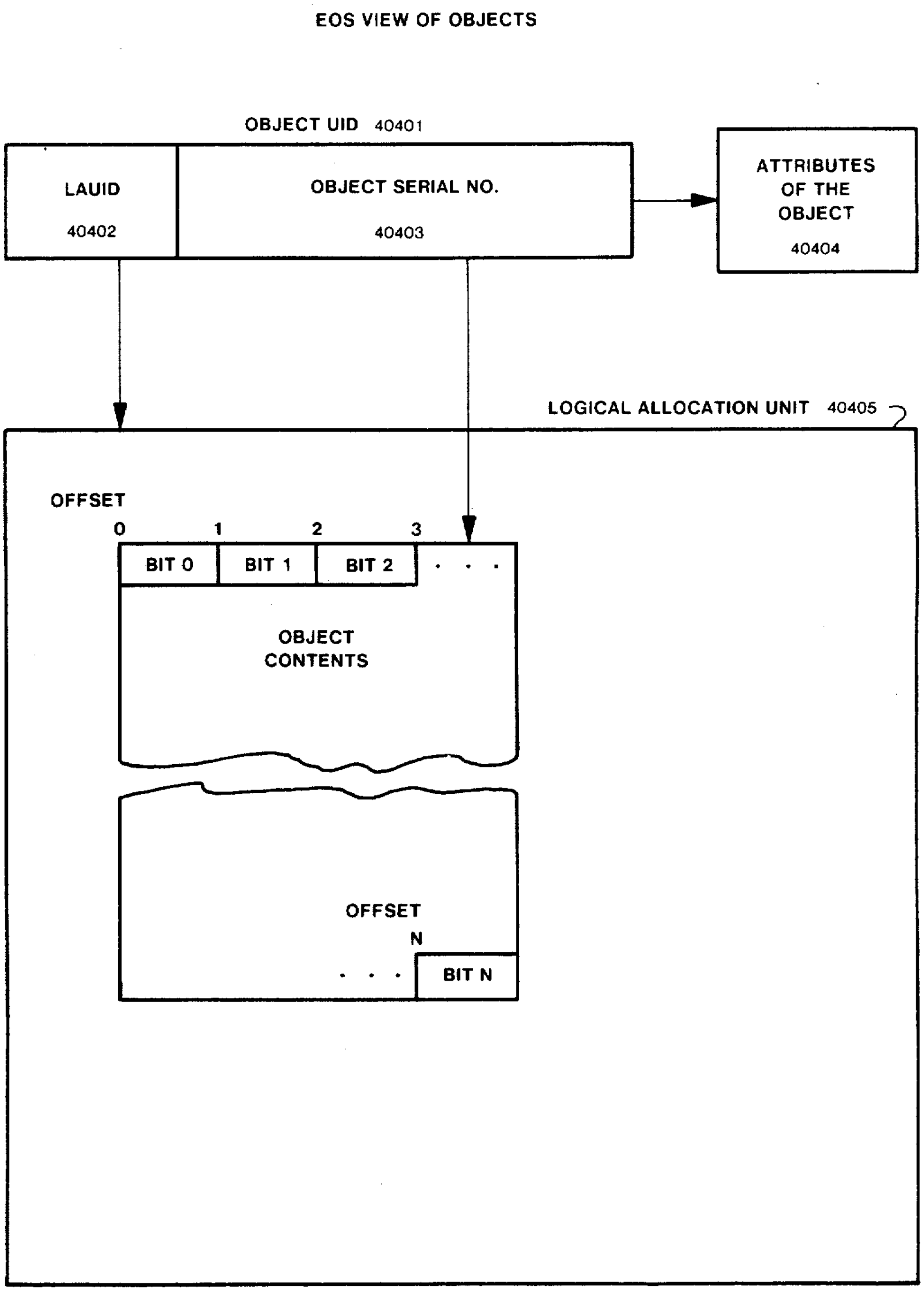
FIG. 404 is a diagram illustrating an EOS view of objects.

B. Objects and Object Management (FIG. 404)

The virtual resources termed objects are defined by KOS and manipulated by EOS and KOS. Objects as seen by EOS have five properties:

A single UID that identifies the object throughout the object's life and specifies what Logical Allocation Unit (LAU) the object belongs to.

A set of attributes that describe the object and limit access to it.

Bit-addressable contents. I the present embodiment, the contents may range from 0 to (2**32) - 1 bits in length. Any bit in the contents may be addressed by an offset.

Objects may be created.

Objects may be destroyed.

All of the data and Procedures 602 in a CS 10110 are contained in objects. Any Process 610 executing on a CS 10110 may use a UID-offset address to attempt to access data or Procedures 602 in certain objects on any CS 10110 accessible to the CS 10110 on which Process 610 is executing. The objects which may be thus accessed by any Process 610 are those having UIDs which are guaranteed unique for all present and future CS 10110. Objects with such unique UIDs thus form a single address space which is at least potentially accessible to any Process 610 executing on any CS 10110. As will be explained in detail later, whether a Process 610 can in fact access an object in this single address space depends on whether Process 610 has access rights to the object. Other objects, whose UIDs are not unique, may be accessed only by Processes 610 executing on CSs 10110 or groups of CSs 10110 for which the non-unique UID is in fact unique. No two objects accessible to a CS 10110 at a given time may have identical UIDs.

The following discussion of objects will first deal with objects as they are seen directly by EOS and indirectly by user programs, and then deal with objects as they appear to KOS.

FIG. 404 illustrates how objects appear to EOS. The object has three parts: the UID 40401, the Attributes 40404, and the Contents, 40406. The object's contents reside in a Logical Allocation Unit (LAU), 40405. UID 40401 has two parts: a LAU Identifier (LAUID) 40402 that indicates what LAU 40405 the object is on, and the Object Serial Number (OSN) 40403, which specifies the object in LAU 40405.

The EOS can create an object on a LAU 40405, and given the object's UID 40401, can destroy the object. In addition, EOS can read and change an object's Attributes 40404. Any Process 610 executing on a CS 10110 may reference information in an object by specifying the object's UID 40401 and the bit in the object at which the information begins. At the highest level, addresses in CS 10110 thus consist of a UID 40401 specifying an object and an offset specifying the number of bits into the object at which the information begins. As will be explained in detail below, KOS translates such UID-offset addresses into intermediate forms called AON-offset addresses for use in JP 10114 and into page number-displacement addresses for use in referencing information which has been copied into MEM 10112.

The physical implementation and manipulation of objects is restricted solely to KOS. For instance, objects and their attributes are in fact stored in Secondary Storage 10124. When a program references a portion of an object, KOS copies that portion of the object from Secondary Storage 10124 into MEM 10112, and if the portion in MEM 10112 is changed, updates the copy of the object in Secondary Storage 10124. EOS and user programs cannot control the location of an object in Secondary Storage 10124 or the location of the copy of a portion of an object in MEM 10112, and therefore can access the object only by means of KOS.

Figure 405:
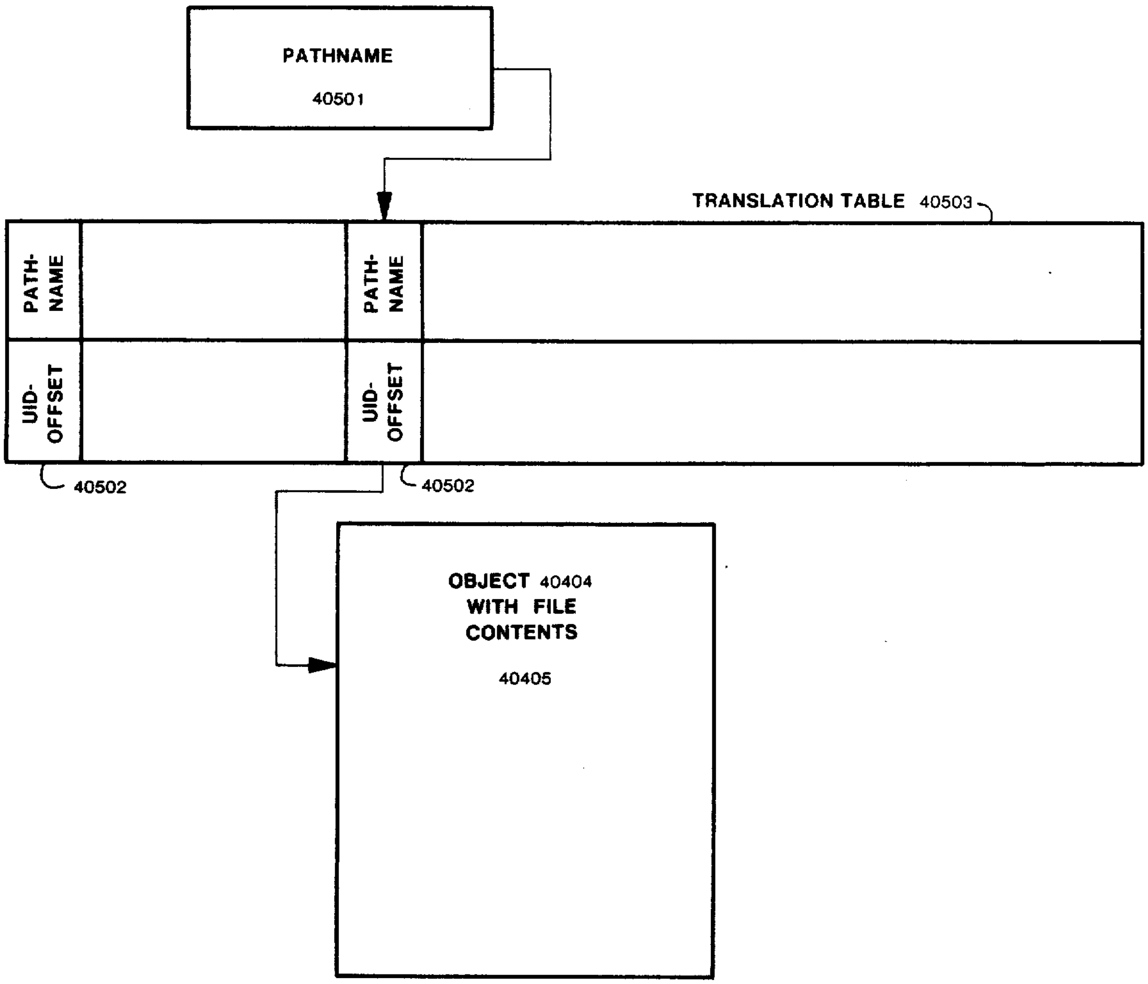
FIG. 405 is a diagram illustrating pathnames to universal identifier translation.

While EOS cannot control the physical implementation of an object, it can provide KOS with information that allows KOS to manage objects more effectively. Such information is termed hints. For instance, KOS generally copies a portion of an object into MEM 10112 only if a Process 610 references information in the object. However, EOS schedules Process 610 execution, and therefore can predict that certain objects will be required in the near future. EOS can pass this information on to KOS, and KOS can use the information to decide what portions of objects to copy into MEM 10112.

a. Objects and User Programs (FIG. 405)

As stated above, user programs manipulate objects, but the objects are generally not directly visible to user programs. Instead, user programs use symbols such as variable names or other references to refer to data stored in objects or file names to refer to the objects themselves. The discussion of Namespace has already illustrated how CS 10110 compilers translate variable names appearing in statements in Procedures 602 into Names, i.e., indexes of NTEs 30401, how Name Resolve microcode resolves NTE 30401 into Logical Descriptors 27116, and how ATU 10228 translates Logical Descriptors 27116 into locations in MEM 10112 containing copies of the portions of the objects in which the data represented by the variables resides.

The translation of filenames to UIDs 40401 is accomplished by EOS. EOS maintains a filename translation table which establishes a relationship between a system filename called a Pathname and the UID 40401 of the object containing the file's data, and thereby associates the Pathname with the object. A Pathname is a sequence of ASCII characters which identifies a file to a user of CS 10110. Each pathname in a given CS 10110 must be unique. FIG. 405 shows the filename translation table. Referring to that figure, when a user gives Pathname 40501 to the EOS, EOS uses Filename Translation Table 40503 to translate Pathname 40501 into UID 40401 for object 40504 containing the file. An object in CS 10110 may thus be identified in two ways: by means of its UID 40401 or by means of a Pathname 40501.

While an object has only a single UID 40401 throughout its life, the object may have many Pathnames 40501. All that is required to change an object's Pathname 40501 is the substitution of one Pathname 40501 for another in the object's Entry 40502 in Filename Translation Table 40503. One consequence of the fact that an object may have different Pathnames 40501 during its life is that when a program uses a Pathname 40501 to identify an object, a user of CS 10110 may make the program process a different object simply by giving the object which formerly had Pathname 40501 which appears in the program a new Pathname 40501 and giving the next object to be processed the Pathname 40501 which appears in the program.

Figure 406:
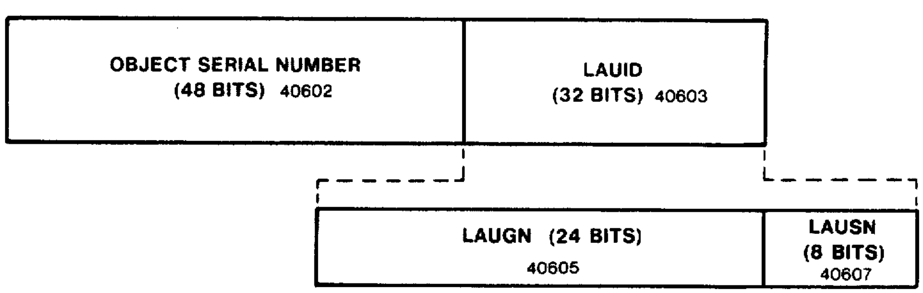
FIG. 406 is a diagram illustrating universal identifier detail.

In the present embodiment, an object may contain only a single file, and consequently, a Pathname 40501 always refers to an entire object. In other embodiments, a Pathname 40501 may refer to a portion of an object, and in such embodiments, Filename Translation Table 40503 will associate a Pathname 40501 with a UID-offset address specifying the beginning of the file.

b. UIDs 40401 (FIG. 406)

UIDs 40401 may identify objects and other entities in CS 10110. Any entity identified by a UID 40401 has only a single UID throughout its life. FIG. 406 is a detailed representation of a CS 10110 UID 40401. UID 40401 is 80 bits long, and has two fields. Field 40402, 32 bits long, is the Logical Allocation Unit Identifier (LAUID). It specifies LAU 40405 containing the object. LAUID 40402 is further subdivided into two subfields: LAU Group Number (LAUGN) 40607 and LAU Serial Number (LAUSN) 40605. LAUGN 40607 specifies a group of LAUs 40405, and LAUSN 40605 specifies a LAU 40405 in that group. Purchasers of CS 10110 may obtain LAUGNs 40607 from the manufacturer. The manufacturer guarantees that he will assign LAUGN 40607 given the purchaser to no other CS 10110, and thus these LAUGNs 40607 may be used to form UIDs 40401 which will be unique for all CSs 10110. Field 40604, 48 bits long, is the Object Serial Number (OSN). It specifies the object in LAU 40405.

UIDs 4O4O1 are generated by KOS Procedures 602. There are two such Procedures 602, one which generates UIDs 40401 which identify objects, and another which generates UIDs 40401 which identify other entities in CS 10110. The former Procedure 602 is called Generate Object UID, and the latter Generate Non-object UID. The Generate Object UID Procedure 602 is called only by the KOS Create Object Procedure 602. Create Object Procedure 602 provides Generate Object UID Procedure 602 with a LAUID 40402, and Generate Object UID Procedure 602 returns a UID 40401 for the object. In the present embodiment, UID 40401 is formed by taking the current value of the architectural clock, contained in a location in MEM 10112, forming an OSN 40403 from the architectural clock's current value, and concatenating OSN 40403 to LAUID 40402.

Generate Non-object UID Procedure 602 may be invoked by EOS to provide a UID 40401 which does not specify an object. Non-object UIDs 40401 may be used in CS 10110 wherever a unique label is required. For example, as will be explained in detail later, all Virtual Processors 612 which are available to CS 10110 have non-object UIDs 40401. All such non-object UIDs 40401 have a single LAUSN 40607, and thus, EOS need only provide a LAUGN 40605 as an argument. Generate Non-object UID Procedure 602 concatenates LAUGN 40605 with the special LAUSN 40607, and LAUID 40402 thus produced with an OSN 40403 obtained from the architectural clock. In other embodiments, OSNs 40403 for both object and non-object UIDs 40401 may be generated by other means, such as counters.

CS 10110 also has a special UID 40401 called the Null UID 40401. The Null UID 40401 contains nothing but 0 bits, and is used in situations which require a UID value which cannot represent an entity in CS 10110.

c. Object Attributes

What a program can do with an object is determined by the object's Attributes 40404. There are two kinds of Attributes 40404: Object Attributes and Control Attributes. Object Attributes describe the object's contents; Control Attributes control access to the object. Objects may have Attributes 40404 even though they have no Contents 40406, and in some cases, objects may even exist solely for their Attributes 40404.

For the purposes of this discussion, there are two kinds of Object Attributes: the Size Attribute and the Type Attributes.

An object's Size Attribute indicates the number of bits that the object currently contains. On each reference to an object's Contents 40406, KOS checks to make sure that the data accessed does not extend beyond the end of the object. If it does, the reference is aborted.

The Type Attributes indicate what kind of information the object contains and how that information may be used. There are three categories of Type Attributes: the Primitive Type Attributes, the Extended Type Attribute, and the Domain of Execution attribute. An object's Primitive Type Attribute indicates whether the object is a data object, a Procedure Object 608, an Extended Type Manager, or an S-interpreter. As their names imply, data objects contain data and Procedure Objects 608 contain Procedures 602. Extended Type Managers (ETMs) are a special type of Procedure Object 608 whose Procedures 608 may perform operations solely on objects called Extended Type Objects. Extended Type Objects (ETOs) are objects which have an Extended Type Attribute in addition to their Primitive Type Attribute; for details, see the discussion of the Extended Type Attribute below. S-interpreters are objects that contain interpreters for S-languages. In the present embodiment, the interpreters consist of dispatch tables and microcode, but in other embodiments, the interpreters may themselves be written in high-level languages. Like the Length Attribute, the Primitive Type Attributes allow KOS to ensure that a program is using an object correctly. For instance, when the KOS executes a call for a Procedure 602 it checks whether the object specified by the call is a Procedure Object 608. If it is not, the call fails.

d. Attributes and Access Control

The remaining Object Attributes and the Control Attributes are all part of CS 10110's Access Control System. The Access Control System is discussed in detail later; here, it is dealt with only to the extent required for the discussion of objects. In CS 10110, an access of an object occurs when a Process 610 fetches SINs contained in a Procedure Object 608, reads data from an object, writes data to an object, or in some cases, when Process 610 transfers control to a Procedure 602. The Access Control System checks whether a Process 610 has the right to perform the access it is attempting. There are two kinds of access in CS 10110, Primitive Access and Extended Access. Primitive Access is access which the Access Control System checks on every reference to an object by a Process 610; Extended Access is access that is checked only on user request. Primitive access checks are performed on every object; extended access checks may be performed only on ETOs, and may be performed only by Procedures 602 contained in ETMs.

The means by which the Access Control System checks a Process 610's access to an object are Process 610's subject and the object's Access Control Lists (ACLs). Each Process 610 has a subject made up of four UIDs 40401. These UIDs 40401 specify the following:

- The user for whom Process 610 was created. This UID 40401 is termed the principal component of the subject.
- Process 610 itself. This UID 40401 is termed the process component.
- The domain in which Process 610 is currently executing. This UID 40401 is termed the domain component.
- A user-defined subgroup of subjects. This UID 40401 is termed the tag component.

A domain is a group of objects which may potentially be accessed by any Process 610 which is executing a Procedure 602 in one of a group of Procedure Objects 608 or ETMs. Each Procedure Object 608 or ETM has a Domain of Execution (DOE) Attribute. This attribute is a UID 40401, and while a Process 610 is executing a Procedure 602 in that Procedure Object 608 or ETM, the DOE attribute UID 40401 is the domain component in Process 610's subject. The DOE attribute thus defines a group of objects which may be accessed by a Process 610 executing Procedures 602 from Procedure Object 608. The group of objects is called Procedure Object 608's domain. As may be seen from the above definition, a subject's domain component may change on any call to or return from a Procedure 602. The tag component may change whenever the user desires. The principal component and the process component, on the other hand, do not change for the life of Process 610.

The ACLs which make up the other half of the Access Control System are attributes of objects. Each ACL consists of a series of Entries (ACLE), and each ACLE has two parts: a Subject Template and a set of Access Privileges. The Subject Template defines a group of subjects, and the set of Access Privileges define the kinds of access that subjects belonging to the group have to the object. To check whether an access to an object is legal, the KOS examines the ACLs. It allows access only if it finds an ACLE whose Subject Template matches the current subject of Process 610 which wishes to make the access and whose set of Access Privileges includes the kind of access desired by Process 610. For example, a Procedure Object 608 may have an ACL with two entries: one whose Subject Template allows any subject access, and whose set of Access Privileges allows only Execute Access, and another whose Subject Template allows only a single subject access and whose set of Access Privileges allows Read, Write, and Execute Access. Such an ACL allows any user of CS 10110 to execute the Procedures 602 in Procedure Object 608, but only a specified Process 610 belonging to a specified user and executing a specified group of Procedures 602 may examine or modify the Procedures 602 in the Procedure Object 608.

There are two kinds of ACLs. All objects have Primitive Access Control Lists (PACLs); ETOs may in addition have Extended Access Control Lists (EACLs). The subject portion of the ACLE is the same in all ACLs; the two kinds of list differ in the kinds of access they control. The access controlled by the PACL is defined by KOS and is checked by KOS on every attempt to gain such access; the access controlled by the EACL is defined by the user and is checked only when the user requests KOS to do so.

e. Implementation of Objects

Figure 407:
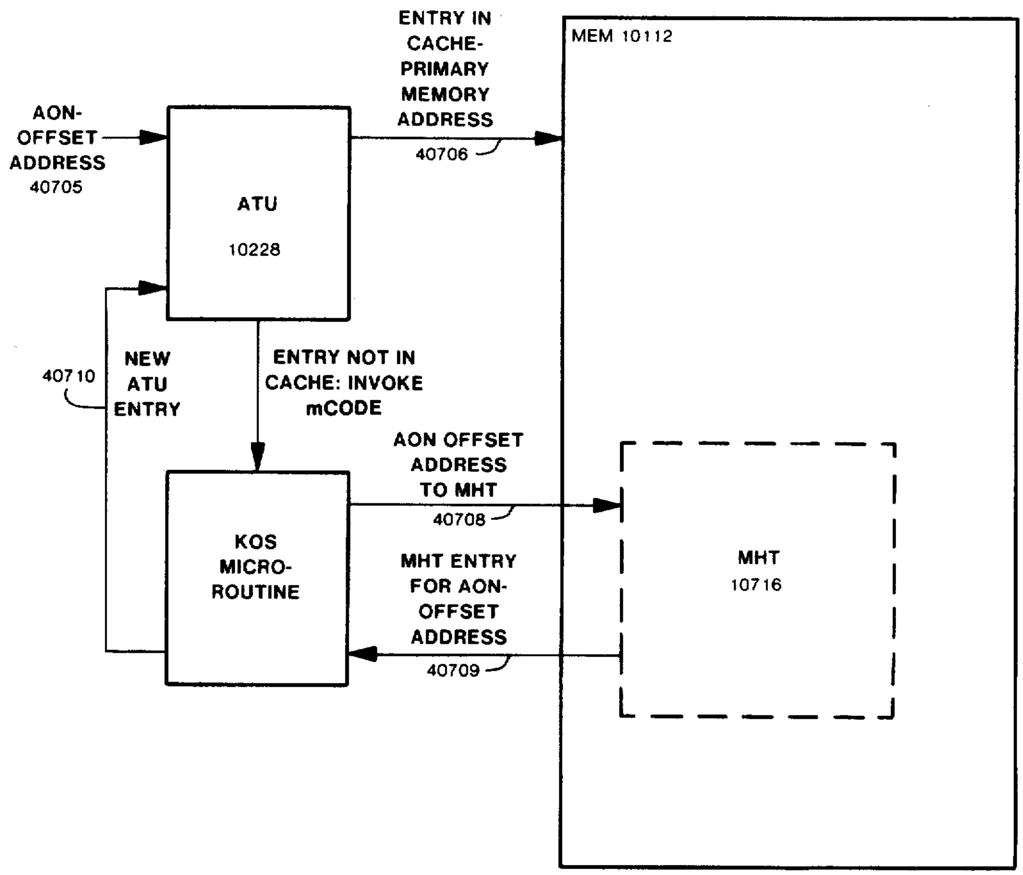
FIG. 407 is a diagram illustrating address translation with an address translation unit, a memory hash table, and a memory.
Figure 408:
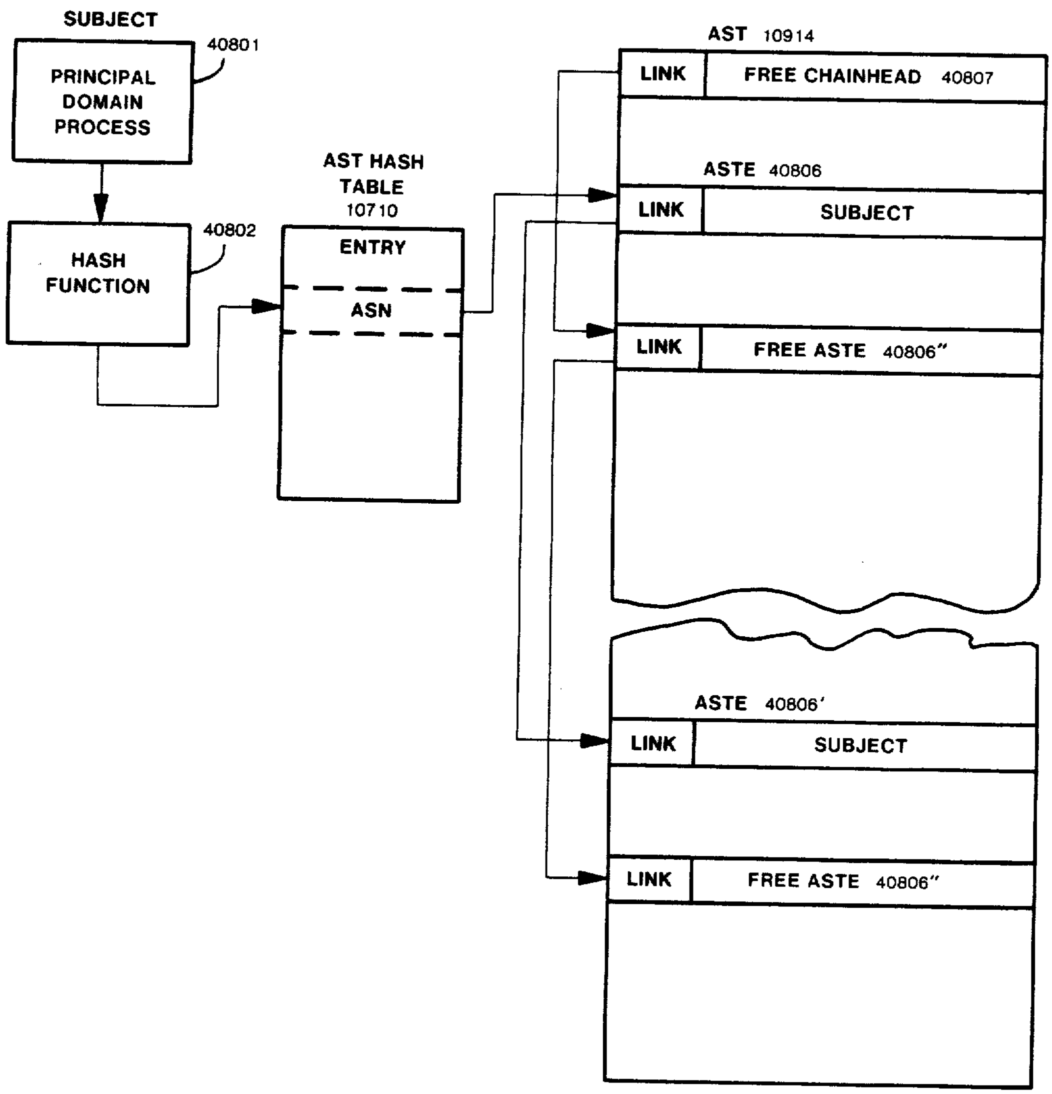

1. Introduction (FIGS. 407, 408)

The user of a CS 10110 need only concern himself with objects as they have just been described. In order for a Process 610 to reference an object, the object's LAU 40405 must be accessible from CS 10110 upon which Process 610 is running, Process 610 must know the object's UID 40401, and Process 610's current subject must have the right to access the object in the desired manner. Process 610 need know neither how the object's Contents 40406 and Attributes 40404 are stored on CS 10110's physical devices nor the methods CS 10110 uses to make the object's Contents 40406 and Attributes 40404 available to Process 610.

The KOS, on the other hand, must implement objects on the physical devices that make up CS 10110. In so doing, it must take into account two sets of physical limitations:

In logical terms, all CSs 10110 have a single logical memory, but the physical implementation of memory in the system is hierarchical: a given CS 10110 has rapid access to a relatively small MEM 10112, much slower access to a relatively large amount of slow Secondary Storage 10124, and very slow access to LAUs 40405 on other accessible CSs 10110.

UIDs 40401, and even more, subjects, are too large to be handled efficiently on JP 10114's internal data paths and in JP 10114's registers.

The means by which the KOS overcomes these physical limitations will vary from embodiment to embodiment. Here, there are presented first an overview and then a detailed discussion of the means used in the present embodiment.

The physical limitations of the memory are overcome by means of a Virtual Memory system. The Virtual Memory System creates a one-level logical memory by automatically bringing copies of those portions of objects required by executing Processes 610 into MEM 10112 and automatically copying altered portions of objects from MEM 10112 back to Secondary Storage 10124. Objects thus reside primarily in Secondary Storage 10124, but copies of portions of them are made available in MEM 10112 when a Process 610 makes a reference to them. Besides bringing portions of objects into MEM 10112, when required, the Virtual Memory System keeps track of where in MEM 10112 the portions are located, and when a Process 610 references a portion of an object that is in MEM 10112, the Virtual Memory System translates the reference into a physical location in MEM 10112.

JP 10114's need for smaller object identifiers and subject identifiers is satisfied by the use of internal identifiers called Active Object Numbers (AONs) and Active Subject Numbers (ASNs) inside JP 10114. Each time a UID 40401 is moved from MEM 10112 into JP 10114's registers, it is translated into an AON, and the reverse translation takes place each time an AON is moved from a JP 10114's registers to MEM 10112. Similarly, the current subjects of Processes 610 which are bound to Virtual Processors 612 are translated from four UIDs 40401 into small integer ASNs, and when Virtual Processor 612 is bound to JP 10114, the ASN for the subject belonging to Virtual Processor 612's Process 610 is placed in a JP 10114 register. The translations from UID 40401 to AON and vice-versa, and from subject to ASN are performed by KOS.

When KOS translates UIDs 40401 to AONs and vice-versa, it uses AOT 10712. An AOT 10712 Entry (AOTE) for an object contains the object's UID 40401, and the AOTE's index in AOT 10712 is that object's AON. Thus, given an object's AON, KOS can use AOT 10712 to determine the object's UID 40401, and given an obect's UID 40401, KOS can use AOT 10712 to determine the object's AON. If the object has not been referenced recently, there may be no AOTE for the object, and thus no AON for the object's UID 40401. Objects that have no AONs are called inactive objects. If an attempt to convert a UID 40401 to an AON reveals that the object is inactive, an Inactive Object Fault results and KOS must activate the object, that is, it must assign the object an AON and make an AOTE for it.

KOS uses AST 10914 to translate subjects into ASN's. When a Process 610's subject changes, AST 10914 provides Process 610 with the new subject's ASN. A subject may presently have no ASN associated with it. Such subjects are termed inactive subjects. If a subject is inactive, an attempt to translate the subject to an ASN causes KOS to activate the subject, that is, to assign the subject an ASN and make an entry for the subject in AST 10914.

In order to achieve efficient execution of programs by Processes 610, KOS accelerates information that is frequently used by executing Processes 610. There are two stages of acceleration:

Tables that contain the information are wired into MEM 10112, that is, the Virtual Memory System never uses MEM 10112 space reserved for the tables for other purposes.

Special hardware devices in JP 10114 contain portions of the information in the tables.

MHT 10716, AOT 10712, and AST 10914 are examples of the first stage of acceleration. As previously mentioned, these tables are always present in MEM 10112. Address Translation Unit (ATU) 10228 is an example of the second stage. As previously explained, ATU 10228 is a hardware cache that contains copies of the most recently used MHT 10716 entries. Like MHT 10716, it translates AON offset addresses into the MEM 10112 locations that contain copies of the data that the UID-offset address corresponding to the AON-offset address refers to. ATU 10228 is maintained by KOS Logical Address Translation (LAT) microcode.

FIG. 407 shows the relationship between ATU 10228, MEM 10112, MHT 10716, and KOS LAT microcode 40704. When JP 10114 makes a memory reference, it passes AON-offset Address 40705 to ATU 10228. If ATU 10228 contains a copy of MHT 10716's entry for Address 40705, it immediately produces the corresponding MEM 10112 Address 40706 and transmits the address to MEM 10112. If there is no copy, ATU 10228 produces an ATU Miss Event Signal which invokes LAT microcode 40704 in JP 10114. LAT microcode 40704 obtains the MHT entry that corresponds to the AON-offset address from MHT 10716, places the entry in ATU 10228, and returns. JP 10114 then repeats the reference. This time, there is an entry for the reference, and ATU 10228 translates the AON address into the address of the copy of the data contained in MEM 10112.

The relationship between KOS table, hardware cache, and microcode just described is typical for the present embodiment of CS 10110. The table (in this case, MHT 10716), is the primary source of information and is maintained by the Virtual Memory Manager Process, while the cache accelerates portions of the table and is maintained by KOS microcode that is invoked by event signals from the cache.

AOT 10712, AST 10914, and MHT 10716 share another characteristic that is typical of the present embodiment of CS 10110: the tables are constructed in such a fashion that the table entry that performs the desired translation is located by means of a hash function and a hash table. The hash function translates the large UID 40401, subject, or AON into a small integer. This integer is the index of an entry in the hash table. The contents of the hash table entry is an index into AOT 10712, AST 10914, or MHT 10716, as the case may be, and these tables are maintained in such a fashion that the entry corresponding to the index provided by the hash table is either the entry that can perform the desired translation or contains information that allows KOS to find the desired entry. The entries in the tables furthermore contain the values they translate. Consequently, KOS can hash the value, find the entry, and then check whether the entry is the one for the hashed value. If it is not, KOS can quickly go from the entry located by the hash table to the correct entry.

FIG. 408 shows how hashing works in AST 10914 in the present embodiment. In the present embodiment, Subject 40801, i.e., the principal, process, and domain components of the current subject, are input into Hash Function 40802. Hash Function 40802 produces the index of an entry in ASTHT 10710. ASTHT Entry 40504 in turn contains the index of an Entry (ASTE) 40806 in AST 10914 These ASTE 40806 indexes are ASNs. ASTE 40806 contains the principal, process, and domain components of some subject and a link field pointing to ASTE 40806'. ASTE 40806' has 0 in its link field, which indicates that it is the last link in the chain of ASTES begining with ASTE 40806. If the hashing of a subject yields ASTE 40806, KOS compares the subject in ASTE 40806 with the hashed subject; if they are identical, ASTE 40806's index in AST 10914 is the subject's ASN. If they are not identical, KOS uses the link in ASTE 40806 to find ASTE 40806'. It compares the subject in ASTE 40806' with the hashed subject; if they are identical, ASTE 40806''s AST index is the subject's ASN; otherwise, ASTE 40806' is the last entry in the chain, and consequently, there is no ASTE 40806 and no ASN for the hashed subject.

In the following, we will discuss the implementation of objects in the present embodiment in detail, beginning with the implementation of objects in Secondary Storage 10124 and proceeding then to CS 10110's Active Object Management System, the Access Control System, and the Virtual Memory System.

Figure 410:
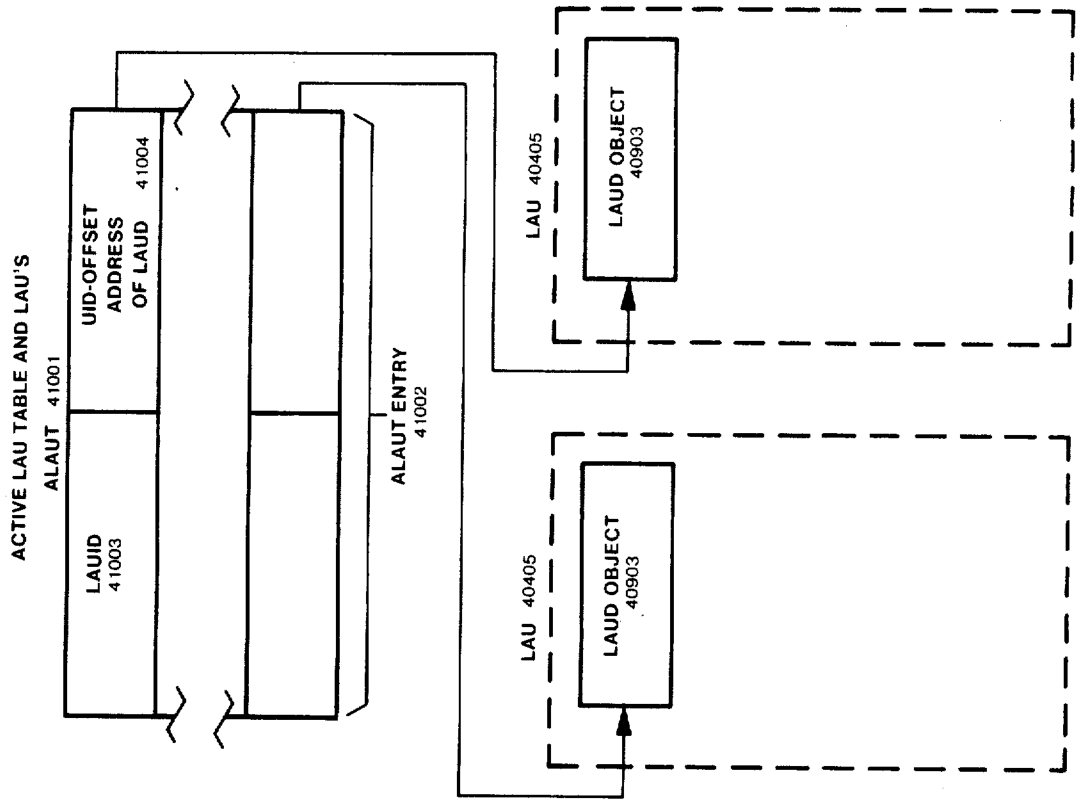
Figure 409:
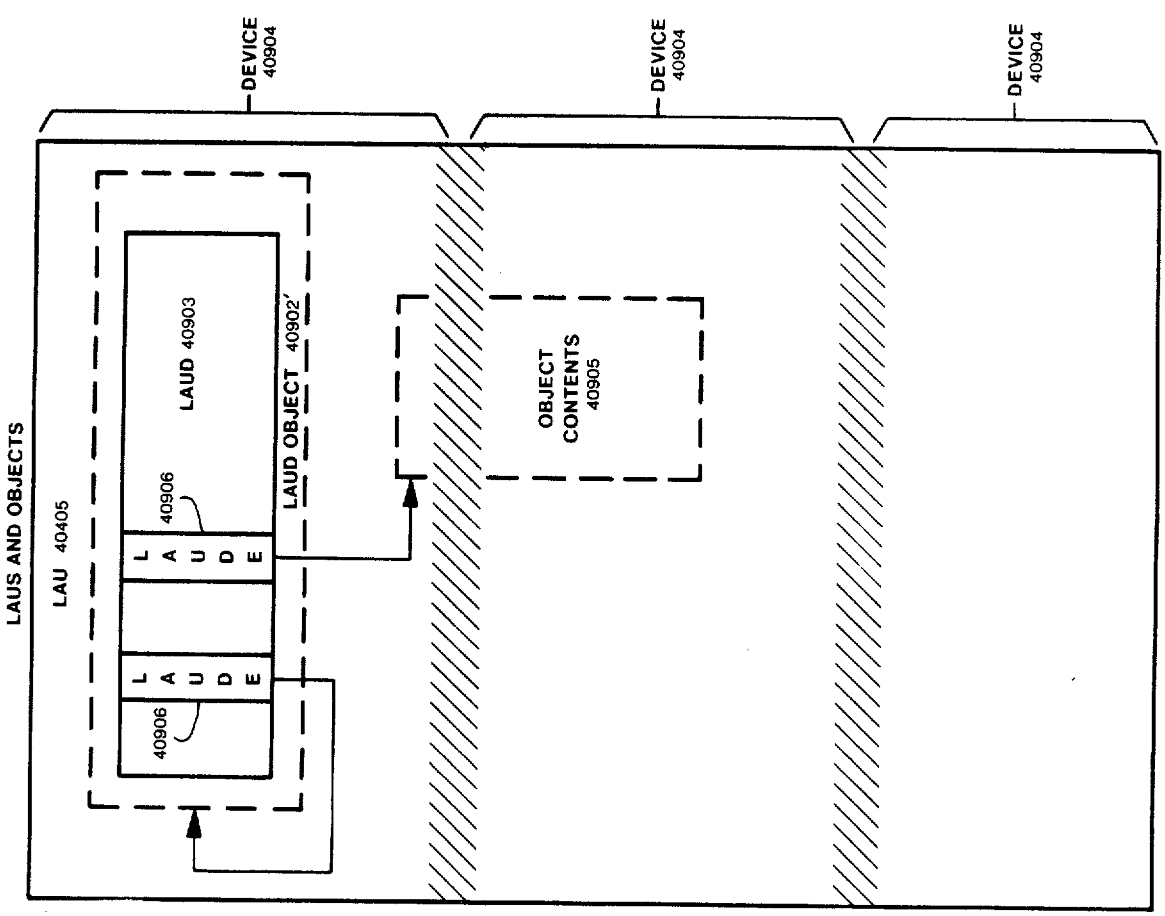

2. Objects in Secondary Storage 10124 (FIGS. 409, 410)

As described above, objects are collected into LAUs 40405. The objects belonging to a LAU 40405 are stored in Secondary Storage 10124. Each LAU 40405 contains an object whose contents are a table called the Logical Allocation Unit Directory (LAUD). As its name implies, the LAUD is a directory of the objects in LAU 40405. Each object in LAU 40405, including the object containing the LAUD, has an entry in the LAUD. FIG. 409 shows the relationship between Secondary Storage 10124, LAU 40405, the LAUD, and objects. LAU 40405 resides on a number of Storage Devices 40904. LAUD Object 40902' in LAU 40405 contains LAUD 40903. Two LAUDEs 40906 are shown. One contains the attributes of LAUD Object 40902 and the location of its contents, and the other contains the attributes of LAUD Object 40902' containing LAUD 40903 and the location of its contents.

KOS uses a table called the Active LAU Table (ALAUT) to locate the LAUD belonging to LAU 40405. FIG. 410 illustrates the relationship between ALAUT 41001, ALAUT Entries 41002, LAUs 40405, and LAUD Objects 40902'. Each LAU 40405 accessible to CS 10110 has an Entry (ALAUTE) 41002 in ALAUT 41001. ALAUTE 41002 for LAU 40405 includes LAU 40405's LAUID 40402 and UID 40401 of LAU 40705's LAUD Object 40902'. Hence, given an object's UID 40401, KOS can use UID 40401's LAUID 40402 to locate ALAUTE 41002 for the object's LAU 40405, and can use ALAUTE 41002 to locate LAU 40405's LAUD 40903. Once LAUD 40903 has been found, OSN portion 40402 of the object's UID 40401 provides the proper LAUDE 40906, and LAUDE 40906 contains object's attributes and the location of its contents.

LAUD 40903 and the Procedures 602 that manipulate it belong to a part of KOS termed the Inactive Object Manager. The following discussion of the Inactive Object Manager will begin with the manner in which an object's contents are represented on Secondary Storage 10124, will then discuss LAUD 40903 in detail, and conclude by discussing the operations performed by Inactive Object Manager Procedures 602.

a.a. Representation of an Object's Contents on Secondary Storage 10124

In general, the manner in which an object's contents are represented on Secondary Storage 10124 depends completely on the Secondary Storage 10124. If a LAU 40405 is made up of disks, then the object's contents will be stored in disk blocks. As long as KOS can locate the object's contents, it makes no difference whether the storage is contiguous or non-contiguous.

In the present embodiment, the objects' contents are stored in files created by the Data General Advanced Operating System (AOS) procedures executing on IOS 10116. These procedures manage files that contain objects' contents for KOS. In future CSs 10110, the representation of an object's contents on Secondary Storage 10124 will be managed by a portion of KOS.

b.b. LAUD 40903 (FIGS. 411, 412)

Figure 411:
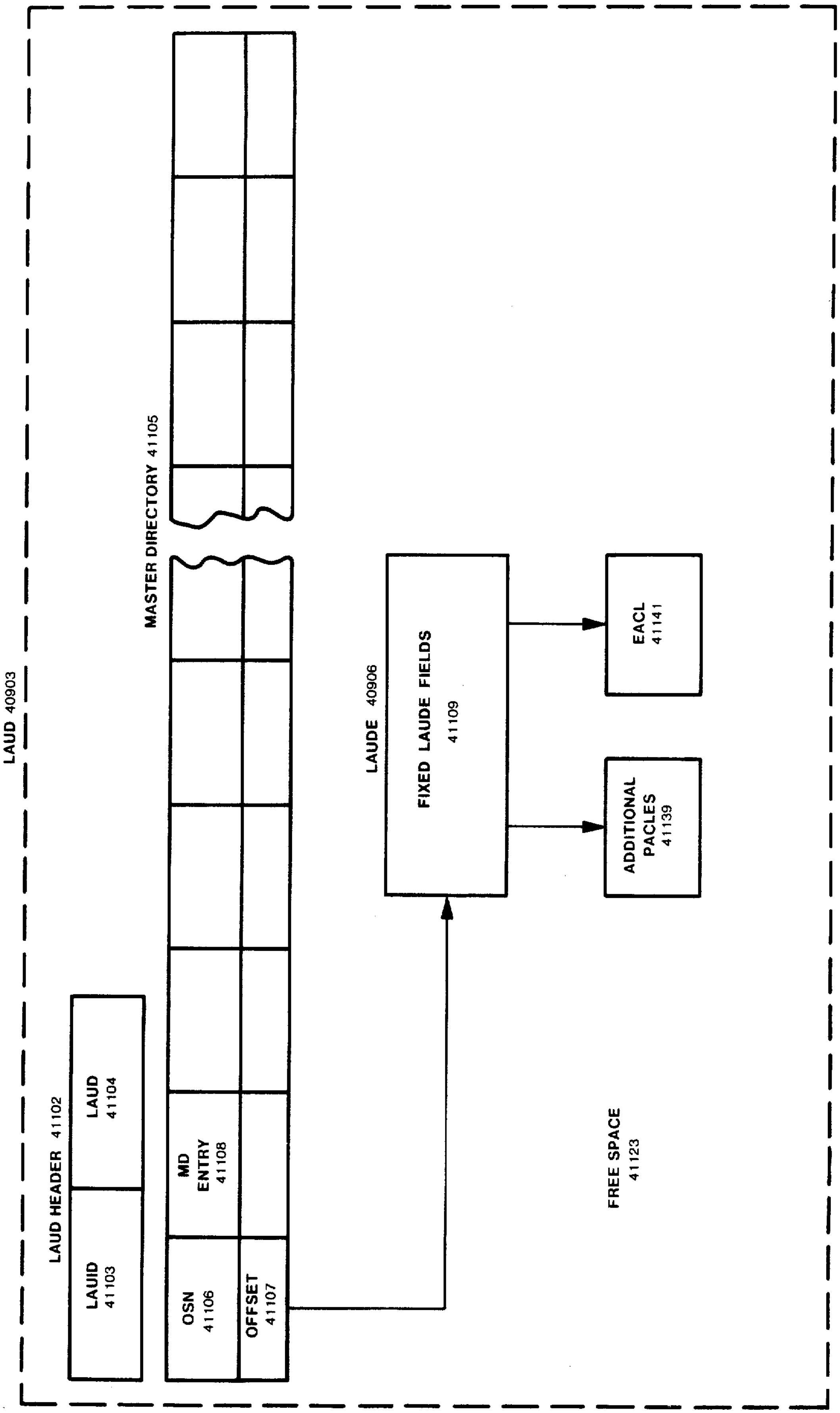
Figure 412:
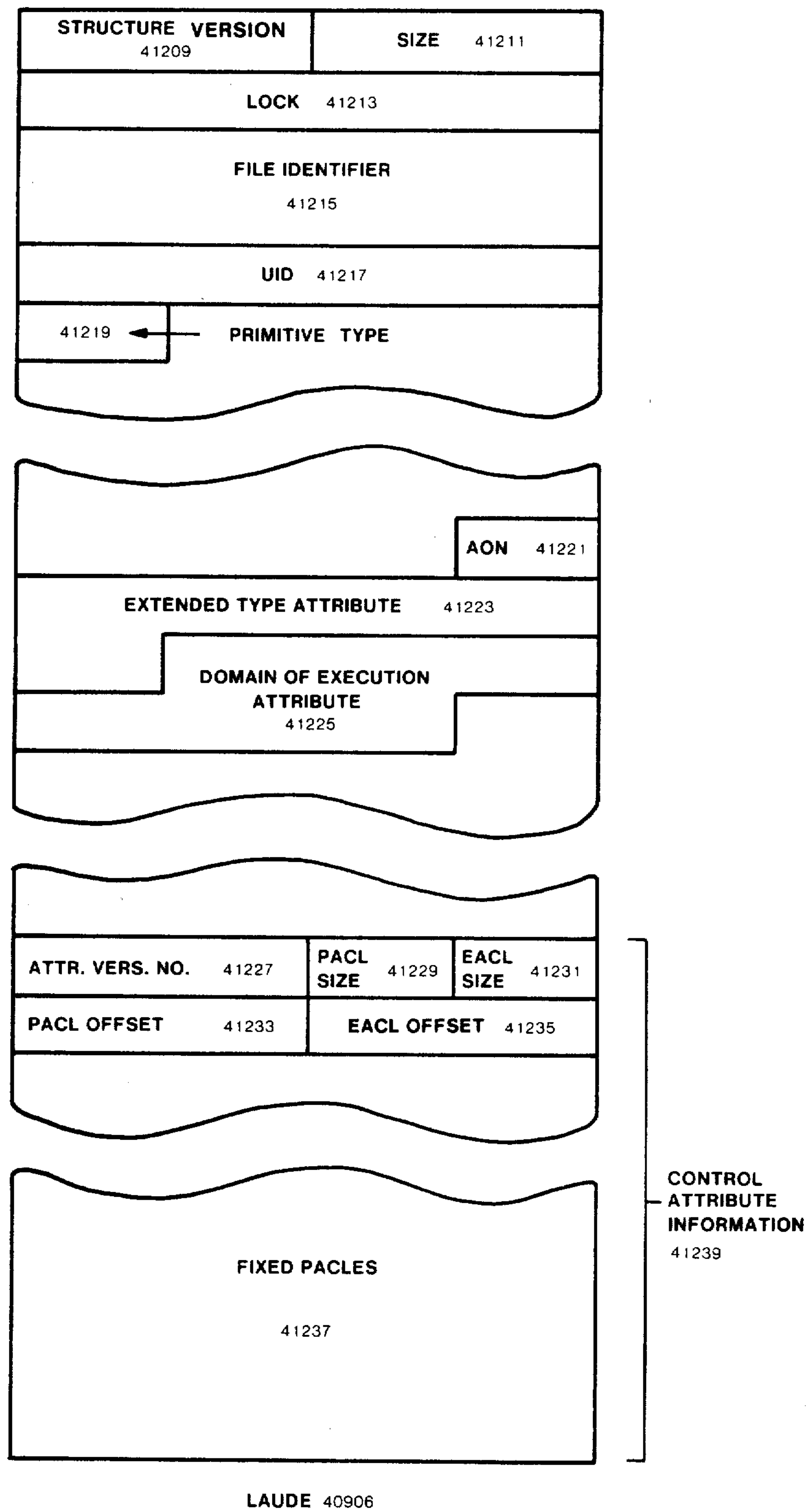

FIG. 411 is a conceptual illustration of LAUD 40903. LAUD 40903 has three parts: LAUD Header 41102, Master Directory 41105, and LAUD Entries (LAUDEs) 40906. LAUD Header 41102 and Master Directory 41105 occupy fixed locations in LAUD 40903, and can therefore always be located from the UID 40401 of LAUD 40903 given in ALAUT 41001. The locations of LAUDEs 40906 are not fixed, but the entry for an individual object can be located from Master Directory 41105.

Turning first to LAUD Header 41102, LAUD Header 41102 contains LAUID 40402 belonging to LAU 40405 to which LAUD 40903 belongs and OSN 40403 of LAUD 40903. As will be explained in greater detail below, KOS can use OSN 40403 to find LAUDE 40906 for LAUD 40903.

Turning now to Master Directory 41105, Master Directory 41105 translates an object's OSN 40403 into the location of the object's LAUDE 40906. Master Directory 41105 contains one Entry 41108 for each object in LAU 40505. Each Entry has two fields: OSN Field 41106 and Offset Field 41107. OSN Field 41106 contains OSN 40403 for the object to which Entry 41108 belongs; Offset Field 41107 contains the offset of the object's LAUDE 40906 in LAUD 40903. KOS orders Entries 41108 by increasing OSN 40403, and can therefore use binary search means to find Entry 41108 containing a given OSN 40403. Once Entry 41108 has been located, Entry 41108's Offset Field 41107, combined with LAUD 40903's OSN 40403, yields the UID-offset address of the object's LAUDE 40906.

Once KOS knows the location of LAUDE 40906 it can determine an object's Attributes 40404 and the location of its Contents 40406. FIG. 411 gives only an overview of LAUDE 40906's general structure. LAUDE 40906 has three components: a group of fields of fixed size 41109 that are present in every LAUDE 40906, and two variable-sized components, one, 41139, containing entries belonging to the object's PACL, and another, 41141, containing the object's EACL.

As the preceding descriptions of the LAUD's components imply, the number of LAUDEs 40906 and Master Direcory Entries 41108 varies with the number of objects in LAU 40405. Furthermore, the amount of space required for an object's EACL and PACL varies from object to object. KOS deals with this problem by including Free Space 41123 in each LAUD 40903. When an object is created, or when an object's ACLs are expanded, the Inactive Object Manager expands LAUD 40903 only if there is no available Free Space 41123; if there is Free Space 41123, the Inactive Object Manager takes the necessary space from Free Space 41123; when an object is deleted or an object's ACLs shortened, the Inactive Object Manager returns the unneeded space to Free Space 41123.

FIG. 412 is a detailed representation of a single LAUDE 40906. FIG. 412 presents those fields of LAUDE 40906 which are common to all embodiments of CS 10110; fields which may vary from embodiment to embodiment are ignored. Starting at the top of FIG. 412, Structure Version Field 41209 contains information by which KOS can determine which version of LAUDE 40906 it is dealing with. Size Field 41211 contains the Size Attribute of the object to which LAUDE 40906 belongs. The Size Attribute specifies the number of bits currently contained in the object. Lock Field 41213 is a KOS lock. As will be explained in detail in the discussion of Processes 610, Lock Field 41213 allows only one Process 610 to read or write LAUDE 40906 at a time, and therefore keeps one Process 610 from altering LAUDE 40906 while another Process 610 is reading LAUDE 40906. File Identifier 41215 contains a system identifier for the file which contains the Contents 40406 of the object to which LAUDE 40906 belongs. The form of File Identifier 41215 may vary from embodiment to embodiment; in the present embodiment, it is an AOS system file identifier. UID Field 41217 contains UID 40401 belonging to LAUDE 40906's object. Primitive Type Field 41219 contains a value which specifies the object's Primitive Type. The object may be a data object, a Procedure Object 608, an ETM, or an S-interpreter object. AON Field 41221 contains a valid value only when LAUDE 40906's object is active, i.e., has an entry in AOT 10712. AON Field 41221 then contains the object's AON. If the object is an ETO, Extended Type Attribute Field 41223 contains the UID 40401 of the ETO's ETM. Otherwise, it contains a Null UID 40401. Similarly, if the object is a Procedure Object 608 or an ETM, Domain of Execution Attribute Field 41225 contains the object's Domain of Execution Attribute.

The remaining parts of LAUDE 40906 belong to the Access Control System and will be explained in detail in that discussion. Attribute Version Number Field 41227 contains a value indicating which version of ACLEs this LAUDE 40906 contains, PACL Size Field 41229 and EACL Size Field 41231 contain the sizes of the respective ACLs, PACL Offset Field 41233 and EACL Offset Field 41235 contain the offsets in LAUD 40903 of additional PACLEs 41139 and EACLEs 41141, and fixed PACLEs 41237 contains the portion of the PACL which is always included in LAUDE 40906.

c.c. Operations on LAUD 40903

All operations on objects but reading or writing the object's Contents 40406 are operations on the information contained in the object's LAUDE 40906. The portion of KOS that performs these operations is called the Inactive Object Manager. Of course, the Inactive Object Manager also works with active objects. As mentioned above and explained in detail below, some of the information in an active object's LAUDE 40906 is copied into AOT 10712 and other KOS tables in MEM 10112 when the object is activated. This fact has two effects on the way that the Inactive Object Manager deals with active objects:

If the Inactive Object Manager is merely reading information in an active object's LAUDE 40906, it first looks for the information in the KOS tables.

If the Inactive Object Manager is altering information in the active object's LAUDE 40906, it first invalidates the information for the object contained in the KOS tables in MEM 10112 and in JP 10114 caches and then changes LAUDE 40906. By so doing, the inactive object manager assures that the information in the KOS tables and in JP 10114 caches is always identical with that contained in LAUDE 40906.

The Inactive Object Manager is implemented as a group of KOS Procedures 602. All of the Procedures 602 may be called directly by EOS, and in some cases, EOS makes Procedures 602 that call the KOS Inactive Object Manager Procedures 602 available to users, so that users may call the KOS Inactive Object Manager Procedures 602 indirectly. The Procedures 602 fall into three groups: those that create and delete objects, those that manipulate the object's LAUDE 40906, and those that provide hints and directives to the Virtual Memory Management System. The first two groups are discussed below; the third group is discussed with the Virtual Memory Management System.

a.a.a. Object Creation and Deletion

KOS Creates Object Procedure 602 creates an object by creating a LAUDE 40906 for the object. In the present embodiment, Create Object Procedure 602 also creates the AOS file that holds the object's Contents 40406. The invoker of the Create Object Procedure 602 provides Create Object Procedure 602 with a subject, a LAUID 40603, lists of attributes, and a variable for a status code. Create Object Procedure 602 returns a UID 40401 for the newly created object and a status code value.

The subject argument is termed the validation subject. The validation subject is the subject for whom Create Object Procedure 602 is being invoked. Note that the validation subject may be different from the subject that results from Create Object Procedure 602's invocation. Typically, a user Process 610 will invoke an EOS Create Object Procedure 602 and when EOS invokes KOS Create Object Procedure 602, it uses the user-process subject that invoked EOS Create Object Procedure 602 as the validation subject when it invokes KOS Create Object Procedure 602. The validation subject allows KOS to verify that the subject for which the object is being created has the access required to set the object's attributes as specified in the lists of attributes.

The LAUID argument is LAUID 40402 of LAU 40405 to which the newly-created object is to belong; the attribute lists are the attribute values for the new object's LAUDE 40906. If the attribute lists do not completely specify the attribute values, KOS Create Object Procedure 602 assigns default values to the attributes. If Create Object Procedure 602 can create an object, it returns the new object's UID 40401 and a status code value indicating that the creation succeeded; otherwise, it returns a status code value which indicates why the operation failed.

Delete Object Procedure 602 does so by deleting LAUDE 40906 for the object. However, before it can delete LAUDE 40906, it must cause any information about the object in KOS tables in MEM 10112 and in JP 10114 caches to be deleted, and must cause the file which contains the object in Secondary Storage 10124 to be deleted. As will be explained in detail later, Delete Object Procedure 602 causes KOS Processes 610 to perform these actions, and deletes LAUDE 40906 only after they are finished. Delete Object Procedure 602 takes a validation subject for which the object is to be deleted, the object's UID 40401, and a variable for the status code. If the operation fails, the status code value indicates why the deletion failed.

b.b.b. Reading and Changing an Object's Attributes

The KOS Read Object Attributes Procedure 602 receives a validation subject, an object's UID 40401, a data structure called an attribute record, and a status variable from the caller. Read Attributes Procedure 602 copies the object's Attributes 40404 into the attribute record. If an error occurs, the value of the status code indicates the kind of error.

KOS Set Object Attributes Procedure 602 has one argument more than Read Object Attributes Procedure 602. The validation subject and UID 40401 work as in that Procedure 602; the attribute record contains the changes that the caller wishes to make in the object's Attributes 40404. If there are errors, Set Object Attributes Procedure 602 returns a status code. The extra argument is an integer specifying the attribute version number. This argument is part of a mechanism to ensure that changes in an object's Attributes 40404 happen in the proper order. Each LAUDE 40906's attribute version number is contained in Field 41227 of LAUDE 40906. Each time KOS changes an object's Attributes 40404, it increments the integer in Field 41227 by 1. The routine that changes the object's Attributes 40404 may only do so if the attribute version number received as an argument to the routine is 0 or equal to the attribute version number in the LAUDE 40906. If the invoker of the routine does not care about the order in which changes to an object's Attributes 40404 occur, the invoker uses 0 as the attribute version number. If the invoker does care, he reads the object's Attributes 40404 to get the current attribute version number from LAUDE 40906 and then uses that value to calculate attribute version numbers for his invocations. For instance, if the invoker wants to change an object's Attributes 40404, perform an operation, and then change the object's Attributes 40404 again, and wants to be sure that other users of the system have not changed the object's Attributes 40404 between these changes, the invoker can get the current attribute version number and then increment it by 1 for the first change in the attributes and by 1 again for the second change. If any other user has changed Attributes 40404 between the first and second changes, KOS will have incremented the value in Field 41227 more than twice, the second attempt to change the attributes will have the wrong attribute version number, and the attempt will fail.

3. Active Objects (FIG. 413)

An active object is an object whose UID 40401 has an AON associated with it. In the present embodiment, each CS 10110 has a set of AONs. KOS associates these AONs with UIDs 40401 in such fashion that at any given moment, an AON in a CS 10110 represents a single UID 40401. Inside FU 10120, AONs are used to represent UIDs CS 10110. In the present embodiment, the AON is represented by 14 bits. A 112-bit UID-offset address (80 bits for UID 40401 and 32 for the offset) is thus represented inside FU 10120 by a 46-bit AON-offset address (14 bits for the AON and 32 bits for the offset).

A CS 10110 has far fewer AONs than there are UIDs 40401. KOS multiplexes a CS 10110's AONs among those objects that are being referenced by CS 10110 and therefore require AONs as well as UIDs 40401. While a given AON represents only a single UID 40401 at any given time, at different times, a UID 40401 may have different AONs associated with it.

Figure 413:
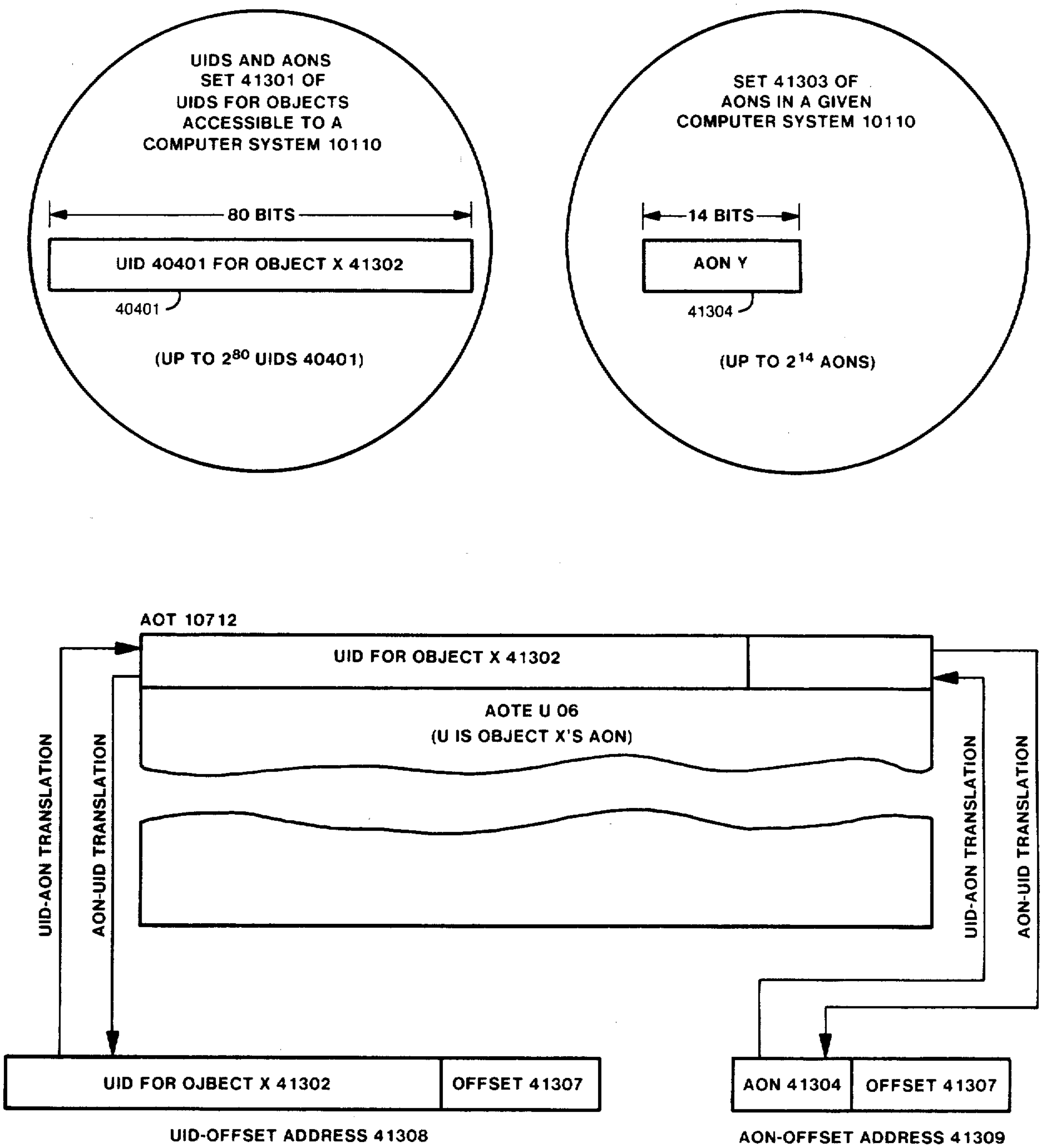

FIG. 413 provides a conceptual representation of the relationship between AONs and UIDs 40401. Each CS 10110 has potential access to 280 UIDs 40401. Some of these UIDs, however, represent entities other than objects, and others are never associated with any entity. Each CS 10110 also has a set of AONs 41303 available to it. In the present embodiment, this set may have up to 214 values. Since the AONS are only used internally, each CS 10110 may have the same set of AONs 41303. Any AON 41304 in set of AONs 41303 may be associated with a single UID 40401 in set of object UIDs 41301. At different times, an AON 41304 may be associated with different UIDs 40401.

As mentioned above, KOS associates AONs 41304 with UIDs 40401. It does so by means of AOT 10712. Each AOT entry (AOTE) 41306 in AOT 10712 associates a UID 40401 with an AON 41304. AON 41304 is the index of AOTE 41306 which contains UID 40401. Until AOTE 41306 is changed, the AON 41304 which is the index of AOTE 41306 containing UID 40401 represents UID 40401. AOT 10712 also allows UIDs 40401 to be translated into AONs 41303 and vice-versa. FIG. 413 illustrates the process for UID-offset Address 41308 and AON-offset Address 41309. AOTE 41306 associates AON 41304 in AON-offset Address 41309 with UID 40401 in UID-offset Address 41308, and Addresses 41308 and 41309 have the same Offset 41307. Consequently, AON-offset Address 41309 represents UID-offset Address 41308 inside JP 10114. Since both addresses use the same Offset, Address 41309 can be translated into address 41308 by translating Address 41309's AON 41304 into Address 41308's UID 40401, and Address 41308 can be translated into Address 41309 by the reverse process. In both cases, the translation is performed by finding the proper AOTE 41306.

The process by which an object becomes active is called object activation. A UID-offset Address 41308 cannot be translated into an AON-offset Address 41309 unless the object to which UID 40401 of UID-offset Address 41308 belongs is active. If a Process 610 attempts to perform such a translation using a UID 40401 belonging to an inactive object, an Inactive Object Fault occurs. KOS handles the fault by removing Process 610 that attempted the translation from JP 10114 until a special KOS Process called the Object Manager Process has activated the object. After the object has been activated, Process 610 may return to JP 10114 and complete the UID 40401 to AON 41304 translation.

The portion of KOS that manages active objects is called the Active Object Manager (AOM). Parts of the AOM are Procedures 602, and parts of it are microcode routines. The high-level language components of the AOM may be invoked only by KOS Processes 610. KOS Active Object Manager Process 610 performs most of the functions involved in active object management.

a.a. UID 40401 to AON 41304 Translation

Generally speaking, in CS 10110, addresses stored in MEM 10112 and Secondary Memory 10124 are stored as UID-offset addresses. The only form of address that FU 10120 can translate into a location in MEM 10112 is the AON-offset form. Consequently, each time an address is loaded from MEM 10112 into a FU 10120 register, the address must be translated from a UID-offset address to an AON-offset address. The reverse translation must be performed each time an address is moved from a FU 10120 register back into memory.

Such translations may occur at any time. For example, a running Virtual Processor 612 performs such a translation when the Process 610 being executed by Virtual Processor 612 carries out an indirect memory reference. An indirect memory reference is a reference which first fetches a pointer, that is, a data item whose value is the address of another data item, and then uses the address contained in-the pointer to fetch the data itself. In CS 10110, pointers represent UID-offset addresses. Virtual Processor 612 performs the indirect memory reference by fetching the pointer from MEM 10112, placing it in FU 10120 registers, translating UID 40401 represented by the pointer into AON 41304 associated with it, and using the resulting AON-offset address to access the data at the location specified by the address.

Figure 414:
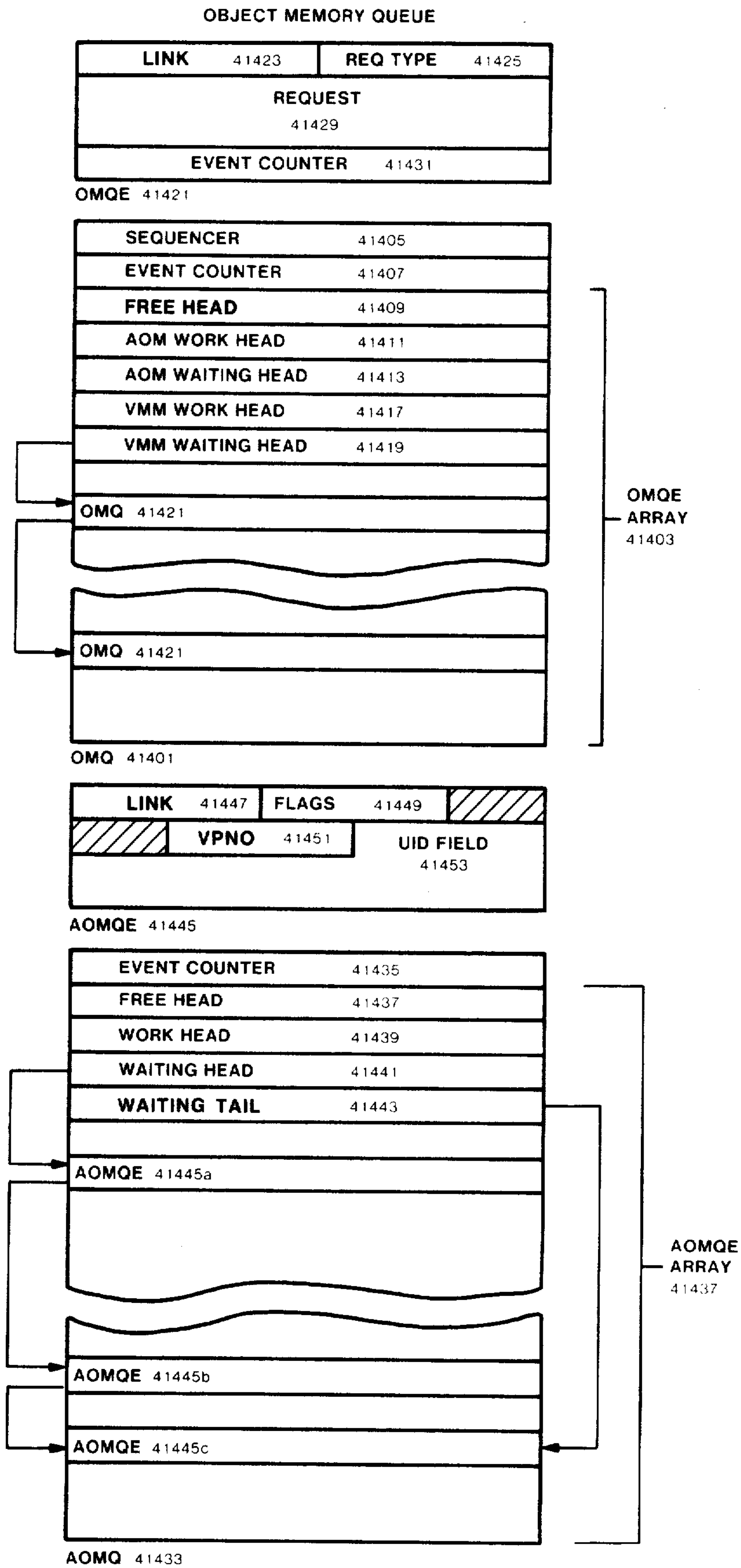

Most such translations, however, occur when Virtual Processor 612 state is saved or restored. For instance, when one Process 610's Virtual Processor 612 is removed from JP 10114 and another Process 610's Virtual Processor 612 is bound to JP 10114, the state of Virtual Processor 612 being removed from JP 10114 is stored in memory, and the state of Virtual Processor 612 being bound to JP 10114 is moved into JP 10114's registers. Because only UID-offset addresses may be stored in memory, all of the AON-offset addresses in the state of Virtual Processor 612 which is being removed from JP 10114 must be translated into UID-offset addresses. Similarly, all of the UID-offset addresses in the state of Virtual Processor 612 being bound to JP 10114 must be translated into AON-offset addresses before they can be loaded into FU 10120 registers.

b.b. Active Object Manager Process 610 (FIG. 414)

Object activations and requests by other Processes 610 for object manager functions are handled by KOS Active Object Manager Process 610. Active Object Manager Process 610 is permanently bound to a Virtual Processor 612, and when that Virtual Processor 612 is bound to JP 10114, the Active Object Manager Process continually executes a program loop which processes two queues: the Object Manage Queue (OMQ) and the Active Object Manager Queue (AOMQ). The OMQ provideds a means by which other Processes 610 in CS 10110 may communicate with Active Object Manager Process 610 and Virtual Memory Manager Process 610, while the AOMQ is the means by which KOS object manager microcode communicates with Active Object Manager Process 610.

When other Processes 610 in CS 10110 make calls to KOS which are carried out by the Object Manager System or the Virtual Memory System, they do so by invoking KOS Object Manager or Virtual Memory Manager Procedures 602. These Procedures 602 create entries in the OMQ indicating the task Object Manager Process 610 is to perform, advance an Event Counter in the OMQ which causes either Active Object Manager Process 610 or Virtual Memory Manager Process 610 to resume processing the OMQ, and suspend user Process 610 making the request. When Active Object Manager Process 610 or Virtual Memory Manager Process 610 has processed an OMQ entry for a user Process 610, Active Object Manager Process 610 or Virtual Memory Manager (VMM) Process 610 advances an Event Counter for that Process 610's Virtual Processor 612, and Process 610 may resume execution.

Similarly, when KOS object manager microcode requires assistance from Object Manager Procedures 602, KOS object manager microcode creates an entry in the AOMQ, advances an Event Counter for the Active Object Manager Process in the AOMQ, and suspends Virtual Processor 612 which was executing on JP 10114 when the KOS microcode was invoked. When Active Object Manager Process 610's Virtual Processor 612 is bound to JP 10114, Active Object Manager Process 610 processes AOMQ entries, and when it has finished processing the AOMQ entry for a Virtual Processor 612, it advances that Virtual Processor 612's Event Counter and Virtual Processor 612 may again be bound to JP 10114.

FIG. 414 contains representations of both the OMQ and the AOMQ. Turning to that Figure, OMQ 41401 has three main parts: an Array 41403 of OMQ Entries (OMQEs), a Sequencer 41405, and an Event Counter 41405. As will be explained in detail in the discussion of Processes 610, Sequencer 41405 ensures that only as many requests are being processed at one time as there are OMQEs 41421. Each time a Process 610 makes an OMQE 41421, it first receives a value from Sequencer 41405 and performs an Await Operation (explained later) for itself on Event Counter 41407 using the value from Sequencer 41405. If there are free OMQEs 41421, Event Counter 414077s current value exceeds the value provided by Sequencer 41405, and Process 610 is not suspended; if there are no free OMQEs 41421, Event Counter 41407's value does not exceed the value provided by Sequencer 41405, and Process 610 is suspended until Event Counter 41407 does equal the value given Process 610 by Sequencer 41405. Besides being awaited by Processes 610 which require OMQEs 41421, Event Counter 41407 is awaited by Active Object Manager Process 610 and VMM Process 610. The advance of Event Counter 41407 causes Active Object Manager Process 610 and VMM Process 610 to process OMQEs 41421.

OMQE Array 41403 is composed of OMQEs 41421. OMQEs 41421 contain requests for tasks to be performed by Active Object Manager Process 610 or by VMM Process 610. Each OMQE 41421 has four fields: a Link field 41423, which contains either 0 or the index of another OMQE 41421 in OMQE array 41403, a Request Type Field 41425, which contains an integer value identifying the kind of request contained in OMQE 41421, a Request Field 41429, which contains the request itself, and Event Counter Field 41431. The Event Counter in Event Counter Field 41431 is awaited by Process 610 which invoked the Object Manager Procedure 602 or VMM Procedure 602 which created OMQE 41421. When the Object Manager or VMM Process 610 is finished processing OMQE 41421, it advances the Event Counter in Field 41431, thereby allowing Process 610 to resume execution.

OMQEs 41421 belong to one of five lists in OMQE Array 41403. The head of each list is a special reserved OMQE 41421. This OMQE 41421 contains no information other than the value in its link field 41423, which contains the index of the first OMQE 41421 in the list. Each OMQE 41421 in a list has the index of the next OMQE 41421 in the list in its Link Field 41423, and the last OMQE 41421 in the list has the value 0 in its Link Field 41423. lists mayThe be described as follows:

- Free Head 41409 is the head of a list of free OMQEs 41421, i.e., OMQEs 41421 which do not contain requests and are therefore not on any of the other lists.
- AOM Work Head 41411 is the head of a list of OMQEs 41421 which contain requests for Object Manager Process 610 that Object Manager Process 610 has not yet begun to process.
- AOM Waiting Head 41413 is the head of a list of OMQEs 41421 which contain requests that Object Manager Process 610 is currently processing.
- VMM Work Head 41417 is the head of a list of OMQEs which contain requests for VMM Process 610 that that Process 610 has not yet begun to process.
- VMM Waiting Head 41413 is the head of a list of OMQEs 41421 which contain requests that VMM Process 610 is currently processing.

The manner in which KOS Object Manager Procedures 602 invoked by Processes 610 other than Active Object Manager Process 610 and OMQ 41401 work together may be illustrated by the steps involved in deleting an object. As previously mentioned, when the delete operation is finished, the deleted object has none of its contents in MEM 10112, no entries in MHT 10716, no information from its LAUDE 40906 in AOT 10712, APAM 10918, ANPAT 10920, or WSM 10720, no AOS file in Secondary Memory 10124, and no LAUDE 40906. The delete operation works like this: When invoked, KOS Delete Object Procedure 602 obtains an OMQE 41421 from the free list, places a request containing UID 40401 of the object to be deleted in OMQE 41421, places OMQE 41421 in the AOM work list, advances Event Counter 41407, and performs an Await Operation on Process 610 usin9 Event Counter 41431. The Await Operation suspends Process 610 which invoked Delete Object Procedure 602.

The advance of Event Counter 41407 causes Active Object Manager Process 610 to begin executing at some later time, and Active Object Manager Process 610 eventually begins processing OMQE 41421. It does so by using UID 40401 in Request 41429 to locate LAUDE 40906 for the object and lock it. The amount of processing depends on the object. If the object is inactive, all that is required is the deletion of the object's AOS file and the object's LAUDE 40906; if the object is active, in addition, information about the object in KOS MEM 10112 tables and JP 10114 caches must be deleted; if the object has portions in MEM 10112, finally, information about the object in KOS virtual memory tables must be deleted. In each case where additional processing is required, Procedures 602 invoked by the Active Object Manager Process place the new request in an OMQE 41421 and place OMQE 41421 with the delete object request on the waiting list. When the new request has been processed, OMQE 41421 is returned to the work list.

If the object is active, AON field 41221 in LAUDE 40906 contains the object's AON 41304. Using this AON, Active Object Manager Process 610 invokes a Procedure 602 which makes a deactivate object request OMQE 41421, places that OMQE 41421 on the AOM work list, and places the OMQE 41421 with the delete request on the AOM waiting list. When the Active Object Manager Process processes OMQE 41421 with the deactivate object request, it invokes Procedures 602 which remove information about the object from AOT 10712, MHT 10716, ATU 10228, Protection Cache 10234, and the Access Control System tables which contain access information about the object. If the object has portions in MEM 10112, the deactivation operation must also cause the Virtual Memory System to free these portions of MEM 10112. To do this, Procedures 602 doing deactivation create another OMQE 41421 with a request to VMM Process 610 to free the portions of MEM 10112 which contain copies of portions of the object being deleted. This OMQE 41421 is placed on the VMM work list as described for OMQE 41421 for the delete request, and OMQE 41421 for the deactivate request is moved to the AOM waiting list until VMM Process 610 has freed the portions of MEM 10112 containing portions of the object. When VMM Process 610 is finished, OMQE 41421 for the deactivate request is moved back to the AOM work list, and when the deactivation is finished, OMQE 41421 for the delete request is moved back to the AOM work list. There is now no portion of the object in MEM 10112 and no information about the object in JP 10114 caches or KOS tables other than LAUDE 40906, so the next stage is the deletion of the AOS file. To do this, Active Object Manager Process 610 places a request to AOS to delete the object's AOS file in IOS 10116 in an I/O queue and again places OMQE 41421 on the AOM waiting list. When AOS has deleted the file, it sends a message to the Active Object Manager Process, which again moves OMQE 41421 to the AOM work list. Now, all that is left of the object is its LAUDE 40906, and Active Object Manager Process 610 deletes LAUDE 40906 and advances Event Counter 41431 in OMQE 41421. By advancing Event Counter 41431, Active Object Manager Process 610 causes Process 610 which invoked KOS Delete Object Procedure 602 to resume executing. It continues with the execution of Delete Object Procedure 602, which returns OMQE 41421 to the free list, and then returns.

AOMQ 41433 is used by Active Object Manager microcode to communicate with the Active Object Manager Process when an active object fault occurs. AOMQ 41433 has two parts: Event Counter 41435 and an Array of AOMQ Entries 41437. An advance of Event Counter 41435 causes Active Object Manager Process 610 to resume executing at some later time. AOMQ Entries (AOMQEs) 41445 in AOMQE Array 41437 are organized into three lists: a list of AOMQEs 41445 which are not in use, called the free list, a list of AOMQEs 41445 which must be processed by Active Object Manager Process 610, called the work list, and a list of AOMQEs 41445 which is in the course of being processed, called the waiting list. AOMQEs 41445 on the work list and the waiting list represent active object faults being processed by Active Object Manager Process 610. Each list has a special AOMQE 41445 at its head which contains only the index of the first ordinary AOMQE 41445 in its list. Free Head 41437 contains the index of the first AOMQE 41445 in the free list, Work Head 41439 contains the index of the first AOMQE 41445 in the work list, and Waiting Head 41441 contains the index of the first AOMQE 41445 in the waiting list. In addition, Waiting Tail 41443 contains the index of the last AOMQE 41445 in the waiting list, thereby allowing AOM Procedures 602 to easily locate either the head or the tail of that list.

AOMQE 41445 has four fields: Link Field 41447 contains the index of the next AOMQE 41445 in the list to which AOMQE 41445 belongs. If AOMQE 41445 is the last AOMQE 41445 in its list, Link Field 41447 has the value 0. Flags Field 41449 contains flags which indicate to the Active Object Manager Process how AOMQE 41445 is to be processed. VPNO Field 41455 contains the number of Virtual Processor 612 which was executing on JP 10114 when the active object fault occurred, and UID Field 41453 contains the UID 40401 of the object to be activated. The function of AOMQE 41445 is described in detail in the discussion of LAR microcode and active object faults which follows.

c.c. AOT 10712 and Logical Address Reduction (LAR) (FIG. 415)

As previously mentioned, KOS uses AOT 10712 to associate AONs 41304 with UIDs 40401 and to translate AONs 41304 to UIDs 40401. The actual translation is termed Logical Address Reduction (LAR), and is carried out by KOS microcode routines. The discussion first explains how KOS microcode uses the information in AOT 10712 to translate AONs 41304 to UIDs 40401 and vice-versa, and then explains how KOS handles active object faults and maintains AOT 10712.

AOT 10712 is always present in MEM 10112 at a location known to KOS. Besides translating AONs 41304 to UIDs 40401 and vice-versa, AOT 10712 contains information copied from LAUDE 40906 about the attributes of the object to which UID 40401 belongs and information used by Active Object Manager Procedures 602.

Figure 415:
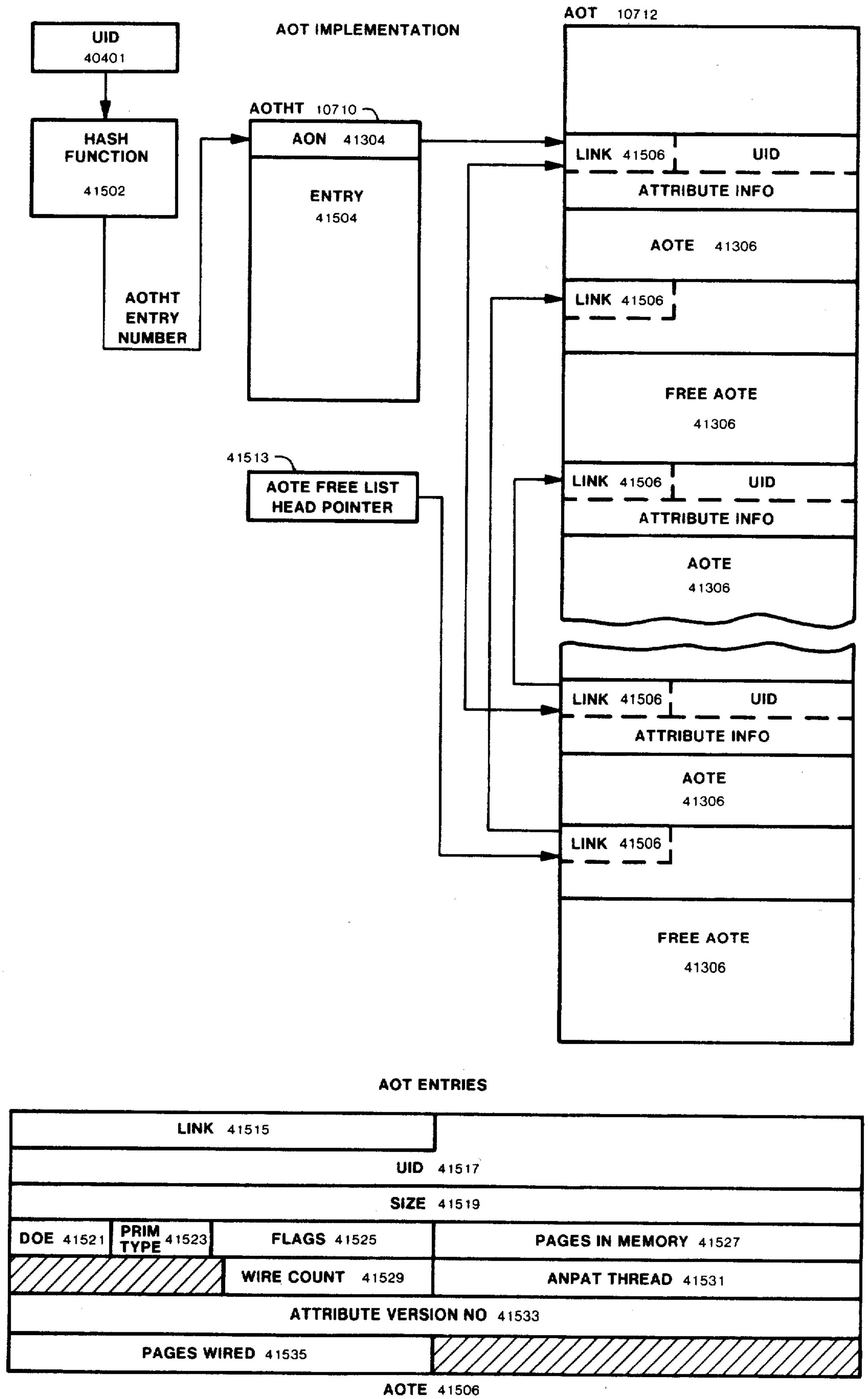

FIG. 415 gives an overview of the implementation of AOT 10712 and of AOT entries (AOTEs) in the present embodiment. The implementation of AOT 10712 follows the same general principles as that of AST 10914, explained in FIG. 408. The implementation has three parts, a microcode Hash Function 41502, a hash table, AOT Hash Table (AOTHT) 10710, and AOT 10712 itself. Each AON 41304 that is associated with a UID 40401 has an AOT entry (AOTE) 41306 in AOT 10712 containing information about the object to which UID 40401 belongs. Since AONs 41304 are indexes of AOTEs 41306, KOS can locate AOTE 41306 for the object whose UID 40401 is associated with a given AON 41304 by multiplying AON 41304 by the size of an AOTE 41306 and adding the result to the MEM 10112 location at which AOT 10712 begins. When LAR microcode translates a UID 40104, it first uses microcode Hash Function 41502 to hash UID 40401 and obtain the index of an Entry (AOTHTE) 41504 in AOTHT 10710. KOS LAR microcode then uses the index to locate AOTHTE 41504. AOTHTE 41504 contains an AON 41304, and KOS LAR microcode uses this AON 41304 to locate an AOTE 41306. Starting with that AOTE 41306, KOS LAR microcode searches AOT 10712 until it locates an AOTE 41306 which contains a UID 40401 which is the same as the one which was hashed or determines that that UID 40401 has no AOTE 41306, and that UID 40401's object is therefore inactive.

To facilitate searching, AOTEs 41306 are organized into lists of AOTEs 41306. Each AOTE 41306 contains a Link Field 41506, which contains the index of the next AOTE 41306 in its list of AOTEs 41306. If the value in Link Field 41506 is 0, the AOTE 41306 is the last link in its list. All AOTEs 41306' for AONs 41304 which have not been associated with UIDs 41504 belong to a single list of free AOTEs 41306'. The location of the first AOTE 41306' is contained in a pointer 41513 in MEM 10112 called the AOTE Free List Head Pointer.

AOTEs 41306 whose AONs 41304 have been associated with UIDs 40401 are linked into lists of AOTEs 41306 whose UIDs 40401 all hash to the same AOTHT 10710 index value when hashed in Hash Function 41502. AON 41304 specifying AOTE 41306 at the beginning of such a list is contained in that AOTHTE 41504 whose index is the value to which all UIDs in that list of AOTEs 41306 hash. Thus, having hashed a UID 40401 and obtained an index of an entry 41504 in AOTHT 10710, KOS LAR microcode can determine whether a given UID 40401 has an AON 41304 by examining only those AOTEs 41306 in the list which begins with AOTE 41306 whose AON 41304 is contained in AOTHTE 41504. If KOS LAR microcode reaches the end of the list without finding an AOTE 41306 containing UID 40401 which is being searched for, UID 40401's object is inactive and an active object fault has occurred. In this case, KOS LAR microcode calls a KOS microroutine which handles active object faults. The active object fault microroutine does three things:

It obtains an AOMQE 41445 from the free list, places UID 40401 for the object whose UID has no AON and the number of Virtual Processor 612 which caused the active object fault in AOMQE 41445, and places AOMQE 41445 on the work list.

It advances Event Counter 41435, thereby guaranteeing that Active Object Manager Process 610 will shortly execute.

It removes Virtual Processor 612 for Process 610 which attempted to translate UID 40401 from JP 10114. Virtual Processor 612 will not be returned to JP 10114 until Active Object Manager Process 610 has resolved the active object fault.

Some time after Virtual Processor 612 for Process 610 which caused the active object fault has been suspended, Virtual Processor 612 belonging to Active Object Manager Process 610 is bound to JP 10114. Procedures 602 invoked by Active Object Manager Process 610 activate the objects that caused the active object faults. They do so by assigning AOTEs 41306 to the UIDs 40401 that caused active object faults. That AOTE 41306's index becomes the AON for its UID 40401. New AOTEs 41306 come from AOT 10712's free list.

After the AOM has assigned an AOTE 41306, and thereby an AON 41304, to UID 40401 for the newly-activated object, the AOM copies information from LAUDE 40906 belonging to the newly activated object into AOTE 41306 and finds which chain of AOTEs 41306 UID 40401's AOTE 41306 belongs to. It then inserts AOTE 41306 belonging to the newly-activated object at the head of the chain. In order to find which chain of AOTEs 41306 UID 40401's AOTE 41306 belongs to, Active Object Manager Process 610 uses Hash Function 41502 to hash UID 40401 and obtain an index into AOTHT 10710. If there is no list of AOTEs 41306 for that hash value, AOTHTE 41504 specified by the hash value contains the value 0; otherwise, AON 41304 contained in AOTHTE 41504 the index of that AOTE 41306 which is at the head of the proper chain of AOTEs 41306. Active Object Manager Process 610 puts AON 41304 belonging to AOTE 41306 for the newly-activated object into AOTHTE 41504 and the value contained in AOTHT 41504 into Link Field 41506 belonging to AOTE 41306 for the newly-activated object.

After the required object has been activated, Virtual Processor 612 belonging to Process 610 which caused the active object fault can again be bound to JP 10113. When Process 610 is returned to JP 10114, it continues to execute the active object fault microcode. Active object fault microcode supplies the AON of the newly-activated object to LAR microcode, thus completing the translation.

In the present embodiment, most AOTEs 41306 are initially on the free list. As objects are activated, the free list grows shorter. When it grows too short, Active Object Manager Process 610 must deactivate objects to provide AOTEs 41306 for newlyactivated objects. To perform this function, Active Object Manager Process 610 invokes a group of KOS Procedures 602 called the AOT Cleaner. These Procedures 601 choose which objects to deactivate by examining a field in AOTE 41306 which indicates whether copies of portions of the object are in MEM 10112. If no portions of the object have copies in MEM 10112, the information in AOTE 41306 information from the object's LAUDE 40906 which may have changed while the object was active is copied back to LAUDE 40906, entries for AOTE 41306's AON 41304 in Access Control System tables are invalidated, and AOTE 41306 is unlinked from its list in AOT 10712 and placed on the free list.

d.d. AOTE 41306

FIG. 415 also contains a detailed representation of AOTE 41306. The first two fields, Link 41506 and UID 41517 were discussed in the preceding section. Continuing from left to right, Size Field 41519 contains the Size Attribute of the object whose UID 40401 is contained in AOTE 41306. When the object is activated, the value of Size Field 41211 from the object's LAUDE 40906 is copied into Size Field 41519, and if an object's size is changed while it is active, Size Field 41519 is altered to reflect the new size. When the object is inactivated, the value of Size Field 41519 is copied back into LAUDE 40906's Size Field 41211. Domain of Execution Field 41521 contains the object's DOE Attribute from LAUDE Field 41225, and Primitive Type Field 41523 contains the object's Primitive Type Attribute from LAUDE Field 41219. Attribute Version Number Field 41533 is also copied from LAUDE 40906. It contains the value of LAUDE Field 41227.

The remaining fields are used by the Active Object Manager and the Virtual Memory Manager. Flags Field 41525 contains flags indicating the state of the object while it is active. These flags are set and read by Active Object Manager and Virtual Memory Manager Procedures 602. Pages in Memory Field 41527 indicates how many portions of the object have copies in MEM 10112. As will be explained in detail in the discussion of the Virtual Memory System, objects are divided into fixed-sized portions called pages, and when a portion of an object is required in MEM 10112, the page containing that portion of the object is copied into MEM 10112. An object may not be inactivated as long as Pages in Memory Field 41527 has a value greater than 0.

Wire Count Field 41529 indicates whether the object whose UID 40401 is contained in AOTE 41306 may be inactivated. As long as Wire Count Field 41529 has a value greater than 0, the object is "wired" active and may not be inactivated. Objects are "wired" active by an Active Object Manager Procedure 602 which simply increments Wire Count Field 41529 each time it is invoked. Another AOM procedure "unwires" objects by decrementing Wire Count Field 41529 each time it is invoked. When an invocation decrements Wire Count Field 41529 to 0, the object may be inactivated. ANPAT Thread 41531 is a pointer to the portion of ANPAT 10920, which contains a copy of the object's PACLEs. That table is explained in detail in the discussion of the implementation of the Access Control System. Pages Wired Field 41535, finally, is a field which indicates how many of the pages of the object currently in MEM 10112 are "wired" into MEM 10112, i.e., may not be removed from MEM 10112. This field is set and read by the Virtual Memory Manager, as will be explained below.

C. The Access Control System

As mentioned in the introduction to objects, ach time a Process 610 accesses data or SINs in an object, the KOS Access Control System checks whether Process 610's current subject has the right to perform the kind of access that Process 610 is attempting. If Process 610's current subject does not have the proper access, the Access Control System aborts the memory operation which Process 610 was attempting to carry out. The following discussion presents details of the implementation of the Access Control System, beginning with subjects, then proceeding to subject templates, and finally to the means used by KOS to accelerate access checking.

a. Subjects

A Process 610's subject is part of Process 610's state and is contained along with other state belonging to Process 610 in an object called a Process Object. Process Objects are dealt with at length in the detailed discussion of Processes 610 which follows the discussion of objects. While a subject has, as mentioned above, four components, the principal component, the process component, the domain component, and the tag component, the Access Control System in the present embodiment of CS 10110 assigns values to only the first three components and ignores the tag component when checking access.

In the present embodiment, the UIDs 40401 which make up the components of a Process 610's subject are the UIDs 40401 of objects containing information about the entities represented by the UIDs 40401. The principal component's UID 40401 represents an object called the Principal Object. The Principal Object contains information about the user for whom Process 610 was created. For example, the information might concern what access rights the user had to the resources of CS 10110, or it might contain records of his use of CS 10110. The process component's UID 40401 represents the Process Object, while the domain component's UID 40401 represents an object called the Domain Object. The Domain Object contains information which must be accessible to any Process 610 whose subject has the Domain Object's UID 40401 as its domain component. Other embodiments of CS 10110 will use the tag component of the subject. In these embodiments, the tag component's UID 40401 is the UID 40401 of a Tag Object containing at least such information as a list of the subjects which make up the group of subjects represented by the tag component's UID.

b. Domains

As stated above, the subject's domain component is the domain of execution attribute belonging to the Procedure Object 608 or ETM whose code is being executed when the access request is made. The domain component of the subject thus gives Process 610 to which the subject belongs potential access to the group of objects whose ACLs have ACLEs with subject templates containing domain components that match the DOE attribute. This group of objects is the domain defined by the Procedure Object 608 or ETM's DOE attribute. When a Process 610 executes a Procedure 602 from a Procedure Object 608 or ETM with a given DOE attribute, Process 610 is said to be executing in the domain defined by that DOE attribute. As may be inferred from the above, different Procedure Objects 608 or ETMs may have the same DOE attribute, and objects may have ACLEs which make them members of many different domains.

In establishing a relationship between a group of Procedure Objects 608 and another group of objects, a domain allows a programmer using CS 10110 to ensure that a given object is read, executed, or modified only by a certain set of Procedures 602. Domains may thus be used to construct protected subsystems in CS 10110. One example of such a protected subsystem is KOS itself: the objects in CS 10110 which contain KOS tables all have ACLs whose domain template components match only the DOE which represents the KOS domain. The only Procedure Objects 608 and ETMs which have this DOE are those which contain KOS Procedures 602, and consequently, only KOS Procedures 602 may manipulate KOS tables.

Since an object may belong to more than one domain, a programmer may use domains to establish hierarchies of access. For example, if some of the objects in a first domain belong both to the first domain and a second domain, and the second domain's objects all also belong to the first domain, then Procedures 602 contained in Procedure Objects 608 whose DOEs define the first domain may access any object in the first domain, including those which also belong to the second domain, while those from Procedure Objects 608 whose DOEs define the second domain may access only those objects in the second domain.

c. Access Control Lists

As previously mentioned, the Access Control System compares the subject belonging to Process 610 making an access to an object and the kind of access Process 610 desires to make with the object's ACLs to determine whether the access is legal. The following discussion of the ACLs will first deal with Subject Templates, since they are common to all ACLs, and then with PACLs and EACLs.

1. Subject Templates (FIG. 416)

Figure 416:
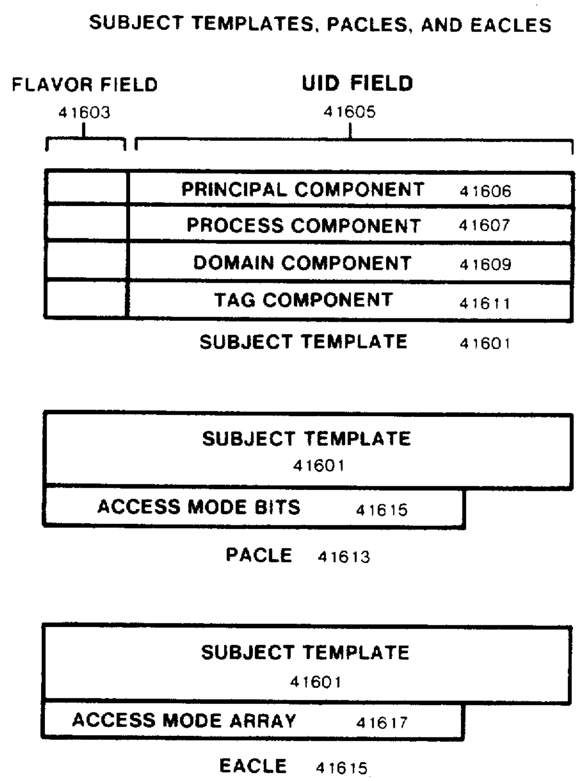

FIG. 416 shows Subject Templates, PACL Entries (PACLEs), and EACL Entries (EACLEs). Turning first to the Subject Templates, Subject Template 41601 consists of four components, Principal Template 41606, Process Template 41607, Domain Template 41609, and Tag Template 41611. Each template has two fields, Flavor Field 41603, and UID Field 41605. Flavor Field 41603 indicates the way in which the template to which it belongs is to match the corresponding component of the subject for Process 610 attempting the access. Flavor Field 41603 may have one of three values: or match any, match one, match group. If Flavor Field 41603 has the value match any, any subject component UID 40401 matches the template, and the Access Control System does not examine UID Field 41605. If Flavor Field 41603 has the value match one, then the corresponding subject component must have the same UID 40401 as the one contained in UID Field 41605. If Flavor Field 41603 has the value match group, finally, then UID Field 41605 contains a UID 40401 of an object containing information about the group of subject components which the given subject component may match.

2. Primitive Access Control Lists (PACLs)

PACLs are made up of PACLEs 41613 as illustrated in FIG. 416. Each PACLE 41613 has two parts: a subject template 41601 and an Access Mode Bits Field 41615. The values in Access Mode Bits Field 41615 define 11 kinds of access. The eleven kinds fall into two groups: Primitive Data Access and Primitive Non-data Access. Primitive Data Access controls what the subject may do with the object's Contents 40406; Primitive Non-data Access controls what the subject may do with the object's Attributes 40404.

There are three kinds of Primitive Data Access: Read Access, Write Access, and Execute Access. If a subject has Read Access, it can examine the data contained in the object; if the subject has Write Access, it can alter the data contained in the object; if it has Execute Access, it can treat the data in the object as a Procedure 602 and attempt to execute it. A subject may have none of these kinds of access, or any combination of the kinds. On every reference to an object, the KOS checks whether the subject performing the reference has the required Primitive Data Access.

Primitive Non-data Access to an object is required only to set or read an object's Attributes 40404, and is checked only when these operations are performed. The kinds of Non-data Access correspond to the kinds of Attributes 40404:

| Attributes | Kind of Access |
|---|---|
| Object Attributes | get object attributes<br>set object attributes |
| Primitive Control | get primitive control attributes. |
| Attributes | set primitive control attributes |
| Extended Control Attributes | get extended control attributes<br>set extended control attributes |
| ETM Access | use as ETM<br>create ETO |

The access rights for object attributes allow a subject to get and set the object attributes described previously. The access rights for primitive and extended control attributes allow a subject to get and set an object's PACL and EACL respectively.

An object may have any number of PACLEs 41613 in its PACL. The first five PACLEs 41613 in an object's PACL are contained in fixed PACLE Field 41237 of LAUDE 40906 for the object; the remainder are stored in LAUD 40903 at the location specified in PACL Offset Field 41233 of LAUDE 40906.

a.a. Setting and Reading PACLs

As already mentioned, the Access Control System automatically checks Primitive Data Access on every reference to an object; in addition, the Access Control System provides Procedures 602 by means of which EOS can read and set an object's entire PACL and read a PACLE 41613 for a given subject.

The Procedure 602 which reads an object's entire PACL is called get_primitive_ACL. It takes six arguments: a list of validation subjects, all of which must have get_primitive_ACL access to the object in question, the object's UID 40401, and four variables: one for the PACL to be returned, one for the current value of Attribute Version Number Field 41227 of LAUDE 40906 for the UID 40401 argument, one for the size of the PACL, and one for a status code. Get_primitive_ACL Procedure 602 merely uses UID 40401 to locate LAUDE 40906 belonging to the object, checks the PACL to find out whether the validation subjects have the required access, and then obtains the information to be returned from LAUDE 49096.

The Procedure 602 which sets an object's entire PACL is called set_primitive_ACL. It takes four values and a status variable as arguments. The values are a list of validation subjects, all of which must have set_primitive_ACL access to the object in question, UID 40401 identifying the object, the attribute version number, and a string of PACLEs 41613 for the object's new PACL. The procedure uses UID 40401 to locate LAUDE 40906, then checks the old PACL to determine whether the validation subjects have the proper access, replaces the entire old PACL with the new PACL, and finally invalidates primitive access control information for the object which is encached in KOS tables or in Protection Cache 10234.

The KOS Procedure 602 which locates and reads PACLE 41613 for a single subject is called get_primitive_access. Get_primitive_access Procedure 602 takes three values and two variables as arguments. The values are a list of validation subjects, which must have get_primitive_access access to the object involved, the object's UID 40401, and the subject whose access is being checked. The variables are for the access mode bits of the PACL involved and a status code. The procedure works like get_primitive_ACL, except that it returns only Access Mode Bits Field 41615 of the first PACLE 41613 on the object's PACL whose Subject Template 41601 matches the subject used as an argument. As will be explained in detail later, get_primitive_access obtains its information from an Access Control System table in MEM 10112 which contains a copy of an active object's PACL, rather than directly from the object's LAUDE 40906.

b.b. Extended Access Rights and EACLs

ETOs may have access rights in addition to those defined by KOS. These access rights are termed Extended Access Rights. Extended access to an ETO is defined by the ETO's EACL. Turning again to FIG. 416, it may be seen that each EACLE 41615 consists of Subject Template 41601 and an Access Mode Array Field 41617. Access Mode Array Field 41617 is a $1 \times 32$ bit array. KOS provides Procedures 602 for EACLs which are analogous with those for PACLs. Get_extended_ACL Procedure 602 reads an ETO's entire EACL, set_extended_ACL Procedure 602 sets the entire EACL, and get_extended_access_and_extended_type Procedure 602 takes a subject as an argument as well as the ETO's UID 40401 and returns EACLE 41615 whose Subject Template 41601 matches the subject argument. Like the equivalent Procedure 602 with PACLs, get_extended_access_and_extended_type obtains its information from an Access Control System table in MEM 10112 instead of from the object's LAUDE 40906. There are two main differences between Procedures 602 for extended access and those for primitive access: first, with extended access, the meaning of Access Mode Array Field 41617 is completely defined by the user, and therefore the Procedures 602 merely set the field or return it as requested, without interpreting it. Second, information from an ETO's EACL is encached in KOS tables, but not in Protection Cache 10234, and consequently, changing an ETO's EACL does not affect Protection Cache 10234.

With ETMs and ETOs, a programmer using CS 10110 can closely limit access to an object. For instance, a programmer might define a linked list data structure with four kinds of access: add an item access, remove an item access, find an item access, and delete list access. He might then make an ETM containing Procedures 602 which created linked list ETOs, added an item to a linked list, removed an item from a linked list, read an item in a linked list, and deleted linked list ETOs. The create linked list ETO Procedure 602 might take the subject for which the linked list ETO is being created as an argument and might set the new ETO's EACL to allow that subject only to have add an item, remove an item, and find an item access, and further set the ETO's EACL to allow only the subject which created the ETO delete list access to the ETO. When the create linked list ETO Procedure 602 created the new ETO, it would use the KOS set_extended access Procedure 602 described above to set the new ETO's EACL, and when the Procedures 602 which added, removed, or found items on the list were invoked, they would not perform the operation until they had used the KOS get_extended_access_and_extended_type Procedure 602 to retrieve Access Mode Array Field 41617 from EACL 41615 and compared the value of the field with the value required to legally perform the operation, thereby verifying that the subject performing the operation had the proper access.

As mentioned at the beginning of the discussion on Attributes 40404, objects may exist solely for their ACLs. For instance, an ETM might create a single object that has no contents but whose EACL contains entries for all of the subjects that have the extended access defined by the ETM. Instead of checking the EACLs of the objects that it is manipulating, the ETM need only check the EACL of the single object.

c.c. Subjects, Domains, and Subject Templates in the Present Embodiment

In order to simplify implementation, the present embodiment places certain limits on domains, tags, and subject template components, while the domain component works as described above, there are only four domains: the user domain, the DBMS domain, the EOS domain, and the KOS domain. Tags are not implemented, and the tag component of the subject template is always set to match any. Match group, finally, is not implemented, so subject template components must be set either to match one or to match any.

d. Acceleration of Access Checking in CS 10110

Having dealt with access checking in terms of subjects, PACLs, and EACLs, the discussion now turns to the means by which access checking is accelerated in CS 10110, beginning with ASNs.

1. Subjects and ASNs (FIG. 408)

The relationship between a subject and an ASN is analogous to that between a UID 40401 and an AON 41304. There is a fixed number of ASNs, and a much larger variable number of subjects. At any given time, each ASN is associated either with no subject or with a single subject. Over time, however, the same subject may be associated with different ASNs and vice-versa. Inside JP 10114, subjects are represented solely by their ASNs. Subjects that are associated with ASNs are termed active subjects, and the process by which a subject is associated with an ASN is subject activation.

The translation of active subjects to ASNs proceeds in the same manner as that of UIDs 40401 to AONs 41304. The overall structure of AST 10914 has already been presented in FIG. 408. Turning again to that figure, it will be noted that each ASTE 40806 contains a Link Field and a field which represents a subject. The index of a given ASTE 40806 is the ASN of the subject represented by that ASTE 40806. The Link Field allows entries 40806 to be organized into lists: if the Link Field is 0, the entry is at the end of a list; otherwise, the link field gives the index of the next ASTE 40806 in the list. A special case of such lists is the list of free ASTEs 40806", that is, of ASTEs 40806 which are not currently associated with subjects, and whose indexes are therefore not ASNs. Head of Free List 40807 is always ASTE 40806 whose index is 0. The remaining lists are made up of ASTEs 40806 whose subjects hash to the same ASTHT index. ASTHT Entry (ASTHTE) 40804 at the index contains the index of the first ASTE 40806 in the list.

Conversion of a subject to an ASN is performed by KOS microcode. It proceeds as follows: Subject 40801 is hashed by microcode Hash Function 40802 to produce an index into ASTHT 40803. ASTHTE 40804 at the index contains an ASTE 40806 index. By multiplying the index by the size of an ASTE 40806 and adding the result to the location of the start of AST 10914, KOS microcode can locate the first ASTE 40806 in the list for that hash value. KOS microcode then compares Subject 40801 with the subject in ASTE 40806. If the subject is the same, then the index of ASTE 40806 is the subject's ASN. If the subjects are different, KOS microcode continues down the list until it finds ASTE 40806 with the subject it is looking for.

If a Subject 40801 is hashed and ASTHT entry 40804 for subject 40801 has the value 0, or if the list of ASTEs 40806 specified by ASTHT entry 40804 has no ASTE 40806 for the subject, then the subject is inactive, i.e., has no ASN associated with it, and the result is an inactive subject fault. Inactive subject faults are dealt with as follows: KOS microcode invoked by the microcode which searches AST 10914 takes a free ASTE 40806" from the head of the free list, copies Subject 40801 into ASTE 40806, hashes Subject 40801 again with Hash Function 40802 to obtain the proper ASTHT 10710 index for the AST list which is to contain subject 40801's ASTE 40806, and then places ASTE 40806 at the head of the list. The latter action is performed by putting the current value of ASTHTE 40804 into ASTE 40806's Link Field and putting ASTE 40806's index into ASTHTE 40804. ASTE 40806's index is now the ASN of Subject 40801.

In the present embodiment, subjects are activated only when a Process 610 is bound to a Virtual Processor 612 and are deactivated only when Process 610 is unbound from Virtual Processor 612. This simplification is possible for two reasons:

Only those Processes 610 that are bound to Virtual Processors 612 have access to JP 10114, and only those Processes 610 require ASNs.

The process and principal components of the subject remains constant throughout the life of a Process 610, and the present embodiment has no tags and only four domains. Consequently, a given Process 610 can have only four subjects in its life.

Taken together, the above facts determine a maximum number of active subjects that is a function of the number of Virtual Processors 612. In the present embodiment, AST 10914 is made large enough to accomodate this number of ASNs. When a Process 610 is bound to a Virtual Processor 612, each of the four subjects that Process 610 can have is activated as described above, and when a Process 610 is unbound from Virtual Processor 612, each of the four subjects is deactivated. Deactivation is accomplished by unlinking ASTE 40806 from its chain, invalidating all Access Control System table entries for ASTE 40806's ASN, and then linking ASTE 40806 at the head of the free list.

2. ASTEs 40806 (FIG. 417)

Figure 417:
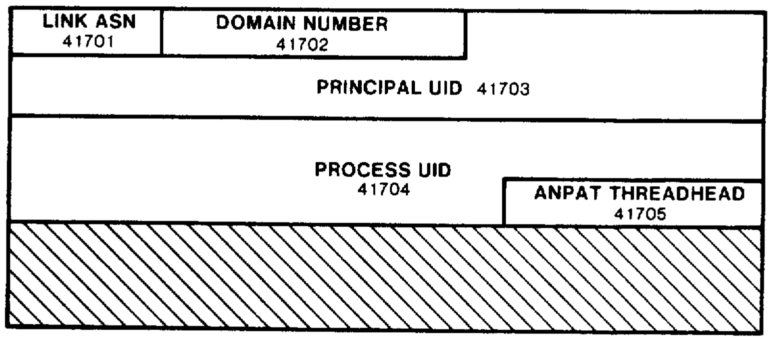

Turning now to ASTEs 40806, these are illustrated in detail in FIG. 417. Link Field 41701 contains either the index of the next ASTE 40806 in the list to which ASTE 40806 belongs or 0 if ASTE 40806 is the last ASTE 40806 in its list. The values of the other fields are meaningful only if ASTE 40806 is not on the free list, i.e., if ASTE 40806's index is an ASN for some active subject. Domain Number Field 41202 contains a small integer called a Domain Number. The Domain Number represents the domain component of the subject associated with ASTE 40806's index. As will be explained in detail below, Domain Numbers have the same relationship to domain UIDs 40401 that ASNs have to subjects. Principal UID Field 41703 and Process UID Field 41704 contain UIDs 40401 for the subject's principal and process components. ANPAT Thread Head Field 41705 contains the index of the start of a list of entries for the subject in ANPAT 10920. That table will be explained in detail below.

Figure 418:
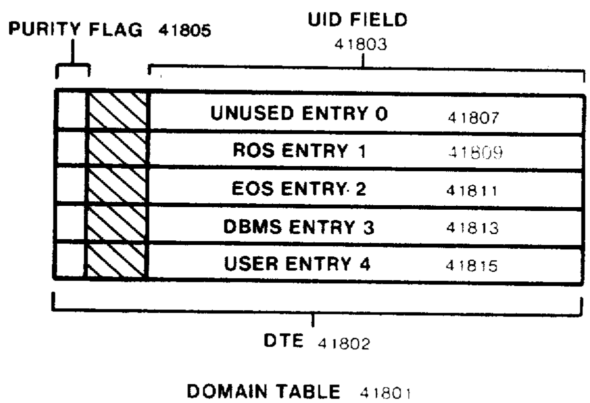

3. Table 41801 and Domain Numbers (FIG. 418)

For reasons of efficiency, KOS uses small integers called Domain Numbers to represent domain UIDs 40401 in KOS tables in MEM 10112. KOS uses a table called the Domain Table for translating domain UIDs 40401 into domain numbers. A domain's Domain Number is the index of the Domain Table Entry for the domain's domain UID 40401. A domain whose UID 40401 has an entry in the domain table is called an active domain. In the present embodiment, there are only four domains, and all four domains are always active. Consequently, the Domain Table consists solely of entries for the four domains and an additional entry for the Null Domain. FIG. 418 shows the present embodiment's Domain Table 41801. Each domain table entry (DTE) 41802 has two fields: a UID Field 41803, which contains domain UID 40401 for the domain represented by DTE 41802, and Purity Flag Field 41805. If a DTE 41802's Purity Flag Field 41805 is set, the domain represented by DTE 41801 is a Pure Domain. Pure Domains are discussed below. In the present embodiment, the five DTEs 41802 are assigned as follows: DTE 41802 0 is assigned to the Null domain, DTE 41802 1 to the KOS domain, DTE 41802 2 to the EOS domain, DTE 41802 3 to the DBMS domain, and DTE 41802 4 to the user domain, giving these domains the domain numbers 0, 1, 2, 3, and 4, respectively. In embodiments which allow definition of additional domains, Domain Table 41801 may have additional DTEs 41802 and the Access Checking System may have means for activating and deactivating domains which function in a manner analogous to the means for activating and deactivating objects and subjects.

4. Pure Domains and Pure Subjects

Objects that belong to a Pure Domain may be accessed by all subjects which have the Pure Domain's UID 40401 as their domain component, regardless of the subject's other components. Such subjects are called Pure Subjects. Consequently, when the Access Checking System encounters a Pure Subject, it disregards all components of the subject but the domain component. This being the case, all Pure Subjects with a given pure domain component may have a common ASTE 40806 and share a single ASN, thus allowing a great reduction in the size of AST 10914, in the present embodiment, KOS subject activation microcode checks Domain Table 41801 before it hashes a subject to determine whether the subject's domain component is a Pure Domain. If it is, KOS subject activation microcode replaces the subject's principal and process components with predetermined principal and process components used with all pure subjects having that pure domain and then hashes the subject. Since all of the pure subjects have the same components when hashed, the hash always locates the common ASTE 40806 for subjects with the Pure Domain. In the present embodiment, only the KOS domain is a Pure Domain; in other embodiments, there may be additional pure domains, including pure user domains.

5. Control Attribute Tables

As previously mentioned, information from an object's LAUDE 40906 is accelerated into KOS Protection Tables 10232 in MEM 10112 when the object is being accessed by Processes 610. The KOS tables which contain the access control information from LAUDE 40906 are APAM 10918 and ANPAT 10920. APAM 10918 contains primitive data access information for active objects, and ANPAT 10920 contains primitive non-data access information and extended access information for active objects. Both tables behave logically like two-dimensional arrays whose indexes are AON 41304s and ASNs. Entries are referenced by an AON 41304, ASN pair, and each entry has a copy of the kinds of access control information mentioned above for the object represented by AON 41304 and the subject represented by the ASN. The discussion below deals first with ANPAT 10920 and then with APAM 10918.

a.a. ANPAT 10920 (FIG. 419)

While ANPAT 10920 behaves logically as described above, it is implemented as a table whose entries are linked into lists. FIG. 419 shows ANPAT 10920, the lists formed by ANPAT Entries (ANPATEs) 41907, and the relationship between ANPAT 10920 lists and ASTEs 40806 and AOTEs 41306.

As was illustrated in FIGS. 415 and 417, AOTEs 41306 and ASTEs 40806 have ANPAT Thread Fields. These Fields contain the indexes of ANPATEs 41907. In the case of ANPAT Thread Field 41705 in ASTE 40806, the index is to the first ANPATE 41907 in the list of ANPATEs 41907 containing access control information relevant to the subject represented by the ASN which is ASTE 40806's index. Similarly, the index in ANPAT Thread Field 41515 in AOTE 41316 is to the first ANPATE 41907 in the list of ANPATEs 41907 containing access control information for the object represented by the AON which is AOTE 41316's index. Each ANPATE 41907 that is in use thus belongs to two lists: the list belonging to AON 41304 of the object to which PACLE 41613 or EACLE 41615 belongs from which the information in ANPATE 41907 was copied and the list belonging to the ASN of a subject which matches Subject Templates 41601 of PACLEs 41613 or EACLEs 41615 which have been copied into ANPATE 41907. The following discussion first presents an overview of ANPAT 10920, then gives the details concerning individual ANPATEs, and finally discusses the use of ANPAT 10920 in CS 10110.

Figure 419:
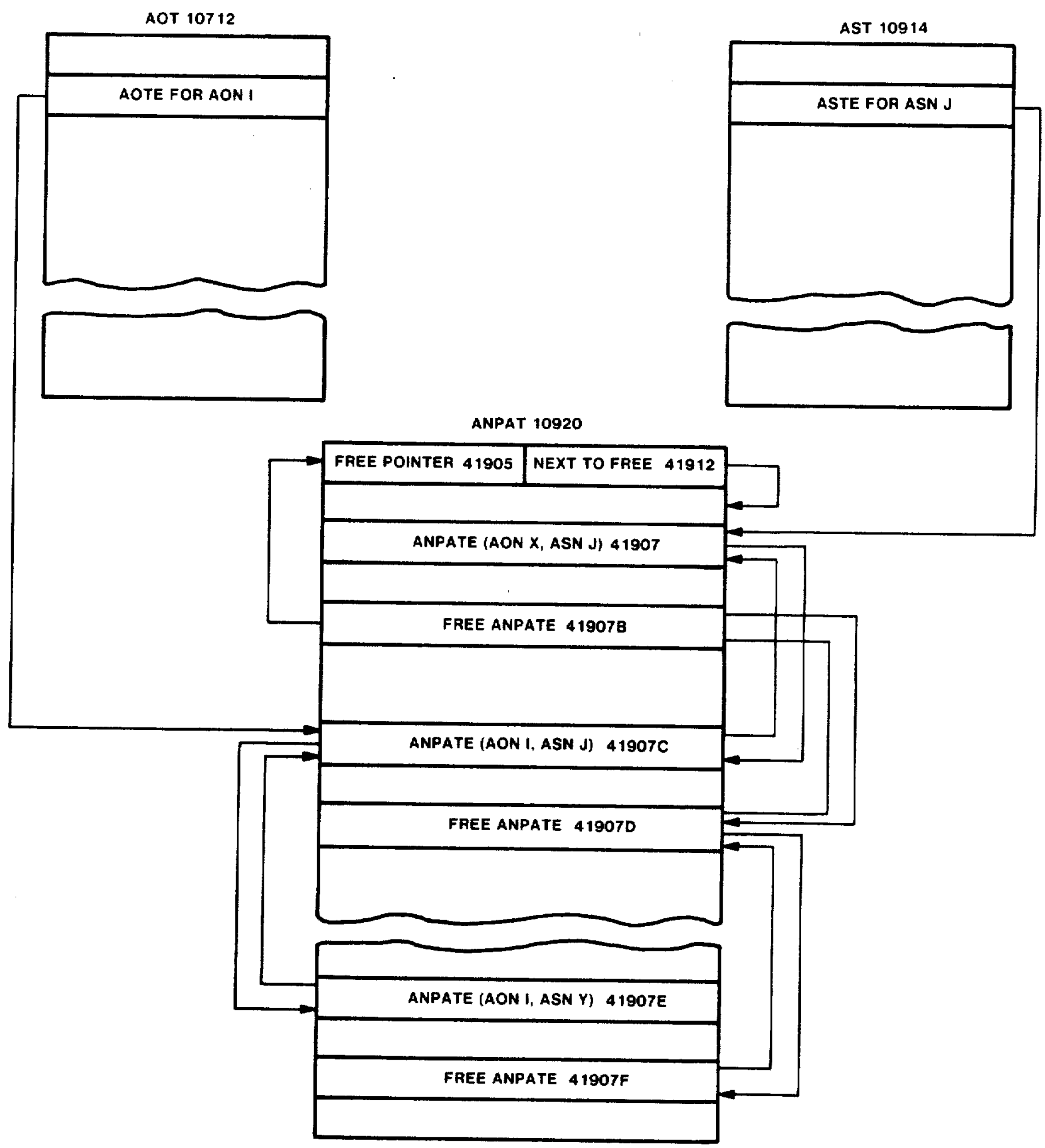

For the sake of clarity, FIG. 419 shows ANPATE 41907 lists for a single AOTE 41306 and a single ASTE 40806 respectively. AOT 10712 contains an AOTE 41306 for AON 41304I; the field in AOTE 41306 that contains the index of the first ANPATE 41907 in the list that belongs to the object represented by AON 41304I points to ANPATE 41907C and a Link Field in ANPATE 41907C contains the index for the next and last entry in the list, ANPATE 41907E. The list may, of course, have many ANPATES 41907. Each ANPATE 41907 after the first contains a field that points back to the previous entry in the list; thus ANPATE 41907E points back to ANPATE 41907C.

ANPATEs 41907 for ASNs are linked in the same fashion as ANPATEs 41906 for AONs 41304. AST 10914 contains an ASTE 40806J for ASNJ. ANPAT Thread Field 41705 in ASTE 40806 contains the index of ANPATE 41907A. A field in ANPATE 41907A points to the next and last entry in the list for ASNJ, ANPATE 41907C. ANPATE 41907C belongs both to the list of entries for AON 41304I and the list of entries for ASNJ; consequently, ANPATE 41907C contains access control information from a PACLE 41613 or an EACLE 41615 which belongs to the object represented by AON 41304I and whose Subject Template 41601 matches the subject represented by ASNJ.

ANPAT 10920 contains two fields that are not ANPATEs, Free Pointer Field 41905 and Next to Free Pointer Field 41912. Free Pointer Field 41905 points to the head of a list of ANPATE 41907 entries that are not in use, i.e., do not belong to any AON 41304 and ASN lists. ANPATEs 41907 on the free list are linked together as described above. Next to Free Pointer Field 41912 points to an ANPATE 41907 that can be reused if the free list is empty. For details, see the discussion of ANPATE 41907 faults below.

b.b. ANPAT Entries 41907 (FIG. 420)

FIG. 420 is a detailed representation of an ANPATE 41907. The first four fields contain the indexes of other entries in the lists to which ANPATE 41907 belongs. Subject Thread 42001 is the index of the next ANPATE 41907 in the ASN list to which ANPATE 41907 belongs; Subject Back Thread 42002 is the index of the previous ANPATE 41907 in the ASN list. Subject Thread 42001 has the value 0 if ANPATE 41907 is the last ANPATE 41907 in the ASN list, and Subject Back Thread 42002 has the value 0 if ANPATE 41907 is the first ANPATE 41907 in the ASN list. Similarly, Object Thread 42003 is the index of the next ANPATE 41907 in the AON list to which ANPATE 41907 belongs, and Object Back Thread 42004 contains the index of the previous ANPATE 41907 in that AON list. Object Thread 42003 has the value 0 if ANPATE 41907 is the last ANPATE 41907 in the AON list, and Object Back Thread 42004 has the value 0 if ANPATE 41907 is the first ANPATE 41907 in the AON list.

ASN Field 42005 contains the ASN for ANPATE 41907's subject. ANPAT Type Flag 42006 indicates whether ANPATE 41907 contains primitive non-data access information or extended access information. Both kinds of ANPATE 41907 have the same format. Valid Flag 42007 indicates whether ANPATE 41907 is valid. If the flag has the value 1, the information in ANPATE 41907 is valid; otherwise, it is not. Access Control Array 42008, finally, contains ANPATE 41907's access control information. Access Control Array 42008 contains 32 bits of data; if ANPAT Type Field 42006 indicates that ANPATE 41907 represents a PACLE 41613, the 32 bits contain a copy of PACLE 41613's Access Mode Bit Field 41615; if Type Field 42006 indicates that ANPATE 41907 represents an EACLE 41615, the 32 bits in Field 42008 contain a copy of EACLE 41615's Access Mode Array Field 41617. In the first case, the field is interpreted as described in the discussion of primitive non-data access; in the second, it is dealt with as described in the discussion of extended access.

c.c. Operations Involving ANPAT 10920

ANPAT 10920 is read by the previously-described Access Control System Procedures 602 get_primitive_access and get_extended_access_and_extended type. It is maintained by these Procedures 602 and by Access Control System Procedures 602 which the Virtual Memory Management System invokes when it deactivates a object or a subject.

Turning first to get_primitive_access and get_extended_access_and_extended type, these Procedures 602 both work in the same manner: they first convert their subject argument to its ASN, then use their object UID 40401 argument to locate the object's AOTE 41306. ANPAT Thread Field 41515 in AOTE 41306 yields the first ANPATE 41907 in the list of ANPATEs 41907, and the Procedures 602 read the list until they either reach its end or locate an ANPATE 41907 whose ASN field 42005 contains the subject argument's ASN. If ANPATE 41907's Valid Flag 42007 is set, and if ANPAT Type Flag 42006 indicates that ANPATE 41907 is the kind of ANPATE 41907 sought by Procedure 602, Procedure 602 returns the required information from Access Control Array Field 42008. Otherwise, Procedure 602 continues searching the list.

If there is no ANPATE 41907 for the subject and object for which access is being checked, the Procedures 602 call other Access Control System Procedures 602 which create an ANPATE 41907 for the subject and object. These procedures locate PACLE 41613 or EACLE 41615 containing the information which get_primitive_access or get_extended_access_and_extended_type attempted to read, obtain the required information, take an ANPATE 41907 from the free list, copy the information into ANPATE 41907, and link ANPATE 41907 to the heads of the AON 41304 list for the object and the ASN list for the subject. If the free list is empty, the routines take ANPATE 41907 specified by Next to Free Field 42012, unlink it from the ASN and AON 41304 lists to which it belongs and link it into the ASN and AON 41304 lists for which ANPATE 41907 is required. Next to Free Field 42012 is then reset to point to a different ANPATE 41907.

Each time an object is deactivated, the Active Object Manager obtains the location of the first ANPATE 41907 in the object's ANPATE list from AOTE field 41515 and then invokes an Access Control System Procedure 602 which unlinks all of the ANPATEs 41907 on the object's ANPATE list and returns them to the list of free ANPATEs, relinking all subject lists which the object list ANPATEs 41907 belong to in the process. When the Access Control System deactivates a subject, it invokes a similar Access Control System Procedure 602 which performs the analagous operation on the list of ANPATEs 41907 belonging to the ASN for the subject which is being deactivated.

d.d. APAM 10918 and Protection Cache 10234 (FIG. 421)

Primitive non-data access rights are checked only when users invoke KOS routines that require such access rights, and extended access rights are checked only when users request such checks. Primitive data access rights, on the other hand, are checked every time a Virtual Processor 612 makes a memory reference while executing a Process 610. The KOS implementation of primitive data access right checking therefore emphasizes speed and efficiency. There are two parts to the implementation: APAM 10918 in MEM 10112, and Protection Cache 10234 in JP 10114. APAM 10918 is in a location in MEM 10112 known to KOS microcode. APAM 10918 contains primitive data access information copied from PACLEs 41613 which belong to active objects and whose Subject Template 41601 matches an active subject. Protection Cache 10234, in turn, contain copies of the information in APAM 10918 for the active subject of Process 610 whose Virtual Processor 612 is currently bound to JP 10114 and active objects referenced by Process 610. A primitive data access check in CS 10110 begins with Protection Cache 10234, and if the information is not contained in Protection Cache 10234, proceeds to APAM 10918, and if it is not there, finally, to the object's PACL. The discussion which follows begins with APAM 10918.

FIG. 421 shows APAM 10918. APAM 10918 is organized as a two-dimensional array. The array's row indexes are AONs 41304, and its column indexes are ASNs. There is a row for each AON 41304 in CS 10110, and a column for each ASN. In FIG. 421, only a single row and column are shown. Any primitive data access information in APAM 10918 for the object represented by AON 41304J is contained in Row 42104, while Column 42105 contains any primitive data access information in APAM 10918 for the subject represented by ASNK. APAM Entry (APAME) 42106 is at the intersection of Row 42104 and Column 42105, and thus contains the primitive data access information from that PACLE 41613 belonging to the object represented by AON 41304J whose Subject Template 41601 matches the subject represented by ASNK.

An expanded view of APAME 42106 is presented beneath the representation of APAM 10918. APAME 42106 contains four 1-bit fields. The bits represent the kinds of primitive data access that the subject represented by APAME 42106's column index has to the object represented by APAME 42106's row index.

- Field 42107 is the Valid Bit. If the Valid Bit is set, APAME 42106 contains whatever primitive data access information is available for the subject represented by the column and the object represented by the row. The remaining fields in APAME 42106 are meaningful only if Valid Bit 42107 is set.
- Field 42109 is the Execute Bit. If it is set, APAME 42106's subject has Execute Access to APAME 42106's object.
- Field 42111 is the Read Bit. If it is set, APAME 42106's subject has Read Access to APAME 42106's object.
- Field 42113 is the Write Bit. If it is set, APAME 42106's subject has Write Access to APAME 42106's object.

Any combination of bits in Fields 42109 through 42113 may be set. If all of these fields are set to 0, APAME 42106 indicates that the subject it represents has no access to the object it represents.

KOS sets APAME 42106 for an ASN and an AON 41304 the first time the subject represented by the ASN references the object represented by AON 41304. Until APAME 42106 is set, Valid Bit 42107 is set to 0. When APAME 42106 is set, Valid Bit 42107 is set to 1 and Fields 42109 through 42113 are set according to the primitive data access information in the object's PACLE 41613 whose Subject Template 41601 matches the subject. When an object is deactivated, Valid Bits 42107 in all APAMEs 42106 in the row belonging to the object's AON 41304 are set to 0; similarly, when a subject is deactivated, Valid Bits 42107 in all APAMEs 42106 in the column belonging to the subject's ASN are set to 0.

e.e. Protection Cache 10234 and Protection Checking (FIG. 422)

The final stage in the acceleration of protection information is Protection Cache 10234 in JP 10114. The details of the way in which Protection Cache 10234 functions are presented in the discussion of the hardware; here, there are discussed the manner in which Protection Cache 10234 performs access checks, the relationship between Protection Cache 10234, APAM 10918, and AOT 10712, and the manner in which KOS protection cache microcode maintains Protection Cache 10234.

FIG. 422 is a block diagram of Protection Cache 10234, AOTE 10712, APAM 10918, and KOS Microcode 42207 which maintains Protection Cache 10234. Each time JP 10114 makes a memory reference using a Logical Descriptor 27116, it simultaneously presents Logical Descriptor 27116 and a Signal 42203 indicating the kind of memory operation to Protection Cache 10234 and ATU 10228. Entries 42215 in Protection Cache 10234 contain primitive data access and length information for objects previously referenced by the current subject of Process 610 whose Virtual Processor 612 is currently bound to JP 10114. On every memory reference, Protection Cache 10234 emits a Valid/invalid Signal 42205 to MEM 10112. If Protection Cache 10234 contains no Entry 42215 for AON 41304 contained in Logical Descriptor 27116's AON field 27111, if Entry 42215 indicates that the subject does not have the type of access required by Process 610, or if the sum of Logical Descriptor 27116's OFF field 27113 and LEN field 27115 exceed the object's current size, Protection Cache 10234 emits an Invalid Signal 42205. This signal causes MEM 10112 to abort the memory reference. Otherwise, Protection Cache 10234 emits a Valid Signal 42205 and MEM 10112 executes the memory reference.

When Protection Cache 10234 emits an Invalid Signal 42205, it latches Logical Descriptor 27116 used to make the reference into Descriptor Trap 20256, the memory command into Command Trap 27018, and if it was a write operation, the data into Data Trap 20258, and at the same time emits one of two Event Signals to KOS microcode. Illegal Access Event Signal 42208 occurs when Process 610 making the reference does not have the proper access rights or the data referenced extends beyond the end of the object. Illegal Access Event Signal 42208 invokes KOS microcode 42215 which performs a Microcode to Software Call 42217 (described in the discussion of Calls) to KOS Access Control System Procedures 602 and passes the contents of Descriptor Trap 20256, Command Trap 27018, the ASN of Process 610 (contained in a register MGR's 10360), and if necessary, the contents of Data Trap 20258 to these Procedures 602. These Procedures 602 inform EOS of the protection violation, and EOS can then remedy it.

Cache Miss Event Signal 42206 occurs when there is no Entry 42215 for AON 41304 in Protection Cache 10234. Cache Miss Event Signal 42206 invokes KOS Protection Cache Miss Microcode 42207, which constructs missing Protection Cache Entry 42215 from information obtained from AOT 10712 and APAM 10918. If APAM 10918 contains no entry for the current subject's ASN and the AON of the object being referenced, Protection Cache Miss Microcode 42207 performs a Microcode-to-software Call to KOS Access Control System Procedures 602 which go to LAUDE 40906 for the object and copy the required primitive data access information from the PACLE 41613 belonging to the object whose Subject Template 41601 matches the subject attempting the reference into APAM 10918. The KOS Access Control System Procedures 602 then return to Cache Miss Microcode 42207, which itself returns. Since Cache Miss Microcode 41107 was invoked by an Event Signal, the return causes JP 10114 to reexecute the memory reference which caused the protection cache miss. If Protection Cache 10234 was loaded as a result of the last protection cache miss, the miss does not recur; if Protection Cache 10234 was not loaded because the required information was not in APAM 10918, the miss recurs, but since the information was placed in APAM 10918 as a result of the previous miss, Cache Miss Microcode 42207 can now construct an Entry 42215 in Protection Cache 10234. When Cache Miss Microcode 42207 returns, the memory reference is again attempted, but this time Protection Cache 10234 contains the information and the miss does not recur.

Cache Miss Microcode 42207 creates a new Protection Cache Entry 42215 and loads it into Protection Cache 10234 as follows: Using AON 41304 from Logical Descriptor 27116 latched into Descriptor Trap 20256 when the memory reference which caused the miss was executed and the current subject's ASN, contained in GR's 10360, Cache Miss Microcode locates APAME 42106 for the subject represented by the ASN and the object represented by AON 41304 and copies the contents of APAME 42106 into a JP 10114 register which may serve as a source for JPD Bus 10142. It also uses AON 41304 to locate AOTE 41306 for the object and copies the contents of Size Field 41519 into another JP 10114 register which is a source for JPD Bus 10142. It then uses three special microcommands, executed in successive microinstructions, to load Protection Cache Entry 42215. The first microcommand loads Protection Cache Entry 42215's TS 24010 with AON 41304 of Logical Descriptor 27116 latched into Descriptor Trap 20256; the second loads the object's size into Entry 42215's EXTENT field, and the third loads the contents of APAME 42106 into the PRIM Access field in the same fashion.

Another microcommand invalidates all Entries 42215 in Protection Cache 10234. This operation, called flushing, is performed when an object is deactivated or when the current subject changes. The current subject changes whenever a Virtual Processor 612 is unbound from JP 10114, and whenever a Process 610 performs a call to or a return from a Procedure 602 executing in a domain different from that in which the calling Procedure 602 or the Procedure 602 being returned to executes in. In the cases of the Call and the unbinding of Virtual Processor 612, the cache flush is performed by KOS Call and dispatching microcode; in the case of object deactivation, it is performed by a KOS procedure using a special KOS SIN which invokes Cache Flush Microcode.

D. Virtual Memory Management (FIG. 423)

As far as users of CS 10110 are concerned, CS 10110's memory has only one level: any Process 610 executing on a CS 11010 may access any object whose LAU 40405 is physically accessible and for which Process 610's current subject possesses the required access rights. CS 10110's memory is, however, hierarchical. Hierarchical memories take advantage of the fact that the price of storage decreases as the time required to access it increases. Since fast access times are required only for Procedures 602 and data being used by Processes 610 which are bound to Virtual Processors 612, a CS 10110's expensive fast memory may be only a small portion of its total memory. Until a Procedure 602 or a piece of data is required by a Process 610, it resides on slow cheap memory; when a Process 610 requires the data or Procedure 602, CS 10110 copies the data or Procedure 602 onto the fast expensive memory. A memory hierarchy may have many levels: for example, a group of slow disks for data not required by any executing Process 610, a fast disk for data that the executing Processes 610 may require, and random-access memory for data that is being used by Processes 610 which are bound to Virtual Processors 612.

While CSs 10110 may have memory systems with many levels, in the present embodiment, the memory system has two levels: Secondary Memory 10124 and MEM 10112. Data resides on Secondary Memory 10124 until the data is required by a Process 610 executing on CS 10110. At that point, KOS automatically moves a copy of the data from Secondary Memory 10124 into MEM 10110. If the program changes the copy in MEM 10112, the operating system updates the copy in Secondary Memory 10124 to agree with the copy in MEM 10112.

In CS 10110, data is moved to and from MEM 10112 and Secondary Memory 10124 in 2048 byte units called Object Pages. Each object in Secondary Memory 10124 is divided into Object Pages, and when a program refers to data in an object, hardware and microcode components of KOS determine which Object Page contains the bits specified by the reference's offset and length and whether there is a copy of that Object Page in MEM 10112. If there is none, KOS initiates I/O operations which copy the entire Object Page containing the data onto a 2048-byte unit of MEM 10112 called a MEM 10112 Frame. When an Object Page is associated with a MEM 10112 Frame, the Object Page is said to be bound to the MEM 10112 Frame.

FIG. 423 illustrates the relationship between Object Pages and MEM 10112 Frames and the relationship between UID-offset addresses, AON-offset addresses, and frame-number displacement addresses. FIG. 423 has five parts, Secondary Memory 10124 containing object A 42301, UID to AON Translator 42304, comprising AOT 10712 and LAR microcode, which translates UIDs 40401 to AONs 41304 and thereby allows the conversion of UID-offset addresses to AON-offset addresses, JP 10114 Registers 42306 for Logical Descriptors 27116 which include the AON-offset addresses, AON-offset to Frame Number-displacement Translator 42316, comprising ATU 10228, KOS Virtual Memory System tables, and KOS Logical Address Translation (LAT) Microcode 40704, and MEM 10112, which contains MEM 10112 Frames 42308. In FIG.

423, Object A is divided into n 2048-byte Object Pages 42302. Location B 42309 in object A 42301 has a UID-offset Address 42303 that locates it in the fifth Object Page 42302 of object A 42301. UID-offset address 42303 may also be expressed in terms of Page Number 42310 and Displacement Within the Page 42311. As previously discussed, when UID-offset Address 42303 is moved from memory into JP 10114's registers, it is translated into AON-offset Address 42305. When JP 10114 uses AON-offset Address 42305 in a memory reference, AON-offset to Frame Number-displacement Translator 42316 translates AON-offset address of B 42305 into frame number-displacement address of B 42307. When the Virtual Memory System binds an Object Page 42302 to a MEM 10112 Frame 42308, tables belonging to Translator 42316 keep track of which Object Page 42302 is bound to which MEM 10112 Frame 42308. In FIG. 423, Object Page 42302 5 is bound to MEM 10112 Frame 42308 2. In MEM 10112 Frame 42308 2, the copy of the data at Location B 42309 in Object Page 42302 5 is at Location B' 42313. Since MEM 10112 Frame 42308 2 contains a copy of Object Page 42302 5, Displacement 42311, which gave the distance from the beginning of Object Page 42302 5 to location B 42309 also gives the distance from the beginning of MEM 10112 Frame 42308 2 to location B'. Translator 42316 converts AON-offset Address of B 42305 into AON-page-displacement Address of B 42313 and then converts the AON-page portion of Address 42313 into Frame Number 42314 of MEM 10112 Frame 42308 to which Object Page 42302 5 is bound. Since Displacement 42311 is the same in both Secondary Memory 10124 and MEM 10112, Frame Number 42314 combined with Displacement 42311 yields the Frame number-displacement Address of B' 42307.

The portion of KOS that makes CS 10110's hierarchical memory system into a one-level virtual memory is the Virtual Memory Manager (VMM). The VMM performs five tasks:

The VMM maintains tables in MEM 10112 that establish relationships between Object Pages 42302 and the MEM 10112 Frames 42308 to which they are bound.

VMM hardware, tables, and microcode translate AON-offset addresses into frame number-displacement addresses.

The VMM handles page faults. A page fault occurs when a Virtual Processor 612 bound to JP 10114 makes a reference to an Object Page 42302 that is not bound to a MEM 10112 Frame 42308. When this happens, the VMM suspends the faulting Virtual Processor 612, binds Object Page 42302 containing the data to a MEM 10112 Frame 42308, and begins an I/O operation that copies Object Page 42302 from Secondary Memory 10124 into MEM 10112 Frame 42308 to which it is bound. When the copying is finished, faulting Virtual Processor 612 can return to JP 10114.

If a program is modifying the data contained in MEM 10112 Frame 42308, the VMM system may periodically copy the contents of MEM 10112 Frame 42308 back to Object Page 42302 which is bound to MEM 10112 Frame 42308, thereby assuring that Object Page 42302 and MEM 10112 Frame 42308 have the same contents. This operation is called frame cleaning.

When an Object Page 42302 is no longer required in MEM 10112, or when there are no more unbound MEM 10112 Frames available, the VMM System unbinds an Object Page 42302 from its MEM 10112 Frame 42308, thereby making MEM 10112 Frame 42308 available for another Object Page 42302. This operation is called purging a page.

For the most part, the VMM System is completely invisible to users of CS 10110. User programs reference data by its location in objects, and the VMM System translates addresses and copies Object Pages 42302 into and out of MEM 10112 as required by the references. However, the VMM system does allow EOS to request that a portion of an object be copied into MEM 10112 Frames 42308 before a reference to data in that portion of the object occurs. This operation is called preloading.

a. Components of the VMM System (FIG. 424)

The VMM System is implemented with tables in MEM 10110, a hardware cache that accelerates some of the information in the main memory tables, a Virtual Memory Manager Process 610, Procedures 602 executed by Virtual Memory Manager Process 610 and other Processes 610, and microcode routines.

FIG. 424 gives a conceptual overview of the VMM System's components. VMM Tables 42404 are always present in MEM 10112 at locations known to KOS VMM microcode. VMM Tables 42404 are manipulated by the other components of the VMM system, and the information contained in Tables 42404 in turn determines the behavior of the other components. ATU 10228 is a component of JP 10114. As described in detail in the discussion of JP 10114, ATU 10228 translates Logical Descriptors 27116 into physical descriptors and transmits the physical descriptors to MEM 10112. Logical Descriptors 27116 are presented to ATU 10228 by Virtual Processor 612 42401 (VP 42401) bound to JP 10114 as VP 42401 executes some Process 610 42406 (PROC 42406). If ATU 10228 is unable to translate a Logical Descriptor 27116, it produces an ATU Miss Event Signal which invokes VMM Microcode 42402. As will be described in detail below, VMM Microcode 42402 first examines VMM Tables 42404 to determine whether Object Page 42302 referenced by Logical Descriptor 27116 which ATU 10228 could not translate is available in MEM 10112. If Object Page 42302 is available, VMM Microcode 42402 makes an entry for Logical Descriptor 27116 in ATU 10228 and execution of VP 42401 continues. If Object Page 42302 is not available, a page fault results and VMM Microcode 42402 first alters VMM Tables 42404 to indicate that VP 42401 has a task for VMM Process 610 42405 (VMM PROC 42405) and then suspends VP 42401.

Some time after VP 42401 is suspended, the alterations made to VMM tables 42404 cause VMM Virtual Processor 612 42403 (VMM VP 42403) to be bound to JP 10114. VMM PROC 42405 is always bound to VMM VP 42403. The components of VMM PROC 42405 examine VMM Tables 42404 to determine what tasks they have to perform. As a task is performed, VMM PROC 42405's components alter VMM Tables 42404. Each time VMM PROC 42405 completes a task, VMM PROC 42405 suspends VMM VP 42403. Eventually, the execution of tasks by VMM PROC 42405 makes Object Page 42302 required by VP 42401 available, and VP 42401 can once again be bound to JP 10114.

b. Advantages of the VMM System

The VMM System in the present embodiment has several advantages. In many operating systems, VMM functions are initiated only when an interrupt signal causes the interruption of an executing Process 610. The VMM functions are executed in whatever Process 610 is running when the interrupt occurs. When a Process 610 causes a page fault, an interrupt occurs and operating system Procedures 602 executed by Process 610 begin the sequence of operations necessary to make a page available and then suspend Process 610. Faulting Process 610's Virtual Processor 612 cannot be bound to the processor again until the page is in fact available. When the page becomes available, another interrupt occurs. Because faulting Process 610 cannot return to the processor until the page is available, this interrupt occurs while a Process 610 other than the faulting Process 610 is running. Operating system Procedures 602 executed by that Process 610 must complete the sequence of operations connected with the page fault, even though the Process 610 executing the routines has nothing to do with the page fault.

Because VMM functions involve interrupts, and because VMM functions must be callable from any executing Process 610, the design of VMM functions has traditionally been complex. The VMM functions must work in Processes 610 that have nothing to do with the work the VMM functions are doing, and must also be able to deal with the manifold situations in which an interrupt might occur.

One method of simplifying the design of VMM functions has been to place the VMM functions in Processes 610 of their own. For example, one VMM Process 610 might handle page faults, another might manage primary memory frames, and a third bind and unbind primary memory frames and pages. This method of design ensures that the environment in which a VMM function is executed is always that provided by a Process 610 specially designed for the function. The disadvantage of this method is that it increases the number of Processes 610 and Virtual Processors 612 that must be allocated to the operating system, and therefore decreases the number of Processes 610 and Virtual Processors 612 available for user programs.

In the present embodiment of CS 10110, the VMM system is designed in a manner which eliminates the complexities introduced by interrupts and which gains the advantages of a VMM system with separate Processes 610 at less cost in Processes 610 and Virtual Processors 612. As described above, a page fault in CS 10110 does not cause an interrupt in PROC 42406 which is executing when the page fault occurs. Instead, the page fault causes the alteration of VMM Tables 42404, including the advance of an Event Counter for VMM PROC 42405, and the suspension of faulting VP 42401. The state of PROC 42406 is unaffected by the page fault. From the point of view of PROC 42406, the only difference between a reference that causes a page fault and one that does not is the time required to make the faulting reference. Furthermore, the only portion of the page fault processing that occurs in PROC 42406 is the manipulation of VMM Tables 42404. All memory operations required to take care of the page fault are done by VMM PROC 42405.

As depicted in FIG. 424, the VMM system in the present embodiment has only the single VMM PROC 42405, and VMM PROC 42405 is permanently bound to VMM VP 42403. However, as will be described in detail below, VMM PROC 42405 is logically equivalent to three Processes 610, one to handle page faults, one to manage MEM 10112 Frames 42308, and one to bind and unbind MEM 10112 Frames 42308 and Object Pages 42302.

c. Detailed Overview of the VMM System (FIG. 425)

FIG. 425 presents a more detailed view of the VMM System. Each of the elements presented in FIG. 424 is broken into its components. Moving from left to right, the leftmost portion of FIG. 425 presents ATU 10228 and the components of VMM Microcode 42402. The center portion presents VMM Tables 42404, and the rightmost portion presents the components of VMM PROC 42405. The relationships between the components are indicated by arrows. If the components are microroutines or Procedures 602, an arrow linking one component to another indicates that the first component invokes the second. If one component is a set of microroutines or Procedures 602 and the other a table, the arrow indicates that the set of microroutines or Procedures 602 alters the table. For example, Paging Manager Procedures 42519 both alter VMM Queue 42506 and invoke Frame Manager Procedures 42520.

VMM Tables 42404 coordinate the other components of the VMM system, and therefore, the overview will begin at the top of the section of FIG. 425 which depicts VMM Tables 42404.

VMMEC 42505

Virtual Memory Manager Event Counter (VMMEC) 42505 controls VMM VP 42403. VMM VP 42403 awaits VMMEC 42505, and some time after VMMEC 42505 is advanced, VMM VP 42403 is bound to JP 10114.

VMMO 42506

VMM Queue (VMMQ) 42506 is in the same table as VMMEC 42505. VMMQ 42506 contains lists of jobs to be performed by VMM PROC 42405 bound to VMM VP 42403.

MHT 10716

The entries in Memory Hash Table (MHT) 10716 associate Object Pages 42302 with MEM 10110 Frames 42308. Valid entries in the table contain an AON-page number for an Object Page 42302 and Frame Number 42314 for MEM 10112 Frame 42308 to which Object Page 42302 represented by the AON-page number is bound. In addition, the entries contain information about the status of Object Page 42302 and MEM 10112 Frame 42308 which are associated by the entry.

MFT 10718

Memory Frame Table (MFT) 10718 contains one entry for each MEM 10112 Frame 42308 in MEM 10112. MFT 10718 contains lists that keep track of the status of MEM 10112 Frames 42308.

OMQ 41401

OMQ 41401 has been previously described. VMM PROC 42405 checks OMQ 41401 for functions to be performed by the VMM System.

IOS messages 42524

These tables are part of the KOS I/O system. The tables send messages to IOS 10116 when IOS 10116 must move Object Pages 42302 into or out of MEM 10112 and receive messages from IOS 10116 when IOS 10116 has completed these activities. VMM PROC 42405 uses IOS messages to start and finish the I/O that copies Object Pages 42302 from Secondary Memory 10124 to MEM 10112 and vice-versa.

VMMEC 42505, VMMQ 42506, MHT 10716, MFT 10718, and WSM 10720 will all be discussed in detail along with the functions which they implement and coordinate.

Turning next to ATU 10228 and VMM Microcode 42402, and starting again at the top, there are:

ATU 10228

As previously discussed, address translation unit (ATU) 10228 is a JP 10114 cache which translates Logical Descriptors 27116 into the physical descriptors required for references to MEM 10112. When VP 42401 running on FU 10120 makes a memory reference using a Logical Descriptor 27116, it presents Logical Descriptor 27116 to ATU 10228. If ATU 10228 has an entry for the Logical Descriptor 27116, it immediately presents the physical descriptor to MEM 10112. If ATU 10228 has no entry for Logical Descriptor 27116, ATU 10228 places Logical Descriptor 27116 in Descriptor Trap 20256 and produces an Event Signal which invokes LAT Microcode 40704.

LAT Microcode 40704

LAT Microcode 40704 has three components: LAT Microcode proper, 42502, WLAT Microcode 42504, and LAT* Microcode. All three components take an AON-page number and search MHT 10716 for an Entry for the AON-page. LAT* simply returns a value indicating whether there is an MHT 10716 Entry for the AON-page; LAT Microcode 42502 and WLAT Microcode 42504 update ATU 10228. If LAT Microcode 42502 or WLAT Microcode 42504 finds an MHT 10716 Entry for the AON-page, and if Object Page 42302 represented by the AON-page number is bound to a MEM 10112 Frame 42308, LAT Microcode 42502 or WLAT Microcode 42504 constructs an entry for the AON-page in ATU 10228 and returns, causing VP 42401 to reattempt the reference. If LAT Microcode 42502 or WLAT Microcode 42504 finds that there is no entry for Object Page 42302 in MHT 1076, or that Object Page 42302 is not available, LAT Microcode 42502 or WLAT Microcode 42504 invokes Page Fault Microcode 42503.

Page Fault Microcode 42503

Page Fault Microcode 42503 begins the process of binding an Object Page 42302 to a MEM 10112 Frame 42308 and copying the contents of Object Page 42302 into the MEM 10112 Frame 42308 to which it has been bound. Page Fault Microcode 42503 first creates an entry for missing Object Page 42302's AON-page number in MHT 10718. The next step is the preparation of an entry in VMMQ 42506. Page Fault Microcode 42503 then advances VMMEC 42505 and suspends VP 42401. After Object Page 42302 is available in MEM 10112, VP 42401 can resume executing Page Fault Microcode 42503. Page Fault Microcode 42503 returns to LAT Microcode 40704 from which it was invoked, and LAT Microcode 40704 returns. Because LAT Microcode 40704 was invoked by an Event Signal, the reference that caused the page fault is reattempted. Since Object Page 42302 which is being referenced is now available but has no entry in ATU 10228, LAT Microcode 40704 proceeds as previously described.

VMM PROC 42405

Turning now to the third portion of the VMM system, the VMM functions executed by VMM PROC 42405, the discussion will deal first with VMM PROC 42405, and then with the functions that it performs.

VMM PROC 42405 is permanently bound to VMM VP 42403. With one exception, VMM PROC 42405 behaves like any other Process 610. The exception is that the only agent which may suspend VMM VP 42403 is VMM PROC 42405 itself. There are two reasons why this is the case: first, SINs for Procedures 602 executed by VMM PROC 42405 and VM Tables 42404 are always present in MEM 10112, and consequently, VMM VP 42403 can never cause a page fault. Second, VMM PROC 42405 is a non-interruptible Process 610. If an IPM interrupt causes the invocation of Dispatcher Microcode while VMM VP 42403 is bound to JP 10114, Dispatcher microcode will not suspend VMM VP 42403 in favor of another Virtual Processor 612. Instead, VMM VP 42403 will continue executing until VMM PROC 42405 suspends it itself.

The functions performed by VMM PROC 42405 are divided into three main groups: VMM Coordinator 42512, Paging Manager Procedures 42519, and Frame Manager Procedures 42520. As the arrows in FIG. 425 indicate, VMM Coordinator 42512 invokes Procedures 602 contained in the other groups either directly or indirectly. The discussion deals first with Coordinator 42512 and then with the other groups.

VMM Coordinator 42512

VMM Coordinator 42512 is a loop that VMM PROC 42405 executes whenever VMM VP 42403 is bound to JP 10114. The loop is made up of a series of components that alter VMM Tables 42404 and invoke Paging Manager Procedures 42519 as required to carry out the VMM tasks outlined above.

Paging Manager Procedures 42519

Whenever VMM Coordinator 42512 performs an operation involving an Object Page 42302 it calls a Procedure 602 in Paging Manager Procedures 42519. These Procedures 602 alter VMMQ 42506 as required to reflect the states of Object Pages 42302 involved in VMM operations and call Frame Manager Procedures 42520 as required to bind and unbind Object Pages 42302 and MEM 10112 Frames 42308.

Frame Manager Procedures 42520

Frame Manager Procedures 42520 actually bind and unbind Object Pages 42302 and MEM 10112 Frames 42308. As indicated by the arrows in FIG. 425, they carry out the binding and unbinding by manipulating MHT 10716 and MFT 10718. Frame Manager Procedures 42520 are invoked by Paging Manager Procedures 42519 as previously mentioned, and also by one component of VMM Coordinator 42512.

The discussion which follows this introduction first describes address translation and page faults in detail, and then describes the operations performed by VMM PROC 42405 in detail.

d. AON-offset Address 42305 to Frame Number-displacement Address 42307 Translation (FIG. 426)

As mentioned above, the VMM System translates the AON-offset addresses used in JP 10114 into the frame number-displacement addresses used in MEM 10112. In FIG. 423, the means used by the VMM system to perform the translation are called AON-offset to Frame-number Displacement Translator 42316. Translator 42316 comprises ATU 10228, MHT 10716, and LAT Microcode 40704. LAT Microcode 40704 further comprises three components LAT 42502, WLAT 42504, and LAT*. LAT* implements a KOS SIN. Since the functioning of ATU 10228 has previously been described, the discussion will first deal with the relationship between AON-page Numbers 42313 and Frame Numbers 42314, then with the microcode routines that perform translations, when ATU 10228 cannot, and finally with the algorithm that these microcode Procedures use to search MHT 10716.

FIG. 106C shows conceptually how the VMM system converts AON-offset addresses into frame number-displacement addresses. As shown in the FIG. 106C, KOS divides the 32 bits of the offset into a page field and a displacement field. The page field, consisting of the 18 most significant bits of the offset, identifies Object Page 42302 which contains the data referred to by the AON-offset address. The displacement field, consisting of the remaining 14 bits, identifies the location of the data in the page.

If Object Page 42302 which contains the data is bound to a MEM 10112 Frame 42308, an Entry (MHTE) in MHT 10716 will indicate which MEM 10112 Frame 42308 Object Page 42302 is bound to. FIG. 426 represents a single MHTE 42601. MHTE 42601 comprises a group of Flag Fields 42602 through 42607, a Frame Number Field 42608, an AON Field 42609, and a Page Number Field 42610. Fields 42602 through 42607 are one-bit flag fields.

Field 42602 is a Lock Field. It is required in CS 10110s with more than one JP 10114. When it is set, a Virtual Processor 612 running on another JP 10114 may not modify MHTE 42601. In the present embodiment, it is not used, and is set to 0.

Field 42603 is the Valid Flag. If Valid Flag 42603 is set and Frame Number Field 42608 has any set bits, then MHTE 42610 specifies that an Object Page 42302 has been bound to a MEM 10112 Frame 42308. If Valid Flag 42603 is reset, MHTE 42601 is unused.

The remaining flags indicate the state of MEM 10112 Frame 42308 associated with MHTE 42601.

Flags 42604 and 42607 indicate whether I/O operations involving MEM 10112 Frame 42308 which belongs to MHTE 42601 are taking place. If Loading or Purging Flag 42604 is set, MEM 10112 Frame 42308 either is being loaded from Secondary Storage 10124 or the VMM System has decided to allocate MEM 10112 Frame 42308 to a different Object Page 42302 and must write its contents back to Object Page 42302 corresponding to MEM 10112 Frame 42308. In either case, MEM 10112 Frame 42308 cannot be referenced. When Loading or Purging Flag 42604 is set, Purging Flag 42607 indicates which operation is underway. If Purging Flag 42607 is set, MEM 10112 Frame 42308 is being purged.

Modified Flag 42605 and Cleaning Required Flag 42611 together keep track of two things: whether MEM 10112 Frame 42308 belonging to MHTE 42601 has been modified, and whether it has been modified since the last call to an Active Object Manager's function which returns the time at which the object was last modified. If either Flag 42605 or Flag 42611 is set, MEM 10112 Frame 42308 belonging to MHTE 42601 must be cleaned.

If Cleaning Flag 06 is set, the MEM 10112 Frame's contents are being copied back into secondary storage 10124.

Flag 42613, Delete When Loaded, may only be set when MEM 10112 Frame 42308 belonging to MHTE 42601 is loading the contents of an Object Page 42302, but must be unbound from Object Page 42302 as soon as loading is complete.

When MHTE 42601's Valid Flag 42603 or Cleaning Required Flag 42611 is set, Fields 42608 through 42610 specify that a given Object Page 42302 is bound or is being bound to a MEM 10112 Frame 42308. AON Field 42609 and Page Number Field 42610 contain the AON 41304 and Page Number 42310 representing an Object Page 42302. If Frame Number Field 42608 has all 0 bits, the VMM system has not yet allocated a MEM 10112 Frame 42308 for Object Page 42302 specified by AON Field 42609 and Page Number Field 42610. Otherwise, the value of Frame Number Field 42608 is the number of MEM 10112 Frame 42308 to which Object Page 42302 represented by the contents of AON Field 42609 and Page Field 42610 is bound. Further details concerning MHTE 42601's fields will be disclosed as those components of the VMM System which modify MHTE 42601's fields are discussed.

e. Implementation of Address Translation

FIG. 407, previously described, gives an overview of the manner in which the KOS performs address translation. Translation begins when a Virtual Processor 612 executing on JP 10114 presents AON-offset Address 42305 indicated by Arrow 40705 to ATU 10228. IF ATU 10228 can translate AON-page Number 42313 representing Object Page 42302 that contains the data specified by the AON-offset Address 42305 into a Frame Number, ATU 10228 produces a Frame Number-displacement Address 42307 (represented by Arrow 40706) of the data referenced by AON-offset address 40705. Frame number-displacement Address 42307 is transmitted to MEM 10110, and the desired read, write, or execute operation is performed on the data at the specified location. ATU 10228 cannot translate AON-page Number 42313 in two situations: when it has no entry for AON Page Number 42313 and when it has an entry, but the operation is a write operation and the ATU 10228 entry's dirty bit is not set, thus indicating that MEM 10112 Frame 42308 represented by the ATU 10228 entry has not been written to since the ATU 10228 entry was created. If it is not necessary to set the dirty bit, the Event Signal invokes LAT microcode 40704; if the dirty bit must be set, the Event Signal invokes WLAT microcode 42504. The manner in which ATU 10228 functions has been explained in detail elsewhere; consequently, the discussion of AON-page Number 42313 to Frame Number 42314 translation here deals only with LAT Microcode 42502 and WLAT Microcode 42504.

LAT Microcode 40704 is invoked by the Event Signal which occurs when there is no ATU 10228 entry for an AON-page and the memory operation being performed is a read or execute operation. When the ATU 10228 miss occurs, JP 10114 latches Logical Descriptor 27116 which was used in the memory reference into Descriptor Trap 20256. LAT microcode 40704 copies Logical Descriptor 27116 into a JP 10114 register and then uses Logical Descriptor 27116's AON-page portion to search MHT 10716 for an MHTE 42601. If there is such a MHTE 42601 and it is valid and loaded, its Frame Number Field 42608 contains the number of the MEM 10112 Frame 42308 which contains Object Page 42302 corresponding to AON-page number 42313. The manner in which MHT 10716 is organized and searched will be described in detail below. If LAT Microcode 42502 finds a MHTE 42601 for AON-page Number 42313 it makes an ATU 10228 entry for AON-page Number 42313 and the Frame Number 42314 contained in Frame Number Field 42608. To do so, it copies Frame Number 42313 into a register in FU 10120 which may be used as a source for JPD Bus 10142 and then uses a special microcommand called LOAD_ATC to create and load the ATU 10228 entry. LOAD_ATC loads an ATU 10228 entry selected by LRUL logic 24080 as follows: it loads the tag field of the ATU 10228 entry with AON-page Number 42313 of the Logical Descriptor 27116 latched in Descriptor Trap 20256, and it loads the FN field with the Frame Number 42314 copied from Frame Number Field 42608. LAT Microcode 42502 then returns, causing JP 10114 to repeat the memory reference. This time, there is an entry in ATU 10228, and ATU 10228 can translate the address.

If there is no MHTE 42601 for Logical Descriptor 27116's AON-page Number 42313, in MHT 10716, or if there is a MHTE 42601 for AON-page Number 42313, but MHTE 42601's Loading or Purging Flag 42604 is set, then Object Page 42302 represented by AON-page Number 42313 is not available in MEM 10112 and LAT microcode 40704 invokes Page Fault Microcode 42503. Page Fault Microcode 42503 will be discussed in more detail below.

If an ATU 10228 miss occurs on a memory write operation, or if the required ATU 10228 entry is present, but its dirty bit is not set, the resulting Event Signal invokes WLAT Microcode 42504. WLAT Microcode 42504 with an ATU 10228 cache miss works in the same fashion as LAT Microcode 42502 described above, except that a version of the LOAD_ATC microcommand called LOAD_ATC_SET_DIRTY is used to load ATU 10228. As the microcommand's name implies, it sets the dirty bit as well as loading the ATU 10228. When there is no ATU 10228 cache miss, WLAT microcode 42504 need not construct a new ATU 10228 entry; instead, it merely uses a microcommand called SET_DIRTY, which sets the dirty bit in the ATU 10228 entry for the AON-page Number 42313 contained in Logical Descriptor 27116 latched into Descriptor Trap 20256. After WLAT Microcode 42504 has loaded an ATU 10228 entry or merely set the entry's dirty bit, it uses AON-page Number 42313 to locate MHTE 42601 for the AON-page Number 42313 and sets Modified Flag 42605 in that MHTE 42601. Once the dirty bit in Object Page 42302's ATU 10228 entry has been set, it inhibits the invocation of WLAT microcode 42504. Consequently, when the reference is repeated, ATU 10228 simply translates AON-page Number 42313 into the proper Frame Number 42314. As will be seen later, when Modified Flag 42605 in MHTE 42601 is set, the Frame Cleaner portion of VMM PROC 42405 will eventually clean MEM 10112 Frame 42308 to which Object Page 42302 is bound, and if Object Page 42302 is unbound from MEM 10112 Frame 42308, VMM Process 42405 will clean MEM 10112 Frame 42308 before it binds another Object Page 42302 to MEM 10112 Frame 42308.

1. The LAT* SIN

Procedures 602 belonging to the KOS VMM system must occasionally test whether an Object Page 42302 is in MEM 10112 without causing a page fault. To do so, these VMM Procedures 602 use a special KOS SIN called LAT*. LAT* consists of the SOP and four Names. The first Name represents a location in memory containing an AON, the second represents a location containing a page number, the third represents a location at which a flag value may be stored, and the fourth represents a location at which a MHTE 42601 index may be stored. LAT* microcode first evaluates the first two Names, combines the resulting values to form an AON-page Number 42313, and uses AON-page Number 42313 to search MHT 10716. It then resolves the third Name. If the search located a valid MHTE 42601 for the AON-page Number 42313, it sets the flag at the location specified to TRUE; otherwise, it sets it to FALSE. Finally, the LAT* microcode resolves the fourth Name and if there was a MHTE 42601 for AON-page Number 42313, it sets the location specified in the Name to MHTE 42601's index.

2. Searching MHT 10716 (FIG. 427)

LAT Microcode 42502, WLAT Microcode 42504, and the LAT* SIN Microcode all employ the same algorithm to search MHT 10716. FIG. 427 illustrates how the algorithm works. The algorithm involves a microcode Hash Function 42702, MHT 10716, and MHTEs 42601. First, AON-page Number 42313 is input into microcode Hash Function 42702, which returns MHT Index 42704. When multiplied by the size of MHTE 42601 and added to Location 42705, the beginning of MHT 10716, MHT Index 42704 yields Location 42706 in MHT 10716. All MHTEs 42601 with AON-page Numbers 42313 that hash to MHT Index 42704 follow Location 42706 and precede the first MHTE 42601 following Location 42706 whose Valid Flag 42603 is reset. Consequently, LAT Microcode 42502, WLAT Microcode 42504, and the LAT* SIN start their search by examining Valid Flag 42603 of MHTE 42601 at Location 42706. If Valid Flag 42603 is reset, there is no MHTE 42601 for AON-page Number 42313. If Valid Flag 42603 is set, the algorithm compares AON Field 42609 and Page Field 42610 of MHTE 42601 at Location 42706 with AON-page Number 42313. If they are the same, AON-page Number 42313's MHTE 42601 has been located. If they are not, the above operations are performed on each MHTE 42601 following MHTE 42601 at location 42706 in turn, until an MHTE 42601 is found whose AON Field 42609 and Page Field 42610 are the same as AON-page Number 42313 or until an MHTE 42601 is found whose Valid Flag 42603 is reset. In the first case, MHTE 42601 for AON-page Number 42313 has been located; in the second case, there is no MHTE 42601 for AON-page Number 42313. If the search reaches the end of MHT 10716, LAT microcode 42502, WLAT microcode 42504, and the LAT* SIN simply go to the beginning of MHT 10716 and continue searching.

The length of time required to search MHT 10716 depends on the number of unused MHTEs 42601. Unused MHTEs 42601 all have their Valid Flags 42603 reset, and may therefore mark the end of a chain of MHTEs 42601 for a specific MHTE Index 42704. The more unused MHTEs 42601 available, the shorter the average length of a chain of MHTEs 42601, and the shorter the average search time. In the present embodiment, MHT 10716 has more than twice as many MHTEs 42601 as there are MEM 10112 Frames 42308. Entries for AON-page Numbers 42313 are added to and deleted from MHT 10716 by Page Fault Microcode 42503 and by Frame Manager Procedures 42520, and consequently, the details of how MHT 10716 is maintained are discussed under these headings.

3. Page Faults

A page fault occurs whenever a Virtual Processor 612 which is bound to JP 10114 attempts to access an Object Page 42302 that is not available in MEM 10112. There are three reasons why an Object Page 42302 may not be available:

Most frequently, Object Page 42302 has not been bound to a MEM 10112 Frame 42308.

Object Page 42302 has already been bound to MEM 10112 Frame 42308, but VMM PROC 42405 has not yet copied the contents of Object Page 42302 into MEM 10112 Frame 42308.

Object Page 42302 is still bound to MEM 10112 Frame 42308, but VMM PROC 42405 is about to unbind Object Page 42302 from MEM 10112 Frame 42308.

In all these cases, resolution of the page fault begins with the invocation of Page Fault Microcode 42503 by LAT Microcode 42502 or WLAT Microcode 42504 and ends when Page Fault Microcode 42503 returns to LAT Microcode 42502 or WLAT Microcode 42504. The LAT* SIN never invokes Page Fault Microcode 42503.

Page Fault Microcode 42503 does four things: it makes an MHTE 42601 for AON-page Number 42313 representing Object Page 42308 which is unavailable in MEM 10112, manipulates VMMQ 42506, and suspends faulting VP 42401. The manipulation of VMMQ 42506 involves two things: incrementing VMMEC 42505, thereby causing VMM PROC 42405 to resume execution at some later time, and creating an entry in VMMQ 42506 for AON-page Number 42313 and faulting VP 42401.

The following will first show VMMQ 42506 in detail, and then discuss Page Fault Microcode 42503 in detail. The other steps in resolving a page fault will be explained in the discussion of VMM PROC 42405.

a.a. VMMEC 42505 and VMMO 42506 (FIG. 428)

FIG. 428 shows the area of MEM 10112 containing VMMEC 42505 and VMMQ 42506. FIG. 428 has three parts: an overall view of VMMEC 42505 and VMMQ 42506, a detailed view of a single VMMQ Entry (VMMQE) 42808, and a detailed view of Flags Field 42709 in VMMQE 42808. The first field of the area of MEM 10112 illustrated in FIG. 428 contains VMMEC 42505. VMMEC 42505 is advanced only by Page Fault Microcode 42503. VMMQ 42506 is an array of VMMQEs 42808. Each VMMQE 42808 has five fields: a Link Field 42803 whose value is 0 or the index of another VMMQE 42808, a Flags Field 42809 (explained in detail below), a VP Number Field 42810, an AON Field 42811, and a Page Field 42812. When a VMMQE 42808 is in use, it represents a single page fault. VP Number Field 42810 then contains the number of VP 42401 which caused the page fault, and AON Field 42811 and Page field 42812 contain AON-page Number 42313 representing Object Page 42302 which was unavailable in MEM 10112

Flags Field 42809 contains 8 1-bit fields. The bits in Fields 42813 through 42818 indicate the status of the page fault and of VP 42401 which made the AON-offset reference that caused the page fault. The remaining two fields are reserved. Fields 42813 through 42818 have the following meanings:

Field 42813, Resume Flag: The VP indicated by VP Number Field 42810 may again be bound to JP 10114. In the present embodiment, this field is always set.

Field 42814, Wire Flag: When this field's bit is set, Object Page 42302 represented by VMMQE 42808 is to be "wired", that is, to be made non-removable from MEM 10112. For details on wiring, see the discussion of Frame Management below.

Field 42815: Not used in the present embodiment.

Field 42816, Waiting for I/O Flag: If this bit is set, I/O has begun for the page fault represented by VMMQE 42808. Processing of the page fault cannot continue until the I/O is complete.

Field 42817, Waiting for a Frame Flag: If this bit is set, there are no MEM 10112 Frames 42308 available, and processing of the page fault must wait until one becomes available.

Field 42818, Waiting for Purging Flag: When this bit is set, VMM PROC 42405 is engaged in unbinding Object Page 42302 from a MEM 10112 Frame 42308, and processing of the page fault must wait until the unbinding is complete.

The manner in which Flag Fields 42813 to 42818 and the other fields in VMMQE 42808 are manipulated will become clear in the course of the discussions of Page Fault Microcode 42503 and of VMM PROC 42405 which follow.

VMMQEs 42808 are organized into three lists: the free list, the work list, and the waiting list. Each VMMQE 42808 belongs to one or the other of these lists. VMMQEs 42808 on the free list do not currently represent a page fault; VMMQEs 42808 on the work list represent page faults that VMM PROC 42405 has not yet processed; entries on the waiting list, finally, represent page faults that VMM PROC 42405 is currently processing.

Figure 428 shows the implementation of these lists in the present embodiment. VMMQEs 42804 through 42806 of are the heads of the free list, the work list, and the , waiting list, respectively. VMMQEs 42804 through 42807 never represent page faults, and the only fields in these VMMQEs 42808 whose values are defined are Link Fields 42803. Link Field 42803 in each VMMQE 42804 through 42806 contains the index of the first VMMQE 42808 in the list headed by the entry. The Link Field in that VMMQE 42808 contains the index of the next VMMQE 42808 in the list, and so on. The Link Field of the last VMMQE 42808 in the list has the value 0. If the Link Field of a list Head 42804 through 42806 has the value 0, the list belonging to the Head is empty, i.e., has no VMMQEs 42808. In addition to Waiting Head 42806, the waiting list also has Waiting Tail 42807. Like VMMQEs 42804 throught 42806, Waiting Tail 42807 never represents a page fault. Its Link Field 42803 contains the index of the last VMMQE 4808 in the waiting list. VMM Process 42405 uses Waiting Tail 42807 to locate the end of the waiting list when it adds VMMQEs 42808 to the end of the waiting list. With the free list and the work list, new VMMQEs 42808 are added only to the list's head.

VMMQEs 42808 belonging to all three lists are shown in VMMQE Array 42506. For the sake of clarity, only the first and last entries in each list are shown, and the lists do not overlap. In the embodiment, each list may have any number of VMMQEs 42808 and any VMMQE 42808 may belong to any list. In FIG. 428, VMMOE 42808E is the first entry in the free list and 42808F is the last; similarly, VMMQE 42808B is the first entry in the waiting list and 42808A is the last. As described above, Link Field 42803 in Waiting Tail 42807 contains the index of VMMQE 42808A.

b.b. Page Fault Microcode 42503 FIGS. 426, 428)

Page Fault Microcode 42503 is invoked by LAT Microcode 42502 or WLAT Microcode 42504 when either finds that Object Page 42302 represented by AON-page Number 42313 is not available in MEM 10112. There are two cases: when there is no valid MHTE 42601 for AON-page Number 42313 and when there is a valid MHTE 42601 but MHTE 42601's Loading or Purging Flag 42604 is set. In the first case, the search for a valid MHTE 42601 ended at an invalid MHTE 42601, and LAT Microcode 42502 or WLAT Microcode 42504 places the index of invalid MHTE 42601 in a FU 10120 register where it will be available to Page Fault microcode 42503. Page Fault Microcode 42503 uses the index to locate invalid MHTE 42601 and sets invalid MHTE 42601's fields as follows:

- Valid Flag 42603 and Loading Flag 42604 are set to 1; the remaining flags are set to 0.
- AON Field 42609 and Page Number Field 42610 are respectively set to AON-page Number 42313's AON and page number.

In the second case, a MHTE 42601 for the AON-page already exists, and Page Fault Microcode 42503 need not set any fields.

Page Fault Microcode 42503 next makes a VMMQE 42808 for the page fault. It does this by first taking a VMMQE 42808 from the head of the free list, then setting VMMQE 42808's VP Number Field 42810 to faulting VP 42401's VP number, setting AON Field 42811 and Page Field 42812 respectively to AON-page Number 42313, and finally adding VMMQE 42808 to the head of the work list.

When Page Fault Microcode 42503 is finished with VMMQE 42808, it advances VMMEC 42505 and suspends faulting VP 42401. VP 42401 will not be bound to JP 10114 again until the page fault has been processed. Some time after the page fault is processed, VP 42401 is again bound to JP 1114, and execution of Page Fault Microcode 42503 resumes. Page Fault Microcode 42503 returns to LAT Microcode 42502, and on return from LAT Microcode 42502, JP 10114 reattempts the reference which caused the page fault. Unless Object Page 42302 represented by AON-page Number 42313 has been again unbound from that MEM 10112 Frame 42302 to which VMM PROC 42405 bound it, this time, LAT Microcode 42502 or WLAT Microcode 42504 will find a valid MHTE 42601 for the AON-page and and will proceed as previously described.

f. VMM PROC 42405

VMM Procedures 602 executed by VMM PROC 42405 actually bind and unbind Object Pages 42302 from MEM 10112 Frames 42308. As previously mentioned, VMM PROC 42405 differs in two respects from other processes 610: it is always bound to VP 42403, which is reserved for it, and VP 42403 is not unbound from JP 10114 unless VMM PROC 42405 itself unbinds it. The operations of VMM PROC 42405 are governed by VM Tables 42404. Of these tables, VMMQ 42506, MHT 10718, and OMQ 41401 have already been explained in detail. Consequently, the discussion of VMM PROC 42405 begins with a detailed explanation of MFT 10718.

1. MFT 10718 (FIG. 429)

FIG. 429 is a detailed representation of MFT 10718. MFT 10718 is an array of MFT Entries (MFTEs) 42901. Each MEM 10112 Frame 42308 has a single MFTE 42901 in MFT 10718, and the Frame Number 42314 belonging to a given MEM 10112 Frame 42308 is the index in MFT 10718 for MFTE 42901 representing MEM 10112 Frame 42308. When a MEM 10112 Frame 42308 is bound to an Object Page 42302, MEM 10112 Frame 42308's MFTE 42901 contains the index of MHTE 42601 belonging to Object Page 42302 which is bound to MEM 10112 Frame 42308. Since a MEM 10112 Frame 42302's MFTE 42901 can be located if MEM 10112 Frame 42302's number is known, MFT 10718 makes it possible to translate Frame Numbers 42314 into AON-page Numbers 42313. In addition, MFT 10718 keeps track of the state of MEM 10112 Frames 42302. There are two ways in which the table records state: as flags in individual MFTEs 42901 and as lists of MFTEs 42901. In embodiments without Working Set Management, there are four such lists:

- The not in use frame list, which contains MFTEs 42901 for all MEM 10112 Frames 42302 not on the other lists.
- The purging list, which contains MFTEs 42901 for MEM 10112 Frames 42302 whose Object Pages 42302 are being unbound.
- The loading list, which contains MFTEs 42901 for MEM 10112 Frames 42302 which are being loaded with the contents of their Object Pages 42302.
- The temporary wired list, which contains MFTEs 42901 for MEM 10112 Frames 42302 having "wired" Object Pages 42302, that is, Object Pages 42302 which cannot be unbound from their MEM 10112 Frames 42308.

As VMM PROC 42405 manages virtual memory, it moves MFTEs 42901 for MEM 10112 Frames 42308 from one list to the next. For example, when an Object Page 42302 is bound to a MEM 10112 Frame 42308, VMM PROC 42405 moves MEM 10112 Frame 42308's MFTE 42901 from the front of the not in use frame list to the loading list; when Object Page 42302 has been loaded into MEM 10112 Frame 42308, MFTE 42901 is moved from the loading list to to the rear of the not in use frame list; and when Object Page 42302 is unbound from MEM 10112 Frame 42308, MFTE 42901 is moved first from the not in use frame list to the purging list, and when the unbinding is finished, back to the head of the not in use frame list.

Turning to MFTE 42901, each MFTE 42901 has five fields:

Wire Count Field 42902 indicates whether Object Page 42302 which is bound to MEM 10112 Fram 42308 is wired. The field is incremented each time Object Page 42302 in the MEM 10112 Frame 42308 represented by MFTE 42901 is "wired" into MEM 10112. A MEM 10112 Frame 42308 may not be deallocated unless its wire count is 0.

Use Count Field 42903 is unused in this embodiment.

When an Object Page 42302 is bound to MEM 10112 Frame 42308 represented by MHTE 42901, MHTE Link Field 42904 contains the index of MHTE 42601 for Object Page 42302 bound to MFTE 42901's MEM 10112 Frame 42308. When MHTE 42901's MEM 10112 Frame 42308 has no Object Page 42302 bound to it, MHTE Link Field 42904 is set to all 1 bits.

Link Fields 42905 and 42906 link MFTES 42901 into lists. Link Field 42905 contains the index of the following MFTE 42901 in the list, and Link Field 42905 contains the index of the preceding MFTE 42901.

The manner in which the four MFTE lists described above are implemented in MFT 10718 is illustrated by 42929. The first five MFTEs 42901 in MFT 10718, specified by numbers 42920 through 42924, do not represent MEM 10112 Frames 42308. Instead, they are list heads. The only fields that are used in these MFTEs 42901 are Forward Link Field 42905 and Back Link Field 42906. Forward Link Field 42905 contains the index of the first MFTE 42901 on the list belonging to the list head, and Back Link Field 42906 contains the index of the last MFTE 42901 on the list belonging to the list head. The lists are thus circular. If the location of a List Head 42920 through 42924 is known, a MFTE 42901 may be easily added to or removed from either the front or the rear of the list. In MFT Lists 42929, a single list, headed by Not in Use Frame List Head 42920, is illustrated. In the representations, F indicates Forward Link Field 42905, and B represents Back Link Field 42906. Field 42805 of Not in Use Frame List Head 42920 contains the index of MFTE 42901 A, the first MFTE 42901 on the not in use frame list, and Field 42806 of Not in Use Frame List Head 42920 contains the index of MFTE 42901 N, the last MFTE 42901 on the Not in Use Frame List list. Field 42905 of MFTE 42901 A contains the index of the next MFTE 42901, MFTE 42901 B, and Field 42906 contains the index of Not in Use Frame List Head 42920. The entire list is linked in this fashion, and consequently, MFTE 42901 n, the last MFTE 42901 in the Not in Use Frame List list, has a Field 42905 which contains the index of Not in Use Frame List Head 42920 and a Field 42906 which contains the index of MFTE 42901 which precedes MFTE 42901 in the list.

The information which the VMM system requires to manipulate MFT 10718 and its lists is contained in VMM Descriptor Table 42907. Like other VMM tables, VMM Descriptor Table 42907 is always present in MEM 10112 at a location known to KOS. The fields of VMM Descriptor Table 42907 have the following contents:

42908: The Version Number. This number tells KOS what version of MFT 10718 it is dealing with.

42909 through 42913: the indexes of the heads of the five lists in MFT 10718. 42909 contains the index of Not in Use Frame List Head 42920, 42910 the index of In Use Frame List Head 42921, 42911 the index of Purging List Head 42922, 42912 the index of Loading List Head 42923, and 42913 the index of Temporarily Wired List Head 42924.

Fields 42914 and 42915: Paging Pool Low Frame Number and Paging Pool High Frame Number: All MEM 10112 Frames 42308 that are available for allocation to Object Pages 42302 have Frame Numbers 42314 that fall the range of values defined by Fields 42914 and 42915 respectively. MEM 10112 Frames 42308 that have Object Pages 42302 permanently bound to them must have Frame Numbers 42314 that fall outside the range of values defined by Fields 42914 and 42915.

Field 42916: Previous Frame Number: This field contains Frame Number 42314 for the last Frame 42308 to have an Object Page 42302 bound to it.

Field 42917: Unbound Frame Count: the number of MEM 10112 Frames 42308 to which no Object Page 42302 is currently bound.

Field 42918: Waiting for a Frame Count: the number of VMMQEs 42808 whose Waiting for a Frame Flag 42817 is set, i.e., the number of page faults that are waiting for MEM 10112 Frames 42308.

Field 42919: MHT Size: A value that is 1 less than the maximum index for MHT 10716. The VMM System uses Field 42919 to check the validity of MHT indexes.

Details concerning the use of Fields 42909 through 42918 will be given in the discussions which follow.

2. VMM Coordinator 42512 (FIGS. 425, 426, 428, 429, 430)

VMM Coordinator 42512 is executed by VMM PROC 42405. VMM PROC 42405 in turn is permanently bound to VMM VP 42403, and VMM VP 42403 may be bound to JP 10114 after Page Fault Microcode 42503 advances VMMEC 42505 or IOS 10116 completes an I/O operation for the VMM System and FU 10120 microcode invoked by an Interprocessor Message (IPM) from IOP 10116 advances a KOS I/O System Event Counter (not shown). When VMM VP 42403 is bound to JP 10114, VMM PROC 42405 resumes execution. The order in which VMM PROC 42405 performs its operations is determined by VMM Coordinator 42512. FIG. 430 is a flowchart which presents an overview of VMM Coordinator 42512. Each Block 43001 through 43007 in FIG. 430 represents an operation performed by VMM Coordinator 42512, and the lines joining the Blocks indicate the flow between them. The discussion will first summarize the operations and then explain the sequences in which they may be performed. Details on the operations will be given later.

43001, Start I/O: This Block begins an I/O operation by sending an I/O request to IOS 10116.

433002, Await VMMEC and KIO Event Counters: This Block unbinds VMM Virtual Processor 42403 to which VMM PROC 42405 is bound from JP 10114, thereby halting execution of VMM PROC 42405 at Block 43002. VMM Virtual Processor 42403 is rebound to JP 10114 sometime after either VMMEC 42505 or KIO Event Counters have advanced to the value specified by the Await Operation performed in Block 43002. When VMM PROC 42405 commences executing again, it continues in Block 43002.

43003, Finish I/O Loop: This Block contains a loop which updates AOT 10712, VMMQ 42506, MHT 10716, and MFT 10718 after I/O operations initiated by Block 43001 have been completed.

43004, Look for a Frame: This Block searches VMMQ 42506's waiting chain for a VMMQE 42808 whose Waiting for a Frame Flag 42817 is set. If it finds such a VMMQE 42808, it attempts to allocate a MEM 10112 Frame 42308 for Object Page 42302 represented by AON Field 42811 and Page Field 42812 in VMMQE 42808.

43004, Process VMMQ Work List: This Block is a loop which processes VMMQEs 42808 which Page Fault Microcode 42503 places on VMMQ 42506's work list when a page fault occurs.

43005, Process OMQ Loop: This block is a loop which processes jobs on OMQ 41401 which require action by VMM PROC 42405.

43006, Clean Frame: This block cleans one MEM 10112 Frame 42308 of those which need cleaning (i.e., have been modified, and therefore must have their contents copied back to Object Page 42302 to which they are bound).

VMM Coordinator 42512's loop is set going when CS 10110 begins running. As mentioned above, VMM VP 42405 may be suspended only by VMM PROC 42405. The portion of VMM Process 42405 which suspends VMM VP 42403 is Block 43002. Consequently, execution of VMM Coordinator 42512 always begins and ends in Block 43002. Once execution of VMM Coordinator 42512 begins, it continues until Blocks 43003 throught 43007 all indicate that there is no more work for their functions to perform. When there is no more work for any function, VMM Coordinator 42512 executes Block 43002 and thereby suspends VMM VP 42405.

In VMM Coordinator 42512, any action which requires I/O or makes resources available for I/O immediately causes a branch to Start I/O Block 43001. If Start I/O Block 43001 was unable to start an I/O operation because no I/O buffer was available, and Finish I/O Loop 43003 performs an operation which makes a buffer available, Finish I/O Loop 43003 branches to Start I/O Block 43001. Similarly, if Block 43004, 43005, or 43007 performs an operation which requires I/O, these Blocks branch to Start I/O Block 43001.

Detailed operation of Blocks 43001 through 43007 is presented in FIGS. 431 through 435. FIG. 431 contains flowcharts for Blocks 43001 and 43002.

a.a. Request to Send Block 43001 (FIGS. 425, 426, 428, 429, 431)

As explained above, Block 43001 may be entered from Blocks 43003, 43004, 43005, and 43007. What happens when Block 43001 is executed depends on the Request to Send Flag. The Request to Send Flag is a Boolean variable (i.e., the variable may have the values TRUE and FALSE). The Flag is set to TRUE whenever a component of VMM Coordinator 42512 performs an action which requires the initiation of I/O; consequently, if the flag has the value FALSE, VMM Coordinator 42512 need not initiate I/O. If the flag has the value TRUE, VMM Coordinator 42512 sends a message to KIO. If KIO has a buffer available, the I/O is initiated, and VMM Coordinator 42512 sets the Request to Send Flag to FALSE; otherwise, the Request to Send Flag is left set to TRUE, to guarantee that VMM Coordinator 42512 will try again to initiate I/O when it reenters Block 43001.

b.b. Await Event Counters Block 43002 (FIGS. 425, 426, 428, 429, 431)

VMM Coordinator 42512 next executes Block 43002. Again, the manner of execution is determined by a Boolean variable, the Work Done Flag. This Flag is set to TRUE whenever an operation is performed by Blocks 43003 through 43007; it will therefore have the value FALSE only if VMM Coordinator 42512 was able to pass through all of these Blocks without performing an operation. When this is the case, there is no more work to be done, and VMM Coordinator 42512 suspends itself by awaiting VMMEC 42505 and KIO Event Counters. Otherwise, VMM Coordinator 42512 resets the Work Done Flag to FALSE and starts executing the loop again. The value of the Request to Send Flag determines what Event Counters VMM PROC 42405 awaits. If the Flag is TRUE, then Block 43001 attempted to initiate an I/O request, but no I/O buffer was available. In this situation, VMM PROC 42405 cannot begin executing again until an I/O buffer is available. Consequently, VMM PROC 42405 awaits KIO Event Counters for incoming and outgoing I/O, but not VMMEC 42505. If the Request to Send Flag is FALSE, no buffer is needed, so VMM PROC 42405 increments a variable which contains the current value of VMMEC 42505 and then awaits VMMEC 42505 and a KIO Event Counter for outgoing I/O.

c.c. Finish I/O Looo 43003 (FIGS. 425, 426, 428, 429, 432)

Turning next to FIG. 432, after VMM PROC 42405 resumes execution, VMM Coordinator 42512 begins executing Finish I/O Loop 43003. In this loop, VMM Coordinator 42512 examines KIO messages until it can find no more to examine. Each time it examines a KIO message, it sets the Work Done Flag to TRUE. If the KIO message indicates that KIO performed a read operation, i.e., that it loaded the contents of an Object Page 42302 into a MEM 10112 Frame 42308, VMM Coordinator 42512 calls Procedures 602 in Paging Manager 42519 which return VMMQEs 42808 for loaded Object Page 42302 from the waiting list to the free list in VMMQ 42506. As each VMMQE 42888 is returned to the free list, the Paging Manager Procedure 602 performs a resume operation on Virtual Processor 612 whose number is contained in VMMQE Field 42810, thereby making Virtual Processor 612 again eligible to be bound to JP 10114. Paging Manager Procedures 42519 in turn call Procedures 602 in Frame Manager 42520. These Procedures 602 update MHT 10716 and MFT 10718 as required by the loading operation. In MHTE 42601 for loaded Object Page 42302, Loading or Purging Flag 42604, set by Page Fault Microcode 42503, is reset. MFTE 42901 for MEM 10112 Frame 42308 to which loaded Object Page 42302 is bound is moved from the loading list, where it was placed when MEM 10112 Frame 42308 was allocated, to the tail of the not in use frame list.

If the KIO message being processed indicates that a write operation was performed, i.e., that the contents of a MEM 10112 Frame 42308 were written back to Object Page 42302 which is bound to MEM 10112 Frame 42308, Procedures 602 in Paging Manager 42519 and Frame Manager 42520 must again modify MHT 10716, MFT 10718 and VMMQ 42506. VMM PROC 42405 performs a write operation only when it is purging an Object Page 42302, i.e. unbinding Object Page 42302 from its MEM 10112 Frame 42308. The method by which a MEM 10112 Frame 42308 is chosen for purging and the operations which take place before the contents of MEM 10112 Frame 42308 are written back to Object Page 42302 which was bound to MEM 10112 Frame 42308 will be explained below; here, there are discussed those operations which take place after the I/O operation is complete.

If a MEM 10112 Frame 42308 has been chosen for purging, its MFTE 42901 is on MFT 10718's purging list and its MHTE 42601 has its Loading or Purging Flag 42604 and Purging Flag 42607 set. After MEM 10112 Frame 42308's contents have been written back to Object Page 42302, Block 43003 of VMM Coordinator 42512 invokes Paging Manager Procedures 42519, and these Procedures 602 invoke Procedures 602 in Frame Manager Procedures 42519 which unbind Object Page 42302 from MEM 10112 Frame 42308 and deallocate MEM 10112 Frame 42308. These operations will be described in detail below. If Object Page 42302 was referenced while it was being purged, a page fault occurred, and there is a VMMQE 42808 for Object Page 42302 on VMMQ 42506's waiting list. In this VMMQE 42808, Waiting for Purging Flag 42818 is set. After Frame Manager Procedures 42520 have rearranged MEM 10112 Frame 42308's MHTE 42601 and MFTE 42901 as described above, Paging Manager Procedures 42519 search VMMQ 42506's waiting list for VMMQEs 42808 for Object Page 42302. If Paging Manager Procedures 42519 find such a VMMQE 42808, they reset Waiting for Purging Flag 42818 and move VMMQE 42808 from the waiting list to the work list, thus guaranteeing that it will be processed by Process VMMQ Loop Block 43005.

Since the completion of the write operation may have made a MEM 10112 Frame 42308 available for a waiting Object Page 42302, VMM Coordinator 42512 sets a Boolean variable called Frame May Be Available to TRUE. The behavior of other components of VMM Coordinator 42512 depends on the setting of this flag variable.

After VMM Coordinator 42512 has processed all KIO messages, it examines the Boolean Request to Send variable. If the variable is set to TRUE, Start I/O Block 43001 has an I/O request which is waiting for an I/O buffer. The processing performed in Finish I/O Loop 43003 may have made a buffer available, and consequently VMM Coordinator 42512 executes Start I/O Block 43001 when Request to Send is TRUE. Otherwise, VMM Coordinator 42512 continues on to Look for Frame Block 43004.

d.d. Look for Frame Block 43004 (FIGS. 425, 426, 428, 429, 433)

FIG. 433 presents the manner in which VMM Coordinator 42512 executes Look for Frame Block 43004. Look for Frame Block 43004 attempts to find a MEM 10112 Frame 42308 for an Object Page 42302 for which none was available. If there is no chance that a MEM 10112 Frame 42308 is available, there is no need to look for one. Consequently, the first thing which VMM Coordinator 42512 does when it enters Block 43004 is examine the Frame May Be Available variable. VMM Coordinator 42512 sets the Frame May Be Available variable to TRUE whenever it completes an operation which may have made a MEM 10112 Frame 42308 available. If the Frame May Be Available variable is FALSE, VMM Coordinator 42512 simply goes on to Block 43005. If the variable is TRUE, VMM Coordinator 42512 calls Paging Manager Procedures 42519 to find out whether a MEM 10112 Frame 42308 is in fact available and whether there is an Object Page 42302 waiting for a MEM 10112 Fame 42308. Paging Manager Procedures 42519 determine these facts by examining VMM Descriptor 42907. If there are MEM 10112 Frames 42308 available, and if there are Object Pages 42302 waiting for MEM 10112 Frames 42308, then Unbound Frame Count Field 42919 and Waiting for a Frame Count Field 42917 will both contain values greater than 0. When this is not the case, Paging Manager Procedures 42519 immediately return an indication of the fact to VMM Coordinator 42512, which then sets Frame May Be Available to FALSE and goes on to Block 43005.

If there are Object Pages 42302 waiting for MEM 10112 Frames 42308 and there are MEM 10112 Frames 42308 available, Paging Manager Procedures 42519 locate a VMMQE 42808 on VMMQ 42801's waiting list whose Waiting for a Frame Flag 42817 is set and then invoke Procedures 602 in Frame Manager 42520 which allocate a MEM 10112 Frame for Object Page 42302 whose AON-page Number 42313 is contained in VMMQE 42808. Allocation will be described in detail below. After Procedures 602 in Frame Manage 42520 have been executed, Procedures 602 in Paging Manager 42519 prepare an I/O request which will be made by Block 43001 and then complete the operation by searching the entire waiting list for all VMMQEs 42808 for newly-bound Object Page 42302. Each time it finds a VMMQE 42808 for Object Page 42302, it sets Waiting for I/O Flag 42816 and resets Waiting for a Frame Flag 42817. Since a newly-allocated MEM 10112 Frame 42308 has to be loaded, VMM Coordinator 42512 finishes the execution of Block 43004 by setting Request to Send and Work Done Flags to TRUE and obtaining a KIO subchannel for the I/O request. VMM Coordinator 42512 then goes to Start I/O Block 43001.

e.e. Process VMMO Work List Loop Block 43005 (FIGS. 425, 426, 428, 429, 434)

FIG. 434 represents the actions taken by VMM Coordinator 42512 in executing Process VMMQ Work List Loop Block 43007. Each time VMM Coordinator 42512 repeats the loop in Block 43007, it first obtains the current value of VMMEC 42505 and stores it in a variable. VMM Coordinator 42512 then checks whether there are any more VMMQEs 42808 on the work list. If there are none, VMM Coordinator 42512 goes on to Block 43006. By obtaining the current value of VMMEC 42505 just before it checks whether there are an more VMMQEs 42808 to process, VMM Coordinator 42512 guarantees that the value that it increments when it suspends VMM VP 42403 in Block 43002 is the value that VMMEC 42505 had when the list was empty. Consequently, in a multiprocessor environment, additions to VMMQ 42801's work list between the time that VMM Coordinator 42512 leaves Block 43005 and the time that VMM Coordinator 42512 suspends VMM VP 42403 will not cause VMM VP 42403 to await the wrong value of VMMEC 42505.

If there are still VMMQEs 42808 on the work list, VMM Coordinator 42512 then gets the next VMMQE 42808 and sets the Work Done Flag to TRUE. The next step is to attempt to allocate a MEM 10112 Frame 42308 for Object Page 42302 represented by VMMQE 42808. VMM Coordinator 42512 makes the attempt by invoking Procedures 602 in Paging Manager 42519, which in turn invoke Procedures 602 in Frame Manager 42520. The latter Procedures 602 allocate a MEM 10112 Frame 42308 if one is available. If the allocation succeeds, Paging Manager Procedures 42519 set VMMQE 42808's Waiting for I/O Flag 42816 and prepare an I/O request for Block 43001; if the allocation fails, Paging Manager Procedures 42519 set VMMQE 42808's Waiting for a Frame Flag 42816. In both cases, VMMQE 42808 is then moved from the work list to the waiting list. Control then returns to VMM Coordinator 42512. If a MEM 10112 Frame 42308 was allocated, VMM Coordinator 42512 sets the Request to Send flag to TRUE, gets a KIO subchannel for the I/O to load MEM 10112 Frame 42308, and then goes to Start I/O Block 43001. If no MEM 10112 Frame 42308 was allocated, VMM Coordinator 42512 returns to the beginning of Process VMMQ Work-list Loop 43005 and repeats the loop.

f.f. Process OMO Loop 43006 (FIGS. 425, 426, 428, 429, 435)

FIG. 435 represents the manner in which VMM Coordinator 42512 executes Process OMQ Loop 43006 and Frame Cleaner 43007. As explained earlier, OMQ 41401 contains queues of jobs for the Object Management System. When these jobs involve the VMM System, they are put on OMQ 41401's VMM Work List. In this embodiment, the jobs comprise the following:

- Determining whether any Object Pages 42302 belonging to an object have been modified.
- Determining whether an object has Object Pages 42302 bound to MEM 10112 Frames 42308.
- Aborting VMM activity for a Process 610 which is being unbound from a Virtual Processor 612
- Unwiring an Object Page 42302.
- Removing a group of Object Pages 42302 from MEM 10112.
- Deleting a group of Object Pages 42302.

Other embodiments may allow the Object Management System to request other functions from the VMM System.

VMM Coordinator 42512 processes the VMM Work Queue in OMQ 41401 as shown in FIG. 435. As long as there are OMQEs 41421 on the VMM Work List, VMM Coordinator 42512 gets the next OMQE 41421 and calls Procedures 602 in Paging Manager 42519 to process OMQE 41421. Since the processing may have made a MEM 10112 Frame 42308 available, VMM Coordinator 42512 sets the Work Done and the Frame Available variables to TRUE after it processes each OMQE 41421. How Paging Manager 42519 processes a given OMQE 41421 depends on the kind of request.

When a Procedure 602 in Paging Manager 42519 must determine whether an object has Object Pages 42302 that have been modified, it invokes a Frame Manager 42520 Procedure 602 which takes the object's AON and searches MHT 10716 for MHTEs 42601 whose AON Field 42609 has that AON and whose Modified Flag 42605 has been set. If it finds any such MHTE 42601, the object has Object Pages 42302 which have been modified. Similarly, when Paging Manager 42519 must determine whether an object has Object Pages 42302 bound to MEM 10112 Frames 42308, it invokes a Frame Manager 42520 Procedure 602 which takes the object's AON and searches MHT 10716 for MHTEs 42601 whose AON field 42609 contains the AON. If it finds one, the object has at least one Object Page 42302 in MEM 10112.

When the VMM work chain contains a request to abort VMM System activity for a Virtual Processor 612, Paging Manager 42519 Procedures 602 search VMMQ 42506's waiting list for VMMQEs 42808 belonging to Virtual Processor 612. If the Procedures 602 find a VMMQE 42808, they move it from the waiting list to the free list. If VMMQE 42808's Waiting for a Frame Flag 42817 was set, they also decrement Waiting for a Frame Count Field 42918 in VMM Descriptor 42907.

When Procedures 602 in Paging Manager 42519 find a request to unwire an Object Page 42302 on the VMM work queue, they invoke a Frame Manager 42520 Procedure 602 which finds Object Page 42302's MHTE 42601 and uses Frame Number Field 42608 in MHTE 42601 to locate MFTE 42901 for MEM 10112 Frame 42308 to which Object Page 42302 is bound. Procedure 602 in Frame Manager 42520 then decrements Wire Count Field 42902 in MFTE 42901, and if Wire Count field 42902 thereby becomes 0, Procedure 602 moves MFTE 42901 from the wired list to the not in use frame list.

Procedures 602 in Paging Manager 42519 handle requests to remove or delete Object Pages 42302 from MEM 10112 in much the same way. The main difference between removal and deletion is that when a modified Object Page 42302 is removed from MEM 10112, the contents of Object Page 42302's MEM 10112 Frame 42308 must be copied back to Secondary Storage 10124; when an Object Page 42302 is deleted, this step is not necessary.

All Object Pages 42302 to be removed or deleted must be unbound from their MEM 10112 Frames 42308. Furthermore, any pending VMM System activity for such an Object Page 42302 must be aborted. When the Procedure 602 in Paging Manager 42519 which processes OMQ 41401's VMM Work List finds such a request, it first aborts any pending VMM activity for Object Page 42302 by invoking another Procedure 602 in Paging Manager 42519 which searches the waiting list in VMMQ 42506 for VMMQEs 42808 for Object Page 42302. When it finds such a VMMQE 42808, it moves VMMQE 42808 from the waiting list to the free list.

Procedures 602 in Paging Manager 42519 then invoke a Frame Manager 42520 Procedure 602 which searches MHT 10716 for MHTEs 42601 for all Object Pages 42302 which are to be removed or deleted. Unless certain flags in MHTE 42601 are set, when a MHTE 42601 for an Object Page 42302 which is to be deleted or removed is located, another Procedure 602 in Frame Manager 42520 unbinds Object Page 42302 from its MEM 10112 Frame 42308, deallocates MEM 10112 Frame 42308, and decrements Pages in Memory Field 41527 in AOTE 41306 for Object Page 42302's object. Details on deallocation and unbinding are given later. When one or more of Flags 42504 (Loading or Purging), 42505 (Modified), 42506 (Cleaning), or 42507 (Purging) are set in MHTE 42601, additional processing is required before Object Page 42302 can be unbound from MEM 10112 Frame 42308. In this case, the Procedure 602 in Frame Manager 42520 sets MHTE 42601 flags as required to ensure proper processing. For example, if Modified Flag 42605 is set and Object Page 42302 is to be removed but not deleted, then the contents of MEM 10112 Frame 42308 must be written back to Object Page 42302 before Object Page 42302 is unbound from MEM 10112 Frame 42308. To accomplish this, the Frame Manager 42520 Procedure 602 calls another Frame Manager 42520 Procedure 602 which sets Purging Flag 42607 in MHTE 42601 and moves MFTE 42901 for MEM 10112 Frame 42308 from the not in use frame list to the purging list. When Object Page 42302 is purged, the contents of MEM 10112 Frame 42308 will be written back to Object Page 42302 and Object Page 42302 will be unbound from MEM 10112 Frame 42308.

g.g. Frame Cleaner Block 43007 (FIGS. 425, 426, 428, 429, 435)

Since Process OMQ Loop Block 43006 never initiates an I/O request, VMM Coordinator 42512 always passes from Block 43006 to Frame Cleaner Block 43007. In the present embodiment, MEM 10112 Frames 42308 are only cleaned when the Object Page 42302 bound to them is purged. Consequently, when VMM Coordinator 42512 enters Block 43007, it first calls a Procedure 602 in Paging Manager 42519 which checks for MFTEs 42901 on the purging list. If there are none, there is nothing for Frame Cleaner Block 43007 to do, and VMM Coordinator 42512 passes to Start I/O Block 43001. If there are MFTEs 42901 on the purging list, the Procedure 602 in Paging Manager 42519 locates MHTE 42601 for MEM 10112 Frame 42308 belonging to the first MFTE 42901 on the purging list from MFTE 42901's MHTE Link Field 42904. If MHTE 42601's Cleaning Flag 42606 is not set, Procedure 602 sets it, and if MHTE 42601's Modified Flag 42605 is set, Procedure 602 sets a Modified Flag in Flags Field 41525 of AOTE 41306 whose AON is contained in AON Field 42609 in MHTE 42601.

After Procedures 602 in Paging Manager 42519 have prepared a MEM 10112 Frame 42308 for cleaning, VMM Coordinator 42512 finishes by preparing an I/O request for Block 43001, setting the Request to Send and Work Done variables to TRUE, and getting a KIO subchannel. VMM Coordinator then proceeds to Block 43001, thus completing its loop.

3. MEM 10112 Frame 42308 Allocation (FIGS. 425, 426, 428, 429, 436, 437, 438)

MEM 10112 Frame 42308 allocation is the binding of an Object Page 42302 to a MEM 10112 Frame 42308. Allocation is performed by a Procedure 602 in Frame Manager 42520. FIG. 436 gives an overview of Allocation Procedure 43600. As indicated in FIG. 436, there are three steps in allocating a MEM 10112 Frame 42308 for an Object Page 42302:

- Locating Object Page 42302's MHTE 42601 by means of the LAT* KOS SIN.
- Examining MHTE 42601 to determine whether a MEM 10112 Frame 42308 has already been allocated for Object Page 42302.
- Allocating a MEM 10112 Frame 42308 for Object Page 42302.

The following discussion begins with an overview of Allocation Procedure 43600 and then presents details regarding the examination of MHTEs 42601 and the allocation of MEM 10112 Frames 42308.

Allocation Procedure 43600 is a function. It is invoked with three arguments: the AON and page number of of AON-page Number 42313 Object Page 42302 for which it is allocating a MEM 10112 Frame 42308 and a variable for a Frame Number 42314. If Allocation Function 43600 is able to allocate a MEM 10112 Frame 42308 for Object Page 42302 represented by the AON and page number arguments, the Frame Number 42314 argument will contain the frame number belonging to allocated MEM 10112 Frame 42308. The value returned by Allocation Function 43600 is the status of MHTE 42601 after the attempted allocation. As indicated in FIG. 436, in the present embodiment, the status may have one of five values:

- Page resident, i.e., Object Page 42302 represented by the AON and page number arguments is bound to a MEM 10112 Frame 42308 and is available for use.
- Page loading, i.e., Object Page 42302 represented by the AON and page number arguments is bound to a MEM 10112 Frame 42308, but MEM 10112 Frame 42308 is being loaded, and Object Page 42302 is therefore not yet available for use.
- Page purging, i.e., Object Page 42302 represented by the AON and page number arguments is bound to a MEM 10112 Frame 42308, but Object Page 42302 is being purged, and is therefore not available for use.
- No frame available, i.e., there are no MEM 10112 Frames 42308 available to be bound to Object Page 42302.
- Frame allocated, i.e., Object Page 42302 has been bound to a MEM 10112 Frame 42308, but loading has not yet begun.

As is apparent from FIG. 436, Frame Allocation Function 43600 begins by using the AON and page number arguments with the LAT* KOS SIN (described in the section on page faults) in order to obtain the location of MHTE 42601 belonging to Object Page 42302 represented by the AON and page number. As previously described, LAT* returns a flag called the Resident Flag. This flag is set when Object Page 42302 represented by the AON and page number arguments has a MHTE 42601 whose Valid Flag 42603 is set and whose Loading or Purging Flag 42604 is reset. If the Resident Flag is set on return from LAT*, some other operation has already allocated a MEM 10112 Frame 42308 for Object Page 42302, and Frame Allocation Function 43600 returns the resident status.

If LAT* does not indicate that Object Page 42302 is resident, Allocation Function 43600 uses the location returned by LAT* to examine MHTE 42601. If MHTE 42601's Loading or Purging Flag 42604 is set, Allocation Function 43600 returns a status value of loading or purging as required; otherwise, it goes on to allocate a MEM 10112 Frame 42308. If no MEM 10112 Frame 42308 is available, Allocation Function 43600 returns the status value no frame available; otherwise, it allocates MEM 10112 Frame 42308 and returns the status value allocated.

FIG. 437 gives the details of Block 43601 in FIG. 436. In most cases, MHTE 42601 examined in Block 43601 is the one created for Object Page 42302 by Page Fault Microcode 42503 when a reference to Object Page 42302 caused the page fault. As previously explained, such an MHTE 42601 has its AON Field 42609 and Page Number Field 42610 set to the AON and page number representing Object Page 42302, its Valid Flag 42603 and Loading or Purging Flag 42604 set, and its Frame Number Field 42608 set to the value 0. As an examination of FIG. 437 illustrates, when MHTE 42601 fields are set as just described, Frame Allocation Function 43600 takes no branches in Block 43601, but instead passes directly to Block 43602.

However, two other cases are possible:

There may be no MHTE 42601 for Object Page 42302.

There may be a valid MHTE 42601 for Object Page 42302 and MHTE 42601 may contain a frame number, but Loading or Purging Flag 42604 and/or Purging Flag 42607 may be set.

The first case occurs when the request to allocate a MEM 10112 Frame 42308 is not the result of a page fault, but was instead made by invoking an Object Manager Procedure 602. Since there was no page fault, no MHTE 42601 has been prepared for Object Page 42302. Frame Allocation Function 43600 therefore prepares an MHTE 42601 by setting MHTE 42601's fields in exactly the same fashion as does Page Fault Microcode 42503. The new MHTE 42601 is then treated exactly like those created by Page Fault Microcode 42503. The second case occurs when a MEM 10112 Frame 42308 has already been allocated for Object Page 42302, but is being loaded or purged, and is therefore unavailable. In this case, there is nothing to allocate and Frame Allocation Function 43600 simply returns either loading or purging status, depending on the settings of flags in MHTE 42601.

FIG. 438 discloses the method by which MEM 10112 Frames 42308 are allocated in the present embodiment. There are two main cases: there is an unbound MEM 10112 Frame 42308 available or there is no unbound MEM 10112 Frame 42308 available. Allocation is much simpler with an unbound MEM 10112 Frame 42308, so Frame Allocation Function 43600 first tries to allocate an unbound MEM 10112 Frame 42308. It does so by examining Unbound Frame Count Field 42917 of VMM Descriptor 42907. If there are any unbound frames available, Unbound Frame Count Field 42917 will have a value greater than 0. As will be described in the discussion of frame deallocation below, the VMM system also places MFTEs 42901 for unbound MEM 10112 Frames 42308 at the head of the not in use frame list. Consequently, as shown in FIG. 438, if there are unbound MEM 10112 Frames 42308 available, Frame Allocation Function 43600 decrements Unbound Frame Count Field 42917 by 1, obtains MFTE 42901 at the head of the not in use frame list, and allocates that MFTE 42901's MEM 10112 Frame 42308 to Object Page 42302.

If there are no unbound MEM 10112 Frames 42308 available, Frame Allocation Function 43600 must unbind a MEM 10112 Frame 42308 from some Object Page 42302. A bound MEM 10112 Frame 42308 may be unbound from its Object Page 42302 only if two conditions are met: MEM 10112 Frame 42308 must not be wired, and the VMM system must not be in the process of loading, cleaning, or purging Object Page 42308.

In the present embodiment, Allocation Function 43600 chooses a MEM 10112 Frame 42308 to be unbound as follows: Allocation Function 43600 first examines Previous Frame Number Field 42916 in VMM Descriptor 42907. Previous Frame Number Field 42916 contains the index of MFTE 42901 for the last bound MEM 10112 Frame 42302 allocated by Allocation Function 43600. Allocation Function 43600 then begins searching MFT 10718 at MFTE 42901 whose MFTE index is one greater than the index contained in Previous Frame Number Field 42916. Allocation Function 43600 examines MFTEs 42901 in order, wrapping around from the last MFTE 42901 to the first if necessary, until it finds a MFTE 42901 whose Wire Count Field 42903 has the value 0 and whose MHTE Link Field 42904 contains the index of a MHTE 42601 whose Loading or Purging Flag 42604 and Cleaning Flag 42606 are both reset. MEM 10112 Frame 42308 represented by this MFTE 42901 may thus be unbound from its Object Page 42302.

When Allocation Function 43600 finds a MFTE 42901 whose MEM 10112 Frame 42308 may be unbound, it places MFTE 42901's index in Previous Frame Number Field 42916, thereby guaranteeing that the next search of MFT 10718 will begin at MFTE 42901 following the one whose MEM 10112 Frame 42308 is to be unbound. If Object Page 42302 has been modified (i.e., if Object Page 42302's MHTE 42601 has its Modified Flag 42605 set), then Object Page 42302 must be cleaned before it can be unbound from MEM 10112 Frame 42308. In this case, MEM 10112 Frame 42308 is not immediately available. Allocation Function 43600 therefore first invokes a Procedure 602 which initiates the purging of MEM 10112 Frame 42308 and when that Procedure 602 is finished, returns the no frame available status. Purging involves deallocation of MEM 10112 Frame 42308, and by initiating purging, Allocation Function 43600 guarantees that an unbound MEM 10112 Frame 42308 will become available in some finite amount of time.

If no cleaning is required, Allocation Function 43600 unbinds Object Page 42302 from MEM 10112 Frame 42308 by calling the Procedure 602 which deallocates MEM 10112 Frames 42308 (this Procedure 602 is described below). Since deallocation may involve rearrangement of MHT 10716, Allocation Function 43600 next repeats the LAT* KOS SIN to locate MHTE 42601 for Object Page 42302.

At this point, Frame Allocation Function 43600 has both an unbound MEM 10112 Frame 42308 and MHTE 42601 belonging to Object Page 42302 which is to be bound to MEM 10112 Frame 42308. The actual binding is accomplished by placing the Frame Number 42314 belonging to MEM 10112 Frame 42308 in Frame Number Field 42608 of MHTE 42601, placing the index of MHTE 42601 in MHTE Link Field 42904 of MFTE 42901 belonging to MEM 10112 Frame 42308, and moving MFTE 42901 onto the loading list. Once this is done, Frame Allocation Function 43600 returns the allocated status.

4. MEM 10112 Frame 42308 Deallocation (FIGS. 425, 426, 428, 429, 436, 439, 440)

There are two situations in which MEM 10112 Frames 42308 are deallocated, i.e., unbound from Object Pages 42302: when an Object Page 42302 is purged, i.e., removed from MEM 10112, and when the only way to obtain a MEM 10112 Frame 42308 for an Object Page 42302 is to "steal" it, that is, unbind it from some other Object Page 42302. In both situations, the major task in frame deallocation is rearranging MHT 10716 so that its search algorithm continues to work after MHTE 42601 belonging to a MEM 10112 Frame 42308 which has been deallocated is invalidated.

Frame deallocation is performed by a Procedure 602 in Frame Manager 42520. FIG. 439 provides an overview of Frame Deallocation Procedure 43900. Frame Deallocation Procedure 43900 is invoked with two arguments: the index number of MHTE 42601 belonging to MEM 10112 Frame 42308 which is being deallocated, and a status flag which indicates whether deallocated MEM 10112 Frame 42308 is needed immediately. As FIG. 439 shows, if deallocated MEM 10112

Frame 42308 is not needed immediately, Deallocation Procedure 43900 places MFTE 42901 for MEM 10112 Frame 42308 at the head of the not in use frame list and increments Unbound Frame Count Field 42917 in VMM Descriptor 42907. As was explained earlier, when unbound MEM 10112 Frames 42308 are available, Frame Allocation Function 43600 allocates MEM 10112 Frames 42308 from the head of the not in use frame list. The next stage is rearranging MHT 10716 so that the search algorithm will continue to work. As previously explained, the search algorithm terminates when it finds an MHTE 42601 whose Valid Flag 42603 is reset. Consequently, if MHTE 42601 belonging to a deallocated MEM 10112 Frame 42308 is simply invalidated, MHT 10716 will have a "hole" and the search algorithm will not be able to find an MHTE 42601 when that MHTE 42601 both follows an invalidated MHTE 42601 and has an AON-page number that hashes to an MHTE index between the index to which the AON-page belonging to invalidated MHTE 42601 hashed and invalidated MHTE 42601's index.

There are several algorithms for filling holes in hash tables. The one used by the current embodiment's Frame Manager Procedures 42520 is illustrated in FIG. 440. The algorithm is the following:

(1) Clear MHTE 42601 being currently examined. At the start of the algorithm, that MHTE 42601 is the one whose MEM 10112 Frame 42308 is being deallocated. Clearing is done by resetting all Flag Fields 42602 through 42612 and assigning standard invalid values to Frame Number Field 42608, AON Field 42609, and Page Number Field 42610.

(2) Save the index of MHTE 42601 which has just been cleared.

(3) Calculate the index of the next MHTE 42601, wrapping around if the end of MHT 10716 is reached.

(4) If the MHTE 42601 whose index has just been calculated has its Valid Flag 42603 reset, there are no valid MHTEs 42601 between MHTE 42601 which has just been cleared and the next invalid MHTE 42601. Consequently, the search algorithm will perform properly and Deallocation Procedure 43900 is finished.

(6) If MHTE 42601 whose index has just been calculated is valid, hash the values contained in MHTE 42601's AON Field 42609 and Page Field 42610 to obtain a MHTE index.

(6) If the index resulting from the hashing is less than or equal to the index of MHTE 42601 which was cleared in step 1, the contents of MHTE 42601 whose index has just been calculated should be in cleared MHTE 42601. Therefore, copy the contents of MHTE 42601 whose index was just calculated into cleared MHTE 42601 and copy the MHTE index belonging to cleared MHTE 42601 into MHTE Link Field 42904 of MFTE 42901 for MEM 10112 Frame 42308 whose Frame Number 42314 appears in Frame Number Field 42608 of MHTE 42601 whose index was just calculated. Then go back to step 1, using MHTE 42601 whose index was just calculated as the current MHTE 42601.

(7) If there is no need to copy the contents of one MHTE 42601 into another MHTE 42601, go back to step 3.

FIG. 440 illustrates the algorithm. MHTEs 42601 A and B show the simplest case: MHTE 42601 A's MEM 10112 Frame 42308 is being deallocated, so Frame Deallocation Procedure 43900 clears MHTE 42601 A. Then, it examines the next MHTE, MHTE 42601 B. However, MHTE 42601 B is ready invalid. There are therefore no MHTEs 42601 between MHTE 42601 A and 42601 B to be "lost", and Frame Deal location Procedure 43900 is finished.

MHTEs 42601 C through F illustrate a more complicated case. Again, MHTE 42601 C's MEM 10112 Frame 42308 is being deallocated. However, if MHTE 42601 C is simply invalidated, then the search algorithm will not be able to find MHTE 42601 D or E, whose MHTE indexes are less than or equal to the MHTE index of MHTE 42601 C. Therefore, MHTE 42601 E's contents must be copied into MHTE 42601 C. When Frame Deallocation Procedure 43900 hashes MHTE 42601 D's AON-page, the hashed value is equal to the MHTE index of MHTE 42601 C; consequently, there is no need to move MHTE 42601 D and Frame Deallocation Procedure 43900 goes on to MHTE 42601 E. MHTE 42601 E is not invalid, and its AON and page number hash to a value that is less than or equal to the index of MHTE 42601 C. Frame Deallocation Procedure 43900 consequently copies the contents of MHTE 42601 E into MHTE 42601 C, updating MFTE 42901 for MHTE 42601 E's MEM 10112 Frame 42308 in the process. MHTE 42601 E is now the current MHTE 42601. Frame Deallocation Procedure 43900 clears MHTE 42601 E and examines the next entry, MHTE 42601 F. MHTE 42601 F is invalid, and consequently, MHT 10716 is in the proper order.

E. Processes a. Introduction (FIG. 402)

As stated in the general discussion of operating systems, a Process 610 may be logically defined as the activity resulting from the execution of a program with its data by a sequential processor. Whenever a user of CS 10110 is using the system, he has one or more Processes 610 executing programs for him. When a user begins using CS 10110, KOS creates a Process 610 for him; when the user commands CS 10110 to execute a program, it is the user's Process 610 which executes it for him. If the user desires, his Process 610 can invoke EOS Procedures 602 which create additional Processes 610.

As previously mentioned, CS 10110 is a multi-process system, that is, a system in which a number of Processes 610 may execute programs concurrently. Each Process 610 appears to have sole access to the physical hardware, and program execution appears to proceed continuously, but the hardware is in fact being multiplexed among Processes 610, and execution of the program being executed by Process 610 goes forward only when Process 610 has access to JP 10114.

FIG. 402, already discussed, illustrates a multiprocess operating system. As FIG. 402 shows, the means by which the physical hardware is multiplexed among Processes 610 is Virtual Processor 612. The execution of a given Process 610's program cannot proceed unless the Process is bound to (associated with) a Virtual Processor 612, and the actual execution takes place only when Virtual Processor 612 is bound to JP 10114. The physical means by which Processes 610 are implemented and bound to Virtual Processors 612, and by which Virtual Processors 612 are implemented and bound to JP 10114 are explained below.

KOS provides both Processes 610 and Virtual Processors 612 to EOS. KOS can provide an essentially unlimited number of Processes 610, but only a small fixed number of Virtual Processors 612. Consequently, execution of Processes 610 can proceed concurrently only if the fixed number of Virtual Processors 612 is multiplexed among Processes 610.

When a Process 610 executes a program for a user, it maintains the state belonging to that execution of the program. The state is stored in Process 610's Macrostack (MAS) 502. Each time a program being executed by Process 610 invokes a Procedure 602 or returns from a Procedure 602, KOS makes the necessary changes in Process 610's MAS 502.

KOS also performs the functions required to synchronize Processes 610. Processes 610 must be synchronized whenever one Process 610 depends on another, for instance when two Processes 610 modify shared data. In order to synchronize Processes 610, KOS uses devices called Event Counters. These devices are explained in detail below.

1. Processes 610 in CS 10110 (FIG. 447)

When a user logs onto CS 10110 to execute a program, EOS commands KOS to create a Process 610 and gives KOS the information needed to invoke the first Procedure 602 in the first program that Process 610 is to execute. KOS creates a Process 610 by providing it with its data bases. FIG. 447 gives an overview of these data bases. The data bases contain two classes of information: data required by KOS and EOS to manage Process 610, and saved state resulting from Process 610's execution of a program. The data required to manage Process 610 is contained in Process Object 901; the saved state is primarily contained in Process 610's MAS 502 and Secure Stack (SS) 504, but may also be contained in Process 610's PET chain 44702 and in objects referenced by Procedures 602 executed by Process 610. As previously described, each time the program being executed by Process 610 makes a Call to a Procedure 602, state is added to Process 610's MAS 502 and state may be added to SS 504. On each Return from a Procedure 602, the state which was added for the Call is removed from MAS 502 and from SS 504. Additional state is saved on SS 504 when a microinvocation by the FU 10120 micromachine causes an overflow of FU Register and Stack Mechanism 10214 or when Virtual Processor 612 to which Process 610 is bound is unbound from JP 10114. Calls and Returns are explained in detail below; the relationship between SS 504 and the FU 10120 micromachine was explained in the discussion of the FU 10120 micromachine in Chapter 2.

In the present embodiment, the greater part of a Process 610's state is stored in six objects: Process Object 901, 4 objects making up MAS 502, and an object for SS 504. KOS may create the objects for Process 610, when it creates Process 610, or it may use previously-created objects. In the present embodiment, MAS 502 always consists of four objects because there are only four domains. The objects making up MAS 502 are for User MAS Object 10328, DBMS MAS Object 10330, EOS MAS Object 10332, and KOS MAS Object 10334. In other embodiments, an object for a domain's portion of MAS 502 may not be created until the program executed by Process 610 invokes a Procedure 602 which has that domain as its DOE. Entries 44703 in Process Event Table 44705 are created when synchronization operations involving Process 610 are carried out. Process synchronization and the operations involved in it are described below.

Process execution begins when EOS requests KOS to bind Process 610 to a Virtual Processor 612. From a logical point of view, process execution continues as long as Process 610 is bound to Virtual Processor 612. Process 610's physical execution, however, proceeds only when Virtual Processor 612 is bound to JP 10114.

In order to get a newly-created Process 610 going, KOS places single frames of previously-created data on SS object 10336 and KOS MAS 10334. A KOS Procedure 602 runs using the previously-created state. The KOS Procedure 602 then calls an EOS Procedure 602, which in turn calls the first Procedure 602 in the program being executed.

2. Synchronization of Processes 610 and Virtual Processors 612

Since Processes 610 and the Virtual Processors 612 to which they are bound may execute concurrently on CS 10110, KOS must provide means for synchronizing Processes 610 which depend on each other. For example, if Process 610 A cannot proceed until Process 610 B has performed some operation, there must be a mechanism for suspending A's execution until B is finished. Generally speaking, four kinds of synchronization are necessary:

- One Process 610 must be able to halt and wait for another Process 610 to finish a task before it proceeds.
- One Process 610 must be able to send another Process 610 a message and wait for a reply before it proceeds.
- When Processes 610 share a data base, one Process 610 must be able to exclude other Processes 610 from the data base until the first Process 610 is finished using the data base.
- One Process 610 must be able to interrupt another Process 610, i.e., asynchronously cause the second Process 610 to perform some action.

KOS has internal mechanisms for each kind of synchronization, and in addition supplies synchronization mechanisms to EOS. KOS uses the internal mechanisms to synchronize Virtual Processors 612 and KOS Processes 610, while EOS uses the mechanisms supplied by KOS to synchronize all other Processes 610. The internal mechanisms are the following:

- Event counters, Await Entries, and Await Tables. As will be explained in detail below, Event Counters and Await Entries allow one Process 610 to halt and wait for another Process 610 to complete an operation. Event counters and Await Entries are also used to implement process interrupts. Await Entries are organized into Await Tables.
- Message Queues. Message Queues allow one Process 610 to send a message to another and wait for a reply. Message Queues are implemented with Event Counters and queue data structures.
- Locks. Locks allow one Process 610 to exclude other Processes 610 from a data base or a segment of code. Locks are implemented with Event Counters and devices called Sequencers.

KOS makes Event Counters, Await Entries, and Message Queues available to EOS. It does not provide Locks, but it does provide Sequencers, so that EOS can construct its own Locks. The following discussion will define and explain the logical properties of Event Counters, Await Entries, Message Queues, Sequencers, and Locks. Their implementation in the present embodiment will be described along with the implementation of Processes 610 and Virtual Processors 612.

a.a. Event Counters 44801, Await Entries 44804, and Await Tables (FIGS. 448, 449)

Event Counters, Await Entries, and Await Tables are the fundamental components of the KOS Synchronization System. FIG. 448 illustrates Event Counters and Await Entries in the present embodiment. FIG. 449 gives a simplified representation of Process Event Table 44705, the present embodiment's Await Tables. Turning first to FIG. 448, Event Counter 44801 is an area of memory which contains a value that may only be increased. In one of the present embodiment, Event Counters 44801 for KOS systems which may not page fault are always present in MEM 10112; other Event Counters 44801 are stored in Secondary Storage 10124 unless a Process 610 has referenced them and thereby caused the VMM System to load them into MEM 10112. The value contained in an Event Counter 44801 is termed an Event Counter Value 44802. In the present embodiment, Event Counter 44801 contains 64 bits of data, of which 60 make up Event Counter Value 44802. Event Counter 44801 may be referred to either as a variable or by means of a 128-bit UID pointer which contains Event Counter 44801's location. The UID pointer is termed an Event Counter Name 44803.

Await Entry 44804 is a component of entries in Await Tables. In the present embodiment, there are two Await Tables: Process Event Table 44705 and Virtual Processor Await Table (VPAT) 45401. VPAT 45401 is always present in MEM 10112. As already mentioned, FIG. 449 illustrates PET 44705. Both PET 44705 and VPAT 45401 will be described in detail later. Each Await Entry 44804 contains an Event Counter Name 44803, an Event Counter Value 44802, and a Back Link 44805 which identifies a Process 610 or a Virtual Processor 612. Await Entry 44804 thus establishes a relationship between an Event Counter 44801, an Event Counter Value 44802, and a Process 610 or Virtual Processor 612.

Turning now to FIG. 449, in the present embodiment, all Await Entries 44804 for user Processes 610 are contained in PET 44705. PET 44705 also contains other information. FIG. 449 presents only those parts of PET 44705 which illustrate Await Entries 44804. PET 44705 is structured to allow rapid location of Await Entries 44804 belonging to a specific Event Counter 44801. PET entries (PETEs) 44909 contain links which allow them to be combined into lists in PETE 44705. There are four kinds of lists in PET 44705:

- Event counter lists: these lists link all PETEs 44909 for Event Counters 44801 whose Event Counter Names 44803 hash to a single value.
- Await lists: These lists link all PETEs 44909 for Event Counters 44801 which a given Process 610 is awaiting.
- Interrupt lists: These lists link all PETEs 44909 for Event Counters 44801 which will cause an interrupt to occur for a given Process 610.
- The Free list: PETEs 44909 which are not being used in one of the above lists are on a free list.

Each PETE 44909 which is on an await list or an interrupt List is also on an event counter list.

Turning first to the event counter lists, all PETEs 44909 on a given event counter list contain Event Counter Names 44803 which hash to a single value. The value is produced by Hash Function 44901, and then used as an index in PET Hash Table (PETHT) 44903. That entry in PETHT 44903 contains the index in PET 44705 of that PETE 44909 which is the head of the event counter list. PETE List 44904 represents one such event counter list. Thus, given an Event Counter Name 44803, KOS can quickly find all Await Entries 44804 belonging to Event Counter 44801.

In the present embodiment, the implementation of Event Counters 44801 and tables with Await Entries 44804 involves both Processes 610 and Virtual Processors 612 to which Processes 610 are bound. As will be explained later, a large number of Event Counters 44801 and Await Entries 44804 belonging to Processes 610 are multiplexed onto a small number of Event Counters 44801 and Await Entries 44804 belonging to the Processes' Virtual Processors 612. Await entries 44804 for Event Counters 44801 belonging to Virtual Processors 612 are contained in VPAT 45401.

b.b. Synchronization with Event Counters 44801 and Await Entries 44804)

The simplest form of Process 610 synchronization provided by KOS uses only Event Counters 44801 and Await Entries 44804. Coordination takes place like this: A Process 610 A requests KOS to perform an Await Operation, i.e., to establish one or more Await Entries 44804 and to suspend Process 610 A until one of the Await Entries is satisfied. In requesting the Await Operation, Process 610 A defines what Event Counters 44801 it is awaiting and what Event Counter Values 44802 these Event Counters 44801 must have for their Await Entries 44804 to be satisfied. After KOS establishes Await Entries 44804, it suspends Process 610 A. While Process 610 A is suspended, other Processes 610 request KOS to perform Advance Operations on the Event Counters 44801 specified in Process 610 A's Await Entries 44804. Each time a Process 610 requests an Advance Operation on an Event Counter 44801, KOS increments Event Counter 44801 and checks Event Counter 44801's Await Entries 44804. Eventually, one Event Counter 44801 satisfies one of Process 610 A's Await Entries 44804, i.e., reaches a value equal to or greater than the Event Counter Value 44802 specified in its Await Entry 44804 for Process 610 A. At this point, KOS allows Process 610 A to resume execution. As Process 610 A resumes execution, it deletes all of its Await Entries 44804.

c.c. Event Counter 44801 Operations (FIG. 450)

KOS provides four operations for Event Counters 44801 and Await Entries 44804:

- Initialize: This operation takes an event counter variable as an argument and initializes the variable to 0.
- Read: This operation takes an event counter variable as an argument and returns the event counter variable's current Event Counter Value 44802.
- Await: This operation takes a list of Event Counter Name 44803 and Event Counter Value 44802 pairs and creates a list of Await Entries 44804 for Process 610 or Virtual Processor 612 performing the operation. There is one Await Entry 44804 for each pair on the list. After creating Await Entries 44804, the operation suspends the execution of Process 610 or Virtual Processor 612 until an advance of one of the Event Counters 44801 satisfies one of the Await Entries 44804. If one of the Await Entries 44804 has already been satisfied by an advance of its Event Counter 44801, the Await Operation neither creates the list of Await Entries 44804 nor suspends Process 610 or Virtual Processor 612.

Advance: This operation takes an Event Counter variable as an argument. It increments Event Counter Value 44802 contained in Event Counter 44801 represented by the variable and causes a search of Await Tables for Await Entries 44804 for Event Counter 44801 which were satisfied by the Advance Operation. When the Advance Operation locates a satisfied Await Entry 44804, it causes Process 610 or Virtual Processor 612 indicated by Back Link Field 44805 in Await Entry 44804 to resume execution. When Process 610 or Virtual Processor 612 resumes execution, it destroys all of the Await Entries 44804 on its Await List.

FIG. 450 illustrates a simple case of synchronization. Two Processes 610, Process 610 A and Process 610 B share a data table C 45003 and an Event Counter 45004. This Event Counter has an Event Counter Name 44803 represented by EC04. Process 610 A and Process 610 B use Table 45003 in turn. After one Process 610 is finished with Table 45003, it performs an Advance Operation on Event Counter 45004, which allows the other Process 610 to execute, and then reads Event Counter 45004's current Event Counter Value 44802, increments the value, and performs an Await Operation with the incremented value. The Await Operation creates an Await Entry 44804 in Await Table 45008 and suspends Process 610 which created Await Entry 44804. FIG. 450 illustrates a period in which first Process 610 B, then Process 610 A, and then Process 610 B is running. During this period, Event Counter 45004 has three Event Counter Values 44802, represented here by val0, val1, and val2. Val0 was created by an Advance Operation performed by Process 610 A before the period shown in FIG. 450; val1 is created by the Advance Operation shown in Process 610 B, and val2 is created by the Advance Operation shown in Process 610 A. Three Await Entries, 45005 A, B, and C, exist in Await Table 45008 during this period for Process 610 A and Process 610 B and Event Counter 45004. The first one, 45005 A, was created by an Await Operation which suspended Process 610 A before the period of time shown in FIG. 450. It is destroyed when Process 610 A resumes execution. The second, 45005 B, is created by the Await Operation shown in Process 610 B and is destroyed when Process 610 B resumes execution. The third, 45005 C, is created by the Await Operation shown in Process 610 A. It still exists at the end of the period of time illustrated in FIG. 450.

FIG. 450 illustrates the following sequence of events: First, Process 610 B changes Table C 45003. Then it does an advance on Event Counter 45004. The advance gives Event Counter 45004 the value val1. This is the value contained in Await Entry 45005 a, and consequently, Process 610 A may resume execution. Since Process 610 A may run anytime after the Advance Operation, Process 610 B cannot modify Table C 45003 after the Advance Operation. Process 610 B next does a Read Operation on Event Counter 45004. The operation returns val1, and Process 610 B increments the value by 1. It then uses the incremented value in an Await Operation. The Await Operation creates Await Entry 45005 b and suspends Process 610 B.

When Process 610 A resumes execution, it, too, changes Table C 45003 and advances Event Counter 45004, giving it the value val2, which in turn is the value contained in Await Entry 45005 b. Consequently, Process 610 B may resume execution at any time after the Advance Operation performed by Process 610 A. Process 610 A then proceeds as did Process 610 B: it reads Event Counter 45004, increments the returned value, val2, by 1, and uses the incremented value in an Await Operation which creates Await Entry 45005 c.

As indicated in the discussion of the Advance Operation and in the above example, a Process 610 may resume execution at any time after an Advance Operation gives an Event Counter 44801 specified by one of Process 610's Await Entries 44804 a value that is greater than or equal to the value specified by that Event Counter 44801's Await Entry 44804. Thus, in the above example, Process 610 A 45001 may resume execution and perform its Advance Operation before Process 610 B 45002 has executed its Await Operation. However, as long as Process 610 B 45002 does not read or modify Table 45003 after it has performed the Advance Operation, the fact that Process 610 A has already performed its advance operation makes no difference. In this case, Process 610 B's Await Operation simply determines that Event Counter 45004 already has the value Process 610 B 45001 is to wait for, and neither creates an Await Entry 44804 nor suspends Process 610 B.

d.d. Event Counters 44801 and Interrupts

The interrupt mechanism allows Processes 610 to react to asynchronous occurences, i.e. to occurences which are not under a Process 610's temporal control. For example, if a Process 610 A gives a task to another Process 610 B, but then does not wait for Process 610 B to finish, but instead executes other tasks, Process 610 B may interrupt Process 610 A when Process 610 B is finished. On receiving the interrupt from Process 610 B, Process 610 A saves its current state and invokes a special Procedure 602, called an Interrupt Handler, which takes the actions made necessary by the fact that 610 B is finished. When Interrupt Handler Procedure 602 is finished, 610 A restores the state that existed when the interrupt occurred and continues execution. A Process 610 may also interrupt itself. For instance, if a Process 610 services two queues, A and B, but spends most of its time servicing queue A, Process 610 may service queue B by periodically interrupting itself as it services queue A, checking whether queue B requires servicing, and servicing it if it does.

In CS 10110, process interrupts are implemented by means of Event Counters 44801 and Await Entries 44804. Interrupts are established by calling a KOS Establish Interrupt Procedure 602 which creates a PETE 44909 for the interrupt. PETE 44909 includes a back link to Process 610 for which the interrupt is created and the location of an Interrupt Handler Procedure 602. Once the interrupt is established, an advance of Event Counter 44801 which causes Event Counter 44801 to equal or exceed Event Counter Value 44802 specified in PETE 44909 for the interrupt causes Process 610 specified in PETE 44909 to invoke Interrupt Handler Procedure 602 specified in PETE 44909. The implementation of interrupts will be explained in detail in the discussion of process implementation.

e.e. Event Counters 44801 and System Clocks

KOS provides processes with clock Event Counters 44801 which behave as if CS 10110's system clock performed Advance Operations on them. Thus, Process 610 may perform Await Operations which await a specific time, or Process 610 may interrupt itself or another Process 610 at a specific time or after an interval of time. The means by which clock Event Counters 44801 are simulated involve Interval Timer 25410 and KOS microcode, and are described in detail in the discussion of process-level and virtual processor-level synchronization operations.

f.f. Locks 45101 (FIG. 451)

Locks are devices which prevent Processes 610 from simultaneously using data bases or executing a portion of a program. In CS 10110, Locks also control the order in which Processes 610 use a data base or execute a portion of a program. Locks are necessary even in embodiments with a single JP 10114, because process execution is still logically simultaneous. For example, if a data base does not have a Lock, a Process 610 A may start altering the data base, but Process 610 A's Virtual Processor 612 may be unbound from JP 10114 before Process 610 A is finished. The data base is thus left in an inconsistant state, and another Process 610, Process 610 B, may then attempt to use the data base in its inconsistant state. If the data base has a Lock, Process 610 A can lock the data base as it begins altering the data base and unlock it when it is finished. As long as the data base is locked, no other Process 610 can have access to the data base, and thus no Process 610 can use it when it is in an inconsistant state.

In CS 10110, Locks are made of Event Counters 44801 and Sequencers. FIG. 451 shows such a Lock. Lock 45101 is an area in memory which contains an Event Counter 44801 and a Sequencer 45102. A given Lock may contain additional information, for example, a link to the data base or code that it locks, and Event Counter 44801 and Sequencer 45102 need not be in adjacent locations in memory. Event Counters 44801 in Locks 45101 are exactly like those already discussed. Physically, Sequencers 45102 resemble Event Counters 44801 in most respects. They are areas in memory which contain Event Counter Values 44802. Event Counter Values 44802 contained in Sequencers 45102 may be used exactly like those contained in Event Counters 44801. The chief difference between Sequencers 45102 and Event Counters 44801 is that Sequencers 45102 never have Await Entries 44804 associated with them. There are furthermore only two operations that can be performed on a Sequencer 45102: Initialize and Ticket. Initialize works like the equivalent operation with Event Counters 44801: it takes a sequencer variable and sets its value to 0. Ticket increments a sequencer variable and returns the value that the sequencer variable had before it was incremented. Ticket thus resembles a combined Read and Advance Operation on an Event Counter 44801, but since Sequencers 45102 do not have Await Entries 44804 associated with them, the operation does not cause any awaiting Processes 610 to resume execution.

To illustrate how Lock 45101 works, it is assumed that Lock 45101's Event Counter 44801 and Sequencer 45102 have both been initialized, but that no Process 610 has yet used the resource locked by Lock 45101. Consequently, both Event Counter 44801 and Sequencer 45102 have the value 0. The first Process 610 that wishes to use the resource is Process 610 A. Process 610 A performs a Lock Operation on Lock 45101. The exact form of a Lock Operation depends on the implementation, but any Lock Operation must do two things:

It must perform a Ticket Operation on Sequencer 45102.

It must use Event Counter Value 44802 obtained via the Ticket Operation and Event Counter Name 44803 belonging to Lock 45101 in an Await Operation.

Since Process 610 A which performed the Lock Operation is the first Process 610 to use the resource, the Ticket Operation returns the value 0. This is also the value of Event Counter 44801 belonging to Lock 45101, so the Await Operation neither establishes an Await Entry 44804 nor suspends the execution of Process 610 A. Process 610 A therefore immediately begins using the resource it has locked. Before Process 610 A is finished with the resource, Process 610 B wants to use it. Process 610 B, too, performs a Lock Operation. This time, the Ticket Operation returns the value 1. However, Event Counter 44801 in Lock 45101 still has the value 0. Consequently, the Await Operation creates an Await Entry 44804 for Process 610 B and suspends Process 610 B. Await Entry 44804 contains 1, the value returned by the Ticket Operation, as its Event Counter Value 44802. If other Processes 610 want to use the resource before Process 610 A is finished, they, too, perform Ticket Operations and Await Operations as described above.

When Process 610 A is finished with the resource, it unlocks the resource. Again, the tasks performed by an Unlock Operation depend on the implementation, but all Unlock Operations must perform an Advance Operation on Lock 45101's Event Counter 44801. As previously described, the Advance Operation causes KOS to search for Await Entries 44804 whose Event Counter Value 44802 is less than or equal to Event Counter Value 44802 belonging to the advanced Event Counter. Continuing with the example, the Advance Operation on Lock 45101's Event Counter 44801 gives it the value 1, which is the Event Counter Value 44801 contained in Await Entry 44804 created by the Lock Operation performed by Process 610 B. The Advance Operation thus completes Process 610 B's await, and Process 610 B can begin using the locked resources. If another Process 610 has locked the resource while either A or B was using it, that Process 610 will gain access to the resource when B unlocks it. The Lock thus assures that only one Process 610 at a time can use the resource, and that the Processes 610 will use the resource in exactly the order in which they locked it.

KOS does not provide Locks 45101 to EOS, but it does provide Sequencers 45102 and the Initialize and Ticket Operations. EOS can thus use Sequencers 45101 and Event Counters 44801 to construct its own Locks 45101. KOS does use Locks 45101 internally.

g.g. Message Queues 45210 (FIG. 452)

In CS 10110, Message Queues are the means by which Processes 610 send messages to each other. Such messages are termed Inter Process Communications (IPCs). KOS provides a Message Queue facility, termed the Secure Message Transmission Facility, to EOS; in addition, KOS uses Message Queues to communicate between KOS Processes 610 and other Processes 610 and to implement the I/0 primitives it provides to KOS and to EOS.

FIG. 452 is a conceptual presentation of a Message Queue. In FIG. 452, the Message Queue is implemented by means of an array; however, other implementations, for example, with linked lists, are possible.

Turning to FIG. 452, Message Queue 45210 consists of two parts: Message Queue Header 45201 and Message Queue Array 45202. Message Queue Header 45201 contains the information required to manage Message Queue 45210, and Message Queue Array 45202 contains the messages.

Beginning with Message Queue Header 45201, five fields are shown. These fields are the ones that are required for any Message Queue 45210; Headers for specific Message Queues 45210 may contain other information as well. The first two fields are Event Counters 44801. Enqueue Event Counter 45203 is advanced every time a message is added to Message Queue 45210; Dequeue Event Counter 45204 is advanced every time a message is taken from Message Queue 45210.

The next two fields are the indexes of the head and tail of Queue 45211 of Message Elements 45208 contained in Message Queue Array 45202. A queue is a first-in, first-out data structure, so Queue Head Index 45205 contains the index of the message that has been in Queue 45210 longest, while Queue Tail Index 45206 contains the index of the message that was last added to Queue 45210. Each time a message is removed from Queue 45210, Queue Head Index 45205 is incremented; each time a message is added, Queue Tail Index 45206 is incremented; if either Index 45205 or Index 45206 has the value of the last index in Message Queue Array 45202 when it is incremented, it receives the value of the first index in Message Queue Array 45202. The relationship between the values of Index 45205 and Index 45206 indicates whether Queue 45210 is full or empty and also indicates how many messages Queue 45210 contains.

The last field, Queue Lock 45207, gives each Process 610 exclusive access to Queue 45210 while it adds a message to Queue 45210 or takes a message from Queue 45207. Queue Lock 45207 is a standard KOS Lock 45101.

Message Queue Array 45202 is an array of Message Elements 45208. Those Message Elements 45208 which contain messages belong to Queue 45211. All other Message Elements 45208 belong to Free Message Elements 45209.

The fundamental operations on a Message Queue 45210 are Enqueue and Dequeue. Enqueue places a message at the tail of Queue 45211 contained in message Queue 45210 and advances Enqueue Event Counter 4520; Dequeue removes a message from the head of Queue 45211 and advances Dequeue Event Counter 45203. Dequeue thus removes messages from the queue in the order in which they enqueued. Both operations lock Message Queue 45210 at the beginning of the operation and unlock it at the end of the operation. Enqueue adds a message to the tail of Queue 45211 by copying the message into Message Element 45208 following the previous tail and updating Queue Tail Index 45206 to indicate the new tail; dequeue removes a message from the head of Queue 45211 by returning the message in Message Element 45208 at the head of Queue 45211 and updating Queue Head Index 45205 to indicate that the new head is the next element in Queue 45211. Enqueue fails if Message Queue Array 45202 contains no more Free Message Elements 45208; Dequeue fails if Queue 45211 contains no messages. When Enqueue fails, it returns Event Counter Name 44803 and Event Counter Value 44802 belonging to Dequeue Event Counter 45204. Process 610 which attempted the Enqueue Operation may use Event Counter Name 44803 and Event Counter Value 44802 in an Await Operation or to establish an interrupt. In the first case, Process 610 will be suspended until another Process 610 performs a Dequeue Operation. In the second, Process 610 will be interrupted when another Process 610 performs a Dequeue Operation. Since Dequeue makes a Message Element 45208 available, Process 610 may reattempt the Enqueue Operation when the await is complete or when the interrupt occurs. When Dequeue fails, it returns Event Counter Name 44803 and Event Counter Value 44802 belonging to Enqueue Event Counter 45203, and Process 610 may use these values, too, to establish an interrupt or perform an Await Operation.

3. Virtual Processors 612 (FIG. 453)

As previously stated, a Virtual Processor 612 may be logically defined as the means by which a Process 610 gains access to JP 10114. In physical terms, a Virtual Processor is an area of MEM 10112 which contains the information that the KOS microcode which binds Virtual Processors 612 to JP 10114 and unbinds them from JP 10114 requires to perform the binding and unbinding operations. FIG. 453 shows a Virtual Processor 612. The area of MEM 10112 belonging to a Virtual Processor 612 is Virtual Processor 612's Virtual Processor State Block (VPSB) 614. Each Virtual Processor 612 in a CS 10110 has a VPSB 614. Together, the VPSBs 614 make up VPSB Array 45301. Within the Virtual Processor management system, each Virtual Processor 612 is known by its VP Number 45304, which is the index of the Virtual Processor 612's VPSB 614 in VPSB Array 45301. Virtual Processors 612 are managed by means of lists contained in Micro VP Lists (MVPL) 45309. Each Virtual Processor 612 has an Entry (MVPLE) 45321 in MVPL 45309, and as Virtual Processor 612 changes state, virtual processor management microcode moves it from one list to another in MVPL 45309.

VPSB 614 contains two kinds of information: information from Process Object 901 belonging to Process 610 which is bound to VPSB 614's Virtual Processor 612, and information used by the Virtual Processor Management System to manage Virtual Processor 612. The most important information from Process Object 901 is the following:

- Process 610's principal and process UIDs 40401.
- AONs 41304 for Process 610's Stack Objects 44703. (VPSB 614 uses AONs 41304 because KOS guarantees that AONs 41304 belonging to Stack Objects 44703 will not change as long as a Process 610 is bound to a Virtual Processor 612.)

Given AON 41304 of Process 610's SS object 10336, the Virtual Processor Management System can locate that portion of Process 610's state which is moved into registers belonging to JP 10114 when Process 610's Virtual Processor 612 is bound to JP 10114. Similarly, when Virtual Processor 612 is unbound from JP 10114, the virtual processor management system can move the contents of JP 10114 registers into the proper location in SS Object 10336.

a.a. Virtual Processor Management (FIG. 453)

EOS can perform six operations on Virtual Processors 612:

- Request VP allows EOS to request a Virtual Processor 612 from KOS.
- Release VP allows EOS to return a Virtual Processor 612 to KOS.
- Bind binds a Process 610 to a Virtual Processor 612.

Unbind unbinds a Process 610 from a Virtual Processor 612.

Run allows KOS to bind Process 610's Virtual Processor 612 to JP 10114.

Stop prevents KOS from binding Process 610's Virtual Processor 612 to JP 10114.

As can be seen from the above list of operations, EOS has no direct influence over the actual binding of a Virtual Processor 612 to JP 10114. This operation is performed by a component of KOS microcode called the Dispatcher. Dispatcher microcode is executed whenever one of four things happens:

Process 610 whose Virtual Processor 612 is currently bound to JP 10114 executes an Await Operation.

Process 610 whose Virtual Processor 612 is currently bound to JP 10114 executes an Advance Operation which satisfies an Await Entry 44801 for some other Process 610.

Either Interval Timer 25410 or Egg Timer 25412 overflows, causing an Event Signal which invokes Dispatcher microcode.

IOJP Bus 10132 is activated, causing an Event Signal which invokes Dispatcher microcode. IOS 10116 activates IOJP bus 10132 when it loads data into MEM 10112 for JP 10114.

When Dispatcher microcode is invoked by one of these events, it examines lists in MVPL 45309 to determine which Virtual Processor 612 is to run next. For the purposes of the present discussion, only two lists are important: the running list and the eligible list. In the present embodiment, the running list, headed by Running List Head 45321, contains only a single MVPLE 45321, that representing Virtual Processor 612 currently bound to JP 10114. In embodiments with multiple JPs 10114, the running list may have more than one MVPLE 45321. The eligible list, headed by Eligible List Head 45313, contains MVPLEs 45321 representing those Virtual Processors 612 which may be bound to JP 10114. MVPLEs 45321 on the eligible list are ordered by priorities assigned Processes 610 by EOS. Whenever KOS Dispatcher microcode is invoked, it compares the priority of Process 610 whose Virtual Processor 612's MVPLE 45321 is on the running list with the priority of Process 610 whose Virtual Processor 612's MVPLE 45321 is at the head of the eligible list. If the latter Process 610 has a higher priority, KOS Dispatcher microcode places MVPLE 45321 belonging to the former Process 610's Virtual Processor 612 on the eligible list and MVPLE 45321 belonging to the latter Process 610's Virtual Processor 612 onto the running list. Dispatcher microcode then swaps Processes 610 by moving state in JP 10114 belonging to the former Process 610 onto the former Process 610's SS object 10336 and moving JP 10114 state belonging to the latter Process 610 from the latter Process 610's SS object 10336 into JP 10114.

b.b. Virtual Processors 612 and Synchronization (FIG. 454)

When a synchronization operation is performed on a Process 610, one of the consequences of the operation is a synchronization operation on a Virtual Processor 612. For example, an Advance Operation which satisfies an Await Entry 44804 for a Process 610 causes an Advance Operation which satisfies a second Await Entry 44804 for Process 610's Virtual Processor 612. Similarly, a synchronization operation performed on a Virtual Processor 612 may have a synchronization operation on Virtual Processor 612's Process 610 as a consequence. For example, if a Virtual Processor 612 performs an operation involving file I/0, Virtual Processor 612's Process 610 must await the completion of the I/0 operation.

FIG. 454 illustrates the means by which process-level synchronization operations result in virtual processor-level synchronization operations and vice-versa. The discussion first describes the components which transmit process-level synchronization operations to Virtual Processors 612 and the manner in which these components operate. Then it describes the components which transmit virtual processor-level synchronization operations to Processes 610 and the operation of these components.

The first set of components is made up of VPSBA 45301 and VPAT 45401. VPSBA 45301 is shown here with two VPSBs 614: one belonging to a Virtual Processor 612 bound to a user Process 610 and one belonging to a Virtual Processor 612 bound to the KOS Process Manager Process 610. VPAT 45401 is a virtual processor-level table of Await Entries 44804. Each Await Entry 44804 is contained in a VPAT Entry (VPATE) 45403. Each Virtual Processor 612 bound to a Process 610 has a VPAT Chunk 45402 of four VPATEs 45403 in VPAT 45401, and can thus await up to four Event Counters 44801 at any given time. The location of a Virtual processor 612's VPAT Chunk 45402 is kept in Virtual Processor 612's VPSB 614. When an Advance Operation satisfies any of the Await Entries 44804 belonging to a Virtual Processor 612, Await Entries 44804 all in Virtual Processor 612's VAT Chunk 45402 are deleted. As in PET 44705, VPATES 45403 containing Await Entries 44804 which are awaiting a given Event Counter 44801 are linked together in a list.

VPATEs 45403 for Virtual Processors 612 bound to user Processes 610 may contain Await Entries 44804 for user Process 610's Private Event Counter 45405. Private Event Counter 45405 is contained in Process 610's Process Object 901. It is advanced each time an Await Entry 44804 in a PETE 44909 on a PET List belonging to Process 610 is satisfied.

The components operate as follows: When KOS performs an Await Operation on Process 610, it makes Await Entries 44804 in both PET 44705 and VPAT 45401 and puts Process 610's VP 612 on the suspended list in MVPL 45309. As previously described, an Await Entry 44804 in PET 44705 awaits an Event Counter 44801 specified in the Await Operation which created Await Entry 44804. Await Entry 44804 in VPAT 45401 awaits Process 610's Private Event Counter 45405. Each time an Await Entry 44804 belonging to Process 610 in PET 44705 is satisfied, Process 610's Private Event Counter 45405 is advanced. The advance of Private Event Counter 45405 satisfies Await Entry 44801 for Process 610's Virtual Processor 612 in VPAT 45401, and consequently, KOS deletes Virtual Processor 612's VPATEs 45403 and moves Virtual Processor 612's MVPLE 45321 in MVPL 45309 from the suspended list to the eligible list.

The components which allow a Virtual Processor 612 to transmit a synchronization operation to a Process 610 are the following: Outward Signals Object (OSO) 45409, Multiplexed Outward Signals Event Counter 45407, and PET 44705. OSO 45409 contains Event Counters 44801 which KOS FU 10120 microcode advances when it performs operations which user Processes 610 are awaiting. Event Counters 44801 in OSO 45409 are awaited by Await Entries 44804 in PET 44705. Each time KOS FU 10120 microcode advances an Event Counter 44801 in OSO 45409, it also advances Multiplexed Outward Signals Event Counter 45407. It is awaited by an Await Entry 44804 in VPAT chunk 45402 belonging to Virtual Processor 612 bound to KOS Process Manager Process 610. When Virtual Processor 62 bound to KOS Process Manager Process 610 is again bound to JP 10114, KOS process Manager process 610 examines all PETEs 44909 belonging to the Event Counters 44801 in OSO 45409. If an advance of an Event Counter 44801 in OSO 44801 satisfied a PETE 44909 for Process 610, that Process 610's Private Event Counter 45405 is advanced as previously described, and Process 610 may again execute.

A user I/0 operation illustrates how the components work together. Each user I/0 channel has an Event Counter 44801 in OSO 45409. When a Process 610 performs a user I/0 operation on a channel, the EOS I/0 routine establishes an Await Entry 44804 in the PET 44705 list belonging to Process 610 for the channel's Event Counter 44801 in OSO 45409. When the I/0 operation is complete, IOS 10116 places a message to JP 10114 in an area of MEM 10112 and activates IOJP Bus 10132. The activation of IOJP Bus 10132 causes an Event Signal which invokes KOS microcode. The microcode examines the message from IOS 10116 to determine which channel is involved, and then advances Event Counter 44801 for that channel in OSO 45409 and also advances Multiplexed Outward Signals Event Counter 45407. The latter advance satisfies an Await Entry 44804 for Process Manager Process 610's Virtual Processor 612 in VPAT 45401, and Process Manager Process 610 begins executing. Process Manager Process 610 examines OSO 45409 to determine which Event Counters 44801 in OSO 45409 have been advanced since the last time process manager Process 610 executed, and when it finds such an Event Counter 44801, it examines the Event Counter Chain in PET 44705 for that Event Counter 44801. If it finds that the advance satisfied any Await Entries 44804 in the Event Counter Chain, it advances Private Event Counter 45405 belonging to Process 610 specified in Await Entry 44804, thereby causing that Process 610 to resume execution as previously described.

b. Implementation of Processes 610

As previously explained, a Process 610 consists physically of a group of objects: Process Object 901, MAS objects 10328 through 10334, and SS object 10336. KOS manages Processes 610 by means of Process Manager Procedures 602. These Procedures 602 respond to and manipulate Event Counters 44801, Await Tables as illustrated in FIG. 449, and Queues as illustrated in FIG. 452. Process Manager Procedures 602 may be called by EOS Processes 610, user Processes 610, or or by KOS Process Manager Process 610. Often, a given process management task is begun by a Process Manager Procedure 602 executed by an EOS or user Process 610 and finished by a Procedure 602 executed by the KOS Process Manager Process 610. For example, when EOS wishes to stop a Process 610, it invokes a Stop Procedure 602 provided by KOS. Stop Procedure 602 makes the necessary changes in Process 610's Process Object 901 and invokes another KOS Procedure 602 which performs the operations necessary to stop Process 610's Virtual Processor 612 and advances an Event Counter 44801 which is awaited by the Process Manager Process 610. When Process Manager Process 610 executes again, it obtains information about the state of stopped Process 610 and places the information in a Message Queue 45210 which transmits the information to EOS. The following discussion will first give a detailed explanation of Process Object 901 and the Message Queues 45210, Await Tables, and Event Counters 44801 maintained and used by the KOS Process Manager. The discussion will next explain the operations on Processes 610 and the manner in which they are implemented.

1. Process Object 901 (FIG. 455)

A Process Object 901 contains that portion of a Process 610's state which is not stored on or accessed via Process 610's SS object 10336 or MAS objects 10328 to 10334. Process Objects 901 are ETOs; however, in the present implementation, the ETM for Process Objects 901 contains no Procedures 602 for manipulating Process Objects 901, but exists solely to allow extended access checking.

FIG. 455 gives a detailed illustration of Process Object 901. FIG. 455 is divided into two parts: a first part giving an overview of an entire Process Object 901 and a second part giving details of those portions of Process Object 901 which are relevant to this discussion.

Beginning at the top of the first part of FIG. 455, the first item in Process Object 901 is Lock 45501. Various KOS Processes 610 modify and use the contents of Process Object 901, and as described in the introduction to synchronization, Lock 45501 ensures that only one Process 610 at a time has access to Process Object 901. The next item is Version Information 90103, which contains information regarding Process Object 901's format. Then comes Private Event Counter 45405. As explained in the discussion of virtual processor synchronization, Private Event Counter 45405 translates process-level advances which satisfy process-level Await Entries 44804 into virtual processor-level advances which satisfy virtual processor-level Await Entries 44804. Creator Field 45505 contains the subject of EOS Process 610 which creates Processes 610 for users. Principal, Process, and Tag Field 45507 contain principal UID 40401 for the user for whom EOS created the process, Process Object 901's UID 40401, and the tag (unused in this implementation) of the subject for whom Process 610 was created.

Virtual Processor Information Field 45509 contains information required to bind a Process 610 to a Virtual Processor 612. Virtual Processor UID 45511 is a non-object UID 40401 which represents Virtual Processor 612 to which Process 610 is bound. Secure Stack UID 45513 and Current Stack UID 45515 are the UIDs 40401 of Process 610's SS object 10336 and of that MAS object 10328 through 10334 which contains the topmost frame of Process 610's MAS 502. SS AON 45517 is the current AON 41304 of SS object 10336. Process AON 45519 is the current AON 41304 of Process Object 901. The KOS object management system guarantees that neither AON 41304 will change as long as Process 610 to which Process Object 901 belongs is bound to a Virtual Processor 612. Virtual Processor Number 45521 is the index of VPSB 45401 belonging to Virtual Processor 612 to which Process 610 is bound. As will be described in detail below, a KOS table translates Virtual Processor UIDs into Virtual Processor Numbers.

EOS Information 45523 contains data which allows KOS and EOS to exchange information about Process 610. Fields 45525 through 45529 contain UIDs 40401 of objects which EOS uses as Message Queues 45210 for messages that KOS sends it concerning Processes 610. These Message Queues 45210 work as described in the section on synchronization. Field 45525 contains the UID 40401 of the Scheduler Message Queue. When a Process 610 is interrupted, or when a Process 610 completes an await, KOS notifies EOS via this Message Queue 45210. Field 45527 contains UID 40401 of a Message Queue 45210 which KOS uses to notify EOS that a Process 610 has been stopped, and field 45529 contains that of a Message Queue 45210 which KOS uses to notify EOS that a Process 610 has been killed.

Fields 45531 through 45535 contain information which EOS provides KOS when it requests the creation of Process 610. Field 45531 is a pointer to a location which EOS uses to store information about Process 610. Whenever EOS requests it, KOS returns the pointer, and all messages sent by KOS to EOS about Process 610 contain the pointer. Using the pointer, EOS can locate the information it has stored concerning Process 610. Field 45533 is a pointer to the gate in Gates 10340 of Procedure Object 608 containing the first Procedure 602 which a Process 610 is to execute. Field 45535 is a pointer to data which the first Procedure 602 takes as arguments. Taken together, Fields 45533 and 45535 provide the information Process 610 needs to invoke a user Procedure 602.

Fields 45537 and 45539 provide EOS with information about awaits taken by Process 610. Field 45537 gives the architectural clock time at which an awaiting Process 610 began the await. EOS can use this information to determine whether a Process 610 should be unbound from its Virtual Processor 612. Field 45539 keeps track of the amount of time that Process 610 has awaited. EOS uses this information to schedule Process 610.

Domain Information 45540 contains the information which Process 610 requires to perform cross-domain Calls, that is, Calls to Procedures 602 contained in Procedure Objects 604 having a different DOE attribute from that of Procedure Object 604 containing Procedure 602 making the Call. In the present embodiment, domain information 45540 contains information concerning the four MAS objects 10328 through 10334. In other embodiments, there may be more MAS objects. For each domain's MAS stack object, per domain information 45541 contains the following: Domain UID 45543, the UID 40401 that specifies the domain to which the stack object belongs, Stack UID 45545, the UID 40401 of the MAS object for that domain, Stack AON 45547, the AON 41304 of the MAS object for that domain, Trace Pointer 45549, a pointer to the Trace Table (data bases for the debugger, explained in detail later) belonging to the domain, Trace AON 45551, the AON 41304 for the Trace Table, and Interrupt List Head 45553, the location of the head of the list of interrupt entries in PET 44705 whose handlers run in the domain.

Synchronization Information 45555 contains information for process-level synchronization operations. Await Quantum Field 45557 specifies a maximum length of time that a Process 610 may await an Event Counter 44801 before the EOS scheduler is informed that Process 610 is still awaiting. Domain of Await Field 45559 contains the UID 40401 of the domain in which Process 610 was executing when an await suspended it. When a suspended Process 610 is interrupted, Field 45559 allows the KOS Process Manager to determine the domain in which the interrupt handler is to run. Await List Head Field 45561 contains the head of the chain of PET 44705 Await Entries 44804 belonging to Process 610. Process State Field 45563 contains the current state of Process 610. There are five process states:

(1) Alive, i.e., not killed.

(2) Bound, i.e., bound to a Virtual Processor 612.

(3) Executing, i.e., Process 610 is neither stopped nor killed, and therefore its Virtual Processor 612 has access to JP 10114.

(4) Runnable, i.e., EOS may perform a Run Operation on the Process 610, and thereby put it into the Executing state.

(5) Message to Send, i.e., Process 610 has a message to send to EOS via one of the EOS Message Queues 45210

A Process 610 may be in several of these states at once. For example, a Process 610 may be Alive, Bound, Executing, and have a message to send. The Process Manager updates Process State Field 45563 each time it modifies a Process 610's state.

Await Quantum Runout Flag Field 45565 is set when a Process 610 has awaited longer than the amount of time specified in Field 45557 and the KOS Process Manager has notified EOS that the await quantum has been exceeded. Flag Field 45565 ensures that the KOS process manager does not send repeated messages to EOS when a Process 610 has exceeded its await quantum.

The information in the remaining fields falls into two categories: the fields in 45567 contain statistics used by the KOS Process Manager and the fields in 45569 contain statistics used by the Virtual Memory Manager. Details regarding these fields are not required for the present discussion.

2. Access to Process Objects 901

Process Objects 901 are ETOs. A subject which performs an operation involving a Process 610's Process Object 901 must have extended access to Process Object 901 which allows it to perform the operation. There are eleven kinds of extended access to Process Objects 901:

(1) Delete Process Access: the subject may delete Process 610 to which Process Object 901 belongs.

(2) Bind Process Access: the subject may bind Process 610 to a Virtual Processor 612.

(3) Unbind Process Access: the subject may unbind Process 610 from a Virtual Processor 612.

(4) Stop Process Access: the subject may stop Process 610, i.e., temporarily bar Process 610's Virtual Processor 612 from JP 10114.

(5) Kill Process Access: the subject may permanently bar Process 610's Virtual Processor 612 from JP 10114.

(6) Get Control State Access: the subject may read certain fields in Process Object 901.

(7) Set Control State Access: the subject may set certain fields in Process Object 901.

(8) Get Scheduler Information Access: The subject may read certain fields in Process Object 901 which contain scheduling information.

(9) Set Process Extended ACLs: the subject may set a Process Object 901's EACL.

(10) Get Process Extended ACLs: the subject may read a Process Object 901's EACL.

In the present embodiment, the Extended Type Manager for Process Objects 901 is empty and exists solely for extended access checking purposes.

3. Process Manager Event Counters 44801, Await Tables 44804, and Queues 45210 (FIG. 456)

FIG. 456 gives an overview of the Event Counters 44801, Await Tables, and Message Queues 45210 used and maintained by the KOS Process Manager. Beginning at the left of the figure, there are four Event Counters 44801 which the KOS Process Manager Process 610 awaits. Like other KOS Processes 610, the Process Manager Process 610 has no Process Object 901, and does not use PET 44705. Instead, Await Entries 44804 for Process Manager Process 610 are contained in VPATEs 45403 for Virtual Processor 612 to which Process Manager Process 610 is bound. The four Event Counters 44801 function as follows:

New Request EC 45601 is advanced whenever an entry is made in Process Manager Request Queue 45607 and whenever a Process 610 makes a PETE 44909 for PM clock EC 45615 which awaits a time earlier than the preceding earliest time awaited by a PETE 44909 for PM clock EC 45615.

Clock EC 45603 is an Event Counter 44801 which KOS microcode advances each time CS 10110 must respond to a time-related event.

The KOS process manager advances Stopped-killed EC 45605 each time it stops or kills a Process 610, i.e., bars it from further access to JP 10114.

Multiplexed Outward Signals Event Counter 45407 has already been mentioned. KOS microcode advances this Event Counter 44801 whenever it advances an Event Counter 44801 in OSO 45409.

OSO 45409 has also already been mentioned. It contains Event Counters 44801 responded to by user Processes 610 which are advanced by KOS microcode.

The KOS Process Manager uses two data bases containing Await Tables. Process Manager Procedures 602 create Await Entries 44804 in PET 44705 and carry out the actions necessary to end the awaits when they are satisfied. As already explained, the Process Manager Process 610 awaits Await Entries 44804 in VPAT 45401.

The Process Manager uses four Message Queues 45210. One of them, Process Manager Request Queue (PMRQ) 45607, transmits messages from Processes 610 which require the assistance of Process Manager Process 610 to Process Manager Process 610. The other three transmit information from KOS Process Manager Process 610 to EOS. Scheduler Queue 45609 transmits messages about Processes 610 which may be of interest to the EOS Scheduler; Stopped Queue 45611 transmits messages indicating that a Process 610 has been stopped; Killed Queue 45613 transmits messages indicating that a Process 610 has been killed.

In the following, PET 44705, OSO 45409, and PMRQ 45607 will be explained in detail; Scheduler Queue 45609, Stopped Queue 45611, and Killed Queue 45613 are Message Queues 45210 and function as previously described.

a.a. PET 44705 (FIGS. 449, 457)

FIG. 449 introduced in the discussion of synchronization, gives an overview of PET 44705. PET 44705 is a table whose entries contain Await Entries 44804 for process-level awaits and interrupts. The table consists of a Lock 44911, format information for KOS (not shown), and an Array 44902 of PET Entries (PETEs) 44909. PETES 44909 are organized into lists of PETEs 44909. PETEs 44909 which are not in use are on the free list, headed by Free List Head 44907. PETEs 44909 which are in use in use are of four types: PETEs 44909 which function as heads for event counter lists, PETEs 44909 for Await Lists, PETEs 44909 for interrupt lists, and PETEs 44909 which contain the location of an interrupt's interrupt handler. The PETEs 44909 for awaits and for interrupts always belong to two lists: an event counter list for an Event Counter Name 44803 and an interrupt list or await list for a Process 610. A PETE 44909 for an await or an interrupt can thus be located either by means of the Event Counter Name 44803 that it contains or by means of Process 610 to which it belongs. FIG. 449 shows only an Event Counter List 44904; other lists will be illustrated later. As illustrated in FIG. 449, Event Counter Lists 44904 are doubly-linked circular lists. Each Event Counter List 44904 has a special Header Entry 44905 which does not contain an Await Entry 44804. Header Entry 44905 has links to the first and last PETE 44909 in List 44904, and each PETE 44909 in List 44904 has a link to the preceding and following PETEs 44909. The first PETE 44909 in List 44904 has a link back to the head of List 44904, and the last entry has a link forward to the head of List 44904. If a List 44904 has several entries for the same Event Counter Name 44803, the entries are ordered by increasing Event Counter Value 44802.

FIG. 457 presents a detailed view of PETEs 44909. PETEs 44909 used as Event Counter List headers, or used in Await Lists, and Interrupt Lists all share some fields and differ in other fields. PET Await List Entry 45702 illustrates the shared fields. The first Field, Tag Field 45701 indicates the kind of PETE 44909. The second is PETE 44909's index in PETE Array 44902; the next two Fields, 45705 and 45707, are links. In the free list and in Event Counter List 44904, Field 45705 is the link to the following PETE 44909, and Field 45707 is the link to the preceding PETE 44909. Thread 45709 is a link used to link PETEs 44909 into lists other than Event Counter Lists 44904. In PETE 44909 entries on the free list, the remaining fields are meaningless. PETEs 44909 for await lists and interrupt lists share Fields 45709 through 45715 as well. Thread 45709 points to the next PETE 44909 in the await or interrupt list belonging to Process 610. Field 45711 contains UID 40401 of Process Object 901 for Process 610 to whose list PETE 44909 belongs, and Fields 45713 and 45715 contain an Event Counter Value 44802 and an Event Counter Name 44803 respectively, and accordingly make up PETE 44909's Await Entry 44804.

The only remaining field in Await List Entry 45702 is Await Complete Flag 45717. When an advance of Event Counter 44801 specified in Field 45715 satisfies Event Counter Value 44802 specified in Field 45713, the Advance Operation sets Await Complete Flag 45717. Flag 45717 serves to mark Await Entry 45702 until Process 610 whose await has ended can resume execution and delete its await list. FIG. 457 shows a PET await list in PET 44705. Await lists are singly-linked, non-circular, and do not have a special header. As illustrated in FIG. 457 and previously described in the discussion of Procedure Object 901, Await List Head Field 45561 in Procedure Object 901 points to the first PETE 44909 in 610's await list.

PET Interrupt List Entries 45718 do not have Await Complete Field 45717 and do have four other fields which are not present in PET Await List Entries 45702. Field 45717 specifies the domain in which the interrupt's Handler Procedure 602 is to execute; Field 45719 is a link to a PETE 44909 Handler Entry which specifies the interrupt's Handler Procedure 602. Handler Entries are explained below. Field 45721 gives the interrupt priority. Priorities determine the order in which interrupts are serviced. The interrupt with the highest priority is serviced first, and if an interrupt occurs while another interrupt is being serviced and the second interrupt has a higher priority than the first, the service of the first interrupt is interrupted until the higher-priority interrupt has been serviced. Field 45723, finally, is the Interrupt Pending Flag. Flag 45723 is set when Interrupt List Entry 45718's Await Entry 44804 is satisfied. Flag 45723 preserves the fact that Await Entry 44804 has been satisfied until the interrupt can be serviced. PETE 45724 is a PETE 44909 which specifies an interrupt handler. These PETEs 44909 share only Tag Field 45707 and PET Index Number Field 45703 with other PETEs 44909. The remainder of the entry contains two fields: Field 45725, a pointer to the location of interrupt handler Procedure 602, and Field 45727, a pointer to a MAS 502 frame containing information which interrupt handler Procedure 602 is to use when it executes. FIG. 457 also, illustrates a PET Interrupt List in PET 44705 for one of the domains in which a Process 610 executes. Like await entry lists, interrupt entry lists are single-linked, non-circular, and do not have special headers. Each Interrupt List Entry 45718 on the interrupt list has a Handler Entry 45724, and the interrupt list's first PETE 44909 is pointed to by Field 45553 in Procedure Object 901. Interrupt List Entries 45718 on the interrupt list are ordered by their Priority Fields 45721: entries with higher priorities precede those with lower priorities.

b.b. Process Manager Clock Event Counter 45615 Implementation (FIG. 458)

Process Manager clock Event Counter (PM Clock EC) 45615 is a dummy Event Counter which appears to be advanced every time CS 10110's clock changes its value. The means by which PM Clock EC 45615 is made to appear to behave in this fashion are illustrated in FIG. 458. The implementation has three levels: at the process level, there are dummy Process Manager Clock Event Counter 45615, PET 44705, and NR Event Counter 45601. Process Manager Clock Event Counter 45615 is simply an area in memory which contains a pointer to the head of an Event Counter List 44904. PETEs 44909 on Event Counter List 44904 pointed to by Process Manager Clock Event Counter 45615 all contain Await Entries 44804 for Process Manager Clock Event Counter 45615. In these Await Entries 44804, Event Counter Name 44802 is a pointer to Process Manager Clock Event Counter 45615 and Event Counter Value 44803 is a CS 10110 system clock value. New Request Event Counter 45601 is an Event Counter 44801 which is awaited by KOS Process Manager Process 610, and consequently has an Await Entry 44804 in Await Chunk 45617 belonging to KOS Process Manager Process 610's Virtual Processor 612.

At the virtual processor level, there are Clock Event Counter 45425, a special Event Counter 44801 which is awaited by Await Entries 44804 in VPAT 45401, and Await Entries 44804 for Clock Event Counter 45425 in Await Chunk 45617 belonging to KOS Process Manager Process 610's Virtual Processor 612 and other Processes 610, and an area in MEM 10112, Next Interesting Clock Value 45801, which contains the next system clock value at which CS 10110 must undertake some action. At the level of FU 10120, finally, there are two hardware devices, Interval Timer 25410 and Egg Timer 25412, and two GR's 10360. KOS microcode may read and reset Interval Timer 25410, and as previously explained, a runout of either Interval Timer 25410 or Egg Timer 25412 produces an Event Signal which invokes KOS microcode. Interval Timer 25410 keeps running after it produces the Event Signal, thus guaranteeing that no time is lost while the runout is serviced. One of the two GR's 10360 registers contains a clock base value. When the present value of Interval Timer 25410 is added to this value, the result is the correct time. The other GR 10360 register contains a value which indicates why Interval Timer 25410 was last set. KOS microcode uses this value to determine what action to take when an Interval Timer 25410 or Egg Timer 25412 runout occurs.

The components work together as follows: when a user Process 610 suspends itself for a certain amount of time or until some time, or causes an interrupt to occur after a certain amount of time, it does so by invoking an EOS Procedure 602, which in turn invokes a KOS Process Manager Procedure 602. KOS Process Manager Procedure 602 creates a PETE 44909 containing the specified time in its EC Value Field 45713 and places the PETE 44909 in the Event Counter List for PM Clock EC 45615. Since the Event Counter List is ordered by increasing Event Counter Value 44802, the first PETE 44909 for PM Clock EC 45615 on the Event Counter List is the next one which CS 10110 must deal with.

If PETE 44909 being added to Event Counter List 44904 for Process Manager Clock Event Counter 45615 goes to the head of Event Counter List 44904, Process Manager Process 610 must create a new Await Entry 44804 for Clock Event Counter 45425 in Process Manager Process 610's VPAT Chunk 45617. The time specified in the new Await Entry 44804 will be that specified in PETE 44909 being added to Await Entry List 44904. Consequently, when Process Manager Procedure 602 places a PETE 44909 at the head of Process Manager Clock Event Counter 45615's Await Entry List 44904, it also advances NR Event Counter 45601, which causes Process Manager Process 610 to resume execution. When Process Manager Process 610 resumes execution, it examines its VPAT Chunk 45617, locates VPATE 45403 for Clock Event Counter 45425, and compares the time contained in the first PETE 44909's Event Counter Value Field 45723 with the time contained in VPATE 45403. If the time in PETE 44909 is sooner, Process Manager Process 610 does a virtual processor level Await Operation for the new time, thus resetting VPATE 45403 to that time and suspending Process Manager Process 610. As will be explained in detail later, when the time specified in VPATE 45403 arrives, Clock Event Counter 45425 is advanced, which satisfies Await Entry 44804 in VPATE 45403 and causes Process Manager Process 610 to resume execution. On resuming execution, Process Manager Process 610 obtains the current system clock value, compares it with Event Counter Value Field 45713 in the first PETE 44909 in PM Clock Event Counter 45615's Event Counter List 44904, and if the time specified in Field 45713 is less than or equal to the current system clock value, Process Manager Process 610 processes all PETEs 44909 in Event Counter List 44904 whose Event Counter Value Fields 45713 contain values which are less than or equal to the current system clock value. When Process Manager Process 610 is finished, it performs another virtual processor-level Await Operation on Clock EC 45425 as described above, using the time specified in the new first PETE 44909 on PM Clock Event Counter 45615's Event Counter List 44904.

c.c. Outward Signals Object (OSO) 45409 and Multiplexed Outward Signals Event Counter 45407 (FIG. 459)

As explained in the introduction to synchronization, communication between Event Counters 44801 advanced by KOS microcode and Await Entries 44804 in PET 44705 is achieved via OSO 45409 and Multiplexed Outward Signals Event Counter 45407. FIG. 459 gives a detailed representation of OSO 45409. OSO 45409 contains KOS Configuration Information 45901 and an Array 45909 of OSO Entries (OSOEs) 45903. Each OSOE 45903 has two parts: an Event Counter 44801 45907 and a field which contains the value that Event Counter 44801 45907 had the last time that Process Manager Process 610 examined OSO 45409.

Event Counters 44801 in OSOEs 45903 are advanced by KOS microcode which performs functions for Processes 610. As previously explained, one example of such KOS microcode is the microcode which handles inter-processor messages from IOS 10116. If IOS 10116 has completed a user I/0 function, then user Process 610 for which the function was completed must be notified. From user Process 610's point of view, the I/0 took place over a virtual resource called a channel. Each user I/0 channel has an OSOE 45903 in Outward Signals Object 45409. When a Process 610 performs a user I/0 function using a channel, it awaits the channel's Event Counter in OSOE 45903. The microcode which handles inter-processor messages is invoked by an Event Signal from IOJP Bus 10132. Messages whose arrival is indicated by the Event Signal are placed in an area in MEM 10112 known to the inter-processor message microcode. If the message involves I/0 for a channel, the message contains Event Counter Name 44803 for an Event Counter 44801 in OSO 45409. KOS microcode then advances that Event Counter 44801 and Multiplexed Outward Signals Event Counter 45407. KOS process manager Process 612 awaits Multiplexed Outward Signals Event Counter 45407. When Multiplexed Outward Signals Event Counter 45407 is advanced, the KOS process manager Process 612 examines each entry in OSO 45409. When it finds an OSOE 45903 whose Event Counter 44801 45907 has a value larger than that contained in Last Value of Event Counter Field 45905, it searches PET 44705 for PETEs 44909 containing Await Entries 44804 for Event Counter 44801 45907. When it finds such an Await Entry 44804, it starts Process 610 which created Await Entry 44804 in the manner previously described and then resets Last Value of Event Counter Field 45905 to Event Counter 44801 45907's current value.

d.d. Process Manager Request Queue (PMRO) 45607 (FIG. 460)

PMRQ 45607 is a queue used by user Processes 610 to transmit messages resulting from the satisfaction of an Await Entry 44804 to EOS. For example, EOS can define a time period, called the await quantum, for a Process 610 which EOS may use to limit the amount of time a Process 610 can await the satisfaction of an Await Entry 44804 in PET 44705. As will be explained in detail in the discussion of the process-level Await Operation, if Process 610 is still awaiting at a time specified by adding the value contained in Await Quantum Field 45557 of Process 610's Process Object 901 to the time at which the await began, Process 610 will resume execution long enough to place an await quantum runout message in PMRQ 45607, advance New Request Event Counter 45601, and resume its await. The advance of New Request Event Counter 45601 causes KOS Process Manager Process 610 to resume execution, and KOS Process Manager Process 610 reads PMRQ 45607 and places a message to EOS indicating that user Process 610 has exceeded its await quantum in Scheduler Message Queue 45609.

FIG. 460 is a representation of PMRQ 45607. PMRQ 45607 has a Lock 45101, which works as described in the discussion of synchronization to prevent more than one Process 610 from accessing PMRQ 45607 concurrently, Fields 46003 containing KOS configuration information, and Count Field 46005, which contains the number of PMRQ Entries (PMRQEs) 46009 in PMRQ 45607. The body of PMRQ 45607 is made up of an Array 46007 of PMRQEs 46009. Each PMRQE 46009 has three fields: Tag Field 46011, which indicates the kind of message requested, Link Field 46013, which is unused in the present embodiment, but which may contain the index of the next PMRQE 46009 on the list in other embodiments, and Process ID Field 46015, which contains UID 40401 identifying Process 610 sending the message. The values of Tag Field 46011 and the kinds of message they indicate are the following:

- unallocated: PMRQE 46009 does not contain a message.
- await_completion: Process 610 has completed an await.
- interruption: Process 610 has been interrupted.
- await quantum runout: Process 610 has awaited longer than the amount of time specified in Await Quantum Field 45557.

In the present embodiment, PMRQ 45607 functions as a LIFO queue or stack: when a Process 610 writes into a PMRQE, it first increments Count Field 46005 and then writes into PMRQE 46009 whose index corresponds to Count Field 46005's value. When Process Manager Process 610 processes PMRQ 45607, it processes the PMRQE 46009 whose index corresponds to the value of Count Field 46005 and then decrements Count Field 46005. Consequently, the last message placed in PMRQ 45607 is the first message processed by KOS process manager Process 610.

e.e. Queues for Communicating with EOS (FIG. 456, 461)

The three queues for communicating with EOS, Scheduler Queue 45609, Stopped Queue 45611, and Killed Queue 45613, are created and read by EOS. The messages which KOS puts in the queues all have the form shown in FIG. 461. Message 46101 has three fields: Tag 46101, which may have one of the same six values as Tag Field 46011 in PMRQ 45607, Process ID Field 46103, which is UID 40401 of Process Object 901 for Process 610 which sent the message, and EOS Information Pointer 46107, which is a pointer to a location where EOS stores information about a Process 610. The value of Field 46107 is obtained from Field 45531 of Process Object 901.

4. Operations on Processes 610

EOS and user Processes 610 may perform operations on Processes 610. In some cases, one Process 610 may perform the operation on another Process 610 or itself, in others, a Process 610 may perform the operation only on itself, and in others, only on other Processes 610. The operations are the following:

Process 610 creation and deletion.

Setting and reading certain fields of a Process 610's Process Object 901.

Operations on process-level Event Counters 44801 and Sequencers 45102

Creation and control of interrupts for a Process 610.

Binding Process 610 to a Virtual Processor 612 and unbinding Process 610 from a Virtual Processor 612.

Running and stopping a Process 610.

In addition, KOS can kill a Process 610, i.e., bar Process 610's Virtual Processor 612 from JP 10114.

What operations may be performed on a Process 610 is determined by the EACL of Process 610's Process Object 901. The manner in which EACLs control access to ETOs is explained in the discussion of the protection system. There are four operations which may be performed on a Process Object 901's EACL:

Reading and setting the EACL.

Converting an index which specifies an extended access mode into a name for the access mode and vice-versa.

All of these operations but those involving interrupts and Virtual Processors 612 are discussed below. Those involving Virtual Processors 612 are dealt with under that heading, and those involving interrupts are dealt with under that heading.

a.a. Create Process Procedure 602 (FIG. 455)

KOS Create Process Procedure 602 is invoked only by EOS. The Procedure 602 creates or obtains six objects for a new Process 610 and fills the objects with enough state to allow Process 610 to be bound to a Virtual Processor 612 and Virtual Processor 612 to be bound to JP 10114.

Create Process Procedure 602 takes five arguments: the validation subject, i.e., the subject for which EOS is requesting the creation of a Process 610, the LAUID of LAU 40405 to which new Process 610's objects will belong, a value which indicates which fields in Process Object 901 belonging to new Process 610 are to be set, a packet of values for fields in Process Object 901, and a variable for a status code. If the creation of Process 610 is successful, the routine returns a status code indicating that the operation was successful and UID 40401 of new Process 610's Process Object 901. If the creation of Process 610 fails at any point, the routine destroys those portions of Process 610 that it has already created and returns a status code indicating the reason for the failure.

The routine begins by checking access rights. It checks the following:

Whether UIDs 40401 for the principal in the validation subject and the principal in the subject executing Create Process Procedure 602 in fact belong to an object which is a principal object.

Whether the validation subject and the subject executing Create Process Procedure 602 have the right to create ETOs and can therefore create Process Objects 901.

Create Process Procedure 602 then creates or obtains an object for Process Object 901 and initializes fields in Process Object 901 using information obtained from Procedure 602's arguments. The following fields are initialized:

Creator Field 45505, with the subject which is creating the Process 610.

Principal, Process, and Tag Fields 45507. The principal and tag UIDs 40401 are obtained from the validation subject argument of Create Process Procedure 602; the process UID 40401 is that of the newly-created or obtained Process Object 901.

The fields which contain the UIDs 40401 of the EOS queues: Scheduler Queue ID Field 45525, Stopped Queue ID Field 45527, and Killed Queue ID Field 45529. EOS provides these UIDs 40401 when it invokes Create Process Procedure 602.

The fields which contain pointers to information provided by or for EOS: EOS Information Pointer Field 45531, Initial Procedure Pointer Field 45533, and Initial Message Pointer Field 45535.

The next step is creating or obtaining objects for the stacks. In the present embodiment, four MAS objects 10328, 10330, 10332, and 10334, and SS object 10336 are created or obtained. In other embodiments, fewer MAS objects may be created or obtained when Process 610 is created and other MAS objects may be added as Process 610 enters additional domains. After the stack objects have been obtained, SS object 10336's UID 40401 is entered in Field 45513 of Process Object 901 and the UIDs 40401 of MAS objects 10328 through 10344 and the UIDs 40401 of their domains are entered in Process Object 901's Fields 45543 and 45 for each object.

Create Process Procedure 602 then invokes a Procedure 602 which initializes the stacks. In the cases of MAS objects 10328, 10330, 10332, and 10334, a KOS MAS header 10410 is placed in each MAS object. With SS object 10336, the stack initialization routine invokes another routine which uses a KOS SIN to provide the secure stack state required to allow the new Process 610 to begin executing its first Procedure 602. The KOS SIN creates a SS 10336 Header 10512 and a SS 10336 Frame 10510 and places the state required to begin execution in SS 10336 Frame 10510. The state has two components: previously-created state which, when copied into registers in FU 10112, allows FU 10112 microcode to execute a Call, and the location of Procedure 602 to be called. Procedure 602 at that location is a special KOS Procedure 602 which will be called and executed when Process 610 is bound to a Virtual Processor 612 and Virtual Processor 612 is bound to JP 10114. Procedure 602 completes Process 610 initialization and calls an EOS Procedure 602. EOS Procedure 602 uses the pointer stored in Initial Procedure Pointer Field 45533 and the pointer stored in Initial Message Pointer Field 45535 to invoke the first user Procedure 602 in the program.

The last steps in creating a new Process 610 are setting Procedure Object 901's Extended Type Attribute 41223 to make it an ETO and then setting Procedure Object 901's EACL. The EACL is set so that the subject which created Process 610 may perform any operation on Process 610.

b.b. Delete Process Procedure 602 (FIGS. 455, 457)

When a Process 610 is deleted, Process Object 901, SS object 10336, and MAS objects 10328, 10330, 10332, and 10334 are all deleted and any PETEs 44909 for Process 610 are removed from PET 44705. In order to delete a Process 610, a subject must have delete process access to Process 610's Process Object 901. Processes 610 may not delete themselves, and consequently, the subject's process component cannot be Process 610's UID 40401. A Process 610 may only be deleted if it is no longer bound to a Virtual Processor 612 and no longer has any messages to send to EOS.

The KOS Process Manager Delete Process Procedure 602 first checks whether the process component of the subject which is attempting to delete Process 610 has Process 610's UID 40401. If it does, Process 610 is attempting to delete itself. Then it checks whether the subject has delete process access to Process Object 901. If it does, the routine checks Process State Field 45563 of Process Object 901. If Field 45563 indicates that Process Object 901's Process 610 is neither bound to a Virtual Processor 612 nor has a message to send, Delete Process Procedure 602 uses Field 45553 to locate the PET interrupt list for each domain in PET 44705 and deletes PETEs 44909 on the list, and then uses Field 45561 to locate and delete PET await list for Process 610. Then it deletes Process 610's stack objects, and finally, Process Object 901.

c.c. Procedures 602 which Set and Read Fields of Process Object 901 (FIG. 455)

There are four operations which set and read fields of Process Object 901:

- Get Scheduler Info returns information contained in Process Object 901 which is of interest to the EOS scheduler.
- Get Initial Message Pointer returns the pointer to an initial message which was supplied to Process 610 on creation of Process 610.
- Get Process Control State returns such information from Process Object 901 as Process 610's state and the UIDs 40401 of Process 610's stacks and queues.
- Set Process Control State allows EOS to set the values of some fields of Process Object 901 belonging to Process 610.

The operations are discussed in order.

Get Scheduler Info Procedure 602 takes a Process 610's UID 40401 as an argument and returns scheduling information about the specified Process 610. The scheduling information is stored in Process Manager Statistics Fields 45567 of Process Object 901 when Process 610 is not bound to a Virtual Processor 612, and is moved into VPSB 45301 for Virtual Processor 612 when Process 610 is bound to Virtual Processor 612. If Process 610 is stopped or killed, Get Scheduler Info Procedure 602 returns the information stored in Process Manager Statistics Fields 45567; if Process 610 is bound to a Virtual Processor 612, Procedure 602 returns the information from Virtual Processor 612's VPSB 614. A subject must have get scheduler info access to Process Object 901 in order to perform the operation.

Get Initial Message Pointer Procedure 602 takes no arguments and returns a pointer which points to the initial message for Process 610 which performs the operation. As previously explained, the pointer is stored in Process Object 901 Field 45535. A subject must have get initial message access to Process Object 901 in order to perform the operation.

Get Process Control State Procedure 602 has five arguments: the subject on whose behalf the information is being obtained, UID 40401 of Process 610 for which the information is to be obtained, a set of flags which indicate what information is desired, a variable to store the information in, and a variable for the operation's status. Get Process Control State Procedure 602 first checks whether the subject on whose behalf information is being obtained and the subject which is actually obtaining it both have get control state access to Process Object 901 belonging to Process 610. Get Process Control State Procedure 602 then locks Process Object 901 using Lock 45501 to guarantee that the information contained in Process Object 901 does not change while the operation is being performed. Then, depending on the values of the flags, the operation locates one or more of the following fields and stores them in the argument passed in for that purpose:

- Principal UID 40401 and Tag UID 40401 from Field 45507.
- Creator UID 40401 from Field 45505.
- Virtual Processor UID 40401 from Field 45511.
- Current process state from Field 45563.
- UIDs 40401 of Scheduler Message Queue 45609, Stopped Message Queue 45611, and Killed Message Queue 45613, stored in Fields 45525, 45527, and 45529 respectively of Process Object 901.
- EOS information pointer from Field 45531, initial procedure pointer from Field 45533, and initial message pointer from Field 45535.
- For all MAS objects but that for the KOS domain, the domain UID 40401 and the MAS object's UID 40401. These items are from Fields 45543 and 45545 for each domain.

When the operation is finished retrieving the desired information, it unlocks Lock 45501 and returns.

Set Process Control Information Procedure 602 takes the same arguments as get control information and works the same way, except that the fields in Process Object 901 belonging to the specified Process 610 are set instead of read. The subject for whom the fields are being set and the subject after the invocation of the operation must both have set process control information access. In the present embodiment, only four fields of Process Object 901 may be set: Fields 45525, 45527, and 45529, containing UIDs 40401 of Process 610's Scheduler Message Queue 45609, Stopped Message Queue 45611, and Killed Message Queue 45613 respectively, and Field 45531, containing the EOS information pointer. Other embodiments may allow other fields to be set.

d.d. Process-level Operations on Event Counters 44801 and Sequencers 45102 (FIG. 457)

Event Counters 44801 and Sequencers 45102 were explained in general in the discussion of synchronization at the beginning of this chapter. In this section, the implementation of process level operations on Event Counters 44801 and Sequencers 45102 is explained in detail.

Processes 610 may perform the following operations on Event Counters 44801:

- PM Initialize Event Counter, which creates an Event Counter 44801.
- PM Read Event Counter, which reads an Event Counter 44801's Value 44802.

PM Advance, which advances an Event Counter 44801.

PM Await, which creates an Await Entry 44804 for an Event Counter 44801 and suspends Process 610 for which Await Entry 44804 is created until Await Entry 44804 is satisfied.

The operations are discussed in order.

PM Initialize Event Counter and PM Read Event Counter work exactly as described in the introduction. PM Initialize Event Counter Procedure 602 creates Event Counters 44801 for users. It takes a variable of the proper type for an Event Counter 44801 as an argument and initializes the variable to 0. PM Read Event Counter and returns the variable's Event Counter Value 44802.

PM Await and PM Advance perform process-level Await and Advance Operations. The implementation of these operations involves Process Objects 901, PET 44705, and PETHT 44903.

a.a.a. The Process-level Await Operation PM Await (FIGS. 449, 455, 457)

PM await Procedure 602 takes a list of Event Counter Name 44803 and Event Counter Value 44802 pairs as an argument. Each pair specifies an Event Counter 44801 that Process 610 performing the Await Operation is to await on and an Event Counter value 44802 which will satisfy the await. When the await is finished, the Await Operation returns the Event Counter Name 44803 belonging to Event Counter 44801 whose advance satisfied the await.

In the present embodiment, PM await creates Await List Entries 45702 in PET 44705. PM Await Procedure 602 first obtains the subject, VP Number, and Process UID 40401 of Process 610 performing the operation from Process Object 901 belonging to Process 610. Then it locks PET 44705 and Process 610's Process Object 901. The next step is to determine whether any of the Event Counters 44801 specified in the argument list has been advanced to the value specified in Event Counter Value 44802 paired with it in the argument list. If it has, the await has already been satisfied and the PM Await Procedure 602 deletes Process 610's await list, unlocks PET 44705 and Process Object 901, and returns.

If one of the Event Counters 44801 on the list of Event Counter Names 44803 and Event Counter Values 44801 given the Await Operation is Process Manager Clock Event Counter 45615, the Await Operation examines the first PETE 44909 on Clock Event Counter 45615's Event Counter List 44904. If the value in Event Counter Value Field 45713 is greater than Event Counter Value 44802 specified for Clock Event Counter 45615 in the Await Operation's argument, the Await Operation advances NR Event Counter 45601 and sets a flag to notify the Process Manager Process 610 that it must reset Clock Event Counter 45615 to the new value and also reset Await Entry 44804 which awaits Clock EC 45425 in Process Manager Process 610's VPAT Chunk 45402.

The next step is allocating a PETE 44909 for each Event Counter Name 44803-Event Counter Value 44802 pair that requires one. The allocated PETEs 44909 come from the free list. For each pair, an allocation Procedure 602 invoked by the PM Await Procedure 602 hashes Event Counter Name 44803 belonging to the pair by means of Hash Function 44901 and PETHT 44903 to locate Event Counter List 44904 for Event Counter 44801. If there is no List 44904, the allocation Procedure 602 first allocates a PETE 44909 for a Header 44905 and then allocates a PETE 44909 and fills in its fields as will be described presently. If there is a list, allocation Procedure 602 locates the proper place for the new PETE 44909 in List 44904 and then allocates the new PETE 44909 and links it in. There are two possibilities: if there are no PETEs 44909 for Event Counter 44801, the new PETE 44909 simply goes to the end of the list; if there are already entries for Event Counter 44801, the allocation routine compares Event Counter Value 44802 for new PETE 44909 with Event Counter Values 44802 in the PETEs 44909 for Event Counter 44801 until it finds one whose Event Counter Value 44802 is greater. It then inserts new PETE 44909 ahead of this PETE 44909, thereby ordering PETEs 44909 for a given Event Counter 44801 by increasing Event Counter Value 44802.

The new PETE 44909 entry is an Await List Entry 45702, and the Await Operation sets its fields as follows: Tag Field 45701 is set to indicate that the entry is an Await List Entry 45702, Link Fields 45705 and 45707 link it to the preceding and following PETEs 44909 in Event Counter List 44904, Thread Field 45709 links it to other Await List Entries 45702 belonging to Process 610 performing the await, Process UID Field 45711 receives Process 610's Process UID 40401, Fields 45713 and 45715 receive Event Counter Value 44802 and Event Counter Name 44803 for which PETE 44909 was created, and the Await Complete Field is set to 0. In order to link new PETE 44909 to other Await List Entries 45702 for Process 610, allocation Procedure 602 obtains the value of Await Thread Field 45561 in Process 610's Process Object 901 and places it in Thread Field 45709, and then places the value of Index Number Field 45703 in Await Thread Field 45561.

After the Await Operation has created its Await List Entries 45702 and placed them in the proper positions in PET 44705, it changes the value of Process State Field 45561 in Process Object 901 so that Process 610 is no longer runnable, reads Process 610's Private Event Counter 45405 to obtain its current Event Counter Value 44802 and increments the value. The Await Operation then unlocks Process 610's Process Object 901 and PET 44705, reads the value of Await Quantum Field 45557, adds the value of Await Quantum Field 45557 to the current system clock time, and uses the time thus calculated and the incremented Event Counter Value 44802 in a KOS Await SIN. The time value calculated from Await Quantum Field 45557 is a time at which EOS is to be notified if Await Entry 44804 created by the process-level Await Operation has not yet been satisfied. The Await SIN performs a virtual processor-level Await Operation which creates Await Entries 44804 in VPAT Chunk 45402 belonging to Process 610's Virtual Processor 612. There are two Await Entries 44804: one which contains Event Counter Name 44803 of Process 610's Private Event Counter 45405 and the incremented Event Counter Value 44802, and another with contains Event Counter Name 44803 of Clock Event Counter 45425 and the time calculated from Await Quantum Field 45557. Execution of the virtual processor-level Await SIN suspends Virtual Processor 612 to which Process 610 is bound and thereby prevents Process 610's execution until 610's Private Event Counter 45405 is advanced as a consequence of the advance of an Event Counter 44801 awaited by Process 610 or until clock EC 45425 reaches the specified value.

When Private Event Counter 45405 is advanced, or when Clock Event Counter 45425 reaches the value specified in its Await Entry 44804, the virtual processor-level await ends, and the execution of the process-level Await Operation continues.

The Await SIN returns Event Counter Name 44803 for Event Counter 44801 whose advance ended the virtual processor-level await. If the Event Counter Name 44803 is that of Private Event Counter 45405, the process-level Await Operation again locks Process Object 901 and PET 44705, frees all of the PETEs 44909 on Process 610's await list, and sets Await Thread 45561 in Process Object 901 to a null value. After this is done, the Await Operation unlocks Process Object 901 and PET 44705.

If the Event Counter Name 44803 is that of Clock Event Counter 45425, the process-level Await Operation invokes a Procedure 602 which creates an await completion entry in PMRQ 45607 and advances NR Event Counter 45601, thus causing Process Manager Process 610 to resume execution and place a message concerning the await quantum runout in Scheduler Message Queue 45607. In either case, the Await Operation then returns to the Procedure 602 that invoked it.

b.b.b. The Process-level Advance Operation PM Advance (FIGS. 449, 455, 457)

PM Advance Procedure 602 takes a single argument: an Event Counter 44801. The procedure which executes the operation first obtains Event Counter 44801's Name 44803 and then uses the UID 40401 portion of Event Counter Name 44803 to check whether the subject performing the Advance Operation has write access to the object, and hence to Event Counter 44801. The next step is to lock PET 44705. Then Advance Procedure 602 performs a KOS Advance SIN on Event Counter 44801. This is a VP-level Advance Operation, but Event Counter 44801 is a process-level Event Counter 44801, and consequently has no Await Entry 44804 in VPAT 45401. In this situation, the KOS Advance SIN merely increments Event Counter 44801's Event Counter Value 44802. The next step is to read newly-advanced Event Counter 44801's value and then hash Event Counter 44801's Name 44803 as described in the discussion of the PM Await Operation to locate Event Counter 44801's List 44904 in PET 44705 and the first PETE 44909 belonging to Event Counter 44801 in List 44904.

Having located the first PETE 44909 belonging to Event Counter 44801, the PM Advance Procedure examines PETEs 44909 until it either finds one which is awaiting an Event Counter Value 44802 less than or equal to the one contained in Event Counter 44801 or has examined all PETEs 44909 for Event Counter 44801. If it finds a PETE 44909, it reads PETE 44909's Tag Field 45701 to determine the kind of PETE 44909. With Await List Entries 45702, PM Advance Procedure 602 sets Await Complete Field 45717 to TRUE, sets Process Object 901's Process State Field 45563 so that Process 610 is again runnable, and performs an Advance SIN on Private Event Counter 45405 belonging to Process 610. Since Private Event Counter 45405 has an Await Entry 44804 in VPAT Chunk 45402 belonging to Process 610's Virtual Processor 612, the virtual processor-level Advance Operation both increments Private Event Counter 45405 and satisfies Await Entry 44804, thereby making Process 610's Virtual Processor 612 eligible to be bound to JP 10114, which in turn causes Process 610 to resume execution. Finally, PM Advance Procedure 602 checks whether Process 610 is currently bound to a Virtual Processor 612. If it is not, PM Advance Procedure 602 places an await complete message in PMRQ 45607 and advances NR Event Counter 45601, which in turn causes Process Manager Process 610 to resume execution and place an await complete message for EOS in Scheduler Message Queue 45609.

If PETE 44909 is an Interrupt Entry 45718, the Advance Operation proceeds as above, except that it sets Interrupt Pending Flag 44723 in Interrupt List Entry 45718 and an Interrupt Pending Flag 46827 in the MAS object belonging to the domain indicated by the current subject's domain component. The consequences of setting these flags will be explained in detail in the discussion of interrupts.

c.c.c. Operations on Sequencers 45102

As explained in the discussion of process synchronization, KOS makes Sequencers 45102 available to EOS and users so that they can use Event Counters 44801 and Sequencers 45102 to construct Locks 45101. The two process-level sequencer operations are Initialize Sequencer and Ticket. Initialize Sequencer takes a sequencer variable as an argument and initializes the variable to 0; Ticket takes a sequencer variable, increments it, and returns the sequencer variable's previous value.

e.e. Operations on a Process Object 901's EACL

As stated in the discussion of Process Objects 901, Process Objects 901 are ETOs. KOS provides operations which allow EOS to get and set a Process Object 901's EACL and to convert the kinds of access to character strings and vice-versa. The latter operations allow EOS to use character strings to transmit access control information from KOS to the user and vice-versa.

All of these operations are straightforward. Procedure 602 which implements Get Process EACL takes the subject on whose behalf the operation is being performed, UID 40401 of Process Object 901 whose EACL is being examined, a variable to receive the EACL, variables to receive version and length information about the EACL, and a status variable. Get Process EACL Procedure 602 first checks whether both the subject on whose behalf the operation is being performed and the subject performing the operation have get extended ACL access to Process Object 901. If they do, Procedure 602 obtains Process Object 901's EACL as described in the section on access control.

The arguments for Set Process Extended ACL Procedure 602 are the subject on whose behalf the operation is being performed, a variable containing the new EACLEs 41615, and variables containing version and length information about the new EACLEs 41615, and a status variable. For this operation, the subject on whose behalf the operation is being performed and the subject performing the operation must have set extended ACL access to Process Object 901. If they do, Set Process Extended ACL Procedure 602 replaces Process Object 901's EACL with the one provided as an argument, as described in the section on access control.

Within KOS, the extended access modes are represented by integers. KOS defines a character-string name for each extended access mode and provides Procedures 602 which map names to integers and vice-versa. The Map Process Extended Mode Index to Name Function is a Procedure 602 which takes an index and returns the character string which KOS has defined for it. EOS uses this Procedure 602 to translate the access modes returned by Get Process EACL Procedure 602 into character strings. The Map Process Extended Mode to Name Function does the reverse. EOS uses this Procedure 602 to translate access mode character strings into the proper integers before it calls Set Process EACL Procedure 602. No special access is required for either of these Procedures 602.

c. Implementation of Virtual Processors 612

As previously stated, a Process 610 has access to JP 10114 only if it is bound to a Virtual Processor 612. The discussion turns now to the details of Virtual Processor 612 implementation, dealing first with VPSB 614, which is the physical form of a Virtual Processor 612, then with the data bases used to manage Virtual Processors 612, and finally with the operations that KOS performs on Virtual Processors 612.

1. VPSB 614 (FIG. 462)

Each VPSB 614 represents a Virtual Processor 612 in CS 10110. As will be explained in detail later, VPSBs 614 for all Virtual Processors 612 in CS 10110 make up VPSB Array 45301. Virtual Processor State Block (VPSB) 614 contains that portion of a Virtual Processor 612's state which is not stored on SS 10336 belonging to Process 610 to which Virtual Processor 612 is currently bound. Functionally, VPSB 614 represents an acceleration of that information contained in Process 610's Process Object 901 which is required by Virtual Processor 612 to which Process 610 is bound. Unlike Process Object 901, VPSB 614 is always available at a known location in MEM 10112; consequently, KOS microcode can easily and rapidly obtain information contained in VPSB 614, and references to VPSB 614 can never cause page faults. When a Process 610 is bound to a Virtual Processor 612, information is copied from Process 610's Process Object 901 to Virtual Processor 612's VPSB 614; as Virtual Processor 612 runs, the information in VPSB 614 is constantly updated; when Process 610 is unbound from Virtual Processor 612, the information as it exists at the moment of unbinding is copied back to Process 610's Process Object 901. Thus, while a Process 610 is bound, VPSB 614 belonging to Process 610's Virtual Processor 612 contains the most current information about Process 610's state.

FIG. 462 illustrates a VPSB 614. The discussion will first provide an overview and then discuss VPSB 614 fields in detail.

- VPSB Number Field 46201 contains VPSB 614's index in VPSBA 45301. This value is also the Virtual Processor Number of Virtual Processor 612 represented by VPSB 614.
- Principal UID Field 46205 contains UID 40401 identifying the principal belonging to Process 610 to which Virtual Processor 612 represented by VPSB 614 is bound.
- Process UID Field 46205 contains UID 40401 identifying Process 610 to which Virtual Processor 612 represented by VPSB 614 is bound.
- Stack Information Fields 46207 contain information about Process 610's stacks.
- Process Manager Information Fields 46215 contain information required for EOS management of Process 610 bound to VPSB 614's Virtual Processor 612.
- Memory Manager Information Fields 46225 contain information used by the VMM System to manage those portions of memory containing Process 610's data. These fields are not relevant to the present discussion.
- Virtual Processor Manager Information Fields 46255 contain information used by KOS to manage Virtual Processor 612.

The fields making up 46207, 46215, and 46255 are now examined in detail, beginning with 46207.

Stack Information Fields 46207 contain AON 41304 of SS Object 10336 in Field 46209 and an Array 46211 of AONs 41304 for MAS objects 10328 through 10334 belonging to Process 610 to which Virtual Processor 612 is bound. In addition, Stack Information Fields 46207 contains an array of AONs 46213 for Trace Tables belonging to MAS objects 10328 through 10334. Trace Tables contain information used by CS 10110 debugging and performance metering systems. They are discussed in detail at the conclusion of this Chapter. These fields may contain AONs 41304 because KOS guarantees that the AONs 41304 of a Process 610's stack objects and of objects containing data associated with the stacks will not change as long as Process 610 is bound to a Virtual Processor 612.

Fields 46215 contain information required for EOS management of Process 610. Field 46217 contains the priority of Process 610. When EOS commands KOS to run a Process 610, EOS assigns a priority to Process 610; the higher Process 610's priority, the more access it will have to JP 10114. Field 46219 contains a time at which Process 610 is to be interrupted. As will be explained below, when a process-level interrupt which depends on PM Clock Event Counter 45615 is set for a Process 610, the interrupt setting routine sets this field to the time at which the interrupt is to occur. Fields 46221 and 46223 together are used by EOS to control the total amount of time that a Process 610 may spend executing on JP 10114. Field 46221 contains the Elapsed Process Execution Time of Process 610 to which VP 612 is bound, that is, the total amount of time that Process 610 has run on JP 10114. Field 46223 gives the total amount of time that a Process 610 may run on JP 10114. When the value of Field 46221 equals or exceeds that of Field 46223, KOS stops Process 610 and informs EOS.

Fields 46255 contain information set and used by KOS Virtual Processor Management microcode and Procedures 602. Field 46257 contains Virtual Processor 612's Atomic Op Depth. As will be explained in detail below, if this Field has a value greater than 0, Dispatcher microcode can remove Virtual Processor 612 from JP 10114 only if Virtual Processor 612 performs a virtual processor-level Await Operation or causes a fault such as a page fault. Field 46259 contains Virtual Processor 612's Suspend Count. As long as this Field's value is greater than 0, Virtual Processor 612 cannot be bound to JP 10114.

Fields 46261 through 46269 are flags for communication between Virtual Processor Manager microcode and Process Manager Procedures 602. Field 46261 is set by KOS microcode when an Interval Timer 25410 runout occurs at a time which is for which Process 610 has an entry in PM Clock Event Counter 45615's List in PET 44705. When Procedures 602 executed by Process Manager Process 610 deal with process-level awaits and interrupts involving PM Clock Event Counter 45615, they use Field 46261 to determine which Process 610's await has been satisfied or which Process 610 has been interrupted. Field 46263 is set by KOS microcode when an Interval Timer 25410 runout occurs because Process 610 to which Virtual Processor 612 is bound has exceeded its process execution time limit. Again, the field is used by software to determine why Process 610 was suspended.

Stop Pending Flag 46265 and Stop Acknowledgement Pending Flag 46267 are used when a Process 610 is stopped. As will be explained in detail in the discussion of the Stop Operation, stopping a Process 610 is an asynchronous operation. To stop a Process 610, EOS invokes the KOS Process Manager Stop Operation, which in turn uses the KOS Stop SIN to stop Process 610's Virtual Processor 612. As part of its operation, the Stop SIN sets both Stop Pending Flag 46265 and Stop Acknowledgement Pending Flag 46267 and advances Stopped-killed Event Counter 45601. The advance awakens Process Manager Process 610, which reads Stop Pending Flag 46265, performs the necessary processing, and resets Stop Acknowledge Pending Flag 46265 to indicate that the stop has been taken care of.

Killed Acknowledgement Pending Field 46269 serves the same purpose with regard to killing a Process 610 as Stopped Acknowledgement Pending Field 46267 does with regard to stopping a Process 610. When KOS kills a Process 610, it does so by killing its Virtual Processor 612. The KOS Kill SIN that does this sets Killed Acknowledgement Pending Flag 46269 and advances Stopped-killed Event Counter 45601. When process manager Process 610 processes VPSB 614, it resets Killed Acknowledgment Pending Flag 46269.

Wired Kernel Virtual Processor Flag 46271, finally, indicates that Virtual Processor 612 belongs to a KOS Process 610. KOS Processes 610 differ in several respects from ordinary Processes 610:

- They have no Process Objects 901, and consequently no entries in PET 44705.
- They await Event Counters 44801 in VPAT Chunk 45402 belonging to their Virtual Processors 612.
- They are "faultless", i.e., a KOS Process 610 which services a given type of fault is itself guaranteed not to cause such a fault. For example, VMM PROC 42406 never causes a page fault, and Active Object Manager Process 610 never causes an active object fault.

2. Virtual Processor Management Data Bases (FIG. 463)

FIG. 463 presents an overview of the data bases involved in virtual processor management. Later figures will show the details of each data base. Virtual processor management involves Virtual Processor Management Procedures 602, KOS SINs, and KOS Dispatcher microcode. Some of the data bases used in virtual processor management are used and altered only by Procedures 602, others are used and altered by microcode, and others are used and altered by both Procedures 602 and microcode. Data bases used and altered by microcode are always present at known locations in MEM 10112; data bases used and altered only by Procedures 602 may be stored in Secondary Storage 10124 and moved into MEM 10112 when referenced.

Virtual Processor Information Array (VPIA) 46301 has an entry (VPIE) 46303 for each Virtual Processor 612 available to CS 10110. VPIE 46303 for a Virtual Processor 612 contains information about Virtual Processor 612 which KOS Process Manager Procedures 602 make available to EOS. As will be explained in detail later, the information includes Virtual Processor 612's Virtual Processor Number, its Virtual Processor Identifier, which is a UID 40401 identifying Virtual Processor 612 to EOS, a value indicating which of the virtual processor states known to EOS Virtual Processor 612 is in, and some flag fields. VPIA 46303 is manipulated only by Virtual Processor Manager Procedure 602.

VP Manager Lock 46308 is a standard KOS lock. Whenever a KOS Virtual Processor Manager Procedure 602 performs an operation which alters or reads a virtual processor manager data base, it locks VP Manager Lock 46308 before performing the operation and unlocks Lock 46308 after it has finished altering or reading the data base.

The chief virtual processor management data bases are VPSBA 45301, High-level VP Lists (HVPL) 46305, and Microcode VP lists (MVPL) 45309. VPSBA 45301 and MVPL 45309 were mentioned briefly in the introduction to Virtual Processors 612. As stated there, VPSBA 45301 is an array of VPSBs 614. Each Virtual Processor 612 in CS 10110 has a VPSB 614 in VPSBA 45301, and the index of VPSB 614 in VPSBA 45301 is the Virtual Processor Number (VP Number) 45304 of Virtual Processor 612 represented by VPSB 614. HVPL 46305 and MVPL 45309 are arrays whose elements make up lists of Virtual Processors 612. In both HVPL 46305 and MVPL 45309, there is an array element for each Virtual Processor 612. As a Virtual Processor 612 changes states, it is moved from one list to another. In HVPL 46305, the lists indicate states known to Virtual Processor Manager Procedures 602, and HVPL 46305 is manipulated only by these Procedures 602. In MVPL 45309, the lists indicate states known to Virtual Processor Manager microcode, and the lists are manipulated by means of KOS SINs or by Dispatcher microcode.

The remaining data bases are Virtual Processor Await Table (VPAT) 45401 and VPAT Hash Table (VPATHT) 46307. As mentioned in the general discussion of synchronization, VPAT 45401 contains Await Entries 44804 for Event Counters 44801 awaited by Virtual Processors 612. VPATHT 46307 is a hash table for transforming Event Counter Names 44803 into VPAT indexes, thereby speeding up the location of Await Entries 44804 in VPAT 45401.

a.a. VPIA 46301 (FIG. 464)

VPIA 46301 contains one VPIE 46303 for each Virtual Processor 612. FIG. 464 gives a detailed illustration of VPIE 46303.

When a Virtual Processor 612 has been configured, i.e., when it has become available for use, VP Number Field 46401 contains Virtual Processor 612's Virtual Processor Number 45304 and thereby determines which Virtual Processor 612 is represented by VPIE 46303. In the present embodiment, configuration occurs only when CS 10110 is initialized; other embodiments may allow dynamic reconfiguration of CS 10110 and the relationship between a VPIE 46303 and a Virtual Processor 612 may change at times other than system initialization.

Field 46403 contains UID 40401 which identifies Virtual Processor 612 represented by VPIE 46303 to EOS. When KOS allocates (i.e., makes available) a Virtual Processor 612 to EOS, KOS generates a UID 40401 for Field 46403. EOS then uses this UID 40401 to identify Virtual Processor 612. In the present embodiment, UID 40401 is a non-object UID 40401; in other embodiments, Virtual Processors 612 may have objects associated with them, and in these embodiments, UID 40401 may be an object UID. Virtual Processors 612 bound to KOS Processes 610 are not available for allocation to EOS and their VPIEs 46303 contain Null UIDs 40401 in Field 46403.

Field 46405 contains the current state of Virtual Processor 612. From the point of view of EOS, a Virtual Processor 612 is always in one of the following states:

Undefined, i.e., a state not known to EOS.

Deconfigured, i.e., not available for use.

Unbound, i.e., not bound to a Process 610.

Runnable, i.e., able to have a run operation performed on it.

Killed and unacknowledged, i.e., Virtual Processor 612 has been killed by KOS microcode, but Process Manager Process 610 has not yet notified EOS that Virtual Processor 612 has been killed.

Killed and acknowledged, i.e., Virtual Processor 612 has been killed and EOS has been notified.

Stopped and unacknowledged, i.e., Virtual Processor 612 has been stopped by KOS microcode, but Process Manager Process 610 has not yet notified EOS that Virtual Processor 612 has stopped.

Stopped and acknowledged, i.e., Virtual Processor 612 has been stopped and EOS has been notified.

The remaining fields are flags that increase the speed with which state information may be obtained from VPIE 46303. VP Configured Flag 46407 is set when Virtual Processor 612 represented by VPIE 46303 is configured, and VP Allocated Flag 46409 is set when Virtual Processor 612 represented by VPIE 46303 is allocated to EOS.

b.b. HVPL 46305 and MVPL 45309 (FIG. 465)

High-level VP Lists (HVPL) 46305 and MVPL 45309 have similar relationships to VPSBA 45301 and similar internal organizations, but differ in the kinds and numbers of lists they contain and in the contents of the list elements. FIG. 465 illustrates these lists. The representation of HVPL 46305 shows the general structure of both sets of lists. Each set of lists is contained in an array. The array has one element for each Virtual Processor 612 in CS 10110 and in addition, as many extra elements as are required to provide a header element for each list in the array. A given list element represents Virtual Processor 612 whose VP Number 45304 is the same as the list element's index in its array. Each list is doubly-linked and circular. Each element in the list contains a link to the element which precedes it and to the element which follows it. The element which follows the header is the first list element, and the one which precedes the header is the last list element.

In HVPL 46305, each HVPLE 46307 has three fields: Field 46513, which points to the following HVPLE 46307 on the list, Field 46515, which points to the preceding HVPLE 46307, and Field 46517, which contains the index of HVPLE 46307 in HVPL 46305. As just explained, HVPLE Index 46517 is also VP Number 45304 of Virtual Processor 612 represented by HVPLE 46307.

HVPL 46305 has six lists:

The null list, headed by Null List Head 46501. HVPLEs 46307 are on this list if they are on none of the others.

The runnable list, headed by Runnable List Head 46503. Virtual Processors 612 represented by HVPLES 46307 on this list may be bound to JP 10114.

The stopped list, headed by Stopped List Head 46505. Virtual Processors 612 whose HVPLES 46307 are on this list are temporarily barred from JP 10114.

The killed list, headed by Killed List Head 46507. Virtual Processors 612 on this list have been killed by KOS.

The unbound list, headed by Unbound List Head 46509. Virtual Processors 612 on this list are not bound to a Process 610, but are available for allocation.

The deconfigured list, headed by Deconfigured List Head 46511. Virtual Processors 612 on this list have not been configured, and are thus not available.

The lists in HVPL 46305 are closely related to the virtual processor states defined for a Virtual Processor 612's entry in VPIE 46301. As a Virtual Processor 612 changes its state, Virtual Processor Manager Procedures 602 move its HVPLE 46303 to a different list and change the value of Execution State Field 46405 in its VPIE 46301.

As previously stated, the lists in MVPL 45309 are manipulated only by KOS SINs and KOS Dispatcher microcode. Three fields of MVPLEs 45309 are like those s 46307. Next Field 46529 and Previous Field 46531 contain pointers to the following and preceding MVPLEs 45309 on a list respectively, and List ID Field 46535 contains the index of MVPLE 45309 in MVPL 45309. As was the case with HVPLEs 46307, this index is also VP Number 453004 of Virtual Processor 612 represented by MVPLE 45309. The fourth field, Counter Field 46533, is used only in MVPLEs 45309 which are list heads. In these entries, Counter Field 46533 indicates how many MVPLEs 45309 are on the list.

There are five lists in MVPL 45309. The states indicated by these lists do not correspond directly to the states indicated by Execution State Field 46403 of a Virtual Processor 612's VPIE 46303 or by the lists in HVPL 46305, but the former states are affected by changes in the latter states, and vice-versa.

The running list, headed by Running List Head 46519. In the present embodiment, this list contains only a single MVPLE 45309, that belonging to Virtual Processor 612 currently bound to JP 10114. In embodiments with multiple JPs 10114, the running list may contain more than one MVPLE 45309.

The eligible list, headed by Eligible List Head 46521. Virtual Processors 612 whose MVPLEs 45309 are on this list may be bound to JP 10114. As will be explained in detail later, MVPLES 45309 on the eligible list are ordered by priorities provided by EOS when it requests KOS to run a Process 610.

The suspended list, headed by Suspended List Head 46523. Virtual Processors 612 whose MVPLES 45415 are on this list are barred from being bound to JP 10114. A Virtual Processor 612 is placed on this list when KOS microcode performs a Suspend SIN on Virtual Processor 612, and is returned to the eligible list when KOS microcode performs a Resume SIN on Virtual Processor 612.

The stopped list, headed by Stopped List Head 46525. The execution of a KOS Stop SIN moves MVPLE 45415 belonging to Process 610's Virtual Processor 612 onto the stopped list until the Stop Operation is acknowledged. At that point, MVPLE 45415 is moved onto the suspended list.

The killed list, headed by Killed List Head 46527. The execution of a KOS Kill SIN moves MVPLE 45415 for Virtual Processor 612 onto the killed list until the kill is acknowledged. At that point, MVPLE 45415 is moved onto the suspended list.

The states indicated by Execution State Field 46405 in a Virtual Processor 612's VPIE 46303 and the states indicated by the lists in MVPL 45309 have the following relationships:

If a Virtual Processor 612 is in the Deconfigured, Unbound, Stopped Acknowledged, or Killed Acknowledged states, its MVPLE 45415 is on the suspended list.

If a Virtual Processor 612 is in the Runnable state, its MVPLE 45415 is on the running or eligible lists unless Virtual Processor 612 is awaiting the advance of an Event Counter 44801. In this case, Virtual Processor 62's MVPLE 45415 is on the suspended list.

If a Virtual Processor 612 is in the Killed Unacknowledged state or Stopped Unacknowledged state, its MVPLE 45415 is on the killed list or stopped list respectively.

c.c. VPAT 45401 (FIG. 466)

As mentioned in the overview of virtual processor management data bases, VPAT 45401 contains virtual processor-level Await Entries 44804. When a Process 610 executes an Await SIN, the SIN creates an Await Entry 44804 in VPAT 45401 and removes Virtual Processor 612 bound to Process 610 from JP 10114. Until Event Counter 44801 specified in Await Entry 44804 is advanced to the value specified in Await Entry 44804, Virtual Processor 612 cannot be bound to JP 10114.

FIG. 466 gives a detailed representation of VPAT 45401 and the tables and functions associated with it. VPAT entries (VPATEs) 45403 have the following fields:

Satisfied Flag 46609. This Flag is set when the await for which VPATE 45403 was created is satisfied.

Notify Flag 46611. This Flag is set when the await is satisfied, but a page fault or active object fault suspends Virtual Processor 612 before it can clear its Await Entries 44804.

AON Field 46613 and Offset Field 46615: These Fields give the AON-offset version of Event Counter Name 44803 belonging to Event Counter 44801 awaited by VPATE 45403. The KOS object management system guarantees that Event Counters 44801 will not change AONs 41304 as long as they have Await Entries 44804 in VPAT 45401.

Event Counter Value Field 46617: this Field contains the vent Counter Value 44802 hich vent Couter 44801 specified in Fields 46613 and 46615 must reach to satisfy the virtual processor-level Await Operation which created VPATE 45403.

Link to next VPATE 46619 is the index in VPAT 45403 of the next entry in a list of VPATEs. As will be explained in detail later, all VPATEs 45403 containing Await Entries 44804 whose Event Counter Names 44803 hash to a single value are linked into a single list.

VP Number Field 46621 contains VP Number 45304 of Virtual Processor 612 whose Process 610 executed the Await SIN which created VPATE 45403.

VPATEs 45403 which do not contain Await Entries 44804 are all on a list of free VPATEs 45403, headed by Free List Head 46607.

Each Virtual Processor 612 in CS 10110 has a VPAT Chunk 45402 in VPAT 45401. Further associated with VPAT 45401 are Hash Function 46602, VPAT Hash Table (VPATHT) 46307, and a Pointer 46605 to Virtual Processor 612's VPAT Chunk 45402 in SS object 10336 belonging to Process 610 to which Virtual Processor 612 is currently bound. The manner in which these components function together is explained in the discussion of virtual processor-level Await and Advance-Processors 612: those which EOS may perform, those which are performed as a part of process-level synchronization operations, and primitive operations which are available only to KOS Processes 610 and microcode and which are used to implement operations belonging to the other groups.

Six operations belong to the first group. All of these operations are invoked through KOS Process Manager Procedures 602.

Request VP allocates a Virtual Processor 612 to EOS.

Release VP returns an allocated Virtual Processor 612 to KOS.

Bind binds a Virtual Processor 612 to a Process 610.

Unbind unbinds a Virtual Processor 612 from a Process 610.

Run makes a Virtual Processor 612 eligible to be bound to JP 10114.

Stop makes a Virtual Processor 612 ineligible to be bound to JP 10114.

The operations are discussed in the above order.

a.a. Request VP (FIGS. 462, 463, 464, 465)

The Request VP Procedure 602 may be invoked only by an EOS Process 610. In the present embodiment, a fixed number of Virtual Processors 612 are allocated to EOS when CS 10110 is initialized, and consequently, Request VP Procedure 602 is invoked only at that time. Other embodiments may allow EOS to request additional Virtual Processors 612 at times other than system initialization.

Request VP Procedure 602 takes as arguments the subject for which the operation is being performed, a variable to hold UID 40401 which identifies new Virtual Processor 612, and a variable for the status code. In the present embodiment, Request VP Procedure 602 changes a Virtual Processor 612's state from Unconfigured to Allocated, and makes the necessary changes in VPIA 46301 and HVPL 46305 to accomplish this state change. After checking whether the subject has access which allows it to request a Virtual Processor 612, Request VP Procedure 602 locks VP Manager Lock 46308 and "creates" a Virtual Processor 612. In the present embodiment, the creation always succeeds; in other embodiments, it may fail because all entries in VPSBA 45301 are in use or because an EOS does not have the right to "create" further Virtual Processors 612. In order to create a Virtual Processor 612, Request VP Procedure 602 locates a VPIE 46303 in VPIA 46301 whose VP Configured Flag 46407 is set to FALSE. It then creates a UID 40401 for Virtual Processor 612 and places UID 40401 in VP ID Field 46403. Virtual Processor 612 represented by VPSB 614 whose index is in VP Number Field 46401 is now identified by this UID 40401. The next step is to put Virtual Processor 612 into the Allocated State. Virtual Processor 612's HVPLE 46307 is moved from the Deconfigured List to the Unbound List, Execution State Field 46405 in Virtual Processor 612's VPIE 46303 is set to Unbound, and VP Configured Flag 46407 and VP Allocated Flag 46409 are set to TRUE. When the operation is finished, Request VP Procedure 602 unlocks VP Manager Lock 46308 and returns. If the operation succeeded, the argument for new Virtual Processor 612's UID 40401 now contains that UID.

b.b. Release VP (FIGS. 462, 463, 464, 465)

In the present embodiment, EOS releases Virtual Processors 612 only when CS 10110 is shut down. In other embodiments, EOS may be able to release Virtual Processors 612 at other times. The Release Operation is the reverse of the Request Operation. In order to be released, a Virtual Processor 612 must be in the Unbound State. Release VP Procedure 602 takes three arguments: the subject on whose behalf Virtual Processor 612 is being released, UID 40401 identifying Virtual Processor 612, and a variable for the status code. Release VP Procedure 602 first checks whether the subject argument has the right to release a Virtual Processor 612. Then it locks VP Manager Lock 46308 and searches VPIA 46301 for VPIE 46303 which contains Virtual Processor 612's UID 40401. Having located VPIE 46303 for Virtual Processor 612, the operation checks Execution State Field 46405 to make sure that Virtual Processor 612 is in the Unbound State. If it is not, Procedure 602 sets the status variable to indicate the problem and returns. Otherwise, Procedure 602 uses VP Number Field 46401 to locate Virtual Processor 612's HVPLE 46305, and unlinks that HVPLE 46305 from the Unbound List and links it to the Deconfigured List. Then Release VP Procedure 602 alters Virtual Processor 612's VPIE 46303 to reflect Virtual Processor 612's new state: VP UID Field 46403 is set to the Null UID, Execution State Field 46405 is set to Deconfigured, and VP Configured Flag 46407 and VP Allocated Flag 46409 are set to 0. After Release VP Procedure 602 is finished, it unlocks VP Manager Lock 46308 and returns.

4. Operations on Processes 610 which Involve Virtual Processors 612

There are five operations on Processes 610 which involve their Virtual Processors 612: Bind, Unbind, Run, Stop, and Kill. The interfaces to the operations are provided by KOS Process Manager Procedures 602. These Procedures 602 manipulate process manager data bases and Process Object 901, and invoke virtual processor manager Procedures 602 when it is necessary to manipulate virtual processor manager data bases. Virtual Process Manager Procedures 602 in turn use KOS SINs when it is necessary to manipulate MVPL 45309.

a.a. The Bind Process Operation (FIGS. 455, 462, 463, 464, 465)

The Bind Process Operation binds a Process 610 to a Virtual Processor 612. When the Bind Process Operation is complete, Process 610 has been associated with Virtual Processor 612, the information which Virtual Processor 612 requires to locate Process 610's state and execute Process 610 on JP 10114 has been copied from Process 610's Process Object 901 into VPSB 614 belonging to Virtual Processor 612, and the virtual processor management data bases have been changed to reflect Virtual Processor 612's new state.

Subjects performing the Bind Process Operation on a Process 610 must have bind process access to Process 610's Process Object 901. Bind Process Procedure 602 which implements the operation takes five arguments:

The subject for which the Bind Operation is being performed.

UID 40401 of Process Object 901 for Process 610.

UID 40401 identifying Virtual Processor 612 to which Process 610 is to be bound.

A Preload Flag. If it is set, process manager Procedure 602 will request the VMM System to preload Object Pages 42302 for Process 610 into MEM 10110.

A status variable.

If any operation performed by Process Manager Bind Procedure 602 fails, Procedure 602 sets the status variable to a value identifying the failure and returns. Process Manager Bind Procedure 602 begins by checking whether the UID argument identifying Process Object 901 is in fact the UID 40401 of a Process Object 901. Then it checks whether the subject on whose behalf the Bind Operation is being performed has bind access to Process Object 901. The next step is to lock Process Object 901 using Lock 45501. It is unlocked on any return from Procedure 602. Then Procedure 602 activates Process Object 901, MAS objects 10328 through 10334, and SS object 10336 belonging to Process 610 and wires the objects active. As explained in the section on object management, the activation operation obtains AON 41304 corresponding to an object's UID 40401 or associates an AON 41304 with a UID 40401 as required. The wiring operation guarantees that the Object Management System will not associate AON 41304 corresponding to UID 40401 with another UID 40401 until an unwiring operation has been performed on the first UID 40401. As Procedure 602 activates and wires each object, it writes the object's AON 41304 into a field of Process Object 901. AON 41304 of Process Object 901 goes into Field 45519, that of SS object 10336 into Field 45517, and those of MAS objects 10328 through 10334 into Domain MAS AON Field 45547 of the domain information array element for that stack. After activating the objects belonging to Process 610, Process Manager Bind Procedure 602 activates Process 610's subject, i.e., calls an Access Control System Procedure 602 which associates Process 610's subject with an ASN as previously described.

The next step is to assemble the information that must be copied from Process Object 901 into VPSB 614. Process Manager Bind Procedure 602 writes the information into a variable called a bind packet, which Procedure 602 then uses as an argument for a Virtual Processor Manager Procedure 602 which actually manipulates the virtual processor management data bases. The bind packet contains information from the following fields of Process Object 901:

The principal and process UIDs 40401 contained in Field 45507.

The SS AON 41304 contained in Field 45517.

The following information for each MAS object: the MAS object AON 41304, contained in Field 45547 for each stack, the Trace Object AON 41304, contained in Field 45551, and the offset from the Trace UID pointer, contained in Field 45549.

Process execution time information from PM Statistics Fields 45567.

Virtual memory management information from VMM Statistics Fields 45569.

In the case of the Trace Table AONs 41304, the objects containing the Trace Tables are activated and wired in the same fashion as the SS and MAS objects.

Once Process Manager Bind Procedure 602 has assembled the bind packet, it invokes Virtual Processor Manager Bind Procedure 602. This Procedure 602 takes four arguments:

UID 40401 of Virtual Processor 612 to which Process 610 is being bound.

The bind packet.

A variable for VP Number 45304 of Virtual Processor 612 to which Process 610 is being bound.

A status code variable.

Virtual Processor Manager Bind Procedure 602 first locks Virtual Processor Manager Lock 46308. It will be unlocked on any return from Procedure 602. The next step is converting Virtual Processor 612's UID 40401 to its VP Number 45304. This is done by searching VPIA 46301 for a VPIE 46303 whose VP ID Field 46403 contains UID 40401 received as an argument to Virtual Processor Manager Bind Procedure 602. When that VPIE 46303 is located, Field 46401 contains Virtual Processor 612's VP Number 45304. The next step is to check Execution State Field 46405 in VPIE 46303. If Field 46405 indicates that Virtual Processor 612 is unbound, the operation may continue; otherwise, KOS is halted.

Using Virtual Processor 612's VP Number 45304 to locate its VPSB 614, Virtual Processor Bind Procedure 602 sets fields in VPSB 614. First, it initializes Elapsed Process Execution Time Field 46221 and fields in Memory Manager Information Fields 46225 to values which indicate that Process 610 has an elapsed execution time of 0 and no page faults. Then Virtual Processor Bind Procedure 602 copies the contents of the bind packet argument into the appropriate fields of VPSB 614. The following table gives the relationship thus established between fields in VPSB 614 and fields in Process Object 901.

| Field in Process Object | Field in VPSB |
|---|---|
| 45507 | 46203 |
| | 46205 |
| 45517 | 46209 |
| 45547 | 46211 |
| 45549, 45551 | 46213 |
| 45569 | 46225 |

After Virtual Processor Manager Bind Procedure 602 has set the proper fields of VPSB 614, it puts Virtual Processor 612 into the stop acknowledged state. It does so by setting Execution State Field 46405 in VPIE 46303 to that value and by unlinking Virtual Processor 612's HVPLE 46307 from the unbound list and linking it into the stopped list in HVPL 46305. Virtual Processor Manager Bind Procedure 602 then unlocks Lock 46308 and returns to Process Manager Bind Procedure 602. On the return, the argument variable for Virtual Processor 612's VP Number 45304 has that number. Process Manager Bind Procedure 602 then copies Virtual Processor 612's VP Number 45304 into Field 45521 of Process Object 901 and changes Process State Field 45563 to include the Bound state. Finally, Process Manager Bind Procedure 602 unlocks Process Object Lock 45501 and returns.

b.b. The Unbind Process Operation (FIG. 455, 462, 463, 464, 465)

The Unbind Operation is the reverse of the Bind Operation. The association between a Process 610 and a Virtual Processor 612 is ended, and those fields of Process Object 901 whose values depend on this association are set to null values. The subject on whose behalf the operation is being performed must have unbind access to Process 610's Process Object 901. In order to be unbound, Process 610 must be in the Stop Acknowledged state and its Virtual Processor 612 must have a Suspend Count of 1, i.e., Virtual Processor 612 may not be suspended pending the resolution of a page fault.

Process Manager Unbind Procedure 602 takes four arguments:

The subject on whose behalf the operation is being performed.

UID 40401 of Process 610's Process Object 901.

An Awaiting Flag. The flag is set if Process 610 has Await Entries 44804 in PET 44705 when it is unbound.

A variable for the status code.

Unbind Procedure 602 begins by checking whether UID 40401 is that of a Process Object 901 and whether the subject argument has unbind process access to Process Object 901. Then it locks Process Object 901 using Lock 45501 and checks Process State Field 45563 in Process Object 901 to determine whether Process 610 is in a state which allows it to be unbound (i.e., in a set of states which does not include the Executing state). The next step is to stop VMM System activity for Process 610. To do so, Unbind Procedure 602 requests the VMM System to abort all virtual memory activity for Process 610.

Process Manager Unbind Procedure 602 then calls Virtual Processor Manager Unbind Procedure 602, which performs the necessary modifications to the virtual processor manager data bases. Virtual Processor Manager Unbind Procedure 602 takes two arguments: UID 40401 identifying Virtual Processor 612 and a status variable.

Virtual Processor Manager Unbind Procedure 602 first locks VP Manager Lock 46307 and uses VPIA 46301 to translate Virtual Processor 612's UID 40401 to its VP Number 45304. The next step is to check Execution State Field 46405 in VPIE 46303 belonging to Virtual Processor 612. If its value is not either Stopped Acknowledged or Killed Acknowledged, Virtual Processor Manager Unbind Procedure 602 returns an error status code. If it is one of those values, Virtual Processor Manager Unbind Procedure 602 checks Suspend Count Field 46259 in VPSB 614 belonging to Virtual Processor 612. If Field 46259's value is greater than 1, Virtual Processor 612 still has paging IO outstanding, and Virtual Processor Manager Unbind Procedure 602 sets the status argument to indicate this and returns. Otherwise, Virtual Processor Manager Unbind Procedure 602 puts Virtual Processor 612 into the Unbound state. It does so by unlinking Virtual Processor 612's HVPLE 46307 from the list it is on in HVPL 46305 and linking it onto the unbound list. Finally, Virtual Processor Manager Unbind Procedure 602 sets Execution State Field 46405 to the Unbound state, unlocks VP Manager Lock 46307, and returns to Process Manager Unbind Procedure 602.

If Virtual Processor Manager Unbind Procedure 602 does not return an error, Process Manager Unbind Procedure 602 completes the unbinding by setting fields in Process Object 901 which obtain their values when Process 610 is bound to a Virtual Processor 612 to null. These fields are the following: VP UID Field 45511, VP Number Field 45521, SS AON Field 45517, Process Object AON Field 45519, and for each MAS object, Stack AON Field 45547 and Trace Pointer AON Field 45551. All objects whose AONs 41304 are removed from Process Object 901 are unwired.

Process Manager Unbind Procedure 602 finishes by setting Process State Field 45563 so that it includes the unbound state, calling an Access Control System Procedure 602 to deactivate Process 610's subject, unlocking Process Object 610, and returning.

c.c. The Run Process Operation (FIG. 455, 456, 462, 463, 464, 465)

When the Run Process operation is performed on a Process 610, Process 610's Virtual Processor 612 may be bound to JP 10114 and Process 610 may execute. As previously mentioned, the Run Process operation does not actually bind Virtual Processor 612 to JP 10114. This binding is performed by Dispatcher microcode and is not under control of Process Manager Procedures 602.

Run Process is implemented by means of a Process Manager Procedure 602, a virtual processor manager Procedure 602, and the KOS Resume SIN. Process Manager Run Process Procedure 602 may only be executed on behalf of subjects with run process access to Process Object 901 belonging to Process 610. Process Manager Run Process Procedure 602 takes four arguments:

- The subject on whose behalf the operation is being performed.
- UID 40401 of Process Object 901 belonging to Process 610.
- A variable containing a packet of information which EOS provides KOS when it requests KOS to run a Process 610.
- A status variable.

The packet of information contains Process 610's priority, its await quantum, its process execution time limit, and Virtual Memory Management System parameters.

Process Manager Run Process Procedure 602 begins by checking whether the subject on whose behalf the operation is being performed has the proper access to Process Object 901. Then Procedure 602 locks Process Object 901, checks Process State Field 45563 of Process Object 901 to make sure that Process 610's state allows it to be run, copies Process 610's await quantum into Process Object Field 45557, and copies the information packet into another packet which it uses as an argument when it calls Virtual Processor Manager Run Process Procedure 602.

This Procedure 602 takes three arguments: the packet of information, UID 40401 identifying Process 610's Virtual Processor 612 (obtained from Process Object Field 45511), and a status variable. Virtual Processor Manager Run Process Procedure 602 first locks the virtual processor manager data bases as previously described, then uses VPIE 46303 to translate Virtual Processor 612's UID 40401 to its VP Number 45394, and then checks Execution State Field 46405 in VPIE 46303. If Field 46405's value is Stopped Acknowledged, the Run Operation may proceed. Otherwise, Virtual Processor Manager Run Process Procedure 602 places an error code in the status variable and returns.

Continuing, Virtual Processor Manager Run Process Procedure 602 copies the information in the packet it received into VPSB 614, setting the following VPSB 614 fields:

- Priority Field 46217
- Elapsed Process Execution Time Limit Field 46221
- Fields in Memory Management Information Fields 46225.

Next, the Virtual Processor Manager Run Process Procedure 602 puts Virtual Processor 612 into the Runnable state. Procedure 602 sets Execution State Field 46405 in VPIE 46303 to Runnable, and unlinks Virtual Processor 612's HVPLE 46307 from the stopped list and links it into the runnable list.

The last steps in preparing Virtual Processor 612's VPSB 45403 are to set Stop Pending Field 46265 to FALSE and to compare Elapsed Process Execution Time Field 46221 with Process Execution Time Limit Field 46223 and set Process Execution Time Limit Pending Field 46263 to TRUE if the elapsed process execution time exceeds the process execution time limit. This action will cause Dispatcher microcode to stop Process 610 the next time it binds Process 610's Virtual Processor 612 to JP 10114.

Virtual Processor Manager Run Process Procedure 602 next executes a Resume SIN. The Resume SIN will be explained in detail later; here, only its effect need be mentioned: Virtual Processor 612's MVPLE 45321 is unlinked from MVPL 45309's suspended list and linked into MVPL 45309's eligible list in a location determined by Process 610's priority, stored in Field 46217 of VPSB 614 belonging to Process 610's Virtual Processor 612.

After performing the Resume SIN, Virtual Processor Manager Run Process Procedure 602 unlocks the virtual processor management data bases and returns to Process Manager Run Process Procedure 602, which unlocks Process Object 901 belonging to Process 610 and returns.

d.d. The Stop Operation (FIG. 455, 456, 462, 463, 464, 465)

The Stop Operation stops a Process 610, i.e., bars Process 610's Virtual Processor 612 from being bound to JP 10114 until EOS performs a Run Operation on it. In CS 10110, the Stop Operation is asynchronous. If a Process 610's Virtual Processor 612 is not bound to JP 10114 when the Stop Operation is executed, Process 610 cannot be stopped until Virtual Processor 612 is again bound to JP 10114. Similarly, if Virtual Processor 612 is executing a series of operations which must be completed, it cannot be stopped until it has reached the end of these operations. As will be explained in detail later, such a series of operations is defined by means of a pair of KOS SINs. The synchronous portions of the Stop Operation are carried out by KOS Process Manager Procedures 602 invoked by user Processes 610; the asynchronous portions are carried out by KOS Dispatcher microcode and KOS Process Manager Process 610. As previously mentioned, communication between the parts of the Stop Operation performed in user Processes 610 and the parts performed in KOS Process Manager Process 610 is achieved by means of PMRQ 45607 and Stopped-Killed Event Counter 45605.

Process Manager Stop Process Procedure 602 which implements the operation takes three arguments:

The subject for whom the operation is being performed.

UID 40401 specifying Process 610 to be stopped.

A status variable.

Process Manager Stop Process Procedure 602 begins by checking whether the subject for whom the operation is being performed has stop process access to Process Object 901 for Process 610. If it does, the procedure locks Process Object 901, checks Process State Field 45563 to verify that Process 610 is in a state which allows the stop operation (i.e., a state which includes Executing), and then obtains UID 40401 of Virtual Processor 612 bound to Process 610 and uses it to call Virtual Processor Manager Stop Procedure 602.

Virtual Processor Manager Stop Process Procedure 602 takes two arguments: UID 40401 of Virtual Processor 612 and a status code variable. Procedure 602 translates UID 40401 to Virtual Processor 612's VP Number by means of VPIA 46301, locks the virtual processor manager data bases, locates Virtual Processor 612's VPSB 614, and sets Stop Pending Field 46265 to TRUE. Virtual Processor Manager Stop Procedure 602 then unlocks the virtual processor manager data bases and returns to Process Manager Stop Process Procedure 602.

Process Manager Stop Process Procedure 602 then advances Private Event Counter 45405 in Process Object 901 belonging to Process 610 being stopped. The Advance Operation guarantees that Virtual Processor 612 bound to Process 610 will shortly gain access to JP 10114. When Virtual Processor 612 does gain access, the Stop Operation is completed by KOS microcode and KOS Process Manager Process 610. Having performed the Advance Operation, Process Manager Stop Process Procedure 602 updates Process 610's state, changing the set of states in Process State Field 45563 to exclude Executing and to include Message To Send and then unlocks Process Object 901 and returns.

The Stop Operation continues when KOS dispatcher microcode binds Virtual Processor 612 belonging to Process 610 to JP 10114. After KOS dispatcher microcode has loaded state from Process 610's SS object 10336 into FU 10120 registers, it checks Stop Pending Flag 46265 in Virtual Processor 612's VPSB 614. As mentioned above, Virtual Processor Manager Stop Process Procedure 602 sets Flag 46265 to TRUE. When Flag 46265 is TRUE, KOS microcode performs a microcode to software Call to a KOS Process Manager Procedure 602. This Procedure 602 first makes sure that Process 610's state is in a condition which allows it to be stopped and uses a KOS SIN called Stop Me which allows a Process 610 to stop itself. The microcode which executes Stop Me unlinks Virtual Processor 612's MVPLE 45321 from the running list, links it into the stopped list, resets Flag 46265 to FALSE, and advances Stopped-killed Event Counter 45605. The advance satisfies an Await Entry 44804 for Process Manager Process 610, and that Process 610 begins executing a loop which continues handling stopped Processes 610 until all of them have been dealt with. For each stopped Process 610, Process Manager Process 610 first invokes a Virtual Processor Manager Procedure 602 which in turn uses a KOS SIN called Get Next Stopped to process the Stopped List in MVPL 45309. The Get Next Stopped SIN returns a MVPLE 45321 on the stopped list to the suspended list and returns VP Number 45304 of Virtual Processor 612 represented by MVPLE 45321. Process Manager Process 610 uses the VP Number 45304 to invoke a Virtual Processor Manager Procedure 602 which moves Virtual Processor 612's HVPLE 46307 from the runnable list to the stopped list in HVPL 46305 and sets Stop Acknowledgement Pending Flag 46267 in VPSB 614 to TRUE. Process manager Process 610 then makes a packet containing information about stopped Process 610, places the packet in a message in Stopped Queue 45611, thereby informing EOS that Process 610 has been stopped, removes Message To Send from Process Object 901's Process State Field 45563, unlocks Process Object 901, and returns.

A Process 610 may be stopped by KOS microcode as well as by Process Manager Stop Process Procedure 602. This occurs when a Process 610 exceeds its execution time limit. What happens under those circumstances is explained in the discussion of virtual processor-level clock operations.

e.e. Killing a Process 610 (FIG. 455, 456, 462, 463, 464, 465)

KOS does not provide a Kill Process operation to EOS, but KOS can kill a Process 610 if there is no other way to bar it from CS 10110's resources. The KOS Process Manager may kill a Process 610, or KOS microcode may kill a Process 610. The Kill Operation is analogous to the Stop Operation, except that there is no need to clean up a killed Process 610's state, and therefore no need for a microcode-to-software Call to Procedures 602 which put Process 610's state in order or for a Kill Pending Flag in VPSB 614. To kill a Process 610, KOS microcode sets Killed Acknowledge Pending Flag 46269 in VPSB 614 belonging to Process 610's Virtual Processor 612 to TRUE, moves MVPLE 45321 for Virtual Processor 612 onto the killed list, and advances Stopped-killed Event Counter 45605. When process manager Process 610 responds to Event Counter 45605, it sets Killed Acknowledgement Pending Flag 462 to FALSE, moves HVPLE 46305 onto the killed list, sets Execution State Field 46405 in VPIE 46303 belonging to Virtual Processor 612 to the killed state, places a message in Killed Message Queue 45613, and sets Process State Field 45563 in Process Object 901 for Process 610 being killed to a state which excludes alive, completing the operation.

5. Virtual Processor-Level Synchronization Operations

At the virtual processor level, there are six synchronization operations. All are KOS SINs. The operations can be divided into three groups:

Advance and Await. These are the virtual processor-level equivalents of the process-level Advance and Await Operations.

Begin Atomic Operation and End Atomic Operation: When a Begin Atomic Operation SIN is executed, Virtual Processor 612 which executes it becomes unstoppable, i.e., a Stop Operation performed on its Process 610 will have no effect until Virtual Processor 612 executes an End Atomic Operation SIN.

Suspend and Resume: Suspend makes a Virtual Processor 612 ineligible to be bound to JP 10114, and Resume makes Virtual Processor 612 once again eligible to be bound.

As will be described in more detail below, the operations are carried out by KOS microcode which manipulates VPAT 45401, VPSB 614, OSO 45423, and MVPL 45309. The microcode for all of these operations executes on Monitor Stack (MOS) 1370 of FU 10120.

a.a. The Advance SIN (FIG. 459, 462, 465, 466)

The Advance and Await SINs manipulate VPAT 45401 and OSO 45423. Detailed representations of these tables are contained in FIGS. 466 and 459 respectively. Turning to those Figures, the discussion begins with the Advance SIN. The Advance SIN consists of an SOP and a Name which evaluates to an Event Counter Name 44803. The SIN evaluates the Name to obtain Event Counter Name 44803, converts Event Counter Name 44803 to its AON-offset equivalent, and then checks whether AON 41304 is that of OSO 45423. If it is, the Advance Operation increments both Event Counter 44801 specified by Event Counter Name 44803's offset in OSO 45423 and Outward Signals Multiplexed Event Counter 45407. Otherwise, the SIN simply increments Event Counter 44801. The next step is to locate Event Counter 44801's Await Entries 44804 in VPAT 45401. To do this, the Advance Operation inputs Event Counter Name 44803's AON-offset into Hash Function 46602, uses the resulting value as the index of VPATHTE 46307, and searches the VPAT 45401 list whose first VPATE 45403 is contained in VPATHTE 46604 for VPATEs 45403 whose Event Counter AON Field 46613 and Event Counter Offset Field 46613 match the AON-Offset of Event Counter Name 44803 and whose Event Counter Value Fields 46617 contain values less than or equal to the incremented value of Event Counter 44801 represented by Event Counter Name 44803. Each time the KOS microcode which executes the Advance SIN finds such a VPATE 45403, it sets VPATE 45403's Satisfied Field 46609, performs a Resume Operation on Virtual Processor 612 specified in VPATE 45403's VP Number Field 46621, invokes Dispatcher microcode to perform a Run Most Worthy Operation (described below), and begins the next SIN. When Virtual Processor 612 is again bound to JP 10114, it will finish executing the virtual processor-level Await Operation which set VPATE 45403 satisfied by the virtual processor-level Advance Operation. If the Advance SIN finds no VPATE 45403 which has been satisfied by the advance of Event Counter 44801, it simply performs a Run Most Worthy Operation.

b.b. The Await SIN (FIG. 459, 462, 465, 466)

The Await SIN creates VPATEs 45403 for up to four Event Counters 44801 and suspends Virtual Processor 612 executing the SIN until an advance of one of Event Counters 44801 satisfies an Await Entry 44804 contained in one of the VPATEs 45403 created by the SIN. The SIN consists of the SOP and up to 10 Names. The Names represent the following:

- The first Name resolves to a location which will contain Event Counter Name 44803 for satisfied Event Counter 44801 when the Await SIN is finished.
- The second Name evaluates to a value between 1 and 4. The value specifies the number of Event Counters 44801 for which VPATEs 45403 are being created.
- Up to four pairs of Names which evaluate to Event Counter Names 44803 and Event Counter Values 44802. Each pair of Names specifies an Event Counter 44801 and the value that it must reach to satisfy Await Entry 44804 created for the pair.

The Await SIN first resolves the first Name and evaluates the second, and then locates Virtual Processor 612's VPAT Chunk 45402 by means of pointer to VPAT Chunk 46605 in SS Object 10336 belonging to Virtual Processor 612's Process 610. Next, for each Event Counter Name 44803-Event Counter Value 44802 pair, the Await SIN evaluates the pair of Names, converts Event Counter Name 44803 to its AON-offset equivalent, and places that AON-offset equivalent and Event Counter Value 44802 in Fields 46613, 46615, and 46617 of a VPATE 45403 in Virtual Processor 612's VPAT Chunk 45402, and sets Satisfied Field 46609 and Notify Field 46611 to FALSE. The SIN then hashes Event Counter Name 44803 to locate the proper event counter list in VPAT 45401, and links VPATE 45403 into the proper location in the list by means of Link to Next VPATE Field 46619. As described for PET 44705, VPATE 45403 is located in its list by means of its Event Counter Name 44803 and its Event Counter Value 44802. All VPATEs 45403 awaiting the same Event Counter 44801 are grouped together in the list, and within a group, VPATEs 45403 are ordered by increasing Event Counter Value 44802. Next, the SIN checks whether the value of Event Counter 44801 specified by Event Counter Name 44803 is already greater than or equal to the value specified by Event Counter Value 44802. If it is, the await is already satisfied and the Await SIN simply sets Satisfied Field 46609 to TRUE and continues as it would after an Advance.

After all VPATEs 45403 have been put in the proper lists, the await operation again checks again whether the Await Entries 44804 in any of the newly-built VPATES 45403 have been satisfied. Each VPATE 45403 belonging to Virtual Processor 612 is examined in turn. If its Await Entry 44804 has not been satisfied, the Await SIN sets Notify Field 46611. If any Await Entries 44804 have been satisfied, then Satisfied Fields 46609 are set to TRUE and Virtual Processor 612 again simply continues as it does after an advance. If no Await Entry 44803 has been satisfied, the Await SIN performs a Suspend Operation on Virtual Processor 612, barring Virtual Processor 612 from JP 10114 until an Advance Operation on one of Event Counters 44801 specified in the Await SIN satisfies Event Counter Value 44802 specified for it.

When the Advance Operation occurs, the Resume Operation which it performs on Virtual Processor 612 eventually causes Virtual Processor 612 to resume execution of the Await SIN. Using Pointer to VPAT Chunk 46605 contained in SS object 10336 belonging to Process 610 bound to Virtual Processor 612, the Await SIN locates VPAT Chunk 45402 and returns all VPATEs 45403 in VPAT Chunk 45402 which contain Await Entries 44804 to the free list in VPAT 45401. As it returns each VPATE 45403, it checks VPATE 45403's Satisfied Flag 46609. If Flag 46609 has the value TRUE, indicating that this VPATE 45403 contained one of the Await Entries 44804 which was satisfied, the Await SIN saves Event Counter AON Field 46613 and Event Counter Offset Field 46615 representing Event Counter Name 44803 for Event Counter 44801 for which VPATE 45403 was created. When all VPATEs 45403 have been returned to the free list, the AON 41403 of the last AON and Offset saved is converted to a UID 40401, and the resulting Event Counter Name 44803 is stored in the location specified by the Await SIN's first Name. The Await SIN then goes on to the next SIN.

c.c. Virtual Processor-level Synchronization Using the System Clock (FIG. 458)

Having explained virtual processor-level Advance and Await Operations, the discussion now turns to the implementation of clock-related synchronization at the virtual processer level. The discussion begins with a description of the manner in which system clock values are synthesized in the present embodiment of CS 10110 and then explains how the present embodiment of CS 10110 reacts to time-related occurrences at the virtual processor level.

At the hardware level, the present embodiment of CS 10110 has no system clock which continually calculates the current time. Instead, as illustrated in FIG. 458, FU 10120 contains Interval Timer 25410, Egg Timer 25412, and two registers in GR's 10360 containing clock-related values. When a Process 610 executing on JP 10114 needs the current system time, it executes a KOS SIN, Read Architectural Clock, which calculates the current time. Read Architectural Clock consists of an SOP and a single Name, which represents a location in which the current system time is to be stored. The KOS microcode which executes Read Architectural Clock resolves the Name, calculates the current time by reading Interval Timer 25410 and adding its value to the Clock Base Value, contained one of the GRs 10360 registers, and then stores the result in the location obtained by resolving the Name.

At the virtual processor level, FU 10120 must react when three time-related events occur: Interval Timer 25410 runs out and must be restarted, a time has been reached which satisfies an Await Entry 44804 in VPAT 45401 for Clock EC 45425, or Virtual Processor 612 currently bound to JP 10114 has exceeded the amount of time allotted it for execution on JP 10114. As previously mentioned, the amount of time allotted to a Virtual Processor 612 and the amount of time it has thus far used are contained in VPSB 614 Fields 46221 and 46223. When Interval Timer 25410 runs out, it produces an Event Signal which invokes KOS microcode; Interval Timer 25410 can furthermore be set by KOS microcode; consequently, KOS microcode ensures that FU 10120 reacts to the satisfaction of an Await Entry 44804 in VPAT 45401 or to Virtual Processor 612 exceeding its process execution time limit by placing that time at which the next such occurrence is to occur in Next Interesting Clock Value 45801, which is always in the same location in MEM 10112, and if this value is less than the time at which Interval Timer Interval Timer 25410 would normally run out, setting Interval Timer 25410 to run out at the time specified in Next Interesting Clock Value 45801 and the reason why Interval Timer 25410 was set to run out at that time in a register in GR's 10360.

On each Interval Timer 25410 runout, KOS microcode proceeds in this manner: It first performs a Begin Atomic Op Operation, thereby guaranteeing that Virtual Processor 612 currently executing will not be stopped until the Interval Timer 25410 runout has been handled. It then examines the GR 10360 register containing the reason why Interval Timer 25410 ran out to determine the reason. If Interval Timer 25410's run out was not related to Next Interesting Clock Value 45801, KOS microcode need only determine whether it is necessary to reset Next Interesting Clock Value 45801, reset it if necessary, and then set Interval Timer 25410 as required by Next Interesting Clock Value 45801. To determine whether it is necessary to reset Next Interesting Clock Value 45801, KOS microcode compares Next Interesting Clock Value 45801's current value with the time specified in the first VPATE 45403 on Await Entry List 44904 belonging to Clock EC 45425 and with the time at which Virtual Processor 612 will have exceeded its process execution time limit. If either of these values is less than Next Interesting Clock Value 45801's current value, Next Interesting Clock Value 45801 is reset to that value. KOS microcode computes the time at which Virtual Processor 612 will exceed its Process Execution Time Limit by adding the current value of Interval Timer 25410 to Elapsed Process Execution Time Field 46221 in Virtual Processor 612's VPSB 614, setting Elapsed Process Execution Time Field 46221 to that amount of time, subtracting that amount of time from Process Execution Time Limit Field 46223, and adding the result to the current value of the system clock.

KOS microcode then subtracts the value in Next Interesting Clock Value 45801 from the current system clock value; if the difference is more than the time it will take Interval Timer 25410 to run out if it is set to run out at its maximum time, KOS microcode sets Timer Set Reason register in GR's 10360 to indicate that that is what it has done, resets Interval Timer 25410 to the maximum interval, does an End Atomic Op Depth, and returns. Otherwise, it sets Timer Set Reason GRF 10354 to indicate that Interval Timer 25410 will run out for the reason for which Next Interesting Clock Value 45801 was set and then resets Interval Timer 25410 to run out when the time between the current time and that contained in Next Interesting Clock Value 45801 has passed.

If, when the Interval Timer 25410 runout Event Signal occurs, Timer Set Reason GRF 10354 indicates that Interval Timer 25410 ran out because an Await Entry 44804 for Clock Event Counter 45425 has been satisfied, KOS microcode sets Clock Event Counter 45425 to the current time −1 and performs an Advance Operation on Clock EC 45425, thus satisfying the Await Entry 44804 from which Interval Timer 25410 was last set. As explained above, the satisfaction of Await Entry 44804 will cause Virtual Processor 612 to which Await Entry 44804 belongs to resume execution. Following the Advance Operation, KOS microcode proceeds as explained above to reset Next Interesting Clock Value 45801 Interval Timer 25410, Timer Set Reason GRF 10354, perform an End Atomic Op Operation, and return.

If Interval Timer 25410 ran out because Process 610 bound to Virtual Processor 612 has exceeded its maximum process execution time limit, KOS microcode sets Process Execution Time Limit Pending Field 46263 in VPSB 614 to TRUE, resets Next Interesting Clock Value 45801, Interval Timer 25410, Timer Set Reason GRF 10354 as described above, executes an End Atomic Op Operation and returns. As described in detail below, the End Atomic Op Operation reads Process Execution Time Limit Field 46263, and if it is set to TRUE, it performs a microcode to software Call to a KOS Process Manager Procedure 602 which makes sure that Process 610 bound to Virtual Processor 612 is in a condition wich allows it to stop and then performs a process-level Stop Operation on Process 610.

d.d. Begin Atomic Ooeration and End Atomic Operation (FIG. 462)

KOS uses the Begin Atomic Operation and End Atomic Operation microcode operations to ensure that KOS Dispatcher microcode will not unbind a Virtual Processor 612 from JP 10114 while Virtual Processor 612 is executing a sequence of operations which must finish before Virtual Processor 612 can be unbound from JP 10114. After Begin Atomic Operation has been executed by a Virtual Processor 612, it may remove itself from JP 10114, but cannot be removed by anyone else. These operations may be invoked by KOS microcode or by KOS high-level language routines via KOS Begin Atomic Operation and End Atomic Operation SINs. These SINs contain no Names, but instead consist solely of the SOP.

Begin Atomic Operation increments Atomic Operation Depth field 46257 in VPSB 614 belonging to Virtual Processor 612 which executes the operation. When Atomic Operation Depth Field 46257 has a value greater than 0, the invocation of KOS Dispatcher microcode is inhibited. KOS microcode which handles events that would normally cause the invocation of KOS Dispatcher microcode examines Atomic Operation Depth Field 46257 before it invokes KOS Dispatcher microcode. If Atomic Operation Depth Field 46257 is greater than 0, the event handling microcode handles the event, but does not finish by invoking the Dispatcher microcode For example, when IOS 10116 has received an Object Page 42302 from Secondary Storage 10124 and written it into a MEM 10112 Frame 42308, IOS 10116 signals JP 10114. The signal causes the invocation of a VMM microroutine which places a message in a KIO Message Queue 45210, advances KIO Event Counter 44801, and only if Atomic Operation Depth Field 46257 is 0 or less, invokes KOS Dispatcher microde.

End Atomic Operation decrements Atomic Operation Depth Field 46257 by one. If the decremented value of Field 46257 is greater than 0, End Atomic Operation simply returns. If the decremented value is 0 or less, End Atomic Operation's behavior depends on the manner in which certain flag fields in VPSB 614 belonging to Virtual Processor 612 which executes the operation are set:

- If Stop Pending Field 46265 has the value TRUE, End Atomic Operation sets Field 46265 to FALSE, sets Stop Acknowledgement Pending Field 46267 to TRUE, advances Stopped-killed Event Counter 45605, and puts Virtual Processor 612's MVPLE 45321 onto the stopped list.
- If either Process Execution Time Alarm Field 46261 or Process Execution Time Limit Pending Field 46263 is set to TRUE, the field is reset and microcode performs a microcode-to-software Call to the Process Manager Procedure 602 described in the discussion of the Stop Operation.

The End Atomic Operation finishes by invoking the KOS Dispatcher's Run Most Worthy microroutine and returning.

e.e. Suspend (FIG. 462. 465)

The Suspend Operation is a microcode operation which increments Suspend Count Field 46259 in a Virtual Processor 612's VPSB 614. If the incremented value of Suspend Count Field 46259 is greater than 0, the Suspend Operation moves Virtual Processor 612's MVPLE 45321 from the running or eligible list to the suspended list in MVPL 45309, thereby barring Virtual Processor 612 from being bound to JP 10114 until a Resume Operation has been performed on it. Before the Suspend Operation returns, it invokes KOS Dispatcher microcode, which performs a Run Most Worthy rescheduling operation. KOS Procedures may use a Suspend SIN to execute the operation, and it may also be carried out by KOS microroutines such as Page Fault Microcode 42503. The Suspend SIN takes a single argument: a Name which evaluates to the VP Number 45304 of Virtual Processor 612 to be suspended.

f.f. Resume (FIG. 462, 465)

The Resume Operation is the reverse of the Suspend Operation. It, too, may be invoked from KOS Procedures via a Resume SIN requiring a Name which evaluates to VP Number 42314 of Virtual Processor 612 being resumed. The Resume Operation decrements Suspend Count Field 46259 in Virtual Processor 612's VPSB 614. If the decremented value of Suspend Count Field 46259 is equal to or less than 0, the Resume Operation moves Virtual Processor 612's MVPLE 45321 from the suspended list to the eligible list, thereby making Virtual Processor 612 eligible to be bound to JP 10114. The location at which the Resume Operation inserts Virtual Processor 612's MVPLE 45321 into the eligible list is determined by the value of Priority Field 46217 in VPSB 614. As previously mentioned, Priority Field 46217 receives its value from EOS when the Run Operation is performed on Process 610 currently bound to Virtual Processor 612. Starting with MVPLE 45321 at the head of the eligible list, the Resume Operation compares the value of Priority Field 46217 contained in VPSB 614 represented by each MVPLE 45321 in the list in turn with that contained in VPSB 614 represented by MVPLE 45321 being added to the list. When the Resume Operation locates a MVPLE 45321 which represents a VPSB 614 whose Priority Field 46217 has a value equal to or greater than that contained in MVPLE 45321 being added to the eligible list, it links MVPLE 45321 being added in ahead of that MVPLE 45321. The eligible list is thus always ordered by the priorities which EOS gives Processes 610.

g.g. KOS Dispatcher Microcode (FIG. 462, 465)

Scheduling of Virtual Processors 612 on JP 10114 and binding of Virtual Processors 612 to JP 10114 is carried out by KOS Dispatcher microcode. There is no Dispatch SIN, so Dispatcher microcode not be invoked directly by either EOS or KOS Procedures 602, but priorities provided by EOS in the Run Process Operation influence the scheduling performed by KOS Dispatcher microcode, and the KOS dispatcher microcode is invoked each time a KOS Advance or End Atomic Operation SIN is executed. In addition, the KOS dispatcher microcode is invoked by KOS microcode which is itself invoked when Interval Timer 25410 runs out or Egg Timer 25412 overflows or when IOS 10116 completes an I/O operation and signals the operation's completion to JP 10114 via IOJP Bus 10132. As previously mentioned in the discussion of the Begin Atomic Operation, the Begin Atomic Operation inhibits invocations of the Dispatcher by means of these Event Signals.

The KOS Dispatcher performs three operations: Run Most Worthy, Unload Virtual Processor State, and Load Virtual Processor State. Run Most Worthy determines which Virtual Processor 612 should next be bound to JP 10114. If Virtual Processor 612 which is to be bound to JP 10114 next is different from Virtual Processor 612 currently bound to JP 10114, Unload Virtual Processor State unloads the state of Virtual Processor 612 currently bound to JP 10114 from FU 10120 and EU 10122 registers to SS object 10336 belonging to Virtual Processor 612's Process 610, and Load Virtual Processor State loads the state of next Virtual Processor 612 from SS object 10336 belonging to that Virtual Processor 612's Process 610 into FU 10120 and EU 10122 registers. Since unloading and loading are standard data transfer operations, only Run Most Worthy is considered in detail.

Run Most Worthy first locates VPSB 614 belonging to Virtual Processor 612 currently bound to JP 10114 and obtains the value of Priority Field 46217. It then locates VPSB 614 belonging to Virtual Processor 612 whose MVPLE 45321 is the first entry in the Eligible List. Having located the entry, Run Most Worthy begins searching for for a Virtual Processor 612 which fulfills two conditions:

- The priority of its Process 610 must be greater than that of Process 610 bound to Virtual Processor 612 currently on JP 10114. The priority is contained in Priority Field 46217 of VPSB 614.
- The Suspend Count of Virtual Processor 612 must be 0 or less. This information is contained in Field 46259.

If the search locates such a Virtual Processor 612, Run Most Worthy moves MVPLE 45321 belonging to Virtual Processor 612 currently bound to JP 10114 from the running list to the proper position for its priority in the eligible list, using the means of locating that position described in the discussion of the Run Operation. Then it moves the first MVPLE 45321 on the eligible list onto the running list, performs a Virtual Processor State Unload Operation on Virtual Processor 612 which was previously on the running list, and a Virtual Processor State Load Operation on Virtual Processor 612 which is presently on the running list. When the Dispatcher microcode returns from the Virtual Processor State Load Operation, the state of Virtual Processor 612 presently on the Running List is in JP 10114's registers and Virtual Processor 612 consequently resumes execution. If Run Most Worthy cannot find a Virtual Processor 612 which fulfills both conditions, currently-executing Virtual Processor 612 remains bound to JP 10114.

d. Process 610 Stack Manipulation

This section of the specification for CS 10110 describes the manner in which Process 610's MAS 502 and SS 504 are manipulated. As previously mentioned, in CS 10110, a Process 610's MAS 502 and SS 504 are contained in several objects. In the present embodiment, there are five objects, one for each domain's portion of the Macro Stack (MAS) (MAS Objects 10328 through 10324) and one for the Secure Stack (SS) (SS Object 10336). In other embodiments, a Process 610's MAS 502 may contain objects for user-defined domains as well. Though a Process 610's MAS 502 and SS 504 are contained in many objects, they function as a single logical stack. The division into several objects is a consequence of two things: the domain component of the protection system, which requires that an object referenced by a Procedure 602 have Procedure 602's domain of execution, and the need for a location inaccessible to user programs for micromachine state and state which may be manipulated only by KOS.

Stack manipulation takes place under the following circumstances:

- When a Procedure 602 is invoked or a Return SIN is executed. Procedure 602 invocations are performed by means of a Call operation. Call causes a transfer of control to the first SIN in the invoked Procedure 602 and the Return SIN causes a transfer of control back to the SIN in the invoking Procedure 602 which follows the Call SIN.
- When a non-local Go To SIN is executed. The non-local Go To causes a transfer of control to an arbitrary position in some Procedure 602 which was previously invoked by Process 610 and whose invocation has not yet ended.
- When a condition arises, i.e., an execution of a statement in a program puts the executive Process 610 into a state which requires the execution of a previously established Handler Procedure 602.
- When a Process 610 is interrupted, i.e., when an Interrupt Entry 45718 for Process 610 is satisfied.

Most of the mechanisms involved in stack manipulation are used in Call and Return; these operations are therefore dealt with in detail and the other operations only as they differ from Call and Return. The discussion first introduces Call and Return, then explains the stacks in detail, and finally analyzes Call and Return and the other operations in detail.

1. Introduction to Call and Return

As a Process 610 executes a program, it executes Call and Return SINs. A Call SIN begins an invocation of a Procedure 602, and a Return SIN ends the invocation. Generally speaking, a Call SIN does the following:

- It saves the state of Process 610's execution of Procedure 602 which contains the Call SIN. Included in this state is the information required to continue Procedure 602's execution after the Call SIN is finished. This portion of the state is termed calling Procedure 602's Macrostate.
- It creates the state which Process 610 requires to begin execution of called Procedure 602.
- It transfers control to the first SIN in the called Procedure 602's code.

The Return SIN does the oposite: it releases the state of called Procedure 602, restores the saved state of calling Procedure 602, and transfers control to the SIN in the calling Procedure 602 following the Call SIN. An invocation of a Procedure 602 lasts from the execution of the Call SIN which transfers control to the Procedure 602 to the execution of the Return SIN which transfers control back to Procedure 602 which contained the Call SIN. The state belonging to a given invocation of a Procedure 602 by a Process 610 is called Procedure 602's invocation state.

While Calls and Returns may be implemented in many different fashions, it is advantageous to implement them using stacks. When a Call creates invocation state for a Procedure 602, that invocation state is added to the top of Process 610's stack. The area of a stack which contains the invocation state of a Procedure 602 is called a frame. Since a called Procedure 602 may call another Procedure 602, and that another, a stack may have any number of frames, each frame containing the innvocation state resulting from the invocation of a Procedure 602 by Process 610, and each frame lasting as long as the invocation it represents. When called Procedure 602 returns to its caller, the frame upon which it executes is released and the caller resumes execution on its frame. Procedure 602 being currently executed by a Process 610 thus always runs on the top frame of Process 610's MAS 502.

Calls and Returns in CS 10110 behave logically like those in other computer systems using stacks to preserve Process 610 state. When a Process 610 executes a Call SIN, the SIN saves as Macrostate the current values of the ABPs, the location of the SIN at which the execution of calling Procedure 602 is to continue, and information such as a pointer to calling Procedure 602's Name Table 10350 and UID 40401 belonging to the S-interpreter object which contains the S-interpreter for Procedure 602's S-language. The Call SIN then creates a stack frame for called Procedure 602, obtains the proper ABP values, the location of called Procedure 602's Name Table 10350 and UID 40401 belonging to its S-interpreter object, and begins executing newly-invoked Procedure 602 on the newly-created stack frame. The Return SIN deletes the stack frame, obtains the ABP values and name interpreter information from the Macrostate saved during the Call SIN, and then transfers control to the SIN at which execution of calling Procedure 602 is to continue.

However, the manner in which Call and Return are implemented is deeply affected by CS 10110's Access Control System. Broadly speaking, there are two classes of Calls and Returns in CS 0110: those which are mediated by KOS and those which are not. In the following discussion, the former class of Calls and Returns are termed Mediated Calls and Returns, and the latter are called Neighborhood Calls and Returns. Most Calls and Returns executed by CS 10110 are Neighborhood Calls and Returns; Mediated Calls and Returns are typically executed when a user Procedure 602 calls EOS Procedures 602 and these in turn call KOS Procedures 602. The Mediated Call makes CS 10110 facilities available to user Processes 610 while protecting these CS 10110 facilities from misuse, and therefore generally serves the same purpose as system calls in the present art. As will be seen in the ensuing discussion, Mediated Call requires more CS 10110 overhead than Neighborhood Call, but the extra overhead is less than that generally required by system calls in the present art.

Mediated Calls and Returns involve S-interpreter, Namespace, and KOS microcode. S-interpreter and Namespace microcode interpret the Names involved in the call and only modifies those portions of Macrostate accessible to the S-interpreter. The remaining Macrostate is modified by KOS microroutines invoked in the course of the Call SIN. A Mediated Call may be made to any Procedure 602 contained in an object to which Process 610's subject has Execute Access at the time the invocation occurs. Mediated Calls and Returns must be made in the following situations:

- When called Procedure 602 has a different Procedure Environment Descriptor (PED) 30303 from that used by calling Procedure 602. Such Calls are termed Cross-PED Calls.
- When called Procedure 602 is in a different Procedure Object 608 from calling Procedure 602. Such Calls are termed Cross-Procedure Object Calls.
- When called Procedure 602's Procedure Object 608 has a different Domain of Execution (DOE) Attribute from that of calling Procedure 602's Procedure Object 608, and therefore must place its Invocation State on a different MAS object from that used by calling Procedure 602. Such Calls are termed Cross-Domain Calls.

In all of the above Calls, the information required to complete the Call is not available to the S-interpreter, and consequently, KOS mediation is required to complete the Call. Neighborhood Calls and Returns only modify two components of Macrostate: the pointer to the current SIN and the FP ABP. Both of these components are available to the S-interpreter as long as called Procedure 602 has the same PED 30303, i.e., uses the same Name Table 10350 and S-interpreter or the calling Procedure 602 and has Names with the same syllable size as calling Procedure 602. The Call and Return SINs are specific to each S-language, but they resemble each other in their general behavior. The following discussion will deal exclusively with this general behavior, and will concentrate on Mediated Calls and Returns. The discussion first describes MAS 502 and SS 504 belonging to a Process 610 and those parts of Procedure Object 608 involved in Calls and Returns, and then describes the implementation of Calls and Returns.

2. Macro Stacks (MAS) 502 (FIG. 467)

FIG. 467 gives an overview of an object belonging to a Process 610's MAS 502. The description of this Figure will be followed by descriptions of other Figures containing detailed representations of portions of MAS objects.

At a minimum, MAS Object 46703 comprises KOS MAS Base 46704 together with Unused Storage 46727 reserved for the other elements comprising MAS Object 46703. If Process 610 has not yet returned from an invocation of a Procedure 602 contained in a Procedure Object 608 whose DOE is that required for access to MAS Object 46703, MAS at least one MAS Frame 46709.

Each MAS Frame 46709 represents one mediated invocation of a Procedure 602 contained in a Procedure Object 608 with the DOE attribute required by MAS 46703, and may in addition represent neighborhood invocations of Procedures 602 which share that Procedure 602's Procedure Object 608. The topmost MAS Frame 46709 represents the most recent group of invocations of Procedures 602 with the DOE attribute required by MAS Object 46703, and the bottom MAS Frame 46709 the earliest group of invocations from which Process 610 has not yet returned. Frames for invocations of Procedures 602 with other domains of execution are contained in other MAS Objects 46703. As will be explained in detail below, MAS Frames 46709 in different MAS objects 46704 are linked by pointers.

MAS Domain Stack Base 46703 has two main parts: KOS MAS Header 10410, which contains information used by KOS microcode which manipulates MAS Object 46703, and Per-domain Information 46707, which contains information about 46703's domain and static information, i.e., information which lasts longer than an invocation, used by Procedures 602 with MAS Frames 46709 on MAS Object 46703. MAS Frame 46709 also has two main parts, a KOS Frame Header 10414, which contains information used by KOS to manipulate Frame 46709, and S-interpreter Portion 46713, which contains information available to the S-interpreter when it executes the group of Procedures 602 whose invocations are represented by Frame 46709.

When making Calls and Returns, the S-interpreter and KOS microcode use a group of pointers to locations in MAS Object 46703. These pointers comprise the following:

MAS Object UID 46715, the UID 40401 of MAS Object 46703.

First Frame Offset (FFO) 46719, which locates the beginning of KOS Frame Header 10414 belonging to the first MAS Frame 46709 in MAS Object 46703.

Frame Header Pointer (FHP) 46702, which locates the beginning of the topmost KOS Frame Header 10414 in MAS Object 46703.

Stack Top Offset (STO) 46704, a 32-bit offset from Stack UID 46715 which marks the first bit in Unused Storage 46727.

As will be seen presently, all of these pointers are contained in fields in KOS MAS Header 46705.

a.a. MAS Base 10410 (FIG. 468)

FIG. 468 is a detailed representation of MAS Domain Stack Base 10410. Turning first to the detailed representation of KOS MAS Header 46705 contained therein, there are the following fields:

Format Information Field 46801, containing information about the format of KOS MAS Header 10410.

Flags Field 46803. Of these flags, only one is of interest to the present discussion: Domain Active Flag 46804. This flag is set to TRUE when Process 610 to which MAS Object 46703 belongs is executing the invocation of Procedure 602 whose invocation record makes up the topmost MAS Frame 46709 contained in MAS Object 46703 to which KOS MAS Header 10410 belongs.

PFO Field 10410: All MAS Headers 46705 and Frame Headers 46709 have fields containing offsets locating the previous and following headers in MAS Object 46703. In a KOS MAS Header 10410, there is no previous header, and this field is set to 0.

FFO Field 46805: The field locating the following header. In a KOS MAS Header 10410, this field contains FFO 46719, since the next header is the first Frame Header in MAS Object 46703.

STO Field 46807: the field containing STO offset 46704.

Process ID Field 46809: UID 40401 belonging to Process Object 901 for Process 610 to which MAS Object 46703 belongs.

Domain Environment Information Pointer Field 46811: The pointer contained in the field locates an area which contains domain-specific information. In the present embodiment, the area is part of MAS Stack Base 46704; however, in other embodiments, it may be contained in a separate object.

Signaller Pointer Field 46813: The pointer contained in the field locates a Procedure 602 which KOS invokes when a Process 610's execution causes a condition to arise while it is executing in the domain to which MAS object 46703 belongs.

AAT Pointer Field 30211: The pointer in Field 30211 locates AAT 30201 for MAS Object 46703. AAT 30201 is described in detail in Chapter 3.

Frame Label Sequencer Field 46819: This field contains a Sequencer 45102. Sequencer 45102 is used to generate labels used to locate MAS Frames 46709 when a non-local GOTO is executed.

Turning now to the detailed representation of Domain Environment Information 46821 located by Domain Environment Information Pointer Field 46811, there are the following fields:

KOS Format Information Field 46823.

Flags Field 46825, containing the following flags:

Pending Interrupt Flag 46827, set to TRUE when Process 610 has an interrupt pending for the domain to which MAS Object 46703 belongs.

Domain Dead Flag 46829, set to TRUE when Process 610 can no longer execute Procedures 602 with domains of execution equal to that to which MAS Object 46703 belongs.

Invoke Verify on Entry Flag 46833 and Invoke Verify on Exit Flag 46835. The former flag is set to TRUE when KOS is to invoke a Procedure 602 which checks the domain's data bases before a Procedure 602 is allowed to execute on the domain's MAS Object 46703; the latter is set to TRUE when KOS is to invoke such a Procedure 602 on exit from a Procedure 602 with the domain as its DOE.

Default Handler Non-null Flag 46835 is set to TRUE when there is a default clean-up handler for the domain. Clean-up handlers are described later.

Interrupt Mask Field 46839 determines what interrupts set for Process 610 in MAS object 46703's domain will be honored.

Domain UID Field 46841 contains UID 40401 for the domain to which MAS Object 46703 belongs.

Fields 46843 through 46849 are pointers to Procedures 602 or tables of pointers to Procedures 602. The Procedures 602 so located handle situations which arise as MASs 502 are manipulated. The use of these fields will become clear as the operations which require their use are explained.

b.b. Per-domain Data Area 46853 (FIG. 468)

Per-domain Data Area 46853 contains data which cannot be kept in MAS Frames 46709 belonging to invocations of Procedures 602 executing in MAS Object 46703's domain, but which must be available to these invocations. Per-Domain Data Area 46853 has two components: Storage Area 46854 and AAT 30201. Storage Area 46854 contains static data used by Procedures 602 with invocations on MAS Object 46703 and data used by S-interpreters which are used by such Procedures 602. Associated Address Table (AAT) 30201 is used to locate data in Storage Area 46854. A detailed discussion of AAT 30201 is contained in Chapter 3.

Two kinds of data are stored in Storage Area 46854: static data and S-interpreter data.

Static data is stored in Static Data Block 46863. Static Data Block 46863 comprises two parts: Linkage Pointers 46865 and Static Data Storage 46867. Linkage Pointers 46865 are pointers to static data not contained in Static Data Storage 46867, for example, data which lasts longer than Process 610, and pointers to External Procedures 602 which the Procedure 602 to which Static Data Storage 46867 belongs invokes. Static Data Storage 46867 contains storage for static data used by the Procedure 602 which does not last longer than Process 610 executing the Procedure 602.

S-interpreter data is data required by S-interpreters used by Procedures 602 executing on MAS object 46703. The S-interpreter data is stored in S-interpreter Environment Block (SEB) 46864, which, like Static Data Block 46864, is located via AAT 30201. The contents of SEB 46864 depend on the S-interpreter.

c.c. MAS Frame 46709 Detail (FIG. 469)

FIG. 469 represents a typical frame in MAS Object 46703. Each MAS Frame 46709 contains a Mediated Frame 46947 produced by a Mediated Call of a Procedure 602 contained in a Procedure Object 608 whose DOE attribute is the one required for execution on MAS object 46703. Mediated Frame 46947 may be followed by Neighborhood Frames 46945 produced by Neighborhood Calls of Procedures 602. Mediated Frame 46947 has two parts, a KOS Frame Header 10414 which is manipulated by KOS microcode, and an S-interpreter Portion which is manipulated by S-interpreter and Namespace microcode. Neighborhood Frames 46945 have no KOS Frame Headers 10414. As will become clear upon closer examination of FIG. 469, Mediated Frames 46947 in the present embodiment contain no Macrostate. In the present embodiment, Macrostate for these frames is kept on SS Object 10336; however in other embodiments, Macrostate may be stored in Mediated Frames 46947. Neighborhood Frames 46945 contain those portions of the macrostate which may be manipulated by Neighborhood Call; the location of this macrostate depends on the Neighborhood Call SIN.

Turning now to KOS Frame Header 10414, there are the following fields:

- KOS Format Information Field 46901, containing information about MAS Frame 46709's format.
- Flags Field 46902. This field contains the following flags:
  - Result of Cross-domain Call Flag 46903. This Flag is TRUE if MAS Frame 46709 which precedes this MAS Frame 46709 is in another MAS Object 46703.
  - Is Signaller Flag 46905. This flag is TRUE if this MAS Frame 46709 was created by the invocation of a Signaller Procedure 602.
  - Do Not Return Flag 46907: This flag is TRUE if Process 610 is not to return to the invocation for which this MAS Frame 46709 was created.
  - Flags 46909 through 46915 indicate whether various lists used in condition handling and non-local GOTOs are present in the MAS Frame 46709.
- Previous Frame Offset Field 46917, Next Frame Offset Field 46919, and Frame Top Offset Field 46921 are offsets which give the location where Header 10414 for the previous MAS Frame 46709 in MAS Object 46703 begins, the location where the header for the next MAS Frame 46709 in MAS Object 46703 begins, and the location of the first bit beyond the top of MAS Frame 46709 respectively.
- Fields 46923 through 46927 are offsets which locate lists in S-interpreter portion 46713 of Frame 46709. KOS establishes such lists to handle conditions and non-local GOTOs. Their use will be explained in detail under those headings.
- Fields 46929 and 46933 contain information about Procedure 602 whose invocation is represented by MAS Frame 46709. Field 46929 contains the number of arguments required by Procedure 602, and Field 46933 contains a resolvable pointer to Procedure 602's PED 30303. Both these fields are used primarily for debugging.
- Dynamic Back Pointer Field 46931 contains a resolved pointer to the preceding MAS Frame 46709 belonging to Process 610's MAS 502 when that MAS Frame 46709 is contained in a different MAS Object 46703. In this case, Flag Field 46903 is set to TRUE. When the preceding MAS Frame 46709 is contained in the same MAS object 46703, field 46931 contains a pointer with a null UID 40401 and Flag Field 46903 is set to FALSE.
- Frame Label Field 46935 is for a Frame Label produced when a non-local GOTO is established which transfers control to the invocation represented by MAS Frame 46709. The label is generated by Frame Label Sequencer 46819 in KOS MAS Header 10410.

S-interpreter Portion 46713 of MAS Frame 46709 comprises those portions of MAS Frame 46709 which are under control of the S-interpreter. S-interpreter Portion 46713 in turn comprises two main subdivisions: those parts belonging to Mediated Frame 46947 and those belonging to Neighborhood Frames 46945.

The exact form of S-interpreter portion 46949 of KOS Frame 46947 and of S-interpreter Frames 46945 depends on the Call SIN which created the frame in question. However, all Neighborhood Frames 46945 and S-interpreter Portions 46949 of Mediated Frames 46947 have the same arrangements for storing Linkage Pointers 10416 and local data in the frame. Linkage Pointers 10416 are pointers to the locations of actual arguments used in the invocation and Local Storage 10420 contains data which exists only during the invocation. In all Mediated Frames 46947 and Neighborhood Frames 46945, Linkage Pointers 10416 precede Local Storage 10420. Furthermore, when a Mediated Frame 46947 or a Neighborhood Frame 46945 is the topmost frame of Process 610's MAS, i.e., when Process 610 is executing on that frame, the FP always points to the beginning of Local Storage 10420, and the beginning of Linkage Pointers 10416 is always at a known displacement from FP. References to Linkage Pointers 10416 may therefore be expressed as negative offsets from FP, and references to Local Storage 10420 as positive offsets.

In addition, S-interpreter Portion 46713 may contain lists of information used by KOS to execute non-local GOTOs and conditions, as well as S-interpreter frames for non-mediated calls. The lists of information used by KOS are contained in List Area 46943. The exact location of List Area 46943 is determined by the compiler which generates the SINs and Name Table for the Procedure 602 whose invocation is represented by Mediated Frame 46947. When Procedure 602's source text contains statements requiring storage in List Area 46943, the compiler generates SINs which place the required amount of storage in Local Storage 10420. KOS routines then build lists in Area 46943, and place the offsets of the heads of the lists in Fields 46923, 46925, or 46927, depending on the kind of list. The lists and their uses are described in detail later.

3. SS 504 (FIG. 470)

FIG. 470 presents an overview of SS 504 belonging to a Process 610. SS 504 is contained in SS Object 10336. SS Object 10336 is manipulated only by KOS microcode routines. Neither Procedures 602 being executed by Process 610 nor S-interpreter or Namespace microcode may access information contained in SS Object 10336.

SS Object 10336 comprises two main components, SS Base 47001 and SS Frames 47003. Turning first to the general structure of SS Frames 47003, each time a Process 610 executes a Mediated Call, KOS microcode creates a new SS Frame 47003 on SS Object 10336 belonging to Process 610, and each time a Process 610 executes a Mediated Return, KOS microcode removes the current top SS Frame 47003 from SS Object 10336. There is thus one SS Frame 47003 on SS Object 10336 belonging to a Process 610 for each Mediated Frame 46947 on Process 610's MAS 502.

SS Frames 47003 comprise two kinds of frames: Ordinary Frames 10510 and Cross-domain Frames 47039. Cross-domain Frames 47039 are created whenever Process 610 executes a Cross-domain Call; for all other Mediated Calls, Ordinary Frames 10510 are created. Cross-domain Frames 47039 divide SS Frames 47003 into Groups 47037 of SS Frames 47003 belonging to sequences of invocations in a single domain. The first SS Frame 47003 in a Group 47037 is a Cross-domain Frame 47039 for the invocation which entered the domain, and the remainder of the SS Frames 47003 are Ordinary Frames 10510 for a sequence of invocations in that domain. These groups of SS Frames 47003 correspond to groups of Mediated Frames 46947 in a single MAS Object 46703.

a.a. SS Base 47001 (FIG. 471)

SS Base 47001 comprises four main parts: SS Header 10512, Process Microstate 47017, Storage Area 47033 for JP 10114 register contents, and Initialization Frame Header 47035. Secure Stack Header 10512 contains the following information:

- Fields 47001 and 47009 contain flag and format information; the exact contents of these fields are unimportant to the present discussion.
- Previous Frame Offset Value Field 47011 is a standard field in headers in SS Object 10336; here, it is set to 0, since there is no previous frame.
- Secure Stack First Frame Offset Field 47013 contains the offset of the first SS Frame 47039 in SS object 10336, i.e., Initialization Frame Header 47035.
- Process UID field 47015 contains UID 40401 of Process 610 to which SS Object 10336 belongs.
- Number of Cross Domain Frames Field 47016 contains the number of Cross-domain Frames 47039 in SS Object 10336.

Process Microstate 47017 contains information used by KOS microcode when it executes Process 610 to which SS Object 10336 belongs. Fields 47019, 47021, and 47022 contain the offsets of locations in SS Object 10336. Field 47019 contains the value of SSTO, the location of the first free bit in SS Object 10336; Field 47021 contains the value of SSFO, the location of the topmost frame in SS object 10336; Field 47022, finally, contains the value of XDFO, the location of the topmost Cross-domain Frame 47039 in SS Object 10336. All of these locations are marked in FIG. 470.

Other fields of interest in Process Microstate 47017 comprise the following: Offsets in Storage Area Field 47023 contains offsets of locations in Storage Area 47033 of SS Object 10336; Domain Number Field 47025 contains the domain number for the DOE of Procedure 602 currently being executed by Process 610. The relationship between domain UIDs and domain numbers is explained in the discussion of domains. VPAT Offset Field 47027 contains the offset in VPAT 45401 of VPAT Chunk 45402 belonging to Virtual Processor 612 to which Process 610 is bound. Signal Pointer Field 47029 contains a resolved pointer to the Signaller (a Procedure 602 used in condition handling) belonging to the domain specified by Domain Number Field 47025, and Trace Information Field 47031 contains a resolved pointer to that domain's Trace Table, described later.

Storage Area for JP 10114 register Contents 47033 is used when a Virtual Processor 612 must be removed from JP 10114. When this occurs, either because Virtual Processor 612 is unbound from JP 10114, because CS 10110 is being halted, or because CS 10110 has failed, the contents of JP 10114 registers which contain information specific to Virtual Processor 612 are copied into Storage Area 47033. When Virtual Processor 612 is returned to JP 10114, these register contents are loaded back into the JP 10114 registers from whence they came. Initialization Frame Header 47035, finally, is a dummy frame header which is used in the creation of SS Object 10336.

b b. SS Frames 47003 (FIG. 471)

Commencing the discussion of SS Frames 47039 and 10510, FIG. 471 illustrates these structures in detail. Ordinary SS Frame 10510 comprises three main divisions: Ordinary SS Frame Header 10514, Macrostate 10516, and Microstate 10520. Ordinary SS Frame Header 10514 contains information used by KOS microcode to manipulate Ordinary SS Frame 10510 to which Header 10514 belongs. Macrostate 10516 contains the values of the ABPs for the frame's mediated invocation and other information required to resume execution of the invocation Microstate 10520 contains micromachine state from FU 10120 and EU 10122 registers. The amount of micromachine state depends on the circumstances; in the present embodiment, some micromachine state is saved on all Mediated Calls; furthermore, if a Process 610 executes a microcode-to-software Call, the micromachine state that existed at the time of the call is saved; finally, Microstate 10520 belonging to the topmost SS Frame 47003 may contain information which was transferred from FU 10120 GRF registers 10354 or EU 10122 register and stack mechanism 10216 when their capacity was exceeded. For details about this portion of Microstate 10520, see the discussion of the FU 10120 micromachine in Chapter 2. The discussion of SS Object 10336 continues with details concerning SS Header 10514 and Macrostate 05163.

a.a.a Ordinary SS Frame Headers 10514 (FIG. 471)

Fields of interest in Ordinary Secure Stack Frame Header 10514 are the following:

- Format Information 47103, which identifies the format of Header 10514.
- Flags Field 47105, which contains one flag of interest in this discussion: Frame Type Flag 47107: in Ordinary SS Frames 10510, this field is set to FALSE.
- Offset Fields 47109 through 47113: Field 47109 contains the offset of the previous SS Frame 47039 or 10510, Field 47111 contains the offset of the following SS Frame 47039 or 10510, and Field 47113 contains the offset of the last SS Frame 47039 or 10510 preceding the next Cross-domain Frame 47039.
- Field 47117 contains the current domain number for the domain in which the mediated invocation represent by SS Frame 47039 or 10510 is executing.
- Field 47119 contains the offset of the preceding Cross-domain Frame 47039.
- Field 47121 contains offsets for important locations in Microstate 10520.

b.b.b. Detailed Structure of Macrostate 10516 FIG. 471)

These fields are of interest in Macrostate 10516:

Syllable Size Field 47125 contains the value of K, i.e., the size of the Names in the SINs belonging to Procedure 602 which the invocation is executing.

End of Name Table Field 47127 contains the location of the last Name in Name Table 10350 belonging to Procedure 602 which the invocation is executing.

Fields 47129 through 47143 are resolved pointers to locations in Procedure Object 901 containing Procedure 602 being executed by the invocation and resolved pointers to locations containing data being used by Procedure 602. Field 47129 contains a pointer to Procedure 602's PED 30303; if Procedure 602 is an External Procedure 602, Field 47131 contains a pointer to Procedure 602's entry in Gates 10340; Field 47135 contains the UID-offset value of FP for the invocation; Field 47135 contains a pointer to SEB 46864 used by Procedure 602's S-interpreter Field 47137 contains the UID-offset value of SDP and Field 47139 contains that of PBP. SIP Field 47141 contains a pointer to Procedure 602's S-interpreter object, and NTP, finally, is a pointer to Procedure 602's Name Table 10350.

Field 47145 contains the PC for the SIN which is to be executed on return from the mediated invocation to which SS Frame 47003 belongs.

c.c.c. Cross-domain SS Frames 47039 (FIG. 471)

Cross-domain SS Frames 47039 differ from Ordinary SS Frames 10510 in two respects: they have an additional component, Cross-domain State 10513, and fields in Cross domain Frame Header 47157 have different meanings from those in Ordinary Frame Header 10514.

Cross-domain State 10513 contains information which KOS Call microcode uses to verify that a return to a Procedure 602 whose DOE differs from that of Procedure 602 whose invocation has ended is returning to the proper domain. Fields of interest in Cross-domain State 10513 include GOTO Tag 47155, used for non-local GOTOs which cross domains, Stack Top Pointer Value 47153, which gives the location of the first free bit in the new domain's MAS Object 46703, and Frame Header Pointer Value 47151, which contains the location of the topmost Mediated Frame Header 46709 in new MAS Object 46703.

There are three fields in Cross-domain Frame Header 47157 which differ from those in Ordinary SS Frame Header 47101. These fields are Flag Field 47107, which in Cross-domain Frame Header 47157 always has the value TRUE, Preceding Cross-domain Frame Offset Field 47161, which contains the offset of preceding Cross-domain Frame 47039 in SS Object 10336, and Next Cross-domain Frame Offset Field 47159, which contains the location of the next Cross-domain Frame 47039. These last two fields occupy the same locations as Fields 47111 and 47109 respectively in Ordinary SS Frame Header 10514.

As will be noted from the above description of SS Frames 47003, Secure Stack Object 10336 in the present embodiment contains three kinds of information: macrostate, cross-domain state, and microstate. In other embodiments, the information in SS object 10336 may be stored in separate stack structures, for example, separate microstate and cross-domain stacks, or information presently stored in MAS Objects 46703 may be stored in SS Object 10336, and vice-versa.

4. Portions of Procedure Object 608 Relevant to Call and Return (FIG. 472)

The information which Process 610 requires to construct new frames on its MAS Objects 46703 and SS Object 10336 and to transfer control to invoked Procedure 602 is contained in invoked Procedure 602's Procedure Object 608. FIG. 472 is an overview of Procedure Object 608 showing the information used in a Call. FIG. 472 expands information contained in FIGS. 103 and 303; fields that appear in those Figures have the names and numbers used there.

Beginning with Procedure Object Header 10336, this area contains two items of information used in Calls: an offset in Field 47201 giving the location of Argument Information Array 10352 in Procedure Object 608 and a value in Field 47203 specifying the number of gates in Procedure Object 608. Gates allow the invocation of External Procedures 602, that is, Procedures 602 which may be invoked by Procedures 602 contained in other Procedure Objects 608. Procedure Object 608's gates are contained in External Entry Descriptor Area 10340. There are two kinds of gates: those for Procedures 602 contained in Procedure Object 608, and those for Procedures 602 contained in other Procedure Objects 608, but callable via Procedure Object 608. Gates for Procedures 602 contained in Procedure Object 608 are termed Local Gates 47205. Local Gates 47205 contain Internal Entry Offset (IEO) Field 47207 which contains the offset in Procedure Object 608 of Entry Descriptor 47227 for Procedure 602. If Procedure 602 is not contained in Procedure object 472, its gate is a Link Gate 47206. Link Gates 47206 contain Binder Area Pointer (BAP) Fields 47208. A BAP Field 47208 contains the location of an area in Binder Area 30323 which in turn contains a pointer to a Gate in another Procedure Object 608. The pointer in Binder Area 30323 may be either resolved or unresolved. If Procedure 602 is contained in that Procedure Object 608, the Gate is a Local Gate 47205; otherwise, it is another Link Gate 47206.

Procedure Environment Descriptors (PEDS) 10348 contains PEDs 30303 for Procedures 602 contained in Procedure Object 608. Most of the macrostate information for a Procedure 602 may be found in its PED 30303. PED 30303 has already been described, but for ease of understanding, its contents are reviewed here.

K Field 30305 contains the size of Procedure 602's Names.

Largest Name (LN) Field 30307 contains an SDPP

LN Field 30307 contains the Names which has the largest index of any in Procedure 602's Name Table 10350.

PBP Field 30315 is the pointer from which the current PC is calculated. When Procedure 602 is invoked, this value becomes the PBP ABP.

S-interpreter Environment Prototype Pointer (SEPP) Field 30316 contains the location of SEB Prototype Field 30317. When Procedure 602 is invoked, Field 30316 locates SEB 46864 via AAT 30201 in the same manner as SDPP field 30313 locates the invocation's static data.

A Procedure 602's PED 30303 may be located from its Internal Entry Descriptor 47227. A PED 30303 may be shared by several Procedures 602. Of course, in this case, the values contained in shared PED 30303 are the same for all Procedures 602 sharing it. As will be explained in detail later, in the present embodiment, if a calling Procedure 602 does not share a PED 30303 with called Procedure 602, the Call must be mediated. A calling Procedure 602 may make a Neighborhood Call only to Procedures 602 with which it shares a PED 30303.

The next portion of Procedure Object 608 which is of interest is Internal Entry Descriptors 10342. Each Procedure 602 contained in Procedure Object 608 has an Entry Descriptor 47227. Entry Descriptor 47227 contains four fields of interest:

PBP Offset Field 47229 contains the off set from PBP at which the first SIN in Procedure 602's code is located.

Flags Field 47230 contains flags which are checked when Procedure 602 is invoked. Four flags are of interest:

Argument Information Array Present Flag 47235, which is set to TRUE if Procedure 602 has entries in Argument Information Array 10352.

SEB Flag 47237 is set to TRUE if SEPP 47225 is non-null, i.e., if Procedure 602 has a SEB 46864 for its S-interpreter.

Do Not Check Access Flag 47239 is set to TRUE if KOS Call microcode is not to perform protection checking on the actual arguments used to invoke Procedure 602.

PED Offset Field 47231 contains the oftset of Procedure 602's PED 30303 from the beginning of Procedure Object 608.

Frame Size Field 47233 contains the initial size of the Local Storage Portion 10420 of MAS Frame 46709 for an invocation of Procedure 602.

Other areas of interest for Calls are SEB Prototype Area 47241, Static Data Area Prototype 30317, Binder Area 30323, and Argument Information Array 10352. SEB Prototype type Area 47241 and Static Data Area Prototype 30315 contain information used to create a SEB 46864 and a Static Data Block 46863 respectively for Procedure 602. These areas are created on a per-MAS Object 46703 basis. The first time that a Process 610 executes a Procedure 602 in a domain, SEB 46864 and Static Data Block 46863 required for Procedure 602 are created either in MAS Object 46703 belonging to the domain or in another object accessible from MAS Object 46703. SEB 46864 and Static Data Block 46863 then remain as long as MAS Object 46703 exists.

Static Data Prototype 30317 contains two kinds of information: Static Data Links 30319 and Static Data Initialization Information 30321. Static Data Links 30319 contain locations in Binder Area 30323, which in turn contains pointers which may be resolved to yield the locations of data or External Procedures 602. When a Static Data Block 46863 is created for a Procedure 602, the information in Binder Area 30323 is used to create Linkage Pointers 46865. Static Data Initialization Information 30321 contains information required to create and initialize static data in Static Data Storage 46867.

As mentioned in the discussions of Link Gates 47206 and Static Data Links 30319, Binder Area 30323 contains pointers which may be resolved as described in Chapter 3 to yield locations of data and External Procedures 602.

Argument Information Array (AIA) 10352 contains information used by KOS Call microcode to check whether the subject which is invoking Procedure 602 has access to the actual arguments used in the invocation which allows the uses made of the arguments in Procedure 602. This so-called "Trojan horse check" is necessary because a Call may change the domain component of a subject. Thus, a subject which is lacking access of a specific kind to a data item could gain that access by passing the data item as an argument to a Procedure 602 whose DOE gives it access rights that the calling subject itself lacks.

Each Local Gate 47205 in Procedure Object 608 has an element in AIA 10352. Each of these Argument Information Array Elements (AIAEs) 60845 has fields indicating the following:

The minimum number of arguments required to invoke Procedure 602 to which Local Gate 47205 belongs, in Field 47247.

The maximum number of arguments which may be used to invoke Procedure 602, in Field 47249.

The access rights that the invoking subject must have to the actual arguments in order to invoke Procedure 602, in Field 47251.

Field 47251 is itself an array which specifies the kinds of access that the invoking subject must have to the actual arguments it uses to invoke Procedure 602. Each formal argument for Procedure 602 has an Access Mode Array Entry (AMAE) 47255. The order of the AMAEs 47255 corresponds to the order of Procedure 602's formal arguments. The first formal argument has the first AMAE 47255, the second the second, and so forth. An AMAE 47253 is four bits long. There are two forms of AMAE 47253: Primitive Access Form 47255 and Extended Access Form 47257. In the former form, the leftmost bit is set to 0. The three remaining bits specify read, write, and execute access. If a bit is on, the subject performing the invocation must have that kind of primitive access to the object containing the data item used as an actual for the formal argument corresponding to that AMAE 47253. In the Extended Access Form 47257, the leftmost bit is set to 1 and the remaining bits are defined to represent extended access required for Procedure 602. The definition of these bits varies from Procedure 602 to Procedure 602.

5. Execution of Mediated Calls

Having described the portions of MAS Object 46703, SS Object 10336, and Procedure Object 608 which are involved in Calls, the discussion turns to the description of the Mediated Call Operation. First, there is presented an overview of the Mediated Call SIN, and then the implementation of Mediated Calls in the present embodiment is discussed, beginning with a simple Mediated Call and continuing with Cross-Procedure Object Calls and Cross Domain Calls. The discussion closes with a description of microcode-to-software Calls.

a.a. Mediated Call SINs

While the exact form of a Mediated Call SIN is S-language specific, all Mediated Call SINs must contain four items of information:

The SOP for the operation.

A Name that resolves to a pointer to the Procedure 602 to be invoked by the SIN.

A literal (constant) specifying the number of actual arguments used in the invocation.

A list of Names which resolve to pointers to the actual arguments used in the invocation.

If Procedure 602 requires no arguments, the literal will be 0 and the list of Names representing the actual arguments will be empty.

In the present embodiment, Mediated Call and Return SINs are used whenever called Procedure 602 has a different PED 30303 from calling Procedure 602. In this case, the Call must save and recalculate macrostate other than FP and PC, and mediation by KOS Call microcode is required. The manner in which KOS Call microcode mediates the Call depends on whether the Call is a simple Mediated Call, a Cross-procedure Object Call, or a Cross-Domain Call.

b.b. Simple Mediated Calls (FIGS. 270, 468, 469, 470, 471, 472)

When the Mediated Call SIN is executed, S-interpreter microcode first evaluates the Name which represents the location of the called Procedure 602. The Name may evaluate to a pointer to a Gate 47205 or 47206 in another Procedure Object 608 or to a pointer to an Internal Entry Descriptor 47227 in the present Procedure Object 608. When the Name has been evaluated, S-interpreter Call microcode invokes KOS Call microcode, using the evaluated Name as an argument. This microcode first fills in Macrostate Fields 10516, left empty until now, in the current invocation's SS Frame 47003. The microcode obtains the values for these fields from registers in FU 10120 where they are maintained while Virtual Processor 612 of Process 610 which is executing the Mediated Call is bound to JP 10114.

The next step is to determine whether the pointer which KOS Call microcode received from S-interpreter Call microcode is a pointer to an External Procedure. To make this determination, KOS Call microcode compares the pointer's AON 41304 with that of Procedure Object 608 for Procedure 602 making the Call. If they are different, the Call is a Cross-Procedure Object Call, described below. In the case of the Simple Mediated Call, the format field indicates that the location is an Entry Descriptor 47227. KOS Call microcode continues by saving the location of Entry Descriptor 47227 and creating a new Mediated Frame 46947 on current MAS Object 46703 and a new Ordinary SS Frame 10510 on SS Object 10336 for called Procedure 602. As KOS Call microcode does so, it sets Fields 46917 and 46919 in Mediated Frame Header 10414 and Fields 47109 and 47111 in Ordinary SS Frame Header 10514 to the values required by the addition of frames to MAS Object 46703 and SS Object 10336.

New Mediated Frame 46947 is now ready for Linkage Pointers 10416 to the actual arguments used in the Call, so KOS Call microcode returns to S-interpreter Call microcode, which parses the SIN to obtain the literal specifying the number of arguments and saves the literal value. S-interpreter Call microcode then parses each argument Name, resolves it, converts the resulting address to a pointer, and places the pointer in Linkage Pointers Section 10416. When Linkage Pointers Section 10416 is complete, S-Interpreter Call Microcode calculates the new location of FP from the location of the top of Linkage Pointers Section 10416 and places a pointer for the location in the FU 10120 register reserved for FP. At this time, S-interpreter Call microcode also places the new location of the top of the stack in Stack Top Offset Field 46807.

S-interpreter Call microcode then invokes KOS Call microcode to place the value of the literal specifying the number of arguments in MAS Frame Field 46929, to calculate the new value of FHP 46702 and place it in the FU 10120 register reserved for that value, and finally to obtain the state necessary to execute called Procedure 602 from called Procedure 602's Entry Descriptor 47227 and PED 30303. As previously stated, S-interpreter Call microcode saved the location of Entry Descriptor 47227. Using this location, KOS Call Microcode obtains the size of the storage required for local data from Field 47233 and adds that amount of storage to the new MAS Frame 46709. Then KOS Call Microcode uses Field 47231 to locate PED 30303 for Procedure 602. PED 30303 contains the remainder of the necessary information about Procedure 602, and KOS Call microcode copies the location of PED 30303 into PED Pointer Field 46933 and then copies the values of K Field 30305, Last Name Field 30307, NTP Field 30311, and PBP Field 30315 into the relevant registers in FU 10120. KOS Call microcode next translates the pointer in SIP Field 30309 into a dialect number as explained in Chapter 3, and places it in register RDIAL 24212 of FU 10220 and thereupon derives SDP by resolving the pointer in SDPP Field 30313 and a pointer to SEB 46864 by resolving the pointer in SEPP Field 30316. Having performed these operations, KOS Call microcode returns to S-interpreter Call microcode, which finishes the Call by obtaining a new PC, that is, resetting registers in I-stream Reader 27001 in FU 10120 so that the next SIN to be fetched will be the first SIN of called Procedure 602. S-interpreter Call microcode obtains the information required to change PC from Field 47229 in Entry Descriptor 47227 which contains the oftset of the first SIN of called Procedure 602 from PBP.

In the present embodiment, some FU 10120 state produced by the Mediated Call SIN is retained on SS 504 throughout the duration of Procedure 602's invocation. The saved state allows Process 610 to reattempt the Mediated Call if the Call fails before the called Procedure 602 begins executing. When a Mediated Return SIN is executed, it resumes execution on the retained state from the CALL SIN. The Mediated Return is much simpler than the Call. Since all of the information required to resume execution of the invocation which performed the Call is contained in Macrostate 10516 in the calling invocation's SS Frame 47003, Return need only pop the called invocation's frames from current MAS Object 46703 and SS Object 10336, copy Macrostate 10516 47123 from the calling invocation's SS Frame 47003 into the proper FU 10120 registers, translate SIP Value 47141 into a dialect number, and resume executing the calling invocation. The pop operation involves nothing more than updating those pointers in MAS Object 46703 and SS Object 10336 which pointed to locations in the old topmost frame so that they now point to equivalent locations in the new topmost frame.

c.c. Invocations of procedures 602 Requiring SEBs 46864 (FIGS. 270, 468, 469, 470, 471, 472)

If a Procedure 602 requires a SEB 46864, this fact is indicated by Flag Field 47237 in Procedure 602's Entry Descriptor 47227. PED 30303 for such a Procedure 602 contains SEPP Field 47225, whose value is a unresolved pointer. The manner in which a SEB 46864 is created for Procedure 602 and SEPP field 47225 is translated into SEP, a pointer which contains the location of SEB 46864 and is saved as part of the invocation's macrostate on SS 10336, is similar to the manner in which a Static Data Block 46863 is created and the non-resolvable pointer contained in SDPP field 47225 is translated into SDP. The first time that a Procedure 602 requiring a SEB 46864 is invoked on a MAS Object 46703, a SEB 46864 is created for the Procedure 602 and an AATE 46857 is created which associates the non-resolvable pointer in SEPP field 47225 and the location of SEB 46864. That location is the value of SEP when the procedure is executing on MAS object 46703. On subsequent invocations of Procedure 602, AATE 46857 serves to translate the value in SEPP field 47225 into SEP.

d.d. Cross-Procedure Object Calls (FIGS. 270, 468, 469, 470, 471, 472)

A Mediated Call which invokes an External Procedure 602 is called a Cross-Procedure Object Call. As previously mentioned, KOS Call microcode assumes that any time the Name representing the called Procedure 602 in a Mediated Call SIN resolves to the location of a Gate that the Call is to an External Procedure 602. As long as newly-called External Procedure 602 has the same DOE as calling Procedure 602, Cross-Procedure Object Calls differ from the Simple Mediated Call only in the manner in which called Procedure 602's Entry Descriptor 47227 is located. Once KOS Call microcode has determined as described above that a Mediated Call is a Cross-Procedure Object Call, it must next determine whether it is a Cross-Domain Call. To do so, KOS Call microcode compares the DOE Attribute of called Procedure 602's Procedure Object 608 with the domain component of the current subject KOS Call microcode uses Procedure Object 608's AON 41304 to obtain Procedure Object 608's DOE from Field 41521 of its AOTE 41306, and it uses the ASN for the current subject, stored in an FU 10120 register, to obtain the current subject's domain component from AST 10914. If the DOE and the current subject's domain component differ, the Call is a Cross-domain Call, described below; otherwise, the Call locates the Gate 47205 or 47206 specified by the evaluated Name for called Procedure 602 in its Procedure Object 608. If the Gate is a Local Gate 47205, the Call uses Entry Descriptor Offset Field 47207 to locate Entry Descriptor 47227 belonging to Called Procedure 602 and then proceeds as described in the discussion of a Simple Mediated Call.

If the Gate is a Link Gate 47206, KOS Call microcode obtains the pointer corresponding to Link Gate 47206 from Binder Area 47245 and resolves it to obtain a pointer to another Gate 47205 or 47206, which KOS Call microcode uses to repeat the External Procedure 602 call described above. The repetitions continue until the newly-located gate is a Local Gate 47205, whereupon Call proceeds as described for Simple Mediated Calls.

e.e. Cross-domain Calls (FIGS. 270, 408, 418, 468, 469, 470, 471, 472)

If a called Procedure 602's Procedure Object 608 has a DOE attribute differing from that of calling Procedure 602's Procedure Object 608, the Call is a Cross-domain Call. The means by which KOS Call microcode determines that a Mediated Call is a Cross-Domain Call have previously been described; If the Call is a Cross-Domain Call, KOS Call microcode must inactivate MAS Object 46703 for the domain from which the Call is made, perform trojan horse argument checks, switch subjects, place a Cross-domain Frame 47039 on SS object 10336, and locate and activate MAS Object 46703 for the new domain before it can make a Mediated Frame 46947 on new MAS Object 46703 and continue as described in the discussion of a Simple Mediated Call.

Cross-domain Call microcode first inactivates the current MAS Object 46703 by setting Domain Active Flag 46804 to FALSE. The next step is the trojan horse argument checks. In order to perform trojan horse argument checks, Cross-domain Call must have pointers to the actual arguments used in the cross-domain invocation. Consequently, Cross-domain Call first continues like a non-cross-domain Call: it creates a Mediated Frame Header 10414 on old MAS Object 46703 and returns to S-interpreter microcode, which resolves the Names of the actual arguments, converts the resulting addresses to pointers, and places the pointers in Linkage Pointers 10416 above Mediated Frame Header 10414. However, the macrostate for the invocation performing the call was placed on SS Object 10336 before Mediated Frame Header 10414 and Linkage Pointers 10416 were placed on old MAS Object 46703. Consequently, when calling Procedure 602 resumes execution after a Return, it will resume on MAS Frame 46709 preceding the one built by Cross-domain Call microcode.

Once the pointers to the actual arguments are available, Cross-domain Call Microcode performs the trojan horse check. As described in the discussion of Procedure Object 608 and illustrated in FIG. 472, the information required to perform the check is contained in AIA 10352 Each Local Gate 47205 in Procedure Object 608 has an AIAE 47245, each formal argument in Local Gate 47205's procedure has an entry in AIAE 47245's AMA 47251, and the formal argument's AMAE 47253 indicates what kind of access to the formal argument's actual argument is required in called Procedure 602.

Field AIA OFF 47201 contains the location of AIA 10352 in Procedure Object 608, and using this information and Local Gate 47205's offset in Procedure Object 608, Cross-domain Call microcode locates AIAE 47245 for Local Gate 47205. The first two fields in AIAE 47245 contain the minimum number of arguments in the invocation and the maximum number of arguments. Cross-domain Call microcode checks whether the number of actual arguments falls between these values. If it does, Cross-domain Call microcode begins checking the access allowed individual arguments. For each argument pointer, Cross-domain Call microcode calls LAR microcode to obtain the current AON 41304 for the pointer's UID and uses AON 41304 and the ASN for Process 610's current subject (i.e., the caller's subject) to locate an entry in either APAM 10918 or ANPAT 10920, depending on whether the argument's AIAE specifies primitive access (47255) or extended access (47257) respectively. If the information from APAM 10918 or ANPAT 10920 confirms that Process 610's current subject has the right to access the argument in the manner required in called Procedure 602, the Trojan Horse microcode goes on to the next argument. If the current subject has the required access to all arguments, the trojan horse check succeeds and the Cross-domain Call continues. Otherwise, it fails and Cross-domain Call performs a microcode-to-software Call as explained below.

Next, Cross-domain Call microcode places Cross domain State 10513 on SS Object 10336. As explained in the discussion of SS object 10336, Cross-domain State 10513 contains the information required to return to the caller's frame on former MAS Object 46703. Having done this, Cross-domain Call microcode changes subjects. Using the current subject's ASN, Cross-Domain Call microcode obtains the current subject from AST 10914, replaces the subject's domain component with DOE Attribute 41225 for called Procedure 602's Procedure Object 608, and uses AST 10914 to translate the new subject thus obtained into a new ASN. That ASN then is placed in the appropriate FU 10120 register.

After the subject has been changed, Cross-domain Call microcode uses Domain Table 41801 to translate the DOE of called Procedure 602 into a domain number. Cross-domain Call microcode then uses the domain number as an index into Array of MAS AONs 46211 in VPSB 614 for Virtual Processor 612 belonging to Process 610 making the cross-domain call. The entry corresponding to the domain number contains AON 41304 of MAS Object 46703 for that domain.

Having located the proper MAS Object 46703, Cross-domain Call microcode uses STO field 46807 in MAS Header 10410 belonging to the new domains MAS Object 46703 to locate the top of the last MAS Fram 46709. It then saves the value of FHP 46702 used in the preceding invocation in a FU 10120 register, adds a Mediated Frame Header 10414 to the top of MAS Object 46703, and calculates a new FHP 46702 which points to new Mediated Frame Header 10414. KOS Cross-Domain Call microcode then places the old value of FHP 46702 in FHP Value Field 47151 of SS Object 10336 and the old value of STO 46704 (pointing to the top of the last complete MAS Frame 46709 on previous MAS Object 46703) in Field 47153 of Cross-Domain State 10513 and fills in Mediated Frame Header 10414 fields as follows: Result of Cross-domain Call Field 46903 is set to TRUE, Previous Frame Offset Field 46917 is set to 0, and Dynamic Back Pointer Field 46931 is set to the saved value of FHP 46702. Dynamic Back Pointer Field 46931 thus points to the header of the topmost Mediated Frame 46947 on the previous MAS Object 46703. The values of the remaining fields are copied from Mediated Frame Header 10414 which Cross-Domain Call created on previous MAS Object 46703.

Cross-domain Call microcode next copies the argument pointers for the formal arguments from the top of previous MAS Object 46703 to new Mediated Frame 46947 and calculates FP. Cross-domain Call Microcode finishes by returning to S-interpreter Call microcode, which completes the Call as described for Simple Mediated Calls.

Except for the work involved in transferring to a new MAS Object 46703, Cross-domain Return is like other Returns from Mediated Calls. Old FHP 46701, from Field 47151 of Cross-Domain State 10513, and old STO 46704, from Field 47153 of Cross-domain State, are placed in FU 10120 registers. Then the frames belonging to the invocation that is ending are popped off of SS Object 10336 and off of MAS Object 46703 belonging to the domain of called Procedure 602, and MAS Object 46703 is inactivated by setting Domain Active Flag 46804 to FALSE. Then KOS Cross-domain Return microcode uses old FHP 46701 and old STO 46704 to locate MAS Object 46703 being returned to and the topmost Mediated Frame 46947 on that MAS Object 46703. MAS Object 46703 being returned to is activated, and finally, the contents of Macrostate 10516 belonging to the invocation being returned to are placed in the appropriate registers of FU 10120 and execution of the invocation resumes.

f.f. Failed Cross-Domain Calls (FIGS. 270, 468, 469, 470, 471, 472)

A Cross-Domain Call as described above may fail at several points between the time that the calling invocation begins the call and called Procedure 602 begins executing. On failure, Cross-Domain Call microcode performs a microcode-to-software Call. KOS Procedures 602 invoked by this Call may remedy the reason for the Cross Domain Call's failure and reattempt the Cross-domain Call. This is possible because the implementation of Cross Domain Call in CS 10110 saves sufficient FU 10120 state to allow Process 610 executing the Cross-Domain Call to return to the invocation and the Mediated Call SIN from which the Cross-Domain Call began. On failure, the invocation's MAS Frame 46709 may be located from the values of STO Field 47153 and FHP Field 47151 in Cross-Domain State 10513, and the Mediated Call SIN may be located by using information saved in FU 10120 state 6. Neighborhood Calls (FIGS. 468, 469, 472)

As previously mentioned, Procedures 602 called via Neighborhood Calls must have the same PED 30303 as calling Procedure 602. The only macrostate values which are not part of PED 30303 are PC and FP; consequently, Neighborhood Call need only save PC and FP of the invocation performing the call and calculate these values for the new invocation. In addition, Neighborhood Call saves STO 46704 in order to make it easier to locate the top of the previous invocation's Neighborhood Frame 46947. Neighborhood Return simply restores the saved values. Since the macrostate values copied from or obtained via PED 30303 do not change during the sequence of invocations, and therefore need not be saved on SS Object 10336, Neighborhood Calls do not have SS Frames 47003.

7. Calls From Microcode (FIGS. 270, 468, 469, 470, 471, 472, 473)

Often, microcode executing on FU 10120 or EU 10122 encounters situations which the microcode cannot resolve. Such situations are termed faults. In some cases, these faults are resolved by Calls from microcode to Procedures 602. For example, if a reference to an operand produces a Protection Cache 10234 miss, and KOS Protection Cache Miss microcode which loads Protection Cache 10234 from APAM 10918 cannot find an APAME 42106 for the current subject's ASN and AON 41304 of the object represented by the operand, then APAM 10918 must be updated from LAUDE 40906 belonging to the operand's object. As explained in the discussion of CS 10110's protection system, the updating operation is performed by a KOS Access Control System Procedure 602 which is invoked from KOS Protection microcode. Similarly, when S-interpreter microcode detects conditions such as arithmetic overflows or underflows, the microcode must invoke Procedures 602 which locate and invoke Signal Handler Procedures 602 for these conditions Calls from microcode to Procedures 602 are accomplished by means of a table, called the Kernel Fault Table (KFT), which allows microcode to locate a Procedure 602 which deals with the fault, and a packet of data called the Fault Packet, which microcode uses to pass information to the Procedure 602. FIG. 473 contains representations of the KFT and the Fault Packet. KFT 47301 is comprised of an Array 47305 of KFT Entries (KFTEs) 47307 and a Field 47303 which contains the number of entries in Array 47305. Each KFTE 47307 corresponds to a fault which cannot be resolved without assistance from Procedures 602. Each fault has a number, and the fault's KFTE 47307 has that number as its Index 47309. The fault's KFTE 47307 contains the location of the Gate in a Procedure Object 901 containing KOS Procedure 602 which handles the fault. Procedure 602's location may be expressed with an AON 41304 because all KOS fault-handling Procedures 602 are contained in objects which are wired active when CS 10110 is initialized.

Fault Packet 47311 comprises the following fields:

UID for Status Object Field 47313 and Condition Code Field 47317 together form an internal identifier for a condition. The internal identifier is implementation-dependent, and a KOS Procedure 602 translates it into a standard condition identifier which is valid across all CSs 10110. Status Object Field 47313 contains UID 40401 of an object which contains error messages for the fault. Condition Code Field 47317 contains an integer which identifies a condition for which a user can define a condition handler.

Fields 47319 and 47321 define Field 47323, which contains information about the fault. Field 47319 defines Field 47323's maximum size, and Field 47321 defines its current size.

Microcode-to-software Call uses the above data bases as follows: when a microcode fault requires the invocation of a Procedure 602, the faulting microcode makes a Fault Packet 47311, and puts it on top of current MAS Object 46703 belonging to Process 610 whose Virtual Processor 612 is bound to JP 10114. The faulting microcode then invokes KOS Signaller microcode, giving it as arguments the location of Fault Packet 47311, an integer value specifying the kind of fault, a flag indicating whether execution can resume at the point where the fault occurred, and the location of KFT 47301. KOS Signaller microcode saves micromachine state in Microstate Portion 10520 of topmost SS Frame 47003 of Process 610's SS Object 10336 and then uses the integer argument to locate the fault's KFTE 47307. If the fault is one which is handled by KOS Procedures 602, KFTE 47307 contains a Resolved Pointer to KOS Procedure 602 which handles the fault. Using the pointer obtained from KFT 47301, Signaller microcode invokes KOS Mediated Call microcode, beginning the Mediated Call at the point where the location of called Procedure 602 is to be determined. From this point, Mediated Call proceeds as described above.

If the fault is one for which CS 10110 users may define condition handlers, KFTE 47307 contains a pointer to a Signal Starter Procedure 602. As will be described in detail in the discussion of conditions, Signal Starter Procedure 602 locates Signaller Procedure 602 for current MAS Object 46703's domain which in turn locates a user-defined Handler Procedure 602.

8. Terminating Several Invocations

In Return SINs, the number of invocations terminated and the location at which the execution of the Procedure 602 being returned to continues are fixed by the definition of the SIN: only the invocation which executes the Return SIN is terminated, and execution of Procedure 602 being returned to continues with the SIN immediately following the Call SIN. However, there are some situations which require CS 10110 to terminate more than one invocation and to return to locations other than the SIN following calling Procedure 602's Call SIN. These situations may occur when CS 10110 executes a Non-local GOTO SIN, when a condition arises in the course of the execution of a program, and when an error requires CS 10110 to "crawl out," i.e., to abandon a portion of a Process 610's MAS 502.

Certain high-level languages allow the programmer to transfer control from a currently-executing invocation of a Procedure 602 to any location in any Procedure 602 with an invocation on MAS 502 of Process 610 executing first Procedure 602. This operation is known as a non-local GOTO and is implemented by means of a Non-local GOTO SIN in the high-level language's S-language. As with the Mediated Call SIN, the form of the Non-local GOTO SIN may vary from S-language to S-language, but all Non-local GOGO SINs function as described below. When a Non local GOTO SIN is executed, all invocations between the invocation that executes the Non-local GOTO SIN and the invocation to which control is transferred are terminated. Since these invocations have no control over when they are terminated, the program may be left in an undefined state unless special measures are taken to prevent it. For example, an invocation of a Procedure 602 may have locked a table and may have been terminated by a Non-local GOTO SIN executed by another Procedure 602 before first Procedure 602 could unlock the table, thus permanently barring the table to other Processes 610.

Conditions are situations which are possible results of any execution of an operation, but whose occurrence cannot be predicted. For example, one such condition is the end of file condition, which occurs when a read operation reaches the end of a data file. Any execution of the read operation may encounter the end of the file, and thus cause the end of file condition to occur, but neither the writer of the program nor the compiler can predict which read operation will cause the condition to occur, since its occurrence depends on the size of the file and the kind of read operations performed on it. To deal with this problem, CS 10110 provides means for detecting such conditions and automatically invoking Procedures 602 which deal with the condition. Such Procedures 602 are termed Condition Handlers. A given Condition Handler may be used in many invocations, and when the condition arises, the Condition Handler must be located and invoked, and sometimes, a number of invocations must be terminated. In this case, handling the condition involves the execution of a Non-local GOTO operation.

Conditions and non-local GOTO are implemented by means of lists in MAS Frames 46709; the discussion will therefore first present these lists and then discuss non-local GOTOs and conditions in detail.

a.a. Lists in MAS Frames 46703 (FIG. 474)

FIG. 474 shows a Mediated Frame 46947 with the three kinds of lists used to implement non-local GOTOs and conditions. In some CS 10110 implementations, similar lists may be used in Neighborhood Call Frames 46949 as well. In any MAS Frame 46709, List Area 46943 for these lists is included in Local Storage 10420, and may not be used for other purposes as long as MAS Frame 46709 exists.

Turning to the lists as they are implemented in Mediated Frames 46709, lists made up of Catch Nodes 47409 contain locations in Procedure 602 being executed by the invocation to which Mediated Frame 46709 belongs to which Non_local GOTO SINs executed by following invocations may return. Lists made up of Clean Up List Nodes 47405 contain pointers to Procedures 602 that are to be executed as Mediated Frame 46947's invocation is terminated; those made up of Condition List Nodes 47401 contain pointers to Procedures 602 which are condition handlers established in Mediated Frame 46947's invocation. Each of these lists is singly-linked, and the offset of the first node in each list is contained in a field in Mediated Frame Header 10414. Catch Node List Offset Field 46927 contains the offset of Catch Node 47401*a*, the first node in that list, Clean Up Node List Offset field 46925 contains the offset of Cleanup Node 47405, the only node in that list, and Condition List Offset Field 46923 contains the offset of Condition List Node 47401*a*, the first node in that list. The fields in each kind of node will be discussed in detail where relevant; here, it need only be noted that each of the nodes contains a Next Node Field 47402, which contains the offset of the next node in the list to which the node belongs.

b.b. Implementation of Non-local GOTO (FIG. 474)

There are two main operations for the Non-local GOTO: establishing the location in the Procedure 602 and the invocation at which execution is to continue, and executing a non-local GOTO SIN which continues execution at a specified location and invocation, abandoning the invocation that executed the Non-local GOTO SIN and any invocations between that invocation and the invocation in which execution is to continue.

a.a.a. Establishing Location to which Non-local GOTO may Transfer Control (FIG. 474)

Locations are established and disestablished by KOS Procedures 602. Catch Procedure 602 establishes a location, and Revert Catch Procedure 602 disestablishes it. Either Procedure 602 may be invoked by any Procedure 602 written in a high-level language which requires a Non-local GOTO SIN. The discussion deals first with Catch and Revert Catch, then with Cleanup Procedures 602, and finally with the execution of the Non local GOTO SIN.

Beginning with the KOS Catch Procedure 602, this Process Manager Procedure 602 creates a label value, i.e., establishes a location to which a Non-local GOTO SIN can return. The location is specified by means of a pointer to a SIN and a value which specifies the current MAS Frame 46709. When a Catch Procedure 602 is executed, the label value is created, placed in a Catch List Node 47411, and then returned to the calling Procedure 602, which can then assign the label value to a label variable. When the label variable is used in a non-local GOTO, the microcode which executes the non-local GOTO compares the variable's contents with Catch Nodes 47411 until the a matching Catch Node 47411 is found. The MAS Frame 46709 containing Catch Node 47411 is MAS Frame 46709 for the invocation at which execution is to continue, and the pointer specifies the next SIN to be executed.

Turning to the detailed illustration of Catch Node 47411 in FIG. 474, it is seen that the node contains the following fields:

Pointer to Reentry Point Field 47413, which contains a resolved pointer to the SIN at which execution is to continue when the Non-local GOTO SIN returns to Procedure 602 being executed when Catch Node 47411 is established.

Frame Label Field 47415, which contains a sequencer value generated by Frame Label Sequencer 46819.

Frame Offset Field 47417, which contains the offset of Frame 46947 in MAS Object 46703.

Stack UID Field 47419, which contains the UID of MAS Object 46703 containing MAS Frame 46947.

The values in fields 47413, 47415, 47417, and 47419 make up the label value. The frame label sequencer value in Fieldd 474B15 ensures that the label value specifies a unique Mediated Frame 46947 in MAS Object 46703, and thereby prevents a non-local GOTO from confusing invocations whose frames occupy the same location in MAS Object 46703 at different times.

Catch Procedure 602 takes three arguments: the PC to which the non-local GOTO is to return, a pointer to the location in List Area 46943 which is to contain Catch Node 47411, and a status variable. Catch Procedure 602 fills fields in Catch List Node 47411 in this manner: first, it uses PBP to translate PC into a resolved pointer and places the pointer in Field 47413; Unless Frame Label Field 46935 of Mediated Call Frame 46947 is set to 0, catch Procedure 602 obtains a value for Frame Label Field 47415 in Catch List Node 47411 from Frame Label Field 46935. If Frame Label Field 46935 is set to 0, Catch Procedure 602 does a Ticket Operation on Frame Label Sequencer 46819 and places the returned value in both Frame Label Field 46935 and Frame Label Field 47415. Catch Procedure 602 then obtains the values of Frame Offset Field 47417 and of Pointer To Mediated Frame Field 47409 using the current value of FHP 46702. Next, Catch List Node 47411 is placed at the head of the catch list in Mediated Frame 46947 belonging to the invocation which called Catch Procedure 602. Catch Node Offset Field 46927 receives the new node's offset from FHP 46702, and Next Node Field 474B02 receives the offset of the old first Catch List Node 47411 on the list.

Revert Catch Procedure 602 simply removes a Catch List Node 47411 from the catch list. Revert catch Procedure 602 takes two arguments: the PC value which identifies the location at which execution is to continue, and a status variable. Revert Catch uses the PC value to locate the desired Catch List Node 47411 in the catch list belonging to Mediated Frame 46947 from which the Revert Catch Procedure was invoked and removes that node from the catch list.

Cleanup Handlers are Procedures 602 which must be executed before a non-local GOTO terminates an invocation. Users may establish Cleanup Handlers for any invocation, and KOS provides a default Cleanup Handler which is executed if there are no user-defined Cleanup Handlers. Each user-defined Cleanup Handler is represented by a Cleanup List Node 47421 on the Cleanup List for the invocation's Mediated Frame 46947. A Cleanup List Node 47421 has two fields: Next Node Field 47401 and Pointer To Cleanup Handler Field 47423, which contains a pointer to Cleanup Handler Procedure 602. Cleanup Nodes 47421 are established by the KOS Establish Cleanup Handler Procedure 602, which takes three arguments: a pointer to a Cleanup Handler Procedure 602, a pointer to a location in List Area 46943 which is to contain Cleanup List Node 47421, and a status variable. Establish Cleanup Handler Procedure 602 uses the pointer to the location in List Area 46943 belonging to the invocation which invoked Establish Cleanup Handler Procedure 602 to locate new Cleanup List Node 47421, takes the pointer to Cleanup Handler Procedure 602, places it in Cleanup List Node 47421, and links Cleanup List Node 47421 into the head of the Cleanup List, placing Cleanup List Node 47421's offset in Cleanup List Offset Field 46925 for Mediated Frame 46947 for which it creates Cleanup List Node 47421. Revert Cleanup Handler Procedure 602 takes only the procedure pointer argument. It uses the argument to locate the proper Cleanup List Node 47421 on Mediated Frame 46947 belonging to the invocation which called revert Cleanup Handler Procedure 602 and removes Cleanup List Node 47421 from the list.

b.b.b. Implementation of the Non-local GOTO SIN (FIG. 474)

The Non-local GOTO SIN consists of the SOP and a single Name. The Name evaluates to a label value as described above. After the S-interpreter microcode for the SIN has evaluated the Name, it invokes KOS non-local GOTO microcode. This microcode searches MAS 502 belonging to Process 610 whose Virtual Processor 612 is currently bound to JP 10114 for a Catch List Node 47411 whose Field 47413 matches the pointer represented by the Name. The search begins with the topmost Mediated Frame 46947 of Process 610's MAS 502 and continues down the MAS 502 until the proper Catch List Node 47411 is located When Non-local GOTO Microcode has determined that a Mediated Frame 46947 does not contain a Catch List Node 47411 whose Field 47413 matches that specified by the GOTO SIN, the invocation must be terminated. In this case, KOS Non-local GOTO Microcode causes any Cleanup Handlers for the invocation to be executed. It does so by taking each Cleanup List Node 47421 in turn and passing the handler pointer in Field 47423 to KOS Mediated Call microcode in the manner described in the discussion of microcode to software Calls. Each Procedure 602 specified in the Cleanup List is thus executed in turn. After all Cleanup Handler Procedures 602 have been executed, KOS Non-local GOTO microcode invokes KOS Mediated Return Microcode. This microcode terminates the invocation as described in the discussion of Mediated Return, restores the previous invocation's macrostate, and then returns to KOS non-local GOTO microcode, which examines the next Mediated Frame 46947 as described above.

When KOS Non-local GOTO microcode finds a Mediated Frame 46947 whose catch list contains a Catch List Node 47411 whose Field 47413 match the label value, the microcode sets PC Information Field 47145 in SS Frame 47003 corresponding to Mediated Frame 46947 to the PC value specified in the label value and then invokes Mediated Return microcode, which causes the invocation to which Mediated Frame 46947 belongs to resume execution at the location specified in the label value.

c.c. Conditions

As stated above, conditions are situations which may occur as a result of any execution of an operation, but whose occurrence cannot be predicted. In CS 10110, conditions may be detected by hardware, microcode, or Procedures 602. For instance, in the present embodiment, the end of file condition previously described is detected by Procedures 602 in the EOS file management system, while EU 10122 hardware detects the container size exceeded condition, i.e., an attempt to write values to memory whose size in bits exceeds the size specified by the value's logical descriptor.

a.a.a. Establishing Condition Handlers (FIG. 474)

When a condition occurs, it is handled by default Condition Handlers provided by CS 10110 or by Condition Handlers provided by the user. Default Condition Handlers are located by means of a table which in turn is located by Static Condition Handler Pointer Field 46843 in MAS object 46703. KOS has Procedures 602 which allow users to provide Condition Handlers and to removes previously-provided Condition Handlers. These Procedures 602 work by adding Condition List Nodes 47401 to condition lists and removing them from condition lists; consequently, the discussion of these Procedures 602 will commence with a detailed discussion of Condition List Nodes 47401.

Condition List Node 47401 contains three items of information: a Condition Identifier 47315, a pointer to Condition Handler Procedure 602, and a pointer to a MAS Frame 46709 containing information used by Condition Handler Procedure 602 when it is executed. Condition Identifier 47315 has two parts: a Status Object UID 40401, stored in Field 47403, identifying both a class of conditions and an object which contains information relating to the class, and a Condition Code, stored in Field 47405, which identifies a condition in a class. Status Object UID 40401 and the Condition Code specifying a given condition are assigned to that condition by KOS. The pointer to the Condition Handler Procedure 602 is contained in Field 47407, and the pointer to MAS Frame 47416 is contained in Field 47409. Next Node Field 47402, finally, contains the location of the next node in the condition node list.

KOS Set Condition Procedure 602 establishes a Condition Node 47401. Procedure 602 takes three arguments:

- A variable containing a value for Condition Identifier 47315, a pointer to Handler Procedure 602, and a pointer to a MAS Frame 46709.
- A pointer to the portion of List Area 46943 in which Condition List Node 47401 is to be located.
- A status variable. Using the pointer argument to locate Condition List Node 47401, set condition Procedure 602 fills in Condition List Node 47401's fields from the first argument and links Condition List Node 47401 into the head of the Condition List. At the end of the operation, Condition List Offset Field 46923 in Mediated Frame 46947 contains new Condition List Node 47401's offset and Next Node Field 47402 in new Condition List Node 47401 contains the offset of the previous first Condition List Node 47401 on the list. There may be more than one Condition List Node 47401 for a given condition on the list, but only the Condition Handler Procedure 602 specified in the most recently set Condition List Node 47401 for the condition will be executed when the condition occurs.

The KOS Revert Condition Procedure 602 removes a Condition List Node 47401 from the condition node list. Revert Condition Procedure 602 takes three arguments: Condition Identifier 47315 for the condition to be removed, a variable for the contents of the condition's Condition List Node 47401, and a status variable. Revert Condition Procedure 602 uses Condition List Offset Field 46923 to locate the first Condition List Node 47401 in the List and then searches the List until it locates the first Condition List Node 47401 whose Status Object UID Field 47403 and Condition Code Field 47405 contain the same values as those which Revert Condition Procedure 602 received as arguments. When it locates Condition List Node 47401, it removes it from the Condition List and returns its contents in the variable argument.

b.b.b. Signallers and the Execution of Condition Handlers (FIGS. 270, 468, 469, 470, 471, 472, 473, 474)

Condition Handler Procedures 602 are located and invoked by special KOS Procedures 602 called Signallers. Each domain entered by a Process 610 has a Signaller, and each MAS Object 46703 belonging to a Process 610 has a pointer to the Signaller for its domain in Signaller Pointer Field 46813. Given a condition identifier as an argument, domain Signaller Procedure 602 locates that condition's Condition List Node 47401. If a condition is detected by a Procedure 602, that Procedure 602 may invoke Signaller Procedure 602 directly; if the condition is detected by hardware or microcode, Signaller Procedure 602 must be located and invoked by microcode. The later invocations take place as follows: microcode which detects conditions for which user-defined signal handlers may exist invokes Signaller microcode, which performs a microcode-to-software Call to a KOS Signal Starter Procedure 602; this Procedure 602 converts the implementation-dependent Condition Identifier 47315 it received from Signaller microcode to a standard condition identifier and invokes another KOS Procedure 602, a Signaller Locator, which takes the standard Condition Identifier 47315 and a pointer to Process 610's current MAS Object 46703 as arguments, and which then locates the domain Signaller using the pointer in Signaller Pointer Field 46813 and invokes the domain Signaller with the standard Condition Identifier 47315.

Once the domain Signaller is invoked, it searches for a Condition Handler whose Condition Identifier 47315 matches the one the domain Signaller received as an argument. The domain Signaller begins its search with the Static Condition Handler Table, located via Static Handler Table Pointer Field 46843. If it finds an entry in the table with a matching Condition Identifier 47315, the search ceases immediately, if there is no such entry, the domain Signaller begins searching condition lists for a Condition List Node 47401 whose Condition Identifier 47315 matches that specified in the Signaller's invocation. Starting at the top of MAS Object 46703 for the domain, domain Signaller Procedure 602 searches Mediated Frames 46947 for the most recent sequence of invocations in MAS Object 46703's domain. Each Mediated Frame 46947's condition list is searched starting with the first Condition List Node 47401. If a Condition List Node 47401 is found whose Condition Identifier 47315 matches the one which domain Signaller Procedure 602 received as an argument, domain Signaller Procedure 602 invokes Condition Handler Procedure 602 specified in Pointer to Handler Procedure Field 47407 and ceases to search.

If a sequence of Mediated Frames 46947 for invocations in MAS Object 46703's domain have been searched without finding the proper Condition List Node 47401, the search for a matching Condition List Node 47401 must cross domains. Domain Signaller Procedure 602 for the domain which has just been searched uses Dynamic Back Pointer Field 46931 to locate MAS Object 46703 for the next domain and then invokes Signaller Locator Procedure 602 described above. That procedure locates and invokes the new domain's Signaller and the new domain's signaller continues the search as described above, until it locates a matching Condition List Node 47401 or must invoke another domain's Signaller. Before the search reaches the bottom of Process 610's MAS 502, the Signaller is guaranteed to find a default Signal Handler for the condition. For example, such a default signal handler may be contained in a Mediated Frame 46947 at the bottom of MAS Object 46703 for the EOS domain.

What happens when the Handler Procedure 602 specified in Condition Node 47401 is invoked depends on Procedure 602. Like any other Procedure 602, a Condition Handler may simply execute and return, perform a non-local GOTO, or crawl out. Crawl outs are explained below; Non-local GOTOs work as previously described; in the case of the return, domain Signaller Procedure 602 and the Procedures 602 invoked to locate it also return, and the invocation in which the condition arose continues executing. Finally, a Condition Handler may continue signalling, in which case the Handler returns to the domain Signaller, but the domain Signaller, instead of returning, continues searching until it finds another Handler for the condition.

d.d. Crawl Outs (FIGS. 270, 468, 469, 470, 471, 472, 473, 474)

Occasionally, an invocation destroys a portion of Process 610's MAS 502. For example, a compiler may erroneously produce Name Table Entries (NTEs) 30401 which contain false offsets from FP and when Procedure 602 to which these NTEs 30401 belongs is invoked, the false offsets may cause Procedure 602's invocation to overwrite information in the invocation's Mediated Frame Header 10414 or in some other invocation's Mediated Frame 46947. The domain protection mechanism prevents an invocation from doing more than destroying that portion of Process 610's MAS 502 which is contained in MAS Object 46703 for the domain in which Process 610 is executing in the invocation, but within a domain, it may no longer be possible to execute Return or Non-local GOTO SINs. When this occurs, the KOS Crawl Out operation makes it possible to return to domain Signaller Procedure 602 belonging to MAS Object 46703 containing Mediated Frame 46947 for the last cross-domain invocation in that portion of Process 610's MAS 502 which was destroyed. In the present embodiment, the Crawl Out operation uses KOS Signaller microcode and Mediated Return microcode.

The crawl out operation commences when KOS microcode detects a situation requiring a crawl out or when a KOS Crawl Out SIN, consisting simply of an SOP, is executed. in both cases, the first result is the invocation of Signaller microcode. Signaller microcode creates a Fault Packet 47311 for the Crawl Out as for other conditions, but if the value of Condition Code Field 47317 indicates a Crawl Out, Signaller microcode does not push Fault Packet 47311 onto MAS Object 46703 Instead, it saves Fault Packet 47311's contents in FU 10120 registers and invokes Crawl Out microcode. Crawl Out microcode abandons the sequence of Mediated Frames 46947 following the last Cross-domain Call made by Process 610. It does so by using Previous Cross-domain Frame Field 47119 in the top SS Frame 47003 in Process 610's SS object 10336 to locate Cross-Domain Frame Header 47157 which begins the sequence of SS Frames 47003 for mediated invocations in the domain, using Previous Cross-domain Frame Header Field 47161 to locate Cross-Domain Frame Header 47157 for the sequence of invocations which preceded those which the crawl out operation is abandoning, and using Top Domain Frame Offset Field 47113 in the latter Cross-domain Frame Header 47157 to locate SS Frame 47003 for the last mediated invocation in the previous domain. Once Crawl-out microcode has found SS Frame 47003, it copies its Macrostate 10516 into FU 10120 registers and branches to the portion of Mediated Return microcode which does Cross-domain Returns. Because Crawl Out microcode has loaded Macrostate belonging to the last mediated invocation in the previous domain into FU 10120 registers, Cross-domain Return returns to that invocation's MAS Frame 46709, and all MAS Frames 46709 created since the the last Cross domain Call on MAS Object 46703 belonging to the domain in which Process 610 was executing when the Crawl Out began are simply abandoned. Such abandonment is necessary because the damaged condition of MAS Object 46703 which causes the Crawl Out condition to arise makes all information in MAS Object 46703 unreliable.

Mediated Return microcode checks the information which the Crawl Out microcode copied into FU 10120 registers, and if a Crawl Out is indicated, Mediated Return microcode makes a Fault Packet 47311 with the proper information for a Crawl Out. Mediated Return microcode then uses new Fault Packet 47311 to invoke Signaller microcode, which in turn brings about the invocation of domain Signaller Procedure 602 for MAS Object 46703 containing Mediated Frame 46947 from which the last Cross-Domain Call was made, as explained in the discussion of conditions. If Process 610's MAS has a Condition Handler Procedure 602 for Crawl Outs, the Handler Procedure 602 will be found and invoked as for any other condition. When the Handler Procedure 602 is finished, Process 610 may resume execution of the mediated invocation from which the last Cross-Domain Call was made.

9. Interrupts

As mentioned in the general discussion of Processes 610, a process-level interrupt occurs when one Process 610 asynchronously causes itself or another Process 610 to perform some action. In CS 10110, process-level interrupts are established by making PETEs 44909, and occur when the advance of an Event Counter 44801 causes interrupted Process 610 to invoke a Procedure 602 specified by PETE 44909 for the interrupt. The behavior of process-level interrupts in CS 10110 is affected by the domain protection system. Process-level interrupts are established in the domain specified by the domain component of Process 610's subject when the interrupt is established, and the Interrupt Handler Procedure 602 belonging to an interrupt established in a given domain may be invoked only if Process 610's subject specifies that domain. Furthermore, CS 10110 does not allow an interrupt to cause a Process 610 to change domains, and consequently, if the advance of an Event Counter 44801 satisfies an interrupt for Process 610 which is established in a domain different from that specified in Process 610's current subject at the time of the interrupt, the Interrupt Handler Procedure 602 will not be invoked until Process 610 again enters the domain in which the Interrupt Handler Procedure 602 was established. If Process 610 never reenters that domain, the Interrupt Handler Procedure 602 will never be invoked.

The process-level interrupt system is comprised of the following:

- Interrupt List Entries 45718 and Interrupt Handler Entries 45724 in PET 44705.
- Interrupt List Head Field 45553 in Per-domain Information Portion 45541 of Process Object 901. This field contains the location of the list of Interrupt Entries 45718 established in each domain entered by Process 610.
- Fields in Domain Environment Information 46821 at the base of each MAS Object 46703. The fields are Flag Field 46827, which is TRUE if an interrupt is pending in the domain, and Interrupt Mask 46839, which determines which pending interrupts are to be processed.

Three sets of KOS Process Manager Procedures 602 are involved in interrupt handling. Interrupts are established and cleared, and priorities set and cleared, by KOS Process Manager Procedures 602 invoked by Processes 610 establishing and clearing interrupts and setting priorities. When the advance of an Event Counter 44801 satisfies an Interrupt List Entry 45718, the Advance Operation examines Interrupt List Entries 45718 whose Await Entries 44804 are satisfied by the Advance to determine the interrupt's domain and sets Pending Interrupt Field 46827 in MAS Object 46703 belonging to the domain in which Interrupt List Entry 45718's interrupt was established. Finally, each time a Mediated Call or Return occurs, and each time a Virtual Processor 612 is unbound from JP 10114 and another Virtual Processor 612 is bound to JP 10114, Pending Interrupt Field 46827 for MAS Object 46703 belonging to the domain in which Virtual Processor 612's Process 610 is currently executing is examined by KOS microcode. If the field's value is TRUE, KOS microcode uses the microcode to software signalling mechanism previously described to invoke Process Manager Interrupt Dispatcher Procedure 602. This Procedure 602 examines Interrupt List Entries 45718 established for the domain and invokes the Interrupt Handler Procedures 602 specified therein until none remain.

The following discussion begins with the KOS Process Manager Procedures 602 which establish and clear interrupts, and then explains how interrupts are honored.

a.a. Establishing and Clearing Interrupts (FIGS. 455, 457, 468)

Processes 610 may invoke KOS Procedures 602 which establish and clear interrupts as follows:

- Interrupts may be established for a Process 610 and a domain.
- Interrupts may be cleared individually, or all interrupts may be cleared for a Process 610.
- Pending interrupts may be cancelled individually, or all pending interrupts for a Process 610 may be cancelled.

The KOS Procedure 602 which establishes interrupts is Add Interrupt Procedure 602. It adds interrupts to the list of interrupts for Process 610 established in a given domain by creating Interrupt List Entries 45719 for the interrupts and linking them into the proper lists in PET 44705. Add Interrupt Procedure 602 takes two arguments: a list of interrupt descriptors and a status variable. Each interrupt descriptor comprises the following:

The name of Event Counter 44801 whose advance will cause the interrupt to occur.

The Event Counter Value 44802 at which the interrupt is to occur.

A pointer to Interrupt Handler Procedure 602.

A pointer to Mediated Frame 46947 that the interrupt handler is to manipulate when the interrupt occurs.

The priority level of the interrupt.

When Procedure 602 is invoked, it processes each interrupt descriptor in the list as follows: First, it obtains two PETEs 44909 from PET 44705's free list. One of these PETEs 44909 becomes Interrupt List Entry 45718 for the interrupt, and the other becomes Interrupt Handler Entry 45724 for the interrupt. The information provided as arguments is copied into the proper fields of both PETEs 44909: in Interrupt List Entry 45718, Tag Field 45701 is set to specify an Interrupt List Entry, Process UID Field 45711 is set to UID 40401 identifying Process 610 invoking Procedure 602, Event Counter Value field 45713 is set to Event Counter Value 44802 supplied as an argument, and Event Counter Name Field 45715 is set to Event Counter Name 44803 so supplied. Domain UID Field 45717 is set to the domain component of Process 610's current subject, Handler Entry Index 45719 is set to the PET 44705 index of Interrupt Handler Entry 45724, and Interrupt Priority Field 45721 is set to the value supplied as an argument. Before setting Interrupt Pending Field 45723, Procedure 602 reads the current value of Event Counter 44801 whose Name 44803 was supplied as an argument. If the current value is greater than that specified in Field 45713, the interrupt has already occured and Procedure 602 sets Interrupt Pending Field 45723 to TRUE; otherwise, it sets it to FALSE. To create Interrupt Handler Entry 45724, Procedure 602 sets Tag Field 45701 to specify an Interrupt Handler Entry and then fills in Pointer To Handler Field 45725 and Pointer To Stack Frame Field 45727 with information from the arguments.

Next, Procedure 602 places new Interrupt List Entry 45718 in the proper PET 44705 lists. The entry is placed in the proper Event Counter List 44904 as described discussion of the process-level Await Operation. It is then linked into the interrupt list for its Process 610 and domain. The head of the interrupt list is contained in Process Object 901 Field 45553 for the domain specified by Process 610's current subject. Using this field to locate the interrupt list, Add Interrupt Entry Procedure 602 examines each Interrupt List Entry 45718 in the List until it finds one whose Priority Field 45721 contains a value less than or equal to that contained in Priority Field 45721 belonging to new Interrupt List Entry 45718. When it finds such an Interrupt List Entry 45718, it sets Link Fields 45705 in both entries so that new Interrupt List Entry 45718 immediately precedes old Entry 45718 in the interrupt list.

The KOS Procedure 602 which removes process interrupts, Clear Process Interrupts, is the reverse of the above. Its arguments, too, are a list of interrupt descriptors and a status variable. For each interrupt descriptor on the list, Procedure 602 hashes Event Counter Name 44803 to locate the Await Entry List 45718 for Event Counter Name 44803's Event Counter 44801, uses Event Counter Value 44803 from the arguments to identify the proper Interrupt List Entry 45718, and then uses the information contained in Interrupt List Entry 45718 to remove it from the PET 44705 lists to which it belongs, relink the lists, and return both Interrupt List Entry 45718 and its Handler Entry 45724 to PET 44705's free list.

Clear All Interrupts clears all Interrupt List Entries 45718 belonging to a Process 610. It does so by using Process Object 901 Field 45553 belonging to each domain to locate that domain's list in PET 44705 and then returning each Interrupt List Entry 45718 and its Interrupt Handler Entry 45724 to PET 44705's free list as just described.

The KOS Process Manager Cancel Pending Interrupts and Cancel All Pending Interrupts Procedures 602 are analogous to Clear Interrupts and Clear All Interrupts, except that they merely set Interrupt Pending Field 45723 to FALSE and do not remove Interrupt List Entries 45718 and their Handler Entries 45724 from Process 610's lists in PETE 44705.

b.b. Interrupt Levels (FIGS. 455, 457, 468)

The current interrupt level determines which Interrupt List Entries 45718 are processed when Interrupt Dispatcher Procedure 602 is invoked. The value of the current interrupt level is kept in Interrupt Mask Field 46839 of Domain Environment Information 46821. On invocation, Interrupt Dispatcher Procedure 602 processes only those Interrupt List Entries 45718 whose Interrupt Pending Fields 45723 have the value TRUE and whose Priority Fields 45721 contain values greater than the current interrupt level. Other Interrupt List Entries 45718 whose Interrupt Pending Fields 45723 are TRUE, but whose Priority Fields 45721 contain values less than or equal to the current interrupt level will not be processed until the interrupt level changes.

A domain's interrupt level is accessible to two Process Manager Procedures 602: Set Interrupt Level and Get Interrupt Level. Get Interrupt Level returns the value of Interrupt Mask Field 46839 in MAS Object 46703 for the domain specified in the current subject of Process 610 which invokes Get Interrupt Level Procedure 602. Set Interrupt Level sets the value of Interrupt Mask Field 46839 in MAS Object 46703 for the domain specified in the current subject of Process 610 which invokes Set Interrupt Level. Set Interrupt Level invokes KOS Interrupt Dispatcher Procedure 602, thereby ensuring that Interrupt Handlers belonging to Interrupt List Entries 45718 whose Priority Fields 45721 contain values greater than the new value of Interrupt Mask Field 46839 are immediately executed. Set Interrupt Level Procedure 602 takes a single argument: the new value of the interrupt level. It sets Interrupt Mask Field 46839 to that value and returns Field 46839's previous value.

c.c. Processing Interrupts (FIGS. 455, 457, 468)

The processing of an interrupt begins when the interrupt occurs, i.e., when Event Counter 44801 for which there is an Interrupt List Entry 45718 is advanced. As described in the discussion of the process-level Advance Operation, an advance causes PET Event Counter List 44904 belonging to Event Counter 44801 to be searched for PETEs 44909 awaiting Event Counter 44801's new value. If Interrupt List Entries 45718 are among those found, the Advance Operation does the following for each Interrupt List Entry 45718 awaiting Event Counter 44801's new value:

It sets Interrupt Pending Flag 45723 to TRUE.

It uses Domain UID Field 45717 of Interrupt List Entry 45718 to determine the domain number of the domain to which the interrupt belongs and uses the domain number as an index to locate Per-domain Information 45541 for the domain in Procedure Object 901, and then uses Per-domain Information 45541 to locate MAS Object 46703 for the domain in which the interrupt represented by Entry 45718 was established and sets Pending Interrupt Flag 46817 in that MAS Object 46703 to TRUE.

KOS microcode checks Pending Interrupt Flag 46817 in a given MAS Object 46703 belonging to a Process 610 each time Process 610's Virtual Processor 612 is bound to JP 10114, each time Process 610's interrupt level changes, and each time Process 610 executes a Mediated Call or Return. If the flag is TRUE, KOS microcode performes a microcode to software Call to KOS Interrupt Dispatcher Procedure 602. Interrupt dispatcher Procedure 602 uses Interrupt List Head Field 45553 in Process Object 901 to locate Process 610's Interrupt List in the domain in which Process 610 was executing when Pending Interrupt Flag 46817 was checked. Interrupt List Entry 45718 with the highest value in Priority Field 45721 is the first Interrupt List Entry 45718 in the Interrupt List. If the value in Priority Field 45721 is larger than the value in Interrupt Mask Field 46839 of MAS Object 46703 for the domain in which the interrupts being examined were established, Interrupt Dispatcher Procedure 602 invokes Interrupt Handler Procedure 602 specified in Interrupt Handler Entry 45724 belonging to Interrupt List Entry 45718. If Interrupt Handler Procedure 602 needs data contained in some MAS Frame 46709 other than the one created by Interrupt Handler Procedure 602's invocation, Pointer to MAS Frame Field 45727 contains the location of that Frame 46709. Before invoking Interrupt Handler Procedure 602, Interrupt Dispatcher Procedure 602 returns Interrupt Handler Entry 45724 and Interrupt List Entry 45718 to PET 44705's free list. Interrupt Dispatcher Procedure 602 continues to process Interrupt List Entries 45718 in the manner just described until it has processed all Interrupt List Entries 45718 whose Priority Field 45721 is greater than the value contained in Interrupt Mask Field 46839.

F. Debugging Aids in CS 10110

A debugger is a computer program which aids programmers in finding errors in other computer programs. CS 10110 provides data structures in memory, devices in FU 10120, FU 10120 microcode, and SINs for debugging purposes. The discussion of CS 10110's debugging aids begins with a comparison of methods used to implement debuggers in the prior art with the methods used in CS 10110, then presents an overview of debugging in CS 10110, and finishes with a detailed presentation of the structure and method of operation of CS 10110's debugging aids.

In the prior art, debuggers have been implemented by modifying the executable code of the program being debugged to produce the behavior required for debugging. The modifications in the executable code may be made by altering the program's source text and then recompiling it to produced the modified executable code, or the modifications may be made directly to the executable code, without changing the source text. Both kinds of debuggers assume that the programmer, having found the problems in his program, will change his source text so that the problems no longer occur and then recompile the source text to produce correct executable code. Debuggers which work by directly modifying the executable code therefore return the executable code to its original state after the debugging session.

An example of debugging in the prior art is the implementation of tracing. A Trace is a list of actions performed by the program as it is executed. For instance, a Call and Return Trace is a list of the calls and returns made by the program.

When debugging is done by modifying the source program, the programmer obtains a Call Trace by recompiling the program being debugged, specifying to the compiler that Call tracing be added to to the code it generates for Calls. The compiler then adds extra tracing code to every Call and Return, and when the program is executed, the Call and Return tracing code makes a list of the Calls and Returns. To obtain a Call Trace in a debugging system that modifies executable code only, the programmer uses the debugger to set a flag in an operating system data base used by operating system routines which execute calls. When the flag is set, the operating system Call routines invoke a special routine which outputs the Call trace information to the debugger.

Similar techniques are used to set Break Points. A Break Point is a point specified by the debugger at which the program performs a test and then, depending on the result, continues executing or stops execution until the debugger allows it to continue. In debugger systems which recompile the source text, the programmer specifies locations at for Break Points and the tests they are to perform. The compiler then generates code which inserts the required test ahead of the statement specified for the Break Point. In debugger systems which modify executable code only, the programmer requests the debugger to set a Break Point, and the debugger replaces the instruction at that point in the executable code with an instruction which transfers control to the debugger. The debugger then performs the test specified in the Break Point and if it succeeds, executes the instruction which it replaced by the Break Point and returns to the program.

Though debuggers which modify source code or executable code only are effective, they have several problems. Foremost among them is the fact that the debugger modifies the code in order to debug it. The modifications cause both logical and physical difficulties. The logical difficulties arise from the fact that the modifications affect program behavior. The program as it is modified by or for the debugger behaves differently from the unmodified program, and may therefore obscure the problem the programmer is attempting to solve, or may contain new errors resulting from the modifications made by or for the debugger. The physical difficulties arise from the fact that other users of the system can execute the modified executable code. One user may set a Break Point in the program, and another user attempt to execute it while the Break Point is set. The Break Point may then cause the second user's execution to halt in a manner completely unexpected by the second user, who knows nothing of the first user's debugging activities.

Debugging systems which modify executable code only have a further difficulty: if a debugging session is prematurely terminated, the changes made to the executable code by the debugger remain in the executable code. This may occur by accident, or users may intentionally use the debugger in this fashion to "patch" their executable code, i.e., change the executable code without changing the source code from which it was compiled or assembled. When the debugger is used in this fashion, the executable code is no longer represented by its source code, and therefore cannot be understood by studying the source code. Over time, such patching can make it impossible to maintain a large program.

In CS 10110, FU 10120 may be enabled to perform certain debugging operations as it interprets SINs. The means by which it is enabled to perform these debugging operations do not involve the SINs it is interpreting, and consequently, debugging on CS 10110 need not involve the modification of a program's executable code, i.e., in CS 10110, Procedure Objects 608 containing Procedures 602 executed by the program. CS 10110 debuggers may thereby avoid the problems of prior art debuggers.

a. Overview of Debugging in CS 10110

Debugging operations provided by CS 10110 to debugging systems executing on it comprise the following:

SIN Tracing, i.e., notifying the debugging system of the execution of SINs at locations specified by the debugging system.

Name Tracing, i.e., notifying the debugging system of eval or resolve operations on Names belonging to a Name Table specified by the debugging system.

Data Store and Fetch tracing, i.e., notifying the debugging system of read or write operations to data in an area of an object specified by the debugging system.

Procedure Entrance and Exit tracing, i.e., notifying the debugging system of Calls, Returns, and Non-local GOTOs which cause control to enter or leave a Procedure 602 specified by the debugging system.

Reading and writing macrostate, i.e., making certain process state values stored on SS object 10336 available to the debugging system, and in some cases, allowing the debugging system to set the state to new values.

Reading and writing macrostate is done by means of Procedures 602 provided by KOS which read from and write to the fields of SS Object 10336 which contain the macrostate. The remaining operations are performed by means of the following components of CS 10110:

Registers in FU 10120 called Trace Enable Registers. These registers are part of MCW1 20290. Depending on how these registers are set, they may cause Event Signals to occur when the execution of a new SIN begins, when an Eval or Resolve Operation is performed, or when a memory reference is made with a Logical Descriptor.

Tables accessible from Process Objects 901 called Trace Tables. These tables are the means by which a debugging system on CS 10110 controls Trace Operations in FU 10120.

FU 10120 Cross-domain Call microcode. Cross-domain Call microcode examines the Trace Tables on a Cross-domain Call or Return and sets Trace Enable Registers as specified by the Trace Tables.

FU 10120 Mediated Call and Return microcode. Mediated Call and Return microcode examines the Trace Tables on a Mediated Call or Return to determine whether Procedure Entry or Exit Tracing is required. If it is, Mediated Call and Return microcode invokes microcode which performs the tracing.

FU 10120 Trace Event microcode. This microcode is invoked when a set Trace Enable Register causes a Trace Event Signal. Each kind of tracing has its own Trace Event Signal and its own microcode. When Trace Event microcode is invoked, it examines the Trace Tables to determine whether the action which caused the Trace Event Signal is being traced. If it is, the Trace Event microcode faults and invokes a Debugging System Procedure 602 to resolve the fault, passing it information about the SIN, Name, logical address, etc., whose occurrence caused the fault. On return from Debugging Procedure 602's invocation, FU 10120 executes the operation which caused the Trace Event Signal to occur.

The method by which an interactive debugging system for CS 11010 might set Break Points can serve as an example of the manner in which the above components work together. When a program is to be debugged, the command which specifies that CS 11010 is to execute a program further specifies that it be executed with the debugger. This specification causes Process 610 executing the program to invoke Debugger Procedures 602 before it begins executing the program to be debugged. Debugger Procedures 602 take commands via a terminal from the person doing the debugging. When that person wishes to set Break Points, he specifies the PC values (i.e., SINs) at which Break Points should be established and the conditions under which program execution should stop. Debugger Procedures 602 then use the information provided by the person doing the debugging to construct two tables: a table of Break Points and a Trace Table for SIN Tracing. The form of the table of break points varies with the debugger. Typically, it contains the location of the Break Points and the conditions under which program execution is to stop at the Break Points. The form of the Trace Table for SIN tracing is defined by CS 10110. The Table contains a list of locations of SINs whose execution the debugger wishes to trace, in this case, the SINs at locations for which there are Break Points.

After the debugger has constructed the Trace Table, it invokes a KOS Procedure 602 which places AON 41304 and UID 40401 pointers for each domain's Trace Table in Process Object 901 belonging to Process 610 executing the program being debugged and places AON 41304 pointers for the Trace Tables in VPSB 614 belonging to Process 610's Virtual Processor 612. Invoking KOS Procedure 602 involves a Cross-domain Call, and on a Cross-domain Return, the Call microcode examines the Trace Table belonging to the domain to which the Cross-domain Return is returning and sets the Trace Enable Register in FU 10120 as specified by the Table. If the Trace Table specifies SIN Tracing, the Call microcode sets that Trace Enable Register and SIN Tracing commences when the Return is complete.

When the person at the terminal commands the debugger to begin executing the program, the Debugger Procedures 602 invoke the first Procedure 602 in the program being debugged. Because SIN Tracing is taking place, the SIN Trace Event Signal occurs as each SIN in Procedure 602 is executed. The SIN Trace Event Signal occurs at the beginning of the execution of the first microinstruction in the sequence of microinstructions which interprets the SIN. The SIN Trace Event microcode invoked by the SIN Trace Event Signal searches the Trace Table constructed by the debugger for an entry for the location of the SIN which caused the Trace Event Signal in the Trace Table. If there is no entry, the debugger is not interested in the SIN at that location, the SIN Trace Event microcode returns to the S-interpreter microcode executing the SIN, and the execution of the first microinstruction in the sequence which interprets the SIN begins again. As will be explained in detail later, the Trace Event microcode is able to temporarily disable the Trace Enable Event, and consequently, it does not reoccur when the execution of the first microinstruction of the SIN begins again.

If the SIN Trace Event microcode finds an entry for the SIN's location in the Trace Table, it invokes the debugger as described in the discussion of microcode-to-software Calls, passing the debugger the location of the SIN for which there is an entry in the Trace Table. The debugger then uses the location it received from the SIN Trace Event microcode to find the entry for that location in the table of Break Points. When it has found the entry, it tests the condition specified in the Break Point. If the condition holds, the debugger indicates to the person debugging the program that the program has been stopped at the Break Point; the person debugging the program may then examine and set program variables and state and finally command the debugger to continue execution of the program. If the condition does not hold, Debugger Procedure 602 merely returns, which causes FU 10120 to reexecute the SIN as described above.

b. Debugging Features Common to All CSs 10110

Certain features of the debugging system described herein are common to all CSs 10110. Foremost among these is the method of debugging without altering the executable code being debugged. In addition, the interface between debugger software and the remainder of CS 10110 is fixed for all CSs 10110. This interface has three components: the Trace Tables, the information returned from CS 10110 to the debugger when a Trace Event occurs, and the macrostate visible to the debuggers. These components are discussed in order.

1. Trace Tables (FIG. 475)

As mentioned above, the Trace Tables are the means by which debugging programs executing on CS 10110 indicate to the FU 10120 micromachine what debugging actions the FU 10120 micromachine is to perform. Each domain in which a program being debugged executes must have a Trace Table. As mentioned above, pointers to the Trace Tables for a Process 610 are contained in Process Object 901, and if Process 610 is bound to a Virtual Processor 612, in Virtual Processor 612's VPSB 614. The pointers are contained in the following fields: Field 95549 of Process Object 901 contains a UID pointer to the Trace Table for its domain, and Field 95551 contains an AON 41304 pointer to the Trace Table. VPSB Field 46213 for the domain contains an AON pointer to the Trace Table. In the present embodiment, each Trace Table for a Process 610 and domain is contained in Per-domain Information Area 46707 of MAS Object 46703 for the domain to which the Trace Table belongs; in other embodiments, a Trace Table may be contained in a separate object. All components of the Trace Table, however, must be contained in the same object.

FIG. 475 contains a representation of Trace Tables. A Trace Table is made up of three kinds of components: at a minimum, a single Trace Table Descriptor (TTD )47501, and in addition, up to five Trace Area Tables (TAT) 47523 and any number of Trace Location Tables (TLT) 47532. As will be explained in detail later, the form of TLTs 47532 depend on the kind of tracing being done. TTD 47501 has two functions: it indicates to Cross-domain Call microcode what Trace Enable Registers in FU 10120 should be set, and it allows Trace Event microcode to locate the portions of the Trace Table which determine whether Trace Event microcode invokes the debugger. TATs 47523 are associated with specific kinds of tracing. TAT 47523 indicates an area, specified by a resolved pointer, in which a specific kind of tracing will result in invocations of the the debugger. TLTs 47532, finally, specify exact locations at which the debugger is to be invoked when a specific kind of tracing is enabled.

Beginning with TTD 47501, TTD 47501 is located by Trace Table Pointer 47502. As previously described, Trace Table Pointer 47502 is stored in Process Object 901 and VPSB 614 belonging to Process 610 executing the program being debugged.

In the present embodiment, TTD 47501 has five Trace Table Descriptor Entries (TTDEs) 47505 and a Version Field 47503. Each TTDE 47505 contains three fields of information about one of the kinds of tracing which debuggers may specify in CS 10110. What kind of tracing the information is associated with is determined by the position of TTDE 47505 in TTD 47501. The first TTDE 47505 in TTD 47501, SIN TTDE 47513, contains information about SIN Tracing, the second, Name Resolve-Eval TTDE 47515 contains information about Name Tracing, and so on. Turning now to the fields of TTDE 47505 and beginning with Trace Disable Field 47509, this Field is a single-bit flag which indicates whether the kind of tracing associated with TTDE 47505's position in TTD 47501 is enabled. If the flag is set, that kind of tracing is not enabled for this Process 610 and domain, and the remaining fields in TTDE 47505 are meaningless. If the flag is set, the specified kind of tracing is enabled and the fields have the following meanings:

Trace Area Table Offset Field 47507 contains the offset in the object containing TTD 47501 which locates TAT 47523 for the kind of tracing specified by TTDE 47505.

Number of Entries Field 47511 contains the number of entries in TAT 47523 specified by Field 47507.

If Number of Entries Field 47511 is 0 and Trace Disable Field 47509 is set, the trace microcode for the kind of tracing specified by TTDE 47505 is to invoke the debugger each time there is a Trace Event Signal for the specified kind of tracing.

TAT 47523 specifies areas of objects in which tracing may occur. The areas of objects may be portions of data objects in which data is being fetched and stored, and those portions of Procedure Objects 901 which contain Entry Descriptors 47227, Code 10344, or Name Tables 10350. A given TAT 47523 will specify only one kind of area, depending on the kind of tracing specified by TTDE 47505 which contains TAT 47523's location. Each TAT Entry (TATE) has three fields: Area Location Field 47527, TLT Location Offset Field 47529, and No Entries 47531. Area Location Field 47527 is a resolved pointer specifying the area being traced. TLT Offset Field 47529 is the offset in the object containing TTD 47501 of TLT 47522 for this TATE 47525. No Entries Field 47531 is a count of the number of entries in TLT 47522 for this TATE 47525. If the offset field is 0, the trace microcode for the specified kind of tracing invokes the debugger each time there is a Trace Event Signal for the specified kind of tracing and the location at which the Trace Event Signal takes place is in the area specified by Area Location Field 47527. TATEs 47525 are arranged in TAT 47523 by increasing value of UID 40401.

The kind of area specified by the pointer in Area Location Field 47527 depends on the kind of tracing specified by TTDE 47505 which contains the location of TAT 47523. The relationship between kind of tracing and area specified is the following:

| Kind of Tracing | Area Specified |
|---|---|
| SIN | Procedure code. |
| Name resolve/eval | Procedure 602's Name Table. |
| Procedure 602 entry and exit | Procedure 602's Procedure Object |
| Data store and fetch | Data object. |

Note that the area containing Names is specified by NTP.

TLT 47532 specified by a given TATE 47525 contains the specific locations at which the kind of Tracing Event Signal specified by TTDE 47505 for TAT 47523 containing TATE 47525 is to result in the invocation of the debugger. There are four formats for TLT 47532, depending on the kind of tracing: SIN TLT 47533, Name Eval/resolve Trace TLT 47537, Procedure Entry and Exit TLT 47545, and Fetch or Store TLT 47553. The tables are discussed in the above order.

SIN TLT 47533 contains the locations of SINs at which SIN Trace microcode is to invoke the debugger when SIN tracing is enabled. Each SIN TLT Entry 47533 contains the PC of the SIN whose execution is to cause invocation of the debugger. This offset is identical with the value that IPC Register 20272 will have when the SIN Trace Event Signal occurs at the beginning of the SIN specified in SIN TLT Entry 47535. SIN TLT Entries 47535 are ordered in SIN TLT 47533 by increasing PC value.

Name Eval/resolve TLT 47537 is a bit array which contains as many bits as there are Names in the Name Table pointed to by Area Location Field 47527 of TATE 47525 which contains Name Eval/resolve TLT 47537's location in TLT Offset Field 47529. The bit corresponding to the Name is located by using the Name's value as an index into the bit array. If the bit contained in the element specified by the Name is set, a Trace Event Signal occurring on an Eval or Resolve Operation for the Name will result in the invocation of the debugger.

Procedure Exit and Entry TLT 47545 contains entries which specify the Procedures 602 for which entries and/or exits are to result in the invocation of the debugger. Each Procedure Exit and Entry TLT Entry 47547 contains two fields: Entry Offset Field 47549 and Trace Type Field 47551. Entry Offset Field 47549 contains the offset of an Entry Descriptor 47227 from the pointer to a Procedure Object specified in Area Location Field 47527 belonging to TATE 47523 whose TLT Offset Field 47529 contains Procedure Exit and Entry TLT 47545's location. Trace Type Field 47551 contains four bits. These bits determine the situations in which the debugger is invoked as follows:

- If the first bit is set, the debugger is invoked each time the Procedure 602 specified by Entry Offset Field 47549 is called.
- If the second bit is set, the debugger is invoked each time a Return from the specified Procedure 602 occurs.
- If the third bit is set, the debugger is invoked each time Procedure 602 invokes another Procedure 602.
- If the fourth bit is set, the debugger is invoked each time there is a Return to the Procedure 602. The Return may result from the execution of a Return SIN or a non-local GOTO SIN.

Any combination of bits may be set.

When Data Fetch or Store Tracing is enabled, Fetch Or Store TLT 47553 specifies portions of data objects. Separate Fetch Or Store TLTs 47553 are required for Data Fetch Tracing and Data Store Tracing. If Data Fetch Tracing is enabled, a fetch from a portion of the data object specified will result in the invocation of the debugger; if Data Store Tracing is enabled, a store to the portion of the data object specified will result in the invocation of the debugger. Fetch or Store TLT Entries 47555 specify a portion of an object by means of an offset and a length. The offset, contained in Offset Field 47557, is an offset in the object specified by Area Location Field 47527 of TATE 47525 whose TLT Offset Field 47529 contains the location of Fetch Or Store TLT 47553. The length, contained in Length Field 47559, specifies a number of bits. The portion of the object described by the entry is that portion which begins at the location specified by Offset Field 47557 and continues for the number of bits specified by Length Field 47559. Entries in Fetch Or Store TLT 47553 are ordered by increasing value of Offset Field 47557.

2. The Trace Table Pointer 47502

Before a Trace Table can be used, its Trace Table Pointer 47502 must be placed in Process Object 901 belonging to Process 610 executing the program being debugged and in VPSB 614 belonging to Virtual Processor 612 bound to Process 610. KOS provides a special Procedure 602, set_trace_pointer, to perform this function. That Procedure 602 takes two arguments: a pointer to the new Trace Table and an error variable. Procedure 602 wires the object containing the Trace Table active and then places the new pointer in the appropriate fields of Process Object 901 and VPSB 614 and returns.

3. Information Returned to the Debugger by Trace Event Microcode

The kind of information the debugger receives when an operation is traced depends on the kind of operation. In all CSs 10110, this information is defined as follows:

- If an SIN is being traced, the debugger receives a pointer to the SIN's location in Procedure Object 608 being executed.
- If a Name is being traced, the debugger receives a pointer to the Name's Name Table Entry 30401 in Procedure Object 608 being executed.
- If a data fetch or store is being traced, the debugger receives a pointer to the location in the data object from which the data is being fetched or into which it is being stored.
- If procedure entry and/or exit are being traced, the debugger receives a pointer to Entry Descriptor 47227 belonging to Procedure 602 being entered or exited.

The kind of pointer returned may vary from implementation to implementation of CS 10110.

4. Macrostate Available to the Debugger

In all implementations of CS 10110, KOS provides the debugger with the means of reading and setting certain process macrostate. In the present embodiment of CS 10110, this macrostate is stored on SS Object 10336. The Procedures 602 provided by KOS for this purpose fall into three groups: Procedures 602 which obtain an FP, Procedures 602 which read macrostate belonging to an invocation identified by an FP, and Procedures 602 which set certain components of the macrostate.

There are three Procedures 602 which obtain FPs: get_current_fp, get_previous_fp, and get_successor_fp. Their names indicate their functions. get_current_fp has a single pointer variable argument. On return from get_current_fp, the argument contains the FP of Mas Frame 46709 which precedes that used by get_current_fp. Get_current_fp is invoked by the debugger, and consequently, the FP which it returns is the FP for an invocation of the debugger Procedure 602 which invokes get_current_fp.

get previous_fp and get_successor_fp both take three arguments: a pointer value, a variable to hold a pointer value, and a variable to hold an error code. The pointer value must be a FP. If it is, get_previous_fp returns the FP belonging to the preceding frame in MAS 502 of Process 610 which invoked the debugger, while get_successor_fp returns the FP for the following frame. If there is no preceding or following frame, an error code is returned. The debugger uses get_current_fp to locate FP for the topmost frame in MAS 502, and then uses get_previous_fp to move down MAS 502 from the topmost frame and get_successor_fP to move back up.

The get_state Procedure 602 allows the debugger to read state in a MAS Frame 46709 specified by an FP obtained from the FP Procedures 602 described above. The state which the debugger may read comprises the following:

- The values of the ABPs for the invocation to which MAS Frame 46709 belongs.
- FHP 46702, the pointer to KOS Frame Header 10414.
- SEP, the pointer to S-interpreter Environment Block 46864.
- EDP, the pointer to Entry Descriptor 47227 for Procedure 602 being currently executed.
- PC, the offset from PBP of the SIN currently being executed.
- STO 46704, the offset of the location of the top of Process 610's MAS 502 at the completion of the last Call.

get_state takes three arguments: an FP value, a pointer to an area in memory into which the readable macrostate will be copied, and a variable for an error code.

set_state allows the debugger to set two macrostate values in an invocation's macrostate: PC, and STO 46704. By setting these macrostate values in an invocation which invoked the debugger, the debugger can make the invocation behave as if the debugger had never been invoked. For example, if the debugger sets PC and STO 46704 in the macrostate for the invocation from which the debugger was invoked to the values they had before the debugger was invoked, a Return from the debugger will cause that SIN to be repeated which was being executed when when the debugger was invoked.

c. Implementation of Debugger Operations in the Present Embodiment

In the present embodiment, many debugger operations are implemented in microcode. For some tracing operations, the present embodiment uses the Event Signal mechanism of FU 10120. The discussion first explains how tracing operations use the Event Signals and then explains how the operations are actually carried out in the present embodiment.

1. Enabling and Disabling Trace Event Signals (FIGS. 273, 475)

FU 10120 controls Trace Event Signals by means of registers in MCW1 20290 and fields in RCWS Registers 27322. FIG. 273, previously presented in the discussion of the FU micromachine, illustrates the relevant registers and fields. Turning to that figure, there are two groups of registers in MCW1 20290 which are of importance: Event Masks (EM) Registers 27301 and TE Registers 27319. In EM Registers 27301, TM Register 27307 masks Trace Event Signals. When TM Register 27307 is set, the only Trace Event Signals which result in trace event invocations are SIN Trace Event Signals. Trace Event microcode invoked by Trace Event Signals sets TM Register 27307 when it begins executing, and clears it when it is finished, thereby preventing recursive invocations of Trace Event microcode.

The following list indicates the effects of setting individual registers in TE Registers 27319. Any combination of registers may be set.

- NT Register 27321 enables Name Trace Event Signals. When NT Register 27321 is set, a Name Trace Event Signal occurs in the M0 cycle of each microinstruction which contains a Resolve or Eval microcommand.
- LR Register 27323 enables Logical Read Trace Event Signals. When LR Register 27323 is set, a Logical Read Trace Event Signal occurs in the M0 cycle of each microinstruction which performs a logical read operation, i.e., has a Logical Read or an Eval microcommand. Logical Read Trace Event Signals do not occur on fetches of SINs from memory.
- LW Register 27325 enables Logical Write Trace Event Signals. When LW Register 27325 is set, a Logical Write Trace Event Signal occurs in the M0 cycle of each microinstruction which performs a logical write operation, i.e., has a Logical Write microcommand or a Storeback microcommand.
- ST Register 27327 enables SIN Trace Event Signals. When ST Register 27327 is set, a SIN Trace Event Signal occurs in the M0 cycle of the first microinstruction of the sequence of microinstructions which interprets a SIN.
- uT Register 27329 enables Microinstruction Trace Event Signals. When uT Register 27329 is set, a Microinstruction Trace Event Signal occurs in the M0 cycle of each microinstruction.
- uB Register 27331 enables Microinstruction Break Point Event Signals. When uB Register 27331 is set, a Microinstruction Break Point Event Signal occurs in the M0 cycle of each microinstruction whose Microinstruction Break Point Bit (bit 56) is set.

In CS 10110, microinstruction tracing and micro break points are used only for debugging microcode, and Event Signals enabled by Fields 27329 and 27331 never cause the invocation of debugger Procedures 602. The methods by which fields 27329 and 27331 are set vary from implementation to implementation and are not discussed here.

Several registers in TE Register 27319 may be set at once, and all registers therein remain set as long as a specific kind of tracing is enabled. The FU 10120 micromachine must therefore provide for the occurrence of more than one kind of Trace Event Signal during the execution of a single microinstruction, and must also ensure that the microcode invoked by a given Trace Event Signal is invoked only once during the execution of a single microinstruction. The means by which FU 10120 accomplishes this are four fields in RCWS Register 27322 and two fields in the Logical Descriptor.

The settings of four of the registers in TE Register 27319 are copied into RCWS Register 27322 when FU 10120 invokes a microroutine. The four registers are NT Register 27321, copied into NT Field 27335 of RCWS Register 27322, ST Register 27327, copied into ST Field 27341, uT Register 27329, copied into uT Field 27343, and uB Register 27331, copied into uB Field 27345. On return from the invocation of the microroutine, the contents of these fields and the other fields of Return Signals 27330 of RCWS Register 27322, together with registers in MCW1 20290, are used as inputs to Event Logic 20294. If the field in Returns Signals 27330 and its corresponding register in TE Registers 27319 are both set, the Trace Event Signal specified by the register in TE Registers 27319 is again produced. Otherwise, it is not. Fields in Returns Signals 27331 may be reset by microcode, and consequently, event microcode invoked by a Trace Event Signal enabled by one of the four TE Registers 27319 whose values are copied into RCWS Register 27322 can reset the field in RCWS Register 27322 corresponding to the register in TE Registers 2719 which caused its invocation, and thereby inhibit its repeated invocation when FU 10120 again attemps the M0 cycle of the microinstruction in which the Trace Event Signal occurred. However, since the event microcode only resets the field in Return Signals 27330 for its event, event microcode for one of the other events will be invoked when the M0 cycle is reattempted. Thus, FU 10120 will repeat the M0 cycle and continue to respond to Trace Event Signals until none are pending.

Repeated invocation of event microcode for Logical Read Trace Signals and Logical Write Trace Signals is inhibited by means of two fields in the Logical Descriptor 27116 for the read or write operation being traced. These fields are illustrated in FIG. 271. RDT Field 27103 inhibits Logical Read Trace Signals when set to 1, and WTD Field 27105 inhibits Logical Write Trace Signals when set to 1. Both bits are normally set to 0. If one of the Fields is set to 0, and the corresponding LR Field 27323 or LW Field 27325 is set in MCW1 20290, a logical read or write using the Logical Descriptor 27116 produces a Logical Read or Write Trace Signal. The Logical Read or Write Trace Event microcode invoked by the signal then sets the proper bit in the Logical Descriptor 27116 to 1, thereby inhibiting the Logical Read or Write Trace Signal and preventing its own repeated invocation.

2. Debugging Operations (FIGS. 273, 475)

There are two levels of debugging operations, those performed by Debugger Procedures 602, and those performed by the FU 10120 micromachine and KOS Procedures 602. The operations performed by Debugger Procedures 602 are described here only insofar as they affect the Trace Tables. Debugger Procedures 602 define the kind of tracing to be performed by CS 10110 for Process 610 by building a Trace Table for Process 610 and a domain and then giving Trace Table Pointer 47502 to a KOS Procedure 602 which places Trace Table Pointer 47502 in the proper locations in Process Object 901 belonging to Process 610 and VPSB 614 to which Process 610 is bound.

As was indicated in the discussion of Trace Tables, the Trace Tables can specify five kinds of tracing and three levels of tracing for each kind of tracing. Depending on the kind of tracing and level of tracing, debugger Procedures 602 build Trace Tables as follows: If any tracing is to be done, the Trace Table contains a TTD 47501. For each kind of tracing to be done, there is a TTDE 47505 with its Trace Disable Field 47509 set to 0. If all occurrences of a traceable operation are to be traced, TTDE 47505 for that kind of tracing has its Number of Entries Field 47511 set to 0. If the operation specified by TTDE 47505 is to be traced in specific areas, TAT Offset Field 47507 specifies the location of a TAT 47523 corresponding to TTDE 47505, and Number of Entries Field 47511 specifies the number of entries in TAT 47523. The areas in which tracing is to occur are specified by TATEs 47525; if all of the specified operations are to be traced in an area, Number of Entries Field 47532 in TATE 47525 is set to 0. If only some of the specified operations are to be traced in an area, TLT Offset Field 47529 contains the location of TLT 47522 associated with that tracing operation and area, and Number of Entries Field 47531 contains the number of entries in TLT 47522. TLT 47522, finally, contains a list of locations which are to be traced.

After the debugger has built the Trace Table, it invokes the KOS set_trace_pointer Procedure 602, which, as described, places Trace Table Pointer 47502 in the proper locations in Process Object 901 belonging to Process 610 which is executing the Procedure 602 being debugged and in VPSB 614 belonging to Virtual Processor 612 to which Process 610 is bound.

On each Cross-domain Call and return, including the Return from KOS set_trace_pointer Procedure 602, the Call microcode examines the trace pointer for the domain it is entering in Array of Trace Pointers Field 46213. If the trace pointer is non-null, there is a Trace Table for the process and domain, and the Call microcode places Trace Pointer 47502 for the domain's Trace Table in a global register in GRs 10360. Using Trace Pointer 47502, Call microcode locates the Trace Table's TTD 47501 to determine what kinds of tracing it should perform. If TTD 47501 specifies SIN Tracing, Name Eval or Resolve Tracing, or Data Fetch Or Store Tracing, Cross-domain Call microcode sets the proper Trace Enable Register in TE Registers 27319.

Once set, the Trace enable Registers in TE register 27319 enable Trace Event Signals as previously described, and these Signals in turn result in invocations of Trace Event microcode. The Trace Event microcode for a specific event being traced uses the Trace Table pointer in GR's 10360 to locate TTD 47501. It then reads the Trace Table starting at TTDE 47505 for the kind of tracing handled by the Trace Event microcode until it determines whether the operation currently being performed should be traced. If it is to be traced, the Trace Event microcode invokes the debugger, giving it a pointer to the location of the item or data being traced. The debugger returns to the Trace Event microcode, which inhibits a repeated invocation on return from the Trace Event microroutine by resetting the bit in RCWS Register 27322 for the previous frame or in the Logical Descriptor 27116 which would cause the Event Signal to recur, and the Trace Event microcode then returns. Since the invocation was the result of an event signal, the return is to the microinstruction in whose M0 cycle the signal occurred. The microinstruction then repeats its M0 cycle, and if no further Event Signals occur, executes its M1 cycle and completes its execution.

In the case of Procedure Entry and Exit Tracing, the Mediated Call and Return microcode examines Procedure Entry-Exit TTDE 47517 before it leaves the invocation from which the Call or Return is being made. If TTDE 47517's Trace Disable Field 47509 is not set, Call and Return microcode invokes Procedure Entry-Exit Tracing microcode which further examines the Trace Table to determine what kind of entry or exit tracing is required. As with other trace microcode, if a specific entry or exit is to be traced, the Procedure Entry-exit Tracing micrococode performs a microcode to software Call to the debugger, giving the debugger a pointer to Entry Descriptor 47227 belonging to Procedure 602 being entered or exited.

APPENDIX A

1. FU 10120 Microinstruction Format

FIG. A1 shows the FU 10120 microinstruction format. The hardware interprets the microinstruction micro-order fields according to a number of different formats. Certain fields (given below) determine the format. In some cases, the formats may overlap (e.g., when literals are specified this may or may not suppress the interpretation of the literal field as a micro-order field). The individual micro-order descriptions provided in the following sections will note such overlaps and the result.

Default format: Bits 64 through 80 are the requested literal. Micro-order interpretation for the overlapped fields varies with the micro-order invoking the overlapping literal. In all cases, control recognizes bits 48 through 63 as micro-orders.

Format A: The machine recognizes format A when l=lit_32 and alu_in=literal. Bits 49 through 80 are the literal field. The micro-order interpretation for the overlapped fields varies with the micro-order invoking the literal.

Format B: The machine recognizes format B if alu_in .ne. literal and nac=use_snac. The snac field will be used for selecting the next address into the control store.

Format C: The machine recognizes format C if alu_in .ne. literal and nac=case. The srce, sc, and mask fields are used to generate the next address into the control store.

Format D: The machine recognizes format D if alu_in .ne. literal and nac=§long_call or long_goto . The 14 bit field lit14(67-80) will be used as the offset literal in branches and calls.

Format E: The machine recognizes format E if any micro-order specifies a 16 bit literal (alu_in=literal and l=lit_16). Bits 65-80 supply the requested literal value.

Format F: The machine recognizes format F if dev_cmd=disp_lit16. The EU 10122 takes its dispatch address as EADDR(0-11). EADDR is formed from the md field value and bits 73-80 of the 16 bit literal field Any unused fields in the microword must be set to zero.

APPENDIX A-continued

2 MICROINSTRUCTION Micro-command FIELDS

FIG. A1 shows the location of each microcommand field in the microinstruction. The following sections describe the function of each field and list the microcommands which may be used in that field. At the beginning of each section, the field's bit location within the microinstruction is given in parentheses after the field name. The encoding for each micro-order of the field is the hexadecimal number at the beginning of the micro-order description. For each field, the default microcommand is identified by a "$" following its hexadecimal code.

Where the construction <n> appears in a field name, it means that one of several different numerical values may occupy this position in the name. These values are given in the microcommand description.

Where references to microcommands are made in the text of the following sections, this is done by naming the microcommand's field and equating it to the microcommand (or microcommands if set off in braces). For example, nac=use_snac refers to the use_snac microcommand in the nac field. The construction snac=§resolve or eval refers to the microcommands resolve and eval in the snac field.

2.1 parity(0) - microinstruction parity

This field contains the parity bit for the microinstruction. This bit must be coded so that the entire word has odd parity. Default is 0.

2.2 timing(1) - hardware timing

When this bit is set, the M0 state is extended by one cycle.

| | | |
|---|---|---|
| 0 | normal_m0 | M0 is unchanged. |
| 1 $ | extend_m0 | Extend M0 by one cycle. The extended cycle is in addition to and comes after any M0 cycles due to M0 hold conditions. |

2.3 reserved(2)

This field must be set to zero.

2.4 jpd ctrl(3-6) - JPD Bus 10142 source control

This field provides total control of all sources to JPD Bus 10142. In some cases, other fields in the microinstruction may require coding to realize an operation. Information about additional encoding is given when necessary.

| | | |
|---|---|---|
| 0 $ | noop | No sources are specified. |
| 1 | storeback_data | A "storeback" implicitly specifies<br>* Gate EU 10122 data onto JPD Bus 10142. The data goes onto JPD Bus 10142 during M0 of the following microinstruction. If the following microinstruction sources JPD Bus 10142, the machine holds in M0 for an extra cycle. The EU 10122 sources JPD Bus 10142 during the first M0 cycle and the microinstruction sources JPD Bus 10142 on subsequent M0 cycles.<br>* send a "data taken" signal to EU 10122 (see dev_cmd=take_E-unit_data) and<br>* enable recognition of storeback events.<br>These may be disabled by dev_cmd=§set_masking_mode micro-order .<br>mem= §a logical write micro-order is required |
| 2 | hash_number | Gate the hash number onto JPD Bus 10142. The hash number is put onto JPD Bus 10142 (bits 16-31) with the other bits of JPD Bus 10142 (0-15) undefined. |

| | | |
|---|---|---|
| 3 | logical_page_number | Gate the logical page number (AON and the upper 18 bits of the object offset) from Descriptor Trap 20256 onto JPD Bus 10142. The dev_cmd field must be set to "lpn_to_jpd". Override the o_in field selection specification for the offset selector and force it to select JPD Bus 10142. Write disable is not overridden if specified in o_in. |
| 4 | data_trap | Gate Data Trap 20256 into JPD Bus 10142. |
| 5 | cmd_trap | Gate the micro-order trap register onto JPD Bus 10142. The value is right justified, and the high-order 24 bits of JPD Bus 10142 are undefined. |
| 6 | mlen_output | Gate LENGRF 20236 output onto JPD Bus 10142. Override the o_in field selection specification for the offset selector and force it to select JPD Bus 10142. Write disable is not overridden if specified in o_in. |
| 7 | aoff_output | Gate OFFALU 20242 onto JPD Bus 10142. |
| 8 | int_timer | Gate INTTMR 25410 onto JPD Bus 10142 (bits 4-31). |
| 9 | repc | Gate EPC 20274 onto JPD BUS 10142 (bits 0-31) The low order three bits are always zero. |
| A | ripc | Gate IPC 20272 onto JPD Bus 10142 (bits 0-31) The low-order three bits are always zero. |
| B | mc_word_0 | Gate MCW0 20292 onto JPD BUS 10142. Bits 17-23, corresponding to the WCS page number register, are undefined |
| C | mc_word_1 | Gate MCW1 20290 onto JPD BUS 10142. |
| D | rc_word | Gate a RCWS Register 27322 onto JPD Bus 10142. RCWS Register 27322 is for the frame selected by dev_cmd=§previous, bottom, or extended . Any other specification by dev_cmd is undefined |
| F | E-unit_data | Gate data from the EU 10122 onto JPD Bus 10142. No storeback is initiated, and no take_E-unit_data is signalled (See jpd_ctrl=storeback_data). The FU 10120 holds in M0 until data is available. |

2.5 nb ctrl(7-8) - Name Bus 20224 source control
This field provides total source control for the Name Bus 20224.

| | | |
|---|---|---|
| 0 $ | offset_alu_ls16 | Gate the OFFALU 20242 output onto Name Bus 20224. The least significant 16 bits of OFFALU 20242's output are used. |
| 1 | parser | Gate the output of INSTB 20262 and Parser 20264 onto Name Bus 20224. If K=0 (8-bit names), the high order eight bits are zeroed. dev_cmd =§a parse micro-order is required. |
| 2 | name_trap | Gate Name Trap 20254 onto Name Bus 20224. |
| 3 | op_code_latch | Gate LOPCODE 24210 onto Name Bus 20224. NOTE: The microcommand gates ADDR 24214 onto bits 0-7 of Name Bus 20224 when dev_cmd = §load_fbox_disp or load_E-unit_disp . The high-order 8 bits are undefined. |

2.6 db ctrl(9) - DB 27021 source control
This field selects the source for Offset Portion 20228 of DB 27021. Either OFFALU 20242 output or the output of OFFALUSB 20244 may be selected as the Offset Bus 20228 source.
Note: The DB 27021, of which the Offset Bus 20228 is a subset, is sourced from AONP 20216, OFFP 20214, and LENP 20220. During nac=use_snac; snac=§eval, resolve, or resolve pointer ; and dev_cmd=§prefetch_dscr_out, dscr_0, dscr_1, dscr_2, or dscr_3 other sources for DB 27021 may be selected. See Section 3 of this appendix for resolution of any contention with this field.

| | | |
|---|---|---|
| 0 $ | soab_output | Gate the output of OFFALUSB 20244 input selector onto Offset Bus 20228. |
| 1 | offset_alu_output | Gate OFFALU 20242 output onto Offset Bus 20228. |

2.7 len ctrl(10-13) - length selection and ALU control
This field controls LENALU 20252 operation, and it selects a length literal or the output of the BIAS Logic 20246 (called biased length) via the bias selector. The selected value is placed on LENGTH Bus 20226 and enabled to LENALU 20252 input 2. The 1 input receives the output of LENGRF 20236. The output of LENALU 20252 is called the bias length.
Note 1: For all nac=use_snac and snac=§eval, resolve or resolve pointer operations; and some dev_cmd operations (see db_ctrl field for a list of these), the source specification of this field as LENGTH Bus 20226 is overridden. However LENALU 20252 input and BIAS Logic 20246 selections are not affected. Note 2: For all LENALU 20252 operations, the 2 input is right aligned and zero extended to 32 bits.

| | | |
|---|---|---|
| 0-6 $ | lit_<n>_dec | Select a length literal (<n>=0,1,2,4,8,16, or 32) and zero extend it (default is <n>=0). Decrement the value from LENGRF 20236 file by this literal and put the length literal onto LENGTH Bus 20226. Encode 0 to select <n>=0, 1 for <n>= 1, 2 for <n>=2, 3 for <n> =4, etc. Note: LENALU 20252 is set up for subtraction; its 2 input is the selected literal, and its 1 input is the output of LENGRF 20236. |
| 7 | | reserved |
| 8-B | lit_<n>_inc | Select a length literal (<n>=1,8,16, or 32) and zero extend it. Increment the value from LENGRF 20236 by this literal and put the length literal onto LENGTH Bus 20226. Encode 8 to select <n>=1, 9 to select <n>=8, etc. Note: LENALU 20252 is set up for addition; its 2 input is the selected literal, and its 1 input is the output of LENGRF 20236. |
| C | bias_dec | Select the output of BIAS Logic 20246 (biased length) |

Decrement the value from LENGRF 20236 by the biased length and put the biased length onto LENGTH Bus 20226. The biased length will be either the output of LENGRF 20236 or 32, whichever is less. This operation is undefined for GR's 10360.
Note: LENALU 20252 is set up for subtraction (1−2); its 2 input is the biased length, and its 1 input is the output of LENGRF 20236.

D zero_alu — Force LENALU 20252 output to zero. BIAS Logic 20246 selects the lit8 field of the microinstruction to LENGTH Bus 20226.

E lit8_inc — Select the low-order 8 bits of the 16-bit literal and zero extend them (see format E). Increment the value from LENGRF 20236 by this literal and put the literal onto LENGTH Bus 20226. The microcommand fields that lie within the literal do not have their execution suppressed or changed
Note: LENALU 20252 is set up for addition (1+2); its 2 input is the literal, and its 1 input is the output of LENGRF 20236

F lit8_dec — Select the low order 8 bits of the 16-bit literal and zero extend them (see format E). Decrement the value from LENGRF 20236 by the literal and put the literal onto LENGTH Bus 20226. The microcommand fields that lie within the literal do not have their execution suppressed or changed.
Note: LENALU 20252 is set up for subtraction (1−2); its 2 input is the literal, and its 1 input is LENGRF 20236.

2.8 1 in(14-15) - LENGRF 20236 input selector control

This field provides total control over the selector which chooses the input for LENGRF 20236, as well as providing a write disable.

0 $ dis_wrt — Disable writes to LENGRF 20236.
The length selector selects LENALU 20252's output. Note that the test condition len_eq_0 tests the source selected by the length selector.

1 dscr_bus — The length selector selects LENGTH Bus 20226 as input to LENGRF 20236. Data from LENGTH Bus 20226 is right aligned and zero filled in LENGRF 20236.

3 offset_bus — The length selector selects Offset Bus 20228 as the input to LENGRF 20236.

2 len_alu — The length selector selects

LENALU 20252 as the input to LENGRF 20236

2.9 r source(16-18) - GRF source address

This field, in conjunction with src_frame, addresses the entire width of the general register file (AONRS, offset and length register files). The src_frame field selects a register frame. The r_source field is used as the address of the register within that frame that is to be used as a source.

<n> r<n> — Select register <n> of the frame (default is <n> =0). <n> =0...7

2.10 r dest(19-21) - GRF 10354 destination address

This field in conjunction with dst_frame addresses the entire width of GRF 10354 (AONGRF 20232, OFFGRF 20234, and LENGRF 20236) The dst_frame field selects a GRF 10354 frame. The r_dest field is used as the address of the register within that GRF 10354 frame that is to be used as a destination.

<n> r<n> — Select register <n> of the GRF 10354 frame (default is <n> =0). <n> =0...7

2.11 com ext(22-25) - GR's 10360 address extension

Either src_frame and/or dst_frame may specify the use of the address extension field com_ext. In these cases the extension field is concatenated with the r_source or r_dest fields respectively to obtain an address into GR's 10360 of GRF 10354.

2.12 src frame(26-27) - GRF 10354 source frame control

| | | |
|---|---|---|
| 0 $ | current | Use the r_source field to address the registers within the current (top of stack) GRF 10354 stack frame |
| 3 | previous | Use the r_source field to address the registers within the previous (top of stack -1) GRF 10358 stack frame. |
| 1 | bottom | Use the r_source field to address the registers within the bottom GRF 10354 stack frame. |
| 2 | common | Address GR's 10360 using the com_ext field concatenated with the r_source field. |

2.13 dst frame(28-29) - GRF destination frame control

| | | |
|---|---|---|
| 0 $ | current | Use the r_dest field to address the registers within the current (top of stack) GRF 10354 stack frame. |
| 3 | previous | Use the r_dest field to address the registers within the previous (top of stack -1) GRF 10354 stack frame. |
| 1 | bottom | Use the r dest field to address the registers within the bottom GRF 10354 stack frame. |
| 2 | common | address GR's 10360 using the com_ext field concatenated with the r_dest field. |

Note: The md field provides an additional source of destination address specification for OFFGRF 20234. Writes specified by the mem field to GRF 10354 specified by the md field logically occur after the write operation addressed by the r_dest field, i.e., between microinstructions. See the md field description for more detail.

2.14 r w(30) - GRF 10354 write enable

This field enables writes into AONGRF 20232, OFFGRF 20234, and LENGRF 20236, subject to an active input selector specification via the l_in, o_in fields or rand=dis_wrt_aon.

Note: Writes specified by the mem and md fields into OFFGRF 20234 and LENGRF 20236 ignore this field, and logically occur after the write operation controlled by this field, i.e., between microinstructions.

| | | |
|---|---|---|
| 0 $ | dis_wrt_files | Disable writes to GRF 10354. |
| 1 | enable_wrt_files | Enable writes to GRF 10354. |

2.15 a w(31) - accumulator register write enable

This field enables writes into OFFMUXR 23818.

Note 0: Writes to OFFMUXR 23818 specified by the mem

APPENDIX A-continued and md fields are independent of a_w and occur between microinstructions.
Note 1: nac=use_snac and snac=§eval or resolve cause writes into OFFMUXR 23818 which override the a_w field specification. This override occurs for vector cache entries. A resolve or eval of a vector cache entry results in a hardware generated memory reference which has the ACC as the destination.
Note 2: The accumulator input selector receives data from the offset selector, except during nac=use_snac and snac=§eval or resolve (for vector entries), or memory references with md=§"anything"_and_acc or dest_acc. During the latter cases, the ACC selector selects MOD Bus 10144.

| | | |
|---|---|---|
| 0 $ | dis_wrt_acc | Disable writes to OFFMUXR 23818. |
| 1 | enable_wrt_acc | Enable writes to OFFMUXR 23818. |

2.16 a in(32-33) - AONGRF 20232 input selector control
This field provides partial control over the selection made by the input selector to AONGRF 20232.
Note: The dis_wrt_maonrs microcommand in the rand field disables some writes to AONGRF 20232.
Note: If the md field specifies GRF 10354, then the addressed register in AONGRF 20232 will be set to zero, regardless of a_in or write disables selected in the rand field. This happens because md operations occur logically after the executing microinstruction.

| | | |
|---|---|---|
| 0 $ | clr_aon | The AONGRF 20232 selector selects zeros as the input to AONGRF 20232. |
| 1 | aon_bus | The AONGRF 20232 selector selects the AONR Bus 2230 as the input to AONGRF 20232. |
| 2 | aon_latch | The AONGRF 20232 selector selects the AONGRF 20232 output as the input to AONGRF 20232. |
| 3 | offset_alu | The AONGRF 20232 selector selects OFFALU 20242 output as the input to AONGRF 20232. The least significant 28 bits of OFFALU 20242'S output are used as the input to AONGRF 20232. |

2.17 o in(34-35) - OFFGRF 20234 input selector control
This field provides partial control of the input selector to OFFGRF 20234 and also controls the write disable for OFFGRF 20234.
Note: jpd_ctrl=§logical_page_number or mlen_output will override the o_in selection and force the offset selector to select JPD Bus 10142. With the exception of dev_cmd=noop, the dev_cmd field also overrides o_in. Since the offset selector can be gated to the ACC, all of this has a role in determining the input to the ACC.

| | | |
|---|---|---|
| 0 $ | dis_wrt_sel_aoff | Disable writes to the OFFGRF 20234. The offset selector selects the OFFALU 20242's output as the input to OFFGRF 20234. |
| 1 | dscr_bus | The offset selector selects Offset Bus 20228 as the input to OFFGRF 20234. |
| 2 | aon_latch | The offset selector selects AONGRF 20232 output as the input to OFFGRF 20234. The data from the AONGRF 20232 is right justified and zero extended from 28 to 32 bits. |
| 3 | offset_alu | The offset selector selects OFFALU 20242 as the input to OFFGRF 20234. |

2.18 alu in(36-37) - OFFALU 20242 input selection
This field provides partial control of:
- the selector, OFFMUX 23816, for the shift network;
- the shift network, OFFSCALE 23818
- the selector for the A input of OFFALU 20242
- the selector for the B input of OFFALU 20242
- and the sign extension and fill function (part of OFFMUX 23816)

Note: rand or dev_cmd field references may override this field. See Section 3, "Resolution of Contention from Microcommand Specifications" below.

| | | |
|---|---|---|
| 0 | jpd_bus | Select JPD Bus 10142 as the A input to OFFALU 20242. The detailed operation is: OFFMUX 23816 selects JPD Bus 10142; The sign extension and fill function of OFFMUX 23816 is setup to pass; The A selector selects OFFSCALE 23818; and the B selector selects the output of OFFGRF 20234. |
| 1 | bias | Select the bias selector output as the A input to OFFALU 20242. The detailed operation is: The A selector selects the output of the bias selector (Biased length) right justified and zero extended; and the B selector selects OFFGRF 20234 output. |
| 2 $ | acc | Select OFFMXR 23812, NAME Bus 20224, ones, or zeros as the A input to OFFALU 20242. The detailed operation is: OFFMUX 23816 selects the source; the sign extension and fill function of OFFMUX 23816 is setup to pass; The A selector selects OFFSCALE 23818; and the B selector selects the output of OFFGRF 20234. NOTE: microcommands in the rand and dev_cmd fields determine the exact selection made. If the microcommands in these fields don't refer to OFFALU 20242, the selection is OFFMUXR 23812. |
| 3 | literal | Select the literal value specified by the 1 field as the A input to OFFALU 20242. The detailed operation is: OFFMUX 23816 selects the literal; the sign extension and fill function of OFFMUX 23818 truncates to 16 bits or passes all 32 bits, depending on the 1 field; the A selector selects OFFSCALE 23818; and the B selector selects OFFGRF 20234. NOTE: If the 1 field is lit_32, the next 32 bits are interpreted as the requested literal value (format A). If the 1 field is lit_16, the last 16 bits in the microinstruction are the requested literal value (i.e., format E applies). The microcommand interpretation of the fields overlapped by the literal is forced to noop. The next microaddress is the microprogram counter plus one. |

2.19 sf(38-40) - OFFSCALE 23818 scale factor
This field specifies a left shift of 0 to 7 bits in APPENDIX A-continued OFFSCALE 23818. Zeros are shifted into the vacated bits. (Default is 0)
Note: This field is ignored and the shift count taken from the IES (inter element spacing) field of the encached descriptor when rand = ies_multiply.

| | | |
|---|---|---|
| <n> shift_<n> | | Shift <n> bits left, <n> =0−7. |

2.20 alu op(41–43) - OFFALU 20242 operation code
This field contains the operation code for OFFALU 20242. In the explanation below, A is the output of the A selector, and B is the output of the B selector.

| | | |
|---|---|---|
| 0 $ | zeros | Set OFFALU 20242 output to zero. |
| 1 | rev_minus | SUBTRACT (B−A) |
| 2 | minus | SUBTRACT (A−B) |
| 3 | plus | ADD (A+B) |
| 4 | xor | EXCLUSIVE OR (A .XOR. B) |
| 5 | or | OR (A .OR. B) |
| 6 | and | AND (A .AND. B) |
| 7 | ones | Set the OFFALU 20242 output to all ones. |

2.21 rand(44–47) - random control

| | | |
|---|---|---|
| 0 $ | noop | No operation specified |
| 1 | se_nb_to_nscale | Select the NAME Bus 20224, (right aligned and sign extended per K) as the input to OFFSACLE 23818 and OFFIESCENC 23820. The detailed operation is: OFFMUX 23816 selects the NAME Bus 20274, and the sign extension and fill function of OFFMUX 23816 is set up to sign extend based on K. |
| 2 | zero_to_sscale | Select zero to OFFMUX 23816. This microcommand overrides the alu_in field references to this network (see Section 3 "Resolution of Contention from Micro-order Specifications"). |
| 3 | one_to_sscale | OFFMUX 23816 selects 1 as input to the sign extension and fill logic. This microcommand may override the alu_in field references to this network (see section 2). |
| 4 | rjzf_fiu | Force the FIU bits of AONR Bus 20230 to the microcommand "right alignment with zero fill" if DB 27021 bus is sourced by Memory Reference Unit 27017; otherwise, ignore this field. |
| 5 | rjsf_fiu | Force the FIU bits of AONR Bus 20230 to the microcommand "right alignment with sign fill" if DB 27021 is sourced by Memory Reference Unit 27017; otherwise, ignore this field. |
| 6 | ljzf_fiu | Force the FIU bits of AONR Bus 20230 to the microcommand "left alignment with zero fill" if DB 27021 is sourced by Memory Reference Unit 27017; otherwise, ignore this field. |
| 7 | ljbf_fiu | Force the FIU bits of AONR Bus 20230 to the microcommand "left alignment with blank fill" if the logical descriptor bus is sourced by Memory Reference Unit 27017; otherwise, ignore this field. |
| 8 | dis_wrt_maonrs | Disable writes into AONGRF 20232. This microcommand may be overridden (see o_in). |
| 9 | ies_multiply | Perform an IES multiply. This microcommand overrides the sf field shift specification. The interelement spacing value from Name Cache 10226 is used as the shift count for OFFSCALE 23818. dev_cmd = nc_ies_value is required. |
| A | test_to_cc | Load the condition code in machine MCWI 20290 with the condition selected by the test field. No matter what other formats are specified by other fields, if this microcommand is issued and the test is an FU 10120 test, the condition code register is loaded with the test condition specified by the bit pattern in the test field location. This is true even if alu_in = literal and 1=§lit_16 or lit_32 . For EU 10122 tests, a conditional branch or a return is required in the same microinstruction and alu_in = literal is not allowed. Note: The test condition seen by the conditional branch logic is Boolean true (one); thus the polarity field will determine if any conditional branches are taken. |
| B | len_le32_to_cc | Load the condition code register with the test condition for the length register file output less than or equal to 32 (len_le_32). The test field specification is honored. |
| C | jpd_to_E-unit_opq | Load the E-unit operand queue with data from JPD Bus 10142. |
| D | cond_read_prefetch | Conditionally perform mem=read_prefetch and dev_cmd = load_cpc, using the test field condition and the polarity field. The test field is used independently of any literal specification for FU 10120 tests. For EU 10122 test conditions, a conditional branch or a return is required in the same microinstruction and alu_in = literal is not allowed. Note that mem=read_prefetch requires explicit coding and a source to JPD Bus 10142 is necessary since CPC 20270 may be loaded. If the test condition is an EU 10122 test then take_E-unit_data is not implicit. Take_E-unit_data must be explicitly issued before Result Register 27013 will be free. Load_cpc should not be coded. Note: The result of this |

| | | |
|---|---|---|
| | | micro-order can be viewed as a conditional branch in the macroprogram. |
| E | dbl_precision | Set the EU 10122 to double precision mode. In this mode, test conditions from the EU 10122 remain valid until the second take_E-unit_data signal. |
| F | set_i_mask | Set indivisibility (I) mask mode. This mode masks the same events as does the monitor mask mode (except the EU 10122 gate fault event) and, further, masks the power failure event and the FU 10120 stack overflow event. The fatal memory error event and UID trace traps are not masked. This mode is used when microatomic operations are necessary. It persists only during the microinstruction that sets it. |

2.22 1(48) - literal size

This field identifies the size of literals requested by the alu_in field of the microinstruction. This field has no effect on the microcommands len_ctrl = §lit8_dec or lit8_inc or dev_cmd = §interrupt_E-unit or disp_lit16 .

| | | |
|---|---|---|
| 0 $ | lit_16 | 16 BIT LITERAL - Suppress control interpretation for the conflicting fields of the microinstruction. Bits 65-80 are interpreted as a literal value |
| 1 | lit_32 | 32 BIT LITERAL - Suppress control interpretation for the conflicting fields of the microinstruction. Bits 49-80 are interpreted as a literal value |

2.23 mem(49-51) - MEM 10112 microcommand

The following is a list of dev_cmd micro-orders that can modify the operation specified by the mem field. All descriptions of the mem field microcommands assume no modification by the dev_cmd field

- ignore_prot: When the micro-order trap register is used for a memory reference, the protection state for that reference is "ignore protection violations" only if the microcommand trap protection state is "ignore" or the dev_cmd field indicates ignore_prot.
- read_phy_lock
- read_err_log
- repair_block
- flush_prot_cache Note that MRR 27339 is cleared in RCW's Register 27322, if a memory reference and a return microcommand are issued in the same microinstruction.

The dev_cmd microcommands shown below conflict with mem field specifications. The result of the specification of microcommands from these fields in the same microinstruction is indicated.

- load_atc: Logical memory references will cause
- an ATU hung reference error. This is system fatal
- load_atc_set_dirty: Logical memory references will cause an ATU hung reference error.
- flush_atc: Results are undefined.
- load_prot_tag: Results are undefined for logical memory references.
- load_prot_extent: Logical memory references will
- cause an ATU hung reference error if ATU 10228 is hung. For ATU 10228 not hung, the results are undefined
- load_prot_mode: Logical memory references will
- cause an ATU hung reference error if ATU 10228 is hung. For ATU 10228 not hung, the results are undefined.
- flush_prot_cache: Results are undefined

- generate_hash: Results are undefined.
- ignore_prot may not be used with use_cmd_trap.

During nac = use_snac and snac = §eval or resolve for a vector entry, this field is overridden and an index value fetched into OFFMUXR 23812. The mem microcommand specified in this field will be lost.

Note: In the microcommand descriptions below, the trap registers implicitly loaded are given. Should a trap register be driving its bus for a memory reference, then it is not loaded.

| | | |
|---|---|---|
| 0 $ | noop | No operation specified. |
| 1 | read | Perform a logical read. Read the value addressed by the contents of DB 27021 into the destination selected by the md field. This microcommand translates the value on DB 27021 into a physical descriptor. Protection Cache 10234 looks for read access. The microcommand execution implicitly loads Command Trap 27018 and Descriptor Trap 20256. |
| 2 | read_lock | Perform a logical read with lock. Read the value addressed by the contents of DB 27021 into the destination specified by the md field and set the value's first bit to one (in MEM 10112). This microcommand translates the value on DB 27021 into a physical descriptor. Protection Cache 10234 looks for read and write access rights. The trap registers loaded are Command Trap 27018 and Descriptor Trap 20256. |
| 3 | read_phy | Perform a physical read Read from MEM 10112 using the low-order 13 bits of the logical page number on DB 27021 as the physical page number. The destination is specified by the md field. No address translation is performed. No protection checks are made. |
| 4 | write | Perform a logical write. Write to the memory location specified by Logical Descriptor 27116 on DB 27021. The data to be written is on JPD Bus 10142. This microcommand translates the value on DB 27021 into a physical descriptor. Protection Cache 10234 looks for write access rights. The trap registers loaded are Command Trap 27018, Descriptor Trap 20256, and Data Trap 20258. |
| 5 | write_phy | Perform a physical write to MEM 10112. The data is on JPD Bus 10142. The low order 13 bits of the logical page number are interpreted as a physical page number for addressing. No protection checks are made. Note: This microcommand implicitly loads Data Trap 20258. |
| 6 | use_cmd_trap | Perform a memory reference using the contents of Command Trap 27018 as the |

| | | |
|---|---|---|
| | | mem, md, and protection state. None of the Traps 20256, 27018, or 20258 is implicitly loaded when a memory reference is made using this microcommand. Note: Results are undefined if dev_cmd = ignore_prot is used with this microcommand. |
| 7 | read_prefetch | Perform a logical read from memory The destination is INSTB 20262. The FIU and LEN fields on DB 27021 are ignored by the memory which uses "right justified and zero fill" with a length of 32 bits. PREF 20260 is loaded from DB 27021. The md field is ignored Logical Descriptor 27116 for the read comes from DB 27021, and a translation of Logical Descriptor 27116 is performed. Protection Cache 10234 looks for execution access rights, and the prefetch mechanism is turned on. The trap registers loaded are the Command Trap 27018 and the Descriptor Trap 20256. |

CAUTION: A length of zero in Length Field 27115 of Logical Descriptor 27116 causes a machine check, any other value is acceptable and ignored.
NOTE 1: The cross page event is not requested on cross page references, because the MEM 10112 ignores the low order five bits of Offset 27113 in Logical Descriptor 27116. Fetches for PREF 20260 always return 32 bits on 32 bit word boundaries.
NOTE 2: When the "INSTB hung" event is serviced using read_prefetch, do not issue dev_cmd = §any micro-order that loads CPC 20270 . The results are undefined. Any other instances of read_prefetch, for example all branches in the S-instruction stream, must issue dev_cmd = §a load CPC micro-order . The proper synchronization between PREF 20260 and (CPC 20270) requires that CPC 20270 and PREF 20260 be loaded with the same Offset during the same microinstruction.
NOTE 3: PREF 20260 should not have its state saved or restored. Any microinstruction that loads CPC 20270 and issues read_prefetch synchronizes prefetching with the I-stream.

2.24 md(52-55) - memory destination
This field identifies the destination for all MEM 10112 read operations, with the exception of those initiated by mem=use_cmd_trap; nac=use_snac and snac=§eval,resolve for a vector entry; or read_prefetch (see just above). Any destination selected by this field is sourced by MOD Bus 10144 at the time of the data transfer.
This field will override any other specification of a source for the chosen destination. However, since the memory "read" occurs between microinstructions, the destination specified by this field may have a source other than MOD Bus 10144 selected by other fields in the microinstruction. However, the memory data will overwrite any data in the location.
NOTE: The memory data is returned to the destination specified, after the execution of the microinstruction that initiated the reference. Any microcommands that change Current 27215 in SR's 10362 (e.g., calls or returns) will cause memory data to be returned to a destination based on the new value of Current 27215.
If a register from GRF 10354 is specified by this field, then AON and RS Fields 27101 and 27111 parts are cleared to zero, LEN Field 27115 is unaffected, and the value returned from MEM 10112 is stored in OFF Field 27113.
When the md field specifies OFFMUXR 23812 as the memory destination, the next microinstruction will be executed while the data is still in the process of being fetched to OFFMUXR 23812. However, if the next microinstruction references OFFMUXR 23812, the execution of the microinstruction is delayed until data is returned to OFFMUXR 23812 (i.e., serial integrity for OFFMUXR 23812 is always assured). NOTE: The GR'S 10360 cannot be destinations for memory data

| | | |
|---|---|---|
| 0 $ | E-unit_data_q | The destination is OPB 20322. |
| 1 | dest_acc | The destination is OFFMUXR 23812. |
| 2 | E-unit_and_acc | The destinations are OPB 20322 data queue and OFMUXR 23812. |
| 3 | E-unit_and_current_7 | The destinations are OPB 20322 and register 7 of the current frame of SR's 10362. |
| 5 | The destinations are OFFMUXR 23812 and register | 7 of the current frame of SR's 10362. |
| 8 | bottom_7 | The destination is register 7 of the bottom frame of SR's 10362. |
| A | previous_7 | The destination is register 7 of the previous frame of SR's 10362. |
| 9 | previous_6 | The destination is register 6 of the previous frame of SR's 10362. |
| B | current_3 | The destination is register 3 of the current frame of SR's 10362. |
| C | current_4 | The destination is register 4 of the current frame of SR's 10362. |
| D | current_5 | The destination is register 5 of the current frame of SR's 10362. |
| E | current_6 | The destination is register 6 of the current frame of SR's 10362. |
| F | current_7 | The destination is register 7 of the current frame of SR's 10362. |

2.25 trace trap(56) - trace trap enable
If this bit is one, the trace trap (not illustrated) (also called the microbreak point trap) is enabled for the microinstruction setting it (unless traps have been masked). (Default is 0)
2.26 dev cmd(57-63) - deice micro-order
This field identifies a set of pseudo devices and their associated microcommands. All unused encodings for this field are reserved.

| | | |
|---|---|---|
| 0 $ | noop | No operation. |
| | 2.26.1 Protection Cache | |
| 28 | ignore_prot | Ignore Protection Cache 10234 violations. This microcommand, if specified, is saved in Command Trap 27018 on logical memory references. This microcommand may not be used with mem = use_cmd_trap. |

The following three microcommands should be issued in the order in which they are presented and must run with all events masked.

| | | |
|---|---|---|
| 19 | load_prot_tag | Load Protection Cache 10234 tag store from the AONR Bus 20230. Descriptor Trap 20256 implicitly drives AONR Bus 20230 (see section 2 for conflict resolution). ATU 10228 goes into the "hung" state pending completion of the loading of Protection |

| | | |
|---|---|---|
| | | Cache 10234's mode and extent stores. |
| 1B | load_prot_extent | Load Protection Cache 10234's extent store for the cache entry whose tag was most recently loaded by load_prot_tag from JPD Bus 10142. The extent store is loaded with the ones complement of the (true extent minus 32) unless this value is negative, in which case zero is loaded. Therefore, an extent violation may be signalled for legal references in the last 32 bits of an object. The micro-order requires that ATU 10228 be in the "hung" state. |
| 1A | load_prot_mode | Load Protection Cache 10234's mode store for the cache entry most recently loaded by load_prot_tag from JPD Bus 10142. The 3 bits are right justified on the bus in the order (most to least significant bits): execute, read, write. This microcommand unhangs ATU 10228 and may be issued only if ATU 10228 is in the "hung" state. |
| 1F | flush_prot_cache | Flush Protection Cache 10234. All the validity bits are reset to indicate invalid entries, and the FIFO replacement pointer resets to point to entry 0. |
| | 2.26.2 Memory | |
| 2D | force_mem_error | Send an illegal memory operation. This micro-order requires that mem = write_phy. |
| 29 | read_phy_lock to a read_phy with lock. | Force the memory operation The data is fetched unmodified. Set the first bit of the operand in memory to one. If mem does not specify read_phy, then this microcommand is ignored. (See mem = read_phy). |
| 2A | read_err_log | Read the error status log in MEM 10112 to the destination specified by the md field. The error log is reset to a "no error" condition upon completion of this microcommand. Thus, the log may be read only once. If mem does not specify read_phy, then the microcommand is ignored (See mem = read_phy). |
| 2B | repair_block | Write the correct ercc into the block addressed in MEM 10112. The microcommand requires a block address, i.e., the lower seven bits must be zero. No data is required on JPD Bus 10142 but the mem field must specify write_phy or the microcommand is ignored. (See mem = write_phy) |
| 2C | flush_data_cache | Flush Data Cache. The blocks in Data Cache with their dirty bits set are written into MEM 10112's banks (a flush takes a maximum of 500 microseconds). All memory references after the flush microcommand are ignored until the System Console intervenes. This microcommand requires that the mem field specify write_phy, if it does not, the micro-order is ignored. Note: Either the JP or the IOP may demand a cache flush. The first such microcommand from either one arms the memory for lockout. The next flush microcommand disables further memory references on completion. If only one processor is running, the System Console must prearm the memory |

2.26.3 Trap Registers and Hashing

| | | |
|---|---|---|
| 22 | generate_hash | Generate the hash number for the AON and Page of Logical Descriptor 27116 on DB 27021 (the bus is implicitly driven by Descriptor Trap 20256), and load the hash number into the hash counter (part of ATU 10228). The ATU 10228 is put into the "hung" state. The jpd_ctrl = hash_number micro-order cannot occur in the same microinstruction. |
| 21 | inc_hash | Increment the hash number modulo the hash table size. The ATU 10228 must be in the hung state. This microcommand can occur in the same microinstruction that issues jpd_ctrl = hash_number. The LAT and WLAT event requests implicitly cause the equivilant of dev_cmd = generate_hash. Note: There are IPL parameters associated with the hash generation that are settable by the scan chain. |
| 24 | lpn_to_jpd | Gate the AON Page onto JPD Bus 10142. These values are from DB 27021. The jpd_ctrl field must be set to the same microcommand. See jpd_ctrl = logical_page_number and the db_ctrl field for override conditions. This microcommand implicitly specifies Descriptor Traps 20256 as the source for DB 27021. See Section 3, "Resolution of Contention from Microcommand Specifications" for resolution of conflicts. |
| 20 | dscr_trap_out | Enable Descriptor Trap 20256 as the source for DB 27021 (see Section 3 "Resolution of Contention from Microcommand Specification" for conflict resolution). |
| 1C | load_data_trap | Load Data Trap 20258 from JPD Bus 10142. |
| 1E | load_cmd_trap | Load Command Trap 27018Z from JPD Bus 10142, bits 24-31. |

APPENDIX A-continued

| | | |
|---|---|---|
| 1D | load_dscr_trap | Load Descriptor Trap 20256 from DB 27021. |
| 75 | load_name_trap | Load Name Trap 20254 from Name Bus 20224. |
| | 2.26.4 ATU 10228 | |
| 25 | load_atc | Load ATU 10228. ATU 10228 is loaded with the ones complement of a physical page number from JPD Bus 10142 and the logical_page_number from DB 27021. DB 27021 is implicitly driven by Descriptor Trap 20256 (see Section 3, "Resolution of Contention from Microcommand Specifications" for conflict resolution. This microcommand may be issued only if the ATU 10228 is in the "lat hung" state. The least recently used entry is replaced, and the dirty bit for the entry is cleared. When the micro-order has finished execution, ATU 10228 is left in the "unhung" state. |
| 26 | load_atc_set_dirty | Load the ATU 10228 and set the dirty bit of the entry loaded. ATU 10228 is loaded with the ones complement of a physical page number from JPD Bus 10142 and the Logical_page_number from DB 27021. Descriptor Trap 20256 implicitly drives DB 27021 (see Section 3, "Resolution of Contention from Microcommand Specifications" for conflict resolution). This microcommand may be issued only if ATU 10228 is in the "lat hung" state. The least recently used entry is replaced, and the dirty bit for the entry is set to 1. When the microcommand has finished execution, ATU 10228 is left in the "unhung" state. This microcommand can be used to load entries whose MHTE 42601 have their Modified Flags 42605 set. |
| 27 | set_dirty | Set the dirty bit of ATU 10228 entry that caused a "wlat hung" state. ATU 10228 must be in the "wlat hung" state. Execution leaves ATU 10228 in the "unhung" state. Descriptor Trap 20256 implicitly drives DB 27021. (see Section 3, "Resolution of Contention from Microcommand Specifications" for conflict resolution) |
| 18 | flush_atc | Flush the ATU 10228, and reset it to the "clean" state, which is defined as: (a) set to "unhung" state (b) all entries indicated as invalid (c) all dirty bits are cleared (d) the information for the LRU algorithm indicates that set entry 0 is mru, set entry 1 is nmru, and set entry 2 is lru. The flush takes place in parallel with FU 10120 operations and takes 17 clock cycles. Any (logical or physical) memory references during the flush will cause FU 10120 to hang in the MI state until the flush is completed. |
| 56 | unhang_atu | Unhang the ATU. ATU 10228 makes the transition from either of its "hung" states ("lat" or "wlat") into the "unhung" state. No memory references are allowed in the same microinstruction with this microcommand. |
| | 2.26.5 Prefetch | |
| 3A | prefetch_dscr_out | Gate PREF 20260 onto DB 27021 (see Section 3, "Resolution of Contention from Microcommand Specification" for conflict resolution") Note: In Logical Descriptor 27116 from PREF 20260, bits 3 and 4 are zero, and FIU Field 27107 and LEN Field 27116 are undefined |
| 39 | turnoff_prefetch | Turn off PREF 20260. PREF 20260 continues to operate until the end of the microinstruction issuing this microcommand. |
| | 2.26.6 Name Cache | |
| 3C | flush_name_cache | Flush NC 10226. This microcommand takes 16 clock cycles to complete. All snac=§resolve or eval references to NC 10226 during this time result in misses. The data returned is undefined for any dev_cmd=db_nc_dscr_<n> references during flush. Any dev_cmd=load_nc_dscr_<n> microcommands are ignored. |
| 38 | load_nc_ptr | Load DB 27021 into the NC 10226 and set the entry ID flag to indicate a pointer entry. The pointer ID on the name bus indicates the register block addressed. Register 0 in the block is loaded. |
| 3B | invalidate_nc_entry | Reset the "valid entry" flag on Name Cache Entry 30601 addressed by the value on NAME Bus 20224. This Name Cache Entry 30601 is now invalid for NC 10226 operations. |
| 3D | nc_ies_value | Return the IES (Name Cache Register 30602 1) for Name Cache Entry 30601 addressed by the Name on NAME Bus 20224. The IES value returns to OFFSCALE 23818's shift count and overrides the field in the microinstruction. DB 27021 is not driven. |

APPENDIX A-continued

| | | |
|---|---|---|
| 34 | db_nc_dscr_0 | Gate Name Cache Register 30602 0 onto the DB 27021. See Section 3, "Resolution of Contention from Microcommand Specifications" for resolution of conflicts. |
| 35 | db_nc_dscr_1 | Gate Name Cache Register 30602 1 onto DB 27021. See Section 3, "Resolution of Contention from Microcommand Specifications" for resolution of conflicts. |
| 36 | db_nc_dscr_2 | Gate Name Cache Register 30602 2 onto DB 27021 bus. See Section 3, "Resolution of Contention from Microcommand Specifications" for resolution of conflicts. |
| 37 | db_nc_dscr_3 | Gate Name Cache Register 30602 3 onto DB 27021 bus. See the section "Resolution of Contention from Microcommand Specifications" for resolution of conflicts. |
| 30 | load_nc_dscr_0 | Load Name Cache Register 30602 0 from DB 27021. (The length portion of Name Cache Register 30602 is loaded from the output of LENGRF 20236 via an internal link. This is the only write entrance for this field. Reads from the length field of Name Cache Register 30602 are to the Length Bus 20226.) If NC 10226 is flushing, this microcommand is ignored. See Section 3, "Resolution of Contention from Microcommand Specifications" for resolution of conflicts |
| 31 | load_nc_dscr_1 | Load Name Cache Register 30602 1 from DB 27021. (The length portion of Name Cache Register 30602 1 is loaded from the output of LENGRF 20236 via an internal link. This is the only write entrance for this field. Reads from the length field of Name Cache Register 30602 1 are to LENGTH Bus 20226. If NC 10226 is flushing, this microcommand is ignored. See Section 3, "Resolution of Contention from Microcommand Specifications"for resolution of conflicts. |
| 32 | load_nc_dscr_2 | Load Name Cache Register 30602 2 from DB 27021. (The length portion of Name Cache Register 30602 2 is loaded from the output of LENGRF 20236 via an internal link. This is the only write entrance for this field. Reads from the length field of Name Cache Register 30602 2 are to LENGTH Bus 20226.) If NC 10226 is flushing, this microcommand is ignored. See Section 3, "Resolution of Contention from Microcommand Specifications" for resolution of conflicts. |
| 33 | load_nc_dscr_3 | Load Name Cache Register 30602 3 from DB 27021. (The length portion of Name Cache Register 30602 3 is loaded from the output of LENGRF 20236 via an internal link. This is the only write entrance for this field. Reads from the length field of Name Cache Register 30602 3 are to LENGTH Bus 20226.) If NC 10226 is flushing, this microcommand is ignored. See Section 3, "Resolution of Contention from Microcommand Specifications" for resolution of conflicts |
| | 2.26.7 Instruction Buffer | |
| 78 | parse_op_stage | Parse to obtain the SOP; load EPC 20274 with the value of IPC 20272; load IPC 20272 with the value of CPC 20270; load Lopcode 24210 from NAME Bus 20224, in M0; then increment CPC 20270 by 8; enable the events associated with a new SOP. The events enabled may be taken by the first microinstruction following the microinstruction containing this microcommand. nb_ctrl = parser is required. This microcommand does not store the parsed value in any register. If other micro-orders in the microinstruction don't transfer the parser output to a register, the parsed value is lost. Note: The integrity of the contents of Lopcode 24210 is not guaranteed if a microinstruction containing a parse_op_stage is aborted. See Section 3, "Resolution of Contention from Microcommand Specifications" for resolution of conflicts. |
| 79 | parse_k_load_epc | Parse the I-stream using a field width of K (current non-opcode syllable size); load EPC 20274 from IPC 20272; then increment CPC 20270 by K. This microcommand does not store the parsed value in any register. If other microcommands in the microinstruction don't transfer the parser output to a register, the parsed value is lost. The only transfer path is by NAME Bus 20224 |
| 7D | parse_k_disp_E-unit | Parse the I-stream using a field width of K (current non-opcode syllable size). The microcommand performs the same actions as parse_k_load_epc. Further, Lopcode 24210 and RDIAL 24212 address EUDISF 24222 to obtain the beginning address of an EU 10122 microroutine. The dispatch microcommand will be loaded |

APPENDIX A-continued

| | | |
|---|---|---|
| | | into COMQ 20342. |
| 7C | load_cpc | Load CPC 20270 from JPD Bus 10142, bits 0-28. Bits 29-31 are ignored. INSTB 20262 is invalidated. PREF 20260 performs an instruction fetch from memory at the end of the microinstruction. |
| 7A | stage_pc | Load EPC 20274 with the contents of IPC 20272. Load IPC 20272 with the contents of CPC 20270. |
| 7B | load_cpc_stage | Load CPC 20272 from JPD Bus 10142, bits 0—28; load EPC 20274 with the contents of IPC 20272; and load IPC 20272 with the (former) contents of CPC 20270. When CPC 20270 is loaded, bits 29-31 of JPD Bus 10142 are ignored. |
| 72 | load_k | Load K (non-opcode syllable length) from bit 31 of JPD Bus 10142. K = 1 indicates 16 bit non-opcode syllables, and K = 0 indicates 8 bit non-opcode syllables |
| 71 | | Load RDIAL 24212 from bits 28-31 of JPD Bus 10142. The dispatch address counter in FUSDT 11010 is cleared (useful when loading Dispatch Files 27004). The dialect specification field is 4 bits. This allows the 1k of FDISP 24218 to be addressed as eight partitions of 128 locations per partition (i.e., 8 S-languages) or as four partitions of 256 locations (i e., 4 S-languages). If bit 28 is one, then eight partitions are selected, and bits 30, 31, 29 (in that order) specify the partition addressed. In this case, only the low-order 7 bits of the opcode are used to address within the partition. If bit 28 is 0, bits 30-31 determine the partition, and all 8 bits of the opcode address within the partition. Note: If the dialect is set up for short opcodes (bit 28 = 1) and a long opcode is used for dispatching, then a "illegal S-op" event occurs |
| 73 | load_op_latch | Load the Lopcode 24210 from NAME Bus 20224. The value is loaded from the least significant 8 bits of NAME Bus 20224. |
| | 2.26.8 EU 10122 | |
| 6C | abort_E-unit | Clear the state of EU 10122. This micro-order aborts the EU 10122 operation and clears COMQ 20342 and OPB 20322. |
| 6B | interrupt_E-unit | Interrupt EU 10122 and load COMQ 20342 with the address specified by bits 8-16 of the 16 bit literal in the microinstruction, concatenated on the left with the md field (format F). No suppression of microcommand execution occurs for the fields overlapped by the field used as the literal |
| 6A | disp_E-unit_on_jpd | Begin execution of the EU 10122 microroutine addressed by bits 20-31 of JPD Bus 10142. The address is loaded onto COMQ 20342. |
| 68 | disp_E-unit | Begin execution of the EU 10122 microroutine addressed by the output of EUDISF 24222 (RDIAL 24212, concatenated with the contents of Lopcode 24210, supplies the address in EUDISF 24222). EU 10122 microroutine address is put onto COMQ 20342. |
| 69 | disp_E-unit_lit16 | Begin execution of the EU 10122 microroutine addressed by bits 8-15 of the 16 bit literal in the microinstruction, concatenated on the left with the md field (format F). The execution of microcommands in overlapping fields of the microinstruction is not suppressed. The resulting address is put onto COMQ 20342. |
| 6F | take E_unit _data | Signal EU 10122 that FU 10120 has taken data or a test condition from Result Register 27013. This micro-order allows the EU 10122 to continue placing items in Result Register 27013or to go to the next operation in COMQ 20342. An "E-unit test"or "source result register to JPD Bus" microcommand is required in the same microinstruction. Note: This signal is raised implicitly by jpd _ctrl = storeback _data |
| 6E | disable _storeback_ events | Disable generation of the "storeback exception"event for the storeback operation initiated by the current microinstruction. If no storeback is initiated, the micro-order is ignored |
| 7F | load E_unit _qate | load from bit 19 of the JPD bus. A one indicates a valid gate for the E-unit dispatch address corresponding to the gate RAM location loaded. The address for the entry loaded is bits 20-29 of the JPD bus. Load each location of the RAM. |
| | 2.26.9 Dispatch Files 27004 and FUSITT 11012 | |
| 77 | load_E-unit_disp | Load EUDISF 24222 from bits 20-31 of JPD Bus 10142 and increment the dispatch address counter in FUSDT 11010 by one after the load. The dispatch address counter is concatenated with RDIAL 24212 to provide bits 20-31 of JPD Bus 10142. The contents of RDIAL 24212 are incremented by one if a carry occurs out of the dispatch address counter. |

When RDIAL 24212 is loaded with JPD28 =0, the counter supplies the lower 8 bits of the address into the EUDISF 24222 while the upper 2 bits come from RDIAL 24212 (these were loaded from bits 30-31 of JPD Bus 10142). RDIAL 24212 should not be loaded with bit 28 of JPD Bus 10142 equal to 1 when the dispatch address counter is used.

| | | |
|---|---|---|
| 76 | load_fbox_disp | Load the FDISP 24218 from bits 10-15 of JPD Bus 10142 and FALG-24220 from bits 16-31 of JPD Bus 10142. Increment the dispatch address counter (concatenated with RDIAL 24212) by one after the load. The contents of RDIAL 24212 are incremented by one if a carry out of the dispatch address counter occurs. The address into FDISP 24218 and FALC-24220 is formed exactly as for load_E_unit disp. (See above ) |
| 6D | load_E_unit_cs | Load EUSITT 20344 from JPD Bus 10142 if the EU 10122 microprogramming has set the unit up for a load of EUSITT 20344; otherwise, ignore the microcommand |
| 60 | load_wcs_a | Load part A (27 bits) of the microinstruction from JPD Bus 10142 into FUSITT 11012 addressed by Repeat Counter 20280 and PNREG 20282. |
| 61 | load_wcs_b | Load part B (27 bits) of the microinstruction from JPD Bus 10142 into FUSITT 11012 addressed by Repeat Counter 20280 and PNREG 20282 |
| 62 | load_wcs_c | Load part C (27 bits) of the microinstruction from JPD Bus 10142 into FUSITT 11012 addressed by Repeat Counter 20280 and PNREG 20282<br>Note: See Section 4, "Microinstruction Images" for the microinstruction image as it is loaded into FUSITT 11012. |

2.26.10

| | | |
|---|---|---|
| 70 | signal_monitor_1 | Signal microinstruction execution to the System Console on monitor line 1. |
| 74 | signal_monitor_2 | Signal microinstruction execution to the System Console on monitor line 2. |
| 58 | send_clk_stop_req | Send a request to the System Console to stop the FU 10120's clock. No memory references are allowed during this cycle |

2.26.11 Event masks

Each of these microcommands sets or clears a bit in EM 27301 of MCWI 20290. These bits control global modes for masking events. The mode persists from the beginning of the microinstruction that sets it until the end of the microinstruction that clears it.

Events recognized only during the first microinstruction of SOPs, cannot be masked (for example "interval timer overflow").

Note: Indivisibility masking is encoded in the RAND field.

| | | |
|---|---|---|
| 48 | set_mon_mask | Set MM Bit 27305. When this bit is set, it inhibits recognition of all the events inhibited by setting AM Bit 27303 and also inhibits recognition of the "F-unit stack fault" event. |
| 49 | clr_mon_mask | Clear MM Bit 27305. |
| 4C | set_trace_mask | Set TM Bit 27307. When this bit is set, it inhibits recognition of all the events inhibited by setting MM Bit 27305 (except E-unit gate fault and F-unit stack overflow events) and also inhibits recognition of "trace trap" events (except UID read/write traps, which cannot be masked). |
| 4D | clr_trace_mask | Clear TM Bit 27307. |
| 4A | set_asyn_mask | Set AM Bit 27303. When this bit is set, it inhibits recognition of the "egg timer overflow" and "E-unit gate fault" |
| 4B | clr_asyn_mask | Clear AM Bit 27303. |
| 50 | load_trace_enable | Load TE 27319 from JPD Bus 10142. Bits 26-31 of JPD Bus 10142 are loaded into TE 27319. A one will enable, and a zero will disable, a trap depending on which bits are specified<br>- bit 26 . . . enable name trace<br>- bit 27 . . . enable logical read trace<br>- bit 28 . . . enable logical write trace<br>- bit 29 . . . enable S-op trace<br>- bit 30 . . . enable microinstruction trace<br>- bit 31 . . . enable microbreakpoint trace |

2.26.12 Timers and Counters

| | | |
|---|---|---|
| 55 | load_int_tmr | Load Interval Timer 25410 from JPD Bus 10142. |
| 52 | clr_int_tmr_pend | Clear IT 27313 in MCWI 20290. |
| 51 | clr_egg_tmr_pend | Clear ET 27311 in MCWI 20290. |
| 65 | load_rptc | Load Repeat Counter 20280 and PNREG 20282 from bits 24-31 and bits 17-23 of JPD Bus 10142, respectively. |
| 66 | inc_rptc | Increment Repeat Counter 20280. |
| 67 | dec_rptc | Decrement the Repeat Counter 20280. |

2.26.13 General Register File, GRF 10358

| | | |
|---|---|---|
| 1 | acc_to_aoff | Use OFFALUSB 20244 to select bits 0-15 of OFFMUXR 23812 (right aligned and zero filled) as the input to port B of OFFALU 20242. See Section 3, "Resolution of Contention from Microcommand Specifications" for side effects and resolution of conflicts |
| 3 | sscale_ms16_zeroed | Set bits 0-15 of OFFMUX 23816 output to zero See Section 3, " Resolution of Contention from Microcommand Specifications" 2 for side effects and resolution of conflicts |
| 2 | sscale_ls16_zeroed | Set bits 16—31 of the output of OFFMUX 23816 to zero. |

| | | |
|---|---|---|
| | | See Section 3, "Resolution of Contention from Microcommand Specifications" for side effects and resolution of contention. |
| 4 | ze_nb_to_nscale | Select NAME Bus 20224 (right aligned and zero extended per K) as the input to OFFSCALE 23818 and OFFIESENC 23820. See Section 3, "Resolution of Contention from Microcommand Specifications" for side effects and resolution of contention |
| 5 | sign_ext_sscale | Sign extend the contents of OFFMUX 23816 from 16 bits to 32 bits. See Section 3, "Resolution of Contention from Microcommand Specifications" for side effects and resolution of contention. |
| 6 | encode_ies_to_aoff | Enable ENCIES (FIG. 238) as the source for the input of OFFALU 20242 See Section 3, "Resolution of Contention from Microcommand Specifications" for resolution of conflicts<br>Note: The bits 0-28 to OFFALU 20242 are undefined. |
| 7 | fiu_typ extract | Perform FIU and TYPE extraction from OFFMUXR 23812 and send the extracted value to OFFSCALE 23818. See Section 3 for side effects and contention. The value is extracted in the following manner:<br>- bit 9 of OFFMUXR 23812 becomes bit 4 of OFFMUX 23816;<br>- bits 10-15 of OFFMUXR 23812 become bits 8-13 of OFFMUX 23816;<br>- all other bits of OFFMUX 23816 are forced to zero. |

2.26.14 RCW 10358 St$ck and Frame Pointers 27211, 27213, 27215

| | | |
|---|---|---|
| 5A | inc_bottom | Increment Bottom Frame Pointer 27211. |
| 5B | dec_bottom | Decrement Bottom Frame Pointer 27211. |
| 5C | load_fptrs | Load Frame Pointers 27211-27215 from JPD Bus 1014. This causes Current Frame Pointer 27215 to be set equal to bits 20-23 of JPD Bus 10142, Previous Frame Pointer 27213 to bits 24-27 of JPD Bus 10142 and Bottom Frame Pointer 27211 to bits 28-31 of JPD Bus 10142.<br>Note: After initialization, the values of Bottom Frame Pointer 27211 and Current Frame Pointers 27215 should be 1, and the value of Previous Frame Pointer 27213 should be 0. |
| 5D | read_previous_rcw | Select RCWS Register 27322 for the previous frame for output to JPD Bus 10142. The jpd_ctrl field controls the gating of the word onto JPD Bus 10142. |
| 5E | read_bottom_rcw | Select RCWS Register 27322 for the bottom frame for output to JPD Bus 10142. The jpd_ctrl field controls the gating of the word onto JPD Bus 10142. |
| 5F | read_ext_rcw | Select RCWS Register 27322 addressed using com_ext for output to JPD Bus 10142. This microcommand allows random access to RCWS Register 27322 of any SR's 10362 frame. The jpd_ctrl field controls the gating of the word onto JPD Bus 10142. |
| 63 | load_prev_rcw | Load bits 8—31 of JPD Bus 10142 into RCWS Register 27322 for the "previous" stack frame<br>Note: If nac = §return or return_and_jam_0 this microcommand is ignored |
| 64 | load bottom rcw | Load bits 8-31 of JPD Bus 10142 into RCWS Register 27322 for the "bottom" stack frame.<br>Note: If nac = §return or return_and_jam_0 this microcommand is ignored. |

2.26.15 IPM

| | | |
|---|---|---|
| 53 | clr_ipm_pend | Clear IPM Interrupt pending flag (part of Event Logic 20294). |
| 54 | send_ipm | Send an IPM Interrupt to IOP. |

2.27 nac64-66) - next microinstruction address control

All offset calculations for these micro-orders are done relative to the current value of mPC 20276 EXCEPT casing. Casing is relative to the value of mPC 20276 plus 1.

| | | |
|---|---|---|
| 4 $ | cond_short_branch | Conditionally execute a short branch (8 bits,signed) based on the test field. The lit8 field value is added to the current value in mPC 20276. |
| 5 | cond_short_call | Conditionally execute a short call (8 bits,signed ) based on the TEST field. A frame is pushed onto SR's 10362, and a RCWS Register 27322 is pushed onto RCWS 10358. The lit8 field is added to the current value in mPC 20276. The details of the operation are: The Previous Frame Pointer 27213 is incremented by 1; the Current Frame Pointer 27215 is incremented by 1; mPC 20276 is incremented by 1 and written to the RCWS Register 27322 addressed by the Current Frame Pointer 27215; and the lit8 field value is added to mPC 20276. |
| 2 | return | Execute a return. The details of the operation are: The mPC 20276 is loaded with the contents of RCWS Register 27322 addressed by Current Frame Pointer 27215; Current Frame Pointer 27215 is decremented by 1; and Previous Frame Counter 27213 is decremented by 1. |

| | | |
|---|---|---|
| 1 | return_jam_0 | Execute a return (see return above). In this case the next microinstruction executed is at FUSITT 11012 location 0 rather than at the location indicated by mPC 20276. The detailed operation is: mPC 20276 is loaded with the contents of RCWS Register 27322 addressed by Current Frame Pointer 27215; the Current Frame Pointer 27215 is decremented by 1; and Previous Frame Pointer 27213 is decremented by 1. |
| 0 | use_snac | Use the secondary next address control (format B) to determine the next microinstruction address. |
| 3 | case | Unconditionally case on mPC 20276 + 1 (format C). The srce, sc, and mask fields require coding. The value obtained from these fields is added to mPC 20276 + 1. |
| 6 | long_goto | Execute a long jump (14 bits, signed, relative, format D). Add the value in the lit14 field to mPC 20276. |
| 7 | long_call | Execute a long call (14 bits, signed, relative, format D). A frame is pushed onto SR's 10362 stack, and a control word is pushed onto RCWS 10358. The detailed operation is: Previous Frame Pointer 27213 is incremented by 1; Current Frame Pointer 27215 is incremented by 1; the value in mPC 20276 is loaded into RCWS Register 27322 addressed by Current Frame Pointer 27215; and the value in the lit14 field is added to mPC 20276. |

2.28 test(67-71) - test conditions

A value of one or zero is returned when a test condition is specified. If a condition is true, then a one is returned; otherwise, a zero is returned. The polarity field will determine on which value conditional operations are performed.

| | | |
|---|---|---|
| F $ | true | One is returned. |
| 8 | len_eg_0 | Length selector output = 0 |
| 9 | len_le_32 | Output of LENGRF 20236 < = 32. The test is based on the source register from GRF 10358. |
| 2 | off_carry | The OFFALU 20242's carry out is returned. |
| 3 | off_sign | The OFFALU 20242's sign bit is returned. |
| 6 | aoff_ne_0 | The A input of OFFALU 20242 is not equal to 0 |
| C | crc_0 | Repeat Counter 20280 = 0 (micro repeat counter). If the dev_cmd = inc_rptc microcommand is executed during the same microinstruction in which the test is tried, a one returned means that Repeat Counter 20280 contains all ones before incrementing. In all other cases, a one returned means that Repeat Counter 20280 contains zero before incrementing. |
| 4 | ao_ne_0 | The specified register of AONGRF 20232 not equal to 0 |
| E | curr_eq_bottom | The current frame of SR's 10362 is the bottom frame. |
| 1 | not_encodable_ies | The low order 8 bits of the input to OFFIESENC have a value that is not an integral power of two and cannot be encoded by the hardware into a shift count for multiplication. The condition code returned for this test is valid only if dev_cmd = encode_ies_to_aoff. |
| D | cc_rc_word_1 | The CC Field from MCW1 20290. |
| A | cc_and_len_le_32 | The CC Field in MCW1 20290 .AND. the output of BIAS Logic 20246 < = 32 |
| B | E-unit_interruptible | The EU 10122 microinterrupt enable flag. |
| 7 | acc_byte0_ne_0 | The most significant byte of OFFMUXR 23812 (bits 0-7) is not 0 |

The following test conditions are EU 10122 test conditions.

| | | |
|---|---|---|
| 10 | E-unit_eq | EU 10122 EQUAL_TO_ZERO flag. |
| 11 | E-unit_lt | The EU 10122 LESS THAN flag. |
| 12 | E-unit_le | The EU 10122 LESS_THAN_OR_EQUAL flag. |
| 13 | E-unit_exception | One if there is an EU 10122 exception condition. |
| 14 | E-unit_floating_sign | The EU 10122 mantissa sign bit is returned. (1 if +, 0 if minus) |
| 15 | E-unit_carry | The EU 10122 carry flag. |
| 17 | E-unit_char_sign | The EU 10122 bcd character sign (1 if +, 0 if −). |
| 16 | E-unit_signal | The EU 10122 signal flag. This flag is set/reset by EU 10122 microcode at the programmer's discretion. |

2.29 polarity(72) - test polarity

| | | |
|---|---|---|
| 1 $ | execute_on_1 | Conditional operations are executed if the test condition returns a one. |
| 0 | execute_on_0 | Conditionals are executed if the test condition returns a zero. |

2.30 lit8(73-80) - signed relative 8 bit offset

This field should be encoded as the twos complement representation of the desired branch offset. (Default is 01)

2.31 snac(67-69) - secondary next address control field

This field is interpreted for next address control only if nac=use_snac.

| | | |
|---|---|---|
| 2 | disp_fetch | Obtain the next microinstruction's address from FDISP 24218 file. The address for FDISP 24218 is a concatenation of values from RDIAL 24212 and Lopcode 24210 (see load dialect microcommand for encoding). This microcommand can be issued in the same microinstruction that issues a parse_op_stage micro-order with timing=normal_m0. |
| 1 | disp_algorithm | Obtain the next microinstruction's address from FALG 24220. The address for FALG 24220 is a concatenation of values from RDIAL 24212 and Lopcode 24210 (see load_dialect) This microcommand requires timing=extend_m0 when |

APPENDIX A-continued issued in the same microinstruction that issues a parse_op_stage micro-order.

Six microcommands interrogate the NC 10226 using a name from NAME Bus 20224. These six micro-orders operate identically EXCEPT for the address to which they jam (a hardware generated call) if certain conditions occur.

For convenience in microprogramming, their mnemonics are divided into "eval" and "resolve". At the hardware level, there is no difference between the function provided by an eval and that provided by a resolve. The difference in function is provided by the conventions established for the encoding of the other fields of the microinstruction.

Any snac=§eval or resolve will:

(1) Enable the NC 10226's output to DB 27021. (See the db_ctrl field for resolution of conflicts.)

(2) Interrogate NC 10226 using the value on NAME Bus 20224. There are four possible results of this interrogation--

- (a) A hit on a scalar quantity. Logical Descriptor 27116 from Name Cache Register 30602 0 is returned and mPC 20276 incremented.
- (b) A hit on a vector quantity. NC 10226 returns Logical Descriptor 27116 from Name Cache Register 30602 0 to DB 27021. The mem and md fields are overridden, and a memory reference "mem=read, md=dest_acc" is initiated. Program control jams to the vector microroutines.
- (c) A hit on a weird entry. NC 10226 returns Logical Descriptor 27116 from Name Cache register 30602 0 to DB 27021. Any memory reference in the executing microinstruction is prevented and program control jams to the weird microroutines.
- (d) A miss. Any memory reference in the executing microinstruction is prevented, and program control jams to the name cache fault handler The other microcommand fields in the microinstruction determine if a memory reference is to be made and the destination for the data from such a reference. Storage of Logical Descriptor 27116 that results from any cache interrogation is also specified by the other micro-order fields. Microprogramming conventions determine the operations selected by the other fields.

One other microcommand can interrogate the name cache: the resolve pointer microcommand. The name bus contains a pointer ID and the result of the interrogation is the same as that for resolve or eval (see above), but only cases (a) and (d) are possible

| | | |
|---|---|---|
| 4 | resolve_A | This microcommand may simply return Logical Descriptor 27116 to DB 27011 or return Logical Descriptor 27116 and jam to vector handler A (FUSITT 11012 address 0184), weird handler A (FUSITT 11012 address 018C), or the name cache fault handler A (FUSITT 11012 address 0180), depending on the type of entry in NC 10226. See the general discussion above |
| 6 | resolve_B | This microcommand may simply return Logical Descriptor 27116 to DB 27021 or return Logical Descriptor 27116 and jam to vector handler B (FUSITT 11012 address 01C4), weird handler B (FUSITT 11012 address 01CC), or the name cache fault handler B (FUSITT 11012 address 01C0), depending on the type of entry in NC 10226. See the general discussion above. |
| 0 | resolve_C | This microcommand may simply return Logcal Descriptor 27116 to DB 27021 or return Logical Descriptor and jam to vector handler C (FUSITT 11012 address 0104), weird handler C (FUSITT 11012 address 010C), or the name cache fault handler C (FUSITT 11012 address 0100), depending on the type of entry in NC 10226. See the general discussion above. |
| 5 | eval_D | This microcommand may simply return Logical Descriptor 27116 to DB 27021 or return Logical Descriptor 27116 and jam to vector handler D (FUSITT 11012 address 01A4), weird handler D (FUSITT 11012 address 01AC), or the name cache fault handler D (FUSITT 11012 address 01A0), depending on the type of entry in NC 10226. See the general discussion above. |
| 7 | eval_E | This microcommand may simply return Logical Descriptor 27116 to DB 27021 or return Logical Descriptor 27116 and jam to vector hahdler E (FUSITT 11012 address 01E4), weird handler E (FUSITT 11012 address 01EC), or the name cache fault handler E (FUSITT 11012 address 01E0), depending on the type of entry in NC 10226. See the general discussion above. |
| 3 | resolve_ptr | Interrogate NC 10226 with a pointer ID and return the Logical Descriptor 27116 from register 0. This microcommand may simply return Logical Descriptor 27116 to DB 27021 or jam to name cache fault handler 5 (FUSITT 11012 address 0160). See the general discussion above. |

2.32 srce(67-69) - case source field

This field specifies an 8 bit field to be used as the case value when casing on the microprogram counter.

| | | |
|---|---|---|
| 4 | acc_0_byte | OFFMUXR 23812 bits 0-7 |
| 5 | acc_1_byte | OFFMUXR 23812 bits 8-15 |
| 6 | acc_2_byte | OFFMUXR 23812 bits 16-23 |
| 7 | acc_3_byte | OFFMUXR 23812 bits 24-31 |
| 1 | fiu_typ | FIU Field 27107 and Type Field 27109 from Logical Descriptor 27116 contained in the GRF 10358 register specified as a source. |

2.33 sc(70-72) - case shift value

This field specifies a left circular shift of from 0 to 7 bits to be performed on the case value. The value encoded should be the ones complement of the shift value desired.

| | | |
|---|---|---|
| §n | rotate_<n> | Rotate by <n> bits. <n> = 0-7 and §n is the complement of <n>. |

2.34 mask(73-80) - case mask

The contents of this field are "anded" with the case value. The result is shifted as specified by the shift field prior to its addition to mPC 20276's value +1. The most significant bit of the case value is masked by the most significant bit of this field.the next most significant bit of the case value is masked by the next most significant bit of this field, and so on. The encoding of the field is the mask desired.

Note that the order of operation is "mask and then shift".

3. RESOLUTION OF CONTENTION microcommand SPECIFICATIONS

Several microinstruction microcommands in different fields explicitly or implicitly specify contradictory actions by some part of FU 10120. In the previous section, we have noted these cases and indicated the overriding micro-order. The functions of the selector mechanisms associated with address generation are particularly complex. For that reason, a detailed summary of the resolution of micro-order contention for that structure is given here.

3.1 A inout of OFFALU 20242

Associated with each input of OFFALU 20242 is a selection mechanism that determines the input to OFFALU 20242. The following text defines a conceptual selection structure for each input of OFFALU 20242. A table of priorities for each commmand in the microinstruction that references this selector structure is given At the A input, the A selector may select OFFSCALE 23818, OFFSIENC 23820, or the output of SBIAS 23916. The input to OFFSCALE 23818 is selected by OFFMUX 23816. Values input to OFFSCALE 23818 may first be processed by FEXT 23814. The operation performed by OFFMUX 23816 is determined by microcommands (possibly contentious) in the microinstruction. The value selected by OFFMUX 23816 is also determined by specific microcommands (possibly contentious) in the microinstruction. The Table of priorities further specifies the operations of FEXT 23814 and the selections available to OFFMUX 23816.

3.2 B input of OFFALU 20242

Associated with the B input of OFFALU 20242 is OFFALUSB 20244. The initial, and only, selector is OFFALUSB 20244. It selects between OFFGRF 20234 and OFFMUXR 23812 (high 16 bits right justified and zero extended).

| PRTY | FIELD AND MNEMONICS | OPERATION |
|---|---|---|
| SSCALE control | | |
| 0 | alu_in=literal | select literal |
| 1 | dev_cmd=ze_nb_to_nscale | select NAME Bus 20244 |
| 1 | dev_cmd=reserved | undefined |
| 1 | dev_cmd=fiu_type_extract | select fiu and type extract |
| 2 | rand=se_nb_to_nscale | select NAME Bus 20244 |
| 2 | rand=zero_sscale | select 0 |
| 2 | rand=one_to_sscale | select 1 |
| 3 | alu_in=jpd_bus | select JPD Bus 10142 |
| 3 | alu_in=acc | select OFFMUXR 23812 |
| Sign extend logic control | | |
| 0 | aalu_in=3,dev_cmd=sscale_ms1-6_zeroed | zero extend the most significant 16 bits |
| 0 | alu_in=3,dev_cmd<=A .and. <>2 | sign extend based on literal size |
| 1 | dev_cmd=sscale_ms16_zeroed | zero most significant 16 bits |
| 1 | dev_cmd=sscale_ls16_zeroed | zero least significant 16 bits |
| 1 | dev_cmd=ze_nb_to_nscale | zero extend based on k |
| 1 | dev_cmd=sign_extend_sscale | sign extend from 16 to 32 bits |
| 1 | rand=se_nb_to_nscale | sign extend based on k. |
| 1 | dev_cmd=fiu_typ_extract | pass unchanged |
| 2 | all others | pass unchanged |
| Offset alu A selector control | | |
| 0 | alu_in=literal | select OFFSCALE 23818 |
| 1 | dev_cmd=encode_ies_to_aoff | select OFFIESENC 23820 |
| 2 | alu_in=jpd_bus | select OFFSCALE 23818 |
| 2 | alu_in=bias | select the output of SBIAS 23916 |
| 2 | alu_in=acc | select OFFSCALE 23818 |
| Offset ALU B selector control | | |
| 0 | dev_cmd=acc_to_aoff | select OFFMUXR 23812 (high 16, zero extend, right justified) |
| 1 | all others | select OFFGRF 20234 |

3.3 Resolution of contention for DB 27021 control

A number of microcommands implicitly or explicitly assign control of DB 27021. The following table shows the priority each such micro-order has in situations where there is contention for control of DB 27021. If two microcommands have the same priority and execute during the same microinstruction, the result is undefined.

| PRIORITY | micro-order |
|---|---|
| 0 | snac=§resolve, eval, or resolve pointer |
| 0 | dev_cmd=read_prefetch |
| 0 | dev_cmd=§nc_dscr_<n> <n>=0-3 |
| 1 | dev_cmd=§load_atc or load_atc_set_dirty |
| 1 | dev_cmd=lpn_to_jpd |
| 1 | dev_cmd=load_prot_tag |
| 1 | dev_cmd=dscr_trap_out |
| 2 | §all db_ctrl micro-orders |

4 Microinstruction Images

The microinstruction as it appears at the beginning of this chapter is not the form of the word when loaded into FUSITT 11012 nor is this the form as it appears in FUSITT 11012 store. The microinstruction is loaded into FUSITT 11012 store from the lower 27 bits of JPD Bus 10142 as three successive pieces. These pieces are right justified and zero filled on JPD Bus 10142.

The transformation into the three pieces is:

Invert the bits in the bit ranges, 0-9
16-29
36-37
44-51
56-63.

The bits of the microinstruction, after any inversion, are permuted according to the following table. The first column gives the bit position on JPD Bus 10142. The subsequent columns give the bit number in the conceptual microinstruction that occupies that JPD bit. Bits 0-4 of JPD Bus 10142 should be set to zero.

| Bit Index | JPD bit# WORD | A | B | C |
|---|---|---|---|---|
| 0 | 5 | 56 | 00 | 01 |
| 1 | 6 | 02 | 09 | 31 |
| 2 | 7 | 32 | 33 | 34 |
| 3 | 8 | 35 | 64 | 65 |
| 4 | 9 | 66 | 67 | 68 |
| 5 | 10 | 69 | 70 | 71 |
| 6 | 11 | 72 | 03 | 04 |
| 7 | 12 | 05 | 06 | 38 |
| 8 | 13 | 39 | 40 | 41 |
| 9 | 14 | 42 | 43 | 07 |
| 10 | 15 | 08 | 30 | 36 |
| 11 | 16 | 37 | 10 | 11 |
| 12 | 17 | 12 | 13 | 14 |
| 13 | 18 | 15 | 44 | 45 |
| 14 | 19 | 46 | 47 | 48 |
| 15 | 20 | 49 | 50 | 51 |
| 16 | 21 | 52 | 53 | 54 |
| 17 | 22 | 55 | 57 | 58 |
| 18 | 23 | 59 | 60 | 61 |
| 19 | 24 | 62 | 63 | 16 |
| 20 | 25 | 17 | 18 | 19 |
| 21 | 26 | 20 | 21 | 22 |
| 22 | 27 | 23 | 24 | 25 |
| 23 | 28 | 26 | 27 | 28 |
| 24 | 29 | 29 | 73 | 74 |
| 25 | 30 | 75 | 76 | 77 |

APPENDIX A-continued

| | |
|---|---|
| 26 31 78 79 80 | |
| Once FSITT 11012 store is loaded, the rams contain microinstructions that have the same bit order as the conceptual microinstruction but the inverted fields are still inverted. | |
| 5. WCS Event Handler Locations | |
| The following are the addresses in FUSITT 11012 that are reserved for interrupts, traps, and jams | |
| 0000 | Execution from main memory FUBAR |
| 0040 | E-unit overflow fault |
| 0042 | Fatal memory error |
| 0044 | Power fail |
| 0046 | Fbox overflow |
| 0048 | E-unit gate fault |
| 004A | Storeback exception |
| 004C | Name trace trap |
| 004E | Logical read trace trap |
| 0050 | Logical write trace trap |
| 0052 | UID read trap |
| 0054 | UID write trap |
| 0056 | Protection cache miss |
| 0058 | Protection violation |
| 005A | Cross page reference trap |
| 005C | LAT (read) |
| 005E | WLAT (write) |
| 0060 | Memory reference aborted |
| 0062 | Egg timer overflow |
| 0064 | E-unit stack underflow |
| 0066 | Nonfatal memory error |
| 0068 | Interval timer overflow |
| 006A | IPM interrupt |
| 006C | S-op trace trap |
| 006E | Illegal S-op |
| 0070 | Microinstruction trace trap |
| 0072 | Nonpresent microinstruction |
| 0074 | Instruction prefetch hung |
| 0076 | Fbox stack underflow |
| 0078 | Microinstruction breakpoint trace trap |
| 007A | Name cache miss on any reference except eval or resolve |
| 010C | Resolve_C miss |
| 0104 | resolve_C vector hit |
| 0100 | Resolve_C weird hit |
| 016C | Resolve_ptr miss |
| 018C | Resolve_A miss |
| 0184 | Resolve_A vector hit |
| 0180 | Resolve_A weird hit |
| 01AC | Eval_D miss |
| 01A4 | Eval_D vector hit |
| 01A0 | Eval_D weird hit |
| 010C | Resolve_B miss |
| 0104 | Resolve_B vector hit |
| 0100 | Resolve_B weird hit |
| 01EC | Eval_E miss |
| 01E4 | Eval_E vector hit |
| 01E0 | Eval_E weird hit |

The above appended description of CS 10110 microcode operation concludes the present invention of a data processing system incorporating a presently preferred embodiment of the present invention. As previously described, an Appendix B is separately available and contains supplemental information regarding overall operation of CS 10110, but is not essential for one of ordinary skill in the art to gain a complete understanding of the present invention.

The invention may be embodied in yet other specific forms without departing from the spirit or essential characteristics thereof. Thus, the present embodiments are to be considered in all respects as illustrative and not restrictive, the scope of the invention being indicated by the appended claims rather than by the foregoing description, and all changes which come within this meaning and range of equivalency of the claims are therefore intended to be embraced therein.

What is claimed is:

1. In a digital computer system including
memory means for performing memory operations including storing and providing items of data, said items of data including instructions;
processor means connected to said memory means for performing operations in response to said instructions including processing said items of data;
memory organization means operative on said memory means for organizing said memory means into objects identified by unique identifiers and allowing the location of said items therein, each said item being associated with an object and addressable by a logical address specifying the unique identifier of the object with which said item is associated and an offset specifying the location of said item its associated object,
said memory organization means further identifying for each one of said objects a selected set of subjects representing entities for which said processor means responds to said instructions;
memory operation specifier generation means in said processor means responsive to said instructions for providing a memory operation specifier for each item processed by said processor, said memory operation specifier for a given item specifying the object in which said given item is to be located and one of said memory operations; and
memory operations means responsive to a memory operation specifier which includes a logical address and a memory command specifying a memory operation for performing the memory operation specified by the memory command on the item specified by the logical address for a current subject for which said processor means is currently executing said instructions only when said current subject is one of the subjects in the selected set of subjects identified for the object specified in said memory operation specifier.

2. In a digital computer system of claim 1 wherein
said memory operation specifier further includes a length specifier specifying the length of said item at the location specified by said logical address; and
said memory operation means performs said memory operation specified by said memory command on said item at said location specified by said logical address having the length specified by said length specifier.

3. In a digital computer system of claim 2 wherein said length specifier specifies a length in bits.

4. In a digital computer system of claim 1 wherein said offset is a bit-granular offset and may specify any bit of the items associated with the object specified in said logical address.

5. In a digital computer system of claim 1 wherein said memory organization means identifies each said object with a single unique identifier and said single unique identifier never identifies any other said object.

6. In a digital computer system of claim 1 wherein said unique identifier contains 80 bits.

7. In a digital computer system of claim 1 wherein
said memory organization means includes means for organizing said memory means into a plurality of logical allocation untis, each said object being associated with one of said logical allocation units, and
said unique identifier further includes
a logical allocation unit identifier specifying the logical allocation unit associated with the object identified by said unique identifier, and an object serial number identifying said object in said associated logical allocation unit.

8. In a digital computer system of claim 7 wherein said memory organization means identifies each said logical allocation unit by a single logical allocation unit identifier and said single logical allocation unit identifier never identifies any other said logical allocation unit, and said memory organization means identifies each object associated with said logical allocation unit by a single object serial number and said object serial number never identifies any other said object associated with said logical allocation unit.

9. In a digital computer system of claim 7 wherein said logical allocation unit identifier further includes a logical allocation unit group number specifying a logical allocation group including a plurality of said logical allocation units, and a logical allocation unit serial number identifying one of the logical allocation units of said plurality of logical allocation units.

10. In a digital computer system of claim 9 wherein said memory organization means identifies each of said plurality of logical allocation unit groups by a single logical allocation unit group number and said single logical allocation unit group number never identifies any other said logical allocation unit group; and said memory organization means identifies each logical allocation unit associated with the logical allocation unit group identified by said logical allocation unit group number by a single logical allocation unit serial number and said single logical allocation unit serial number never identifies any other logical allocation unit in the logical allocation unit group specified by said logical allocation unit group number.

11. In a digital computer system of claim 9 wherein said logical allocation unit group number contains 9 bits;

said logical allocation unit serial number contains 8 bits;

said object serial number contains 48 bits; and said offset identifies a single bit which may be any bit in the items associated with the object identified by said unique identifier.

12. In a digital computer system of claim 1 wherein said univeral identifiers do not specify locations of objects relative to other said objects.

13. In a digital computer system of claim 1 wherein certain ones of said subjects, including said current subject, are active subjects for which said processor means is or shortly will be executing said instructions;

said memory operations means includes means for temporarily associating each said active subject with a different active subject number, said current subject being represented in said memory operation means by the active subject number currently associated therewith and said memory operations means using the active subject number currently associated with said current subject to determine whether said current subject is one of the set of subjects identified for the object specified in said memory operation specifier.

14. In a digital computer system of claim 13 wherein said memory operation means further includes means accessible to said processor means for storing the active subject number currently associated with said current subject.

15. In a digital computer system of claim 1 wherein said memory organization means further identifies for each of said selected set of subjects a selected set of said memory operations which said selected set of subjects is authorized to perform on the items locatable by a said object; and said memory operation means further performs the memory operation specified in said memory operation specifier only if said specified memory operation is identified as one of the selected set of memory operations which said current subject is authorized to perform on the items locatable by the object specified in said memory operation specifier.

16. In a digital computer system of claim 15 wherein said memory operation means further includes protection cache means for encaching information specifying said memory operations which a current subject is authorized to perform on the objects specified in the memory operation specifiers produced in response to said instructions, said protection cache means receiving said memory operation specifier and responding thereto by producing an access violation signal when said encached information indicates that said current subject may not perform the memory operation specified by said memory operation specifier on the object specified by said memory operaton specifier; and means responsive to said access violation signal for inhibiting the performance of said specified memory operation.

17. In a digital computer system of claim 1 wherein said instructions are contained in procedures of said items and said processor means responds to said instructions only while executing one of said procedures;

the operations performed by said processor means further include a call operation for suspending a current execution of one of said procedures and commencing another execution as the current execution, and a return operation for terminating said current execution and resuming the execution which was suspended to commence the terminated current execution; and said current subject changes as a consequence of said call opeation and said return operation.

* * * * *